US011713333B2

(12) United States Patent
Jeon et al.

(10) Patent No.: US 11,713,333 B2
(45) Date of Patent: Aug. 1, 2023

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Aram Jeon, Seoul (KR); Seungyeon Kwak, Suwon-si (KR); Kum Hee Lee, Suwon-si (KR); Jun Chwae, Seoul (KR); Whail Choi, Seoul (KR); Kyuyoung Hwang, Anyang-si (KR); Yoonhyun Kwak, Seoul (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 438 days.

(21) Appl. No.: 16/892,487

(22) Filed: Jun. 4, 2020

(65) Prior Publication Data

US 2021/0163517 A1 Jun. 3, 2021

(30) Foreign Application Priority Data

Nov. 28, 2019 (KR) ........................ 10-2019-0156110

(51) Int. Cl.

| | |
|---|---|
| ***C07F 15/00*** | (2006.01) |
| ***H01L 51/00*** | (2006.01) |
| ***H10K 85/30*** | (2023.01) |
| *H10K 30/30* | (2023.01) |
| *H10K 50/15* | (2023.01) |
| *H10K 50/16* | (2023.01) |
| *H10K 50/17* | (2023.01) |

(52) U.S. Cl.

CPC ....... *C07F 15/0033* (2013.01); *H10K 85/342* (2023.02); *H10K 30/353* (2023.02); *H10K 50/15* (2023.02); *H10K 50/16* (2023.02); *H10K 50/17* (2023.02)

(58) Field of Classification Search

CPC .... C07F 15/0033; C07F 7/02; H01L 51/0085; H01L 51/50; H01L 51/00

USPC ................ 546/2, 14; 313/498, 504; 428/690

See application file for complete search history.

(56) References Cited

U.S. PATENT DOCUMENTS

| | | | | |
|---|---|---|---|---|
| 9,257,658 | B2 | 2/2016 | Kottas et al. | |
| 10,400,163 | B2 | 9/2019 | Beers et al. | |
| 2012/0292600 | A1 | 11/2012 | Kottas et al. | |
| 2015/0115250 | A1 | 4/2015 | Ma et al. | |
| 2016/0268521 | A1 | 9/2016 | Lee et al. | |
| 2020/0287144 | A1 | 9/2020 | Hwang et al. | |
| 2021/0083205 | A1 | 3/2021 | Hwang et al. | |
| 2021/0104691 | A1* | 4/2021 | Lee et al. | H01L 51/0085 313/498 |

FOREIGN PATENT DOCUMENTS

| | | | |
|---|---|---|---|
| KR | 1020140028043 | A | 3/2014 |
| KR | 1020140101292 | A | 8/2014 |
| KR | 1020150050383 | A | 5/2015 |
| KR | 1020160109907 | A | 9/2016 |
| KR | 1020200107830 | A | 9/2020 |
| KR | 1020210031395 | A | 3/2021 |

* cited by examiner

*Primary Examiner* — Charanjit Aulakh

(74) *Attorney, Agent, or Firm* — Cantor Colburn LLP

(57) ABSTRACT

Provided are an organometallic compound, an organic light-emitting device including the organometallic compound, and a diagnostic composition including the organometallic compound.

15 Claims, 1 Drawing Sheet

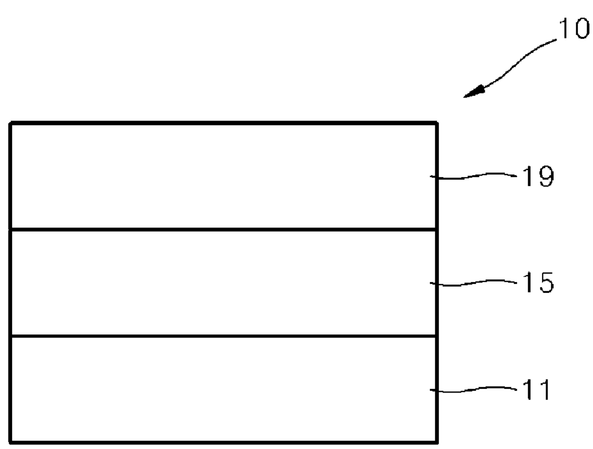
10
19
15
11

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATIONS

This application claims priority to and the benefit of Korean Patent Application No. 10-2019-0156110, filed on Nov. 28, 2019, in the Korean Intellectual Property Office, the content of which is incorporated herein in its entirety by reference.

BACKGROUND

1. Field

One or more embodiments relate to organometallic compounds, organic light-emitting devices including the same, and diagnostic compositions including the same.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds, for example, phosphorescent compounds, may be used for monitoring, sensing, and detecting biological materials such as various cells and proteins.

SUMMARY

One or more embodiments relate to organometallic compounds, organic light-emitting devices including the same, and diagnostic compositions including the same.

Additional aspects will be set forth in part in the description which follows and, in part, will be apparent from the description, or may be learned by practice of the presented embodiments of the disclosure.

According to an aspect, provided is an organometallic compound represented by Formula 1.

$$M(L_1)_{n1}(L_2)_{n2} \quad \text{Formula 1}$$

In Formula 1,

M may be a transition metal, $L_1$ may be a ligand represented by Formula 2-1, n1 may be 1, 2, or 3, when n1 is 2 or more, two or more $L_1$(s) may be identical to or different from each other, $L_2$ may be a ligand represented by Formula 2-2, n2 may be 1, 2, 3, or 4, when n2 is two or more, two or more $L_2$(s) may be identical to or different from each other, Formula 2-1

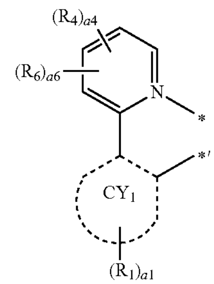

Formula 2-2

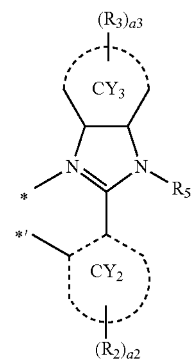

in Formulae 2-1 and 2-2, $CY_1$ to $CY_3$ may each independently be a $C_5$-$C_{30}$ carbocyclic group, a $C_1$-$C_{30}$ heterocyclic group, or any combination thereof, $R_1$ to $R_5$ may each independently be deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof, $R_6$ may be a Si-containing group or a Ge-containing group, a1 to a3 may each independently be an integer from 0 to 10, wherein, when a1 is an integer of 2 or more, two or more $R_1$(s) may be identical to or different from each other, when a2 is an integer of 2 or more, two or more $R_2$(s) may be identical to or different from each other, and when a3 is an integer of 2 or more, two or more $R_3$(s) may be identical to or different from each other, a4 may be an integer from 0 to 4, and when a4 is an integer of 2 or more, two or more $R_4$(s) may be identical to or different from each other, a6 may be an integer from 1 to 4, and when a6 is an integer of 2 or more, two or more $R_6$(s) may be identical to or different from each other, two or more neighboring $R_1$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more neighboring $R_2$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more neighboring $R_3$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more neighboring $R_4$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_1$ to $R_5$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$,

* and *' each indicate a binding site to M in Formula 1, and at least one substituent the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{29})(Q_{29})$, or any combination thereof, or —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{39})(Q_{39})$, or any combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one of a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

Another aspect provides an organic light-emitting device including a first electrode, a second electrode, and an organic layer between the first electrode and the second electrode and including an emission layer, wherein the organic layer includes at least one of the organometallic compound.

The organometallic compound in the organic layer may function as a dopant.

BRIEF DESCRIPTION OF THE DRAWING

The above and other aspects, features, and advantages of certain embodiments of the disclosure will be more apparent from the following description taken in conjunction with FIGURE which shows a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the FIG. Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1:

$$M(L_1)_{n1}(L_2)_{n2}. \qquad \text{Formula 1}$$

In Formula 1, M may be a transition metal.

For example, M may be a Period 1 transition metal, a Period 2 transition metal, or a Period 3 transition metal.

In one or more embodiments, M may be iridium (Ir), platinum (Pt), osmium (Os), titanium (Ti), zirconium (Zr), hafnium (Hf), europium (Eu), terbium (Tb), thulium (Tm)), or rhodium (Rh).

In one or more embodiments, M may be Ir, Pt, Os, or Rh, but embodiments are not limited thereto.

$L_1$ in Formula 1 may be a ligand represented by Formula 2-1:

Formula 2-1

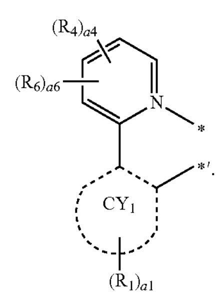

The description of Formula 2-1 is the same as described in the specification.

n1 in Formula 1 indicates the number of $L_1$, and may be 1, 2, or 3, and when n1 is 2 or more, two or more $L_1$(s) may be identical to or different from each other.

$L_2$ in Formula 1 may be a ligand represented by Formula 2-2:

Formula 2-2

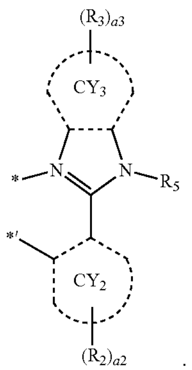

The description of Formula 2-2 is the same as described in the specification.

n2 in Formula 1 indicates the number of $L_2$, and may be 1, 2, 3, or 4, and when n2 is 2 or more, two or more $L_2$(s) may be identical to or different from each other.

In one or more embodiments, M in Formula 1 may be Ir or Os, and the sum of n1 and n2 may be 3 or 4. For example, regarding Formula 1, M may be Ir or Os, n1 may be 2, and n2 may be 1.

$CY_1$ to $CY_3$ in Formulae 2-1 and 2-2 may each independently be a $C_5$-$C_{30}$ carbocyclic group, a $C_1$-$C_{30}$ heterocyclic group, or any combination thereof.

In one or more embodiments, ring $CY_1$ to ring $CY_3$ may each independently be:

a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or any combination thereof, but embodiments of the present disclosure are not limited thereto.

$R_1$ to $R_5$ in Formulae 2-1 and 2-2 may each independently be deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" are hetero-rings having the backbones of "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group", wherein at least one carbon forming the corresponding ring is substituted with nitrogen.

In one or more embodiments, $R_1$ to $R_4$ may each independently be:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —$SF_5$, $C_1$-$C_{20}$ alkyl group, a $C_1$-$C_{20}$ alkoxy group, or any combination thereof;

a $C_1$-$C_{20}$ alkyl group, a $C_1$-$C_{20}$ alkoxy group, or any combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof, wherein $Q_1$ to $Q_9$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, but embodiments of the present disclosure are not limited thereto.

In one or more embodiments, $R_4$ may be: hydrogen, deuterium, a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group; or a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each substituted with at least one deuterium, but embodiments of the present disclosure are not limited thereto.

In one or more embodiments, $R_5$ may be:

a $C_1$-$C_{20}$ alkyl group unsubstituted or substituted with at least one deuterium; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with at least one deuterium, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, but embodiments of the present disclosure are not limited thereto.

$R_6$ in Formula 2-1 may be a Si-containing group or a Ge-containing group.

The term "a Si-containing group" used herein refers to a monovalent substituent group having a Si atom, for example, a group in which at least one hydrogen (H) of —$SiH_3$ is substituted with deuterium, a methyl group, an ethyl group, a phenyl group, or the like. Examples of the Si-containing group are —$Si(CH_3)_3$, —$Si(CH_3)_2(CH_2CH_3)$, —$Si(Ph)_3$, and —$Si(CH_3)_2(Ph)$.

The term "a Ge-containing group" used herein refers to a monovalent substituent group having a Ge atom, for example, a group in which at least one hydrogen (H) of —$GeH_3$ is substituted with deuterium, a methyl group, an ethyl group, a phenyl group, or the like. Examples of the Ge-containing group are —$Ge(CH_3)_3$, —$Ge(CH_3)_2(CH_2CH_3)$, —$Ge(Ph)_3$, and —$Ge(CH_3)_2(Ph)$.

In one or more embodiments, $R_6$ in Formula 1 may be represented by Formula 3-1:

Formula 3-1

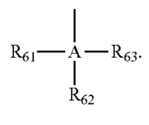

In Formula 3-1,

A may be Si or Ge, $R_{61}$ to $R_{63}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof, and

*" is a binding site to an adjacent group.

$R_{61}$ to $R_{63}$ in Formula 3-1 may be:

hydrogen, deuterium, a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group or any combination thereof; or a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof, each substituted with at least one deuterium, but embodiments of the present disclosure are not limited thereto.

$R_{61}$ to $R_{63}$ may be identical to or different from each other.

For example, $R_{61}$ to $R_{63}$ may be identical to each other. For example, $R_{61}$ and $R_{62}$ may be different from each other. For example, $R_{61}$ and $R_{62}$ may be different from each other, and $R_{61}$ and $R_{63}$ may be different from each other. For example, $R_{61}$ to $R_{63}$ may be different from each other.

In one or more embodiments, Formula 2-1 may be represented by one of Formulae 4-1 to 4-4.

4-1

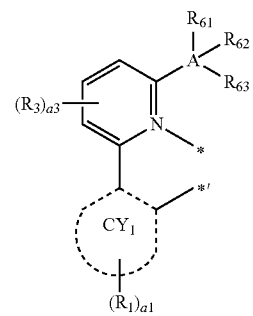

-continued 4-2

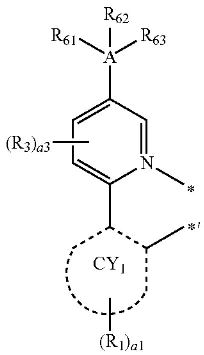

4-3

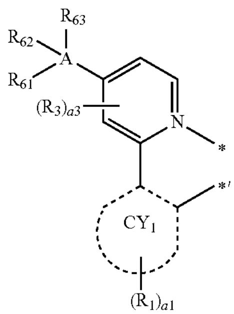

4-4

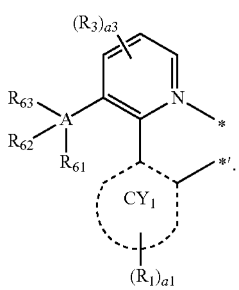

In Formulae 4-1 to 4-4,

A may be Si or Ge, and $R_{61}$ to $R_{63}$, $CY_1$, $R_1$, $R_3$, a1, and a3 may be the same as described above.

In one or more embodiments, Formula 2-1 may be represented by one of Formulae 4-1-1 to 4-4-1.

4-1-1

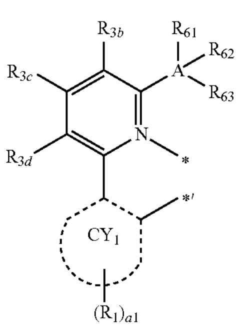

-continued 4-2-1

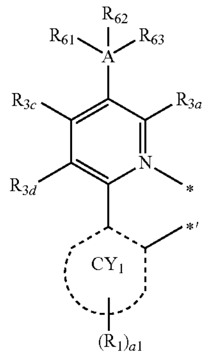

4-3-1

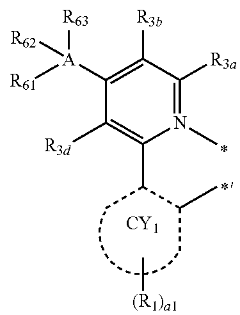

4-4-1

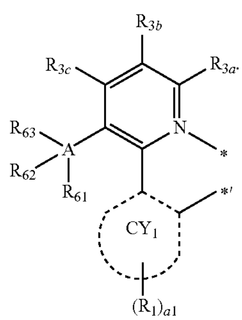

In Formulae 4-1-1 to 4-4-1,

A, $R_{61}$ to $R_{63}$, $CY_1$, $R_1$, and a1 may be the same as described above, $R_{3a}$, $R_{3b}$, $R_{3c}$, and $R_{3d}$ may each be the same as described in connection with $R_3$, wherein $R_{3c}$ is not a phenyl group.

In one or more embodiments, Formula 2-2 may be represented by Formula 5-1:

Formula 5-1

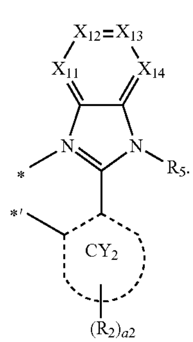

In Formula 5-1, $X_{11}$ may be $C(R_{11})$ or N, $X_{12}$ may be $C(R_{12})$ or N, $X_{13}$ may be $C(R_{13})$ or N, and $X_{14}$ may be $C(R_{14})$ or N, $R_{11}$ to $R_{14}$ are the same as described in connection with $R_3$, and $CY_2$, $R_2$, $R_5$, and a2 are the same as described above.

In one or more embodiments, $X_{11}$ may be $C(R_{11})$, $X_{12}$ may be $C(R_{12})$, $X_{13}$ may be $C(R_{13})$, and $X_{14}$ may be $C(R_{14})$.

In one or more embodiments, $X_{11}$ may be N, $X_{12}$ may be $C(R_{12})$, $X_{13}$ may be $C(R_{13})$, and $X_{14}$ may be $C(R_{14})$. In one or more embodiments, may be $C(R_{11})$, $X_{12}$ may be N, $X_{13}$ may be $C(R_{13})$, and $X_{14}$ may be $C(R_{14})$. In one or more embodiments, $X_{11}$ may be $C(R_{11})$, $X_{12}$ may be $C(R_{12})$, $X_{13}$ may be N, and $X_{14}$ may be $C(R_{14})$. In one or more embodiments, $X_{11}$ may be $C(R_{11})$, $X_{12}$ may be $C(R_{12})$, $X_{13}$ may be $C(R_{13})$, and $X_{14}$ may be N. In one or more embodiments, $X_{11}$ may be N, $X_{12}$ may be N, $X_{13}$ may be $C(R_{13})$, and $X_{14}$ may be $C(R_{14})$. In one or more embodiments, $X_{11}$ may be N, $X_{12}$ may be $C(R_{12})$, $X_{13}$ may be N, and $X_{14}$ may be $C(R_{14})$. In one or more embodiments, $X_{11}$ may be N, $X_{12}$ may be $C(R_{12})$, $X_{13}$ may be $C(R_{13})$, and $X_{14}$ may be N. In one or more embodiments, may be $C(R_{11})$, $X_{12}$ may be N, $X_{13}$ may be N, and $X_{14}$ may be $C(R_{14})$. In one or more embodiments, may be $C(R_{11})$, $X_{12}$ may be N, $X_{13}$ may be $C(R_{13})$, and $X_{14}$ may be N. In one or more embodiments, may be $C(R_{11})$, $X_{12}$ may be $C(R_{12})$, $X_{13}$ may be N, and $X_{14}$ may be N. In one or more embodiments, $X_{11}$ may be N, $X_{12}$ may be N, $X_{13}$ may be N, and $X_{14}$ may be $C(R_{14})$. In one or more embodiments, $X_{11}$ may be N, $X_{12}$ may be N, $X_{13}$ may be $C(R_{13})$, and $X_{14}$ may be N. In one or more embodiments, $X_{11}$ may be N, $X_{12}$ may be $C(R_{12})$, $X_{13}$ may be N, and $X_{14}$ may be N. In one or more embodiments, $X_{11}$ may be $C(R_{11})$, $X_{12}$ may be N, $X_{13}$ may be N, and $X_{14}$ may be N. In one or more embodiments, $X_{11}$ may be N, $X_{12}$ may be N, $X_{13}$ may be N, and $X_{14}$ may be N.

Regarding Formulae 2-1 and 2-2, a1 to a3 may each independently be an integer from 0 to 10, wherein, when a1 is 2 or more, two or more $R_1$(s) may be identical to or different from each other, when a2 is 2 or more, two or more $R_2$(s) may be identical to or different from each other, and when a3 is 2 or more, two or more $R_3$(s) may be identical to or different from each other, and a4 may each independently be an integer from 0 to 4, wherein, when a4 is 2 or more, two or more $R_4$(s) may be identical to or different from each other, and a6 may be an integer from 1 to 4, wherein, when a6 is 2 or more, $R_6$(s) may be identical to or different from each other.

Regarding Formulae 2-1 and 2-2, (i) two or more neighboring $R_1$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, (ii) two or more neighboring $R_2$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, (iii) two or more neighboring $R_3$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, (iv) two or more neighboring $R_4$(s) may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and (v) $R_1$ to $R_5$ may optionally be linked together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ is the same as described in connection with $R_1$.

In one or more embodiments, the organometallic compound may be at least one of Compounds 1 to 9796 represented by $(L_1)_2IrL_2$ and may include ligand $L_1$ and ligand $L_2$ shown in Table 1 below and, but embodiments of the present disclosure are not limited thereto:

TABLE 1

| | | |
|---|---|---|
| Compound 1 | $L_{1-1}$ | $L_{2-1}$ |
| Compound 2 | $L_{1-1}$ | $L_{2-2}$ |
| Compound 3 | $L_{1-1}$ | $L_{2-3}$ |
| Compound 4 | $L_{1-1}$ | $L_{2-4}$ |
| Compound 5 | $L_{1-1}$ | $L_{2-5}$ |
| Compound 6 | $L_{1-1}$ | $L_{2-6}$ |
| Compound 7 | $L_{1-1}$ | $L_{2-7}$ |
| Compound 8 | $L_{1-1}$ | $L_{2-8}$ |
| Compound 9 | $L_{1-1}$ | $L_{2-9}$ |
| Compound 10 | $L_{1-1}$ | $L_{2-10}$ |
| Compound 11 | $L_{1-1}$ | $L_{2-11}$ |
| Compound 12 | $L_{1-1}$ | $L_{2-12}$ |
| Compound 13 | $L_{1-1}$ | $L_{2-13}$ |
| Compound 14 | $L_{1-1}$ | $L_{2-14}$ |
| Compound 15 | $L_{1-1}$ | $L_{2-15}$ |
| Compound 16 | $L_{1-1}$ | $L_{2-16}$ |
| Compound 17 | $L_{1-1}$ | $L_{2-17}$ |
| Compound 18 | $L_{1-1}$ | $L_{2-18}$ |
| Compound 19 | $L_{1-1}$ | $L_{2-19}$ |
| Compound 20 | $L_{1-1}$ | $L_{2-20}$ |
| Compound 21 | $L_{1-1}$ | $L_{2-21}$ |
| Compound 22 | $L_{1-1}$ | $L_{2-22}$ |
| Compound 23 | $L_{1-1}$ | $L_{2-23}$ |
| Compound 24 | $L_{1-1}$ | $L_{2-24}$ |
| Compound 25 | $L_{1-1}$ | $L_{2-25}$ |
| Compound 26 | $L_{1-1}$ | $L_{2-26}$ |
| Compound 27 | $L_{1-1}$ | $L_{2-27}$ |
| Compound 28 | $L_{1-1}$ | $L_{2-28}$ |
| Compound 29 | $L_{1-1}$ | $L_{2-29}$ |
| Compound 30 | $L_{1-1}$ | $L_{2-30}$ |
| Compound 31 | $L_{1-1}$ | $L_{2-31}$ |
| Compound 32 | $L_{1-1}$ | $L_{2-32}$ |
| Compound 33 | $L_{1-1}$ | $L_{2-33}$ |
| Compound 34 | $L_{1-1}$ | $L_{2-34}$ |
| Compound 35 | $L_{1-1}$ | $L_{2-35}$ |
| Compound 36 | $L_{1-1}$ | $L_{2-36}$ |
| Compound 37 | $L_{1-1}$ | $L_{2-37}$ |
| Compound 38 | $L_{1-1}$ | $L_{2-38}$ |
| Compound 39 | $L_{1-1}$ | $L_{2-39}$ |
| Compound 40 | $L_{1-1}$ | $L_{2-40}$ |
| Compound 41 | $L_{1-1}$ | $L_{2-41}$ |
| Compound 42 | $L_{1-1}$ | $L_{2-42}$ |
| Compound 43 | $L_{1-1}$ | $L_{2-43}$ |
| Compound 44 | $L_{1-1}$ | $L_{2-44}$ |
| Compound 45 | $L_{1-1}$ | $L_{2-45}$ |
| Compound 46 | $L_{1-1}$ | $L_{2-46}$ |
| Compound 47 | $L_{1-1}$ | $L_{2-47}$ |
| Compound 48 | $L_{1-1}$ | $L_{2-48}$ |
| Compound 49 | $L_{1-1}$ | $L_{2-49}$ |
| Compound 50 | $L_{1-1}$ | $L_{2-50}$ |
| Compound 51 | $L_{1-1}$ | $L_{2-51}$ |
| Compound 52 | $L_{1-1}$ | $L_{2-52}$ |
| Compound 53 | $L_{1-1}$ | $L_{2-53}$ |
| Compound 54 | $L_{1-1}$ | $L_{2-54}$ |
| Compound 55 | $L_{1-1}$ | $L_{2-55}$ |
| Compound 56 | $L_{1-1}$ | $L_{2-56}$ |
| Compound 57 | $L_{1-1}$ | $L_{2-57}$ |
| Compound 58 | $L_{1-1}$ | $L_{2-58}$ |
| Compound 59 | $L_{1-1}$ | $L_{2-59}$ |
| Compound 60 | $L_{1-1}$ | $L_{2-60}$ |
| Compound 61 | $L_{1-1}$ | $L_{2-61}$ |
| Compound 62 | $L_{1-1}$ | $L_{2-62}$ |
| Compound 63 | $L_{1-1}$ | $L_{2-63}$ |
| Compound 64 | $L_{1-1}$ | $L_{2-64}$ |
| Compound 65 | $L_{1-1}$ | $L_{2-65}$ |
| Compound 66 | $L_{1-1}$ | $L_{2-66}$ |
| Compound 67 | $L_{1-1}$ | $L_{2-67}$ |
| Compound 68 | $L_{1-1}$ | $L_{2-68}$ |
| Compound 69 | $L_{1-1}$ | $L_{2-69}$ |

TABLE 1-continued

| | | |
|---|---|---|
| Compound 70 | $L_{1-1}$ | $L_{2-70}$ |
| Compound 71 | $L_{1-1}$ | $L_{2-71}$ |
| Compound 72 | $L_{1-1}$ | $L_{2-72}$ |
| Compound 73 | $L_{1-1}$ | $L_{2-73}$ |
| Compound 74 | $L_{1-1}$ | $L_{2-74}$ |
| Compound 75 | $L_{1-1}$ | $L_{2-75}$ |
| Compound 76 | $L_{1-1}$ | $L_{2-76}$ |
| Compound 77 | $L_{1-1}$ | $L_{2-77}$ |
| Compound 78 | $L_{1-1}$ | $L_{2-78}$ |
| Compound 79 | $L_{1-1}$ | $L_{2-79}$ |
| Compound 80 | $L_{1-1}$ | $L_{2-80}$ |
| Compound 81 | $L_{1-1}$ | $L_{2-81}$ |
| Compound 82 | $L_{1-1}$ | $L_{2-82}$ |
| Compound 83 | $L_{1-1}$ | $L_{2-83}$ |
| Compound 84 | $L_{1-1}$ | $L_{2-84}$ |
| Compound 85 | $L_{1-1}$ | $L_{2-85}$ |
| Compound 86 | $L_{1-1}$ | $L_{2-86}$ |
| Compound 87 | $L_{1-1}$ | $L_{2-87}$ |
| Compound 88 | $L_{1-1}$ | $L_{2-88}$ |
| Compound 89 | $L_{1-1}$ | $L_{2-89}$ |
| Compound 90 | $L_{1-1}$ | $L_{2-90}$ |
| Compound 91 | $L_{1-1}$ | $L_{2-91}$ |
| Compound 92 | $L_{1-1}$ | $L_{2-92}$ |
| Compound 93 | $L_{1-1}$ | $L_{2-93}$ |
| Compound 94 | $L_{1-1}$ | $L_{2-94}$ |
| Compound 95 | $L_{1-1}$ | $L_{2-95}$ |
| Compound 96 | $L_{1-1}$ | $L_{2-96}$ |
| Compound 97 | $L_{1-1}$ | $L_{2-97}$ |
| Compound 98 | $L_{1-1}$ | $L_{2-98}$ |
| Compound 99 | $L_{1-1}$ | $L_{2-99}$ |
| Compound 100 | $L_{1-1}$ | $L_{2-100}$ |
| Compound 101 | $L_{1-1}$ | $L_{2-101}$ |
| Compound 102 | $L_{1-1}$ | $L_{2-102}$ |
| Compound 103 | $L_{1-1}$ | $L_{2-103}$ |
| Compound 104 | $L_{1-1}$ | $L_{2-104}$ |
| Compound 105 | $L_{1-1}$ | $L_{2-105}$ |
| Compound 106 | $L_{1-1}$ | $L_{2-106}$ |
| Compound 107 | $L_{1-1}$ | $L_{2-107}$ |
| Compound 108 | $L_{1-1}$ | $L_{2-108}$ |
| Compound 109 | $L_{1-1}$ | $L_{2-109}$ |
| Compound 110 | $L_{1-1}$ | $L_{2-110}$ |
| Compound 111 | $L_{1-1}$ | $L_{2-111}$ |
| Compound 112 | $L_{1-1}$ | $L_{2-112}$ |
| Compound 113 | $L_{1-1}$ | $L_{2-113}$ |
| Compound 114 | $L_{1-1}$ | $L_{2-114}$ |
| Compound 115 | $L_{1-1}$ | $L_{2-115}$ |
| Compound 116 | $L_{1-1}$ | $L_{2-116}$ |
| Compound 117 | $L_{1-1}$ | $L_{2-117}$ |
| Compound 118 | $L_{1-1}$ | $L_{2-118}$ |
| Compound 119 | $L_{1-1}$ | $L_{2-119}$ |
| Compound 120 | $L_{1-1}$ | $L_{2-120}$ |
| Compound 121 | $L_{1-1}$ | $L_{2-121}$ |
| Compound 122 | $L_{1-1}$ | $L_{2-122}$ |
| Compound 123 | $L_{1-1}$ | $L_{2-123}$ |
| Compound 124 | $L_{1-1}$ | $L_{2-124}$ |
| Compound 125 | $L_{1-1}$ | $L_{2-125}$ |
| Compound 126 | $L_{1-1}$ | $L_{2-126}$ |
| Compound 127 | $L_{1-1}$ | $L_{2-127}$ |
| Compound 128 | $L_{1-1}$ | $L_{2-128}$ |
| Compound 129 | $L_{1-1}$ | $L_{2-129}$ |
| Compound 130 | $L_{1-1}$ | $L_{2-130}$ |
| Compound 131 | $L_{1-1}$ | $L_{2-131}$ |
| Compound 132 | $L_{1-1}$ | $L_{2-132}$ |
| Compound 133 | $L_{1-1}$ | $L_{2-133}$ |
| Compound 134 | $L_{1-1}$ | $L_{2-134}$ |
| Compound 135 | $L_{1-1}$ | $L_{2-135}$ |
| Compound 136 | $L_{1-1}$ | $L_{2-136}$ |
| Compound 137 | $L_{1-1}$ | $L_{2-137}$ |
| Compound 138 | $L_{1-1}$ | $L_{2-138}$ |
| Compound 139 | $L_{1-1}$ | $L_{2-139}$ |
| Compound 140 | $L_{1-1}$ | $L_{2-140}$ |
| Compound 141 | $L_{1-1}$ | $L_{2-141}$ |
| Compound 142 | $L_{1-1}$ | $L_{2-142}$ |
| Compound 143 | $L_{1-1}$ | $L_{2-143}$ |
| Compound 144 | $L_{1-1}$ | $L_{2-144}$ |
| Compound 145 | $L_{1-1}$ | $L_{2-145}$ |
| Compound 146 | $L_{1-1}$ | $L_{2-146}$ |
| Compound 147 | $L_{1-1}$ | $L_{2-147}$ |
| Compound 148 | $L_{1-1}$ | $L_{2-148}$ |
| Compound 149 | $L_{1-1}$ | $L_{2-149}$ |

TABLE 1-continued

| | | |
|---|---|---|
| Compound 150 | $L_{1-1}$ | $L_{2-150}$ |
| Compound 151 | $L_{1-1}$ | $L_{2-151}$ |
| Compound 152 | $L_{1-1}$ | $L_{2-152}$ |
| Compound 153 | $L_{1-1}$ | $L_{2-153}$ |
| Compound 154 | $L_{1-1}$ | $L_{2-154}$ |
| Compound 155 | $L_{1-1}$ | $L_{2-155}$ |
| Compound 156 | $L_{1-1}$ | $L_{2-156}$ |
| Compound 157 | $L_{1-1}$ | $L_{2-157}$ |
| Compound 158 | $L_{1-1}$ | $L_{2-158}$ |
| Compound 159 | $L_{1-1}$ | $L_{2-159}$ |
| Compound 160 | $L_{1-1}$ | $L_{2-160}$ |
| Compound 161 | $L_{1-1}$ | $L_{2-161}$ |
| Compound 162 | $L_{1-1}$ | $L_{2-162}$ |
| Compound 163 | $L_{1-1}$ | $L_{2-163}$ |
| Compound 164 | $L_{1-1}$ | $L_{2-164}$ |
| Compound 165 | $L_{1-1}$ | $L_{2-165}$ |
| Compound 166 | $L_{1-1}$ | $L_{2-166}$ |
| Compound 167 | $L_{1-1}$ | $L_{2-167}$ |
| Compound 168 | $L_{1-1}$ | $L_{2-168}$ |
| Compound 169 | $L_{1-1}$ | $L_{2-169}$ |
| Compound 170 | $L_{1-1}$ | $L_{2-170}$ |
| Compound 171 | $L_{1-1}$ | $L_{2-171}$ |
| Compound 172 | $L_{1-1}$ | $L_{2-172}$ |
| Compound 173 | $L_{1-1}$ | $L_{2-173}$ |
| Compound 174 | $L_{1-1}$ | $L_{2-174}$ |
| Compound 175 | $L_{1-1}$ | $L_{2-175}$ |
| Compound 176 | $L_{1-1}$ | $L_{2-176}$ |
| Compound 177 | $L_{1-1}$ | $L_{2-177}$ |
| Compound 178 | $L_{1-1}$ | $L_{2-178}$ |
| Compound 179 | $L_{1-1}$ | $L_{2-179}$ |
| Compound 180 | $L_{1-1}$ | $L_{2-180}$ |
| Compound 181 | $L_{1-1}$ | $L_{2-181}$ |
| Compound 182 | $L_{1-1}$ | $L_{2-182}$ |
| Compound 183 | $L_{1-1}$ | $L_{2-183}$ |
| Compound 184 | $L_{1-1}$ | $L_{2-184}$ |
| Compound 185 | $L_{1-1}$ | $L_{2-185}$ |
| Compound 186 | $L_{1-1}$ | $L_{2-186}$ |
| Compound 187 | $L_{1-1}$ | $L_{2-187}$ |
| Compound 188 | $L_{1-1}$ | $L_{2-188}$ |
| Compound 189 | $L_{1-1}$ | $L_{2-189}$ |
| Compound 190 | $L_{1-1}$ | $L_{2-190}$ |
| Compound 191 | $L_{1-1}$ | $L_{2-191}$ |
| Compound 192 | $L_{1-1}$ | $L_{2-192}$ |
| Compound 193 | $L_{1-1}$ | $L_{2-193}$ |
| Compound 194 | $L_{1-1}$ | $L_{2-194}$ |
| Compound 195 | $L_{1-1}$ | $L_{2-195}$ |
| Compound 196 | $L_{1-1}$ | $L_{2-196}$ |
| Compound 197 | $L_{1-1}$ | $L_{2-197}$ |
| Compound 198 | $L_{1-1}$ | $L_{2-198}$ |
| Compound 199 | $L_{1-1}$ | $L_{2-199}$ |
| Compound 200 | $L_{1-1}$ | $L_{2-200}$ |
| Compound 201 | $L_{1-1}$ | $L_{2-201}$ |
| Compound 202 | $L_{1-1}$ | $L_{2-202}$ |
| Compound 203 | $L_{1-1}$ | $L_{2-203}$ |
| Compound 204 | $L_{1-1}$ | $L_{2-204}$ |
| Compound 205 | $L_{1-1}$ | $L_{2-205}$ |
| Compound 206 | $L_{1-1}$ | $L_{2-206}$ |
| Compound 207 | $L_{1-1}$ | $L_{2-207}$ |
| Compound 208 | $L_{1-1}$ | $L_{2-208}$ |
| Compound 209 | $L_{1-1}$ | $L_{2-209}$ |
| Compound 210 | $L_{1-1}$ | $L_{2-210}$ |
| Compound 211 | $L_{1-1}$ | $L_{2-211}$ |
| Compound 212 | $L_{1-1}$ | $L_{2-212}$ |
| Compound 213 | $L_{1-1}$ | $L_{2-213}$ |
| Compound 214 | $L_{1-1}$ | $L_{2-214}$ |
| Compound 215 | $L_{1-1}$ | $L_{2-215}$ |
| Compound 216 | $L_{1-1}$ | $L_{2-216}$ |
| Compound 217 | $L_{1-1}$ | $L_{2-217}$ |
| Compound 218 | $L_{1-1}$ | $L_{2-218}$ |
| Compound 219 | $L_{1-1}$ | $L_{2-219}$ |
| Compound 220 | $L_{1-1}$ | $L_{2-220}$ |
| Compound 221 | $L_{1-1}$ | $L_{2-221}$ |
| Compound 222 | $L_{1-1}$ | $L_{2-222}$ |
| Compound 223 | $L_{1-1}$ | $L_{2-223}$ |
| Compound 224 | $L_{1-1}$ | $L_{2-224}$ |
| Compound 225 | $L_{1-1}$ | $L_{2-225}$ |
| Compound 226 | $L_{1-1}$ | $L_{2-226}$ |
| Compound 227 | $L_{1-1}$ | $L_{2-227}$ |
| Compound 228 | $L_{1-1}$ | $L_{2-228}$ |
| Compound 229 | $L_{1-1}$ | $L_{2-229}$ |

TABLE 1-continued

| | | |
|---|---|---|
| Compound 230 | $L_{1-1}$ | $L_{2-230}$ |
| Compound 231 | $L_{1-1}$ | $L_{2-231}$ |
| Compound 232 | $L_{1-1}$ | $L_{2-232}$ |
| Compound 233 | $L_{1-1}$ | $L_{2-233}$ |
| Compound 234 | $L_{1-1}$ | $L_{2-234}$ |
| Compound 235 | $L_{1-1}$ | $L_{2-235}$ |
| Compound 236 | $L_{1-1}$ | $L_{2-236}$ |
| Compound 237 | $L_{1-1}$ | $L_{2-237}$ |
| Compound 238 | $L_{1-1}$ | $L_{2-238}$ |
| Compound 239 | $L_{1-1}$ | $L_{2-239}$ |
| Compound 240 | $L_{1-1}$ | $L_{2-240}$ |
| Compound 241 | $L_{1-1}$ | $L_{2-241}$ |
| Compound 242 | $L_{1-1}$ | $L_{2-242}$ |
| Compound 243 | $L_{1-1}$ | $L_{2-243}$ |
| Compound 244 | $L_{1-1}$ | $L_{2-244}$ |
| Compound 245 | $L_{1-1}$ | $L_{2-245}$ |
| Compound 246 | $L_{1-1}$ | $L_{2-246}$ |
| Compound 247 | $L_{1-1}$ | $L_{2-247}$ |
| Compound 248 | $L_{1-1}$ | $L_{2-248}$ |
| Compound 249 | $L_{1-1}$ | $L_{2-249}$ |
| Compound 250 | $L_{1-1}$ | $L_{2-250}$ |
| Compound 251 | $L_{1-1}$ | $L_{2-251}$ |
| Compound 252 | $L_{1-1}$ | $L_{2-252}$ |
| Compound 253 | $L_{1-1}$ | $L_{2-253}$ |
| Compound 254 | $L_{1-1}$ | $L_{2-254}$ |
| Compound 255 | $L_{1-1}$ | $L_{2-255}$ |
| Compound 256 | $L_{1-1}$ | $L_{2-256}$ |
| Compound 257 | $L_{1-1}$ | $L_{2-257}$ |
| Compound 258 | $L_{1-1}$ | $L_{2-258}$ |
| Compound 259 | $L_{1-1}$ | $L_{2-259}$ |
| Compound 260 | $L_{1-1}$ | $L_{2-260}$ |
| Compound 261 | $L_{1-1}$ | $L_{2-261}$ |
| Compound 262 | $L_{1-1}$ | $L_{2-262}$ |
| Compound 263 | $L_{1-1}$ | $L_{2-263}$ |
| Compound 264 | $L_{1-1}$ | $L_{2-264}$ |
| Compound 265 | $L_{1-1}$ | $L_{2-265}$ |
| Compound 266 | $L_{1-1}$ | $L_{2-266}$ |
| Compound 267 | $L_{1-1}$ | $L_{2-267}$ |
| Compound 268 | $L_{1-1}$ | $L_{2-268}$ |
| Compound 269 | $L_{1-1}$ | $L_{2-269}$ |
| Compound 270 | $L_{1-1}$ | $L_{2-270}$ |
| Compound 271 | $L_{1-1}$ | $L_{2-271}$ |
| Compound 272 | $L_{1-1}$ | $L_{2-272}$ |
| Compound 273 | $L_{1-1}$ | $L_{2-273}$ |
| Compound 274 | $L_{1-1}$ | $L_{2-274}$ |
| Compound 275 | $L_{1-1}$ | $L_{2-275}$ |
| Compound 276 | $L_{1-1}$ | $L_{2-276}$ |
| Compound 277 | $L_{1-1}$ | $L_{2-277}$ |
| Compound 278 | $L_{1-1}$ | $L_{2-278}$ |
| Compound 279 | $L_{1-1}$ | $L_{2-279}$ |
| Compound 280 | $L_{1-1}$ | $L_{2-280}$ |
| Compound 281 | $L_{1-1}$ | $L_{2-281}$ |
| Compound 282 | $L_{1-1}$ | $L_{2-282}$ |
| Compound 283 | $L_{1-1}$ | $L_{2-283}$ |
| Compound 284 | $L_{1-1}$ | $L_{2-284}$ |
| Compound 285 | $L_{1-1}$ | $L_{2-285}$ |
| Compound 286 | $L_{1-1}$ | $L_{2-286}$ |
| Compound 287 | $L_{1-1}$ | $L_{2-287}$ |
| Compound 288 | $L_{1-1}$ | $L_{2-288}$ |
| Compound 289 | $L_{1-1}$ | $L_{2-289}$ |
| Compound 290 | $L_{1-1}$ | $L_{2-290}$ |
| Compound 291 | $L_{1-1}$ | $L_{2-291}$ |
| Compound 292 | $L_{1-1}$ | $L_{2-292}$ |
| Compound 293 | $L_{1-1}$ | $L_{2-293}$ |
| Compound 294 | $L_{1-1}$ | $L_{2-294}$ |
| Compound 295 | $L_{1-1}$ | $L_{2-295}$ |
| Compound 296 | $L_{1-1}$ | $L_{2-296}$ |
| Compound 297 | $L_{1-1}$ | $L_{2-297}$ |
| Compound 298 | $L_{1-1}$ | $L_{2-298}$ |
| Compound 299 | $L_{1-1}$ | $L_{2-299}$ |
| Compound 300 | $L_{1-1}$ | $L_{2-300}$ |
| Compound 301 | $L_{1-1}$ | $L_{2-301}$ |
| Compound 302 | $L_{1-1}$ | $L_{2-302}$ |
| Compound 303 | $L_{1-1}$ | $L_{2-303}$ |
| Compound 304 | $L_{1-1}$ | $L_{2-304}$ |
| Compound 305 | $L_{1-1}$ | $L_{2-305}$ |
| Compound 306 | $L_{1-1}$ | $L_{2-306}$ |
| Compound 307 | $L_{1-1}$ | $L_{2-307}$ |
| Compound 308 | $L_{1-1}$ | $L_{2-308}$ |
| Compound 309 | $L_{1-1}$ | $L_{2-309}$ |

TABLE 1-continued

| | | |
|---|---|---|
| Compound 310 | $L_{1-1}$ | $L_{2-310}$ |
| Compound 311 | $L_{1-1}$ | $L_{2-311}$ |
| Compound 312 | $L_{1-1}$ | $L_{2-312}$ |
| Compound 313 | $L_{1-1}$ | $L_{2-313}$ |
| Compound 314 | $L_{1-1}$ | $L_{2-314}$ |
| Compound 315 | $L_{1-1}$ | $L_{2-315}$ |
| Compound 316 | $L_{1-1}$ | $L_{2-316}$ |
| Compound 317 | $L_{1-1}$ | $L_{2-317}$ |
| Compound 318 | $L_{1-1}$ | $L_{2-318}$ |
| Compound 319 | $L_{1-1}$ | $L_{2-319}$ |
| Compound 320 | $L_{1-1}$ | $L_{2-320}$ |
| Compound 321 | $L_{1-1}$ | $L_{2-321}$ |
| Compound 322 | $L_{1-1}$ | $L_{2-322}$ |
| Compound 323 | $L_{1-1}$ | $L_{2-323}$ |
| Compound 324 | $L_{1-1}$ | $L_{2-324}$ |
| Compound 325 | $L_{1-1}$ | $L_{2-325}$ |
| Compound 326 | $L_{1-1}$ | $L_{2-326}$ |
| Compound 327 | $L_{1-1}$ | $L_{2-327}$ |
| Compound 328 | $L_{1-1}$ | $L_{2-328}$ |
| Compound 329 | $L_{1-1}$ | $L_{2-329}$ |
| Compound 330 | $L_{1-1}$ | $L_{2-330}$ |
| Compound 331 | $L_{1-1}$ | $L_{2-331}$ |
| Compound 332 | $L_{1-1}$ | $L_{2-332}$ |
| Compound 333 | $L_{1-1}$ | $L_{2-333}$ |
| Compound 334 | $L_{1-1}$ | $L_{2-334}$ |
| Compound 335 | $L_{1-1}$ | $L_{2-335}$ |
| Compound 336 | $L_{1-1}$ | $L_{2-336}$ |
| Compound 337 | $L_{1-1}$ | $L_{2-337}$ |
| Compound 338 | $L_{1-1}$ | $L_{2-338}$ |
| Compound 339 | $L_{1-1}$ | $L_{2-339}$ |
| Compound 340 | $L_{1-1}$ | $L_{2-340}$ |
| Compound 341 | $L_{1-1}$ | $L_{2-341}$ |
| Compound 342 | $L_{1-1}$ | $L_{2-342}$ |
| Compound 343 | $L_{1-1}$ | $L_{2-343}$ |
| Compound 344 | $L_{1-1}$ | $L_{2-344}$ |
| Compound 345 | $L_{1-1}$ | $L_{2-345}$ |
| Compound 346 | $L_{1-1}$ | $L_{2-346}$ |
| Compound 347 | $L_{1-1}$ | $L_{2-347}$ |
| Compound 348 | $L_{1-1}$ | $L_{2-348}$ |
| Compound 349 | $L_{1-1}$ | $L_{2-349}$ |
| Compound 350 | $L_{1-1}$ | $L_{2-350}$ |
| Compound 351 | $L_{1-1}$ | $L_{2-351}$ |
| Compound 352 | $L_{1-1}$ | $L_{2-352}$ |
| Compound 353 | $L_{1-1}$ | $L_{2-353}$ |
| Compound 354 | $L_{1-1}$ | $L_{2-354}$ |
| Compound 355 | $L_{1-1}$ | $L_{2-355}$ |
| Compound 356 | $L_{1-1}$ | $L_{2-356}$ |
| Compound 357 | $L_{1-1}$ | $L_{2-357}$ |
| Compound 358 | $L_{1-1}$ | $L_{2-358}$ |
| Compound 359 | $L_{1-1}$ | $L_{2-359}$ |
| Compound 360 | $L_{1-1}$ | $L_{2-360}$ |
| Compound 361 | $L_{1-1}$ | $L_{2-361}$ |
| Compound 362 | $L_{1-1}$ | $L_{2-362}$ |
| Compound 363 | $L_{1-1}$ | $L_{2-363}$ |
| Compound 364 | $L_{1-1}$ | $L_{2-364}$ |
| Compound 365 | $L_{1-1}$ | $L_{2-365}$ |
| Compound 366 | $L_{1-1}$ | $L_{2-366}$ |
| Compound 367 | $L_{1-1}$ | $L_{2-367}$ |
| Compound 368 | $L_{1-1}$ | $L_{2-368}$ |
| Compound 369 | $L_{1-1}$ | $L_{2-369}$ |
| Compound 370 | $L_{1-1}$ | $L_{2-370}$ |
| Compound 371 | $L_{1-1}$ | $L_{2-371}$ |
| Compound 372 | $L_{1-1}$ | $L_{2-372}$ |
| Compound 373 | $L_{1-1}$ | $L_{2-373}$ |
| Compound 374 | $L_{1-1}$ | $L_{2-374}$ |
| Compound 375 | $L_{1-1}$ | $L_{2-375}$ |
| Compound 376 | $L_{1-1}$ | $L_{2-376}$ |
| Compound 377 | $L_{1-1}$ | $L_{2-377}$ |
| Compound 378 | $L_{1-2}$ | $L_{2-1}$ |
| Compound 379 | $L_{1-2}$ | $L_{2-2}$ |
| Compound 380 | $L_{1-2}$ | $L_{2-3}$ |
| Compound 381 | $L_{1-2}$ | $L_{2-4}$ |
| Compound 382 | $L_{1-2}$ | $L_{2-5}$ |
| Compound 383 | $L_{1-2}$ | $L_{2-6}$ |
| Compound 384 | $L_{1-2}$ | $L_{2-7}$ |
| Compound 385 | $L_{1-2}$ | $L_{2-8}$ |
| Compound 386 | $L_{1-2}$ | $L_{2-9}$ |
| Compound 387 | $L_{1-2}$ | $L_{2-10}$ |
| Compound 388 | $L_{1-2}$ | $L_{2-11}$ |
| Compound 389 | $L_{1-2}$ | $L_{2-12}$ |

TABLE 1-continued

| | | |
|---|---|---|
| Compound 390 | $L_{1-2}$ | $L_{2-13}$ |
| Compound 391 | $L_{1-2}$ | $L_{2-14}$ |
| Compound 392 | $L_{1-2}$ | $L_{2-15}$ |
| Compound 393 | $L_{1-2}$ | $L_{2-16}$ |
| Compound 394 | $L_{1-2}$ | $L_{2-17}$ |
| Compound 395 | $L_{1-2}$ | $L_{2-18}$ |
| Compound 396 | $L_{1-2}$ | $L_{2-19}$ |
| Compound 397 | $L_{1-2}$ | $L_{2-20}$ |
| Compound 398 | $L_{1-2}$ | $L_{2-21}$ |
| Compound 399 | $L_{1-2}$ | $L_{2-22}$ |
| Compound 400 | $L_{1-2}$ | $L_{2-23}$ |
| Compound 401 | $L_{1-2}$ | $L_{2-24}$ |
| Compound 402 | $L_{1-2}$ | $L_{2-25}$ |
| Compound 403 | $L_{1-2}$ | $L_{2-26}$ |
| Compound 404 | $L_{1-2}$ | $L_{2-27}$ |
| Compound 405 | $L_{1-2}$ | $L_{2-28}$ |
| Compound 406 | $L_{1-2}$ | $L_{2-29}$ |
| Compound 407 | $L_{1-2}$ | $L_{2-30}$ |
| Compound 408 | $L_{1-2}$ | $L_{2-31}$ |
| Compound 409 | $L_{1-2}$ | $L_{2-32}$ |
| Compound 410 | $L_{1-2}$ | $L_{2-33}$ |
| Compound 411 | $L_{1-2}$ | $L_{2-34}$ |
| Compound 412 | $L_{1-2}$ | $L_{2-35}$ |
| Compound 413 | $L_{1-2}$ | $L_{2-36}$ |
| Compound 414 | $L_{1-2}$ | $L_{2-37}$ |
| Compound 415 | $L_{1-2}$ | $L_{2-38}$ |
| Compound 416 | $L_{1-2}$ | $L_{2-39}$ |
| Compound 417 | $L_{1-2}$ | $L_{2-40}$ |
| Compound 418 | $L_{1-2}$ | $L_{2-41}$ |
| Compound 419 | $L_{1-2}$ | $L_{2-42}$ |
| Compound 420 | $L_{1-2}$ | $L_{2-43}$ |
| Compound 421 | $L_{1-2}$ | $L_{2-44}$ |
| Compound 422 | $L_{1-2}$ | $L_{2-45}$ |
| Compound 423 | $L_{1-2}$ | $L_{2-46}$ |
| Compound 424 | $L_{1-2}$ | $L_{2-47}$ |
| Compound 425 | $L_{1-2}$ | $L_{2-48}$ |
| Compound 426 | $L_{1-2}$ | $L_{2-49}$ |
| Compound 427 | $L_{1-2}$ | $L_{2-50}$ |
| Compound 428 | $L_{1-2}$ | $L_{2-51}$ |
| Compound 429 | $L_{1-2}$ | $L_{2-52}$ |
| Compound 430 | $L_{1-2}$ | $L_{2-53}$ |
| Compound 431 | $L_{1-2}$ | $L_{2-54}$ |
| Compound 432 | $L_{1-2}$ | $L_{2-55}$ |
| Compound 433 | $L_{1-2}$ | $L_{2-56}$ |
| Compound 434 | $L_{1-2}$ | $L_{2-57}$ |
| Compound 435 | $L_{1-2}$ | $L_{2-58}$ |
| Compound 436 | $L_{1-2}$ | $L_{2-59}$ |
| Compound 437 | $L_{1-2}$ | $L_{2-60}$ |
| Compound 438 | $L_{1-2}$ | $L_{2-61}$ |
| Compound 439 | $L_{1-2}$ | $L_{2-62}$ |
| Compound 440 | $L_{1-2}$ | $L_{2-63}$ |
| Compound 441 | $L_{1-2}$ | $L_{2-64}$ |
| Compound 442 | $L_{1-2}$ | $L_{2-65}$ |
| Compound 443 | $L_{1-2}$ | $L_{2-66}$ |
| Compound 444 | $L_{1-2}$ | $L_{2-67}$ |
| Compound 445 | $L_{1-2}$ | $L_{2-68}$ |
| Compound 446 | $L_{1-2}$ | $L_{2-69}$ |
| Compound 447 | $L_{1-2}$ | $L_{2-70}$ |
| Compound 448 | $L_{1-2}$ | $L_{2-71}$ |
| Compound 449 | $L_{1-2}$ | $L_{2-72}$ |
| Compound 450 | $L_{1-2}$ | $L_{2-73}$ |
| Compound 451 | $L_{1-2}$ | $L_{2-74}$ |
| Compound 452 | $L_{1-2}$ | $L_{2-75}$ |
| Compound 453 | $L_{1-2}$ | $L_{2-76}$ |
| Compound 454 | $L_{1-2}$ | $L_{2-77}$ |
| Compound 455 | $L_{1-2}$ | $L_{2-78}$ |
| Compound 456 | $L_{1-2}$ | $L_{2-79}$ |
| Compound 457 | $L_{1-2}$ | $L_{2-80}$ |
| Compound 458 | $L_{1-2}$ | $L_{2-81}$ |
| Compound 459 | $L_{1-2}$ | $L_{2-82}$ |
| Compound 460 | $L_{1-2}$ | $L_{2-83}$ |
| Compound 461 | $L_{1-2}$ | $L_{2-84}$ |
| Compound 462 | $L_{1-2}$ | $L_{2-85}$ |
| Compound 463 | $L_{1-2}$ | $L_{2-86}$ |
| Compound 464 | $L_{1-2}$ | $L_{2-87}$ |
| Compound 465 | $L_{1-2}$ | $L_{2-88}$ |
| Compound 466 | $L_{1-2}$ | $L_{2-89}$ |
| Compound 467 | $L_{1-2}$ | $L_{2-90}$ |
| Compound 468 | $L_{1-2}$ | $L_{2-91}$ |
| Compound 469 | $L_{1-2}$ | $L_{2-92}$ |

TABLE 1-continued

| | | |
|---|---|---|
| Compound 470 | $L_{1-2}$ | $L_{2-93}$ |
| Compound 471 | $L_{1-2}$ | $L_{2-94}$ |
| Compound 472 | $L_{1-2}$ | $L_{2-95}$ |
| Compound 473 | $L_{1-2}$ | $L_{2-96}$ |
| Compound 474 | $L_{1-2}$ | $L_{2-97}$ |
| Compound 475 | $L_{1-2}$ | $L_{2-98}$ |
| Compound 476 | $L_{1-2}$ | $L_{2-99}$ |
| Compound 477 | $L_{1-2}$ | $L_{2-100}$ |
| Compound 478 | $L_{1-2}$ | $L_{2-101}$ |
| Compound 479 | $L_{1-2}$ | $L_{2-102}$ |
| Compound 480 | $L_{1-2}$ | $L_{2-103}$ |
| Compound 481 | $L_{1-2}$ | $L_{2-104}$ |
| Compound 482 | $L_{1-2}$ | $L_{2-105}$ |
| Compound 483 | $L_{1-2}$ | $L_{2-106}$ |
| Compound 484 | $L_{1-2}$ | $L_{2-107}$ |
| Compound 485 | $L_{1-2}$ | $L_{2-108}$ |
| Compound 486 | $L_{1-2}$ | $L_{2-109}$ |
| Compound 487 | $L_{1-2}$ | $L_{2-110}$ |
| Compound 488 | $L_{1-2}$ | $L_{2-111}$ |
| Compound 489 | $L_{1-2}$ | $L_{2-112}$ |
| Compound 490 | $L_{1-2}$ | $L_{2-113}$ |
| Compound 491 | $L_{1-2}$ | $L_{2-114}$ |
| Compound 492 | $L_{1-2}$ | $L_{2-115}$ |
| Compound 493 | $L_{1-2}$ | $L_{2-116}$ |
| Compound 494 | $L_{1-2}$ | $L_{2-117}$ |
| Compound 495 | $L_{1-2}$ | $L_{2-118}$ |
| Compound 496 | $L_{1-2}$ | $L_{2-119}$ |
| Compound 497 | $L_{1-2}$ | $L_{2-120}$ |
| Compound 498 | $L_{1-2}$ | $L_{2-121}$ |
| Compound 499 | $L_{1-2}$ | $L_{2-122}$ |
| Compound 500 | $L_{1-2}$ | $L_{2-123}$ |
| Compound 501 | $L_{1-2}$ | $L_{2-124}$ |
| Compound 502 | $L_{1-2}$ | $L_{2-125}$ |
| Compound 503 | $L_{1-2}$ | $L_{2-126}$ |
| Compound 504 | $L_{1-2}$ | $L_{2-127}$ |
| Compound 505 | $L_{1-2}$ | $L_{2-128}$ |
| Compound 506 | $L_{1-2}$ | $L_{2-129}$ |
| Compound 507 | $L_{1-2}$ | $L_{2-130}$ |
| Compound 508 | $L_{1-2}$ | $L_{2-131}$ |
| Compound 509 | $L_{1-2}$ | $L_{2-132}$ |
| Compound 510 | $L_{1-2}$ | $L_{2-133}$ |
| Compound 511 | $L_{1-2}$ | $L_{2-134}$ |
| Compound 512 | $L_{1-2}$ | $L_{2-135}$ |
| Compound 513 | $L_{1-2}$ | $L_{2-136}$ |
| Compound 514 | $L_{1-2}$ | $L_{2-137}$ |
| Compound 515 | $L_{1-2}$ | $L_{2-138}$ |
| Compound 516 | $L_{1-2}$ | $L_{2-139}$ |
| Compound 517 | $L_{1-2}$ | $L_{2-140}$ |
| Compound 518 | $L_{1-2}$ | $L_{2-141}$ |
| Compound 519 | $L_{1-2}$ | $L_{2-142}$ |
| Compound 520 | $L_{1-2}$ | $L_{2-143}$ |
| Compound 521 | $L_{1-2}$ | $L_{2-144}$ |
| Compound 522 | $L_{1-2}$ | $L_{2-145}$ |
| Compound 523 | $L_{1-2}$ | $L_{2-146}$ |
| Compound 524 | $L_{1-2}$ | $L_{2-147}$ |
| Compound 525 | $L_{1-2}$ | $L_{2-148}$ |
| Compound 526 | $L_{1-2}$ | $L_{2-149}$ |
| Compound 527 | $L_{1-2}$ | $L_{2-150}$ |
| Compound 528 | $L_{1-2}$ | $L_{2-151}$ |
| Compound 529 | $L_{1-2}$ | $L_{2-152}$ |
| Compound 530 | $L_{1-2}$ | $L_{2-153}$ |
| Compound 531 | $L_{1-2}$ | $L_{2-154}$ |
| Compound 532 | $L_{1-2}$ | $L_{2-155}$ |
| Compound 533 | $L_{1-2}$ | $L_{2-156}$ |
| Compound 534 | $L_{1-2}$ | $L_{2-157}$ |
| Compound 535 | $L_{1-2}$ | $L_{2-158}$ |
| Compound 536 | $L_{1-2}$ | $L_{2-159}$ |
| Compound 537 | $L_{1-2}$ | $L_{2-160}$ |
| Compound 538 | $L_{1-2}$ | $L_{2-161}$ |
| Compound 539 | $L_{1-2}$ | $L_{2-162}$ |
| Compound 540 | $L_{1-2}$ | $L_{2-163}$ |
| Compound 541 | $L_{1-2}$ | $L_{2-164}$ |
| Compound 542 | $L_{1-2}$ | $L_{2-165}$ |
| Compound 543 | $L_{1-2}$ | $L_{2-166}$ |
| Compound 544 | $L_{1-2}$ | $L_{2-167}$ |
| Compound 545 | $L_{1-2}$ | $L_{2-168}$ |
| Compound 546 | $L_{1-2}$ | $L_{2-169}$ |
| Compound 547 | $L_{1-2}$ | $L_{2-170}$ |
| Compound 548 | $L_{1-2}$ | $L_{2-171}$ |
| Compound 549 | $L_{1-2}$ | $L_{2-172}$ |

TABLE 1-continued

| | | |
|---|---|---|
| Compound 550 | $L_{1-2}$ | $L_{2-173}$ |
| Compound 551 | $L_{1-2}$ | $L_{2-174}$ |
| Compound 552 | $L_{1-2}$ | $L_{2-175}$ |
| Compound 553 | $L_{1-2}$ | $L_{2-176}$ |
| Compound 554 | $L_{1-2}$ | $L_{2-177}$ |
| Compound 555 | $L_{1-2}$ | $L_{2-178}$ |
| Compound 556 | $L_{1-2}$ | $L_{2-179}$ |
| Compound 557 | $L_{1-2}$ | $L_{2-180}$ |
| Compound 558 | $L_{1-2}$ | $L_{2-181}$ |
| Compound 559 | $L_{1-2}$ | $L_{2-182}$ |
| Compound 560 | $L_{1-2}$ | $L_{2-183}$ |
| Compound 561 | $L_{1-2}$ | $L_{2-184}$ |
| Compound 562 | $L_{1-2}$ | $L_{2-185}$ |
| Compound 563 | $L_{1-2}$ | $L_{2-186}$ |
| Compound 564 | $L_{1-2}$ | $L_{2-187}$ |
| Compound 565 | $L_{1-2}$ | $L_{2-188}$ |
| Compound 566 | $L_{1-2}$ | $L_{2-189}$ |
| Compound 567 | $L_{1-2}$ | $L_{2-190}$ |
| Compound 568 | $L_{1-2}$ | $L_{2-191}$ |
| Compound 569 | $L_{1-2}$ | $L_{2-192}$ |
| Compound 570 | $L_{1-2}$ | $L_{2-193}$ |
| Compound 571 | $L_{1-2}$ | $L_{2-194}$ |
| Compound 572 | $L_{1-2}$ | $L_{2-195}$ |
| Compound 573 | $L_{1-2}$ | $L_{2-196}$ |
| Compound 574 | $L_{1-2}$ | $L_{2-197}$ |
| Compound 575 | $L_{1-2}$ | $L_{2-198}$ |
| Compound 576 | $L_{1-2}$ | $L_{2-199}$ |
| Compound 577 | $L_{1-2}$ | $L_{2-200}$ |
| Compound 578 | $L_{1-2}$ | $L_{2-201}$ |
| Compound 579 | $L_{1-2}$ | $L_{2-202}$ |
| Compound 580 | $L_{1-2}$ | $L_{2-203}$ |
| Compound 581 | $L_{1-2}$ | $L_{2-204}$ |
| Compound 582 | $L_{1-2}$ | $L_{2-205}$ |
| Compound 583 | $L_{1-2}$ | $L_{2-206}$ |
| Compound 584 | $L_{1-2}$ | $L_{2-207}$ |
| Compound 585 | $L_{1-2}$ | $L_{2-208}$ |
| Compound 586 | $L_{1-2}$ | $L_{2-209}$ |
| Compound 587 | $L_{1-2}$ | $L_{2-210}$ |
| Compound 588 | $L_{1-2}$ | $L_{2-211}$ |
| Compound 589 | $L_{1-2}$ | $L_{2-212}$ |
| Compound 590 | $L_{1-2}$ | $L_{2-213}$ |
| Compound 591 | $L_{1-2}$ | $L_{2-214}$ |
| Compound 592 | $L_{1-2}$ | $L_{2-215}$ |
| Compound 593 | $L_{1-2}$ | $L_{2-216}$ |
| Compound 594 | $L_{1-2}$ | $L_{2-217}$ |
| Compound 595 | $L_{1-2}$ | $L_{2-218}$ |
| Compound 596 | $L_{1-2}$ | $L_{2-219}$ |
| Compound 597 | $L_{1-2}$ | $L_{2-220}$ |
| Compound 598 | $L_{1-2}$ | $L_{2-221}$ |
| Compound 599 | $L_{1-2}$ | $L_{2-222}$ |
| Compound 600 | $L_{1-2}$ | $L_{2-223}$ |
| Compound 601 | $L_{1-2}$ | $L_{2-224}$ |
| Compound 602 | $L_{1-2}$ | $L_{2-225}$ |
| Compound 603 | $L_{1-2}$ | $L_{2-226}$ |
| Compound 604 | $L_{1-2}$ | $L_{2-227}$ |
| Compound 605 | $L_{1-2}$ | $L_{2-228}$ |
| Compound 606 | $L_{1-2}$ | $L_{2-229}$ |
| Compound 607 | $L_{1-2}$ | $L_{2-230}$ |
| Compound 608 | $L_{1-2}$ | $L_{2-231}$ |
| Compound 609 | $L_{1-2}$ | $L_{2-232}$ |
| Compound 610 | $L_{1-2}$ | $L_{2-233}$ |
| Compound 611 | $L_{1-2}$ | $L_{2-234}$ |
| Compound 612 | $L_{1-2}$ | $L_{2-235}$ |
| Compound 613 | $L_{1-2}$ | $L_{2-236}$ |
| Compound 614 | $L_{1-2}$ | $L_{2-237}$ |
| Compound 615 | $L_{1-2}$ | $L_{2-238}$ |
| Compound 616 | $L_{1-2}$ | $L_{2-239}$ |
| Compound 617 | $L_{1-2}$ | $L_{2-240}$ |
| Compound 618 | $L_{1-2}$ | $L_{2-241}$ |
| Compound 619 | $L_{1-2}$ | $L_{2-242}$ |
| Compound 620 | $L_{1-2}$ | $L_{2-243}$ |
| Compound 621 | $L_{1-2}$ | $L_{2-244}$ |
| Compound 622 | $L_{1-2}$ | $L_{2-245}$ |
| Compound 623 | $L_{1-2}$ | $L_{2-246}$ |
| Compound 624 | $L_{1-2}$ | $L_{2-247}$ |
| Compound 625 | $L_{1-2}$ | $L_{2-248}$ |
| Compound 626 | $L_{1-2}$ | $L_{2-249}$ |
| Compound 627 | $L_{1-2}$ | $L_{2-250}$ |
| Compound 628 | $L_{1-2}$ | $L_{2-251}$ |
| Compound 629 | $L_{1-2}$ | $L_{2-252}$ |

TABLE 1-continued

| | | |
|---|---|---|
| Compound 630 | $L_{1-2}$ | $L_{2-253}$ |
| Compound 631 | $L_{1-2}$ | $L_{2-254}$ |
| Compound 632 | $L_{1-2}$ | $L_{2-255}$ |
| Compound 633 | $L_{1-2}$ | $L_{2-256}$ |
| Compound 634 | $L_{1-2}$ | $L_{2-257}$ |
| Compound 635 | $L_{1-2}$ | $L_{2-258}$ |
| Compound 636 | $L_{1-2}$ | $L_{2-259}$ |
| Compound 637 | $L_{1-2}$ | $L_{2-260}$ |
| Compound 638 | $L_{1-2}$ | $L_{2-261}$ |
| Compound 639 | $L_{1-2}$ | $L_{2-262}$ |
| Compound 640 | $L_{1-2}$ | $L_{2-263}$ |
| Compound 641 | $L_{1-2}$ | $L_{2-264}$ |
| Compound 642 | $L_{1-2}$ | $L_{2-265}$ |
| Compound 643 | $L_{1-2}$ | $L_{2-266}$ |
| Compound 644 | $L_{1-2}$ | $L_{2-267}$ |
| Compound 645 | $L_{1-2}$ | $L_{2-268}$ |
| Compound 646 | $L_{1-2}$ | $L_{2-269}$ |
| Compound 647 | $L_{1-2}$ | $L_{2-270}$ |
| Compound 648 | $L_{1-2}$ | $L_{2-271}$ |
| Compound 649 | $L_{1-2}$ | $L_{2-272}$ |
| Compound 650 | $L_{1-2}$ | $L_{2-273}$ |
| Compound 651 | $L_{1-2}$ | $L_{2-274}$ |
| Compound 652 | $L_{1-2}$ | $L_{2-275}$ |
| Compound 653 | $L_{1-2}$ | $L_{2-276}$ |
| Compound 654 | $L_{1-2}$ | $L_{2-277}$ |
| Compound 655 | $L_{1-2}$ | $L_{2-278}$ |
| Compound 656 | $L_{1-2}$ | $L_{2-279}$ |
| Compound 657 | $L_{1-2}$ | $L_{2-280}$ |
| Compound 658 | $L_{1-2}$ | $L_{2-281}$ |
| Compound 659 | $L_{1-2}$ | $L_{2-282}$ |
| Compound 660 | $L_{1-2}$ | $L_{2-283}$ |
| Compound 661 | $L_{1-2}$ | $L_{2-284}$ |
| Compound 662 | $L_{1-2}$ | $L_{2-285}$ |
| Compound 663 | $L_{1-2}$ | $L_{2-286}$ |
| Compound 664 | $L_{1-2}$ | $L_{2-287}$ |
| Compound 665 | $L_{1-2}$ | $L_{2-288}$ |
| Compound 666 | $L_{1-2}$ | $L_{2-289}$ |
| Compound 667 | $L_{1-2}$ | $L_{2-290}$ |
| Compound 668 | $L_{1-2}$ | $L_{2-291}$ |
| Compound 669 | $L_{1-2}$ | $L_{2-292}$ |
| Compound 670 | $L_{1-2}$ | $L_{2-293}$ |
| Compound 671 | $L_{1-2}$ | $L_{2-294}$ |
| Compound 672 | $L_{1-2}$ | $L_{2-295}$ |
| Compound 673 | $L_{1-2}$ | $L_{2-296}$ |
| Compound 674 | $L_{1-2}$ | $L_{2-297}$ |
| Compound 675 | $L_{1-2}$ | $L_{2-298}$ |
| Compound 676 | $L_{1-2}$ | $L_{2-299}$ |
| Compound 677 | $L_{1-2}$ | $L_{2-300}$ |
| Compound 678 | $L_{1-2}$ | $L_{2-301}$ |
| Compound 679 | $L_{1-2}$ | $L_{2-302}$ |
| Compound 680 | $L_{1-2}$ | $L_{2-303}$ |
| Compound 681 | $L_{1-2}$ | $L_{2-304}$ |
| Compound 682 | $L_{1-2}$ | $L_{2-305}$ |
| Compound 683 | $L_{1-2}$ | $L_{2-306}$ |
| Compound 684 | $L_{1-2}$ | $L_{2-307}$ |
| Compound 685 | $L_{1-2}$ | $L_{2-308}$ |
| Compound 686 | $L_{1-2}$ | $L_{2-309}$ |
| Compound 687 | $L_{1-2}$ | $L_{2-310}$ |
| Compound 688 | $L_{1-2}$ | $L_{2-311}$ |
| Compound 689 | $L_{1-2}$ | $L_{2-312}$ |
| Compound 690 | $L_{1-2}$ | $L_{2-313}$ |
| Compound 691 | $L_{1-2}$ | $L_{2-314}$ |
| Compound 692 | $L_{1-2}$ | $L_{2-315}$ |
| Compound 693 | $L_{1-2}$ | $L_{2-316}$ |
| Compound 694 | $L_{1-2}$ | $L_{2-317}$ |
| Compound 695 | $L_{1-2}$ | $L_{2-318}$ |
| Compound 696 | $L_{1-2}$ | $L_{2-319}$ |
| Compound 697 | $L_{1-2}$ | $L_{2-320}$ |
| Compound 698 | $L_{1-2}$ | $L_{2-321}$ |
| Compound 699 | $L_{1-2}$ | $L_{2-322}$ |
| Compound 700 | $L_{1-2}$ | $L_{2-323}$ |
| Compound 701 | $L_{1-2}$ | $L_{2-324}$ |
| Compound 702 | $L_{1-2}$ | $L_{2-325}$ |
| Compound 703 | $L_{1-2}$ | $L_{2-326}$ |
| Compound 704 | $L_{1-2}$ | $L_{2-327}$ |
| Compound 705 | $L_{1-2}$ | $L_{2-328}$ |
| Compound 706 | $L_{1-2}$ | $L_{2-329}$ |
| Compound 707 | $L_{1-2}$ | $L_{2-330}$ |
| Compound 708 | $L_{1-2}$ | $L_{2-331}$ |
| Compound 709 | $L_{1-2}$ | $L_{2-332}$ |

TABLE 1-continued

| | | |
|---|---|---|
| Compound 710 | $L_{1-2}$ | $L_{2-333}$ |
| Compound 711 | $L_{1-2}$ | $L_{2-334}$ |
| Compound 712 | $L_{1-2}$ | $L_{2-335}$ |
| Compound 713 | $L_{1-2}$ | $L_{2-336}$ |
| Compound 714 | $L_{1-2}$ | $L_{2-337}$ |
| Compound 715 | $L_{1-2}$ | $L_{2-338}$ |
| Compound 716 | $L_{1-2}$ | $L_{2-339}$ |
| Compound 717 | $L_{1-2}$ | $L_{2-340}$ |
| Compound 718 | $L_{1-2}$ | $L_{2-341}$ |
| Compound 719 | $L_{1-2}$ | $L_{2-342}$ |
| Compound 720 | $L_{1-2}$ | $L_{2-343}$ |
| Compound 721 | $L_{1-2}$ | $L_{2-344}$ |
| Compound 722 | $L_{1-2}$ | $L_{2-345}$ |
| Compound 723 | $L_{1-2}$ | $L_{2-346}$ |
| Compound 724 | $L_{1-2}$ | $L_{2-347}$ |
| Compound 725 | $L_{1-2}$ | $L_{2-348}$ |
| Compound 726 | $L_{1-2}$ | $L_{2-349}$ |
| Compound 727 | $L_{1-2}$ | $L_{2-350}$ |
| Compound 728 | $L_{1-2}$ | $L_{2-351}$ |
| Compound 729 | $L_{1-2}$ | $L_{2-352}$ |
| Compound 730 | $L_{1-2}$ | $L_{2-353}$ |
| Compound 731 | $L_{1-2}$ | $L_{2-354}$ |
| Compound 732 | $L_{1-2}$ | $L_{2-355}$ |
| Compound 733 | $L_{1-2}$ | $L_{2-356}$ |
| Compound 734 | $L_{1-2}$ | $L_{2-357}$ |
| Compound 735 | $L_{1-2}$ | $L_{2-358}$ |
| Compound 736 | $L_{1-2}$ | $L_{2-359}$ |
| Compound 737 | $L_{1-2}$ | $L_{2-360}$ |
| Compound 738 | $L_{1-2}$ | $L_{2-361}$ |
| Compound 739 | $L_{1-2}$ | $L_{2-362}$ |
| Compound 740 | $L_{1-2}$ | $L_{2-363}$ |
| Compound 741 | $L_{1-2}$ | $L_{2-364}$ |
| Compound 742 | $L_{1-2}$ | $L_{2-365}$ |
| Compound 743 | $L_{1-2}$ | $L_{2-366}$ |
| Compound 744 | $L_{1-2}$ | $L_{2-367}$ |
| Compound 745 | $L_{1-2}$ | $L_{2-368}$ |
| Compound 746 | $L_{1-2}$ | $L_{2-369}$ |
| Compound 747 | $L_{1-2}$ | $L_{2-370}$ |
| Compound 748 | $L_{1-2}$ | $L_{2-371}$ |
| Compound 749 | $L_{1-2}$ | $L_{2-372}$ |
| Compound 750 | $L_{1-2}$ | $L_{2-373}$ |
| Compound 751 | $L_{1-2}$ | $L_{2-374}$ |
| Compound 752 | $L_{1-2}$ | $L_{2-375}$ |
| Compound 753 | $L_{1-2}$ | $L_{2-376}$ |
| Compound 754 | $L_{1-2}$ | $L_{2-377}$ |
| Compound 755 | $L_{1-3}$ | $L_{2-1}$ |
| Compound 756 | $L_{1-3}$ | $L_{2-2}$ |
| Compound 757 | $L_{1-3}$ | $L_{2-3}$ |
| Compound 758 | $L_{1-3}$ | $L_{2-4}$ |
| Compound 759 | $L_{1-3}$ | $L_{2-5}$ |
| Compound 760 | $L_{1-3}$ | $L_{2-6}$ |
| Compound 761 | $L_{1-3}$ | $L_{2-7}$ |
| Compound 762 | $L_{1-3}$ | $L_{2-8}$ |
| Compound 763 | $L_{1-3}$ | $L_{2-9}$ |
| Compound 764 | $L_{1-3}$ | $L_{2-10}$ |
| Compound 765 | $L_{1-3}$ | $L_{2-11}$ |
| Compound 766 | $L_{1-3}$ | $L_{2-12}$ |
| Compound 767 | $L_{1-3}$ | $L_{2-13}$ |
| Compound 768 | $L_{1-3}$ | $L_{2-14}$ |
| Compound 769 | $L_{1-3}$ | $L_{2-15}$ |
| Compound 770 | $L_{1-3}$ | $L_{2-16}$ |
| Compound 771 | $L_{1-3}$ | $L_{2-17}$ |
| Compound 772 | $L_{1-3}$ | $L_{2-18}$ |
| Compound 773 | $L_{1-3}$ | $L_{2-19}$ |
| Compound 774 | $L_{1-3}$ | $L_{2-20}$ |
| Compound 775 | $L_{1-3}$ | $L_{2-21}$ |
| Compound 776 | $L_{1-3}$ | $L_{2-22}$ |
| Compound 777 | $L_{1-3}$ | $L_{2-23}$ |
| Compound 778 | $L_{1-3}$ | $L_{2-24}$ |
| Compound 779 | $L_{1-3}$ | $L_{2-25}$ |
| Compound 780 | $L_{1-3}$ | $L_{2-26}$ |
| Compound 781 | $L_{1-3}$ | $L_{2-27}$ |
| Compound 782 | $L_{1-3}$ | $L_{2-28}$ |
| Compound 783 | $L_{1-3}$ | $L_{2-29}$ |
| Compound 784 | $L_{1-3}$ | $L_{2-30}$ |
| Compound 785 | $L_{1-3}$ | $L_{2-31}$ |
| Compound 786 | $L_{1-3}$ | $L_{2-32}$ |
| Compound 787 | $L_{1-3}$ | $L_{2-33}$ |
| Compound 788 | $L_{1-3}$ | $L_{2-34}$ |
| Compound 789 | $L_{1-3}$ | $L_{2-35}$ |

TABLE 1-continued

| | | |
|---|---|---|
| Compound 790 | $L_{1-3}$ | $L_{2-36}$ |
| Compound 791 | $L_{1-3}$ | $L_{2-37}$ |
| Compound 792 | $L_{1-3}$ | $L_{2-38}$ |
| Compound 793 | $L_{1-3}$ | $L_{2-39}$ |
| Compound 794 | $L_{1-3}$ | $L_{2-40}$ |
| Compound 795 | $L_{1-3}$ | $L_{2-41}$ |
| Compound 796 | $L_{1-3}$ | $L_{2-42}$ |
| Compound 797 | $L_{1-3}$ | $L_{2-43}$ |
| Compound 798 | $L_{1-3}$ | $L_{2-44}$ |
| Compound 799 | $L_{1-3}$ | $L_{2-45}$ |
| Compound 800 | $L_{1-3}$ | $L_{2-46}$ |
| Compound 801 | $L_{1-3}$ | $L_{2-47}$ |
| Compound 802 | $L_{1-3}$ | $L_{2-48}$ |
| Compound 803 | $L_{1-3}$ | $L_{2-49}$ |
| Compound 804 | $L_{1-3}$ | $L_{2-50}$ |
| Compound 805 | $L_{1-3}$ | $L_{2-51}$ |
| Compound 806 | $L_{1-3}$ | $L_{2-52}$ |
| Compound 807 | $L_{1-3}$ | $L_{2-53}$ |
| Compound 808 | $L_{1-3}$ | $L_{2-54}$ |
| Compound 809 | $L_{1-3}$ | $L_{2-55}$ |
| Compound 810 | $L_{1-3}$ | $L_{2-56}$ |
| Compound 811 | $L_{1-3}$ | $L_{2-57}$ |
| Compound 812 | $L_{1-3}$ | $L_{2-58}$ |
| Compound 813 | $L_{1-3}$ | $L_{2-59}$ |
| Compound 814 | $L_{1-3}$ | $L_{2-60}$ |
| Compound 815 | $L_{1-3}$ | $L_{2-61}$ |
| Compound 816 | $L_{1-3}$ | $L_{2-62}$ |
| Compound 817 | $L_{1-3}$ | $L_{2-63}$ |
| Compound 818 | $L_{1-3}$ | $L_{2-64}$ |
| Compound 819 | $L_{1-3}$ | $L_{2-65}$ |
| Compound 820 | $L_{1-3}$ | $L_{2-66}$ |
| Compound 821 | $L_{1-3}$ | $L_{2-67}$ |
| Compound 822 | $L_{1-3}$ | $L_{2-68}$ |
| Compound 823 | $L_{1-3}$ | $L_{2-69}$ |
| Compound 824 | $L_{1-3}$ | $L_{2-70}$ |
| Compound 825 | $L_{1-3}$ | $L_{2-71}$ |
| Compound 826 | $L_{1-3}$ | $L_{2-72}$ |
| Compound 827 | $L_{1-3}$ | $L_{2-73}$ |
| Compound 828 | $L_{1-3}$ | $L_{2-74}$ |
| Compound 829 | $L_{1-3}$ | $L_{2-75}$ |
| Compound 830 | $L_{1-3}$ | $L_{2-76}$ |
| Compound 831 | $L_{1-3}$ | $L_{2-77}$ |
| Compound 832 | $L_{1-3}$ | $L_{2-78}$ |
| Compound 833 | $L_{1-3}$ | $L_{2-79}$ |
| Compound 834 | $L_{1-3}$ | $L_{2-80}$ |
| Compound 835 | $L_{1-3}$ | $L_{2-81}$ |
| Compound 836 | $L_{1-3}$ | $L_{2-82}$ |
| Compound 837 | $L_{1-3}$ | $L_{2-83}$ |
| Compound 838 | $L_{1-3}$ | $L_{2-84}$ |
| Compound 839 | $L_{1-3}$ | $L_{2-85}$ |
| Compound 840 | $L_{1-3}$ | $L_{2-86}$ |
| Compound 841 | $L_{1-3}$ | $L_{2-87}$ |
| Compound 842 | $L_{1-3}$ | $L_{2-88}$ |
| Compound 843 | $L_{1-3}$ | $L_{2-89}$ |
| Compound 844 | $L_{1-3}$ | $L_{2-90}$ |
| Compound 845 | $L_{1-3}$ | $L_{2-91}$ |
| Compound 846 | $L_{1-3}$ | $L_{2-92}$ |
| Compound 847 | $L_{1-3}$ | $L_{2-93}$ |
| Compound 848 | $L_{1-3}$ | $L_{2-94}$ |
| Compound 849 | $L_{1-3}$ | $L_{2-95}$ |
| Compound 850 | $L_{1-3}$ | $L_{2-96}$ |
| Compound 851 | $L_{1-3}$ | $L_{2-97}$ |
| Compound 852 | $L_{1-3}$ | $L_{2-98}$ |
| Compound 853 | $L_{1-3}$ | $L_{2-99}$ |
| Compound 854 | $L_{1-3}$ | $L_{2-100}$ |
| Compound 855 | $L_{1-3}$ | $L_{2-101}$ |
| Compound 856 | $L_{1-3}$ | $L_{2-102}$ |
| Compound 857 | $L_{1-3}$ | $L_{2-103}$ |
| Compound 858 | $L_{1-3}$ | $L_{2-104}$ |
| Compound 859 | $L_{1-3}$ | $L_{2-105}$ |
| Compound 860 | $L_{1-3}$ | $L_{2-106}$ |
| Compound 861 | $L_{1-3}$ | $L_{2-107}$ |
| Compound 862 | $L_{1-3}$ | $L_{2-108}$ |
| Compound 863 | $L_{1-3}$ | $L_{2-109}$ |
| Compound 864 | $L_{1-3}$ | $L_{2-110}$ |
| Compound 865 | $L_{1-3}$ | $L_{2-111}$ |
| Compound 866 | $L_{1-3}$ | $L_{2-112}$ |
| Compound 867 | $L_{1-3}$ | $L_{2-113}$ |
| Compound 868 | $L_{1-3}$ | $L_{2-114}$ |
| Compound 869 | $L_{1-3}$ | $L_{2-115}$ |

TABLE 1-continued

| | | |
|---|---|---|
| Compound 870 | $L_{1-3}$ | $L_{2-116}$ |
| Compound 871 | $L_{1-3}$ | $L_{2-117}$ |
| Compound 872 | $L_{1-3}$ | $L_{2-118}$ |
| Compound 873 | $L_{1-3}$ | $L_{2-119}$ |
| Compound 874 | $L_{1-3}$ | $L_{2-120}$ |
| Compound 875 | $L_{1-3}$ | $L_{2-121}$ |
| Compound 876 | $L_{1-3}$ | $L_{2-122}$ |
| Compound 877 | $L_{1-3}$ | $L_{2-123}$ |
| Compound 878 | $L_{1-3}$ | $L_{2-124}$ |
| Compound 879 | $L_{1-3}$ | $L_{2-125}$ |
| Compound 880 | $L_{1-3}$ | $L_{2-126}$ |
| Compound 881 | $L_{1-3}$ | $L_{2-127}$ |
| Compound 882 | $L_{1-3}$ | $L_{2-128}$ |
| Compound 883 | $L_{1-3}$ | $L_{2-129}$ |
| Compound 884 | $L_{1-3}$ | $L_{2-130}$ |
| Compound 885 | $L_{1-3}$ | $L_{2-131}$ |
| Compound 886 | $L_{1-3}$ | $L_{2-132}$ |
| Compound 887 | $L_{1-3}$ | $L_{2-133}$ |
| Compound 888 | $L_{1-3}$ | $L_{2-134}$ |
| Compound 889 | $L_{1-3}$ | $L_{2-135}$ |
| Compound 890 | $L_{1-3}$ | $L_{2-136}$ |
| Compound 891 | $L_{1-3}$ | $L_{2-137}$ |
| Compound 892 | $L_{1-3}$ | $L_{2-138}$ |
| Compound 893 | $L_{1-3}$ | $L_{2-139}$ |
| Compound 894 | $L_{1-3}$ | $L_{2-140}$ |
| Compound 895 | $L_{1-3}$ | $L_{2-141}$ |
| Compound 896 | $L_{1-3}$ | $L_{2-142}$ |
| Compound 897 | $L_{1-3}$ | $L_{2-143}$ |
| Compound 898 | $L_{1-3}$ | $L_{2-144}$ |
| Compound 899 | $L_{1-3}$ | $L_{2-145}$ |
| Compound 900 | $L_{1-3}$ | $L_{2-146}$ |
| Compound 901 | $L_{1-3}$ | $L_{2-147}$ |
| Compound 902 | $L_{1-3}$ | $L_{2-148}$ |
| Compound 903 | $L_{1-3}$ | $L_{2-149}$ |
| Compound 904 | $L_{1-3}$ | $L_{2-150}$ |
| Compound 905 | $L_{1-3}$ | $L_{2-151}$ |
| Compound 906 | $L_{1-3}$ | $L_{2-152}$ |
| Compound 907 | $L_{1-3}$ | $L_{2-153}$ |
| Compound 908 | $L_{1-3}$ | $L_{2-154}$ |
| Compound 909 | $L_{1-3}$ | $L_{2-155}$ |
| Compound 910 | $L_{1-3}$ | $L_{2-156}$ |
| Compound 911 | $L_{1-3}$ | $L_{2-157}$ |
| Compound 912 | $L_{1-3}$ | $L_{2-158}$ |
| Compound 913 | $L_{1-3}$ | $L_{2-159}$ |
| Compound 914 | $L_{1-3}$ | $L_{2-160}$ |
| Compound 915 | $L_{1-3}$ | $L_{2-161}$ |
| Compound 916 | $L_{1-3}$ | $L_{2-162}$ |
| Compound 917 | $L_{1-3}$ | $L_{2-163}$ |
| Compound 918 | $L_{1-3}$ | $L_{2-164}$ |
| Compound 919 | $L_{1-3}$ | $L_{2-165}$ |
| Compound 920 | $L_{1-3}$ | $L_{2-166}$ |
| Compound 921 | $L_{1-3}$ | $L_{2-167}$ |
| Compound 922 | $L_{1-3}$ | $L_{2-168}$ |
| Compound 923 | $L_{1-3}$ | $L_{2-169}$ |
| Compound 924 | $L_{1-3}$ | $L_{2-170}$ |
| Compound 925 | $L_{1-3}$ | $L_{2-171}$ |
| Compound 926 | $L_{1-3}$ | $L_{2-172}$ |
| Compound 927 | $L_{1-3}$ | $L_{2-173}$ |
| Compound 928 | $L_{1-3}$ | $L_{2-174}$ |
| Compound 929 | $L_{1-3}$ | $L_{2-175}$ |
| Compound 930 | $L_{1-3}$ | $L_{2-176}$ |
| Compound 931 | $L_{1-3}$ | $L_{2-177}$ |
| Compound 932 | $L_{1-3}$ | $L_{2-178}$ |
| Compound 933 | $L_{1-3}$ | $L_{2-179}$ |
| Compound 934 | $L_{1-3}$ | $L_{2-180}$ |
| Compound 935 | $L_{1-3}$ | $L_{2-181}$ |
| Compound 936 | $L_{1-3}$ | $L_{2-182}$ |
| Compound 937 | $L_{1-3}$ | $L_{2-183}$ |
| Compound 938 | $L_{1-3}$ | $L_{2-184}$ |
| Compound 939 | $L_{1-3}$ | $L_{2-185}$ |
| Compound 940 | $L_{1-3}$ | $L_{2-186}$ |
| Compound 941 | $L_{1-3}$ | $L_{2-187}$ |
| Compound 942 | $L_{1-3}$ | $L_{2-188}$ |
| Compound 943 | $L_{1-3}$ | $L_{2-189}$ |
| Compound 944 | $L_{1-3}$ | $L_{2-190}$ |
| Compound 945 | $L_{1-3}$ | $L_{2-191}$ |
| Compound 946 | $L_{1-3}$ | $L_{2-192}$ |
| Compound 947 | $L_{1-3}$ | $L_{2-193}$ |
| Compound 948 | $L_{1-3}$ | $L_{2-194}$ |
| Compound 949 | $L_{1-3}$ | $L_{2-195}$ |

TABLE 1-continued

| | | |
|---|---|---|
| Compound 950 | $L_{1-3}$ | $L_{2-196}$ |
| Compound 951 | $L_{1-3}$ | $L_{2-197}$ |
| Compound 952 | $L_{1-3}$ | $L_{2-198}$ |
| Compound 953 | $L_{1-3}$ | $L_{2-199}$ |
| Compound 954 | $L_{1-3}$ | $L_{2-200}$ |
| Compound 955 | $L_{1-3}$ | $L_{2-201}$ |
| Compound 956 | $L_{1-3}$ | $L_{2-202}$ |
| Compound 957 | $L_{1-3}$ | $L_{2-203}$ |
| Compound 958 | $L_{1-3}$ | $L_{2-204}$ |
| Compound 959 | $L_{1-3}$ | $L_{2-205}$ |
| Compound 960 | $L_{1-3}$ | $L_{2-206}$ |
| Compound 961 | $L_{1-3}$ | $L_{2-207}$ |
| Compound 962 | $L_{1-3}$ | $L_{2-208}$ |
| Compound 963 | $L_{1-3}$ | $L_{2-209}$ |
| Compound 964 | $L_{1-3}$ | $L_{2-210}$ |
| Compound 965 | $L_{1-3}$ | $L_{2-211}$ |
| Compound 966 | $L_{1-3}$ | $L_{2-212}$ |
| Compound 967 | $L_{1-3}$ | $L_{2-213}$ |
| Compound 968 | $L_{1-3}$ | $L_{2-214}$ |
| Compound 969 | $L_{1-3}$ | $L_{2-215}$ |
| Compound 970 | $L_{1-3}$ | $L_{2-216}$ |
| Compound 971 | $L_{1-3}$ | $L_{2-217}$ |
| Compound 972 | $L_{1-3}$ | $L_{2-218}$ |
| Compound 973 | $L_{1-3}$ | $L_{2-219}$ |
| Compound 974 | $L_{1-3}$ | $L_{2-220}$ |
| Compound 975 | $L_{1-3}$ | $L_{2-221}$ |
| Compound 976 | $L_{1-3}$ | $L_{2-222}$ |
| Compound 977 | $L_{1-3}$ | $L_{2-223}$ |
| Compound 978 | $L_{1-3}$ | $L_{2-224}$ |
| Compound 979 | $L_{1-3}$ | $L_{2-225}$ |
| Compound 980 | $L_{1-3}$ | $L_{2-226}$ |
| Compound 981 | $L_{1-3}$ | $L_{2-227}$ |
| Compound 982 | $L_{1-3}$ | $L_{2-228}$ |
| Compound 983 | $L_{1-3}$ | $L_{2-229}$ |
| Compound 984 | $L_{1-3}$ | $L_{2-230}$ |
| Compound 985 | $L_{1-3}$ | $L_{2-231}$ |
| Compound 986 | $L_{1-3}$ | $L_{2-232}$ |
| Compound 987 | $L_{1-3}$ | $L_{2-233}$ |
| Compound 988 | $L_{1-3}$ | $L_{2-234}$ |
| Compound 989 | $L_{1-3}$ | $L_{2-235}$ |
| Compound 990 | $L_{1-3}$ | $L_{2-236}$ |
| Compound 991 | $L_{1-3}$ | $L_{2-237}$ |
| Compound 992 | $L_{1-3}$ | $L_{2-238}$ |
| Compound 993 | $L_{1-3}$ | $L_{2-239}$ |
| Compound 994 | $L_{1-3}$ | $L_{2-240}$ |
| Compound 995 | $L_{1-3}$ | $L_{2-241}$ |
| Compound 996 | $L_{1-3}$ | $L_{2-242}$ |
| Compound 997 | $L_{1-3}$ | $L_{2-243}$ |
| Compound 998 | $L_{1-3}$ | $L_{2-244}$ |
| Compound 999 | $L_{1-3}$ | $L_{2-245}$ |
| Compound 1000 | $L_{1-3}$ | $L_{2-246}$ |
| Compound 1001 | $L_{1-3}$ | $L_{2-247}$ |
| Compound 1002 | $L_{1-3}$ | $L_{2-248}$ |
| Compound 1003 | $L_{1-3}$ | $L_{2-249}$ |
| Compound 1004 | $L_{1-3}$ | $L_{2-250}$ |
| Compound 1005 | $L_{1-3}$ | $L_{2-251}$ |
| Compound 1006 | $L_{1-3}$ | $L_{2-252}$ |
| Compound 1007 | $L_{1-3}$ | $L_{2-253}$ |
| Compound 1008 | $L_{1-3}$ | $L_{2-254}$ |
| Compound 1009 | $L_{1-3}$ | $L_{2-255}$ |
| Compound 1010 | $L_{1-3}$ | $L_{2-256}$ |
| Compound 1011 | $L_{1-3}$ | $L_{2-257}$ |
| Compound 1012 | $L_{1-3}$ | $L_{2-258}$ |
| Compound 1013 | $L_{1-3}$ | $L_{2-259}$ |
| Compound 1014 | $L_{1-3}$ | $L_{2-260}$ |
| Compound 1015 | $L_{1-3}$ | $L_{2-261}$ |
| Compound 1016 | $L_{1-3}$ | $L_{2-262}$ |
| Compound 1017 | $L_{1-3}$ | $L_{2-263}$ |
| Compound 1018 | $L_{1-3}$ | $L_{2-264}$ |
| Compound 1019 | $L_{1-3}$ | $L_{2-265}$ |
| Compound 1020 | $L_{1-3}$ | $L_{2-266}$ |
| Compound 1021 | $L_{1-3}$ | $L_{2-267}$ |
| Compound 1022 | $L_{1-3}$ | $L_{2-268}$ |
| Compound 1023 | $L_{1-3}$ | $L_{2-269}$ |
| Compound 1024 | $L_{1-3}$ | $L_{2-270}$ |
| Compound 1025 | $L_{1-3}$ | $L_{2-271}$ |
| Compound 1026 | $L_{1-3}$ | $L_{2-272}$ |
| Compound 1027 | $L_{1-3}$ | $L_{2-273}$ |
| Compound 1028 | $L_{1-3}$ | $L_{2-274}$ |
| Compound 1029 | $L_{1-3}$ | $L_{2-275}$ |

TABLE 1-continued

| | | |
|---|---|---|
| Compound 1030 | $L_{1-3}$ | $L_{2-276}$ |
| Compound 1031 | $L_{1-3}$ | $L_{2-277}$ |
| Compound 1032 | $L_{1-3}$ | $L_{2-278}$ |
| Compound 1033 | $L_{1-3}$ | $L_{2-279}$ |
| Compound 1034 | $L_{1-3}$ | $L_{2-280}$ |
| Compound 1035 | $L_{1-3}$ | $L_{2-281}$ |
| Compound 1036 | $L_{1-3}$ | $L_{2-282}$ |
| Compound 1037 | $L_{1-3}$ | $L_{2-283}$ |
| Compound 1038 | $L_{1-3}$ | $L_{2-284}$ |
| Compound 1039 | $L_{1-3}$ | $L_{2-285}$ |
| Compound 1040 | $L_{1-3}$ | $L_{2-286}$ |
| Compound 1041 | $L_{1-3}$ | $L_{2-287}$ |
| Compound 1042 | $L_{1-3}$ | $L_{2-288}$ |
| Compound 1043 | $L_{1-3}$ | $L_{2-289}$ |
| Compound 1044 | $L_{1-3}$ | $L_{2-290}$ |
| Compound 1045 | $L_{1-3}$ | $L_{2-291}$ |
| Compound 1046 | $L_{1-3}$ | $L_{2-292}$ |
| Compound 1047 | $L_{1-3}$ | $L_{2-293}$ |
| Compound 1048 | $L_{1-3}$ | $L_{2-294}$ |
| Compound 1049 | $L_{1-3}$ | $L_{2-295}$ |
| Compound 1050 | $L_{1-3}$ | $L_{2-296}$ |
| Compound 1051 | $L_{1-3}$ | $L_{2-297}$ |
| Compound 1052 | $L_{1-3}$ | $L_{2-298}$ |
| Compound 1053 | $L_{1-3}$ | $L_{2-299}$ |
| Compound 1054 | $L_{1-3}$ | $L_{2-300}$ |
| Compound 1055 | $L_{1-3}$ | $L_{2-301}$ |
| Compound 1056 | $L_{1-3}$ | $L_{2-302}$ |
| Compound 1057 | $L_{1-3}$ | $L_{2-303}$ |
| Compound 1058 | $L_{1-3}$ | $L_{2-304}$ |
| Compound 1059 | $L_{1-3}$ | $L_{2-305}$ |
| Compound 1060 | $L_{1-3}$ | $L_{2-306}$ |
| Compound 1061 | $L_{1-3}$ | $L_{2-307}$ |
| Compound 1062 | $L_{1-3}$ | $L_{2-308}$ |
| Compound 1063 | $L_{1-3}$ | $L_{2-309}$ |
| Compound 1064 | $L_{1-3}$ | $L_{2-310}$ |
| Compound 1065 | $L_{1-3}$ | $L_{2-311}$ |
| Compound 1066 | $L_{1-3}$ | $L_{2-312}$ |
| Compound 1067 | $L_{1-3}$ | $L_{2-313}$ |
| Compound 1068 | $L_{1-3}$ | $L_{2-314}$ |
| Compound 1069 | $L_{1-3}$ | $L_{2-315}$ |
| Compound 1070 | $L_{1-3}$ | $L_{2-316}$ |
| Compound 1071 | $L_{1-3}$ | $L_{2-317}$ |
| Compound 1072 | $L_{1-3}$ | $L_{2-318}$ |
| Compound 1073 | $L_{1-3}$ | $L_{2-319}$ |
| Compound 1074 | $L_{1-3}$ | $L_{2-320}$ |
| Compound 1075 | $L_{1-3}$ | $L_{2-321}$ |
| Compound 1076 | $L_{1-3}$ | $L_{2-322}$ |
| Compound 1077 | $L_{1-3}$ | $L_{2-323}$ |
| Compound 1078 | $L_{1-3}$ | $L_{2-324}$ |
| Compound 1079 | $L_{1-3}$ | $L_{2-325}$ |
| Compound 1080 | $L_{1-3}$ | $L_{2-326}$ |
| Compound 1081 | $L_{1-3}$ | $L_{2-327}$ |
| Compound 1082 | $L_{1-3}$ | $L_{2-328}$ |
| Compound 1083 | $L_{1-3}$ | $L_{2-329}$ |
| Compound 1084 | $L_{1-3}$ | $L_{2-330}$ |
| Compound 1085 | $L_{1-3}$ | $L_{2-331}$ |
| Compound 1086 | $L_{1-3}$ | $L_{2-332}$ |
| Compound 1087 | $L_{1-3}$ | $L_{2-333}$ |
| Compound 1088 | $L_{1-3}$ | $L_{2-334}$ |
| Compound 1089 | $L_{1-3}$ | $L_{2-335}$ |
| Compound 1090 | $L_{1-3}$ | $L_{2-336}$ |
| Compound 1091 | $L_{1-3}$ | $L_{2-337}$ |
| Compound 1092 | $L_{1-3}$ | $L_{2-338}$ |
| Compound 1093 | $L_{1-3}$ | $L_{2-339}$ |
| Compound 1094 | $L_{1-3}$ | $L_{2-340}$ |
| Compound 1095 | $L_{1-3}$ | $L_{2-341}$ |
| Compound 1096 | $L_{1-3}$ | $L_{2-342}$ |
| Compound 1097 | $L_{1-3}$ | $L_{2-343}$ |
| Compound 1098 | $L_{1-3}$ | $L_{2-344}$ |
| Compound 1099 | $L_{1-3}$ | $L_{2-345}$ |
| Compound 1100 | $L_{1-3}$ | $L_{2-346}$ |
| Compound 1101 | $L_{1-3}$ | $L_{2-347}$ |
| Compound 1102 | $L_{1-3}$ | $L_{2-348}$ |
| Compound 1103 | $L_{1-3}$ | $L_{2-349}$ |
| Compound 1104 | $L_{1-3}$ | $L_{2-350}$ |
| Compound 1105 | $L_{1-3}$ | $L_{2-351}$ |
| Compound 1106 | $L_{1-3}$ | $L_{2-352}$ |
| Compound 1107 | $L_{1-3}$ | $L_{2-353}$ |
| Compound 1108 | $L_{1-3}$ | $L_{2-354}$ |
| Compound 1109 | $L_{1-3}$ | $L_{2-355}$ |

TABLE 1-continued

| | | |
|---|---|---|
| Compound 1110 | $L_{1-3}$ | $L_{2-356}$ |
| Compound 1111 | $L_{1-3}$ | $L_{2-357}$ |
| Compound 1112 | $L_{1-3}$ | $L_{2-358}$ |
| Compound 1113 | $L_{1-3}$ | $L_{2-359}$ |
| Compound 1114 | $L_{1-3}$ | $L_{2-360}$ |
| Compound 1115 | $L_{1-3}$ | $L_{2-361}$ |
| Compound 1116 | $L_{1-3}$ | $L_{2-362}$ |
| Compound 1117 | $L_{1-3}$ | $L_{2-363}$ |
| Compound 1118 | $L_{1-3}$ | $L_{2-364}$ |
| Compound 1119 | $L_{1-3}$ | $L_{2-365}$ |
| Compound 1120 | $L_{1-3}$ | $L_{2-366}$ |
| Compound 1121 | $L_{1-3}$ | $L_{2-367}$ |
| Compound 1122 | $L_{1-3}$ | $L_{2-368}$ |
| Compound 1123 | $L_{1-3}$ | $L_{2-369}$ |
| Compound 1124 | $L_{1-3}$ | $L_{2-370}$ |
| Compound 1125 | $L_{1-3}$ | $L_{2-371}$ |
| Compound 1126 | $L_{1-3}$ | $L_{2-372}$ |
| Compound 1127 | $L_{1-3}$ | $L_{2-373}$ |
| Compound 1128 | $L_{1-3}$ | $L_{2-374}$ |
| Compound 1129 | $L_{1-3}$ | $L_{2-375}$ |
| Compound 1130 | $L_{1-3}$ | $L_{2-376}$ |
| Compound 1131 | $L_{1-3}$ | $L_{2-377}$ |
| Compound 1132 | $L_{1-4}$ | $L_{2-1}$ |
| Compound 1133 | $L_{1-4}$ | $L_{2-2}$ |
| Compound 1134 | $L_{1-4}$ | $L_{2-3}$ |
| Compound 1135 | $L_{1-4}$ | $L_{2-4}$ |
| Compound 1136 | $L_{1-4}$ | $L_{2-5}$ |
| Compound 1137 | $L_{1-4}$ | $L_{2-6}$ |
| Compound 1138 | $L_{1-4}$ | $L_{2-7}$ |
| Compound 1139 | $L_{1-4}$ | $L_{2-8}$ |
| Compound 1140 | $L_{1-4}$ | $L_{2-9}$ |
| Compound 1141 | $L_{1-4}$ | $L_{2-10}$ |
| Compound 1142 | $L_{1-4}$ | $L_{2-11}$ |
| Compound 1143 | $L_{1-4}$ | $L_{2-12}$ |
| Compound 1144 | $L_{1-4}$ | $L_{2-13}$ |
| Compound 1145 | $L_{1-4}$ | $L_{2-14}$ |
| Compound 1146 | $L_{1-4}$ | $L_{2-15}$ |
| Compound 1147 | $L_{1-4}$ | $L_{2-16}$ |
| Compound 1148 | $L_{1-4}$ | $L_{2-17}$ |
| Compound 1149 | $L_{1-4}$ | $L_{2-18}$ |
| Compound 1150 | $L_{1-4}$ | $L_{2-19}$ |
| Compound 1151 | $L_{1-4}$ | $L_{2-20}$ |
| Compound 1152 | $L_{1-4}$ | $L_{2-21}$ |
| Compound 1153 | $L_{1-4}$ | $L_{2-22}$ |
| Compound 1154 | $L_{1-4}$ | $L_{2-23}$ |
| Compound 1155 | $L_{1-4}$ | $L_{2-24}$ |
| Compound 1156 | $L_{1-4}$ | $L_{2-25}$ |
| Compound 1157 | $L_{1-4}$ | $L_{2-26}$ |
| Compound 1158 | $L_{1-4}$ | $L_{2-27}$ |
| Compound 1159 | $L_{1-4}$ | $L_{2-28}$ |
| Compound 1160 | $L_{1-4}$ | $L_{2-29}$ |
| Compound 1161 | $L_{1-4}$ | $L_{2-30}$ |
| Compound 1162 | $L_{1-4}$ | $L_{2-31}$ |
| Compound 1163 | $L_{1-4}$ | $L_{2-32}$ |
| Compound 1164 | $L_{1-4}$ | $L_{2-33}$ |
| Compound 1165 | $L_{1-4}$ | $L_{2-34}$ |
| Compound 1166 | $L_{1-4}$ | $L_{2-35}$ |
| Compound 1167 | $L_{1-4}$ | $L_{2-36}$ |
| Compound 1168 | $L_{1-4}$ | $L_{2-37}$ |
| Compound 1169 | $L_{1-4}$ | $L_{2-38}$ |
| Compound 1170 | $L_{1-4}$ | $L_{2-39}$ |
| Compound 1171 | $L_{1-4}$ | $L_{2-40}$ |
| Compound 1172 | $L_{1-4}$ | $L_{2-41}$ |
| Compound 1173 | $L_{1-4}$ | $L_{2-42}$ |
| Compound 1174 | $L_{1-4}$ | $L_{2-43}$ |
| Compound 1175 | $L_{1-4}$ | $L_{2-44}$ |
| Compound 1176 | $L_{1-4}$ | $L_{2-45}$ |
| Compound 1177 | $L_{1-4}$ | $L_{2-46}$ |
| Compound 1178 | $L_{1-4}$ | $L_{2-47}$ |
| Compound 1179 | $L_{1-4}$ | $L_{2-48}$ |
| Compound 1180 | $L_{1-4}$ | $L_{2-49}$ |
| Compound 1181 | $L_{1-4}$ | $L_{2-50}$ |
| Compound 1182 | $L_{1-4}$ | $L_{2-51}$ |
| Compound 1183 | $L_{1-4}$ | $L_{2-52}$ |
| Compound 1184 | $L_{1-4}$ | $L_{2-53}$ |
| Compound 1185 | $L_{1-4}$ | $L_{2-54}$ |
| Compound 1186 | $L_{1-4}$ | $L_{2-55}$ |
| Compound 1187 | $L_{1-4}$ | $L_{2-56}$ |
| Compound 1188 | $L_{1-4}$ | $L_{2-57}$ |
| Compound 1189 | $L_{1-4}$ | $L_{2-58}$ |

TABLE 1-continued

| | | |
|---|---|---|
| Compound 1190 | $L_{1-4}$ | $L_{2-59}$ |
| Compound 1191 | $L_{1-4}$ | $L_{2-60}$ |
| Compound 1192 | $L_{1-4}$ | $L_{2-61}$ |
| Compound 1193 | $L_{1-4}$ | $L_{2-62}$ |
| Compound 1194 | $L_{1-4}$ | $L_{2-63}$ |
| Compound 1195 | $L_{1-4}$ | $L_{2-64}$ |
| Compound 1196 | $L_{1-4}$ | $L_{2-65}$ |
| Compound 1197 | $L_{1-4}$ | $L_{2-66}$ |
| Compound 1198 | $L_{1-4}$ | $L_{2-67}$ |
| Compound 1199 | $L_{1-4}$ | $L_{2-68}$ |
| Compound 1200 | $L_{1-4}$ | $L_{2-69}$ |
| Compound 1201 | $L_{1-4}$ | $L_{2-70}$ |
| Compound 1202 | $L_{1-4}$ | $L_{2-71}$ |
| Compound 1203 | $L_{1-4}$ | $L_{2-72}$ |
| Compound 1204 | $L_{1-4}$ | $L_{2-73}$ |
| Compound 1205 | $L_{1-4}$ | $L_{2-74}$ |
| Compound 1206 | $L_{1-4}$ | $L_{2-75}$ |
| Compound 1207 | $L_{1-4}$ | $L_{2-76}$ |
| Compound 1208 | $L_{1-4}$ | $L_{2-77}$ |
| Compound 1209 | $L_{1-4}$ | $L_{2-78}$ |
| Compound 1210 | $L_{1-4}$ | $L_{2-79}$ |
| Compound 1211 | $L_{1-4}$ | $L_{2-80}$ |
| Compound 1212 | $L_{1-4}$ | $L_{2-81}$ |
| Compound 1213 | $L_{1-4}$ | $L_{2-82}$ |
| Compound 1214 | $L_{1-4}$ | $L_{2-83}$ |
| Compound 1215 | $L_{1-4}$ | $L_{2-84}$ |
| Compound 1216 | $L_{1-4}$ | $L_{2-85}$ |
| Compound 1217 | $L_{1-4}$ | $L_{2-86}$ |
| Compound 1218 | $L_{1-4}$ | $L_{2-87}$ |
| Compound 1219 | $L_{1-4}$ | $L_{2-88}$ |
| Compound 1220 | $L_{1-4}$ | $L_{2-89}$ |
| Compound 1221 | $L_{1-4}$ | $L_{2-90}$ |
| Compound 1222 | $L_{1-4}$ | $L_{2-91}$ |
| Compound 1223 | $L_{1-4}$ | $L_{2-92}$ |
| Compound 1224 | $L_{1-4}$ | $L_{2-93}$ |
| Compound 1225 | $L_{1-4}$ | $L_{2-94}$ |
| Compound 1226 | $L_{1-4}$ | $L_{2-95}$ |
| Compound 1227 | $L_{1-4}$ | $L_{2-96}$ |
| Compound 1228 | $L_{1-4}$ | $L_{2-97}$ |
| Compound 1229 | $L_{1-4}$ | $L_{2-98}$ |
| Compound 1230 | $L_{1-4}$ | $L_{2-99}$ |
| Compound 1231 | $L_{1-4}$ | $L_{2-100}$ |
| Compound 1232 | $L_{1-4}$ | $L_{2-101}$ |
| Compound 1233 | $L_{1-4}$ | $L_{2-102}$ |
| Compound 1234 | $L_{1-4}$ | $L_{2-103}$ |
| Compound 1235 | $L_{1-4}$ | $L_{2-104}$ |
| Compound 1236 | $L_{1-4}$ | $L_{2-105}$ |
| Compound 1237 | $L_{1-4}$ | $L_{2-106}$ |
| Compound 1238 | $L_{1-4}$ | $L_{2-107}$ |
| Compound 1239 | $L_{1-4}$ | $L_{2-108}$ |
| Compound 1240 | $L_{1-4}$ | $L_{2-109}$ |
| Compound 1241 | $L_{1-4}$ | $L_{2-110}$ |
| Compound 1242 | $L_{1-4}$ | $L_{2-111}$ |
| Compound 1243 | $L_{1-4}$ | $L_{2-112}$ |
| Compound 1244 | $L_{1-4}$ | $L_{2-113}$ |
| Compound 1245 | $L_{1-4}$ | $L_{2-114}$ |
| Compound 1246 | $L_{1-4}$ | $L_{2-115}$ |
| Compound 1247 | $L_{1-4}$ | $L_{2-116}$ |
| Compound 1248 | $L_{1-4}$ | $L_{2-117}$ |
| Compound 1249 | $L_{1-4}$ | $L_{2-118}$ |
| Compound 1250 | $L_{1-4}$ | $L_{2-119}$ |
| Compound 1251 | $L_{1-4}$ | $L_{2-120}$ |
| Compound 1252 | $L_{1-4}$ | $L_{2-121}$ |
| Compound 1253 | $L_{1-4}$ | $L_{2-122}$ |
| Compound 1254 | $L_{1-4}$ | $L_{2-123}$ |
| Compound 1255 | $L_{1-4}$ | $L_{2-124}$ |
| Compound 1256 | $L_{1-4}$ | $L_{2-125}$ |
| Compound 1257 | $L_{1-4}$ | $L_{2-126}$ |
| Compound 1258 | $L_{1-4}$ | $L_{2-127}$ |
| Compound 1259 | $L_{1-4}$ | $L_{2-128}$ |
| Compound 1260 | $L_{1-4}$ | $L_{2-129}$ |
| Compound 1261 | $L_{1-4}$ | $L_{2-130}$ |
| Compound 1262 | $L_{1-4}$ | $L_{2-131}$ |
| Compound 1263 | $L_{1-4}$ | $L_{2-132}$ |
| Compound 1264 | $L_{1-4}$ | $L_{2-133}$ |
| Compound 1265 | $L_{1-4}$ | $L_{2-134}$ |
| Compound 1266 | $L_{1-4}$ | $L_{2-135}$ |
| Compound 1267 | $L_{1-4}$ | $L_{2-136}$ |
| Compound 1268 | $L_{1-4}$ | $L_{2-137}$ |
| Compound 1269 | $L_{1-4}$ | $L_{2-138}$ |

TABLE 1-continued

| | | |
|---|---|---|
| Compound 1270 | $L_{1-4}$ | $L_{2-139}$ |
| Compound 1271 | $L_{1-4}$ | $L_{2-140}$ |
| Compound 1272 | $L_{1-4}$ | $L_{2-141}$ |
| Compound 1273 | $L_{1-4}$ | $L_{2-142}$ |
| Compound 1274 | $L_{1-4}$ | $L_{2-143}$ |
| Compound 1275 | $L_{1-4}$ | $L_{2-144}$ |
| Compound 1276 | $L_{1-4}$ | $L_{2-145}$ |
| Compound 1277 | $L_{1-4}$ | $L_{2-146}$ |
| Compound 1278 | $L_{1-4}$ | $L_{2-147}$ |
| Compound 1279 | $L_{1-4}$ | $L_{2-148}$ |
| Compound 1280 | $L_{1-4}$ | $L_{2-149}$ |
| Compound 1281 | $L_{1-4}$ | $L_{2-150}$ |
| Compound 1282 | $L_{1-4}$ | $L_{2-151}$ |
| Compound 1283 | $L_{1-4}$ | $L_{2-152}$ |
| Compound 1284 | $L_{1-4}$ | $L_{2-153}$ |
| Compound 1285 | $L_{1-4}$ | $L_{2-154}$ |
| Compound 1286 | $L_{1-4}$ | $L_{2-155}$ |
| Compound 1287 | $L_{1-4}$ | $L_{2-156}$ |
| Compound 1288 | $L_{1-4}$ | $L_{2-157}$ |
| Compound 1289 | $L_{1-4}$ | $L_{2-158}$ |
| Compound 1290 | $L_{1-4}$ | $L_{2-159}$ |
| Compound 1291 | $L_{1-4}$ | $L_{2-160}$ |
| Compound 1292 | $L_{1-4}$ | $L_{2-161}$ |
| Compound 1293 | $L_{1-4}$ | $L_{2-162}$ |
| Compound 1294 | $L_{1-4}$ | $L_{2-163}$ |
| Compound 1295 | $L_{1-4}$ | $L_{2-164}$ |
| Compound 1296 | $L_{1-4}$ | $L_{2-165}$ |
| Compound 1297 | $L_{1-4}$ | $L_{2-166}$ |
| Compound 1298 | $L_{1-4}$ | $L_{2-167}$ |
| Compound 1299 | $L_{1-4}$ | $L_{2-168}$ |
| Compound 1300 | $L_{1-4}$ | $L_{2-169}$ |
| Compound 1301 | $L_{1-4}$ | $L_{2-170}$ |
| Compound 1302 | $L_{1-4}$ | $L_{2-171}$ |
| Compound 1303 | $L_{1-4}$ | $L_{2-172}$ |
| Compound 1304 | $L_{1-4}$ | $L_{2-173}$ |
| Compound 1305 | $L_{1-4}$ | $L_{2-174}$ |
| Compound 1306 | $L_{1-4}$ | $L_{2-175}$ |
| Compound 1307 | $L_{1-4}$ | $L_{2-176}$ |
| Compound 1308 | $L_{1-4}$ | $L_{2-177}$ |
| Compound 1309 | $L_{1-4}$ | $L_{2-178}$ |
| Compound 1310 | $L_{1-4}$ | $L_{2-179}$ |
| Compound 1311 | $L_{1-4}$ | $L_{2-180}$ |
| Compound 1312 | $L_{1-4}$ | $L_{2-181}$ |
| Compound 1313 | $L_{1-4}$ | $L_{2-182}$ |
| Compound 1314 | $L_{1-4}$ | $L_{2-183}$ |
| Compound 1315 | $L_{1-4}$ | $L_{2-184}$ |
| Compound 1316 | $L_{1-4}$ | $L_{2-185}$ |
| Compound 1317 | $L_{1-4}$ | $L_{2-186}$ |
| Compound 1318 | $L_{1-4}$ | $L_{2-187}$ |
| Compound 1319 | $L_{1-4}$ | $L_{2-188}$ |
| Compound 1320 | $L_{1-4}$ | $L_{2-189}$ |
| Compound 1321 | $L_{1-4}$ | $L_{2-190}$ |
| Compound 1322 | $L_{1-4}$ | $L_{2-191}$ |
| Compound 1323 | $L_{1-4}$ | $L_{2-192}$ |
| Compound 1324 | $L_{1-4}$ | $L_{2-193}$ |
| Compound 1325 | $L_{1-4}$ | $L_{2-194}$ |
| Compound 1326 | $L_{1-4}$ | $L_{2-195}$ |
| Compound 1327 | $L_{1-4}$ | $L_{2-196}$ |
| Compound 1328 | $L_{1-4}$ | $L_{2-197}$ |
| Compound 1329 | $L_{1-4}$ | $L_{2-198}$ |
| Compound 1330 | $L_{1-4}$ | $L_{2-199}$ |
| Compound 1331 | $L_{1-4}$ | $L_{2-200}$ |
| Compound 1332 | $L_{1-4}$ | $L_{2-201}$ |
| Compound 1333 | $L_{1-4}$ | $L_{2-202}$ |
| Compound 1334 | $L_{1-4}$ | $L_{2-203}$ |
| Compound 1335 | $L_{1-4}$ | $L_{2-204}$ |
| Compound 1336 | $L_{1-4}$ | $L_{2-205}$ |
| Compound 1337 | $L_{1-4}$ | $L_{2-206}$ |
| Compound 1338 | $L_{1-4}$ | $L_{2-207}$ |
| Compound 1339 | $L_{1-4}$ | $L_{2-208}$ |
| Compound 1340 | $L_{1-4}$ | $L_{2-209}$ |
| Compound 1341 | $L_{1-4}$ | $L_{2-210}$ |
| Compound 1342 | $L_{1-4}$ | $L_{2-211}$ |
| Compound 1343 | $L_{1-4}$ | $L_{2-212}$ |
| Compound 1344 | $L_{1-4}$ | $L_{2-213}$ |
| Compound 1345 | $L_{1-4}$ | $L_{2-214}$ |
| Compound 1346 | $L_{1-4}$ | $L_{2-215}$ |
| Compound 1347 | $L_{1-4}$ | $L_{2-216}$ |
| Compound 1348 | $L_{1-4}$ | $L_{2-217}$ |
| Compound 1349 | $L_{1-4}$ | $L_{2-218}$ |

TABLE 1-continued

| | | |
|---|---|---|
| Compound 1350 | $L_{1-4}$ | $L_{2-219}$ |
| Compound 1351 | $L_{1-4}$ | $L_{2-220}$ |
| Compound 1352 | $L_{1-4}$ | $L_{2-221}$ |
| Compound 1353 | $L_{1-4}$ | $L_{2-222}$ |
| Compound 1354 | $L_{1-4}$ | $L_{2-223}$ |
| Compound 1355 | $L_{1-4}$ | $L_{2-224}$ |
| Compound 1356 | $L_{1-4}$ | $L_{2-225}$ |
| Compound 1357 | $L_{1-4}$ | $L_{2-226}$ |
| Compound 1358 | $L_{1-4}$ | $L_{2-227}$ |
| Compound 1359 | $L_{1-4}$ | $L_{2-228}$ |
| Compound 1360 | $L_{1-4}$ | $L_{2-229}$ |
| Compound 1361 | $L_{1-4}$ | $L_{2-230}$ |
| Compound 1362 | $L_{1-4}$ | $L_{2-231}$ |
| Compound 1363 | $L_{1-4}$ | $L_{2-232}$ |
| Compound 1364 | $L_{1-4}$ | $L_{2-233}$ |
| Compound 1365 | $L_{1-4}$ | $L_{2-234}$ |
| Compound 1366 | $L_{1-4}$ | $L_{2-235}$ |
| Compound 1367 | $L_{1-4}$ | $L_{2-236}$ |
| Compound 1368 | $L_{1-4}$ | $L_{2-237}$ |
| Compound 1369 | $L_{1-4}$ | $L_{2-238}$ |
| Compound 1370 | $L_{1-4}$ | $L_{2-239}$ |
| Compound 1371 | $L_{1-4}$ | $L_{2-240}$ |
| Compound 1372 | $L_{1-4}$ | $L_{2-241}$ |
| Compound 1373 | $L_{1-4}$ | $L_{2-242}$ |
| Compound 1374 | $L_{1-4}$ | $L_{2-243}$ |
| Compound 1375 | $L_{1-4}$ | $L_{2-244}$ |
| Compound 1376 | $L_{1-4}$ | $L_{2-245}$ |
| Compound 1377 | $L_{1-4}$ | $L_{2-246}$ |
| Compound 1378 | $L_{1-4}$ | $L_{2-247}$ |
| Compound 1379 | $L_{1-4}$ | $L_{2-248}$ |
| Compound 1380 | $L_{1-4}$ | $L_{2-249}$ |
| Compound 1381 | $L_{1-4}$ | $L_{2-250}$ |
| Compound 1382 | $L_{1-4}$ | $L_{2-251}$ |
| Compound 1383 | $L_{1-4}$ | $L_{2-252}$ |
| Compound 1384 | $L_{1-4}$ | $L_{2-253}$ |
| Compound 1385 | $L_{1-4}$ | $L_{2-254}$ |
| Compound 1386 | $L_{1-4}$ | $L_{2-255}$ |
| Compound 1387 | $L_{1-4}$ | $L_{2-256}$ |
| Compound 1388 | $L_{1-4}$ | $L_{2-257}$ |
| Compound 1389 | $L_{1-4}$ | $L_{2-258}$ |
| Compound 1390 | $L_{1-4}$ | $L_{2-259}$ |
| Compound 1391 | $L_{1-4}$ | $L_{2-260}$ |
| Compound 1392 | $L_{1-4}$ | $L_{2-261}$ |
| Compound 1393 | $L_{1-4}$ | $L_{2-262}$ |
| Compound 1394 | $L_{1-4}$ | $L_{2-263}$ |
| Compound 1395 | $L_{1-4}$ | $L_{2-264}$ |
| Compound 1396 | $L_{1-4}$ | $L_{2-265}$ |
| Compound 1397 | $L_{1-4}$ | $L_{2-266}$ |
| Compound 1398 | $L_{1-4}$ | $L_{2-267}$ |
| Compound 1399 | $L_{1-4}$ | $L_{2-268}$ |
| Compound 1400 | $L_{1-4}$ | $L_{2-269}$ |
| Compound 1401 | $L_{1-4}$ | $L_{2-270}$ |
| Compound 1402 | $L_{1-4}$ | $L_{2-271}$ |
| Compound 1403 | $L_{1-4}$ | $L_{2-272}$ |
| Compound 1404 | $L_{1-4}$ | $L_{2-273}$ |
| Compound 1405 | $L_{1-4}$ | $L_{2-274}$ |
| Compound 1406 | $L_{1-4}$ | $L_{2-275}$ |
| Compound 1407 | $L_{1-4}$ | $L_{2-276}$ |
| Compound 1408 | $L_{1-4}$ | $L_{2-277}$ |
| Compound 1409 | $L_{1-4}$ | $L_{2-278}$ |
| Compound 1410 | $L_{1-4}$ | $L_{2-279}$ |
| Compound 1411 | $L_{1-4}$ | $L_{2-280}$ |
| Compound 1412 | $L_{1-4}$ | $L_{2-281}$ |
| Compound 1413 | $L_{1-4}$ | $L_{2-282}$ |
| Compound 1414 | $L_{1-4}$ | $L_{2-283}$ |
| Compound 1415 | $L_{1-4}$ | $L_{2-284}$ |
| Compound 1416 | $L_{1-4}$ | $L_{2-285}$ |
| Compound 1417 | $L_{1-4}$ | $L_{2-286}$ |
| Compound 1418 | $L_{1-4}$ | $L_{2-287}$ |
| Compound 1419 | $L_{1-4}$ | $L_{2-288}$ |
| Compound 1420 | $L_{1-4}$ | $L_{2-289}$ |
| Compound 1421 | $L_{1-4}$ | $L_{2-290}$ |
| Compound 1422 | $L_{1-4}$ | $L_{2-291}$ |
| Compound 1423 | $L_{1-4}$ | $L_{2-292}$ |
| Compound 1424 | $L_{1-4}$ | $L_{2-293}$ |
| Compound 1425 | $L_{1-4}$ | $L_{2-294}$ |
| Compound 1426 | $L_{1-4}$ | $L_{2-295}$ |
| Compound 1427 | $L_{1-4}$ | $L_{2-296}$ |
| Compound 1428 | $L_{1-4}$ | $L_{2-297}$ |
| Compound 1429 | $L_{1-4}$ | $L_{2-298}$ |

TABLE 1-continued

| | | |
|---|---|---|
| Compound 1430 | $L_{1-4}$ | $L_{2-299}$ |
| Compound 1431 | $L_{1-4}$ | $L_{2-300}$ |
| Compound 1432 | $L_{1-4}$ | $L_{2-301}$ |
| Compound 1433 | $L_{1-4}$ | $L_{2-302}$ |
| Compound 1434 | $L_{1-4}$ | $L_{2-303}$ |
| Compound 1435 | $L_{1-4}$ | $L_{2-304}$ |
| Compound 1436 | $L_{1-4}$ | $L_{2-305}$ |
| Compound 1437 | $L_{1-4}$ | $L_{2-306}$ |
| Compound 1438 | $L_{1-4}$ | $L_{2-307}$ |
| Compound 1439 | $L_{1-4}$ | $L_{2-308}$ |
| Compound 1440 | $L_{1-4}$ | $L_{2-309}$ |
| Compound 1441 | $L_{1-4}$ | $L_{2-310}$ |
| Compound 1442 | $L_{1-4}$ | $L_{2-311}$ |
| Compound 1443 | $L_{1-4}$ | $L_{2-312}$ |
| Compound 1444 | $L_{1-4}$ | $L_{2-313}$ |
| Compound 1445 | $L_{1-4}$ | $L_{2-314}$ |
| Compound 1446 | $L_{1-4}$ | $L_{2-315}$ |
| Compound 1447 | $L_{1-4}$ | $L_{2-316}$ |
| Compound 1448 | $L_{1-4}$ | $L_{2-317}$ |
| Compound 1449 | $L_{1-4}$ | $L_{2-318}$ |
| Compound 1450 | $L_{1-4}$ | $L_{2-319}$ |
| Compound 1451 | $L_{1-4}$ | $L_{2-320}$ |
| Compound 1452 | $L_{1-4}$ | $L_{2-321}$ |
| Compound 1453 | $L_{1-4}$ | $L_{2-322}$ |
| Compound 1454 | $L_{1-4}$ | $L_{2-323}$ |
| Compound 1455 | $L_{1-4}$ | $L_{2-324}$ |
| Compound 1456 | $L_{1-4}$ | $L_{2-325}$ |
| Compound 1457 | $L_{1-4}$ | $L_{2-326}$ |
| Compound 1458 | $L_{1-4}$ | $L_{2-327}$ |
| Compound 1459 | $L_{1-4}$ | $L_{2-328}$ |
| Compound 1460 | $L_{1-4}$ | $L_{2-329}$ |
| Compound 1461 | $L_{1-4}$ | $L_{2-330}$ |
| Compound 1462 | $L_{1-4}$ | $L_{2-331}$ |
| Compound 1463 | $L_{1-4}$ | $L_{2-332}$ |
| Compound 1464 | $L_{1-4}$ | $L_{2-333}$ |
| Compound 1465 | $L_{1-4}$ | $L_{2-334}$ |
| Compound 1466 | $L_{1-4}$ | $L_{2-335}$ |
| Compound 1467 | $L_{1-4}$ | $L_{2-336}$ |
| Compound 1468 | $L_{1-4}$ | $L_{2-337}$ |
| Compound 1469 | $L_{1-4}$ | $L_{2-338}$ |
| Compound 1470 | $L_{1-4}$ | $L_{2-339}$ |
| Compound 1471 | $L_{1-4}$ | $L_{2-340}$ |
| Compound 1472 | $L_{1-4}$ | $L_{2-341}$ |
| Compound 1473 | $L_{1-4}$ | $L_{2-342}$ |
| Compound 1474 | $L_{1-4}$ | $L_{2-343}$ |
| Compound 1475 | $L_{1-4}$ | $L_{2-344}$ |
| Compound 1476 | $L_{1-4}$ | $L_{2-345}$ |
| Compound 1477 | $L_{1-4}$ | $L_{2-346}$ |
| Compound 1478 | $L_{1-4}$ | $L_{2-347}$ |
| Compound 1479 | $L_{1-4}$ | $L_{2-348}$ |
| Compound 1480 | $L_{1-4}$ | $L_{2-349}$ |
| Compound 1481 | $L_{1-4}$ | $L_{2-350}$ |
| Compound 1482 | $L_{1-4}$ | $L_{2-351}$ |
| Compound 1483 | $L_{1-4}$ | $L_{2-352}$ |
| Compound 1484 | $L_{1-4}$ | $L_{2-353}$ |
| Compound 1485 | $L_{1-4}$ | $L_{2-354}$ |
| Compound 1486 | $L_{1-4}$ | $L_{2-355}$ |
| Compound 1487 | $L_{1-4}$ | $L_{2-356}$ |
| Compound 1488 | $L_{1-4}$ | $L_{2-357}$ |
| Compound 1489 | $L_{1-4}$ | $L_{2-358}$ |
| Compound 1490 | $L_{1-4}$ | $L_{2-359}$ |
| Compound 1491 | $L_{1-4}$ | $L_{2-360}$ |
| Compound 1492 | $L_{1-4}$ | $L_{2-361}$ |
| Compound 1493 | $L_{1-4}$ | $L_{2-362}$ |
| Compound 1494 | $L_{1-4}$ | $L_{2-363}$ |
| Compound 1495 | $L_{1-4}$ | $L_{2-364}$ |
| Compound 1496 | $L_{1-4}$ | $L_{2-365}$ |
| Compound 1497 | $L_{1-4}$ | $L_{2-366}$ |
| Compound 1498 | $L_{1-4}$ | $L_{2-367}$ |
| Compound 1499 | $L_{1-4}$ | $L_{2-368}$ |
| Compound 1500 | $L_{1-4}$ | $L_{2-369}$ |
| Compound 1501 | $L_{1-4}$ | $L_{2-370}$ |
| Compound 1502 | $L_{1-4}$ | $L_{2-371}$ |
| Compound 1503 | $L_{1-4}$ | $L_{2-372}$ |
| Compound 1504 | $L_{1-4}$ | $L_{2-373}$ |
| Compound 1505 | $L_{1-4}$ | $L_{2-374}$ |
| Compound 1506 | $L_{1-4}$ | $L_{2-375}$ |
| Compound 1507 | $L_{1-4}$ | $L_{2-376}$ |
| Compound 1508 | $L_{1-4}$ | $L_{2-377}$ |
| Compound 1509 | $L_{1-5}$ | $L_{2-1}$ |

TABLE 1-continued

| | | |
|---|---|---|
| Compound 1510 | $L_{1-5}$ | $L_{2-2}$ |
| Compound 1511 | $L_{1-5}$ | $L_{2-3}$ |
| Compound 1512 | $L_{1-5}$ | $L_{2-4}$ |
| Compound 1513 | $L_{1-5}$ | $L_{2-5}$ |
| Compound 1514 | $L_{1-5}$ | $L_{2-6}$ |
| Compound 1515 | $L_{1-5}$ | $L_{2-7}$ |
| Compound 1516 | $L_{1-5}$ | $L_{2-8}$ |
| Compound 1517 | $L_{1-5}$ | $L_{2-9}$ |
| Compound 1518 | $L_{1-5}$ | $L_{2-10}$ |
| Compound 1519 | $L_{1-5}$ | $L_{2-11}$ |
| Compound 1520 | $L_{1-5}$ | $L_{2-12}$ |
| Compound 1521 | $L_{1-5}$ | $L_{2-13}$ |
| Compound 1522 | $L_{1-5}$ | $L_{2-14}$ |
| Compound 1523 | $L_{1-5}$ | $L_{2-15}$ |
| Compound 1524 | $L_{1-5}$ | $L_{2-16}$ |
| Compound 1525 | $L_{1-5}$ | $L_{2-17}$ |
| Compound 1526 | $L_{1-5}$ | $L_{2-18}$ |
| Compound 1527 | $L_{1-5}$ | $L_{2-19}$ |
| Compound 1528 | $L_{1-5}$ | $L_{2-20}$ |
| Compound 1529 | $L_{1-5}$ | $L_{2-21}$ |
| Compound 1530 | $L_{1-5}$ | $L_{2-22}$ |
| Compound 1531 | $L_{1-5}$ | $L_{2-23}$ |
| Compound 1532 | $L_{1-5}$ | $L_{2-24}$ |
| Compound 1533 | $L_{1-5}$ | $L_{2-25}$ |
| Compound 1534 | $L_{1-5}$ | $L_{2-26}$ |
| Compound 1535 | $L_{1-5}$ | $L_{2-27}$ |
| Compound 1536 | $L_{1-5}$ | $L_{2-28}$ |
| Compound 1537 | $L_{1-5}$ | $L_{2-29}$ |
| Compound 1538 | $L_{1-5}$ | $L_{2-30}$ |
| Compound 1539 | $L_{1-5}$ | $L_{2-31}$ |
| Compound 1540 | $L_{1-5}$ | $L_{2-32}$ |
| Compound 1541 | $L_{1-5}$ | $L_{2-33}$ |
| Compound 1542 | $L_{1-5}$ | $L_{2-34}$ |
| Compound 1543 | $L_{1-5}$ | $L_{2-35}$ |
| Compound 1544 | $L_{1-5}$ | $L_{2-36}$ |
| Compound 1545 | $L_{1-5}$ | $L_{2-37}$ |
| Compound 1546 | $L_{1-5}$ | $L_{2-38}$ |
| Compound 1547 | $L_{1-5}$ | $L_{2-39}$ |
| Compound 1548 | $L_{1-5}$ | $L_{2-40}$ |
| Compound 1549 | $L_{1-5}$ | $L_{2-41}$ |
| Compound 1550 | $L_{1-5}$ | $L_{2-42}$ |
| Compound 1551 | $L_{1-5}$ | $L_{2-43}$ |
| Compound 1552 | $L_{1-5}$ | $L_{2-44}$ |
| Compound 1553 | $L_{1-5}$ | $L_{2-45}$ |
| Compound 1554 | $L_{1-5}$ | $L_{2-46}$ |
| Compound 1555 | $L_{1-5}$ | $L_{2-47}$ |
| Compound 1556 | $L_{1-5}$ | $L_{2-48}$ |
| Compound 1557 | $L_{1-5}$ | $L_{2-49}$ |
| Compound 1558 | $L_{1-5}$ | $L_{2-50}$ |
| Compound 1559 | $L_{1-5}$ | $L_{2-51}$ |
| Compound 1560 | $L_{1-5}$ | $L_{2-52}$ |
| Compound 1561 | $L_{1-5}$ | $L_{2-53}$ |
| Compound 1562 | $L_{1-5}$ | $L_{2-54}$ |
| Compound 1563 | $L_{1-5}$ | $L_{2-55}$ |
| Compound 1564 | $L_{1-5}$ | $L_{2-56}$ |
| Compound 1565 | $L_{1-5}$ | $L_{2-57}$ |
| Compound 1566 | $L_{1-5}$ | $L_{2-58}$ |
| Compound 1567 | $L_{1-5}$ | $L_{2-59}$ |
| Compound 1568 | $L_{1-5}$ | $L_{2-60}$ |
| Compound 1569 | $L_{1-5}$ | $L_{2-61}$ |
| Compound 1570 | $L_{1-5}$ | $L_{2-62}$ |
| Compound 1571 | $L_{1-5}$ | $L_{2-63}$ |
| Compound 1572 | $L_{1-5}$ | $L_{2-64}$ |
| Compound 1573 | $L_{1-5}$ | $L_{2-65}$ |
| Compound 1574 | $L_{1-5}$ | $L_{2-66}$ |
| Compound 1575 | $L_{1-5}$ | $L_{2-67}$ |
| Compound 1576 | $L_{1-5}$ | $L_{2-68}$ |
| Compound 1577 | $L_{1-5}$ | $L_{2-69}$ |
| Compound 1578 | $L_{1-5}$ | $L_{2-70}$ |
| Compound 1579 | $L_{1-5}$ | $L_{2-71}$ |
| Compound 1580 | $L_{1-5}$ | $L_{2-72}$ |
| Compound 1581 | $L_{1-5}$ | $L_{2-73}$ |
| Compound 1582 | $L_{1-5}$ | $L_{2-74}$ |
| Compound 1583 | $L_{1-5}$ | $L_{2-75}$ |
| Compound 1584 | $L_{1-5}$ | $L_{2-76}$ |
| Compound 1585 | $L_{1-5}$ | $L_{2-77}$ |
| Compound 1586 | $L_{1-5}$ | $L_{2-78}$ |
| Compound 1587 | $L_{1-5}$ | $L_{2-79}$ |
| Compound 1588 | $L_{1-5}$ | $L_{2-80}$ |
| Compound 1589 | $L_{1-5}$ | $L_{2-81}$ |

TABLE 1-continued

| | | |
|---|---|---|
| Compound 1590 | $L_{1-5}$ | $L_{2-82}$ |
| Compound 1591 | $L_{1-5}$ | $L_{2-83}$ |
| Compound 1592 | $L_{1-5}$ | $L_{2-84}$ |
| Compound 1593 | $L_{1-5}$ | $L_{2-85}$ |
| Compound 1594 | $L_{1-5}$ | $L_{2-86}$ |
| Compound 1595 | $L_{1-5}$ | $L_{2-87}$ |
| Compound 1596 | $L_{1-5}$ | $L_{2-88}$ |
| Compound 1597 | $L_{1-5}$ | $L_{2-89}$ |
| Compound 1598 | $L_{1-5}$ | $L_{2-90}$ |
| Compound 1599 | $L_{1-5}$ | $L_{2-91}$ |
| Compound 1600 | $L_{1-5}$ | $L_{2-92}$ |
| Compound 1601 | $L_{1-5}$ | $L_{2-93}$ |
| Compound 1602 | $L_{1-5}$ | $L_{2-94}$ |
| Compound 1603 | $L_{1-5}$ | $L_{2-95}$ |
| Compound 1604 | $L_{1-5}$ | $L_{2-96}$ |
| Compound 1605 | $L_{1-5}$ | $L_{2-97}$ |
| Compound 1606 | $L_{1-5}$ | $L_{2-98}$ |
| Compound 1607 | $L_{1-5}$ | $L_{2-99}$ |
| Compound 1608 | $L_{1-5}$ | $L_{2-100}$ |
| Compound 1609 | $L_{1-5}$ | $L_{2-101}$ |
| Compound 1610 | $L_{1-5}$ | $L_{2-102}$ |
| Compound 1611 | $L_{1-5}$ | $L_{2-103}$ |
| Compound 1612 | $L_{1-5}$ | $L_{2-104}$ |
| Compound 1613 | $L_{1-5}$ | $L_{2-105}$ |
| Compound 1614 | $L_{1-5}$ | $L_{2-106}$ |
| Compound 1615 | $L_{1-5}$ | $L_{2-107}$ |
| Compound 1616 | $L_{1-5}$ | $L_{2-108}$ |
| Compound 1617 | $L_{1-5}$ | $L_{2-109}$ |
| Compound 1618 | $L_{1-5}$ | $L_{2-110}$ |
| Compound 1619 | $L_{1-5}$ | $L_{2-111}$ |
| Compound 1620 | $L_{1-5}$ | $L_{2-112}$ |
| Compound 1621 | $L_{1-5}$ | $L_{2-113}$ |
| Compound 1622 | $L_{1-5}$ | $L_{2-114}$ |
| Compound 1623 | $L_{1-5}$ | $L_{2-115}$ |
| Compound 1624 | $L_{1-5}$ | $L_{2-116}$ |
| Compound 1625 | $L_{1-5}$ | $L_{2-117}$ |
| Compound 1626 | $L_{1-5}$ | $L_{2-118}$ |
| Compound 1627 | $L_{1-5}$ | $L_{2-119}$ |
| Compound 1628 | $L_{1-5}$ | $L_{2-120}$ |
| Compound 1629 | $L_{1-5}$ | $L_{2-121}$ |
| Compound 1630 | $L_{1-5}$ | $L_{2-122}$ |
| Compound 1631 | $L_{1-5}$ | $L_{2-123}$ |
| Compound 1632 | $L_{1-5}$ | $L_{2-124}$ |
| Compound 1633 | $L_{1-5}$ | $L_{2-125}$ |
| Compound 1634 | $L_{1-5}$ | $L_{2-126}$ |
| Compound 1635 | $L_{1-5}$ | $L_{2-127}$ |
| Compound 1636 | $L_{1-5}$ | $L_{2-128}$ |
| Compound 1637 | $L_{1-5}$ | $L_{2-129}$ |
| Compound 1638 | $L_{1-5}$ | $L_{2-130}$ |
| Compound 1639 | $L_{1-5}$ | $L_{2-131}$ |
| Compound 1640 | $L_{1-5}$ | $L_{2-132}$ |
| Compound 1641 | $L_{1-5}$ | $L_{2-133}$ |
| Compound 1642 | $L_{1-5}$ | $L_{2-134}$ |
| Compound 1643 | $L_{1-5}$ | $L_{2-135}$ |
| Compound 1644 | $L_{1-5}$ | $L_{2-136}$ |
| Compound 1645 | $L_{1-5}$ | $L_{2-137}$ |
| Compound 1646 | $L_{1-5}$ | $L_{2-138}$ |
| Compound 1647 | $L_{1-5}$ | $L_{2-139}$ |
| Compound 1648 | $L_{1-5}$ | $L_{2-140}$ |
| Compound 1649 | $L_{1-5}$ | $L_{2-141}$ |
| Compound 1650 | $L_{1-5}$ | $L_{2-142}$ |
| Compound 1651 | $L_{1-5}$ | $L_{2-143}$ |
| Compound 1652 | $L_{1-5}$ | $L_{2-144}$ |
| Compound 1653 | $L_{1-5}$ | $L_{2-145}$ |
| Compound 1654 | $L_{1-5}$ | $L_{2-146}$ |
| Compound 1655 | $L_{1-5}$ | $L_{2-147}$ |
| Compound 1656 | $L_{1-5}$ | $L_{2-148}$ |
| Compound 1657 | $L_{1-5}$ | $L_{2-149}$ |
| Compound 1658 | $L_{1-5}$ | $L_{2-150}$ |
| Compound 1659 | $L_{1-5}$ | $L_{2-151}$ |
| Compound 1660 | $L_{1-5}$ | $L_{2-152}$ |
| Compound 1661 | $L_{1-5}$ | $L_{2-153}$ |
| Compound 1662 | $L_{1-5}$ | $L_{2-154}$ |
| Compound 1663 | $L_{1-5}$ | $L_{2-155}$ |
| Compound 1664 | $L_{1-5}$ | $L_{2-156}$ |
| Compound 1665 | $L_{1-5}$ | $L_{2-157}$ |
| Compound 1666 | $L_{1-5}$ | $L_{2-158}$ |
| Compound 1667 | $L_{1-5}$ | $L_{2-159}$ |
| Compound 1668 | $L_{1-5}$ | $L_{2-160}$ |
| Compound 1669 | $L_{1-5}$ | $L_{2-161}$ |

TABLE 1-continued

| | | |
|---|---|---|
| Compound 1670 | $L_{1-5}$ | $L_{2-162}$ |
| Compound 1671 | $L_{1-5}$ | $L_{2-163}$ |
| Compound 1672 | $L_{1-5}$ | $L_{2-164}$ |
| Compound 1673 | $L_{1-5}$ | $L_{2-165}$ |
| Compound 1674 | $L_{1-5}$ | $L_{2-166}$ |
| Compound 1675 | $L_{1-5}$ | $L_{2-167}$ |
| Compound 1676 | $L_{1-5}$ | $L_{2-168}$ |
| Compound 1677 | $L_{1-5}$ | $L_{2-169}$ |
| Compound 1678 | $L_{1-5}$ | $L_{2-170}$ |
| Compound 1679 | $L_{1-5}$ | $L_{2-171}$ |
| Compound 1680 | $L_{1-5}$ | $L_{2-172}$ |
| Compound 1681 | $L_{1-5}$ | $L_{2-173}$ |
| Compound 1682 | $L_{1-5}$ | $L_{2-174}$ |
| Compound 1683 | $L_{1-5}$ | $L_{2-175}$ |
| Compound 1684 | $L_{1-5}$ | $L_{2-176}$ |
| Compound 1685 | $L_{1-5}$ | $L_{2-177}$ |
| Compound 1686 | $L_{1-5}$ | $L_{2-178}$ |
| Compound 1687 | $L_{1-5}$ | $L_{2-179}$ |
| Compound 1688 | $L_{1-5}$ | $L_{2-180}$ |
| Compound 1689 | $L_{1-5}$ | $L_{2-181}$ |
| Compound 1690 | $L_{1-5}$ | $L_{2-182}$ |
| Compound 1691 | $L_{1-5}$ | $L_{2-183}$ |
| Compound 1692 | $L_{1-5}$ | $L_{2-184}$ |
| Compound 1693 | $L_{1-5}$ | $L_{2-185}$ |
| Compound 1694 | $L_{1-5}$ | $L_{2-186}$ |
| Compound 1695 | $L_{1-5}$ | $L_{2-187}$ |
| Compound 1696 | $L_{1-5}$ | $L_{2-188}$ |
| Compound 1697 | $L_{1-5}$ | $L_{2-189}$ |
| Compound 1698 | $L_{1-5}$ | $L_{2-190}$ |
| Compound 1699 | $L_{1-5}$ | $L_{2-191}$ |
| Compound 1700 | $L_{1-5}$ | $L_{2-192}$ |
| Compound 1701 | $L_{1-5}$ | $L_{2-193}$ |
| Compound 1702 | $L_{1-5}$ | $L_{2-194}$ |
| Compound 1703 | $L_{1-5}$ | $L_{2-195}$ |
| Compound 1704 | $L_{1-5}$ | $L_{2-196}$ |
| Compound 1705 | $L_{1-5}$ | $L_{2-197}$ |
| Compound 1706 | $L_{1-5}$ | $L_{2-198}$ |
| Compound 1707 | $L_{1-5}$ | $L_{2-199}$ |
| Compound 1708 | $L_{1-5}$ | $L_{2-200}$ |
| Compound 1709 | $L_{1-5}$ | $L_{2-201}$ |
| Compound 1710 | $L_{1-5}$ | $L_{2-202}$ |
| Compound 1711 | $L_{1-5}$ | $L_{2-203}$ |
| Compound 1712 | $L_{1-5}$ | $L_{2-204}$ |
| Compound 1713 | $L_{1-5}$ | $L_{2-205}$ |
| Compound 1714 | $L_{1-5}$ | $L_{2-206}$ |
| Compound 1715 | $L_{1-5}$ | $L_{2-207}$ |
| Compound 1716 | $L_{1-5}$ | $L_{2-208}$ |
| Compound 1717 | $L_{1-5}$ | $L_{2-209}$ |
| Compound 1718 | $L_{1-5}$ | $L_{2-210}$ |
| Compound 1719 | $L_{1-5}$ | $L_{2-211}$ |
| Compound 1720 | $L_{1-5}$ | $L_{2-212}$ |
| Compound 1721 | $L_{1-5}$ | $L_{2-213}$ |
| Compound 1722 | $L_{1-5}$ | $L_{2-214}$ |
| Compound 1723 | $L_{1-5}$ | $L_{2-215}$ |
| Compound 1724 | $L_{1-5}$ | $L_{2-216}$ |
| Compound 1725 | $L_{1-5}$ | $L_{2-217}$ |
| Compound 1726 | $L_{1-5}$ | $L_{2-218}$ |
| Compound 1727 | $L_{1-5}$ | $L_{2-219}$ |
| Compound 1728 | $L_{1-5}$ | $L_{2-220}$ |
| Compound 1729 | $L_{1-5}$ | $L_{2-221}$ |
| Compound 1730 | $L_{1-5}$ | $L_{2-222}$ |
| Compound 1731 | $L_{1-5}$ | $L_{2-223}$ |
| Compound 1732 | $L_{1-5}$ | $L_{2-224}$ |
| Compound 1733 | $L_{1-5}$ | $L_{2-225}$ |
| Compound 1734 | $L_{1-5}$ | $L_{2-226}$ |
| Compound 1735 | $L_{1-5}$ | $L_{2-227}$ |
| Compound 1736 | $L_{1-5}$ | $L_{2-228}$ |
| Compound 1737 | $L_{1-5}$ | $L_{2-229}$ |
| Compound 1738 | $L_{1-5}$ | $L_{2-230}$ |
| Compound 1739 | $L_{1-5}$ | $L_{2-231}$ |
| Compound 1740 | $L_{1-5}$ | $L_{2-232}$ |
| Compound 1741 | $L_{1-5}$ | $L_{2-233}$ |
| Compound 1742 | $L_{1-5}$ | $L_{2-234}$ |
| Compound 1743 | $L_{1-5}$ | $L_{2-235}$ |
| Compound 1744 | $L_{1-5}$ | $L_{2-236}$ |
| Compound 1745 | $L_{1-5}$ | $L_{2-237}$ |
| Compound 1746 | $L_{1-5}$ | $L_{2-238}$ |
| Compound 1747 | $L_{1-5}$ | $L_{2-239}$ |
| Compound 1748 | $L_{1-5}$ | $L_{2-240}$ |
| Compound 1749 | $L_{1-5}$ | $L_{2-241}$ |

TABLE 1-continued

| | | |
|---|---|---|
| Compound 1750 | $L_{1-5}$ | $L_{2-242}$ |
| Compound 1751 | $L_{1-5}$ | $L_{2-243}$ |
| Compound 1752 | $L_{1-5}$ | $L_{2-244}$ |
| Compound 1753 | $L_{1-5}$ | $L_{2-245}$ |
| Compound 1754 | $L_{1-5}$ | $L_{2-246}$ |
| Compound 1755 | $L_{1-5}$ | $L_{2-247}$ |
| Compound 1756 | $L_{1-5}$ | $L_{2-248}$ |
| Compound 1757 | $L_{1-5}$ | $L_{2-249}$ |
| Compound 1758 | $L_{1-5}$ | $L_{2-250}$ |
| Compound 1759 | $L_{1-5}$ | $L_{2-251}$ |
| Compound 1760 | $L_{1-5}$ | $L_{2-252}$ |
| Compound 1761 | $L_{1-5}$ | $L_{2-253}$ |
| Compound 1762 | $L_{1-5}$ | $L_{2-254}$ |
| Compound 1763 | $L_{1-5}$ | $L_{2-255}$ |
| Compound 1764 | $L_{1-5}$ | $L_{2-256}$ |
| Compound 1765 | $L_{1-5}$ | $L_{2-257}$ |
| Compound 1766 | $L_{1-5}$ | $L_{2-258}$ |
| Compound 1767 | $L_{1-5}$ | $L_{2-259}$ |
| Compound 1768 | $L_{1-5}$ | $L_{2-260}$ |
| Compound 1769 | $L_{1-5}$ | $L_{2-261}$ |
| Compound 1770 | $L_{1-5}$ | $L_{2-262}$ |
| Compound 1771 | $L_{1-5}$ | $L_{2-263}$ |
| Compound 1772 | $L_{1-5}$ | $L_{2-264}$ |
| Compound 1773 | $L_{1-5}$ | $L_{2-265}$ |
| Compound 1774 | $L_{1-5}$ | $L_{2-266}$ |
| Compound 1775 | $L_{1-5}$ | $L_{2-267}$ |
| Compound 1776 | $L_{1-5}$ | $L_{2-268}$ |
| Compound 1777 | $L_{1-5}$ | $L_{2-269}$ |
| Compound 1778 | $L_{1-5}$ | $L_{2-270}$ |
| Compound 1779 | $L_{1-5}$ | $L_{2-271}$ |
| Compound 1780 | $L_{1-5}$ | $L_{2-272}$ |
| Compound 1781 | $L_{1-5}$ | $L_{2-273}$ |
| Compound 1782 | $L_{1-5}$ | $L_{2-274}$ |
| Compound 1783 | $L_{1-5}$ | $L_{2-275}$ |
| Compound 1784 | $L_{1-5}$ | $L_{2-276}$ |
| Compound 1785 | $L_{1-5}$ | $L_{2-277}$ |
| Compound 1786 | $L_{1-5}$ | $L_{2-278}$ |
| Compound 1787 | $L_{1-5}$ | $L_{2-279}$ |
| Compound 1788 | $L_{1-5}$ | $L_{2-280}$ |
| Compound 1789 | $L_{1-5}$ | $L_{2-281}$ |
| Compound 1790 | $L_{1-5}$ | $L_{2-282}$ |
| Compound 1791 | $L_{1-5}$ | $L_{2-283}$ |
| Compound 1792 | $L_{1-5}$ | $L_{2-284}$ |
| Compound 1793 | $L_{1-5}$ | $L_{2-285}$ |
| Compound 1794 | $L_{1-5}$ | $L_{2-286}$ |
| Compound 1795 | $L_{1-5}$ | $L_{2-287}$ |
| Compound 1796 | $L_{1-5}$ | $L_{2-288}$ |
| Compound 1797 | $L_{1-5}$ | $L_{2-289}$ |
| Compound 1798 | $L_{1-5}$ | $L_{2-290}$ |
| Compound 1799 | $L_{1-5}$ | $L_{2-291}$ |
| Compound 1800 | $L_{1-5}$ | $L_{2-292}$ |
| Compound 1801 | $L_{1-5}$ | $L_{2-293}$ |
| Compound 1802 | $L_{1-5}$ | $L_{2-294}$ |
| Compound 1803 | $L_{1-5}$ | $L_{2-295}$ |
| Compound 1804 | $L_{1-5}$ | $L_{2-296}$ |
| Compound 1805 | $L_{1-5}$ | $L_{2-297}$ |
| Compound 1806 | $L_{1-5}$ | $L_{2-298}$ |
| Compound 1807 | $L_{1-5}$ | $L_{2-299}$ |
| Compound 1808 | $L_{1-5}$ | $L_{2-300}$ |
| Compound 1809 | $L_{1-5}$ | $L_{2-301}$ |
| Compound 1810 | $L_{1-5}$ | $L_{2-302}$ |
| Compound 1811 | $L_{1-5}$ | $L_{2-303}$ |
| Compound 1812 | $L_{1-5}$ | $L_{2-304}$ |
| Compound 1813 | $L_{1-5}$ | $L_{2-305}$ |
| Compound 1814 | $L_{1-5}$ | $L_{2-306}$ |
| Compound 1815 | $L_{1-5}$ | $L_{2-307}$ |
| Compound 1816 | $L_{1-5}$ | $L_{2-308}$ |
| Compound 1817 | $L_{1-5}$ | $L_{2-309}$ |
| Compound 1818 | $L_{1-5}$ | $L_{2-310}$ |
| Compound 1819 | $L_{1-5}$ | $L_{2-311}$ |
| Compound 1820 | $L_{1-5}$ | $L_{2-312}$ |
| Compound 1821 | $L_{1-5}$ | $L_{2-313}$ |
| Compound 1822 | $L_{1-5}$ | $L_{2-314}$ |
| Compound 1823 | $L_{1-5}$ | $L_{2-315}$ |
| Compound 1824 | $L_{1-5}$ | $L_{2-316}$ |
| Compound 1825 | $L_{1-5}$ | $L_{2-317}$ |
| Compound 1826 | $L_{1-5}$ | $L_{2-318}$ |
| Compound 1827 | $L_{1-5}$ | $L_{2-319}$ |
| Compound 1828 | $L_{1-5}$ | $L_{2-320}$ |
| Compound 1829 | $L_{1-5}$ | $L_{2-321}$ |

TABLE 1-continued

| | | |
|---|---|---|
| Compound 1830 | $L_{1-5}$ | $L_{2-322}$ |
| Compound 1831 | $L_{1-5}$ | $L_{2-323}$ |
| Compound 1832 | $L_{1-5}$ | $L_{2-324}$ |
| Compound 1833 | $L_{1-5}$ | $L_{2-325}$ |
| Compound 1834 | $L_{1-5}$ | $L_{2-326}$ |
| Compound 1835 | $L_{1-5}$ | $L_{2-327}$ |
| Compound 1836 | $L_{1-5}$ | $L_{2-328}$ |
| Compound 1837 | $L_{1-5}$ | $L_{2-329}$ |
| Compound 1838 | $L_{1-5}$ | $L_{2-330}$ |
| Compound 1839 | $L_{1-5}$ | $L_{2-331}$ |
| Compound 1840 | $L_{1-5}$ | $L_{2-332}$ |
| Compound 1841 | $L_{1-5}$ | $L_{2-333}$ |
| Compound 1842 | $L_{1-5}$ | $L_{2-334}$ |
| Compound 1843 | $L_{1-5}$ | $L_{2-335}$ |
| Compound 1844 | $L_{1-5}$ | $L_{2-336}$ |
| Compound 1845 | $L_{1-5}$ | $L_{2-337}$ |
| Compound 1846 | $L_{1-5}$ | $L_{2-338}$ |
| Compound 1847 | $L_{1-5}$ | $L_{2-339}$ |
| Compound 1848 | $L_{1-5}$ | $L_{2-340}$ |
| Compound 1849 | $L_{1-5}$ | $L_{2-341}$ |
| Compound 1850 | $L_{1-5}$ | $L_{2-342}$ |
| Compound 1851 | $L_{1-5}$ | $L_{2-343}$ |
| Compound 1852 | $L_{1-5}$ | $L_{2-344}$ |
| Compound 1853 | $L_{1-5}$ | $L_{2-345}$ |
| Compound 1854 | $L_{1-5}$ | $L_{2-346}$ |
| Compound 1855 | $L_{1-5}$ | $L_{2-347}$ |
| Compound 1856 | $L_{1-5}$ | $L_{2-348}$ |
| Compound 1857 | $L_{1-5}$ | $L_{2-349}$ |
| Compound 1858 | $L_{1-5}$ | $L_{2-350}$ |
| Compound 1859 | $L_{1-5}$ | $L_{2-351}$ |
| Compound 1860 | $L_{1-5}$ | $L_{2-352}$ |
| Compound 1861 | $L_{1-5}$ | $L_{2-353}$ |
| Compound 1862 | $L_{1-5}$ | $L_{2-354}$ |
| Compound 1863 | $L_{1-5}$ | $L_{2-355}$ |
| Compound 1864 | $L_{1-5}$ | $L_{2-356}$ |
| Compound 1865 | $L_{1-5}$ | $L_{2-357}$ |
| Compound 1866 | $L_{1-5}$ | $L_{2-358}$ |
| Compound 1867 | $L_{1-5}$ | $L_{2-359}$ |
| Compound 1868 | $L_{1-5}$ | $L_{2-360}$ |
| Compound 1869 | $L_{1-5}$ | $L_{2-361}$ |
| Compound 1870 | $L_{1-5}$ | $L_{2-362}$ |
| Compound 1871 | $L_{1-5}$ | $L_{2-363}$ |
| Compound 1872 | $L_{1-5}$ | $L_{2-364}$ |
| Compound 1873 | $L_{1-5}$ | $L_{2-365}$ |
| Compound 1874 | $L_{1-5}$ | $L_{2-366}$ |
| Compound 1875 | $L_{1-5}$ | $L_{2-367}$ |
| Compound 1876 | $L_{1-5}$ | $L_{2-368}$ |
| Compound 1877 | $L_{1-5}$ | $L_{2-369}$ |
| Compound 1878 | $L_{1-5}$ | $L_{2-370}$ |
| Compound 1879 | $L_{1-5}$ | $L_{2-371}$ |
| Compound 1880 | $L_{1-5}$ | $L_{2-372}$ |
| Compound 1881 | $L_{1-5}$ | $L_{2-373}$ |
| Compound 1882 | $L_{1-5}$ | $L_{2-374}$ |
| Compound 1883 | $L_{1-5}$ | $L_{2-375}$ |
| Compound 1884 | $L_{1-5}$ | $L_{2-376}$ |
| Compound 1885 | $L_{1-5}$ | $L_{2-377}$ |
| Compound 1886 | $L_{1-6}$ | $L_{2-1}$ |
| Compound 1887 | $L_{1-6}$ | $L_{2-2}$ |
| Compound 1888 | $L_{1-6}$ | $L_{2-3}$ |
| Compound 1889 | $L_{1-6}$ | $L_{2-4}$ |
| Compound 1890 | $L_{1-6}$ | $L_{2-5}$ |
| Compound 1891 | $L_{1-6}$ | $L_{2-6}$ |
| Compound 1892 | $L_{1-6}$ | $L_{2-7}$ |
| Compound 1893 | $L_{1-6}$ | $L_{2-8}$ |
| Compound 1894 | $L_{1-6}$ | $L_{2-9}$ |
| Compound 1895 | $L_{1-6}$ | $L_{2-10}$ |
| Compound 1896 | $L_{1-6}$ | $L_{2-11}$ |
| Compound 1897 | $L_{1-6}$ | $L_{2-12}$ |
| Compound 1898 | $L_{1-6}$ | $L_{2-13}$ |
| Compound 1899 | $L_{1-6}$ | $L_{2-14}$ |
| Compound 1900 | $L_{1-6}$ | $L_{2-15}$ |
| Compound 1901 | $L_{1-6}$ | $L_{2-16}$ |
| Compound 1902 | $L_{1-6}$ | $L_{2-17}$ |
| Compound 1903 | $L_{1-6}$ | $L_{2-18}$ |
| Compound 1904 | $L_{1-6}$ | $L_{2-19}$ |
| Compound 1905 | $L_{1-6}$ | $L_{2-20}$ |
| Compound 1906 | $L_{1-6}$ | $L_{2-21}$ |
| Compound 1907 | $L_{1-6}$ | $L_{2-22}$ |
| Compound 1908 | $L_{1-6}$ | $L_{2-23}$ |
| Compound 1909 | $L_{1-6}$ | $L_{2-24}$ |
| Compound 1910 | $L_{1-6}$ | $L_{2-25}$ |
| Compound 1911 | $L_{1-6}$ | $L_{2-26}$ |
| Compound 1912 | $L_{1-6}$ | $L_{2-27}$ |
| Compound 1913 | $L_{1-6}$ | $L_{2-28}$ |
| Compound 1914 | $L_{1-6}$ | $L_{2-29}$ |
| Compound 1915 | $L_{1-6}$ | $L_{2-30}$ |
| Compound 1916 | $L_{1-6}$ | $L_{2-31}$ |
| Compound 1917 | $L_{1-6}$ | $L_{2-32}$ |
| Compound 1918 | $L_{1-6}$ | $L_{2-33}$ |
| Compound 1919 | $L_{1-6}$ | $L_{2-34}$ |
| Compound 1920 | $L_{1-6}$ | $L_{2-35}$ |
| Compound 1921 | $L_{1-6}$ | $L_{2-36}$ |
| Compound 1922 | $L_{1-6}$ | $L_{2-37}$ |
| Compound 1923 | $L_{1-6}$ | $L_{2-38}$ |
| Compound 1924 | $L_{1-6}$ | $L_{2-39}$ |
| Compound 1925 | $L_{1-6}$ | $L_{2-40}$ |
| Compound 1926 | $L_{1-6}$ | $L_{2-41}$ |
| Compound 1927 | $L_{1-6}$ | $L_{2-42}$ |
| Compound 1928 | $L_{1-6}$ | $L_{2-43}$ |
| Compound 1929 | $L_{1-6}$ | $L_{2-44}$ |
| Compound 1930 | $L_{1-6}$ | $L_{2-45}$ |
| Compound 1931 | $L_{1-6}$ | $L_{2-46}$ |
| Compound 1932 | $L_{1-6}$ | $L_{2-47}$ |
| Compound 1933 | $L_{1-6}$ | $L_{2-48}$ |
| Compound 1934 | $L_{1-6}$ | $L_{2-49}$ |
| Compound 1935 | $L_{1-6}$ | $L_{2-50}$ |
| Compound 1936 | $L_{1-6}$ | $L_{2-51}$ |
| Compound 1937 | $L_{1-6}$ | $L_{2-52}$ |
| Compound 1938 | $L_{1-6}$ | $L_{2-53}$ |
| Compound 1939 | $L_{1-6}$ | $L_{2-54}$ |
| Compound 1940 | $L_{1-6}$ | $L_{2-55}$ |
| Compound 1941 | $L_{1-6}$ | $L_{2-56}$ |
| Compound 1942 | $L_{1-6}$ | $L_{2-57}$ |
| Compound 1943 | $L_{1-6}$ | $L_{2-58}$ |
| Compound 1944 | $L_{1-6}$ | $L_{2-59}$ |
| Compound 1945 | $L_{1-6}$ | $L_{2-60}$ |
| Compound 1946 | $L_{1-6}$ | $L_{2-61}$ |
| Compound 1947 | $L_{1-6}$ | $L_{2-62}$ |
| Compound 1948 | $L_{1-6}$ | $L_{2-63}$ |
| Compound 1949 | $L_{1-6}$ | $L_{2-64}$ |
| Compound 1950 | $L_{1-6}$ | $L_{2-65}$ |
| Compound 1951 | $L_{1-6}$ | $L_{2-66}$ |
| Compound 1952 | $L_{1-6}$ | $L_{2-67}$ |
| Compound 1953 | $L_{1-6}$ | $L_{2-68}$ |
| Compound 1954 | $L_{1-6}$ | $L_{2-69}$ |
| Compound 1955 | $L_{1-6}$ | $L_{2-70}$ |
| Compound 1956 | $L_{1-6}$ | $L_{2-71}$ |
| Compound 1957 | $L_{1-6}$ | $L_{2-72}$ |
| Compound 1958 | $L_{1-6}$ | $L_{2-73}$ |
| Compound 1959 | $L_{1-6}$ | $L_{2-74}$ |
| Compound 1960 | $L_{1-6}$ | $L_{2-75}$ |
| Compound 1961 | $L_{1-6}$ | $L_{2-76}$ |
| Compound 1962 | $L_{1-6}$ | $L_{2-77}$ |
| Compound 1963 | $L_{1-6}$ | $L_{2-78}$ |
| Compound 1964 | $L_{1-6}$ | $L_{2-79}$ |
| Compound 1965 | $L_{1-6}$ | $L_{2-80}$ |
| Compound 1966 | $L_{1-6}$ | $L_{2-81}$ |
| Compound 1967 | $L_{1-6}$ | $L_{2-82}$ |
| Compound 1968 | $L_{1-6}$ | $L_{2-83}$ |
| Compound 1969 | $L_{1-6}$ | $L_{2-84}$ |
| Compound 1970 | $L_{1-6}$ | $L_{2-85}$ |
| Compound 1971 | $L_{1-6}$ | $L_{2-86}$ |
| Compound 1972 | $L_{1-6}$ | $L_{2-87}$ |
| Compound 1973 | $L_{1-6}$ | $L_{2-88}$ |
| Compound 1974 | $L_{1-6}$ | $L_{2-89}$ |
| Compound 1975 | $L_{1-6}$ | $L_{2-90}$ |
| Compound 1976 | $L_{1-6}$ | $L_{2-91}$ |
| Compound 1977 | $L_{1-6}$ | $L_{2-92}$ |
| Compound 1978 | $L_{1-6}$ | $L_{2-93}$ |
| Compound 1979 | $L_{1-6}$ | $L_{2-94}$ |
| Compound 1980 | $L_{1-6}$ | $L_{2-95}$ |
| Compound 1981 | $L_{1-6}$ | $L_{2-96}$ |
| Compound 1982 | $L_{1-6}$ | $L_{2-97}$ |
| Compound 1983 | $L_{1-6}$ | $L_{2-98}$ |
| Compound 1984 | $L_{1-6}$ | $L_{2-99}$ |
| Compound 1985 | $L_{1-6}$ | $L_{2-100}$ |
| Compound 1986 | $L_{1-6}$ | $L_{2-101}$ |
| Compound 1987 | $L_{1-6}$ | $L_{2-102}$ |
| Compound 1988 | $L_{1-6}$ | $L_{2-103}$ |
| Compound 1989 | $L_{1-6}$ | $L_{2-104}$ |

TABLE 1-continued

| | | |
|---|---|---|
| Compound 1990 | $L_{1-6}$ | $L_{2-105}$ |
| Compound 1991 | $L_{1-6}$ | $L_{2-106}$ |
| Compound 1992 | $L_{1-6}$ | $L_{2-107}$ |
| Compound 1993 | $L_{1-6}$ | $L_{2-108}$ |
| Compound 1994 | $L_{1-6}$ | $L_{2-109}$ |
| Compound 1995 | $L_{1-6}$ | $L_{2-110}$ |
| Compound 1996 | $L_{1-6}$ | $L_{2-111}$ |
| Compound 1997 | $L_{1-6}$ | $L_{2-112}$ |
| Compound 1998 | $L_{1-6}$ | $L_{2-113}$ |
| Compound 1999 | $L_{1-6}$ | $L_{2-114}$ |
| Compound 2000 | $L_{1-6}$ | $L_{2-115}$ |
| Compound 2001 | $L_{1-6}$ | $L_{2-116}$ |
| Compound 2002 | $L_{1-6}$ | $L_{2-117}$ |
| Compound 2003 | $L_{1-6}$ | $L_{2-118}$ |
| Compound 2004 | $L_{1-6}$ | $L_{2-119}$ |
| Compound 2005 | $L_{1-6}$ | $L_{2-120}$ |
| Compound 2006 | $L_{1-6}$ | $L_{2-121}$ |
| Compound 2007 | $L_{1-6}$ | $L_{2-122}$ |
| Compound 2008 | $L_{1-6}$ | $L_{2-123}$ |
| Compound 2009 | $L_{1-6}$ | $L_{2-124}$ |
| Compound 2010 | $L_{1-6}$ | $L_{2-125}$ |
| Compound 2011 | $L_{1-6}$ | $L_{2-126}$ |
| Compound 2012 | $L_{1-6}$ | $L_{2-127}$ |
| Compound 2013 | $L_{1-6}$ | $L_{2-128}$ |
| Compound 2014 | $L_{1-6}$ | $L_{2-129}$ |
| Compound 2015 | $L_{1-6}$ | $L_{2-130}$ |
| Compound 2016 | $L_{1-6}$ | $L_{2-131}$ |
| Compound 2017 | $L_{1-6}$ | $L_{2-132}$ |
| Compound 2018 | $L_{1-6}$ | $L_{2-133}$ |
| Compound 2019 | $L_{1-6}$ | $L_{2-134}$ |
| Compound 2020 | $L_{1-6}$ | $L_{2-135}$ |
| Compound 2021 | $L_{1-6}$ | $L_{2-136}$ |
| Compound 2022 | $L_{1-6}$ | $L_{2-137}$ |
| Compound 2023 | $L_{1-6}$ | $L_{2-138}$ |
| Compound 2024 | $L_{1-6}$ | $L_{2-139}$ |
| Compound 2025 | $L_{1-6}$ | $L_{2-140}$ |
| Compound 2026 | $L_{1-6}$ | $L_{2-141}$ |
| Compound 2027 | $L_{1-6}$ | $L_{2-142}$ |
| Compound 2028 | $L_{1-6}$ | $L_{2-143}$ |
| Compound 2029 | $L_{1-6}$ | $L_{2-144}$ |
| Compound 2030 | $L_{1-6}$ | $L_{2-145}$ |
| Compound 2031 | $L_{1-6}$ | $L_{2-146}$ |
| Compound 2032 | $L_{1-6}$ | $L_{2-147}$ |
| Compound 2033 | $L_{1-6}$ | $L_{2-148}$ |
| Compound 2034 | $L_{1-6}$ | $L_{2-149}$ |
| Compound 2035 | $L_{1-6}$ | $L_{2-150}$ |
| Compound 2036 | $L_{1-6}$ | $L_{2-151}$ |
| Compound 2037 | $L_{1-6}$ | $L_{2-152}$ |
| Compound 2038 | $L_{1-6}$ | $L_{2-153}$ |
| Compound 2039 | $L_{1-6}$ | $L_{2-154}$ |
| Compound 2040 | $L_{1-6}$ | $L_{2-155}$ |
| Compound 2041 | $L_{1-6}$ | $L_{2-156}$ |
| Compound 2042 | $L_{1-6}$ | $L_{2-157}$ |
| Compound 2043 | $L_{1-6}$ | $L_{2-158}$ |
| Compound 2044 | $L_{1-6}$ | $L_{2-159}$ |
| Compound 2045 | $L_{1-6}$ | $L_{2-160}$ |
| Compound 2046 | $L_{1-6}$ | $L_{2-161}$ |
| Compound 2047 | $L_{1-6}$ | $L_{2-162}$ |
| Compound 2048 | $L_{1-6}$ | $L_{2-163}$ |
| Compound 2049 | $L_{1-6}$ | $L_{2-164}$ |
| Compound 2050 | $L_{1-6}$ | $L_{2-165}$ |
| Compound 2051 | $L_{1-6}$ | $L_{2-166}$ |
| Compound 2052 | $L_{1-6}$ | $L_{2-167}$ |
| Compound 2053 | $L_{1-6}$ | $L_{2-168}$ |
| Compound 2054 | $L_{1-6}$ | $L_{2-169}$ |
| Compound 2055 | $L_{1-6}$ | $L_{2-170}$ |
| Compound 2056 | $L_{1-6}$ | $L_{2-171}$ |
| Compound 2057 | $L_{1-6}$ | $L_{2-172}$ |
| Compound 2058 | $L_{1-6}$ | $L_{2-173}$ |
| Compound 2059 | $L_{1-6}$ | $L_{2-174}$ |
| Compound 2060 | $L_{1-6}$ | $L_{2-175}$ |
| Compound 2061 | $L_{1-6}$ | $L_{2-176}$ |
| Compound 2062 | $L_{1-6}$ | $L_{2-177}$ |
| Compound 2063 | $L_{1-6}$ | $L_{2-178}$ |
| Compound 2064 | $L_{1-6}$ | $L_{2-179}$ |
| Compound 2065 | $L_{1-6}$ | $L_{2-180}$ |
| Compound 2066 | $L_{1-6}$ | $L_{2-181}$ |
| Compound 2067 | $L_{1-6}$ | $L_{2-182}$ |
| Compound 2068 | $L_{1-6}$ | $L_{2-183}$ |
| Compound 2069 | $L_{1-6}$ | $L_{2-184}$ |

TABLE 1-continued

| | | |
|---|---|---|
| Compound 2070 | $L_{1-6}$ | $L_{2-185}$ |
| Compound 2071 | $L_{1-6}$ | $L_{2-186}$ |
| Compound 2072 | $L_{1-6}$ | $L_{2-187}$ |
| Compound 2073 | $L_{1-6}$ | $L_{2-188}$ |
| Compound 2074 | $L_{1-6}$ | $L_{2-189}$ |
| Compound 2075 | $L_{1-6}$ | $L_{2-190}$ |
| Compound 2076 | $L_{1-6}$ | $L_{2-191}$ |
| Compound 2077 | $L_{1-6}$ | $L_{2-192}$ |
| Compound 2078 | $L_{1-6}$ | $L_{2-193}$ |
| Compound 2079 | $L_{1-6}$ | $L_{2-194}$ |
| Compound 2080 | $L_{1-6}$ | $L_{2-195}$ |
| Compound 2081 | $L_{1-6}$ | $L_{2-196}$ |
| Compound 2082 | $L_{1-6}$ | $L_{2-197}$ |
| Compound 2083 | $L_{1-6}$ | $L_{2-198}$ |
| Compound 2084 | $L_{1-6}$ | $L_{2-199}$ |
| Compound 2085 | $L_{1-6}$ | $L_{2-200}$ |
| Compound 2086 | $L_{1-6}$ | $L_{2-201}$ |
| Compound 2087 | $L_{1-6}$ | $L_{2-202}$ |
| Compound 2088 | $L_{1-6}$ | $L_{2-203}$ |
| Compound 2089 | $L_{1-6}$ | $L_{2-204}$ |
| Compound 2090 | $L_{1-6}$ | $L_{2-205}$ |
| Compound 2091 | $L_{1-6}$ | $L_{2-206}$ |
| Compound 2092 | $L_{1-6}$ | $L_{2-207}$ |
| Compound 2093 | $L_{1-6}$ | $L_{2-208}$ |
| Compound 2094 | $L_{1-6}$ | $L_{2-209}$ |
| Compound 2095 | $L_{1-6}$ | $L_{2-210}$ |
| Compound 2096 | $L_{1-6}$ | $L_{2-211}$ |
| Compound 2097 | $L_{1-6}$ | $L_{2-212}$ |
| Compound 2098 | $L_{1-6}$ | $L_{2-213}$ |
| Compound 2099 | $L_{1-6}$ | $L_{2-214}$ |
| Compound 2100 | $L_{1-6}$ | $L_{2-215}$ |
| Compound 2101 | $L_{1-6}$ | $L_{2-216}$ |
| Compound 2102 | $L_{1-6}$ | $L_{2-217}$ |
| Compound 2103 | $L_{1-6}$ | $L_{2-218}$ |
| Compound 2104 | $L_{1-6}$ | $L_{2-219}$ |
| Compound 2105 | $L_{1-6}$ | $L_{2-220}$ |
| Compound 2106 | $L_{1-6}$ | $L_{2-221}$ |
| Compound 2107 | $L_{1-6}$ | $L_{2-222}$ |
| Compound 2108 | $L_{1-6}$ | $L_{2-223}$ |
| Compound 2109 | $L_{1-6}$ | $L_{2-224}$ |
| Compound 2110 | $L_{1-6}$ | $L_{2-225}$ |
| Compound 2111 | $L_{1-6}$ | $L_{2-226}$ |
| Compound 2112 | $L_{1-6}$ | $L_{2-227}$ |
| Compound 2113 | $L_{1-6}$ | $L_{2-228}$ |
| Compound 2114 | $L_{1-6}$ | $L_{2-229}$ |
| Compound 2115 | $L_{1-6}$ | $L_{2-230}$ |
| Compound 2116 | $L_{1-6}$ | $L_{2-231}$ |
| Compound 2117 | $L_{1-6}$ | $L_{2-232}$ |
| Compound 2118 | $L_{1-6}$ | $L_{2-233}$ |
| Compound 2119 | $L_{1-6}$ | $L_{2-234}$ |
| Compound 2120 | $L_{1-6}$ | $L_{2-235}$ |
| Compound 2121 | $L_{1-6}$ | $L_{2-236}$ |
| Compound 2122 | $L_{1-6}$ | $L_{2-237}$ |
| Compound 2123 | $L_{1-6}$ | $L_{2-238}$ |
| Compound 2124 | $L_{1-6}$ | $L_{2-239}$ |
| Compound 2125 | $L_{1-6}$ | $L_{2-240}$ |
| Compound 2126 | $L_{1-6}$ | $L_{2-241}$ |
| Compound 2127 | $L_{1-6}$ | $L_{2-242}$ |
| Compound 2128 | $L_{1-6}$ | $L_{2-243}$ |
| Compound 2129 | $L_{1-6}$ | $L_{2-244}$ |
| Compound 2130 | $L_{1-6}$ | $L_{2-245}$ |
| Compound 2131 | $L_{1-6}$ | $L_{2-246}$ |
| Compound 2132 | $L_{1-6}$ | $L_{2-247}$ |
| Compound 2133 | $L_{1-6}$ | $L_{2-248}$ |
| Compound 2134 | $L_{1-6}$ | $L_{2-249}$ |
| Compound 2135 | $L_{1-6}$ | $L_{2-250}$ |
| Compound 2136 | $L_{1-6}$ | $L_{2-251}$ |
| Compound 2137 | $L_{1-6}$ | $L_{2-252}$ |
| Compound 2138 | $L_{1-6}$ | $L_{2-253}$ |
| Compound 2139 | $L_{1-6}$ | $L_{2-254}$ |
| Compound 2140 | $L_{1-6}$ | $L_{2-255}$ |
| Compound 2141 | $L_{1-6}$ | $L_{2-256}$ |
| Compound 2142 | $L_{1-6}$ | $L_{2-257}$ |
| Compound 2143 | $L_{1-6}$ | $L_{2-258}$ |
| Compound 2144 | $L_{1-6}$ | $L_{2-259}$ |
| Compound 2145 | $L_{1-6}$ | $L_{2-260}$ |
| Compound 2146 | $L_{1-6}$ | $L_{2-261}$ |
| Compound 2147 | $L_{1-6}$ | $L_{2-262}$ |
| Compound 2148 | $L_{1-6}$ | $L_{2-263}$ |
| Compound 2149 | $L_{1-6}$ | $L_{2-264}$ |

TABLE 1-continued

| | | |
|---|---|---|
| Compound 2150 | $L_{1-6}$ | $L_{2-265}$ |
| Compound 2151 | $L_{1-6}$ | $L_{2-266}$ |
| Compound 2152 | $L_{1-6}$ | $L_{2-267}$ |
| Compound 2153 | $L_{1-6}$ | $L_{2-268}$ |
| Compound 2154 | $L_{1-6}$ | $L_{2-269}$ |
| Compound 2155 | $L_{1-6}$ | $L_{2-270}$ |
| Compound 2156 | $L_{1-6}$ | $L_{2-271}$ |
| Compound 2157 | $L_{1-6}$ | $L_{2-272}$ |
| Compound 2158 | $L_{1-6}$ | $L_{2-273}$ |
| Compound 2159 | $L_{1-6}$ | $L_{2-274}$ |
| Compound 2160 | $L_{1-6}$ | $L_{2-275}$ |
| Compound 2161 | $L_{1-6}$ | $L_{2-276}$ |
| Compound 2162 | $L_{1-6}$ | $L_{2-277}$ |
| Compound 2163 | $L_{1-6}$ | $L_{2-278}$ |
| Compound 2164 | $L_{1-6}$ | $L_{2-279}$ |
| Compound 2165 | $L_{1-6}$ | $L_{2-280}$ |
| Compound 2166 | $L_{1-6}$ | $L_{2-281}$ |
| Compound 2167 | $L_{1-6}$ | $L_{2-282}$ |
| Compound 2168 | $L_{1-6}$ | $L_{2-283}$ |
| Compound 2169 | $L_{1-6}$ | $L_{2-284}$ |
| Compound 2170 | $L_{1-6}$ | $L_{2-285}$ |
| Compound 2171 | $L_{1-6}$ | $L_{2-286}$ |
| Compound 2172 | $L_{1-6}$ | $L_{2-287}$ |
| Compound 2173 | $L_{1-6}$ | $L_{2-288}$ |
| Compound 2174 | $L_{1-6}$ | $L_{2-289}$ |
| Compound 2175 | $L_{1-6}$ | $L_{2-290}$ |
| Compound 2176 | $L_{1-6}$ | $L_{2-291}$ |
| Compound 2177 | $L_{1-6}$ | $L_{2-292}$ |
| Compound 2178 | $L_{1-6}$ | $L_{2-293}$ |
| Compound 2179 | $L_{1-6}$ | $L_{2-294}$ |
| Compound 2180 | $L_{1-6}$ | $L_{2-295}$ |
| Compound 2181 | $L_{1-6}$ | $L_{2-296}$ |
| Compound 2182 | $L_{1-6}$ | $L_{2-297}$ |
| Compound 2183 | $L_{1-6}$ | $L_{2-298}$ |
| Compound 2184 | $L_{1-6}$ | $L_{2-299}$ |
| Compound 2185 | $L_{1-6}$ | $L_{2-300}$ |
| Compound 2186 | $L_{1-6}$ | $L_{2-301}$ |
| Compound 2187 | $L_{1-6}$ | $L_{2-302}$ |
| Compound 2188 | $L_{1-6}$ | $L_{2-303}$ |
| Compound 2189 | $L_{1-6}$ | $L_{2-304}$ |
| Compound 2190 | $L_{1-6}$ | $L_{2-305}$ |
| Compound 2191 | $L_{1-6}$ | $L_{2-306}$ |
| Compound 2192 | $L_{1-6}$ | $L_{2-307}$ |
| Compound 2193 | $L_{1-6}$ | $L_{2-308}$ |
| Compound 2194 | $L_{1-6}$ | $L_{2-309}$ |
| Compound 2195 | $L_{1-6}$ | $L_{2-310}$ |
| Compound 2196 | $L_{1-6}$ | $L_{2-311}$ |
| Compound 2197 | $L_{1-6}$ | $L_{2-312}$ |
| Compound 2198 | $L_{1-6}$ | $L_{2-313}$ |
| Compound 2199 | $L_{1-6}$ | $L_{2-314}$ |
| Compound 2200 | $L_{1-6}$ | $L_{2-315}$ |
| Compound 2201 | $L_{1-6}$ | $L_{2-316}$ |
| Compound 2202 | $L_{1-6}$ | $L_{2-317}$ |
| Compound 2203 | $L_{1-6}$ | $L_{2-318}$ |
| Compound 2204 | $L_{1-6}$ | $L_{2-319}$ |
| Compound 2205 | $L_{1-6}$ | $L_{2-320}$ |
| Compound 2206 | $L_{1-6}$ | $L_{2-321}$ |
| Compound 2207 | $L_{1-6}$ | $L_{2-322}$ |
| Compound 2208 | $L_{1-6}$ | $L_{2-323}$ |
| Compound 2209 | $L_{1-6}$ | $L_{2-324}$ |
| Compound 2210 | $L_{1-6}$ | $L_{2-325}$ |
| Compound 2211 | $L_{1-6}$ | $L_{2-326}$ |
| Compound 2212 | $L_{1-6}$ | $L_{2-327}$ |
| Compound 2213 | $L_{1-6}$ | $L_{2-328}$ |
| Compound 2214 | $L_{1-6}$ | $L_{2-329}$ |
| Compound 2215 | $L_{1-6}$ | $L_{2-330}$ |
| Compound 2216 | $L_{1-6}$ | $L_{2-331}$ |
| Compound 2217 | $L_{1-6}$ | $L_{2-332}$ |
| Compound 2218 | $L_{1-6}$ | $L_{2-333}$ |
| Compound 2219 | $L_{1-6}$ | $L_{2-334}$ |
| Compound 2220 | $L_{1-6}$ | $L_{2-335}$ |
| Compound 2221 | $L_{1-6}$ | $L_{2-336}$ |
| Compound 2222 | $L_{1-6}$ | $L_{2-337}$ |
| Compound 2223 | $L_{1-6}$ | $L_{2-338}$ |
| Compound 2224 | $L_{1-6}$ | $L_{2-339}$ |
| Compound 2225 | $L_{1-6}$ | $L_{2-340}$ |
| Compound 2226 | $L_{1-6}$ | $L_{2-341}$ |
| Compound 2227 | $L_{1-6}$ | $L_{2-342}$ |
| Compound 2228 | $L_{1-6}$ | $L_{2-343}$ |
| Compound 2229 | $L_{1-6}$ | $L_{2-344}$ |

TABLE 1-continued

| | | |
|---|---|---|
| Compound 2230 | $L_{1-6}$ | $L_{2-345}$ |
| Compound 2231 | $L_{1-6}$ | $L_{2-346}$ |
| Compound 2232 | $L_{1-6}$ | $L_{2-347}$ |
| Compound 2233 | $L_{1-6}$ | $L_{2-348}$ |
| Compound 2234 | $L_{1-6}$ | $L_{2-349}$ |
| Compound 2235 | $L_{1-6}$ | $L_{2-350}$ |
| Compound 2236 | $L_{1-6}$ | $L_{2-351}$ |
| Compound 2237 | $L_{1-6}$ | $L_{2-352}$ |
| Compound 2238 | $L_{1-6}$ | $L_{2-353}$ |
| Compound 2239 | $L_{1-6}$ | $L_{2-354}$ |
| Compound 2240 | $L_{1-6}$ | $L_{2-355}$ |
| Compound 2241 | $L_{1-6}$ | $L_{2-356}$ |
| Compound 2242 | $L_{1-6}$ | $L_{2-357}$ |
| Compound 2243 | $L_{1-6}$ | $L_{2-358}$ |
| Compound 2244 | $L_{1-6}$ | $L_{2-359}$ |
| Compound 2245 | $L_{1-6}$ | $L_{2-360}$ |
| Compound 2246 | $L_{1-6}$ | $L_{2-361}$ |
| Compound 2247 | $L_{1-6}$ | $L_{2-362}$ |
| Compound 2248 | $L_{1-6}$ | $L_{2-363}$ |
| Compound 2249 | $L_{1-6}$ | $L_{2-364}$ |
| Compound 2250 | $L_{1-6}$ | $L_{2-365}$ |
| Compound 2251 | $L_{1-6}$ | $L_{2-366}$ |
| Compound 2252 | $L_{1-6}$ | $L_{2-367}$ |
| Compound 2253 | $L_{1-6}$ | $L_{2-368}$ |
| Compound 2254 | $L_{1-6}$ | $L_{2-369}$ |
| Compound 2255 | $L_{1-6}$ | $L_{2-370}$ |
| Compound 2256 | $L_{1-6}$ | $L_{2-371}$ |
| Compound 2257 | $L_{1-6}$ | $L_{2-372}$ |
| Compound 2258 | $L_{1-6}$ | $L_{2-373}$ |
| Compound 2259 | $L_{1-6}$ | $L_{2-374}$ |
| Compound 2260 | $L_{1-6}$ | $L_{2-375}$ |
| Compound 2261 | $L_{1-6}$ | $L_{2-376}$ |
| Compound 2262 | $L_{1-6}$ | $L_{2-377}$ |
| Compound 2263 | $L_{1-7}$ | $L_{2-1}$ |
| Compound 2264 | $L_{1-7}$ | $L_{2-2}$ |
| Compound 2265 | $L_{1-7}$ | $L_{2-3}$ |
| Compound 2266 | $L_{1-7}$ | $L_{2-4}$ |
| Compound 2267 | $L_{1-7}$ | $L_{2-5}$ |
| Compound 2268 | $L_{1-7}$ | $L_{2-6}$ |
| Compound 2269 | $L_{1-7}$ | $L_{2-7}$ |
| Compound 2270 | $L_{1-7}$ | $L_{2-8}$ |
| Compound 2271 | $L_{1-7}$ | $L_{2-9}$ |
| Compound 2272 | $L_{1-7}$ | $L_{2-10}$ |
| Compound 2273 | $L_{1-7}$ | $L_{2-11}$ |
| Compound 2274 | $L_{1-7}$ | $L_{2-12}$ |
| Compound 2275 | $L_{1-7}$ | $L_{2-13}$ |
| Compound 2276 | $L_{1-7}$ | $L_{2-14}$ |
| Compound 2277 | $L_{1-7}$ | $L_{2-15}$ |
| Compound 2278 | $L_{1-7}$ | $L_{2-16}$ |
| Compound 2279 | $L_{1-7}$ | $L_{2-17}$ |
| Compound 2280 | $L_{1-7}$ | $L_{2-18}$ |
| Compound 2281 | $L_{1-7}$ | $L_{2-19}$ |
| Compound 2282 | $L_{1-7}$ | $L_{2-20}$ |
| Compound 2283 | $L_{1-7}$ | $L_{2-21}$ |
| Compound 2284 | $L_{1-7}$ | $L_{2-22}$ |
| Compound 2285 | $L_{1-7}$ | $L_{2-23}$ |
| Compound 2286 | $L_{1-7}$ | $L_{2-24}$ |
| Compound 2287 | $L_{1-7}$ | $L_{2-25}$ |
| Compound 2288 | $L_{1-7}$ | $L_{2-26}$ |
| Compound 2289 | $L_{1-7}$ | $L_{2-27}$ |
| Compound 2290 | $L_{1-7}$ | $L_{2-28}$ |
| Compound 2291 | $L_{1-7}$ | $L_{2-29}$ |
| Compound 2292 | $L_{1-7}$ | $L_{2-30}$ |
| Compound 2293 | $L_{1-7}$ | $L_{2-31}$ |
| Compound 2294 | $L_{1-7}$ | $L_{2-32}$ |
| Compound 2295 | $L_{1-7}$ | $L_{2-33}$ |
| Compound 2296 | $L_{1-7}$ | $L_{2-34}$ |
| Compound 2297 | $L_{1-7}$ | $L_{2-35}$ |
| Compound 2298 | $L_{1-7}$ | $L_{2-36}$ |
| Compound 2299 | $L_{1-7}$ | $L_{2-37}$ |
| Compound 2300 | $L_{1-7}$ | $L_{2-38}$ |
| Compound 2301 | $L_{1-7}$ | $L_{2-39}$ |
| Compound 2302 | $L_{1-7}$ | $L_{2-40}$ |
| Compound 2303 | $L_{1-7}$ | $L_{2-41}$ |
| Compound 2304 | $L_{1-7}$ | $L_{2-42}$ |
| Compound 2305 | $L_{1-7}$ | $L_{2-43}$ |
| Compound 2306 | $L_{1-7}$ | $L_{2-44}$ |
| Compound 2307 | $L_{1-7}$ | $L_{2-45}$ |
| Compound 2308 | $L_{1-7}$ | $L_{2-46}$ |
| Compound 2309 | $L_{1-7}$ | $L_{2-47}$ |

TABLE 1-continued

| | | |
|---|---|---|
| Compound 2310 | $L_{1-7}$ | $L_{2-48}$ |
| Compound 2311 | $L_{1-7}$ | $L_{2-49}$ |
| Compound 2312 | $L_{1-7}$ | $L_{2-50}$ |
| Compound 2313 | $L_{1-7}$ | $L_{2-51}$ |
| Compound 2314 | $L_{1-7}$ | $L_{2-52}$ |
| Compound 2315 | $L_{1-7}$ | $L_{2-53}$ |
| Compound 2316 | $L_{1-7}$ | $L_{2-54}$ |
| Compound 2317 | $L_{1-7}$ | $L_{2-55}$ |
| Compound 2318 | $L_{1-7}$ | $L_{2-56}$ |
| Compound 2319 | $L_{1-7}$ | $L_{2-57}$ |
| Compound 2320 | $L_{1-7}$ | $L_{2-58}$ |
| Compound 2321 | $L_{1-7}$ | $L_{2-59}$ |
| Compound 2322 | $L_{1-7}$ | $L_{2-60}$ |
| Compound 2323 | $L_{1-7}$ | $L_{2-61}$ |
| Compound 2324 | $L_{1-7}$ | $L_{2-62}$ |
| Compound 2325 | $L_{1-7}$ | $L_{2-63}$ |
| Compound 2326 | $L_{1-7}$ | $L_{2-64}$ |
| Compound 2327 | $L_{1-7}$ | $L_{2-65}$ |
| Compound 2328 | $L_{1-7}$ | $L_{2-66}$ |
| Compound 2329 | $L_{1-7}$ | $L_{2-67}$ |
| Compound 2330 | $L_{1-7}$ | $L_{2-68}$ |
| Compound 2331 | $L_{1-7}$ | $L_{2-69}$ |
| Compound 2332 | $L_{1-7}$ | $L_{2-70}$ |
| Compound 2333 | $L_{1-7}$ | $L_{2-71}$ |
| Compound 2334 | $L_{1-7}$ | $L_{2-72}$ |
| Compound 2335 | $L_{1-7}$ | $L_{2-73}$ |
| Compound 2336 | $L_{1-7}$ | $L_{2-74}$ |
| Compound 2337 | $L_{1-7}$ | $L_{2-75}$ |
| Compound 2338 | $L_{1-7}$ | $L_{2-76}$ |
| Compound 2339 | $L_{1-7}$ | $L_{2-77}$ |
| Compound 2340 | $L_{1-7}$ | $L_{2-78}$ |
| Compound 2341 | $L_{1-7}$ | $L_{2-79}$ |
| Compound 2342 | $L_{1-7}$ | $L_{2-80}$ |
| Compound 2343 | $L_{1-7}$ | $L_{2-81}$ |
| Compound 2344 | $L_{1-7}$ | $L_{2-82}$ |
| Compound 2345 | $L_{1-7}$ | $L_{2-83}$ |
| Compound 2346 | $L_{1-7}$ | $L_{2-84}$ |
| Compound 2347 | $L_{1-7}$ | $L_{2-85}$ |
| Compound 2348 | $L_{1-7}$ | $L_{2-86}$ |
| Compound 2349 | $L_{1-7}$ | $L_{2-87}$ |
| Compound 2350 | $L_{1-7}$ | $L_{2-88}$ |
| Compound 2351 | $L_{1-7}$ | $L_{2-89}$ |
| Compound 2352 | $L_{1-7}$ | $L_{2-90}$ |
| Compound 2353 | $L_{1-7}$ | $L_{2-91}$ |
| Compound 2354 | $L_{1-7}$ | $L_{2-92}$ |
| Compound 2355 | $L_{1-7}$ | $L_{2-93}$ |
| Compound 2356 | $L_{1-7}$ | $L_{2-94}$ |
| Compound 2357 | $L_{1-7}$ | $L_{2-95}$ |
| Compound 2358 | $L_{1-7}$ | $L_{2-96}$ |
| Compound 2359 | $L_{1-7}$ | $L_{2-97}$ |
| Compound 2360 | $L_{1-7}$ | $L_{2-98}$ |
| Compound 2361 | $L_{1-7}$ | $L_{2-99}$ |
| Compound 2362 | $L_{1-7}$ | $L_{2-100}$ |
| Compound 2363 | $L_{1-7}$ | $L_{2-101}$ |
| Compound 2364 | $L_{1-7}$ | $L_{2-102}$ |
| Compound 2365 | $L_{1-7}$ | $L_{2-103}$ |
| Compound 2366 | $L_{1-7}$ | $L_{2-104}$ |
| Compound 2367 | $L_{1-7}$ | $L_{2-105}$ |
| Compound 2368 | $L_{1-7}$ | $L_{2-106}$ |
| Compound 2369 | $L_{1-7}$ | $L_{2-107}$ |
| Compound 2370 | $L_{1-7}$ | $L_{2-108}$ |
| Compound 2371 | $L_{1-7}$ | $L_{2-109}$ |
| Compound 2372 | $L_{1-7}$ | $L_{2-110}$ |
| Compound 2373 | $L_{1-7}$ | $L_{2-111}$ |
| Compound 2374 | $L_{1-7}$ | $L_{2-112}$ |
| Compound 2375 | $L_{1-7}$ | $L_{2-113}$ |
| Compound 2376 | $L_{1-7}$ | $L_{2-114}$ |
| Compound 2377 | $L_{1-7}$ | $L_{2-115}$ |
| Compound 2378 | $L_{1-7}$ | $L_{2-116}$ |
| Compound 2379 | $L_{1-7}$ | $L_{2-117}$ |
| Compound 2380 | $L_{1-7}$ | $L_{2-118}$ |
| Compound 2381 | $L_{1-7}$ | $L_{2-119}$ |
| Compound 2382 | $L_{1-7}$ | $L_{2-120}$ |
| Compound 2383 | $L_{1-7}$ | $L_{2-121}$ |
| Compound 2384 | $L_{1-7}$ | $L_{2-122}$ |
| Compound 2385 | $L_{1-7}$ | $L_{2-123}$ |
| Compound 2386 | $L_{1-7}$ | $L_{2-124}$ |
| Compound 2387 | $L_{1-7}$ | $L_{2-125}$ |
| Compound 2388 | $L_{1-7}$ | $L_{2-126}$ |
| Compound 2389 | $L_{1-7}$ | $L_{2-127}$ |

TABLE 1-continued

| | | |
|---|---|---|
| Compound 2390 | $L_{1-7}$ | $L_{2-128}$ |
| Compound 2391 | $L_{1-7}$ | $L_{2-129}$ |
| Compound 2392 | $L_{1-7}$ | $L_{2-130}$ |
| Compound 2393 | $L_{1-7}$ | $L_{2-131}$ |
| Compound 2394 | $L_{1-7}$ | $L_{2-132}$ |
| Compound 2395 | $L_{1-7}$ | $L_{2-133}$ |
| Compound 2396 | $L_{1-7}$ | $L_{2-134}$ |
| Compound 2397 | $L_{1-7}$ | $L_{2-135}$ |
| Compound 2398 | $L_{1-7}$ | $L_{2-136}$ |
| Compound 2399 | $L_{1-7}$ | $L_{2-137}$ |
| Compound 2400 | $L_{1-7}$ | $L_{2-138}$ |
| Compound 2401 | $L_{1-7}$ | $L_{2-139}$ |
| Compound 2402 | $L_{1-7}$ | $L_{2-140}$ |
| Compound 2403 | $L_{1-7}$ | $L_{2-141}$ |
| Compound 2404 | $L_{1-7}$ | $L_{2-142}$ |
| Compound 2405 | $L_{1-7}$ | $L_{2-143}$ |
| Compound 2406 | $L_{1-7}$ | $L_{2-144}$ |
| Compound 2407 | $L_{1-7}$ | $L_{2-145}$ |
| Compound 2408 | $L_{1-7}$ | $L_{2-146}$ |
| Compound 2409 | $L_{1-7}$ | $L_{2-147}$ |
| Compound 2410 | $L_{1-7}$ | $L_{2-148}$ |
| Compound 2411 | $L_{1-7}$ | $L_{2-149}$ |
| Compound 2412 | $L_{1-7}$ | $L_{2-150}$ |
| Compound 2413 | $L_{1-7}$ | $L_{2-151}$ |
| Compound 2414 | $L_{1-7}$ | $L_{2-152}$ |
| Compound 2415 | $L_{1-7}$ | $L_{2-153}$ |
| Compound 2416 | $L_{1-7}$ | $L_{2-154}$ |
| Compound 2417 | $L_{1-7}$ | $L_{2-155}$ |
| Compound 2418 | $L_{1-7}$ | $L_{2-156}$ |
| Compound 2419 | $L_{1-7}$ | $L_{2-157}$ |
| Compound 2420 | $L_{1-7}$ | $L_{2-158}$ |
| Compound 2421 | $L_{1-7}$ | $L_{2-159}$ |
| Compound 2422 | $L_{1-7}$ | $L_{2-160}$ |
| Compound 2423 | $L_{1-7}$ | $L_{2-161}$ |
| Compound 2424 | $L_{1-7}$ | $L_{2-162}$ |
| Compound 2425 | $L_{1-7}$ | $L_{2-163}$ |
| Compound 2426 | $L_{1-7}$ | $L_{2-164}$ |
| Compound 2427 | $L_{1-7}$ | $L_{2-165}$ |
| Compound 2428 | $L_{1-7}$ | $L_{2-166}$ |
| Compound 2429 | $L_{1-7}$ | $L_{2-167}$ |
| Compound 2430 | $L_{1-7}$ | $L_{2-168}$ |
| Compound 2431 | $L_{1-7}$ | $L_{2-169}$ |
| Compound 2432 | $L_{1-7}$ | $L_{2-170}$ |
| Compound 2433 | $L_{1-7}$ | $L_{2-171}$ |
| Compound 2434 | $L_{1-7}$ | $L_{2-172}$ |
| Compound 2435 | $L_{1-7}$ | $L_{2-173}$ |
| Compound 2436 | $L_{1-7}$ | $L_{2-174}$ |
| Compound 2437 | $L_{1-7}$ | $L_{2-175}$ |
| Compound 2438 | $L_{1-7}$ | $L_{2-176}$ |
| Compound 2439 | $L_{1-7}$ | $L_{2-177}$ |
| Compound 2440 | $L_{1-7}$ | $L_{2-178}$ |
| Compound 2441 | $L_{1-7}$ | $L_{2-179}$ |
| Compound 2442 | $L_{1-7}$ | $L_{2-180}$ |
| Compound 2443 | $L_{1-7}$ | $L_{2-181}$ |
| Compound 2444 | $L_{1-7}$ | $L_{2-182}$ |
| Compound 2445 | $L_{1-7}$ | $L_{2-183}$ |
| Compound 2446 | $L_{1-7}$ | $L_{2-184}$ |
| Compound 2447 | $L_{1-7}$ | $L_{2-185}$ |
| Compound 2448 | $L_{1-7}$ | $L_{2-186}$ |
| Compound 2449 | $L_{1-7}$ | $L_{2-187}$ |
| Compound 2450 | $L_{1-7}$ | $L_{2-188}$ |
| Compound 2451 | $L_{1-7}$ | $L_{2-189}$ |
| Compound 2452 | $L_{1-7}$ | $L_{2-190}$ |
| Compound 2453 | $L_{1-7}$ | $L_{2-191}$ |
| Compound 2454 | $L_{1-7}$ | $L_{2-192}$ |
| Compound 2455 | $L_{1-7}$ | $L_{2-193}$ |
| Compound 2456 | $L_{1-7}$ | $L_{2-194}$ |
| Compound 2457 | $L_{1-7}$ | $L_{2-195}$ |
| Compound 2458 | $L_{1-7}$ | $L_{2-196}$ |
| Compound 2459 | $L_{1-7}$ | $L_{2-197}$ |
| Compound 2460 | $L_{1-7}$ | $L_{2-198}$ |
| Compound 2461 | $L_{1-7}$ | $L_{2-199}$ |
| Compound 2462 | $L_{1-7}$ | $L_{2-200}$ |
| Compound 2463 | $L_{1-7}$ | $L_{2-201}$ |
| Compound 2464 | $L_{1-7}$ | $L_{2-202}$ |
| Compound 2465 | $L_{1-7}$ | $L_{2-203}$ |
| Compound 2466 | $L_{1-7}$ | $L_{2-204}$ |
| Compound 2467 | $L_{1-7}$ | $L_{2-205}$ |
| Compound 2468 | $L_{1-7}$ | $L_{2-206}$ |
| Compound 2469 | $L_{1-7}$ | $L_{2-207}$ |

TABLE 1-continued

| | | |
|---|---|---|
| Compound 2470 | $L_{1-7}$ | $L_{2-208}$ |
| Compound 2471 | $L_{1-7}$ | $L_{2-209}$ |
| Compound 2472 | $L_{1-7}$ | $L_{2-210}$ |
| Compound 2473 | $L_{1-7}$ | $L_{2-211}$ |
| Compound 2474 | $L_{1-7}$ | $L_{2-212}$ |
| Compound 2475 | $L_{1-7}$ | $L_{2-213}$ |
| Compound 2476 | $L_{1-7}$ | $L_{2-214}$ |
| Compound 2477 | $L_{1-7}$ | $L_{2-215}$ |
| Compound 2478 | $L_{1-7}$ | $L_{2-216}$ |
| Compound 2479 | $L_{1-7}$ | $L_{2-217}$ |
| Compound 2480 | $L_{1-7}$ | $L_{2-218}$ |
| Compound 2481 | $L_{1-7}$ | $L_{2-219}$ |
| Compound 2482 | $L_{1-7}$ | $L_{2-220}$ |
| Compound 2483 | $L_{1-7}$ | $L_{2-221}$ |
| Compound 2484 | $L_{1-7}$ | $L_{2-222}$ |
| Compound 2485 | $L_{1-7}$ | $L_{2-223}$ |
| Compound 2486 | $L_{1-7}$ | $L_{2-224}$ |
| Compound 2487 | $L_{1-7}$ | $L_{2-225}$ |
| Compound 2488 | $L_{1-7}$ | $L_{2-226}$ |
| Compound 2489 | $L_{1-7}$ | $L_{2-227}$ |
| Compound 2490 | $L_{1-7}$ | $L_{2-228}$ |
| Compound 2491 | $L_{1-7}$ | $L_{2-229}$ |
| Compound 2492 | $L_{1-7}$ | $L_{2-230}$ |
| Compound 2493 | $L_{1-7}$ | $L_{2-231}$ |
| Compound 2494 | $L_{1-7}$ | $L_{2-232}$ |
| Compound 2495 | $L_{1-7}$ | $L_{2-233}$ |
| Compound 2496 | $L_{1-7}$ | $L_{2-234}$ |
| Compound 2497 | $L_{1-7}$ | $L_{2-235}$ |
| Compound 2498 | $L_{1-7}$ | $L_{2-236}$ |
| Compound 2499 | $L_{1-7}$ | $L_{2-237}$ |
| Compound 2500 | $L_{1-7}$ | $L_{2-238}$ |
| Compound 2501 | $L_{1-7}$ | $L_{2-239}$ |
| Compound 2502 | $L_{1-7}$ | $L_{2-240}$ |
| Compound 2503 | $L_{1-7}$ | $L_{2-241}$ |
| Compound 2504 | $L_{1-7}$ | $L_{2-242}$ |
| Compound 2505 | $L_{1-7}$ | $L_{2-243}$ |
| Compound 2506 | $L_{1-7}$ | $L_{2-244}$ |
| Compound 2507 | $L_{1-7}$ | $L_{2-245}$ |
| Compound 2508 | $L_{1-7}$ | $L_{2-246}$ |
| Compound 2509 | $L_{1-7}$ | $L_{2-247}$ |
| Compound 2510 | $L_{1-7}$ | $L_{2-248}$ |
| Compound 2511 | $L_{1-7}$ | $L_{2-249}$ |
| Compound 2512 | $L_{1-7}$ | $L_{2-250}$ |
| Compound 2513 | $L_{1-7}$ | $L_{2-251}$ |
| Compound 2514 | $L_{1-7}$ | $L_{2-252}$ |
| Compound 2515 | $L_{1-7}$ | $L_{2-253}$ |
| Compound 2516 | $L_{1-7}$ | $L_{2-254}$ |
| Compound 2517 | $L_{1-7}$ | $L_{2-255}$ |
| Compound 2518 | $L_{1-7}$ | $L_{2-256}$ |
| Compound 2519 | $L_{1-7}$ | $L_{2-257}$ |
| Compound 2520 | $L_{1-7}$ | $L_{2-258}$ |
| Compound 2521 | $L_{1-7}$ | $L_{2-259}$ |
| Compound 2522 | $L_{1-7}$ | $L_{2-260}$ |
| Compound 2523 | $L_{1-7}$ | $L_{2-261}$ |
| Compound 2524 | $L_{1-7}$ | $L_{2-262}$ |
| Compound 2525 | $L_{1-7}$ | $L_{2-263}$ |
| Compound 2526 | $L_{1-7}$ | $L_{2-264}$ |
| Compound 2527 | $L_{1-7}$ | $L_{2-265}$ |
| Compound 2528 | $L_{1-7}$ | $L_{2-266}$ |
| Compound 2529 | $L_{1-7}$ | $L_{2-267}$ |
| Compound 2530 | $L_{1-7}$ | $L_{2-268}$ |
| Compound 2531 | $L_{1-7}$ | $L_{2-269}$ |
| Compound 2532 | $L_{1-7}$ | $L_{2-270}$ |
| Compound 2533 | $L_{1-7}$ | $L_{2-271}$ |
| Compound 2534 | $L_{1-7}$ | $L_{2-272}$ |
| Compound 2535 | $L_{1-7}$ | $L_{2-273}$ |
| Compound 2536 | $L_{1-7}$ | $L_{2-274}$ |
| Compound 2537 | $L_{1-7}$ | $L_{2-275}$ |
| Compound 2538 | $L_{1-7}$ | $L_{2-276}$ |
| Compound 2539 | $L_{1-7}$ | $L_{2-277}$ |
| Compound 2540 | $L_{1-7}$ | $L_{2-278}$ |
| Compound 2541 | $L_{1-7}$ | $L_{2-279}$ |
| Compound 2542 | $L_{1-7}$ | $L_{2-280}$ |
| Compound 2543 | $L_{1-7}$ | $L_{2-281}$ |
| Compound 2544 | $L_{1-7}$ | $L_{2-282}$ |
| Compound 2545 | $L_{1-7}$ | $L_{2-283}$ |
| Compound 2546 | $L_{1-7}$ | $L_{2-284}$ |
| Compound 2547 | $L_{1-7}$ | $L_{2-285}$ |
| Compound 2548 | $L_{1-7}$ | $L_{2-286}$ |
| Compound 2549 | $L_{1-7}$ | $L_{2-287}$ |

TABLE 1-continued

| | | |
|---|---|---|
| Compound 2550 | $L_{1-7}$ | $L_{2-288}$ |
| Compound 2551 | $L_{1-7}$ | $L_{2-289}$ |
| Compound 2552 | $L_{1-7}$ | $L_{2-290}$ |
| Compound 2553 | $L_{1-7}$ | $L_{2-291}$ |
| Compound 2554 | $L_{1-7}$ | $L_{2-292}$ |
| Compound 2555 | $L_{1-7}$ | $L_{2-293}$ |
| Compound 2556 | $L_{1-7}$ | $L_{2-294}$ |
| Compound 2557 | $L_{1-7}$ | $L_{2-295}$ |
| Compound 2558 | $L_{1-7}$ | $L_{2-296}$ |
| Compound 2559 | $L_{1-7}$ | $L_{2-297}$ |
| Compound 2560 | $L_{1-7}$ | $L_{2-298}$ |
| Compound 2561 | $L_{1-7}$ | $L_{2-299}$ |
| Compound 2562 | $L_{1-7}$ | $L_{2-300}$ |
| Compound 2563 | $L_{1-7}$ | $L_{2-301}$ |
| Compound 2564 | $L_{1-7}$ | $L_{2-302}$ |
| Compound 2565 | $L_{1-7}$ | $L_{2-303}$ |
| Compound 2566 | $L_{1-7}$ | $L_{2-304}$ |
| Compound 2567 | $L_{1-7}$ | $L_{2-305}$ |
| Compound 2568 | $L_{1-7}$ | $L_{2-306}$ |
| Compound 2569 | $L_{1-7}$ | $L_{2-307}$ |
| Compound 2570 | $L_{1-7}$ | $L_{2-308}$ |
| Compound 2571 | $L_{1-7}$ | $L_{2-309}$ |
| Compound 2572 | $L_{1-7}$ | $L_{2-310}$ |
| Compound 2573 | $L_{1-7}$ | $L_{2-311}$ |
| Compound 2574 | $L_{1-7}$ | $L_{2-312}$ |
| Compound 2575 | $L_{1-7}$ | $L_{2-313}$ |
| Compound 2576 | $L_{1-7}$ | $L_{2-314}$ |
| Compound 2577 | $L_{1-7}$ | $L_{2-315}$ |
| Compound 2578 | $L_{1-7}$ | $L_{2-316}$ |
| Compound 2579 | $L_{1-7}$ | $L_{2-317}$ |
| Compound 2580 | $L_{1-7}$ | $L_{2-318}$ |
| Compound 2581 | $L_{1-7}$ | $L_{2-319}$ |
| Compound 2582 | $L_{1-7}$ | $L_{2-320}$ |
| Compound 2583 | $L_{1-7}$ | $L_{2-321}$ |
| Compound 2584 | $L_{1-7}$ | $L_{2-322}$ |
| Compound 2585 | $L_{1-7}$ | $L_{2-323}$ |
| Compound 2586 | $L_{1-7}$ | $L_{2-324}$ |
| Compound 2587 | $L_{1-7}$ | $L_{2-325}$ |
| Compound 2588 | $L_{1-7}$ | $L_{2-326}$ |
| Compound 2589 | $L_{1-7}$ | $L_{2-327}$ |
| Compound 2590 | $L_{1-7}$ | $L_{2-328}$ |
| Compound 2591 | $L_{1-7}$ | $L_{2-329}$ |
| Compound 2592 | $L_{1-7}$ | $L_{2-330}$ |
| Compound 2593 | $L_{1-7}$ | $L_{2-331}$ |
| Compound 2594 | $L_{1-7}$ | $L_{2-332}$ |
| Compound 2595 | $L_{1-7}$ | $L_{2-333}$ |
| Compound 2596 | $L_{1-7}$ | $L_{2-334}$ |
| Compound 2597 | $L_{1-7}$ | $L_{2-335}$ |
| Compound 2598 | $L_{1-7}$ | $L_{2-336}$ |
| Compound 2599 | $L_{1-7}$ | $L_{2-337}$ |
| Compound 2600 | $L_{1-7}$ | $L_{2-338}$ |
| Compound 2601 | $L_{1-7}$ | $L_{2-339}$ |
| Compound 2602 | $L_{1-7}$ | $L_{2-340}$ |
| Compound 2603 | $L_{1-7}$ | $L_{2-341}$ |
| Compound 2604 | $L_{1-7}$ | $L_{2-342}$ |
| Compound 2605 | $L_{1-7}$ | $L_{2-343}$ |
| Compound 2606 | $L_{1-7}$ | $L_{2-344}$ |
| Compound 2607 | $L_{1-7}$ | $L_{2-345}$ |
| Compound 2608 | $L_{1-7}$ | $L_{2-346}$ |
| Compound 2609 | $L_{1-7}$ | $L_{2-347}$ |
| Compound 2610 | $L_{1-7}$ | $L_{2-348}$ |
| Compound 2611 | $L_{1-7}$ | $L_{2-349}$ |
| Compound 2612 | $L_{1-7}$ | $L_{2-350}$ |
| Compound 2613 | $L_{1-7}$ | $L_{2-351}$ |
| Compound 2614 | $L_{1-7}$ | $L_{2-352}$ |
| Compound 2615 | $L_{1-7}$ | $L_{2-353}$ |
| Compound 2616 | $L_{1-7}$ | $L_{2-354}$ |
| Compound 2617 | $L_{1-7}$ | $L_{2-355}$ |
| Compound 2618 | $L_{1-7}$ | $L_{2-356}$ |
| Compound 2619 | $L_{1-7}$ | $L_{2-357}$ |
| Compound 2620 | $L_{1-7}$ | $L_{2-358}$ |
| Compound 2621 | $L_{1-7}$ | $L_{2-359}$ |
| Compound 2622 | $L_{1-7}$ | $L_{2-360}$ |
| Compound 2623 | $L_{1-7}$ | $L_{2-361}$ |
| Compound 2624 | $L_{1-7}$ | $L_{2-362}$ |
| Compound 2625 | $L_{1-7}$ | $L_{2-363}$ |
| Compound 2626 | $L_{1-7}$ | $L_{2-364}$ |
| Compound 2627 | $L_{1-7}$ | $L_{2-365}$ |
| Compound 2628 | $L_{1-7}$ | $L_{2-366}$ |
| Compound 2629 | $L_{1-7}$ | $L_{2-367}$ |

TABLE 1-continued

| | | |
|---|---|---|
| Compound 2630 | $L_{1-7}$ | $L_{2-368}$ |
| Compound 2631 | $L_{1-7}$ | $L_{2-369}$ |
| Compound 2632 | $L_{1-7}$ | $L_{2-370}$ |
| Compound 2633 | $L_{1-7}$ | $L_{2-371}$ |
| Compound 2634 | $L_{1-7}$ | $L_{2-372}$ |
| Compound 2635 | $L_{1-7}$ | $L_{2-373}$ |
| Compound 2636 | $L_{1-7}$ | $L_{2-374}$ |
| Compound 2637 | $L_{1-7}$ | $L_{2-375}$ |
| Compound 2638 | $L_{1-7}$ | $L_{2-376}$ |
| Compound 2639 | $L_{1-7}$ | $L_{2-377}$ |
| Compound 2640 | $L_{1-8}$ | $L_{2-1}$ |
| Compound 2641 | $L_{1-8}$ | $L_{2-2}$ |
| Compound 2642 | $L_{1-8}$ | $L_{2-3}$ |
| Compound 2643 | $L_{1-8}$ | $L_{2-4}$ |
| Compound 2644 | $L_{1-8}$ | $L_{2-5}$ |
| Compound 2645 | $L_{1-8}$ | $L_{2-6}$ |
| Compound 2646 | $L_{1-8}$ | $L_{2-7}$ |
| Compound 2647 | $L_{1-8}$ | $L_{2-8}$ |
| Compound 2648 | $L_{1-8}$ | $L_{2-9}$ |
| Compound 2649 | $L_{1-8}$ | $L_{2-10}$ |
| Compound 2650 | $L_{1-8}$ | $L_{2-11}$ |
| Compound 2651 | $L_{1-8}$ | $L_{2-12}$ |
| Compound 2652 | $L_{1-8}$ | $L_{2-13}$ |
| Compound 2653 | $L_{1-8}$ | $L_{2-14}$ |
| Compound 2654 | $L_{1-8}$ | $L_{2-15}$ |
| Compound 2655 | $L_{1-8}$ | $L_{2-16}$ |
| Compound 2656 | $L_{1-8}$ | $L_{2-17}$ |
| Compound 2657 | $L_{1-8}$ | $L_{2-18}$ |
| Compound 2658 | $L_{1-8}$ | $L_{2-19}$ |
| Compound 2659 | $L_{1-8}$ | $L_{2-20}$ |
| Compound 2660 | $L_{1-8}$ | $L_{2-21}$ |
| Compound 2661 | $L_{1-8}$ | $L_{2-22}$ |
| Compound 2662 | $L_{1-8}$ | $L_{2-23}$ |
| Compound 2663 | $L_{1-8}$ | $L_{2-24}$ |
| Compound 2664 | $L_{1-8}$ | $L_{2-25}$ |
| Compound 2665 | $L_{1-8}$ | $L_{2-26}$ |
| Compound 2666 | $L_{1-8}$ | $L_{2-27}$ |
| Compound 2667 | $L_{1-8}$ | $L_{2-28}$ |
| Compound 2668 | $L_{1-8}$ | $L_{2-29}$ |
| Compound 2669 | $L_{1-8}$ | $L_{2-30}$ |
| Compound 2670 | $L_{1-8}$ | $L_{2-31}$ |
| Compound 2671 | $L_{1-8}$ | $L_{2-32}$ |
| Compound 2672 | $L_{1-8}$ | $L_{2-33}$ |
| Compound 2673 | $L_{1-8}$ | $L_{2-34}$ |
| Compound 2674 | $L_{1-8}$ | $L_{2-35}$ |
| Compound 2675 | $L_{1-8}$ | $L_{2-36}$ |
| Compound 2676 | $L_{1-8}$ | $L_{2-37}$ |
| Compound 2677 | $L_{1-8}$ | $L_{2-38}$ |
| Compound 2678 | $L_{1-8}$ | $L_{2-39}$ |
| Compound 2679 | $L_{1-8}$ | $L_{2-40}$ |
| Compound 2680 | $L_{1-8}$ | $L_{2-41}$ |
| Compound 2681 | $L_{1-8}$ | $L_{2-42}$ |
| Compound 2682 | $L_{1-8}$ | $L_{2-43}$ |
| Compound 2683 | $L_{1-8}$ | $L_{2-44}$ |
| Compound 2684 | $L_{1-8}$ | $L_{2-45}$ |
| Compound 2685 | $L_{1-8}$ | $L_{2-46}$ |
| Compound 2686 | $L_{1-8}$ | $L_{2-47}$ |
| Compound 2687 | $L_{1-8}$ | $L_{2-48}$ |
| Compound 2688 | $L_{1-8}$ | $L_{2-49}$ |
| Compound 2689 | $L_{1-8}$ | $L_{2-50}$ |
| Compound 2690 | $L_{1-8}$ | $L_{2-51}$ |
| Compound 2691 | $L_{1-8}$ | $L_{2-52}$ |
| Compound 2692 | $L_{1-8}$ | $L_{2-53}$ |
| Compound 2693 | $L_{1-8}$ | $L_{2-54}$ |
| Compound 2694 | $L_{1-8}$ | $L_{2-55}$ |
| Compound 2695 | $L_{1-8}$ | $L_{2-56}$ |
| Compound 2696 | $L_{1-8}$ | $L_{2-57}$ |
| Compound 2697 | $L_{1-8}$ | $L_{2-58}$ |
| Compound 2698 | $L_{1-8}$ | $L_{2-59}$ |
| Compound 2699 | $L_{1-8}$ | $L_{2-60}$ |
| Compound 2700 | $L_{1-8}$ | $L_{2-61}$ |
| Compound 2701 | $L_{1-8}$ | $L_{2-62}$ |
| Compound 2702 | $L_{1-8}$ | $L_{2-63}$ |
| Compound 2703 | $L_{1-8}$ | $L_{2-64}$ |
| Compound 2704 | $L_{1-8}$ | $L_{2-65}$ |
| Compound 2705 | $L_{1-8}$ | $L_{2-66}$ |
| Compound 2706 | $L_{1-8}$ | $L_{2-67}$ |
| Compound 2707 | $L_{1-8}$ | $L_{2-68}$ |
| Compound 2708 | $L_{1-8}$ | $L_{2-69}$ |
| Compound 2709 | $L_{1-8}$ | $L_{2-70}$ |

TABLE 1-continued

| | | |
|---|---|---|
| Compound 2710 | $L_{1-8}$ | $L_{2-71}$ |
| Compound 2711 | $L_{1-8}$ | $L_{2-72}$ |
| Compound 2712 | $L_{1-8}$ | $L_{2-73}$ |
| Compound 2713 | $L_{1-8}$ | $L_{2-74}$ |
| Compound 2714 | $L_{1-8}$ | $L_{2-75}$ |
| Compound 2715 | $L_{1-8}$ | $L_{2-76}$ |
| Compound 2716 | $L_{1-8}$ | $L_{2-77}$ |
| Compound 2717 | $L_{1-8}$ | $L_{2-78}$ |
| Compound 2718 | $L_{1-8}$ | $L_{2-79}$ |
| Compound 2719 | $L_{1-8}$ | $L_{2-80}$ |
| Compound 2720 | $L_{1-8}$ | $L_{2-81}$ |
| Compound 2721 | $L_{1-8}$ | $L_{2-82}$ |
| Compound 2722 | $L_{1-8}$ | $L_{2-83}$ |
| Compound 2723 | $L_{1-8}$ | $L_{2-84}$ |
| Compound 2724 | $L_{1-8}$ | $L_{2-85}$ |
| Compound 2725 | $L_{1-8}$ | $L_{2-86}$ |
| Compound 2726 | $L_{1-8}$ | $L_{2-87}$ |
| Compound 2727 | $L_{1-8}$ | $L_{2-88}$ |
| Compound 2728 | $L_{1-8}$ | $L_{2-89}$ |
| Compound 2729 | $L_{1-8}$ | $L_{2-90}$ |
| Compound 2730 | $L_{1-8}$ | $L_{2-91}$ |
| Compound 2731 | $L_{1-8}$ | $L_{2-92}$ |
| Compound 2732 | $L_{1-8}$ | $L_{2-93}$ |
| Compound 2733 | $L_{1-8}$ | $L_{2-94}$ |
| Compound 2734 | $L_{1-8}$ | $L_{2-95}$ |
| Compound 2735 | $L_{1-8}$ | $L_{2-96}$ |
| Compound 2736 | $L_{1-8}$ | $L_{2-97}$ |
| Compound 2737 | $L_{1-8}$ | $L_{2-98}$ |
| Compound 2738 | $L_{1-8}$ | $L_{2-99}$ |
| Compound 2739 | $L_{1-8}$ | $L_{2-100}$ |
| Compound 2740 | $L_{1-8}$ | $L_{2-101}$ |
| Compound 2741 | $L_{1-8}$ | $L_{2-102}$ |
| Compound 2742 | $L_{1-8}$ | $L_{2-103}$ |
| Compound 2743 | $L_{1-8}$ | $L_{2-104}$ |
| Compound 2744 | $L_{1-8}$ | $L_{2-105}$ |
| Compound 2745 | $L_{1-8}$ | $L_{2-106}$ |
| Compound 2746 | $L_{1-8}$ | $L_{2-107}$ |
| Compound 2747 | $L_{1-8}$ | $L_{2-108}$ |
| Compound 2748 | $L_{1-8}$ | $L_{2-109}$ |
| Compound 2749 | $L_{1-8}$ | $L_{2-110}$ |
| Compound 2750 | $L_{1-8}$ | $L_{2-111}$ |
| Compound 2751 | $L_{1-8}$ | $L_{2-112}$ |
| Compound 2752 | $L_{1-8}$ | $L_{2-113}$ |
| Compound 2753 | $L_{1-8}$ | $L_{2-114}$ |
| Compound 2754 | $L_{1-8}$ | $L_{2-115}$ |
| Compound 2755 | $L_{1-8}$ | $L_{2-116}$ |
| Compound 2756 | $L_{1-8}$ | $L_{2-117}$ |
| Compound 2757 | $L_{1-8}$ | $L_{2-118}$ |
| Compound 2758 | $L_{1-8}$ | $L_{2-119}$ |
| Compound 2759 | $L_{1-8}$ | $L_{2-120}$ |
| Compound 2760 | $L_{1-8}$ | $L_{2-121}$ |
| Compound 2761 | $L_{1-8}$ | $L_{2-122}$ |
| Compound 2762 | $L_{1-8}$ | $L_{2-123}$ |
| Compound 2763 | $L_{1-8}$ | $L_{2-124}$ |
| Compound 2764 | $L_{1-8}$ | $L_{2-125}$ |
| Compound 2765 | $L_{1-8}$ | $L_{2-126}$ |
| Compound 2766 | $L_{1-8}$ | $L_{2-127}$ |
| Compound 2767 | $L_{1-8}$ | $L_{2-128}$ |
| Compound 2768 | $L_{1-8}$ | $L_{2-129}$ |
| Compound 2769 | $L_{1-8}$ | $L_{2-130}$ |
| Compound 2770 | $L_{1-8}$ | $L_{2-131}$ |
| Compound 2771 | $L_{1-8}$ | $L_{2-132}$ |
| Compound 2772 | $L_{1-8}$ | $L_{2-133}$ |
| Compound 2773 | $L_{1-8}$ | $L_{2-134}$ |
| Compound 2774 | $L_{1-8}$ | $L_{2-135}$ |
| Compound 2775 | $L_{1-8}$ | $L_{2-136}$ |
| Compound 2776 | $L_{1-8}$ | $L_{2-137}$ |
| Compound 2777 | $L_{1-8}$ | $L_{2-138}$ |
| Compound 2778 | $L_{1-8}$ | $L_{2-139}$ |
| Compound 2779 | $L_{1-8}$ | $L_{2-140}$ |
| Compound 2780 | $L_{1-8}$ | $L_{2-141}$ |
| Compound 2781 | $L_{1-8}$ | $L_{2-142}$ |
| Compound 2782 | $L_{1-8}$ | $L_{2-143}$ |
| Compound 2783 | $L_{1-8}$ | $L_{2-144}$ |
| Compound 2784 | $L_{1-8}$ | $L_{2-145}$ |
| Compound 2785 | $L_{1-8}$ | $L_{2-146}$ |
| Compound 2786 | $L_{1-8}$ | $L_{2-147}$ |
| Compound 2787 | $L_{1-8}$ | $L_{2-148}$ |
| Compound 2788 | $L_{1-8}$ | $L_{2-149}$ |
| Compound 2789 | $L_{1-8}$ | $L_{2-150}$ |

TABLE 1-continued

| | | |
|---|---|---|
| Compound 2790 | $L_{1-8}$ | $L_{2-151}$ |
| Compound 2791 | $L_{1-8}$ | $L_{2-152}$ |
| Compound 2792 | $L_{1-8}$ | $L_{2-153}$ |
| Compound 2793 | $L_{1-8}$ | $L_{2-154}$ |
| Compound 2794 | $L_{1-8}$ | $L_{2-155}$ |
| Compound 2795 | $L_{1-8}$ | $L_{2-156}$ |
| Compound 2796 | $L_{1-8}$ | $L_{2-157}$ |
| Compound 2797 | $L_{1-8}$ | $L_{2-158}$ |
| Compound 2798 | $L_{1-8}$ | $L_{2-159}$ |
| Compound 2799 | $L_{1-8}$ | $L_{2-160}$ |
| Compound 2800 | $L_{1-8}$ | $L_{2-161}$ |
| Compound 2801 | $L_{1-8}$ | $L_{2-162}$ |
| Compound 2802 | $L_{1-8}$ | $L_{2-163}$ |
| Compound 2803 | $L_{1-8}$ | $L_{2-164}$ |
| Compound 2804 | $L_{1-8}$ | $L_{2-165}$ |
| Compound 2805 | $L_{1-8}$ | $L_{2-166}$ |
| Compound 2806 | $L_{1-8}$ | $L_{2-167}$ |
| Compound 2807 | $L_{1-8}$ | $L_{2-168}$ |
| Compound 2808 | $L_{1-8}$ | $L_{2-169}$ |
| Compound 2809 | $L_{1-8}$ | $L_{2-170}$ |
| Compound 2810 | $L_{1-8}$ | $L_{2-171}$ |
| Compound 2811 | $L_{1-8}$ | $L_{2-172}$ |
| Compound 2812 | $L_{1-8}$ | $L_{2-173}$ |
| Compound 2813 | $L_{1-8}$ | $L_{2-174}$ |
| Compound 2814 | $L_{1-8}$ | $L_{2-175}$ |
| Compound 2815 | $L_{1-8}$ | $L_{2-176}$ |
| Compound 2816 | $L_{1-8}$ | $L_{2-177}$ |
| Compound 2817 | $L_{1-8}$ | $L_{2-178}$ |
| Compound 2818 | $L_{1-8}$ | $L_{2-179}$ |
| Compound 2819 | $L_{1-8}$ | $L_{2-180}$ |
| Compound 2820 | $L_{1-8}$ | $L_{2-181}$ |
| Compound 2821 | $L_{1-8}$ | $L_{2-182}$ |
| Compound 2822 | $L_{1-8}$ | $L_{2-183}$ |
| Compound 2823 | $L_{1-8}$ | $L_{2-184}$ |
| Compound 2824 | $L_{1-8}$ | $L_{2-185}$ |
| Compound 2825 | $L_{1-8}$ | $L_{2-186}$ |
| Compound 2826 | $L_{1-8}$ | $L_{2-187}$ |
| Compound 2827 | $L_{1-8}$ | $L_{2-188}$ |
| Compound 2828 | $L_{1-8}$ | $L_{2-189}$ |
| Compound 2829 | $L_{1-8}$ | $L_{2-190}$ |
| Compound 2830 | $L_{1-8}$ | $L_{2-191}$ |
| Compound 2831 | $L_{1-8}$ | $L_{2-192}$ |
| Compound 2832 | $L_{1-8}$ | $L_{2-193}$ |
| Compound 2833 | $L_{1-8}$ | $L_{2-194}$ |
| Compound 2834 | $L_{1-8}$ | $L_{2-195}$ |
| Compound 2835 | $L_{1-8}$ | $L_{2-196}$ |
| Compound 2836 | $L_{1-8}$ | $L_{2-197}$ |
| Compound 2837 | $L_{1-8}$ | $L_{2-198}$ |
| Compound 2838 | $L_{1-8}$ | $L_{2-199}$ |
| Compound 2839 | $L_{1-8}$ | $L_{2-200}$ |
| Compound 2840 | $L_{1-8}$ | $L_{2-201}$ |
| Compound 2841 | $L_{1-8}$ | $L_{2-202}$ |
| Compound 2842 | $L_{1-8}$ | $L_{2-203}$ |
| Compound 2843 | $L_{1-8}$ | $L_{2-204}$ |
| Compound 2844 | $L_{1-8}$ | $L_{2-205}$ |
| Compound 2845 | $L_{1-8}$ | $L_{2-206}$ |
| Compound 2846 | $L_{1-8}$ | $L_{2-207}$ |
| Compound 2847 | $L_{1-8}$ | $L_{2-208}$ |
| Compound 2848 | $L_{1-8}$ | $L_{2-209}$ |
| Compound 2849 | $L_{1-8}$ | $L_{2-210}$ |
| Compound 2850 | $L_{1-8}$ | $L_{2-211}$ |
| Compound 2851 | $L_{1-8}$ | $L_{2-212}$ |
| Compound 2852 | $L_{1-8}$ | $L_{2-213}$ |
| Compound 2853 | $L_{1-8}$ | $L_{2-214}$ |
| Compound 2854 | $L_{1-8}$ | $L_{2-215}$ |
| Compound 2855 | $L_{1-8}$ | $L_{2-216}$ |
| Compound 2856 | $L_{1-8}$ | $L_{2-217}$ |
| Compound 2857 | $L_{1-8}$ | $L_{2-218}$ |
| Compound 2858 | $L_{1-8}$ | $L_{2-219}$ |
| Compound 2859 | $L_{1-8}$ | $L_{2-220}$ |
| Compound 2860 | $L_{1-8}$ | $L_{2-221}$ |
| Compound 2861 | $L_{1-8}$ | $L_{2-222}$ |
| Compound 2862 | $L_{1-8}$ | $L_{2-223}$ |
| Compound 2863 | $L_{1-8}$ | $L_{2-224}$ |
| Compound 2864 | $L_{1-8}$ | $L_{2-225}$ |
| Compound 2865 | $L_{1-8}$ | $L_{2-226}$ |
| Compound 2866 | $L_{1-8}$ | $L_{2-227}$ |
| Compound 2867 | $L_{1-8}$ | $L_{2-228}$ |
| Compound 2868 | $L_{1-8}$ | $L_{2-229}$ |
| Compound 2869 | $L_{1-8}$ | $L_{2-230}$ |

TABLE 1-continued

| | | |
|---|---|---|
| Compound 2870 | $L_{1-8}$ | $L_{2-231}$ |
| Compound 2871 | $L_{1-8}$ | $L_{2-232}$ |
| Compound 2872 | $L_{1-8}$ | $L_{2-233}$ |
| Compound 2873 | $L_{1-8}$ | $L_{2-234}$ |
| Compound 2874 | $L_{1-8}$ | $L_{2-235}$ |
| Compound 2875 | $L_{1-8}$ | $L_{2-236}$ |
| Compound 2876 | $L_{1-8}$ | $L_{2-237}$ |
| Compound 2877 | $L_{1-8}$ | $L_{2-238}$ |
| Compound 2878 | $L_{1-8}$ | $L_{2-239}$ |
| Compound 2879 | $L_{1-8}$ | $L_{2-240}$ |
| Compound 2880 | $L_{1-8}$ | $L_{2-241}$ |
| Compound 2881 | $L_{1-8}$ | $L_{2-242}$ |
| Compound 2882 | $L_{1-8}$ | $L_{2-243}$ |
| Compound 2883 | $L_{1-8}$ | $L_{2-244}$ |
| Compound 2884 | $L_{1-8}$ | $L_{2-245}$ |
| Compound 2885 | $L_{1-8}$ | $L_{2-246}$ |
| Compound 2886 | $L_{1-8}$ | $L_{2-247}$ |
| Compound 2887 | $L_{1-8}$ | $L_{2-248}$ |
| Compound 2888 | $L_{1-8}$ | $L_{2-249}$ |
| Compound 2889 | $L_{1-8}$ | $L_{2-250}$ |
| Compound 2890 | $L_{1-8}$ | $L_{2-251}$ |
| Compound 2891 | $L_{1-8}$ | $L_{2-252}$ |
| Compound 2892 | $L_{1-8}$ | $L_{2-253}$ |
| Compound 2893 | $L_{1-8}$ | $L_{2-254}$ |
| Compound 2894 | $L_{1-8}$ | $L_{2-255}$ |
| Compound 2895 | $L_{1-8}$ | $L_{2-256}$ |
| Compound 2896 | $L_{1-8}$ | $L_{2-257}$ |
| Compound 2897 | $L_{1-8}$ | $L_{2-258}$ |
| Compound 2898 | $L_{1-8}$ | $L_{2-259}$ |
| Compound 2899 | $L_{1-8}$ | $L_{2-260}$ |
| Compound 2900 | $L_{1-8}$ | $L_{2-261}$ |
| Compound 2901 | $L_{1-8}$ | $L_{2-262}$ |
| Compound 2902 | $L_{1-8}$ | $L_{2-263}$ |
| Compound 2903 | $L_{1-8}$ | $L_{2-264}$ |
| Compound 2904 | $L_{1-8}$ | $L_{2-265}$ |
| Compound 2905 | $L_{1-8}$ | $L_{2-266}$ |
| Compound 2906 | $L_{1-8}$ | $L_{2-267}$ |
| Compound 2907 | $L_{1-8}$ | $L_{2-268}$ |
| Compound 2908 | $L_{1-8}$ | $L_{2-269}$ |
| Compound 2909 | $L_{1-8}$ | $L_{2-270}$ |
| Compound 2910 | $L_{1-8}$ | $L_{2-271}$ |
| Compound 2911 | $L_{1-8}$ | $L_{2-272}$ |
| Compound 2912 | $L_{1-8}$ | $L_{2-273}$ |
| Compound 2913 | $L_{1-8}$ | $L_{2-274}$ |
| Compound 2914 | $L_{1-8}$ | $L_{2-275}$ |
| Compound 2915 | $L_{1-8}$ | $L_{2-276}$ |
| Compound 2916 | $L_{1-8}$ | $L_{2-277}$ |
| Compound 2917 | $L_{1-8}$ | $L_{2-278}$ |
| Compound 2918 | $L_{1-8}$ | $L_{2-279}$ |
| Compound 2919 | $L_{1-8}$ | $L_{2-280}$ |
| Compound 2920 | $L_{1-8}$ | $L_{2-281}$ |
| Compound 2921 | $L_{1-8}$ | $L_{2-282}$ |
| Compound 2922 | $L_{1-8}$ | $L_{2-283}$ |
| Compound 2923 | $L_{1-8}$ | $L_{2-284}$ |
| Compound 2924 | $L_{1-8}$ | $L_{2-285}$ |
| Compound 2925 | $L_{1-8}$ | $L_{2-286}$ |
| Compound 2926 | $L_{1-8}$ | $L_{2-287}$ |
| Compound 2927 | $L_{1-8}$ | $L_{2-288}$ |
| Compound 2928 | $L_{1-8}$ | $L_{2-289}$ |
| Compound 2929 | $L_{1-8}$ | $L_{2-290}$ |
| Compound 2930 | $L_{1-8}$ | $L_{2-291}$ |
| Compound 2931 | $L_{1-8}$ | $L_{2-292}$ |
| Compound 2932 | $L_{1-8}$ | $L_{2-293}$ |
| Compound 2933 | $L_{1-8}$ | $L_{2-294}$ |
| Compound 2934 | $L_{1-8}$ | $L_{2-295}$ |
| Compound 2935 | $L_{1-8}$ | $L_{2-296}$ |
| Compound 2936 | $L_{1-8}$ | $L_{2-297}$ |
| Compound 2937 | $L_{1-8}$ | $L_{2-298}$ |
| Compound 2938 | $L_{1-8}$ | $L_{2-299}$ |
| Compound 2939 | $L_{1-8}$ | $L_{2-300}$ |
| Compound 2940 | $L_{1-8}$ | $L_{2-301}$ |
| Compound 2941 | $L_{1-8}$ | $L_{2-302}$ |
| Compound 2942 | $L_{1-8}$ | $L_{2-303}$ |
| Compound 2943 | $L_{1-8}$ | $L_{2-304}$ |
| Compound 2944 | $L_{1-8}$ | $L_{2-305}$ |
| Compound 2945 | $L_{1-8}$ | $L_{2-306}$ |
| Compound 2946 | $L_{1-8}$ | $L_{2-307}$ |
| Compound 2947 | $L_{1-8}$ | $L_{2-308}$ |
| Compound 2948 | $L_{1-8}$ | $L_{2-309}$ |
| Compound 2949 | $L_{1-8}$ | $L_{2-310}$ |

TABLE 1-continued

| | | |
|---|---|---|
| Compound 2950 | $L_{1-8}$ | $L_{2-311}$ |
| Compound 2951 | $L_{1-8}$ | $L_{2-312}$ |
| Compound 2952 | $L_{1-8}$ | $L_{2-313}$ |
| Compound 2953 | $L_{1-8}$ | $L_{2-314}$ |
| Compound 2954 | $L_{1-8}$ | $L_{2-315}$ |
| Compound 2955 | $L_{1-8}$ | $L_{2-316}$ |
| Compound 2956 | $L_{1-8}$ | $L_{2-317}$ |
| Compound 2957 | $L_{1-8}$ | $L_{2-318}$ |
| Compound 2958 | $L_{1-8}$ | $L_{2-319}$ |
| Compound 2959 | $L_{1-8}$ | $L_{2-320}$ |
| Compound 2960 | $L_{1-8}$ | $L_{2-321}$ |
| Compound 2961 | $L_{1-8}$ | $L_{2-322}$ |
| Compound 2962 | $L_{1-8}$ | $L_{2-323}$ |
| Compound 2963 | $L_{1-8}$ | $L_{2-324}$ |
| Compound 2964 | $L_{1-8}$ | $L_{2-325}$ |
| Compound 2965 | $L_{1-8}$ | $L_{2-326}$ |
| Compound 2966 | $L_{1-8}$ | $L_{2-327}$ |
| Compound 2967 | $L_{1-8}$ | $L_{2-328}$ |
| Compound 2968 | $L_{1-8}$ | $L_{2-329}$ |
| Compound 2969 | $L_{1-8}$ | $L_{2-330}$ |
| Compound 2970 | $L_{1-8}$ | $L_{2-331}$ |
| Compound 2971 | $L_{1-8}$ | $L_{2-332}$ |
| Compound 2972 | $L_{1-8}$ | $L_{2-333}$ |
| Compound 2973 | $L_{1-8}$ | $L_{2-334}$ |
| Compound 2974 | $L_{1-8}$ | $L_{2-335}$ |
| Compound 2975 | $L_{1-8}$ | $L_{2-336}$ |
| Compound 2976 | $L_{1-8}$ | $L_{2-337}$ |
| Compound 2977 | $L_{1-8}$ | $L_{2-338}$ |
| Compound 2978 | $L_{1-8}$ | $L_{2-339}$ |
| Compound 2979 | $L_{1-8}$ | $L_{2-340}$ |
| Compound 2980 | $L_{1-8}$ | $L_{2-341}$ |
| Compound 2981 | $L_{1-8}$ | $L_{2-342}$ |
| Compound 2982 | $L_{1-8}$ | $L_{2-343}$ |
| Compound 2983 | $L_{1-8}$ | $L_{2-344}$ |
| Compound 2984 | $L_{1-8}$ | $L_{2-345}$ |
| Compound 2985 | $L_{1-8}$ | $L_{2-346}$ |
| Compound 2986 | $L_{1-8}$ | $L_{2-347}$ |
| Compound 2987 | $L_{1-8}$ | $L_{2-348}$ |
| Compound 2988 | $L_{1-8}$ | $L_{2-349}$ |
| Compound 2989 | $L_{1-8}$ | $L_{2-350}$ |
| Compound 2990 | $L_{1-8}$ | $L_{2-351}$ |
| Compound 2991 | $L_{1-8}$ | $L_{2-352}$ |
| Compound 2992 | $L_{1-8}$ | $L_{2-353}$ |
| Compound 2993 | $L_{1-8}$ | $L_{2-354}$ |
| Compound 2994 | $L_{1-8}$ | $L_{2-355}$ |
| Compound 2995 | $L_{1-8}$ | $L_{2-356}$ |
| Compound 2996 | $L_{1-8}$ | $L_{2-357}$ |
| Compound 2997 | $L_{1-8}$ | $L_{2-358}$ |
| Compound 2998 | $L_{1-8}$ | $L_{2-359}$ |
| Compound 2999 | $L_{1-8}$ | $L_{2-360}$ |
| Compound 3000 | $L_{1-8}$ | $L_{2-361}$ |
| Compound 3001 | $L_{1-8}$ | $L_{2-362}$ |
| Compound 3002 | $L_{1-8}$ | $L_{2-363}$ |
| Compound 3003 | $L_{1-8}$ | $L_{2-364}$ |
| Compound 3004 | $L_{1-8}$ | $L_{2-365}$ |
| Compound 3005 | $L_{1-8}$ | $L_{2-366}$ |
| Compound 3006 | $L_{1-8}$ | $L_{2-367}$ |
| Compound 3007 | $L_{1-8}$ | $L_{2-368}$ |
| Compound 3008 | $L_{1-8}$ | $L_{2-369}$ |
| Compound 3009 | $L_{1-8}$ | $L_{2-370}$ |
| Compound 3010 | $L_{1-8}$ | $L_{2-371}$ |
| Compound 3011 | $L_{1-8}$ | $L_{2-372}$ |
| Compound 3012 | $L_{1-8}$ | $L_{2-373}$ |
| Compound 3013 | $L_{1-8}$ | $L_{2-374}$ |
| Compound 3014 | $L_{1-8}$ | $L_{2-375}$ |
| Compound 3015 | $L_{1-8}$ | $L_{2-376}$ |
| Compound 3016 | $L_{1-8}$ | $L_{2-377}$ |
| Compound 3017 | $L_{1-9}$ | $L_{2-1}$ |
| Compound 3018 | $L_{1-9}$ | $L_{2-2}$ |
| Compound 3019 | $L_{1-9}$ | $L_{2-3}$ |
| Compound 3020 | $L_{1-9}$ | $L_{2-4}$ |
| Compound 3021 | $L_{1-9}$ | $L_{2-5}$ |
| Compound 3022 | $L_{1-9}$ | $L_{2-6}$ |
| Compound 3023 | $L_{1-9}$ | $L_{2-7}$ |
| Compound 3024 | $L_{1-9}$ | $L_{2-8}$ |
| Compound 3025 | $L_{1-9}$ | $L_{2-9}$ |
| Compound 3026 | $L_{1-9}$ | $L_{2-10}$ |
| Compound 3027 | $L_{1-9}$ | $L_{2-11}$ |
| Compound 3028 | $L_{1-9}$ | $L_{2-12}$ |
| Compound 3029 | $L_{1-9}$ | $L_{2-13}$ |
| Compound 3030 | $L_{1-9}$ | $L_{2-14}$ |
| Compound 3031 | $L_{1-9}$ | $L_{2-15}$ |
| Compound 3032 | $L_{1-9}$ | $L_{2-16}$ |
| Compound 3033 | $L_{1-9}$ | $L_{2-17}$ |
| Compound 3034 | $L_{1-9}$ | $L_{2-18}$ |
| Compound 3035 | $L_{1-9}$ | $L_{2-19}$ |
| Compound 3036 | $L_{1-9}$ | $L_{2-20}$ |
| Compound 3037 | $L_{1-9}$ | $L_{2-21}$ |
| Compound 3038 | $L_{1-9}$ | $L_{2-22}$ |
| Compound 3039 | $L_{1-9}$ | $L_{2-23}$ |
| Compound 3040 | $L_{1-9}$ | $L_{2-24}$ |
| Compound 3041 | $L_{1-9}$ | $L_{2-25}$ |
| Compound 3042 | $L_{1-9}$ | $L_{2-26}$ |
| Compound 3043 | $L_{1-9}$ | $L_{2-27}$ |
| Compound 3044 | $L_{1-9}$ | $L_{2-28}$ |
| Compound 3045 | $L_{1-9}$ | $L_{2-29}$ |
| Compound 3046 | $L_{1-9}$ | $L_{2-30}$ |
| Compound 3047 | $L_{1-9}$ | $L_{2-31}$ |
| Compound 3048 | $L_{1-9}$ | $L_{2-32}$ |
| Compound 3049 | $L_{1-9}$ | $L_{2-33}$ |
| Compound 3050 | $L_{1-9}$ | $L_{2-34}$ |
| Compound 3051 | $L_{1-9}$ | $L_{2-35}$ |
| Compound 3052 | $L_{1-9}$ | $L_{2-36}$ |
| Compound 3053 | $L_{1-9}$ | $L_{2-37}$ |
| Compound 3054 | $L_{1-9}$ | $L_{2-38}$ |
| Compound 3055 | $L_{1-9}$ | $L_{2-39}$ |
| Compound 3056 | $L_{1-9}$ | $L_{2-40}$ |
| Compound 3057 | $L_{1-9}$ | $L_{2-41}$ |
| Compound 3058 | $L_{1-9}$ | $L_{2-42}$ |
| Compound 3059 | $L_{1-9}$ | $L_{2-43}$ |
| Compound 3060 | $L_{1-9}$ | $L_{2-44}$ |
| Compound 3061 | $L_{1-9}$ | $L_{2-45}$ |
| Compound 3062 | $L_{1-9}$ | $L_{2-46}$ |
| Compound 3063 | $L_{1-9}$ | $L_{2-47}$ |
| Compound 3064 | $L_{1-9}$ | $L_{2-48}$ |
| Compound 3065 | $L_{1-9}$ | $L_{2-49}$ |
| Compound 3066 | $L_{1-9}$ | $L_{2-50}$ |
| Compound 3067 | $L_{1-9}$ | $L_{2-51}$ |
| Compound 3068 | $L_{1-9}$ | $L_{2-52}$ |
| Compound 3069 | $L_{1-9}$ | $L_{2-53}$ |
| Compound 3070 | $L_{1-9}$ | $L_{2-54}$ |
| Compound 3071 | $L_{1-9}$ | $L_{2-55}$ |
| Compound 3072 | $L_{1-9}$ | $L_{2-56}$ |
| Compound 3073 | $L_{1-9}$ | $L_{2-57}$ |
| Compound 3074 | $L_{1-9}$ | $L_{2-58}$ |
| Compound 3075 | $L_{1-9}$ | $L_{2-59}$ |
| Compound 3076 | $L_{1-9}$ | $L_{2-60}$ |
| Compound 3077 | $L_{1-9}$ | $L_{2-61}$ |
| Compound 3078 | $L_{1-9}$ | $L_{2-62}$ |
| Compound 3079 | $L_{1-9}$ | $L_{2-63}$ |
| Compound 3080 | $L_{1-9}$ | $L_{2-64}$ |
| Compound 3081 | $L_{1-9}$ | $L_{2-65}$ |
| Compound 3082 | $L_{1-9}$ | $L_{2-66}$ |
| Compound 3083 | $L_{1-9}$ | $L_{2-67}$ |
| Compound 3084 | $L_{1-9}$ | $L_{2-68}$ |
| Compound 3085 | $L_{1-9}$ | $L_{2-69}$ |
| Compound 3086 | $L_{1-9}$ | $L_{2-70}$ |
| Compound 3087 | $L_{1-9}$ | $L_{2-71}$ |
| Compound 3088 | $L_{1-9}$ | $L_{2-72}$ |
| Compound 3089 | $L_{1-9}$ | $L_{2-73}$ |
| Compound 3090 | $L_{1-9}$ | $L_{2-74}$ |
| Compound 3091 | $L_{1-9}$ | $L_{2-75}$ |
| Compound 3092 | $L_{1-9}$ | $L_{2-76}$ |
| Compound 3093 | $L_{1-9}$ | $L_{2-77}$ |
| Compound 3094 | $L_{1-9}$ | $L_{2-78}$ |
| Compound 3095 | $L_{1-9}$ | $L_{2-79}$ |
| Compound 3096 | $L_{1-9}$ | $L_{2-80}$ |
| Compound 3097 | $L_{1-9}$ | $L_{2-81}$ |
| Compound 3098 | $L_{1-9}$ | $L_{2-82}$ |
| Compound 3099 | $L_{1-9}$ | $L_{2-83}$ |
| Compound 3100 | $L_{1-9}$ | $L_{2-84}$ |
| Compound 3101 | $L_{1-9}$ | $L_{2-85}$ |
| Compound 3102 | $L_{1-9}$ | $L_{2-86}$ |
| Compound 3103 | $L_{1-9}$ | $L_{2-87}$ |
| Compound 3104 | $L_{1-9}$ | $L_{2-88}$ |
| Compound 3105 | $L_{1-9}$ | $L_{2-89}$ |
| Compound 3106 | $L_{1-9}$ | $L_{2-90}$ |
| Compound 3107 | $L_{1-9}$ | $L_{2-91}$ |
| Compound 3108 | $L_{1-9}$ | $L_{2-92}$ |
| Compound 3109 | $L_{1-9}$ | $L_{2-93}$ |

TABLE 1-continued

| | | |
|---|---|---|
| Compound 3110 | $L_{1-9}$ | $L_{2-94}$ |
| Compound 3111 | $L_{1-9}$ | $L_{2-95}$ |
| Compound 3112 | $L_{1-9}$ | $L_{2-96}$ |
| Compound 3113 | $L_{1-9}$ | $L_{2-97}$ |
| Compound 3114 | $L_{1-9}$ | $L_{2-98}$ |
| Compound 3115 | $L_{1-9}$ | $L_{2-99}$ |
| Compound 3116 | $L_{1-9}$ | $L_{2-100}$ |
| Compound 3117 | $L_{1-9}$ | $L_{2-101}$ |
| Compound 3118 | $L_{1-9}$ | $L_{2-102}$ |
| Compound 3119 | $L_{1-9}$ | $L_{2-103}$ |
| Compound 3120 | $L_{1-9}$ | $L_{2-104}$ |
| Compound 3121 | $L_{1-9}$ | $L_{2-105}$ |
| Compound 3122 | $L_{1-9}$ | $L_{2-106}$ |
| Compound 3123 | $L_{1-9}$ | $L_{2-107}$ |
| Compound 3124 | $L_{1-9}$ | $L_{2-108}$ |
| Compound 3125 | $L_{1-9}$ | $L_{2-109}$ |
| Compound 3126 | $L_{1-9}$ | $L_{2-110}$ |
| Compound 3127 | $L_{1-9}$ | $L_{2-111}$ |
| Compound 3128 | $L_{1-9}$ | $L_{2-112}$ |
| Compound 3129 | $L_{1-9}$ | $L_{2-113}$ |
| Compound 3130 | $L_{1-9}$ | $L_{2-114}$ |
| Compound 3131 | $L_{1-9}$ | $L_{2-115}$ |
| Compound 3132 | $L_{1-9}$ | $L_{2-116}$ |
| Compound 3133 | $L_{1-9}$ | $L_{2-117}$ |
| Compound 3134 | $L_{1-9}$ | $L_{2-118}$ |
| Compound 3135 | $L_{1-9}$ | $L_{2-119}$ |
| Compound 3136 | $L_{1-9}$ | $L_{2-120}$ |
| Compound 3137 | $L_{1-9}$ | $L_{2-121}$ |
| Compound 3138 | $L_{1-9}$ | $L_{2-122}$ |
| Compound 3139 | $L_{1-9}$ | $L_{2-123}$ |
| Compound 3140 | $L_{1-9}$ | $L_{2-124}$ |
| Compound 3141 | $L_{1-9}$ | $L_{2-125}$ |
| Compound 3142 | $L_{1-9}$ | $L_{2-126}$ |
| Compound 3143 | $L_{1-9}$ | $L_{2-127}$ |
| Compound 3144 | $L_{1-9}$ | $L_{2-128}$ |
| Compound 3145 | $L_{1-9}$ | $L_{2-129}$ |
| Compound 3146 | $L_{1-9}$ | $L_{2-130}$ |
| Compound 3147 | $L_{1-9}$ | $L_{2-131}$ |
| Compound 3148 | $L_{1-9}$ | $L_{2-132}$ |
| Compound 3149 | $L_{1-9}$ | $L_{2-133}$ |
| Compound 3150 | $L_{1-9}$ | $L_{2-134}$ |
| Compound 3151 | $L_{1-9}$ | $L_{2-135}$ |
| Compound 3152 | $L_{1-9}$ | $L_{2-136}$ |
| Compound 3153 | $L_{1-9}$ | $L_{2-137}$ |
| Compound 3154 | $L_{1-9}$ | $L_{2-138}$ |
| Compound 3155 | $L_{1-9}$ | $L_{2-139}$ |
| Compound 3156 | $L_{1-9}$ | $L_{2-140}$ |
| Compound 3157 | $L_{1-9}$ | $L_{2-141}$ |
| Compound 3158 | $L_{1-9}$ | $L_{2-142}$ |
| Compound 3159 | $L_{1-9}$ | $L_{2-143}$ |
| Compound 3160 | $L_{1-9}$ | $L_{2-144}$ |
| Compound 3161 | $L_{1-9}$ | $L_{2-145}$ |
| Compound 3162 | $L_{1-9}$ | $L_{2-146}$ |
| Compound 3163 | $L_{1-9}$ | $L_{2-147}$ |
| Compound 3164 | $L_{1-9}$ | $L_{2-148}$ |
| Compound 3165 | $L_{1-9}$ | $L_{2-149}$ |
| Compound 3166 | $L_{1-9}$ | $L_{2-150}$ |
| Compound 3167 | $L_{1-9}$ | $L_{2-151}$ |
| Compound 3168 | $L_{1-9}$ | $L_{2-152}$ |
| Compound 3169 | $L_{1-9}$ | $L_{2-153}$ |
| Compound 3170 | $L_{1-9}$ | $L_{2-154}$ |
| Compound 3171 | $L_{1-9}$ | $L_{2-155}$ |
| Compound 3172 | $L_{1-9}$ | $L_{2-156}$ |
| Compound 3173 | $L_{1-9}$ | $L_{2-157}$ |
| Compound 3174 | $L_{1-9}$ | $L_{2-158}$ |
| Compound 3175 | $L_{1-9}$ | $L_{2-159}$ |
| Compound 3176 | $L_{1-9}$ | $L_{2-160}$ |
| Compound 3177 | $L_{1-9}$ | $L_{2-161}$ |
| Compound 3178 | $L_{1-9}$ | $L_{2-162}$ |
| Compound 3179 | $L_{1-9}$ | $L_{2-163}$ |
| Compound 3180 | $L_{1-9}$ | $L_{2-164}$ |
| Compound 3181 | $L_{1-9}$ | $L_{2-165}$ |
| Compound 3182 | $L_{1-9}$ | $L_{2-166}$ |
| Compound 3183 | $L_{1-9}$ | $L_{2-167}$ |
| Compound 3184 | $L_{1-9}$ | $L_{2-168}$ |
| Compound 3185 | $L_{1-9}$ | $L_{2-169}$ |
| Compound 3186 | $L_{1-9}$ | $L_{2-170}$ |
| Compound 3187 | $L_{1-9}$ | $L_{2-171}$ |
| Compound 3188 | $L_{1-9}$ | $L_{2-172}$ |
| Compound 3189 | $L_{1-9}$ | $L_{2-173}$ |

TABLE 1-continued

| | | |
|---|---|---|
| Compound 3190 | $L_{1-9}$ | $L_{2-174}$ |
| Compound 3191 | $L_{1-9}$ | $L_{2-175}$ |
| Compound 3192 | $L_{1-9}$ | $L_{2-176}$ |
| Compound 3193 | $L_{1-9}$ | $L_{2-177}$ |
| Compound 3194 | $L_{1-9}$ | $L_{2-178}$ |
| Compound 3195 | $L_{1-9}$ | $L_{2-179}$ |
| Compound 3196 | $L_{1-9}$ | $L_{2-180}$ |
| Compound 3197 | $L_{1-9}$ | $L_{2-181}$ |
| Compound 3198 | $L_{1-9}$ | $L_{2-182}$ |
| Compound 3199 | $L_{1-9}$ | $L_{2-183}$ |
| Compound 3200 | $L_{1-9}$ | $L_{2-184}$ |
| Compound 3201 | $L_{1-9}$ | $L_{2-185}$ |
| Compound 3202 | $L_{1-9}$ | $L_{2-186}$ |
| Compound 3203 | $L_{1-9}$ | $L_{2-187}$ |
| Compound 3204 | $L_{1-9}$ | $L_{2-188}$ |
| Compound 3205 | $L_{1-9}$ | $L_{2-189}$ |
| Compound 3206 | $L_{1-9}$ | $L_{2-190}$ |
| Compound 3207 | $L_{1-9}$ | $L_{2-191}$ |
| Compound 3208 | $L_{1-9}$ | $L_{2-192}$ |
| Compound 3209 | $L_{1-9}$ | $L_{2-193}$ |
| Compound 3210 | $L_{1-9}$ | $L_{2-194}$ |
| Compound 3211 | $L_{1-9}$ | $L_{2-195}$ |
| Compound 3212 | $L_{1-9}$ | $L_{2-196}$ |
| Compound 3213 | $L_{1-9}$ | $L_{2-197}$ |
| Compound 3214 | $L_{1-9}$ | $L_{2-198}$ |
| Compound 3215 | $L_{1-9}$ | $L_{2-199}$ |
| Compound 3216 | $L_{1-9}$ | $L_{2-200}$ |
| Compound 3217 | $L_{1-9}$ | $L_{2-201}$ |
| Compound 3218 | $L_{1-9}$ | $L_{2-202}$ |
| Compound 3219 | $L_{1-9}$ | $L_{2-203}$ |
| Compound 3220 | $L_{1-9}$ | $L_{2-204}$ |
| Compound 3221 | $L_{1-9}$ | $L_{2-205}$ |
| Compound 3222 | $L_{1-9}$ | $L_{2-206}$ |
| Compound 3223 | $L_{1-9}$ | $L_{2-207}$ |
| Compound 3224 | $L_{1-9}$ | $L_{2-208}$ |
| Compound 3225 | $L_{1-9}$ | $L_{2-209}$ |
| Compound 3226 | $L_{1-9}$ | $L_{2-210}$ |
| Compound 3227 | $L_{1-9}$ | $L_{2-211}$ |
| Compound 3228 | $L_{1-9}$ | $L_{2-212}$ |
| Compound 3229 | $L_{1-9}$ | $L_{2-213}$ |
| Compound 3230 | $L_{1-9}$ | $L_{2-214}$ |
| Compound 3231 | $L_{1-9}$ | $L_{2-215}$ |
| Compound 3232 | $L_{1-9}$ | $L_{2-216}$ |
| Compound 3233 | $L_{1-9}$ | $L_{2-217}$ |
| Compound 3234 | $L_{1-9}$ | $L_{2-218}$ |
| Compound 3235 | $L_{1-9}$ | $L_{2-219}$ |
| Compound 3236 | $L_{1-9}$ | $L_{2-220}$ |
| Compound 3237 | $L_{1-9}$ | $L_{2-221}$ |
| Compound 3238 | $L_{1-9}$ | $L_{2-222}$ |
| Compound 3239 | $L_{1-9}$ | $L_{2-223}$ |
| Compound 3240 | $L_{1-9}$ | $L_{2-224}$ |
| Compound 3241 | $L_{1-9}$ | $L_{2-225}$ |
| Compound 3242 | $L_{1-9}$ | $L_{2-226}$ |
| Compound 3243 | $L_{1-9}$ | $L_{2-227}$ |
| Compound 3244 | $L_{1-9}$ | $L_{2-228}$ |
| Compound 3245 | $L_{1-9}$ | $L_{2-229}$ |
| Compound 3246 | $L_{1-9}$ | $L_{2-230}$ |
| Compound 3247 | $L_{1-9}$ | $L_{2-231}$ |
| Compound 3248 | $L_{1-9}$ | $L_{2-232}$ |
| Compound 3249 | $L_{1-9}$ | $L_{2-233}$ |
| Compound 3250 | $L_{1-9}$ | $L_{2-234}$ |
| Compound 3251 | $L_{1-9}$ | $L_{2-235}$ |
| Compound 3252 | $L_{1-9}$ | $L_{2-236}$ |
| Compound 3253 | $L_{1-9}$ | $L_{2-237}$ |
| Compound 3254 | $L_{1-9}$ | $L_{2-238}$ |
| Compound 3255 | $L_{1-9}$ | $L_{2-239}$ |
| Compound 3256 | $L_{1-9}$ | $L_{2-240}$ |
| Compound 3257 | $L_{1-9}$ | $L_{2-241}$ |
| Compound 3258 | $L_{1-9}$ | $L_{2-242}$ |
| Compound 3259 | $L_{1-9}$ | $L_{2-243}$ |
| Compound 3260 | $L_{1-9}$ | $L_{2-244}$ |
| Compound 3261 | $L_{1-9}$ | $L_{2-245}$ |
| Compound 3262 | $L_{1-9}$ | $L_{2-246}$ |
| Compound 3263 | $L_{1-9}$ | $L_{2-247}$ |
| Compound 3264 | $L_{1-9}$ | $L_{2-248}$ |
| Compound 3265 | $L_{1-9}$ | $L_{2-249}$ |
| Compound 3266 | $L_{1-9}$ | $L_{2-250}$ |
| Compound 3267 | $L_{1-9}$ | $L_{2-251}$ |
| Compound 3268 | $L_{1-9}$ | $L_{2-252}$ |
| Compound 3269 | $L_{1-9}$ | $L_{2-253}$ |

TABLE 1-continued

| | | |
|---|---|---|
| Compound 3270 | $L_{1-9}$ | $L_{2-254}$ |
| Compound 3271 | $L_{1-9}$ | $L_{2-255}$ |
| Compound 3272 | $L_{1-9}$ | $L_{2-256}$ |
| Compound 3273 | $L_{1-9}$ | $L_{2-257}$ |
| Compound 3274 | $L_{1-9}$ | $L_{2-258}$ |
| Compound 3275 | $L_{1-9}$ | $L_{2-259}$ |
| Compound 3276 | $L_{1-9}$ | $L_{2-260}$ |
| Compound 3277 | $L_{1-9}$ | $L_{2-261}$ |
| Compound 3278 | $L_{1-9}$ | $L_{2-262}$ |
| Compound 3279 | $L_{1-9}$ | $L_{2-263}$ |
| Compound 3280 | $L_{1-9}$ | $L_{2-264}$ |
| Compound 3281 | $L_{1-9}$ | $L_{2-265}$ |
| Compound 3282 | $L_{1-9}$ | $L_{2-266}$ |
| Compound 3283 | $L_{1-9}$ | $L_{2-267}$ |
| Compound 3284 | $L_{1-9}$ | $L_{2-268}$ |
| Compound 3285 | $L_{1-9}$ | $L_{2-269}$ |
| Compound 3286 | $L_{1-9}$ | $L_{2-270}$ |
| Compound 3287 | $L_{1-9}$ | $L_{2-271}$ |
| Compound 3288 | $L_{1-9}$ | $L_{2-272}$ |
| Compound 3289 | $L_{1-9}$ | $L_{2-273}$ |
| Compound 3290 | $L_{1-9}$ | $L_{2-274}$ |
| Compound 3291 | $L_{1-9}$ | $L_{2-275}$ |
| Compound 3292 | $L_{1-9}$ | $L_{2-276}$ |
| Compound 3293 | $L_{1-9}$ | $L_{2-277}$ |
| Compound 3294 | $L_{1-9}$ | $L_{2-278}$ |
| Compound 3295 | $L_{1-9}$ | $L_{2-279}$ |
| Compound 3296 | $L_{1-9}$ | $L_{2-280}$ |
| Compound 3297 | $L_{1-9}$ | $L_{2-281}$ |
| Compound 3298 | $L_{1-9}$ | $L_{2-282}$ |
| Compound 3299 | $L_{1-9}$ | $L_{2-283}$ |
| Compound 3300 | $L_{1-9}$ | $L_{2-284}$ |
| Compound 3301 | $L_{1-9}$ | $L_{2-285}$ |
| Compound 3302 | $L_{1-9}$ | $L_{2-286}$ |
| Compound 3303 | $L_{1-9}$ | $L_{2-287}$ |
| Compound 3304 | $L_{1-9}$ | $L_{2-288}$ |
| Compound 3305 | $L_{1-9}$ | $L_{2-289}$ |
| Compound 3306 | $L_{1-9}$ | $L_{2-290}$ |
| Compound 3307 | $L_{1-9}$ | $L_{2-291}$ |
| Compound 3308 | $L_{1-9}$ | $L_{2-292}$ |
| Compound 3309 | $L_{1-9}$ | $L_{2-293}$ |
| Compound 3310 | $L_{1-9}$ | $L_{2-294}$ |
| Compound 3311 | $L_{1-9}$ | $L_{2-295}$ |
| Compound 3312 | $L_{1-9}$ | $L_{2-296}$ |
| Compound 3313 | $L_{1-9}$ | $L_{2-297}$ |
| Compound 3314 | $L_{1-9}$ | $L_{2-298}$ |
| Compound 3315 | $L_{1-9}$ | $L_{2-299}$ |
| Compound 3316 | $L_{1-9}$ | $L_{2-300}$ |
| Compound 3317 | $L_{1-9}$ | $L_{2-301}$ |
| Compound 3318 | $L_{1-9}$ | $L_{2-302}$ |
| Compound 3319 | $L_{1-9}$ | $L_{2-303}$ |
| Compound 3320 | $L_{1-9}$ | $L_{2-304}$ |
| Compound 3321 | $L_{1-9}$ | $L_{2-305}$ |
| Compound 3322 | $L_{1-9}$ | $L_{2-306}$ |
| Compound 3323 | $L_{1-9}$ | $L_{2-307}$ |
| Compound 3324 | $L_{1-9}$ | $L_{2-308}$ |
| Compound 3325 | $L_{1-9}$ | $L_{2-309}$ |
| Compound 3326 | $L_{1-9}$ | $L_{2-310}$ |
| Compound 3327 | $L_{1-9}$ | $L_{2-311}$ |
| Compound 3328 | $L_{1-9}$ | $L_{2-312}$ |
| Compound 3329 | $L_{1-9}$ | $L_{2-313}$ |
| Compound 3330 | $L_{1-9}$ | $L_{2-314}$ |
| Compound 3331 | $L_{1-9}$ | $L_{2-315}$ |
| Compound 3332 | $L_{1-9}$ | $L_{2-316}$ |
| Compound 3333 | $L_{1-9}$ | $L_{2-317}$ |
| Compound 3334 | $L_{1-9}$ | $L_{2-318}$ |
| Compound 3335 | $L_{1-9}$ | $L_{2-319}$ |
| Compound 3336 | $L_{1-9}$ | $L_{2-320}$ |
| Compound 3337 | $L_{1-9}$ | $L_{2-321}$ |
| Compound 3338 | $L_{1-9}$ | $L_{2-322}$ |
| Compound 3339 | $L_{1-9}$ | $L_{2-323}$ |
| Compound 3340 | $L_{1-9}$ | $L_{2-324}$ |
| Compound 3341 | $L_{1-9}$ | $L_{2-325}$ |
| Compound 3342 | $L_{1-9}$ | $L_{2-326}$ |
| Compound 3343 | $L_{1-9}$ | $L_{2-327}$ |
| Compound 3344 | $L_{1-9}$ | $L_{2-328}$ |
| Compound 3345 | $L_{1-9}$ | $L_{2-329}$ |
| Compound 3346 | $L_{1-9}$ | $L_{2-330}$ |
| Compound 3347 | $L_{1-9}$ | $L_{2-331}$ |
| Compound 3348 | $L_{1-9}$ | $L_{2-332}$ |
| Compound 3349 | $L_{1-9}$ | $L_{2-333}$ |

TABLE 1-continued

| | | |
|---|---|---|
| Compound 3350 | $L_{1-9}$ | $L_{2-334}$ |
| Compound 3351 | $L_{1-9}$ | $L_{2-335}$ |
| Compound 3352 | $L_{1-9}$ | $L_{2-336}$ |
| Compound 3353 | $L_{1-9}$ | $L_{2-337}$ |
| Compound 3354 | $L_{1-9}$ | $L_{2-338}$ |
| Compound 3355 | $L_{1-9}$ | $L_{2-339}$ |
| Compound 3356 | $L_{1-9}$ | $L_{2-340}$ |
| Compound 3357 | $L_{1-9}$ | $L_{2-341}$ |
| Compound 3358 | $L_{1-9}$ | $L_{2-342}$ |
| Compound 3359 | $L_{1-9}$ | $L_{2-343}$ |
| Compound 3360 | $L_{1-9}$ | $L_{2-344}$ |
| Compound 3361 | $L_{1-9}$ | $L_{2-345}$ |
| Compound 3362 | $L_{1-9}$ | $L_{2-346}$ |
| Compound 3363 | $L_{1-9}$ | $L_{2-347}$ |
| Compound 3364 | $L_{1-9}$ | $L_{2-348}$ |
| Compound 3365 | $L_{1-9}$ | $L_{2-349}$ |
| Compound 3366 | $L_{1-9}$ | $L_{2-350}$ |
| Compound 3367 | $L_{1-9}$ | $L_{2-351}$ |
| Compound 3368 | $L_{1-9}$ | $L_{2-352}$ |
| Compound 3369 | $L_{1-9}$ | $L_{2-353}$ |
| Compound 3370 | $L_{1-9}$ | $L_{2-354}$ |
| Compound 3371 | $L_{1-9}$ | $L_{2-355}$ |
| Compound 3372 | $L_{1-9}$ | $L_{2-356}$ |
| Compound 3373 | $L_{1-9}$ | $L_{2-357}$ |
| Compound 3374 | $L_{1-9}$ | $L_{2-358}$ |
| Compound 3375 | $L_{1-9}$ | $L_{2-359}$ |
| Compound 3376 | $L_{1-9}$ | $L_{2-360}$ |
| Compound 3377 | $L_{1-9}$ | $L_{2-361}$ |
| Compound 3378 | $L_{1-9}$ | $L_{2-362}$ |
| Compound 3379 | $L_{1-9}$ | $L_{2-363}$ |
| Compound 3380 | $L_{1-9}$ | $L_{2-364}$ |
| Compound 3381 | $L_{1-9}$ | $L_{2-365}$ |
| Compound 3382 | $L_{1-9}$ | $L_{2-366}$ |
| Compound 3383 | $L_{1-9}$ | $L_{2-367}$ |
| Compound 3384 | $L_{1-9}$ | $L_{2-368}$ |
| Compound 3385 | $L_{1-9}$ | $L_{2-369}$ |
| Compound 3386 | $L_{1-9}$ | $L_{2-370}$ |
| Compound 3387 | $L_{1-9}$ | $L_{2-371}$ |
| Compound 3388 | $L_{1-9}$ | $L_{2-372}$ |
| Compound 3389 | $L_{1-9}$ | $L_{2-373}$ |
| Compound 3390 | $L_{1-9}$ | $L_{2-374}$ |
| Compound 3391 | $L_{1-9}$ | $L_{2-375}$ |
| Compound 3392 | $L_{1-9}$ | $L_{2-376}$ |
| Compound 3393 | $L_{1-9}$ | $L_{2-377}$ |
| Compound 3394 | $L_{1-10}$ | $L_{2-1}$ |
| Compound 3395 | $L_{1-10}$ | $L_{2-2}$ |
| Compound 3396 | $L_{1-10}$ | $L_{2-3}$ |
| Compound 3397 | $L_{1-10}$ | $L_{2-4}$ |
| Compound 3398 | $L_{1-10}$ | $L_{2-5}$ |
| Compound 3399 | $L_{1-10}$ | $L_{2-6}$ |
| Compound 3400 | $L_{1-10}$ | $L_{2-7}$ |
| Compound 3401 | $L_{1-10}$ | $L_{2-8}$ |
| Compound 3402 | $L_{1-10}$ | $L_{2-9}$ |
| Compound 3403 | $L_{1-10}$ | $L_{2-10}$ |
| Compound 3404 | $L_{1-10}$ | $L_{2-11}$ |
| Compound 3405 | $L_{1-10}$ | $L_{2-12}$ |
| Compound 3406 | $L_{1-10}$ | $L_{2-13}$ |
| Compound 3407 | $L_{1-10}$ | $L_{2-14}$ |
| Compound 3408 | $L_{1-10}$ | $L_{2-15}$ |
| Compound 3409 | $L_{1-10}$ | $L_{2-16}$ |
| Compound 3410 | $L_{1-10}$ | $L_{2-17}$ |
| Compound 3411 | $L_{1-10}$ | $L_{2-18}$ |
| Compound 3412 | $L_{1-10}$ | $L_{2-19}$ |
| Compound 3413 | $L_{1-10}$ | $L_{2-20}$ |
| Compound 3414 | $L_{1-10}$ | $L_{2-21}$ |
| Compound 3415 | $L_{1-10}$ | $L_{2-22}$ |
| Compound 3416 | $L_{1-10}$ | $L_{2-23}$ |
| Compound 3417 | $L_{1-10}$ | $L_{2-24}$ |
| Compound 3418 | $L_{1-10}$ | $L_{2-25}$ |
| Compound 3419 | $L_{1-10}$ | $L_{2-26}$ |
| Compound 3420 | $L_{1-10}$ | $L_{2-27}$ |
| Compound 3421 | $L_{1-10}$ | $L_{2-28}$ |
| Compound 3422 | $L_{1-10}$ | $L_{2-29}$ |
| Compound 3423 | $L_{1-10}$ | $L_{2-30}$ |
| Compound 3424 | $L_{1-10}$ | $L_{2-31}$ |
| Compound 3425 | $L_{1-10}$ | $L_{2-32}$ |
| Compound 3426 | $L_{1-10}$ | $L_{2-33}$ |
| Compound 3427 | $L_{1-10}$ | $L_{2-34}$ |
| Compound 3428 | $L_{1-10}$ | $L_{2-35}$ |
| Compound 3429 | $L_{1-10}$ | $L_{2-36}$ |

TABLE 1-continued

| | | |
|---|---|---|
| Compound 3430 | $L_{1-10}$ | $L_{2-37}$ |
| Compound 3431 | $L_{1-10}$ | $L_{2-38}$ |
| Compound 3432 | $L_{1-10}$ | $L_{2-39}$ |
| Compound 3433 | $L_{1-10}$ | $L_{2-40}$ |
| Compound 3434 | $L_{1-10}$ | $L_{2-41}$ |
| Compound 3435 | $L_{1-10}$ | $L_{2-42}$ |
| Compound 3436 | $L_{1-10}$ | $L_{2-43}$ |
| Compound 3437 | $L_{1-10}$ | $L_{2-44}$ |
| Compound 3438 | $L_{1-10}$ | $L_{2-45}$ |
| Compound 3439 | $L_{1-10}$ | $L_{2-46}$ |
| Compound 3440 | $L_{1-10}$ | $L_{2-47}$ |
| Compound 3441 | $L_{1-10}$ | $L_{2-48}$ |
| Compound 3442 | $L_{1-10}$ | $L_{2-49}$ |
| Compound 3443 | $L_{1-10}$ | $L_{2-50}$ |
| Compound 3444 | $L_{1-10}$ | $L_{2-51}$ |
| Compound 3445 | $L_{1-10}$ | $L_{2-52}$ |
| Compound 3446 | $L_{1-10}$ | $L_{2-53}$ |
| Compound 3447 | $L_{1-10}$ | $L_{2-54}$ |
| Compound 3448 | $L_{1-10}$ | $L_{2-55}$ |
| Compound 3449 | $L_{1-10}$ | $L_{2-56}$ |
| Compound 3450 | $L_{1-10}$ | $L_{2-57}$ |
| Compound 3451 | $L_{1-10}$ | $L_{2-58}$ |
| Compound 3452 | $L_{1-10}$ | $L_{2-59}$ |
| Compound 3453 | $L_{1-10}$ | $L_{2-60}$ |
| Compound 3454 | $L_{1-10}$ | $L_{2-61}$ |
| Compound 3455 | $L_{1-10}$ | $L_{2-62}$ |
| Compound 3456 | $L_{1-10}$ | $L_{2-63}$ |
| Compound 3457 | $L_{1-10}$ | $L_{2-64}$ |
| Compound 3458 | $L_{1-10}$ | $L_{2-65}$ |
| Compound 3459 | $L_{1-10}$ | $L_{2-66}$ |
| Compound 3460 | $L_{1-10}$ | $L_{2-67}$ |
| Compound 3461 | $L_{1-10}$ | $L_{2-68}$ |
| Compound 3462 | $L_{1-10}$ | $L_{2-69}$ |
| Compound 3463 | $L_{1-10}$ | $L_{2-70}$ |
| Compound 3464 | $L_{1-10}$ | $L_{2-71}$ |
| Compound 3465 | $L_{1-10}$ | $L_{2-72}$ |
| Compound 3466 | $L_{1-10}$ | $L_{2-73}$ |
| Compound 3467 | $L_{1-10}$ | $L_{2-74}$ |
| Compound 3468 | $L_{1-10}$ | $L_{2-75}$ |
| Compound 3469 | $L_{1-10}$ | $L_{2-76}$ |
| Compound 3470 | $L_{1-10}$ | $L_{2-77}$ |
| Compound 3471 | $L_{1-10}$ | $L_{2-78}$ |
| Compound 3472 | $L_{1-10}$ | $L_{2-79}$ |
| Compound 3473 | $L_{1-10}$ | $L_{2-80}$ |
| Compound 3474 | $L_{1-10}$ | $L_{2-81}$ |
| Compound 3475 | $L_{1-10}$ | $L_{2-82}$ |
| Compound 3476 | $L_{1-10}$ | $L_{2-83}$ |
| Compound 3477 | $L_{1-10}$ | $L_{2-84}$ |
| Compound 3478 | $L_{1-10}$ | $L_{2-85}$ |
| Compound 3479 | $L_{1-10}$ | $L_{2-86}$ |
| Compound 3480 | $L_{1-10}$ | $L_{2-87}$ |
| Compound 3481 | $L_{1-10}$ | $L_{2-88}$ |
| Compound 3482 | $L_{1-10}$ | $L_{2-89}$ |
| Compound 3483 | $L_{1-10}$ | $L_{2-90}$ |
| Compound 3484 | $L_{1-10}$ | $L_{2-91}$ |
| Compound 3485 | $L_{1-10}$ | $L_{2-92}$ |
| Compound 3486 | $L_{1-10}$ | $L_{2-93}$ |
| Compound 3487 | $L_{1-10}$ | $L_{2-94}$ |
| Compound 3488 | $L_{1-10}$ | $L_{2-95}$ |
| Compound 3489 | $L_{1-10}$ | $L_{2-96}$ |
| Compound 3490 | $L_{1-10}$ | $L_{2-97}$ |
| Compound 3491 | $L_{1-10}$ | $L_{2-98}$ |
| Compound 3492 | $L_{1-10}$ | $L_{2-99}$ |
| Compound 3493 | $L_{1-10}$ | $L_{2-100}$ |
| Compound 3494 | $L_{1-10}$ | $L_{2-101}$ |
| Compound 3495 | $L_{1-10}$ | $L_{2-102}$ |
| Compound 3496 | $L_{1-10}$ | $L_{2-103}$ |
| Compound 3497 | $L_{1-10}$ | $L_{2-104}$ |
| Compound 3498 | $L_{1-10}$ | $L_{2-105}$ |
| Compound 3499 | $L_{1-10}$ | $L_{2-106}$ |
| Compound 3500 | $L_{1-10}$ | $L_{2-107}$ |
| Compound 3501 | $L_{1-10}$ | $L_{2-108}$ |
| Compound 3502 | $L_{1-10}$ | $L_{2-109}$ |
| Compound 3503 | $L_{1-10}$ | $L_{2-110}$ |
| Compound 3504 | $L_{1-10}$ | $L_{2-111}$ |
| Compound 3505 | $L_{1-10}$ | $L_{2-112}$ |
| Compound 3506 | $L_{1-10}$ | $L_{2-113}$ |
| Compound 3507 | $L_{1-10}$ | $L_{2-114}$ |
| Compound 3508 | $L_{1-10}$ | $L_{2-115}$ |
| Compound 3509 | $L_{1-10}$ | $L_{2-116}$ |

TABLE 1-continued

| | | |
|---|---|---|
| Compound 3510 | $L_{1-10}$ | $L_{2-117}$ |
| Compound 3511 | $L_{1-10}$ | $L_{2-118}$ |
| Compound 3512 | $L_{1-10}$ | $L_{2-119}$ |
| Compound 3513 | $L_{1-10}$ | $L_{2-120}$ |
| Compound 3514 | $L_{1-10}$ | $L_{2-121}$ |
| Compound 3515 | $L_{1-10}$ | $L_{2-122}$ |
| Compound 3516 | $L_{1-10}$ | $L_{2-123}$ |
| Compound 3517 | $L_{1-10}$ | $L_{2-124}$ |
| Compound 3518 | $L_{1-10}$ | $L_{2-125}$ |
| Compound 3519 | $L_{1-10}$ | $L_{2-126}$ |
| Compound 3520 | $L_{1-10}$ | $L_{2-127}$ |
| Compound 3521 | $L_{1-10}$ | $L_{2-128}$ |
| Compound 3522 | $L_{1-10}$ | $L_{2-129}$ |
| Compound 3523 | $L_{1-10}$ | $L_{2-130}$ |
| Compound 3524 | $L_{1-10}$ | $L_{2-131}$ |
| Compound 3525 | $L_{1-10}$ | $L_{2-132}$ |
| Compound 3526 | $L_{1-10}$ | $L_{2-133}$ |
| Compound 3527 | $L_{1-10}$ | $L_{2-134}$ |
| Compound 3528 | $L_{1-10}$ | $L_{2-135}$ |
| Compound 3529 | $L_{1-10}$ | $L_{2-136}$ |
| Compound 3530 | $L_{1-10}$ | $L_{2-137}$ |
| Compound 3531 | $L_{1-10}$ | $L_{2-138}$ |
| Compound 3532 | $L_{1-10}$ | $L_{2-139}$ |
| Compound 3533 | $L_{1-10}$ | $L_{2-140}$ |
| Compound 3534 | $L_{1-10}$ | $L_{2-141}$ |
| Compound 3535 | $L_{1-10}$ | $L_{2-142}$ |
| Compound 3536 | $L_{1-10}$ | $L_{2-143}$ |
| Compound 3537 | $L_{1-10}$ | $L_{2-144}$ |
| Compound 3538 | $L_{1-10}$ | $L_{2-145}$ |
| Compound 3539 | $L_{1-10}$ | $L_{2-146}$ |
| Compound 3540 | $L_{1-10}$ | $L_{2-147}$ |
| Compound 3541 | $L_{1-10}$ | $L_{2-148}$ |
| Compound 3542 | $L_{1-10}$ | $L_{2-149}$ |
| Compound 3543 | $L_{1-10}$ | $L_{2-150}$ |
| Compound 3544 | $L_{1-10}$ | $L_{2-151}$ |
| Compound 3545 | $L_{1-10}$ | $L_{2-152}$ |
| Compound 3546 | $L_{1-10}$ | $L_{2-153}$ |
| Compound 3547 | $L_{1-10}$ | $L_{2-154}$ |
| Compound 3548 | $L_{1-10}$ | $L_{2-155}$ |
| Compound 3549 | $L_{1-10}$ | $L_{2-156}$ |
| Compound 3550 | $L_{1-10}$ | $L_{2-157}$ |
| Compound 3551 | $L_{1-10}$ | $L_{2-158}$ |
| Compound 3552 | $L_{1-10}$ | $L_{2-159}$ |
| Compound 3553 | $L_{1-10}$ | $L_{2-160}$ |
| Compound 3554 | $L_{1-10}$ | $L_{2-161}$ |
| Compound 3555 | $L_{1-10}$ | $L_{2-162}$ |
| Compound 3556 | $L_{1-10}$ | $L_{2-163}$ |
| Compound 3557 | $L_{1-10}$ | $L_{2-164}$ |
| Compound 3558 | $L_{1-10}$ | $L_{2-165}$ |
| Compound 3559 | $L_{1-10}$ | $L_{2-166}$ |
| Compound 3560 | $L_{1-10}$ | $L_{2-167}$ |
| Compound 3561 | $L_{1-10}$ | $L_{2-168}$ |
| Compound 3562 | $L_{1-10}$ | $L_{2-169}$ |
| Compound 3563 | $L_{1-10}$ | $L_{2-170}$ |
| Compound 3564 | $L_{1-10}$ | $L_{2-171}$ |
| Compound 3565 | $L_{1-10}$ | $L_{2-172}$ |
| Compound 3566 | $L_{1-10}$ | $L_{2-173}$ |
| Compound 3567 | $L_{1-10}$ | $L_{2-174}$ |
| Compound 3568 | $L_{1-10}$ | $L_{2-175}$ |
| Compound 3569 | $L_{1-10}$ | $L_{2-176}$ |
| Compound 3570 | $L_{1-10}$ | $L_{2-177}$ |
| Compound 3571 | $L_{1-10}$ | $L_{2-178}$ |
| Compound 3572 | $L_{1-10}$ | $L_{2-179}$ |
| Compound 3573 | $L_{1-10}$ | $L_{2-180}$ |
| Compound 3574 | $L_{1-10}$ | $L_{2-181}$ |
| Compound 3575 | $L_{1-10}$ | $L_{2-182}$ |
| Compound 3576 | $L_{1-10}$ | $L_{2-183}$ |
| Compound 3577 | $L_{1-10}$ | $L_{2-184}$ |
| Compound 3578 | $L_{1-10}$ | $L_{2-185}$ |
| Compound 3579 | $L_{1-10}$ | $L_{2-186}$ |
| Compound 3580 | $L_{1-10}$ | $L_{2-187}$ |
| Compound 3581 | $L_{1-10}$ | $L_{2-188}$ |
| Compound 3582 | $L_{1-10}$ | $L_{2-189}$ |
| Compound 3583 | $L_{1-10}$ | $L_{2-190}$ |
| Compound 3584 | $L_{1-10}$ | $L_{2-191}$ |
| Compound 3585 | $L_{1-10}$ | $L_{2-192}$ |
| Compound 3586 | $L_{1-10}$ | $L_{2-193}$ |
| Compound 3587 | $L_{1-10}$ | $L_{2-194}$ |
| Compound 3588 | $L_{1-10}$ | $L_{2-195}$ |
| Compound 3589 | $L_{1-10}$ | $L_{2-196}$ |

TABLE 1-continued

| | | |
|---|---|---|
| Compound 3590 | $L_{1-10}$ | $L_{2-197}$ |
| Compound 3591 | $L_{1-10}$ | $L_{2-198}$ |
| Compound 3592 | $L_{1-10}$ | $L_{2-199}$ |
| Compound 3593 | $L_{1-10}$ | $L_{2-200}$ |
| Compound 3594 | $L_{1-10}$ | $L_{2-201}$ |
| Compound 3595 | $L_{1-10}$ | $L_{2-202}$ |
| Compound 3596 | $L_{1-10}$ | $L_{2-203}$ |
| Compound 3597 | $L_{1-10}$ | $L_{2-204}$ |
| Compound 3598 | $L_{1-10}$ | $L_{2-205}$ |
| Compound 3599 | $L_{1-10}$ | $L_{2-206}$ |
| Compound 3600 | $L_{1-10}$ | $L_{2-207}$ |
| Compound 3601 | $L_{1-10}$ | $L_{2-208}$ |
| Compound 3602 | $L_{1-10}$ | $L_{2-209}$ |
| Compound 3603 | $L_{1-10}$ | $L_{2-210}$ |
| Compound 3604 | $L_{1-10}$ | $L_{2-211}$ |
| Compound 3605 | $L_{1-10}$ | $L_{2-212}$ |
| Compound 3606 | $L_{1-10}$ | $L_{2-213}$ |
| Compound 3607 | $L_{1-10}$ | $L_{2-214}$ |
| Compound 3608 | $L_{1-10}$ | $L_{2-215}$ |
| Compound 3609 | $L_{1-10}$ | $L_{2-216}$ |
| Compound 3610 | $L_{1-10}$ | $L_{2-217}$ |
| Compound 3611 | $L_{1-10}$ | $L_{2-218}$ |
| Compound 3612 | $L_{1-10}$ | $L_{2-219}$ |
| Compound 3613 | $L_{1-10}$ | $L_{2-220}$ |
| Compound 3614 | $L_{1-10}$ | $L_{2-221}$ |
| Compound 3615 | $L_{1-10}$ | $L_{2-222}$ |
| Compound 3616 | $L_{1-10}$ | $L_{2-223}$ |
| Compound 3617 | $L_{1-10}$ | $L_{2-224}$ |
| Compound 3618 | $L_{1-10}$ | $L_{2-225}$ |
| Compound 3619 | $L_{1-10}$ | $L_{2-226}$ |
| Compound 3620 | $L_{1-10}$ | $L_{2-227}$ |
| Compound 3621 | $L_{1-10}$ | $L_{2-228}$ |
| Compound 3622 | $L_{1-10}$ | $L_{2-229}$ |
| Compound 3623 | $L_{1-10}$ | $L_{2-230}$ |
| Compound 3624 | $L_{1-10}$ | $L_{2-231}$ |
| Compound 3625 | $L_{1-10}$ | $L_{2-232}$ |
| Compound 3626 | $L_{1-10}$ | $L_{2-233}$ |
| Compound 3627 | $L_{1-10}$ | $L_{2-234}$ |
| Compound 3628 | $L_{1-10}$ | $L_{2-235}$ |
| Compound 3629 | $L_{1-10}$ | $L_{2-236}$ |
| Compound 3630 | $L_{1-10}$ | $L_{2-237}$ |
| Compound 3631 | $L_{1-10}$ | $L_{2-238}$ |
| Compound 3632 | $L_{1-10}$ | $L_{2-239}$ |
| Compound 3633 | $L_{1-10}$ | $L_{2-240}$ |
| Compound 3634 | $L_{1-10}$ | $L_{2-241}$ |
| Compound 3635 | $L_{1-10}$ | $L_{2-242}$ |
| Compound 3636 | $L_{1-10}$ | $L_{2-243}$ |
| Compound 3637 | $L_{1-10}$ | $L_{2-244}$ |
| Compound 3638 | $L_{1-10}$ | $L_{2-245}$ |
| Compound 3639 | $L_{1-10}$ | $L_{2-246}$ |
| Compound 3640 | $L_{1-10}$ | $L_{2-247}$ |
| Compound 3641 | $L_{1-10}$ | $L_{2-248}$ |
| Compound 3642 | $L_{1-10}$ | $L_{2-249}$ |
| Compound 3643 | $L_{1-10}$ | $L_{2-250}$ |
| Compound 3644 | $L_{1-10}$ | $L_{2-251}$ |
| Compound 3645 | $L_{1-10}$ | $L_{2-252}$ |
| Compound 3646 | $L_{1-10}$ | $L_{2-253}$ |
| Compound 3647 | $L_{1-10}$ | $L_{2-254}$ |
| Compound 3648 | $L_{1-10}$ | $L_{2-255}$ |
| Compound 3649 | $L_{1-10}$ | $L_{2-256}$ |
| Compound 3650 | $L_{1-10}$ | $L_{2-257}$ |
| Compound 3651 | $L_{1-10}$ | $L_{2-258}$ |
| Compound 3652 | $L_{1-10}$ | $L_{2-259}$ |
| Compound 3653 | $L_{1-10}$ | $L_{2-260}$ |
| Compound 3654 | $L_{1-10}$ | $L_{2-261}$ |
| Compound 3655 | $L_{1-10}$ | $L_{2-262}$ |
| Compound 3656 | $L_{1-10}$ | $L_{2-263}$ |
| Compound 3657 | $L_{1-10}$ | $L_{2-264}$ |
| Compound 3658 | $L_{1-10}$ | $L_{2-265}$ |
| Compound 3659 | $L_{1-10}$ | $L_{2-266}$ |
| Compound 3660 | $L_{1-10}$ | $L_{2-267}$ |
| Compound 3661 | $L_{1-10}$ | $L_{2-268}$ |
| Compound 3662 | $L_{1-10}$ | $L_{2-269}$ |
| Compound 3663 | $L_{1-10}$ | $L_{2-270}$ |
| Compound 3664 | $L_{1-10}$ | $L_{2-271}$ |
| Compound 3665 | $L_{1-10}$ | $L_{2-272}$ |
| Compound 3666 | $L_{1-10}$ | $L_{2-273}$ |
| Compound 3667 | $L_{1-10}$ | $L_{2-274}$ |
| Compound 3668 | $L_{1-10}$ | $L_{2-275}$ |
| Compound 3669 | $L_{1-10}$ | $L_{2-276}$ |
| Compound 3670 | $L_{1-10}$ | $L_{2-277}$ |
| Compound 3671 | $L_{1-10}$ | $L_{2-278}$ |
| Compound 3672 | $L_{1-10}$ | $L_{2-279}$ |
| Compound 3673 | $L_{1-10}$ | $L_{2-280}$ |
| Compound 3674 | $L_{1-10}$ | $L_{2-281}$ |
| Compound 3675 | $L_{1-10}$ | $L_{2-282}$ |
| Compound 3676 | $L_{1-10}$ | $L_{2-283}$ |
| Compound 3677 | $L_{1-10}$ | $L_{2-284}$ |
| Compound 3678 | $L_{1-10}$ | $L_{2-285}$ |
| Compound 3679 | $L_{1-10}$ | $L_{2-286}$ |
| Compound 3680 | $L_{1-10}$ | $L_{2-287}$ |
| Compound 3681 | $L_{1-10}$ | $L_{2-288}$ |
| Compound 3682 | $L_{1-10}$ | $L_{2-289}$ |
| Compound 3683 | $L_{1-10}$ | $L_{2-290}$ |
| Compound 3684 | $L_{1-10}$ | $L_{2-291}$ |
| Compound 3685 | $L_{1-10}$ | $L_{2-292}$ |
| Compound 3686 | $L_{1-10}$ | $L_{2-293}$ |
| Compound 3687 | $L_{1-10}$ | $L_{2-294}$ |
| Compound 3688 | $L_{1-10}$ | $L_{2-295}$ |
| Compound 3689 | $L_{1-10}$ | $L_{2-296}$ |
| Compound 3690 | $L_{1-10}$ | $L_{2-297}$ |
| Compound 3691 | $L_{1-10}$ | $L_{2-298}$ |
| Compound 3692 | $L_{1-10}$ | $L_{2-299}$ |
| Compound 3693 | $L_{1-10}$ | $L_{2-300}$ |
| Compound 3694 | $L_{1-10}$ | $L_{2-301}$ |
| Compound 3695 | $L_{1-10}$ | $L_{2-302}$ |
| Compound 3696 | $L_{1-10}$ | $L_{2-303}$ |
| Compound 3697 | $L_{1-10}$ | $L_{2-304}$ |
| Compound 3698 | $L_{1-10}$ | $L_{2-305}$ |
| Compound 3699 | $L_{1-10}$ | $L_{2-306}$ |
| Compound 3700 | $L_{1-10}$ | $L_{2-307}$ |
| Compound 3701 | $L_{1-10}$ | $L_{2-308}$ |
| Compound 3702 | $L_{1-10}$ | $L_{2-309}$ |
| Compound 3703 | $L_{1-10}$ | $L_{2-310}$ |
| Compound 3704 | $L_{1-10}$ | $L_{2-311}$ |
| Compound 3705 | $L_{1-10}$ | $L_{2-312}$ |
| Compound 3706 | $L_{1-10}$ | $L_{2-313}$ |
| Compound 3707 | $L_{1-10}$ | $L_{2-314}$ |
| Compound 3708 | $L_{1-10}$ | $L_{2-315}$ |
| Compound 3709 | $L_{1-10}$ | $L_{2-316}$ |
| Compound 3710 | $L_{1-10}$ | $L_{2-317}$ |
| Compound 3711 | $L_{1-10}$ | $L_{2-318}$ |
| Compound 3712 | $L_{1-10}$ | $L_{2-319}$ |
| Compound 3713 | $L_{1-10}$ | $L_{2-320}$ |
| Compound 3714 | $L_{1-10}$ | $L_{2-321}$ |
| Compound 3715 | $L_{1-10}$ | $L_{2-322}$ |
| Compound 3716 | $L_{1-10}$ | $L_{2-323}$ |
| Compound 3717 | $L_{1-10}$ | $L_{2-324}$ |
| Compound 3718 | $L_{1-10}$ | $L_{2-325}$ |
| Compound 3719 | $L_{1-10}$ | $L_{2-326}$ |
| Compound 3720 | $L_{1-10}$ | $L_{2-327}$ |
| Compound 3721 | $L_{1-10}$ | $L_{2-328}$ |
| Compound 3722 | $L_{1-10}$ | $L_{2-329}$ |
| Compound 3723 | $L_{1-10}$ | $L_{2-330}$ |
| Compound 3724 | $L_{1-10}$ | $L_{2-331}$ |
| Compound 3725 | $L_{1-10}$ | $L_{2-332}$ |
| Compound 3726 | $L_{1-10}$ | $L_{2-333}$ |
| Compound 3727 | $L_{1-10}$ | $L_{2-334}$ |
| Compound 3728 | $L_{1-10}$ | $L_{2-335}$ |
| Compound 3729 | $L_{1-10}$ | $L_{2-336}$ |
| Compound 3730 | $L_{1-10}$ | $L_{2-337}$ |
| Compound 3731 | $L_{1-10}$ | $L_{2-338}$ |
| Compound 3732 | $L_{1-10}$ | $L_{2-339}$ |
| Compound 3733 | $L_{1-10}$ | $L_{2-340}$ |
| Compound 3734 | $L_{1-10}$ | $L_{2-341}$ |
| Compound 3735 | $L_{1-10}$ | $L_{2-342}$ |
| Compound 3736 | $L_{1-10}$ | $L_{2-343}$ |
| Compound 3737 | $L_{1-10}$ | $L_{2-344}$ |
| Compound 3738 | $L_{1-10}$ | $L_{2-345}$ |
| Compound 3739 | $L_{1-10}$ | $L_{2-346}$ |
| Compound 3740 | $L_{1-10}$ | $L_{2-347}$ |
| Compound 3741 | $L_{1-10}$ | $L_{2-348}$ |
| Compound 3742 | $L_{1-10}$ | $L_{2-349}$ |
| Compound 3743 | $L_{1-10}$ | $L_{2-350}$ |
| Compound 3744 | $L_{1-10}$ | $L_{2-351}$ |
| Compound 3745 | $L_{1-10}$ | $L_{2-352}$ |
| Compound 3746 | $L_{1-10}$ | $L_{2-353}$ |
| Compound 3747 | $L_{1-10}$ | $L_{2-354}$ |
| Compound 3748 | $L_{1-10}$ | $L_{2-355}$ |
| Compound 3749 | $L_{1-10}$ | $L_{2-356}$ |

TABLE 1-continued

| | | |
|---|---|---|
| Compound 3750 | $L_{1-10}$ | $L_{2-357}$ |
| Compound 3751 | $L_{1-10}$ | $L_{2-358}$ |
| Compound 3752 | $L_{1-10}$ | $L_{2-359}$ |
| Compound 3753 | $L_{1-10}$ | $L_{2-360}$ |
| Compound 3754 | $L_{1-10}$ | $L_{2-361}$ |
| Compound 3755 | $L_{1-10}$ | $L_{2-362}$ |
| Compound 3756 | $L_{1-10}$ | $L_{2-363}$ |
| Compound 3757 | $L_{1-10}$ | $L_{2-364}$ |
| Compound 3758 | $L_{1-10}$ | $L_{2-365}$ |
| Compound 3759 | $L_{1-10}$ | $L_{2-366}$ |
| Compound 3760 | $L_{1-10}$ | $L_{2-367}$ |
| Compound 3761 | $L_{1-10}$ | $L_{2-368}$ |
| Compound 3762 | $L_{1-10}$ | $L_{2-369}$ |
| Compound 3763 | $L_{1-10}$ | $L_{2-370}$ |
| Compound 3764 | $L_{1-10}$ | $L_{2-371}$ |
| Compound 3765 | $L_{1-10}$ | $L_{2-372}$ |
| Compound 3766 | $L_{1-10}$ | $L_{2-373}$ |
| Compound 3767 | $L_{1-10}$ | $L_{2-374}$ |
| Compound 3768 | $L_{1-10}$ | $L_{2-375}$ |
| Compound 3769 | $L_{1-10}$ | $L_{2-376}$ |
| Compound 3770 | $L_{1-10}$ | $L_{2-377}$ |
| Compound 3771 | $L_{1-199}$ | $L_{2-1}$ |
| Compound 3772 | $L_{1-199}$ | $L_{2-2}$ |
| Compound 3773 | $L_{1-199}$ | $L_{2-3}$ |
| Compound 3774 | $L_{1-199}$ | $L_{2-4}$ |
| Compound 3775 | $L_{1-199}$ | $L_{2-5}$ |
| Compound 3776 | $L_{1-199}$ | $L_{2-6}$ |
| Compound 3777 | $L_{1-199}$ | $L_{2-7}$ |
| Compound 3778 | $L_{1-199}$ | $L_{2-8}$ |
| Compound 3779 | $L_{1-199}$ | $L_{2-9}$ |
| Compound 3780 | $L_{1-199}$ | $L_{2-10}$ |
| Compound 3781 | $L_{1-199}$ | $L_{2-11}$ |
| Compound 3782 | $L_{1-199}$ | $L_{2-12}$ |
| Compound 3783 | $L_{1-199}$ | $L_{2-13}$ |
| Compound 3784 | $L_{1-199}$ | $L_{2-14}$ |
| Compound 3785 | $L_{1-199}$ | $L_{2-15}$ |
| Compound 3786 | $L_{1-199}$ | $L_{2-16}$ |
| Compound 3787 | $L_{1-199}$ | $L_{2-17}$ |
| Compound 3788 | $L_{1-199}$ | $L_{2-18}$ |
| Compound 3789 | $L_{1-199}$ | $L_{2-19}$ |
| Compound 3790 | $L_{1-199}$ | $L_{2-20}$ |
| Compound 3791 | $L_{1-199}$ | $L_{2-21}$ |
| Compound 3792 | $L_{1-199}$ | $L_{2-22}$ |
| Compound 3793 | $L_{1-199}$ | $L_{2-23}$ |
| Compound 3794 | $L_{1-199}$ | $L_{2-24}$ |
| Compound 3795 | $L_{1-199}$ | $L_{2-25}$ |
| Compound 3796 | $L_{1-199}$ | $L_{2-26}$ |
| Compound 3797 | $L_{1-199}$ | $L_{2-27}$ |
| Compound 3798 | $L_{1-199}$ | $L_{2-28}$ |
| Compound 3799 | $L_{1-199}$ | $L_{2-29}$ |
| Compound 3800 | $L_{1-199}$ | $L_{2-30}$ |
| Compound 3801 | $L_{1-199}$ | $L_{2-31}$ |
| Compound 3802 | $L_{1-199}$ | $L_{2-32}$ |
| Compound 3803 | $L_{1-199}$ | $L_{2-33}$ |
| Compound 3804 | $L_{1-199}$ | $L_{2-34}$ |
| Compound 3805 | $L_{1-199}$ | $L_{2-35}$ |
| Compound 3806 | $L_{1-199}$ | $L_{2-36}$ |
| Compound 3807 | $L_{1-199}$ | $L_{2-37}$ |
| Compound 3808 | $L_{1-199}$ | $L_{2-38}$ |
| Compound 3809 | $L_{1-199}$ | $L_{2-39}$ |
| Compound 3810 | $L_{1-199}$ | $L_{2-40}$ |
| Compound 3811 | $L_{1-199}$ | $L_{2-41}$ |
| Compound 3812 | $L_{1-199}$ | $L_{2-42}$ |
| Compound 3813 | $L_{1-199}$ | $L_{2-43}$ |
| Compound 3814 | $L_{1-199}$ | $L_{2-44}$ |
| Compound 3815 | $L_{1-199}$ | $L_{2-45}$ |
| Compound 3816 | $L_{1-199}$ | $L_{2-46}$ |
| Compound 3817 | $L_{1-199}$ | $L_{2-47}$ |
| Compound 3818 | $L_{1-199}$ | $L_{2-48}$ |
| Compound 3819 | $L_{1-199}$ | $L_{2-49}$ |
| Compound 3820 | $L_{1-199}$ | $L_{2-50}$ |
| Compound 3821 | $L_{1-199}$ | $L_{2-51}$ |
| Compound 3822 | $L_{1-199}$ | $L_{2-52}$ |
| Compound 3823 | $L_{1-199}$ | $L_{2-53}$ |
| Compound 3824 | $L_{1-199}$ | $L_{2-54}$ |
| Compound 3825 | $L_{1-199}$ | $L_{2-55}$ |
| Compound 3826 | $L_{1-199}$ | $L_{2-56}$ |
| Compound 3827 | $L_{1-199}$ | $L_{2-57}$ |
| Compound 3828 | $L_{1-199}$ | $L_{2-58}$ |
| Compound 3829 | $L_{1-199}$ | $L_{2-59}$ |

TABLE 1-continued

| | | |
|---|---|---|
| Compound 3830 | $L_{1-199}$ | $L_{2-60}$ |
| Compound 3831 | $L_{1-199}$ | $L_{2-61}$ |
| Compound 3832 | $L_{1-199}$ | $L_{2-62}$ |
| Compound 3833 | $L_{1-199}$ | $L_{2-63}$ |
| Compound 3834 | $L_{1-199}$ | $L_{2-64}$ |
| Compound 3835 | $L_{1-199}$ | $L_{2-65}$ |
| Compound 3836 | $L_{1-199}$ | $L_{2-66}$ |
| Compound 3837 | $L_{1-199}$ | $L_{2-67}$ |
| Compound 3838 | $L_{1-199}$ | $L_{2-68}$ |
| Compound 3839 | $L_{1-199}$ | $L_{2-69}$ |
| Compound 3840 | $L_{1-199}$ | $L_{2-70}$ |
| Compound 3841 | $L_{1-199}$ | $L_{2-71}$ |
| Compound 3842 | $L_{1-199}$ | $L_{2-72}$ |
| Compound 3843 | $L_{1-199}$ | $L_{2-73}$ |
| Compound 3844 | $L_{1-199}$ | $L_{2-74}$ |
| Compound 3845 | $L_{1-199}$ | $L_{2-75}$ |
| Compound 3846 | $L_{1-199}$ | $L_{2-76}$ |
| Compound 3847 | $L_{1-199}$ | $L_{2-77}$ |
| Compound 3848 | $L_{1-199}$ | $L_{2-78}$ |
| Compound 3849 | $L_{1-199}$ | $L_{2-79}$ |
| Compound 3850 | $L_{1-199}$ | $L_{2-80}$ |
| Compound 3851 | $L_{1-199}$ | $L_{2-81}$ |
| Compound 3852 | $L_{1-199}$ | $L_{2-82}$ |
| Compound 3853 | $L_{1-199}$ | $L_{2-83}$ |
| Compound 3854 | $L_{1-199}$ | $L_{2-84}$ |
| Compound 3855 | $L_{1-199}$ | $L_{2-85}$ |
| Compound 3856 | $L_{1-199}$ | $L_{2-86}$ |
| Compound 3857 | $L_{1-199}$ | $L_{2-87}$ |
| Compound 3858 | $L_{1-199}$ | $L_{2-88}$ |
| Compound 3859 | $L_{1-199}$ | $L_{2-89}$ |
| Compound 3860 | $L_{1-199}$ | $L_{2-90}$ |
| Compound 3861 | $L_{1-199}$ | $L_{2-91}$ |
| Compound 3862 | $L_{1-199}$ | $L_{2-92}$ |
| Compound 3863 | $L_{1-199}$ | $L_{2-93}$ |
| Compound 3864 | $L_{1-199}$ | $L_{2-94}$ |
| Compound 3865 | $L_{1-199}$ | $L_{2-95}$ |
| Compound 3866 | $L_{1-199}$ | $L_{2-96}$ |
| Compound 3867 | $L_{1-199}$ | $L_{2-97}$ |
| Compound 3868 | $L_{1-199}$ | $L_{2-98}$ |
| Compound 3869 | $L_{1-199}$ | $L_{2-99}$ |
| Compound 3870 | $L_{1-199}$ | $L_{2-100}$ |
| Compound 3871 | $L_{1-199}$ | $L_{2-101}$ |
| Compound 3872 | $L_{1-199}$ | $L_{2-102}$ |
| Compound 3873 | $L_{1-199}$ | $L_{2-103}$ |
| Compound 3874 | $L_{1-199}$ | $L_{2-104}$ |
| Compound 3875 | $L_{1-199}$ | $L_{2-105}$ |
| Compound 3876 | $L_{1-199}$ | $L_{2-106}$ |
| Compound 3877 | $L_{1-199}$ | $L_{2-107}$ |
| Compound 3878 | $L_{1-199}$ | $L_{2-108}$ |
| Compound 3879 | $L_{1-199}$ | $L_{2-109}$ |
| Compound 3880 | $L_{1-199}$ | $L_{2-110}$ |
| Compound 3881 | $L_{1-199}$ | $L_{2-111}$ |
| Compound 3882 | $L_{1-199}$ | $L_{2-112}$ |
| Compound 3883 | $L_{1-199}$ | $L_{2-113}$ |
| Compound 3884 | $L_{1-199}$ | $L_{2-114}$ |
| Compound 3885 | $L_{1-199}$ | $L_{2-115}$ |
| Compound 3886 | $L_{1-199}$ | $L_{2-116}$ |
| Compound 3887 | $L_{1-199}$ | $L_{2-117}$ |
| Compound 3888 | $L_{1-199}$ | $L_{2-118}$ |
| Compound 3889 | $L_{1-199}$ | $L_{2-119}$ |
| Compound 3890 | $L_{1-199}$ | $L_{2-120}$ |
| Compound 3891 | $L_{1-199}$ | $L_{2-121}$ |
| Compound 3892 | $L_{1-199}$ | $L_{2-122}$ |
| Compound 3893 | $L_{1-199}$ | $L_{2-123}$ |
| Compound 3894 | $L_{1-199}$ | $L_{2-124}$ |
| Compound 3895 | $L_{1-199}$ | $L_{2-125}$ |
| Compound 3896 | $L_{1-199}$ | $L_{2-126}$ |
| Compound 3897 | $L_{1-199}$ | $L_{2-127}$ |
| Compound 3898 | $L_{1-199}$ | $L_{2-128}$ |
| Compound 3899 | $L_{1-199}$ | $L_{2-129}$ |
| Compound 3900 | $L_{1-199}$ | $L_{2-130}$ |
| Compound 3901 | $L_{1-199}$ | $L_{2-131}$ |
| Compound 3902 | $L_{1-199}$ | $L_{2-132}$ |
| Compound 3903 | $L_{1-199}$ | $L_{2-133}$ |
| Compound 3904 | $L_{1-199}$ | $L_{2-134}$ |
| Compound 3905 | $L_{1-199}$ | $L_{2-135}$ |
| Compound 3906 | $L_{1-199}$ | $L_{2-136}$ |
| Compound 3907 | $L_{1-199}$ | $L_{2-137}$ |
| Compound 3908 | $L_{1-199}$ | $L_{2-138}$ |
| Compound 3909 | $L_{1-199}$ | $L_{2-139}$ |

TABLE 1-continued

| | | |
|---|---|---|
| Compound 3910 | $L_{1-199}$ | $L_{2-140}$ |
| Compound 3911 | $L_{1-199}$ | $L_{2-141}$ |
| Compound 3912 | $L_{1-199}$ | $L_{2-142}$ |
| Compound 3913 | $L_{1-199}$ | $L_{2-143}$ |
| Compound 3914 | $L_{1-199}$ | $L_{2-144}$ |
| Compound 3915 | $L_{1-199}$ | $L_{2-145}$ |
| Compound 3916 | $L_{1-199}$ | $L_{2-146}$ |
| Compound 3917 | $L_{1-199}$ | $L_{2-147}$ |
| Compound 3918 | $L_{1-199}$ | $L_{2-148}$ |
| Compound 3919 | $L_{1-199}$ | $L_{2-149}$ |
| Compound 3920 | $L_{1-199}$ | $L_{2-150}$ |
| Compound 3921 | $L_{1-199}$ | $L_{2-151}$ |
| Compound 3922 | $L_{1-199}$ | $L_{2-152}$ |
| Compound 3923 | $L_{1-199}$ | $L_{2-153}$ |
| Compound 3924 | $L_{1-199}$ | $L_{2-154}$ |
| Compound 3925 | $L_{1-199}$ | $L_{2-155}$ |
| Compound 3926 | $L_{1-199}$ | $L_{2-156}$ |
| Compound 3927 | $L_{1-199}$ | $L_{2-157}$ |
| Compound 3928 | $L_{1-199}$ | $L_{2-158}$ |
| Compound 3929 | $L_{1-199}$ | $L_{2-159}$ |
| Compound 3930 | $L_{1-199}$ | $L_{2-160}$ |
| Compound 3931 | $L_{1-199}$ | $L_{2-161}$ |
| Compound 3932 | $L_{1-199}$ | $L_{2-162}$ |
| Compound 3933 | $L_{1-199}$ | $L_{2-163}$ |
| Compound 3934 | $L_{1-199}$ | $L_{2-164}$ |
| Compound 3935 | $L_{1-199}$ | $L_{2-165}$ |
| Compound 3936 | $L_{1-199}$ | $L_{2-166}$ |
| Compound 3937 | $L_{1-199}$ | $L_{2-167}$ |
| Compound 3938 | $L_{1-199}$ | $L_{2-168}$ |
| Compound 3939 | $L_{1-199}$ | $L_{2-169}$ |
| Compound 3940 | $L_{1-199}$ | $L_{2-170}$ |
| Compound 3941 | $L_{1-199}$ | $L_{2-171}$ |
| Compound 3942 | $L_{1-199}$ | $L_{2-172}$ |
| Compound 3943 | $L_{1-199}$ | $L_{2-173}$ |
| Compound 3944 | $L_{1-199}$ | $L_{2-174}$ |
| Compound 3945 | $L_{1-199}$ | $L_{2-175}$ |
| Compound 3946 | $L_{1-199}$ | $L_{2-176}$ |
| Compound 3947 | $L_{1-199}$ | $L_{2-177}$ |
| Compound 3948 | $L_{1-199}$ | $L_{2-178}$ |
| Compound 3949 | $L_{1-199}$ | $L_{2-179}$ |
| Compound 3950 | $L_{1-199}$ | $L_{2-180}$ |
| Compound 3951 | $L_{1-199}$ | $L_{2-181}$ |
| Compound 3952 | $L_{1-199}$ | $L_{2-182}$ |
| Compound 3953 | $L_{1-199}$ | $L_{2-183}$ |
| Compound 3954 | $L_{1-199}$ | $L_{2-184}$ |
| Compound 3955 | $L_{1-199}$ | $L_{2-185}$ |
| Compound 3956 | $L_{1-199}$ | $L_{2-186}$ |
| Compound 3957 | $L_{1-199}$ | $L_{2-187}$ |
| Compound 3958 | $L_{1-199}$ | $L_{2-188}$ |
| Compound 3959 | $L_{1-199}$ | $L_{2-189}$ |
| Compound 3960 | $L_{1-199}$ | $L_{2-190}$ |
| Compound 3961 | $L_{1-199}$ | $L_{2-191}$ |
| Compound 3962 | $L_{1-199}$ | $L_{2-192}$ |
| Compound 3963 | $L_{1-199}$ | $L_{2-193}$ |
| Compound 3964 | $L_{1-199}$ | $L_{2-194}$ |
| Compound 3965 | $L_{1-199}$ | $L_{2-195}$ |
| Compound 3966 | $L_{1-199}$ | $L_{2-196}$ |
| Compound 3967 | $L_{1-199}$ | $L_{2-197}$ |
| Compound 3968 | $L_{1-199}$ | $L_{2-198}$ |
| Compound 3969 | $L_{1-199}$ | $L_{2-199}$ |
| Compound 3970 | $L_{1-199}$ | $L_{2-200}$ |
| Compound 3971 | $L_{1-199}$ | $L_{2-201}$ |
| Compound 3972 | $L_{1-199}$ | $L_{2-202}$ |
| Compound 3973 | $L_{1-199}$ | $L_{2-203}$ |
| Compound 3974 | $L_{1-199}$ | $L_{2-204}$ |
| Compound 3975 | $L_{1-199}$ | $L_{2-205}$ |
| Compound 3976 | $L_{1-199}$ | $L_{2-206}$ |
| Compound 3977 | $L_{1-199}$ | $L_{2-207}$ |
| Compound 3978 | $L_{1-199}$ | $L_{2-208}$ |
| Compound 3979 | $L_{1-199}$ | $L_{2-209}$ |
| Compound 3980 | $L_{1-199}$ | $L_{2-210}$ |
| Compound 3981 | $L_{1-199}$ | $L_{2-211}$ |
| Compound 3982 | $L_{1-199}$ | $L_{2-212}$ |
| Compound 3983 | $L_{1-199}$ | $L_{2-213}$ |
| Compound 3984 | $L_{1-199}$ | $L_{2-214}$ |
| Compound 3985 | $L_{1-199}$ | $L_{2-215}$ |
| Compound 3986 | $L_{1-199}$ | $L_{2-216}$ |
| Compound 3987 | $L_{1-199}$ | $L_{2-217}$ |
| Compound 3988 | $L_{1-199}$ | $L_{2-218}$ |
| Compound 3989 | $L_{1-199}$ | $L_{2-219}$ |

TABLE 1-continued

| | | |
|---|---|---|
| Compound 3990 | $L_{1-199}$ | $L_{2-220}$ |
| Compound 3991 | $L_{1-199}$ | $L_{2-221}$ |
| Compound 3992 | $L_{1-199}$ | $L_{2-222}$ |
| Compound 3993 | $L_{1-199}$ | $L_{2-223}$ |
| Compound 3994 | $L_{1-199}$ | $L_{2-224}$ |
| Compound 3995 | $L_{1-199}$ | $L_{2-225}$ |
| Compound 3996 | $L_{1-199}$ | $L_{2-226}$ |
| Compound 3997 | $L_{1-199}$ | $L_{2-227}$ |
| Compound 3998 | $L_{1-199}$ | $L_{2-228}$ |
| Compound 3999 | $L_{1-199}$ | $L_{2-229}$ |
| Compound 4000 | $L_{1-199}$ | $L_{2-230}$ |
| Compound 4001 | $L_{1-199}$ | $L_{2-231}$ |
| Compound 4002 | $L_{1-199}$ | $L_{2-232}$ |
| Compound 4003 | $L_{1-199}$ | $L_{2-233}$ |
| Compound 4004 | $L_{1-199}$ | $L_{2-234}$ |
| Compound 4005 | $L_{1-199}$ | $L_{2-235}$ |
| Compound 4006 | $L_{1-199}$ | $L_{2-236}$ |
| Compound 4007 | $L_{1-199}$ | $L_{2-237}$ |
| Compound 4008 | $L_{1-199}$ | $L_{2-238}$ |
| Compound 4009 | $L_{1-199}$ | $L_{2-239}$ |
| Compound 4010 | $L_{1-199}$ | $L_{2-240}$ |
| Compound 4011 | $L_{1-199}$ | $L_{2-241}$ |
| Compound 4012 | $L_{1-199}$ | $L_{2-242}$ |
| Compound 4013 | $L_{1-199}$ | $L_{2-243}$ |
| Compound 4014 | $L_{1-199}$ | $L_{2-244}$ |
| Compound 4015 | $L_{1-199}$ | $L_{2-245}$ |
| Compound 4016 | $L_{1-199}$ | $L_{2-246}$ |
| Compound 4017 | $L_{1-199}$ | $L_{2-247}$ |
| Compound 4018 | $L_{1-199}$ | $L_{2-248}$ |
| Compound 4019 | $L_{1-199}$ | $L_{2-249}$ |
| Compound 4020 | $L_{1-199}$ | $L_{2-250}$ |
| Compound 4021 | $L_{1-199}$ | $L_{2-251}$ |
| Compound 4022 | $L_{1-199}$ | $L_{2-252}$ |
| Compound 4023 | $L_{1-199}$ | $L_{2-253}$ |
| Compound 4024 | $L_{1-199}$ | $L_{2-254}$ |
| Compound 4025 | $L_{1-199}$ | $L_{2-255}$ |
| Compound 4026 | $L_{1-199}$ | $L_{2-256}$ |
| Compound 4027 | $L_{1-199}$ | $L_{2-257}$ |
| Compound 4028 | $L_{1-199}$ | $L_{2-258}$ |
| Compound 4029 | $L_{1-199}$ | $L_{2-259}$ |
| Compound 4030 | $L_{1-199}$ | $L_{2-260}$ |
| Compound 4031 | $L_{1-199}$ | $L_{2-261}$ |
| Compound 4032 | $L_{1-199}$ | $L_{2-262}$ |
| Compound 4033 | $L_{1-199}$ | $L_{2-263}$ |
| Compound 4034 | $L_{1-199}$ | $L_{2-264}$ |
| Compound 4035 | $L_{1-199}$ | $L_{2-265}$ |
| Compound 4036 | $L_{1-199}$ | $L_{2-266}$ |
| Compound 4037 | $L_{1-199}$ | $L_{2-267}$ |
| Compound 4038 | $L_{1-199}$ | $L_{2-268}$ |
| Compound 4039 | $L_{1-199}$ | $L_{2-269}$ |
| Compound 4040 | $L_{1-199}$ | $L_{2-270}$ |
| Compound 4041 | $L_{1-199}$ | $L_{2-271}$ |
| Compound 4042 | $L_{1-199}$ | $L_{2-272}$ |
| Compound 4043 | $L_{1-199}$ | $L_{2-273}$ |
| Compound 4044 | $L_{1-199}$ | $L_{2-274}$ |
| Compound 4045 | $L_{1-199}$ | $L_{2-275}$ |
| Compound 4046 | $L_{1-199}$ | $L_{2-276}$ |
| Compound 4047 | $L_{1-199}$ | $L_{2-277}$ |
| Compound 4048 | $L_{1-199}$ | $L_{2-278}$ |
| Compound 4049 | $L_{1-199}$ | $L_{2-279}$ |
| Compound 4050 | $L_{1-199}$ | $L_{2-280}$ |
| Compound 4051 | $L_{1-199}$ | $L_{2-281}$ |
| Compound 4052 | $L_{1-199}$ | $L_{2-282}$ |
| Compound 4053 | $L_{1-199}$ | $L_{2-283}$ |
| Compound 4054 | $L_{1-199}$ | $L_{2-284}$ |
| Compound 4055 | $L_{1-199}$ | $L_{2-285}$ |
| Compound 4056 | $L_{1-199}$ | $L_{2-286}$ |
| Compound 4057 | $L_{1-199}$ | $L_{2-287}$ |
| Compound 4058 | $L_{1-199}$ | $L_{2-288}$ |
| Compound 4059 | $L_{1-199}$ | $L_{2-289}$ |
| Compound 4060 | $L_{1-199}$ | $L_{2-290}$ |
| Compound 4061 | $L_{1-199}$ | $L_{2-291}$ |
| Compound 4062 | $L_{1-199}$ | $L_{2-292}$ |
| Compound 4063 | $L_{1-199}$ | $L_{2-293}$ |
| Compound 4064 | $L_{1-199}$ | $L_{2-294}$ |
| Compound 4065 | $L_{1-199}$ | $L_{2-295}$ |
| Compound 4066 | $L_{1-199}$ | $L_{2-296}$ |
| Compound 4067 | $L_{1-199}$ | $L_{2-297}$ |
| Compound 4068 | $L_{1-199}$ | $L_{2-298}$ |
| Compound 4069 | $L_{1-199}$ | $L_{2-299}$ |

TABLE 1-continued

| | | |
|---|---|---|
| Compound 4070 | $L_{1-199}$ | $L_{2-300}$ |
| Compound 4071 | $L_{1-199}$ | $L_{2-301}$ |
| Compound 4072 | $L_{1-199}$ | $L_{2-302}$ |
| Compound 4073 | $L_{1-199}$ | $L_{2-303}$ |
| Compound 4074 | $L_{1-199}$ | $L_{2-304}$ |
| Compound 4075 | $L_{1-199}$ | $L_{2-305}$ |
| Compound 4076 | $L_{1-199}$ | $L_{2-306}$ |
| Compound 4077 | $L_{1-199}$ | $L_{2-307}$ |
| Compound 4078 | $L_{1-199}$ | $L_{2-308}$ |
| Compound 4079 | $L_{1-199}$ | $L_{2-309}$ |
| Compound 4080 | $L_{1-199}$ | $L_{2-310}$ |
| Compound 4081 | $L_{1-199}$ | $L_{2-311}$ |
| Compound 4082 | $L_{1-199}$ | $L_{2-312}$ |
| Compound 4083 | $L_{1-199}$ | $L_{2-313}$ |
| Compound 4084 | $L_{1-199}$ | $L_{2-314}$ |
| Compound 4085 | $L_{1-199}$ | $L_{2-315}$ |
| Compound 4086 | $L_{1-199}$ | $L_{2-316}$ |
| Compound 4087 | $L_{1-199}$ | $L_{2-317}$ |
| Compound 4088 | $L_{1-199}$ | $L_{2-318}$ |
| Compound 4089 | $L_{1-199}$ | $L_{2-319}$ |
| Compound 4090 | $L_{1-199}$ | $L_{2-320}$ |
| Compound 4091 | $L_{1-199}$ | $L_{2-321}$ |
| Compound 4092 | $L_{1-199}$ | $L_{2-322}$ |
| Compound 4093 | $L_{1-199}$ | $L_{2-323}$ |
| Compound 4094 | $L_{1-199}$ | $L_{2-324}$ |
| Compound 4095 | $L_{1-199}$ | $L_{2-325}$ |
| Compound 4096 | $L_{1-199}$ | $L_{2-326}$ |
| Compound 4097 | $L_{1-199}$ | $L_{2-327}$ |
| Compound 4098 | $L_{1-199}$ | $L_{2-328}$ |
| Compound 4099 | $L_{1-199}$ | $L_{2-329}$ |
| Compound 4100 | $L_{1-199}$ | $L_{2-330}$ |
| Compound 4101 | $L_{1-199}$ | $L_{2-331}$ |
| Compound 4102 | $L_{1-199}$ | $L_{2-332}$ |
| Compound 4103 | $L_{1-199}$ | $L_{2-333}$ |
| Compound 4104 | $L_{1-199}$ | $L_{2-334}$ |
| Compound 4105 | $L_{1-199}$ | $L_{2-335}$ |
| Compound 4106 | $L_{1-199}$ | $L_{2-336}$ |
| Compound 4107 | $L_{1-199}$ | $L_{2-337}$ |
| Compound 4108 | $L_{1-199}$ | $L_{2-338}$ |
| Compound 4109 | $L_{1-199}$ | $L_{2-339}$ |
| Compound 4110 | $L_{1-199}$ | $L_{2-340}$ |
| Compound 4111 | $L_{1-199}$ | $L_{2-341}$ |
| Compound 4112 | $L_{1-199}$ | $L_{2-342}$ |
| Compound 4113 | $L_{1-199}$ | $L_{2-343}$ |
| Compound 4114 | $L_{1-199}$ | $L_{2-344}$ |
| Compound 4115 | $L_{1-199}$ | $L_{2-345}$ |
| Compound 4116 | $L_{1-199}$ | $L_{2-346}$ |
| Compound 4117 | $L_{1-199}$ | $L_{2-347}$ |
| Compound 4118 | $L_{1-199}$ | $L_{2-348}$ |
| Compound 4119 | $L_{1-199}$ | $L_{2-349}$ |
| Compound 4120 | $L_{1-199}$ | $L_{2-350}$ |
| Compound 4121 | $L_{1-199}$ | $L_{2-351}$ |
| Compound 4122 | $L_{1-199}$ | $L_{2-352}$ |
| Compound 4123 | $L_{1-199}$ | $L_{2-353}$ |
| Compound 4124 | $L_{1-199}$ | $L_{2-354}$ |
| Compound 4125 | $L_{1-199}$ | $L_{2-355}$ |
| Compound 4126 | $L_{1-199}$ | $L_{2-356}$ |
| Compound 4127 | $L_{1-199}$ | $L_{2-357}$ |
| Compound 4128 | $L_{1-199}$ | $L_{2-358}$ |
| Compound 4129 | $L_{1-199}$ | $L_{2-359}$ |
| Compound 4130 | $L_{1-199}$ | $L_{2-360}$ |
| Compound 4131 | $L_{1-199}$ | $L_{2-361}$ |
| Compound 4132 | $L_{1-199}$ | $L_{2-362}$ |
| Compound 4133 | $L_{1-199}$ | $L_{2-363}$ |
| Compound 4134 | $L_{1-199}$ | $L_{2-364}$ |
| Compound 4135 | $L_{1-199}$ | $L_{2-365}$ |
| Compound 4136 | $L_{1-199}$ | $L_{2-366}$ |
| Compound 4137 | $L_{1-199}$ | $L_{2-367}$ |
| Compound 4138 | $L_{1-199}$ | $L_{2-368}$ |
| Compound 4139 | $L_{1-199}$ | $L_{2-369}$ |
| Compound 4140 | $L_{1-199}$ | $L_{2-370}$ |
| Compound 4141 | $L_{1-199}$ | $L_{2-371}$ |
| Compound 4142 | $L_{1-199}$ | $L_{2-372}$ |
| Compound 4143 | $L_{1-199}$ | $L_{2-373}$ |
| Compound 4144 | $L_{1-199}$ | $L_{2-374}$ |
| Compound 4145 | $L_{1-199}$ | $L_{2-375}$ |
| Compound 4146 | $L_{1-199}$ | $L_{2-376}$ |
| Compound 4147 | $L_{1-199}$ | $L_{2-377}$ |
| Compound 4148 | $L_{1-200}$ | $L_{2-1}$ |
| Compound 4149 | $L_{1-200}$ | $L_{2-2}$ |
| Compound 4150 | $L_{1-200}$ | $L_{2-3}$ |
| Compound 4151 | $L_{1-200}$ | $L_{2-4}$ |
| Compound 4152 | $L_{1-200}$ | $L_{2-5}$ |
| Compound 4153 | $L_{1-200}$ | $L_{2-6}$ |
| Compound 4154 | $L_{1-200}$ | $L_{2-7}$ |
| Compound 4155 | $L_{1-200}$ | $L_{2-8}$ |
| Compound 4156 | $L_{1-200}$ | $L_{2-9}$ |
| Compound 4157 | $L_{1-200}$ | $L_{2-10}$ |
| Compound 4158 | $L_{1-200}$ | $L_{2-11}$ |
| Compound 4159 | $L_{1-200}$ | $L_{2-12}$ |
| Compound 4160 | $L_{1-200}$ | $L_{2-13}$ |
| Compound 4161 | $L_{1-200}$ | $L_{2-14}$ |
| Compound 4162 | $L_{1-200}$ | $L_{2-15}$ |
| Compound 4163 | $L_{1-200}$ | $L_{2-16}$ |
| Compound 4164 | $L_{1-200}$ | $L_{2-17}$ |
| Compound 4165 | $L_{1-200}$ | $L_{2-18}$ |
| Compound 4166 | $L_{1-200}$ | $L_{2-19}$ |
| Compound 4167 | $L_{1-200}$ | $L_{2-20}$ |
| Compound 4168 | $L_{1-200}$ | $L_{2-21}$ |
| Compound 4169 | $L_{1-200}$ | $L_{2-22}$ |
| Compound 4170 | $L_{1-200}$ | $L_{2-23}$ |
| Compound 4171 | $L_{1-200}$ | $L_{2-24}$ |
| Compound 4172 | $L_{1-200}$ | $L_{2-25}$ |
| Compound 4173 | $L_{1-200}$ | $L_{2-26}$ |
| Compound 4174 | $L_{1-200}$ | $L_{2-27}$ |
| Compound 4175 | $L_{1-200}$ | $L_{2-28}$ |
| Compound 4176 | $L_{1-200}$ | $L_{2-29}$ |
| Compound 4177 | $L_{1-200}$ | $L_{2-30}$ |
| Compound 4178 | $L_{1-200}$ | $L_{2-31}$ |
| Compound 4179 | $L_{1-200}$ | $L_{2-32}$ |
| Compound 4180 | $L_{1-200}$ | $L_{2-33}$ |
| Compound 4181 | $L_{1-200}$ | $L_{2-34}$ |
| Compound 4182 | $L_{1-200}$ | $L_{2-35}$ |
| Compound 4183 | $L_{1-200}$ | $L_{2-36}$ |
| Compound 4184 | $L_{1-200}$ | $L_{2-37}$ |
| Compound 4185 | $L_{1-200}$ | $L_{2-38}$ |
| Compound 4186 | $L_{1-200}$ | $L_{2-39}$ |
| Compound 4187 | $L_{1-200}$ | $L_{2-40}$ |
| Compound 4188 | $L_{1-200}$ | $L_{2-41}$ |
| Compound 4189 | $L_{1-200}$ | $L_{2-42}$ |
| Compound 4190 | $L_{1-200}$ | $L_{2-43}$ |
| Compound 4191 | $L_{1-200}$ | $L_{2-44}$ |
| Compound 4192 | $L_{1-200}$ | $L_{2-45}$ |
| Compound 4193 | $L_{1-200}$ | $L_{2-46}$ |
| Compound 4194 | $L_{1-200}$ | $L_{2-47}$ |
| Compound 4195 | $L_{1-200}$ | $L_{2-48}$ |
| Compound 4196 | $L_{1-200}$ | $L_{2-49}$ |
| Compound 4197 | $L_{1-200}$ | $L_{2-50}$ |
| Compound 4198 | $L_{1-200}$ | $L_{2-51}$ |
| Compound 4199 | $L_{1-200}$ | $L_{2-52}$ |
| Compound 4200 | $L_{1-200}$ | $L_{2-53}$ |
| Compound 4201 | $L_{1-200}$ | $L_{2-54}$ |
| Compound 4202 | $L_{1-200}$ | $L_{2-55}$ |
| Compound 4203 | $L_{1-200}$ | $L_{2-56}$ |
| Compound 4204 | $L_{1-200}$ | $L_{2-57}$ |
| Compound 4205 | $L_{1-200}$ | $L_{2-58}$ |
| Compound 4206 | $L_{1-200}$ | $L_{2-59}$ |
| Compound 4207 | $L_{1-200}$ | $L_{2-60}$ |
| Compound 4208 | $L_{1-200}$ | $L_{2-61}$ |
| Compound 4209 | $L_{1-200}$ | $L_{2-62}$ |
| Compound 4210 | $L_{1-200}$ | $L_{2-63}$ |
| Compound 4211 | $L_{1-200}$ | $L_{2-64}$ |
| Compound 4212 | $L_{1-200}$ | $L_{2-65}$ |
| Compound 4213 | $L_{1-200}$ | $L_{2-66}$ |
| Compound 4214 | $L_{1-200}$ | $L_{2-67}$ |
| Compound 4215 | $L_{1-200}$ | $L_{2-68}$ |
| Compound 4216 | $L_{1-200}$ | $L_{2-69}$ |
| Compound 4217 | $L_{1-200}$ | $L_{2-70}$ |
| Compound 4218 | $L_{1-200}$ | $L_{2-71}$ |
| Compound 4219 | $L_{1-200}$ | $L_{2-72}$ |
| Compound 4220 | $L_{1-200}$ | $L_{2-73}$ |
| Compound 4221 | $L_{1-200}$ | $L_{2-74}$ |
| Compound 4222 | $L_{1-200}$ | $L_{2-75}$ |
| Compound 4223 | $L_{1-200}$ | $L_{2-76}$ |
| Compound 4224 | $L_{1-200}$ | $L_{2-77}$ |
| Compound 4225 | $L_{1-200}$ | $L_{2-78}$ |
| Compound 4226 | $L_{1-200}$ | $L_{2-79}$ |
| Compound 4227 | $L_{1-200}$ | $L_{2-80}$ |
| Compound 4228 | $L_{1-200}$ | $L_{2-81}$ |
| Compound 4229 | $L_{1-200}$ | $L_{2-82}$ |

TABLE 1-continued

| | | |
|---|---|---|
| Compound 4230 | $L_{1-200}$ | $L_{2-83}$ |
| Compound 4231 | $L_{1-200}$ | $L_{2-84}$ |
| Compound 4232 | $L_{1-200}$ | $L_{2-85}$ |
| Compound 4233 | $L_{1-200}$ | $L_{2-86}$ |
| Compound 4234 | $L_{1-200}$ | $L_{2-87}$ |
| Compound 4235 | $L_{1-200}$ | $L_{2-88}$ |
| Compound 4236 | $L_{1-200}$ | $L_{2-89}$ |
| Compound 4237 | $L_{1-200}$ | $L_{2-90}$ |
| Compound 4238 | $L_{1-200}$ | $L_{2-91}$ |
| Compound 4239 | $L_{1-200}$ | $L_{2-92}$ |
| Compound 4240 | $L_{1-200}$ | $L_{2-93}$ |
| Compound 4241 | $L_{1-200}$ | $L_{2-94}$ |
| Compound 4242 | $L_{1-200}$ | $L_{2-95}$ |
| Compound 4243 | $L_{1-200}$ | $L_{2-96}$ |
| Compound 4244 | $L_{1-200}$ | $L_{2-97}$ |
| Compound 4245 | $L_{1-200}$ | $L_{2-98}$ |
| Compound 4246 | $L_{1-200}$ | $L_{2-99}$ |
| Compound 4247 | $L_{1-200}$ | $L_{2-100}$ |
| Compound 4248 | $L_{1-200}$ | $L_{2-101}$ |
| Compound 4249 | $L_{1-200}$ | $L_{2-102}$ |
| Compound 4250 | $L_{1-200}$ | $L_{2-103}$ |
| Compound 4251 | $L_{1-200}$ | $L_{2-104}$ |
| Compound 4252 | $L_{1-200}$ | $L_{2-105}$ |
| Compound 4253 | $L_{1-200}$ | $L_{2-106}$ |
| Compound 4254 | $L_{1-200}$ | $L_{2-107}$ |
| Compound 4255 | $L_{1-200}$ | $L_{2-108}$ |
| Compound 4256 | $L_{1-200}$ | $L_{2-109}$ |
| Compound 4257 | $L_{1-200}$ | $L_{2-110}$ |
| Compound 4258 | $L_{1-200}$ | $L_{2-111}$ |
| Compound 4259 | $L_{1-200}$ | $L_{2-112}$ |
| Compound 4260 | $L_{1-200}$ | $L_{2-113}$ |
| Compound 4261 | $L_{1-200}$ | $L_{2-114}$ |
| Compound 4262 | $L_{1-200}$ | $L_{2-115}$ |
| Compound 4263 | $L_{1-200}$ | $L_{2-116}$ |
| Compound 4264 | $L_{1-200}$ | $L_{2-117}$ |
| Compound 4265 | $L_{1-200}$ | $L_{2-118}$ |
| Compound 4266 | $L_{1-200}$ | $L_{2-119}$ |
| Compound 4267 | $L_{1-200}$ | $L_{2-120}$ |
| Compound 4268 | $L_{1-200}$ | $L_{2-121}$ |
| Compound 4269 | $L_{1-200}$ | $L_{2-122}$ |
| Compound 4270 | $L_{1-200}$ | $L_{2-123}$ |
| Compound 4271 | $L_{1-200}$ | $L_{2-124}$ |
| Compound 4272 | $L_{1-200}$ | $L_{2-125}$ |
| Compound 4273 | $L_{1-200}$ | $L_{2-126}$ |
| Compound 4274 | $L_{1-200}$ | $L_{2-127}$ |
| Compound 4275 | $L_{1-200}$ | $L_{2-128}$ |
| Compound 4276 | $L_{1-200}$ | $L_{2-129}$ |
| Compound 4277 | $L_{1-200}$ | $L_{2-130}$ |
| Compound 4278 | $L_{1-200}$ | $L_{2-131}$ |
| Compound 4279 | $L_{1-200}$ | $L_{2-132}$ |
| Compound 4280 | $L_{1-200}$ | $L_{2-133}$ |
| Compound 4281 | $L_{1-200}$ | $L_{2-134}$ |
| Compound 4282 | $L_{1-200}$ | $L_{2-135}$ |
| Compound 4283 | $L_{1-200}$ | $L_{2-136}$ |
| Compound 4284 | $L_{1-200}$ | $L_{2-137}$ |
| Compound 4285 | $L_{1-200}$ | $L_{2-138}$ |
| Compound 4286 | $L_{1-200}$ | $L_{2-139}$ |
| Compound 4287 | $L_{1-200}$ | $L_{2-140}$ |
| Compound 4288 | $L_{1-200}$ | $L_{2-141}$ |
| Compound 4289 | $L_{1-200}$ | $L_{2-142}$ |
| Compound 4290 | $L_{1-200}$ | $L_{2-143}$ |
| Compound 4291 | $L_{1-200}$ | $L_{2-144}$ |
| Compound 4292 | $L_{1-200}$ | $L_{2-145}$ |
| Compound 4293 | $L_{1-200}$ | $L_{2-146}$ |
| Compound 4294 | $L_{1-200}$ | $L_{2-147}$ |
| Compound 4295 | $L_{1-200}$ | $L_{2-148}$ |
| Compound 4296 | $L_{1-200}$ | $L_{2-149}$ |
| Compound 4297 | $L_{1-200}$ | $L_{2-150}$ |
| Compound 4298 | $L_{1-200}$ | $L_{2-151}$ |
| Compound 4299 | $L_{1-200}$ | $L_{2-152}$ |
| Compound 4300 | $L_{1-200}$ | $L_{2-153}$ |
| Compound 4301 | $L_{1-200}$ | $L_{2-154}$ |
| Compound 4302 | $L_{1-200}$ | $L_{2-155}$ |
| Compound 4303 | $L_{1-200}$ | $L_{2-156}$ |
| Compound 4304 | $L_{1-200}$ | $L_{2-157}$ |
| Compound 4305 | $L_{1-200}$ | $L_{2-158}$ |
| Compound 4306 | $L_{1-200}$ | $L_{2-159}$ |
| Compound 4307 | $L_{1-200}$ | $L_{2-160}$ |
| Compound 4308 | $L_{1-200}$ | $L_{2-161}$ |
| Compound 4309 | $L_{1-200}$ | $L_{2-162}$ |

TABLE 1-continued

| | | |
|---|---|---|
| Compound 4310 | $L_{1-200}$ | $L_{2-163}$ |
| Compound 4311 | $L_{1-200}$ | $L_{2-164}$ |
| Compound 4312 | $L_{1-200}$ | $L_{2-165}$ |
| Compound 4313 | $L_{1-200}$ | $L_{2-166}$ |
| Compound 4314 | $L_{1-200}$ | $L_{2-167}$ |
| Compound 4315 | $L_{1-200}$ | $L_{2-168}$ |
| Compound 4316 | $L_{1-200}$ | $L_{2-169}$ |
| Compound 4317 | $L_{1-200}$ | $L_{2-170}$ |
| Compound 4318 | $L_{1-200}$ | $L_{2-171}$ |
| Compound 4319 | $L_{1-200}$ | $L_{2-172}$ |
| Compound 4320 | $L_{1-200}$ | $L_{2-173}$ |
| Compound 4321 | $L_{1-200}$ | $L_{2-174}$ |
| Compound 4322 | $L_{1-200}$ | $L_{2-175}$ |
| Compound 4323 | $L_{1-200}$ | $L_{2-176}$ |
| Compound 4324 | $L_{1-200}$ | $L_{2-177}$ |
| Compound 4325 | $L_{1-200}$ | $L_{2-178}$ |
| Compound 4326 | $L_{1-200}$ | $L_{2-179}$ |
| Compound 4327 | $L_{1-200}$ | $L_{2-180}$ |
| Compound 4328 | $L_{1-200}$ | $L_{2-181}$ |
| Compound 4329 | $L_{1-200}$ | $L_{2-182}$ |
| Compound 4330 | $L_{1-200}$ | $L_{2-183}$ |
| Compound 4331 | $L_{1-200}$ | $L_{2-184}$ |
| Compound 4332 | $L_{1-200}$ | $L_{2-185}$ |
| Compound 4333 | $L_{1-200}$ | $L_{2-186}$ |
| Compound 4334 | $L_{1-200}$ | $L_{2-187}$ |
| Compound 4335 | $L_{1-200}$ | $L_{2-188}$ |
| Compound 4336 | $L_{1-200}$ | $L_{2-189}$ |
| Compound 4337 | $L_{1-200}$ | $L_{2-190}$ |
| Compound 4338 | $L_{1-200}$ | $L_{2-191}$ |
| Compound 4339 | $L_{1-200}$ | $L_{2-192}$ |
| Compound 4340 | $L_{1-200}$ | $L_{2-193}$ |
| Compound 4341 | $L_{1-200}$ | $L_{2-194}$ |
| Compound 4342 | $L_{1-200}$ | $L_{2-195}$ |
| Compound 4343 | $L_{1-200}$ | $L_{2-196}$ |
| Compound 4344 | $L_{1-200}$ | $L_{2-197}$ |
| Compound 4345 | $L_{1-200}$ | $L_{2-198}$ |
| Compound 4346 | $L_{1-200}$ | $L_{2-199}$ |
| Compound 4347 | $L_{1-200}$ | $L_{2-200}$ |
| Compound 4348 | $L_{1-200}$ | $L_{2-201}$ |
| Compound 4349 | $L_{1-200}$ | $L_{2-202}$ |
| Compound 4350 | $L_{1-200}$ | $L_{2-203}$ |
| Compound 4351 | $L_{1-200}$ | $L_{2-204}$ |
| Compound 4352 | $L_{1-200}$ | $L_{2-205}$ |
| Compound 4353 | $L_{1-200}$ | $L_{2-206}$ |
| Compound 4354 | $L_{1-200}$ | $L_{2-207}$ |
| Compound 4355 | $L_{1-200}$ | $L_{2-208}$ |
| Compound 4356 | $L_{1-200}$ | $L_{2-209}$ |
| Compound 4357 | $L_{1-200}$ | $L_{2-210}$ |
| Compound 4358 | $L_{1-200}$ | $L_{2-211}$ |
| Compound 4359 | $L_{1-200}$ | $L_{2-212}$ |
| Compound 4360 | $L_{1-200}$ | $L_{2-213}$ |
| Compound 4361 | $L_{1-200}$ | $L_{2-214}$ |
| Compound 4362 | $L_{1-200}$ | $L_{2-215}$ |
| Compound 4363 | $L_{1-200}$ | $L_{2-216}$ |
| Compound 4364 | $L_{1-200}$ | $L_{2-217}$ |
| Compound 4365 | $L_{1-200}$ | $L_{2-218}$ |
| Compound 4366 | $L_{1-200}$ | $L_{2-219}$ |
| Compound 4367 | $L_{1-200}$ | $L_{2-220}$ |
| Compound 4368 | $L_{1-200}$ | $L_{2-221}$ |
| Compound 4369 | $L_{1-200}$ | $L_{2-222}$ |
| Compound 4370 | $L_{1-200}$ | $L_{2-223}$ |
| Compound 4371 | $L_{1-200}$ | $L_{2-224}$ |
| Compound 4372 | $L_{1-200}$ | $L_{2-225}$ |
| Compound 4373 | $L_{1-200}$ | $L_{2-226}$ |
| Compound 4374 | $L_{1-200}$ | $L_{2-227}$ |
| Compound 4375 | $L_{1-200}$ | $L_{2-228}$ |
| Compound 4376 | $L_{1-200}$ | $L_{2-229}$ |
| Compound 4377 | $L_{1-200}$ | $L_{2-230}$ |
| Compound 4378 | $L_{1-200}$ | $L_{2-231}$ |
| Compound 4379 | $L_{1-200}$ | $L_{2-232}$ |
| Compound 4380 | $L_{1-200}$ | $L_{2-233}$ |
| Compound 4381 | $L_{1-200}$ | $L_{2-234}$ |
| Compound 4382 | $L_{1-200}$ | $L_{2-235}$ |
| Compound 4383 | $L_{1-200}$ | $L_{2-236}$ |
| Compound 4384 | $L_{1-200}$ | $L_{2-237}$ |
| Compound 4385 | $L_{1-200}$ | $L_{2-238}$ |
| Compound 4386 | $L_{1-200}$ | $L_{2-239}$ |
| Compound 4387 | $L_{1-200}$ | $L_{2-240}$ |
| Compound 4388 | $L_{1-200}$ | $L_{2-241}$ |
| Compound 4389 | $L_{1-200}$ | $L_{2-242}$ |

TABLE 1-continued

| | | |
|---|---|---|
| Compound 4390 | $L_{1-200}$ | $L_{2-243}$ |
| Compound 4391 | $L_{1-200}$ | $L_{2-244}$ |
| Compound 4392 | $L_{1-200}$ | $L_{2-245}$ |
| Compound 4393 | $L_{1-200}$ | $L_{2-246}$ |
| Compound 4394 | $L_{1-200}$ | $L_{2-247}$ |
| Compound 4395 | $L_{1-200}$ | $L_{2-248}$ |
| Compound 4396 | $L_{1-200}$ | $L_{2-249}$ |
| Compound 4397 | $L_{1-200}$ | $L_{2-250}$ |
| Compound 4398 | $L_{1-200}$ | $L_{2-251}$ |
| Compound 4399 | $L_{1-200}$ | $L_{2-252}$ |
| Compound 4400 | $L_{1-200}$ | $L_{2-253}$ |
| Compound 4401 | $L_{1-200}$ | $L_{2-254}$ |
| Compound 4402 | $L_{1-200}$ | $L_{2-255}$ |
| Compound 4403 | $L_{1-200}$ | $L_{2-256}$ |
| Compound 4404 | $L_{1-200}$ | $L_{2-257}$ |
| Compound 4405 | $L_{1-200}$ | $L_{2-258}$ |
| Compound 4406 | $L_{1-200}$ | $L_{2-259}$ |
| Compound 4407 | $L_{1-200}$ | $L_{2-260}$ |
| Compound 4408 | $L_{1-200}$ | $L_{2-261}$ |
| Compound 4409 | $L_{1-200}$ | $L_{2-262}$ |
| Compound 4410 | $L_{1-200}$ | $L_{2-263}$ |
| Compound 4411 | $L_{1-200}$ | $L_{2-264}$ |
| Compound 4412 | $L_{1-200}$ | $L_{2-265}$ |
| Compound 4413 | $L_{1-200}$ | $L_{2-266}$ |
| Compound 4414 | $L_{1-200}$ | $L_{2-267}$ |
| Compound 4415 | $L_{1-200}$ | $L_{2-268}$ |
| Compound 4416 | $L_{1-200}$ | $L_{2-269}$ |
| Compound 4417 | $L_{1-200}$ | $L_{2-270}$ |
| Compound 4418 | $L_{1-200}$ | $L_{2-271}$ |
| Compound 4419 | $L_{1-200}$ | $L_{2-272}$ |
| Compound 4420 | $L_{1-200}$ | $L_{2-273}$ |
| Compound 4421 | $L_{1-200}$ | $L_{2-274}$ |
| Compound 4422 | $L_{1-200}$ | $L_{2-275}$ |
| Compound 4423 | $L_{1-200}$ | $L_{2-276}$ |
| Compound 4424 | $L_{1-200}$ | $L_{2-277}$ |
| Compound 4425 | $L_{1-200}$ | $L_{2-278}$ |
| Compound 4426 | $L_{1-200}$ | $L_{2-279}$ |
| Compound 4427 | $L_{1-200}$ | $L_{2-280}$ |
| Compound 4428 | $L_{1-200}$ | $L_{2-281}$ |
| Compound 4429 | $L_{1-200}$ | $L_{2-282}$ |
| Compound 4430 | $L_{1-200}$ | $L_{2-283}$ |
| Compound 4431 | $L_{1-200}$ | $L_{2-284}$ |
| Compound 4432 | $L_{1-200}$ | $L_{2-285}$ |
| Compound 4433 | $L_{1-200}$ | $L_{2-286}$ |
| Compound 4434 | $L_{1-200}$ | $L_{2-287}$ |
| Compound 4435 | $L_{1-200}$ | $L_{2-288}$ |
| Compound 4436 | $L_{1-200}$ | $L_{2-289}$ |
| Compound 4437 | $L_{1-200}$ | $L_{2-290}$ |
| Compound 4438 | $L_{1-200}$ | $L_{2-291}$ |
| Compound 4439 | $L_{1-200}$ | $L_{2-292}$ |
| Compound 4440 | $L_{1-200}$ | $L_{2-293}$ |
| Compound 4441 | $L_{1-200}$ | $L_{2-294}$ |
| Compound 4442 | $L_{1-200}$ | $L_{2-295}$ |
| Compound 4443 | $L_{1-200}$ | $L_{2-296}$ |
| Compound 4444 | $L_{1-200}$ | $L_{2-297}$ |
| Compound 4445 | $L_{1-200}$ | $L_{2-298}$ |
| Compound 4446 | $L_{1-200}$ | $L_{2-299}$ |
| Compound 4447 | $L_{1-200}$ | $L_{2-300}$ |
| Compound 4448 | $L_{1-200}$ | $L_{2-301}$ |
| Compound 4449 | $L_{1-200}$ | $L_{2-302}$ |
| Compound 4450 | $L_{1-200}$ | $L_{2-303}$ |
| Compound 4451 | $L_{1-200}$ | $L_{2-304}$ |
| Compound 4452 | $L_{1-200}$ | $L_{2-305}$ |
| Compound 4453 | $L_{1-200}$ | $L_{2-306}$ |
| Compound 4454 | $L_{1-200}$ | $L_{2-307}$ |
| Compound 4455 | $L_{1-200}$ | $L_{2-308}$ |
| Compound 4456 | $L_{1-200}$ | $L_{2-309}$ |
| Compound 4457 | $L_{1-200}$ | $L_{2-310}$ |
| Compound 4458 | $L_{1-200}$ | $L_{2-311}$ |
| Compound 4459 | $L_{1-200}$ | $L_{2-312}$ |
| Compound 4460 | $L_{1-200}$ | $L_{2-313}$ |
| Compound 4461 | $L_{1-200}$ | $L_{2-314}$ |
| Compound 4462 | $L_{1-200}$ | $L_{2-315}$ |
| Compound 4463 | $L_{1-200}$ | $L_{2-316}$ |
| Compound 4464 | $L_{1-200}$ | $L_{2-317}$ |
| Compound 4465 | $L_{1-200}$ | $L_{2-318}$ |
| Compound 4466 | $L_{1-200}$ | $L_{2-319}$ |
| Compound 4467 | $L_{1-200}$ | $L_{2-320}$ |
| Compound 4468 | $L_{1-200}$ | $L_{2-321}$ |
| Compound 4469 | $L_{1-200}$ | $L_{2-322}$ |

TABLE 1-continued

| | | |
|---|---|---|
| Compound 4470 | $L_{1-200}$ | $L_{2-323}$ |
| Compound 4471 | $L_{1-200}$ | $L_{2-324}$ |
| Compound 4472 | $L_{1-200}$ | $L_{2-325}$ |
| Compound 4473 | $L_{1-200}$ | $L_{2-326}$ |
| Compound 4474 | $L_{1-200}$ | $L_{2-327}$ |
| Compound 4475 | $L_{1-200}$ | $L_{2-328}$ |
| Compound 4476 | $L_{1-200}$ | $L_{2-329}$ |
| Compound 4477 | $L_{1-200}$ | $L_{2-330}$ |
| Compound 4478 | $L_{1-200}$ | $L_{2-331}$ |
| Compound 4479 | $L_{1-200}$ | $L_{2-332}$ |
| Compound 4480 | $L_{1-200}$ | $L_{2-333}$ |
| Compound 4481 | $L_{1-200}$ | $L_{2-334}$ |
| Compound 4482 | $L_{1-200}$ | $L_{2-335}$ |
| Compound 4483 | $L_{1-200}$ | $L_{2-336}$ |
| Compound 4484 | $L_{1-200}$ | $L_{2-337}$ |
| Compound 4485 | $L_{1-200}$ | $L_{2-338}$ |
| Compound 4486 | $L_{1-200}$ | $L_{2-339}$ |
| Compound 4487 | $L_{1-200}$ | $L_{2-340}$ |
| Compound 4488 | $L_{1-200}$ | $L_{2-341}$ |
| Compound 4489 | $L_{1-200}$ | $L_{2-342}$ |
| Compound 4490 | $L_{1-200}$ | $L_{2-343}$ |
| Compound 4491 | $L_{1-200}$ | $L_{2-344}$ |
| Compound 4492 | $L_{1-200}$ | $L_{2-345}$ |
| Compound 4493 | $L_{1-200}$ | $L_{2-346}$ |
| Compound 4494 | $L_{1-200}$ | $L_{2-347}$ |
| Compound 4495 | $L_{1-200}$ | $L_{2-348}$ |
| Compound 4496 | $L_{1-200}$ | $L_{2-349}$ |
| Compound 4497 | $L_{1-200}$ | $L_{2-350}$ |
| Compound 4498 | $L_{1-200}$ | $L_{2-351}$ |
| Compound 4499 | $L_{1-200}$ | $L_{2-352}$ |
| Compound 4500 | $L_{1-200}$ | $L_{2-353}$ |
| Compound 4501 | $L_{1-200}$ | $L_{2-354}$ |
| Compound 4502 | $L_{1-200}$ | $L_{2-355}$ |
| Compound 4503 | $L_{1-200}$ | $L_{2-356}$ |
| Compound 4504 | $L_{1-200}$ | $L_{2-357}$ |
| Compound 4505 | $L_{1-200}$ | $L_{2-358}$ |
| Compound 4506 | $L_{1-200}$ | $L_{2-359}$ |
| Compound 4507 | $L_{1-200}$ | $L_{2-360}$ |
| Compound 4508 | $L_{1-200}$ | $L_{2-361}$ |
| Compound 4509 | $L_{1-200}$ | $L_{2-362}$ |
| Compound 4510 | $L_{1-200}$ | $L_{2-363}$ |
| Compound 4511 | $L_{1-200}$ | $L_{2-364}$ |
| Compound 4512 | $L_{1-200}$ | $L_{2-365}$ |
| Compound 4513 | $L_{1-200}$ | $L_{2-366}$ |
| Compound 4514 | $L_{1-200}$ | $L_{2-367}$ |
| Compound 4515 | $L_{1-200}$ | $L_{2-368}$ |
| Compound 4516 | $L_{1-200}$ | $L_{2-369}$ |
| Compound 4517 | $L_{1-200}$ | $L_{2-370}$ |
| Compound 4518 | $L_{1-200}$ | $L_{2-371}$ |
| Compound 4519 | $L_{1-200}$ | $L_{2-372}$ |
| Compound 4520 | $L_{1-200}$ | $L_{2-373}$ |
| Compound 4521 | $L_{1-200}$ | $L_{2-374}$ |
| Compound 4522 | $L_{1-200}$ | $L_{2-375}$ |
| Compound 4523 | $L_{1-200}$ | $L_{2-376}$ |
| Compound 4524 | $L_{1-201}$ | $L_{2-377}$ |
| Compound 4525 | $L_{1-201}$ | $L_{2-1}$ |
| Compound 4526 | $L_{1-201}$ | $L_{2-2}$ |
| Compound 4527 | $L_{1-201}$ | $L_{2-3}$ |
| Compound 4528 | $L_{1-201}$ | $L_{2-4}$ |
| Compound 4529 | $L_{1-201}$ | $L_{2-5}$ |
| Compound 4530 | $L_{1-201}$ | $L_{2-6}$ |
| Compound 4531 | $L_{1-201}$ | $L_{2-7}$ |
| Compound 4532 | $L_{1-201}$ | $L_{2-8}$ |
| Compound 4533 | $L_{1-201}$ | $L_{2-9}$ |
| Compound 4534 | $L_{1-201}$ | $L_{2-10}$ |
| Compound 4535 | $L_{1-201}$ | $L_{2-11}$ |
| Compound 4536 | $L_{1-201}$ | $L_{2-12}$ |
| Compound 4537 | $L_{1-201}$ | $L_{2-13}$ |
| Compound 4538 | $L_{1-201}$ | $L_{2-14}$ |
| Compound 4539 | $L_{1-201}$ | $L_{2-15}$ |
| Compound 4540 | $L_{1-201}$ | $L_{2-16}$ |
| Compound 4541 | $L_{1-201}$ | $L_{2-17}$ |
| Compound 4542 | $L_{1-201}$ | $L_{2-18}$ |
| Compound 4543 | $L_{1-201}$ | $L_{2-19}$ |
| Compound 4544 | $L_{1-201}$ | $L_{2-20}$ |
| Compound 4545 | $L_{1-201}$ | $L_{2-21}$ |
| Compound 4546 | $L_{1-201}$ | $L_{2-22}$ |
| Compound 4547 | $L_{1-201}$ | $L_{2-23}$ |
| Compound 4548 | $L_{1-201}$ | $L_{2-24}$ |
| Compound 4549 | $L_{1-201}$ | $L_{2-25}$ |

TABLE 1-continued

| | | |
|---|---|---|
| Compound 4550 | $L_{1-201}$ | $L_{2-26}$ |
| Compound 4551 | $L_{1-201}$ | $L_{2-27}$ |
| Compound 4552 | $L_{1-201}$ | $L_{2-28}$ |
| Compound 4553 | $L_{1-201}$ | $L_{2-29}$ |
| Compound 4554 | $L_{1-201}$ | $L_{2-30}$ |
| Compound 4555 | $L_{1-201}$ | $L_{2-31}$ |
| Compound 4556 | $L_{1-201}$ | $L_{2-32}$ |
| Compound 4557 | $L_{1-201}$ | $L_{2-33}$ |
| Compound 4558 | $L_{1-201}$ | $L_{2-34}$ |
| Compound 4559 | $L_{1-201}$ | $L_{2-35}$ |
| Compound 4560 | $L_{1-201}$ | $L_{2-36}$ |
| Compound 4561 | $L_{1-201}$ | $L_{2-37}$ |
| Compound 4562 | $L_{1-201}$ | $L_{2-38}$ |
| Compound 4563 | $L_{1-201}$ | $L_{2-39}$ |
| Compound 4564 | $L_{1-201}$ | $L_{2-40}$ |
| Compound 4565 | $L_{1-201}$ | $L_{2-41}$ |
| Compound 4566 | $L_{1-201}$ | $L_{2-42}$ |
| Compound 4567 | $L_{1-201}$ | $L_{2-43}$ |
| Compound 4568 | $L_{1-201}$ | $L_{2-44}$ |
| Compound 4569 | $L_{1-201}$ | $L_{2-45}$ |
| Compound 4570 | $L_{1-201}$ | $L_{2-46}$ |
| Compound 4571 | $L_{1-201}$ | $L_{2-47}$ |
| Compound 4572 | $L_{1-201}$ | $L_{2-48}$ |
| Compound 4573 | $L_{1-201}$ | $L_{2-49}$ |
| Compound 4574 | $L_{1-201}$ | $L_{2-50}$ |
| Compound 4575 | $L_{1-201}$ | $L_{2-51}$ |
| Compound 4576 | $L_{1-201}$ | $L_{2-52}$ |
| Compound 4577 | $L_{1-201}$ | $L_{2-53}$ |
| Compound 4578 | $L_{1-201}$ | $L_{2-54}$ |
| Compound 4579 | $L_{1-201}$ | $L_{2-55}$ |
| Compound 4580 | $L_{1-201}$ | $L_{2-56}$ |
| Compound 4581 | $L_{1-201}$ | $L_{2-57}$ |
| Compound 4582 | $L_{1-201}$ | $L_{2-58}$ |
| Compound 4583 | $L_{1-201}$ | $L_{2-59}$ |
| Compound 4584 | $L_{1-201}$ | $L_{2-60}$ |
| Compound 4585 | $L_{1-201}$ | $L_{2-61}$ |
| Compound 4586 | $L_{1-201}$ | $L_{2-62}$ |
| Compound 4587 | $L_{1-201}$ | $L_{2-63}$ |
| Compound 4588 | $L_{1-201}$ | $L_{2-64}$ |
| Compound 4589 | $L_{1-201}$ | $L_{2-65}$ |
| Compound 4590 | $L_{1-201}$ | $L_{2-66}$ |
| Compound 4591 | $L_{1-201}$ | $L_{2-67}$ |
| Compound 4592 | $L_{1-201}$ | $L_{2-68}$ |
| Compound 4593 | $L_{1-201}$ | $L_{2-69}$ |
| Compound 4594 | $L_{1-201}$ | $L_{2-70}$ |
| Compound 4595 | $L_{1-201}$ | $L_{2-71}$ |
| Compound 4596 | $L_{1-201}$ | $L_{2-72}$ |
| Compound 4597 | $L_{1-201}$ | $L_{2-73}$ |
| Compound 4598 | $L_{1-201}$ | $L_{2-74}$ |
| Compound 4599 | $L_{1-201}$ | $L_{2-75}$ |
| Compound 4600 | $L_{1-201}$ | $L_{2-76}$ |
| Compound 4601 | $L_{1-201}$ | $L_{2-77}$ |
| Compound 4602 | $L_{1-201}$ | $L_{2-78}$ |
| Compound 4603 | $L_{1-201}$ | $L_{2-79}$ |
| Compound 4604 | $L_{1-201}$ | $L_{2-80}$ |
| Compound 4605 | $L_{1-201}$ | $L_{2-81}$ |
| Compound 4606 | $L_{1-201}$ | $L_{2-82}$ |
| Compound 4607 | $L_{1-201}$ | $L_{2-83}$ |
| Compound 4608 | $L_{1-201}$ | $L_{2-84}$ |
| Compound 4609 | $L_{1-201}$ | $L_{2-85}$ |
| Compound 4610 | $L_{1-201}$ | $L_{2-86}$ |
| Compound 4611 | $L_{1-201}$ | $L_{2-87}$ |
| Compound 4612 | $L_{1-201}$ | $L_{2-88}$ |
| Compound 4613 | $L_{1-201}$ | $L_{2-89}$ |
| Compound 4614 | $L_{1-201}$ | $L_{2-90}$ |
| Compound 4615 | $L_{1-201}$ | $L_{2-91}$ |
| Compound 4616 | $L_{1-201}$ | $L_{2-92}$ |
| Compound 4617 | $L_{1-201}$ | $L_{2-93}$ |
| Compound 4618 | $L_{1-201}$ | $L_{2-94}$ |
| Compound 4619 | $L_{1-201}$ | $L_{2-95}$ |
| Compound 4620 | $L_{1-201}$ | $L_{2-96}$ |
| Compound 4621 | $L_{1-201}$ | $L_{2-97}$ |
| Compound 4622 | $L_{1-201}$ | $L_{2-98}$ |
| Compound 4623 | $L_{1-201}$ | $L_{2-99}$ |
| Compound 4624 | $L_{1-201}$ | $L_{2-100}$ |
| Compound 4625 | $L_{1-201}$ | $L_{2-101}$ |
| Compound 4626 | $L_{1-201}$ | $L_{2-102}$ |
| Compound 4627 | $L_{1-201}$ | $L_{2-103}$ |
| Compound 4628 | $L_{1-201}$ | $L_{2-104}$ |
| Compound 4629 | $L_{1-201}$ | $L_{2-105}$ |

TABLE 1-continued

| | | |
|---|---|---|
| Compound 4630 | $L_{1-201}$ | $L_{2-106}$ |
| Compound 4631 | $L_{1-201}$ | $L_{2-107}$ |
| Compound 4632 | $L_{1-201}$ | $L_{2-108}$ |
| Compound 4633 | $L_{1-201}$ | $L_{2-109}$ |
| Compound 4634 | $L_{1-201}$ | $L_{2-110}$ |
| Compound 4635 | $L_{1-201}$ | $L_{2-111}$ |
| Compound 4636 | $L_{1-201}$ | $L_{2-112}$ |
| Compound 4637 | $L_{1-201}$ | $L_{2-113}$ |
| Compound 4638 | $L_{1-201}$ | $L_{2-114}$ |
| Compound 4639 | $L_{1-201}$ | $L_{2-115}$ |
| Compound 4640 | $L_{1-201}$ | $L_{2-116}$ |
| Compound 4641 | $L_{1-201}$ | $L_{2-117}$ |
| Compound 4642 | $L_{1-201}$ | $L_{2-118}$ |
| Compound 4643 | $L_{1-201}$ | $L_{2-119}$ |
| Compound 4644 | $L_{1-201}$ | $L_{2-120}$ |
| Compound 4645 | $L_{1-201}$ | $L_{2-121}$ |
| Compound 4646 | $L_{1-201}$ | $L_{2-122}$ |
| Compound 4647 | $L_{1-201}$ | $L_{2-123}$ |
| Compound 4648 | $L_{1-201}$ | $L_{2-124}$ |
| Compound 4649 | $L_{1-201}$ | $L_{2-125}$ |
| Compound 4650 | $L_{1-201}$ | $L_{2-126}$ |
| Compound 4651 | $L_{1-201}$ | $L_{2-127}$ |
| Compound 4652 | $L_{1-201}$ | $L_{2-128}$ |
| Compound 4653 | $L_{1-201}$ | $L_{2-129}$ |
| Compound 4654 | $L_{1-201}$ | $L_{2-130}$ |
| Compound 4655 | $L_{1-201}$ | $L_{2-131}$ |
| Compound 4656 | $L_{1-201}$ | $L_{2-132}$ |
| Compound 4657 | $L_{1-201}$ | $L_{2-133}$ |
| Compound 4658 | $L_{1-201}$ | $L_{2-134}$ |
| Compound 4659 | $L_{1-201}$ | $L_{2-135}$ |
| Compound 4660 | $L_{1-201}$ | $L_{2-136}$ |
| Compound 4661 | $L_{1-201}$ | $L_{2-137}$ |
| Compound 4662 | $L_{1-201}$ | $L_{2-138}$ |
| Compound 4663 | $L_{1-201}$ | $L_{2-139}$ |
| Compound 4664 | $L_{1-201}$ | $L_{2-140}$ |
| Compound 4665 | $L_{1-201}$ | $L_{2-141}$ |
| Compound 4666 | $L_{1-201}$ | $L_{2-142}$ |
| Compound 4667 | $L_{1-201}$ | $L_{2-143}$ |
| Compound 4668 | $L_{1-201}$ | $L_{2-144}$ |
| Compound 4669 | $L_{1-201}$ | $L_{2-145}$ |
| Compound 4670 | $L_{1-201}$ | $L_{2-146}$ |
| Compound 4671 | $L_{1-201}$ | $L_{2-147}$ |
| Compound 4672 | $L_{1-201}$ | $L_{2-148}$ |
| Compound 4673 | $L_{1-201}$ | $L_{2-149}$ |
| Compound 4674 | $L_{1-201}$ | $L_{2-150}$ |
| Compound 4675 | $L_{1-201}$ | $L_{2-151}$ |
| Compound 4676 | $L_{1-201}$ | $L_{2-152}$ |
| Compound 4677 | $L_{1-201}$ | $L_{2-153}$ |
| Compound 4678 | $L_{1-201}$ | $L_{2-154}$ |
| Compound 4679 | $L_{1-201}$ | $L_{2-155}$ |
| Compound 4680 | $L_{1-201}$ | $L_{2-156}$ |
| Compound 4681 | $L_{1-201}$ | $L_{2-157}$ |
| Compound 4682 | $L_{1-201}$ | $L_{2-158}$ |
| Compound 4683 | $L_{1-201}$ | $L_{2-159}$ |
| Compound 4684 | $L_{1-201}$ | $L_{2-160}$ |
| Compound 4685 | $L_{1-201}$ | $L_{2-161}$ |
| Compound 4686 | $L_{1-201}$ | $L_{2-162}$ |
| Compound 4687 | $L_{1-201}$ | $L_{2-163}$ |
| Compound 4688 | $L_{1-201}$ | $L_{2-164}$ |
| Compound 4689 | $L_{1-201}$ | $L_{2-165}$ |
| Compound 4690 | $L_{1-201}$ | $L_{2-166}$ |
| Compound 4691 | $L_{1-201}$ | $L_{2-167}$ |
| Compound 4692 | $L_{1-201}$ | $L_{2-168}$ |
| Compound 4693 | $L_{1-201}$ | $L_{2-169}$ |
| Compound 4694 | $L_{1-201}$ | $L_{2-170}$ |
| Compound 4695 | $L_{1-201}$ | $L_{2-171}$ |
| Compound 4696 | $L_{1-201}$ | $L_{2-172}$ |
| Compound 4697 | $L_{1-201}$ | $L_{2-173}$ |
| Compound 4698 | $L_{1-201}$ | $L_{2-174}$ |
| Compound 4699 | $L_{1-201}$ | $L_{2-175}$ |
| Compound 4700 | $L_{1-201}$ | $L_{2-176}$ |
| Compound 4701 | $L_{1-201}$ | $L_{2-177}$ |
| Compound 4702 | $L_{1-201}$ | $L_{2-178}$ |
| Compound 4703 | $L_{1-201}$ | $L_{2-179}$ |
| Compound 4704 | $L_{1-201}$ | $L_{2-180}$ |
| Compound 4705 | $L_{1-201}$ | $L_{2-181}$ |
| Compound 4706 | $L_{1-201}$ | $L_{2-182}$ |
| Compound 4707 | $L_{1-201}$ | $L_{2-183}$ |
| Compound 4708 | $L_{1-201}$ | $L_{2-184}$ |
| Compound 4709 | $L_{1-201}$ | $L_{2-185}$ |

TABLE 1-continued

| | | |
|---|---|---|
| Compound 4710 | $L_{1-201}$ | $L_{2-186}$ |
| Compound 4711 | $L_{1-201}$ | $L_{2-187}$ |
| Compound 4712 | $L_{1-201}$ | $L_{2-188}$ |
| Compound 4713 | $L_{1-201}$ | $L_{2-189}$ |
| Compound 4714 | $L_{1-201}$ | $L_{2-190}$ |
| Compound 4715 | $L_{1-201}$ | $L_{2-191}$ |
| Compound 4716 | $L_{1-201}$ | $L_{2-192}$ |
| Compound 4717 | $L_{1-201}$ | $L_{2-193}$ |
| Compound 4718 | $L_{1-201}$ | $L_{2-194}$ |
| Compound 4719 | $L_{1-201}$ | $L_{2-195}$ |
| Compound 4720 | $L_{1-201}$ | $L_{2-196}$ |
| Compound 4721 | $L_{1-201}$ | $L_{2-197}$ |
| Compound 4722 | $L_{1-201}$ | $L_{2-198}$ |
| Compound 4723 | $L_{1-201}$ | $L_{2-199}$ |
| Compound 4724 | $L_{1-201}$ | $L_{2-200}$ |
| Compound 4725 | $L_{1-201}$ | $L_{2-201}$ |
| Compound 4726 | $L_{1-201}$ | $L_{2-202}$ |
| Compound 4727 | $L_{1-201}$ | $L_{2-203}$ |
| Compound 4728 | $L_{1-201}$ | $L_{2-204}$ |
| Compound 4729 | $L_{1-201}$ | $L_{2-205}$ |
| Compound 4730 | $L_{1-201}$ | $L_{2-206}$ |
| Compound 4731 | $L_{1-201}$ | $L_{2-207}$ |
| Compound 4732 | $L_{1-201}$ | $L_{2-208}$ |
| Compound 4733 | $L_{1-201}$ | $L_{2-209}$ |
| Compound 4734 | $L_{1-201}$ | $L_{2-210}$ |
| Compound 4735 | $L_{1-201}$ | $L_{2-211}$ |
| Compound 4736 | $L_{1-201}$ | $L_{2-212}$ |
| Compound 4737 | $L_{1-201}$ | $L_{2-213}$ |
| Compound 4738 | $L_{1-201}$ | $L_{2-214}$ |
| Compound 4739 | $L_{1-201}$ | $L_{2-215}$ |
| Compound 4740 | $L_{1-201}$ | $L_{2-216}$ |
| Compound 4741 | $L_{1-201}$ | $L_{2-217}$ |
| Compound 4742 | $L_{1-201}$ | $L_{2-218}$ |
| Compound 4743 | $L_{1-201}$ | $L_{2-219}$ |
| Compound 4744 | $L_{1-201}$ | $L_{2-220}$ |
| Compound 4745 | $L_{1-201}$ | $L_{2-221}$ |
| Compound 4746 | $L_{1-201}$ | $L_{2-222}$ |
| Compound 4747 | $L_{1-201}$ | $L_{2-223}$ |
| Compound 4748 | $L_{1-201}$ | $L_{2-224}$ |
| Compound 4749 | $L_{1-201}$ | $L_{2-225}$ |
| Compound 4750 | $L_{1-201}$ | $L_{2-226}$ |
| Compound 4751 | $L_{1-201}$ | $L_{2-227}$ |
| Compound 4752 | $L_{1-201}$ | $L_{2-228}$ |
| Compound 4753 | $L_{1-201}$ | $L_{2-229}$ |
| Compound 4754 | $L_{1-201}$ | $L_{2-230}$ |
| Compound 4755 | $L_{1-201}$ | $L_{2-231}$ |
| Compound 4756 | $L_{1-201}$ | $L_{2-232}$ |
| Compound 4757 | $L_{1-201}$ | $L_{2-233}$ |
| Compound 4758 | $L_{1-201}$ | $L_{2-234}$ |
| Compound 4759 | $L_{1-201}$ | $L_{2-235}$ |
| Compound 4760 | $L_{1-201}$ | $L_{2-236}$ |
| Compound 4761 | $L_{1-201}$ | $L_{2-237}$ |
| Compound 4762 | $L_{1-201}$ | $L_{2-238}$ |
| Compound 4763 | $L_{1-201}$ | $L_{2-239}$ |
| Compound 4764 | $L_{1-201}$ | $L_{2-240}$ |
| Compound 4765 | $L_{1-201}$ | $L_{2-241}$ |
| Compound 4766 | $L_{1-201}$ | $L_{2-242}$ |
| Compound 4767 | $L_{1-201}$ | $L_{2-243}$ |
| Compound 4768 | $L_{1-201}$ | $L_{2-244}$ |
| Compound 4769 | $L_{1-201}$ | $L_{2-245}$ |
| Compound 4770 | $L_{1-201}$ | $L_{2-246}$ |
| Compound 4771 | $L_{1-201}$ | $L_{2-247}$ |
| Compound 4772 | $L_{1-201}$ | $L_{2-248}$ |
| Compound 4773 | $L_{1-201}$ | $L_{2-249}$ |
| Compound 4774 | $L_{1-201}$ | $L_{2-250}$ |
| Compound 4775 | $L_{1-201}$ | $L_{2-251}$ |
| Compound 4776 | $L_{1-201}$ | $L_{2-252}$ |
| Compound 4777 | $L_{1-201}$ | $L_{2-253}$ |
| Compound 4778 | $L_{1-201}$ | $L_{2-254}$ |
| Compound 4779 | $L_{1-201}$ | $L_{2-255}$ |
| Compound 4780 | $L_{1-201}$ | $L_{2-256}$ |
| Compound 4781 | $L_{1-201}$ | $L_{2-257}$ |
| Compound 4782 | $L_{1-201}$ | $L_{2-258}$ |
| Compound 4783 | $L_{1-201}$ | $L_{2-259}$ |
| Compound 4784 | $L_{1-201}$ | $L_{2-260}$ |
| Compound 4785 | $L_{1-201}$ | $L_{2-261}$ |
| Compound 4786 | $L_{1-201}$ | $L_{2-262}$ |
| Compound 4787 | $L_{1-201}$ | $L_{2-263}$ |
| Compound 4788 | $L_{1-201}$ | $L_{2-264}$ |
| Compound 4789 | $L_{1-201}$ | $L_{2-265}$ |

TABLE 1-continued

| | | |
|---|---|---|
| Compound 4790 | $L_{1-201}$ | $L_{2-266}$ |
| Compound 4791 | $L_{1-201}$ | $L_{2-267}$ |
| Compound 4792 | $L_{1-201}$ | $L_{2-268}$ |
| Compound 4793 | $L_{1-201}$ | $L_{2-269}$ |
| Compound 4794 | $L_{1-201}$ | $L_{2-270}$ |
| Compound 4795 | $L_{1-201}$ | $L_{2-271}$ |
| Compound 4796 | $L_{1-201}$ | $L_{2-272}$ |
| Compound 4797 | $L_{1-201}$ | $L_{2-273}$ |
| Compound 4798 | $L_{1-201}$ | $L_{2-274}$ |
| Compound 4799 | $L_{1-201}$ | $L_{2-275}$ |
| Compound 4800 | $L_{1-201}$ | $L_{2-276}$ |
| Compound 4801 | $L_{1-201}$ | $L_{2-277}$ |
| Compound 4802 | $L_{1-201}$ | $L_{2-278}$ |
| Compound 4803 | $L_{1-201}$ | $L_{2-279}$ |
| Compound 4804 | $L_{1-201}$ | $L_{2-280}$ |
| Compound 4805 | $L_{1-201}$ | $L_{2-281}$ |
| Compound 4806 | $L_{1-201}$ | $L_{2-282}$ |
| Compound 4807 | $L_{1-201}$ | $L_{2-283}$ |
| Compound 4808 | $L_{1-201}$ | $L_{2-284}$ |
| Compound 4809 | $L_{1-201}$ | $L_{2-285}$ |
| Compound 4810 | $L_{1-201}$ | $L_{2-286}$ |
| Compound 4811 | $L_{1-201}$ | $L_{2-287}$ |
| Compound 4812 | $L_{1-201}$ | $L_{2-288}$ |
| Compound 4813 | $L_{1-201}$ | $L_{2-289}$ |
| Compound 4814 | $L_{1-201}$ | $L_{2-290}$ |
| Compound 4815 | $L_{1-201}$ | $L_{2-291}$ |
| Compound 4816 | $L_{1-201}$ | $L_{2-292}$ |
| Compound 4817 | $L_{1-201}$ | $L_{2-293}$ |
| Compound 4818 | $L_{1-201}$ | $L_{2-294}$ |
| Compound 4819 | $L_{1-201}$ | $L_{2-295}$ |
| Compound 4820 | $L_{1-201}$ | $L_{2-296}$ |
| Compound 4821 | $L_{1-201}$ | $L_{2-297}$ |
| Compound 4822 | $L_{1-201}$ | $L_{2-298}$ |
| Compound 4823 | $L_{1-201}$ | $L_{2-299}$ |
| Compound 4824 | $L_{1-201}$ | $L_{2-300}$ |
| Compound 4825 | $L_{1-201}$ | $L_{2-301}$ |
| Compound 4826 | $L_{1-201}$ | $L_{2-302}$ |
| Compound 4827 | $L_{1-201}$ | $L_{2-303}$ |
| Compound 4828 | $L_{1-201}$ | $L_{2-304}$ |
| Compound 4829 | $L_{1-201}$ | $L_{2-305}$ |
| Compound 4830 | $L_{1-201}$ | $L_{2-306}$ |
| Compound 4831 | $L_{1-201}$ | $L_{2-307}$ |
| Compound 4832 | $L_{1-201}$ | $L_{2-308}$ |
| Compound 4833 | $L_{1-201}$ | $L_{2-309}$ |
| Compound 4834 | $L_{1-201}$ | $L_{2-310}$ |
| Compound 4835 | $L_{1-201}$ | $L_{2-311}$ |
| Compound 4836 | $L_{1-201}$ | $L_{2-312}$ |
| Compound 4837 | $L_{1-201}$ | $L_{2-313}$ |
| Compound 4838 | $L_{1-201}$ | $L_{2-314}$ |
| Compound 4839 | $L_{1-201}$ | $L_{2-315}$ |
| Compound 4840 | $L_{1-201}$ | $L_{2-316}$ |
| Compound 4841 | $L_{1-201}$ | $L_{2-317}$ |
| Compound 4842 | $L_{1-201}$ | $L_{2-318}$ |
| Compound 4843 | $L_{1-201}$ | $L_{2-319}$ |
| Compound 4844 | $L_{1-201}$ | $L_{2-320}$ |
| Compound 4845 | $L_{1-201}$ | $L_{2-321}$ |
| Compound 4846 | $L_{1-201}$ | $L_{2-322}$ |
| Compound 4847 | $L_{1-201}$ | $L_{2-323}$ |
| Compound 4848 | $L_{1-201}$ | $L_{2-324}$ |
| Compound 4849 | $L_{1-201}$ | $L_{2-325}$ |
| Compound 4850 | $L_{1-201}$ | $L_{2-326}$ |
| Compound 4851 | $L_{1-201}$ | $L_{2-327}$ |
| Compound 4852 | $L_{1-201}$ | $L_{2-328}$ |
| Compound 4853 | $L_{1-201}$ | $L_{2-329}$ |
| Compound 4854 | $L_{1-201}$ | $L_{2-330}$ |
| Compound 4855 | $L_{1-201}$ | $L_{2-331}$ |
| Compound 4856 | $L_{1-201}$ | $L_{2-332}$ |
| Compound 4857 | $L_{1-201}$ | $L_{2-333}$ |
| Compound 4858 | $L_{1-201}$ | $L_{2-334}$ |
| Compound 4859 | $L_{1-201}$ | $L_{2-335}$ |
| Compound 4860 | $L_{1-201}$ | $L_{2-336}$ |
| Compound 4861 | $L_{1-201}$ | $L_{2-337}$ |
| Compound 4862 | $L_{1-201}$ | $L_{2-338}$ |
| Compound 4863 | $L_{1-201}$ | $L_{2-339}$ |
| Compound 4864 | $L_{1-201}$ | $L_{2-340}$ |
| Compound 4865 | $L_{1-201}$ | $L_{2-341}$ |
| Compound 4866 | $L_{1-201}$ | $L_{2-342}$ |
| Compound 4867 | $L_{1-201}$ | $L_{2-343}$ |
| Compound 4868 | $L_{1-201}$ | $L_{2-344}$ |
| Compound 4869 | $L_{1-201}$ | $L_{2-345}$ |

TABLE 1-continued

| | | |
|---|---|---|
| Compound 4870 | $L_{1-201}$ | $L_{2-346}$ |
| Compound 4871 | $L_{1-201}$ | $L_{2-347}$ |
| Compound 4872 | $L_{1-201}$ | $L_{2-348}$ |
| Compound 4873 | $L_{1-201}$ | $L_{2-349}$ |
| Compound 4874 | $L_{1-201}$ | $L_{2-350}$ |
| Compound 4875 | $L_{1-201}$ | $L_{2-351}$ |
| Compound 4876 | $L_{1-201}$ | $L_{2-352}$ |
| Compound 4877 | $L_{1-201}$ | $L_{2-353}$ |
| Compound 4878 | $L_{1-201}$ | $L_{2-354}$ |
| Compound 4879 | $L_{1-201}$ | $L_{2-355}$ |
| Compound 4880 | $L_{1-201}$ | $L_{2-356}$ |
| Compound 4881 | $L_{1-201}$ | $L_{2-357}$ |
| Compound 4882 | $L_{1-201}$ | $L_{2-358}$ |
| Compound 4883 | $L_{1-201}$ | $L_{2-359}$ |
| Compound 4884 | $L_{1-201}$ | $L_{2-360}$ |
| Compound 4885 | $L_{1-201}$ | $L_{2-361}$ |
| Compound 4886 | $L_{1-201}$ | $L_{2-362}$ |
| Compound 4887 | $L_{1-201}$ | $L_{2-363}$ |
| Compound 4888 | $L_{1-201}$ | $L_{2-364}$ |
| Compound 4889 | $L_{1-201}$ | $L_{2-365}$ |
| Compound 4890 | $L_{1-201}$ | $L_{2-366}$ |
| Compound 4891 | $L_{1-201}$ | $L_{2-367}$ |
| Compound 4892 | $L_{1-201}$ | $L_{2-368}$ |
| Compound 4893 | $L_{1-201}$ | $L_{2-369}$ |
| Compound 4894 | $L_{1-201}$ | $L_{2-370}$ |
| Compound 4895 | $L_{1-201}$ | $L_{2-371}$ |
| Compound 4896 | $L_{1-201}$ | $L_{2-372}$ |
| Compound 4897 | $L_{1-201}$ | $L_{2-373}$ |
| Compound 4898 | $L_{1-201}$ | $L_{2-374}$ |
| Compound 4899 | $L_{1-201}$ | $L_{2-375}$ |
| Compound 4900 | $L_{1-201}$ | $L_{2-376}$ |
| Compound 4901 | $L_{1-202}$ | $L_{2-377}$ |
| Compound 4902 | $L_{1-202}$ | $L_{2-1}$ |
| Compound 4903 | $L_{1-202}$ | $L_{2-2}$ |
| Compound 4904 | $L_{1-202}$ | $L_{2-3}$ |
| Compound 4905 | $L_{1-202}$ | $L_{2-4}$ |
| Compound 4906 | $L_{1-202}$ | $L_{2-5}$ |
| Compound 4907 | $L_{1-202}$ | $L_{2-6}$ |
| Compound 4908 | $L_{1-202}$ | $L_{2-7}$ |
| Compound 4909 | $L_{1-202}$ | $L_{2-8}$ |
| Compound 4910 | $L_{1-202}$ | $L_{2-9}$ |
| Compound 4911 | $L_{1-202}$ | $L_{2-10}$ |
| Compound 4912 | $L_{1-202}$ | $L_{2-11}$ |
| Compound 4913 | $L_{1-202}$ | $L_{2-12}$ |
| Compound 4914 | $L_{1-202}$ | $L_{2-13}$ |
| Compound 4915 | $L_{1-202}$ | $L_{2-14}$ |
| Compound 4916 | $L_{1-202}$ | $L_{2-15}$ |
| Compound 4917 | $L_{1-202}$ | $L_{2-16}$ |
| Compound 4918 | $L_{1-202}$ | $L_{2-17}$ |
| Compound 4919 | $L_{1-202}$ | $L_{2-18}$ |
| Compound 4920 | $L_{1-202}$ | $L_{2-19}$ |
| Compound 4921 | $L_{1-202}$ | $L_{2-20}$ |
| Compound 4922 | $L_{1-202}$ | $L_{2-21}$ |
| Compound 4923 | $L_{1-202}$ | $L_{2-22}$ |
| Compound 4924 | $L_{1-202}$ | $L_{2-23}$ |
| Compound 4925 | $L_{1-202}$ | $L_{2-24}$ |
| Compound 4926 | $L_{1-202}$ | $L_{2-25}$ |
| Compound 4927 | $L_{1-202}$ | $L_{2-26}$ |
| Compound 4928 | $L_{1-202}$ | $L_{2-27}$ |
| Compound 4929 | $L_{1-202}$ | $L_{2-28}$ |
| Compound 4930 | $L_{1-202}$ | $L_{2-29}$ |
| Compound 4931 | $L_{1-202}$ | $L_{2-30}$ |
| Compound 4932 | $L_{1-202}$ | $L_{2-31}$ |
| Compound 4933 | $L_{1-202}$ | $L_{2-32}$ |
| Compound 4934 | $L_{1-202}$ | $L_{2-33}$ |
| Compound 4935 | $L_{1-202}$ | $L_{2-34}$ |
| Compound 4936 | $L_{1-202}$ | $L_{2-35}$ |
| Compound 4937 | $L_{1-202}$ | $L_{2-36}$ |
| Compound 4938 | $L_{1-202}$ | $L_{2-37}$ |
| Compound 4939 | $L_{1-202}$ | $L_{2-38}$ |
| Compound 4940 | $L_{1-202}$ | $L_{2-39}$ |
| Compound 4941 | $L_{1-202}$ | $L_{2-40}$ |
| Compound 4942 | $L_{1-202}$ | $L_{2-41}$ |
| Compound 4943 | $L_{1-202}$ | $L_{2-42}$ |
| Compound 4944 | $L_{1-202}$ | $L_{2-43}$ |
| Compound 4945 | $L_{1-202}$ | $L_{2-44}$ |
| Compound 4946 | $L_{1-202}$ | $L_{2-45}$ |
| Compound 4947 | $L_{1-202}$ | $L_{2-46}$ |
| Compound 4948 | $L_{1-202}$ | $L_{2-47}$ |
| Compound 4949 | $L_{1-202}$ | $L_{2-48}$ |
| Compound 4950 | $L_{1-202}$ | $L_{2-49}$ |
| Compound 4951 | $L_{1-202}$ | $L_{2-50}$ |
| Compound 4952 | $L_{1-202}$ | $L_{2-51}$ |
| Compound 4953 | $L_{1-202}$ | $L_{2-52}$ |
| Compound 4954 | $L_{1-202}$ | $L_{2-53}$ |
| Compound 4955 | $L_{1-202}$ | $L_{2-54}$ |
| Compound 4956 | $L_{1-202}$ | $L_{2-55}$ |
| Compound 4957 | $L_{1-202}$ | $L_{2-56}$ |
| Compound 4958 | $L_{1-202}$ | $L_{2-57}$ |
| Compound 4959 | $L_{1-202}$ | $L_{2-58}$ |
| Compound 4960 | $L_{1-202}$ | $L_{2-59}$ |
| Compound 4961 | $L_{1-202}$ | $L_{2-60}$ |
| Compound 4962 | $L_{1-202}$ | $L_{2-61}$ |
| Compound 4963 | $L_{1-202}$ | $L_{2-62}$ |
| Compound 4964 | $L_{1-202}$ | $L_{2-63}$ |
| Compound 4965 | $L_{1-202}$ | $L_{2-64}$ |
| Compound 4966 | $L_{1-202}$ | $L_{2-65}$ |
| Compound 4967 | $L_{1-202}$ | $L_{2-66}$ |
| Compound 4968 | $L_{1-202}$ | $L_{2-67}$ |
| Compound 4969 | $L_{1-202}$ | $L_{2-68}$ |
| Compound 4970 | $L_{1-202}$ | $L_{2-69}$ |
| Compound 4971 | $L_{1-202}$ | $L_{2-70}$ |
| Compound 4972 | $L_{1-202}$ | $L_{2-71}$ |
| Compound 4973 | $L_{1-202}$ | $L_{2-72}$ |
| Compound 4974 | $L_{1-202}$ | $L_{2-73}$ |
| Compound 4975 | $L_{1-202}$ | $L_{2-74}$ |
| Compound 4976 | $L_{1-202}$ | $L_{2-75}$ |
| Compound 4977 | $L_{1-202}$ | $L_{2-76}$ |
| Compound 4978 | $L_{1-202}$ | $L_{2-77}$ |
| Compound 4979 | $L_{1-202}$ | $L_{2-78}$ |
| Compound 4980 | $L_{1-202}$ | $L_{2-79}$ |
| Compound 4981 | $L_{1-202}$ | $L_{2-80}$ |
| Compound 4982 | $L_{1-202}$ | $L_{2-81}$ |
| Compound 4983 | $L_{1-202}$ | $L_{2-82}$ |
| Compound 4984 | $L_{1-202}$ | $L_{2-83}$ |
| Compound 4985 | $L_{1-202}$ | $L_{2-84}$ |
| Compound 4986 | $L_{1-202}$ | $L_{2-85}$ |
| Compound 4987 | $L_{1-202}$ | $L_{2-86}$ |
| Compound 4988 | $L_{1-202}$ | $L_{2-87}$ |
| Compound 4989 | $L_{1-202}$ | $L_{2-88}$ |
| Compound 4990 | $L_{1-202}$ | $L_{2-89}$ |
| Compound 4991 | $L_{1-202}$ | $L_{2-90}$ |
| Compound 4992 | $L_{1-202}$ | $L_{2-91}$ |
| Compound 4993 | $L_{1-202}$ | $L_{2-92}$ |
| Compound 4994 | $L_{1-202}$ | $L_{2-93}$ |
| Compound 4995 | $L_{1-202}$ | $L_{2-94}$ |
| Compound 4996 | $L_{1-202}$ | $L_{2-95}$ |
| Compound 4997 | $L_{1-202}$ | $L_{2-96}$ |
| Compound 4998 | $L_{1-202}$ | $L_{2-97}$ |
| Compound 4999 | $L_{1-202}$ | $L_{2-98}$ |
| Compound 5000 | $L_{1-202}$ | $L_{2-99}$ |
| Compound 5001 | $L_{1-202}$ | $L_{2-100}$ |
| Compound 5002 | $L_{1-202}$ | $L_{2-101}$ |
| Compound 5003 | $L_{1-202}$ | $L_{2-102}$ |
| Compound 5004 | $L_{1-202}$ | $L_{2-103}$ |
| Compound 5005 | $L_{1-202}$ | $L_{2-104}$ |
| Compound 5006 | $L_{1-202}$ | $L_{2-105}$ |
| Compound 5007 | $L_{1-202}$ | $L_{2-106}$ |
| Compound 5008 | $L_{1-202}$ | $L_{2-107}$ |
| Compound 5009 | $L_{1-202}$ | $L_{2-108}$ |
| Compound 5010 | $L_{1-202}$ | $L_{2-109}$ |
| Compound 5011 | $L_{1-202}$ | $L_{2-110}$ |
| Compound 5012 | $L_{1-202}$ | $L_{2-111}$ |
| Compound 5013 | $L_{1-202}$ | $L_{2-112}$ |
| Compound 5014 | $L_{1-202}$ | $L_{2-113}$ |
| Compound 5015 | $L_{1-202}$ | $L_{2-114}$ |
| Compound 5016 | $L_{1-202}$ | $L_{2-115}$ |
| Compound 5017 | $L_{1-202}$ | $L_{2-116}$ |
| Compound 5018 | $L_{1-202}$ | $L_{2-117}$ |
| Compound 5019 | $L_{1-202}$ | $L_{2-118}$ |
| Compound 5020 | $L_{1-202}$ | $L_{2-119}$ |
| Compound 5021 | $L_{1-202}$ | $L_{2-120}$ |
| Compound 5022 | $L_{1-202}$ | $L_{2-121}$ |
| Compound 5023 | $L_{1-202}$ | $L_{2-122}$ |
| Compound 5024 | $L_{1-202}$ | $L_{2-123}$ |
| Compound 5025 | $L_{1-202}$ | $L_{2-124}$ |
| Compound 5026 | $L_{1-202}$ | $L_{2-125}$ |
| Compound 5027 | $L_{1-202}$ | $L_{2-126}$ |
| Compound 5028 | $L_{1-202}$ | $L_{2-127}$ |
| Compound 5029 | $L_{1-202}$ | $L_{2-128}$ |

TABLE 1-continued

| | | |
|---|---|---|
| Compound 5030 | $L_{1-202}$ | $L_{2-129}$ |
| Compound 5031 | $L_{1-202}$ | $L_{2-130}$ |
| Compound 5032 | $L_{1-202}$ | $L_{2-131}$ |
| Compound 5033 | $L_{1-202}$ | $L_{2-132}$ |
| Compound 5034 | $L_{1-202}$ | $L_{2-133}$ |
| Compound 5035 | $L_{1-202}$ | $L_{2-134}$ |
| Compound 5036 | $L_{1-202}$ | $L_{2-135}$ |
| Compound 5037 | $L_{1-202}$ | $L_{2-136}$ |
| Compound 5038 | $L_{1-202}$ | $L_{2-137}$ |
| Compound 5039 | $L_{1-202}$ | $L_{2-138}$ |
| Compound 5040 | $L_{1-202}$ | $L_{2-139}$ |
| Compound 5041 | $L_{1-202}$ | $L_{2-140}$ |
| Compound 5042 | $L_{1-202}$ | $L_{2-141}$ |
| Compound 5043 | $L_{1-202}$ | $L_{2-142}$ |
| Compound 5044 | $L_{1-202}$ | $L_{2-143}$ |
| Compound 5045 | $L_{1-202}$ | $L_{2-144}$ |
| Compound 5046 | $L_{1-202}$ | $L_{2-145}$ |
| Compound 5047 | $L_{1-202}$ | $L_{2-146}$ |
| Compound 5048 | $L_{1-202}$ | $L_{2-147}$ |
| Compound 5049 | $L_{1-202}$ | $L_{2-148}$ |
| Compound 5050 | $L_{1-202}$ | $L_{2-149}$ |
| Compound 5051 | $L_{1-202}$ | $L_{2-150}$ |
| Compound 5052 | $L_{1-202}$ | $L_{2-151}$ |
| Compound 5053 | $L_{1-202}$ | $L_{2-152}$ |
| Compound 5054 | $L_{1-202}$ | $L_{2-153}$ |
| Compound 5055 | $L_{1-202}$ | $L_{2-154}$ |
| Compound 5056 | $L_{1-202}$ | $L_{2-155}$ |
| Compound 5057 | $L_{1-202}$ | $L_{2-156}$ |
| Compound 5058 | $L_{1-202}$ | $L_{2-157}$ |
| Compound 5059 | $L_{1-202}$ | $L_{2-158}$ |
| Compound 5060 | $L_{1-202}$ | $L_{2-159}$ |
| Compound 5061 | $L_{1-202}$ | $L_{2-160}$ |
| Compound 5062 | $L_{1-202}$ | $L_{2-161}$ |
| Compound 5063 | $L_{1-202}$ | $L_{2-162}$ |
| Compound 5064 | $L_{1-202}$ | $L_{2-163}$ |
| Compound 5065 | $L_{1-202}$ | $L_{2-164}$ |
| Compound 5066 | $L_{1-202}$ | $L_{2-165}$ |
| Compound 5067 | $L_{1-202}$ | $L_{2-166}$ |
| Compound 5068 | $L_{1-202}$ | $L_{2-167}$ |
| Compound 5069 | $L_{1-202}$ | $L_{2-168}$ |
| Compound 5070 | $L_{1-202}$ | $L_{2-169}$ |
| Compound 5071 | $L_{1-202}$ | $L_{2-170}$ |
| Compound 5072 | $L_{1-202}$ | $L_{2-171}$ |
| Compound 5073 | $L_{1-202}$ | $L_{2-172}$ |
| Compound 5074 | $L_{1-202}$ | $L_{2-173}$ |
| Compound 5075 | $L_{1-202}$ | $L_{2-174}$ |
| Compound 5076 | $L_{1-202}$ | $L_{2-175}$ |
| Compound 5077 | $L_{1-202}$ | $L_{2-176}$ |
| Compound 5078 | $L_{1-202}$ | $L_{2-177}$ |
| Compound 5079 | $L_{1-202}$ | $L_{2-178}$ |
| Compound 5080 | $L_{1-202}$ | $L_{2-179}$ |
| Compound 5081 | $L_{1-202}$ | $L_{2-180}$ |
| Compound 5082 | $L_{1-202}$ | $L_{2-181}$ |
| Compound 5083 | $L_{1-202}$ | $L_{2-182}$ |
| Compound 5084 | $L_{1-202}$ | $L_{2-183}$ |
| Compound 5085 | $L_{1-202}$ | $L_{2-184}$ |
| Compound 5086 | $L_{1-202}$ | $L_{2-185}$ |
| Compound 5087 | $L_{1-202}$ | $L_{2-186}$ |
| Compound 5088 | $L_{1-202}$ | $L_{2-187}$ |
| Compound 5089 | $L_{1-202}$ | $L_{2-188}$ |
| Compound 5090 | $L_{1-202}$ | $L_{2-189}$ |
| Compound 5091 | $L_{1-202}$ | $L_{2-190}$ |
| Compound 5092 | $L_{1-202}$ | $L_{2-191}$ |
| Compound 5093 | $L_{1-202}$ | $L_{2-192}$ |
| Compound 5094 | $L_{1-202}$ | $L_{2-193}$ |
| Compound 5095 | $L_{1-202}$ | $L_{2-194}$ |
| Compound 5096 | $L_{1-202}$ | $L_{2-195}$ |
| Compound 5097 | $L_{1-202}$ | $L_{2-196}$ |
| Compound 5098 | $L_{1-202}$ | $L_{2-197}$ |
| Compound 5099 | $L_{1-202}$ | $L_{2-198}$ |
| Compound 5100 | $L_{1-202}$ | $L_{2-199}$ |
| Compound 5101 | $L_{1-202}$ | $L_{2-200}$ |
| Compound 5102 | $L_{1-202}$ | $L_{2-201}$ |
| Compound 5103 | $L_{1-202}$ | $L_{2-202}$ |
| Compound 5104 | $L_{1-202}$ | $L_{2-203}$ |
| Compound 5105 | $L_{1-202}$ | $L_{2-204}$ |
| Compound 5106 | $L_{1-202}$ | $L_{2-205}$ |
| Compound 5107 | $L_{1-202}$ | $L_{2-206}$ |
| Compound 5108 | $L_{1-202}$ | $L_{2-207}$ |
| Compound 5109 | $L_{1-202}$ | $L_{2-208}$ |

TABLE 1-continued

| | | |
|---|---|---|
| Compound 5110 | $L_{1-202}$ | $L_{2-209}$ |
| Compound 5111 | $L_{1-202}$ | $L_{2-210}$ |
| Compound 5112 | $L_{1-202}$ | $L_{2-211}$ |
| Compound 5113 | $L_{1-202}$ | $L_{2-212}$ |
| Compound 5114 | $L_{1-202}$ | $L_{2-213}$ |
| Compound 5115 | $L_{1-202}$ | $L_{2-214}$ |
| Compound 5116 | $L_{1-202}$ | $L_{2-215}$ |
| Compound 5117 | $L_{1-202}$ | $L_{2-216}$ |
| Compound 5118 | $L_{1-202}$ | $L_{2-217}$ |
| Compound 5119 | $L_{1-202}$ | $L_{2-218}$ |
| Compound 5120 | $L_{1-202}$ | $L_{2-219}$ |
| Compound 5121 | $L_{1-202}$ | $L_{2-220}$ |
| Compound 5122 | $L_{1-202}$ | $L_{2-221}$ |
| Compound 5123 | $L_{1-202}$ | $L_{2-222}$ |
| Compound 5124 | $L_{1-202}$ | $L_{2-223}$ |
| Compound 5125 | $L_{1-202}$ | $L_{2-224}$ |
| Compound 5126 | $L_{1-202}$ | $L_{2-225}$ |
| Compound 5127 | $L_{1-202}$ | $L_{2-226}$ |
| Compound 5128 | $L_{1-202}$ | $L_{2-227}$ |
| Compound 5129 | $L_{1-202}$ | $L_{2-228}$ |
| Compound 5130 | $L_{1-202}$ | $L_{2-229}$ |
| Compound 5131 | $L_{1-202}$ | $L_{2-230}$ |
| Compound 5132 | $L_{1-202}$ | $L_{2-231}$ |
| Compound 5133 | $L_{1-202}$ | $L_{2-232}$ |
| Compound 5134 | $L_{1-202}$ | $L_{2-233}$ |
| Compound 5135 | $L_{1-202}$ | $L_{2-234}$ |
| Compound 5136 | $L_{1-202}$ | $L_{2-235}$ |
| Compound 5137 | $L_{1-202}$ | $L_{2-236}$ |
| Compound 5138 | $L_{1-202}$ | $L_{2-237}$ |
| Compound 5139 | $L_{1-202}$ | $L_{2-238}$ |
| Compound 5140 | $L_{1-202}$ | $L_{2-239}$ |
| Compound 5141 | $L_{1-202}$ | $L_{2-240}$ |
| Compound 5142 | $L_{1-202}$ | $L_{2-241}$ |
| Compound 5143 | $L_{1-202}$ | $L_{2-242}$ |
| Compound 5144 | $L_{1-202}$ | $L_{2-243}$ |
| Compound 5145 | $L_{1-202}$ | $L_{2-244}$ |
| Compound 5146 | $L_{1-202}$ | $L_{2-245}$ |
| Compound 5147 | $L_{1-202}$ | $L_{2-246}$ |
| Compound 5148 | $L_{1-202}$ | $L_{2-247}$ |
| Compound 5149 | $L_{1-202}$ | $L_{2-248}$ |
| Compound 5150 | $L_{1-202}$ | $L_{2-249}$ |
| Compound 5151 | $L_{1-202}$ | $L_{2-250}$ |
| Compound 5152 | $L_{1-202}$ | $L_{2-251}$ |
| Compound 5153 | $L_{1-202}$ | $L_{2-252}$ |
| Compound 5154 | $L_{1-202}$ | $L_{2-253}$ |
| Compound 5155 | $L_{1-202}$ | $L_{2-254}$ |
| Compound 5156 | $L_{1-202}$ | $L_{2-255}$ |
| Compound 5157 | $L_{1-202}$ | $L_{2-256}$ |
| Compound 5158 | $L_{1-202}$ | $L_{2-257}$ |
| Compound 5159 | $L_{1-202}$ | $L_{2-258}$ |
| Compound 5160 | $L_{1-202}$ | $L_{2-259}$ |
| Compound 5161 | $L_{1-202}$ | $L_{2-260}$ |
| Compound 5162 | $L_{1-202}$ | $L_{2-261}$ |
| Compound 5163 | $L_{1-202}$ | $L_{2-262}$ |
| Compound 5164 | $L_{1-202}$ | $L_{2-263}$ |
| Compound 5165 | $L_{1-202}$ | $L_{2-264}$ |
| Compound 5166 | $L_{1-202}$ | $L_{2-265}$ |
| Compound 5167 | $L_{1-202}$ | $L_{2-266}$ |
| Compound 5168 | $L_{1-202}$ | $L_{2-267}$ |
| Compound 5169 | $L_{1-202}$ | $L_{2-268}$ |
| Compound 5170 | $L_{1-202}$ | $L_{2-269}$ |
| Compound 5171 | $L_{1-202}$ | $L_{2-270}$ |
| Compound 5172 | $L_{1-202}$ | $L_{2-271}$ |
| Compound 5173 | $L_{1-202}$ | $L_{2-272}$ |
| Compound 5174 | $L_{1-202}$ | $L_{2-273}$ |
| Compound 5175 | $L_{1-202}$ | $L_{2-274}$ |
| Compound 5176 | $L_{1-202}$ | $L_{2-275}$ |
| Compound 5177 | $L_{1-202}$ | $L_{2-276}$ |
| Compound 5178 | $L_{1-202}$ | $L_{2-277}$ |
| Compound 5179 | $L_{1-202}$ | $L_{2-278}$ |
| Compound 5180 | $L_{1-202}$ | $L_{2-279}$ |
| Compound 5181 | $L_{1-202}$ | $L_{2-280}$ |
| Compound 5182 | $L_{1-202}$ | $L_{2-281}$ |
| Compound 5183 | $L_{1-202}$ | $L_{2-282}$ |
| Compound 5184 | $L_{1-202}$ | $L_{2-283}$ |
| Compound 5185 | $L_{1-202}$ | $L_{2-284}$ |
| Compound 5186 | $L_{1-202}$ | $L_{2-285}$ |
| Compound 5187 | $L_{1-202}$ | $L_{2-286}$ |
| Compound 5188 | $L_{1-202}$ | $L_{2-287}$ |
| Compound 5189 | $L_{1-202}$ | $L_{2-288}$ |

TABLE 1-continued

| | | |
|---|---|---|
| Compound 5190 | $L_{1-202}$ | $L_{2-289}$ |
| Compound 5191 | $L_{1-202}$ | $L_{2-290}$ |
| Compound 5192 | $L_{1-202}$ | $L_{2-291}$ |
| Compound 5193 | $L_{1-202}$ | $L_{2-292}$ |
| Compound 5194 | $L_{1-202}$ | $L_{2-293}$ |
| Compound 5195 | $L_{1-202}$ | $L_{2-294}$ |
| Compound 5196 | $L_{1-202}$ | $L_{2-295}$ |
| Compound 5197 | $L_{1-202}$ | $L_{2-296}$ |
| Compound 5198 | $L_{1-202}$ | $L_{2-297}$ |
| Compound 5199 | $L_{1-202}$ | $L_{2-298}$ |
| Compound 5200 | $L_{1-202}$ | $L_{2-299}$ |
| Compound 5201 | $L_{1-202}$ | $L_{2-300}$ |
| Compound 5202 | $L_{1-202}$ | $L_{2-301}$ |
| Compound 5203 | $L_{1-202}$ | $L_{2-302}$ |
| Compound 5204 | $L_{1-202}$ | $L_{2-303}$ |
| Compound 5205 | $L_{1-202}$ | $L_{2-304}$ |
| Compound 5206 | $L_{1-202}$ | $L_{2-305}$ |
| Compound 5207 | $L_{1-202}$ | $L_{2-306}$ |
| Compound 5208 | $L_{1-202}$ | $L_{2-307}$ |
| Compound 5209 | $L_{1-202}$ | $L_{2-308}$ |
| Compound 5210 | $L_{1-202}$ | $L_{2-309}$ |
| Compound 5211 | $L_{1-202}$ | $L_{2-310}$ |
| Compound 5212 | $L_{1-202}$ | $L_{2-311}$ |
| Compound 5213 | $L_{1-202}$ | $L_{2-312}$ |
| Compound 5214 | $L_{1-202}$ | $L_{2-313}$ |
| Compound 5215 | $L_{1-202}$ | $L_{2-314}$ |
| Compound 5216 | $L_{1-202}$ | $L_{2-315}$ |
| Compound 5217 | $L_{1-202}$ | $L_{2-316}$ |
| Compound 5218 | $L_{1-202}$ | $L_{2-317}$ |
| Compound 5219 | $L_{1-202}$ | $L_{2-318}$ |
| Compound 5220 | $L_{1-202}$ | $L_{2-319}$ |
| Compound 5221 | $L_{1-202}$ | $L_{2-320}$ |
| Compound 5222 | $L_{1-202}$ | $L_{2-321}$ |
| Compound 5223 | $L_{1-202}$ | $L_{2-322}$ |
| Compound 5224 | $L_{1-202}$ | $L_{2-323}$ |
| Compound 5225 | $L_{1-202}$ | $L_{2-324}$ |
| Compound 5226 | $L_{1-202}$ | $L_{2-325}$ |
| Compound 5227 | $L_{1-202}$ | $L_{2-326}$ |
| Compound 5228 | $L_{1-202}$ | $L_{2-327}$ |
| Compound 5229 | $L_{1-202}$ | $L_{2-328}$ |
| Compound 5230 | $L_{1-202}$ | $L_{2-329}$ |
| Compound 5231 | $L_{1-202}$ | $L_{2-330}$ |
| Compound 5232 | $L_{1-202}$ | $L_{2-331}$ |
| Compound 5233 | $L_{1-202}$ | $L_{2-332}$ |
| Compound 5234 | $L_{1-202}$ | $L_{2-333}$ |
| Compound 5235 | $L_{1-202}$ | $L_{2-334}$ |
| Compound 5236 | $L_{1-202}$ | $L_{2-335}$ |
| Compound 5237 | $L_{1-202}$ | $L_{2-336}$ |
| Compound 5238 | $L_{1-202}$ | $L_{2-337}$ |
| Compound 5239 | $L_{1-202}$ | $L_{2-338}$ |
| Compound 5240 | $L_{1-202}$ | $L_{2-339}$ |
| Compound 5241 | $L_{1-202}$ | $L_{2-340}$ |
| Compound 5242 | $L_{1-202}$ | $L_{2-341}$ |
| Compound 5243 | $L_{1-202}$ | $L_{2-342}$ |
| Compound 5244 | $L_{1-202}$ | $L_{2-343}$ |
| Compound 5245 | $L_{1-202}$ | $L_{2-344}$ |
| Compound 5246 | $L_{1-202}$ | $L_{2-345}$ |
| Compound 5247 | $L_{1-202}$ | $L_{2-346}$ |
| Compound 5248 | $L_{1-202}$ | $L_{2-347}$ |
| Compound 5249 | $L_{1-202}$ | $L_{2-348}$ |
| Compound 5250 | $L_{1-202}$ | $L_{2-349}$ |
| Compound 5251 | $L_{1-202}$ | $L_{2-350}$ |
| Compound 5252 | $L_{1-202}$ | $L_{2-351}$ |
| Compound 5253 | $L_{1-202}$ | $L_{2-352}$ |
| Compound 5254 | $L_{1-202}$ | $L_{2-353}$ |
| Compound 5255 | $L_{1-202}$ | $L_{2-354}$ |
| Compound 5256 | $L_{1-202}$ | $L_{2-355}$ |
| Compound 5257 | $L_{1-202}$ | $L_{2-356}$ |
| Compound 5258 | $L_{1-202}$ | $L_{2-357}$ |
| Compound 5259 | $L_{1-202}$ | $L_{2-358}$ |
| Compound 5260 | $L_{1-202}$ | $L_{2-359}$ |
| Compound 5261 | $L_{1-202}$ | $L_{2-360}$ |
| Compound 5262 | $L_{1-202}$ | $L_{2-361}$ |
| Compound 5263 | $L_{1-202}$ | $L_{2-362}$ |
| Compound 5264 | $L_{1-202}$ | $L_{2-363}$ |
| Compound 5265 | $L_{1-202}$ | $L_{2-364}$ |
| Compound 5266 | $L_{1-202}$ | $L_{2-365}$ |
| Compound 5267 | $L_{1-202}$ | $L_{2-366}$ |
| Compound 5268 | $L_{1-202}$ | $L_{2-367}$ |
| Compound 5269 | $L_{1-202}$ | $L_{2-368}$ |

TABLE 1-continued

| | | |
|---|---|---|
| Compound 5270 | $L_{1-202}$ | $L_{2-369}$ |
| Compound 5271 | $L_{1-202}$ | $L_{2-370}$ |
| Compound 5272 | $L_{1-202}$ | $L_{2-371}$ |
| Compound 5273 | $L_{1-202}$ | $L_{2-372}$ |
| Compound 5274 | $L_{1-202}$ | $L_{2-373}$ |
| Compound 5275 | $L_{1-202}$ | $L_{2-374}$ |
| Compound 5276 | $L_{1-202}$ | $L_{2-375}$ |
| Compound 5277 | $L_{1-202}$ | $L_{2-376}$ |
| Compound 5278 | $L_{1-203}$ | $L_{2-377}$ |
| Compound 5279 | $L_{1-203}$ | $L_{2-1}$ |
| Compound 5280 | $L_{1-203}$ | $L_{2-2}$ |
| Compound 5281 | $L_{1-203}$ | $L_{2-3}$ |
| Compound 5282 | $L_{1-203}$ | $L_{2-4}$ |
| Compound 5283 | $L_{1-203}$ | $L_{2-5}$ |
| Compound 5284 | $L_{1-203}$ | $L_{2-6}$ |
| Compound 5285 | $L_{1-203}$ | $L_{2-7}$ |
| Compound 5286 | $L_{1-203}$ | $L_{2-8}$ |
| Compound 5287 | $L_{1-203}$ | $L_{2-9}$ |
| Compound 5288 | $L_{1-203}$ | $L_{2-10}$ |
| Compound 5289 | $L_{1-203}$ | $L_{2-11}$ |
| Compound 5290 | $L_{1-203}$ | $L_{2-12}$ |
| Compound 5291 | $L_{1-203}$ | $L_{2-13}$ |
| Compound 5292 | $L_{1-203}$ | $L_{2-14}$ |
| Compound 5293 | $L_{1-203}$ | $L_{2-15}$ |
| Compound 5294 | $L_{1-203}$ | $L_{2-16}$ |
| Compound 5295 | $L_{1-203}$ | $L_{2-17}$ |
| Compound 5296 | $L_{1-203}$ | $L_{2-18}$ |
| Compound 5297 | $L_{1-203}$ | $L_{2-19}$ |
| Compound 5298 | $L_{1-203}$ | $L_{2-20}$ |
| Compound 5299 | $L_{1-203}$ | $L_{2-21}$ |
| Compound 5300 | $L_{1-203}$ | $L_{2-22}$ |
| Compound 5301 | $L_{1-203}$ | $L_{2-23}$ |
| Compound 5302 | $L_{1-203}$ | $L_{2-24}$ |
| Compound 5303 | $L_{1-203}$ | $L_{2-25}$ |
| Compound 5304 | $L_{1-203}$ | $L_{2-26}$ |
| Compound 5305 | $L_{1-203}$ | $L_{2-27}$ |
| Compound 5306 | $L_{1-203}$ | $L_{2-28}$ |
| Compound 5307 | $L_{1-203}$ | $L_{2-29}$ |
| Compound 5308 | $L_{1-203}$ | $L_{2-30}$ |
| Compound 5309 | $L_{1-203}$ | $L_{2-31}$ |
| Compound 5310 | $L_{1-203}$ | $L_{2-32}$ |
| Compound 5311 | $L_{1-203}$ | $L_{2-33}$ |
| Compound 5312 | $L_{1-203}$ | $L_{2-34}$ |
| Compound 5313 | $L_{1-203}$ | $L_{2-35}$ |
| Compound 5314 | $L_{1-203}$ | $L_{2-36}$ |
| Compound 5315 | $L_{1-203}$ | $L_{2-37}$ |
| Compound 5316 | $L_{1-203}$ | $L_{2-38}$ |
| Compound 5317 | $L_{1-203}$ | $L_{2-39}$ |
| Compound 5318 | $L_{1-203}$ | $L_{2-40}$ |
| Compound 5319 | $L_{1-203}$ | $L_{2-41}$ |
| Compound 5320 | $L_{1-203}$ | $L_{2-42}$ |
| Compound 5321 | $L_{1-203}$ | $L_{2-43}$ |
| Compound 5322 | $L_{1-203}$ | $L_{2-44}$ |
| Compound 5323 | $L_{1-203}$ | $L_{2-45}$ |
| Compound 5324 | $L_{1-203}$ | $L_{2-46}$ |
| Compound 5325 | $L_{1-203}$ | $L_{2-47}$ |
| Compound 5326 | $L_{1-203}$ | $L_{2-48}$ |
| Compound 5327 | $L_{1-203}$ | $L_{2-49}$ |
| Compound 5328 | $L_{1-203}$ | $L_{2-50}$ |
| Compound 5329 | $L_{1-203}$ | $L_{2-51}$ |
| Compound 5330 | $L_{1-203}$ | $L_{2-52}$ |
| Compound 5331 | $L_{1-203}$ | $L_{2-53}$ |
| Compound 5332 | $L_{1-203}$ | $L_{2-54}$ |
| Compound 5333 | $L_{1-203}$ | $L_{2-55}$ |
| Compound 5334 | $L_{1-203}$ | $L_{2-56}$ |
| Compound 5335 | $L_{1-203}$ | $L_{2-57}$ |
| Compound 5336 | $L_{1-203}$ | $L_{2-58}$ |
| Compound 5337 | $L_{1-203}$ | $L_{2-59}$ |
| Compound 5338 | $L_{1-203}$ | $L_{2-60}$ |
| Compound 5339 | $L_{1-203}$ | $L_{2-61}$ |
| Compound 5340 | $L_{1-203}$ | $L_{2-62}$ |
| Compound 5341 | $L_{1-203}$ | $L_{2-63}$ |
| Compound 5342 | $L_{1-203}$ | $L_{2-64}$ |
| Compound 5343 | $L_{1-203}$ | $L_{2-65}$ |
| Compound 5344 | $L_{1-203}$ | $L_{2-66}$ |
| Compound 5345 | $L_{1-203}$ | $L_{2-67}$ |
| Compound 5346 | $L_{1-203}$ | $L_{2-68}$ |
| Compound 5347 | $L_{1-203}$ | $L_{2-69}$ |
| Compound 5348 | $L_{1-203}$ | $L_{2-70}$ |
| Compound 5349 | $L_{1-203}$ | $L_{2-71}$ |

TABLE 1-continued

| | | |
|---|---|---|
| Compound 5350 | $L_{1-203}$ | $L_{2-72}$ |
| Compound 5351 | $L_{1-203}$ | $L_{2-73}$ |
| Compound 5352 | $L_{1-203}$ | $L_{2-74}$ |
| Compound 5353 | $L_{1-203}$ | $L_{2-75}$ |
| Compound 5354 | $L_{1-203}$ | $L_{2-76}$ |
| Compound 5355 | $L_{1-203}$ | $L_{2-77}$ |
| Compound 5356 | $L_{1-203}$ | $L_{2-78}$ |
| Compound 5357 | $L_{1-203}$ | $L_{2-79}$ |
| Compound 5358 | $L_{1-203}$ | $L_{2-80}$ |
| Compound 5359 | $L_{1-203}$ | $L_{2-81}$ |
| Compound 5360 | $L_{1-203}$ | $L_{2-82}$ |
| Compound 5361 | $L_{1-203}$ | $L_{2-83}$ |
| Compound 5362 | $L_{1-203}$ | $L_{2-84}$ |
| Compound 5363 | $L_{1-203}$ | $L_{2-85}$ |
| Compound 5364 | $L_{1-203}$ | $L_{2-86}$ |
| Compound 5365 | $L_{1-203}$ | $L_{2-87}$ |
| Compound 5366 | $L_{1-203}$ | $L_{2-88}$ |
| Compound 5367 | $L_{1-203}$ | $L_{2-89}$ |
| Compound 5368 | $L_{1-203}$ | $L_{2-90}$ |
| Compound 5369 | $L_{1-203}$ | $L_{2-91}$ |
| Compound 5370 | $L_{1-203}$ | $L_{2-92}$ |
| Compound 5371 | $L_{1-203}$ | $L_{2-93}$ |
| Compound 5372 | $L_{1-203}$ | $L_{2-94}$ |
| Compound 5373 | $L_{1-203}$ | $L_{2-95}$ |
| Compound 5374 | $L_{1-203}$ | $L_{2-96}$ |
| Compound 5375 | $L_{1-203}$ | $L_{2-97}$ |
| Compound 5376 | $L_{1-203}$ | $L_{2-98}$ |
| Compound 5377 | $L_{1-203}$ | $L_{2-99}$ |
| Compound 5378 | $L_{1-203}$ | $L_{2-100}$ |
| Compound 5379 | $L_{1-203}$ | $L_{2-101}$ |
| Compound 5380 | $L_{1-203}$ | $L_{2-102}$ |
| Compound 5381 | $L_{1-203}$ | $L_{2-103}$ |
| Compound 5382 | $L_{1-203}$ | $L_{2-104}$ |
| Compound 5383 | $L_{1-203}$ | $L_{2-105}$ |
| Compound 5384 | $L_{1-203}$ | $L_{2-106}$ |
| Compound 5385 | $L_{1-203}$ | $L_{2-107}$ |
| Compound 5386 | $L_{1-203}$ | $L_{2-108}$ |
| Compound 5387 | $L_{1-203}$ | $L_{2-109}$ |
| Compound 5388 | $L_{1-203}$ | $L_{2-110}$ |
| Compound 5389 | $L_{1-203}$ | $L_{2-111}$ |
| Compound 5390 | $L_{1-203}$ | $L_{2-112}$ |
| Compound 5391 | $L_{1-203}$ | $L_{2-113}$ |
| Compound 5392 | $L_{1-203}$ | $L_{2-114}$ |
| Compound 5393 | $L_{1-203}$ | $L_{2-115}$ |
| Compound 5394 | $L_{1-203}$ | $L_{2-116}$ |
| Compound 5395 | $L_{1-203}$ | $L_{2-117}$ |
| Compound 5396 | $L_{1-203}$ | $L_{2-118}$ |
| Compound 5397 | $L_{1-203}$ | $L_{2-119}$ |
| Compound 5398 | $L_{1-203}$ | $L_{2-120}$ |
| Compound 5399 | $L_{1-203}$ | $L_{2-121}$ |
| Compound 5400 | $L_{1-203}$ | $L_{2-122}$ |
| Compound 5401 | $L_{1-203}$ | $L_{2-123}$ |
| Compound 5402 | $L_{1-203}$ | $L_{2-124}$ |
| Compound 5403 | $L_{1-203}$ | $L_{2-125}$ |
| Compound 5404 | $L_{1-203}$ | $L_{2-126}$ |
| Compound 5405 | $L_{1-203}$ | $L_{2-127}$ |
| Compound 5406 | $L_{1-203}$ | $L_{2-128}$ |
| Compound 5407 | $L_{1-203}$ | $L_{2-129}$ |
| Compound 5408 | $L_{1-203}$ | $L_{2-130}$ |
| Compound 5409 | $L_{1-203}$ | $L_{2-131}$ |
| Compound 5410 | $L_{1-203}$ | $L_{2-132}$ |
| Compound 5411 | $L_{1-203}$ | $L_{2-133}$ |
| Compound 5412 | $L_{1-203}$ | $L_{2-134}$ |
| Compound 5413 | $L_{1-203}$ | $L_{2-135}$ |
| Compound 5414 | $L_{1-203}$ | $L_{2-136}$ |
| Compound 5415 | $L_{1-203}$ | $L_{2-137}$ |
| Compound 5416 | $L_{1-203}$ | $L_{2-138}$ |
| Compound 5417 | $L_{1-203}$ | $L_{2-139}$ |
| Compound 5418 | $L_{1-203}$ | $L_{2-140}$ |
| Compound 5419 | $L_{1-203}$ | $L_{2-141}$ |
| Compound 5420 | $L_{1-203}$ | $L_{2-142}$ |
| Compound 5421 | $L_{1-203}$ | $L_{2-143}$ |
| Compound 5422 | $L_{1-203}$ | $L_{2-144}$ |
| Compound 5423 | $L_{1-203}$ | $L_{2-145}$ |
| Compound 5424 | $L_{1-203}$ | $L_{2-146}$ |
| Compound 5425 | $L_{1-203}$ | $L_{2-147}$ |
| Compound 5426 | $L_{1-203}$ | $L_{2-148}$ |
| Compound 5427 | $L_{1-203}$ | $L_{2-149}$ |
| Compound 5428 | $L_{1-203}$ | $L_{2-150}$ |
| Compound 5429 | $L_{1-203}$ | $L_{2-151}$ |

TABLE 1-continued

| | | |
|---|---|---|
| Compound 5430 | $L_{1-203}$ | $L_{2-152}$ |
| Compound 5431 | $L_{1-203}$ | $L_{2-153}$ |
| Compound 5432 | $L_{1-203}$ | $L_{2-154}$ |
| Compound 5433 | $L_{1-203}$ | $L_{2-155}$ |
| Compound 5434 | $L_{1-203}$ | $L_{2-156}$ |
| Compound 5435 | $L_{1-203}$ | $L_{2-157}$ |
| Compound 5436 | $L_{1-203}$ | $L_{2-158}$ |
| Compound 5437 | $L_{1-203}$ | $L_{2-159}$ |
| Compound 5438 | $L_{1-203}$ | $L_{2-160}$ |
| Compound 5439 | $L_{1-203}$ | $L_{2-161}$ |
| Compound 5440 | $L_{1-203}$ | $L_{2-162}$ |
| Compound 5441 | $L_{1-203}$ | $L_{2-163}$ |
| Compound 5442 | $L_{1-203}$ | $L_{2-164}$ |
| Compound 5443 | $L_{1-203}$ | $L_{2-165}$ |
| Compound 5444 | $L_{1-203}$ | $L_{2-166}$ |
| Compound 5445 | $L_{1-203}$ | $L_{2-167}$ |
| Compound 5446 | $L_{1-203}$ | $L_{2-168}$ |
| Compound 5447 | $L_{1-203}$ | $L_{2-169}$ |
| Compound 5448 | $L_{1-203}$ | $L_{2-170}$ |
| Compound 5449 | $L_{1-203}$ | $L_{2-171}$ |
| Compound 5450 | $L_{1-203}$ | $L_{2-172}$ |
| Compound 5451 | $L_{1-203}$ | $L_{2-173}$ |
| Compound 5452 | $L_{1-203}$ | $L_{2-174}$ |
| Compound 5453 | $L_{1-203}$ | $L_{2-175}$ |
| Compound 5454 | $L_{1-203}$ | $L_{2-176}$ |
| Compound 5455 | $L_{1-203}$ | $L_{2-177}$ |
| Compound 5456 | $L_{1-203}$ | $L_{2-178}$ |
| Compound 5457 | $L_{1-203}$ | $L_{2-179}$ |
| Compound 5458 | $L_{1-203}$ | $L_{2-180}$ |
| Compound 5459 | $L_{1-203}$ | $L_{2-181}$ |
| Compound 5460 | $L_{1-203}$ | $L_{2-182}$ |
| Compound 5461 | $L_{1-203}$ | $L_{2-183}$ |
| Compound 5462 | $L_{1-203}$ | $L_{2-184}$ |
| Compound 5463 | $L_{1-203}$ | $L_{2-185}$ |
| Compound 5464 | $L_{1-203}$ | $L_{2-186}$ |
| Compound 5465 | $L_{1-203}$ | $L_{2-187}$ |
| Compound 5466 | $L_{1-203}$ | $L_{2-188}$ |
| Compound 5467 | $L_{1-203}$ | $L_{2-189}$ |
| Compound 5468 | $L_{1-203}$ | $L_{2-190}$ |
| Compound 5469 | $L_{1-203}$ | $L_{2-191}$ |
| Compound 5470 | $L_{1-203}$ | $L_{2-192}$ |
| Compound 5471 | $L_{1-203}$ | $L_{2-193}$ |
| Compound 5472 | $L_{1-203}$ | $L_{2-194}$ |
| Compound 5473 | $L_{1-203}$ | $L_{2-195}$ |
| Compound 5474 | $L_{1-203}$ | $L_{2-196}$ |
| Compound 5475 | $L_{1-203}$ | $L_{2-197}$ |
| Compound 5476 | $L_{1-203}$ | $L_{2-198}$ |
| Compound 5477 | $L_{1-203}$ | $L_{2-199}$ |
| Compound 5478 | $L_{1-203}$ | $L_{2-200}$ |
| Compound 5479 | $L_{1-203}$ | $L_{2-201}$ |
| Compound 5480 | $L_{1-203}$ | $L_{2-202}$ |
| Compound 5481 | $L_{1-203}$ | $L_{2-203}$ |
| Compound 5482 | $L_{1-203}$ | $L_{2-204}$ |
| Compound 5483 | $L_{1-203}$ | $L_{2-205}$ |
| Compound 5484 | $L_{1-203}$ | $L_{2-206}$ |
| Compound 5485 | $L_{1-203}$ | $L_{2-207}$ |
| Compound 5486 | $L_{1-203}$ | $L_{2-208}$ |
| Compound 5487 | $L_{1-203}$ | $L_{2-209}$ |
| Compound 5488 | $L_{1-203}$ | $L_{2-210}$ |
| Compound 5489 | $L_{1-203}$ | $L_{2-211}$ |
| Compound 5490 | $L_{1-203}$ | $L_{2-212}$ |
| Compound 5491 | $L_{1-203}$ | $L_{2-213}$ |
| Compound 5492 | $L_{1-203}$ | $L_{2-214}$ |
| Compound 5493 | $L_{1-203}$ | $L_{2-215}$ |
| Compound 5494 | $L_{1-203}$ | $L_{2-216}$ |
| Compound 5495 | $L_{1-203}$ | $L_{2-217}$ |
| Compound 5496 | $L_{1-203}$ | $L_{2-218}$ |
| Compound 5497 | $L_{1-203}$ | $L_{2-219}$ |
| Compound 5498 | $L_{1-203}$ | $L_{2-220}$ |
| Compound 5499 | $L_{1-203}$ | $L_{2-221}$ |
| Compound 5500 | $L_{1-203}$ | $L_{2-222}$ |
| Compound 5501 | $L_{1-203}$ | $L_{2-223}$ |
| Compound 5502 | $L_{1-203}$ | $L_{2-224}$ |
| Compound 5503 | $L_{1-203}$ | $L_{2-225}$ |
| Compound 5504 | $L_{1-203}$ | $L_{2-226}$ |
| Compound 5505 | $L_{1-203}$ | $L_{2-227}$ |
| Compound 5506 | $L_{1-203}$ | $L_{2-228}$ |
| Compound 5507 | $L_{1-203}$ | $L_{2-229}$ |
| Compound 5508 | $L_{1-203}$ | $L_{2-230}$ |
| Compound 5509 | $L_{1-203}$ | $L_{2-231}$ |

TABLE 1-continued

| | | |
|---|---|---|
| Compound 5510 | $L_{1-203}$ | $L_{2-232}$ |
| Compound 5511 | $L_{1-203}$ | $L_{2-233}$ |
| Compound 5512 | $L_{1-203}$ | $L_{2-234}$ |
| Compound 5513 | $L_{1-203}$ | $L_{2-235}$ |
| Compound 5514 | $L_{1-203}$ | $L_{2-236}$ |
| Compound 5515 | $L_{1-203}$ | $L_{2-237}$ |
| Compound 5516 | $L_{1-203}$ | $L_{2-238}$ |
| Compound 5517 | $L_{1-203}$ | $L_{2-239}$ |
| Compound 5518 | $L_{1-203}$ | $L_{2-240}$ |
| Compound 5519 | $L_{1-203}$ | $L_{2-241}$ |
| Compound 5520 | $L_{1-203}$ | $L_{2-242}$ |
| Compound 5521 | $L_{1-203}$ | $L_{2-243}$ |
| Compound 5522 | $L_{1-203}$ | $L_{2-244}$ |
| Compound 5523 | $L_{1-203}$ | $L_{2-245}$ |
| Compound 5524 | $L_{1-203}$ | $L_{2-246}$ |
| Compound 5525 | $L_{1-203}$ | $L_{2-247}$ |
| Compound 5526 | $L_{1-203}$ | $L_{2-248}$ |
| Compound 5527 | $L_{1-203}$ | $L_{2-249}$ |
| Compound 5528 | $L_{1-203}$ | $L_{2-250}$ |
| Compound 5529 | $L_{1-203}$ | $L_{2-251}$ |
| Compound 5530 | $L_{1-203}$ | $L_{2-252}$ |
| Compound 5531 | $L_{1-203}$ | $L_{2-253}$ |
| Compound 5532 | $L_{1-203}$ | $L_{2-254}$ |
| Compound 5533 | $L_{1-203}$ | $L_{2-255}$ |
| Compound 5534 | $L_{1-203}$ | $L_{2-256}$ |
| Compound 5535 | $L_{1-203}$ | $L_{2-257}$ |
| Compound 5536 | $L_{1-203}$ | $L_{2-258}$ |
| Compound 5537 | $L_{1-203}$ | $L_{2-259}$ |
| Compound 5538 | $L_{1-203}$ | $L_{2-260}$ |
| Compound 5539 | $L_{1-203}$ | $L_{2-261}$ |
| Compound 5540 | $L_{1-203}$ | $L_{2-262}$ |
| Compound 5541 | $L_{1-203}$ | $L_{2-263}$ |
| Compound 5542 | $L_{1-203}$ | $L_{2-264}$ |
| Compound 5543 | $L_{1-203}$ | $L_{2-265}$ |
| Compound 5544 | $L_{1-203}$ | $L_{2-266}$ |
| Compound 5545 | $L_{1-203}$ | $L_{2-267}$ |
| Compound 5546 | $L_{1-203}$ | $L_{2-268}$ |
| Compound 5547 | $L_{1-203}$ | $L_{2-269}$ |
| Compound 5548 | $L_{1-203}$ | $L_{2-270}$ |
| Compound 5549 | $L_{1-203}$ | $L_{2-271}$ |
| Compound 5550 | $L_{1-203}$ | $L_{2-272}$ |
| Compound 5551 | $L_{1-203}$ | $L_{2-273}$ |
| Compound 5552 | $L_{1-203}$ | $L_{2-274}$ |
| Compound 5553 | $L_{1-203}$ | $L_{2-275}$ |
| Compound 5554 | $L_{1-203}$ | $L_{2-276}$ |
| Compound 5555 | $L_{1-203}$ | $L_{2-277}$ |
| Compound 5556 | $L_{1-203}$ | $L_{2-278}$ |
| Compound 5557 | $L_{1-203}$ | $L_{2-279}$ |
| Compound 5558 | $L_{1-203}$ | $L_{2-280}$ |
| Compound 5559 | $L_{1-203}$ | $L_{2-281}$ |
| Compound 5560 | $L_{1-203}$ | $L_{2-282}$ |
| Compound 5561 | $L_{1-203}$ | $L_{2-283}$ |
| Compound 5562 | $L_{1-203}$ | $L_{2-284}$ |
| Compound 5563 | $L_{1-203}$ | $L_{2-285}$ |
| Compound 5564 | $L_{1-203}$ | $L_{2-286}$ |
| Compound 5565 | $L_{1-203}$ | $L_{2-287}$ |
| Compound 5566 | $L_{1-203}$ | $L_{2-288}$ |
| Compound 5567 | $L_{1-203}$ | $L_{2-289}$ |
| Compound 5568 | $L_{1-203}$ | $L_{2-290}$ |
| Compound 5569 | $L_{1-203}$ | $L_{2-291}$ |
| Compound 5570 | $L_{1-203}$ | $L_{2-292}$ |
| Compound 5571 | $L_{1-203}$ | $L_{2-293}$ |
| Compound 5572 | $L_{1-203}$ | $L_{2-294}$ |
| Compound 5573 | $L_{1-203}$ | $L_{2-295}$ |
| Compound 5574 | $L_{1-203}$ | $L_{2-296}$ |
| Compound 5575 | $L_{1-203}$ | $L_{2-297}$ |
| Compound 5576 | $L_{1-203}$ | $L_{2-298}$ |
| Compound 5577 | $L_{1-203}$ | $L_{2-299}$ |
| Compound 5578 | $L_{1-203}$ | $L_{2-300}$ |
| Compound 5579 | $L_{1-203}$ | $L_{2-301}$ |
| Compound 5580 | $L_{1-203}$ | $L_{2-302}$ |
| Compound 5581 | $L_{1-203}$ | $L_{2-303}$ |
| Compound 5582 | $L_{1-203}$ | $L_{2-304}$ |
| Compound 5583 | $L_{1-203}$ | $L_{2-305}$ |
| Compound 5584 | $L_{1-203}$ | $L_{2-306}$ |
| Compound 5585 | $L_{1-203}$ | $L_{2-307}$ |
| Compound 5586 | $L_{1-203}$ | $L_{2-308}$ |
| Compound 5587 | $L_{1-203}$ | $L_{2-309}$ |
| Compound 5588 | $L_{1-203}$ | $L_{2-310}$ |
| Compound 5589 | $L_{1-203}$ | $L_{2-311}$ |

TABLE 1-continued

| | | |
|---|---|---|
| Compound 5590 | $L_{1-203}$ | $L_{2-312}$ |
| Compound 5591 | $L_{1-203}$ | $L_{2-313}$ |
| Compound 5592 | $L_{1-203}$ | $L_{2-314}$ |
| Compound 5593 | $L_{1-203}$ | $L_{2-315}$ |
| Compound 5594 | $L_{1-203}$ | $L_{2-316}$ |
| Compound 5595 | $L_{1-203}$ | $L_{2-317}$ |
| Compound 5596 | $L_{1-203}$ | $L_{2-318}$ |
| Compound 5597 | $L_{1-203}$ | $L_{2-319}$ |
| Compound 5598 | $L_{1-203}$ | $L_{2-320}$ |
| Compound 5599 | $L_{1-203}$ | $L_{2-321}$ |
| Compound 5600 | $L_{1-203}$ | $L_{2-322}$ |
| Compound 5601 | $L_{1-203}$ | $L_{2-323}$ |
| Compound 5602 | $L_{1-203}$ | $L_{2-324}$ |
| Compound 5603 | $L_{1-203}$ | $L_{2-325}$ |
| Compound 5604 | $L_{1-203}$ | $L_{2-326}$ |
| Compound 5605 | $L_{1-203}$ | $L_{2-327}$ |
| Compound 5606 | $L_{1-203}$ | $L_{2-328}$ |
| Compound 5607 | $L_{1-203}$ | $L_{2-329}$ |
| Compound 5608 | $L_{1-203}$ | $L_{2-330}$ |
| Compound 5609 | $L_{1-203}$ | $L_{2-331}$ |
| Compound 5610 | $L_{1-203}$ | $L_{2-332}$ |
| Compound 5611 | $L_{1-203}$ | $L_{2-333}$ |
| Compound 5612 | $L_{1-203}$ | $L_{2-334}$ |
| Compound 5613 | $L_{1-203}$ | $L_{2-335}$ |
| Compound 5614 | $L_{1-203}$ | $L_{2-336}$ |
| Compound 5615 | $L_{1-203}$ | $L_{2-337}$ |
| Compound 5616 | $L_{1-203}$ | $L_{2-338}$ |
| Compound 5617 | $L_{1-203}$ | $L_{2-339}$ |
| Compound 5618 | $L_{1-203}$ | $L_{2-340}$ |
| Compound 5619 | $L_{1-203}$ | $L_{2-341}$ |
| Compound 5620 | $L_{1-203}$ | $L_{2-342}$ |
| Compound 5621 | $L_{1-203}$ | $L_{2-343}$ |
| Compound 5622 | $L_{1-203}$ | $L_{2-344}$ |
| Compound 5623 | $L_{1-203}$ | $L_{2-345}$ |
| Compound 5624 | $L_{1-203}$ | $L_{2-346}$ |
| Compound 5625 | $L_{1-203}$ | $L_{2-347}$ |
| Compound 5626 | $L_{1-203}$ | $L_{2-348}$ |
| Compound 5627 | $L_{1-203}$ | $L_{2-349}$ |
| Compound 5628 | $L_{1-203}$ | $L_{2-350}$ |
| Compound 5629 | $L_{1-203}$ | $L_{2-351}$ |
| Compound 5630 | $L_{1-203}$ | $L_{2-352}$ |
| Compound 5631 | $L_{1-203}$ | $L_{2-353}$ |
| Compound 5632 | $L_{1-203}$ | $L_{2-354}$ |
| Compound 5633 | $L_{1-203}$ | $L_{2-355}$ |
| Compound 5634 | $L_{1-203}$ | $L_{2-356}$ |
| Compound 5635 | $L_{1-203}$ | $L_{2-357}$ |
| Compound 5636 | $L_{1-203}$ | $L_{2-358}$ |
| Compound 5637 | $L_{1-203}$ | $L_{2-359}$ |
| Compound 5638 | $L_{1-203}$ | $L_{2-360}$ |
| Compound 5639 | $L_{1-203}$ | $L_{2-361}$ |
| Compound 5640 | $L_{1-203}$ | $L_{2-362}$ |
| Compound 5641 | $L_{1-203}$ | $L_{2-363}$ |
| Compound 5642 | $L_{1-203}$ | $L_{2-364}$ |
| Compound 5643 | $L_{1-203}$ | $L_{2-365}$ |
| Compound 5644 | $L_{1-203}$ | $L_{2-366}$ |
| Compound 5645 | $L_{1-203}$ | $L_{2-367}$ |
| Compound 5646 | $L_{1-203}$ | $L_{2-368}$ |
| Compound 5647 | $L_{1-203}$ | $L_{2-369}$ |
| Compound 5648 | $L_{1-203}$ | $L_{2-370}$ |
| Compound 5649 | $L_{1-203}$ | $L_{2-371}$ |
| Compound 5650 | $L_{1-203}$ | $L_{2-372}$ |
| Compound 5651 | $L_{1-203}$ | $L_{2-373}$ |
| Compound 5652 | $L_{1-203}$ | $L_{2-374}$ |
| Compound 5653 | $L_{1-203}$ | $L_{2-375}$ |
| Compound 5654 | $L_{1-203}$ | $L_{2-376}$ |
| Compound 5655 | $L_{1-204}$ | $L_{2-377}$ |
| Compound 5656 | $L_{1-204}$ | $L_{2-1}$ |
| Compound 5657 | $L_{1-204}$ | $L_{2-2}$ |
| Compound 5658 | $L_{1-204}$ | $L_{2-3}$ |
| Compound 5659 | $L_{1-204}$ | $L_{2-4}$ |
| Compound 5660 | $L_{1-204}$ | $L_{2-5}$ |
| Compound 5661 | $L_{1-204}$ | $L_{2-6}$ |
| Compound 5662 | $L_{1-204}$ | $L_{2-7}$ |
| Compound 5663 | $L_{1-204}$ | $L_{2-8}$ |
| Compound 5664 | $L_{1-204}$ | $L_{2-9}$ |
| Compound 5665 | $L_{1-204}$ | $L_{2-10}$ |
| Compound 5666 | $L_{1-204}$ | $L_{2-11}$ |
| Compound 5667 | $L_{1-204}$ | $L_{2-12}$ |
| Compound 5668 | $L_{1-204}$ | $L_{2-13}$ |
| Compound 5669 | $L_{1-204}$ | $L_{2-14}$ |

TABLE 1-continued

| | | |
|---|---|---|
| Compound 5670 | $L_{1-204}$ | $L_{2-15}$ |
| Compound 5671 | $L_{1-204}$ | $L_{2-16}$ |
| Compound 5672 | $L_{1-204}$ | $L_{2-17}$ |
| Compound 5673 | $L_{1-204}$ | $L_{2-18}$ |
| Compound 5674 | $L_{1-204}$ | $L_{2-19}$ |
| Compound 5675 | $L_{1-204}$ | $L_{2-20}$ |
| Compound 5676 | $L_{1-204}$ | $L_{2-21}$ |
| Compound 5677 | $L_{1-204}$ | $L_{2-22}$ |
| Compound 5678 | $L_{1-204}$ | $L_{2-23}$ |
| Compound 5679 | $L_{1-204}$ | $L_{2-24}$ |
| Compound 5680 | $L_{1-204}$ | $L_{2-25}$ |
| Compound 5681 | $L_{1-204}$ | $L_{2-26}$ |
| Compound 5682 | $L_{1-204}$ | $L_{2-27}$ |
| Compound 5683 | $L_{1-204}$ | $L_{2-28}$ |
| Compound 5684 | $L_{1-204}$ | $L_{2-29}$ |
| Compound 5685 | $L_{1-204}$ | $L_{2-30}$ |
| Compound 5686 | $L_{1-204}$ | $L_{2-31}$ |
| Compound 5687 | $L_{1-204}$ | $L_{2-32}$ |
| Compound 5688 | $L_{1-204}$ | $L_{2-33}$ |
| Compound 5689 | $L_{1-204}$ | $L_{2-34}$ |
| Compound 5690 | $L_{1-204}$ | $L_{2-35}$ |
| Compound 5691 | $L_{1-204}$ | $L_{2-36}$ |
| Compound 5692 | $L_{1-204}$ | $L_{2-37}$ |
| Compound 5693 | $L_{1-204}$ | $L_{2-38}$ |
| Compound 5694 | $L_{1-204}$ | $L_{2-39}$ |
| Compound 5695 | $L_{1-204}$ | $L_{2-40}$ |
| Compound 5696 | $L_{1-204}$ | $L_{2-41}$ |
| Compound 5697 | $L_{1-204}$ | $L_{2-42}$ |
| Compound 5698 | $L_{1-204}$ | $L_{2-43}$ |
| Compound 5699 | $L_{1-204}$ | $L_{2-44}$ |
| Compound 5700 | $L_{1-204}$ | $L_{2-45}$ |
| Compound 5701 | $L_{1-204}$ | $L_{2-46}$ |
| Compound 5702 | $L_{1-204}$ | $L_{2-47}$ |
| Compound 5703 | $L_{1-204}$ | $L_{2-48}$ |
| Compound 5704 | $L_{1-204}$ | $L_{2-49}$ |
| Compound 5705 | $L_{1-204}$ | $L_{2-50}$ |
| Compound 5706 | $L_{1-204}$ | $L_{2-51}$ |
| Compound 5707 | $L_{1-204}$ | $L_{2-52}$ |
| Compound 5708 | $L_{1-204}$ | $L_{2-53}$ |
| Compound 5709 | $L_{1-204}$ | $L_{2-54}$ |
| Compound 5710 | $L_{1-204}$ | $L_{2-55}$ |
| Compound 5711 | $L_{1-204}$ | $L_{2-56}$ |
| Compound 5712 | $L_{1-204}$ | $L_{2-57}$ |
| Compound 5713 | $L_{1-204}$ | $L_{2-58}$ |
| Compound 5714 | $L_{1-204}$ | $L_{2-59}$ |
| Compound 5715 | $L_{1-204}$ | $L_{2-60}$ |
| Compound 5716 | $L_{1-204}$ | $L_{2-61}$ |
| Compound 5717 | $L_{1-204}$ | $L_{2-62}$ |
| Compound 5718 | $L_{1-204}$ | $L_{2-63}$ |
| Compound 5719 | $L_{1-204}$ | $L_{2-64}$ |
| Compound 5720 | $L_{1-204}$ | $L_{2-65}$ |
| Compound 5721 | $L_{1-204}$ | $L_{2-66}$ |
| Compound 5722 | $L_{1-204}$ | $L_{2-67}$ |
| Compound 5723 | $L_{1-204}$ | $L_{2-68}$ |
| Compound 5724 | $L_{1-204}$ | $L_{2-69}$ |
| Compound 5725 | $L_{1-204}$ | $L_{2-70}$ |
| Compound 5726 | $L_{1-204}$ | $L_{2-71}$ |
| Compound 5727 | $L_{1-204}$ | $L_{2-72}$ |
| Compound 5728 | $L_{1-204}$ | $L_{2-73}$ |
| Compound 5729 | $L_{1-204}$ | $L_{2-74}$ |
| Compound 5730 | $L_{1-204}$ | $L_{2-75}$ |
| Compound 5731 | $L_{1-204}$ | $L_{2-76}$ |
| Compound 5732 | $L_{1-204}$ | $L_{2-77}$ |
| Compound 5733 | $L_{1-204}$ | $L_{2-78}$ |
| Compound 5734 | $L_{1-204}$ | $L_{2-79}$ |
| Compound 5735 | $L_{1-204}$ | $L_{2-80}$ |
| Compound 5736 | $L_{1-204}$ | $L_{2-81}$ |
| Compound 5737 | $L_{1-204}$ | $L_{2-82}$ |
| Compound 5738 | $L_{1-204}$ | $L_{2-83}$ |
| Compound 5739 | $L_{1-204}$ | $L_{2-84}$ |
| Compound 5740 | $L_{1-204}$ | $L_{2-85}$ |
| Compound 5741 | $L_{1-204}$ | $L_{2-86}$ |
| Compound 5742 | $L_{1-204}$ | $L_{2-87}$ |
| Compound 5743 | $L_{1-204}$ | $L_{2-88}$ |
| Compound 5744 | $L_{1-204}$ | $L_{2-89}$ |
| Compound 5745 | $L_{1-204}$ | $L_{2-90}$ |
| Compound 5746 | $L_{1-204}$ | $L_{2-91}$ |
| Compound 5747 | $L_{1-204}$ | $L_{2-92}$ |
| Compound 5748 | $L_{1-204}$ | $L_{2-93}$ |
| Compound 5749 | $L_{1-204}$ | $L_{2-94}$ |

TABLE 1-continued

| | | |
|---|---|---|
| Compound 5750 | $L_{1-204}$ | $L_{2-95}$ |
| Compound 5751 | $L_{1-204}$ | $L_{2-96}$ |
| Compound 5752 | $L_{1-204}$ | $L_{2-97}$ |
| Compound 5753 | $L_{1-204}$ | $L_{2-98}$ |
| Compound 5754 | $L_{1-204}$ | $L_{2-99}$ |
| Compound 5755 | $L_{1-204}$ | $L_{2-100}$ |
| Compound 5756 | $L_{1-204}$ | $L_{2-101}$ |
| Compound 5757 | $L_{1-204}$ | $L_{2-102}$ |
| Compound 5758 | $L_{1-204}$ | $L_{2-103}$ |
| Compound 5759 | $L_{1-204}$ | $L_{2-104}$ |
| Compound 5760 | $L_{1-204}$ | $L_{2-105}$ |
| Compound 5761 | $L_{1-204}$ | $L_{2-106}$ |
| Compound 5762 | $L_{1-204}$ | $L_{2-107}$ |
| Compound 5763 | $L_{1-204}$ | $L_{2-108}$ |
| Compound 5764 | $L_{1-204}$ | $L_{2-109}$ |
| Compound 5765 | $L_{1-204}$ | $L_{2-110}$ |
| Compound 5766 | $L_{1-204}$ | $L_{2-111}$ |
| Compound 5767 | $L_{1-204}$ | $L_{2-112}$ |
| Compound 5768 | $L_{1-204}$ | $L_{2-113}$ |
| Compound 5769 | $L_{1-204}$ | $L_{2-114}$ |
| Compound 5770 | $L_{1-204}$ | $L_{2-115}$ |
| Compound 5771 | $L_{1-204}$ | $L_{2-116}$ |
| Compound 5772 | $L_{1-204}$ | $L_{2-117}$ |
| Compound 5773 | $L_{1-204}$ | $L_{2-118}$ |
| Compound 5774 | $L_{1-204}$ | $L_{2-119}$ |
| Compound 5775 | $L_{1-204}$ | $L_{2-120}$ |
| Compound 5776 | $L_{1-204}$ | $L_{2-121}$ |
| Compound 5777 | $L_{1-204}$ | $L_{2-122}$ |
| Compound 5778 | $L_{1-204}$ | $L_{2-123}$ |
| Compound 5779 | $L_{1-204}$ | $L_{2-124}$ |
| Compound 5780 | $L_{1-204}$ | $L_{2-125}$ |
| Compound 5781 | $L_{1-204}$ | $L_{2-126}$ |
| Compound 5782 | $L_{1-204}$ | $L_{2-127}$ |
| Compound 5783 | $L_{1-204}$ | $L_{2-128}$ |
| Compound 5784 | $L_{1-204}$ | $L_{2-129}$ |
| Compound 5785 | $L_{1-204}$ | $L_{2-130}$ |
| Compound 5786 | $L_{1-204}$ | $L_{2-131}$ |
| Compound 5787 | $L_{1-204}$ | $L_{2-132}$ |
| Compound 5788 | $L_{1-204}$ | $L_{2-133}$ |
| Compound 5789 | $L_{1-204}$ | $L_{2-134}$ |
| Compound 5790 | $L_{1-204}$ | $L_{2-135}$ |
| Compound 5791 | $L_{1-204}$ | $L_{2-136}$ |
| Compound 5792 | $L_{1-204}$ | $L_{2-137}$ |
| Compound 5793 | $L_{1-204}$ | $L_{2-138}$ |
| Compound 5794 | $L_{1-204}$ | $L_{2-139}$ |
| Compound 5795 | $L_{1-204}$ | $L_{2-140}$ |
| Compound 5796 | $L_{1-204}$ | $L_{2-141}$ |
| Compound 5797 | $L_{1-204}$ | $L_{2-142}$ |
| Compound 5798 | $L_{1-204}$ | $L_{2-143}$ |
| Compound 5799 | $L_{1-204}$ | $L_{2-144}$ |
| Compound 5800 | $L_{1-204}$ | $L_{2-145}$ |
| Compound 5801 | $L_{1-204}$ | $L_{2-146}$ |
| Compound 5802 | $L_{1-204}$ | $L_{2-147}$ |
| Compound 5803 | $L_{1-204}$ | $L_{2-148}$ |
| Compound 5804 | $L_{1-204}$ | $L_{2-149}$ |
| Compound 5805 | $L_{1-204}$ | $L_{2-150}$ |
| Compound 5806 | $L_{1-204}$ | $L_{2-151}$ |
| Compound 5807 | $L_{1-204}$ | $L_{2-152}$ |
| Compound 5808 | $L_{1-204}$ | $L_{2-153}$ |
| Compound 5809 | $L_{1-204}$ | $L_{2-154}$ |
| Compound 5810 | $L_{1-204}$ | $L_{2-155}$ |
| Compound 5811 | $L_{1-204}$ | $L_{2-156}$ |
| Compound 5812 | $L_{1-204}$ | $L_{2-157}$ |
| Compound 5813 | $L_{1-204}$ | $L_{2-158}$ |
| Compound 5814 | $L_{1-204}$ | $L_{2-159}$ |
| Compound 5815 | $L_{1-204}$ | $L_{2-160}$ |
| Compound 5816 | $L_{1-204}$ | $L_{2-161}$ |
| Compound 5817 | $L_{1-204}$ | $L_{2-162}$ |
| Compound 5818 | $L_{1-204}$ | $L_{2-163}$ |
| Compound 5819 | $L_{1-204}$ | $L_{2-164}$ |
| Compound 5820 | $L_{1-204}$ | $L_{2-165}$ |
| Compound 5821 | $L_{1-204}$ | $L_{2-166}$ |
| Compound 5822 | $L_{1-204}$ | $L_{2-167}$ |
| Compound 5823 | $L_{1-204}$ | $L_{2-168}$ |
| Compound 5824 | $L_{1-204}$ | $L_{2-169}$ |
| Compound 5825 | $L_{1-204}$ | $L_{2-170}$ |
| Compound 5826 | $L_{1-204}$ | $L_{2-171}$ |
| Compound 5827 | $L_{1-204}$ | $L_{2-172}$ |
| Compound 5828 | $L_{1-204}$ | $L_{2-173}$ |
| Compound 5829 | $L_{1-204}$ | $L_{2-174}$ |

TABLE 1-continued

| | | |
|---|---|---|
| Compound 5830 | $L_{1-204}$ | $L_{2-175}$ |
| Compound 5831 | $L_{1-204}$ | $L_{2-176}$ |
| Compound 5832 | $L_{1-204}$ | $L_{2-177}$ |
| Compound 5833 | $L_{1-204}$ | $L_{2-178}$ |
| Compound 5834 | $L_{1-204}$ | $L_{2-179}$ |
| Compound 5835 | $L_{1-204}$ | $L_{2-180}$ |
| Compound 5836 | $L_{1-204}$ | $L_{2-181}$ |
| Compound 5837 | $L_{1-204}$ | $L_{2-182}$ |
| Compound 5838 | $L_{1-204}$ | $L_{2-183}$ |
| Compound 5839 | $L_{1-204}$ | $L_{2-184}$ |
| Compound 5840 | $L_{1-204}$ | $L_{2-185}$ |
| Compound 5841 | $L_{1-204}$ | $L_{2-186}$ |
| Compound 5842 | $L_{1-204}$ | $L_{2-187}$ |
| Compound 5843 | $L_{1-204}$ | $L_{2-188}$ |
| Compound 5844 | $L_{1-204}$ | $L_{2-189}$ |
| Compound 5845 | $L_{1-204}$ | $L_{2-190}$ |
| Compound 5846 | $L_{1-204}$ | $L_{2-191}$ |
| Compound 5847 | $L_{1-204}$ | $L_{2-192}$ |
| Compound 5848 | $L_{1-204}$ | $L_{2-193}$ |
| Compound 5849 | $L_{1-204}$ | $L_{2-194}$ |
| Compound 5850 | $L_{1-204}$ | $L_{2-195}$ |
| Compound 5851 | $L_{1-204}$ | $L_{2-196}$ |
| Compound 5852 | $L_{1-204}$ | $L_{2-197}$ |
| Compound 5853 | $L_{1-204}$ | $L_{2-198}$ |
| Compound 5854 | $L_{1-204}$ | $L_{2-199}$ |
| Compound 5855 | $L_{1-204}$ | $L_{2-200}$ |
| Compound 5856 | $L_{1-204}$ | $L_{2-201}$ |
| Compound 5857 | $L_{1-204}$ | $L_{2-202}$ |
| Compound 5858 | $L_{1-204}$ | $L_{2-203}$ |
| Compound 5859 | $L_{1-204}$ | $L_{2-204}$ |
| Compound 5860 | $L_{1-204}$ | $L_{2-205}$ |
| Compound 5861 | $L_{1-204}$ | $L_{2-206}$ |
| Compound 5862 | $L_{1-204}$ | $L_{2-207}$ |
| Compound 5863 | $L_{1-204}$ | $L_{2-208}$ |
| Compound 5864 | $L_{1-204}$ | $L_{2-209}$ |
| Compound 5865 | $L_{1-204}$ | $L_{2-210}$ |
| Compound 5866 | $L_{1-204}$ | $L_{2-211}$ |
| Compound 5867 | $L_{1-204}$ | $L_{2-212}$ |
| Compound 5868 | $L_{1-204}$ | $L_{2-213}$ |
| Compound 5869 | $L_{1-204}$ | $L_{2-214}$ |
| Compound 5870 | $L_{1-204}$ | $L_{2-215}$ |
| Compound 5871 | $L_{1-204}$ | $L_{2-216}$ |
| Compound 5872 | $L_{1-204}$ | $L_{2-217}$ |
| Compound 5873 | $L_{1-204}$ | $L_{2-218}$ |
| Compound 5874 | $L_{1-204}$ | $L_{2-219}$ |
| Compound 5875 | $L_{1-204}$ | $L_{2-220}$ |
| Compound 5876 | $L_{1-204}$ | $L_{2-221}$ |
| Compound 5877 | $L_{1-204}$ | $L_{2-222}$ |
| Compound 5878 | $L_{1-204}$ | $L_{2-223}$ |
| Compound 5879 | $L_{1-204}$ | $L_{2-224}$ |
| Compound 5880 | $L_{1-204}$ | $L_{2-225}$ |
| Compound 5881 | $L_{1-204}$ | $L_{2-226}$ |
| Compound 5882 | $L_{1-204}$ | $L_{2-227}$ |
| Compound 5883 | $L_{1-204}$ | $L_{2-228}$ |
| Compound 5884 | $L_{1-204}$ | $L_{2-229}$ |
| Compound 5885 | $L_{1-204}$ | $L_{2-230}$ |
| Compound 5886 | $L_{1-204}$ | $L_{2-231}$ |
| Compound 5887 | $L_{1-204}$ | $L_{2-232}$ |
| Compound 5888 | $L_{1-204}$ | $L_{2-233}$ |
| Compound 5889 | $L_{1-204}$ | $L_{2-234}$ |
| Compound 5890 | $L_{1-204}$ | $L_{2-235}$ |
| Compound 5891 | $L_{1-204}$ | $L_{2-236}$ |
| Compound 5892 | $L_{1-204}$ | $L_{2-237}$ |
| Compound 5893 | $L_{1-204}$ | $L_{2-238}$ |
| Compound 5894 | $L_{1-204}$ | $L_{2-239}$ |
| Compound 5895 | $L_{1-204}$ | $L_{2-240}$ |
| Compound 5896 | $L_{1-204}$ | $L_{2-241}$ |
| Compound 5897 | $L_{1-204}$ | $L_{2-242}$ |
| Compound 5898 | $L_{1-204}$ | $L_{2-243}$ |
| Compound 5899 | $L_{1-204}$ | $L_{2-244}$ |
| Compound 5900 | $L_{1-204}$ | $L_{2-245}$ |
| Compound 5901 | $L_{1-204}$ | $L_{2-246}$ |
| Compound 5902 | $L_{1-204}$ | $L_{2-247}$ |
| Compound 5903 | $L_{1-204}$ | $L_{2-248}$ |
| Compound 5904 | $L_{1-204}$ | $L_{2-249}$ |
| Compound 5905 | $L_{1-204}$ | $L_{2-250}$ |
| Compound 5906 | $L_{1-204}$ | $L_{2-251}$ |
| Compound 5907 | $L_{1-204}$ | $L_{2-252}$ |
| Compound 5908 | $L_{1-204}$ | $L_{2-253}$ |
| Compound 5909 | $L_{1-204}$ | $L_{2-254}$ |

TABLE 1-continued

| | | |
|---|---|---|
| Compound 5910 | $L_{1-204}$ | $L_{2-255}$ |
| Compound 5911 | $L_{1-204}$ | $L_{2-256}$ |
| Compound 5912 | $L_{1-204}$ | $L_{2-257}$ |
| Compound 5913 | $L_{1-204}$ | $L_{2-258}$ |
| Compound 5914 | $L_{1-204}$ | $L_{2-259}$ |
| Compound 5915 | $L_{1-204}$ | $L_{2-260}$ |
| Compound 5916 | $L_{1-204}$ | $L_{2-261}$ |
| Compound 5917 | $L_{1-204}$ | $L_{2-262}$ |
| Compound 5918 | $L_{1-204}$ | $L_{2-263}$ |
| Compound 5919 | $L_{1-204}$ | $L_{2-264}$ |
| Compound 5920 | $L_{1-204}$ | $L_{2-265}$ |
| Compound 5921 | $L_{1-204}$ | $L_{2-266}$ |
| Compound 5922 | $L_{1-204}$ | $L_{2-267}$ |
| Compound 5923 | $L_{1-204}$ | $L_{2-268}$ |
| Compound 5924 | $L_{1-204}$ | $L_{2-269}$ |
| Compound 5925 | $L_{1-204}$ | $L_{2-270}$ |
| Compound 5926 | $L_{1-204}$ | $L_{2-271}$ |
| Compound 5927 | $L_{1-204}$ | $L_{2-272}$ |
| Compound 5928 | $L_{1-204}$ | $L_{2-273}$ |
| Compound 5929 | $L_{1-204}$ | $L_{2-274}$ |
| Compound 5930 | $L_{1-204}$ | $L_{2-275}$ |
| Compound 5931 | $L_{1-204}$ | $L_{2-276}$ |
| Compound 5932 | $L_{1-204}$ | $L_{2-277}$ |
| Compound 5933 | $L_{1-204}$ | $L_{2-278}$ |
| Compound 5934 | $L_{1-204}$ | $L_{2-279}$ |
| Compound 5935 | $L_{1-204}$ | $L_{2-280}$ |
| Compound 5936 | $L_{1-204}$ | $L_{2-281}$ |
| Compound 5937 | $L_{1-204}$ | $L_{2-282}$ |
| Compound 5938 | $L_{1-204}$ | $L_{2-283}$ |
| Compound 5939 | $L_{1-204}$ | $L_{2-284}$ |
| Compound 5940 | $L_{1-204}$ | $L_{2-285}$ |
| Compound 5941 | $L_{1-204}$ | $L_{2-286}$ |
| Compound 5942 | $L_{1-204}$ | $L_{2-287}$ |
| Compound 5943 | $L_{1-204}$ | $L_{2-288}$ |
| Compound 5944 | $L_{1-204}$ | $L_{2-289}$ |
| Compound 5945 | $L_{1-204}$ | $L_{2-290}$ |
| Compound 5946 | $L_{1-204}$ | $L_{2-291}$ |
| Compound 5947 | $L_{1-204}$ | $L_{2-292}$ |
| Compound 5948 | $L_{1-204}$ | $L_{2-293}$ |
| Compound 5949 | $L_{1-204}$ | $L_{2-294}$ |
| Compound 5950 | $L_{1-204}$ | $L_{2-295}$ |
| Compound 5951 | $L_{1-204}$ | $L_{2-296}$ |
| Compound 5952 | $L_{1-204}$ | $L_{2-297}$ |
| Compound 5953 | $L_{1-204}$ | $L_{2-298}$ |
| Compound 5954 | $L_{1-204}$ | $L_{2-299}$ |
| Compound 5955 | $L_{1-204}$ | $L_{2-300}$ |
| Compound 5956 | $L_{1-204}$ | $L_{2-301}$ |
| Compound 5957 | $L_{1-204}$ | $L_{2-302}$ |
| Compound 5958 | $L_{1-204}$ | $L_{2-303}$ |
| Compound 5959 | $L_{1-204}$ | $L_{2-304}$ |
| Compound 5960 | $L_{1-204}$ | $L_{2-305}$ |
| Compound 5961 | $L_{1-204}$ | $L_{2-306}$ |
| Compound 5962 | $L_{1-204}$ | $L_{2-307}$ |
| Compound 5963 | $L_{1-204}$ | $L_{2-308}$ |
| Compound 5964 | $L_{1-204}$ | $L_{2-309}$ |
| Compound 5965 | $L_{1-204}$ | $L_{2-310}$ |
| Compound 5966 | $L_{1-204}$ | $L_{2-311}$ |
| Compound 5967 | $L_{1-204}$ | $L_{2-312}$ |
| Compound 5968 | $L_{1-204}$ | $L_{2-313}$ |
| Compound 5969 | $L_{1-204}$ | $L_{2-314}$ |
| Compound 5970 | $L_{1-204}$ | $L_{2-315}$ |
| Compound 5971 | $L_{1-204}$ | $L_{2-316}$ |
| Compound 5972 | $L_{1-204}$ | $L_{2-317}$ |
| Compound 5973 | $L_{1-204}$ | $L_{2-318}$ |
| Compound 5974 | $L_{1-204}$ | $L_{2-319}$ |
| Compound 5975 | $L_{1-204}$ | $L_{2-320}$ |
| Compound 5976 | $L_{1-204}$ | $L_{2-321}$ |
| Compound 5977 | $L_{1-204}$ | $L_{2-322}$ |
| Compound 5978 | $L_{1-204}$ | $L_{2-323}$ |
| Compound 5979 | $L_{1-204}$ | $L_{2-324}$ |
| Compound 5980 | $L_{1-204}$ | $L_{2-325}$ |
| Compound 5981 | $L_{1-204}$ | $L_{2-326}$ |
| Compound 5982 | $L_{1-204}$ | $L_{2-327}$ |
| Compound 5983 | $L_{1-204}$ | $L_{2-328}$ |
| Compound 5984 | $L_{1-204}$ | $L_{2-329}$ |
| Compound 5985 | $L_{1-204}$ | $L_{2-330}$ |
| Compound 5986 | $L_{1-204}$ | $L_{2-331}$ |
| Compound 5987 | $L_{1-204}$ | $L_{2-332}$ |
| Compound 5988 | $L_{1-204}$ | $L_{2-333}$ |
| Compound 5989 | $L_{1-204}$ | $L_{2-334}$ |

TABLE 1-continued

| | | |
|---|---|---|
| Compound 5990 | $L_{1-204}$ | $L_{2-335}$ |
| Compound 5991 | $L_{1-204}$ | $L_{2-336}$ |
| Compound 5992 | $L_{1-204}$ | $L_{2-337}$ |
| Compound 5993 | $L_{1-204}$ | $L_{2-338}$ |
| Compound 5994 | $L_{1-204}$ | $L_{2-339}$ |
| Compound 5995 | $L_{1-204}$ | $L_{2-340}$ |
| Compound 5996 | $L_{1-204}$ | $L_{2-341}$ |
| Compound 5997 | $L_{1-204}$ | $L_{2-342}$ |
| Compound 5998 | $L_{1-204}$ | $L_{2-343}$ |
| Compound 5999 | $L_{1-204}$ | $L_{2-344}$ |
| Compound 6000 | $L_{1-204}$ | $L_{2-345}$ |
| Compound 6001 | $L_{1-204}$ | $L_{2-346}$ |
| Compound 6002 | $L_{1-204}$ | $L_{2-347}$ |
| Compound 6003 | $L_{1-204}$ | $L_{2-348}$ |
| Compound 6004 | $L_{1-204}$ | $L_{2-349}$ |
| Compound 6005 | $L_{1-204}$ | $L_{2-350}$ |
| Compound 6006 | $L_{1-204}$ | $L_{2-351}$ |
| Compound 6007 | $L_{1-204}$ | $L_{2-352}$ |
| Compound 6008 | $L_{1-204}$ | $L_{2-353}$ |
| Compound 6009 | $L_{1-204}$ | $L_{2-354}$ |
| Compound 6010 | $L_{1-204}$ | $L_{2-355}$ |
| Compound 6011 | $L_{1-204}$ | $L_{2-356}$ |
| Compound 6012 | $L_{1-204}$ | $L_{2-357}$ |
| Compound 6013 | $L_{1-204}$ | $L_{2-358}$ |
| Compound 6014 | $L_{1-204}$ | $L_{2-359}$ |
| Compound 6015 | $L_{1-204}$ | $L_{2-360}$ |
| Compound 6016 | $L_{1-204}$ | $L_{2-361}$ |
| Compound 6017 | $L_{1-204}$ | $L_{2-362}$ |
| Compound 6018 | $L_{1-204}$ | $L_{2-363}$ |
| Compound 6019 | $L_{1-204}$ | $L_{2-364}$ |
| Compound 6020 | $L_{1-204}$ | $L_{2-365}$ |
| Compound 6021 | $L_{1-204}$ | $L_{2-366}$ |
| Compound 6022 | $L_{1-204}$ | $L_{2-367}$ |
| Compound 6023 | $L_{1-204}$ | $L_{2-368}$ |
| Compound 6024 | $L_{1-204}$ | $L_{2-369}$ |
| Compound 6025 | $L_{1-204}$ | $L_{2-370}$ |
| Compound 6026 | $L_{1-204}$ | $L_{2-371}$ |
| Compound 6027 | $L_{1-204}$ | $L_{2-372}$ |
| Compound 6028 | $L_{1-204}$ | $L_{2-373}$ |
| Compound 6029 | $L_{1-204}$ | $L_{2-374}$ |
| Compound 6030 | $L_{1-204}$ | $L_{2-375}$ |
| Compound 6031 | $L_{1-204}$ | $L_{2-376}$ |
| Compound 6032 | $L_{1-205}$ | $L_{2-377}$ |
| Compound 6033 | $L_{1-205}$ | $L_{2-1}$ |
| Compound 6034 | $L_{1-205}$ | $L_{2-2}$ |
| Compound 6035 | $L_{1-205}$ | $L_{2-3}$ |
| Compound 6036 | $L_{1-205}$ | $L_{2-4}$ |
| Compound 6037 | $L_{1-205}$ | $L_{2-5}$ |
| Compound 6038 | $L_{1-205}$ | $L_{2-6}$ |
| Compound 6039 | $L_{1-205}$ | $L_{2-7}$ |
| Compound 6040 | $L_{1-205}$ | $L_{2-8}$ |
| Compound 6041 | $L_{1-205}$ | $L_{2-9}$ |
| Compound 6042 | $L_{1-205}$ | $L_{2-10}$ |
| Compound 6043 | $L_{1-205}$ | $L_{2-11}$ |
| Compound 6044 | $L_{1-205}$ | $L_{2-12}$ |
| Compound 6045 | $L_{1-205}$ | $L_{2-13}$ |
| Compound 6046 | $L_{1-205}$ | $L_{2-14}$ |
| Compound 6047 | $L_{1-205}$ | $L_{2-15}$ |
| Compound 6048 | $L_{1-205}$ | $L_{2-16}$ |
| Compound 6049 | $L_{1-205}$ | $L_{2-17}$ |
| Compound 6050 | $L_{1-205}$ | $L_{2-18}$ |
| Compound 6051 | $L_{1-205}$ | $L_{2-19}$ |
| Compound 6052 | $L_{1-205}$ | $L_{2-20}$ |
| Compound 6053 | $L_{1-205}$ | $L_{2-21}$ |
| Compound 6054 | $L_{1-205}$ | $L_{2-22}$ |
| Compound 6055 | $L_{1-205}$ | $L_{2-23}$ |
| Compound 6056 | $L_{1-205}$ | $L_{2-24}$ |
| Compound 6057 | $L_{1-205}$ | $L_{2-25}$ |
| Compound 6058 | $L_{1-205}$ | $L_{2-26}$ |
| Compound 6059 | $L_{1-205}$ | $L_{2-27}$ |
| Compound 6060 | $L_{1-205}$ | $L_{2-28}$ |
| Compound 6061 | $L_{1-205}$ | $L_{2-29}$ |
| Compound 6062 | $L_{1-205}$ | $L_{2-30}$ |
| Compound 6063 | $L_{1-205}$ | $L_{2-31}$ |
| Compound 6064 | $L_{1-205}$ | $L_{2-32}$ |
| Compound 6065 | $L_{1-205}$ | $L_{2-33}$ |
| Compound 6066 | $L_{1-205}$ | $L_{2-34}$ |
| Compound 6067 | $L_{1-205}$ | $L_{2-35}$ |
| Compound 6068 | $L_{1-205}$ | $L_{2-36}$ |
| Compound 6069 | $L_{1-205}$ | $L_{2-37}$ |

TABLE 1-continued

| | | |
|---|---|---|
| Compound 6070 | $L_{1-205}$ | $L_{2-38}$ |
| Compound 6071 | $L_{1-205}$ | $L_{2-39}$ |
| Compound 6072 | $L_{1-205}$ | $L_{2-40}$ |
| Compound 6073 | $L_{1-205}$ | $L_{2-41}$ |
| Compound 6074 | $L_{1-205}$ | $L_{2-42}$ |
| Compound 6075 | $L_{1-205}$ | $L_{2-43}$ |
| Compound 6076 | $L_{1-205}$ | $L_{2-44}$ |
| Compound 6077 | $L_{1-205}$ | $L_{2-45}$ |
| Compound 6078 | $L_{1-205}$ | $L_{2-46}$ |
| Compound 6079 | $L_{1-205}$ | $L_{2-47}$ |
| Compound 6080 | $L_{1-205}$ | $L_{2-48}$ |
| Compound 6081 | $L_{1-205}$ | $L_{2-49}$ |
| Compound 6082 | $L_{1-205}$ | $L_{2-50}$ |
| Compound 6083 | $L_{1-205}$ | $L_{2-51}$ |
| Compound 6084 | $L_{1-205}$ | $L_{2-52}$ |
| Compound 6085 | $L_{1-205}$ | $L_{2-53}$ |
| Compound 6086 | $L_{1-205}$ | $L_{2-54}$ |
| Compound 6087 | $L_{1-205}$ | $L_{2-55}$ |
| Compound 6088 | $L_{1-205}$ | $L_{2-56}$ |
| Compound 6089 | $L_{1-205}$ | $L_{2-57}$ |
| Compound 6090 | $L_{1-205}$ | $L_{2-58}$ |
| Compound 6091 | $L_{1-205}$ | $L_{2-59}$ |
| Compound 6092 | $L_{1-205}$ | $L_{2-60}$ |
| Compound 6093 | $L_{1-205}$ | $L_{2-61}$ |
| Compound 6094 | $L_{1-205}$ | $L_{2-62}$ |
| Compound 6095 | $L_{1-205}$ | $L_{2-63}$ |
| Compound 6096 | $L_{1-205}$ | $L_{2-64}$ |
| Compound 6097 | $L_{1-205}$ | $L_{2-65}$ |
| Compound 6098 | $L_{1-205}$ | $L_{2-66}$ |
| Compound 6099 | $L_{1-205}$ | $L_{2-67}$ |
| Compound 6100 | $L_{1-205}$ | $L_{2-68}$ |
| Compound 6101 | $L_{1-205}$ | $L_{2-69}$ |
| Compound 6102 | $L_{1-205}$ | $L_{2-70}$ |
| Compound 6103 | $L_{1-205}$ | $L_{2-71}$ |
| Compound 6104 | $L_{1-205}$ | $L_{2-72}$ |
| Compound 6105 | $L_{1-205}$ | $L_{2-73}$ |
| Compound 6106 | $L_{1-205}$ | $L_{2-74}$ |
| Compound 6107 | $L_{1-205}$ | $L_{2-75}$ |
| Compound 6108 | $L_{1-205}$ | $L_{2-76}$ |
| Compound 6109 | $L_{1-205}$ | $L_{2-77}$ |
| Compound 6110 | $L_{1-205}$ | $L_{2-78}$ |
| Compound 6111 | $L_{1-205}$ | $L_{2-79}$ |
| Compound 6112 | $L_{1-205}$ | $L_{2-80}$ |
| Compound 6113 | $L_{1-205}$ | $L_{2-81}$ |
| Compound 6114 | $L_{1-205}$ | $L_{2-82}$ |
| Compound 6115 | $L_{1-205}$ | $L_{2-83}$ |
| Compound 6116 | $L_{1-205}$ | $L_{2-84}$ |
| Compound 6117 | $L_{1-205}$ | $L_{2-85}$ |
| Compound 6118 | $L_{1-205}$ | $L_{2-86}$ |
| Compound 6119 | $L_{1-205}$ | $L_{2-87}$ |
| Compound 6120 | $L_{1-205}$ | $L_{2-88}$ |
| Compound 6121 | $L_{1-205}$ | $L_{2-89}$ |
| Compound 6122 | $L_{1-205}$ | $L_{2-90}$ |
| Compound 6123 | $L_{1-205}$ | $L_{2-91}$ |
| Compound 6124 | $L_{1-205}$ | $L_{2-92}$ |
| Compound 6125 | $L_{1-205}$ | $L_{2-93}$ |
| Compound 6126 | $L_{1-205}$ | $L_{2-94}$ |
| Compound 6127 | $L_{1-205}$ | $L_{2-95}$ |
| Compound 6128 | $L_{1-205}$ | $L_{2-96}$ |
| Compound 6129 | $L_{1-205}$ | $L_{2-97}$ |
| Compound 6130 | $L_{1-205}$ | $L_{2-98}$ |
| Compound 6131 | $L_{1-205}$ | $L_{2-99}$ |
| Compound 6132 | $L_{1-205}$ | $L_{2-100}$ |
| Compound 6133 | $L_{1-205}$ | $L_{2-101}$ |
| Compound 6134 | $L_{1-205}$ | $L_{2-102}$ |
| Compound 6135 | $L_{1-205}$ | $L_{2-103}$ |
| Compound 6136 | $L_{1-205}$ | $L_{2-104}$ |
| Compound 6137 | $L_{1-205}$ | $L_{2-105}$ |
| Compound 6138 | $L_{1-205}$ | $L_{2-106}$ |
| Compound 6139 | $L_{1-205}$ | $L_{2-107}$ |
| Compound 6140 | $L_{1-205}$ | $L_{2-108}$ |
| Compound 6141 | $L_{1-205}$ | $L_{2-109}$ |
| Compound 6142 | $L_{1-205}$ | $L_{2-110}$ |
| Compound 6143 | $L_{1-205}$ | $L_{2-111}$ |
| Compound 6144 | $L_{1-205}$ | $L_{2-112}$ |
| Compound 6145 | $L_{1-205}$ | $L_{2-113}$ |
| Compound 6146 | $L_{1-205}$ | $L_{2-114}$ |
| Compound 6147 | $L_{1-205}$ | $L_{2-115}$ |
| Compound 6148 | $L_{1-205}$ | $L_{2-116}$ |
| Compound 6149 | $L_{1-205}$ | $L_{2-117}$ |

TABLE 1-continued

| | | |
|---|---|---|
| Compound 6150 | $L_{1-205}$ | $L_{2-118}$ |
| Compound 6151 | $L_{1-205}$ | $L_{2-119}$ |
| Compound 6152 | $L_{1-205}$ | $L_{2-120}$ |
| Compound 6153 | $L_{1-205}$ | $L_{2-121}$ |
| Compound 6154 | $L_{1-205}$ | $L_{2-122}$ |
| Compound 6155 | $L_{1-205}$ | $L_{2-123}$ |
| Compound 6156 | $L_{1-205}$ | $L_{2-124}$ |
| Compound 6157 | $L_{1-205}$ | $L_{2-125}$ |
| Compound 6158 | $L_{1-205}$ | $L_{2-126}$ |
| Compound 6159 | $L_{1-205}$ | $L_{2-127}$ |
| Compound 6160 | $L_{1-205}$ | $L_{2-128}$ |
| Compound 6161 | $L_{1-205}$ | $L_{2-129}$ |
| Compound 6162 | $L_{1-205}$ | $L_{2-130}$ |
| Compound 6163 | $L_{1-205}$ | $L_{2-131}$ |
| Compound 6164 | $L_{1-205}$ | $L_{2-132}$ |
| Compound 6165 | $L_{1-205}$ | $L_{2-133}$ |
| Compound 6166 | $L_{1-205}$ | $L_{2-134}$ |
| Compound 6167 | $L_{1-205}$ | $L_{2-135}$ |
| Compound 6168 | $L_{1-205}$ | $L_{2-136}$ |
| Compound 6169 | $L_{1-205}$ | $L_{2-137}$ |
| Compound 6170 | $L_{1-205}$ | $L_{2-138}$ |
| Compound 6171 | $L_{1-205}$ | $L_{2-139}$ |
| Compound 6172 | $L_{1-205}$ | $L_{2-140}$ |
| Compound 6173 | $L_{1-205}$ | $L_{2-141}$ |
| Compound 6174 | $L_{1-205}$ | $L_{2-142}$ |
| Compound 6175 | $L_{1-205}$ | $L_{2-143}$ |
| Compound 6176 | $L_{1-205}$ | $L_{2-144}$ |
| Compound 6177 | $L_{1-205}$ | $L_{2-145}$ |
| Compound 6178 | $L_{1-205}$ | $L_{2-146}$ |
| Compound 6179 | $L_{1-205}$ | $L_{2-147}$ |
| Compound 6180 | $L_{1-205}$ | $L_{2-148}$ |
| Compound 6181 | $L_{1-205}$ | $L_{2-149}$ |
| Compound 6182 | $L_{1-205}$ | $L_{2-150}$ |
| Compound 6183 | $L_{1-205}$ | $L_{2-151}$ |
| Compound 6184 | $L_{1-205}$ | $L_{2-152}$ |
| Compound 6185 | $L_{1-205}$ | $L_{2-153}$ |
| Compound 6186 | $L_{1-205}$ | $L_{2-154}$ |
| Compound 6187 | $L_{1-205}$ | $L_{2-155}$ |
| Compound 6188 | $L_{1-205}$ | $L_{2-156}$ |
| Compound 6189 | $L_{1-205}$ | $L_{2-157}$ |
| Compound 6190 | $L_{1-205}$ | $L_{2-158}$ |
| Compound 6191 | $L_{1-205}$ | $L_{2-159}$ |
| Compound 6192 | $L_{1-205}$ | $L_{2-160}$ |
| Compound 6193 | $L_{1-205}$ | $L_{2-161}$ |
| Compound 6194 | $L_{1-205}$ | $L_{2-162}$ |
| Compound 6195 | $L_{1-205}$ | $L_{2-163}$ |
| Compound 6196 | $L_{1-205}$ | $L_{2-164}$ |
| Compound 6197 | $L_{1-205}$ | $L_{2-165}$ |
| Compound 6198 | $L_{1-205}$ | $L_{2-166}$ |
| Compound 6199 | $L_{1-205}$ | $L_{2-167}$ |
| Compound 6200 | $L_{1-205}$ | $L_{2-168}$ |
| Compound 6201 | $L_{1-205}$ | $L_{2-169}$ |
| Compound 6202 | $L_{1-205}$ | $L_{2-170}$ |
| Compound 6203 | $L_{1-205}$ | $L_{2-171}$ |
| Compound 6204 | $L_{1-205}$ | $L_{2-172}$ |
| Compound 6205 | $L_{1-205}$ | $L_{2-173}$ |
| Compound 6206 | $L_{1-205}$ | $L_{2-174}$ |
| Compound 6207 | $L_{1-205}$ | $L_{2-175}$ |
| Compound 6208 | $L_{1-205}$ | $L_{2-176}$ |
| Compound 6209 | $L_{1-205}$ | $L_{2-177}$ |
| Compound 6210 | $L_{1-205}$ | $L_{2-178}$ |
| Compound 6211 | $L_{1-205}$ | $L_{2-179}$ |
| Compound 6212 | $L_{1-205}$ | $L_{2-180}$ |
| Compound 6213 | $L_{1-205}$ | $L_{2-181}$ |
| Compound 6214 | $L_{1-205}$ | $L_{2-182}$ |
| Compound 6215 | $L_{1-205}$ | $L_{2-183}$ |
| Compound 6216 | $L_{1-205}$ | $L_{2-184}$ |
| Compound 6217 | $L_{1-205}$ | $L_{2-185}$ |
| Compound 6218 | $L_{1-205}$ | $L_{2-186}$ |
| Compound 6219 | $L_{1-205}$ | $L_{2-187}$ |
| Compound 6220 | $L_{1-205}$ | $L_{2-188}$ |
| Compound 6221 | $L_{1-205}$ | $L_{2-189}$ |
| Compound 6222 | $L_{1-205}$ | $L_{2-190}$ |
| Compound 6223 | $L_{1-205}$ | $L_{2-191}$ |
| Compound 6224 | $L_{1-205}$ | $L_{2-192}$ |
| Compound 6225 | $L_{1-205}$ | $L_{2-193}$ |
| Compound 6226 | $L_{1-205}$ | $L_{2-194}$ |
| Compound 6227 | $L_{1-205}$ | $L_{2-195}$ |
| Compound 6228 | $L_{1-205}$ | $L_{2-196}$ |
| Compound 6229 | $L_{1-205}$ | $L_{2-197}$ |

TABLE 1-continued

| | | |
|---|---|---|
| Compound 6230 | $L_{1-205}$ | $L_{2-198}$ |
| Compound 6231 | $L_{1-205}$ | $L_{2-199}$ |
| Compound 6232 | $L_{1-205}$ | $L_{2-200}$ |
| Compound 6233 | $L_{1-205}$ | $L_{2-201}$ |
| Compound 6234 | $L_{1-205}$ | $L_{2-202}$ |
| Compound 6235 | $L_{1-205}$ | $L_{2-203}$ |
| Compound 6236 | $L_{1-205}$ | $L_{2-204}$ |
| Compound 6237 | $L_{1-205}$ | $L_{2-205}$ |
| Compound 6238 | $L_{1-205}$ | $L_{2-206}$ |
| Compound 6239 | $L_{1-205}$ | $L_{2-207}$ |
| Compound 6240 | $L_{1-205}$ | $L_{2-208}$ |
| Compound 6241 | $L_{1-205}$ | $L_{2-209}$ |
| Compound 6242 | $L_{1-205}$ | $L_{2-210}$ |
| Compound 6243 | $L_{1-205}$ | $L_{2-211}$ |
| Compound 6244 | $L_{1-205}$ | $L_{2-212}$ |
| Compound 6245 | $L_{1-205}$ | $L_{2-213}$ |
| Compound 6246 | $L_{1-205}$ | $L_{2-214}$ |
| Compound 6247 | $L_{1-205}$ | $L_{2-215}$ |
| Compound 6248 | $L_{1-205}$ | $L_{2-216}$ |
| Compound 6249 | $L_{1-205}$ | $L_{2-217}$ |
| Compound 6250 | $L_{1-205}$ | $L_{2-218}$ |
| Compound 6251 | $L_{1-205}$ | $L_{2-219}$ |
| Compound 6252 | $L_{1-205}$ | $L_{2-220}$ |
| Compound 6253 | $L_{1-205}$ | $L_{2-221}$ |
| Compound 6254 | $L_{1-205}$ | $L_{2-222}$ |
| Compound 6255 | $L_{1-205}$ | $L_{2-223}$ |
| Compound 6256 | $L_{1-205}$ | $L_{2-224}$ |
| Compound 6257 | $L_{1-205}$ | $L_{2-225}$ |
| Compound 6258 | $L_{1-205}$ | $L_{2-226}$ |
| Compound 6259 | $L_{1-205}$ | $L_{2-227}$ |
| Compound 6260 | $L_{1-205}$ | $L_{2-228}$ |
| Compound 6261 | $L_{1-205}$ | $L_{2-229}$ |
| Compound 6262 | $L_{1-205}$ | $L_{2-230}$ |
| Compound 6263 | $L_{1-205}$ | $L_{2-231}$ |
| Compound 6264 | $L_{1-205}$ | $L_{2-232}$ |
| Compound 6265 | $L_{1-205}$ | $L_{2-233}$ |
| Compound 6266 | $L_{1-205}$ | $L_{2-234}$ |
| Compound 6267 | $L_{1-205}$ | $L_{2-235}$ |
| Compound 6268 | $L_{1-205}$ | $L_{2-236}$ |
| Compound 6269 | $L_{1-205}$ | $L_{2-237}$ |
| Compound 6270 | $L_{1-205}$ | $L_{2-238}$ |
| Compound 6271 | $L_{1-205}$ | $L_{2-239}$ |
| Compound 6272 | $L_{1-205}$ | $L_{2-240}$ |
| Compound 6273 | $L_{1-205}$ | $L_{2-241}$ |
| Compound 6274 | $L_{1-205}$ | $L_{2-242}$ |
| Compound 6275 | $L_{1-205}$ | $L_{2-243}$ |
| Compound 6276 | $L_{1-205}$ | $L_{2-244}$ |
| Compound 6277 | $L_{1-205}$ | $L_{2-245}$ |
| Compound 6278 | $L_{1-205}$ | $L_{2-246}$ |
| Compound 6279 | $L_{1-205}$ | $L_{2-247}$ |
| Compound 6280 | $L_{1-205}$ | $L_{2-248}$ |
| Compound 6281 | $L_{1-205}$ | $L_{2-249}$ |
| Compound 6282 | $L_{1-205}$ | $L_{2-250}$ |
| Compound 6283 | $L_{1-205}$ | $L_{2-251}$ |
| Compound 6284 | $L_{1-205}$ | $L_{2-252}$ |
| Compound 6285 | $L_{1-205}$ | $L_{2-253}$ |
| Compound 6286 | $L_{1-205}$ | $L_{2-254}$ |
| Compound 6287 | $L_{1-205}$ | $L_{2-255}$ |
| Compound 6288 | $L_{1-205}$ | $L_{2-256}$ |
| Compound 6289 | $L_{1-205}$ | $L_{2-257}$ |
| Compound 6290 | $L_{1-205}$ | $L_{2-258}$ |
| Compound 6291 | $L_{1-205}$ | $L_{2-259}$ |
| Compound 6292 | $L_{1-205}$ | $L_{2-260}$ |
| Compound 6293 | $L_{1-205}$ | $L_{2-261}$ |
| Compound 6294 | $L_{1-205}$ | $L_{2-262}$ |
| Compound 6295 | $L_{1-205}$ | $L_{2-263}$ |
| Compound 6296 | $L_{1-205}$ | $L_{2-264}$ |
| Compound 6297 | $L_{1-205}$ | $L_{2-265}$ |
| Compound 6298 | $L_{1-205}$ | $L_{2-266}$ |
| Compound 6299 | $L_{1-205}$ | $L_{2-267}$ |
| Compound 6300 | $L_{1-205}$ | $L_{2-268}$ |
| Compound 6301 | $L_{1-205}$ | $L_{2-269}$ |
| Compound 6302 | $L_{1-205}$ | $L_{2-270}$ |
| Compound 6303 | $L_{1-205}$ | $L_{2-271}$ |
| Compound 6304 | $L_{1-205}$ | $L_{2-272}$ |
| Compound 6305 | $L_{1-205}$ | $L_{2-273}$ |
| Compound 6306 | $L_{1-205}$ | $L_{2-274}$ |
| Compound 6307 | $L_{1-205}$ | $L_{2-275}$ |
| Compound 6308 | $L_{1-205}$ | $L_{2-276}$ |
| Compound 6309 | $L_{1-205}$ | $L_{2-277}$ |

TABLE 1-continued

| | | |
|---|---|---|
| Compound 6310 | $L_{1-205}$ | $L_{2-278}$ |
| Compound 6311 | $L_{1-205}$ | $L_{2-279}$ |
| Compound 6312 | $L_{1-205}$ | $L_{2-280}$ |
| Compound 6313 | $L_{1-205}$ | $L_{2-281}$ |
| Compound 6314 | $L_{1-205}$ | $L_{2-282}$ |
| Compound 6315 | $L_{1-205}$ | $L_{2-283}$ |
| Compound 6316 | $L_{1-205}$ | $L_{2-284}$ |
| Compound 6317 | $L_{1-205}$ | $L_{2-285}$ |
| Compound 6318 | $L_{1-205}$ | $L_{2-286}$ |
| Compound 6319 | $L_{1-205}$ | $L_{2-287}$ |
| Compound 6320 | $L_{1-205}$ | $L_{2-288}$ |
| Compound 6321 | $L_{1-205}$ | $L_{2-289}$ |
| Compound 6322 | $L_{1-205}$ | $L_{2-290}$ |
| Compound 6323 | $L_{1-205}$ | $L_{2-291}$ |
| Compound 6324 | $L_{1-205}$ | $L_{2-292}$ |
| Compound 6325 | $L_{1-205}$ | $L_{2-293}$ |
| Compound 6326 | $L_{1-205}$ | $L_{2-294}$ |
| Compound 6327 | $L_{1-205}$ | $L_{2-295}$ |
| Compound 6328 | $L_{1-205}$ | $L_{2-296}$ |
| Compound 6329 | $L_{1-205}$ | $L_{2-297}$ |
| Compound 6330 | $L_{1-205}$ | $L_{2-298}$ |
| Compound 6331 | $L_{1-205}$ | $L_{2-299}$ |
| Compound 6332 | $L_{1-205}$ | $L_{2-300}$ |
| Compound 6333 | $L_{1-205}$ | $L_{2-301}$ |
| Compound 6334 | $L_{1-205}$ | $L_{2-302}$ |
| Compound 6335 | $L_{1-205}$ | $L_{2-303}$ |
| Compound 6336 | $L_{1-205}$ | $L_{2-304}$ |
| Compound 6337 | $L_{1-205}$ | $L_{2-305}$ |
| Compound 6338 | $L_{1-205}$ | $L_{2-306}$ |
| Compound 6339 | $L_{1-205}$ | $L_{2-307}$ |
| Compound 6340 | $L_{1-205}$ | $L_{2-308}$ |
| Compound 6341 | $L_{1-205}$ | $L_{2-309}$ |
| Compound 6342 | $L_{1-205}$ | $L_{2-310}$ |
| Compound 6343 | $L_{1-205}$ | $L_{2-311}$ |
| Compound 6344 | $L_{1-205}$ | $L_{2-312}$ |
| Compound 6345 | $L_{1-205}$ | $L_{2-313}$ |
| Compound 6346 | $L_{1-205}$ | $L_{2-314}$ |
| Compound 6347 | $L_{1-205}$ | $L_{2-315}$ |
| Compound 6348 | $L_{1-205}$ | $L_{2-316}$ |
| Compound 6349 | $L_{1-205}$ | $L_{2-317}$ |
| Compound 6350 | $L_{1-205}$ | $L_{2-318}$ |
| Compound 6351 | $L_{1-205}$ | $L_{2-319}$ |
| Compound 6352 | $L_{1-205}$ | $L_{2-320}$ |
| Compound 6353 | $L_{1-205}$ | $L_{2-321}$ |
| Compound 6354 | $L_{1-205}$ | $L_{2-322}$ |
| Compound 6355 | $L_{1-205}$ | $L_{2-323}$ |
| Compound 6356 | $L_{1-205}$ | $L_{2-324}$ |
| Compound 6357 | $L_{1-205}$ | $L_{2-325}$ |
| Compound 6358 | $L_{1-205}$ | $L_{2-326}$ |
| Compound 6359 | $L_{1-205}$ | $L_{2-327}$ |
| Compound 6360 | $L_{1-205}$ | $L_{2-328}$ |
| Compound 6361 | $L_{1-205}$ | $L_{2-329}$ |
| Compound 6362 | $L_{1-205}$ | $L_{2-330}$ |
| Compound 6363 | $L_{1-205}$ | $L_{2-331}$ |
| Compound 6364 | $L_{1-205}$ | $L_{2-332}$ |
| Compound 6365 | $L_{1-205}$ | $L_{2-333}$ |
| Compound 6366 | $L_{1-205}$ | $L_{2-334}$ |
| Compound 6367 | $L_{1-205}$ | $L_{2-335}$ |
| Compound 6368 | $L_{1-205}$ | $L_{2-336}$ |
| Compound 6369 | $L_{1-205}$ | $L_{2-337}$ |
| Compound 6370 | $L_{1-205}$ | $L_{2-338}$ |
| Compound 6371 | $L_{1-205}$ | $L_{2-339}$ |
| Compound 6372 | $L_{1-205}$ | $L_{2-340}$ |
| Compound 6373 | $L_{1-205}$ | $L_{2-341}$ |
| Compound 6374 | $L_{1-205}$ | $L_{2-342}$ |
| Compound 6375 | $L_{1-205}$ | $L_{2-343}$ |
| Compound 6376 | $L_{1-205}$ | $L_{2-344}$ |
| Compound 6377 | $L_{1-205}$ | $L_{2-345}$ |
| Compound 6378 | $L_{1-205}$ | $L_{2-346}$ |
| Compound 6379 | $L_{1-205}$ | $L_{2-347}$ |
| Compound 6380 | $L_{1-205}$ | $L_{2-348}$ |
| Compound 6381 | $L_{1-205}$ | $L_{2-349}$ |
| Compound 6382 | $L_{1-205}$ | $L_{2-350}$ |
| Compound 6383 | $L_{1-205}$ | $L_{2-351}$ |
| Compound 6384 | $L_{1-205}$ | $L_{2-352}$ |
| Compound 6385 | $L_{1-205}$ | $L_{2-353}$ |
| Compound 6386 | $L_{1-205}$ | $L_{2-354}$ |
| Compound 6387 | $L_{1-205}$ | $L_{2-355}$ |
| Compound 6388 | $L_{1-205}$ | $L_{2-356}$ |
| Compound 6389 | $L_{1-205}$ | $L_{2-357}$ |

TABLE 1-continued

| | | |
|---|---|---|
| Compound 6390 | $L_{1-205}$ | $L_{2-358}$ |
| Compound 6391 | $L_{1-205}$ | $L_{2-359}$ |
| Compound 6392 | $L_{1-205}$ | $L_{2-360}$ |
| Compound 6393 | $L_{1-205}$ | $L_{2-361}$ |
| Compound 6394 | $L_{1-205}$ | $L_{2-362}$ |
| Compound 6395 | $L_{1-205}$ | $L_{2-363}$ |
| Compound 6396 | $L_{1-205}$ | $L_{2-364}$ |
| Compound 6397 | $L_{1-205}$ | $L_{2-365}$ |
| Compound 6398 | $L_{1-205}$ | $L_{2-366}$ |
| Compound 6399 | $L_{1-205}$ | $L_{2-367}$ |
| Compound 6400 | $L_{1-205}$ | $L_{2-368}$ |
| Compound 6401 | $L_{1-205}$ | $L_{2-369}$ |
| Compound 6402 | $L_{1-205}$ | $L_{2-370}$ |
| Compound 6403 | $L_{1-205}$ | $L_{2-371}$ |
| Compound 6404 | $L_{1-205}$ | $L_{2-372}$ |
| Compound 6405 | $L_{1-205}$ | $L_{2-373}$ |
| Compound 6406 | $L_{1-205}$ | $L_{2-374}$ |
| Compound 6407 | $L_{1-205}$ | $L_{2-375}$ |
| Compound 6408 | $L_{1-205}$ | $L_{2-376}$ |
| Compound 6409 | $L_{1-206}$ | $L_{2-377}$ |
| Compound 6410 | $L_{1-206}$ | $L_{2-1}$ |
| Compound 6411 | $L_{1-206}$ | $L_{2-2}$ |
| Compound 6412 | $L_{1-206}$ | $L_{2-3}$ |
| Compound 6413 | $L_{1-206}$ | $L_{2-4}$ |
| Compound 6414 | $L_{1-206}$ | $L_{2-5}$ |
| Compound 6415 | $L_{1-206}$ | $L_{2-6}$ |
| Compound 6416 | $L_{1-206}$ | $L_{2-7}$ |
| Compound 6417 | $L_{1-206}$ | $L_{2-8}$ |
| Compound 6418 | $L_{1-206}$ | $L_{2-9}$ |
| Compound 6419 | $L_{1-206}$ | $L_{2-10}$ |
| Compound 6420 | $L_{1-206}$ | $L_{2-11}$ |
| Compound 6421 | $L_{1-206}$ | $L_{2-12}$ |
| Compound 6422 | $L_{1-206}$ | $L_{2-13}$ |
| Compound 6423 | $L_{1-206}$ | $L_{2-14}$ |
| Compound 6424 | $L_{1-206}$ | $L_{2-15}$ |
| Compound 6425 | $L_{1-206}$ | $L_{2-16}$ |
| Compound 6426 | $L_{1-206}$ | $L_{2-17}$ |
| Compound 6427 | $L_{1-206}$ | $L_{2-18}$ |
| Compound 6428 | $L_{1-206}$ | $L_{2-19}$ |
| Compound 6429 | $L_{1-206}$ | $L_{2-20}$ |
| Compound 6430 | $L_{1-206}$ | $L_{2-21}$ |
| Compound 6431 | $L_{1-206}$ | $L_{2-22}$ |
| Compound 6432 | $L_{1-206}$ | $L_{2-23}$ |
| Compound 6433 | $L_{1-206}$ | $L_{2-24}$ |
| Compound 6434 | $L_{1-206}$ | $L_{2-25}$ |
| Compound 6435 | $L_{1-206}$ | $L_{2-26}$ |
| Compound 6436 | $L_{1-206}$ | $L_{2-27}$ |
| Compound 6437 | $L_{1-206}$ | $L_{2-28}$ |
| Compound 6438 | $L_{1-206}$ | $L_{2-29}$ |
| Compound 6439 | $L_{1-206}$ | $L_{2-30}$ |
| Compound 6440 | $L_{1-206}$ | $L_{2-31}$ |
| Compound 6441 | $L_{1-206}$ | $L_{2-32}$ |
| Compound 6442 | $L_{1-206}$ | $L_{2-33}$ |
| Compound 6443 | $L_{1-206}$ | $L_{2-34}$ |
| Compound 6444 | $L_{1-206}$ | $L_{2-35}$ |
| Compound 6445 | $L_{1-206}$ | $L_{2-36}$ |
| Compound 6446 | $L_{1-206}$ | $L_{2-37}$ |
| Compound 6447 | $L_{1-206}$ | $L_{2-38}$ |
| Compound 6448 | $L_{1-206}$ | $L_{2-39}$ |
| Compound 6449 | $L_{1-206}$ | $L_{2-40}$ |
| Compound 6450 | $L_{1-206}$ | $L_{2-41}$ |
| Compound 6451 | $L_{1-206}$ | $L_{2-42}$ |
| Compound 6452 | $L_{1-206}$ | $L_{2-43}$ |
| Compound 6453 | $L_{1-206}$ | $L_{2-44}$ |
| Compound 6454 | $L_{1-206}$ | $L_{2-45}$ |
| Compound 6455 | $L_{1-206}$ | $L_{2-46}$ |
| Compound 6456 | $L_{1-206}$ | $L_{2-47}$ |
| Compound 6457 | $L_{1-206}$ | $L_{2-48}$ |
| Compound 6458 | $L_{1-206}$ | $L_{2-49}$ |
| Compound 6459 | $L_{1-206}$ | $L_{2-50}$ |
| Compound 6460 | $L_{1-206}$ | $L_{2-51}$ |
| Compound 6461 | $L_{1-206}$ | $L_{2-52}$ |
| Compound 6462 | $L_{1-206}$ | $L_{2-53}$ |
| Compound 6463 | $L_{1-206}$ | $L_{2-54}$ |
| Compound 6464 | $L_{1-206}$ | $L_{2-55}$ |
| Compound 6465 | $L_{1-206}$ | $L_{2-56}$ |
| Compound 6466 | $L_{1-206}$ | $L_{2-57}$ |
| Compound 6467 | $L_{1-206}$ | $L_{2-58}$ |
| Compound 6468 | $L_{1-206}$ | $L_{2-59}$ |
| Compound 6469 | $L_{1-206}$ | $L_{2-60}$ |

TABLE 1-continued

| | | |
|---|---|---|
| Compound 6470 | $L_{1-206}$ | $L_{2-61}$ |
| Compound 6471 | $L_{1-206}$ | $L_{2-62}$ |
| Compound 6472 | $L_{1-206}$ | $L_{2-63}$ |
| Compound 6473 | $L_{1-206}$ | $L_{2-64}$ |
| Compound 6474 | $L_{1-206}$ | $L_{2-65}$ |
| Compound 6475 | $L_{1-206}$ | $L_{2-66}$ |
| Compound 6476 | $L_{1-206}$ | $L_{2-67}$ |
| Compound 6477 | $L_{1-206}$ | $L_{2-68}$ |
| Compound 6478 | $L_{1-206}$ | $L_{2-69}$ |
| Compound 6479 | $L_{1-206}$ | $L_{2-70}$ |
| Compound 6480 | $L_{1-206}$ | $L_{2-71}$ |
| Compound 6481 | $L_{1-206}$ | $L_{2-72}$ |
| Compound 6482 | $L_{1-206}$ | $L_{2-73}$ |
| Compound 6483 | $L_{1-206}$ | $L_{2-74}$ |
| Compound 6484 | $L_{1-206}$ | $L_{2-75}$ |
| Compound 6485 | $L_{1-206}$ | $L_{2-76}$ |
| Compound 6486 | $L_{1-206}$ | $L_{2-77}$ |
| Compound 6487 | $L_{1-206}$ | $L_{2-78}$ |
| Compound 6488 | $L_{1-206}$ | $L_{2-79}$ |
| Compound 6489 | $L_{1-206}$ | $L_{2-80}$ |
| Compound 6490 | $L_{1-206}$ | $L_{2-81}$ |
| Compound 6491 | $L_{1-206}$ | $L_{2-82}$ |
| Compound 6492 | $L_{1-206}$ | $L_{2-83}$ |
| Compound 6493 | $L_{1-206}$ | $L_{2-84}$ |
| Compound 6494 | $L_{1-206}$ | $L_{2-85}$ |
| Compound 6495 | $L_{1-206}$ | $L_{2-86}$ |
| Compound 6496 | $L_{1-206}$ | $L_{2-87}$ |
| Compound 6497 | $L_{1-206}$ | $L_{2-88}$ |
| Compound 6498 | $L_{1-206}$ | $L_{2-89}$ |
| Compound 6499 | $L_{1-206}$ | $L_{2-90}$ |
| Compound 6500 | $L_{1-206}$ | $L_{2-91}$ |
| Compound 6501 | $L_{1-206}$ | $L_{2-92}$ |
| Compound 6502 | $L_{1-206}$ | $L_{2-93}$ |
| Compound 6503 | $L_{1-206}$ | $L_{2-94}$ |
| Compound 6504 | $L_{1-206}$ | $L_{2-95}$ |
| Compound 6505 | $L_{1-206}$ | $L_{2-96}$ |
| Compound 6506 | $L_{1-206}$ | $L_{2-97}$ |
| Compound 6507 | $L_{1-206}$ | $L_{2-98}$ |
| Compound 6508 | $L_{1-206}$ | $L_{2-99}$ |
| Compound 6509 | $L_{1-206}$ | $L_{2-100}$ |
| Compound 6510 | $L_{1-206}$ | $L_{2-101}$ |
| Compound 6511 | $L_{1-206}$ | $L_{2-102}$ |
| Compound 6512 | $L_{1-206}$ | $L_{2-103}$ |
| Compound 6513 | $L_{1-206}$ | $L_{2-104}$ |
| Compound 6514 | $L_{1-206}$ | $L_{2-105}$ |
| Compound 6515 | $L_{1-206}$ | $L_{2-106}$ |
| Compound 6516 | $L_{1-206}$ | $L_{2-107}$ |
| Compound 6517 | $L_{1-206}$ | $L_{2-108}$ |
| Compound 6518 | $L_{1-206}$ | $L_{2-109}$ |
| Compound 6519 | $L_{1-206}$ | $L_{2-110}$ |
| Compound 6520 | $L_{1-206}$ | $L_{2-111}$ |
| Compound 6521 | $L_{1-206}$ | $L_{2-112}$ |
| Compound 6522 | $L_{1-206}$ | $L_{2-113}$ |
| Compound 6523 | $L_{1-206}$ | $L_{2-114}$ |
| Compound 6524 | $L_{1-206}$ | $L_{2-115}$ |
| Compound 6525 | $L_{1-206}$ | $L_{2-116}$ |
| Compound 6526 | $L_{1-206}$ | $L_{2-117}$ |
| Compound 6527 | $L_{1-206}$ | $L_{2-118}$ |
| Compound 6528 | $L_{1-206}$ | $L_{2-119}$ |
| Compound 6529 | $L_{1-206}$ | $L_{2-120}$ |
| Compound 6530 | $L_{1-206}$ | $L_{2-121}$ |
| Compound 6531 | $L_{1-206}$ | $L_{2-122}$ |
| Compound 6532 | $L_{1-206}$ | $L_{2-123}$ |
| Compound 6533 | $L_{1-206}$ | $L_{2-124}$ |
| Compound 6534 | $L_{1-206}$ | $L_{2-125}$ |
| Compound 6535 | $L_{1-206}$ | $L_{2-126}$ |
| Compound 6536 | $L_{1-206}$ | $L_{2-127}$ |
| Compound 6537 | $L_{1-206}$ | $L_{2-128}$ |
| Compound 6538 | $L_{1-206}$ | $L_{2-129}$ |
| Compound 6539 | $L_{1-206}$ | $L_{2-130}$ |
| Compound 6540 | $L_{1-206}$ | $L_{2-131}$ |
| Compound 6541 | $L_{1-206}$ | $L_{2-132}$ |
| Compound 6542 | $L_{1-206}$ | $L_{2-133}$ |
| Compound 6543 | $L_{1-206}$ | $L_{2-134}$ |
| Compound 6544 | $L_{1-206}$ | $L_{2-135}$ |
| Compound 6545 | $L_{1-206}$ | $L_{2-136}$ |
| Compound 6546 | $L_{1-206}$ | $L_{2-137}$ |
| Compound 6547 | $L_{1-206}$ | $L_{2-138}$ |
| Compound 6548 | $L_{1-206}$ | $L_{2-139}$ |
| Compound 6549 | $L_{1-206}$ | $L_{2-140}$ |

TABLE 1-continued

| | | |
|---|---|---|
| Compound 6550 | $L_{1-206}$ | $L_{2-141}$ |
| Compound 6551 | $L_{1-206}$ | $L_{2-142}$ |
| Compound 6552 | $L_{1-206}$ | $L_{2-143}$ |
| Compound 6553 | $L_{1-206}$ | $L_{2-144}$ |
| Compound 6554 | $L_{1-206}$ | $L_{2-145}$ |
| Compound 6555 | $L_{1-206}$ | $L_{2-146}$ |
| Compound 6556 | $L_{1-206}$ | $L_{2-147}$ |
| Compound 6557 | $L_{1-206}$ | $L_{2-148}$ |
| Compound 6558 | $L_{1-206}$ | $L_{2-149}$ |
| Compound 6559 | $L_{1-206}$ | $L_{2-150}$ |
| Compound 6560 | $L_{1-206}$ | $L_{2-151}$ |
| Compound 6561 | $L_{1-206}$ | $L_{2-152}$ |
| Compound 6562 | $L_{1-206}$ | $L_{2-153}$ |
| Compound 6563 | $L_{1-206}$ | $L_{2-154}$ |
| Compound 6564 | $L_{1-206}$ | $L_{2-155}$ |
| Compound 6565 | $L_{1-206}$ | $L_{2-156}$ |
| Compound 6566 | $L_{1-206}$ | $L_{2-157}$ |
| Compound 6567 | $L_{1-206}$ | $L_{2-158}$ |
| Compound 6568 | $L_{1-206}$ | $L_{2-159}$ |
| Compound 6569 | $L_{1-206}$ | $L_{2-160}$ |
| Compound 6570 | $L_{1-206}$ | $L_{2-161}$ |
| Compound 6571 | $L_{1-206}$ | $L_{2-162}$ |
| Compound 6572 | $L_{1-206}$ | $L_{2-163}$ |
| Compound 6573 | $L_{1-206}$ | $L_{2-164}$ |
| Compound 6574 | $L_{1-206}$ | $L_{2-165}$ |
| Compound 6575 | $L_{1-206}$ | $L_{2-166}$ |
| Compound 6576 | $L_{1-206}$ | $L_{2-167}$ |
| Compound 6577 | $L_{1-206}$ | $L_{2-168}$ |
| Compound 6578 | $L_{1-206}$ | $L_{2-169}$ |
| Compound 6579 | $L_{1-206}$ | $L_{2-170}$ |
| Compound 6580 | $L_{1-206}$ | $L_{2-171}$ |
| Compound 6581 | $L_{1-206}$ | $L_{2-172}$ |
| Compound 6582 | $L_{1-206}$ | $L_{2-173}$ |
| Compound 6583 | $L_{1-206}$ | $L_{2-174}$ |
| Compound 6584 | $L_{1-206}$ | $L_{2-175}$ |
| Compound 6585 | $L_{1-206}$ | $L_{2-176}$ |
| Compound 6586 | $L_{1-206}$ | $L_{2-177}$ |
| Compound 6587 | $L_{1-206}$ | $L_{2-178}$ |
| Compound 6588 | $L_{1-206}$ | $L_{2-179}$ |
| Compound 6589 | $L_{1-206}$ | $L_{2-180}$ |
| Compound 6590 | $L_{1-206}$ | $L_{2-181}$ |
| Compound 6591 | $L_{1-206}$ | $L_{2-182}$ |
| Compound 6592 | $L_{1-206}$ | $L_{2-183}$ |
| Compound 6593 | $L_{1-206}$ | $L_{2-184}$ |
| Compound 6594 | $L_{1-206}$ | $L_{2-185}$ |
| Compound 6595 | $L_{1-206}$ | $L_{2-186}$ |
| Compound 6596 | $L_{1-206}$ | $L_{2-187}$ |
| Compound 6597 | $L_{1-206}$ | $L_{2-188}$ |
| Compound 6598 | $L_{1-206}$ | $L_{2-189}$ |
| Compound 6599 | $L_{1-206}$ | $L_{2-190}$ |
| Compound 6600 | $L_{1-206}$ | $L_{2-191}$ |
| Compound 6601 | $L_{1-206}$ | $L_{2-192}$ |
| Compound 6602 | $L_{1-206}$ | $L_{2-193}$ |
| Compound 6603 | $L_{1-206}$ | $L_{2-194}$ |
| Compound 6604 | $L_{1-206}$ | $L_{2-195}$ |
| Compound 6605 | $L_{1-206}$ | $L_{2-196}$ |
| Compound 6606 | $L_{1-206}$ | $L_{2-197}$ |
| Compound 6607 | $L_{1-206}$ | $L_{2-198}$ |
| Compound 6608 | $L_{1-206}$ | $L_{2-199}$ |
| Compound 6609 | $L_{1-206}$ | $L_{2-200}$ |
| Compound 6610 | $L_{1-206}$ | $L_{2-201}$ |
| Compound 6611 | $L_{1-206}$ | $L_{2-202}$ |
| Compound 6612 | $L_{1-206}$ | $L_{2-203}$ |
| Compound 6613 | $L_{1-206}$ | $L_{2-204}$ |
| Compound 6614 | $L_{1-206}$ | $L_{2-205}$ |
| Compound 6615 | $L_{1-206}$ | $L_{2-206}$ |
| Compound 6616 | $L_{1-206}$ | $L_{2-207}$ |
| Compound 6617 | $L_{1-206}$ | $L_{2-208}$ |
| Compound 6618 | $L_{1-206}$ | $L_{2-209}$ |
| Compound 6619 | $L_{1-206}$ | $L_{2-210}$ |
| Compound 6620 | $L_{1-206}$ | $L_{2-211}$ |
| Compound 6621 | $L_{1-206}$ | $L_{2-212}$ |
| Compound 6622 | $L_{1-206}$ | $L_{2-213}$ |
| Compound 6623 | $L_{1-206}$ | $L_{2-214}$ |
| Compound 6624 | $L_{1-206}$ | $L_{2-215}$ |
| Compound 6625 | $L_{1-206}$ | $L_{2-216}$ |
| Compound 6626 | $L_{1-206}$ | $L_{2-217}$ |
| Compound 6627 | $L_{1-206}$ | $L_{2-218}$ |
| Compound 6628 | $L_{1-206}$ | $L_{2-219}$ |
| Compound 6629 | $L_{1-206}$ | $L_{2-220}$ |

TABLE 1-continued

| | | |
|---|---|---|
| Compound 6630 | $L_{1-206}$ | $L_{2-221}$ |
| Compound 6631 | $L_{1-206}$ | $L_{2-222}$ |
| Compound 6632 | $L_{1-206}$ | $L_{2-223}$ |
| Compound 6633 | $L_{1-206}$ | $L_{2-224}$ |
| Compound 6634 | $L_{1-206}$ | $L_{2-225}$ |
| Compound 6635 | $L_{1-206}$ | $L_{2-226}$ |
| Compound 6636 | $L_{1-206}$ | $L_{2-227}$ |
| Compound 6637 | $L_{1-206}$ | $L_{2-228}$ |
| Compound 6638 | $L_{1-206}$ | $L_{2-229}$ |
| Compound 6639 | $L_{1-206}$ | $L_{2-230}$ |
| Compound 6640 | $L_{1-206}$ | $L_{2-231}$ |
| Compound 6641 | $L_{1-206}$ | $L_{2-232}$ |
| Compound 6642 | $L_{1-206}$ | $L_{2-233}$ |
| Compound 6643 | $L_{1-206}$ | $L_{2-234}$ |
| Compound 6644 | $L_{1-206}$ | $L_{2-235}$ |
| Compound 6645 | $L_{1-206}$ | $L_{2-236}$ |
| Compound 6646 | $L_{1-206}$ | $L_{2-237}$ |
| Compound 6647 | $L_{1-206}$ | $L_{2-238}$ |
| Compound 6648 | $L_{1-206}$ | $L_{2-239}$ |
| Compound 6649 | $L_{1-206}$ | $L_{2-240}$ |
| Compound 6650 | $L_{1-206}$ | $L_{2-241}$ |
| Compound 6651 | $L_{1-206}$ | $L_{2-242}$ |
| Compound 6652 | $L_{1-206}$ | $L_{2-243}$ |
| Compound 6653 | $L_{1-206}$ | $L_{2-244}$ |
| Compound 6654 | $L_{1-206}$ | $L_{2-245}$ |
| Compound 6655 | $L_{1-206}$ | $L_{2-246}$ |
| Compound 6656 | $L_{1-206}$ | $L_{2-247}$ |
| Compound 6657 | $L_{1-206}$ | $L_{2-248}$ |
| Compound 6658 | $L_{1-206}$ | $L_{2-249}$ |
| Compound 6659 | $L_{1-206}$ | $L_{2-250}$ |
| Compound 6660 | $L_{1-206}$ | $L_{2-251}$ |
| Compound 6661 | $L_{1-206}$ | $L_{2-252}$ |
| Compound 6662 | $L_{1-206}$ | $L_{2-253}$ |
| Compound 6663 | $L_{1-206}$ | $L_{2-254}$ |
| Compound 6664 | $L_{1-206}$ | $L_{2-255}$ |
| Compound 6665 | $L_{1-206}$ | $L_{2-256}$ |
| Compound 6666 | $L_{1-206}$ | $L_{2-257}$ |
| Compound 6667 | $L_{1-206}$ | $L_{2-258}$ |
| Compound 6668 | $L_{1-206}$ | $L_{2-259}$ |
| Compound 6669 | $L_{1-206}$ | $L_{2-260}$ |
| Compound 6670 | $L_{1-206}$ | $L_{2-261}$ |
| Compound 6671 | $L_{1-206}$ | $L_{2-262}$ |
| Compound 6672 | $L_{1-206}$ | $L_{2-263}$ |
| Compound 6673 | $L_{1-206}$ | $L_{2-264}$ |
| Compound 6674 | $L_{1-206}$ | $L_{2-265}$ |
| Compound 6675 | $L_{1-206}$ | $L_{2-266}$ |
| Compound 6676 | $L_{1-206}$ | $L_{2-267}$ |
| Compound 6677 | $L_{1-206}$ | $L_{2-268}$ |
| Compound 6678 | $L_{1-206}$ | $L_{2-269}$ |
| Compound 6679 | $L_{1-206}$ | $L_{2-270}$ |
| Compound 6680 | $L_{1-206}$ | $L_{2-271}$ |
| Compound 6681 | $L_{1-206}$ | $L_{2-272}$ |
| Compound 6682 | $L_{1-206}$ | $L_{2-273}$ |
| Compound 6683 | $L_{1-206}$ | $L_{2-274}$ |
| Compound 6684 | $L_{1-206}$ | $L_{2-275}$ |
| Compound 6685 | $L_{1-206}$ | $L_{2-276}$ |
| Compound 6686 | $L_{1-206}$ | $L_{2-277}$ |
| Compound 6687 | $L_{1-206}$ | $L_{2-278}$ |
| Compound 6688 | $L_{1-206}$ | $L_{2-279}$ |
| Compound 6689 | $L_{1-206}$ | $L_{2-280}$ |
| Compound 6690 | $L_{1-206}$ | $L_{2-281}$ |
| Compound 6691 | $L_{1-206}$ | $L_{2-282}$ |
| Compound 6692 | $L_{1-206}$ | $L_{2-283}$ |
| Compound 6693 | $L_{1-206}$ | $L_{2-284}$ |
| Compound 6694 | $L_{1-206}$ | $L_{2-285}$ |
| Compound 6695 | $L_{1-206}$ | $L_{2-286}$ |
| Compound 6696 | $L_{1-206}$ | $L_{2-287}$ |
| Compound 6697 | $L_{1-206}$ | $L_{2-288}$ |
| Compound 6698 | $L_{1-206}$ | $L_{2-289}$ |
| Compound 6699 | $L_{1-206}$ | $L_{2-290}$ |
| Compound 6700 | $L_{1-206}$ | $L_{2-291}$ |
| Compound 6701 | $L_{1-206}$ | $L_{2-292}$ |
| Compound 6702 | $L_{1-206}$ | $L_{2-293}$ |
| Compound 6703 | $L_{1-206}$ | $L_{2-294}$ |
| Compound 6704 | $L_{1-206}$ | $L_{2-295}$ |
| Compound 6705 | $L_{1-206}$ | $L_{2-296}$ |
| Compound 6706 | $L_{1-206}$ | $L_{2-297}$ |
| Compound 6707 | $L_{1-206}$ | $L_{2-298}$ |
| Compound 6708 | $L_{1-206}$ | $L_{2-299}$ |
| Compound 6709 | $L_{1-206}$ | $L_{2-300}$ |

TABLE 1-continued

| | | |
|---|---|---|
| Compound 6710 | $L_{1-206}$ | $L_{2-301}$ |
| Compound 6711 | $L_{1-206}$ | $L_{2-302}$ |
| Compound 6712 | $L_{1-206}$ | $L_{2-303}$ |
| Compound 6713 | $L_{1-206}$ | $L_{2-304}$ |
| Compound 6714 | $L_{1-206}$ | $L_{2-305}$ |
| Compound 6715 | $L_{1-206}$ | $L_{2-306}$ |
| Compound 6716 | $L_{1-206}$ | $L_{2-307}$ |
| Compound 6717 | $L_{1-206}$ | $L_{2-308}$ |
| Compound 6718 | $L_{1-206}$ | $L_{2-309}$ |
| Compound 6719 | $L_{1-206}$ | $L_{2-310}$ |
| Compound 6720 | $L_{1-206}$ | $L_{2-311}$ |
| Compound 6721 | $L_{1-206}$ | $L_{2-312}$ |
| Compound 6722 | $L_{1-206}$ | $L_{2-313}$ |
| Compound 6723 | $L_{1-206}$ | $L_{2-314}$ |
| Compound 6724 | $L_{1-206}$ | $L_{2-315}$ |
| Compound 6725 | $L_{1-206}$ | $L_{2-316}$ |
| Compound 6726 | $L_{1-206}$ | $L_{2-317}$ |
| Compound 6727 | $L_{1-206}$ | $L_{2-318}$ |
| Compound 6728 | $L_{1-206}$ | $L_{2-319}$ |
| Compound 6729 | $L_{1-206}$ | $L_{2-320}$ |
| Compound 6730 | $L_{1-206}$ | $L_{2-321}$ |
| Compound 6731 | $L_{1-206}$ | $L_{2-322}$ |
| Compound 6732 | $L_{1-206}$ | $L_{2-323}$ |
| Compound 6733 | $L_{1-206}$ | $L_{2-324}$ |
| Compound 6734 | $L_{1-206}$ | $L_{2-325}$ |
| Compound 6735 | $L_{1-206}$ | $L_{2-326}$ |
| Compound 6736 | $L_{1-206}$ | $L_{2-327}$ |
| Compound 6737 | $L_{1-206}$ | $L_{2-328}$ |
| Compound 6738 | $L_{1-206}$ | $L_{2-329}$ |
| Compound 6739 | $L_{1-206}$ | $L_{2-330}$ |
| Compound 6740 | $L_{1-206}$ | $L_{2-331}$ |
| Compound 6741 | $L_{1-206}$ | $L_{2-332}$ |
| Compound 6742 | $L_{1-206}$ | $L_{2-333}$ |
| Compound 6743 | $L_{1-206}$ | $L_{2-334}$ |
| Compound 6744 | $L_{1-206}$ | $L_{2-335}$ |
| Compound 6745 | $L_{1-206}$ | $L_{2-336}$ |
| Compound 6746 | $L_{1-206}$ | $L_{2-337}$ |
| Compound 6747 | $L_{1-206}$ | $L_{2-338}$ |
| Compound 6748 | $L_{1-206}$ | $L_{2-339}$ |
| Compound 6749 | $L_{1-206}$ | $L_{2-340}$ |
| Compound 6750 | $L_{1-206}$ | $L_{2-341}$ |
| Compound 6751 | $L_{1-206}$ | $L_{2-342}$ |
| Compound 6752 | $L_{1-206}$ | $L_{2-343}$ |
| Compound 6753 | $L_{1-206}$ | $L_{2-344}$ |
| Compound 6754 | $L_{1-206}$ | $L_{2-345}$ |
| Compound 6755 | $L_{1-206}$ | $L_{2-346}$ |
| Compound 6756 | $L_{1-206}$ | $L_{2-347}$ |
| Compound 6757 | $L_{1-206}$ | $L_{2-348}$ |
| Compound 6758 | $L_{1-206}$ | $L_{2-349}$ |
| Compound 6759 | $L_{1-206}$ | $L_{2-350}$ |
| Compound 6760 | $L_{1-206}$ | $L_{2-351}$ |
| Compound 6761 | $L_{1-206}$ | $L_{2-352}$ |
| Compound 6762 | $L_{1-206}$ | $L_{2-353}$ |
| Compound 6763 | $L_{1-206}$ | $L_{2-354}$ |
| Compound 6764 | $L_{1-206}$ | $L_{2-355}$ |
| Compound 6765 | $L_{1-206}$ | $L_{2-356}$ |
| Compound 6766 | $L_{1-206}$ | $L_{2-357}$ |
| Compound 6767 | $L_{1-206}$ | $L_{2-358}$ |
| Compound 6768 | $L_{1-206}$ | $L_{2-359}$ |
| Compound 6769 | $L_{1-206}$ | $L_{2-360}$ |
| Compound 6770 | $L_{1-206}$ | $L_{2-361}$ |
| Compound 6771 | $L_{1-206}$ | $L_{2-362}$ |
| Compound 6772 | $L_{1-206}$ | $L_{2-363}$ |
| Compound 6773 | $L_{1-206}$ | $L_{2-364}$ |
| Compound 6774 | $L_{1-206}$ | $L_{2-365}$ |
| Compound 6775 | $L_{1-206}$ | $L_{2-366}$ |
| Compound 6776 | $L_{1-206}$ | $L_{2-367}$ |
| Compound 6777 | $L_{1-206}$ | $L_{2-368}$ |
| Compound 6778 | $L_{1-206}$ | $L_{2-369}$ |
| Compound 6779 | $L_{1-206}$ | $L_{2-370}$ |
| Compound 6780 | $L_{1-206}$ | $L_{2-371}$ |
| Compound 6781 | $L_{1-206}$ | $L_{2-372}$ |
| Compound 6782 | $L_{1-206}$ | $L_{2-373}$ |
| Compound 6783 | $L_{1-206}$ | $L_{2-374}$ |
| Compound 6784 | $L_{1-206}$ | $L_{2-375}$ |
| Compound 6785 | $L_{1-206}$ | $L_{2-376}$ |
| Compound 6786 | $L_{1-207}$ | $L_{2-377}$ |
| Compound 6787 | $L_{1-207}$ | $L_{2-1}$ |
| Compound 6788 | $L_{1-207}$ | $L_{2-2}$ |
| Compound 6789 | $L_{1-207}$ | $L_{2-3}$ |

TABLE 1-continued

| | | |
|---|---|---|
| Compound 6790 | $L_{1-207}$ | $L_{2-4}$ |
| Compound 6791 | $L_{1-207}$ | $L_{2-5}$ |
| Compound 6792 | $L_{1-207}$ | $L_{2-6}$ |
| Compound 6793 | $L_{1-207}$ | $L_{2-7}$ |
| Compound 6794 | $L_{1-207}$ | $L_{2-8}$ |
| Compound 6795 | $L_{1-207}$ | $L_{2-9}$ |
| Compound 6796 | $L_{1-207}$ | $L_{2-10}$ |
| Compound 6797 | $L_{1-207}$ | $L_{2-11}$ |
| Compound 6798 | $L_{1-207}$ | $L_{2-12}$ |
| Compound 6799 | $L_{1-207}$ | $L_{2-13}$ |
| Compound 6800 | $L_{1-207}$ | $L_{2-14}$ |
| Compound 6801 | $L_{1-207}$ | $L_{2-15}$ |
| Compound 6802 | $L_{1-207}$ | $L_{2-16}$ |
| Compound 6803 | $L_{1-207}$ | $L_{2-17}$ |
| Compound 6804 | $L_{1-207}$ | $L_{2-18}$ |
| Compound 6805 | $L_{1-207}$ | $L_{2-19}$ |
| Compound 6806 | $L_{1-207}$ | $L_{2-20}$ |
| Compound 6807 | $L_{1-207}$ | $L_{2-21}$ |
| Compound 6808 | $L_{1-207}$ | $L_{2-22}$ |
| Compound 6809 | $L_{1-207}$ | $L_{2-23}$ |
| Compound 6810 | $L_{1-207}$ | $L_{2-24}$ |
| Compound 6811 | $L_{1-207}$ | $L_{2-25}$ |
| Compound 6812 | $L_{1-207}$ | $L_{2-26}$ |
| Compound 6813 | $L_{1-207}$ | $L_{2-27}$ |
| Compound 6814 | $L_{1-207}$ | $L_{2-28}$ |
| Compound 6815 | $L_{1-207}$ | $L_{2-29}$ |
| Compound 6816 | $L_{1-207}$ | $L_{2-30}$ |
| Compound 6817 | $L_{1-207}$ | $L_{2-31}$ |
| Compound 6818 | $L_{1-207}$ | $L_{2-32}$ |
| Compound 6819 | $L_{1-207}$ | $L_{2-33}$ |
| Compound 6820 | $L_{1-207}$ | $L_{2-34}$ |
| Compound 6821 | $L_{1-207}$ | $L_{2-35}$ |
| Compound 6822 | $L_{1-207}$ | $L_{2-36}$ |
| Compound 6823 | $L_{1-207}$ | $L_{2-37}$ |
| Compound 6824 | $L_{1-207}$ | $L_{2-38}$ |
| Compound 6825 | $L_{1-207}$ | $L_{2-39}$ |
| Compound 6826 | $L_{1-207}$ | $L_{2-40}$ |
| Compound 6827 | $L_{1-207}$ | $L_{2-41}$ |
| Compound 6828 | $L_{1-207}$ | $L_{2-42}$ |
| Compound 6829 | $L_{1-207}$ | $L_{2-43}$ |
| Compound 6830 | $L_{1-207}$ | $L_{2-44}$ |
| Compound 6831 | $L_{1-207}$ | $L_{2-45}$ |
| Compound 6832 | $L_{1-207}$ | $L_{2-46}$ |
| Compound 6833 | $L_{1-207}$ | $L_{2-47}$ |
| Compound 6834 | $L_{1-207}$ | $L_{2-48}$ |
| Compound 6835 | $L_{1-207}$ | $L_{2-49}$ |
| Compound 6836 | $L_{1-207}$ | $L_{2-50}$ |
| Compound 6837 | $L_{1-207}$ | $L_{2-51}$ |
| Compound 6838 | $L_{1-207}$ | $L_{2-52}$ |
| Compound 6839 | $L_{1-207}$ | $L_{2-53}$ |
| Compound 6840 | $L_{1-207}$ | $L_{2-54}$ |
| Compound 6841 | $L_{1-207}$ | $L_{2-55}$ |
| Compound 6842 | $L_{1-207}$ | $L_{2-56}$ |
| Compound 6843 | $L_{1-207}$ | $L_{2-57}$ |
| Compound 6844 | $L_{1-207}$ | $L_{2-58}$ |
| Compound 6845 | $L_{1-207}$ | $L_{2-59}$ |
| Compound 6846 | $L_{1-207}$ | $L_{2-60}$ |
| Compound 6847 | $L_{1-207}$ | $L_{2-61}$ |
| Compound 6848 | $L_{1-207}$ | $L_{2-62}$ |
| Compound 6849 | $L_{1-207}$ | $L_{2-63}$ |
| Compound 6850 | $L_{1-207}$ | $L_{2-64}$ |
| Compound 6851 | $L_{1-207}$ | $L_{2-65}$ |
| Compound 6852 | $L_{1-207}$ | $L_{2-66}$ |
| Compound 6853 | $L_{1-207}$ | $L_{2-67}$ |
| Compound 6854 | $L_{1-207}$ | $L_{2-68}$ |
| Compound 6855 | $L_{1-207}$ | $L_{2-69}$ |
| Compound 6856 | $L_{1-207}$ | $L_{2-70}$ |
| Compound 6857 | $L_{1-207}$ | $L_{2-71}$ |
| Compound 6858 | $L_{1-207}$ | $L_{2-72}$ |
| Compound 6859 | $L_{1-207}$ | $L_{2-73}$ |
| Compound 6860 | $L_{1-207}$ | $L_{2-74}$ |
| Compound 6861 | $L_{1-207}$ | $L_{2-75}$ |
| Compound 6862 | $L_{1-207}$ | $L_{2-76}$ |
| Compound 6863 | $L_{1-207}$ | $L_{2-77}$ |
| Compound 6864 | $L_{1-207}$ | $L_{2-78}$ |
| Compound 6865 | $L_{1-207}$ | $L_{2-79}$ |
| Compound 6866 | $L_{1-207}$ | $L_{2-80}$ |
| Compound 6867 | $L_{1-207}$ | $L_{2-81}$ |
| Compound 6868 | $L_{1-207}$ | $L_{2-82}$ |
| Compound 6869 | $L_{1-207}$ | $L_{2-83}$ |

TABLE 1-continued

| | | |
|---|---|---|
| Compound 6870 | $L_{1-207}$ | $L_{2-84}$ |
| Compound 6871 | $L_{1-207}$ | $L_{2-85}$ |
| Compound 6872 | $L_{1-207}$ | $L_{2-86}$ |
| Compound 6873 | $L_{1-207}$ | $L_{2-87}$ |
| Compound 6874 | $L_{1-207}$ | $L_{2-88}$ |
| Compound 6875 | $L_{1-207}$ | $L_{2-89}$ |
| Compound 6876 | $L_{1-207}$ | $L_{2-90}$ |
| Compound 6877 | $L_{1-207}$ | $L_{2-91}$ |
| Compound 6878 | $L_{1-207}$ | $L_{2-92}$ |
| Compound 6879 | $L_{1-207}$ | $L_{2-93}$ |
| Compound 6880 | $L_{1-207}$ | $L_{2-94}$ |
| Compound 6881 | $L_{1-207}$ | $L_{2-95}$ |
| Compound 6882 | $L_{1-207}$ | $L_{2-96}$ |
| Compound 6883 | $L_{1-207}$ | $L_{2-97}$ |
| Compound 6884 | $L_{1-207}$ | $L_{2-98}$ |
| Compound 6885 | $L_{1-207}$ | $L_{2-99}$ |
| Compound 6886 | $L_{1-207}$ | $L_{2-100}$ |
| Compound 6887 | $L_{1-207}$ | $L_{2-101}$ |
| Compound 6888 | $L_{1-207}$ | $L_{2-102}$ |
| Compound 6889 | $L_{1-207}$ | $L_{2-103}$ |
| Compound 6890 | $L_{1-207}$ | $L_{2-104}$ |
| Compound 6891 | $L_{1-207}$ | $L_{2-105}$ |
| Compound 6892 | $L_{1-207}$ | $L_{2-106}$ |
| Compound 6893 | $L_{1-207}$ | $L_{2-107}$ |
| Compound 6894 | $L_{1-207}$ | $L_{2-108}$ |
| Compound 6895 | $L_{1-207}$ | $L_{2-109}$ |
| Compound 6896 | $L_{1-207}$ | $L_{2-110}$ |
| Compound 6897 | $L_{1-207}$ | $L_{2-111}$ |
| Compound 6898 | $L_{1-207}$ | $L_{2-112}$ |
| Compound 6899 | $L_{1-207}$ | $L_{2-113}$ |
| Compound 6900 | $L_{1-207}$ | $L_{2-114}$ |
| Compound 6901 | $L_{1-207}$ | $L_{2-115}$ |
| Compound 6902 | $L_{1-207}$ | $L_{2-116}$ |
| Compound 6903 | $L_{1-207}$ | $L_{2-117}$ |
| Compound 6904 | $L_{1-207}$ | $L_{2-118}$ |
| Compound 6905 | $L_{1-207}$ | $L_{2-119}$ |
| Compound 6906 | $L_{1-207}$ | $L_{2-120}$ |
| Compound 6907 | $L_{1-207}$ | $L_{2-121}$ |
| Compound 6908 | $L_{1-207}$ | $L_{2-122}$ |
| Compound 6909 | $L_{1-207}$ | $L_{2-123}$ |
| Compound 6910 | $L_{1-207}$ | $L_{2-124}$ |
| Compound 6911 | $L_{1-207}$ | $L_{2-125}$ |
| Compound 6912 | $L_{1-207}$ | $L_{2-126}$ |
| Compound 6913 | $L_{1-207}$ | $L_{2-127}$ |
| Compound 6914 | $L_{1-207}$ | $L_{2-128}$ |
| Compound 6915 | $L_{1-207}$ | $L_{2-129}$ |
| Compound 6916 | $L_{1-207}$ | $L_{2-130}$ |
| Compound 6917 | $L_{1-207}$ | $L_{2-131}$ |
| Compound 6918 | $L_{1-207}$ | $L_{2-132}$ |
| Compound 6919 | $L_{1-207}$ | $L_{2-133}$ |
| Compound 6920 | $L_{1-207}$ | $L_{2-134}$ |
| Compound 6921 | $L_{1-207}$ | $L_{2-135}$ |
| Compound 6922 | $L_{1-207}$ | $L_{2-136}$ |
| Compound 6923 | $L_{1-207}$ | $L_{2-137}$ |
| Compound 6924 | $L_{1-207}$ | $L_{2-138}$ |
| Compound 6925 | $L_{1-207}$ | $L_{2-139}$ |
| Compound 6926 | $L_{1-207}$ | $L_{2-140}$ |
| Compound 6927 | $L_{1-207}$ | $L_{2-141}$ |
| Compound 6928 | $L_{1-207}$ | $L_{2-142}$ |
| Compound 6929 | $L_{1-207}$ | $L_{2-143}$ |
| Compound 6930 | $L_{1-207}$ | $L_{2-144}$ |
| Compound 6931 | $L_{1-207}$ | $L_{2-145}$ |
| Compound 6932 | $L_{1-207}$ | $L_{2-146}$ |
| Compound 6933 | $L_{1-207}$ | $L_{2-147}$ |
| Compound 6934 | $L_{1-207}$ | $L_{2-148}$ |
| Compound 6935 | $L_{1-207}$ | $L_{2-149}$ |
| Compound 6936 | $L_{1-207}$ | $L_{2-150}$ |
| Compound 6937 | $L_{1-207}$ | $L_{2-151}$ |
| Compound 6938 | $L_{1-207}$ | $L_{2-152}$ |
| Compound 6939 | $L_{1-207}$ | $L_{2-153}$ |
| Compound 6940 | $L_{1-207}$ | $L_{2-154}$ |
| Compound 6941 | $L_{1-207}$ | $L_{2-155}$ |
| Compound 6942 | $L_{1-207}$ | $L_{2-156}$ |
| Compound 6943 | $L_{1-207}$ | $L_{2-157}$ |
| Compound 6944 | $L_{1-207}$ | $L_{2-158}$ |
| Compound 6945 | $L_{1-207}$ | $L_{2-159}$ |
| Compound 6946 | $L_{1-207}$ | $L_{2-160}$ |
| Compound 6947 | $L_{1-207}$ | $L_{2-161}$ |
| Compound 6948 | $L_{1-207}$ | $L_{2-162}$ |
| Compound 6949 | $L_{1-207}$ | $L_{2-163}$ |

TABLE 1-continued

| | | |
|---|---|---|
| Compound 6950 | $L_{1-207}$ | $L_{2-164}$ |
| Compound 6951 | $L_{1-207}$ | $L_{2-165}$ |
| Compound 6952 | $L_{1-207}$ | $L_{2-166}$ |
| Compound 6953 | $L_{1-207}$ | $L_{2-167}$ |
| Compound 6954 | $L_{1-207}$ | $L_{2-168}$ |
| Compound 6955 | $L_{1-207}$ | $L_{2-169}$ |
| Compound 6956 | $L_{1-207}$ | $L_{2-170}$ |
| Compound 6957 | $L_{1-207}$ | $L_{2-171}$ |
| Compound 6958 | $L_{1-207}$ | $L_{2-172}$ |
| Compound 6959 | $L_{1-207}$ | $L_{2-173}$ |
| Compound 6960 | $L_{1-207}$ | $L_{2-174}$ |
| Compound 6961 | $L_{1-207}$ | $L_{2-175}$ |
| Compound 6962 | $L_{1-207}$ | $L_{2-176}$ |
| Compound 6963 | $L_{1-207}$ | $L_{2-177}$ |
| Compound 6964 | $L_{1-207}$ | $L_{2-178}$ |
| Compound 6965 | $L_{1-207}$ | $L_{2-179}$ |
| Compound 6966 | $L_{1-207}$ | $L_{2-180}$ |
| Compound 6967 | $L_{1-207}$ | $L_{2-181}$ |
| Compound 6968 | $L_{1-207}$ | $L_{2-182}$ |
| Compound 6969 | $L_{1-207}$ | $L_{2-183}$ |
| Compound 6970 | $L_{1-207}$ | $L_{2-184}$ |
| Compound 6971 | $L_{1-207}$ | $L_{2-185}$ |
| Compound 6972 | $L_{1-207}$ | $L_{2-186}$ |
| Compound 6973 | $L_{1-207}$ | $L_{2-187}$ |
| Compound 6974 | $L_{1-207}$ | $L_{2-188}$ |
| Compound 6975 | $L_{1-207}$ | $L_{2-189}$ |
| Compound 6976 | $L_{1-207}$ | $L_{2-190}$ |
| Compound 6977 | $L_{1-207}$ | $L_{2-191}$ |
| Compound 6978 | $L_{1-207}$ | $L_{2-192}$ |
| Compound 6979 | $L_{1-207}$ | $L_{2-193}$ |
| Compound 6980 | $L_{1-207}$ | $L_{2-194}$ |
| Compound 6981 | $L_{1-207}$ | $L_{2-195}$ |
| Compound 6982 | $L_{1-207}$ | $L_{2-196}$ |
| Compound 6983 | $L_{1-207}$ | $L_{2-197}$ |
| Compound 6984 | $L_{1-207}$ | $L_{2-198}$ |
| Compound 6985 | $L_{1-207}$ | $L_{2-199}$ |
| Compound 6986 | $L_{1-207}$ | $L_{2-200}$ |
| Compound 6987 | $L_{1-207}$ | $L_{2-201}$ |
| Compound 6988 | $L_{1-207}$ | $L_{2-202}$ |
| Compound 6989 | $L_{1-207}$ | $L_{2-203}$ |
| Compound 6990 | $L_{1-207}$ | $L_{2-204}$ |
| Compound 6991 | $L_{1-207}$ | $L_{2-205}$ |
| Compound 6992 | $L_{1-207}$ | $L_{2-206}$ |
| Compound 6993 | $L_{1-207}$ | $L_{2-207}$ |
| Compound 6994 | $L_{1-207}$ | $L_{2-208}$ |
| Compound 6995 | $L_{1-207}$ | $L_{2-209}$ |
| Compound 6996 | $L_{1-207}$ | $L_{2-210}$ |
| Compound 6997 | $L_{1-207}$ | $L_{2-211}$ |
| Compound 6998 | $L_{1-207}$ | $L_{2-212}$ |
| Compound 6999 | $L_{1-207}$ | $L_{2-213}$ |
| Compound 7000 | $L_{1-207}$ | $L_{2-214}$ |
| Compound 7001 | $L_{1-207}$ | $L_{2-215}$ |
| Compound 7002 | $L_{1-207}$ | $L_{2-216}$ |
| Compound 7003 | $L_{1-207}$ | $L_{2-217}$ |
| Compound 7004 | $L_{1-207}$ | $L_{2-218}$ |
| Compound 7005 | $L_{1-207}$ | $L_{2-219}$ |
| Compound 7006 | $L_{1-207}$ | $L_{2-220}$ |
| Compound 7007 | $L_{1-207}$ | $L_{2-221}$ |
| Compound 7008 | $L_{1-207}$ | $L_{2-222}$ |
| Compound 7009 | $L_{1-207}$ | $L_{2-223}$ |
| Compound 7010 | $L_{1-207}$ | $L_{2-224}$ |
| Compound 7011 | $L_{1-207}$ | $L_{2-225}$ |
| Compound 7012 | $L_{1-207}$ | $L_{2-226}$ |
| Compound 7013 | $L_{1-207}$ | $L_{2-227}$ |
| Compound 7014 | $L_{1-207}$ | $L_{2-228}$ |
| Compound 7015 | $L_{1-207}$ | $L_{2-229}$ |
| Compound 7016 | $L_{1-207}$ | $L_{2-230}$ |
| Compound 7017 | $L_{1-207}$ | $L_{2-231}$ |
| Compound 7018 | $L_{1-207}$ | $L_{2-232}$ |
| Compound 7019 | $L_{1-207}$ | $L_{2-233}$ |
| Compound 7020 | $L_{1-207}$ | $L_{2-234}$ |
| Compound 7021 | $L_{1-207}$ | $L_{2-235}$ |
| Compound 7022 | $L_{1-207}$ | $L_{2-236}$ |
| Compound 7023 | $L_{1-207}$ | $L_{2-237}$ |
| Compound 7024 | $L_{1-207}$ | $L_{2-238}$ |
| Compound 7025 | $L_{1-207}$ | $L_{2-239}$ |
| Compound 7026 | $L_{1-207}$ | $L_{2-240}$ |
| Compound 7027 | $L_{1-207}$ | $L_{2-241}$ |
| Compound 7028 | $L_{1-207}$ | $L_{2-242}$ |
| Compound 7029 | $L_{1-207}$ | $L_{2-243}$ |

TABLE 1-continued

| | | |
|---|---|---|
| Compound 7030 | $L_{1-207}$ | $L_{2-244}$ |
| Compound 7031 | $L_{1-207}$ | $L_{2-245}$ |
| Compound 7032 | $L_{1-207}$ | $L_{2-246}$ |
| Compound 7033 | $L_{1-207}$ | $L_{2-247}$ |
| Compound 7034 | $L_{1-207}$ | $L_{2-248}$ |
| Compound 7035 | $L_{1-207}$ | $L_{2-249}$ |
| Compound 7036 | $L_{1-207}$ | $L_{2-250}$ |
| Compound 7037 | $L_{1-207}$ | $L_{2-251}$ |
| Compound 7038 | $L_{1-207}$ | $L_{2-252}$ |
| Compound 7039 | $L_{1-207}$ | $L_{2-253}$ |
| Compound 7040 | $L_{1-207}$ | $L_{2-254}$ |
| Compound 7041 | $L_{1-207}$ | $L_{2-255}$ |
| Compound 7042 | $L_{1-207}$ | $L_{2-256}$ |
| Compound 7043 | $L_{1-207}$ | $L_{2-257}$ |
| Compound 7044 | $L_{1-207}$ | $L_{2-258}$ |
| Compound 7045 | $L_{1-207}$ | $L_{2-259}$ |
| Compound 7046 | $L_{1-207}$ | $L_{2-260}$ |
| Compound 7047 | $L_{1-207}$ | $L_{2-261}$ |
| Compound 7048 | $L_{1-207}$ | $L_{2-262}$ |
| Compound 7049 | $L_{1-207}$ | $L_{2-263}$ |
| Compound 7050 | $L_{1-207}$ | $L_{2-264}$ |
| Compound 7051 | $L_{1-207}$ | $L_{2-265}$ |
| Compound 7052 | $L_{1-207}$ | $L_{2-266}$ |
| Compound 7053 | $L_{1-207}$ | $L_{2-267}$ |
| Compound 7054 | $L_{1-207}$ | $L_{2-268}$ |
| Compound 7055 | $L_{1-207}$ | $L_{2-269}$ |
| Compound 7056 | $L_{1-207}$ | $L_{2-270}$ |
| Compound 7057 | $L_{1-207}$ | $L_{2-271}$ |
| Compound 7058 | $L_{1-207}$ | $L_{2-272}$ |
| Compound 7059 | $L_{1-207}$ | $L_{2-273}$ |
| Compound 7060 | $L_{1-207}$ | $L_{2-274}$ |
| Compound 7061 | $L_{1-207}$ | $L_{2-275}$ |
| Compound 7062 | $L_{1-207}$ | $L_{2-276}$ |
| Compound 7063 | $L_{1-207}$ | $L_{2-277}$ |
| Compound 7064 | $L_{1-207}$ | $L_{2-278}$ |
| Compound 7065 | $L_{1-207}$ | $L_{2-279}$ |
| Compound 7066 | $L_{1-207}$ | $L_{2-280}$ |
| Compound 7067 | $L_{1-207}$ | $L_{2-281}$ |
| Compound 7068 | $L_{1-207}$ | $L_{2-282}$ |
| Compound 7069 | $L_{1-207}$ | $L_{2-283}$ |
| Compound 7070 | $L_{1-207}$ | $L_{2-284}$ |
| Compound 7071 | $L_{1-207}$ | $L_{2-285}$ |
| Compound 7072 | $L_{1-207}$ | $L_{2-286}$ |
| Compound 7073 | $L_{1-207}$ | $L_{2-287}$ |
| Compound 7074 | $L_{1-207}$ | $L_{2-288}$ |
| Compound 7075 | $L_{1-207}$ | $L_{2-289}$ |
| Compound 7076 | $L_{1-207}$ | $L_{2-290}$ |
| Compound 7077 | $L_{1-207}$ | $L_{2-291}$ |
| Compound 7078 | $L_{1-207}$ | $L_{2-292}$ |
| Compound 7079 | $L_{1-207}$ | $L_{2-293}$ |
| Compound 7080 | $L_{1-207}$ | $L_{2-294}$ |
| Compound 7081 | $L_{1-207}$ | $L_{2-295}$ |
| Compound 7082 | $L_{1-207}$ | $L_{2-296}$ |
| Compound 7083 | $L_{1-207}$ | $L_{2-297}$ |
| Compound 7084 | $L_{1-207}$ | $L_{2-298}$ |
| Compound 7085 | $L_{1-207}$ | $L_{2-299}$ |
| Compound 7086 | $L_{1-207}$ | $L_{2-300}$ |
| Compound 7087 | $L_{1-207}$ | $L_{2-301}$ |
| Compound 7088 | $L_{1-207}$ | $L_{2-302}$ |
| Compound 7089 | $L_{1-207}$ | $L_{2-303}$ |
| Compound 7090 | $L_{1-207}$ | $L_{2-304}$ |
| Compound 7091 | $L_{1-207}$ | $L_{2-305}$ |
| Compound 7092 | $L_{1-207}$ | $L_{2-306}$ |
| Compound 7093 | $L_{1-207}$ | $L_{2-307}$ |
| Compound 7094 | $L_{1-207}$ | $L_{2-308}$ |
| Compound 7095 | $L_{1-207}$ | $L_{2-309}$ |
| Compound 7096 | $L_{1-207}$ | $L_{2-310}$ |
| Compound 7097 | $L_{1-207}$ | $L_{2-311}$ |
| Compound 7098 | $L_{1-207}$ | $L_{2-312}$ |
| Compound 7099 | $L_{1-207}$ | $L_{2-313}$ |
| Compound 7100 | $L_{1-207}$ | $L_{2-314}$ |
| Compound 7101 | $L_{1-207}$ | $L_{2-315}$ |
| Compound 7102 | $L_{1-207}$ | $L_{2-316}$ |
| Compound 7103 | $L_{1-207}$ | $L_{2-317}$ |
| Compound 7104 | $L_{1-207}$ | $L_{2-318}$ |
| Compound 7105 | $L_{1-207}$ | $L_{2-319}$ |
| Compound 7106 | $L_{1-207}$ | $L_{2-320}$ |
| Compound 7107 | $L_{1-207}$ | $L_{2-321}$ |
| Compound 7108 | $L_{1-207}$ | $L_{2-322}$ |
| Compound 7109 | $L_{1-207}$ | $L_{2-323}$ |

TABLE 1-continued

| | | |
|---|---|---|
| Compound 7110 | $L_{1-207}$ | $L_{2-324}$ |
| Compound 7111 | $L_{1-207}$ | $L_{2-325}$ |
| Compound 7112 | $L_{1-207}$ | $L_{2-326}$ |
| Compound 7113 | $L_{1-207}$ | $L_{2-327}$ |
| Compound 7114 | $L_{1-207}$ | $L_{2-328}$ |
| Compound 7115 | $L_{1-207}$ | $L_{2-329}$ |
| Compound 7116 | $L_{1-207}$ | $L_{2-330}$ |
| Compound 7117 | $L_{1-207}$ | $L_{2-331}$ |
| Compound 7118 | $L_{1-207}$ | $L_{2-332}$ |
| Compound 7119 | $L_{1-207}$ | $L_{2-333}$ |
| Compound 7120 | $L_{1-207}$ | $L_{2-334}$ |
| Compound 7121 | $L_{1-207}$ | $L_{2-335}$ |
| Compound 7122 | $L_{1-207}$ | $L_{2-336}$ |
| Compound 7123 | $L_{1-207}$ | $L_{2-337}$ |
| Compound 7124 | $L_{1-207}$ | $L_{2-338}$ |
| Compound 7125 | $L_{1-207}$ | $L_{2-339}$ |
| Compound 7126 | $L_{1-207}$ | $L_{2-340}$ |
| Compound 7127 | $L_{1-207}$ | $L_{2-341}$ |
| Compound 7128 | $L_{1-207}$ | $L_{2-342}$ |
| Compound 7129 | $L_{1-207}$ | $L_{2-343}$ |
| Compound 7130 | $L_{1-207}$ | $L_{2-344}$ |
| Compound 7131 | $L_{1-207}$ | $L_{2-345}$ |
| Compound 7132 | $L_{1-207}$ | $L_{2-346}$ |
| Compound 7133 | $L_{1-207}$ | $L_{2-347}$ |
| Compound 7134 | $L_{1-207}$ | $L_{2-348}$ |
| Compound 7135 | $L_{1-207}$ | $L_{2-349}$ |
| Compound 7136 | $L_{1-207}$ | $L_{2-350}$ |
| Compound 7137 | $L_{1-207}$ | $L_{2-351}$ |
| Compound 7138 | $L_{1-207}$ | $L_{2-352}$ |
| Compound 7139 | $L_{1-207}$ | $L_{2-353}$ |
| Compound 7140 | $L_{1-207}$ | $L_{2-354}$ |
| Compound 7141 | $L_{1-207}$ | $L_{2-355}$ |
| Compound 7142 | $L_{1-207}$ | $L_{2-356}$ |
| Compound 7143 | $L_{1-207}$ | $L_{2-357}$ |
| Compound 7144 | $L_{1-207}$ | $L_{2-358}$ |
| Compound 7145 | $L_{1-207}$ | $L_{2-359}$ |
| Compound 7146 | $L_{1-207}$ | $L_{2-360}$ |
| Compound 7147 | $L_{1-207}$ | $L_{2-361}$ |
| Compound 7148 | $L_{1-207}$ | $L_{2-362}$ |
| Compound 7149 | $L_{1-207}$ | $L_{2-363}$ |
| Compound 7150 | $L_{1-207}$ | $L_{2-364}$ |
| Compound 7151 | $L_{1-207}$ | $L_{2-365}$ |
| Compound 7152 | $L_{1-207}$ | $L_{2-366}$ |
| Compound 7153 | $L_{1-207}$ | $L_{2-367}$ |
| Compound 7154 | $L_{1-207}$ | $L_{2-368}$ |
| Compound 7155 | $L_{1-207}$ | $L_{2-369}$ |
| Compound 7156 | $L_{1-207}$ | $L_{2-370}$ |
| Compound 7157 | $L_{1-207}$ | $L_{2-371}$ |
| Compound 7158 | $L_{1-207}$ | $L_{2-372}$ |
| Compound 7159 | $L_{1-207}$ | $L_{2-373}$ |
| Compound 7160 | $L_{1-207}$ | $L_{2-374}$ |
| Compound 7161 | $L_{1-207}$ | $L_{2-375}$ |
| Compound 7162 | $L_{1-207}$ | $L_{2-376}$ |
| Compound 7163 | $L_{1-208}$ | $L_{2-377}$ |
| Compound 7164 | $L_{1-208}$ | $L_{2-1}$ |
| Compound 7165 | $L_{1-208}$ | $L_{2-2}$ |
| Compound 7166 | $L_{1-208}$ | $L_{2-3}$ |
| Compound 7167 | $L_{1-208}$ | $L_{2-4}$ |
| Compound 7168 | $L_{1-208}$ | $L_{2-5}$ |
| Compound 7169 | $L_{1-208}$ | $L_{2-6}$ |
| Compound 7170 | $L_{1-208}$ | $L_{2-7}$ |
| Compound 7171 | $L_{1-208}$ | $L_{2-8}$ |
| Compound 7172 | $L_{1-208}$ | $L_{2-9}$ |
| Compound 7173 | $L_{1-208}$ | $L_{2-10}$ |
| Compound 7174 | $L_{1-208}$ | $L_{2-11}$ |
| Compound 7175 | $L_{1-208}$ | $L_{2-12}$ |
| Compound 7176 | $L_{1-208}$ | $L_{2-13}$ |
| Compound 7177 | $L_{1-208}$ | $L_{2-14}$ |
| Compound 7178 | $L_{1-208}$ | $L_{2-15}$ |
| Compound 7179 | $L_{1-208}$ | $L_{2-16}$ |
| Compound 7180 | $L_{1-208}$ | $L_{2-17}$ |
| Compound 7181 | $L_{1-208}$ | $L_{2-18}$ |
| Compound 7182 | $L_{1-208}$ | $L_{2-19}$ |
| Compound 7183 | $L_{1-208}$ | $L_{2-20}$ |
| Compound 7184 | $L_{1-208}$ | $L_{2-21}$ |
| Compound 7185 | $L_{1-208}$ | $L_{2-22}$ |
| Compound 7186 | $L_{1-208}$ | $L_{2-23}$ |
| Compound 7187 | $L_{1-208}$ | $L_{2-24}$ |
| Compound 7188 | $L_{1-208}$ | $L_{2-25}$ |
| Compound 7189 | $L_{1-208}$ | $L_{2-26}$ |

TABLE 1-continued

| | | |
|---|---|---|
| Compound 7190 | $L_{1-208}$ | $L_{2-27}$ |
| Compound 7191 | $L_{1-208}$ | $L_{2-28}$ |
| Compound 7192 | $L_{1-208}$ | $L_{2-29}$ |
| Compound 7193 | $L_{1-208}$ | $L_{2-30}$ |
| Compound 7194 | $L_{1-208}$ | $L_{2-31}$ |
| Compound 7195 | $L_{1-208}$ | $L_{2-32}$ |
| Compound 7196 | $L_{1-208}$ | $L_{2-33}$ |
| Compound 7197 | $L_{1-208}$ | $L_{2-34}$ |
| Compound 7198 | $L_{1-208}$ | $L_{2-35}$ |
| Compound 7199 | $L_{1-208}$ | $L_{2-36}$ |
| Compound 7200 | $L_{1-208}$ | $L_{2-37}$ |
| Compound 7201 | $L_{1-208}$ | $L_{2-38}$ |
| Compound 7202 | $L_{1-208}$ | $L_{2-39}$ |
| Compound 7203 | $L_{1-208}$ | $L_{2-40}$ |
| Compound 7204 | $L_{1-208}$ | $L_{2-41}$ |
| Compound 7205 | $L_{1-208}$ | $L_{2-42}$ |
| Compound 7206 | $L_{1-208}$ | $L_{2-43}$ |
| Compound 7207 | $L_{1-208}$ | $L_{2-44}$ |
| Compound 7208 | $L_{1-208}$ | $L_{2-45}$ |
| Compound 7209 | $L_{1-208}$ | $L_{2-46}$ |
| Compound 7210 | $L_{1-208}$ | $L_{2-47}$ |
| Compound 7211 | $L_{1-208}$ | $L_{2-48}$ |
| Compound 7212 | $L_{1-208}$ | $L_{2-49}$ |
| Compound 7213 | $L_{1-208}$ | $L_{2-50}$ |
| Compound 7214 | $L_{1-208}$ | $L_{2-51}$ |
| Compound 7215 | $L_{1-208}$ | $L_{2-52}$ |
| Compound 7216 | $L_{1-208}$ | $L_{2-53}$ |
| Compound 7217 | $L_{1-208}$ | $L_{2-54}$ |
| Compound 7218 | $L_{1-208}$ | $L_{2-55}$ |
| Compound 7219 | $L_{1-208}$ | $L_{2-56}$ |
| Compound 7220 | $L_{1-208}$ | $L_{2-57}$ |
| Compound 7221 | $L_{1-208}$ | $L_{2-58}$ |
| Compound 7222 | $L_{1-208}$ | $L_{2-59}$ |
| Compound 7223 | $L_{1-208}$ | $L_{2-60}$ |
| Compound 7224 | $L_{1-208}$ | $L_{2-61}$ |
| Compound 7225 | $L_{1-208}$ | $L_{2-62}$ |
| Compound 7226 | $L_{1-208}$ | $L_{2-63}$ |
| Compound 7227 | $L_{1-208}$ | $L_{2-64}$ |
| Compound 7228 | $L_{1-208}$ | $L_{2-65}$ |
| Compound 7229 | $L_{1-208}$ | $L_{2-66}$ |
| Compound 7230 | $L_{1-208}$ | $L_{2-67}$ |
| Compound 7231 | $L_{1-208}$ | $L_{2-68}$ |
| Compound 7232 | $L_{1-208}$ | $L_{2-69}$ |
| Compound 7233 | $L_{1-208}$ | $L_{2-70}$ |
| Compound 7234 | $L_{1-208}$ | $L_{2-71}$ |
| Compound 7235 | $L_{1-208}$ | $L_{2-72}$ |
| Compound 7236 | $L_{1-208}$ | $L_{2-73}$ |
| Compound 7237 | $L_{1-208}$ | $L_{2-74}$ |
| Compound 7238 | $L_{1-208}$ | $L_{2-75}$ |
| Compound 7239 | $L_{1-208}$ | $L_{2-76}$ |
| Compound 7240 | $L_{1-208}$ | $L_{2-77}$ |
| Compound 7241 | $L_{1-208}$ | $L_{2-78}$ |
| Compound 7242 | $L_{1-208}$ | $L_{2-79}$ |
| Compound 7243 | $L_{1-208}$ | $L_{2-80}$ |
| Compound 7244 | $L_{1-208}$ | $L_{2-81}$ |
| Compound 7245 | $L_{1-208}$ | $L_{2-82}$ |
| Compound 7246 | $L_{1-208}$ | $L_{2-83}$ |
| Compound 7247 | $L_{1-208}$ | $L_{2-84}$ |
| Compound 7248 | $L_{1-208}$ | $L_{2-85}$ |
| Compound 7249 | $L_{1-208}$ | $L_{2-86}$ |
| Compound 7250 | $L_{1-208}$ | $L_{2-87}$ |
| Compound 7251 | $L_{1-208}$ | $L_{2-88}$ |
| Compound 7252 | $L_{1-208}$ | $L_{2-89}$ |
| Compound 7253 | $L_{1-208}$ | $L_{2-90}$ |
| Compound 7254 | $L_{1-208}$ | $L_{2-91}$ |
| Compound 7255 | $L_{1-208}$ | $L_{2-92}$ |
| Compound 7256 | $L_{1-208}$ | $L_{2-93}$ |
| Compound 7257 | $L_{1-208}$ | $L_{2-94}$ |
| Compound 7258 | $L_{1-208}$ | $L_{2-95}$ |
| Compound 7259 | $L_{1-208}$ | $L_{2-96}$ |
| Compound 7260 | $L_{1-208}$ | $L_{2-97}$ |
| Compound 7261 | $L_{1-208}$ | $L_{2-98}$ |
| Compound 7262 | $L_{1-208}$ | $L_{2-99}$ |
| Compound 7263 | $L_{1-208}$ | $L_{2-100}$ |
| Compound 7264 | $L_{1-208}$ | $L_{2-101}$ |
| Compound 7265 | $L_{1-208}$ | $L_{2-102}$ |
| Compound 7266 | $L_{1-208}$ | $L_{2-103}$ |
| Compound 7267 | $L_{1-208}$ | $L_{2-104}$ |
| Compound 7268 | $L_{1-208}$ | $L_{2-105}$ |
| Compound 7269 | $L_{1-208}$ | $L_{2-106}$ |

TABLE 1-continued

| | | |
|---|---|---|
| Compound 7270 | $L_{1-208}$ | $L_{2-107}$ |
| Compound 7271 | $L_{1-208}$ | $L_{2-108}$ |
| Compound 7272 | $L_{1-208}$ | $L_{2-109}$ |
| Compound 7273 | $L_{1-208}$ | $L_{2-110}$ |
| Compound 7274 | $L_{1-208}$ | $L_{2-111}$ |
| Compound 7275 | $L_{1-208}$ | $L_{2-112}$ |
| Compound 7276 | $L_{1-208}$ | $L_{2-113}$ |
| Compound 7277 | $L_{1-208}$ | $L_{2-114}$ |
| Compound 7278 | $L_{1-208}$ | $L_{2-115}$ |
| Compound 7279 | $L_{1-208}$ | $L_{2-116}$ |
| Compound 7280 | $L_{1-208}$ | $L_{2-117}$ |
| Compound 7281 | $L_{1-208}$ | $L_{2-118}$ |
| Compound 7282 | $L_{1-208}$ | $L_{2-119}$ |
| Compound 7283 | $L_{1-208}$ | $L_{2-120}$ |
| Compound 7284 | $L_{1-208}$ | $L_{2-121}$ |
| Compound 7285 | $L_{1-208}$ | $L_{2-122}$ |
| Compound 7286 | $L_{1-208}$ | $L_{2-123}$ |
| Compound 7287 | $L_{1-208}$ | $L_{2-124}$ |
| Compound 7288 | $L_{1-208}$ | $L_{2-125}$ |
| Compound 7289 | $L_{1-208}$ | $L_{2-126}$ |
| Compound 7290 | $L_{1-208}$ | $L_{2-127}$ |
| Compound 7291 | $L_{1-208}$ | $L_{2-128}$ |
| Compound 7292 | $L_{1-208}$ | $L_{2-129}$ |
| Compound 7293 | $L_{1-208}$ | $L_{2-130}$ |
| Compound 7294 | $L_{1-208}$ | $L_{2-131}$ |
| Compound 7295 | $L_{1-208}$ | $L_{2-132}$ |
| Compound 7296 | $L_{1-208}$ | $L_{2-133}$ |
| Compound 7297 | $L_{1-208}$ | $L_{2-134}$ |
| Compound 7298 | $L_{1-208}$ | $L_{2-135}$ |
| Compound 7299 | $L_{1-208}$ | $L_{2-136}$ |
| Compound 7300 | $L_{1-208}$ | $L_{2-137}$ |
| Compound 7301 | $L_{1-208}$ | $L_{2-138}$ |
| Compound 7302 | $L_{1-208}$ | $L_{2-139}$ |
| Compound 7303 | $L_{1-208}$ | $L_{2-140}$ |
| Compound 7304 | $L_{1-208}$ | $L_{2-141}$ |
| Compound 7305 | $L_{1-208}$ | $L_{2-142}$ |
| Compound 7306 | $L_{1-208}$ | $L_{2-143}$ |
| Compound 7307 | $L_{1-208}$ | $L_{2-144}$ |
| Compound 7308 | $L_{1-208}$ | $L_{2-145}$ |
| Compound 7309 | $L_{1-208}$ | $L_{2-146}$ |
| Compound 7310 | $L_{1-208}$ | $L_{2-147}$ |
| Compound 7311 | $L_{1-208}$ | $L_{2-148}$ |
| Compound 7312 | $L_{1-208}$ | $L_{2-149}$ |
| Compound 7313 | $L_{1-208}$ | $L_{2-150}$ |
| Compound 7314 | $L_{1-208}$ | $L_{2-151}$ |
| Compound 7315 | $L_{1-208}$ | $L_{2-152}$ |
| Compound 7316 | $L_{1-208}$ | $L_{2-153}$ |
| Compound 7317 | $L_{1-208}$ | $L_{2-154}$ |
| Compound 7318 | $L_{1-208}$ | $L_{2-155}$ |
| Compound 7319 | $L_{1-208}$ | $L_{2-156}$ |
| Compound 7320 | $L_{1-208}$ | $L_{2-157}$ |
| Compound 7321 | $L_{1-208}$ | $L_{2-158}$ |
| Compound 7322 | $L_{1-208}$ | $L_{2-159}$ |
| Compound 7323 | $L_{1-208}$ | $L_{2-160}$ |
| Compound 7324 | $L_{1-208}$ | $L_{2-161}$ |
| Compound 7325 | $L_{1-208}$ | $L_{2-162}$ |
| Compound 7326 | $L_{1-208}$ | $L_{2-163}$ |
| Compound 7327 | $L_{1-208}$ | $L_{2-164}$ |
| Compound 7328 | $L_{1-208}$ | $L_{2-165}$ |
| Compound 7329 | $L_{1-208}$ | $L_{2-166}$ |
| Compound 7330 | $L_{1-208}$ | $L_{2-167}$ |
| Compound 7331 | $L_{1-208}$ | $L_{2-168}$ |
| Compound 7332 | $L_{1-208}$ | $L_{2-169}$ |
| Compound 7333 | $L_{1-208}$ | $L_{2-170}$ |
| Compound 7334 | $L_{1-208}$ | $L_{2-171}$ |
| Compound 7335 | $L_{1-208}$ | $L_{2-172}$ |
| Compound 7336 | $L_{1-208}$ | $L_{2-173}$ |
| Compound 7337 | $L_{1-208}$ | $L_{2-174}$ |
| Compound 7338 | $L_{1-208}$ | $L_{2-175}$ |
| Compound 7339 | $L_{1-208}$ | $L_{2-176}$ |
| Compound 7340 | $L_{1-208}$ | $L_{2-177}$ |
| Compound 7341 | $L_{1-208}$ | $L_{2-178}$ |
| Compound 7342 | $L_{1-208}$ | $L_{2-179}$ |
| Compound 7343 | $L_{1-208}$ | $L_{2-180}$ |
| Compound 7344 | $L_{1-208}$ | $L_{2-181}$ |
| Compound 7345 | $L_{1-208}$ | $L_{2-182}$ |
| Compound 7346 | $L_{1-208}$ | $L_{2-183}$ |
| Compound 7347 | $L_{1-208}$ | $L_{2-184}$ |
| Compound 7348 | $L_{1-208}$ | $L_{2-185}$ |
| Compound 7349 | $L_{1-208}$ | $L_{2-186}$ |

TABLE 1-continued

| | | |
|---|---|---|
| Compound 7350 | $L_{1-208}$ | $L_{2-187}$ |
| Compound 7351 | $L_{1-208}$ | $L_{2-188}$ |
| Compound 7352 | $L_{1-208}$ | $L_{2-189}$ |
| Compound 7353 | $L_{1-208}$ | $L_{2-190}$ |
| Compound 7354 | $L_{1-208}$ | $L_{2-191}$ |
| Compound 7355 | $L_{1-208}$ | $L_{2-192}$ |
| Compound 7356 | $L_{1-208}$ | $L_{2-193}$ |
| Compound 7357 | $L_{1-208}$ | $L_{2-194}$ |
| Compound 7358 | $L_{1-208}$ | $L_{2-195}$ |
| Compound 7359 | $L_{1-208}$ | $L_{2-196}$ |
| Compound 7360 | $L_{1-208}$ | $L_{2-197}$ |
| Compound 7361 | $L_{1-208}$ | $L_{2-198}$ |
| Compound 7362 | $L_{1-208}$ | $L_{2-199}$ |
| Compound 7363 | $L_{1-208}$ | $L_{2-200}$ |
| Compound 7364 | $L_{1-208}$ | $L_{2-201}$ |
| Compound 7365 | $L_{1-208}$ | $L_{2-202}$ |
| Compound 7366 | $L_{1-208}$ | $L_{2-203}$ |
| Compound 7367 | $L_{1-208}$ | $L_{2-204}$ |
| Compound 7368 | $L_{1-208}$ | $L_{2-205}$ |
| Compound 7369 | $L_{1-208}$ | $L_{2-206}$ |
| Compound 7370 | $L_{1-208}$ | $L_{2-207}$ |
| Compound 7371 | $L_{1-208}$ | $L_{2-208}$ |
| Compound 7372 | $L_{1-208}$ | $L_{2-209}$ |
| Compound 7373 | $L_{1-208}$ | $L_{2-210}$ |
| Compound 7374 | $L_{1-208}$ | $L_{2-211}$ |
| Compound 7375 | $L_{1-208}$ | $L_{2-212}$ |
| Compound 7376 | $L_{1-208}$ | $L_{2-213}$ |
| Compound 7377 | $L_{1-208}$ | $L_{2-214}$ |
| Compound 7378 | $L_{1-208}$ | $L_{2-215}$ |
| Compound 7379 | $L_{1-208}$ | $L_{2-216}$ |
| Compound 7380 | $L_{1-208}$ | $L_{2-217}$ |
| Compound 7381 | $L_{1-208}$ | $L_{2-218}$ |
| Compound 7382 | $L_{1-208}$ | $L_{2-219}$ |
| Compound 7383 | $L_{1-208}$ | $L_{2-220}$ |
| Compound 7384 | $L_{1-208}$ | $L_{2-221}$ |
| Compound 7385 | $L_{1-208}$ | $L_{2-222}$ |
| Compound 7386 | $L_{1-208}$ | $L_{2-223}$ |
| Compound 7387 | $L_{1-208}$ | $L_{2-224}$ |
| Compound 7388 | $L_{1-208}$ | $L_{2-225}$ |
| Compound 7389 | $L_{1-208}$ | $L_{2-226}$ |
| Compound 7390 | $L_{1-208}$ | $L_{2-227}$ |
| Compound 7391 | $L_{1-208}$ | $L_{2-228}$ |
| Compound 7392 | $L_{1-208}$ | $L_{2-229}$ |
| Compound 7393 | $L_{1-208}$ | $L_{2-230}$ |
| Compound 7394 | $L_{1-208}$ | $L_{2-231}$ |
| Compound 7395 | $L_{1-208}$ | $L_{2-232}$ |
| Compound 7396 | $L_{1-208}$ | $L_{2-233}$ |
| Compound 7397 | $L_{1-208}$ | $L_{2-234}$ |
| Compound 7398 | $L_{1-208}$ | $L_{2-235}$ |
| Compound 7399 | $L_{1-208}$ | $L_{2-236}$ |
| Compound 7400 | $L_{1-208}$ | $L_{2-237}$ |
| Compound 7401 | $L_{1-208}$ | $L_{2-238}$ |
| Compound 7402 | $L_{1-208}$ | $L_{2-239}$ |
| Compound 7403 | $L_{1-208}$ | $L_{2-240}$ |
| Compound 7404 | $L_{1-208}$ | $L_{2-241}$ |
| Compound 7405 | $L_{1-208}$ | $L_{2-242}$ |
| Compound 7406 | $L_{1-208}$ | $L_{2-243}$ |
| Compound 7407 | $L_{1-208}$ | $L_{2-244}$ |
| Compound 7408 | $L_{1-208}$ | $L_{2-245}$ |
| Compound 7409 | $L_{1-208}$ | $L_{2-246}$ |
| Compound 7410 | $L_{1-208}$ | $L_{2-247}$ |
| Compound 7411 | $L_{1-208}$ | $L_{2-248}$ |
| Compound 7412 | $L_{1-208}$ | $L_{2-249}$ |
| Compound 7413 | $L_{1-208}$ | $L_{2-250}$ |
| Compound 7414 | $L_{1-208}$ | $L_{2-251}$ |
| Compound 7415 | $L_{1-208}$ | $L_{2-252}$ |
| Compound 7416 | $L_{1-208}$ | $L_{2-253}$ |
| Compound 7417 | $L_{1-208}$ | $L_{2-254}$ |
| Compound 7418 | $L_{1-208}$ | $L_{2-255}$ |
| Compound 7419 | $L_{1-208}$ | $L_{2-256}$ |
| Compound 7420 | $L_{1-208}$ | $L_{2-257}$ |
| Compound 7421 | $L_{1-208}$ | $L_{2-258}$ |
| Compound 7422 | $L_{1-208}$ | $L_{2-259}$ |
| Compound 7423 | $L_{1-208}$ | $L_{2-260}$ |
| Compound 7424 | $L_{1-208}$ | $L_{2-261}$ |
| Compound 7425 | $L_{1-208}$ | $L_{2-262}$ |
| Compound 7426 | $L_{1-208}$ | $L_{2-263}$ |
| Compound 7427 | $L_{1-208}$ | $L_{2-264}$ |
| Compound 7428 | $L_{1-208}$ | $L_{2-265}$ |
| Compound 7429 | $L_{1-208}$ | $L_{2-266}$ |

TABLE 1-continued

| | | |
|---|---|---|
| Compound 7430 | $L_{1-208}$ | $L_{2-267}$ |
| Compound 7431 | $L_{1-208}$ | $L_{2-268}$ |
| Compound 7432 | $L_{1-208}$ | $L_{2-269}$ |
| Compound 7433 | $L_{1-208}$ | $L_{2-270}$ |
| Compound 7434 | $L_{1-208}$ | $L_{2-271}$ |
| Compound 7435 | $L_{1-208}$ | $L_{2-272}$ |
| Compound 7436 | $L_{1-208}$ | $L_{2-273}$ |
| Compound 7437 | $L_{1-208}$ | $L_{2-274}$ |
| Compound 7438 | $L_{1-208}$ | $L_{2-275}$ |
| Compound 7439 | $L_{1-208}$ | $L_{2-276}$ |
| Compound 7440 | $L_{1-208}$ | $L_{2-277}$ |
| Compound 7441 | $L_{1-208}$ | $L_{2-278}$ |
| Compound 7442 | $L_{1-208}$ | $L_{2-279}$ |
| Compound 7443 | $L_{1-208}$ | $L_{2-280}$ |
| Compound 7444 | $L_{1-208}$ | $L_{2-281}$ |
| Compound 7445 | $L_{1-208}$ | $L_{2-282}$ |
| Compound 7446 | $L_{1-208}$ | $L_{2-283}$ |
| Compound 7447 | $L_{1-208}$ | $L_{2-284}$ |
| Compound 7448 | $L_{1-208}$ | $L_{2-285}$ |
| Compound 7449 | $L_{1-208}$ | $L_{2-286}$ |
| Compound 7450 | $L_{1-208}$ | $L_{2-287}$ |
| Compound 7451 | $L_{1-208}$ | $L_{2-288}$ |
| Compound 7452 | $L_{1-208}$ | $L_{2-289}$ |
| Compound 7453 | $L_{1-208}$ | $L_{2-290}$ |
| Compound 7454 | $L_{1-208}$ | $L_{2-291}$ |
| Compound 7455 | $L_{1-208}$ | $L_{2-292}$ |
| Compound 7456 | $L_{1-208}$ | $L_{2-293}$ |
| Compound 7457 | $L_{1-208}$ | $L_{2-294}$ |
| Compound 7458 | $L_{1-208}$ | $L_{2-295}$ |
| Compound 7459 | $L_{1-208}$ | $L_{2-296}$ |
| Compound 7460 | $L_{1-208}$ | $L_{2-297}$ |
| Compound 7461 | $L_{1-208}$ | $L_{2-298}$ |
| Compound 7462 | $L_{1-208}$ | $L_{2-299}$ |
| Compound 7463 | $L_{1-208}$ | $L_{2-300}$ |
| Compound 7464 | $L_{1-208}$ | $L_{2-301}$ |
| Compound 7465 | $L_{1-208}$ | $L_{2-302}$ |
| Compound 7466 | $L_{1-208}$ | $L_{2-303}$ |
| Compound 7467 | $L_{1-208}$ | $L_{2-304}$ |
| Compound 7468 | $L_{1-208}$ | $L_{2-305}$ |
| Compound 7469 | $L_{1-208}$ | $L_{2-306}$ |
| Compound 7470 | $L_{1-208}$ | $L_{2-307}$ |
| Compound 7471 | $L_{1-208}$ | $L_{2-308}$ |
| Compound 7472 | $L_{1-208}$ | $L_{2-309}$ |
| Compound 7473 | $L_{1-208}$ | $L_{2-310}$ |
| Compound 7474 | $L_{1-208}$ | $L_{2-311}$ |
| Compound 7475 | $L_{1-208}$ | $L_{2-312}$ |
| Compound 7476 | $L_{1-208}$ | $L_{2-313}$ |
| Compound 7477 | $L_{1-208}$ | $L_{2-314}$ |
| Compound 7478 | $L_{1-208}$ | $L_{2-315}$ |
| Compound 7479 | $L_{1-208}$ | $L_{2-316}$ |
| Compound 7480 | $L_{1-208}$ | $L_{2-317}$ |
| Compound 7481 | $L_{1-208}$ | $L_{2-318}$ |
| Compound 7482 | $L_{1-208}$ | $L_{2-319}$ |
| Compound 7483 | $L_{1-208}$ | $L_{2-320}$ |
| Compound 7484 | $L_{1-208}$ | $L_{2-321}$ |
| Compound 7485 | $L_{1-208}$ | $L_{2-322}$ |
| Compound 7486 | $L_{1-208}$ | $L_{2-323}$ |
| Compound 7487 | $L_{1-208}$ | $L_{2-324}$ |
| Compound 7488 | $L_{1-208}$ | $L_{2-325}$ |
| Compound 7489 | $L_{1-208}$ | $L_{2-326}$ |
| Compound 7490 | $L_{1-208}$ | $L_{2-327}$ |
| Compound 7491 | $L_{1-208}$ | $L_{2-328}$ |
| Compound 7492 | $L_{1-208}$ | $L_{2-329}$ |
| Compound 7493 | $L_{1-208}$ | $L_{2-330}$ |
| Compound 7494 | $L_{1-208}$ | $L_{2-331}$ |
| Compound 7495 | $L_{1-208}$ | $L_{2-332}$ |
| Compound 7496 | $L_{1-208}$ | $L_{2-333}$ |
| Compound 7497 | $L_{1-208}$ | $L_{2-334}$ |
| Compound 7498 | $L_{1-208}$ | $L_{2-335}$ |
| Compound 7499 | $L_{1-208}$ | $L_{2-336}$ |
| Compound 7500 | $L_{1-208}$ | $L_{2-337}$ |
| Compound 7501 | $L_{1-208}$ | $L_{2-338}$ |
| Compound 7502 | $L_{1-208}$ | $L_{2-339}$ |
| Compound 7503 | $L_{1-208}$ | $L_{2-340}$ |
| Compound 7504 | $L_{1-208}$ | $L_{2-341}$ |
| Compound 7505 | $L_{1-208}$ | $L_{2-342}$ |
| Compound 7506 | $L_{1-208}$ | $L_{2-343}$ |
| Compound 7507 | $L_{1-208}$ | $L_{2-344}$ |
| Compound 7508 | $L_{1-208}$ | $L_{2-345}$ |
| Compound 7509 | $L_{1-208}$ | $L_{2-346}$ |

TABLE 1-continued

| | | |
|---|---|---|
| Compound 7510 | $L_{1-208}$ | $L_{2-347}$ |
| Compound 7511 | $L_{1-208}$ | $L_{2-348}$ |
| Compound 7512 | $L_{1-208}$ | $L_{2-349}$ |
| Compound 7513 | $L_{1-208}$ | $L_{2-350}$ |
| Compound 7514 | $L_{1-208}$ | $L_{2-351}$ |
| Compound 7515 | $L_{1-208}$ | $L_{2-352}$ |
| Compound 7516 | $L_{1-208}$ | $L_{2-353}$ |
| Compound 7517 | $L_{1-208}$ | $L_{2-354}$ |
| Compound 7518 | $L_{1-208}$ | $L_{2-355}$ |
| Compound 7519 | $L_{1-208}$ | $L_{2-356}$ |
| Compound 7520 | $L_{1-208}$ | $L_{2-357}$ |
| Compound 7521 | $L_{1-208}$ | $L_{2-358}$ |
| Compound 7522 | $L_{1-208}$ | $L_{2-359}$ |
| Compound 7523 | $L_{1-208}$ | $L_{2-360}$ |
| Compound 7524 | $L_{1-208}$ | $L_{2-361}$ |
| Compound 7525 | $L_{1-208}$ | $L_{2-362}$ |
| Compound 7526 | $L_{1-208}$ | $L_{2-363}$ |
| Compound 7527 | $L_{1-208}$ | $L_{2-364}$ |
| Compound 7528 | $L_{1-208}$ | $L_{2-365}$ |
| Compound 7529 | $L_{1-208}$ | $L_{2-366}$ |
| Compound 7530 | $L_{1-208}$ | $L_{2-367}$ |
| Compound 7531 | $L_{1-208}$ | $L_{2-368}$ |
| Compound 7532 | $L_{1-208}$ | $L_{2-369}$ |
| Compound 7533 | $L_{1-208}$ | $L_{2-370}$ |
| Compound 7534 | $L_{1-208}$ | $L_{2-371}$ |
| Compound 7535 | $L_{1-208}$ | $L_{2-372}$ |
| Compound 7536 | $L_{1-208}$ | $L_{2-373}$ |
| Compound 7537 | $L_{1-208}$ | $L_{2-374}$ |
| Compound 7538 | $L_{1-208}$ | $L_{2-375}$ |
| Compound 7539 | $L_{1-208}$ | $L_{2-376}$ |
| Compound 7540 | $L_{1-208}$ | $L_{2-377}$ |
| Compound 7541 | $L_{1-11}$ | $L_{2-1}$ |
| Compound 7542 | $L_{1-11}$ | $L_{2-10}$ |
| Compound 7543 | $L_{1-11}$ | $L_{2-15}$ |
| Compound 7544 | $L_{1-11}$ | $L_{2-20}$ |
| Compound 7545 | $L_{1-11}$ | $L_{2-65}$ |
| Compound 7546 | $L_{1-11}$ | $L_{2-109}$ |
| Compound 7547 | $L_{1-12}$ | $L_{2-1}$ |
| Compound 7548 | $L_{1-12}$ | $L_{2-10}$ |
| Compound 7549 | $L_{1-12}$ | $L_{2-15}$ |
| Compound 7550 | $L_{1-12}$ | $L_{2-20}$ |
| Compound 7551 | $L_{1-12}$ | $L_{2-65}$ |
| Compound 7552 | $L_{1-12}$ | $L_{2-109}$ |
| Compound 7553 | $L_{1-13}$ | $L_{2-1}$ |
| Compound 7554 | $L_{1-13}$ | $L_{2-10}$ |
| Compound 7555 | $L_{1-13}$ | $L_{2-15}$ |
| Compound 7556 | $L_{1-13}$ | $L_{2-20}$ |
| Compound 7557 | $L_{1-13}$ | $L_{2-65}$ |
| Compound 7558 | $L_{1-13}$ | $L_{2-109}$ |
| Compound 7559 | $L_{1-14}$ | $L_{2-1}$ |
| Compound 7560 | $L_{1-14}$ | $L_{2-10}$ |
| Compound 7561 | $L_{1-14}$ | $L_{2-15}$ |
| Compound 7562 | $L_{1-14}$ | $L_{2-20}$ |
| Compound 7563 | $L_{1-14}$ | $L_{2-65}$ |
| Compound 7564 | $L_{1-14}$ | $L_{2-109}$ |
| Compound 7565 | $L_{1-15}$ | $L_{2-1}$ |
| Compound 7566 | $L_{1-15}$ | $L_{2-10}$ |
| Compound 7567 | $L_{1-15}$ | $L_{2-15}$ |
| Compound 7568 | $L_{1-15}$ | $L_{2-20}$ |
| Compound 7569 | $L_{1-15}$ | $L_{2-65}$ |
| Compound 7570 | $L_{1-15}$ | $L_{2-109}$ |
| Compound 7571 | $L_{1-16}$ | $L_{2-1}$ |
| Compound 7572 | $L_{1-16}$ | $L_{2-10}$ |
| Compound 7573 | $L_{1-16}$ | $L_{2-15}$ |
| Compound 7574 | $L_{1-16}$ | $L_{2-20}$ |
| Compound 7575 | $L_{1-16}$ | $L_{2-65}$ |
| Compound 7576 | $L_{1-16}$ | $L_{2-109}$ |
| Compound 7577 | $L_{1-17}$ | $L_{2-1}$ |
| Compound 7578 | $L_{1-17}$ | $L_{2-10}$ |
| Compound 7579 | $L_{1-17}$ | $L_{2-15}$ |
| Compound 7580 | $L_{1-17}$ | $L_{2-20}$ |
| Compound 7581 | $L_{1-17}$ | $L_{2-65}$ |
| Compound 7582 | $L_{1-17}$ | $L_{2-109}$ |
| Compound 7583 | $L_{1-18}$ | $L_{2-1}$ |
| Compound 7584 | $L_{1-18}$ | $L_{2-10}$ |
| Compound 7585 | $L_{1-18}$ | $L_{2-15}$ |
| Compound 7586 | $L_{1-18}$ | $L_{2-20}$ |
| Compound 7587 | $L_{1-18}$ | $L_{2-65}$ |
| Compound 7588 | $L_{1-18}$ | $L_{2-109}$ |
| Compound 7589 | $L_{1-19}$ | $L_{2-1}$ |

TABLE 1-continued

| | | |
|---|---|---|
| Compound 7590 | $L_{1-19}$ | $L_{2-10}$ |
| Compound 7591 | $L_{1-19}$ | $L_{2-15}$ |
| Compound 7592 | $L_{1-19}$ | $L_{2-20}$ |
| Compound 7593 | $L_{1-19}$ | $L_{2-65}$ |
| Compound 7594 | $L_{1-19}$ | $L_{2-109}$ |
| Compound 7595 | $L_{1-20}$ | $L_{2-1}$ |
| Compound 7596 | $L_{1-20}$ | $L_{2-10}$ |
| Compound 7597 | $L_{1-20}$ | $L_{2-15}$ |
| Compound 7598 | $L_{1-20}$ | $L_{2-20}$ |
| Compound 7599 | $L_{1-20}$ | $L_{2-65}$ |
| Compound 7600 | $L_{1-20}$ | $L_{2-109}$ |
| Compound 7601 | $L_{1-21}$ | $L_{2-1}$ |
| Compound 7602 | $L_{1-21}$ | $L_{2-10}$ |
| Compound 7603 | $L_{1-21}$ | $L_{2-15}$ |
| Compound 7604 | $L_{1-21}$ | $L_{2-20}$ |
| Compound 7605 | $L_{1-21}$ | $L_{2-65}$ |
| Compound 7606 | $L_{1-21}$ | $L_{2-109}$ |
| Compound 7607 | $L_{1-22}$ | $L_{2-1}$ |
| Compound 7608 | $L_{1-22}$ | $L_{2-10}$ |
| Compound 7609 | $L_{1-22}$ | $L_{2-15}$ |
| Compound 7610 | $L_{1-22}$ | $L_{2-20}$ |
| Compound 7611 | $L_{1-22}$ | $L_{2-65}$ |
| Compound 7612 | $L_{1-22}$ | $L_{2-109}$ |
| Compound 7613 | $L_{1-23}$ | $L_{2-1}$ |
| Compound 7614 | $L_{1-23}$ | $L_{2-10}$ |
| Compound 7615 | $L_{1-23}$ | $L_{2-15}$ |
| Compound 7616 | $L_{1-23}$ | $L_{2-20}$ |
| Compound 7617 | $L_{1-23}$ | $L_{2-65}$ |
| Compound 7618 | $L_{1-23}$ | $L_{2-109}$ |
| Compound 7619 | $L_{1-24}$ | $L_{2-1}$ |
| Compound 7620 | $L_{1-24}$ | $L_{2-10}$ |
| Compound 7621 | $L_{1-24}$ | $L_{2-15}$ |
| Compound 7622 | $L_{1-24}$ | $L_{2-20}$ |
| Compound 7623 | $L_{1-24}$ | $L_{2-65}$ |
| Compound 7624 | $L_{1-24}$ | $L_{2-109}$ |
| Compound 7625 | $L_{1-25}$ | $L_{2-1}$ |
| Compound 7626 | $L_{1-25}$ | $L_{2-10}$ |
| Compound 7627 | $L_{1-25}$ | $L_{2-15}$ |
| Compound 7628 | $L_{1-25}$ | $L_{2-20}$ |
| Compound 7629 | $L_{1-25}$ | $L_{2-65}$ |
| Compound 7630 | $L_{1-25}$ | $L_{2-109}$ |
| Compound 7631 | $L_{1-26}$ | $L_{2-1}$ |
| Compound 7632 | $L_{1-26}$ | $L_{2-10}$ |
| Compound 7633 | $L_{1-26}$ | $L_{2-15}$ |
| Compound 7634 | $L_{1-26}$ | $L_{2-20}$ |
| Compound 7635 | $L_{1-26}$ | $L_{2-65}$ |
| Compound 7636 | $L_{1-26}$ | $L_{2-109}$ |
| Compound 7637 | $L_{1-27}$ | $L_{2-1}$ |
| Compound 7638 | $L_{1-27}$ | $L_{2-10}$ |
| Compound 7639 | $L_{1-27}$ | $L_{2-15}$ |
| Compound 7640 | $L_{1-27}$ | $L_{2-20}$ |
| Compound 7641 | $L_{1-27}$ | $L_{2-65}$ |
| Compound 7642 | $L_{1-27}$ | $L_{2-109}$ |
| Compound 7643 | $L_{1-28}$ | $L_{2-1}$ |
| Compound 7644 | $L_{1-28}$ | $L_{2-10}$ |
| Compound 7645 | $L_{1-28}$ | $L_{2-15}$ |
| Compound 7646 | $L_{1-28}$ | $L_{2-20}$ |
| Compound 7647 | $L_{1-28}$ | $L_{2-65}$ |
| Compound 7648 | $L_{1-28}$ | $L_{2-109}$ |
| Compound 7649 | $L_{1-29}$ | $L_{2-1}$ |
| Compound 7650 | $L_{1-29}$ | $L_{2-10}$ |
| Compound 7651 | $L_{1-29}$ | $L_{2-15}$ |
| Compound 7652 | $L_{1-29}$ | $L_{2-20}$ |
| Compound 7653 | $L_{1-29}$ | $L_{2-65}$ |
| Compound 7654 | $L_{1-29}$ | $L_{2-109}$ |
| Compound 7655 | $L_{1-30}$ | $L_{2-1}$ |
| Compound 7656 | $L_{1-30}$ | $L_{2-10}$ |
| Compound 7657 | $L_{1-30}$ | $L_{2-15}$ |
| Compound 7658 | $L_{1-30}$ | $L_{2-20}$ |
| Compound 7659 | $L_{1-30}$ | $L_{2-65}$ |
| Compound 7660 | $L_{1-30}$ | $L_{2-109}$ |
| Compound 7661 | $L_{1-31}$ | $L_{2-1}$ |
| Compound 7662 | $L_{1-31}$ | $L_{2-10}$ |
| Compound 7663 | $L_{1-31}$ | $L_{2-15}$ |
| Compound 7664 | $L_{1-31}$ | $L_{2-20}$ |
| Compound 7665 | $L_{1-31}$ | $L_{2-65}$ |
| Compound 7666 | $L_{1-31}$ | $L_{2-109}$ |
| Compound 7667 | $L_{1-32}$ | $L_{2-1}$ |
| Compound 7668 | $L_{1-32}$ | $L_{2-10}$ |
| Compound 7669 | $L_{1-32}$ | $L_{2-15}$ |

TABLE 1-continued

| | | |
|---|---|---|
| Compound 7670 | $L_{1-32}$ | $L_{2-20}$ |
| Compound 7671 | $L_{1-32}$ | $L_{2-65}$ |
| Compound 7672 | $L_{1-32}$ | $L_{2-109}$ |
| Compound 7673 | $L_{1-33}$ | $L_{2-1}$ |
| Compound 7674 | $L_{1-33}$ | $L_{2-10}$ |
| Compound 7675 | $L_{1-33}$ | $L_{2-15}$ |
| Compound 7676 | $L_{1-33}$ | $L_{2-20}$ |
| Compound 7677 | $L_{1-33}$ | $L_{2-65}$ |
| Compound 7678 | $L_{1-33}$ | $L_{2-109}$ |
| Compound 7679 | $L_{1-34}$ | $L_{2-1}$ |
| Compound 7680 | $L_{1-34}$ | $L_{2-10}$ |
| Compound 7681 | $L_{1-34}$ | $L_{2-15}$ |
| Compound 7682 | $L_{1-34}$ | $L_{2-20}$ |
| Compound 7683 | $L_{1-34}$ | $L_{2-65}$ |
| Compound 7684 | $L_{1-34}$ | $L_{2-109}$ |
| Compound 7685 | $L_{1-35}$ | $L_{2-1}$ |
| Compound 7686 | $L_{1-35}$ | $L_{2-10}$ |
| Compound 7687 | $L_{1-35}$ | $L_{2-15}$ |
| Compound 7688 | $L_{1-35}$ | $L_{2-20}$ |
| Compound 7689 | $L_{1-35}$ | $L_{2-65}$ |
| Compound 7690 | $L_{1-35}$ | $L_{2-109}$ |
| Compound 7691 | $L_{1-36}$ | $L_{2-1}$ |
| Compound 7692 | $L_{1-36}$ | $L_{2-10}$ |
| Compound 7693 | $L_{1-36}$ | $L_{2-15}$ |
| Compound 7694 | $L_{1-36}$ | $L_{2-20}$ |
| Compound 7695 | $L_{1-36}$ | $L_{2-65}$ |
| Compound 7696 | $L_{1-36}$ | $L_{2-109}$ |
| Compound 7697 | $L_{1-37}$ | $L_{2-1}$ |
| Compound 7698 | $L_{1-37}$ | $L_{2-10}$ |
| Compound 7699 | $L_{1-37}$ | $L_{2-15}$ |
| Compound 7700 | $L_{1-37}$ | $L_{2-20}$ |
| Compound 7701 | $L_{1-37}$ | $L_{2-65}$ |
| Compound 7702 | $L_{1-37}$ | $L_{2-109}$ |
| Compound 7703 | $L_{1-38}$ | $L_{2-1}$ |
| Compound 7704 | $L_{1-38}$ | $L_{2-10}$ |
| Compound 7705 | $L_{1-38}$ | $L_{2-15}$ |
| Compound 7706 | $L_{1-38}$ | $L_{2-20}$ |
| Compound 7707 | $L_{1-38}$ | $L_{2-65}$ |
| Compound 7708 | $L_{1-38}$ | $L_{2-109}$ |
| Compound 7709 | $L_{1-39}$ | $L_{2-1}$ |
| Compound 7710 | $L_{1-39}$ | $L_{2-10}$ |
| Compound 7711 | $L_{1-39}$ | $L_{2-15}$ |
| Compound 7712 | $L_{1-39}$ | $L_{2-20}$ |
| Compound 7713 | $L_{1-39}$ | $L_{2-65}$ |
| Compound 7714 | $L_{1-39}$ | $L_{2-109}$ |
| Compound 7715 | $L_{1-40}$ | $L_{2-1}$ |
| Compound 7716 | $L_{1-40}$ | $L_{2-10}$ |
| Compound 7717 | $L_{1-40}$ | $L_{2-15}$ |
| Compound 7718 | $L_{1-40}$ | $L_{2-20}$ |
| Compound 7719 | $L_{1-40}$ | $L_{2-65}$ |
| Compound 7720 | $L_{1-40}$ | $L_{2-109}$ |
| Compound 7721 | $L_{1-41}$ | $L_{2-1}$ |
| Compound 7722 | $L_{1-41}$ | $L_{2-10}$ |
| Compound 7723 | $L_{1-41}$ | $L_{2-15}$ |
| Compound 7724 | $L_{1-41}$ | $L_{2-20}$ |
| Compound 7725 | $L_{1-41}$ | $L_{2-65}$ |
| Compound 7726 | $L_{1-41}$ | $L_{2-109}$ |
| Compound 7727 | $L_{1-42}$ | $L_{2-1}$ |
| Compound 7728 | $L_{1-42}$ | $L_{2-10}$ |
| Compound 7729 | $L_{1-42}$ | $L_{2-15}$ |
| Compound 7730 | $L_{1-42}$ | $L_{2-20}$ |
| Compound 7731 | $L_{1-42}$ | $L_{2-65}$ |
| Compound 7732 | $L_{1-42}$ | $L_{2-109}$ |
| Compound 7733 | $L_{1-43}$ | $L_{2-1}$ |
| Compound 7734 | $L_{1-43}$ | $L_{2-10}$ |
| Compound 7735 | $L_{1-43}$ | $L_{2-15}$ |
| Compound 7736 | $L_{1-43}$ | $L_{2-20}$ |
| Compound 7737 | $L_{1-43}$ | $L_{2-65}$ |
| Compound 7738 | $L_{1-43}$ | $L_{2-109}$ |
| Compound 7739 | $L_{1-44}$ | $L_{2-1}$ |
| Compound 7740 | $L_{1-44}$ | $L_{2-10}$ |
| Compound 7741 | $L_{1-44}$ | $L_{2-15}$ |
| Compound 7742 | $L_{1-44}$ | $L_{2-20}$ |
| Compound 7743 | $L_{1-44}$ | $L_{2-65}$ |
| Compound 7744 | $L_{1-44}$ | $L_{2-109}$ |
| Compound 7745 | $L_{1-45}$ | $L_{2-1}$ |
| Compound 7746 | $L_{1-45}$ | $L_{2-10}$ |
| Compound 7747 | $L_{1-45}$ | $L_{2-15}$ |
| Compound 7748 | $L_{1-45}$ | $L_{2-20}$ |
| Compound 7749 | $L_{1-45}$ | $L_{2-65}$ |

TABLE 1-continued

| | | |
|---|---|---|
| Compound 7750 | $L_{1-45}$ | $L_{2-109}$ |
| Compound 7751 | $L_{1-46}$ | $L_{2-1}$ |
| Compound 7752 | $L_{1-46}$ | $L_{2-10}$ |
| Compound 7753 | $L_{1-46}$ | $L_{2-15}$ |
| Compound 7754 | $L_{1-46}$ | $L_{2-20}$ |
| Compound 7755 | $L_{1-46}$ | $L_{2-65}$ |
| Compound 7756 | $L_{1-46}$ | $L_{2-109}$ |
| Compound 7757 | $L_{1-47}$ | $L_{2-1}$ |
| Compound 7758 | $L_{1-47}$ | $L_{2-10}$ |
| Compound 7759 | $L_{1-47}$ | $L_{2-15}$ |
| Compound 7760 | $L_{1-47}$ | $L_{2-20}$ |
| Compound 7761 | $L_{1-47}$ | $L_{2-65}$ |
| Compound 7762 | $L_{1-47}$ | $L_{2-109}$ |
| Compound 7763 | $L_{1-48}$ | $L_{2-1}$ |
| Compound 7764 | $L_{1-48}$ | $L_{2-10}$ |
| Compound 7765 | $L_{1-48}$ | $L_{2-15}$ |
| Compound 7766 | $L_{1-48}$ | $L_{2-20}$ |
| Compound 7767 | $L_{1-48}$ | $L_{2-65}$ |
| Compound 7768 | $L_{1-48}$ | $L_{2-109}$ |
| Compound 7769 | $L_{1-49}$ | $L_{2-1}$ |
| Compound 7770 | $L_{1-49}$ | $L_{2-10}$ |
| Compound 7771 | $L_{1-49}$ | $L_{2-15}$ |
| Compound 7772 | $L_{1-49}$ | $L_{2-20}$ |
| Compound 7773 | $L_{1-49}$ | $L_{2-65}$ |
| Compound 7774 | $L_{1-49}$ | $L_{2-109}$ |
| Compound 7775 | $L_{1-50}$ | $L_{2-1}$ |
| Compound 7776 | $L_{1-50}$ | $L_{2-10}$ |
| Compound 7777 | $L_{1-50}$ | $L_{2-15}$ |
| Compound 7778 | $L_{1-50}$ | $L_{2-20}$ |
| Compound 7779 | $L_{1-50}$ | $L_{2-65}$ |
| Compound 7780 | $L_{1-50}$ | $L_{2-109}$ |
| Compound 7781 | $L_{1-51}$ | $L_{2-1}$ |
| Compound 7782 | $L_{1-51}$ | $L_{2-10}$ |
| Compound 7783 | $L_{1-51}$ | $L_{2-15}$ |
| Compound 7784 | $L_{1-51}$ | $L_{2-20}$ |
| Compound 7785 | $L_{1-51}$ | $L_{2-65}$ |
| Compound 7786 | $L_{1-51}$ | $L_{2-109}$ |
| Compound 7787 | $L_{1-52}$ | $L_{2-1}$ |
| Compound 7788 | $L_{1-52}$ | $L_{2-10}$ |
| Compound 7789 | $L_{1-52}$ | $L_{2-15}$ |
| Compound 7790 | $L_{1-52}$ | $L_{2-20}$ |
| Compound 7791 | $L_{1-52}$ | $L_{2-65}$ |
| Compound 7792 | $L_{1-52}$ | $L_{2-109}$ |
| Compound 7793 | $L_{1-53}$ | $L_{2-1}$ |
| Compound 7794 | $L_{1-53}$ | $L_{2-10}$ |
| Compound 7795 | $L_{1-53}$ | $L_{2-15}$ |
| Compound 7796 | $L_{1-53}$ | $L_{2-20}$ |
| Compound 7797 | $L_{1-53}$ | $L_{2-65}$ |
| Compound 7798 | $L_{1-53}$ | $L_{2-109}$ |
| Compound 7799 | $L_{1-54}$ | $L_{2-1}$ |
| Compound 7800 | $L_{1-54}$ | $L_{2-10}$ |
| Compound 7801 | $L_{1-54}$ | $L_{2-15}$ |
| Compound 7802 | $L_{1-54}$ | $L_{2-20}$ |
| Compound 7803 | $L_{1-54}$ | $L_{2-65}$ |
| Compound 7804 | $L_{1-54}$ | $L_{2-109}$ |
| Compound 7805 | $L_{1-55}$ | $L_{2-1}$ |
| Compound 7806 | $L_{1-55}$ | $L_{2-10}$ |
| Compound 7807 | $L_{1-55}$ | $L_{2-15}$ |
| Compound 7808 | $L_{1-55}$ | $L_{2-20}$ |
| Compound 7809 | $L_{1-55}$ | $L_{2-65}$ |
| Compound 7810 | $L_{1-55}$ | $L_{2-109}$ |
| Compound 7811 | $L_{1-56}$ | $L_{2-1}$ |
| Compound 7812 | $L_{1-56}$ | $L_{2-10}$ |
| Compound 7813 | $L_{1-56}$ | $L_{2-15}$ |
| Compound 7814 | $L_{1-56}$ | $L_{2-20}$ |
| Compound 7815 | $L_{1-56}$ | $L_{2-65}$ |
| Compound 7816 | $L_{1-56}$ | $L_{2-109}$ |
| Compound 7817 | $L_{1-57}$ | $L_{2-1}$ |
| Compound 7818 | $L_{1-57}$ | $L_{2-10}$ |
| Compound 7819 | $L_{1-57}$ | $L_{2-15}$ |
| Compound 7820 | $L_{1-57}$ | $L_{2-20}$ |
| Compound 7821 | $L_{1-57}$ | $L_{2-65}$ |
| Compound 7822 | $L_{1-57}$ | $L_{2-109}$ |
| Compound 7823 | $L_{1-58}$ | $L_{2-1}$ |
| Compound 7824 | $L_{1-58}$ | $L_{2-10}$ |
| Compound 7825 | $L_{1-58}$ | $L_{2-15}$ |
| Compound 7826 | $L_{1-58}$ | $L_{2-20}$ |
| Compound 7827 | $L_{1-58}$ | $L_{2-65}$ |
| Compound 7828 | $L_{1-58}$ | $L_{2-109}$ |
| Compound 7829 | $L_{1-59}$ | $L_{2-1}$ |

TABLE 1-continued

| | | |
|---|---|---|
| Compound 7830 | $L_{1-59}$ | $L_{2-10}$ |
| Compound 7831 | $L_{1-59}$ | $L_{2-15}$ |
| Compound 7832 | $L_{1-59}$ | $L_{2-20}$ |
| Compound 7833 | $L_{1-59}$ | $L_{2-65}$ |
| Compound 7834 | $L_{1-59}$ | $L_{2-109}$ |
| Compound 7835 | $L_{1-60}$ | $L_{2-1}$ |
| Compound 7836 | $L_{1-60}$ | $L_{2-10}$ |
| Compound 7837 | $L_{1-60}$ | $L_{2-15}$ |
| Compound 7838 | $L_{1-60}$ | $L_{2-20}$ |
| Compound 7839 | $L_{1-60}$ | $L_{2-65}$ |
| Compound 7840 | $L_{1-60}$ | $L_{2-109}$ |
| Compound 7841 | $L_{1-61}$ | $L_{2-1}$ |
| Compound 7842 | $L_{1-61}$ | $L_{2-10}$ |
| Compound 7843 | $L_{1-61}$ | $L_{2-15}$ |
| Compound 7844 | $L_{1-61}$ | $L_{2-20}$ |
| Compound 7845 | $L_{1-61}$ | $L_{2-65}$ |
| Compound 7846 | $L_{1-61}$ | $L_{2-109}$ |
| Compound 7847 | $L_{1-62}$ | $L_{2-1}$ |
| Compound 7848 | $L_{1-62}$ | $L_{2-10}$ |
| Compound 7849 | $L_{1-62}$ | $L_{2-15}$ |
| Compound 7850 | $L_{1-62}$ | $L_{2-20}$ |
| Compound 7851 | $L_{1-62}$ | $L_{2-65}$ |
| Compound 7852 | $L_{1-62}$ | $L_{2-109}$ |
| Compound 7853 | $L_{1-63}$ | $L_{2-1}$ |
| Compound 7854 | $L_{1-63}$ | $L_{2-10}$ |
| Compound 7855 | $L_{1-63}$ | $L_{2-15}$ |
| Compound 7856 | $L_{1-63}$ | $L_{2-20}$ |
| Compound 7857 | $L_{1-63}$ | $L_{2-65}$ |
| Compound 7858 | $L_{1-63}$ | $L_{2-109}$ |
| Compound 7859 | $L_{1-64}$ | $L_{2-1}$ |
| Compound 7860 | $L_{1-64}$ | $L_{2-10}$ |
| Compound 7861 | $L_{1-64}$ | $L_{2-15}$ |
| Compound 7862 | $L_{1-64}$ | $L_{2-20}$ |
| Compound 7863 | $L_{1-64}$ | $L_{2-65}$ |
| Compound 7864 | $L_{1-64}$ | $L_{2-109}$ |
| Compound 7865 | $L_{1-65}$ | $L_{2-1}$ |
| Compound 7866 | $L_{1-65}$ | $L_{2-10}$ |
| Compound 7867 | $L_{1-65}$ | $L_{2-15}$ |
| Compound 7868 | $L_{1-65}$ | $L_{2-20}$ |
| Compound 7869 | $L_{1-65}$ | $L_{2-65}$ |
| Compound 7870 | $L_{1-65}$ | $L_{2-109}$ |
| Compound 7871 | $L_{1-66}$ | $L_{2-1}$ |
| Compound 7872 | $L_{1-66}$ | $L_{2-10}$ |
| Compound 7873 | $L_{1-66}$ | $L_{2-15}$ |
| Compound 7874 | $L_{1-66}$ | $L_{2-20}$ |
| Compound 7875 | $L_{1-66}$ | $L_{2-65}$ |
| Compound 7876 | $L_{1-66}$ | $L_{2-109}$ |
| Compound 7877 | $L_{1-67}$ | $L_{2-1}$ |
| Compound 7878 | $L_{1-67}$ | $L_{2-10}$ |
| Compound 7879 | $L_{1-67}$ | $L_{2-15}$ |
| Compound 7880 | $L_{1-67}$ | $L_{2-20}$ |
| Compound 7881 | $L_{1-67}$ | $L_{2-65}$ |
| Compound 7882 | $L_{1-67}$ | $L_{2-109}$ |
| Compound 7883 | $L_{1-68}$ | $L_{2-1}$ |
| Compound 7884 | $L_{1-68}$ | $L_{2-10}$ |
| Compound 7885 | $L_{1-68}$ | $L_{2-15}$ |
| Compound 7886 | $L_{1-68}$ | $L_{2-20}$ |
| Compound 7887 | $L_{1-68}$ | $L_{2-65}$ |
| Compound 7888 | $L_{1-68}$ | $L_{2-109}$ |
| Compound 7889 | $L_{1-69}$ | $L_{2-1}$ |
| Compound 7890 | $L_{1-69}$ | $L_{2-10}$ |
| Compound 7891 | $L_{1-69}$ | $L_{2-15}$ |
| Compound 7892 | $L_{1-69}$ | $L_{2-20}$ |
| Compound 7893 | $L_{1-69}$ | $L_{2-65}$ |
| Compound 7894 | $L_{1-69}$ | $L_{2-109}$ |
| Compound 7895 | $L_{1-70}$ | $L_{2-1}$ |
| Compound 7896 | $L_{1-70}$ | $L_{2-10}$ |
| Compound 7897 | $L_{1-70}$ | $L_{2-15}$ |
| Compound 7898 | $L_{1-70}$ | $L_{2-20}$ |
| Compound 7899 | $L_{1-70}$ | $L_{2-65}$ |
| Compound 7900 | $L_{1-70}$ | $L_{2-109}$ |
| Compound 7901 | $L_{1-71}$ | $L_{2-1}$ |
| Compound 7902 | $L_{1-71}$ | $L_{2-10}$ |
| Compound 7903 | $L_{1-71}$ | $L_{2-15}$ |
| Compound 7904 | $L_{1-71}$ | $L_{2-20}$ |
| Compound 7905 | $L_{1-71}$ | $L_{2-65}$ |
| Compound 7906 | $L_{1-71}$ | $L_{2-109}$ |
| Compound 7907 | $L_{1-72}$ | $L_{2-1}$ |
| Compound 7908 | $L_{1-72}$ | $L_{2-10}$ |
| Compound 7909 | $L_{1-72}$ | $L_{2-15}$ |

TABLE 1-continued

| | | |
|---|---|---|
| Compound 7910 | $L_{1-72}$ | $L_{2-20}$ |
| Compound 7911 | $L_{1-72}$ | $L_{2-65}$ |
| Compound 7912 | $L_{1-72}$ | $L_{2-109}$ |
| Compound 7913 | $L_{1-73}$ | $L_{2-1}$ |
| Compound 7914 | $L_{1-73}$ | $L_{2-10}$ |
| Compound 7915 | $L_{1-73}$ | $L_{2-15}$ |
| Compound 7916 | $L_{1-73}$ | $L_{2-20}$ |
| Compound 7917 | $L_{1-73}$ | $L_{2-65}$ |
| Compound 7918 | $L_{1-73}$ | $L_{2-109}$ |
| Compound 7919 | $L_{1-74}$ | $L_{2-1}$ |
| Compound 7920 | $L_{1-74}$ | $L_{2-10}$ |
| Compound 7921 | $L_{1-74}$ | $L_{2-15}$ |
| Compound 7922 | $L_{1-74}$ | $L_{2-20}$ |
| Compound 7923 | $L_{1-74}$ | $L_{2-65}$ |
| Compound 7924 | $L_{1-74}$ | $L_{2-109}$ |
| Compound 7925 | $L_{1-75}$ | $L_{2-1}$ |
| Compound 7926 | $L_{1-75}$ | $L_{2-10}$ |
| Compound 7927 | $L_{1-75}$ | $L_{2-15}$ |
| Compound 7928 | $L_{1-75}$ | $L_{2-20}$ |
| Compound 7929 | $L_{1-75}$ | $L_{2-65}$ |
| Compound 7930 | $L_{1-75}$ | $L_{2-109}$ |
| Compound 7931 | $L_{1-76}$ | $L_{2-1}$ |
| Compound 7932 | $L_{1-76}$ | $L_{2-10}$ |
| Compound 7933 | $L_{1-76}$ | $L_{2-15}$ |
| Compound 7934 | $L_{1-76}$ | $L_{2-20}$ |
| Compound 7935 | $L_{1-76}$ | $L_{2-65}$ |
| Compound 7936 | $L_{1-76}$ | $L_{2-109}$ |
| Compound 7937 | $L_{1-77}$ | $L_{2-1}$ |
| Compound 7938 | $L_{1-77}$ | $L_{2-10}$ |
| Compound 7939 | $L_{1-77}$ | $L_{2-15}$ |
| Compound 7940 | $L_{1-77}$ | $L_{2-20}$ |
| Compound 7941 | $L_{1-77}$ | $L_{2-65}$ |
| Compound 7942 | $L_{1-77}$ | $L_{2-109}$ |
| Compound 7943 | $L_{1-78}$ | $L_{2-1}$ |
| Compound 7944 | $L_{1-78}$ | $L_{2-10}$ |
| Compound 7945 | $L_{1-78}$ | $L_{2-15}$ |
| Compound 7946 | $L_{1-78}$ | $L_{2-20}$ |
| Compound 7947 | $L_{1-78}$ | $L_{2-65}$ |
| Compound 7948 | $L_{1-78}$ | $L_{2-109}$ |
| Compound 7949 | $L_{1-79}$ | $L_{2-1}$ |
| Compound 7950 | $L_{1-79}$ | $L_{2-10}$ |
| Compound 7951 | $L_{1-79}$ | $L_{2-15}$ |
| Compound 7952 | $L_{1-79}$ | $L_{2-20}$ |
| Compound 7953 | $L_{1-79}$ | $L_{2-65}$ |
| Compound 7954 | $L_{1-79}$ | $L_{2-109}$ |
| Compound 7955 | $L_{1-80}$ | $L_{2-1}$ |
| Compound 7956 | $L_{1-80}$ | $L_{2-10}$ |
| Compound 7957 | $L_{1-80}$ | $L_{2-15}$ |
| Compound 7958 | $L_{1-80}$ | $L_{2-20}$ |
| Compound 7959 | $L_{1-80}$ | $L_{2-65}$ |
| Compound 7960 | $L_{1-80}$ | $L_{2-109}$ |
| Compound 7961 | $L_{1-81}$ | $L_{2-1}$ |
| Compound 7962 | $L_{1-81}$ | $L_{2-10}$ |
| Compound 7963 | $L_{1-81}$ | $L_{2-15}$ |
| Compound 7964 | $L_{1-81}$ | $L_{2-20}$ |
| Compound 7965 | $L_{1-81}$ | $L_{2-65}$ |
| Compound 7966 | $L_{1-81}$ | $L_{2-109}$ |
| Compound 7967 | $L_{1-82}$ | $L_{2-1}$ |
| Compound 7968 | $L_{1-82}$ | $L_{2-10}$ |
| Compound 7969 | $L_{1-82}$ | $L_{2-15}$ |
| Compound 7970 | $L_{1-82}$ | $L_{2-20}$ |
| Compound 7971 | $L_{1-82}$ | $L_{2-65}$ |
| Compound 7972 | $L_{1-82}$ | $L_{2-109}$ |
| Compound 7973 | $L_{1-83}$ | $L_{2-1}$ |
| Compound 7974 | $L_{1-83}$ | $L_{2-10}$ |
| Compound 7975 | $L_{1-83}$ | $L_{2-15}$ |
| Compound 7976 | $L_{1-83}$ | $L_{2-20}$ |
| Compound 7977 | $L_{1-83}$ | $L_{2-65}$ |
| Compound 7978 | $L_{1-83}$ | $L_{2-109}$ |
| Compound 7979 | $L_{1-84}$ | $L_{2-1}$ |
| Compound 7980 | $L_{1-84}$ | $L_{2-10}$ |
| Compound 7981 | $L_{1-84}$ | $L_{2-15}$ |
| Compound 7982 | $L_{1-84}$ | $L_{2-20}$ |
| Compound 7983 | $L_{1-84}$ | $L_{2-65}$ |
| Compound 7984 | $L_{1-84}$ | $L_{2-109}$ |
| Compound 7985 | $L_{1-85}$ | $L_{2-1}$ |
| Compound 7986 | $L_{1-85}$ | $L_{2-10}$ |
| Compound 7987 | $L_{1-85}$ | $L_{2-15}$ |
| Compound 7988 | $L_{1-85}$ | $L_{2-20}$ |
| Compound 7989 | $L_{1-85}$ | $L_{2-65}$ |

TABLE 1-continued

| | | |
|---|---|---|
| Compound 7990 | $L_{1-85}$ | $L_{2-109}$ |
| Compound 7991 | $L_{1-86}$ | $L_{2-1}$ |
| Compound 7992 | $L_{1-86}$ | $L_{2-10}$ |
| Compound 7993 | $L_{1-86}$ | $L_{2-15}$ |
| Compound 7994 | $L_{1-86}$ | $L_{2-20}$ |
| Compound 7995 | $L_{1-86}$ | $L_{2-65}$ |
| Compound 7996 | $L_{1-86}$ | $L_{2-109}$ |
| Compound 7997 | $L_{1-87}$ | $L_{2-1}$ |
| Compound 7998 | $L_{1-87}$ | $L_{2-10}$ |
| Compound 7999 | $L_{1-87}$ | $L_{2-15}$ |
| Compound 8000 | $L_{1-87}$ | $L_{2-20}$ |
| Compound 8001 | $L_{1-87}$ | $L_{2-65}$ |
| Compound 8002 | $L_{1-87}$ | $L_{2-109}$ |
| Compound 8003 | $L_{1-88}$ | $L_{2-1}$ |
| Compound 8004 | $L_{1-88}$ | $L_{2-10}$ |
| Compound 8005 | $L_{1-88}$ | $L_{2-15}$ |
| Compound 8006 | $L_{1-88}$ | $L_{2-20}$ |
| Compound 8007 | $L_{1-88}$ | $L_{2-65}$ |
| Compound 8008 | $L_{1-88}$ | $L_{2-109}$ |
| Compound 8009 | $L_{1-89}$ | $L_{2-1}$ |
| Compound 8010 | $L_{1-89}$ | $L_{2-10}$ |
| Compound 8011 | $L_{1-89}$ | $L_{2-15}$ |
| Compound 8012 | $L_{1-89}$ | $L_{2-20}$ |
| Compound 8013 | $L_{1-89}$ | $L_{2-65}$ |
| Compound 8014 | $L_{1-89}$ | $L_{2-109}$ |
| Compound 8015 | $L_{1-90}$ | $L_{2-1}$ |
| Compound 8016 | $L_{1-90}$ | $L_{2-10}$ |
| Compound 8017 | $L_{1-90}$ | $L_{2-15}$ |
| Compound 8018 | $L_{1-90}$ | $L_{2-20}$ |
| Compound 8019 | $L_{1-90}$ | $L_{2-65}$ |
| Compound 8020 | $L_{1-90}$ | $L_{2-109}$ |
| Compound 8021 | $L_{1-91}$ | $L_{2-1}$ |
| Compound 8022 | $L_{1-91}$ | $L_{2-10}$ |
| Compound 8023 | $L_{1-91}$ | $L_{2-15}$ |
| Compound 8024 | $L_{1-91}$ | $L_{2-20}$ |
| Compound 8025 | $L_{1-91}$ | $L_{2-65}$ |
| Compound 8026 | $L_{1-91}$ | $L_{2-109}$ |
| Compound 8027 | $L_{1-92}$ | $L_{2-1}$ |
| Compound 8028 | $L_{1-92}$ | $L_{2-10}$ |
| Compound 8029 | $L_{1-92}$ | $L_{2-15}$ |
| Compound 8030 | $L_{1-92}$ | $L_{2-20}$ |
| Compound 8031 | $L_{1-92}$ | $L_{2-65}$ |
| Compound 8032 | $L_{1-92}$ | $L_{2-109}$ |
| Compound 8033 | $L_{1-93}$ | $L_{2-1}$ |
| Compound 8034 | $L_{1-93}$ | $L_{2-10}$ |
| Compound 8035 | $L_{1-93}$ | $L_{2-15}$ |
| Compound 8036 | $L_{1-93}$ | $L_{2-20}$ |
| Compound 8037 | $L_{1-93}$ | $L_{2-65}$ |
| Compound 8038 | $L_{1-93}$ | $L_{2-109}$ |
| Compound 8039 | $L_{1-94}$ | $L_{2-1}$ |
| Compound 8040 | $L_{1-94}$ | $L_{2-10}$ |
| Compound 8041 | $L_{1-94}$ | $L_{2-15}$ |
| Compound 8042 | $L_{1-94}$ | $L_{2-20}$ |
| Compound 8043 | $L_{1-94}$ | $L_{2-65}$ |
| Compound 8044 | $L_{1-94}$ | $L_{2-109}$ |
| Compound 8045 | $L_{1-95}$ | $L_{2-1}$ |
| Compound 8046 | $L_{1-95}$ | $L_{2-10}$ |
| Compound 8047 | $L_{1-95}$ | $L_{2-15}$ |
| Compound 8048 | $L_{1-95}$ | $L_{2-20}$ |
| Compound 8049 | $L_{1-95}$ | $L_{2-65}$ |
| Compound 8050 | $L_{1-95}$ | $L_{2-109}$ |
| Compound 8051 | $L_{1-96}$ | $L_{2-1}$ |
| Compound 8052 | $L_{1-96}$ | $L_{2-10}$ |
| Compound 8053 | $L_{1-96}$ | $L_{2-15}$ |
| Compound 8054 | $L_{1-96}$ | $L_{2-20}$ |
| Compound 8055 | $L_{1-96}$ | $L_{2-65}$ |
| Compound 8056 | $L_{1-96}$ | $L_{2-109}$ |
| Compound 8057 | $L_{1-97}$ | $L_{2-1}$ |
| Compound 8058 | $L_{1-97}$ | $L_{2-10}$ |
| Compound 8059 | $L_{1-97}$ | $L_{2-15}$ |
| Compound 8060 | $L_{1-97}$ | $L_{2-20}$ |
| Compound 8061 | $L_{1-97}$ | $L_{2-65}$ |
| Compound 8062 | $L_{1-97}$ | $L_{2-109}$ |
| Compound 8063 | $L_{1-98}$ | $L_{2-1}$ |
| Compound 8064 | $L_{1-98}$ | $L_{2-10}$ |
| Compound 8065 | $L_{1-98}$ | $L_{2-15}$ |
| Compound 8066 | $L_{1-98}$ | $L_{2-20}$ |
| Compound 8067 | $L_{1-98}$ | $L_{2-65}$ |
| Compound 8068 | $L_{1-98}$ | $L_{2-109}$ |
| Compound 8069 | $L_{1-99}$ | $L_{2-1}$ |

TABLE 1-continued

| | | |
|---|---|---|
| Compound 8070 | $L_{1-99}$ | $L_{2-10}$ |
| Compound 8071 | $L_{1-99}$ | $L_{2-15}$ |
| Compound 8072 | $L_{1-99}$ | $L_{2-20}$ |
| Compound 8073 | $L_{1-99}$ | $L_{2-65}$ |
| Compound 8074 | $L_{1-99}$ | $L_{2-109}$ |
| Compound 8075 | $L_{1-100}$ | $L_{2-1}$ |
| Compound 8076 | $L_{1-100}$ | $L_{2-10}$ |
| Compound 8077 | $L_{1-100}$ | $L_{2-15}$ |
| Compound 8078 | $L_{1-100}$ | $L_{2-20}$ |
| Compound 8079 | $L_{1-100}$ | $L_{2-65}$ |
| Compound 8080 | $L_{1-100}$ | $L_{2-109}$ |
| Compound 8081 | $L_{1-101}$ | $L_{2-1}$ |
| Compound 8082 | $L_{1-101}$ | $L_{2-10}$ |
| Compound 8083 | $L_{1-101}$ | $L_{2-15}$ |
| Compound 8084 | $L_{1-101}$ | $L_{2-20}$ |
| Compound 8085 | $L_{1-101}$ | $L_{2-65}$ |
| Compound 8086 | $L_{1-101}$ | $L_{2-109}$ |
| Compound 8087 | $L_{1-102}$ | $L_{2-1}$ |
| Compound 8088 | $L_{1-102}$ | $L_{2-10}$ |
| Compound 8089 | $L_{1-102}$ | $L_{2-15}$ |
| Compound 8090 | $L_{1-102}$ | $L_{2-20}$ |
| Compound 8091 | $L_{1-102}$ | $L_{2-65}$ |
| Compound 8092 | $L_{1-102}$ | $L_{2-109}$ |
| Compound 8093 | $L_{1-103}$ | $L_{2-1}$ |
| Compound 8094 | $L_{1-103}$ | $L_{2-10}$ |
| Compound 8095 | $L_{1-103}$ | $L_{2-15}$ |
| Compound 8096 | $L_{1-103}$ | $L_{2-20}$ |
| Compound 8097 | $L_{1-103}$ | $L_{2-65}$ |
| Compound 8098 | $L_{1-103}$ | $L_{2-109}$ |
| Compound 8099 | $L_{1-104}$ | $L_{2-1}$ |
| Compound 8100 | $L_{1-104}$ | $L_{2-10}$ |
| Compound 8101 | $L_{1-104}$ | $L_{2-15}$ |
| Compound 8102 | $L_{1-104}$ | $L_{2-20}$ |
| Compound 8103 | $L_{1-104}$ | $L_{2-65}$ |
| Compound 8104 | $L_{1-104}$ | $L_{2-109}$ |
| Compound 8105 | $L_{1-105}$ | $L_{2-1}$ |
| Compound 8106 | $L_{1-105}$ | $L_{2-10}$ |
| Compound 8107 | $L_{1-105}$ | $L_{2-15}$ |
| Compound 8108 | $L_{1-105}$ | $L_{2-20}$ |
| Compound 8109 | $L_{1-105}$ | $L_{2-65}$ |
| Compound 8110 | $L_{1-105}$ | $L_{2-109}$ |
| Compound 8111 | $L_{1-106}$ | $L_{2-1}$ |
| Compound 8112 | $L_{1-106}$ | $L_{2-10}$ |
| Compound 8113 | $L_{1-106}$ | $L_{2-15}$ |
| Compound 8114 | $L_{1-106}$ | $L_{2-20}$ |
| Compound 8115 | $L_{1-106}$ | $L_{2-65}$ |
| Compound 8116 | $L_{1-106}$ | $L_{2-109}$ |
| Compound 8117 | $L_{1-107}$ | $L_{2-1}$ |
| Compound 8118 | $L_{1-107}$ | $L_{2-10}$ |
| Compound 8119 | $L_{1-107}$ | $L_{2-15}$ |
| Compound 8120 | $L_{1-107}$ | $L_{2-20}$ |
| Compound 8121 | $L_{1-107}$ | $L_{2-65}$ |
| Compound 8122 | $L_{1-107}$ | $L_{2-109}$ |
| Compound 8123 | $L_{1-108}$ | $L_{2-1}$ |
| Compound 8124 | $L_{1-108}$ | $L_{2-10}$ |
| Compound 8125 | $L_{1-108}$ | $L_{2-15}$ |
| Compound 8126 | $L_{1-108}$ | $L_{2-20}$ |
| Compound 8127 | $L_{1-108}$ | $L_{2-65}$ |
| Compound 8128 | $L_{1-108}$ | $L_{2-109}$ |
| Compound 8129 | $L_{1-109}$ | $L_{2-1}$ |
| Compound 8130 | $L_{1-109}$ | $L_{2-10}$ |
| Compound 8131 | $L_{1-109}$ | $L_{2-15}$ |
| Compound 8132 | $L_{1-109}$ | $L_{2-20}$ |
| Compound 8133 | $L_{1-109}$ | $L_{2-65}$ |
| Compound 8134 | $L_{1-109}$ | $L_{2-109}$ |
| Compound 8135 | $L_{1-110}$ | $L_{2-1}$ |
| Compound 8136 | $L_{1-110}$ | $L_{2-10}$ |
| Compound 8137 | $L_{1-110}$ | $L_{2-15}$ |
| Compound 8138 | $L_{1-110}$ | $L_{2-20}$ |
| Compound 8139 | $L_{1-110}$ | $L_{2-65}$ |
| Compound 8140 | $L_{1-110}$ | $L_{2-109}$ |
| Compound 8141 | $L_{1-111}$ | $L_{2-1}$ |
| Compound 8142 | $L_{1-111}$ | $L_{2-10}$ |
| Compound 8143 | $L_{1-111}$ | $L_{2-15}$ |
| Compound 8144 | $L_{1-111}$ | $L_{2-20}$ |
| Compound 8145 | $L_{1-111}$ | $L_{2-65}$ |
| Compound 8146 | $L_{1-111}$ | $L_{2-109}$ |
| Compound 8147 | $L_{1-112}$ | $L_{2-1}$ |
| Compound 8148 | $L_{1-112}$ | $L_{2-10}$ |
| Compound 8149 | $L_{1-112}$ | $L_{2-15}$ |

TABLE 1-continued

| | | |
|---|---|---|
| Compound 8150 | $L_{1-112}$ | $L_{2-20}$ |
| Compound 8151 | $L_{1-112}$ | $L_{2-65}$ |
| Compound 8152 | $L_{1-112}$ | $L_{2-109}$ |
| Compound 8153 | $L_{1-113}$ | $L_{2-1}$ |
| Compound 8154 | $L_{1-113}$ | $L_{2-10}$ |
| Compound 8155 | $L_{1-113}$ | $L_{2-15}$ |
| Compound 8156 | $L_{1-113}$ | $L_{2-20}$ |
| Compound 8157 | $L_{1-113}$ | $L_{2-65}$ |
| Compound 8158 | $L_{1-113}$ | $L_{2-109}$ |
| Compound 8159 | $L_{1-114}$ | $L_{2-1}$ |
| Compound 8160 | $L_{1-114}$ | $L_{2-10}$ |
| Compound 8161 | $L_{1-114}$ | $L_{2-15}$ |
| Compound 8162 | $L_{1-114}$ | $L_{2-20}$ |
| Compound 8163 | $L_{1-114}$ | $L_{2-65}$ |
| Compound 8164 | $L_{1-114}$ | $L_{2-109}$ |
| Compound 8165 | $L_{1-115}$ | $L_{2-1}$ |
| Compound 8166 | $L_{1-115}$ | $L_{2-10}$ |
| Compound 8167 | $L_{1-115}$ | $L_{2-15}$ |
| Compound 8168 | $L_{1-115}$ | $L_{2-20}$ |
| Compound 8169 | $L_{1-115}$ | $L_{2-65}$ |
| Compound 8170 | $L_{1-115}$ | $L_{2-109}$ |
| Compound 8171 | $L_{1-116}$ | $L_{2-1}$ |
| Compound 8172 | $L_{1-116}$ | $L_{2-10}$ |
| Compound 8173 | $L_{1-116}$ | $L_{2-15}$ |
| Compound 8174 | $L_{1-116}$ | $L_{2-20}$ |
| Compound 8175 | $L_{1-116}$ | $L_{2-65}$ |
| Compound 8176 | $L_{1-116}$ | $L_{2-109}$ |
| Compound 8177 | $L_{1-117}$ | $L_{2-1}$ |
| Compound 8178 | $L_{1-117}$ | $L_{2-10}$ |
| Compound 8179 | $L_{1-117}$ | $L_{2-15}$ |
| Compound 8180 | $L_{1-117}$ | $L_{2-20}$ |
| Compound 8181 | $L_{1-117}$ | $L_{2-65}$ |
| Compound 8182 | $L_{1-117}$ | $L_{2-109}$ |
| Compound 8183 | $L_{1-118}$ | $L_{2-1}$ |
| Compound 8184 | $L_{1-118}$ | $L_{2-10}$ |
| Compound 8185 | $L_{1-118}$ | $L_{2-15}$ |
| Compound 8186 | $L_{1-118}$ | $L_{2-20}$ |
| Compound 8187 | $L_{1-118}$ | $L_{2-65}$ |
| Compound 8188 | $L_{1-118}$ | $L_{2-109}$ |
| Compound 8189 | $L_{1-119}$ | $L_{2-1}$ |
| Compound 8190 | $L_{1-119}$ | $L_{2-10}$ |
| Compound 8191 | $L_{1-119}$ | $L_{2-15}$ |
| Compound 8192 | $L_{1-119}$ | $L_{2-20}$ |
| Compound 8193 | $L_{1-119}$ | $L_{2-65}$ |
| Compound 8194 | $L_{1-119}$ | $L_{2-109}$ |
| Compound 8195 | $L_{1-120}$ | $L_{2-1}$ |
| Compound 8196 | $L_{1-120}$ | $L_{2-10}$ |
| Compound 8197 | $L_{1-120}$ | $L_{2-15}$ |
| Compound 8198 | $L_{1-120}$ | $L_{2-20}$ |
| Compound 8199 | $L_{1-120}$ | $L_{2-65}$ |
| Compound 8200 | $L_{1-120}$ | $L_{2-109}$ |
| Compound 8201 | $L_{1-121}$ | $L_{2-1}$ |
| Compound 8202 | $L_{1-121}$ | $L_{2-10}$ |
| Compound 8203 | $L_{1-121}$ | $L_{2-15}$ |
| Compound 8204 | $L_{1-121}$ | $L_{2-20}$ |
| Compound 8205 | $L_{1-121}$ | $L_{2-65}$ |
| Compound 8206 | $L_{1-121}$ | $L_{2-109}$ |
| Compound 8207 | $L_{1-122}$ | $L_{2-1}$ |
| Compound 8208 | $L_{1-122}$ | $L_{2-10}$ |
| Compound 8209 | $L_{1-122}$ | $L_{2-15}$ |
| Compound 8210 | $L_{1-122}$ | $L_{2-20}$ |
| Compound 8211 | $L_{1-122}$ | $L_{2-65}$ |
| Compound 8212 | $L_{1-122}$ | $L_{2-109}$ |
| Compound 8213 | $L_{1-123}$ | $L_{2-1}$ |
| Compound 8214 | $L_{1-123}$ | $L_{2-10}$ |
| Compound 8215 | $L_{1-123}$ | $L_{2-15}$ |
| Compound 8216 | $L_{1-123}$ | $L_{2-20}$ |
| Compound 8217 | $L_{1-123}$ | $L_{2-65}$ |
| Compound 8218 | $L_{1-123}$ | $L_{2-109}$ |
| Compound 8219 | $L_{1-124}$ | $L_{2-1}$ |
| Compound 8220 | $L_{1-124}$ | $L_{2-10}$ |
| Compound 8221 | $L_{1-124}$ | $L_{2-15}$ |
| Compound 8222 | $L_{1-124}$ | $L_{2-20}$ |
| Compound 8223 | $L_{1-124}$ | $L_{2-65}$ |
| Compound 8224 | $L_{1-124}$ | $L_{2-109}$ |
| Compound 8225 | $L_{1-125}$ | $L_{2-1}$ |
| Compound 8226 | $L_{1-125}$ | $L_{2-10}$ |
| Compound 8227 | $L_{1-125}$ | $L_{2-15}$ |
| Compound 8228 | $L_{1-125}$ | $L_{2-20}$ |
| Compound 8229 | $L_{1-125}$ | $L_{2-65}$ |

TABLE 1-continued

| | | |
|---|---|---|
| Compound 8230 | $L_{1-125}$ | $L_{2-109}$ |
| Compound 8231 | $L_{1-126}$ | $L_{2-1}$ |
| Compound 8232 | $L_{1-126}$ | $L_{2-10}$ |
| Compound 8233 | $L_{1-126}$ | $L_{2-15}$ |
| Compound 8234 | $L_{1-126}$ | $L_{2-20}$ |
| Compound 8235 | $L_{1-126}$ | $L_{2-65}$ |
| Compound 8236 | $L_{1-126}$ | $L_{2-109}$ |
| Compound 8237 | $L_{1-127}$ | $L_{2-1}$ |
| Compound 8238 | $L_{1-127}$ | $L_{2-10}$ |
| Compound 8239 | $L_{1-127}$ | $L_{2-15}$ |
| Compound 8240 | $L_{1-127}$ | $L_{2-20}$ |
| Compound 8241 | $L_{1-127}$ | $L_{2-65}$ |
| Compound 8242 | $L_{1-127}$ | $L_{2-109}$ |
| Compound 8243 | $L_{1-128}$ | $L_{2-1}$ |
| Compound 8244 | $L_{1-128}$ | $L_{2-10}$ |
| Compound 8245 | $L_{1-128}$ | $L_{2-15}$ |
| Compound 8246 | $L_{1-128}$ | $L_{2-20}$ |
| Compound 8247 | $L_{1-128}$ | $L_{2-65}$ |
| Compound 8248 | $L_{1-128}$ | $L_{2-109}$ |
| Compound 8249 | $L_{1-129}$ | $L_{2-1}$ |
| Compound 8250 | $L_{1-129}$ | $L_{2-10}$ |
| Compound 8251 | $L_{1-129}$ | $L_{2-15}$ |
| Compound 8252 | $L_{1-129}$ | $L_{2-20}$ |
| Compound 8253 | $L_{1-129}$ | $L_{2-65}$ |
| Compound 8254 | $L_{1-129}$ | $L_{2-109}$ |
| Compound 8255 | $L_{1-130}$ | $L_{2-1}$ |
| Compound 8256 | $L_{1-130}$ | $L_{2-10}$ |
| Compound 8257 | $L_{1-130}$ | $L_{2-15}$ |
| Compound 8258 | $L_{1-130}$ | $L_{2-20}$ |
| Compound 8259 | $L_{1-130}$ | $L_{2-65}$ |
| Compound 8260 | $L_{1-130}$ | $L_{2-109}$ |
| Compound 8261 | $L_{1-131}$ | $L_{2-1}$ |
| Compound 8262 | $L_{1-131}$ | $L_{2-10}$ |
| Compound 8263 | $L_{1-131}$ | $L_{2-15}$ |
| Compound 8264 | $L_{1-131}$ | $L_{2-20}$ |
| Compound 8265 | $L_{1-131}$ | $L_{2-65}$ |
| Compound 8266 | $L_{1-131}$ | $L_{2-109}$ |
| Compound 8267 | $L_{1-132}$ | $L_{2-1}$ |
| Compound 8268 | $L_{1-132}$ | $L_{2-10}$ |
| Compound 8269 | $L_{1-132}$ | $L_{2-15}$ |
| Compound 8270 | $L_{1-132}$ | $L_{2-20}$ |
| Compound 8271 | $L_{1-132}$ | $L_{2-65}$ |
| Compound 8272 | $L_{1-132}$ | $L_{2-109}$ |
| Compound 8273 | $L_{1-133}$ | $L_{2-1}$ |
| Compound 8274 | $L_{1-133}$ | $L_{2-10}$ |
| Compound 8275 | $L_{1-133}$ | $L_{2-15}$ |
| Compound 8276 | $L_{1-133}$ | $L_{2-20}$ |
| Compound 8277 | $L_{1-133}$ | $L_{2-65}$ |
| Compound 8278 | $L_{1-133}$ | $L_{2-109}$ |
| Compound 8279 | $L_{1-134}$ | $L_{2-1}$ |
| Compound 8280 | $L_{1-134}$ | $L_{2-10}$ |
| Compound 8281 | $L_{1-134}$ | $L_{2-15}$ |
| Compound 8282 | $L_{1-134}$ | $L_{2-20}$ |
| Compound 8283 | $L_{1-134}$ | $L_{2-65}$ |
| Compound 8284 | $L_{1-134}$ | $L_{2-109}$ |
| Compound 8285 | $L_{1-135}$ | $L_{2-1}$ |
| Compound 8286 | $L_{1-135}$ | $L_{2-10}$ |
| Compound 8287 | $L_{1-135}$ | $L_{2-15}$ |
| Compound 8288 | $L_{1-135}$ | $L_{2-20}$ |
| Compound 8289 | $L_{1-135}$ | $L_{2-65}$ |
| Compound 8290 | $L_{1-135}$ | $L_{2-109}$ |
| Compound 8291 | $L_{1-136}$ | $L_{2-1}$ |
| Compound 8292 | $L_{1-136}$ | $L_{2-10}$ |
| Compound 8293 | $L_{1-136}$ | $L_{2-15}$ |
| Compound 8294 | $L_{1-136}$ | $L_{2-20}$ |
| Compound 8295 | $L_{1-136}$ | $L_{2-65}$ |
| Compound 8296 | $L_{1-136}$ | $L_{2-109}$ |
| Compound 8297 | $L_{1-137}$ | $L_{2-1}$ |
| Compound 8298 | $L_{1-137}$ | $L_{2-10}$ |
| Compound 8299 | $L_{1-137}$ | $L_{2-15}$ |
| Compound 8300 | $L_{1-137}$ | $L_{2-20}$ |
| Compound 8301 | $L_{1-137}$ | $L_{2-65}$ |
| Compound 8302 | $L_{1-137}$ | $L_{2-109}$ |
| Compound 8303 | $L_{1-138}$ | $L_{2-1}$ |
| Compound 8304 | $L_{1-138}$ | $L_{2-10}$ |
| Compound 8305 | $L_{1-138}$ | $L_{2-15}$ |
| Compound 8306 | $L_{1-138}$ | $L_{2-20}$ |
| Compound 8307 | $L_{1-138}$ | $L_{2-65}$ |
| Compound 8308 | $L_{1-138}$ | $L_{2-109}$ |
| Compound 8309 | $L_{1-139}$ | $L_{2-1}$ |

TABLE 1-continued

| | | |
|---|---|---|
| Compound 8310 | $L_{1-139}$ | $L_{2-10}$ |
| Compound 8311 | $L_{1-139}$ | $L_{2-15}$ |
| Compound 8312 | $L_{1-139}$ | $L_{2-20}$ |
| Compound 8313 | $L_{1-139}$ | $L_{2-65}$ |
| Compound 8314 | $L_{1-139}$ | $L_{2-109}$ |
| Compound 8315 | $L_{1-140}$ | $L_{2-1}$ |
| Compound 8316 | $L_{1-140}$ | $L_{2-10}$ |
| Compound 8317 | $L_{1-140}$ | $L_{2-15}$ |
| Compound 8318 | $L_{1-140}$ | $L_{2-20}$ |
| Compound 8319 | $L_{1-140}$ | $L_{2-65}$ |
| Compound 8320 | $L_{1-140}$ | $L_{2-109}$ |
| Compound 8321 | $L_{1-141}$ | $L_{2-1}$ |
| Compound 8322 | $L_{1-141}$ | $L_{2-10}$ |
| Compound 8323 | $L_{1-141}$ | $L_{2-15}$ |
| Compound 8324 | $L_{1-141}$ | $L_{2-20}$ |
| Compound 8325 | $L_{1-141}$ | $L_{2-65}$ |
| Compound 8326 | $L_{1-141}$ | $L_{2-109}$ |
| Compound 8327 | $L_{1-142}$ | $L_{2-1}$ |
| Compound 8328 | $L_{1-142}$ | $L_{2-10}$ |
| Compound 8329 | $L_{1-142}$ | $L_{2-15}$ |
| Compound 8330 | $L_{1-142}$ | $L_{2-20}$ |
| Compound 8331 | $L_{1-142}$ | $L_{2-65}$ |
| Compound 8332 | $L_{1-142}$ | $L_{2-109}$ |
| Compound 8333 | $L_{1-143}$ | $L_{2-1}$ |
| Compound 8334 | $L_{1-143}$ | $L_{2-10}$ |
| Compound 8335 | $L_{1-143}$ | $L_{2-15}$ |
| Compound 8336 | $L_{1-143}$ | $L_{2-20}$ |
| Compound 8337 | $L_{1-143}$ | $L_{2-65}$ |
| Compound 8338 | $L_{1-143}$ | $L_{2-109}$ |
| Compound 8339 | $L_{1-144}$ | $L_{2-1}$ |
| Compound 8340 | $L_{1-144}$ | $L_{2-10}$ |
| Compound 8341 | $L_{1-144}$ | $L_{2-15}$ |
| Compound 8342 | $L_{1-144}$ | $L_{2-20}$ |
| Compound 8343 | $L_{1-144}$ | $L_{2-65}$ |
| Compound 8344 | $L_{1-144}$ | $L_{2-109}$ |
| Compound 8345 | $L_{1-145}$ | $L_{2-1}$ |
| Compound 8346 | $L_{1-145}$ | $L_{2-10}$ |
| Compound 8347 | $L_{1-145}$ | $L_{2-15}$ |
| Compound 8348 | $L_{1-145}$ | $L_{2-20}$ |
| Compound 8349 | $L_{1-145}$ | $L_{2-65}$ |
| Compound 8350 | $L_{1-145}$ | $L_{2-109}$ |
| Compound 8351 | $L_{1-146}$ | $L_{2-1}$ |
| Compound 8352 | $L_{1-146}$ | $L_{2-10}$ |
| Compound 8353 | $L_{1-146}$ | $L_{2-15}$ |
| Compound 8354 | $L_{1-146}$ | $L_{2-20}$ |
| Compound 8355 | $L_{1-146}$ | $L_{2-65}$ |
| Compound 8356 | $L_{1-146}$ | $L_{2-109}$ |
| Compound 8357 | $L_{1-147}$ | $L_{2-1}$ |
| Compound 8358 | $L_{1-147}$ | $L_{2-10}$ |
| Compound 8359 | $L_{1-147}$ | $L_{2-15}$ |
| Compound 8360 | $L_{1-147}$ | $L_{2-20}$ |
| Compound 8361 | $L_{1-147}$ | $L_{2-65}$ |
| Compound 8362 | $L_{1-147}$ | $L_{2-109}$ |
| Compound 8363 | $L_{1-148}$ | $L_{2-1}$ |
| Compound 8364 | $L_{1-148}$ | $L_{2-10}$ |
| Compound 8365 | $L_{1-148}$ | $L_{2-15}$ |
| Compound 8366 | $L_{1-148}$ | $L_{2-20}$ |
| Compound 8367 | $L_{1-148}$ | $L_{2-65}$ |
| Compound 8368 | $L_{1-148}$ | $L_{2-109}$ |
| Compound 8369 | $L_{1-149}$ | $L_{2-1}$ |
| Compound 8370 | $L_{1-149}$ | $L_{2-10}$ |
| Compound 8371 | $L_{1-149}$ | $L_{2-15}$ |
| Compound 8372 | $L_{1-149}$ | $L_{2-20}$ |
| Compound 8373 | $L_{1-149}$ | $L_{2-65}$ |
| Compound 8374 | $L_{1-149}$ | $L_{2-109}$ |
| Compound 8375 | $L_{1-150}$ | $L_{2-1}$ |
| Compound 8376 | $L_{1-150}$ | $L_{2-10}$ |
| Compound 8377 | $L_{1-150}$ | $L_{2-15}$ |
| Compound 8378 | $L_{1-150}$ | $L_{2-20}$ |
| Compound 8379 | $L_{1-150}$ | $L_{2-65}$ |
| Compound 8380 | $L_{1-150}$ | $L_{2-109}$ |
| Compound 8381 | $L_{1-151}$ | $L_{2-1}$ |
| Compound 8382 | $L_{1-151}$ | $L_{2-10}$ |
| Compound 8383 | $L_{1-151}$ | $L_{2-15}$ |
| Compound 8384 | $L_{1-151}$ | $L_{2-20}$ |
| Compound 8385 | $L_{1-151}$ | $L_{2-65}$ |
| Compound 8386 | $L_{1-151}$ | $L_{2-109}$ |
| Compound 8387 | $L_{1-152}$ | $L_{2-1}$ |
| Compound 8388 | $L_{1-152}$ | $L_{2-10}$ |
| Compound 8389 | $L_{1-152}$ | $L_{2-15}$ |

TABLE 1-continued

| | | |
|---|---|---|
| Compound 8390 | $L_{1-152}$ | $L_{2-20}$ |
| Compound 8391 | $L_{1-152}$ | $L_{2-65}$ |
| Compound 8392 | $L_{1-152}$ | $L_{2-109}$ |
| Compound 8393 | $L_{1-153}$ | $L_{2-1}$ |
| Compound 8394 | $L_{1-153}$ | $L_{2-10}$ |
| Compound 8395 | $L_{1-153}$ | $L_{2-15}$ |
| Compound 8396 | $L_{1-153}$ | $L_{2-20}$ |
| Compound 8397 | $L_{1-153}$ | $L_{2-65}$ |
| Compound 8398 | $L_{1-153}$ | $L_{2-109}$ |
| Compound 8399 | $L_{1-154}$ | $L_{2-1}$ |
| Compound 8400 | $L_{1-154}$ | $L_{2-10}$ |
| Compound 8401 | $L_{1-154}$ | $L_{2-15}$ |
| Compound 8402 | $L_{1-154}$ | $L_{2-20}$ |
| Compound 8403 | $L_{1-154}$ | $L_{2-65}$ |
| Compound 8404 | $L_{1-154}$ | $L_{2-109}$ |
| Compound 8405 | $L_{1-155}$ | $L_{2-1}$ |
| Compound 8406 | $L_{1-155}$ | $L_{2-10}$ |
| Compound 8407 | $L_{1-155}$ | $L_{2-15}$ |
| Compound 8408 | $L_{1-155}$ | $L_{2-20}$ |
| Compound 8409 | $L_{1-155}$ | $L_{2-65}$ |
| Compound 8410 | $L_{1-155}$ | $L_{2-109}$ |
| Compound 8411 | $L_{1-156}$ | $L_{2-1}$ |
| Compound 8412 | $L_{1-156}$ | $L_{2-10}$ |
| Compound 8413 | $L_{1-156}$ | $L_{2-15}$ |
| Compound 8414 | $L_{1-156}$ | $L_{2-20}$ |
| Compound 8415 | $L_{1-156}$ | $L_{2-65}$ |
| Compound 8416 | $L_{1-156}$ | $L_{2-109}$ |
| Compound 8417 | $L_{1-157}$ | $L_{2-1}$ |
| Compound 8418 | $L_{1-157}$ | $L_{2-10}$ |
| Compound 8419 | $L_{1-157}$ | $L_{2-15}$ |
| Compound 8420 | $L_{1-157}$ | $L_{2-20}$ |
| Compound 8421 | $L_{1-157}$ | $L_{2-65}$ |
| Compound 8422 | $L_{1-157}$ | $L_{2-109}$ |
| Compound 8423 | $L_{1-158}$ | $L_{2-1}$ |
| Compound 8424 | $L_{1-158}$ | $L_{2-10}$ |
| Compound 8425 | $L_{1-158}$ | $L_{2-15}$ |
| Compound 8426 | $L_{1-158}$ | $L_{2-20}$ |
| Compound 8427 | $L_{1-158}$ | $L_{2-65}$ |
| Compound 8428 | $L_{1-158}$ | $L_{2-109}$ |
| Compound 8429 | $L_{1-159}$ | $L_{2-1}$ |
| Compound 8430 | $L_{1-159}$ | $L_{2-10}$ |
| Compound 8431 | $L_{1-159}$ | $L_{2-15}$ |
| Compound 8432 | $L_{1-159}$ | $L_{2-20}$ |
| Compound 8433 | $L_{1-159}$ | $L_{2-65}$ |
| Compound 8434 | $L_{1-159}$ | $L_{2-109}$ |
| Compound 8435 | $L_{1-160}$ | $L_{2-1}$ |
| Compound 8436 | $L_{1-160}$ | $L_{2-10}$ |
| Compound 8437 | $L_{1-160}$ | $L_{2-15}$ |
| Compound 8438 | $L_{1-160}$ | $L_{2-20}$ |
| Compound 8439 | $L_{1-160}$ | $L_{2-65}$ |
| Compound 8440 | $L_{1-160}$ | $L_{2-109}$ |
| Compound 8441 | $L_{1-161}$ | $L_{2-1}$ |
| Compound 8442 | $L_{1-161}$ | $L_{2-10}$ |
| Compound 8443 | $L_{1-161}$ | $L_{2-15}$ |
| Compound 8444 | $L_{1-161}$ | $L_{2-20}$ |
| Compound 8445 | $L_{1-161}$ | $L_{2-65}$ |
| Compound 8446 | $L_{1-161}$ | $L_{2-109}$ |
| Compound 8447 | $L_{1-162}$ | $L_{2-1}$ |
| Compound 8448 | $L_{1-162}$ | $L_{2-10}$ |
| Compound 8449 | $L_{1-162}$ | $L_{2-15}$ |
| Compound 8450 | $L_{1-162}$ | $L_{2-20}$ |
| Compound 8451 | $L_{1-162}$ | $L_{2-65}$ |
| Compound 8452 | $L_{1-162}$ | $L_{2-109}$ |
| Compound 8453 | $L_{1-163}$ | $L_{2-1}$ |
| Compound 8454 | $L_{1-163}$ | $L_{2-10}$ |
| Compound 8455 | $L_{1-163}$ | $L_{2-15}$ |
| Compound 8456 | $L_{1-163}$ | $L_{2-20}$ |
| Compound 8457 | $L_{1-163}$ | $L_{2-65}$ |
| Compound 8458 | $L_{1-163}$ | $L_{2-109}$ |
| Compound 8459 | $L_{1-164}$ | $L_{2-1}$ |
| Compound 8460 | $L_{1-164}$ | $L_{2-10}$ |
| Compound 8461 | $L_{1-164}$ | $L_{2-15}$ |
| Compound 8462 | $L_{1-164}$ | $L_{2-20}$ |
| Compound 8463 | $L_{1-164}$ | $L_{2-65}$ |
| Compound 8464 | $L_{1-164}$ | $L_{2-109}$ |
| Compound 8465 | $L_{1-165}$ | $L_{2-1}$ |
| Compound 8466 | $L_{1-165}$ | $L_{2-10}$ |
| Compound 8467 | $L_{1-165}$ | $L_{2-15}$ |
| Compound 8468 | $L_{1-165}$ | $L_{2-20}$ |
| Compound 8469 | $L_{1-165}$ | $L_{2-65}$ |

TABLE 1-continued

| | | |
|---|---|---|
| Compound 8470 | $L_{1-165}$ | $L_{2-109}$ |
| Compound 8471 | $L_{1-166}$ | $L_{2-1}$ |
| Compound 8472 | $L_{1-166}$ | $L_{2-10}$ |
| Compound 8473 | $L_{1-166}$ | $L_{2-15}$ |
| Compound 8474 | $L_{1-166}$ | $L_{2-20}$ |
| Compound 8475 | $L_{1-166}$ | $L_{2-65}$ |
| Compound 8476 | $L_{1-166}$ | $L_{2-109}$ |
| Compound 8477 | $L_{1-167}$ | $L_{2-1}$ |
| Compound 8478 | $L_{1-167}$ | $L_{2-10}$ |
| Compound 8479 | $L_{1-167}$ | $L_{2-15}$ |
| Compound 8480 | $L_{1-167}$ | $L_{2-20}$ |
| Compound 8481 | $L_{1-167}$ | $L_{2-65}$ |
| Compound 8482 | $L_{1-167}$ | $L_{2-109}$ |
| Compound 8483 | $L_{1-168}$ | $L_{2-1}$ |
| Compound 8484 | $L_{1-168}$ | $L_{2-10}$ |
| Compound 8485 | $L_{1-168}$ | $L_{2-15}$ |
| Compound 8486 | $L_{1-168}$ | $L_{2-20}$ |
| Compound 8487 | $L_{1-168}$ | $L_{2-65}$ |
| Compound 8488 | $L_{1-168}$ | $L_{2-109}$ |
| Compound 8489 | $L_{1-169}$ | $L_{2-1}$ |
| Compound 8490 | $L_{1-169}$ | $L_{2-10}$ |
| Compound 8491 | $L_{1-169}$ | $L_{2-15}$ |
| Compound 8492 | $L_{1-169}$ | $L_{2-20}$ |
| Compound 8493 | $L_{1-169}$ | $L_{2-65}$ |
| Compound 8494 | $L_{1-169}$ | $L_{2-109}$ |
| Compound 8495 | $L_{1-170}$ | $L_{2-1}$ |
| Compound 8496 | $L_{1-170}$ | $L_{2-10}$ |
| Compound 8497 | $L_{1-170}$ | $L_{2-15}$ |
| Compound 8498 | $L_{1-170}$ | $L_{2-20}$ |
| Compound 8499 | $L_{1-170}$ | $L_{2-65}$ |
| Compound 8500 | $L_{1-170}$ | $L_{2-109}$ |
| Compound 8501 | $L_{1-171}$ | $L_{2-1}$ |
| Compound 8502 | $L_{1-171}$ | $L_{2-10}$ |
| Compound 8503 | $L_{1-171}$ | $L_{2-15}$ |
| Compound 8504 | $L_{1-171}$ | $L_{2-20}$ |
| Compound 8505 | $L_{1-171}$ | $L_{2-65}$ |
| Compound 8506 | $L_{1-171}$ | $L_{2-109}$ |
| Compound 8507 | $L_{1-172}$ | $L_{2-1}$ |
| Compound 8508 | $L_{1-172}$ | $L_{2-10}$ |
| Compound 8509 | $L_{1-172}$ | $L_{2-15}$ |
| Compound 8510 | $L_{1-172}$ | $L_{2-20}$ |
| Compound 8511 | $L_{1-172}$ | $L_{2-65}$ |
| Compound 8512 | $L_{1-172}$ | $L_{2-109}$ |
| Compound 8513 | $L_{1-173}$ | $L_{2-1}$ |
| Compound 8514 | $L_{1-173}$ | $L_{2-10}$ |
| Compound 8515 | $L_{1-173}$ | $L_{2-15}$ |
| Compound 8516 | $L_{1-173}$ | $L_{2-20}$ |
| Compound 8517 | $L_{1-173}$ | $L_{2-65}$ |
| Compound 8518 | $L_{1-173}$ | $L_{2-109}$ |
| Compound 8519 | $L_{1-174}$ | $L_{2-1}$ |
| Compound 8520 | $L_{1-174}$ | $L_{2-10}$ |
| Compound 8521 | $L_{1-174}$ | $L_{2-15}$ |
| Compound 8522 | $L_{1-174}$ | $L_{2-20}$ |
| Compound 8523 | $L_{1-174}$ | $L_{2-65}$ |
| Compound 8524 | $L_{1-174}$ | $L_{2-109}$ |
| Compound 8525 | $L_{1-175}$ | $L_{2-1}$ |
| Compound 8526 | $L_{1-175}$ | $L_{2-10}$ |
| Compound 8527 | $L_{1-175}$ | $L_{2-15}$ |
| Compound 8528 | $L_{1-175}$ | $L_{2-20}$ |
| Compound 8529 | $L_{1-175}$ | $L_{2-65}$ |
| Compound 8530 | $L_{1-175}$ | $L_{2-109}$ |
| Compound 8531 | $L_{1-176}$ | $L_{2-1}$ |
| Compound 8532 | $L_{1-176}$ | $L_{2-10}$ |
| Compound 8533 | $L_{1-176}$ | $L_{2-15}$ |
| Compound 8534 | $L_{1-176}$ | $L_{2-20}$ |
| Compound 8535 | $L_{1-176}$ | $L_{2-65}$ |
| Compound 8536 | $L_{1-176}$ | $L_{2-109}$ |
| Compound 8537 | $L_{1-177}$ | $L_{2-1}$ |
| Compound 8538 | $L_{1-177}$ | $L_{2-10}$ |
| Compound 8539 | $L_{1-177}$ | $L_{2-15}$ |
| Compound 8540 | $L_{1-177}$ | $L_{2-20}$ |
| Compound 8541 | $L_{1-177}$ | $L_{2-65}$ |
| Compound 8542 | $L_{1-177}$ | $L_{2-109}$ |
| Compound 8543 | $L_{1-178}$ | $L_{2-1}$ |
| Compound 8544 | $L_{1-178}$ | $L_{2-10}$ |
| Compound 8545 | $L_{1-178}$ | $L_{2-15}$ |
| Compound 8546 | $L_{1-178}$ | $L_{2-20}$ |
| Compound 8547 | $L_{1-178}$ | $L_{2-65}$ |
| Compound 8548 | $L_{1-178}$ | $L_{2-109}$ |
| Compound 8549 | $L_{1-179}$ | $L_{2-1}$ |

TABLE 1-continued

| | | |
|---|---|---|
| Compound 8550 | $L_{1-179}$ | $L_{2-10}$ |
| Compound 8551 | $L_{1-179}$ | $L_{2-15}$ |
| Compound 8552 | $L_{1-179}$ | $L_{2-20}$ |
| Compound 8553 | $L_{1-179}$ | $L_{2-65}$ |
| Compound 8554 | $L_{1-179}$ | $L_{2-109}$ |
| Compound 8555 | $L_{1-180}$ | $L_{2-1}$ |
| Compound 8556 | $L_{1-180}$ | $L_{2-10}$ |
| Compound 8557 | $L_{1-180}$ | $L_{2-15}$ |
| Compound 8558 | $L_{1-180}$ | $L_{2-20}$ |
| Compound 8559 | $L_{1-180}$ | $L_{2-65}$ |
| Compound 8560 | $L_{1-180}$ | $L_{2-109}$ |
| Compound 8561 | $L_{1-181}$ | $L_{2-1}$ |
| Compound 8562 | $L_{1-181}$ | $L_{2-10}$ |
| Compound 8563 | $L_{1-181}$ | $L_{2-15}$ |
| Compound 8564 | $L_{1-181}$ | $L_{2-20}$ |
| Compound 8565 | $L_{1-181}$ | $L_{2-65}$ |
| Compound 8566 | $L_{1-181}$ | $L_{2-109}$ |
| Compound 8567 | $L_{1-182}$ | $L_{2-1}$ |
| Compound 8568 | $L_{1-182}$ | $L_{2-10}$ |
| Compound 8569 | $L_{1-182}$ | $L_{2-15}$ |
| Compound 8570 | $L_{1-182}$ | $L_{2-20}$ |
| Compound 8571 | $L_{1-182}$ | $L_{2-65}$ |
| Compound 8572 | $L_{1-182}$ | $L_{2-109}$ |
| Compound 8573 | $L_{1-183}$ | $L_{2-1}$ |
| Compound 8574 | $L_{1-183}$ | $L_{2-10}$ |
| Compound 8575 | $L_{1-183}$ | $L_{2-15}$ |
| Compound 8576 | $L_{1-183}$ | $L_{2-20}$ |
| Compound 8577 | $L_{1-183}$ | $L_{2-65}$ |
| Compound 8578 | $L_{1-183}$ | $L_{2-109}$ |
| Compound 8579 | $L_{1-184}$ | $L_{2-1}$ |
| Compound 8580 | $L_{1-184}$ | $L_{2-10}$ |
| Compound 8581 | $L_{1-184}$ | $L_{2-15}$ |
| Compound 8582 | $L_{1-184}$ | $L_{2-20}$ |
| Compound 8583 | $L_{1-184}$ | $L_{2-65}$ |
| Compound 8584 | $L_{1-184}$ | $L_{2-109}$ |
| Compound 8585 | $L_{1-185}$ | $L_{2-1}$ |
| Compound 8586 | $L_{1-185}$ | $L_{2-10}$ |
| Compound 8587 | $L_{1-185}$ | $L_{2-15}$ |
| Compound 8588 | $L_{1-185}$ | $L_{2-20}$ |
| Compound 8589 | $L_{1-185}$ | $L_{2-65}$ |
| Compound 8590 | $L_{1-185}$ | $L_{2-109}$ |
| Compound 8591 | $L_{1-186}$ | $L_{2-1}$ |
| Compound 8592 | $L_{1-186}$ | $L_{2-10}$ |
| Compound 8593 | $L_{1-186}$ | $L_{2-15}$ |
| Compound 8594 | $L_{1-186}$ | $L_{2-20}$ |
| Compound 8595 | $L_{1-186}$ | $L_{2-65}$ |
| Compound 8596 | $L_{1-186}$ | $L_{2-109}$ |
| Compound 8597 | $L_{1-187}$ | $L_{2-1}$ |
| Compound 8598 | $L_{1-187}$ | $L_{2-10}$ |
| Compound 8599 | $L_{1-187}$ | $L_{2-15}$ |
| Compound 8600 | $L_{1-187}$ | $L_{2-20}$ |
| Compound 8601 | $L_{1-187}$ | $L_{2-65}$ |
| Compound 8602 | $L_{1-187}$ | $L_{2-109}$ |
| Compound 8603 | $L_{1-188}$ | $L_{2-1}$ |
| Compound 8604 | $L_{1-188}$ | $L_{2-10}$ |
| Compound 8605 | $L_{1-188}$ | $L_{2-15}$ |
| Compound 8606 | $L_{1-188}$ | $L_{2-20}$ |
| Compound 8607 | $L_{1-188}$ | $L_{2-65}$ |
| Compound 8608 | $L_{1-188}$ | $L_{2-109}$ |
| Compound 8609 | $L_{1-189}$ | $L_{2-1}$ |
| Compound 8610 | $L_{1-189}$ | $L_{2-10}$ |
| Compound 8611 | $L_{1-189}$ | $L_{2-15}$ |
| Compound 8612 | $L_{1-189}$ | $L_{2-20}$ |
| Compound 8613 | $L_{1-189}$ | $L_{2-65}$ |
| Compound 8614 | $L_{1-189}$ | $L_{2-109}$ |
| Compound 8615 | $L_{1-190}$ | $L_{2-1}$ |
| Compound 8616 | $L_{1-190}$ | $L_{2-10}$ |
| Compound 8617 | $L_{1-190}$ | $L_{2-15}$ |
| Compound 8618 | $L_{1-190}$ | $L_{2-20}$ |
| Compound 8619 | $L_{1-190}$ | $L_{2-65}$ |
| Compound 8620 | $L_{1-190}$ | $L_{2-109}$ |
| Compound 8621 | $L_{1-191}$ | $L_{2-1}$ |
| Compound 8622 | $L_{1-191}$ | $L_{2-10}$ |
| Compound 8623 | $L_{1-191}$ | $L_{2-15}$ |
| Compound 8624 | $L_{1-191}$ | $L_{2-20}$ |
| Compound 8625 | $L_{1-191}$ | $L_{2-65}$ |
| Compound 8626 | $L_{1-191}$ | $L_{2-109}$ |
| Compound 8627 | $L_{1-192}$ | $L_{2-1}$ |
| Compound 8628 | $L_{1-192}$ | $L_{2-10}$ |
| Compound 8629 | $L_{1-192}$ | $L_{2-15}$ |

TABLE 1-continued

| | | |
|---|---|---|
| Compound 8630 | $L_{1-192}$ | $L_{2-20}$ |
| Compound 8631 | $L_{1-192}$ | $L_{2-65}$ |
| Compound 8632 | $L_{1-192}$ | $L_{2-109}$ |
| Compound 8633 | $L_{1-193}$ | $L_{2-1}$ |
| Compound 8634 | $L_{1-193}$ | $L_{2-10}$ |
| Compound 8635 | $L_{1-193}$ | $L_{2-15}$ |
| Compound 8636 | $L_{1-193}$ | $L_{2-20}$ |
| Compound 8637 | $L_{1-193}$ | $L_{2-65}$ |
| Compound 8638 | $L_{1-193}$ | $L_{2-109}$ |
| Compound 8639 | $L_{1-194}$ | $L_{2-1}$ |
| Compound 8640 | $L_{1-194}$ | $L_{2-10}$ |
| Compound 8641 | $L_{1-194}$ | $L_{2-15}$ |
| Compound 8642 | $L_{1-194}$ | $L_{2-20}$ |
| Compound 8643 | $L_{1-194}$ | $L_{2-65}$ |
| Compound 8644 | $L_{1-194}$ | $L_{2-109}$ |
| Compound 8645 | $L_{1-195}$ | $L_{2-1}$ |
| Compound 8646 | $L_{1-195}$ | $L_{2-10}$ |
| Compound 8647 | $L_{1-195}$ | $L_{2-15}$ |
| Compound 8648 | $L_{1-195}$ | $L_{2-20}$ |
| Compound 8649 | $L_{1-195}$ | $L_{2-65}$ |
| Compound 8650 | $L_{1-195}$ | $L_{2-109}$ |
| Compound 8651 | $L_{1-196}$ | $L_{2-1}$ |
| Compound 8652 | $L_{1-196}$ | $L_{2-10}$ |
| Compound 8653 | $L_{1-196}$ | $L_{2-15}$ |
| Compound 8654 | $L_{1-196}$ | $L_{2-20}$ |
| Compound 8655 | $L_{1-196}$ | $L_{2-65}$ |
| Compound 8656 | $L_{1-196}$ | $L_{2-109}$ |
| Compound 8657 | $L_{1-197}$ | $L_{2-1}$ |
| Compound 8658 | $L_{1-197}$ | $L_{2-10}$ |
| Compound 8659 | $L_{1-197}$ | $L_{2-15}$ |
| Compound 8660 | $L_{1-197}$ | $L_{2-20}$ |
| Compound 8661 | $L_{1-197}$ | $L_{2-65}$ |
| Compound 8662 | $L_{1-197}$ | $L_{2-109}$ |
| Compound 8663 | $L_{1-198}$ | $L_{2-1}$ |
| Compound 8664 | $L_{1-198}$ | $L_{2-10}$ |
| Compound 8665 | $L_{1-198}$ | $L_{2-15}$ |
| Compound 8666 | $L_{1-198}$ | $L_{2-20}$ |
| Compound 8667 | $L_{1-198}$ | $L_{2-65}$ |
| Compound 8668 | $L_{1-198}$ | $L_{2-109}$ |
| Compound 8669 | $L_{1-209}$ | $L_{2-1}$ |
| Compound 8670 | $L_{1-209}$ | $L_{2-10}$ |
| Compound 8671 | $L_{1-209}$ | $L_{2-15}$ |
| Compound 8672 | $L_{1-209}$ | $L_{2-20}$ |
| Compound 8673 | $L_{1-209}$ | $L_{2-65}$ |
| Compound 8674 | $L_{1-209}$ | $L_{2-109}$ |
| Compound 8675 | $L_{1-210}$ | $L_{2-1}$ |
| Compound 8676 | $L_{1-210}$ | $L_{2-10}$ |
| Compound 8677 | $L_{1-210}$ | $L_{2-15}$ |
| Compound 8678 | $L_{1-210}$ | $L_{2-20}$ |
| Compound 8679 | $L_{1-210}$ | $L_{2-65}$ |
| Compound 8680 | $L_{1-210}$ | $L_{2-109}$ |
| Compound 8681 | $L_{1-211}$ | $L_{2-1}$ |
| Compound 8682 | $L_{1-211}$ | $L_{2-10}$ |
| Compound 8683 | $L_{1-211}$ | $L_{2-15}$ |
| Compound 8684 | $L_{1-211}$ | $L_{2-20}$ |
| Compound 8685 | $L_{1-211}$ | $L_{2-65}$ |
| Compound 8686 | $L_{1-211}$ | $L_{2-109}$ |
| Compound 8687 | $L_{1-212}$ | $L_{2-1}$ |
| Compound 8688 | $L_{1-212}$ | $L_{2-10}$ |
| Compound 8689 | $L_{1-212}$ | $L_{2-15}$ |
| Compound 8690 | $L_{1-212}$ | $L_{2-20}$ |
| Compound 8691 | $L_{1-212}$ | $L_{2-65}$ |
| Compound 8692 | $L_{1-212}$ | $L_{2-109}$ |
| Compound 8693 | $L_{1-213}$ | $L_{2-1}$ |
| Compound 8694 | $L_{1-213}$ | $L_{2-10}$ |
| Compound 8695 | $L_{1-213}$ | $L_{2-15}$ |
| Compound 8696 | $L_{1-213}$ | $L_{2-20}$ |
| Compound 8697 | $L_{1-213}$ | $L_{2-65}$ |
| Compound 8698 | $L_{1-213}$ | $L_{2-109}$ |
| Compound 8699 | $L_{1-214}$ | $L_{2-1}$ |
| Compound 8700 | $L_{1-214}$ | $L_{2-10}$ |
| Compound 8701 | $L_{1-214}$ | $L_{2-15}$ |
| Compound 8702 | $L_{1-214}$ | $L_{2-20}$ |
| Compound 8703 | $L_{1-214}$ | $L_{2-65}$ |
| Compound 8704 | $L_{1-214}$ | $L_{2-109}$ |
| Compound 8705 | $L_{1-215}$ | $L_{2-1}$ |
| Compound 8706 | $L_{1-215}$ | $L_{2-10}$ |
| Compound 8707 | $L_{1-215}$ | $L_{2-15}$ |
| Compound 8708 | $L_{1-215}$ | $L_{2-20}$ |
| Compound 8709 | $L_{1-215}$ | $L_{2-65}$ |

TABLE 1-continued

| | | |
|---|---|---|
| Compound 8710 | $L_{1-215}$ | $L_{2-109}$ |
| Compound 8711 | $L_{1-216}$ | $L_{2-1}$ |
| Compound 8712 | $L_{1-216}$ | $L_{2-10}$ |
| Compound 8713 | $L_{1-216}$ | $L_{2-15}$ |
| Compound 8714 | $L_{1-216}$ | $L_{2-20}$ |
| Compound 8715 | $L_{1-216}$ | $L_{2-65}$ |
| Compound 8716 | $L_{1-216}$ | $L_{2-109}$ |
| Compound 8717 | $L_{1-217}$ | $L_{2-1}$ |
| Compound 8718 | $L_{1-217}$ | $L_{2-10}$ |
| Compound 8719 | $L_{1-217}$ | $L_{2-15}$ |
| Compound 8720 | $L_{1-217}$ | $L_{2-20}$ |
| Compound 8721 | $L_{1-217}$ | $L_{2-65}$ |
| Compound 8722 | $L_{1-217}$ | $L_{2-109}$ |
| Compound 8723 | $L_{1-218}$ | $L_{2-1}$ |
| Compound 8724 | $L_{1-218}$ | $L_{2-10}$ |
| Compound 8725 | $L_{1-218}$ | $L_{2-15}$ |
| Compound 8726 | $L_{1-218}$ | $L_{2-20}$ |
| Compound 8727 | $L_{1-218}$ | $L_{2-65}$ |
| Compound 8728 | $L_{1-218}$ | $L_{2-109}$ |
| Compound 8729 | $L_{1-219}$ | $L_{2-1}$ |
| Compound 8730 | $L_{1-219}$ | $L_{2-10}$ |
| Compound 8731 | $L_{1-219}$ | $L_{2-15}$ |
| Compound 8732 | $L_{1-219}$ | $L_{2-20}$ |
| Compound 8733 | $L_{1-219}$ | $L_{2-65}$ |
| Compound 8734 | $L_{1-219}$ | $L_{2-109}$ |
| Compound 8735 | $L_{1-220}$ | $L_{2-1}$ |
| Compound 8736 | $L_{1-220}$ | $L_{2-10}$ |
| Compound 8737 | $L_{1-220}$ | $L_{2-15}$ |
| Compound 8738 | $L_{1-220}$ | $L_{2-20}$ |
| Compound 8739 | $L_{1-220}$ | $L_{2-65}$ |
| Compound 8740 | $L_{1-220}$ | $L_{2-109}$ |
| Compound 8741 | $L_{1-221}$ | $L_{2-1}$ |
| Compound 8742 | $L_{1-221}$ | $L_{2-10}$ |
| Compound 8743 | $L_{1-221}$ | $L_{2-15}$ |
| Compound 8744 | $L_{1-221}$ | $L_{2-20}$ |
| Compound 8745 | $L_{1-221}$ | $L_{2-65}$ |
| Compound 8746 | $L_{1-221}$ | $L_{2-109}$ |
| Compound 8747 | $L_{1-222}$ | $L_{2-1}$ |
| Compound 8748 | $L_{1-222}$ | $L_{2-10}$ |
| Compound 8749 | $L_{1-222}$ | $L_{2-15}$ |
| Compound 8750 | $L_{1-222}$ | $L_{2-20}$ |
| Compound 8751 | $L_{1-222}$ | $L_{2-65}$ |
| Compound 8752 | $L_{1-222}$ | $L_{2-109}$ |
| Compound 8753 | $L_{1-223}$ | $L_{2-1}$ |
| Compound 8754 | $L_{1-223}$ | $L_{2-10}$ |
| Compound 8755 | $L_{1-223}$ | $L_{2-15}$ |
| Compound 8756 | $L_{1-223}$ | $L_{2-20}$ |
| Compound 8757 | $L_{1-223}$ | $L_{2-65}$ |
| Compound 8758 | $L_{1-223}$ | $L_{2-109}$ |
| Compound 8759 | $L_{1-224}$ | $L_{2-1}$ |
| Compound 8760 | $L_{1-224}$ | $L_{2-10}$ |
| Compound 8761 | $L_{1-224}$ | $L_{2-15}$ |
| Compound 8762 | $L_{1-224}$ | $L_{2-20}$ |
| Compound 8763 | $L_{1-224}$ | $L_{2-65}$ |
| Compound 8764 | $L_{1-224}$ | $L_{2-109}$ |
| Compound 8765 | $L_{1-225}$ | $L_{2-1}$ |
| Compound 8766 | $L_{1-225}$ | $L_{2-10}$ |
| Compound 8767 | $L_{1-225}$ | $L_{2-15}$ |
| Compound 8768 | $L_{1-225}$ | $L_{2-20}$ |
| Compound 8769 | $L_{1-225}$ | $L_{2-65}$ |
| Compound 8770 | $L_{1-225}$ | $L_{2-109}$ |
| Compound 8771 | $L_{1-226}$ | $L_{2-1}$ |
| Compound 8772 | $L_{1-226}$ | $L_{2-10}$ |
| Compound 8773 | $L_{1-226}$ | $L_{2-15}$ |
| Compound 8774 | $L_{1-226}$ | $L_{2-20}$ |
| Compound 8775 | $L_{1-226}$ | $L_{2-65}$ |
| Compound 8776 | $L_{1-226}$ | $L_{2-109}$ |
| Compound 8777 | $L_{1-227}$ | $L_{2-1}$ |
| Compound 8778 | $L_{1-227}$ | $L_{2-10}$ |
| Compound 8779 | $L_{1-227}$ | $L_{2-15}$ |
| Compound 8780 | $L_{1-227}$ | $L_{2-20}$ |
| Compound 8781 | $L_{1-227}$ | $L_{2-65}$ |
| Compound 8782 | $L_{1-227}$ | $L_{2-109}$ |
| Compound 8783 | $L_{1-228}$ | $L_{2-1}$ |
| Compound 8784 | $L_{1-228}$ | $L_{2-10}$ |
| Compound 8785 | $L_{1-228}$ | $L_{2-15}$ |
| Compound 8786 | $L_{1-228}$ | $L_{2-20}$ |
| Compound 8787 | $L_{1-228}$ | $L_{2-65}$ |
| Compound 8788 | $L_{1-228}$ | $L_{2-109}$ |
| Compound 8789 | $L_{1-229}$ | $L_{2-1}$ |

TABLE 1-continued

| | | |
|---|---|---|
| Compound 8790 | $L_{1-229}$ | $L_{2-10}$ |
| Compound 8791 | $L_{1-229}$ | $L_{2-15}$ |
| Compound 8792 | $L_{1-229}$ | $L_{2-20}$ |
| Compound 8793 | $L_{1-229}$ | $L_{2-65}$ |
| Compound 8794 | $L_{1-229}$ | $L_{2-109}$ |
| Compound 8795 | $L_{1-230}$ | $L_{2-1}$ |
| Compound 8796 | $L_{1-230}$ | $L_{2-10}$ |
| Compound 8797 | $L_{1-230}$ | $L_{2-15}$ |
| Compound 8798 | $L_{1-230}$ | $L_{2-20}$ |
| Compound 8799 | $L_{1-230}$ | $L_{2-65}$ |
| Compound 8800 | $L_{1-230}$ | $L_{2-109}$ |
| Compound 8801 | $L_{1-231}$ | $L_{2-1}$ |
| Compound 8802 | $L_{1-231}$ | $L_{2-10}$ |
| Compound 8803 | $L_{1-231}$ | $L_{2-15}$ |
| Compound 8804 | $L_{1-231}$ | $L_{2-20}$ |
| Compound 8805 | $L_{1-231}$ | $L_{2-65}$ |
| Compound 8806 | $L_{1-231}$ | $L_{2-109}$ |
| Compound 8807 | $L_{1-232}$ | $L_{2-1}$ |
| Compound 8808 | $L_{1-232}$ | $L_{2-10}$ |
| Compound 8809 | $L_{1-232}$ | $L_{2-15}$ |
| Compound 8810 | $L_{1-232}$ | $L_{2-20}$ |
| Compound 8811 | $L_{1-232}$ | $L_{2-65}$ |
| Compound 8812 | $L_{1-232}$ | $L_{2-109}$ |
| Compound 8813 | $L_{1-233}$ | $L_{2-1}$ |
| Compound 8814 | $L_{1-233}$ | $L_{2-10}$ |
| Compound 8815 | $L_{1-233}$ | $L_{2-15}$ |
| Compound 8816 | $L_{1-233}$ | $L_{2-20}$ |
| Compound 8817 | $L_{1-233}$ | $L_{2-65}$ |
| Compound 8818 | $L_{1-233}$ | $L_{2-109}$ |
| Compound 8819 | $L_{1-234}$ | $L_{2-1}$ |
| Compound 8820 | $L_{1-234}$ | $L_{2-10}$ |
| Compound 8821 | $L_{1-234}$ | $L_{2-15}$ |
| Compound 8822 | $L_{1-234}$ | $L_{2-20}$ |
| Compound 8823 | $L_{1-234}$ | $L_{2-65}$ |
| Compound 8824 | $L_{1-234}$ | $L_{2-109}$ |
| Compound 8825 | $L_{1-235}$ | $L_{2-1}$ |
| Compound 8826 | $L_{1-235}$ | $L_{2-10}$ |
| Compound 8827 | $L_{1-235}$ | $L_{2-15}$ |
| Compound 8828 | $L_{1-235}$ | $L_{2-20}$ |
| Compound 8829 | $L_{1-235}$ | $L_{2-65}$ |
| Compound 8830 | $L_{1-235}$ | $L_{2-109}$ |
| Compound 8831 | $L_{1-236}$ | $L_{2-1}$ |
| Compound 8832 | $L_{1-236}$ | $L_{2-10}$ |
| Compound 8833 | $L_{1-236}$ | $L_{2-15}$ |
| Compound 8834 | $L_{1-236}$ | $L_{2-20}$ |
| Compound 8835 | $L_{1-236}$ | $L_{2-65}$ |
| Compound 8836 | $L_{1-236}$ | $L_{2-109}$ |
| Compound 8837 | $L_{1-237}$ | $L_{2-1}$ |
| Compound 8838 | $L_{1-237}$ | $L_{2-10}$ |
| Compound 8839 | $L_{1-237}$ | $L_{2-15}$ |
| Compound 8840 | $L_{1-237}$ | $L_{2-20}$ |
| Compound 8841 | $L_{1-237}$ | $L_{2-65}$ |
| Compound 8842 | $L_{1-237}$ | $L_{2-109}$ |
| Compound 8843 | $L_{1-238}$ | $L_{2-1}$ |
| Compound 8844 | $L_{1-238}$ | $L_{2-10}$ |
| Compound 8845 | $L_{1-238}$ | $L_{2-15}$ |
| Compound 8846 | $L_{1-238}$ | $L_{2-20}$ |
| Compound 8847 | $L_{1-238}$ | $L_{2-65}$ |
| Compound 8848 | $L_{1-238}$ | $L_{2-109}$ |
| Compound 8849 | $L_{1-239}$ | $L_{2-1}$ |
| Compound 8850 | $L_{1-239}$ | $L_{2-10}$ |
| Compound 8851 | $L_{1-239}$ | $L_{2-15}$ |
| Compound 8852 | $L_{1-239}$ | $L_{2-20}$ |
| Compound 8853 | $L_{1-239}$ | $L_{2-65}$ |
| Compound 8854 | $L_{1-239}$ | $L_{2-109}$ |
| Compound 8855 | $L_{1-240}$ | $L_{2-1}$ |
| Compound 8856 | $L_{1-240}$ | $L_{2-10}$ |
| Compound 8857 | $L_{1-240}$ | $L_{2-15}$ |
| Compound 8858 | $L_{1-240}$ | $L_{2-20}$ |
| Compound 8859 | $L_{1-240}$ | $L_{2-65}$ |
| Compound 8860 | $L_{1-240}$ | $L_{2-109}$ |
| Compound 8861 | $L_{1-241}$ | $L_{2-1}$ |
| Compound 8862 | $L_{1-241}$ | $L_{2-10}$ |
| Compound 8863 | $L_{1-241}$ | $L_{2-15}$ |
| Compound 8864 | $L_{1-241}$ | $L_{2-20}$ |
| Compound 8865 | $L_{1-241}$ | $L_{2-65}$ |
| Compound 8866 | $L_{1-241}$ | $L_{2-109}$ |
| Compound 8867 | $L_{1-242}$ | $L_{2-1}$ |
| Compound 8868 | $L_{1-242}$ | $L_{2-10}$ |
| Compound 8869 | $L_{1-242}$ | $L_{2-15}$ |

TABLE 1-continued

| | | |
|---|---|---|
| Compound 8870 | $L_{1-242}$ | $L_{2-20}$ |
| Compound 8871 | $L_{1-242}$ | $L_{2-65}$ |
| Compound 8872 | $L_{1-242}$ | $L_{2-109}$ |
| Compound 8873 | $L_{1-243}$ | $L_{2-1}$ |
| Compound 8874 | $L_{1-243}$ | $L_{2-10}$ |
| Compound 8875 | $L_{1-243}$ | $L_{2-15}$ |
| Compound 8876 | $L_{1-243}$ | $L_{2-20}$ |
| Compound 8877 | $L_{1-243}$ | $L_{2-65}$ |
| Compound 8878 | $L_{1-243}$ | $L_{2-109}$ |
| Compound 8879 | $L_{1-244}$ | $L_{2-1}$ |
| Compound 8880 | $L_{1-244}$ | $L_{2-10}$ |
| Compound 8881 | $L_{1-244}$ | $L_{2-15}$ |
| Compound 8882 | $L_{1-244}$ | $L_{2-20}$ |
| Compound 8883 | $L_{1-244}$ | $L_{2-65}$ |
| Compound 8884 | $L_{1-244}$ | $L_{2-109}$ |
| Compound 8885 | $L_{1-245}$ | $L_{2-1}$ |
| Compound 8886 | $L_{1-245}$ | $L_{2-10}$ |
| Compound 8887 | $L_{1-245}$ | $L_{2-15}$ |
| Compound 8888 | $L_{1-245}$ | $L_{2-20}$ |
| Compound 8889 | $L_{1-245}$ | $L_{2-65}$ |
| Compound 8890 | $L_{1-245}$ | $L_{2-109}$ |
| Compound 8891 | $L_{1-246}$ | $L_{2-1}$ |
| Compound 8892 | $L_{1-246}$ | $L_{2-10}$ |
| Compound 8893 | $L_{1-246}$ | $L_{2-15}$ |
| Compound 8894 | $L_{1-246}$ | $L_{2-20}$ |
| Compound 8895 | $L_{1-246}$ | $L_{2-65}$ |
| Compound 8896 | $L_{1-246}$ | $L_{2-109}$ |
| Compound 8897 | $L_{1-247}$ | $L_{2-1}$ |
| Compound 8898 | $L_{1-247}$ | $L_{2-10}$ |
| Compound 8899 | $L_{1-247}$ | $L_{2-15}$ |
| Compound 8900 | $L_{1-247}$ | $L_{2-20}$ |
| Compound 8901 | $L_{1-247}$ | $L_{2-65}$ |
| Compound 8902 | $L_{1-247}$ | $L_{2-109}$ |
| Compound 8903 | $L_{1-248}$ | $L_{2-1}$ |
| Compound 8904 | $L_{1-248}$ | $L_{2-10}$ |
| Compound 8905 | $L_{1-248}$ | $L_{2-15}$ |
| Compound 8906 | $L_{1-248}$ | $L_{2-20}$ |
| Compound 8907 | $L_{1-248}$ | $L_{2-65}$ |
| Compound 8908 | $L_{1-248}$ | $L_{2-109}$ |
| Compound 8909 | $L_{1-249}$ | $L_{2-1}$ |
| Compound 8910 | $L_{1-249}$ | $L_{2-10}$ |
| Compound 8911 | $L_{1-249}$ | $L_{2-15}$ |
| Compound 8912 | $L_{1-249}$ | $L_{2-20}$ |
| Compound 8913 | $L_{1-249}$ | $L_{2-65}$ |
| Compound 8914 | $L_{1-249}$ | $L_{2-109}$ |
| Compound 8915 | $L_{1-250}$ | $L_{2-1}$ |
| Compound 8916 | $L_{1-250}$ | $L_{2-10}$ |
| Compound 8917 | $L_{1-250}$ | $L_{2-15}$ |
| Compound 8918 | $L_{1-250}$ | $L_{2-20}$ |
| Compound 8919 | $L_{1-250}$ | $L_{2-65}$ |
| Compound 8920 | $L_{1-250}$ | $L_{2-109}$ |
| Compound 8921 | $L_{1-251}$ | $L_{2-1}$ |
| Compound 8922 | $L_{1-251}$ | $L_{2-10}$ |
| Compound 8923 | $L_{1-251}$ | $L_{2-15}$ |
| Compound 8924 | $L_{1-251}$ | $L_{2-20}$ |
| Compound 8925 | $L_{1-251}$ | $L_{2-65}$ |
| Compound 8926 | $L_{1-251}$ | $L_{2-109}$ |
| Compound 8927 | $L_{1-252}$ | $L_{2-1}$ |
| Compound 8928 | $L_{1-252}$ | $L_{2-10}$ |
| Compound 8929 | $L_{1-252}$ | $L_{2-15}$ |
| Compound 8930 | $L_{1-252}$ | $L_{2-20}$ |
| Compound 8931 | $L_{1-252}$ | $L_{2-65}$ |
| Compound 8932 | $L_{1-252}$ | $L_{2-109}$ |
| Compound 8933 | $L_{1-253}$ | $L_{2-1}$ |
| Compound 8934 | $L_{1-253}$ | $L_{2-10}$ |
| Compound 8935 | $L_{1-253}$ | $L_{2-15}$ |
| Compound 8936 | $L_{1-253}$ | $L_{2-20}$ |
| Compound 8937 | $L_{1-253}$ | $L_{2-65}$ |
| Compound 8938 | $L_{1-253}$ | $L_{2-109}$ |
| Compound 8939 | $L_{1-254}$ | $L_{2-1}$ |
| Compound 8940 | $L_{1-254}$ | $L_{2-10}$ |
| Compound 8941 | $L_{1-254}$ | $L_{2-15}$ |
| Compound 8942 | $L_{1-254}$ | $L_{2-20}$ |
| Compound 8943 | $L_{1-254}$ | $L_{2-65}$ |
| Compound 8944 | $L_{1-254}$ | $L_{2-109}$ |
| Compound 8945 | $L_{1-255}$ | $L_{2-1}$ |
| Compound 8946 | $L_{1-255}$ | $L_{2-10}$ |
| Compound 8947 | $L_{1-255}$ | $L_{2-15}$ |
| Compound 8948 | $L_{1-255}$ | $L_{2-20}$ |
| Compound 8949 | $L_{1-255}$ | $L_{2-65}$ |

TABLE 1-continued

| | | |
|---|---|---|
| Compound 8950 | $L_{1-255}$ | $L_{2-109}$ |
| Compound 8951 | $L_{1-256}$ | $L_{2-1}$ |
| Compound 8952 | $L_{1-256}$ | $L_{2-10}$ |
| Compound 8953 | $L_{1-256}$ | $L_{2-15}$ |
| Compound 8954 | $L_{1-256}$ | $L_{2-20}$ |
| Compound 8955 | $L_{1-256}$ | $L_{2-65}$ |
| Compound 8956 | $L_{1-256}$ | $L_{2-109}$ |
| Compound 8957 | $L_{1-257}$ | $L_{2-1}$ |
| Compound 8958 | $L_{1-257}$ | $L_{2-10}$ |
| Compound 8959 | $L_{1-257}$ | $L_{2-15}$ |
| Compound 8960 | $L_{1-257}$ | $L_{2-20}$ |
| Compound 8961 | $L_{1-257}$ | $L_{2-65}$ |
| Compound 8962 | $L_{1-257}$ | $L_{2-109}$ |
| Compound 8963 | $L_{1-258}$ | $L_{2-1}$ |
| Compound 8964 | $L_{1-258}$ | $L_{2-10}$ |
| Compound 8965 | $L_{1-258}$ | $L_{2-15}$ |
| Compound 8966 | $L_{1-258}$ | $L_{2-20}$ |
| Compound 8967 | $L_{1-258}$ | $L_{2-65}$ |
| Compound 8968 | $L_{1-258}$ | $L_{2-109}$ |
| Compound 8969 | $L_{1-259}$ | $L_{2-1}$ |
| Compound 8970 | $L_{1-259}$ | $L_{2-10}$ |
| Compound 8971 | $L_{1-259}$ | $L_{2-15}$ |
| Compound 8972 | $L_{1-259}$ | $L_{2-20}$ |
| Compound 8973 | $L_{1-259}$ | $L_{2-65}$ |
| Compound 8974 | $L_{1-259}$ | $L_{2-109}$ |
| Compound 8975 | $L_{1-260}$ | $L_{2-1}$ |
| Compound 8976 | $L_{1-260}$ | $L_{2-10}$ |
| Compound 8977 | $L_{1-260}$ | $L_{2-15}$ |
| Compound 8978 | $L_{1-260}$ | $L_{2-20}$ |
| Compound 8979 | $L_{1-260}$ | $L_{2-65}$ |
| Compound 8980 | $L_{1-260}$ | $L_{2-109}$ |
| Compound 8981 | $L_{1-261}$ | $L_{2-1}$ |
| Compound 8982 | $L_{1-261}$ | $L_{2-10}$ |
| Compound 8983 | $L_{1-261}$ | $L_{2-15}$ |
| Compound 8984 | $L_{1-261}$ | $L_{2-20}$ |
| Compound 8985 | $L_{1-261}$ | $L_{2-65}$ |
| Compound 8986 | $L_{1-261}$ | $L_{2-109}$ |
| Compound 8987 | $L_{1-262}$ | $L_{2-1}$ |
| Compound 8988 | $L_{1-262}$ | $L_{2-10}$ |
| Compound 8989 | $L_{1-262}$ | $L_{2-15}$ |
| Compound 8990 | $L_{1-262}$ | $L_{2-20}$ |
| Compound 8991 | $L_{1-262}$ | $L_{2-65}$ |
| Compound 8992 | $L_{1-262}$ | $L_{2-109}$ |
| Compound 8993 | $L_{1-263}$ | $L_{2-1}$ |
| Compound 8994 | $L_{1-263}$ | $L_{2-10}$ |
| Compound 8995 | $L_{1-263}$ | $L_{2-15}$ |
| Compound 8996 | $L_{1-263}$ | $L_{2-20}$ |
| Compound 8997 | $L_{1-263}$ | $L_{2-65}$ |
| Compound 8998 | $L_{1-263}$ | $L_{2-109}$ |
| Compound 8999 | $L_{1-264}$ | $L_{2-1}$ |
| Compound 9000 | $L_{1-264}$ | $L_{2-10}$ |
| Compound 9001 | $L_{1-264}$ | $L_{2-15}$ |
| Compound 9002 | $L_{1-264}$ | $L_{2-20}$ |
| Compound 9003 | $L_{1-264}$ | $L_{2-65}$ |
| Compound 9004 | $L_{1-264}$ | $L_{2-109}$ |
| Compound 9005 | $L_{1-265}$ | $L_{2-1}$ |
| Compound 9006 | $L_{1-265}$ | $L_{2-10}$ |
| Compound 9007 | $L_{1-265}$ | $L_{2-15}$ |
| Compound 9008 | $L_{1-265}$ | $L_{2-20}$ |
| Compound 9009 | $L_{1-265}$ | $L_{2-65}$ |
| Compound 9010 | $L_{1-265}$ | $L_{2-109}$ |
| Compound 9011 | $L_{1-266}$ | $L_{2-1}$ |
| Compound 9012 | $L_{1-266}$ | $L_{2-10}$ |
| Compound 9013 | $L_{1-266}$ | $L_{2-15}$ |
| Compound 9014 | $L_{1-266}$ | $L_{2-20}$ |
| Compound 9015 | $L_{1-266}$ | $L_{2-65}$ |
| Compound 9016 | $L_{1-266}$ | $L_{2-109}$ |
| Compound 9017 | $L_{1-267}$ | $L_{2-1}$ |
| Compound 9018 | $L_{1-267}$ | $L_{2-10}$ |
| Compound 9019 | $L_{1-267}$ | $L_{2-15}$ |
| Compound 9020 | $L_{1-267}$ | $L_{2-20}$ |
| Compound 9021 | $L_{1-267}$ | $L_{2-65}$ |
| Compound 9022 | $L_{1-267}$ | $L_{2-109}$ |
| Compound 9023 | $L_{1-268}$ | $L_{2-1}$ |
| Compound 9024 | $L_{1-268}$ | $L_{2-10}$ |
| Compound 9025 | $L_{1-268}$ | $L_{2-15}$ |
| Compound 9026 | $L_{1-268}$ | $L_{2-20}$ |
| Compound 9027 | $L_{1-268}$ | $L_{2-65}$ |
| Compound 9028 | $L_{1-268}$ | $L_{2-109}$ |
| Compound 9029 | $L_{1-269}$ | $L_{2-1}$ |

TABLE 1-continued

| | | |
|---|---|---|
| Compound 9030 | $L_{1-269}$ | $L_{2-10}$ |
| Compound 9031 | $L_{1-269}$ | $L_{2-15}$ |
| Compound 9032 | $L_{1-269}$ | $L_{2-20}$ |
| Compound 9033 | $L_{1-269}$ | $L_{2-65}$ |
| Compound 9034 | $L_{1-269}$ | $L_{2-109}$ |
| Compound 9035 | $L_{1-270}$ | $L_{2-1}$ |
| Compound 9036 | $L_{1-270}$ | $L_{2-10}$ |
| Compound 9037 | $L_{1-270}$ | $L_{2-15}$ |
| Compound 9038 | $L_{1-270}$ | $L_{2-20}$ |
| Compound 9039 | $L_{1-270}$ | $L_{2-65}$ |
| Compound 9040 | $L_{1-270}$ | $L_{2-109}$ |
| Compound 9041 | $L_{1-271}$ | $L_{2-1}$ |
| Compound 9042 | $L_{1-271}$ | $L_{2-10}$ |
| Compound 9043 | $L_{1-271}$ | $L_{2-15}$ |
| Compound 9044 | $L_{1-271}$ | $L_{2-20}$ |
| Compound 9045 | $L_{1-271}$ | $L_{2-65}$ |
| Compound 9046 | $L_{1-271}$ | $L_{2-109}$ |
| Compound 9047 | $L_{1-272}$ | $L_{2-1}$ |
| Compound 9048 | $L_{1-272}$ | $L_{2-10}$ |
| Compound 9049 | $L_{1-272}$ | $L_{2-15}$ |
| Compound 9050 | $L_{1-272}$ | $L_{2-20}$ |
| Compound 9051 | $L_{1-272}$ | $L_{2-65}$ |
| Compound 9052 | $L_{1-272}$ | $L_{2-109}$ |
| Compound 9053 | $L_{1-273}$ | $L_{2-1}$ |
| Compound 9054 | $L_{1-273}$ | $L_{2-10}$ |
| Compound 9055 | $L_{1-273}$ | $L_{2-15}$ |
| Compound 9056 | $L_{1-273}$ | $L_{2-20}$ |
| Compound 9057 | $L_{1-273}$ | $L_{2-65}$ |
| Compound 9058 | $L_{1-273}$ | $L_{2-109}$ |
| Compound 9059 | $L_{1-274}$ | $L_{2-1}$ |
| Compound 9060 | $L_{1-274}$ | $L_{2-10}$ |
| Compound 9061 | $L_{1-274}$ | $L_{2-15}$ |
| Compound 9062 | $L_{1-274}$ | $L_{2-20}$ |
| Compound 9063 | $L_{1-274}$ | $L_{2-65}$ |
| Compound 9064 | $L_{1-274}$ | $L_{2-109}$ |
| Compound 9065 | $L_{1-275}$ | $L_{2-1}$ |
| Compound 9066 | $L_{1-275}$ | $L_{2-10}$ |
| Compound 9067 | $L_{1-275}$ | $L_{2-15}$ |
| Compound 9068 | $L_{1-275}$ | $L_{2-20}$ |
| Compound 9069 | $L_{1-275}$ | $L_{2-65}$ |
| Compound 9070 | $L_{1-275}$ | $L_{2-109}$ |
| Compound 9071 | $L_{1-276}$ | $L_{2-1}$ |
| Compound 9072 | $L_{1-276}$ | $L_{2-10}$ |
| Compound 9073 | $L_{1-276}$ | $L_{2-15}$ |
| Compound 9074 | $L_{1-276}$ | $L_{2-20}$ |
| Compound 9075 | $L_{1-276}$ | $L_{2-65}$ |
| Compound 9076 | $L_{1-276}$ | $L_{2-109}$ |
| Compound 9077 | $L_{1-277}$ | $L_{2-1}$ |
| Compound 9078 | $L_{1-277}$ | $L_{2-10}$ |
| Compound 9079 | $L_{1-277}$ | $L_{2-15}$ |
| Compound 9080 | $L_{1-277}$ | $L_{2-20}$ |
| Compound 9081 | $L_{1-277}$ | $L_{2-65}$ |
| Compound 9082 | $L_{1-277}$ | $L_{2-109}$ |
| Compound 9083 | $L_{1-278}$ | $L_{2-1}$ |
| Compound 9084 | $L_{1-278}$ | $L_{2-10}$ |
| Compound 9085 | $L_{1-278}$ | $L_{2-15}$ |
| Compound 9086 | $L_{1-278}$ | $L_{2-20}$ |
| Compound 9087 | $L_{1-278}$ | $L_{2-65}$ |
| Compound 9088 | $L_{1-278}$ | $L_{2-109}$ |
| Compound 9089 | $L_{1-279}$ | $L_{2-1}$ |
| Compound 9090 | $L_{1-279}$ | $L_{2-10}$ |
| Compound 9091 | $L_{1-279}$ | $L_{2-15}$ |
| Compound 9092 | $L_{1-279}$ | $L_{2-20}$ |
| Compound 9093 | $L_{1-279}$ | $L_{2-65}$ |
| Compound 9094 | $L_{1-279}$ | $L_{2-109}$ |
| Compound 9095 | $L_{1-280}$ | $L_{2-1}$ |
| Compound 9096 | $L_{1-280}$ | $L_{2-10}$ |
| Compound 9097 | $L_{1-280}$ | $L_{2-15}$ |
| Compound 9098 | $L_{1-280}$ | $L_{2-20}$ |
| Compound 9099 | $L_{1-280}$ | $L_{2-65}$ |
| Compound 9100 | $L_{1-280}$ | $L_{2-109}$ |
| Compound 9101 | $L_{1-281}$ | $L_{2-1}$ |
| Compound 9102 | $L_{1-281}$ | $L_{2-10}$ |
| Compound 9103 | $L_{1-281}$ | $L_{2-15}$ |
| Compound 9104 | $L_{1-281}$ | $L_{2-20}$ |
| Compound 9105 | $L_{1-281}$ | $L_{2-65}$ |
| Compound 9106 | $L_{1-281}$ | $L_{2-109}$ |
| Compound 9107 | $L_{1-282}$ | $L_{2-1}$ |
| Compound 9108 | $L_{1-282}$ | $L_{2-10}$ |
| Compound 9109 | $L_{1-282}$ | $L_{2-15}$ |
| Compound 9110 | $L_{1-282}$ | $L_{2-20}$ |
| Compound 9111 | $L_{1-282}$ | $L_{2-65}$ |
| Compound 9112 | $L_{1-282}$ | $L_{2-109}$ |
| Compound 9113 | $L_{1-283}$ | $L_{2-1}$ |
| Compound 9114 | $L_{1-283}$ | $L_{2-10}$ |
| Compound 9115 | $L_{1-283}$ | $L_{2-15}$ |
| Compound 9116 | $L_{1-283}$ | $L_{2-20}$ |
| Compound 9117 | $L_{1-283}$ | $L_{2-65}$ |
| Compound 9118 | $L_{1-283}$ | $L_{2-109}$ |
| Compound 9119 | $L_{1-284}$ | $L_{2-1}$ |
| Compound 9120 | $L_{1-284}$ | $L_{2-10}$ |
| Compound 9121 | $L_{1-284}$ | $L_{2-15}$ |
| Compound 9122 | $L_{1-284}$ | $L_{2-20}$ |
| Compound 9123 | $L_{1-284}$ | $L_{2-65}$ |
| Compound 9124 | $L_{1-284}$ | $L_{2-109}$ |
| Compound 9125 | $L_{1-285}$ | $L_{2-1}$ |
| Compound 9126 | $L_{1-285}$ | $L_{2-10}$ |
| Compound 9127 | $L_{1-285}$ | $L_{2-15}$ |
| Compound 9128 | $L_{1-285}$ | $L_{2-20}$ |
| Compound 9129 | $L_{1-285}$ | $L_{2-65}$ |
| Compound 9130 | $L_{1-285}$ | $L_{2-109}$ |
| Compound 9131 | $L_{1-286}$ | $L_{2-1}$ |
| Compound 9132 | $L_{1-286}$ | $L_{2-10}$ |
| Compound 9133 | $L_{1-286}$ | $L_{2-15}$ |
| Compound 9134 | $L_{1-286}$ | $L_{2-20}$ |
| Compound 9135 | $L_{1-286}$ | $L_{2-65}$ |
| Compound 9136 | $L_{1-286}$ | $L_{2-109}$ |
| Compound 9137 | $L_{1-287}$ | $L_{2-1}$ |
| Compound 9138 | $L_{1-287}$ | $L_{2-10}$ |
| Compound 9139 | $L_{1-287}$ | $L_{2-15}$ |
| Compound 9140 | $L_{1-287}$ | $L_{2-20}$ |
| Compound 9141 | $L_{1-287}$ | $L_{2-65}$ |
| Compound 9142 | $L_{1-287}$ | $L_{2-109}$ |
| Compound 9143 | $L_{1-288}$ | $L_{2-1}$ |
| Compound 9144 | $L_{1-288}$ | $L_{2-10}$ |
| Compound 9145 | $L_{1-288}$ | $L_{2-15}$ |
| Compound 9146 | $L_{1-288}$ | $L_{2-20}$ |
| Compound 9147 | $L_{1-288}$ | $L_{2-65}$ |
| Compound 9148 | $L_{1-288}$ | $L_{2-109}$ |
| Compound 9149 | $L_{1-289}$ | $L_{2-1}$ |
| Compound 9150 | $L_{1-289}$ | $L_{2-10}$ |
| Compound 9151 | $L_{1-289}$ | $L_{2-15}$ |
| Compound 9152 | $L_{1-289}$ | $L_{2-20}$ |
| Compound 9153 | $L_{1-289}$ | $L_{2-65}$ |
| Compound 9154 | $L_{1-289}$ | $L_{2-109}$ |
| Compound 9155 | $L_{1-290}$ | $L_{2-1}$ |
| Compound 9156 | $L_{1-290}$ | $L_{2-10}$ |
| Compound 9157 | $L_{1-290}$ | $L_{2-15}$ |
| Compound 9158 | $L_{1-290}$ | $L_{2-20}$ |
| Compound 9159 | $L_{1-290}$ | $L_{2-65}$ |
| Compound 9160 | $L_{1-290}$ | $L_{2-109}$ |
| Compound 9161 | $L_{1-291}$ | $L_{2-1}$ |
| Compound 9162 | $L_{1-291}$ | $L_{2-10}$ |
| Compound 9163 | $L_{1-291}$ | $L_{2-15}$ |
| Compound 9164 | $L_{1-291}$ | $L_{2-20}$ |
| Compound 9165 | $L_{1-291}$ | $L_{2-65}$ |
| Compound 9166 | $L_{1-291}$ | $L_{2-109}$ |
| Compound 9167 | $L_{1-292}$ | $L_{2-1}$ |
| Compound 9168 | $L_{1-292}$ | $L_{2-10}$ |
| Compound 9169 | $L_{1-292}$ | $L_{2-15}$ |
| Compound 9170 | $L_{1-292}$ | $L_{2-20}$ |
| Compound 9171 | $L_{1-292}$ | $L_{2-65}$ |
| Compound 9172 | $L_{1-292}$ | $L_{2-109}$ |
| Compound 9173 | $L_{1-293}$ | $L_{2-1}$ |
| Compound 9174 | $L_{1-293}$ | $L_{2-10}$ |
| Compound 9175 | $L_{1-293}$ | $L_{2-15}$ |
| Compound 9176 | $L_{1-293}$ | $L_{2-20}$ |
| Compound 9177 | $L_{1-293}$ | $L_{2-65}$ |
| Compound 9178 | $L_{1-293}$ | $L_{2-109}$ |
| Compound 9179 | $L_{1-294}$ | $L_{2-1}$ |
| Compound 9180 | $L_{1-294}$ | $L_{2-10}$ |
| Compound 9181 | $L_{1-294}$ | $L_{2-15}$ |
| Compound 9182 | $L_{1-294}$ | $L_{2-20}$ |
| Compound 9183 | $L_{1-294}$ | $L_{2-65}$ |
| Compound 9184 | $L_{1-294}$ | $L_{2-109}$ |
| Compound 9185 | $L_{1-295}$ | $L_{2-1}$ |
| Compound 9186 | $L_{1-295}$ | $L_{2-10}$ |
| Compound 9187 | $L_{1-295}$ | $L_{2-15}$ |
| Compound 9188 | $L_{1-295}$ | $L_{2-20}$ |
| Compound 9189 | $L_{1-295}$ | $L_{2-65}$ |

TABLE 1-continued

| | | |
|---|---|---|
| Compound 9190 | $L_{1-295}$ | $L_{2-109}$ |
| Compound 9191 | $L_{1-296}$ | $L_{2-1}$ |
| Compound 9192 | $L_{1-296}$ | $L_{2-10}$ |
| Compound 9193 | $L_{1-296}$ | $L_{2-15}$ |
| Compound 9194 | $L_{1-296}$ | $L_{2-20}$ |
| Compound 9195 | $L_{1-296}$ | $L_{2-65}$ |
| Compound 9196 | $L_{1-296}$ | $L_{2-109}$ |
| Compound 9197 | $L_{1-297}$ | $L_{2-1}$ |
| Compound 9198 | $L_{1-297}$ | $L_{2-10}$ |
| Compound 9199 | $L_{1-297}$ | $L_{2-15}$ |
| Compound 9200 | $L_{1-297}$ | $L_{2-20}$ |
| Compound 9201 | $L_{1-297}$ | $L_{2-65}$ |
| Compound 9202 | $L_{1-297}$ | $L_{2-109}$ |
| Compound 9203 | $L_{1-298}$ | $L_{2-1}$ |
| Compound 9204 | $L_{1-298}$ | $L_{2-10}$ |
| Compound 9205 | $L_{1-298}$ | $L_{2-15}$ |
| Compound 9206 | $L_{1-298}$ | $L_{2-20}$ |
| Compound 9207 | $L_{1-298}$ | $L_{2-65}$ |
| Compound 9208 | $L_{1-298}$ | $L_{2-109}$ |
| Compound 9209 | $L_{1-299}$ | $L_{2-1}$ |
| Compound 9210 | $L_{1-299}$ | $L_{2-10}$ |
| Compound 9211 | $L_{1-299}$ | $L_{2-15}$ |
| Compound 9212 | $L_{1-299}$ | $L_{2-20}$ |
| Compound 9213 | $L_{1-299}$ | $L_{2-65}$ |
| Compound 9214 | $L_{1-299}$ | $L_{2-109}$ |
| Compound 9215 | $L_{1-300}$ | $L_{2-1}$ |
| Compound 9216 | $L_{1-300}$ | $L_{2-10}$ |
| Compound 9217 | $L_{1-300}$ | $L_{2-15}$ |
| Compound 9218 | $L_{1-300}$ | $L_{2-20}$ |
| Compound 9219 | $L_{1-300}$ | $L_{2-65}$ |
| Compound 9220 | $L_{1-300}$ | $L_{2-109}$ |
| Compound 9221 | $L_{1-301}$ | $L_{2-1}$ |
| Compound 9222 | $L_{1-301}$ | $L_{2-10}$ |
| Compound 9223 | $L_{1-301}$ | $L_{2-15}$ |
| Compound 9224 | $L_{1-301}$ | $L_{2-20}$ |
| Compound 9225 | $L_{1-301}$ | $L_{2-65}$ |
| Compound 9226 | $L_{1-301}$ | $L_{2-109}$ |
| Compound 9227 | $L_{1-302}$ | $L_{2-1}$ |
| Compound 9228 | $L_{1-302}$ | $L_{2-10}$ |
| Compound 9229 | $L_{1-302}$ | $L_{2-15}$ |
| Compound 9230 | $L_{1-302}$ | $L_{2-20}$ |
| Compound 9231 | $L_{1-302}$ | $L_{2-65}$ |
| Compound 9232 | $L_{1-302}$ | $L_{2-109}$ |
| Compound 9233 | $L_{1-303}$ | $L_{2-1}$ |
| Compound 9234 | $L_{1-303}$ | $L_{2-10}$ |
| Compound 9235 | $L_{1-303}$ | $L_{2-15}$ |
| Compound 9236 | $L_{1-303}$ | $L_{2-20}$ |
| Compound 9237 | $L_{1-303}$ | $L_{2-65}$ |
| Compound 9238 | $L_{1-303}$ | $L_{2-109}$ |
| Compound 9239 | $L_{1-304}$ | $L_{2-1}$ |
| Compound 9240 | $L_{1-304}$ | $L_{2-10}$ |
| Compound 9241 | $L_{1-304}$ | $L_{2-15}$ |
| Compound 9242 | $L_{1-304}$ | $L_{2-20}$ |
| Compound 9243 | $L_{1-304}$ | $L_{2-65}$ |
| Compound 9244 | $L_{1-304}$ | $L_{2-109}$ |
| Compound 9245 | $L_{1-305}$ | $L_{2-1}$ |
| Compound 9246 | $L_{1-305}$ | $L_{2-10}$ |
| Compound 9247 | $L_{1-305}$ | $L_{2-15}$ |
| Compound 9248 | $L_{1-305}$ | $L_{2-20}$ |
| Compound 9249 | $L_{1-305}$ | $L_{2-65}$ |
| Compound 9250 | $L_{1-305}$ | $L_{2-109}$ |
| Compound 9251 | $L_{1-306}$ | $L_{2-1}$ |
| Compound 9252 | $L_{1-306}$ | $L_{2-10}$ |
| Compound 9253 | $L_{1-306}$ | $L_{2-15}$ |
| Compound 9254 | $L_{1-306}$ | $L_{2-20}$ |
| Compound 9255 | $L_{1-306}$ | $L_{2-65}$ |
| Compound 9256 | $L_{1-306}$ | $L_{2-109}$ |
| Compound 9257 | $L_{1-307}$ | $L_{2-1}$ |
| Compound 9258 | $L_{1-307}$ | $L_{2-10}$ |
| Compound 9259 | $L_{1-307}$ | $L_{2-15}$ |
| Compound 9260 | $L_{1-307}$ | $L_{2-20}$ |
| Compound 9261 | $L_{1-307}$ | $L_{2-65}$ |
| Compound 9262 | $L_{1-307}$ | $L_{2-109}$ |
| Compound 9263 | $L_{1-308}$ | $L_{2-1}$ |
| Compound 9264 | $L_{1-308}$ | $L_{2-10}$ |
| Compound 9265 | $L_{1-308}$ | $L_{2-15}$ |
| Compound 9266 | $L_{1-308}$ | $L_{2-20}$ |
| Compound 9267 | $L_{1-308}$ | $L_{2-65}$ |
| Compound 9268 | $L_{1-308}$ | $L_{2-109}$ |
| Compound 9269 | $L_{1-309}$ | $L_{2-1}$ |

TABLE 1-continued

| | | |
|---|---|---|
| Compound 9270 | $L_{1-309}$ | $L_{2-10}$ |
| Compound 9271 | $L_{1-309}$ | $L_{2-15}$ |
| Compound 9272 | $L_{1-309}$ | $L_{2-20}$ |
| Compound 9273 | $L_{1-309}$ | $L_{2-65}$ |
| Compound 9274 | $L_{1-309}$ | $L_{2-109}$ |
| Compound 9275 | $L_{1-310}$ | $L_{2-1}$ |
| Compound 9276 | $L_{1-310}$ | $L_{2-10}$ |
| Compound 9277 | $L_{1-310}$ | $L_{2-15}$ |
| Compound 9278 | $L_{1-310}$ | $L_{2-20}$ |
| Compound 9279 | $L_{1-310}$ | $L_{2-65}$ |
| Compound 9280 | $L_{1-310}$ | $L_{2-109}$ |
| Compound 9281 | $L_{1-311}$ | $L_{2-1}$ |
| Compound 9282 | $L_{1-311}$ | $L_{2-10}$ |
| Compound 9283 | $L_{1-311}$ | $L_{2-15}$ |
| Compound 9284 | $L_{1-311}$ | $L_{2-20}$ |
| Compound 9285 | $L_{1-311}$ | $L_{2-65}$ |
| Compound 9286 | $L_{1-311}$ | $L_{2-109}$ |
| Compound 9287 | $L_{1-312}$ | $L_{2-1}$ |
| Compound 9288 | $L_{1-312}$ | $L_{2-10}$ |
| Compound 9289 | $L_{1-312}$ | $L_{2-15}$ |
| Compound 9290 | $L_{1-312}$ | $L_{2-20}$ |
| Compound 9291 | $L_{1-312}$ | $L_{2-65}$ |
| Compound 9292 | $L_{1-312}$ | $L_{2-109}$ |
| Compound 9293 | $L_{1-313}$ | $L_{2-1}$ |
| Compound 9294 | $L_{1-313}$ | $L_{2-10}$ |
| Compound 9295 | $L_{1-313}$ | $L_{2-15}$ |
| Compound 9296 | $L_{1-313}$ | $L_{2-20}$ |
| Compound 9297 | $L_{1-313}$ | $L_{2-65}$ |
| Compound 9298 | $L_{1-313}$ | $L_{2-109}$ |
| Compound 9299 | $L_{1-314}$ | $L_{2-1}$ |
| Compound 9300 | $L_{1-314}$ | $L_{2-10}$ |
| Compound 9301 | $L_{1-314}$ | $L_{2-15}$ |
| Compound 9302 | $L_{1-314}$ | $L_{2-20}$ |
| Compound 9303 | $L_{1-314}$ | $L_{2-65}$ |
| Compound 9304 | $L_{1-314}$ | $L_{2-109}$ |
| Compound 9305 | $L_{1-315}$ | $L_{2-1}$ |
| Compound 9306 | $L_{1-315}$ | $L_{2-10}$ |
| Compound 9307 | $L_{1-315}$ | $L_{2-15}$ |
| Compound 9308 | $L_{1-315}$ | $L_{2-20}$ |
| Compound 9309 | $L_{1-315}$ | $L_{2-65}$ |
| Compound 9310 | $L_{1-315}$ | $L_{2-109}$ |
| Compound 9311 | $L_{1-316}$ | $L_{2-1}$ |
| Compound 9312 | $L_{1-316}$ | $L_{2-10}$ |
| Compound 9313 | $L_{1-316}$ | $L_{2-15}$ |
| Compound 9314 | $L_{1-316}$ | $L_{2-20}$ |
| Compound 9315 | $L_{1-316}$ | $L_{2-65}$ |
| Compound 9316 | $L_{1-316}$ | $L_{2-109}$ |
| Compound 9317 | $L_{1-317}$ | $L_{2-1}$ |
| Compound 9318 | $L_{1-317}$ | $L_{2-10}$ |
| Compound 9319 | $L_{1-317}$ | $L_{2-15}$ |
| Compound 9320 | $L_{1-317}$ | $L_{2-20}$ |
| Compound 9321 | $L_{1-317}$ | $L_{2-65}$ |
| Compound 9322 | $L_{1-317}$ | $L_{2-109}$ |
| Compound 9323 | $L_{1-318}$ | $L_{2-1}$ |
| Compound 9324 | $L_{1-318}$ | $L_{2-10}$ |
| Compound 9325 | $L_{1-318}$ | $L_{2-15}$ |
| Compound 9326 | $L_{1-318}$ | $L_{2-20}$ |
| Compound 9327 | $L_{1-318}$ | $L_{2-65}$ |
| Compound 9328 | $L_{1-318}$ | $L_{2-109}$ |
| Compound 9329 | $L_{1-319}$ | $L_{2-1}$ |
| Compound 9330 | $L_{1-319}$ | $L_{2-10}$ |
| Compound 9331 | $L_{1-319}$ | $L_{2-15}$ |
| Compound 9332 | $L_{1-319}$ | $L_{2-20}$ |
| Compound 9333 | $L_{1-319}$ | $L_{2-65}$ |
| Compound 9334 | $L_{1-319}$ | $L_{2-109}$ |
| Compound 9335 | $L_{1-320}$ | $L_{2-1}$ |
| Compound 9336 | $L_{1-320}$ | $L_{2-10}$ |
| Compound 9337 | $L_{1-320}$ | $L_{2-15}$ |
| Compound 9338 | $L_{1-320}$ | $L_{2-20}$ |
| Compound 9339 | $L_{1-320}$ | $L_{2-65}$ |
| Compound 9340 | $L_{1-320}$ | $L_{2-109}$ |
| Compound 9341 | $L_{1-321}$ | $L_{2-1}$ |
| Compound 9342 | $L_{1-321}$ | $L_{2-10}$ |
| Compound 9343 | $L_{1-321}$ | $L_{2-15}$ |
| Compound 9344 | $L_{1-321}$ | $L_{2-20}$ |
| Compound 9345 | $L_{1-321}$ | $L_{2-65}$ |
| Compound 9346 | $L_{1-321}$ | $L_{2-109}$ |
| Compound 9347 | $L_{1-322}$ | $L_{2-1}$ |
| Compound 9348 | $L_{1-322}$ | $L_{2-10}$ |
| Compound 9349 | $L_{1-322}$ | $L_{2-15}$ |

TABLE 1-continued

| | | |
|---|---|---|
| Compound 9350 | $L_{1-322}$ | $L_{2-20}$ |
| Compound 9351 | $L_{1-322}$ | $L_{2-65}$ |
| Compound 9352 | $L_{1-322}$ | $L_{2-109}$ |
| Compound 9353 | $L_{1-323}$ | $L_{2-1}$ |
| Compound 9354 | $L_{1-323}$ | $L_{2-10}$ |
| Compound 9355 | $L_{1-323}$ | $L_{2-15}$ |
| Compound 9356 | $L_{1-323}$ | $L_{2-20}$ |
| Compound 9357 | $L_{1-323}$ | $L_{2-65}$ |
| Compound 9358 | $L_{1-323}$ | $L_{2-109}$ |
| Compound 9359 | $L_{1-324}$ | $L_{2-1}$ |
| Compound 9360 | $L_{1-324}$ | $L_{2-10}$ |
| Compound 9361 | $L_{1-324}$ | $L_{2-15}$ |
| Compound 9362 | $L_{1-324}$ | $L_{2-20}$ |
| Compound 9363 | $L_{1-324}$ | $L_{2-65}$ |
| Compound 9364 | $L_{1-324}$ | $L_{2-109}$ |
| Compound 9365 | $L_{1-325}$ | $L_{2-1}$ |
| Compound 9366 | $L_{1-325}$ | $L_{2-10}$ |
| Compound 9367 | $L_{1-325}$ | $L_{2-15}$ |
| Compound 9368 | $L_{1-325}$ | $L_{2-20}$ |
| Compound 9369 | $L_{1-325}$ | $L_{2-65}$ |
| Compound 9370 | $L_{1-325}$ | $L_{2-109}$ |
| Compound 9371 | $L_{1-326}$ | $L_{2-1}$ |
| Compound 9372 | $L_{1-326}$ | $L_{2-10}$ |
| Compound 9373 | $L_{1-326}$ | $L_{2-15}$ |
| Compound 9374 | $L_{1-326}$ | $L_{2-20}$ |
| Compound 9375 | $L_{1-326}$ | $L_{2-65}$ |
| Compound 9376 | $L_{1-326}$ | $L_{2-109}$ |
| Compound 9377 | $L_{1-327}$ | $L_{2-1}$ |
| Compound 9378 | $L_{1-327}$ | $L_{2-10}$ |
| Compound 9379 | $L_{1-327}$ | $L_{2-15}$ |
| Compound 9380 | $L_{1-327}$ | $L_{2-20}$ |
| Compound 9381 | $L_{1-327}$ | $L_{2-65}$ |
| Compound 9382 | $L_{1-327}$ | $L_{2-109}$ |
| Compound 9383 | $L_{1-328}$ | $L_{2-1}$ |
| Compound 9384 | $L_{1-328}$ | $L_{2-10}$ |
| Compound 9385 | $L_{1-328}$ | $L_{2-15}$ |
| Compound 9386 | $L_{1-328}$ | $L_{2-20}$ |
| Compound 9387 | $L_{1-328}$ | $L_{2-65}$ |
| Compound 9388 | $L_{1-328}$ | $L_{2-109}$ |
| Compound 9389 | $L_{1-329}$ | $L_{2-1}$ |
| Compound 9390 | $L_{1-329}$ | $L_{2-10}$ |
| Compound 9391 | $L_{1-329}$ | $L_{2-15}$ |
| Compound 9392 | $L_{1-329}$ | $L_{2-20}$ |
| Compound 9393 | $L_{1-329}$ | $L_{2-65}$ |
| Compound 9394 | $L_{1-329}$ | $L_{2-109}$ |
| Compound 9395 | $L_{1-330}$ | $L_{2-1}$ |
| Compound 9396 | $L_{1-330}$ | $L_{2-10}$ |
| Compound 9397 | $L_{1-330}$ | $L_{2-15}$ |
| Compound 9398 | $L_{1-330}$ | $L_{2-20}$ |
| Compound 9399 | $L_{1-330}$ | $L_{2-65}$ |
| Compound 9400 | $L_{1-330}$ | $L_{2-109}$ |
| Compound 9401 | $L_{1-331}$ | $L_{2-1}$ |
| Compound 9402 | $L_{1-331}$ | $L_{2-10}$ |
| Compound 9403 | $L_{1-331}$ | $L_{2-15}$ |
| Compound 9404 | $L_{1-331}$ | $L_{2-20}$ |
| Compound 9405 | $L_{1-331}$ | $L_{2-65}$ |
| Compound 9406 | $L_{1-331}$ | $L_{2-109}$ |
| Compound 9407 | $L_{1-332}$ | $L_{2-1}$ |
| Compound 9408 | $L_{1-332}$ | $L_{2-10}$ |
| Compound 9409 | $L_{1-332}$ | $L_{2-15}$ |
| Compound 9410 | $L_{1-332}$ | $L_{2-20}$ |
| Compound 9411 | $L_{1-332}$ | $L_{2-65}$ |
| Compound 9412 | $L_{1-332}$ | $L_{2-109}$ |
| Compound 9413 | $L_{1-333}$ | $L_{2-1}$ |
| Compound 9414 | $L_{1-333}$ | $L_{2-10}$ |
| Compound 9415 | $L_{1-333}$ | $L_{2-15}$ |
| Compound 9416 | $L_{1-333}$ | $L_{2-20}$ |
| Compound 9417 | $L_{1-333}$ | $L_{2-65}$ |
| Compound 9418 | $L_{1-333}$ | $L_{2-109}$ |
| Compound 9419 | $L_{1-334}$ | $L_{2-1}$ |
| Compound 9420 | $L_{1-334}$ | $L_{2-10}$ |
| Compound 9421 | $L_{1-334}$ | $L_{2-15}$ |
| Compound 9422 | $L_{1-334}$ | $L_{2-20}$ |
| Compound 9423 | $L_{1-334}$ | $L_{2-65}$ |
| Compound 9424 | $L_{1-334}$ | $L_{2-109}$ |
| Compound 9425 | $L_{1-335}$ | $L_{2-1}$ |
| Compound 9426 | $L_{1-335}$ | $L_{2-10}$ |
| Compound 9427 | $L_{1-335}$ | $L_{2-15}$ |
| Compound 9428 | $L_{1-335}$ | $L_{2-20}$ |
| Compound 9429 | $L_{1-335}$ | $L_{2-65}$ |

TABLE 1-continued

| | | |
|---|---|---|
| Compound 9430 | $L_{1-335}$ | $L_{2-109}$ |
| Compound 9431 | $L_{1-336}$ | $L_{2-1}$ |
| Compound 9432 | $L_{1-336}$ | $L_{2-10}$ |
| Compound 9433 | $L_{1-336}$ | $L_{2-15}$ |
| Compound 9434 | $L_{1-336}$ | $L_{2-20}$ |
| Compound 9435 | $L_{1-336}$ | $L_{2-65}$ |
| Compound 9436 | $L_{1-336}$ | $L_{2-109}$ |
| Compound 9437 | $L_{1-337}$ | $L_{2-1}$ |
| Compound 9438 | $L_{1-337}$ | $L_{2-10}$ |
| Compound 9439 | $L_{1-337}$ | $L_{2-15}$ |
| Compound 9440 | $L_{1-337}$ | $L_{2-20}$ |
| Compound 9441 | $L_{1-337}$ | $L_{2-65}$ |
| Compound 9442 | $L_{1-337}$ | $L_{2-109}$ |
| Compound 9443 | $L_{1-338}$ | $L_{2-1}$ |
| Compound 9444 | $L_{1-338}$ | $L_{2-10}$ |
| Compound 9445 | $L_{1-338}$ | $L_{2-15}$ |
| Compound 9446 | $L_{1-338}$ | $L_{2-20}$ |
| Compound 9447 | $L_{1-338}$ | $L_{2-65}$ |
| Compound 9448 | $L_{1-338}$ | $L_{2-109}$ |
| Compound 9449 | $L_{1-339}$ | $L_{2-1}$ |
| Compound 9450 | $L_{1-339}$ | $L_{2-10}$ |
| Compound 9451 | $L_{1-339}$ | $L_{2-15}$ |
| Compound 9452 | $L_{1-339}$ | $L_{2-20}$ |
| Compound 9453 | $L_{1-339}$ | $L_{2-65}$ |
| Compound 9454 | $L_{1-339}$ | $L_{2-109}$ |
| Compound 9455 | $L_{1-340}$ | $L_{2-1}$ |
| Compound 9456 | $L_{1-340}$ | $L_{2-10}$ |
| Compound 9457 | $L_{1-340}$ | $L_{2-15}$ |
| Compound 9458 | $L_{1-340}$ | $L_{2-20}$ |
| Compound 9459 | $L_{1-340}$ | $L_{2-65}$ |
| Compound 9460 | $L_{1-340}$ | $L_{2-109}$ |
| Compound 9461 | $L_{1-341}$ | $L_{2-1}$ |
| Compound 9462 | $L_{1-341}$ | $L_{2-10}$ |
| Compound 9463 | $L_{1-341}$ | $L_{2-15}$ |
| Compound 9464 | $L_{1-341}$ | $L_{2-20}$ |
| Compound 9465 | $L_{1-341}$ | $L_{2-65}$ |
| Compound 9466 | $L_{1-341}$ | $L_{2-109}$ |
| Compound 9467 | $L_{1-342}$ | $L_{2-1}$ |
| Compound 9468 | $L_{1-342}$ | $L_{2-10}$ |
| Compound 9469 | $L_{1-342}$ | $L_{2-15}$ |
| Compound 9470 | $L_{1-342}$ | $L_{2-20}$ |
| Compound 9471 | $L_{1-342}$ | $L_{2-65}$ |
| Compound 9472 | $L_{1-342}$ | $L_{2-109}$ |
| Compound 9473 | $L_{1-343}$ | $L_{2-1}$ |
| Compound 9474 | $L_{1-343}$ | $L_{2-10}$ |
| Compound 9475 | $L_{1-343}$ | $L_{2-15}$ |
| Compound 9476 | $L_{1-343}$ | $L_{2-20}$ |
| Compound 9477 | $L_{1-343}$ | $L_{2-65}$ |
| Compound 9478 | $L_{1-343}$ | $L_{2-109}$ |
| Compound 9479 | $L_{1-344}$ | $L_{2-1}$ |
| Compound 9480 | $L_{1-344}$ | $L_{2-10}$ |
| Compound 9481 | $L_{1-344}$ | $L_{2-15}$ |
| Compound 9482 | $L_{1-344}$ | $L_{2-20}$ |
| Compound 9483 | $L_{1-344}$ | $L_{2-65}$ |
| Compound 9484 | $L_{1-344}$ | $L_{2-109}$ |
| Compound 9485 | $L_{1-345}$ | $L_{2-1}$ |
| Compound 9486 | $L_{1-345}$ | $L_{2-10}$ |
| Compound 9487 | $L_{1-345}$ | $L_{2-15}$ |
| Compound 9488 | $L_{1-345}$ | $L_{2-20}$ |
| Compound 9489 | $L_{1-345}$ | $L_{2-65}$ |
| Compound 9490 | $L_{1-345}$ | $L_{2-109}$ |
| Compound 9491 | $L_{1-346}$ | $L_{2-1}$ |
| Compound 9492 | $L_{1-346}$ | $L_{2-10}$ |
| Compound 9493 | $L_{1-346}$ | $L_{2-15}$ |
| Compound 9494 | $L_{1-346}$ | $L_{2-20}$ |
| Compound 9495 | $L_{1-346}$ | $L_{2-65}$ |
| Compound 9496 | $L_{1-346}$ | $L_{2-109}$ |
| Compound 9497 | $L_{1-347}$ | $L_{2-1}$ |
| Compound 9498 | $L_{1-347}$ | $L_{2-10}$ |
| Compound 9499 | $L_{1-347}$ | $L_{2-15}$ |
| Compound 9500 | $L_{1-347}$ | $L_{2-20}$ |
| Compound 9501 | $L_{1-347}$ | $L_{2-65}$ |
| Compound 9502 | $L_{1-347}$ | $L_{2-109}$ |
| Compound 9503 | $L_{1-348}$ | $L_{2-1}$ |
| Compound 9504 | $L_{1-348}$ | $L_{2-10}$ |
| Compound 9505 | $L_{1-348}$ | $L_{2-15}$ |
| Compound 9506 | $L_{1-348}$ | $L_{2-20}$ |
| Compound 9507 | $L_{1-348}$ | $L_{2-65}$ |
| Compound 9508 | $L_{1-348}$ | $L_{2-109}$ |
| Compound 9509 | $L_{1-349}$ | $L_{2-1}$ |

TABLE 1-continued

| | | |
|---|---|---|
| Compound 9510 | $L_{1-349}$ | $L_{2-10}$ |
| Compound 9511 | $L_{1-349}$ | $L_{2-15}$ |
| Compound 9512 | $L_{1-349}$ | $L_{2-20}$ |
| Compound 9513 | $L_{1-349}$ | $L_{2-65}$ |
| Compound 9514 | $L_{1-349}$ | $L_{2-109}$ |
| Compound 9515 | $L_{1-350}$ | $L_{2-1}$ |
| Compound 9516 | $L_{1-350}$ | $L_{2-10}$ |
| Compound 9517 | $L_{1-350}$ | $L_{2-15}$ |
| Compound 9518 | $L_{1-350}$ | $L_{2-20}$ |
| Compound 9519 | $L_{1-350}$ | $L_{2-65}$ |
| Compound 9520 | $L_{1-350}$ | $L_{2-109}$ |
| Compound 9521 | $L_{1-351}$ | $L_{2-1}$ |
| Compound 9522 | $L_{1-351}$ | $L_{2-10}$ |
| Compound 9523 | $L_{1-351}$ | $L_{2-15}$ |
| Compound 9524 | $L_{1-351}$ | $L_{2-20}$ |
| Compound 9525 | $L_{1-351}$ | $L_{2-65}$ |
| Compound 9526 | $L_{1-351}$ | $L_{2-109}$ |
| Compound 9527 | $L_{1-352}$ | $L_{2-1}$ |
| Compound 9528 | $L_{1-352}$ | $L_{2-10}$ |
| Compound 9529 | $L_{1-352}$ | $L_{2-15}$ |
| Compound 9530 | $L_{1-352}$ | $L_{2-20}$ |
| Compound 9531 | $L_{1-352}$ | $L_{2-65}$ |
| Compound 9532 | $L_{1-352}$ | $L_{2-109}$ |
| Compound 9533 | $L_{1-353}$ | $L_{2-1}$ |
| Compound 9534 | $L_{1-353}$ | $L_{2-10}$ |
| Compound 9535 | $L_{1-353}$ | $L_{2-15}$ |
| Compound 9536 | $L_{1-353}$ | $L_{2-20}$ |
| Compound 9537 | $L_{1-353}$ | $L_{2-65}$ |
| Compound 9538 | $L_{1-353}$ | $L_{2-109}$ |
| Compound 9539 | $L_{1-354}$ | $L_{2-1}$ |
| Compound 9540 | $L_{1-354}$ | $L_{2-10}$ |
| Compound 9541 | $L_{1-354}$ | $L_{2-15}$ |
| Compound 9542 | $L_{1-354}$ | $L_{2-20}$ |
| Compound 9543 | $L_{1-354}$ | $L_{2-65}$ |
| Compound 9544 | $L_{1-354}$ | $L_{2-109}$ |
| Compound 9545 | $L_{1-355}$ | $L_{2-1}$ |
| Compound 9546 | $L_{1-355}$ | $L_{2-10}$ |
| Compound 9547 | $L_{1-355}$ | $L_{2-15}$ |
| Compound 9548 | $L_{1-355}$ | $L_{2-20}$ |
| Compound 9549 | $L_{1-355}$ | $L_{2-65}$ |
| Compound 9550 | $L_{1-355}$ | $L_{2-109}$ |
| Compound 9551 | $L_{1-356}$ | $L_{2-1}$ |
| Compound 9552 | $L_{1-356}$ | $L_{2-10}$ |
| Compound 9553 | $L_{1-356}$ | $L_{2-15}$ |
| Compound 9554 | $L_{1-356}$ | $L_{2-20}$ |
| Compound 9555 | $L_{1-356}$ | $L_{2-65}$ |
| Compound 9556 | $L_{1-356}$ | $L_{2-109}$ |
| Compound 9557 | $L_{1-357}$ | $L_{2-1}$ |
| Compound 9558 | $L_{1-357}$ | $L_{2-10}$ |
| Compound 9559 | $L_{1-357}$ | $L_{2-15}$ |
| Compound 9560 | $L_{1-357}$ | $L_{2-20}$ |
| Compound 9561 | $L_{1-357}$ | $L_{2-65}$ |
| Compound 9562 | $L_{1-357}$ | $L_{2-109}$ |
| Compound 9563 | $L_{1-358}$ | $L_{2-1}$ |
| Compound 9564 | $L_{1-358}$ | $L_{2-10}$ |
| Compound 9565 | $L_{1-358}$ | $L_{2-15}$ |
| Compound 9566 | $L_{1-358}$ | $L_{2-20}$ |
| Compound 9567 | $L_{1-358}$ | $L_{2-65}$ |
| Compound 9568 | $L_{1-358}$ | $L_{2-109}$ |
| Compound 9569 | $L_{1-359}$ | $L_{2-1}$ |
| Compound 9570 | $L_{1-359}$ | $L_{2-10}$ |
| Compound 9571 | $L_{1-359}$ | $L_{2-15}$ |
| Compound 9572 | $L_{1-359}$ | $L_{2-20}$ |
| Compound 9573 | $L_{1-359}$ | $L_{2-65}$ |
| Compound 9574 | $L_{1-359}$ | $L_{2-109}$ |
| Compound 9575 | $L_{1-360}$ | $L_{2-1}$ |
| Compound 9576 | $L_{1-360}$ | $L_{2-10}$ |
| Compound 9577 | $L_{1-360}$ | $L_{2-15}$ |
| Compound 9578 | $L_{1-360}$ | $L_{2-20}$ |
| Compound 9579 | $L_{1-360}$ | $L_{2-65}$ |
| Compound 9580 | $L_{1-360}$ | $L_{2-109}$ |
| Compound 9581 | $L_{1-361}$ | $L_{2-1}$ |
| Compound 9582 | $L_{1-361}$ | $L_{2-10}$ |
| Compound 9583 | $L_{1-361}$ | $L_{2-15}$ |
| Compound 9584 | $L_{1-361}$ | $L_{2-20}$ |
| Compound 9585 | $L_{1-361}$ | $L_{2-65}$ |
| Compound 9586 | $L_{1-361}$ | $L_{2-109}$ |
| Compound 9587 | $L_{1-362}$ | $L_{2-1}$ |
| Compound 9588 | $L_{1-362}$ | $L_{2-10}$ |
| Compound 9589 | $L_{1-362}$ | $L_{2-15}$ |

TABLE 1-continued

| | | |
|---|---|---|
| Compound 9590 | $L_{1-362}$ | $L_{2-20}$ |
| Compound 9591 | $L_{1-362}$ | $L_{2-65}$ |
| Compound 9592 | $L_{1-362}$ | $L_{2-109}$ |
| Compound 9593 | $L_{1-363}$ | $L_{2-1}$ |
| Compound 9594 | $L_{1-363}$ | $L_{2-10}$ |
| Compound 9595 | $L_{1-363}$ | $L_{2-15}$ |
| Compound 9596 | $L_{1-363}$ | $L_{2-20}$ |
| Compound 9597 | $L_{1-363}$ | $L_{2-65}$ |
| Compound 9598 | $L_{1-363}$ | $L_{2-109}$ |
| Compound 9599 | $L_{1-364}$ | $L_{2-1}$ |
| Compound 9600 | $L_{1-364}$ | $L_{2-10}$ |
| Compound 9601 | $L_{1-364}$ | $L_{2-15}$ |
| Compound 9602 | $L_{1-364}$ | $L_{2-20}$ |
| Compound 9603 | $L_{1-364}$ | $L_{2-65}$ |
| Compound 9604 | $L_{1-364}$ | $L_{2-109}$ |
| Compound 9605 | $L_{1-365}$ | $L_{2-1}$ |
| Compound 9606 | $L_{1-365}$ | $L_{2-10}$ |
| Compound 9607 | $L_{1-365}$ | $L_{2-15}$ |
| Compound 9608 | $L_{1-365}$ | $L_{2-20}$ |
| Compound 9609 | $L_{1-365}$ | $L_{2-65}$ |
| Compound 9610 | $L_{1-365}$ | $L_{2-109}$ |
| Compound 9611 | $L_{1-366}$ | $L_{2-1}$ |
| Compound 9612 | $L_{1-366}$ | $L_{2-10}$ |
| Compound 9613 | $L_{1-366}$ | $L_{2-15}$ |
| Compound 9614 | $L_{1-366}$ | $L_{2-20}$ |
| Compound 9615 | $L_{1-366}$ | $L_{2-65}$ |
| Compound 9616 | $L_{1-366}$ | $L_{2-109}$ |
| Compound 9617 | $L_{1-367}$ | $L_{2-1}$ |
| Compound 9618 | $L_{1-367}$ | $L_{2-10}$ |
| Compound 9619 | $L_{1-367}$ | $L_{2-15}$ |
| Compound 9620 | $L_{1-367}$ | $L_{2-20}$ |
| Compound 9621 | $L_{1-367}$ | $L_{2-65}$ |
| Compound 9622 | $L_{1-367}$ | $L_{2-109}$ |
| Compound 9623 | $L_{1-368}$ | $L_{2-1}$ |
| Compound 9624 | $L_{1-368}$ | $L_{2-10}$ |
| Compound 9625 | $L_{1-368}$ | $L_{2-15}$ |
| Compound 9626 | $L_{1-368}$ | $L_{2-20}$ |
| Compound 9627 | $L_{1-368}$ | $L_{2-65}$ |
| Compound 9628 | $L_{1-368}$ | $L_{2-109}$ |
| Compound 9629 | $L_{1-369}$ | $L_{2-1}$ |
| Compound 9630 | $L_{1-369}$ | $L_{2-10}$ |
| Compound 9631 | $L_{1-369}$ | $L_{2-15}$ |
| Compound 9632 | $L_{1-369}$ | $L_{2-20}$ |
| Compound 9633 | $L_{1-369}$ | $L_{2-65}$ |
| Compound 9634 | $L_{1-369}$ | $L_{2-109}$ |
| Compound 9635 | $L_{1-370}$ | $L_{2-1}$ |
| Compound 9636 | $L_{1-370}$ | $L_{2-10}$ |
| Compound 9637 | $L_{1-370}$ | $L_{2-15}$ |
| Compound 9638 | $L_{1-370}$ | $L_{2-20}$ |
| Compound 9639 | $L_{1-370}$ | $L_{2-65}$ |
| Compound 9640 | $L_{1-370}$ | $L_{2-109}$ |
| Compound 9641 | $L_{1-371}$ | $L_{2-1}$ |
| Compound 9642 | $L_{1-371}$ | $L_{2-10}$ |
| Compound 9643 | $L_{1-371}$ | $L_{2-15}$ |
| Compound 9644 | $L_{1-371}$ | $L_{2-20}$ |
| Compound 9645 | $L_{1-371}$ | $L_{2-65}$ |
| Compound 9646 | $L_{1-371}$ | $L_{2-109}$ |
| Compound 9647 | $L_{1-372}$ | $L_{2-1}$ |
| Compound 9648 | $L_{1-372}$ | $L_{2-10}$ |
| Compound 9649 | $L_{1-372}$ | $L_{2-15}$ |
| Compound 9650 | $L_{1-372}$ | $L_{2-20}$ |
| Compound 9651 | $L_{1-372}$ | $L_{2-65}$ |
| Compound 9652 | $L_{1-372}$ | $L_{2-109}$ |
| Compound 9653 | $L_{1-373}$ | $L_{2-1}$ |
| Compound 9654 | $L_{1-373}$ | $L_{2-10}$ |
| Compound 9655 | $L_{1-373}$ | $L_{2-15}$ |
| Compound 9656 | $L_{1-373}$ | $L_{2-20}$ |
| Compound 9657 | $L_{1-373}$ | $L_{2-65}$ |
| Compound 9658 | $L_{1-373}$ | $L_{2-109}$ |
| Compound 9659 | $L_{1-374}$ | $L_{2-1}$ |
| Compound 9660 | $L_{1-374}$ | $L_{2-10}$ |
| Compound 9661 | $L_{1-374}$ | $L_{2-15}$ |
| Compound 9662 | $L_{1-374}$ | $L_{2-20}$ |
| Compound 9663 | $L_{1-374}$ | $L_{2-65}$ |
| Compound 9664 | $L_{1-374}$ | $L_{2-109}$ |
| Compound 9665 | $L_{1-375}$ | $L_{2-1}$ |
| Compound 9666 | $L_{1-375}$ | $L_{2-10}$ |
| Compound 9667 | $L_{1-375}$ | $L_{2-15}$ |
| Compound 9668 | $L_{1-375}$ | $L_{2-20}$ |
| Compound 9669 | $L_{1-375}$ | $L_{2-65}$ |

TABLE 1-continued

| | | |
|---|---|---|
| Compound 9670 | $L_{1-375}$ | $L_{2-109}$ |
| Compound 9671 | $L_{1-376}$ | $L_{2-1}$ |
| Compound 9672 | $L_{1-376}$ | $L_{2-10}$ |
| Compound 9673 | $L_{1-376}$ | $L_{2-15}$ |
| Compound 9674 | $L_{1-376}$ | $L_{2-20}$ |
| Compound 9675 | $L_{1-376}$ | $L_{2-65}$ |
| Compound 9676 | $L_{1-376}$ | $L_{2-109}$ |
| Compound 9677 | $L_{1-377}$ | $L_{2-1}$ |
| Compound 9678 | $L_{1-377}$ | $L_{2-10}$ |
| Compound 9679 | $L_{1-377}$ | $L_{2-15}$ |
| Compound 9680 | $L_{1-377}$ | $L_{2-20}$ |
| Compound 9681 | $L_{1-377}$ | $L_{2-65}$ |
| Compound 9682 | $L_{1-377}$ | $L_{2-109}$ |
| Compound 9683 | $L_{1-378}$ | $L_{2-1}$ |
| Compound 9684 | $L_{1-378}$ | $L_{2-10}$ |
| Compound 9685 | $L_{1-378}$ | $L_{2-15}$ |
| Compound 9686 | $L_{1-378}$ | $L_{2-20}$ |
| Compound 9687 | $L_{1-378}$ | $L_{2-65}$ |
| Compound 9688 | $L_{1-378}$ | $L_{2-109}$ |
| Compound 9689 | $L_{1-379}$ | $L_{2-1}$ |
| Compound 9690 | $L_{1-379}$ | $L_{2-10}$ |
| Compound 9691 | $L_{1-379}$ | $L_{2-15}$ |
| Compound 9692 | $L_{1-379}$ | $L_{2-20}$ |
| Compound 9693 | $L_{1-379}$ | $L_{2-65}$ |
| Compound 9694 | $L_{1-379}$ | $L_{2-109}$ |
| Compound 9695 | $L_{1-380}$ | $L_{2-1}$ |
| Compound 9696 | $L_{1-380}$ | $L_{2-10}$ |
| Compound 9697 | $L_{1-380}$ | $L_{2-15}$ |
| Compound 9698 | $L_{1-380}$ | $L_{2-20}$ |
| Compound 9699 | $L_{1-380}$ | $L_{2-65}$ |
| Compound 9700 | $L_{1-380}$ | $L_{2-109}$ |
| Compound 9701 | $L_{1-381}$ | $L_{2-1}$ |
| Compound 9702 | $L_{1-381}$ | $L_{2-10}$ |
| Compound 9703 | $L_{1-381}$ | $L_{2-15}$ |
| Compound 9704 | $L_{1-381}$ | $L_{2-20}$ |
| Compound 9705 | $L_{1-381}$ | $L_{2-65}$ |
| Compound 9706 | $L_{1-381}$ | $L_{2-109}$ |
| Compound 9707 | $L_{1-382}$ | $L_{2-1}$ |
| Compound 9708 | $L_{1-382}$ | $L_{2-10}$ |
| Compound 9709 | $L_{1-382}$ | $L_{2-15}$ |
| Compound 9710 | $L_{1-382}$ | $L_{2-20}$ |
| Compound 9711 | $L_{1-382}$ | $L_{2-65}$ |
| Compound 9712 | $L_{1-382}$ | $L_{2-109}$ |
| Compound 9713 | $L_{1-383}$ | $L_{2-1}$ |
| Compound 9714 | $L_{1-383}$ | $L_{2-10}$ |
| Compound 9715 | $L_{1-383}$ | $L_{2-15}$ |
| Compound 9716 | $L_{1-383}$ | $L_{2-20}$ |
| Compound 9717 | $L_{1-383}$ | $L_{2-65}$ |
| Compound 9718 | $L_{1-383}$ | $L_{2-109}$ |
| Compound 9719 | $L_{1-384}$ | $L_{2-1}$ |
| Compound 9720 | $L_{1-384}$ | $L_{2-10}$ |
| Compound 9721 | $L_{1-384}$ | $L_{2-15}$ |
| Compound 9722 | $L_{1-384}$ | $L_{2-20}$ |
| Compound 9723 | $L_{1-384}$ | $L_{2-65}$ |
| Compound 9724 | $L_{1-384}$ | $L_{2-109}$ |
| Compound 9725 | $L_{1-385}$ | $L_{2-1}$ |
| Compound 9726 | $L_{1-385}$ | $L_{2-10}$ |
| Compound 9727 | $L_{1-385}$ | $L_{2-15}$ |
| Compound 9728 | $L_{1-385}$ | $L_{2-20}$ |
| Compound 9729 | $L_{1-385}$ | $L_{2-65}$ |
| Compound 9730 | $L_{1-385}$ | $L_{2-109}$ |
| Compound 9731 | $L_{1-386}$ | $L_{2-1}$ |
| Compound 9732 | $L_{1-386}$ | $L_{2-10}$ |
| Compound 9733 | $L_{1-386}$ | $L_{2-15}$ |
| Compound 9734 | $L_{1-386}$ | $L_{2-20}$ |
| Compound 9735 | $L_{1-386}$ | $L_{2-65}$ |
| Compound 9736 | $L_{1-386}$ | $L_{2-109}$ |
| Compound 9737 | $L_{1-387}$ | $L_{2-1}$ |
| Compound 9738 | $L_{1-387}$ | $L_{2-10}$ |
| Compound 9739 | $L_{1-387}$ | $L_{2-15}$ |
| Compound 9740 | $L_{1-387}$ | $L_{2-20}$ |
| Compound 9741 | $L_{1-387}$ | $L_{2-65}$ |
| Compound 9742 | $L_{1-387}$ | $L_{2-109}$ |
| Compound 9743 | $L_{1-388}$ | $L_{2-1}$ |
| Compound 9744 | $L_{1-388}$ | $L_{2-10}$ |
| Compound 9745 | $L_{1-388}$ | $L_{2-15}$ |
| Compound 9746 | $L_{1-388}$ | $L_{2-20}$ |
| Compound 9747 | $L_{1-388}$ | $L_{2-65}$ |
| Compound 9748 | $L_{1-388}$ | $L_{2-109}$ |
| Compound 9749 | $L_{1-389}$ | $L_{2-1}$ |
| Compound 9750 | $L_{1-389}$ | $L_{2-10}$ |
| Compound 9751 | $L_{1-389}$ | $L_{2-15}$ |
| Compound 9752 | $L_{1-389}$ | $L_{2-20}$ |
| Compound 9753 | $L_{1-389}$ | $L_{2-65}$ |
| Compound 9754 | $L_{1-389}$ | $L_{2-109}$ |
| Compound 9755 | $L_{1-390}$ | $L_{2-1}$ |
| Compound 9756 | $L_{1-390}$ | $L_{2-10}$ |
| Compound 9757 | $L_{1-390}$ | $L_{2-15}$ |
| Compound 9758 | $L_{1-390}$ | $L_{2-20}$ |
| Compound 9759 | $L_{1-390}$ | $L_{2-65}$ |
| Compound 9760 | $L_{1-390}$ | $L_{2-109}$ |
| Compound 9761 | $L_{1-391}$ | $L_{2-1}$ |
| Compound 9762 | $L_{1-391}$ | $L_{2-10}$ |
| Compound 9763 | $L_{1-391}$ | $L_{2-15}$ |
| Compound 9764 | $L_{1-391}$ | $L_{2-20}$ |
| Compound 9765 | $L_{1-391}$ | $L_{2-65}$ |
| Compound 9766 | $L_{1-391}$ | $L_{2-109}$ |
| Compound 9767 | $L_{1-392}$ | $L_{2-1}$ |
| Compound 9768 | $L_{1-392}$ | $L_{2-10}$ |
| Compound 9769 | $L_{1-392}$ | $L_{2-15}$ |
| Compound 9770 | $L_{1-392}$ | $L_{2-20}$ |
| Compound 9771 | $L_{1-392}$ | $L_{2-65}$ |
| Compound 9772 | $L_{1-392}$ | $L_{2-109}$ |
| Compound 9773 | $L_{1-393}$ | $L_{2-1}$ |
| Compound 9774 | $L_{1-393}$ | $L_{2-10}$ |
| Compound 9775 | $L_{1-393}$ | $L_{2-15}$ |
| Compound 9776 | $L_{1-393}$ | $L_{2-20}$ |
| Compound 9777 | $L_{1-393}$ | $L_{2-65}$ |
| Compound 9778 | $L_{1-393}$ | $L_{2-109}$ |
| Compound 9779 | $L_{1-394}$ | $L_{2-1}$ |
| Compound 9780 | $L_{1-394}$ | $L_{2-10}$ |
| Compound 9781 | $L_{1-394}$ | $L_{2-15}$ |
| Compound 9782 | $L_{1-394}$ | $L_{2-20}$ |
| Compound 9783 | $L_{1-394}$ | $L_{2-65}$ |
| Compound 9784 | $L_{1-394}$ | $L_{2-109}$ |
| Compound 9785 | $L_{1-395}$ | $L_{2-1}$ |
| Compound 9786 | $L_{1-395}$ | $L_{2-10}$ |
| Compound 9787 | $L_{1-395}$ | $L_{2-15}$ |
| Compound 9788 | $L_{1-395}$ | $L_{2-20}$ |
| Compound 9789 | $L_{1-395}$ | $L_{2-65}$ |
| Compound 9790 | $L_{1-395}$ | $L_{2-109}$ |
| Compound 9791 | $L_{1-396}$ | $L_{2-1}$ |
| Compound 9792 | $L_{1-396}$ | $L_{2-10}$ |
| Compound 9793 | $L_{1-396}$ | $L_{2-15}$ |
| Compound 9794 | $L_{1-396}$ | $L_{2-20}$ |
| Compound 9795 | $L_{1-396}$ | $L_{2-65}$ |
| Compound 9796 | $L_{1-396}$ | $L_{2-109}$ |

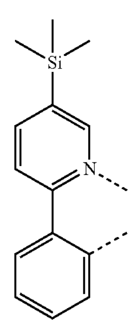

$L_{1-1}$

-continued
L1-2
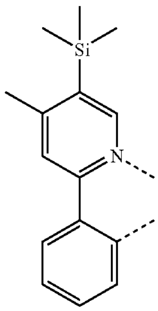
L1-3
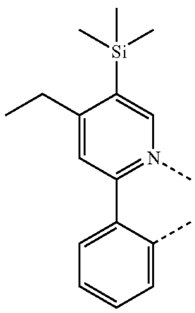
L1-4
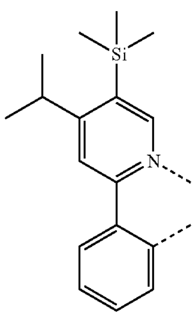
L1-5
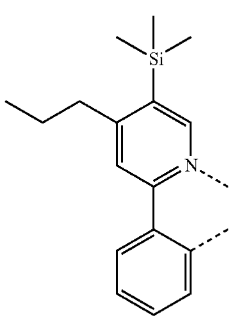
L1-6
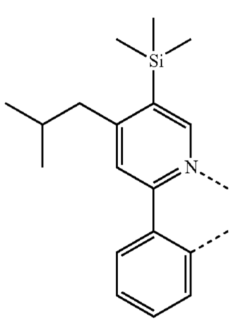
-continued
L1-7
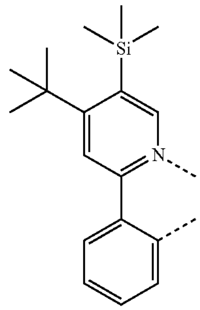
L1-8
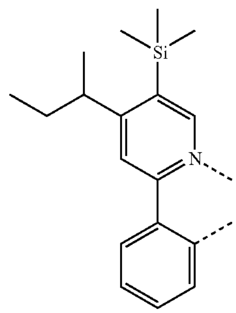
L1-9
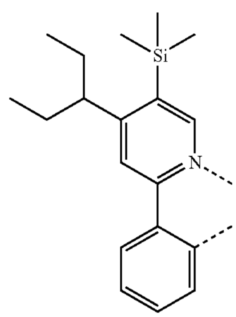
L1-10
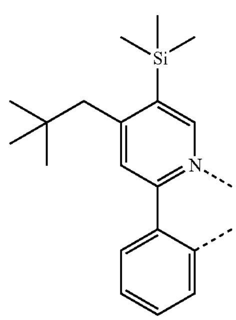
L1-11
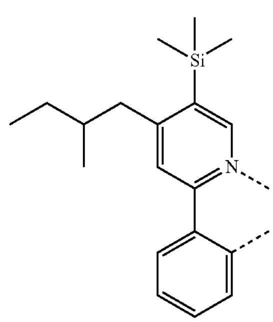

-continued
L1-12
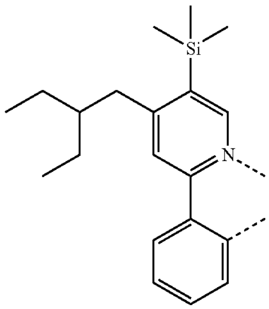
L1-13
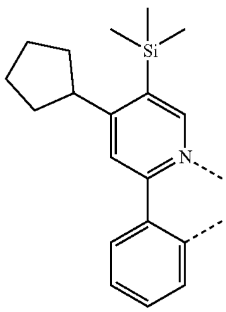
L1-14
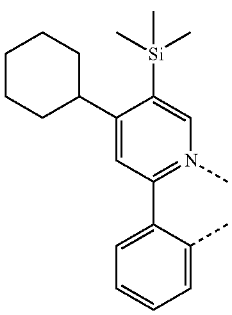
L1-15
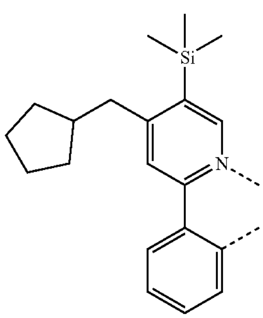
L1-16
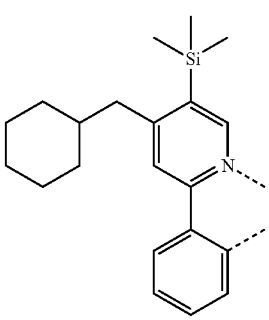
-continued
L1-17
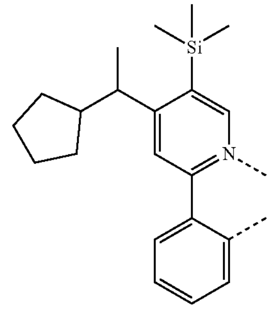
L1-18
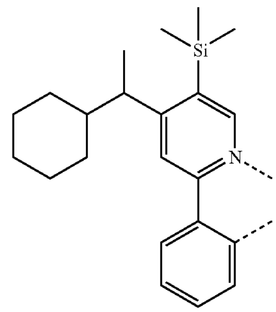
L1-19
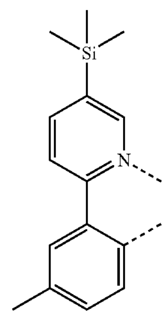
L1-20
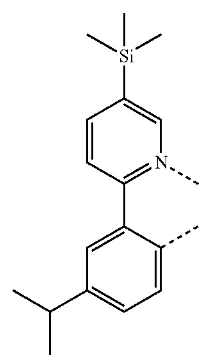
L1-21
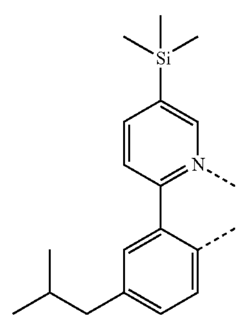

-continued
L1-22
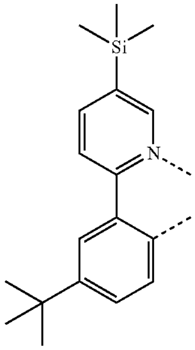
L1-23
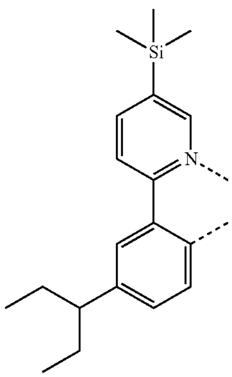
L1-24
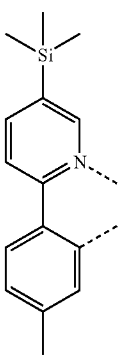
L1-25
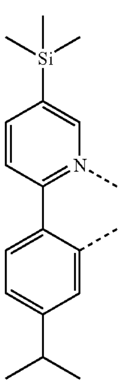
-continued
L1-26
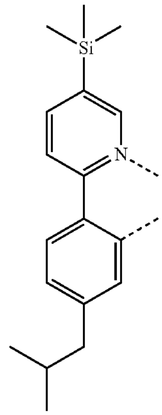
L1-27
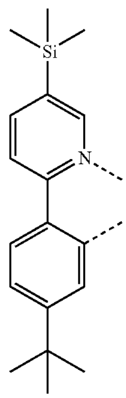
L1-28
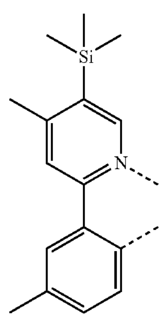
L1-29
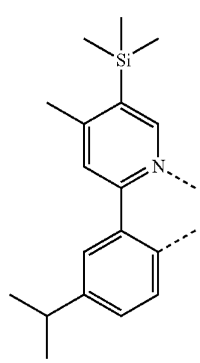

-continued
$L_{1-30}$
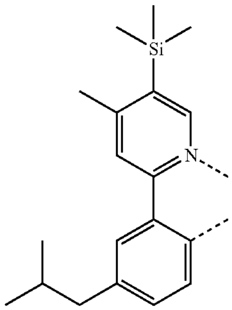
$L_{1-31}$
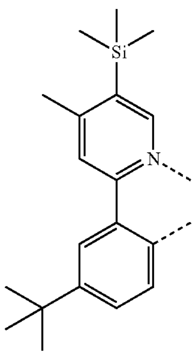
$L_{1-32}$
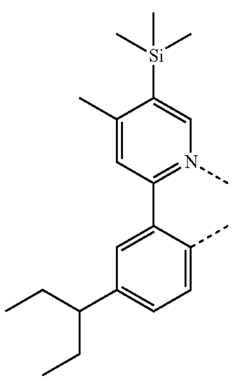
$L_{1-33}$
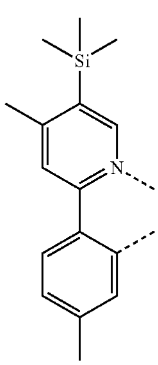
$L_{1-34}$
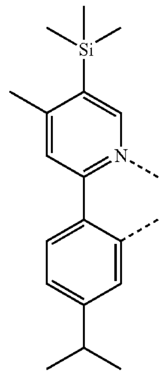
$L_{1-35}$
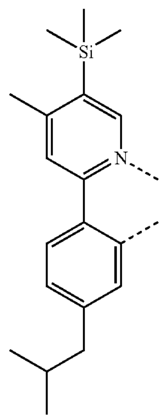
$L_{1-36}$
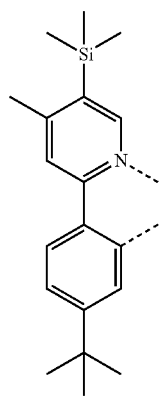
$L_{1-37}$
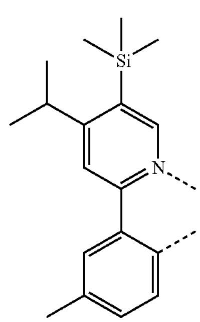

-continued
L1-38
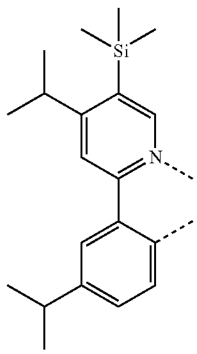
L1-39
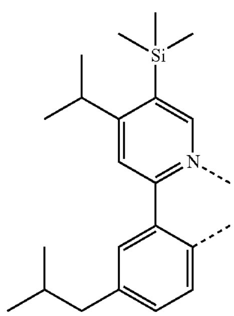
L1-40
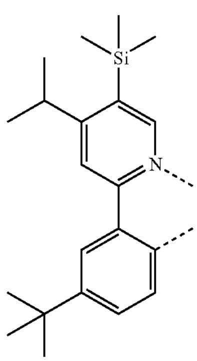
L1-41
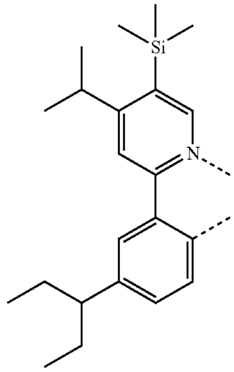
-continued
L1-42
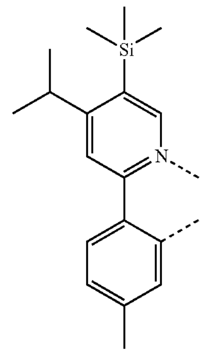
L1-43
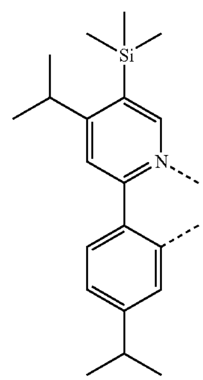
L1-44
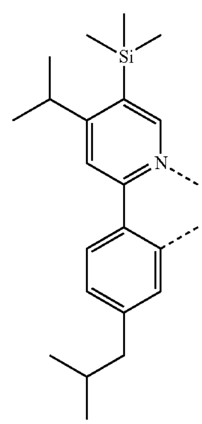
L1-45
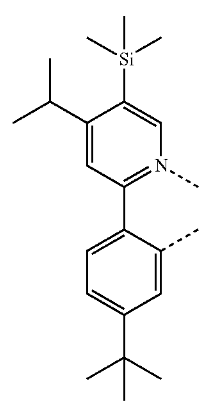

-continued
$L_{1-46}$
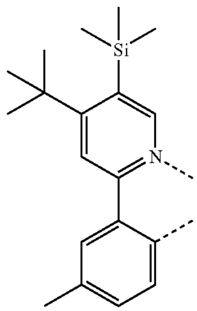
$L_{1-47}$
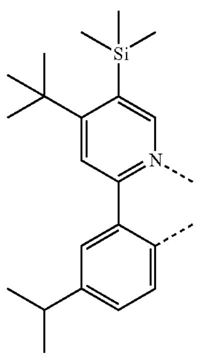
$L_{1-48}$
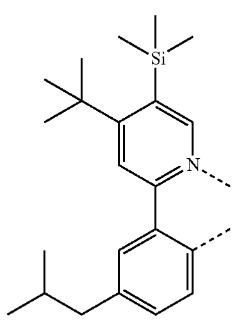
$L_{1-49}$
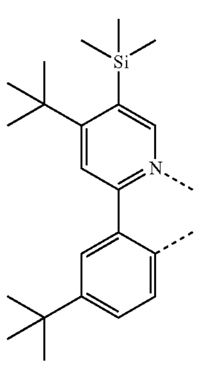
-continued
$L_{1-50}$
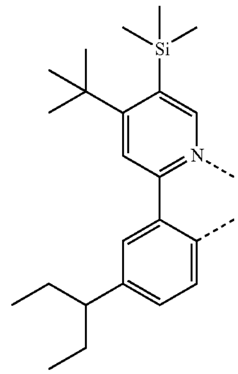
$L_{1-51}$
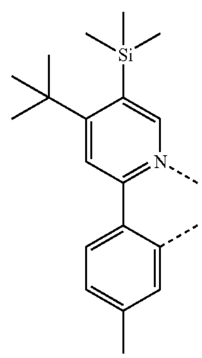
$L_{1-52}$
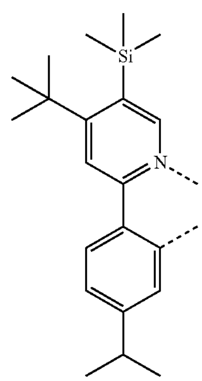
$L_{1-53}$
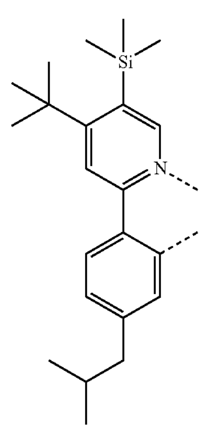

-continued
$L_{1-54}$
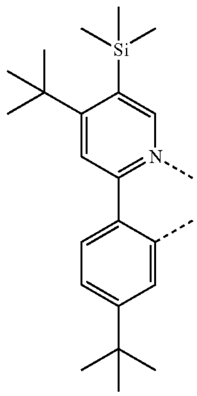
$L_{1-55}$
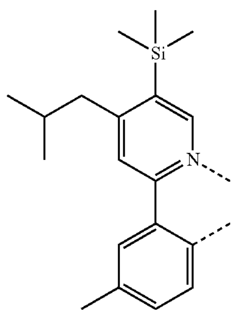
$L_{1-56}$
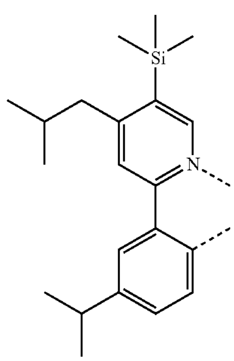
$L_{1-57}$
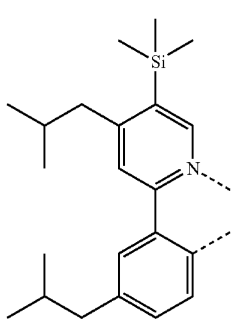
-continued
$L_{1-58}$
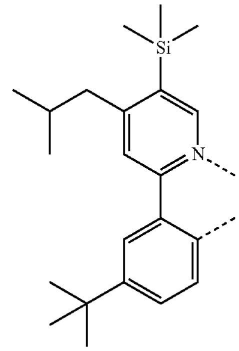
$L_{1-59}$
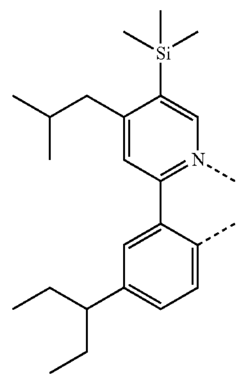
$L_{1-60}$
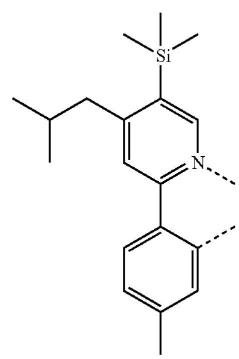
$L_{1-61}$
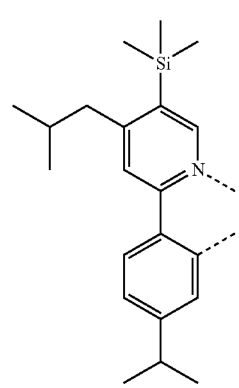

$L_{1-62}$
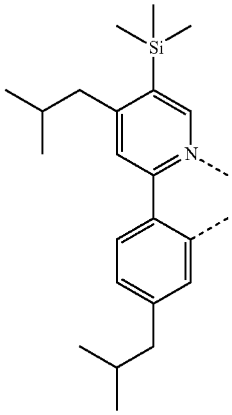
$L_{1-63}$
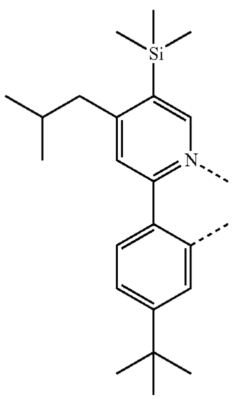
$L_{1-64}$
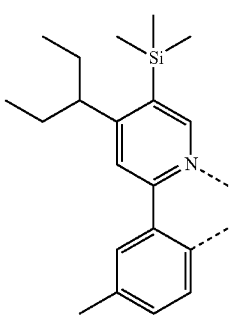
$L_{1-65}$
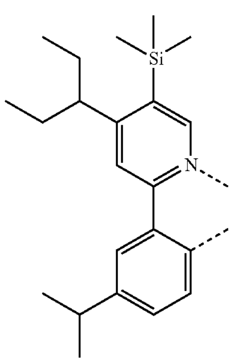
$L_{1-66}$
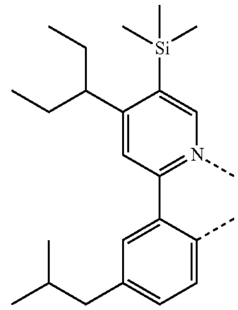
$L_{1-67}$
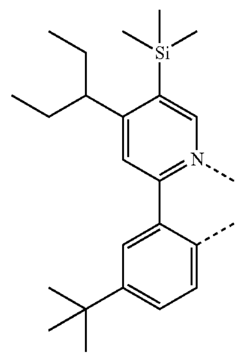
$L_{1-68}$
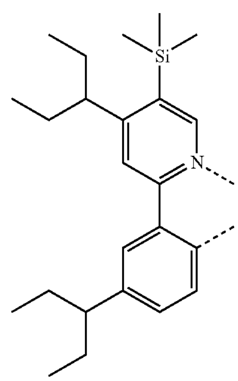
$L_{1-69}$
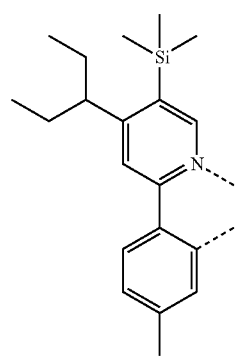

-continued
L1-70
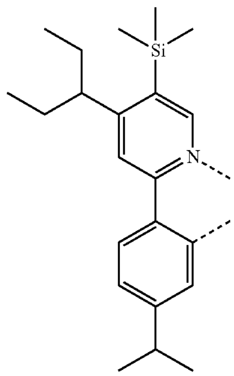
L1-71
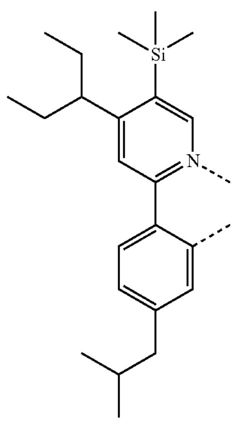
L1-72
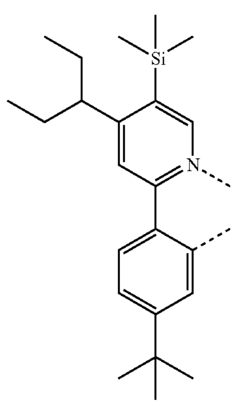
L1-73
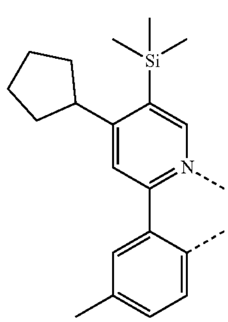
-continued
L1-74
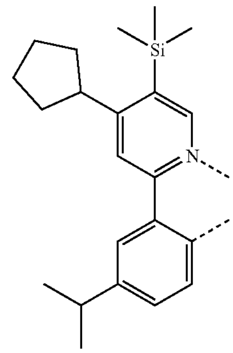
L1-75
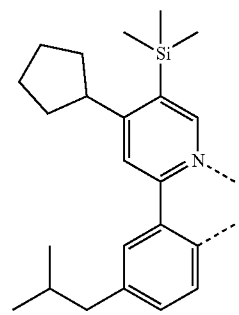
L1-76
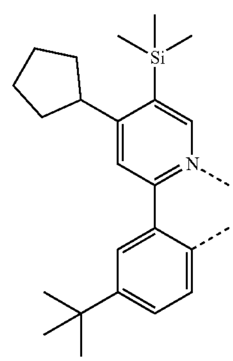
L1-77
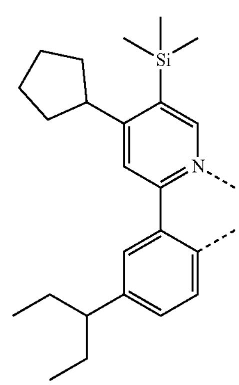

-continued
$L_{1-78}$
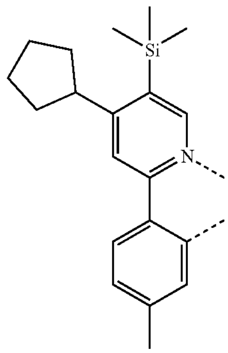
$L_{1-79}$
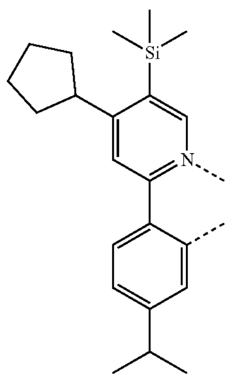
$L_{1-80}$
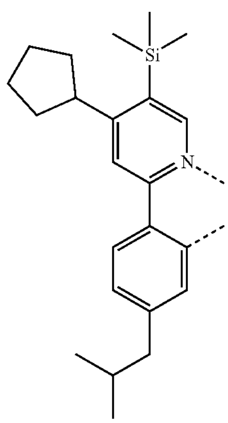
$L_{1-81}$
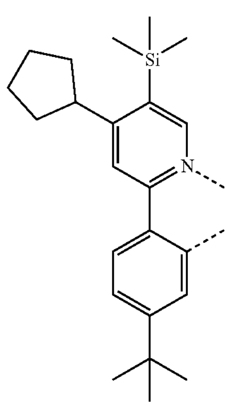
-continued
$L_{1-82}$
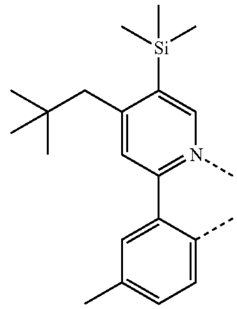
$L_{1-83}$
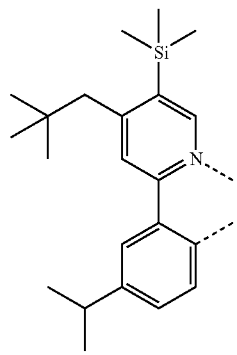
$L_{1-84}$
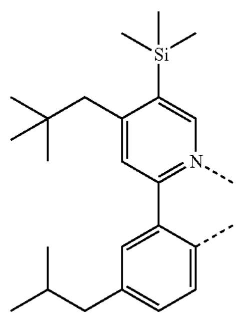
$L_{1-85}$
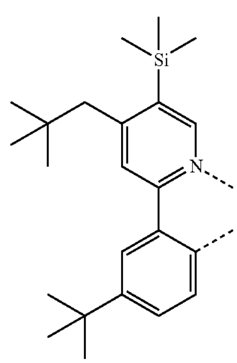

-continued
L1-86
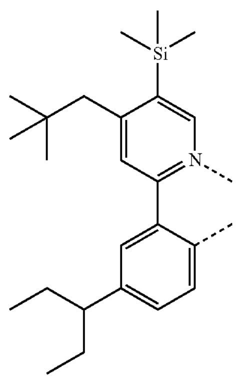
L1-87
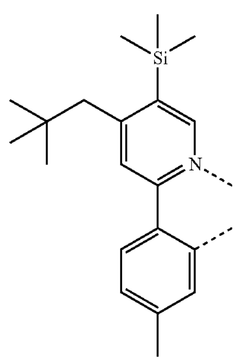
L1-88
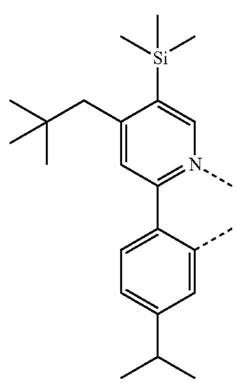
L1-89
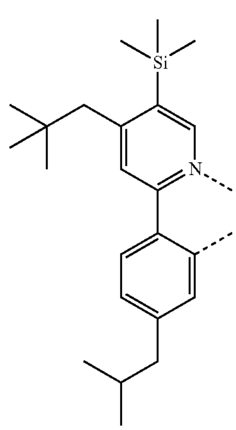
-continued
L1-90
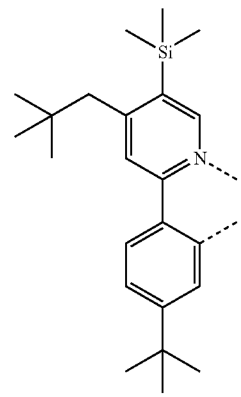
L1-91
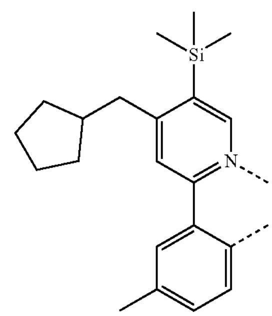
L1-92
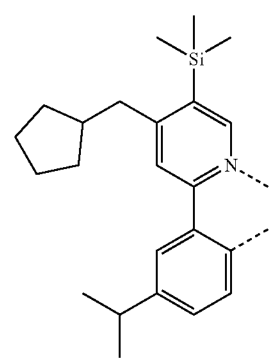
L1-93
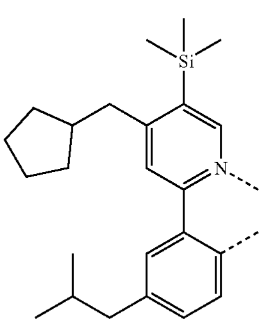

-continued
L1-94
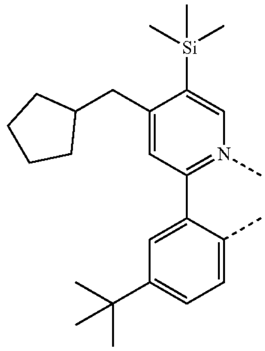
L1-95
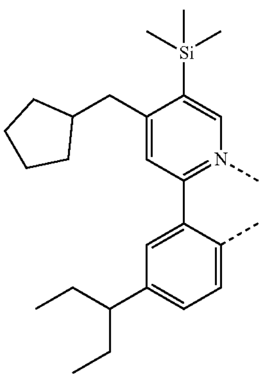
L1-96
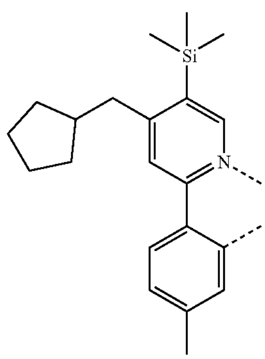
L1-97
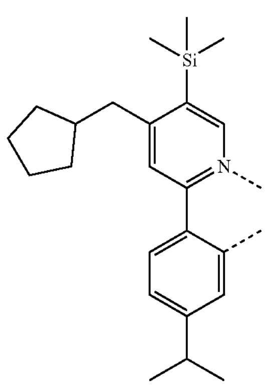
-continued
L1-98
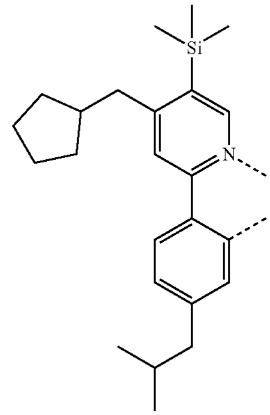
L1-99
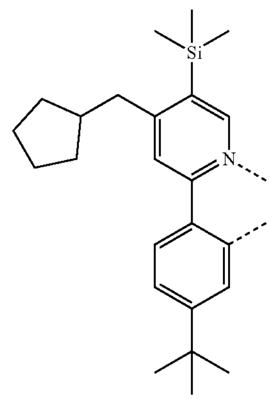
L1-100
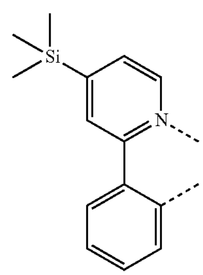
L1-101
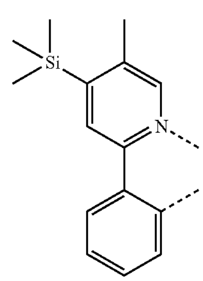

-continued
L1-102
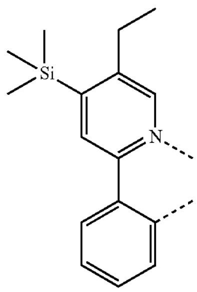
L1-103
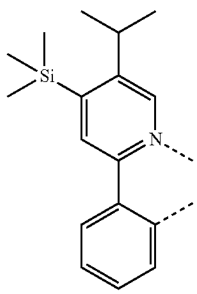
L1-104
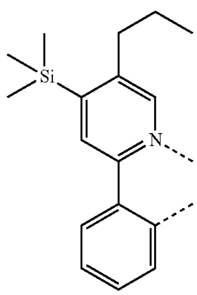
L1-105
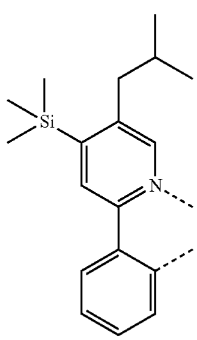
L1-106
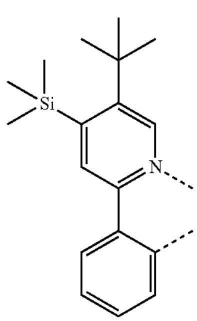
-continued
L1-107
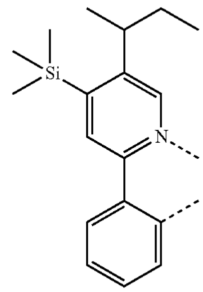
L1-108
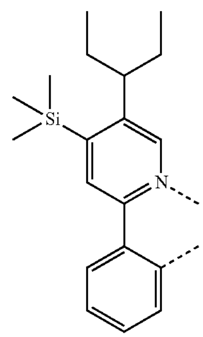
L1-109
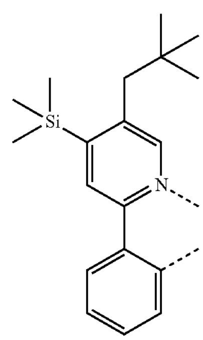
L1-110
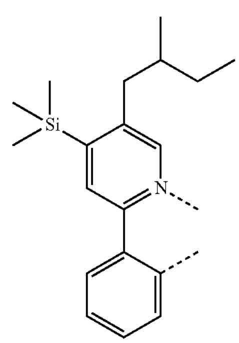

L1-111
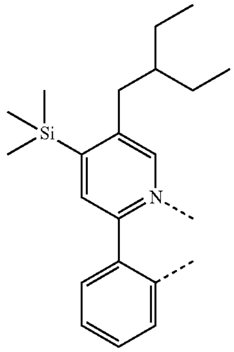
L1-112
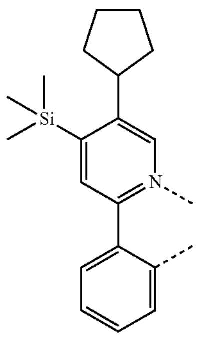
L1-113
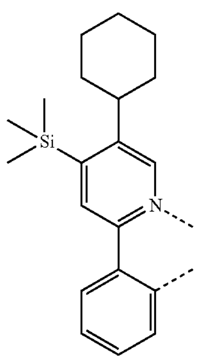
L1-114
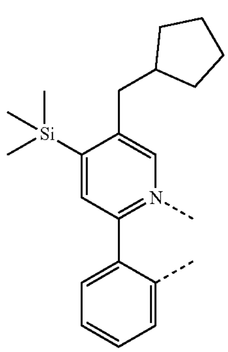
L1-115
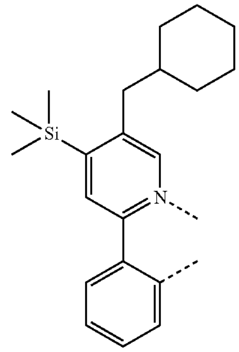
L1-116
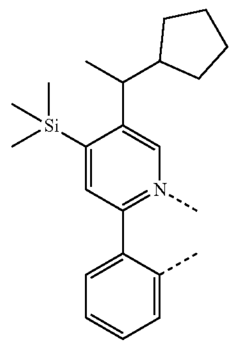
L1-117
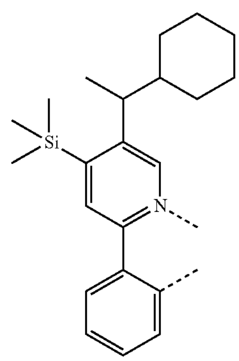
L1-118
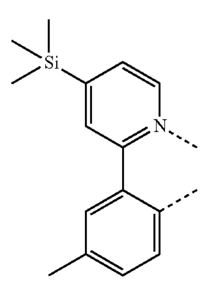

-continued
$L_{1\text{-}119}$
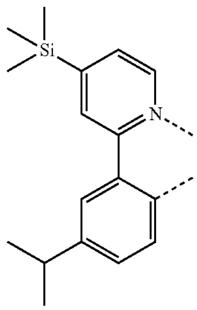
$L_{1\text{-}120}$
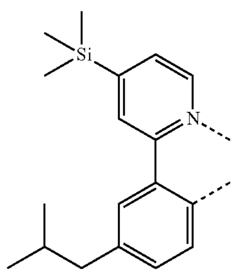
$L_{1\text{-}121}$
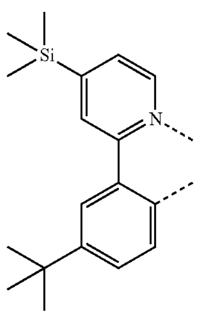
$L_{1\text{-}122}$
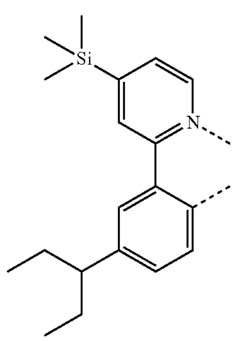
$L_{1\text{-}123}$
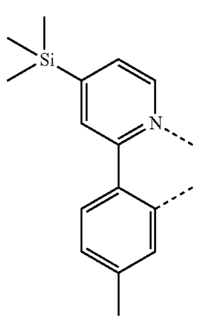
-continued
$L_{1\text{-}124}$
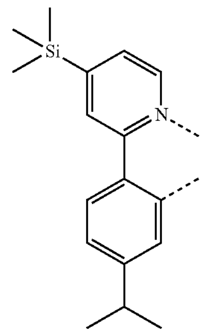
$L_{1\text{-}125}$
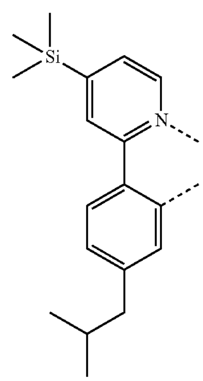
$L_{1\text{-}126}$
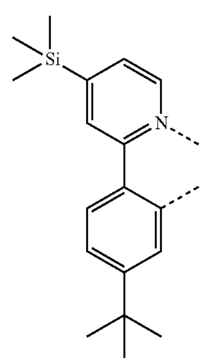
$L_{1\text{-}127}$
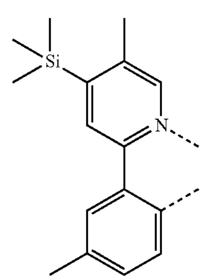

-continued
L1-128
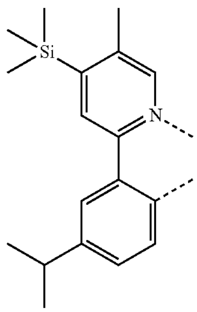
L1-129
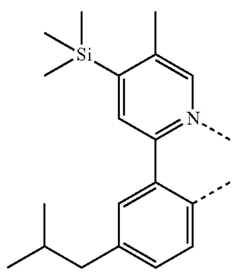
L1-130
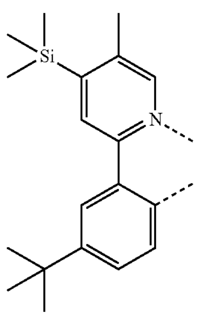
L1-131
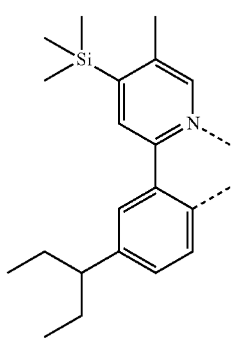
L1-132
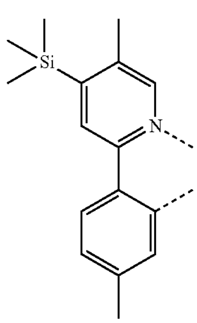
-continued
L1-133
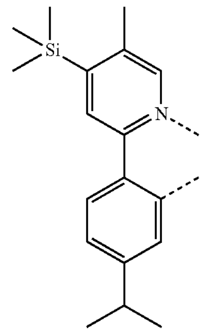
L1-134
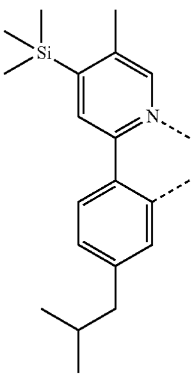
L1-135
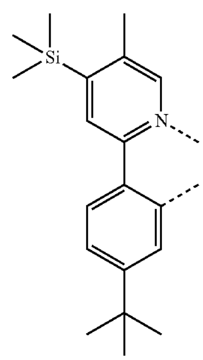
L1-136
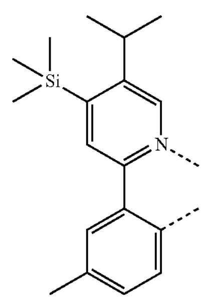

-continued
$L_{1-137}$
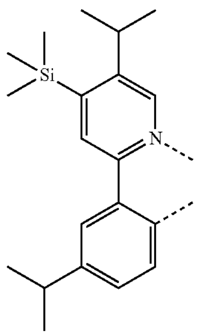
$L_{1-138}$
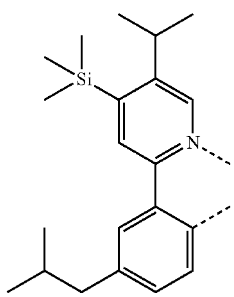
$L_{1-139}$
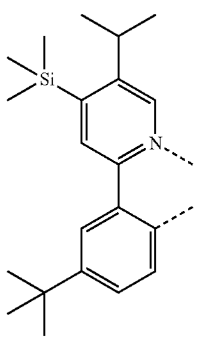
$L_{1-140}$
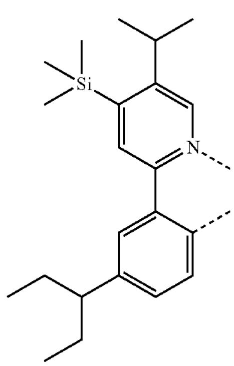
-continued
$L_{1-141}$
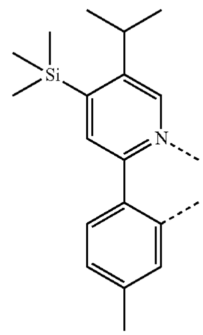
$L_{1-142}$
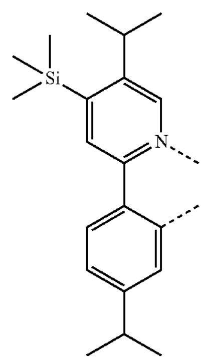
$L_{1-143}$
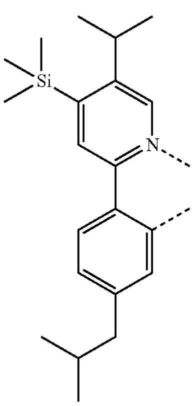
$L_{1-144}$
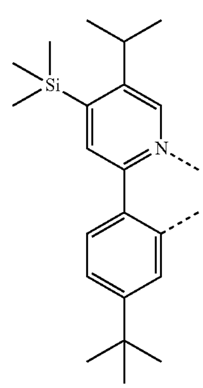

$L_{1-145}$
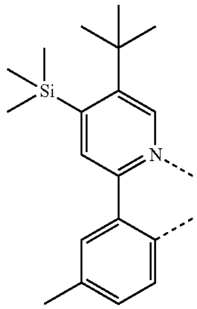
$L_{1-146}$
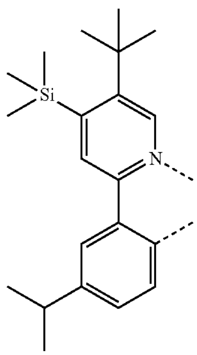
$L_{1-147}$
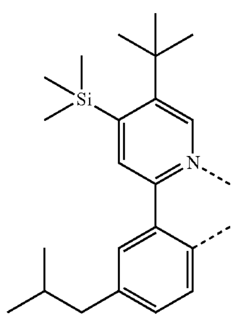
$L_{1-148}$
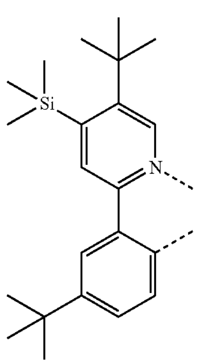
$L_{1-149}$
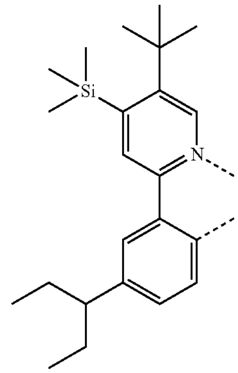
$L_{1-150}$
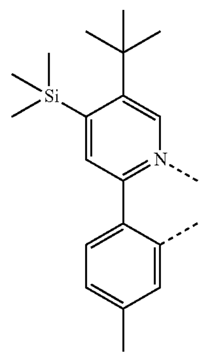
$L_{1-151}$
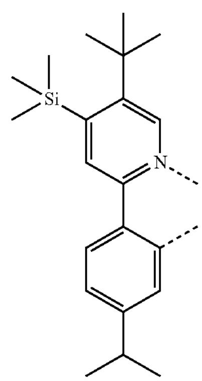
$L_{1-152}$
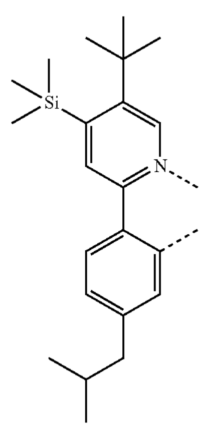

-continued
$L_{1\text{-}153}$
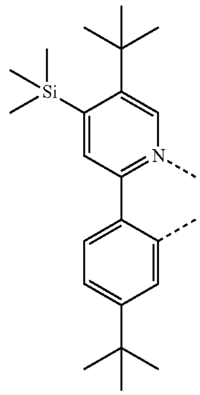
$L_{1\text{-}154}$
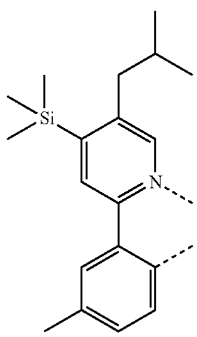
$L_{1\text{-}155}$
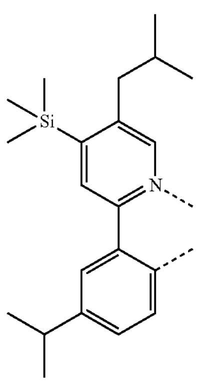
$L_{1\text{-}156}$
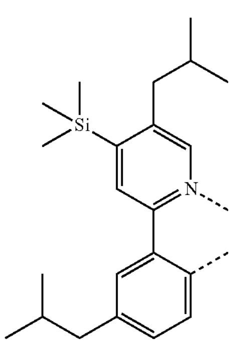
-continued
$L_{1\text{-}157}$
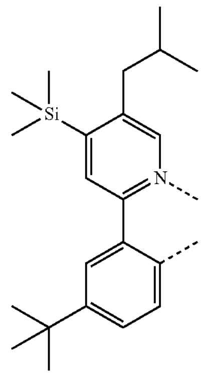
$L_{1\text{-}158}$
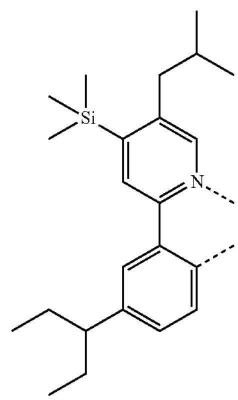
$L_{1\text{-}159}$
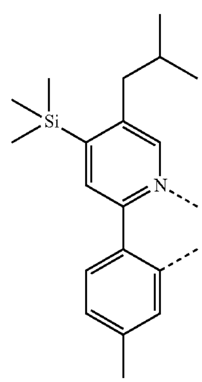
$L_{1\text{-}160}$
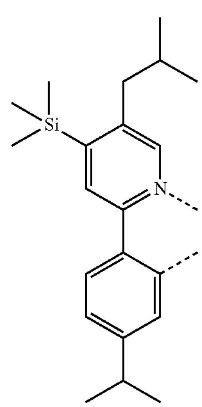

$L_{1-161}$
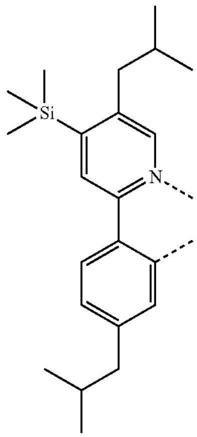
$L_{1-162}$
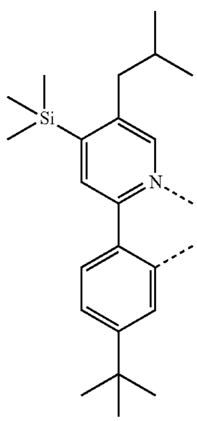
$L_{1-163}$
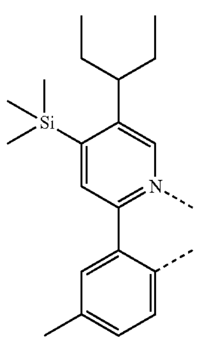
$L_{1-164}$
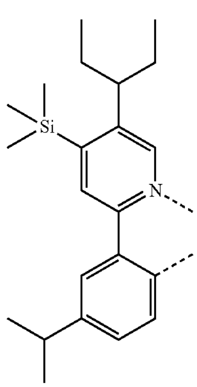
$L_{1-165}$
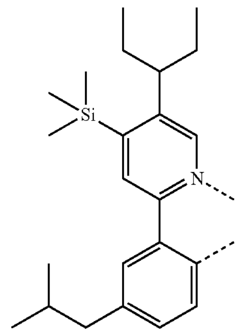
$L_{1-166}$
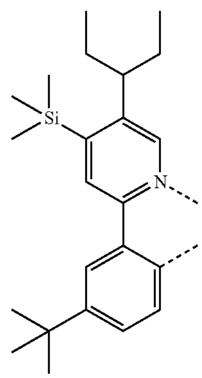
$L_{1-167}$
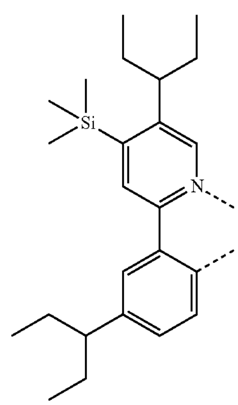
$L_{1-168}$
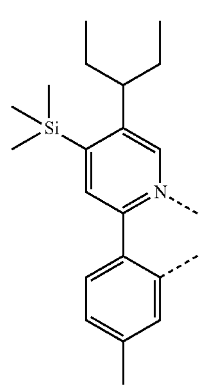

-continued
L1-169
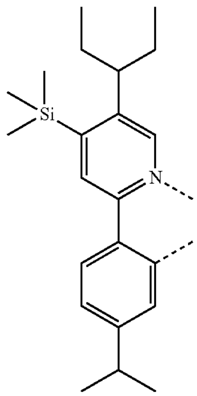
L1-170
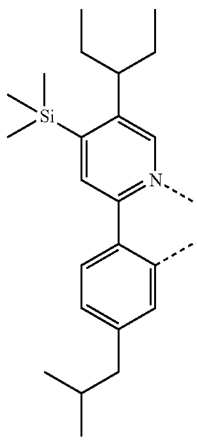
L1-171
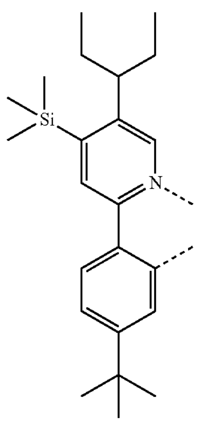
L1-172
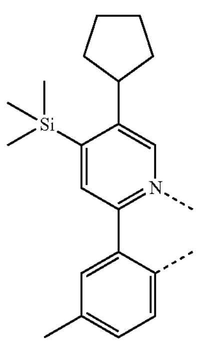
-continued
L1-173
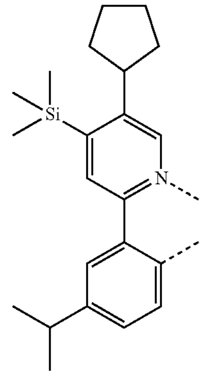
L1-174
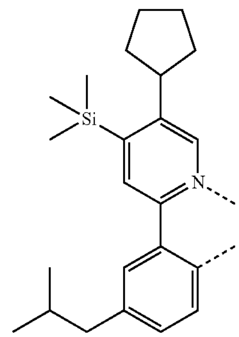
L1-175
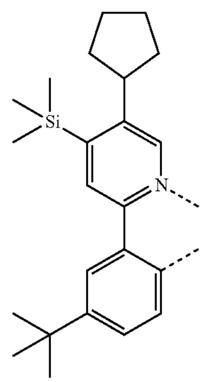
L1-176
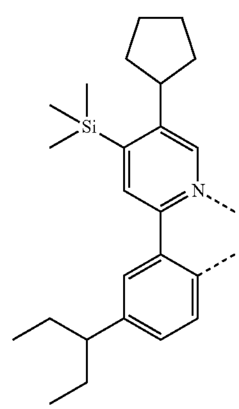

-continued
$L_{1-177}$
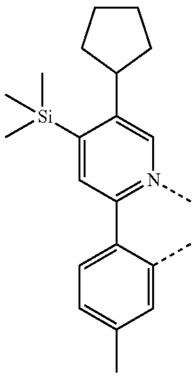
$L_{1-178}$
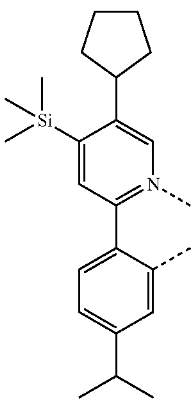
$L_{1-179}$
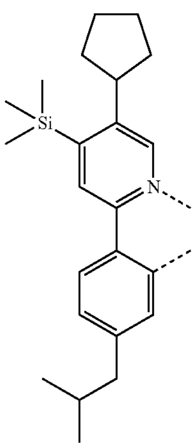
$L_{1-180}$
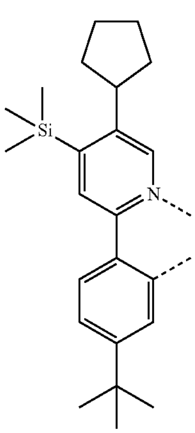
-continued
$L_{1-181}$
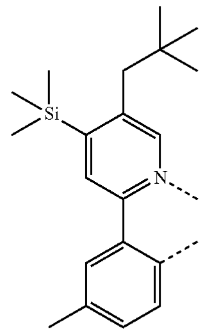
$L_{1-182}$
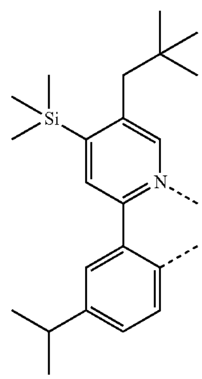
$L_{1-183}$
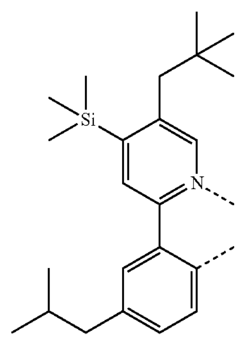
$L_{1-184}$
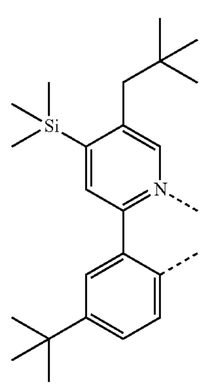

-continued
L1-185
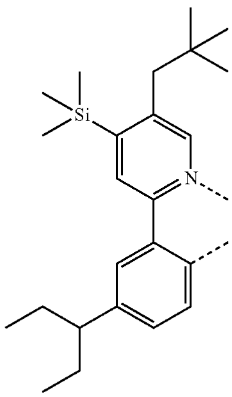
L1-186
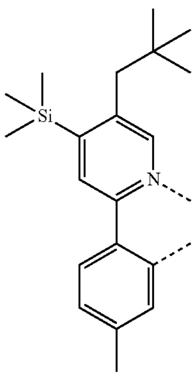
L1-187
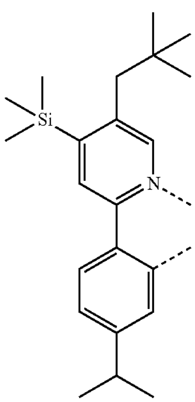
L1-188
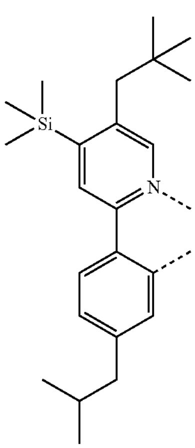
-continued
L1-189
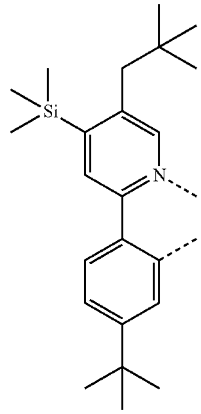
L1-190
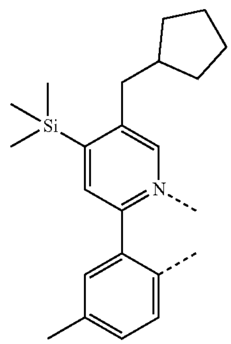
L1-191
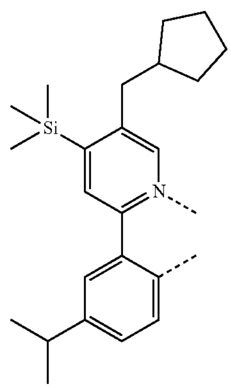
L1-192
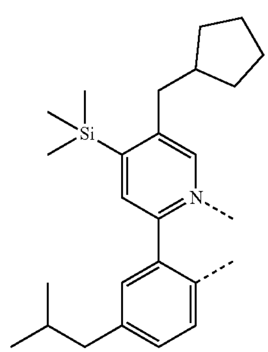

-continued
L1-193
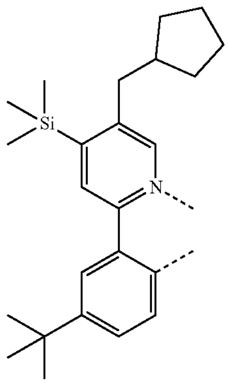
L1-194
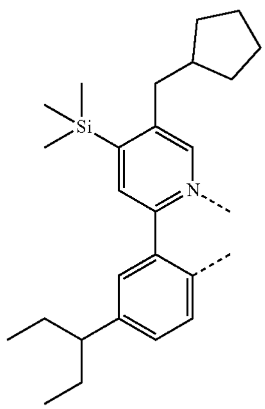
L1-195
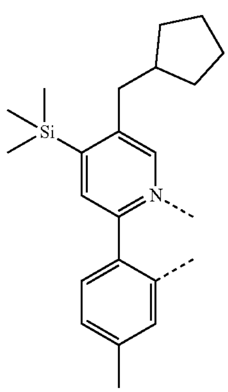
L1-196
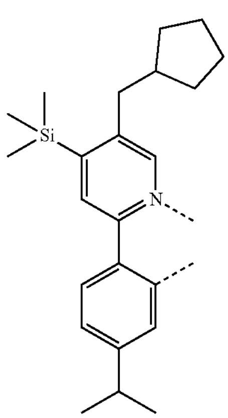
-continued
L1-197
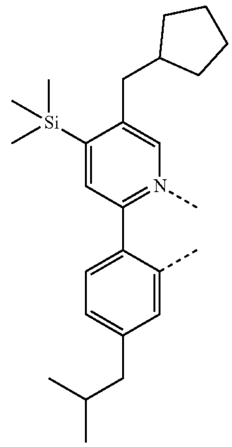
L1-198
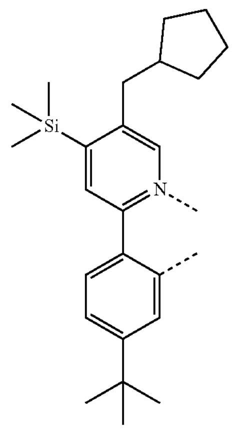
L1-199
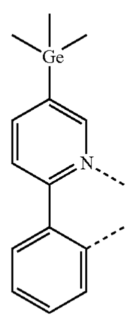
L1-200
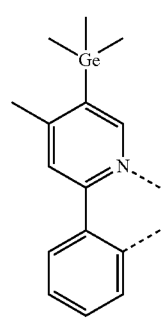

-continued
$L_{1-201}$
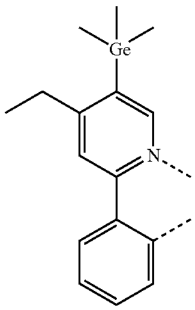
$L_{1-202}$
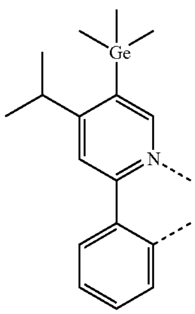
$L_{1-203}$
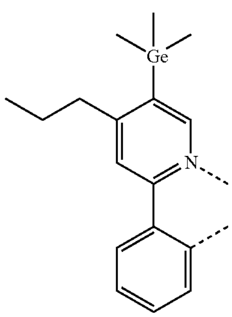
$L_{1-204}$
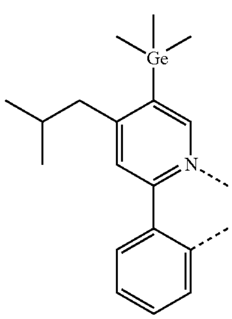
$L_{1-205}$
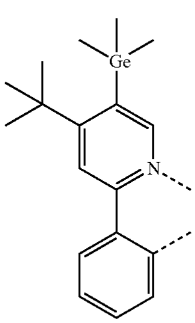
-continued
$L_{1-206}$
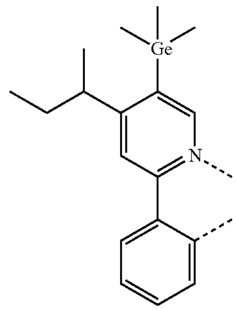
$L_{1-207}$
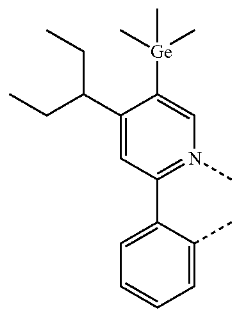
$L_{1-208}$
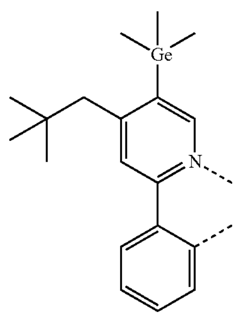
$L_{1-209}$
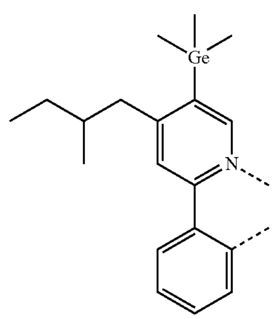
$L_{1-210}$
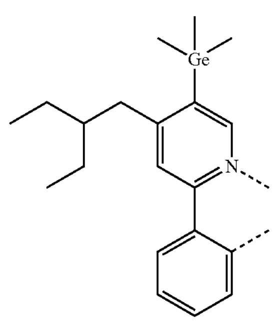

L1-211
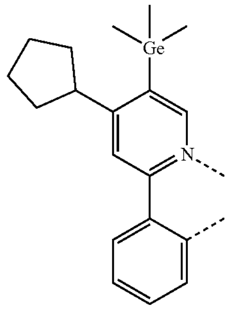
L1-212
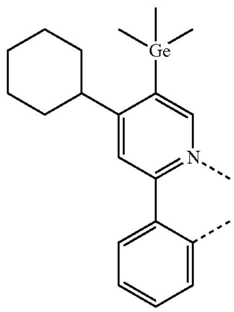
L1-213
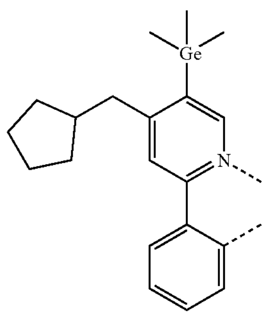
L1-214
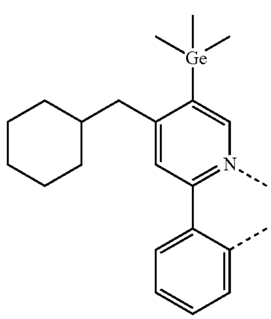
L1-215
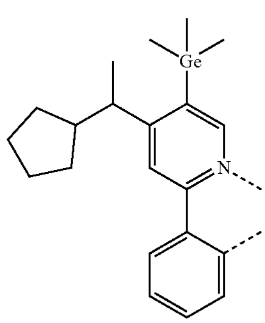
L1-216
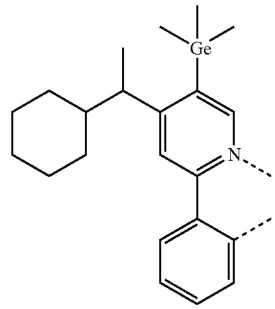
L1-217
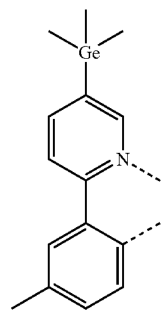
L1-218
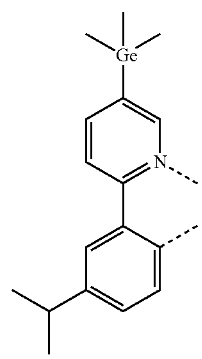
L1-219
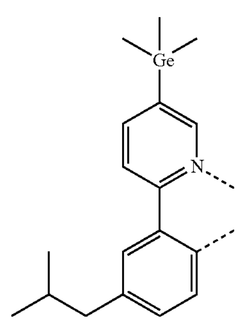

-continued
$L_{1-220}$
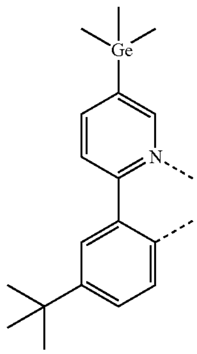
$L_{1-221}$
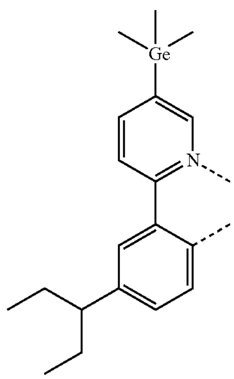
$L_{1-222}$
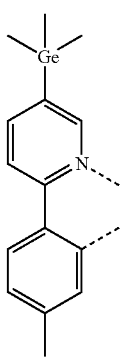
$L_{1-223}$
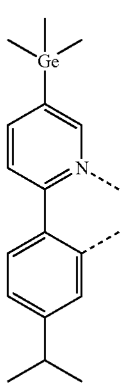
-continued
$L_{1-224}$
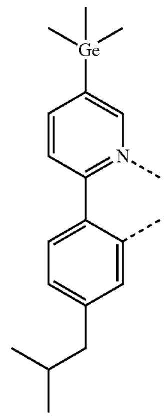
$L_{1-225}$
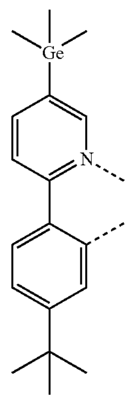
$L_{1-226}$
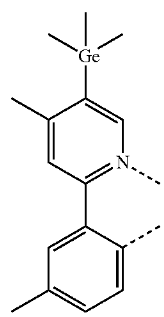
$L_{1-227}$
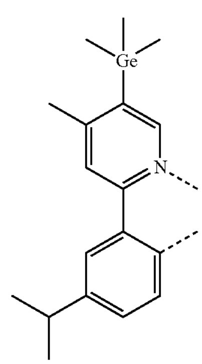

$L_{1-228}$
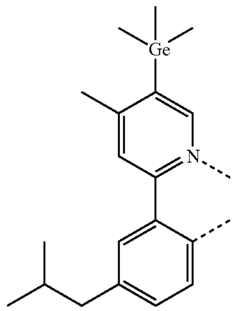
$L_{1-229}$
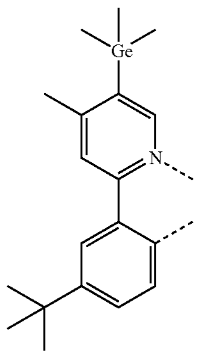
$L_{1-230}$
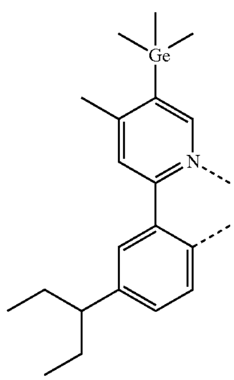
$L_{1-231}$
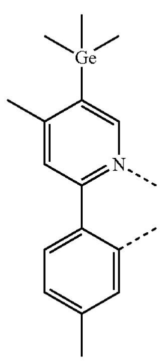
$L_{1-232}$
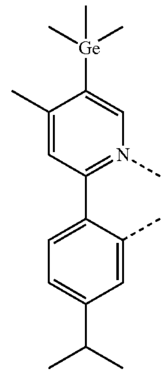
$L_{1-233}$
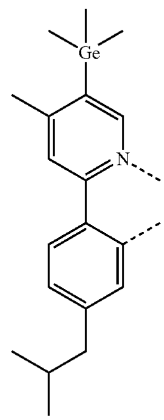
$L_{1-234}$
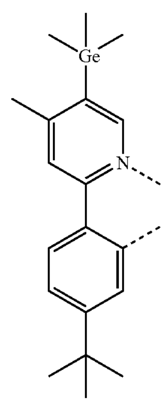
$L_{1-235}$
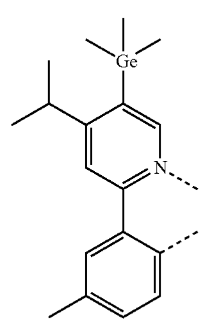

L1-236
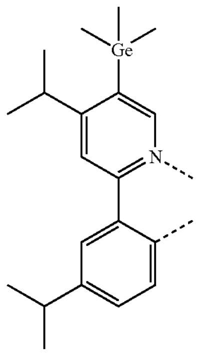
L1-237
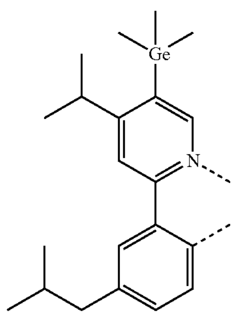
L1-238
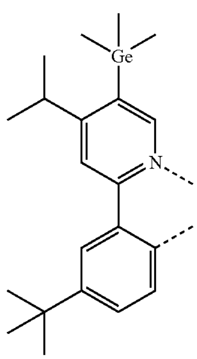
L1-239
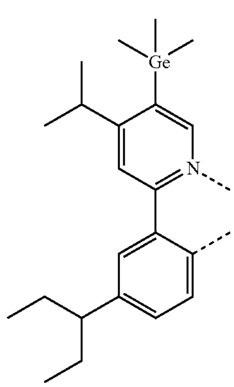
L1-240
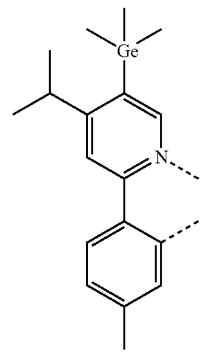
L1-241
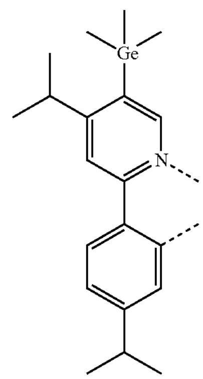
L1-242
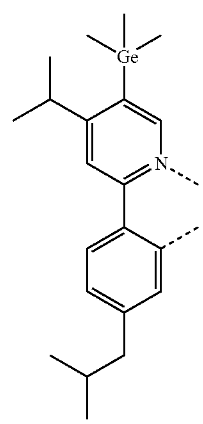
L1-243
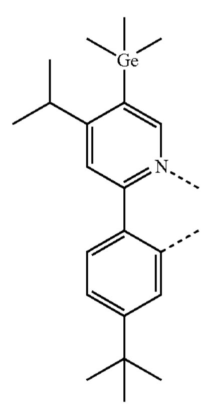

-continued
L1-244
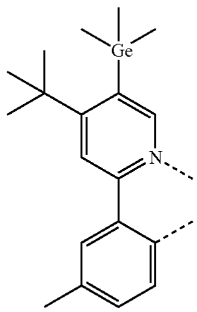
L1-245
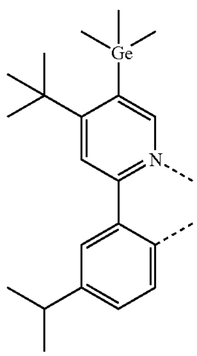
L1-246
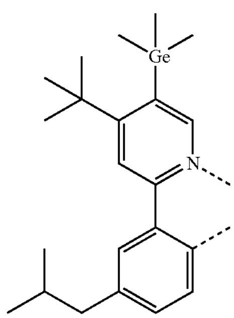
L1-247
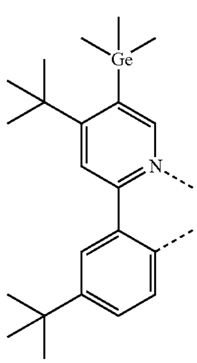
-continued
L1-248
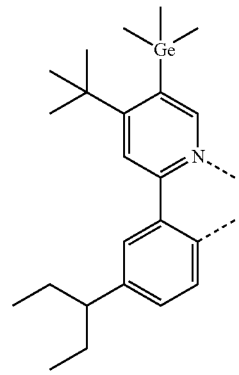
L1-249
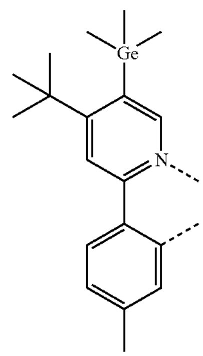
L1-250
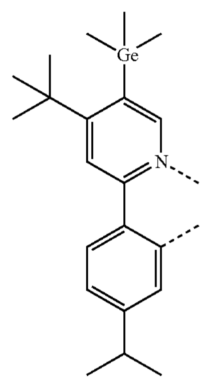
L1-251
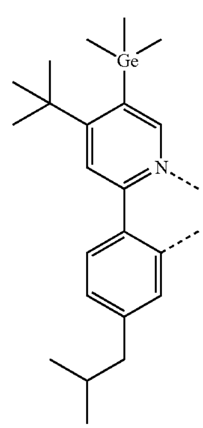

-continued
L1-252
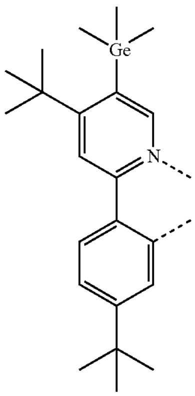
L1-253
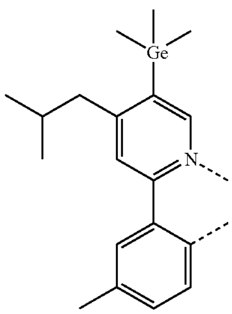
L1-254
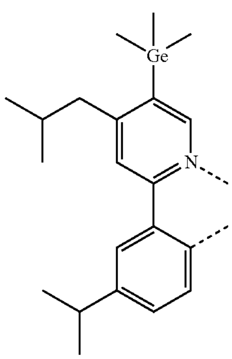
L1-255
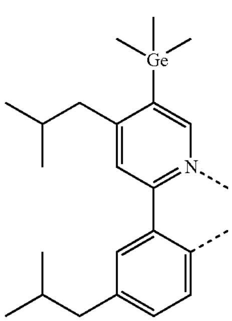
-continued
L1-256
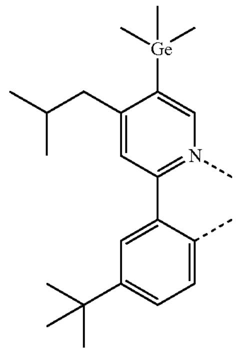
L1-257
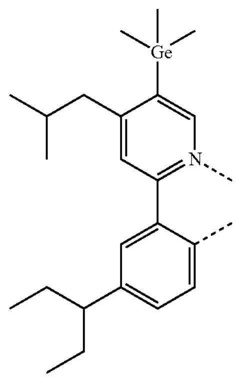
L1-258
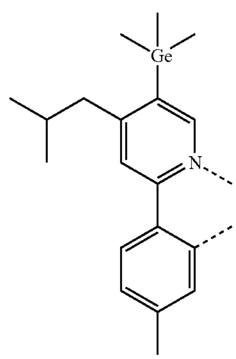
L1-259
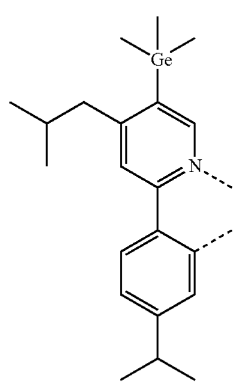

-continued
L1-260
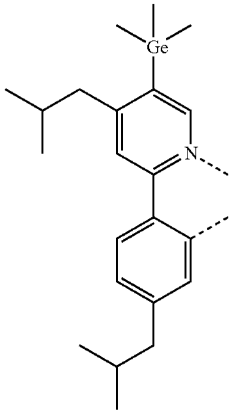
L1-261
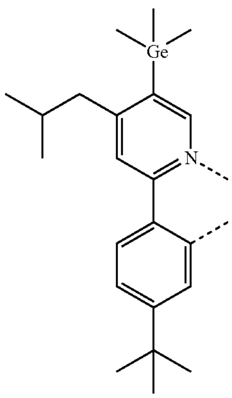
L1-262
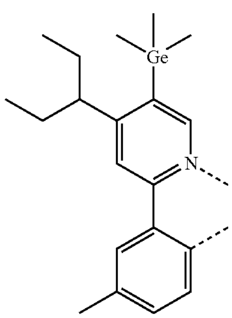
L1-263
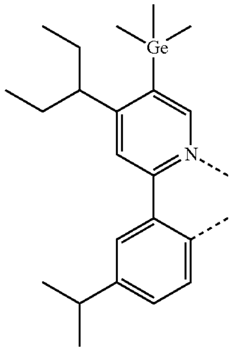
-continued
L1-264
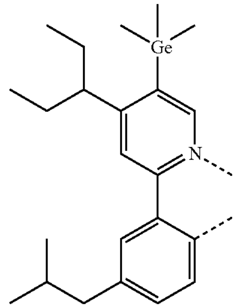
L1-265
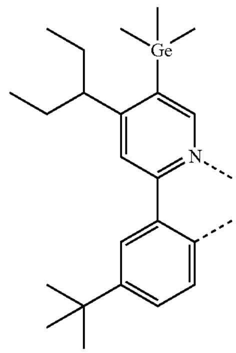
L1-266
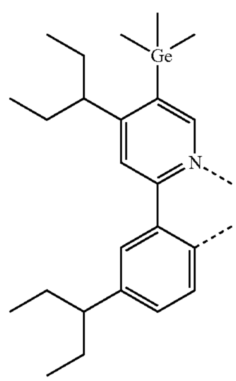
L1-267
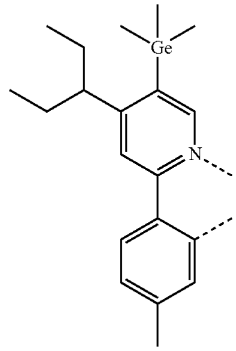

-continued
$L_{1-268}$
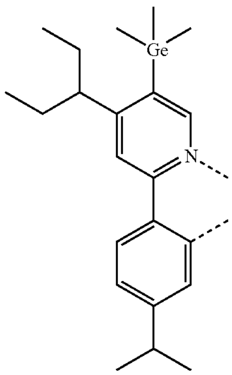
$L_{1-269}$
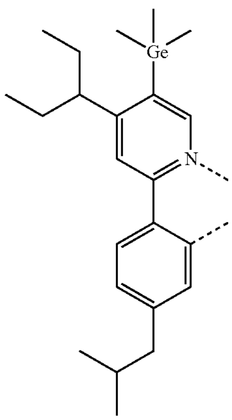
$L_{1-270}$
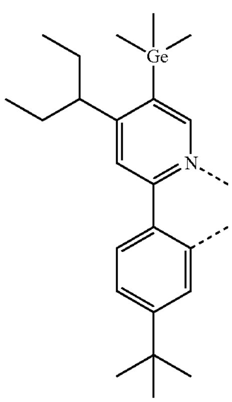
$L_{1-271}$
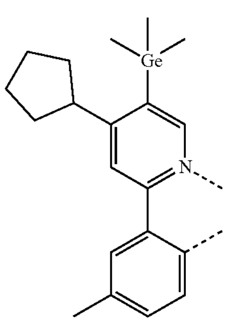
-continued
$L_{1-272}$
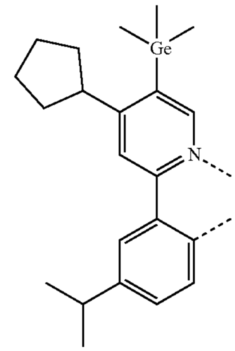
$L_{1-273}$
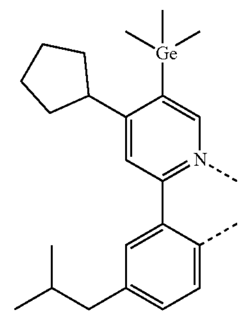
$L_{1-274}$
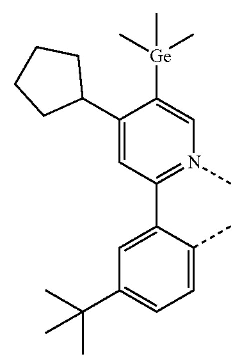
$L_{1-275}$
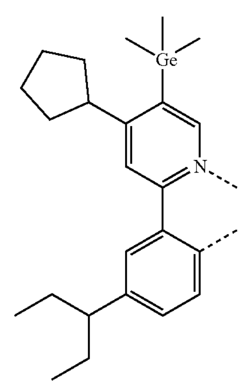

-continued
L1-276
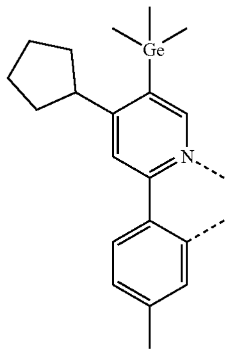
L1-277
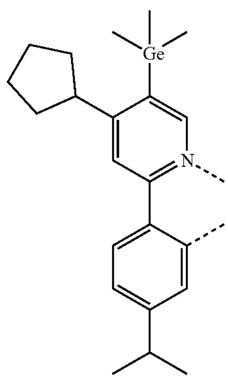
L1-278
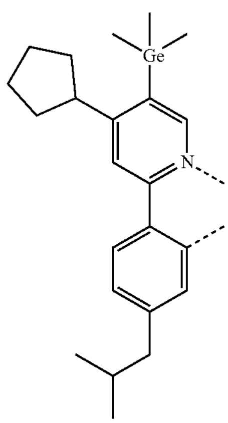
L1-279
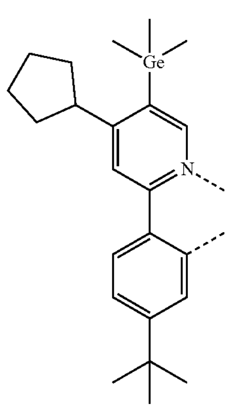
-continued
L1-280
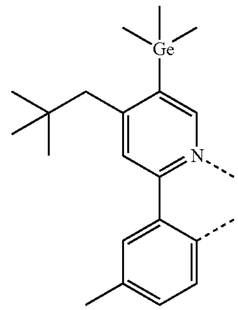
L1-281
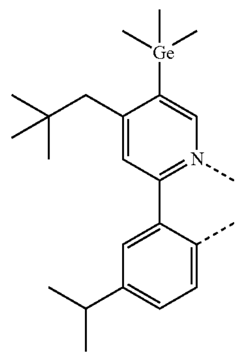
L1-282
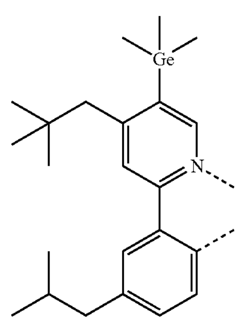
L1-283
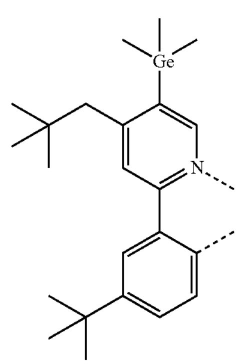

-continued
L1-284
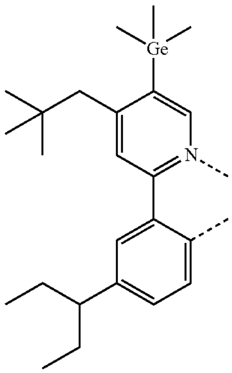
L1-285
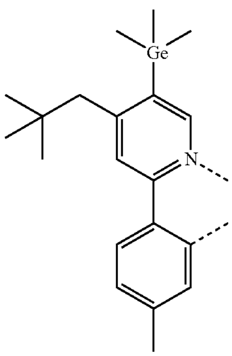
L1-286
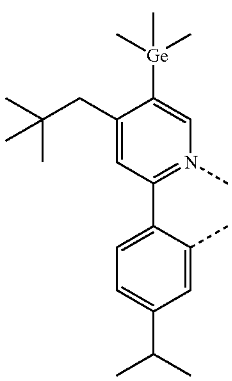
L1-287
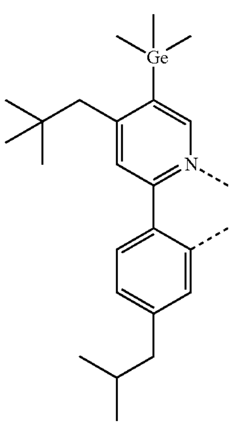
-continued
L1-288
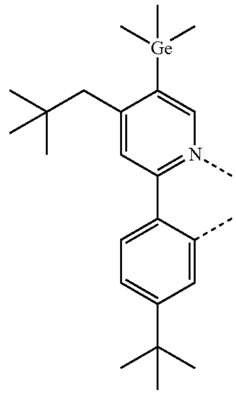
L1-289
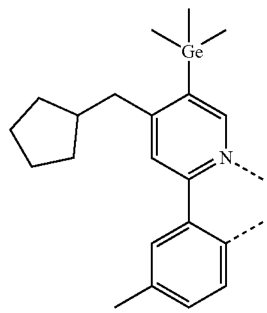
L1-290
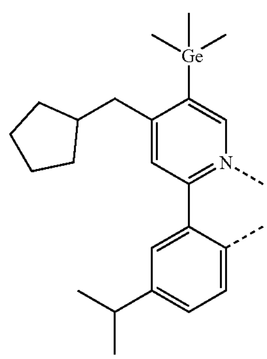
L1-291
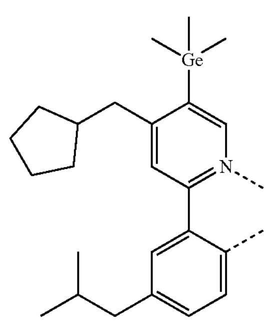

-continued
L1-292
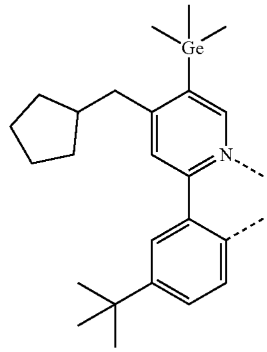
L1-293
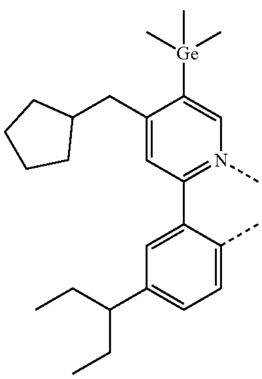
L1-294
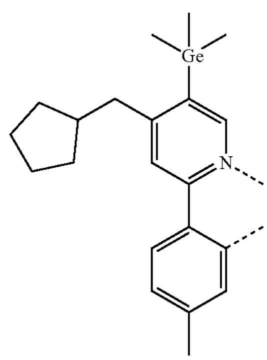
L1-295
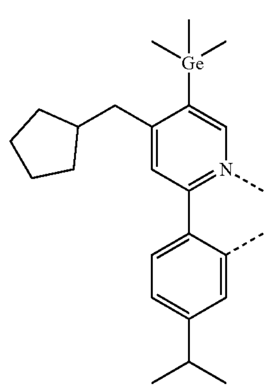
-continued
L1-296
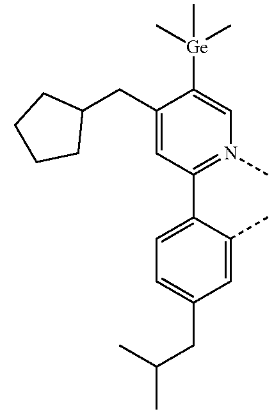
L1-297
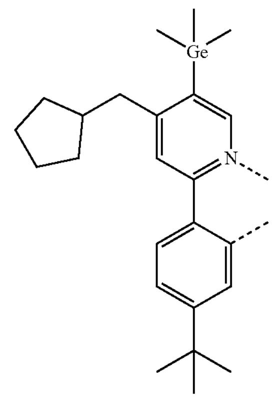
L1-298
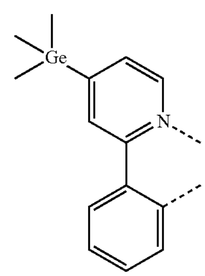
L1-299
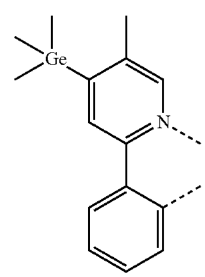

-continued
L1-300
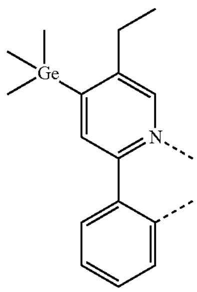
L1-301
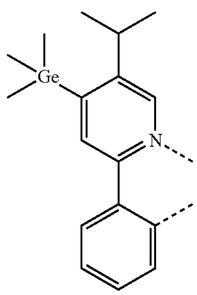
L1-302
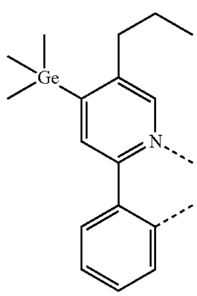
L1-303
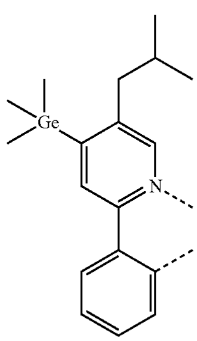
L1-304
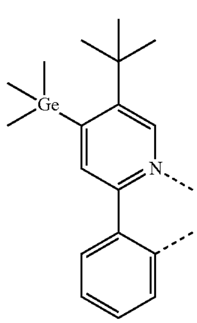
-continued
L1-305
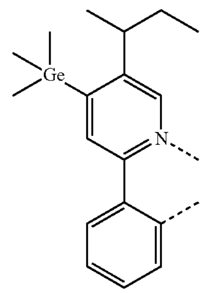
L1-306
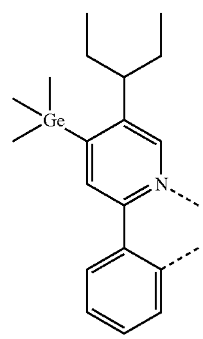
L1-307
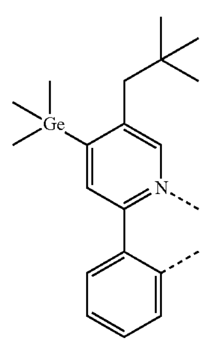
L1-308
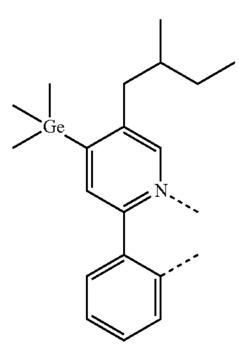

-continued
L1-309
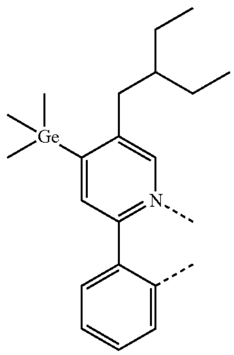
L1-310
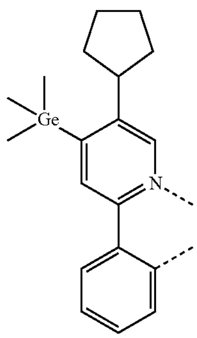
L1-311
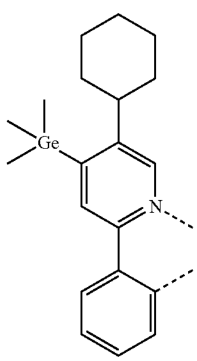
L1-312
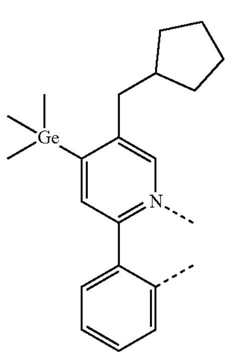
-continued
L1-313
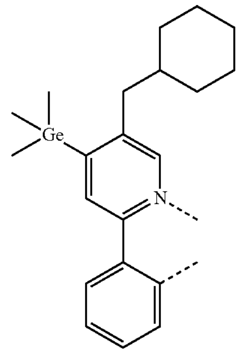
L1-314
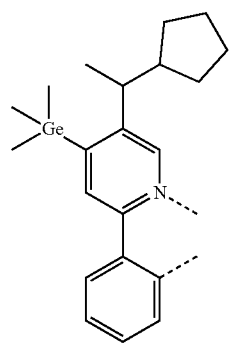
L1-315
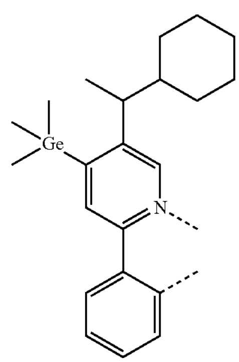
L1-316
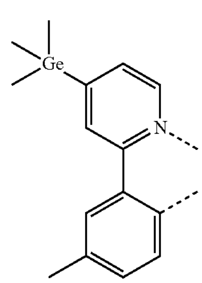

$L_{1-317}$
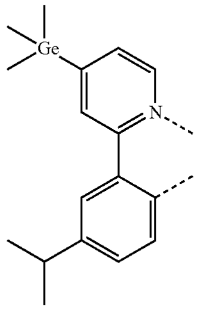
$L_{1-318}$
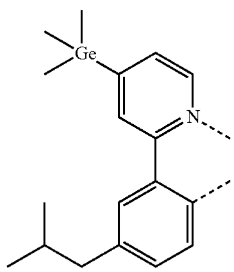
$L_{1-319}$
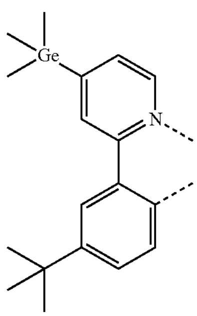
$L_{1-320}$
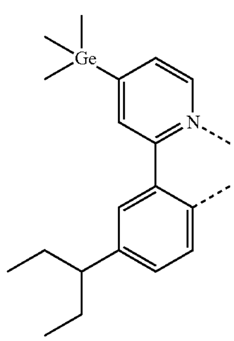
$L_{1-321}$
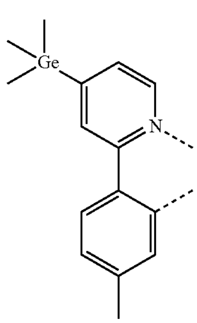
$L_{1-322}$
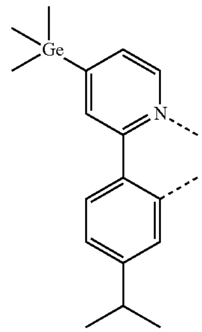
$L_{1-323}$
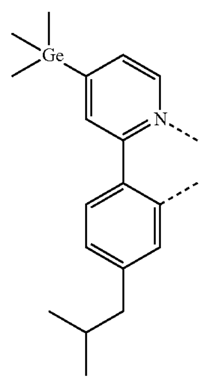
$L_{1-324}$
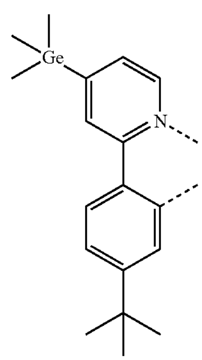
$L_{1-325}$
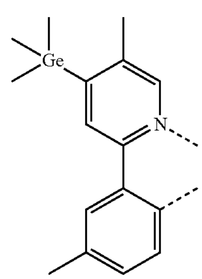

L1-326
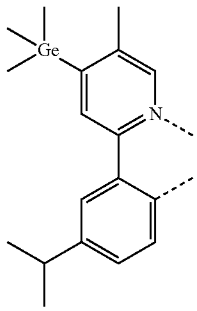
L1-327
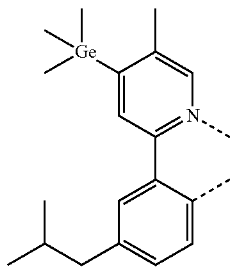
L1-328
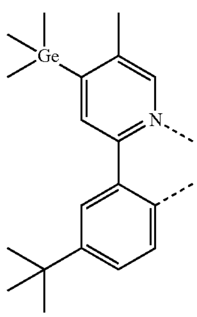
L1-329
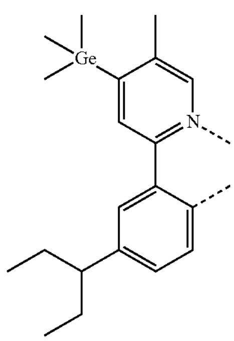
L1-330
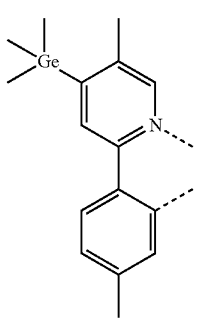
L1-331
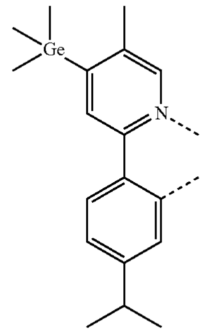
L1-332
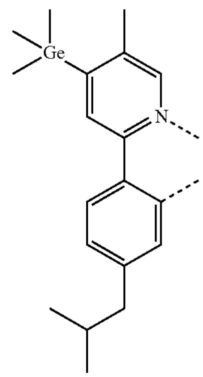
L1-333
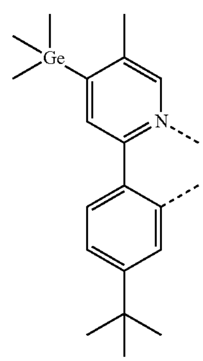
L1-334
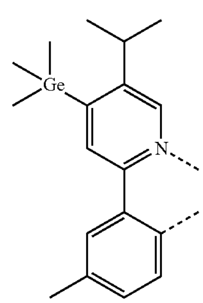

-continued
L1-335
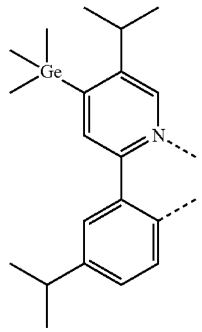
L1-336
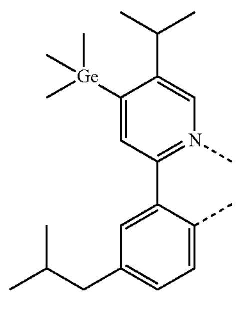
L1-337
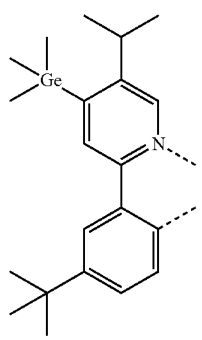
L1-338
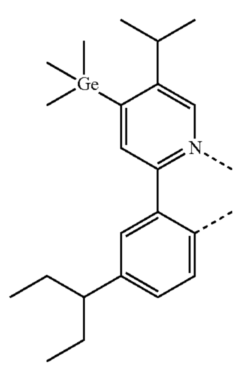
-continued
L1-339
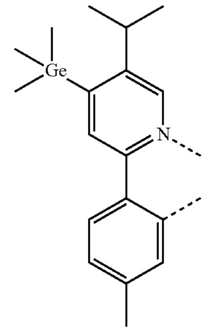
L1-340
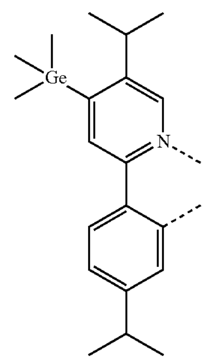
L1-341
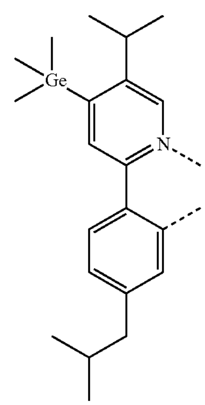
L1-342
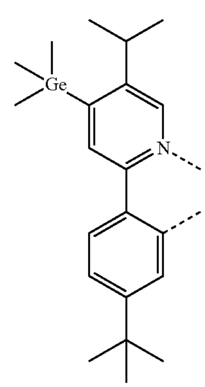

-continued
$L_{1-343}$
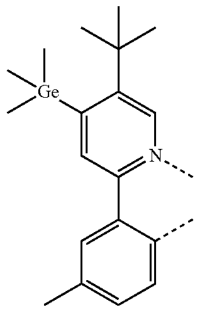
$L_{1-344}$
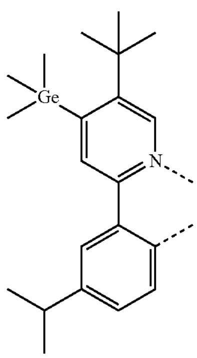
$L_{1-345}$
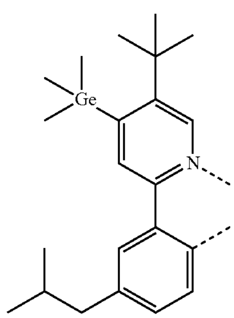
$L_{1-346}$
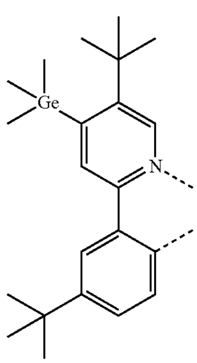
-continued
$L_{1-347}$
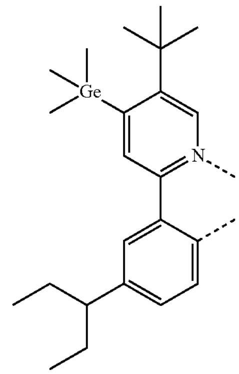
$L_{1-348}$
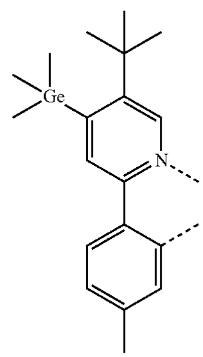
$L_{1-349}$
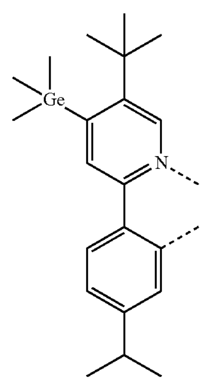
$L_{1-350}$
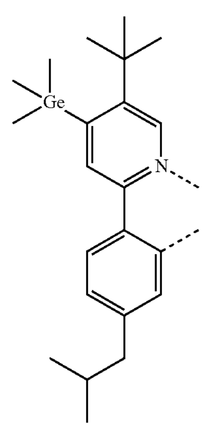

-continued
L1-351
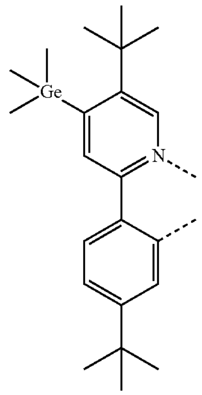
L1-352
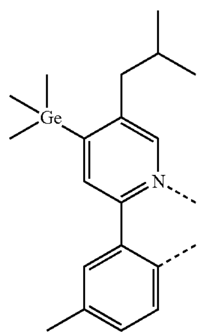
L1-353
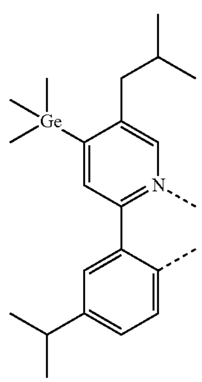
L1-354
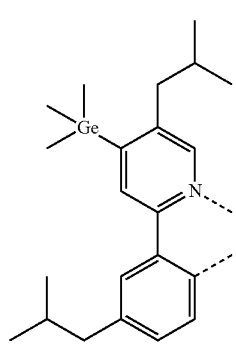
-continued
L1-355
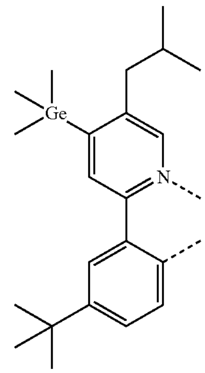
L1-356
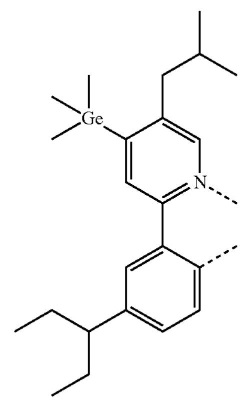
L1-357
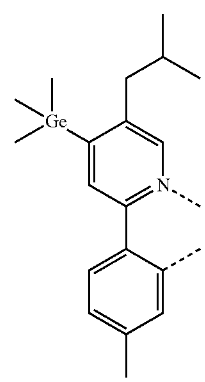
L1-358
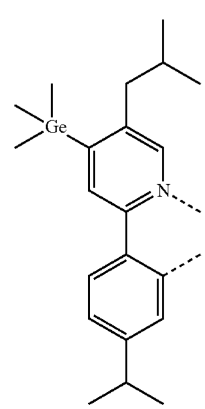

-continued
L1-359
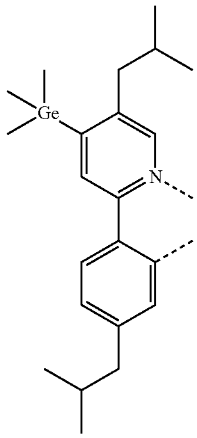
L1-360
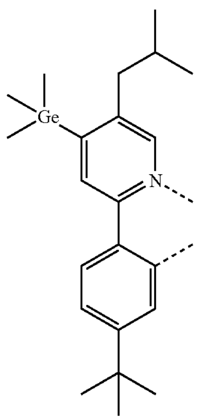
L1-361
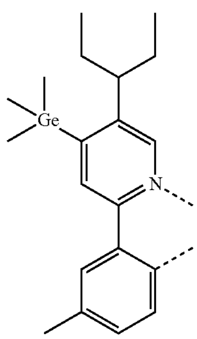
L1-362
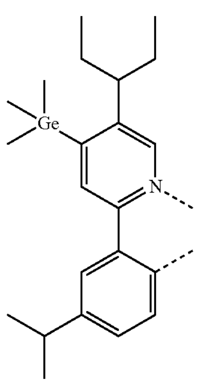
-continued
L1-363
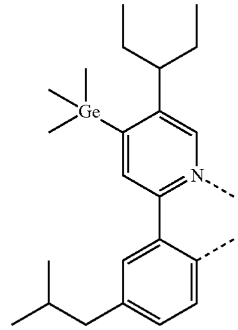
L1-364
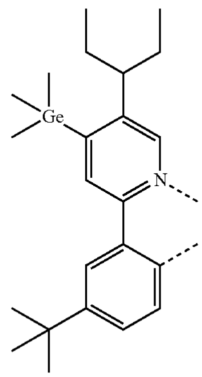
L1-365
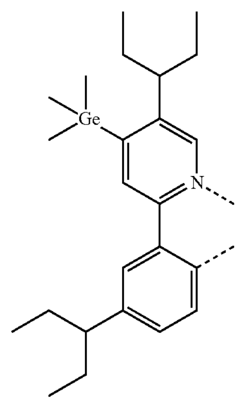
L1-366
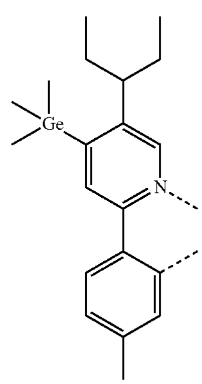

L1-367
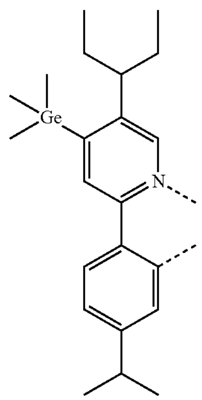
L1-368
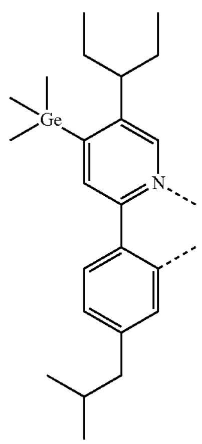
L1-369
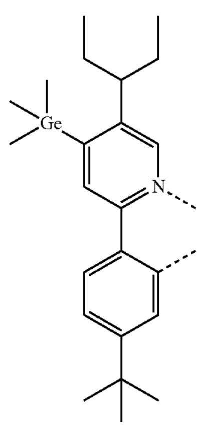
L1-370
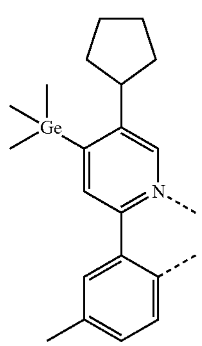
L1-371
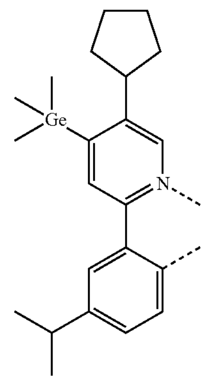
L1-372
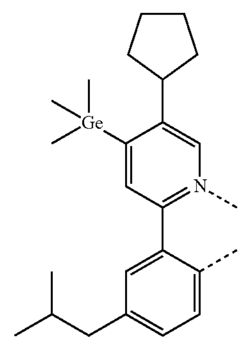
L1-373
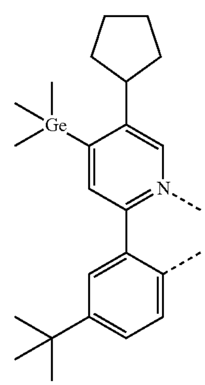
L1-374
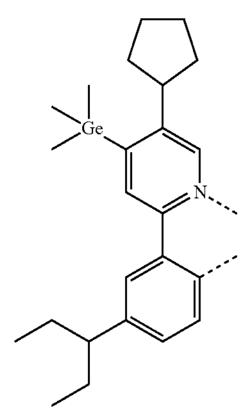

-continued
$L_{1-375}$
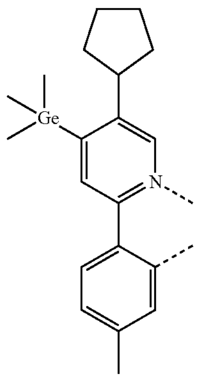
$L_{1-376}$
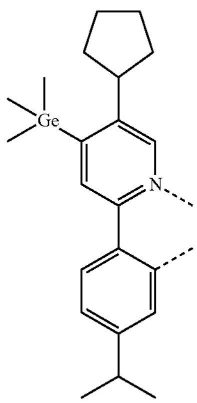
$L_{1-377}$
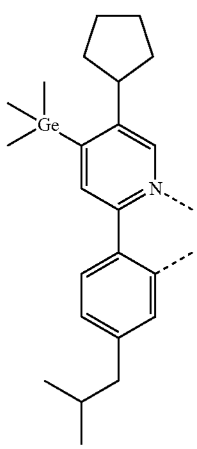
$L_{1-378}$
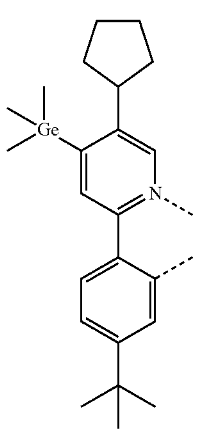
-continued
$L_{1-379}$
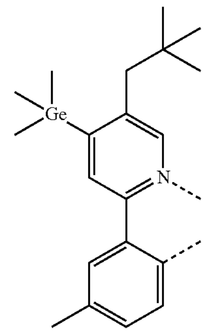
$L_{1-380}$
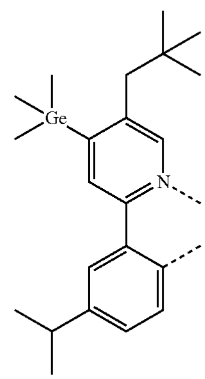
$L_{1-381}$
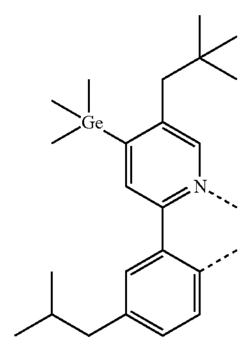
$L_{1-382}$
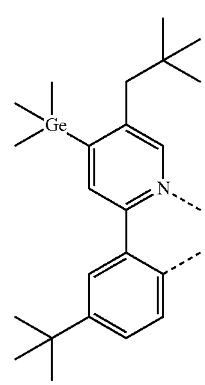

-continued
L1-383
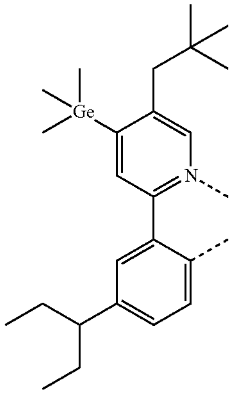
L1-384
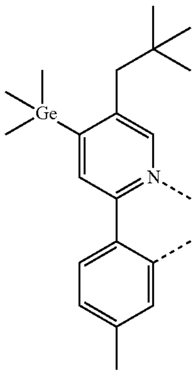
L1-385
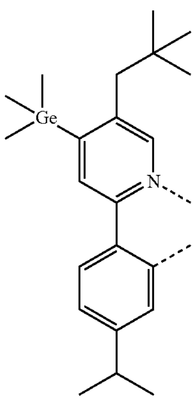
L1-386
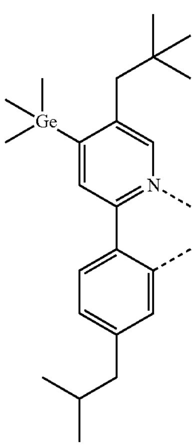
-continued
L1-387
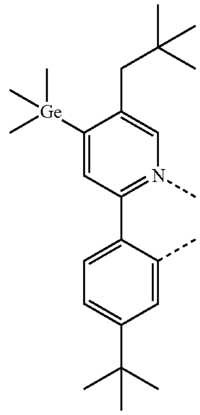
L1-388
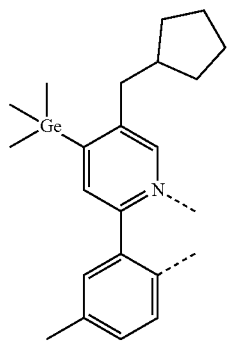
L1-389
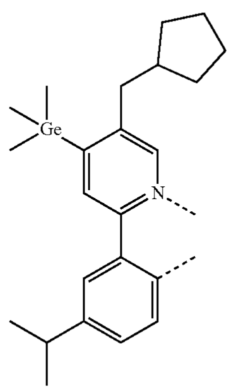
L1-390
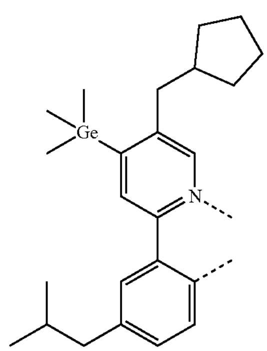

-continued
L1-391
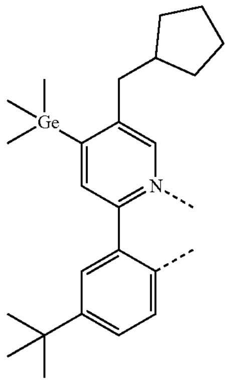
L1-392
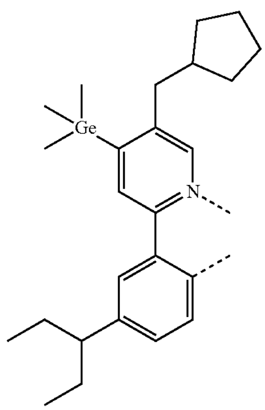
L1-393
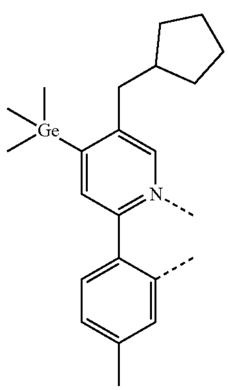
L1-394
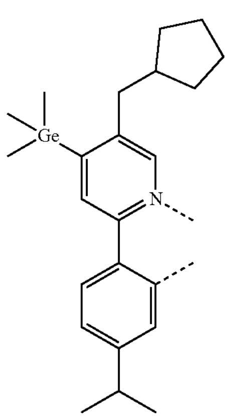
-continued
L1-395
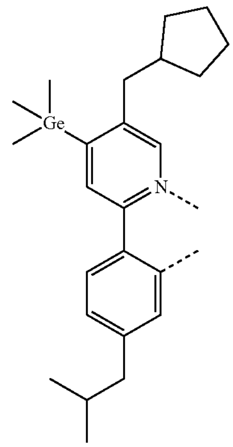
L1-396
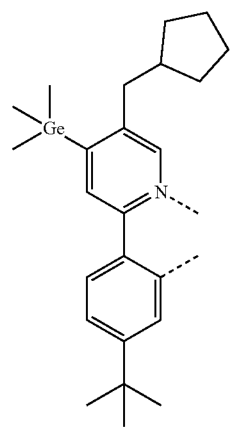
L2-1
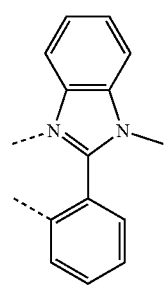
L2-2
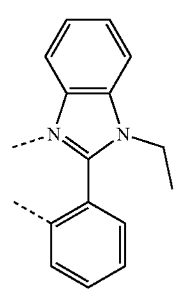

-continued
$L_{2-3}$
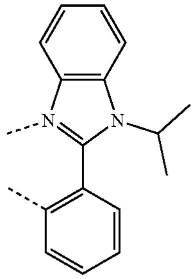
$L_{2-4}$
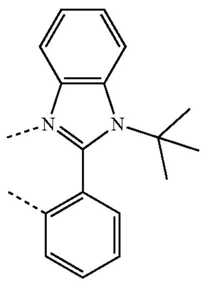
$L_{2-5}$
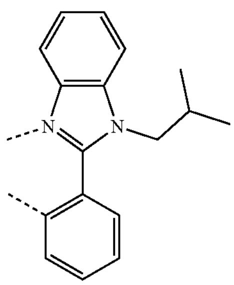
$L_{2-6}$
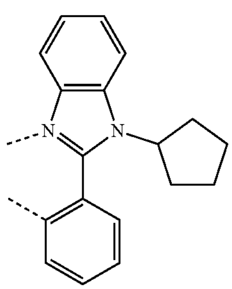
$L_{2-7}$
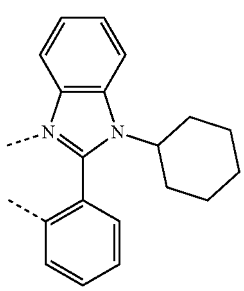
-continued
$L_{2-8}$
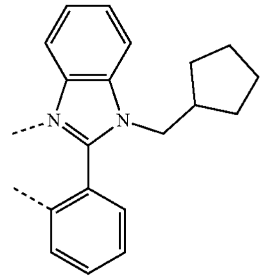
$L_{2-9}$
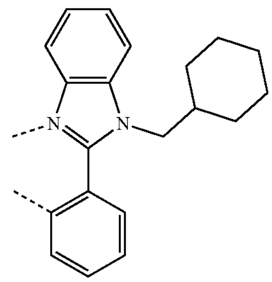
$L_{2-10}$
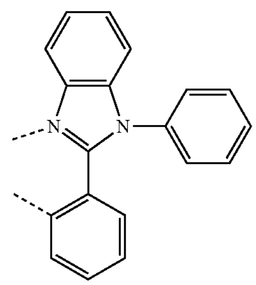
$L_{2-11}$
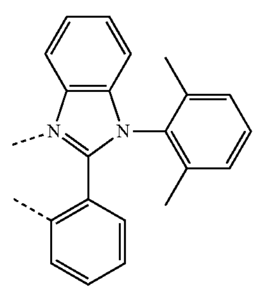
$L_{2-12}$
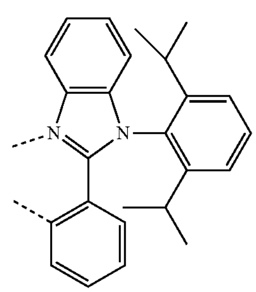

-continued
L2-13
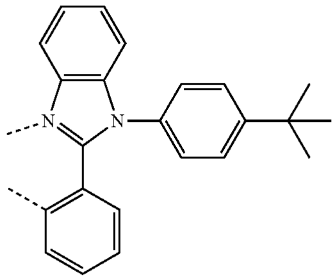
L2-14
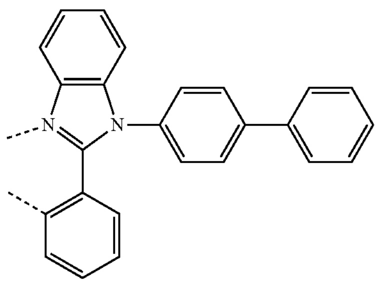
L2-15
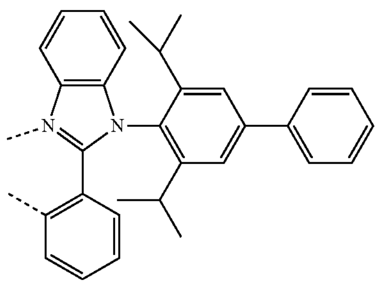
L2-16
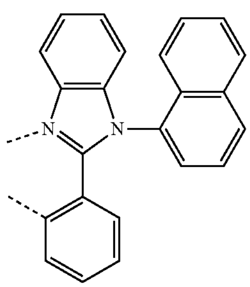
L2-17
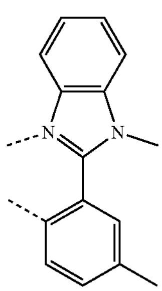
-continued
L2-18
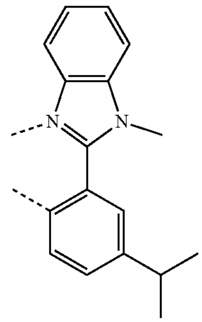
L2-19
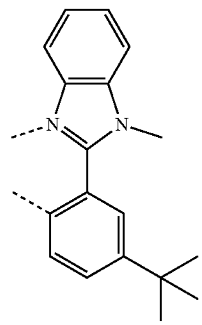
L2-20
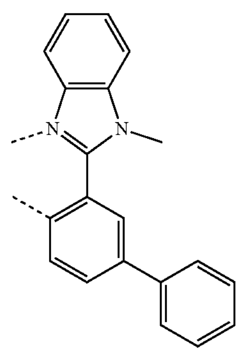
L2-21
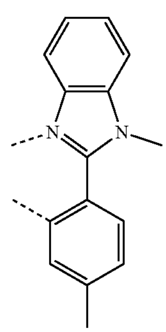

-continued
L2-22
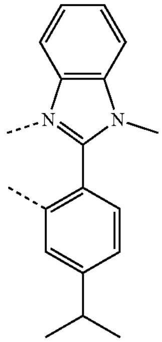
L2-23
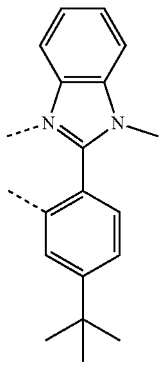
L2-24
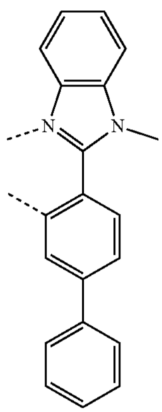
L2-25
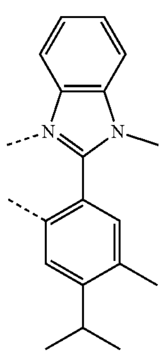
-continued
L2-26
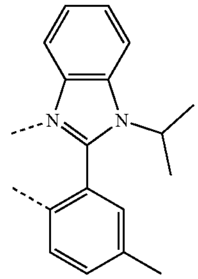
L2-27
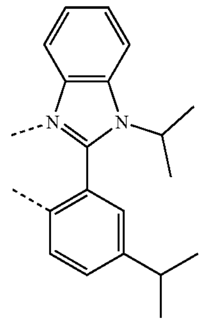
L2-28
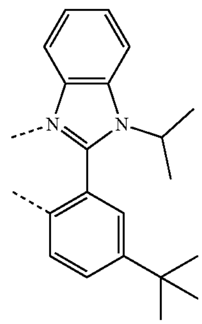
L2-29
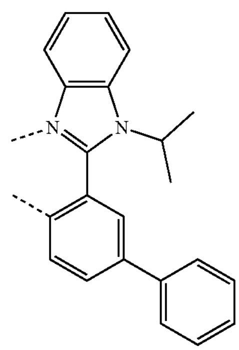
L2-30
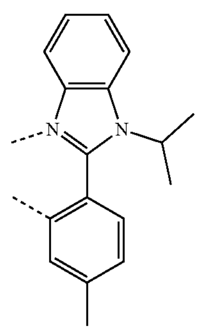

-continued
L2-31
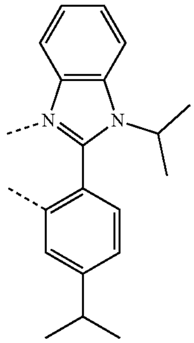
L2-32
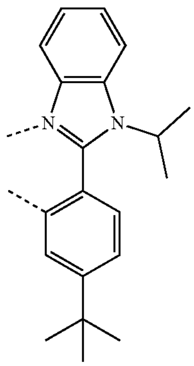
L2-33
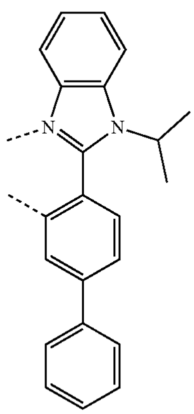
L2-34
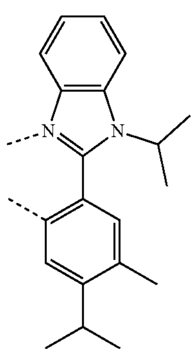
-continued
L2-35
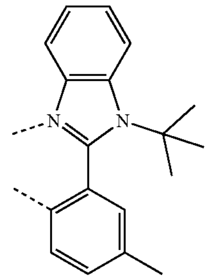
L2-36
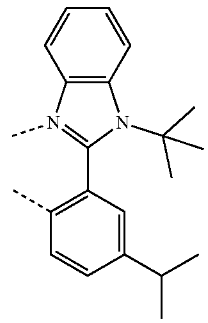
L2-37
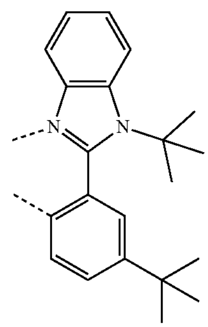
L2-38
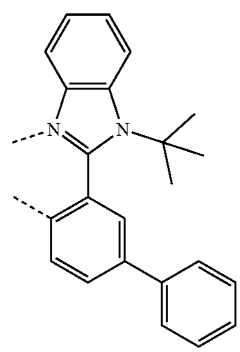
L2-39
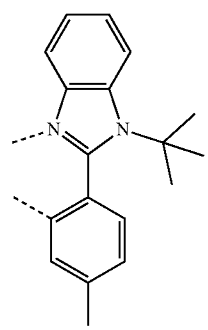

-continued
L2-40
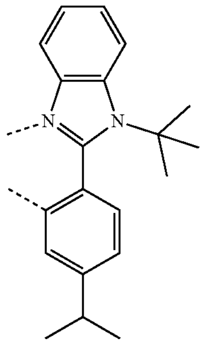
L2-41
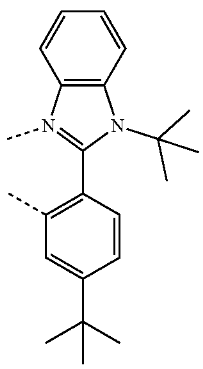
L2-42
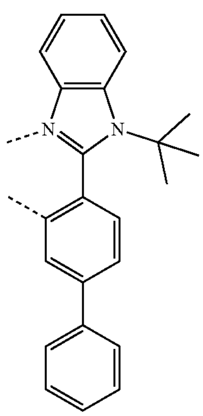
L2-43
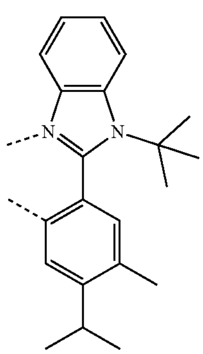
-continued
L2-44
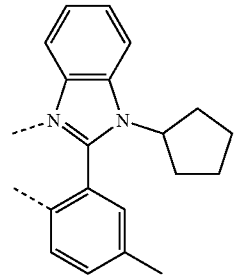
L2-45
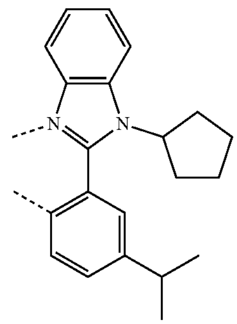
L2-46
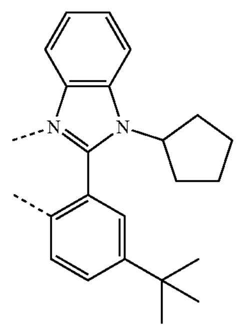
L2-47
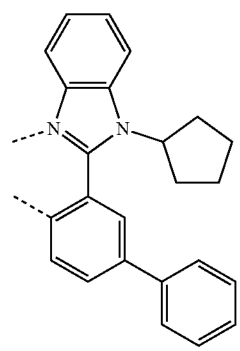
L2-48
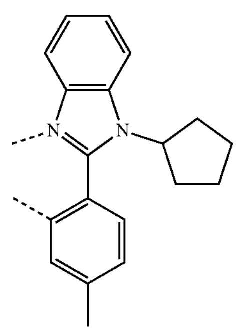

-continued
L2-49
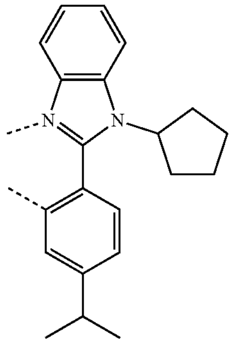
L2-50
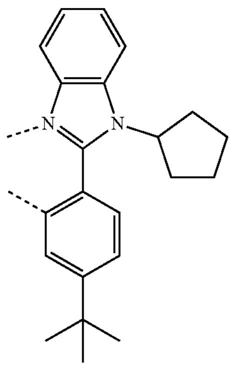
L2-51
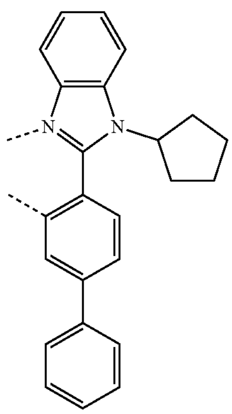
L2-52
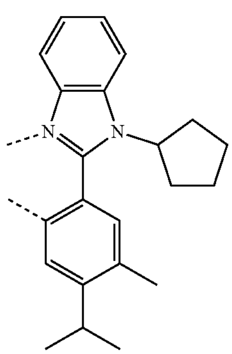
-continued
L2-53
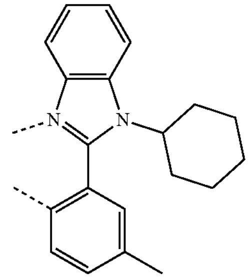
L2-54
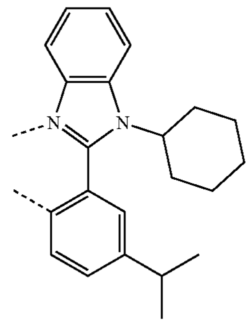
L2-55
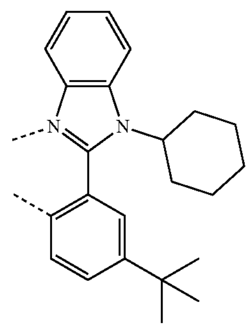
L2-56
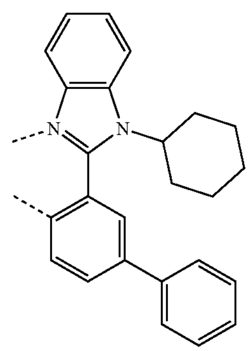
L2-57
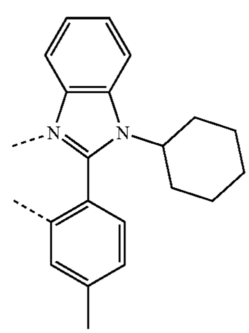

-continued
L2-58
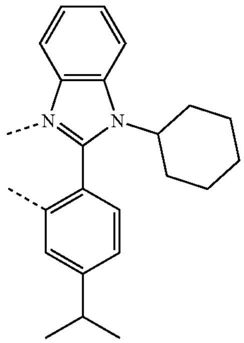
L2-59
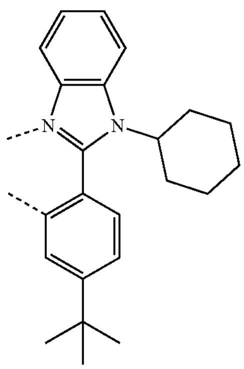
L2-60
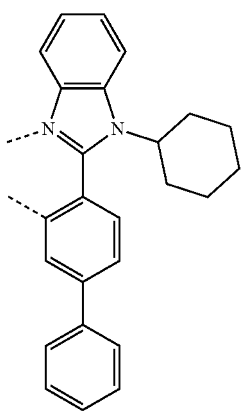
L2-61
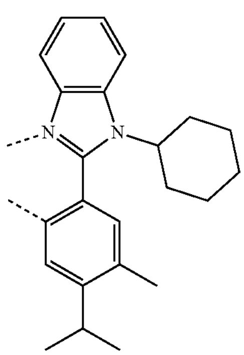
-continued
L2-62
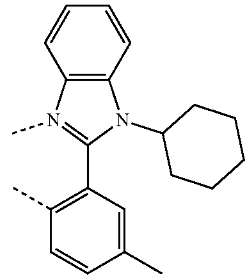
L2-63
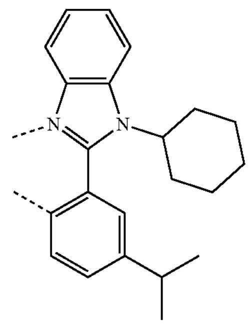
L2-64
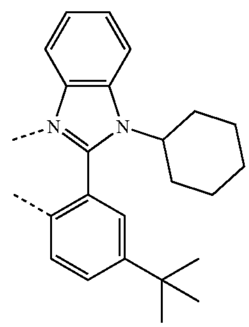
L2-65
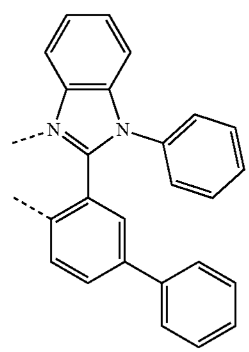
L2-66
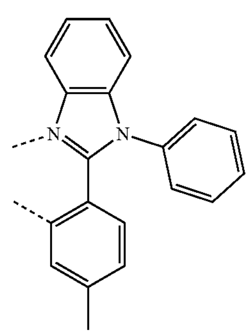

L2-67
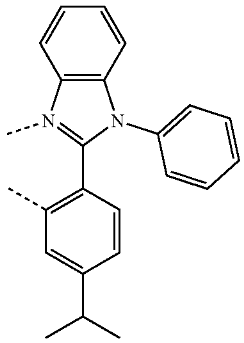
L2-68
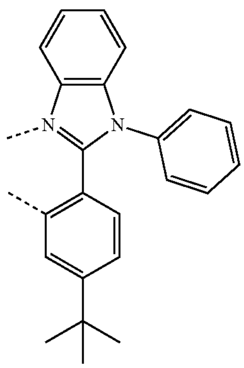
L2-69
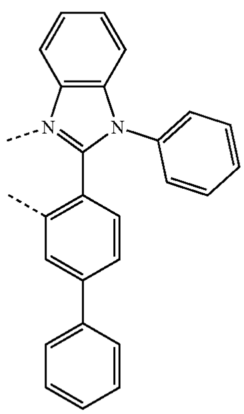
L2-70
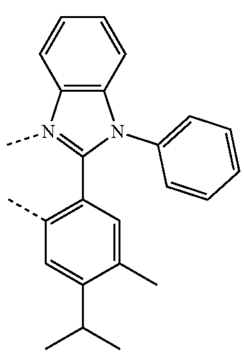
L2-71
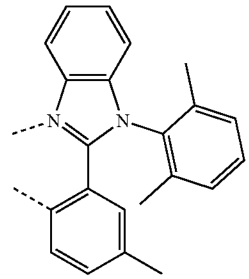
L2-72
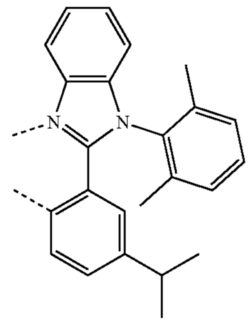
L2-73
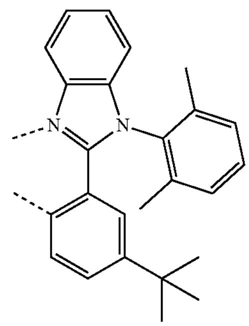
L2-74
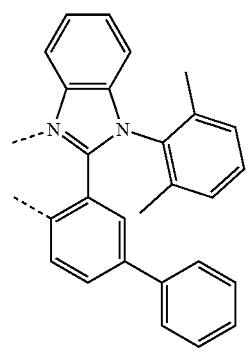
L2-75
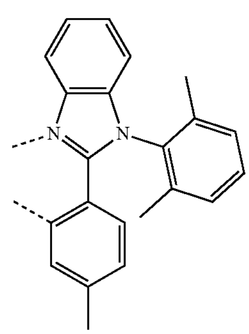

-continued
L2-76
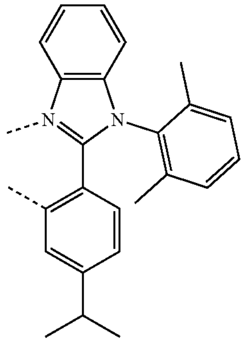
L2-77
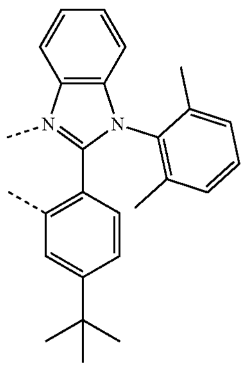
L2-78
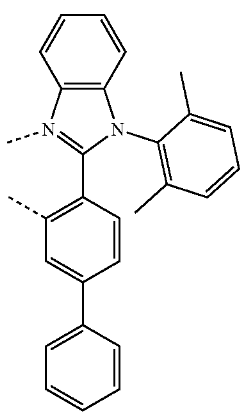
L2-79
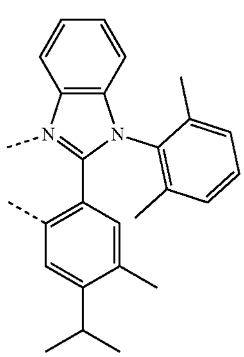
-continued
L2-80
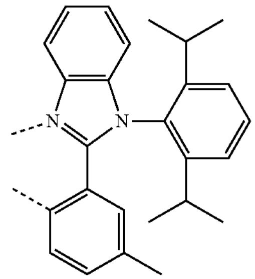
L2-81
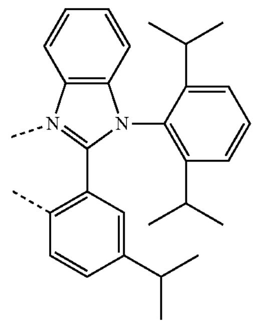
L2-82
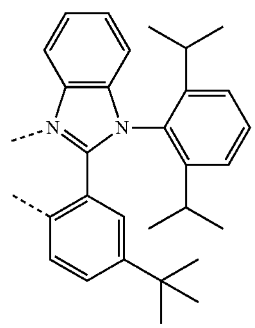
L2-83
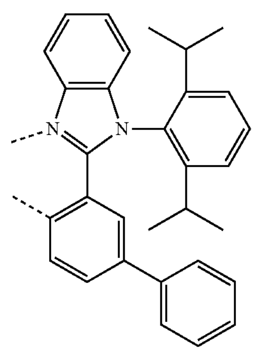
L2-84
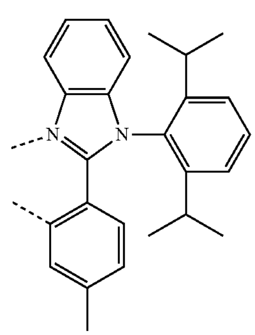

-continued
$L_{2-85}$
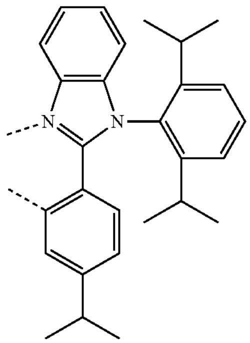
$L_{2-86}$
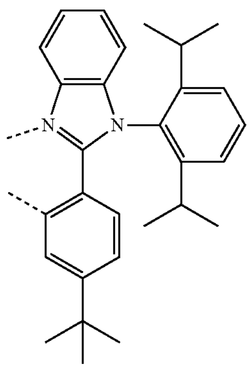
$L_{2-87}$
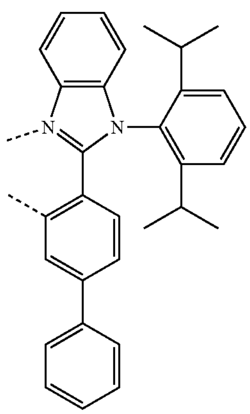
$L_{2-88}$
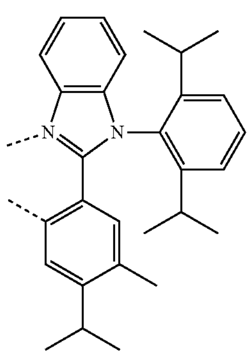
-continued
$L_{2-89}$
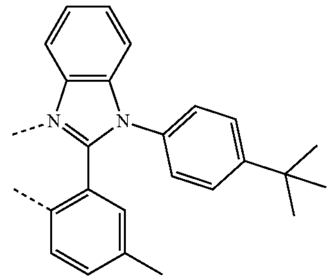
$L_{2-90}$
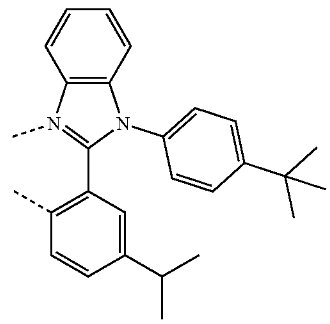
$L_{2-91}$
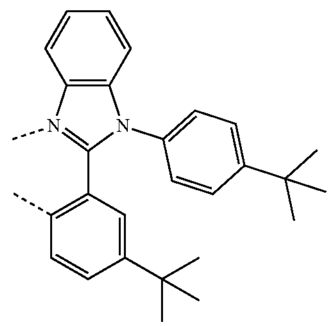
$L_{2-92}$
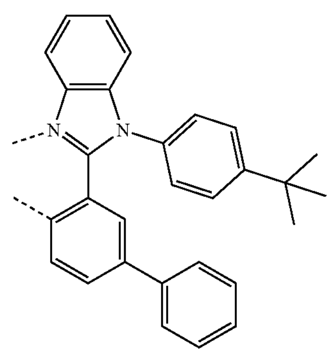
$L_{2-93}$
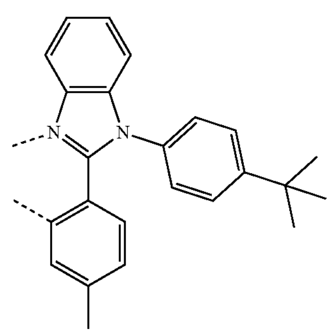

-continued
L2-94
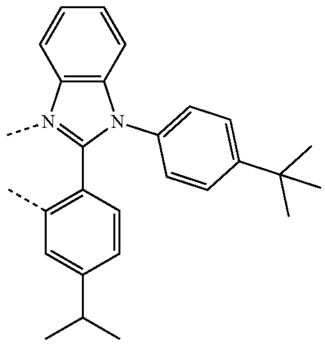
L2-95
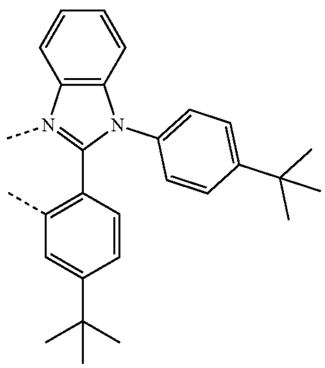
L2-96
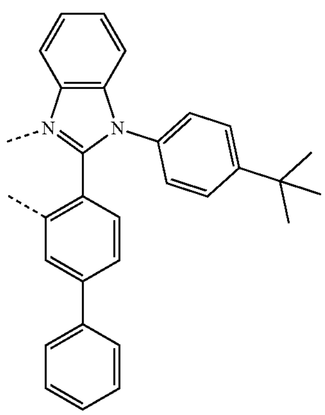
L2-97
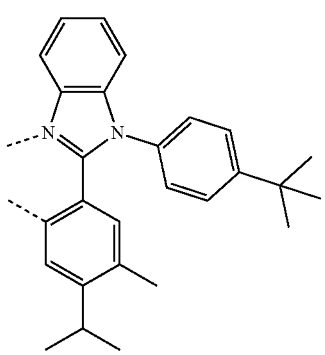
-continued
L2-98
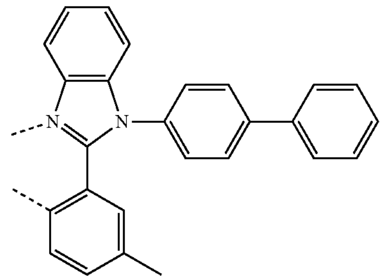
L2-99
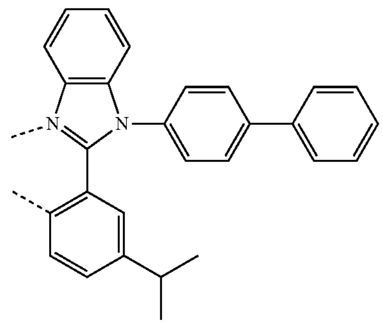
L2-100
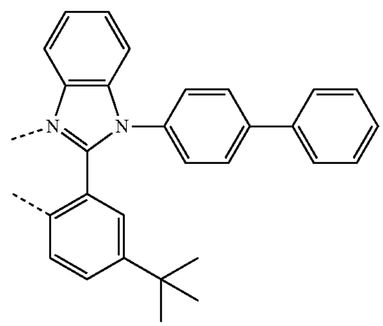
L2-101
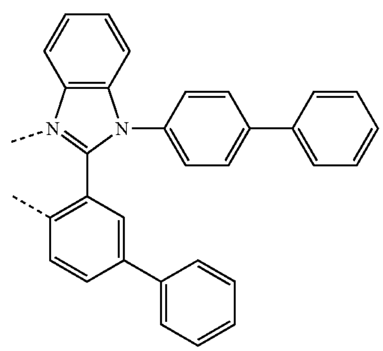
L2-102
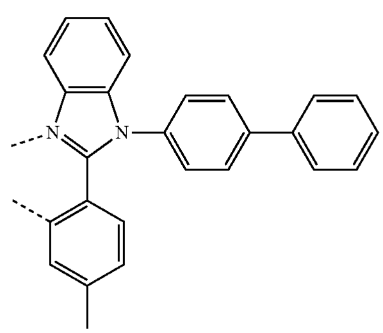

-continued
L2-103
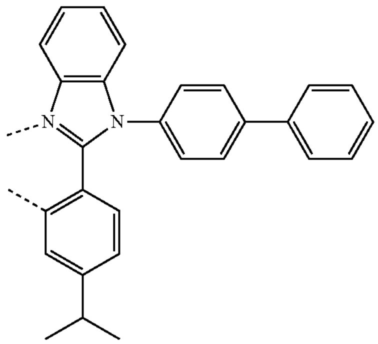
L2-104
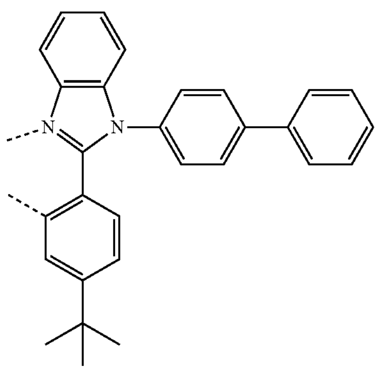
L2-105
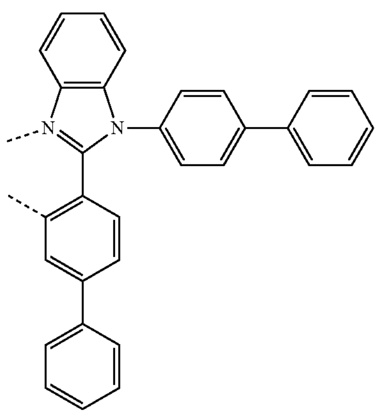
L2-106
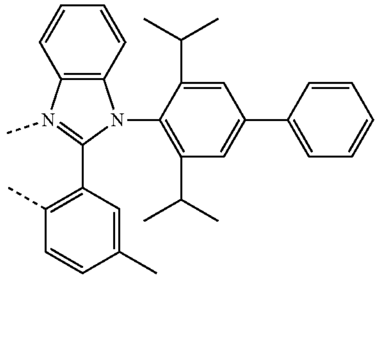
-continued
L2-107
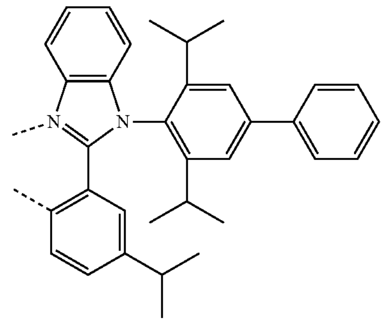
L2-108
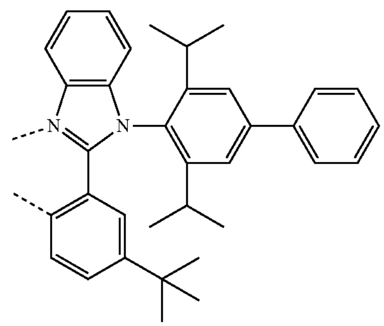
L2-109
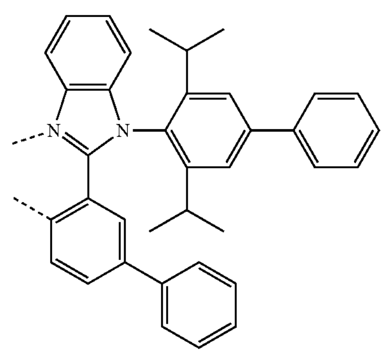
L2-110
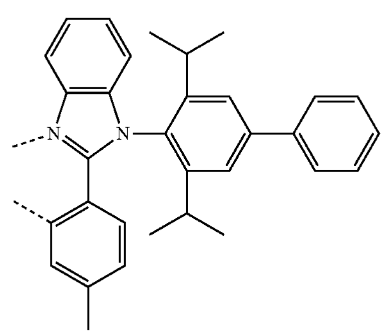

-continued
L2-111
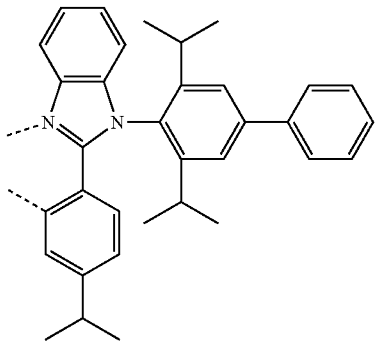
L2-112
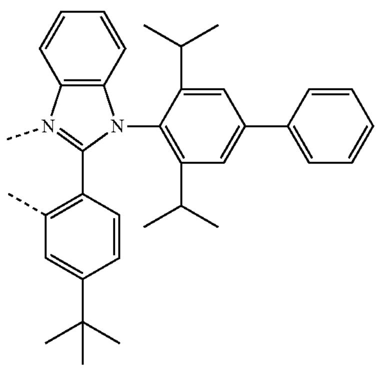
L2-113
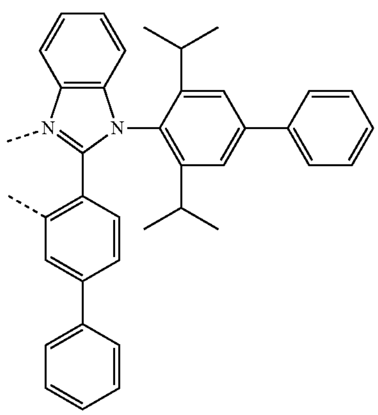
L2-114
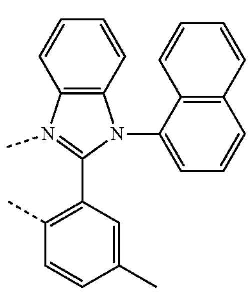
-continued
L2-115
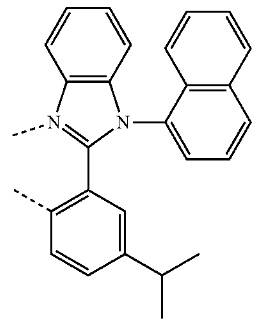
L2-116
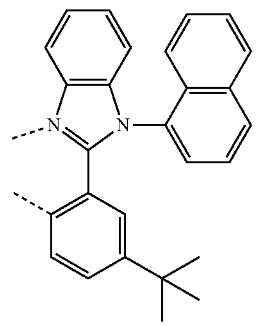
L2-117
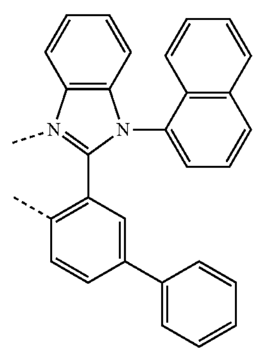
L2-118
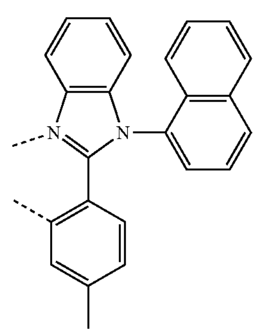

-continued
L2-119
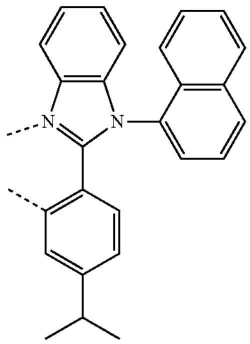
L2-120
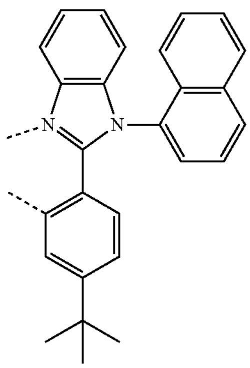
L2-121
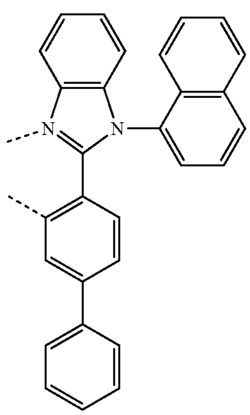
L2-122
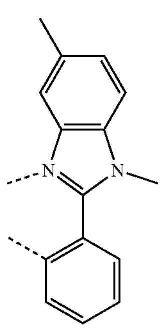
-continued
L2-123
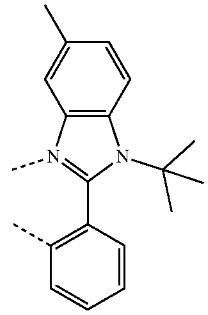
L2-124
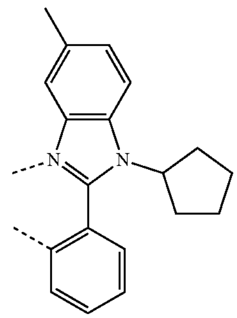
L2-125
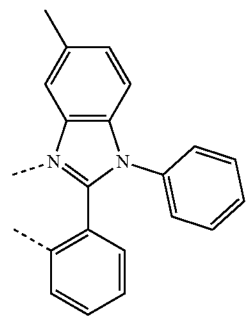
L2-126
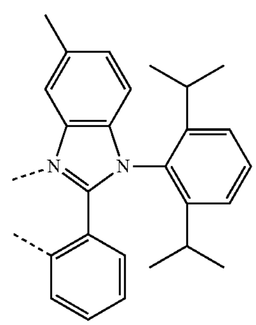
L2-127
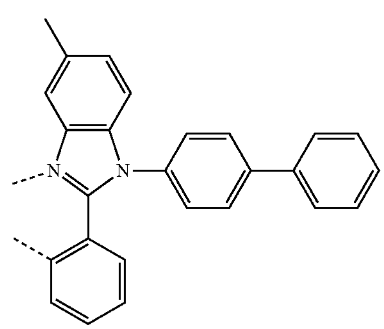

-continued
L2-128
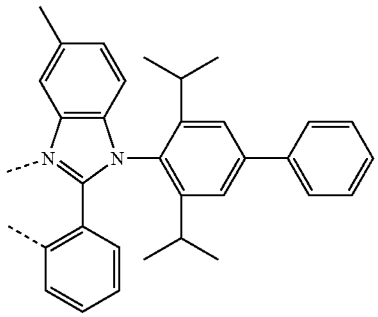
L2-129
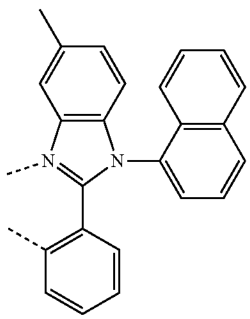
L2-130
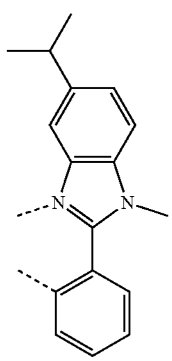
L2-131
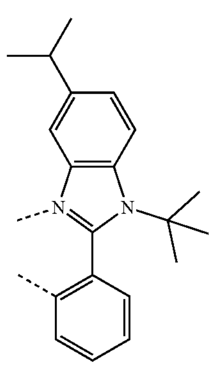
-continued
L2-132
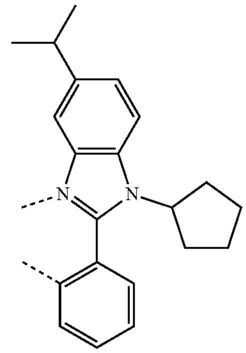
L2-133
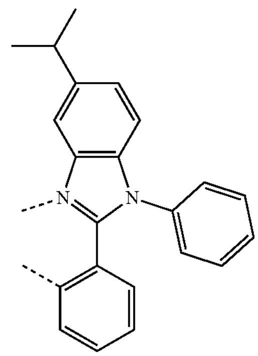
L2-134
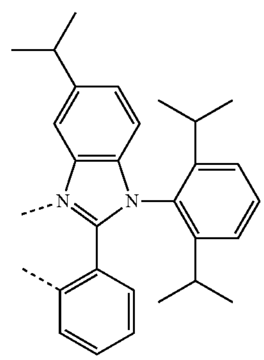
L2-135
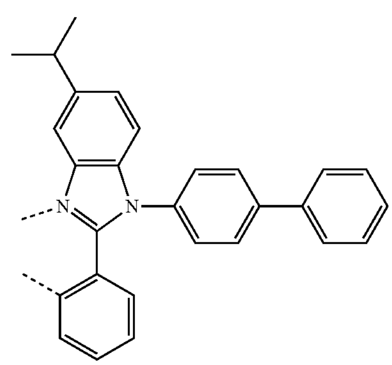

-continued
L2-136
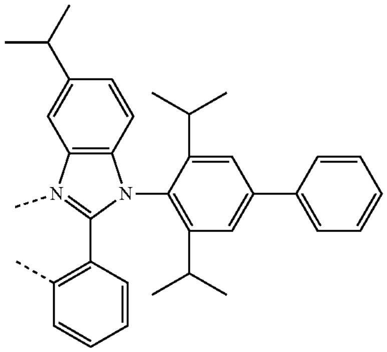
L2-137
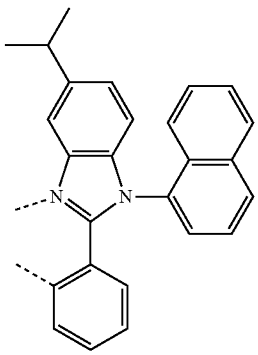
L2-138
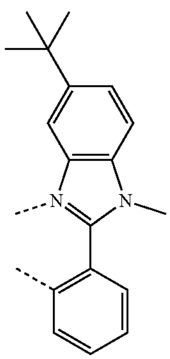
L2-139
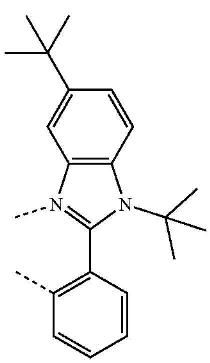
-continued
L2-140
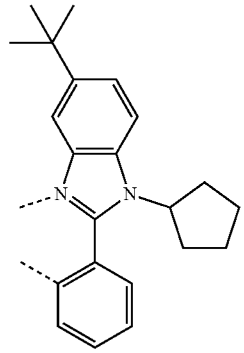
L2-141
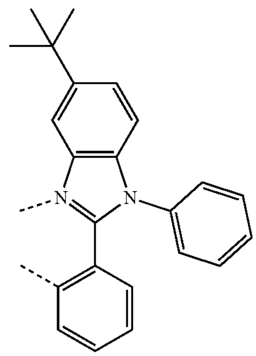
L2-142
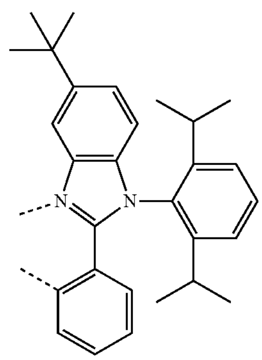
L2-143
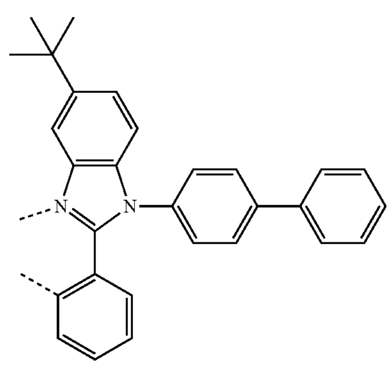

-continued
$L_{2-144}$
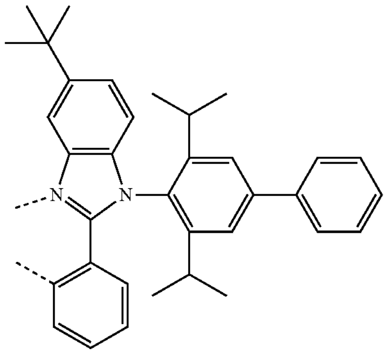
$L_{2-145}$
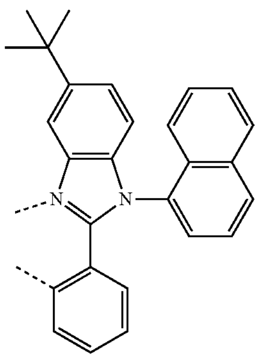
$L_{2-146}$
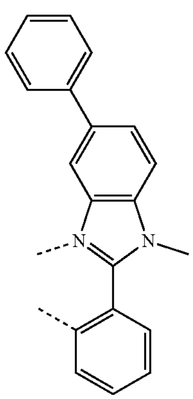
$L_{2-147}$
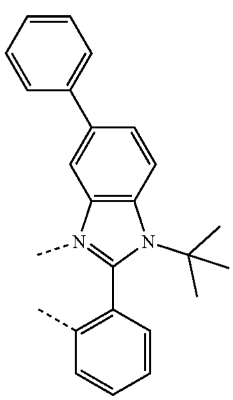
-continued
$L_{2-148}$
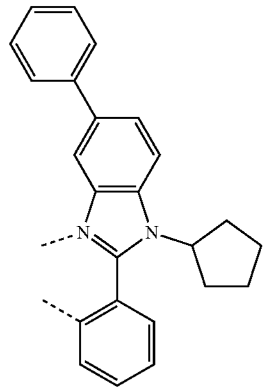
$L_{2-149}$
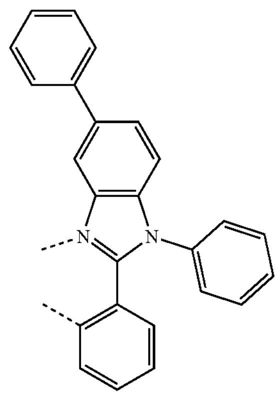
$L_{2-150}$
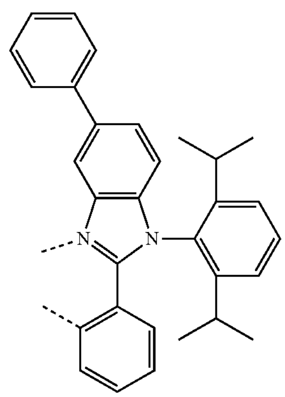
$L_{2-151}$
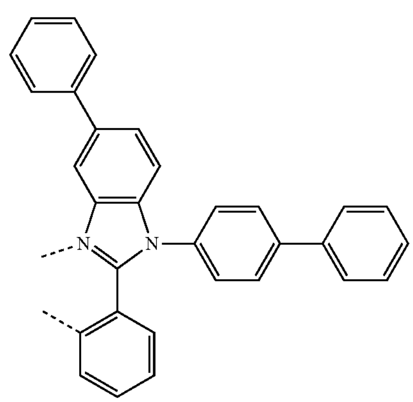

-continued
L2-152
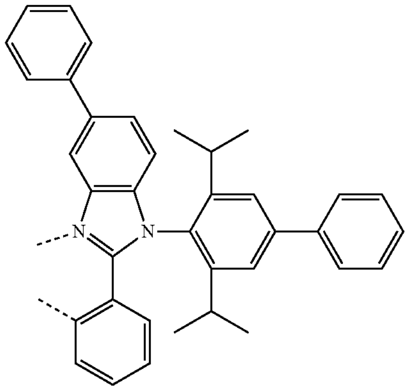
L2-153
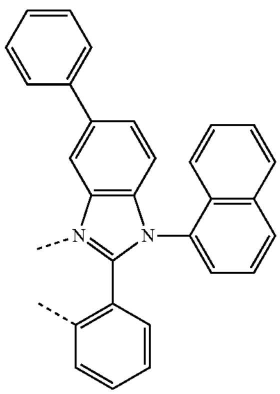
L2-154
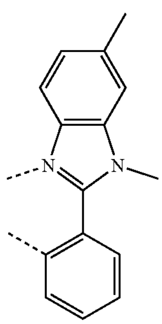
L2-155
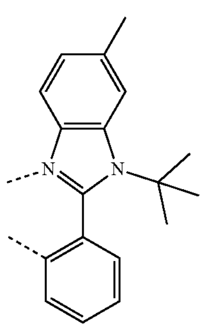
-continued
L2-156
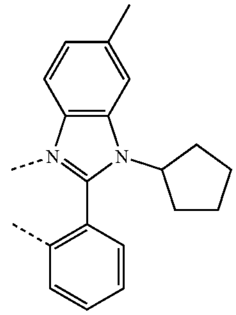
L2-157
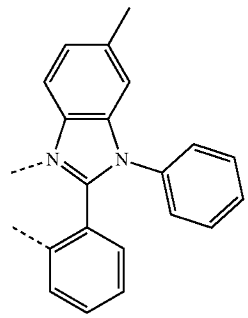
L2-158
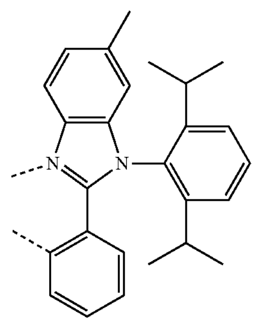
L2-159
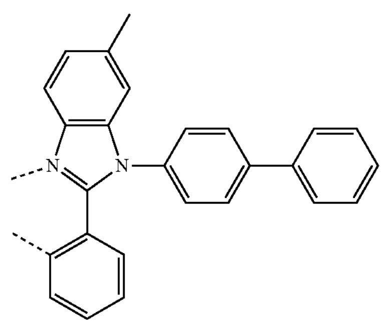
L2-160
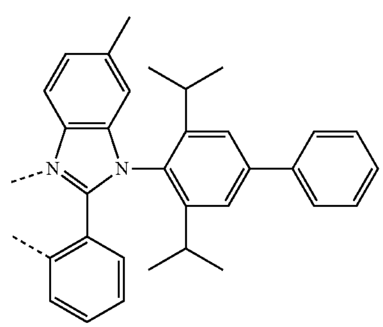

-continued
L2-161
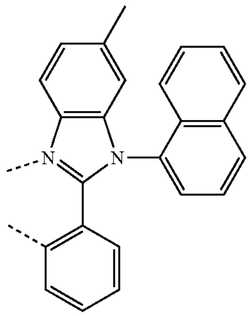
L2-162
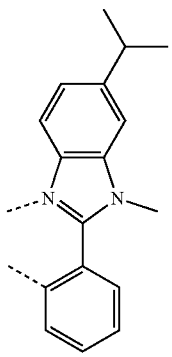
L2-163
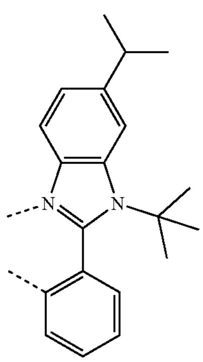
L2-164
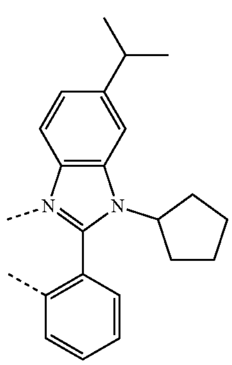
-continued
L2-165
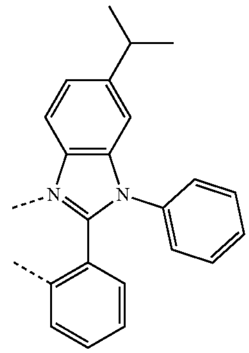
L2-166
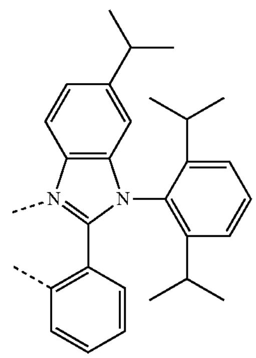
L2-167
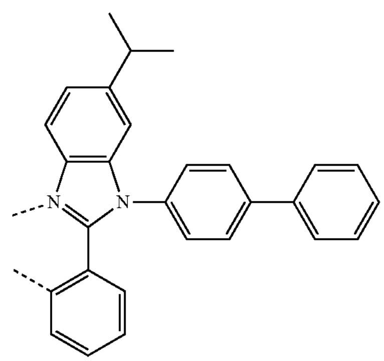
L2-168
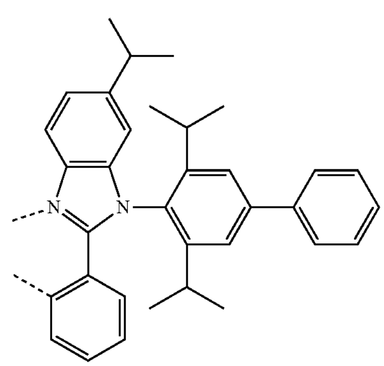

-continued
$L_{2-169}$
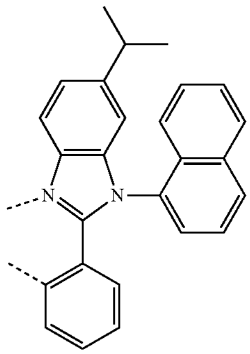
$L_{2-170}$
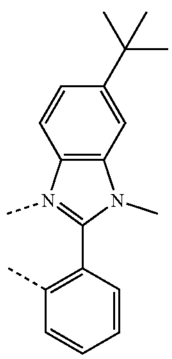
$L_{2-171}$
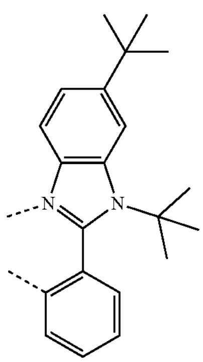
$L_{2-172}$
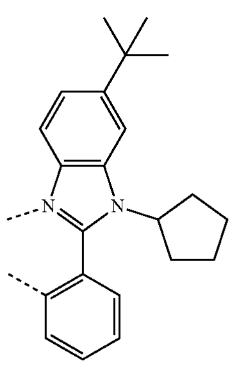
-continued
$L_{2-173}$
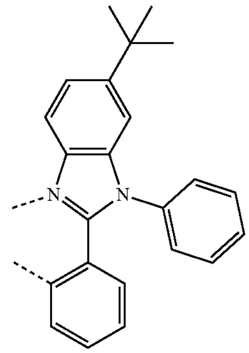
$L_{2-174}$
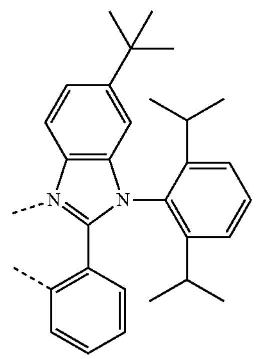
$L_{2-175}$
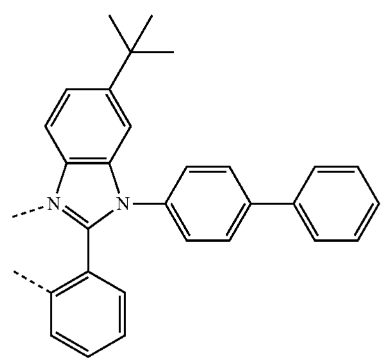
$L_{2-176}$
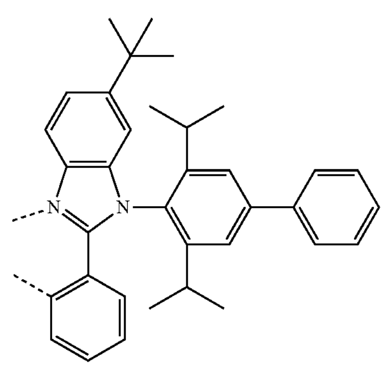

-continued
L2-177
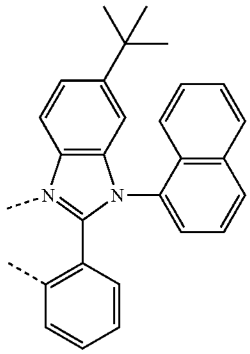
L2-178
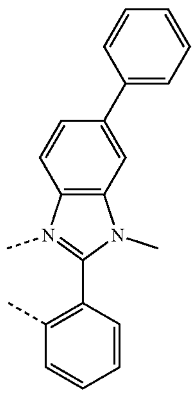
L2-179
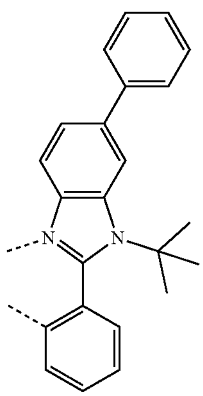
L2-180
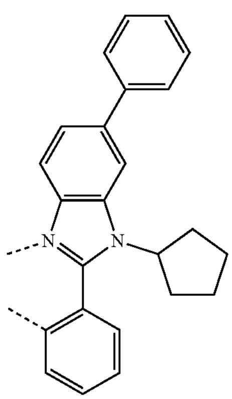
-continued
L2-181
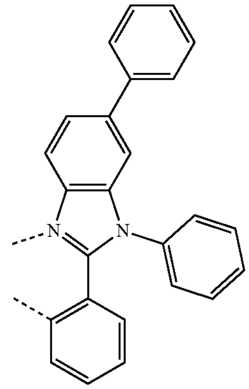
L2-182
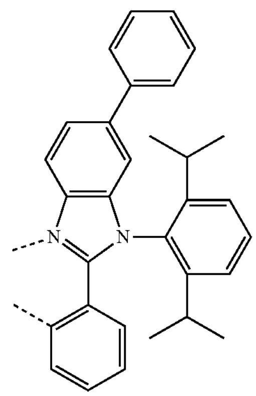
L2-183
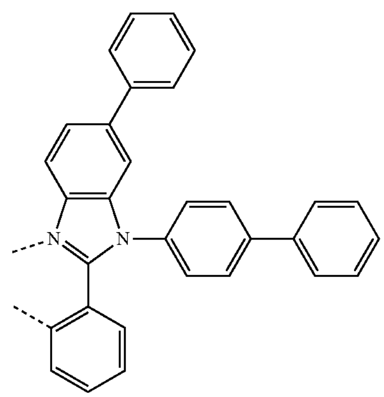
L2-184
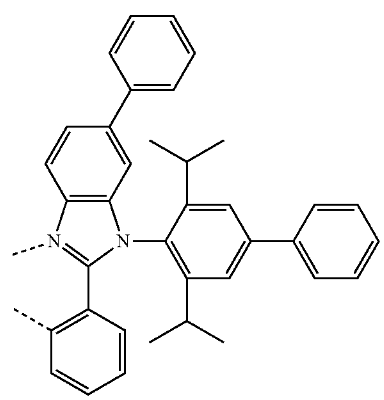

-continued
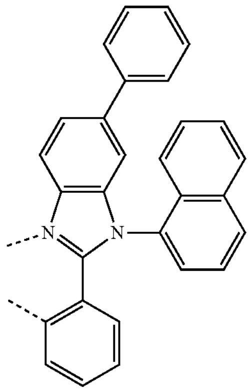
$L_{2-185}$
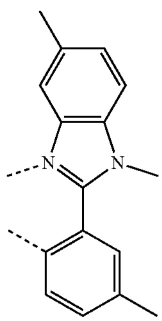
$L_{2-186}$
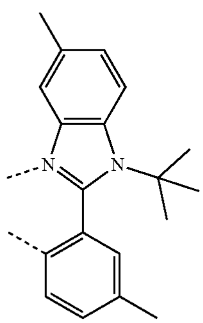
$L_{2-187}$
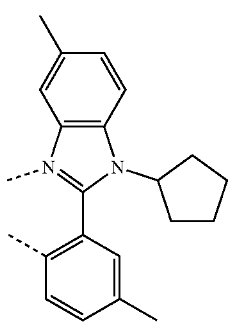
$L_{2-188}$
-continued
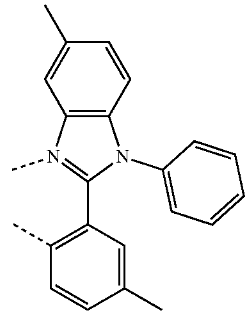
$L_{2-189}$
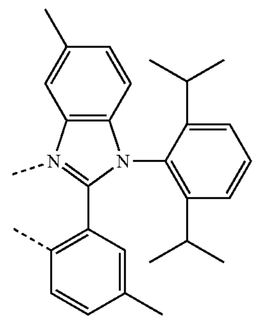
$L_{2-190}$
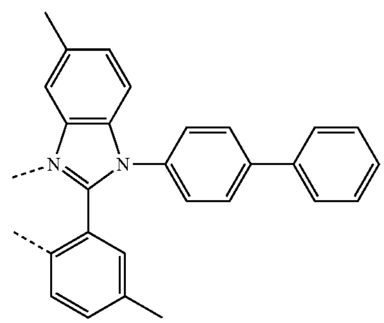
$L_{2-191}$
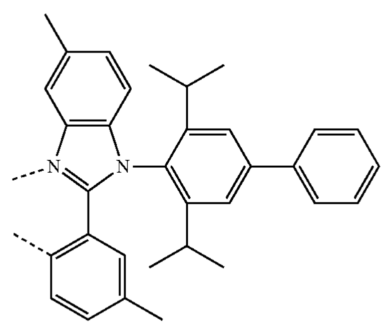
$L_{2-192}$
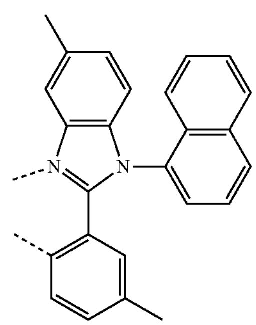
$L_{2-193}$ -continued
L2-194
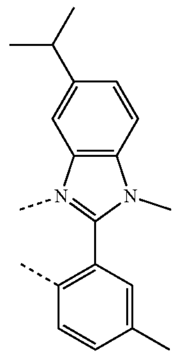
L2-195
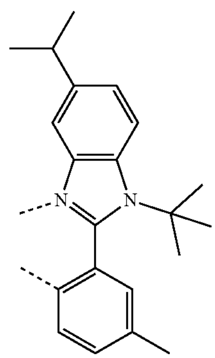
L2-196
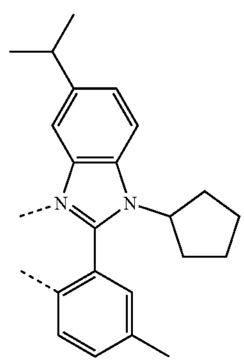
L2-197
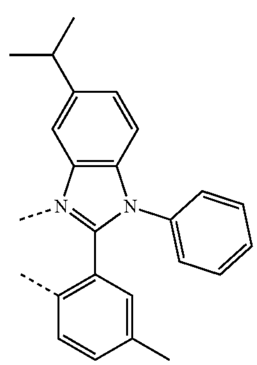
-continued
L2-198
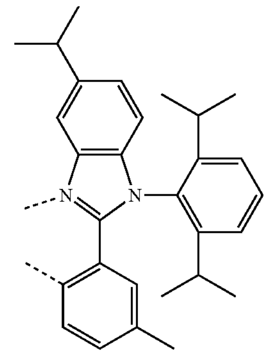
L2-199
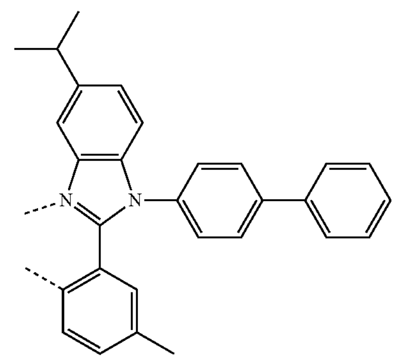
L2-200
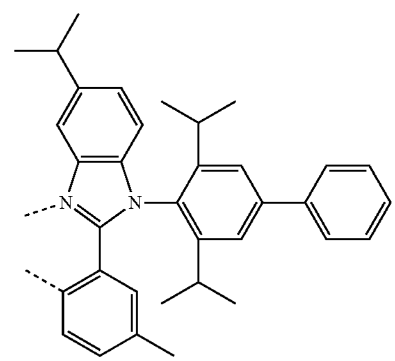
L2-201
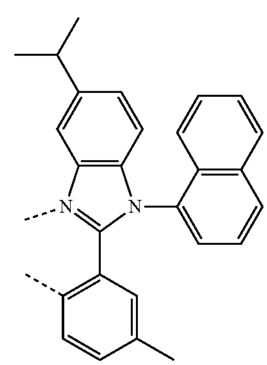

$L_{2-202}$
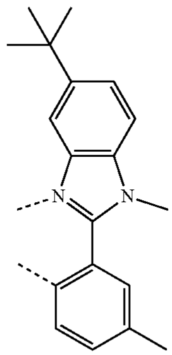
$L_{2-203}$
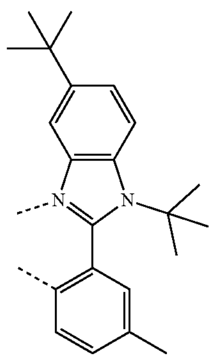
$L_{2-204}$
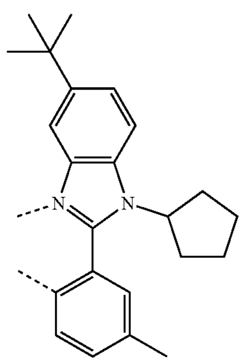
$L_{2-205}$
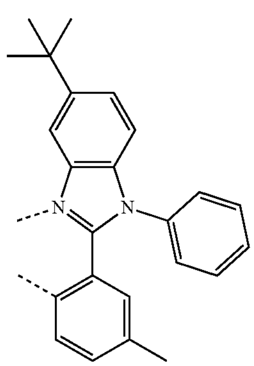
$L_{2-206}$
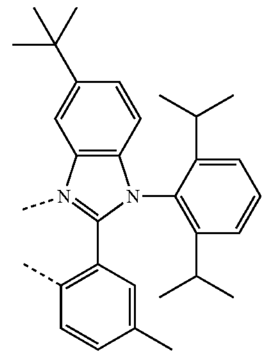
$L_{2-207}$
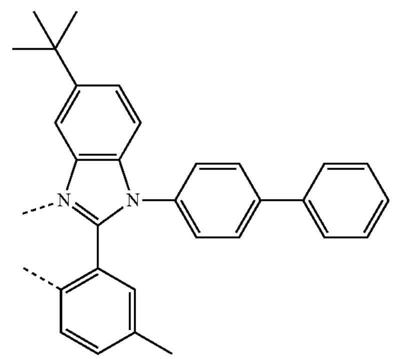
$L_{2-208}$
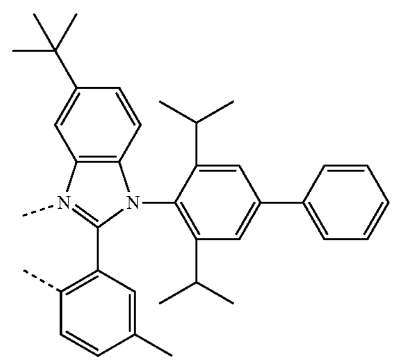
$L_{2-209}$
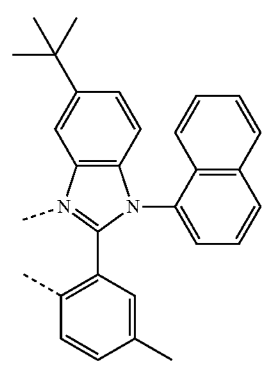

$L_{2-210}$
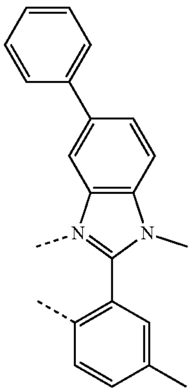
$L_{2-211}$
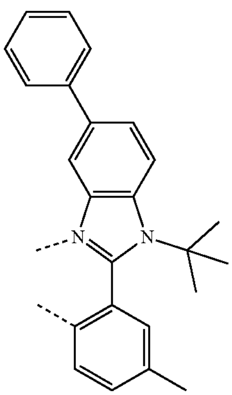
$L_{2-212}$
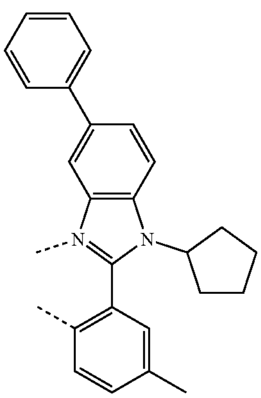
$L_{2-213}$
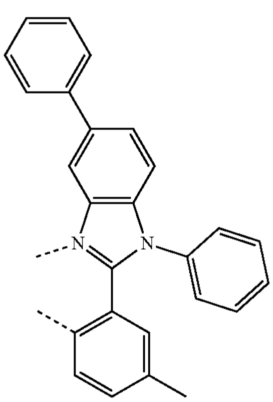
$L_{2-214}$
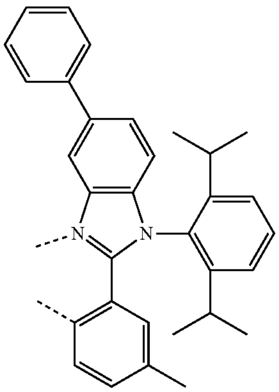
$L_{2-215}$
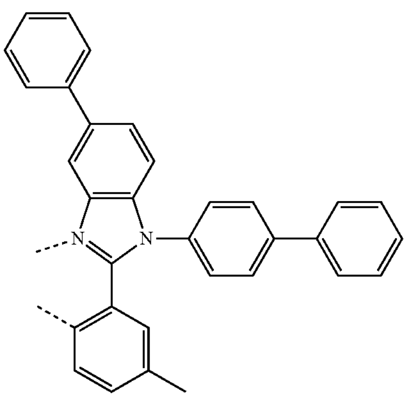
$L_{2-216}$
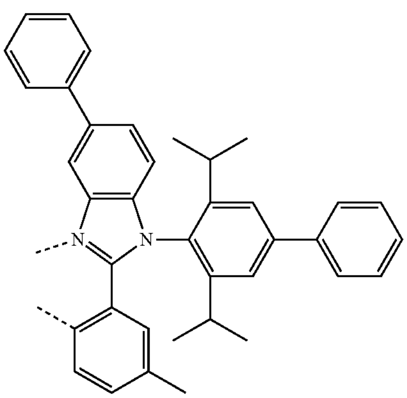
$L_{2-217}$
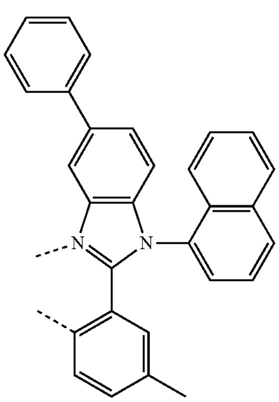

-continued
$L_{2-218}$
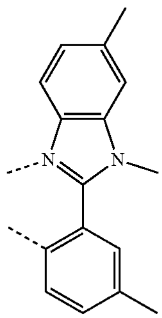
$L_{2-219}$
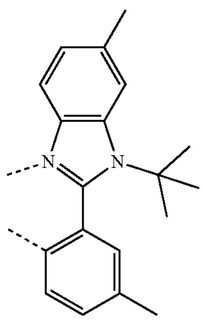
$L_{2-220}$
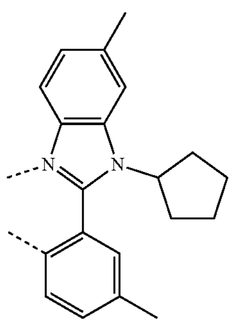
$L_{2-221}$
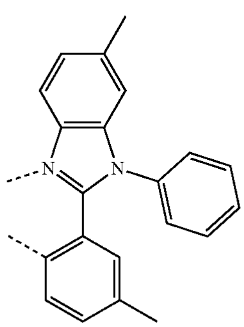
$L_{2-222}$
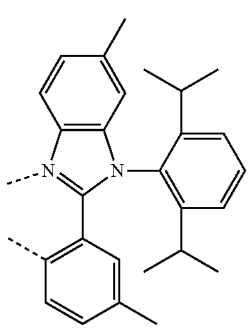
-continued
$L_{2-223}$
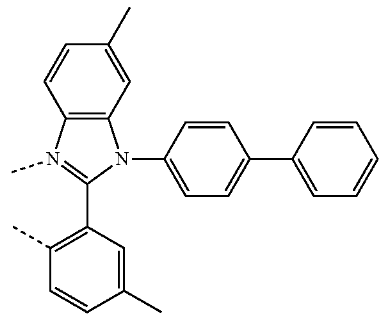
$L_{2-224}$
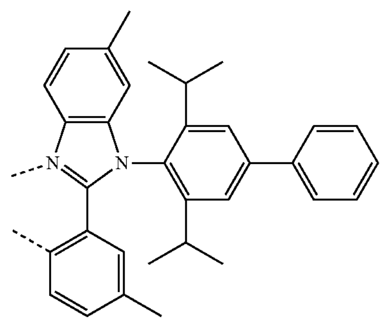
$L_{2-225}$
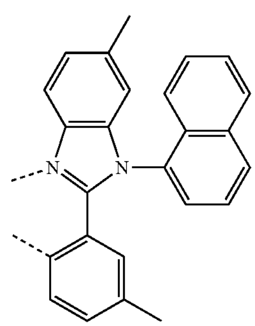
$L_{2-226}$
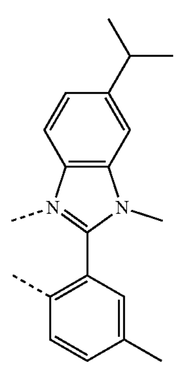

L2-227
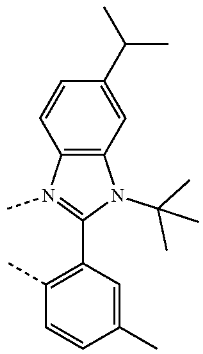
L2-228
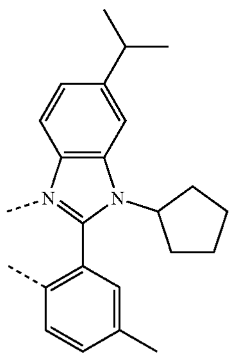
L2-229
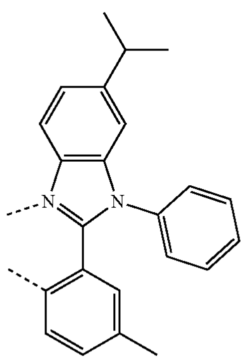
L2-230
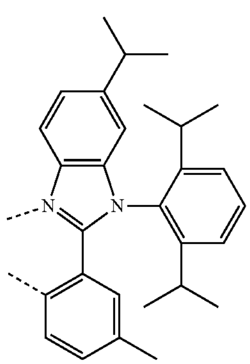
L2-231
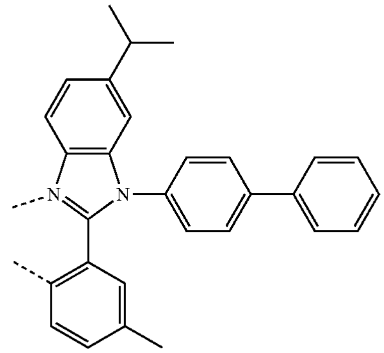
L2-232
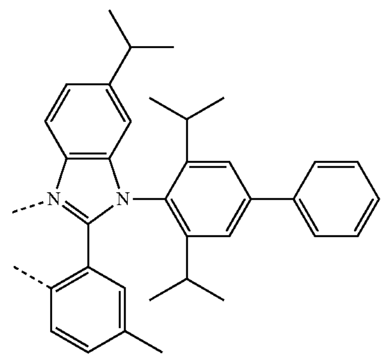
L2-233
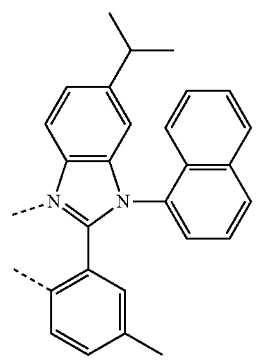
L2-234
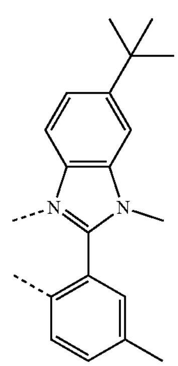

-continued
$L_{2-235}$
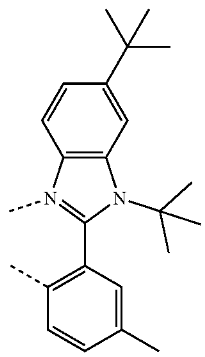
$L_{2-236}$
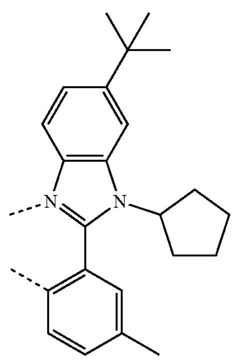
$L_{2-237}$
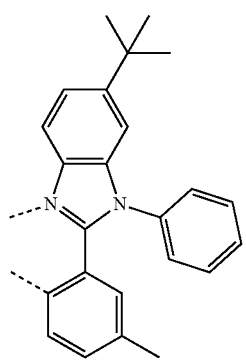
$L_{2-238}$
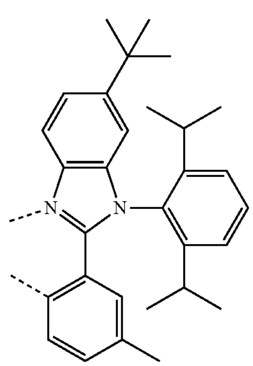
-continued
$L_{2-239}$
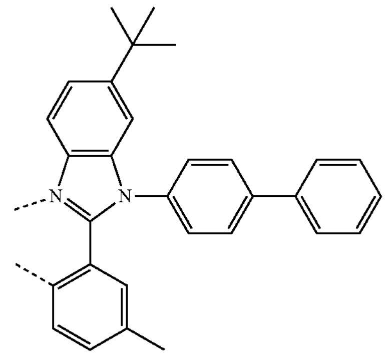
$L_{2-240}$
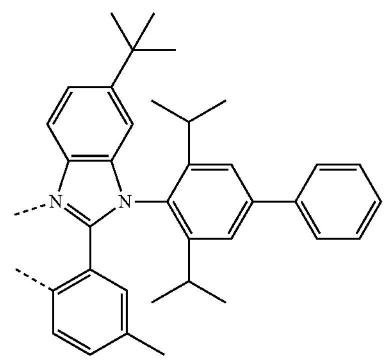
$L_{2-241}$
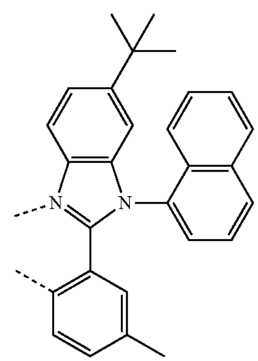
$L_{2-242}$
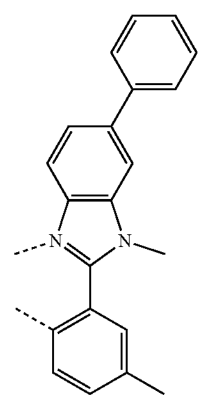

-continued
L2-243
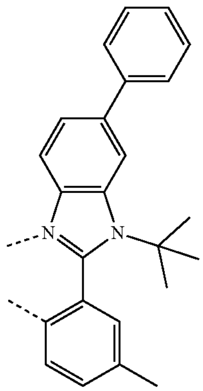
L2-244
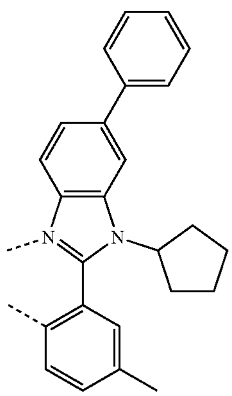
L2-245
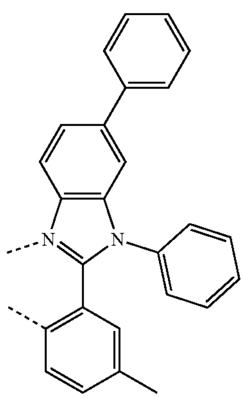
L2-246
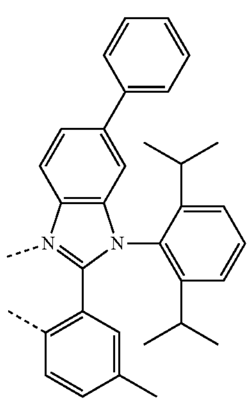
-continued
L2-247
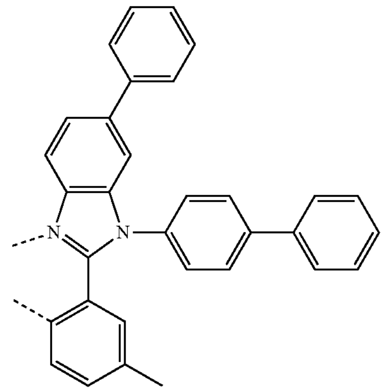
L2-248
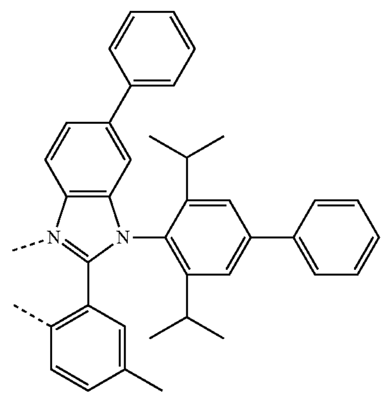
L2-249
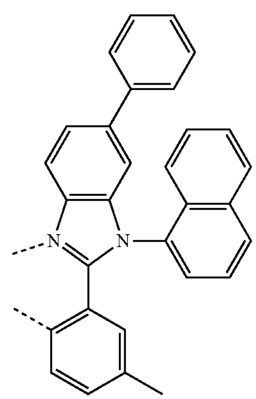
L2-250
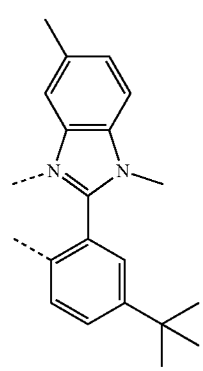

-continued
L2-251
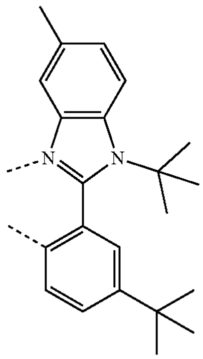
L2-252
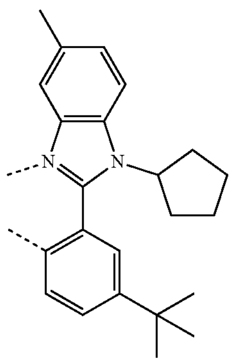
L2-253
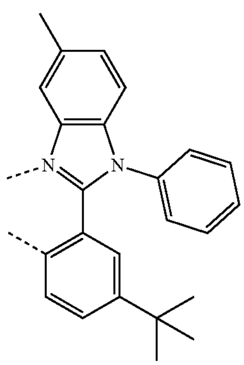
L2-254
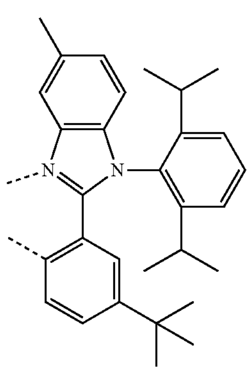
-continued
L2-255
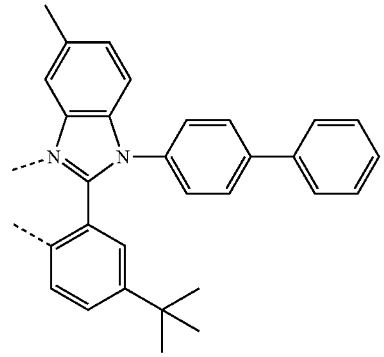
L2-256
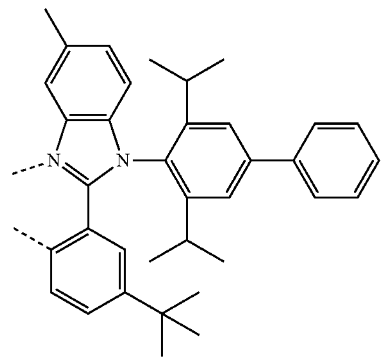
L2-257
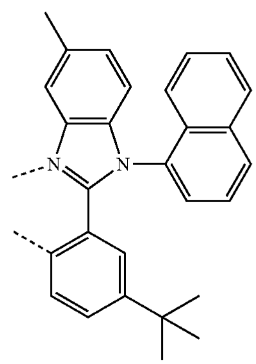
L2-258
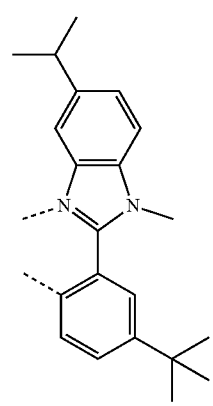

-continued
L2-259
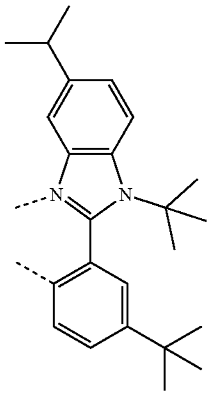
L2-260
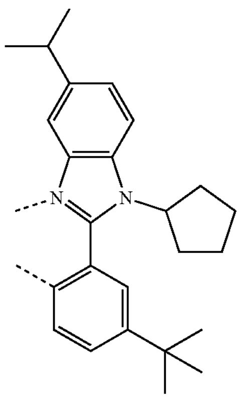
L2-261
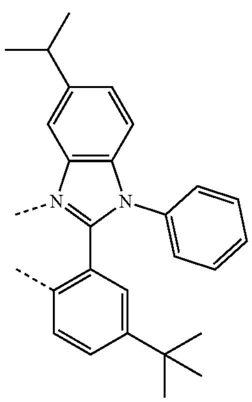
L2-262
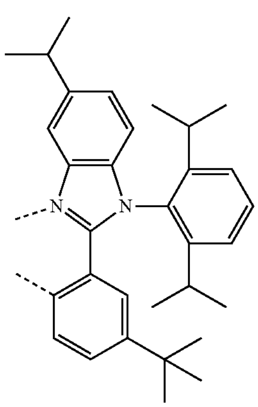
-continued
L2-263
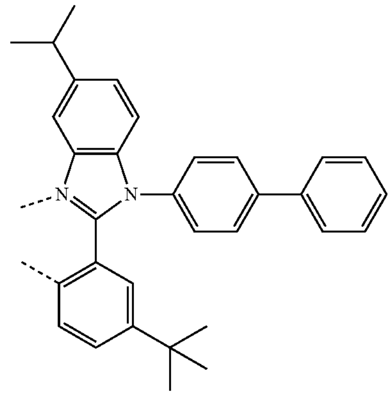
L2-264
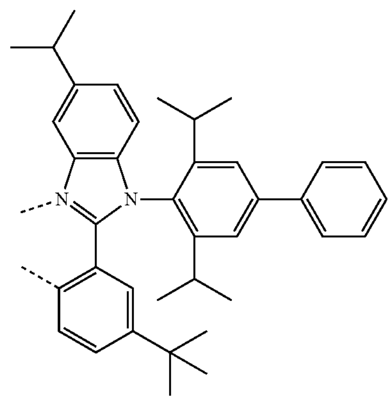
L2-265
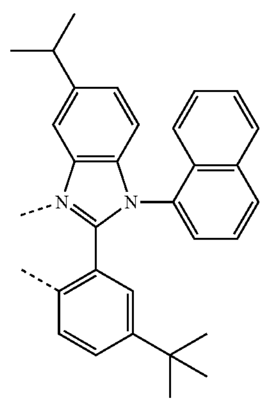
L2-266
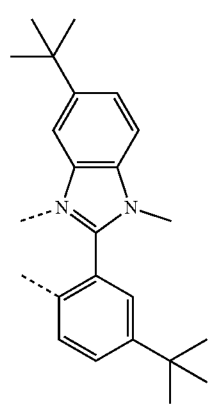

-continued
L2-267
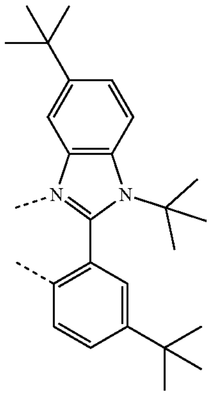
L2-268
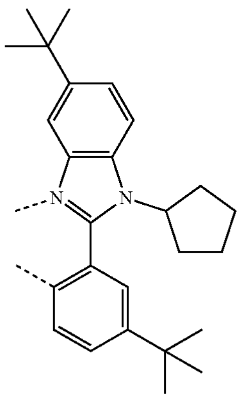
L2-269
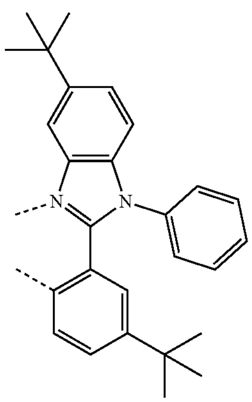
L2-270
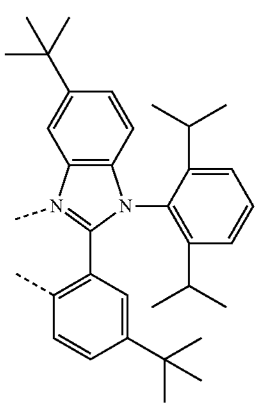
-continued
L2-271
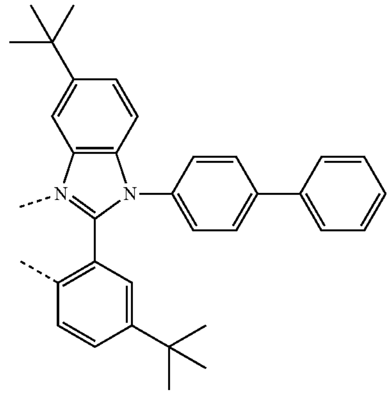
L2-272
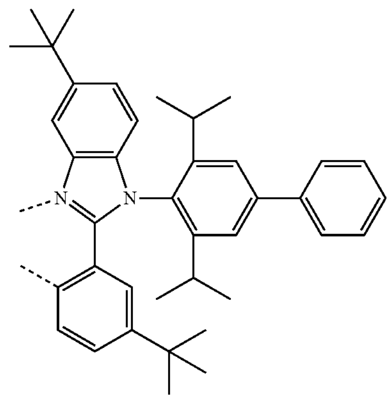
L2-273
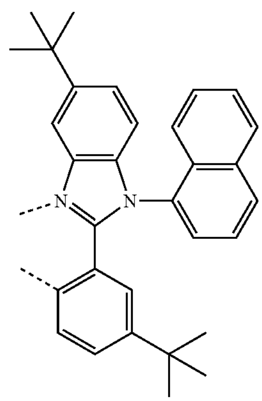
L2-274
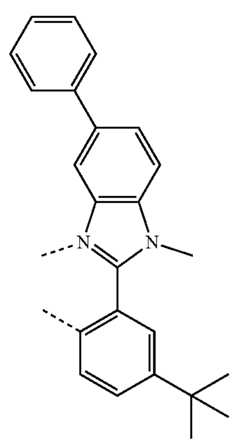

L2-275
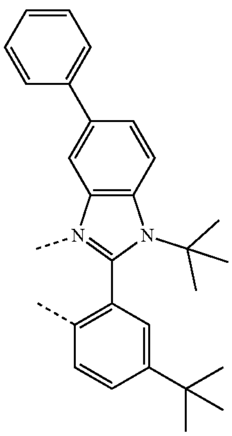
L2-276
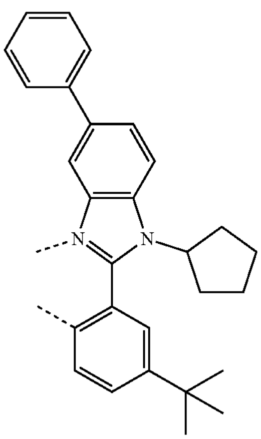
L2-277
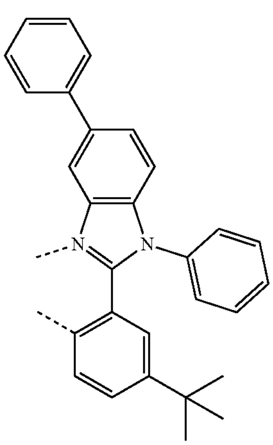
L2-278
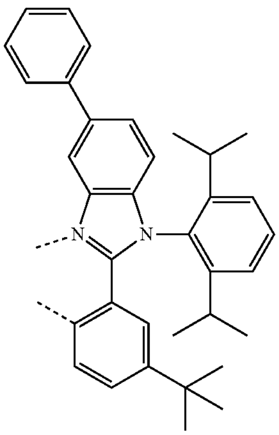
L2-279
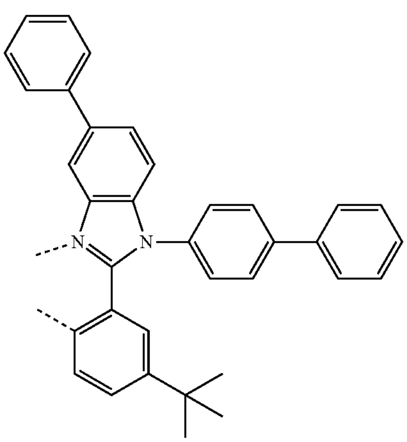
L2-280
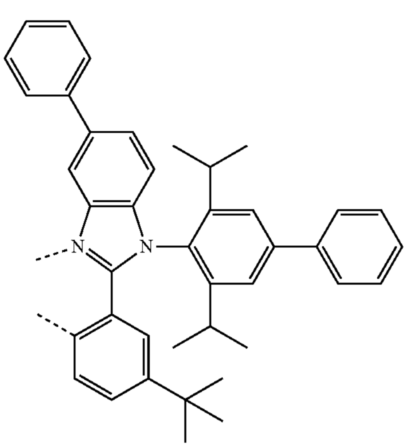

-continued
L2-281
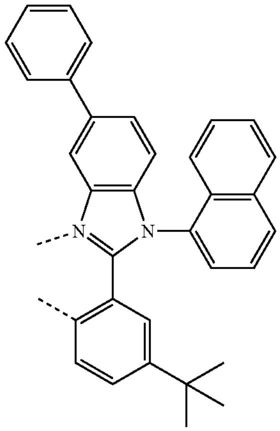
L2-282
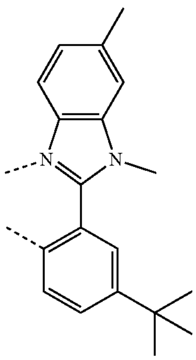
L2-283
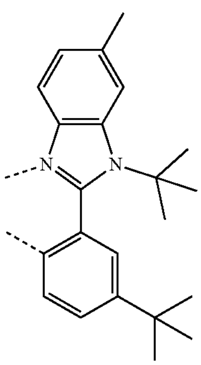
L2-284
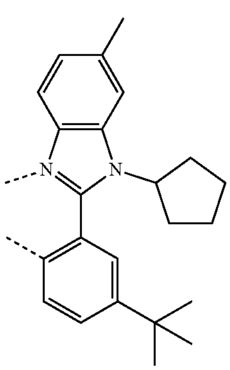
-continued
L2-285
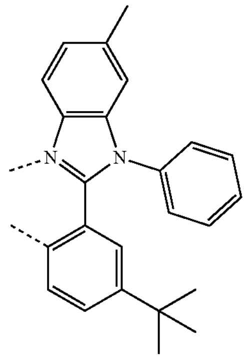
L2-286
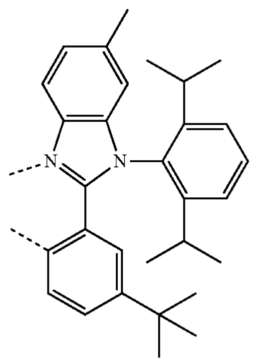
L2-287
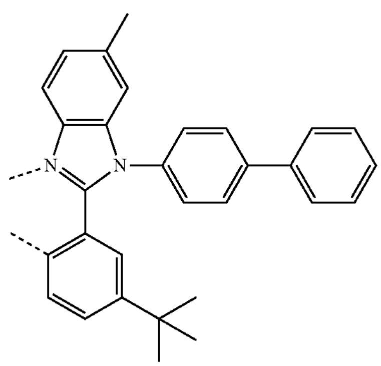
L2-288
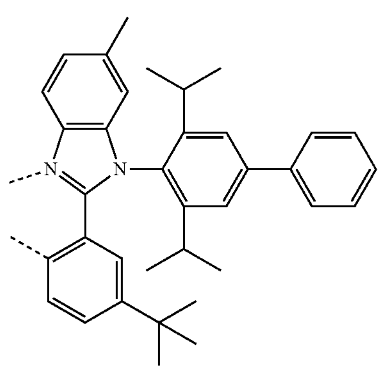

-continued
L2-289
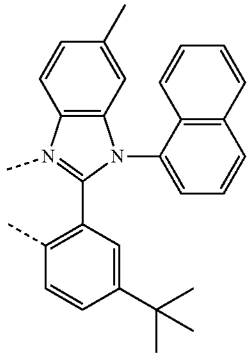
L2-290
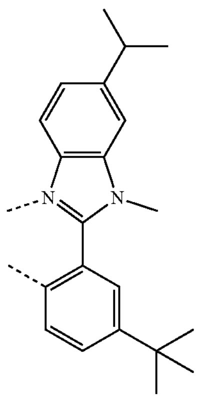
L2-291
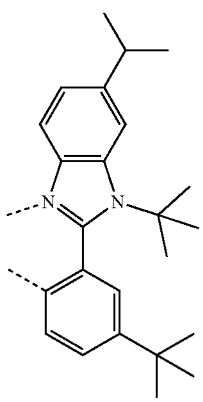
L2-292
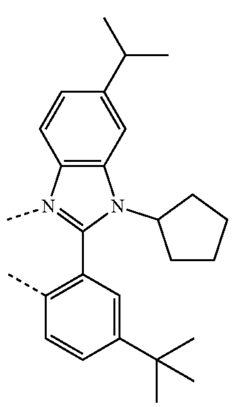
-continued
L2-293
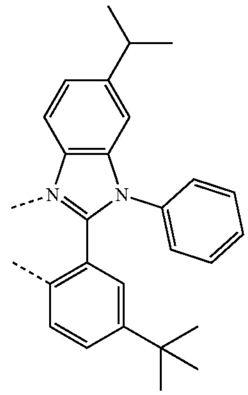
L2-294
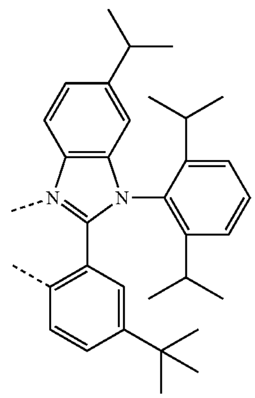
L2-295
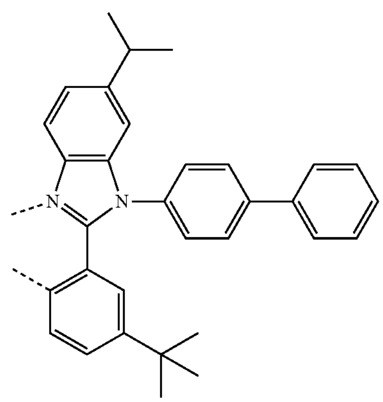
L2-296
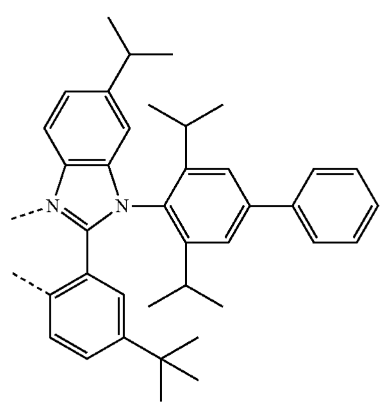

L2-297
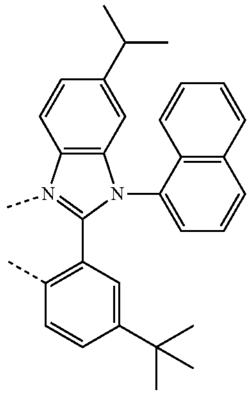
L2-298
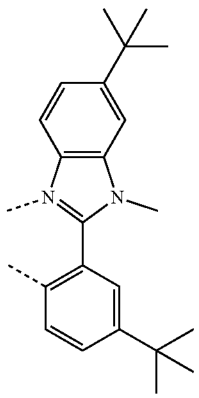
L2-299
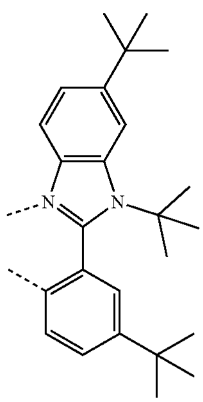
L2-300
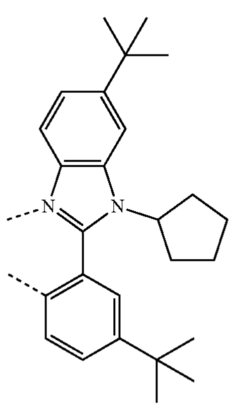
L2-301
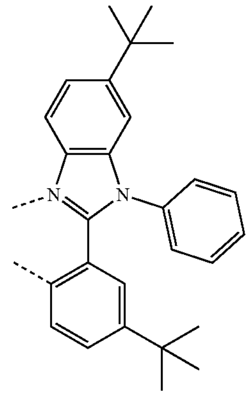
L2-302
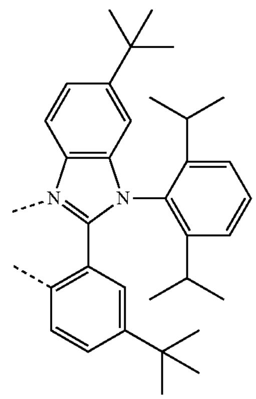
L2-303
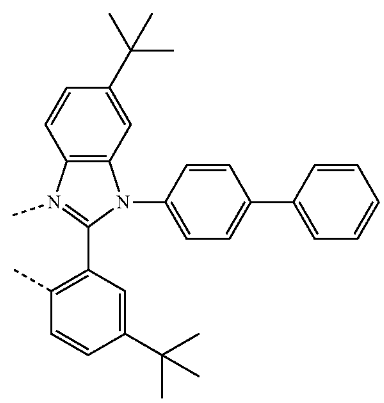
L2-304
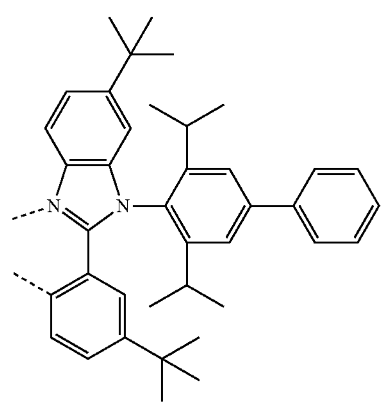

-continued
L2-305
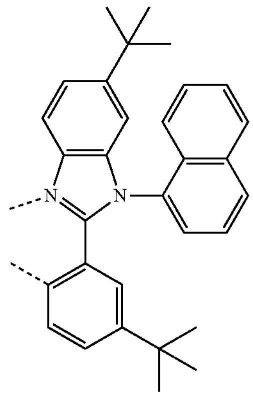
L2-306
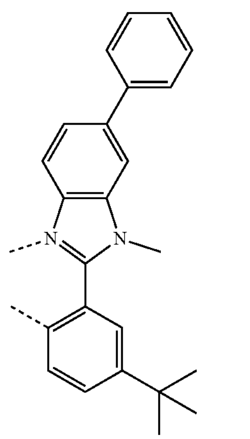
L2-307
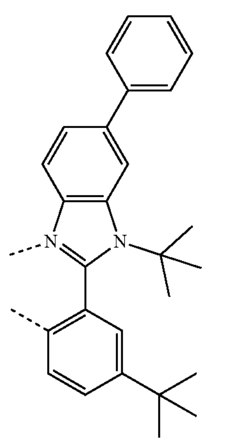
-continued
L2-308
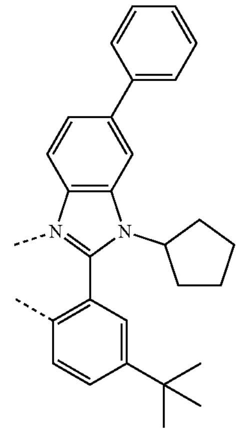
L2-309
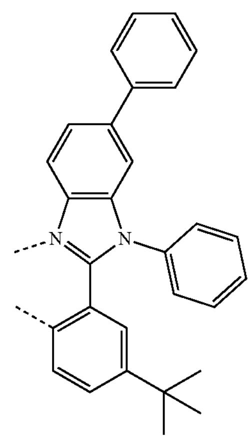
L2-310
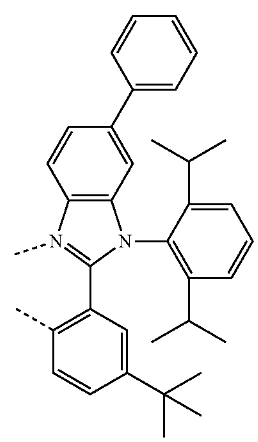

L2-311
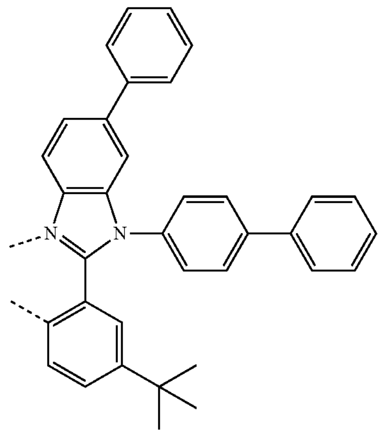
L2-312
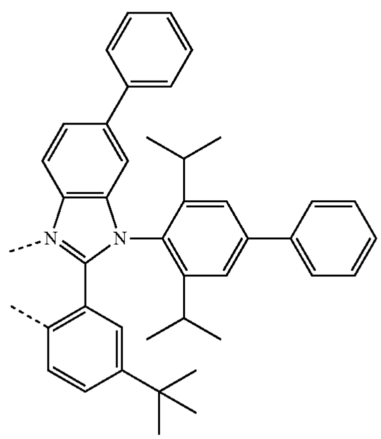
L2-313
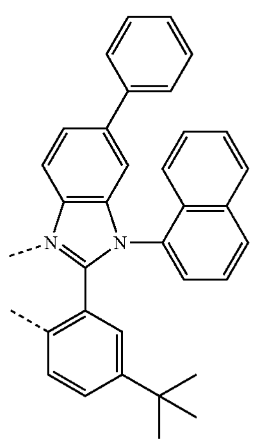
L2-314
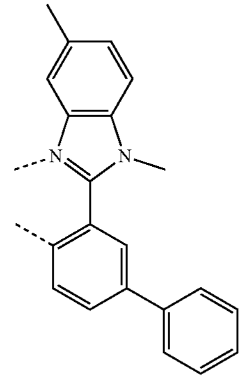
L2-315
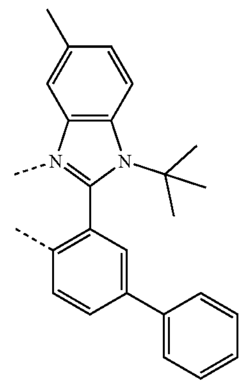
L2-316
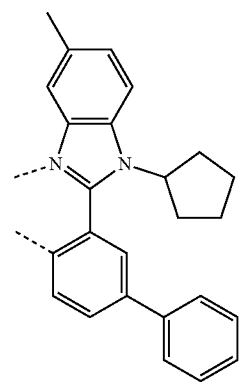
L2-317
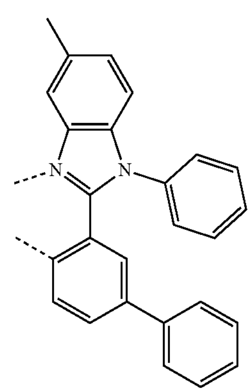

L2-318
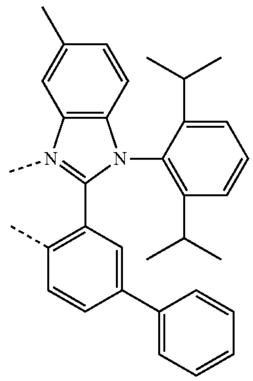
L2-319
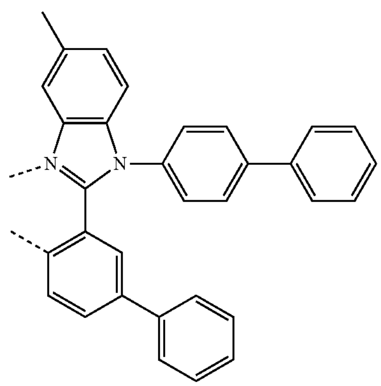
L2-320
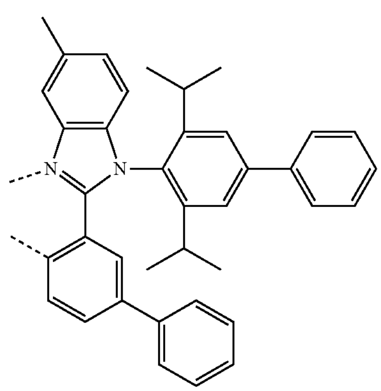
L2-321
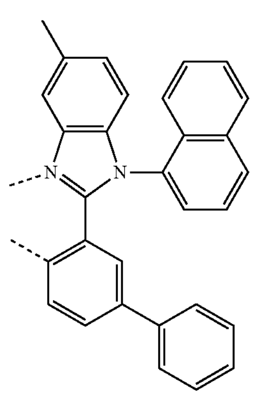
L2-322
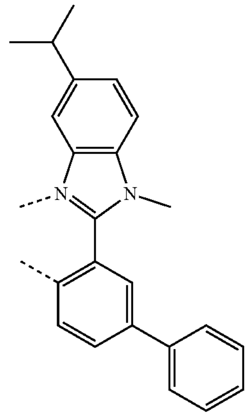
L2-323
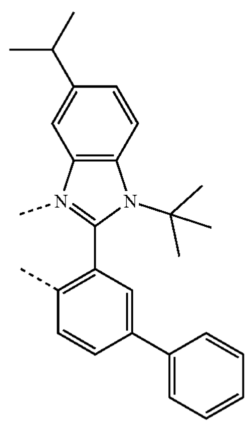
L2-324
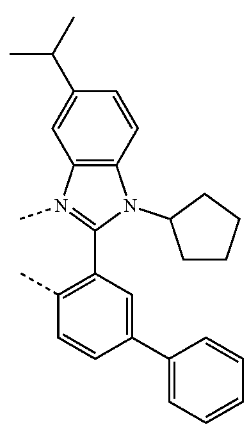

-continued
L$_{2-325}$
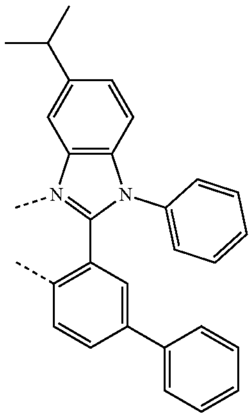
L$_{2-326}$
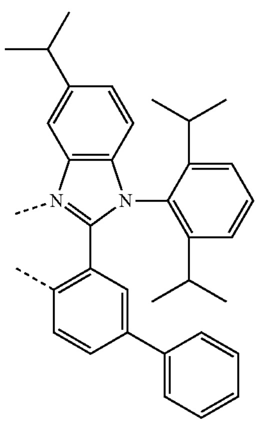
L$_{2-327}$
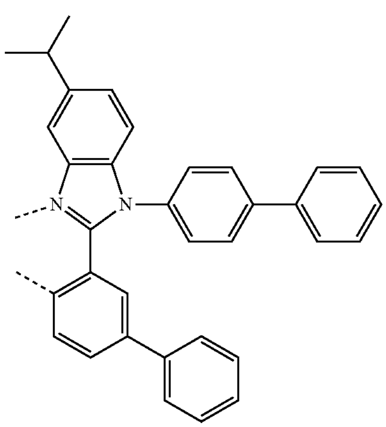
-continued
L$_{2-328}$
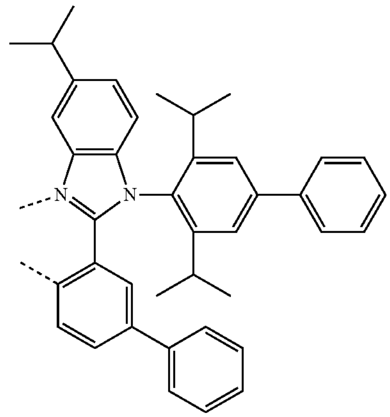
L$_{2-329}$
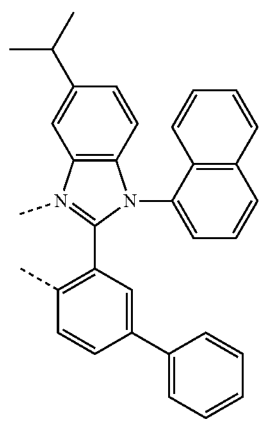
L$_{2-330}$
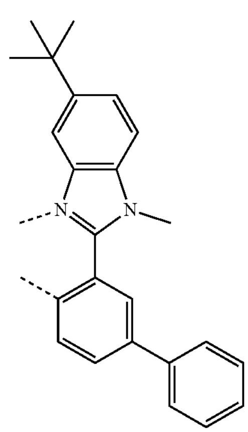

-continued
L2-331
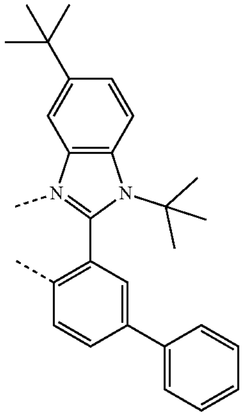
L2-332
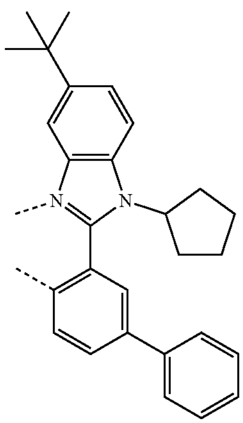
L2-333
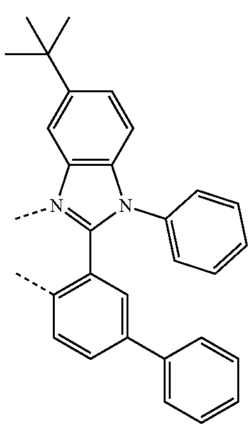
-continued
L2-334
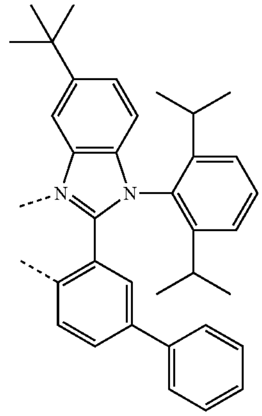
L2-335
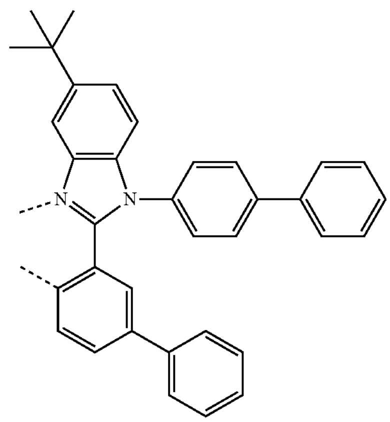
L2-336
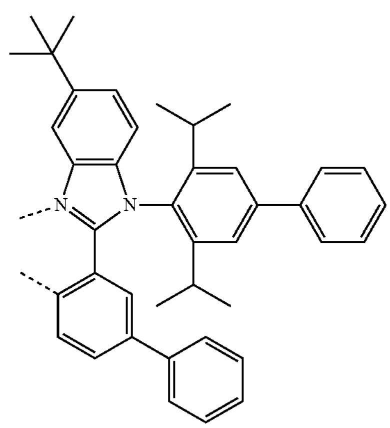

-continued
$L_{2-337}$
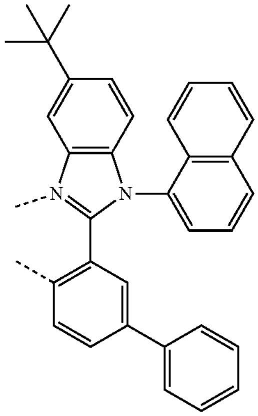
$L_{2-338}$
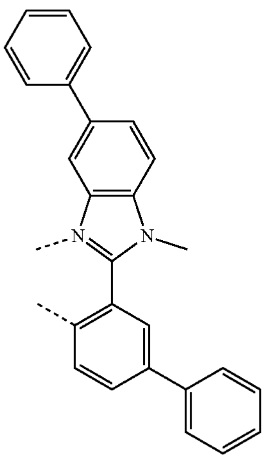
$L_{2-339}$
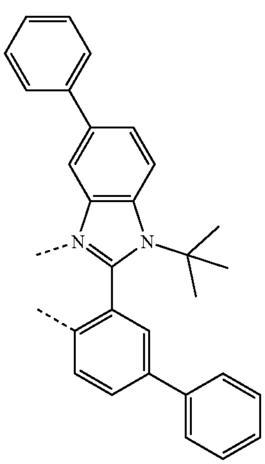
-continued
$L_{2-340}$
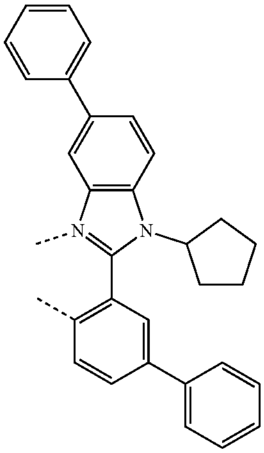
$L_{2-341}$
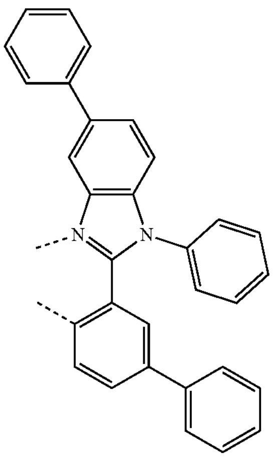
$L_{2-342}$
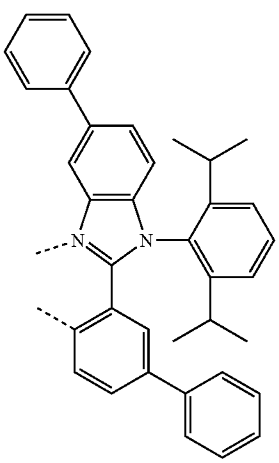

L2-343
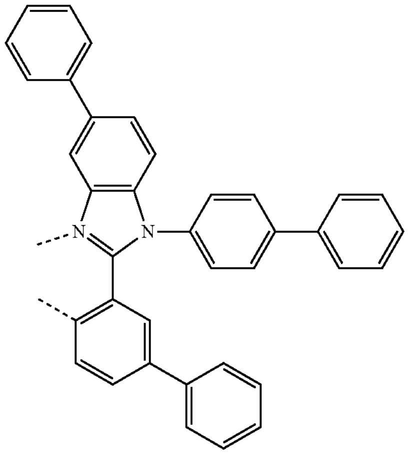
L2-344
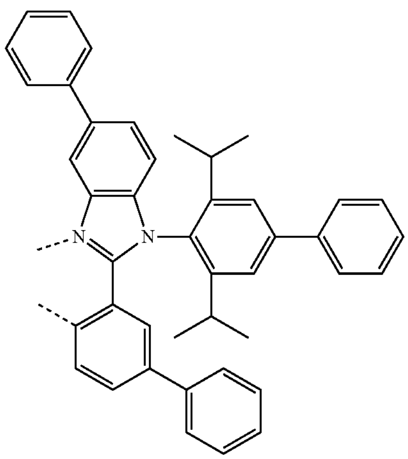
L2-345
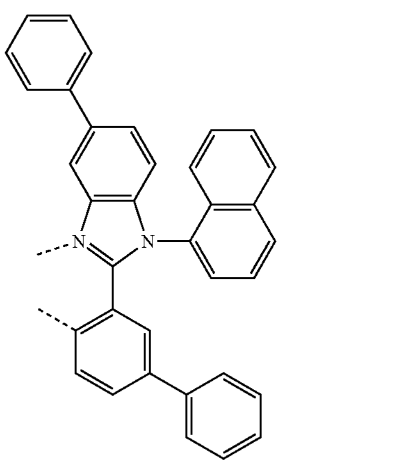
L2-346
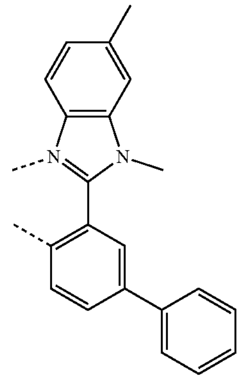
L2-347
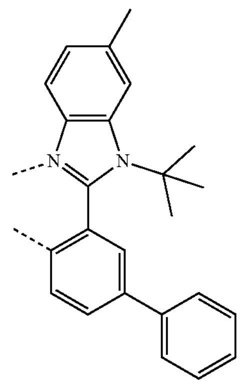
L2-348
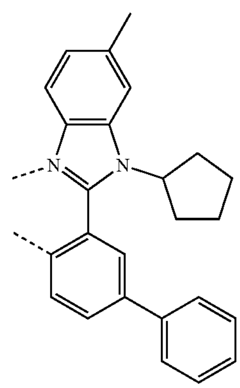
L2-349
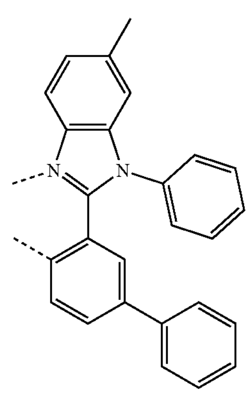

-continued
L2-350
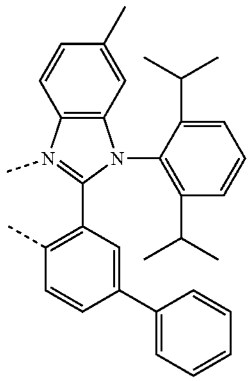
L2-351
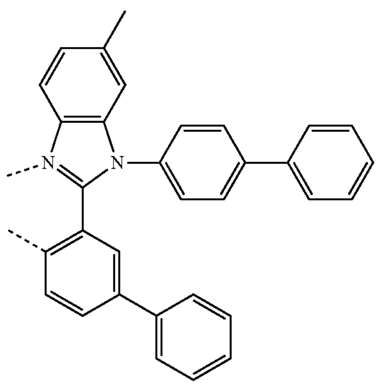
L2-352
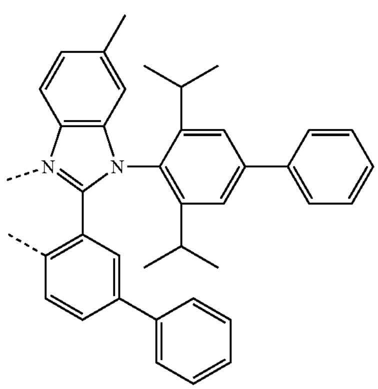
L2-353
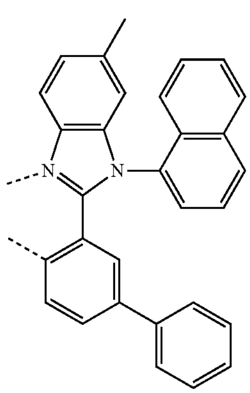
-continued
L2-354
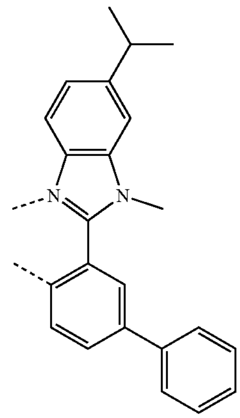
L2-355
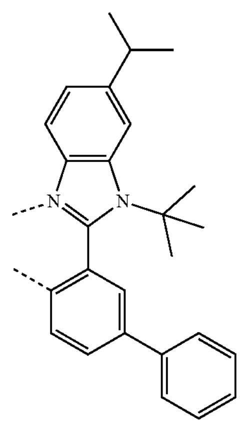
L2-356
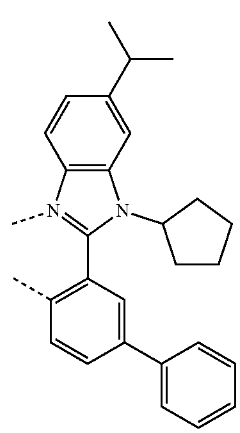

-continued
L2-357
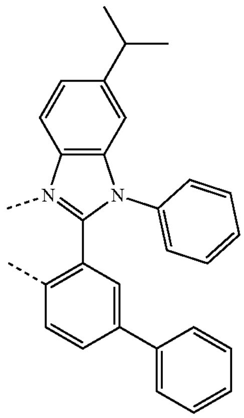
L2-358
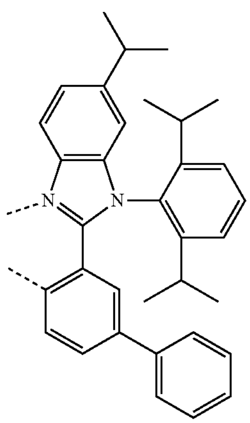
L2-359
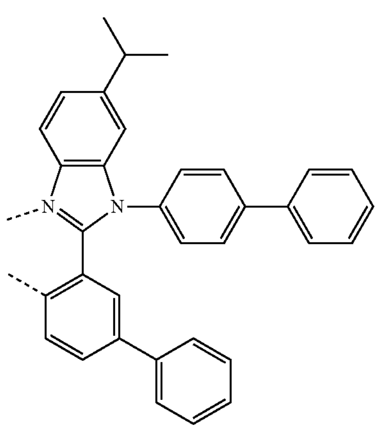
-continued
L2-360
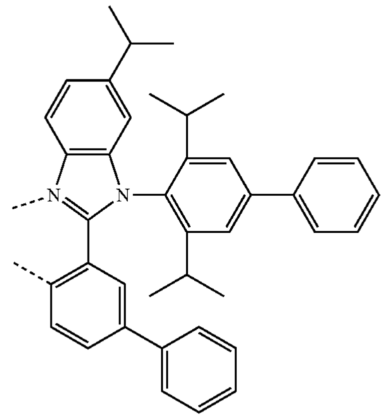
L2-361
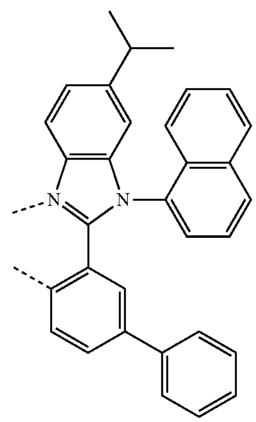
L2-362
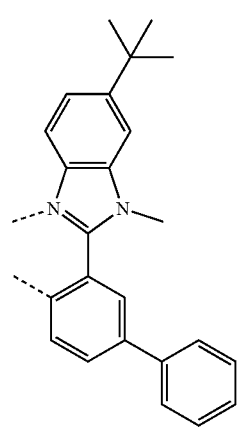

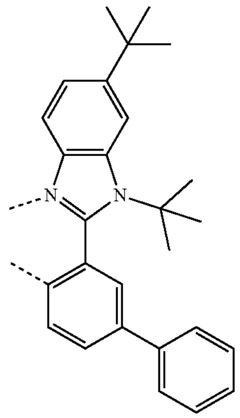
$L_{2\text{-}363}$
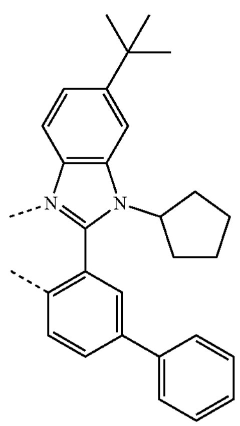
$L_{2\text{-}364}$
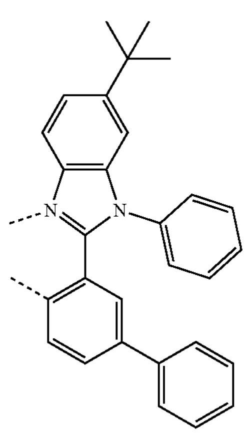
$L_{2\text{-}365}$
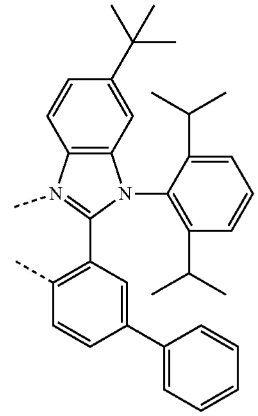
$L_{2\text{-}366}$
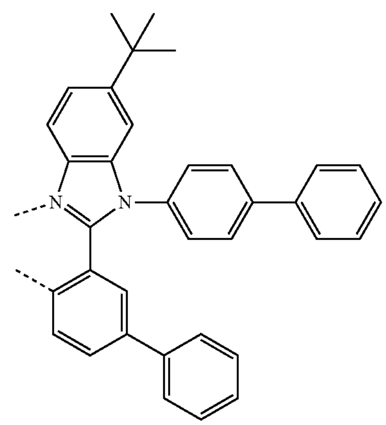
$L_{2\text{-}367}$
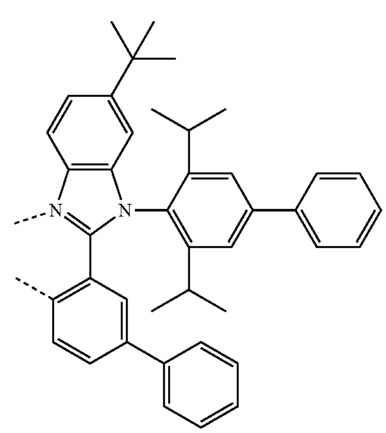
$L_{2\text{-}368}$ -continued
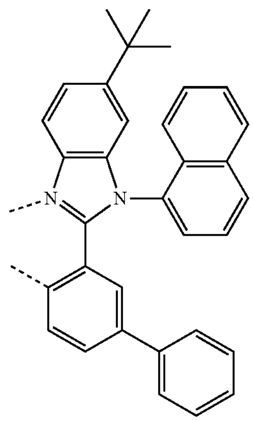
$L_{2-369}$
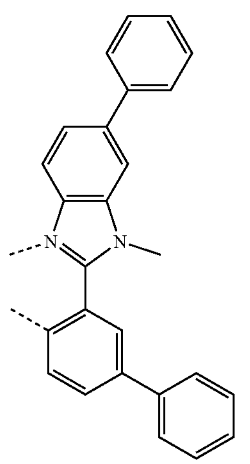
$L_{2-370}$
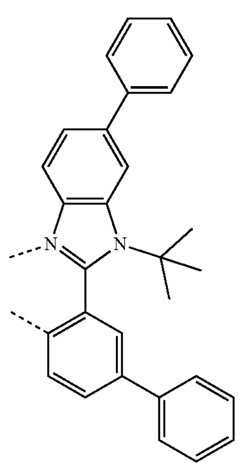
$L_{2-371}$
-continued
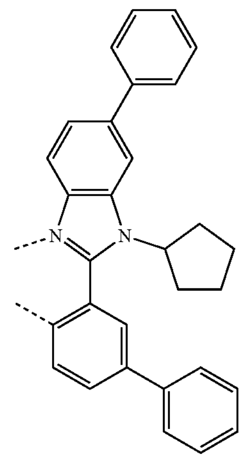
$L_{2-372}$
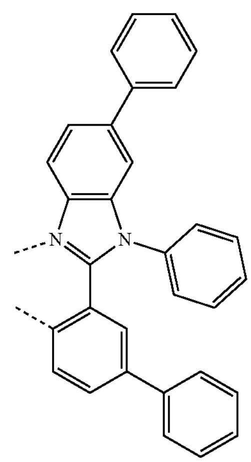
$L_{2-373}$
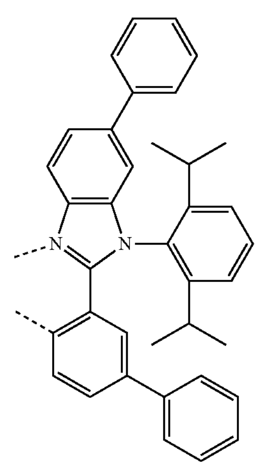
$L_{2-374}$ -continued

L2-375

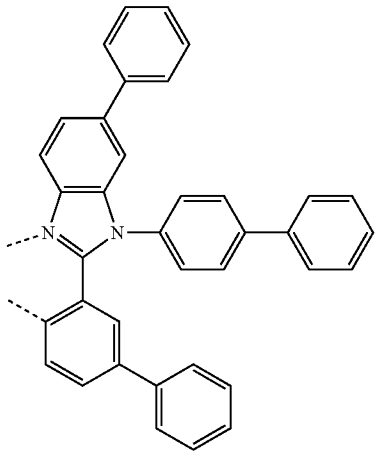

L2-376

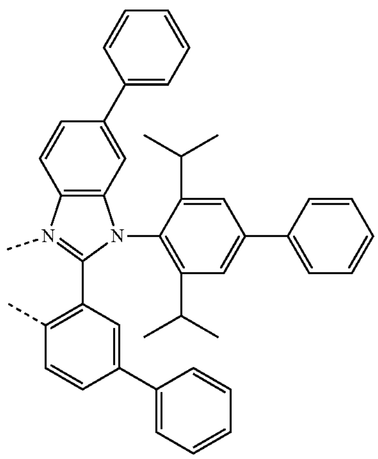

L2-377

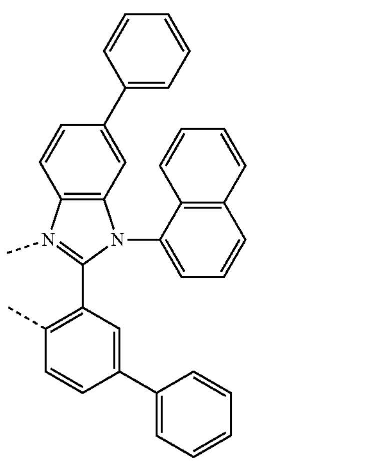

In the organometallic compound represented by Formula 1, $L_1$ may be a ligand represented by Formula 2-1, and $L_2$ may include a ligand represented by Formula 2-2. The organometallic compound is a heteroleptic organometallic compound.

By introducing at least one of a Si-containing group or a Ge-containing group to a pyridine ring in Formula 2-1, the energy level may be easily controlled, and by including a condensed ring as an upper ligand in Formula 2-2, the external luminescence efficiency may be substantially improved.

By introducing at least one of a Si-containing group or a Ge-containing group into a pyridine ring in Formula 2-1, the molecular orientation and electron mobility of the organometallic compound represented by Formula 1 are greatly improved as compared to a pyridine ring that is not substituted with a Si-containing group or a Ge-containing group, and thus, the external quantum efficiency of an electron device including the organometallic compound, for example, an organic light-emitting device including the organometallic compound may be improved.

By including a condensed ring as an upper ligand in Formula 2-2, compared to a ligand including a non-condensed ring, electrons are delocalized, providing electric stability and a rigid skeleton structure. Accordingly, the lifespan of an electron device including the organometallic compound, for example, an organic light-emitting device including the organometallic compound may be prolonged.

The highest occupied molecular orbital (HOMO) energy level, lowest unoccupied molecular orbital (LUMO) energy level, bandgap, $S_1$ energy level, and $T_1$ energy level of several compounds among organometallic compounds represented by Formula 1 were evaluated by using Gaussian 09 program with molecular structure optimization by density functional theory (DFT) based on B3LYP. Results thereof are shown in Table 2.

TABLE 2

| Compound No. | HOMO (eV) | LUMO (eV) | $S_1$ (eV) | $T_1$ (eV) |
|---|---|---|---|---|
| 1 | −4.511 | −1.062 | 2.821 | 2.590 |
| 15 | −4.498 | −1.075 | 2.827 | 2.593 |
| 1886 | −4.644 | −1.075 | 2.844 | 2.598 |
| 1895 | −4.661 | −1.095 | 2.848 | 2.594 |
| 1900 | −4.666 | −1.091 | 2.848 | 2.601 |
| 1994 | −4.667 | −1.122 | 2.847 | 2.607 |
| 3394 | −4.652 | −1.091 | 2.848 | 2.607 |
| 3408 | −4.673 | −1.102 | 2.852 | 2.609 |
| 3785 | −4.575 | −1.028 | 2.854 | 2.584 |
| 5670 | −4.752 | −1.044 | 2.876 | 2.592 |
| 7178 | −4.759 | −1.052 | 2.880 | 2.601 |

From Table 2, it is confirmed that the organometallic compound represented by Formula 1 has such electric characteristics that are suitable for use as a dopant for an electric device, for example, an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer between the first electrode and the second electrode and including an emission layer and at least one of the organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit green light, for example, green light having a maximum emission wavelength of 470 nm or more (for example, equal to or greater than about 470 nm and less than or equal to about 550 nm).

The expression "(an organic layer) includes at least one of the organometallic compound" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, both Compound 1 and Compound 2 may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region between the first electrode and the emission layer and an electron transport region between the emission layer and the second electrode, and the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be located between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one m-MTDATA, TDATA, 2-TNATA, NPB, β-NPB, TPD, Spiro-TPD, Spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:
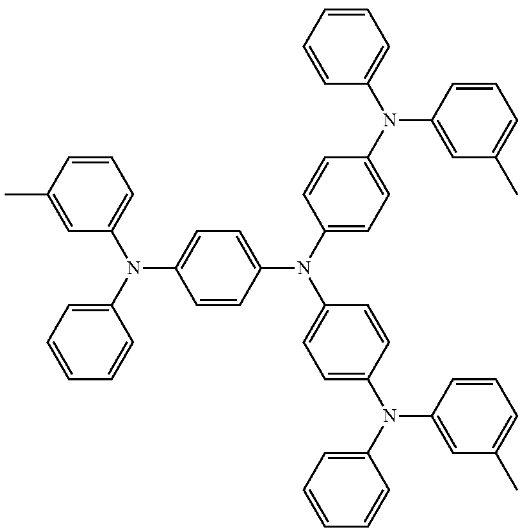
m-MTDATA
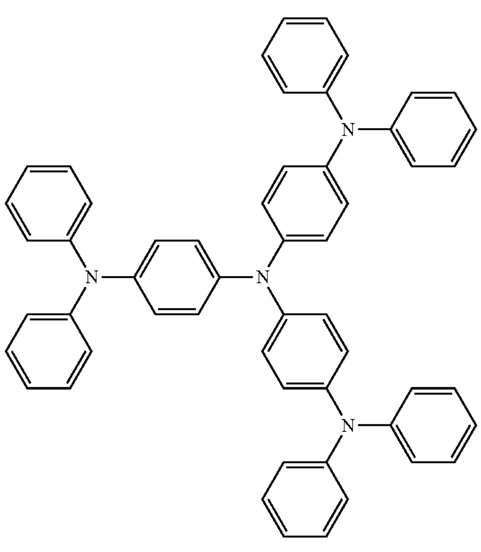
TDATA
-continued
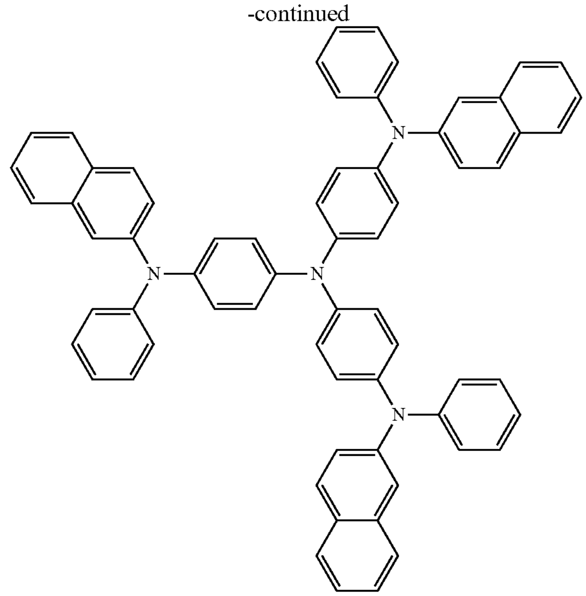
2-TNATA
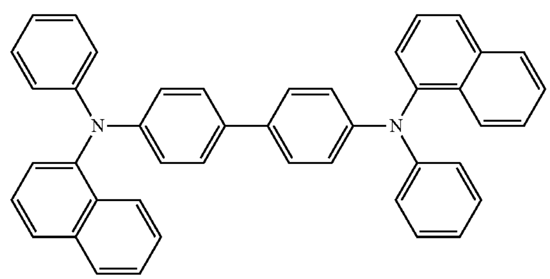
NPB
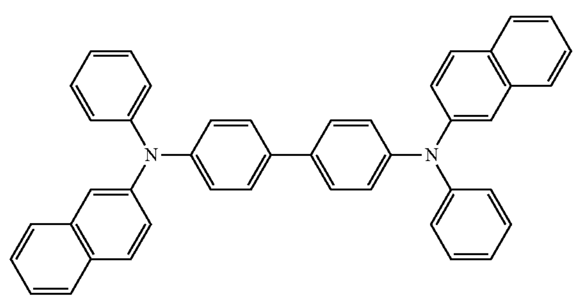
β-NPB
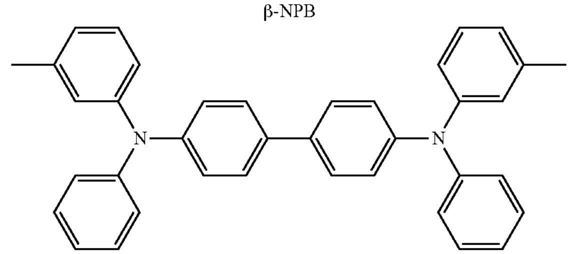
TPD -continued

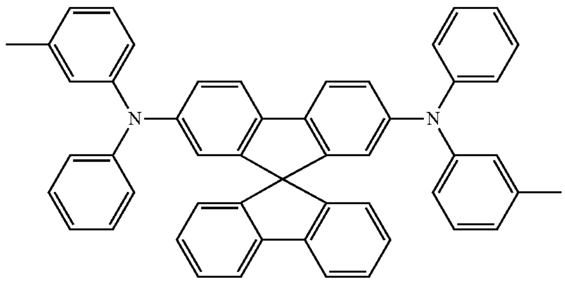

Spiro-TPD

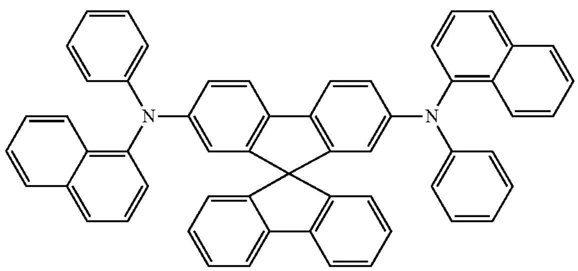

Spiro-NPB

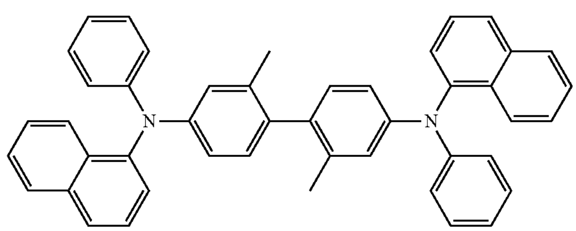

methylated NPB

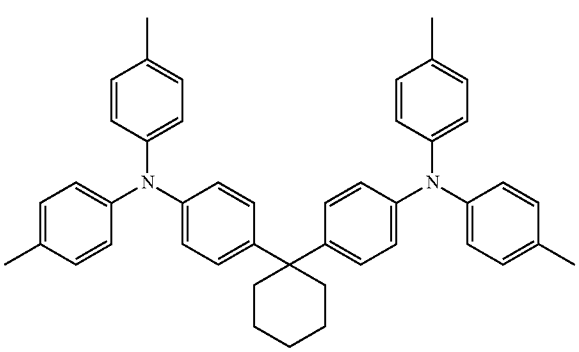

TAPC

-continued

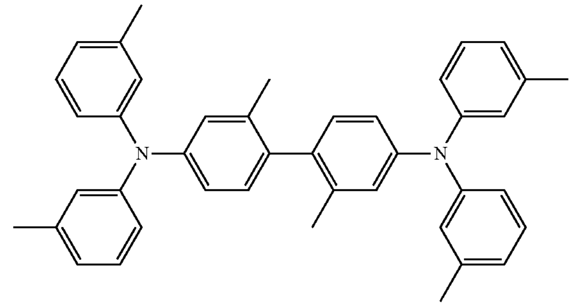

HMTPD

Formula 201

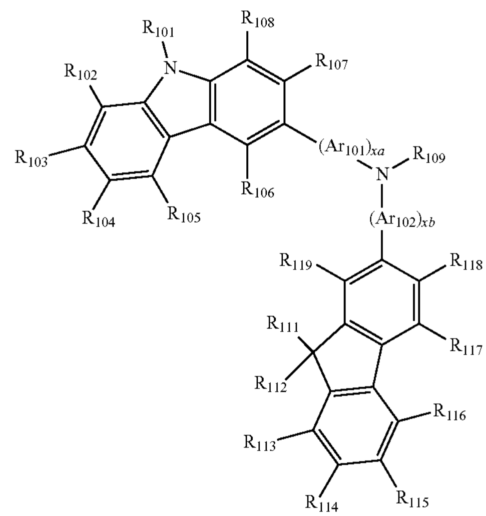

Formula 202

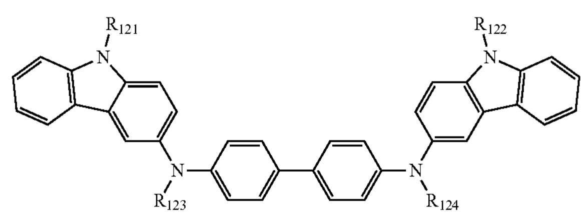

$Ar_{101}$ to $Ar_{102}$ in Formula 201 may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, or any combination thereof;

a phenyl group, a naphthyl group, an anthracenyl group, a fluorenyl group, a pyrenyl group or any combination thereof; or a phenyl group, a naphthyl group, an anthracenyl group, a fluorenyl group, a pyrenyl group, or any combination thereof, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, or any combination thereof, but embodiments of the present disclosure are not limited thereto.

$R_{109}$ in Formula 201 may be:

a phenyl group, a naphthyl group, an anthracenyl group, or a pyridinyl group; or a phenyl group, a naphthyl group, an anthracenyl group, or a pyridinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, or a pyridinyl group.

According to an embodiment, the compound represented by Formula 201 may be represented by Formula 201A below, but embodiments of the present disclosure are not limited thereto:

Formula 201A

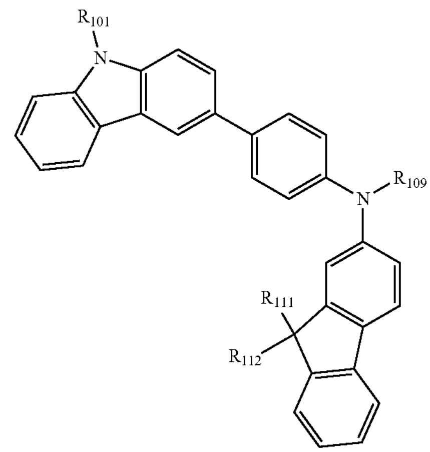

$R_{101}$, $R_{111}$, $R_{112}$, and $R_{109}$ in Formula 201A may be understood by referring to the description provided herein.

For example, the compound represented by Formula 201 and the compound represented by Formula 202 may include compounds HT1 to HT20 illustrated below, but are not limited thereto:

HT1

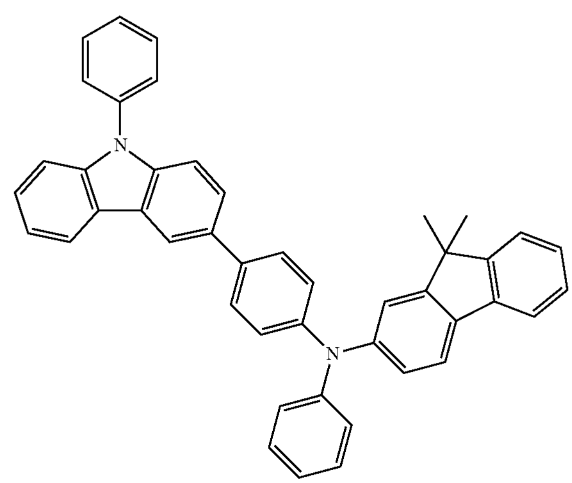

-continued
HT2
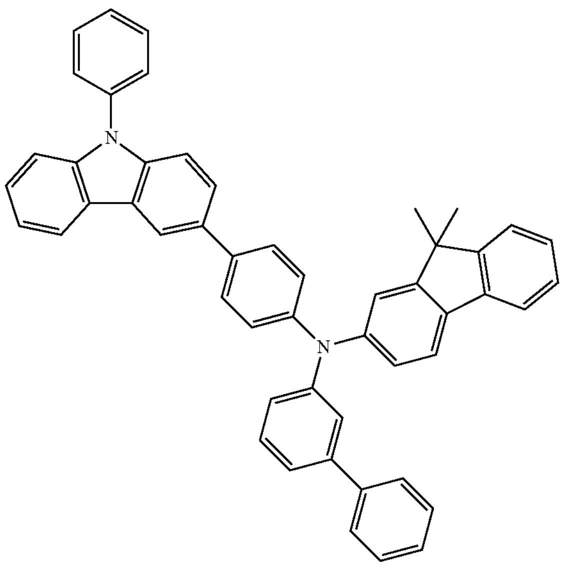
-continued
HT4
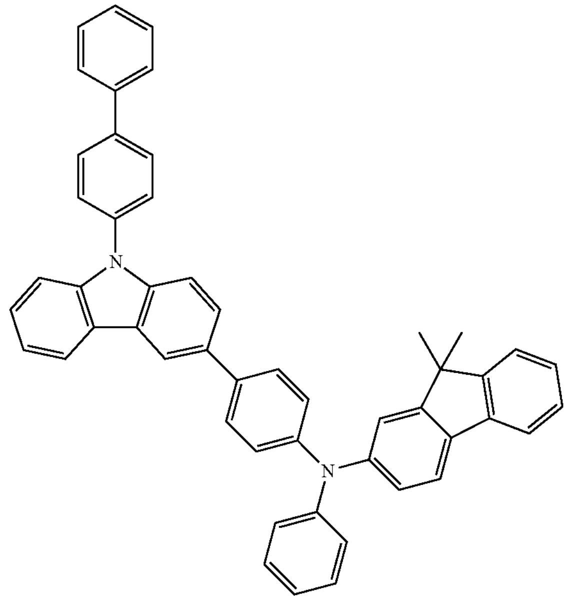
HT3
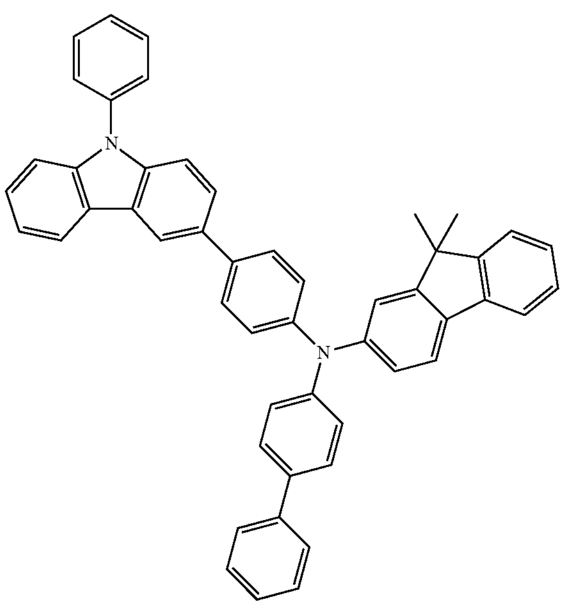
HT5
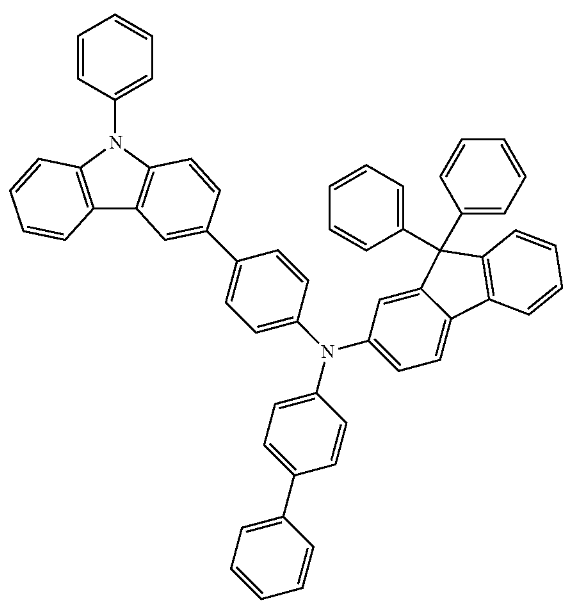

HT6
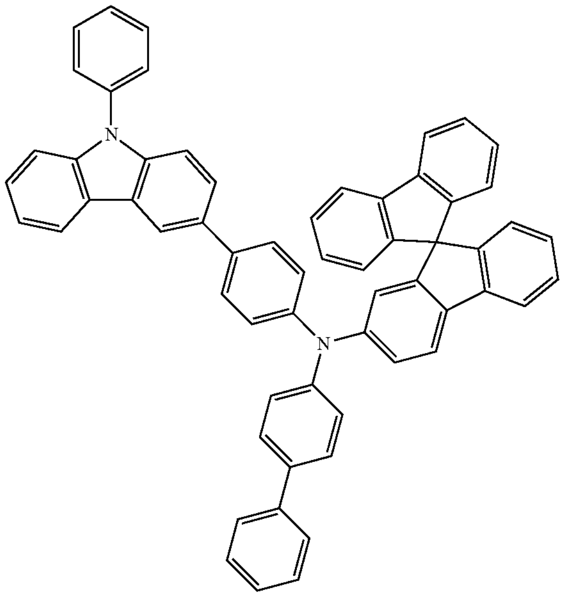
HT7
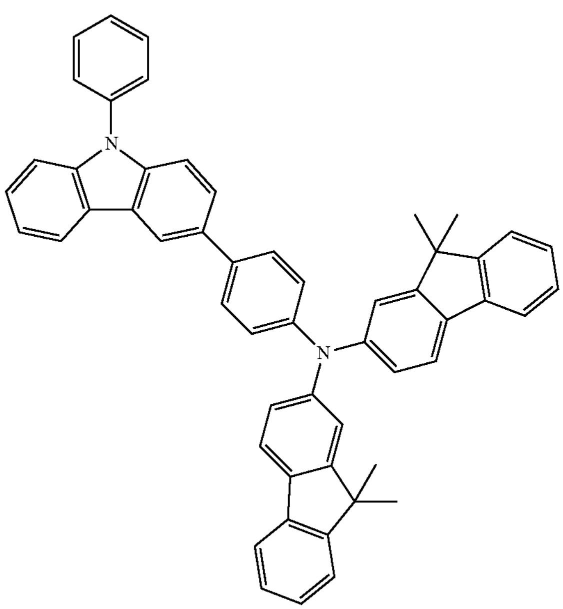
HT8
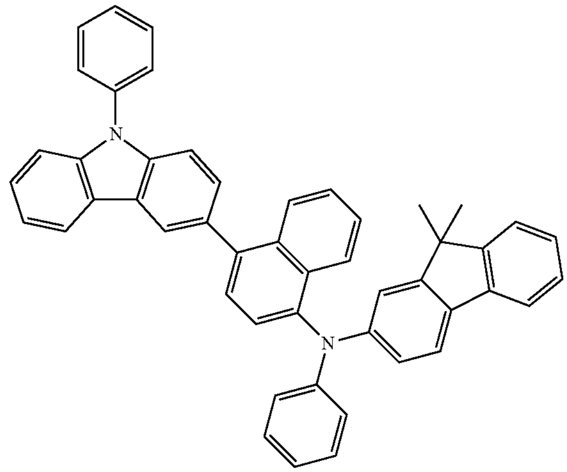
HT9
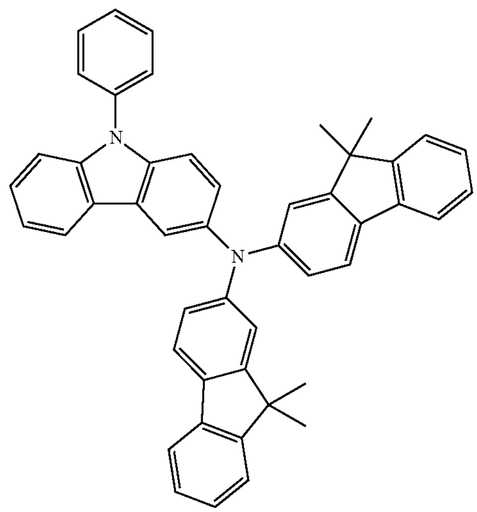
HT10
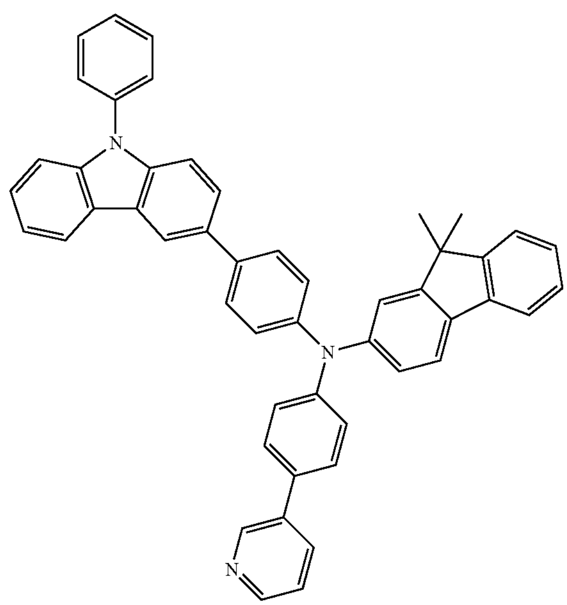

-continued
HT11
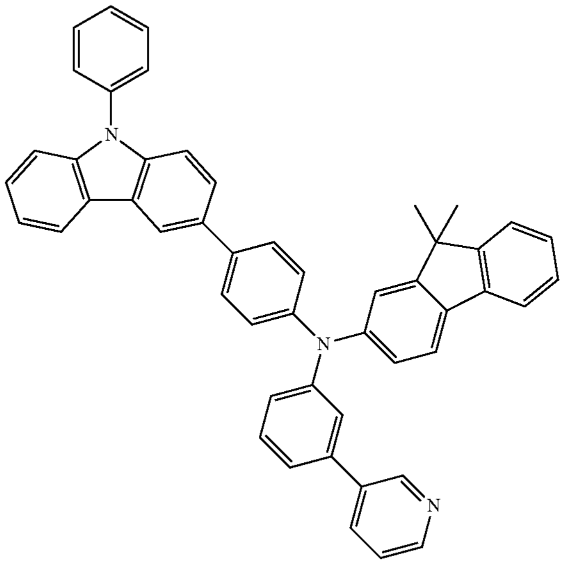
HT12
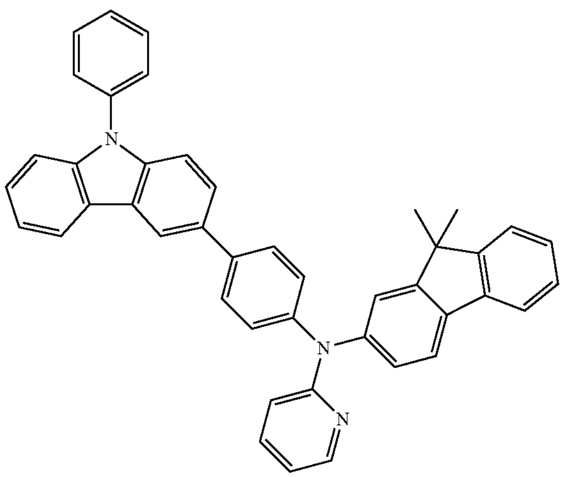
HT13
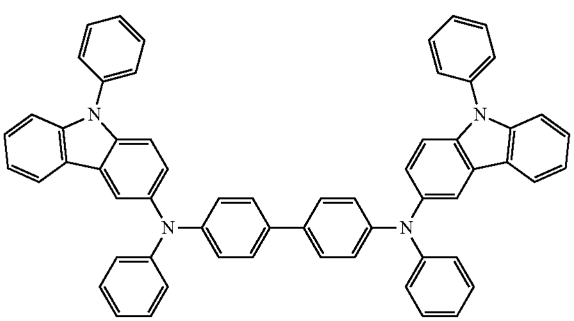
-continued
HT14
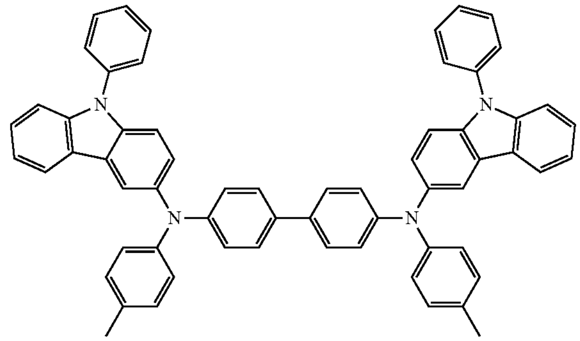
HT15
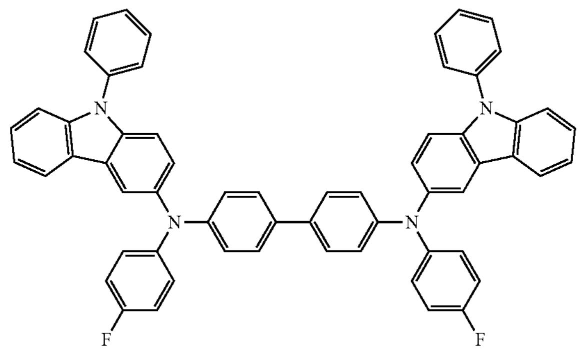
HT16
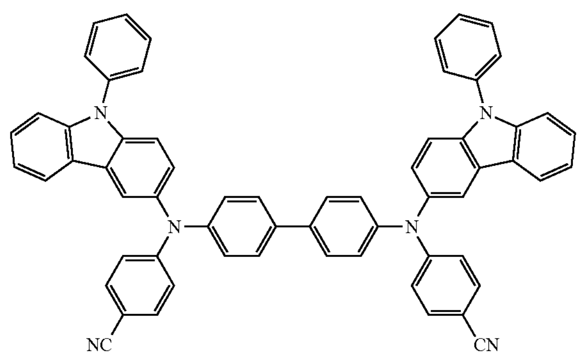
HT17
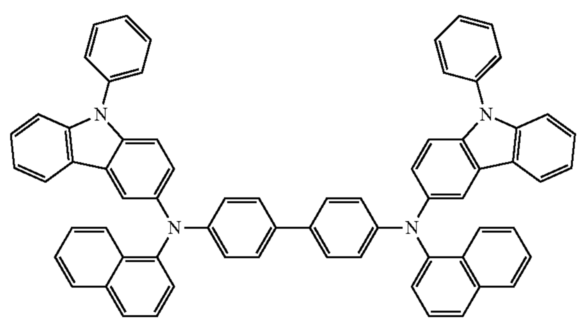

-continued

HT18

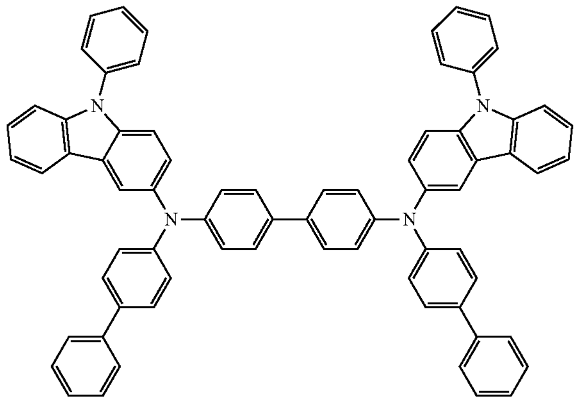

HT19

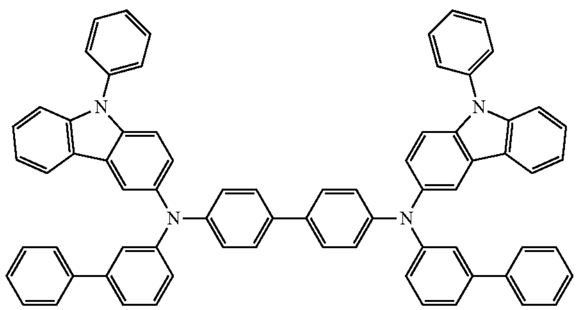

HT20

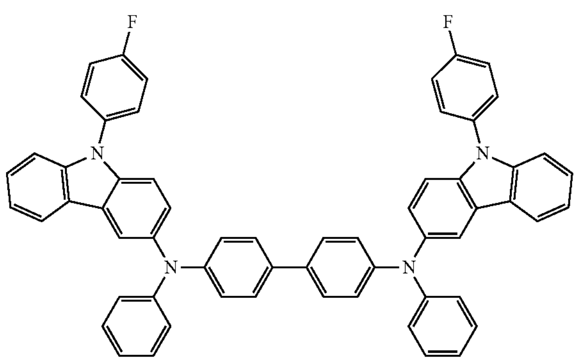

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one a quinone derivative, a metal oxide, and a cyano group-containing compound, but embodiments of the present disclosure are not limited thereto. Examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto.

HT-D1

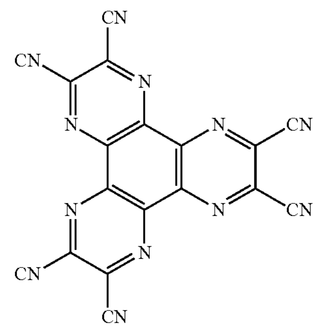

F4-TCNQ

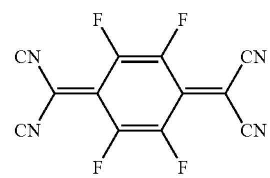

The hole transport region may further include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

Meanwhile, when the hole transport region includes an electron blocking layer, a material for the electron blocking layer may be materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one TPBi, TBADN, ADN (also referred to as "DNA"), CBP, CDBP, TCP, mCP, and Compound H50 to Compound H52:

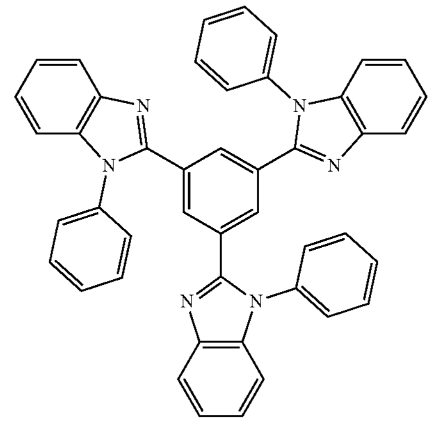
TPBi
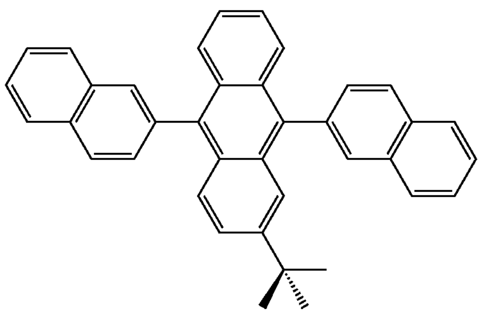
TBADN
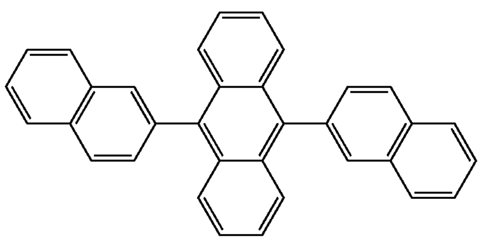
ADN
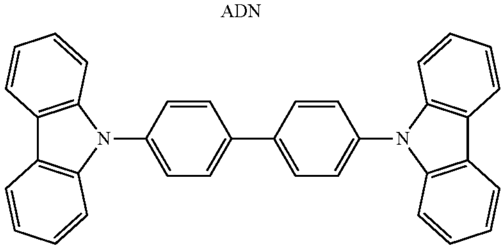
CBP
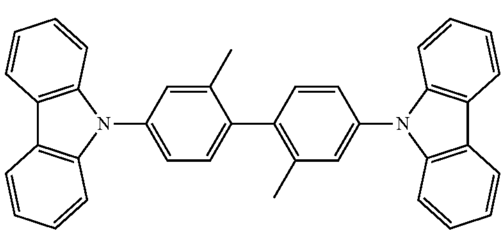
CDBP
-continued
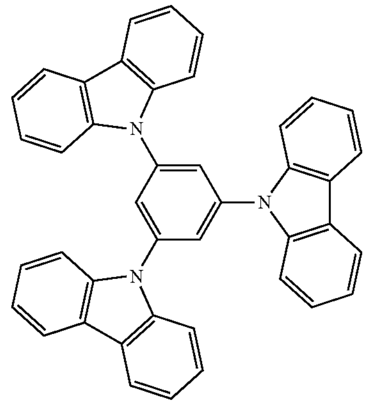
TCP
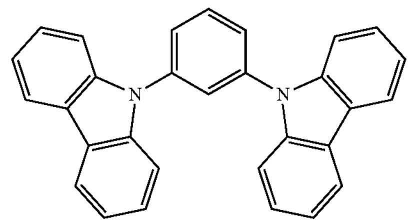
mCP
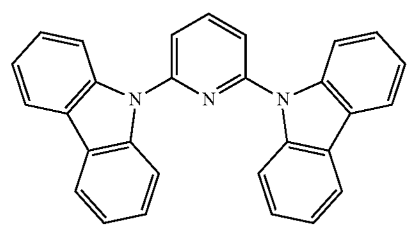
H50
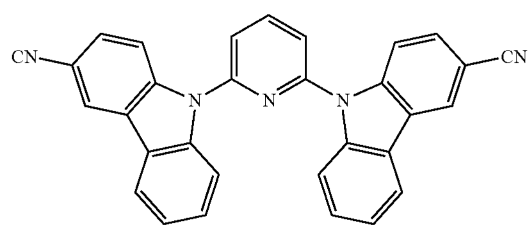
H51
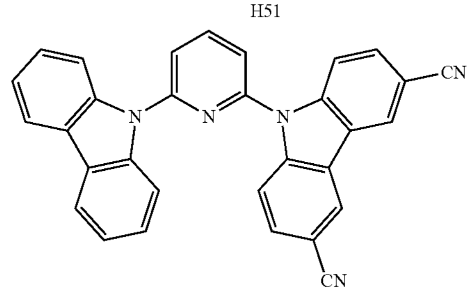
H52
In one or more embodiments, the host may further include a compound represented by Formula 301 below.

Formula 301

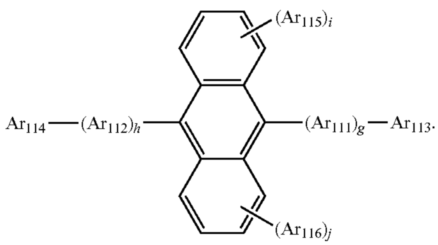

$Ar_{111}$ and $Ar_{112}$ in Formula 301 may each independently be:

a phenylene group, a naphthylene group, a phenanthrenylene group, a pyrenylene group, or any combination thereof; or a phenylene group, a naphthylene group, a phenanthrenylene group, a pyrenylene group, or any combination thereof, each substituted with at least one of a phenyl group, a naphthyl group, an anthracenyl group, or any combination thereof.

$Ar_{113}$ to $Ar_{116}$ in Formula 301 may each independently be:

a $C_1$-$C_{10}$ alkyl group, a phenyl group, a naphthyl group, a phenanthrenyl group, a pyrenyl group, or any combination thereof; or a phenyl group, a naphthyl group, a phenanthrenyl group, a pyrenyl group, or any combination thereof, each substituted with at least one a phenyl group, a naphthyl group, an anthracenyl group, or any combination thereof.

g, h, i, and j in Formula 301 may each independently be an integer from 0 to 4 and may be, for example, 0, 1, or 2.

$Ar_{113}$ to $Ar_{116}$ in Formula 301 may each independently be:

a $C_1$-$C_{10}$ alkyl group, substituted with at least one a phenyl group, a naphthyl group, an anthracenyl group, or any combination thereof;

a phenyl group, a naphthyl group, an anthracenyl group, a pyrenyl, a phenanthrenyl group, a fluorenyl group, or any combination thereof;

a phenyl group, a naphthyl group, an anthracenyl group, a pyrenyl group, a phenanthrenyl group, a fluorenyl group, or any combination thereof, each substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or any combination thereof; or

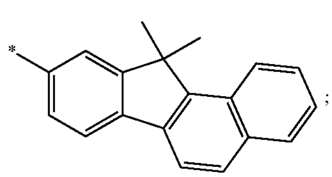 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

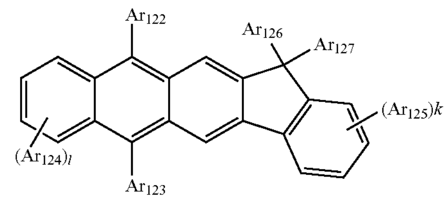

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, Balq, or any combination thereof, but embodiments of the present disclosure are not limited thereto.

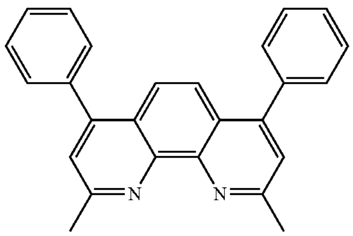

BCP

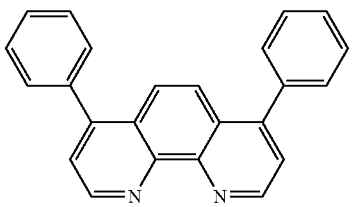

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include at least one BCP, Bphen, $Alq_3$, Balq, TAZ, NTAZ, or any combination thereof.

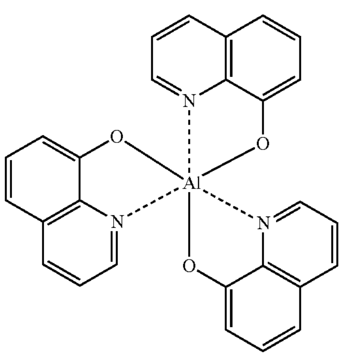

$Alq_3$

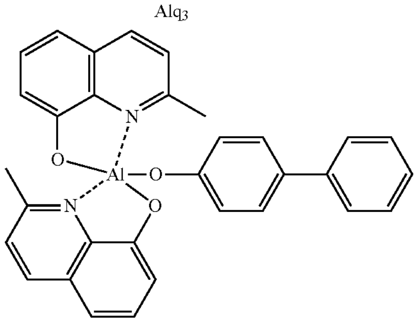

BAlq

-continued

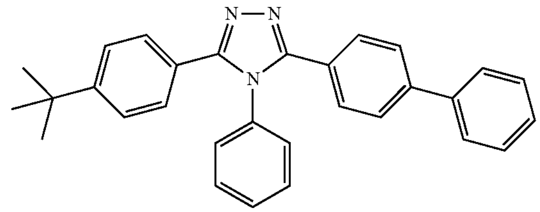

TAZ

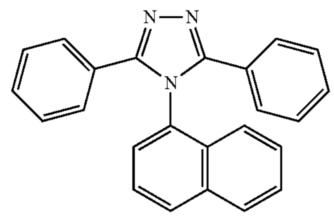

NTAZ

In one or more embodiments, the electron transport layer may include at least one of Compounds ET1 to ET25, but are not limited thereto:

ET1

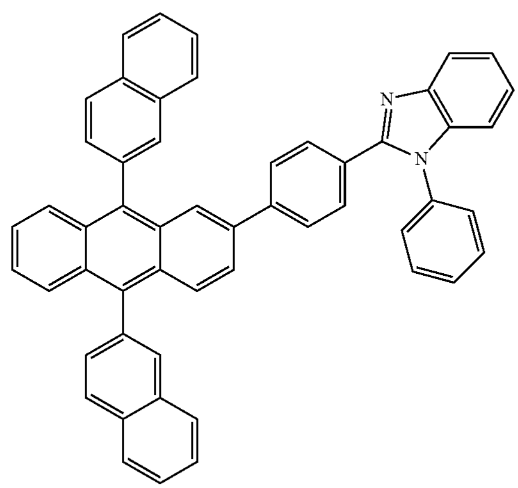

ET2

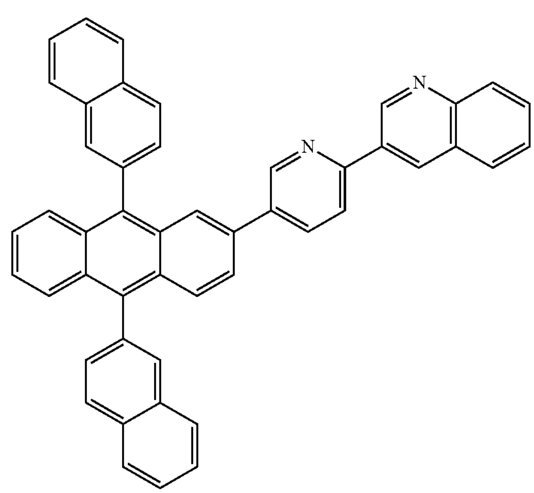

-continued
ET3
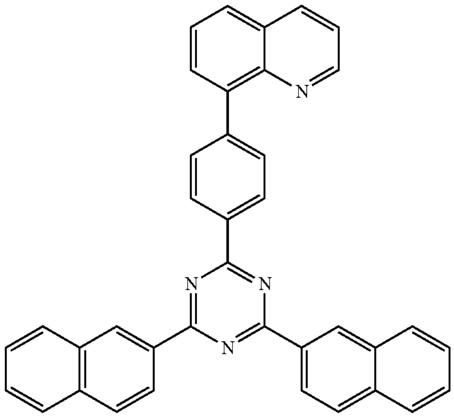
ET4
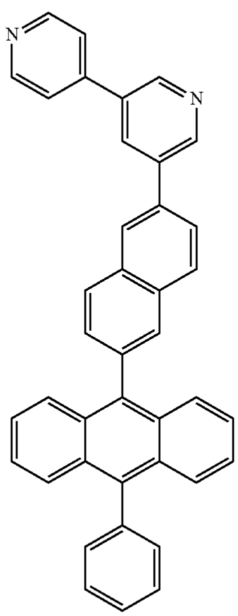
ET5
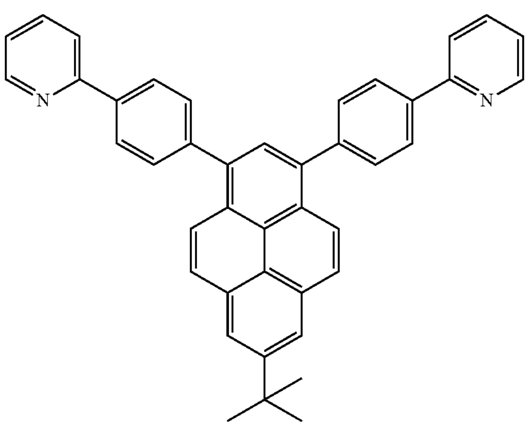
-continued
ET6
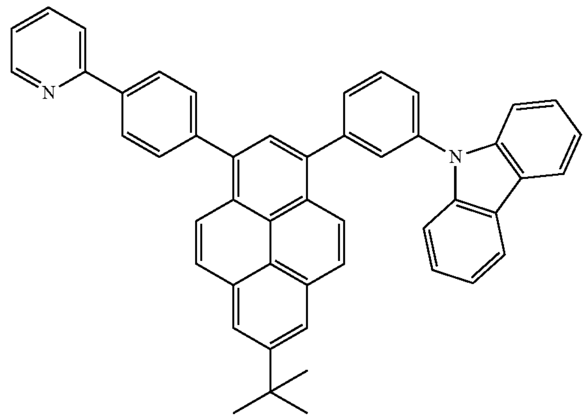
ET7
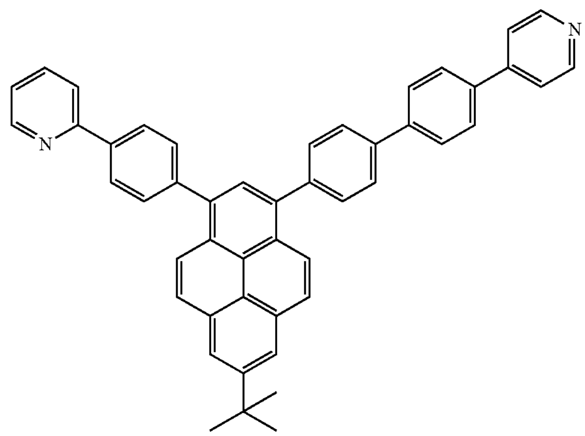
ET8
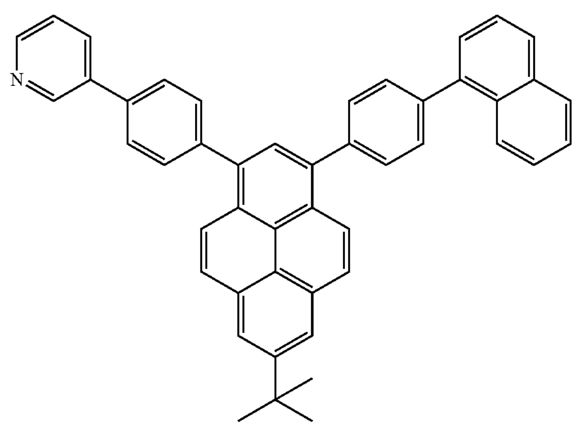

-continued
ET9
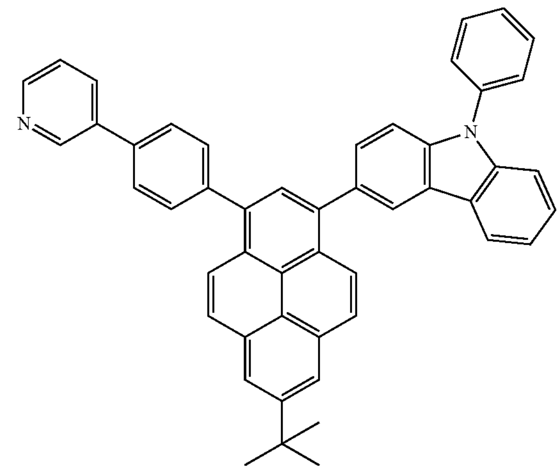
ET10
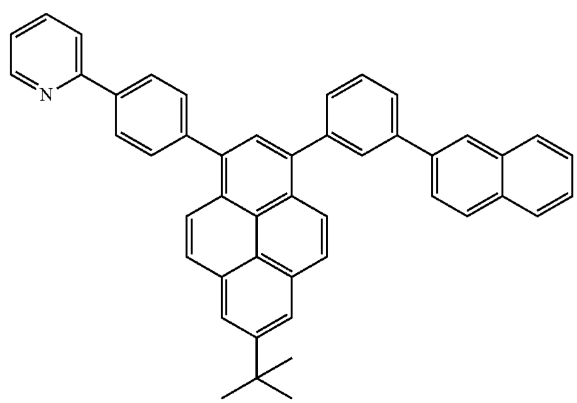
ET11
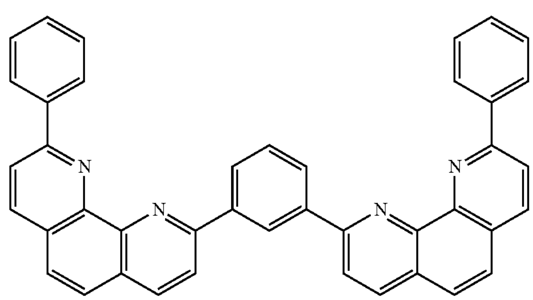
ET12
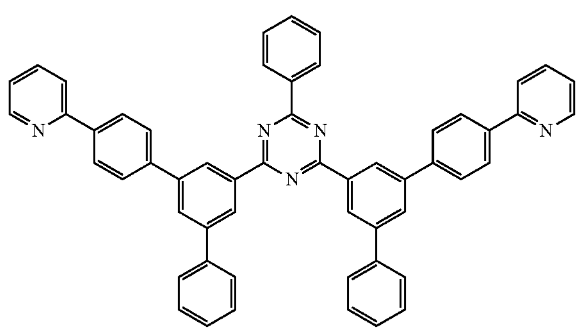
-continued
ET13
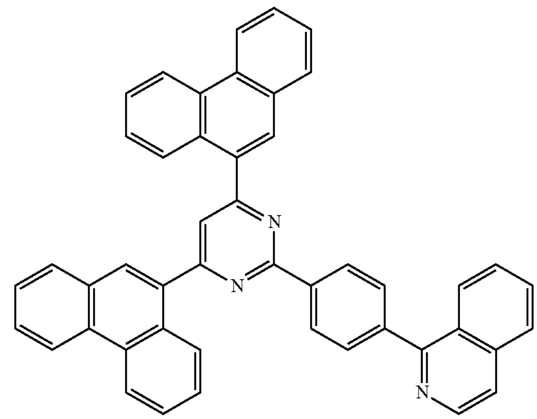
ET14
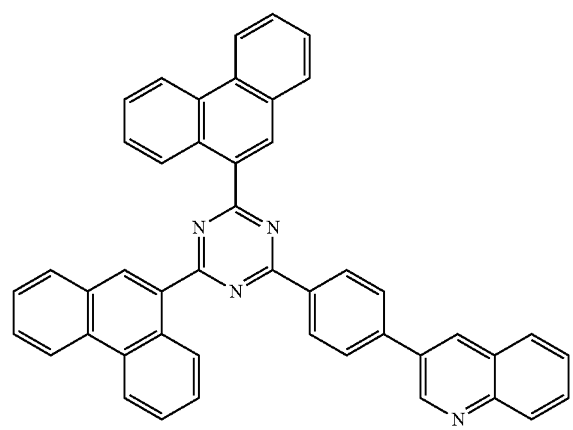
ET15
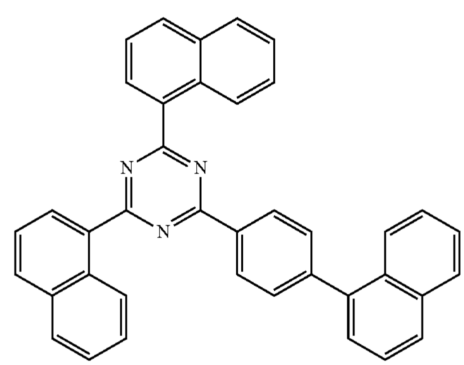

-continued
ET16
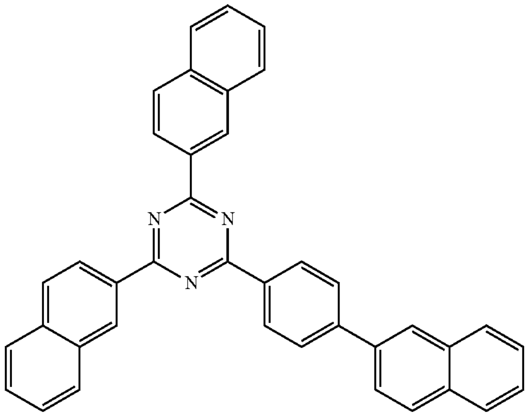
ET17
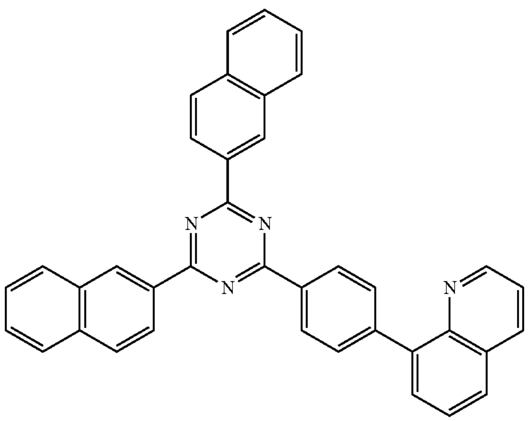
ET18
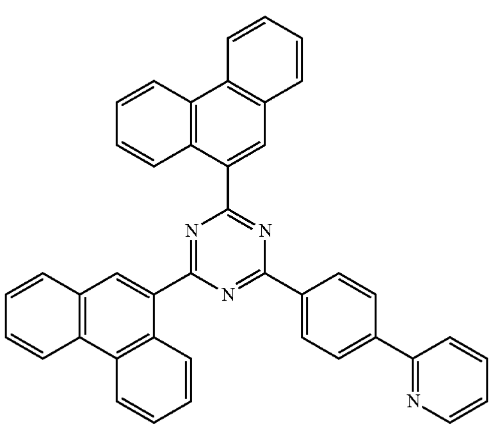
-continued
ET19
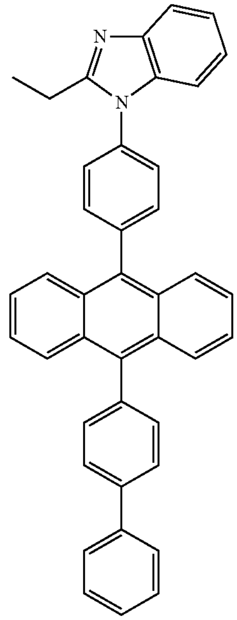
ET20
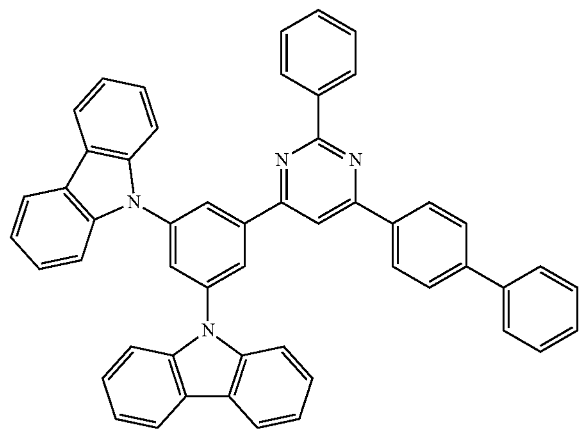
ET21
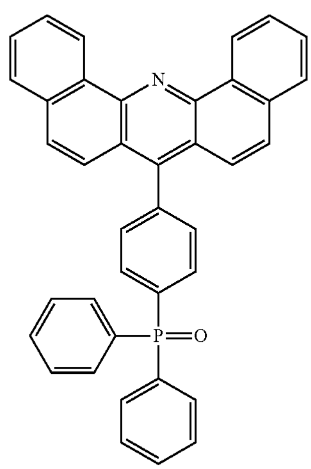

-continued

ET22

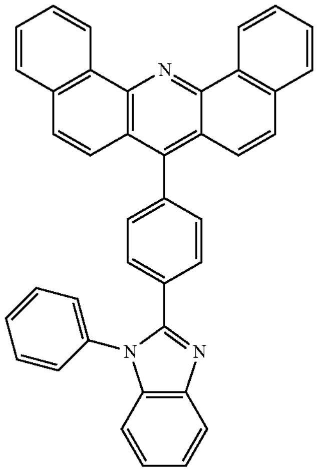

ET23

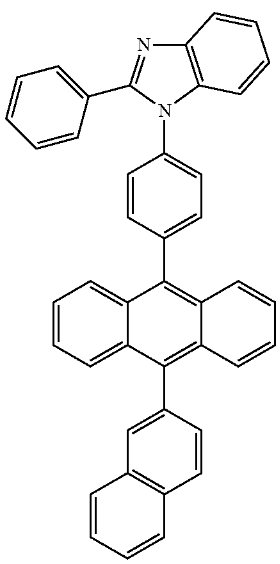

ET24

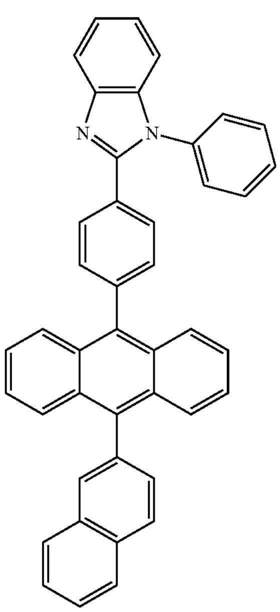

-continued

ET25

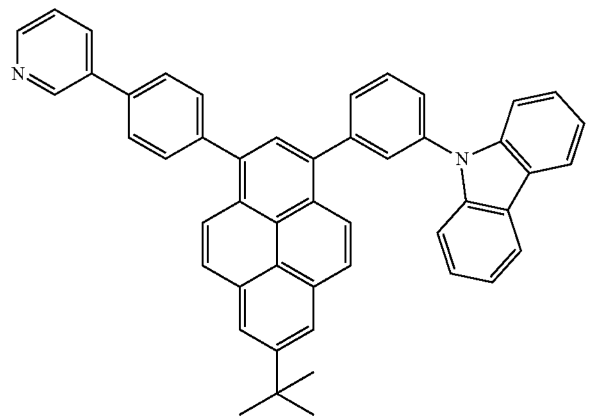

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

ET-D1

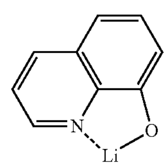

ET-D2

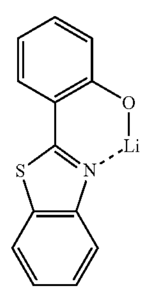

The electron transport region may include an electron injection layer that promotes flow of electrons from the second electrode 19 thereinto.

The electron injection layer may include at least one LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be a metal, an alloy, an electrically conductive compound, which has a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Another aspect provides a diagnostic composition including at least one of an organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one N, O, P, Si, B, Se, Ge, Te, S, or any combination thereof as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one N, O, P, Si, B, Se, Ge, Te, S, or any combination thereof as a ring-forming atom, 2 to 10 carbon atoms, and at least one double bond in its ring. Examples of the $C_2$-$C_{10}$ heterocycloalkenyl group are a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom N, O, P, Si, B, Se, Ge, Te, S, or any combination thereof as a ring-forming atom, and 1 to 60 carbon atoms. The term "$C_1$-$C_{60}$ heteroarylene group" as used herein refers to a divalent group having a carbocyclic aromatic system that has at least one N, O, P, B, Se, Ge, Te, S, or any combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom N, O, P, Si, and S, other than carbon atoms, as a ring-forming atom, and no aromaticity in its entire molecular structure. The monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one N, O, P, Si, B, Se, Ge, Te, S, or any combination thereof other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, or any combination thereof; and $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, and $—P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

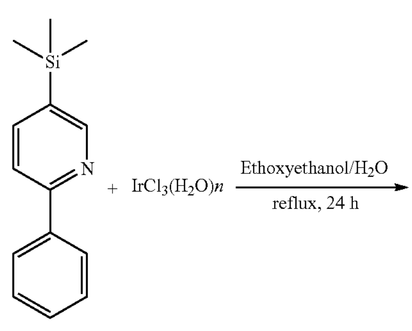

-continued

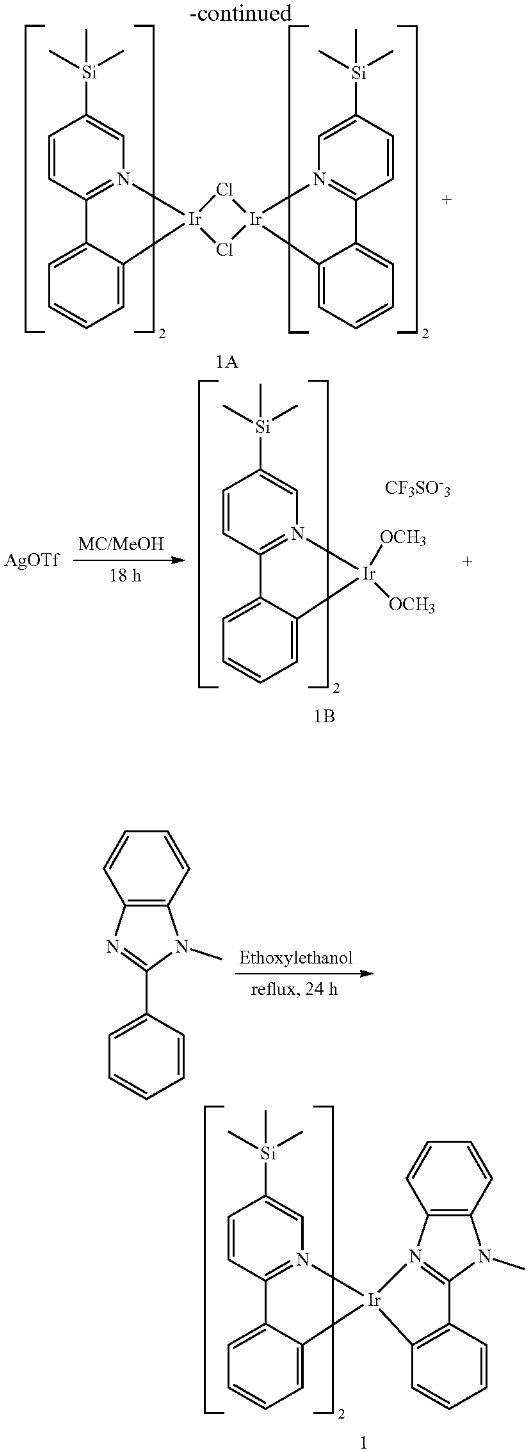

Synthesis of Compound 1A 2-phenyl-5-(trimethylsilyl)pyridine (7.5 g, 33.1 mmol) and iridium chloride (5.2 g, 14.7 mmol) were mixed with 120 mL of ethoxyethanol and 40 mL of distilled water, and then the mixture was stirred while refluxing for 24 hours and cooled to room temperature. A solid material formed therefrom was separated by filtration and washed thoroughly with water/methanol/hexane in the stated order to obtain a solid which was then dried in a vacuum oven to obtain 8.2 g(yield of 82%) of Compound $A_1$.

Synthesis of Compound 1B

Compound 1A (1.6 g, 1.2 mmol) was mixed with 45 mL of methylene chloride, and then AgOTf (0.6 g, 2.3 mmol) were mixed with 15 mL of methanol and added thereto. Subsequently, the mixture was stirred for 18 hours at room temperature while blocking light with aluminum foil, and then a solid (Compound 1B) obtained by removing a solid formed by celite filtration and concentrating a filtrate was used in the next reaction without additional purification.

Synthesis of Compound 1

Compound 1B (2.0 g, 2.3 mmol) and 1-methyl-2-phenyl-1H-benzo[d]imidazole (0.6 g, 2.8 mmol) were mixed with 100 mL of 2-ethoxyethanol, and then the mixture was stirred while refluxing for 24 hours and cooled to room temperature. A compound obtained therefrom was concentrated to obtain a solid which was then subject to column chromatography (eluent: methylene chloride (MC) and hexane) to obtain 0.9 g (yield of 46%) of Compound 1. The substance was identified by Mass and HPLC analysis.

HRMS(MALDI) calcd for C42H43IrN4Si2: m/z 852.2 Found: 852.3

Synthesis Example 2 (Compound 15)

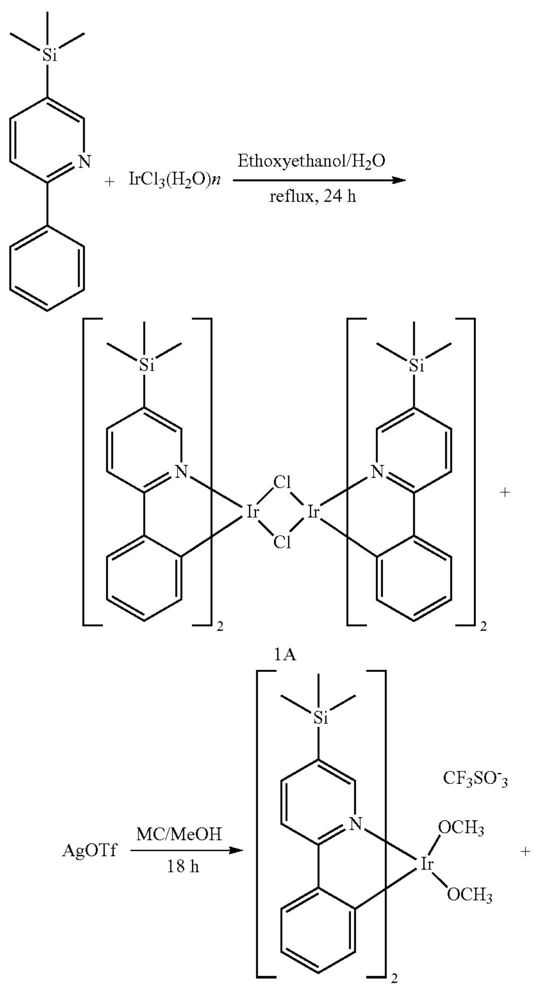

1B

-continued

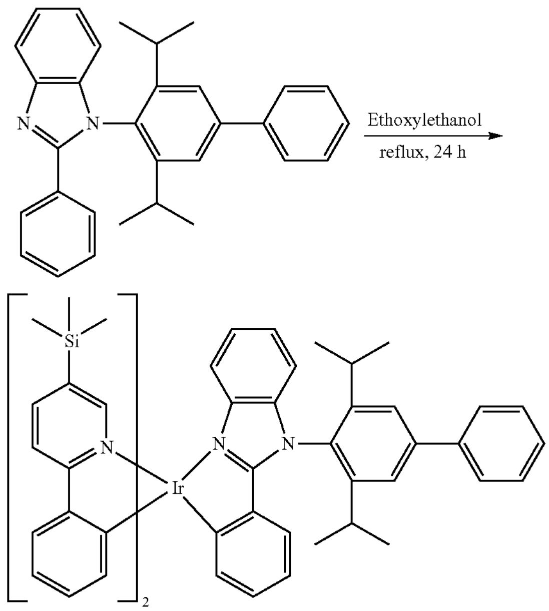

15

Synthesis of Compound 15

Compound 15 (yield of 37%) was obtained by using the same method as the synthesis method of Compound 1 of Synthesis Example 1, except that 1-(3,5-diisopropyl-[1,1'-biphenyl]-4-yl)-2-phenyl-1H-benzo[d]imidazole was used instead of 1-methyl-2-phenyl-1H-benzo[d]imidazole. The substance was identified by Mass and HPLC analysis.

HRMS(MALDI) calcd $C_{59}$H61IrN4Si2: m/z 1074.5 Found: 1074.4 Synthesis Example 3 (Compound 1886)

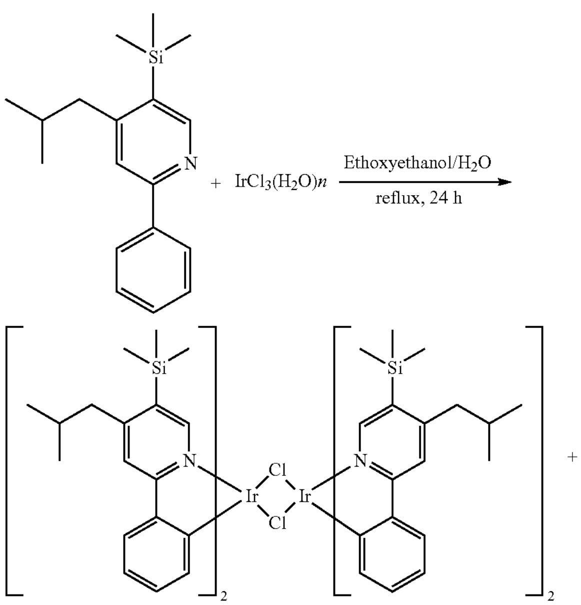

1886A

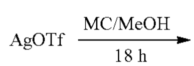

-continued

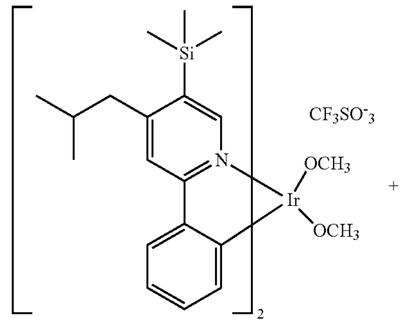

1886B

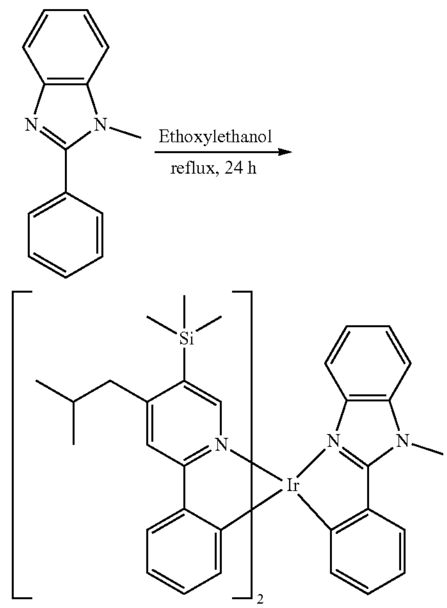

1886

Synthesis of Compound 1886A

Compound 1886A (yield of 87%) was obtained by using the same method as the synthesis method of Compound 1A of Synthesis Example 1, except that 4-isobutyl-2-phenyl-5-(trimethylsilyl)pyridine was used instead of 2-phenyl-5-(trimethylsilyl)pyridine.

Synthesis of Compound 1886B

Compound 1886B was obtained by using the same method as the synthesis method of Compound 1B of Synthesis Example 1, except that Compound 1886A was used instead of Compound 1A. Obtained Compound 1886B was used in the next reaction without additional purification.

Synthesis of Compound 1886

Compound 1886 (yield of 36%) was obtained by using the same method as the synthesis method of Compound 1 of Synthesis Example 1, except that Compound 1886B was used instead of Compound 1B. The substance was identified by Mass and HPLC analysis.

HRMS(MALDI) calcd for C50H59IrN4Si2: m/z 964.4 Found: 964.4 Synthesis Example 4 (Compound 1895)

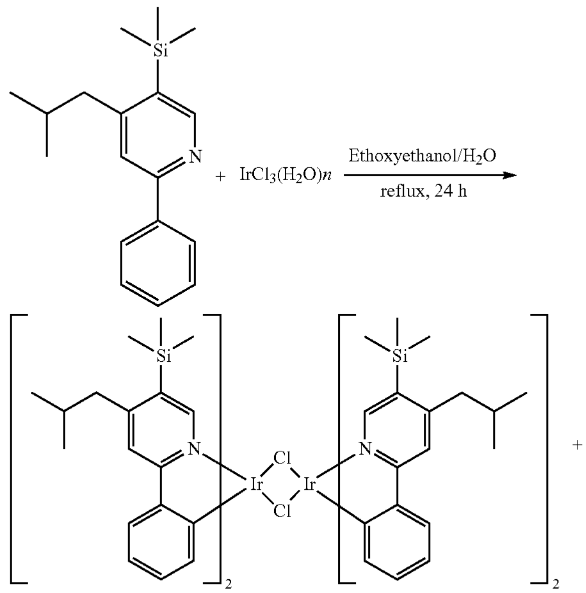

1886A

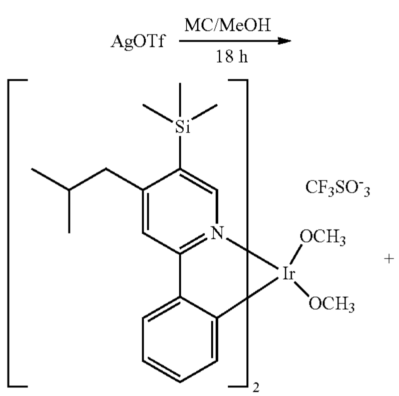

1886B

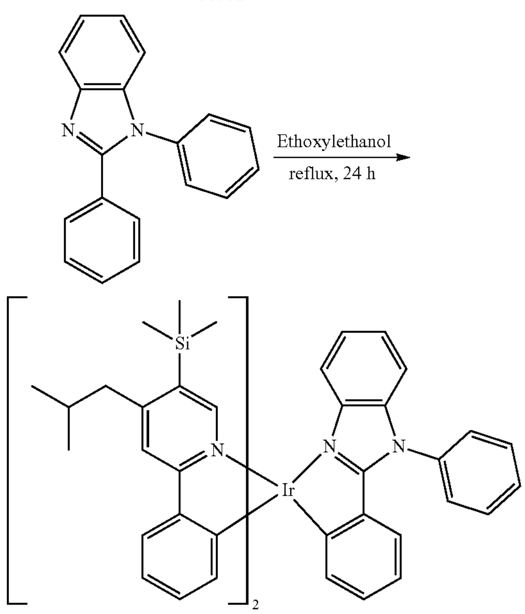

1895

Synthesis of Compound 1895

Compound 1895 (yield of 33%) was obtained by using the same method as the synthesis method of Compound 1886 of Synthesis Example 3, except that 1,2-diphenyl-1H-benzo[d]imidazole was used instead of 1-methyl-2-phenyl-1H-benzo[d]an imidazole. The substance was identified by Mass and HPLC analysis.

HRMS(MALDI) calcd for C55H61IrN4Si2: m/z 1026.5 Found: 1026.4 Synthesis Example 5 (Compound 1900)

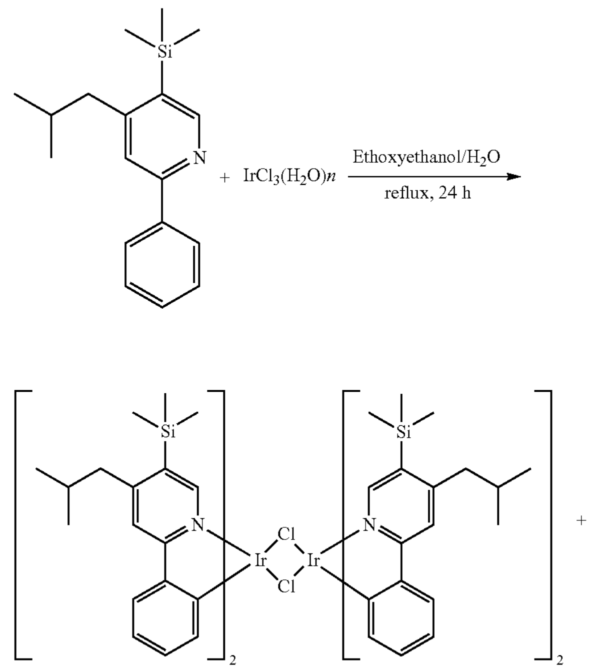

1886A

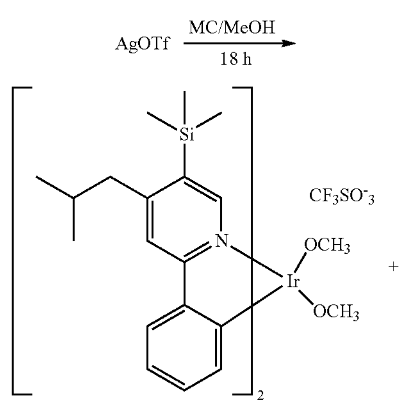

1886B

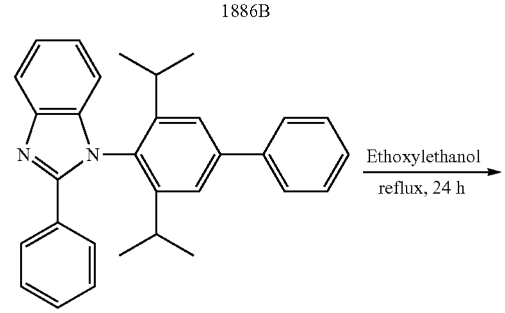

-continued

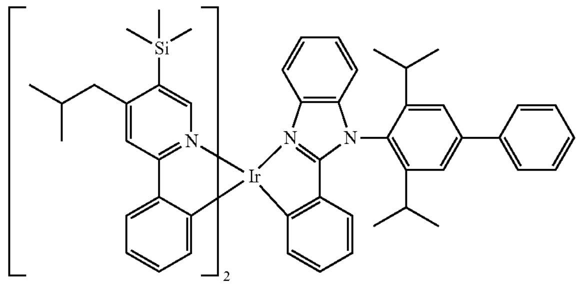

1900

Synthesis of Compound 1900

Compound 1900 (yield of 29%) was obtained by using the same method as the synthesis method of Compound 1886 of Synthesis Example 3, except that 1-(3,5-diisopropyl-[1,1'-biphenyl]-4-yl)-2-phenyl-1H-benzo[d]imidazole was used instead of 1-methyl-2-phenyl-1H-benzo[d]imidazole. The substance was identified by Mass and HPLC analysis.

HRMS(MALDI) calcd for C67H77IrN4Si2: m/z 1186.7 Found: 1186.5 Synthesis Example 6 (Compound 1994)

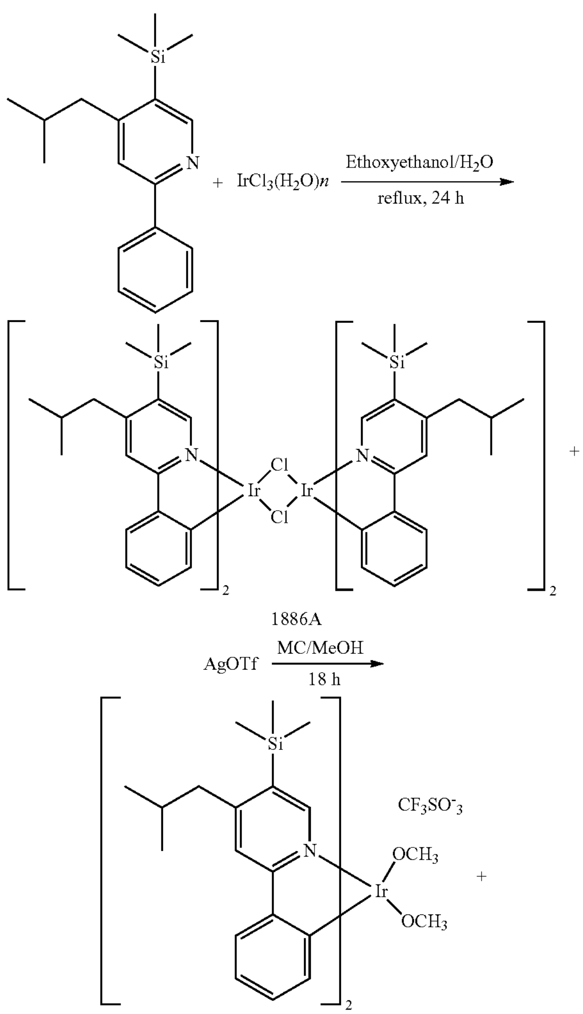

1886A

1886B

-continued

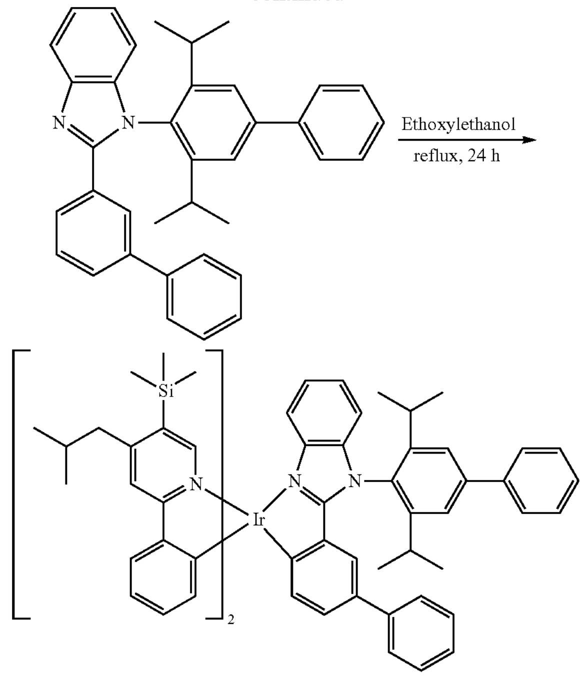

1994

Synthesis of Compound 1994

Compound 1994 (yield of 27%) was obtained by using the same method as the synthesis method of Compound 1886 of Synthesis Example 3, except that 2-([1,1'-biphenyl]-3-yl)-1-(3,5-diisopropyl-[1,1'-biphenyl]-4-yl)-1H-benzo[d]imidazole was used instead of 1-methyl-2-phenyl-1H-benzo[d]imidazole. The substance was identified by Mass and HPLC analysis.

HRMS(MALDI) calcd for C73H81IrN4Si2: m/z 1262.8.7 Found: 1262.6 Synthesis Example 7 (Compound 3394)

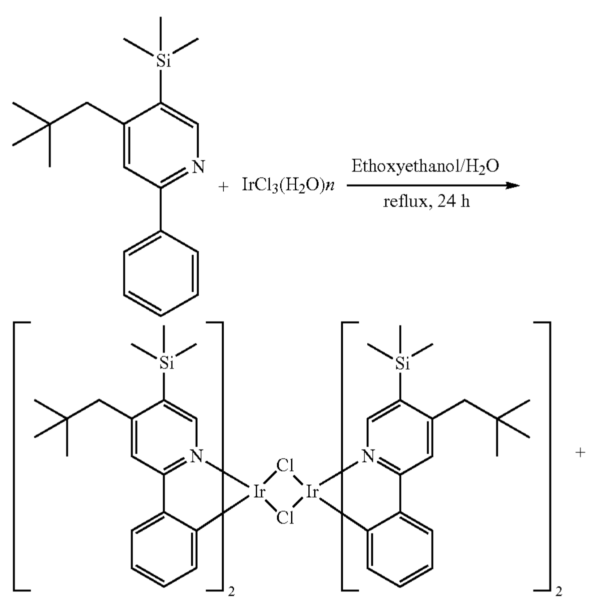

3394A

-continued

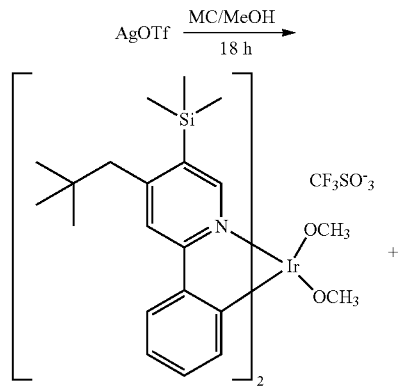

3394B

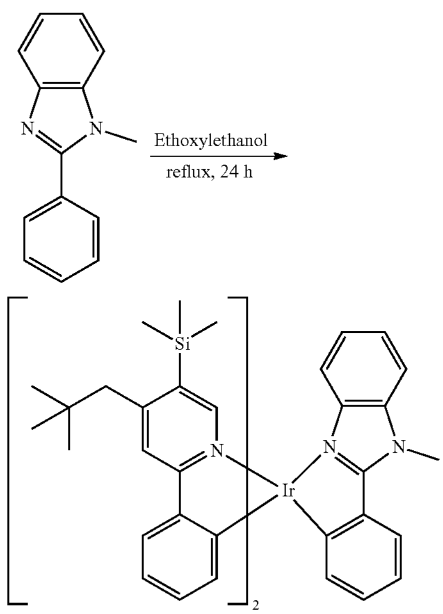

3394

Synthesis of Compound 3394A

Compound 3394A (yield of 83%) was obtained by using the same method as the synthesis method of Compound 1A of Synthesis Example 1, except that 4-neopentyl-2-phenyl-5-(trimethylsilyl)pyridine was used instead of 2-phenyl-5-(trimethylsilyl)pyridine.

Synthesis of Compound 3394B

Compound 3394B was obtained by using the same method as the synthesis method of Compound 1B of Synthesis Example 1, except that Compound 3394A was used instead of Compound 1A. Obtained Compound 3394B was used in the next reaction without additional purification.

Synthesis of Compound 3394

Compound 3394 (yield of 35%) was obtained by using the same method as the synthesis method of Compound 1 of Synthesis Example 1, except that Compound 3394B was used instead of Compound 1B. The substance was identified by Mass and HPLC analysis.

HRMS(MALDI) calcd for C52H63IrN4Si2: m/z 992.5 Found: 992.4 Synthesis Example 8 (Compound 3408)

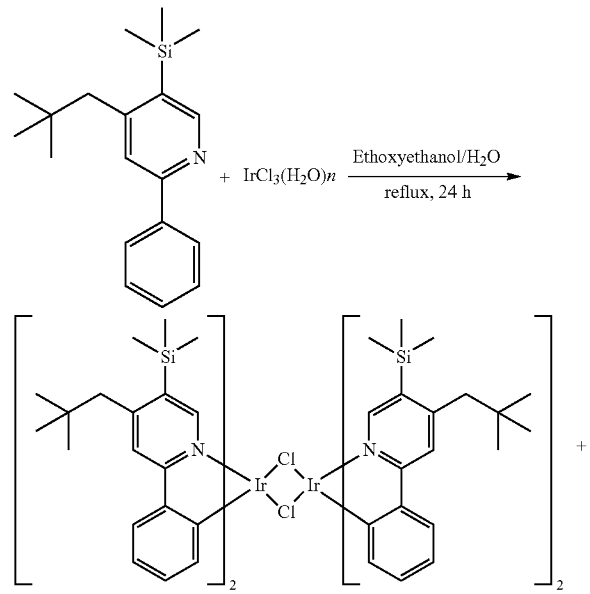

3394A

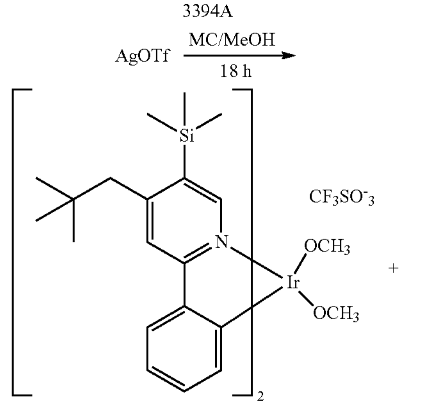

3394B

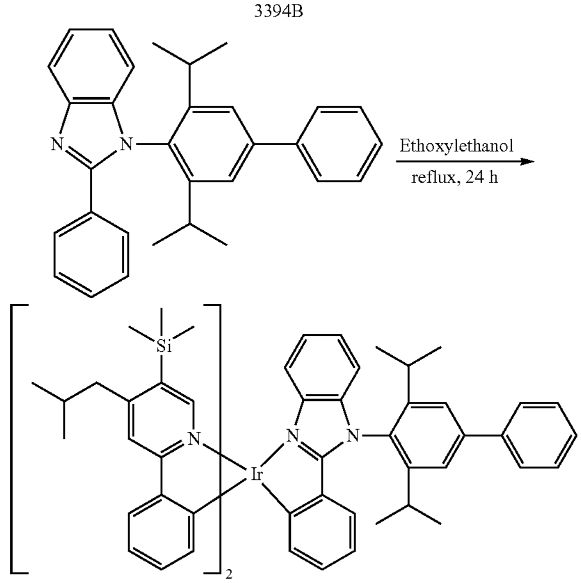

3408

Synthesis of Compound 3408

Compound 3408 (yield of 31%) was obtained by using the same method as the synthesis method of Compound 3394 of Synthesis Example 7, except that 1-(3,5-diisopropyl-[1,1'-biphenyl]-4-yl)-2-phenyl-1H-benzo[d]imidazole was used instead of 1-methyl-2-phenyl-1H-benzo[d]imidazole. The substance was identified by Mass and HPLC analysis.

HRMS(MALDI) calcd for C60H81IrN4Si2: m/z 1214.8 Found: 1214.6 Synthesis Example 9 (Compound 5670)

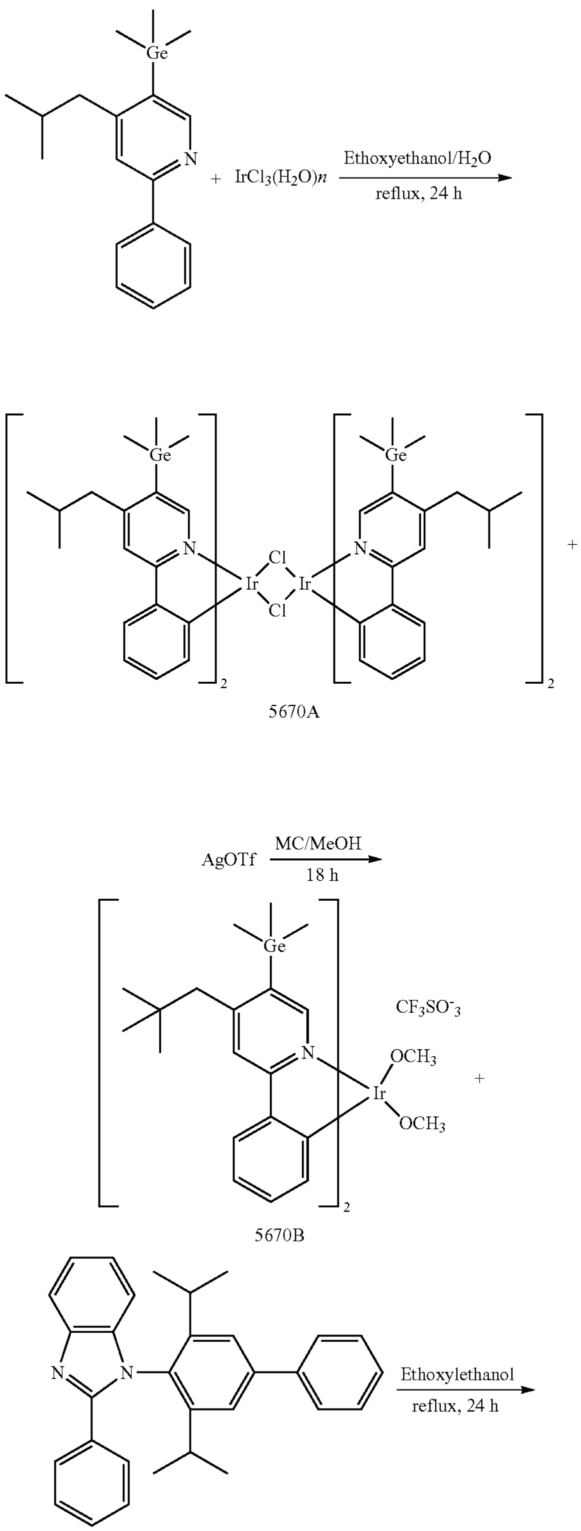

-continued

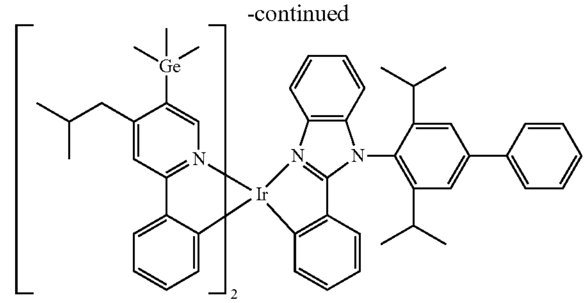

5670

Synthesis of Compound 5670A

Compound 5670A (yield of 75%) was obtained by using the same method as the synthesis method of Compound 1A of Synthesis Example 1, except that 4-isobutyl-2-phenyl-5-(trimethylgermyl)pyridine was used instead of 2-phenyl-5-(trimethylsilyl)pyridine.

Synthesis of Compound 5670B

Compound 5670B was obtained by using the same method as the synthesis method of Compound 1B of Synthesis Example 1, except that Compound 5670A was used instead of Compound 1A. Obtained Compound 5670B was used in the next reaction without additional purification.

Synthesis of Compound 5670

Compound 5670 (yield of 30%) was obtained by using the same method as the synthesis method of Compound 1 of Synthesis Example 1, except that Compound 5670B was used instead of Compound 1B, and 1-(3,5-diisopropyl-[1,1'-biphenyl]-4-yl)-2-phenyl-1H-benzo[d]imidazole was used instead of 1-methyl-2-phenyl-1H-benzo[d]imidazole. The substance was identified by Mass and HPLC analysis.

HRMS(MALDI) calcd for C67H77Ge2IrN4: m/z 1278.9 Found: 1278.4

Example 1

As an anode, a glass substrate with ITO patterned thereon was cut to a size of 50 mm×50 mm×0.5 mm, sonicated by using isopropyl alcohol and pure water for 5 minutes each, and then irradiated with ultraviolet light for 30 minutes and exposed to ozone for cleaning. Then, the resultant glass substrate was loaded onto a vacuum deposition apparatus.

Compound HT3 and F6-TCNNQ were vacuum-deposited at a weight ratio of 98:2 on the anode to form a hole injection layer having a thickness of 100 Å, and Compound HT3 was vacuum-deposited on the hole injection layer to form a hole transport layer having a thickness of 1,650 Å.

Subsequently, Compound CBP (host) and Compound 1 (dopant) were co-deposited at a weight ratio of 95:5 on the hole transport layer to form an emission layer having a thickness of 400 Å.

Then, Compound ET3 and ET-D1 were co-deposited at a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing an organic light-emitting device.

HT3

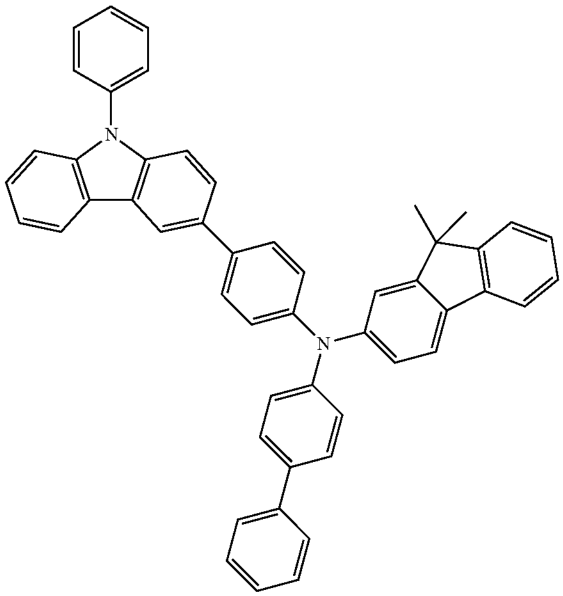

F6-TCNNQ

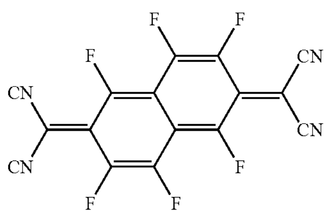

CBP

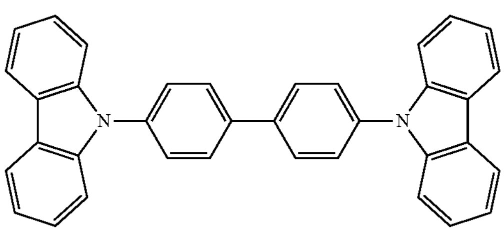

ET3

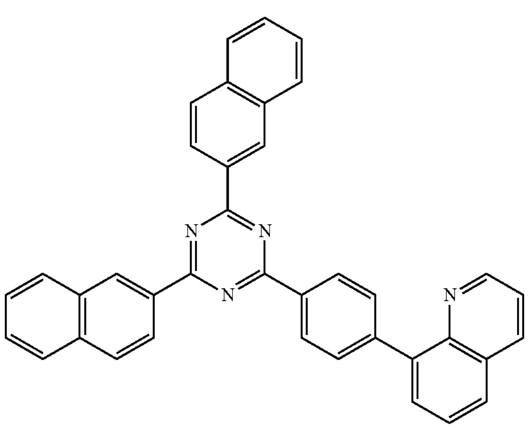

-continued

ET-D1

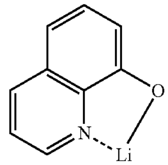

Examples 2 to 9 and Comparative Examples 1 and 2

Organic light-emitting devices were manufactured in the same manner as in Example 1, except that Compounds shown in Table 3 were each used instead of Compound 1 as a dopant in forming an emission layer.

Evaluation Example 1: Characteristic Evaluation of Organic Light-Emitting Device For each organic light-emitting device manufactured in Examples 1 to 9 and Comparative Examples 1 to 2, the maximum value of external quantum efficiency (Max EQE), roll-off ratio, and the lifespan ($LT_{97}$) were evaluated. Results thereof are shown in Table 3. This evaluation was performed using a current-voltage meter (Keithley 2400) and a luminescence meter (Minolta Cs-1,000A), and the lifespan ($LT_{97}$) (at 18000 nit) was evaluated by measuring the amount of time that elapsed until luminance was reduced to 97% of the initial brightness of 100%. The roll-off ratio was calculated by the following Equation 20.

$$\text{Roll-off ratio}=\{1-(\text{efficiency(at 18000 nit)/maximum luminescence efficiency})\}\times 100\% \qquad \text{Equation 20}$$

TABLE 3

| | Dopant in emission layer | Max EQE (%) | Roll-off ratio (%) | LT97 (hr) (at 18000 nit) |
|---|---|---|---|---|
| Example 1 | 1 | 21.6 | 17 | 48 |
| Example 2 | 15 | 22.4 | 14 | 62 |
| Example 3 | 1886 | 22.1 | 15 | 51 |
| Example 4 | 1895 | 23.3 | 12 | 73 |
| Example 5 | 1900 | 23.8 | 11 | 88 |
| Example 6 | 1994 | 23.4 | 12 | 91 |
| Example 7 | 3394 | 22.2 | 15 | 49 |
| Example 8 | 3408 | 23.9 | 11 | 80 |
| Example 9 | 5670 | 24.0 | 11 | 85 |
| Comparative Example 1 | A | 18.3 | 28 | 21 |
| Comparative Example 2 | B | 19.6 | 25 | 30 |

1

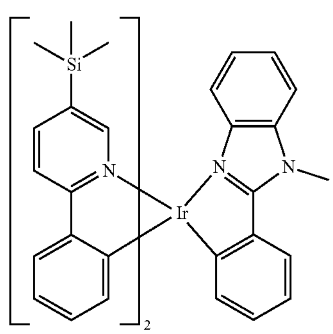

-continued
15
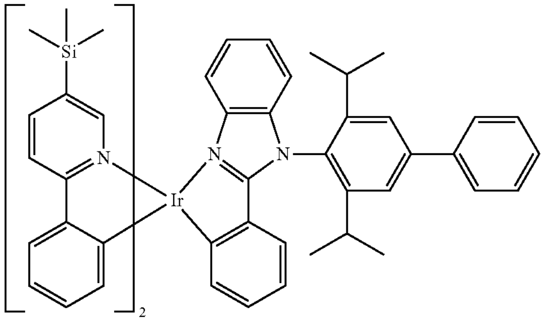
1886
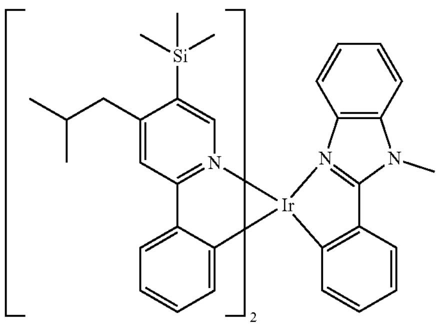
1895
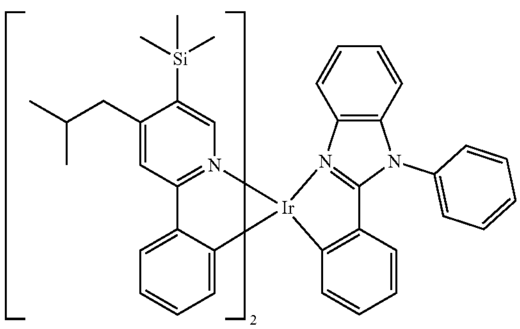
1900
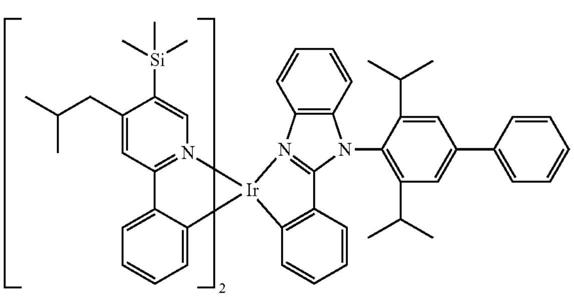
-continued
1994
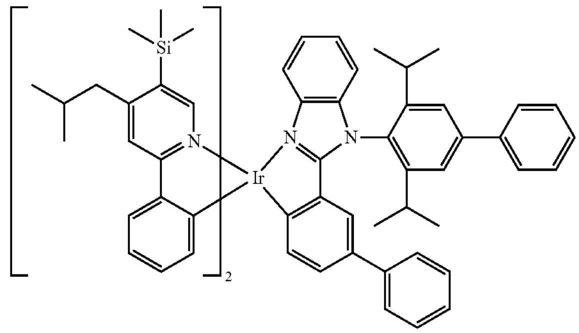
3394
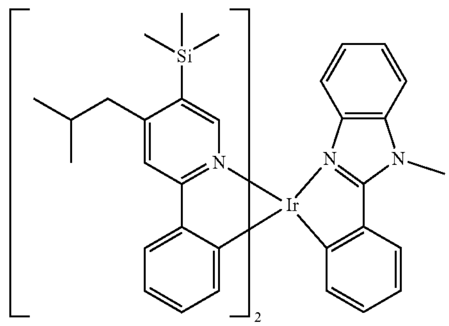
3408
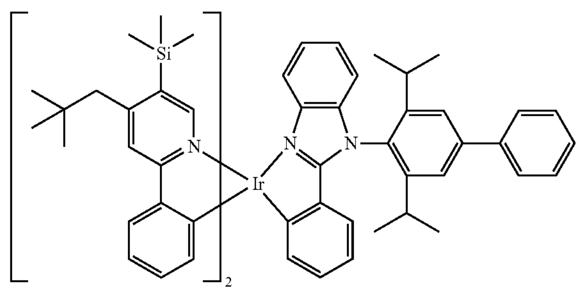
3785
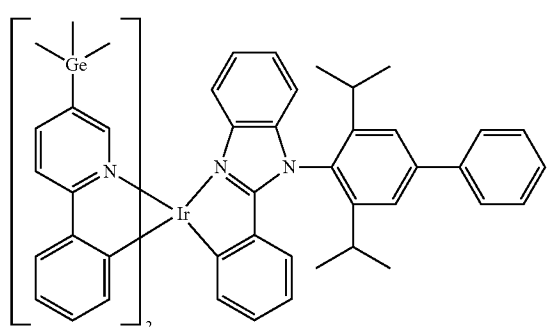

-continued

5670

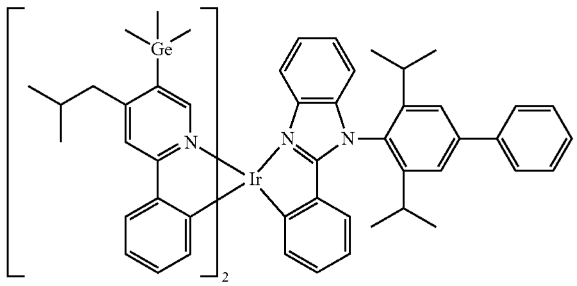

7178

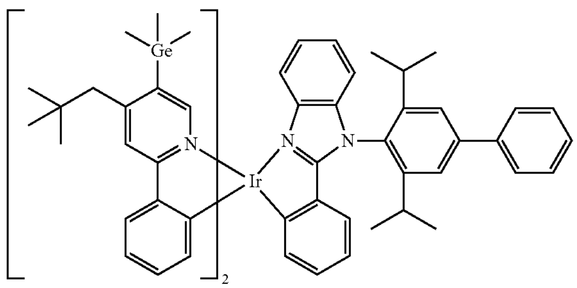

A

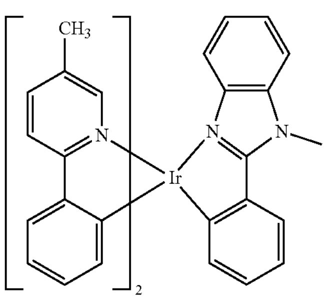

B

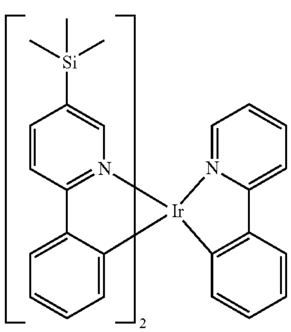

As described in Table 3, the organic light-emitting devices manufactured according to Examples 1 to 9 emit red light and have improved driving voltage, improved external quantum efficiency, improved roll-off ratio, and improved lifespan characteristics, compared to the organic light-emitting devices manufactured according to Comparative Examples 1 and 2.

The organometallic compound according to embodiments has excellent electric characteristics and thermal stability. Accordingly, an organic light-emitting device including the organometallic compound may have excellent characteristics in terms of driving voltage, luminescence efficiency, quantum luminescence efficiency, roll-off ratio, and lifespan. In particular, orientation of the organometallic compound significantly increases, and thus, quantum luminescence efficiency substantially increases.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

Formula 1

$$M(L_1)_{n1}(L_2)_{n2}$$

wherein, in Formula 1,

M is Ir or Os, $L_1$ is a ligand represented by Formula 2-1, n1 is 1, 2, or 3, and when n1 is 2 or more, two or more $L_1$(s) are identical to or different from each other, $L_2$ is a ligand represented by Formula 2-2, n2 is 1, 2, 3, or 4, when n2 is two or more, two or more $L_2$(s) are identical to or different from each other, Formula 2-1

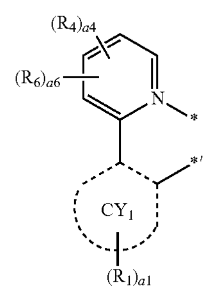

Formula 2-2

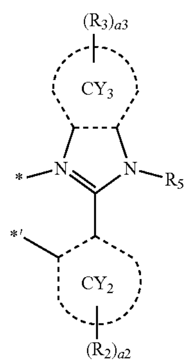

wherein, in Formulae 2-1 and 2-2, $CY_1$ to $CY_3$ are each a benzene group, $R_1$ to $R_4$ may each independently:

deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —$SF_5$, $C_1$-$C_{20}$ alkyl group, a $C_1$-$C_{20}$ alkoxy group, or any combination thereof;

a $C_1$-$C_{20}$ alkyl group or a $C_1$-$C_{20}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof, wherein $Q_1$ to $Q_9$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof, $R_5$ is:

a $C_1$-$C_{20}$ alkyl group unsubstituted or substituted with at least one deuterium; or a cyclopentyl group a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinozalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group a dibenzothiophenyl group, a benzocarbazolyl group, a dibenzocarbazolyl group, an imidazopyridinyl group, or an imidazopyrimidinyl group, each unsubstituted or substituted with at least one deuterium, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, $R_6$ is a Si-containing group or a Ge-containing group, a1 to a3 are each independently an integer from 0 to 4, wherein, when a1 is an integer of 2 or more, two or more $R_1$(s) are identical to or different from each other, when a2 is an integer of 2 or more, two or more $R_2$(s) are identical to or different from each other, and when a3 is an integer of 2 or more, two or more $R_3$(s) are identical to or different from each other, a4 is an integer from 0 to 4, and when a4 is an integer of 2 or more, two or more $R_4$(s) are identical to or different from each other, a6 is an integer from 1 to 4, and when a6 is an integer of 2 or more, two or more $R_6$(s) are identical to or different from each other, two or more neighboring $R_1$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more neighboring $R_2$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more neighboring $R_3$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more neighboring $R_4$(s) are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_1$ to $R_5$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$,

*and *' each indicate a binding site to M in Formula 1.

2. The organometallic compound of claim 1, wherein the sum of n1 and n2 is 3 or 4.

3. The organometallic compound of claim 1, wherein n1 is 2, and n2 is 1.

4. The organometallic compound of claim 1, wherein $R_4$ is:

deuterium, a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group; or a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each substituted with at least one deuterium.

5. The organometallic compound of claim 1, wherein $R_6$ is represented by Formula 3-1 below:

Formula 3-1

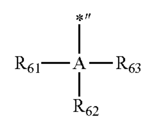

wherein, in Formula 3-1,

A is Si or Ge, $R_{61}$ to $R_{63}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof, and

*" is a binding site to an adjacent group.

6. The organometallic compound of claim 5, wherein $R_{61}$ to $R_{63}$ are each independently:

hydrogen, deuterium, a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof; or a methyl group, an ethyl group, an n-propyl group, an isopropyl group, an n-butyl group, an isobutyl group, a sec-butyl group, a tert-butyl group, an n-pentyl group, a tert-pentyl group, an neo-pentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an iso-octyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof, each substituted with at least one deuterium.

7. The organometallic compound of claim 5, wherein $R_{61}$ to $R_{63}$ are identical to each other.

8. The organometallic compound of claim 5, wherein $R_{61}$ and $R_{62}$ are different from each other.

9. The organometallic compound of claim 1, wherein Formula 2-1 is represented by any one of Formulae 4-1 to 4-4:

4-1

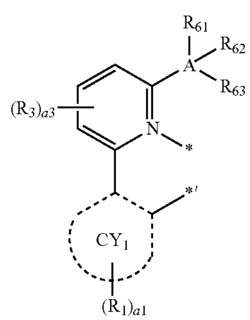

4-2

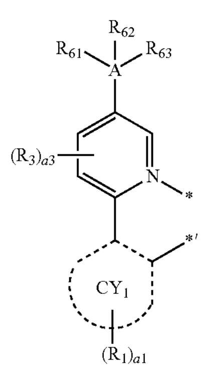

-continued 4-3

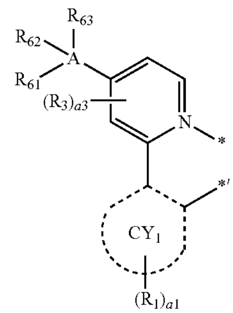

4-4

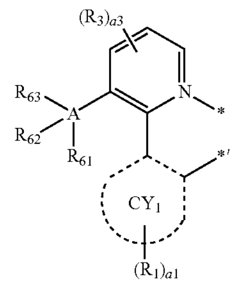

wherein, in Formulae 4-1 to 4-4,

A is Si or Ge, $R_{61}$ to $R_{63}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$) alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or any combination thereof, and $CY_1$, $R_1$, $R_3$, a1, and a3 are each the same as described in claim 1.

10. The organometallic compound of claim 1, wherein the organometallic compound is one of Compounds 1 to 9796 represented by $(L_1)_2IrL_2$ and comprises ligand $L_1$ and ligand $L_2$ that are presented below:

| | | |
|---|---|---|
| COMPOUND 1 | $L_{1-1}$ | $L_{2-1}$ |
| COMPOUND 2 | $L_{1-1}$ | $L_{2-2}$ |
| COMPOUND 3 | $L_{1-1}$ | $L_{2-3}$ |
| COMPOUND 4 | $L_{1-1}$ | $L_{2-4}$ |
| COMPOUND 5 | $L_{1-1}$ | $L_{2-5}$ |
| COMPOUND 6 | $L_{1-1}$ | $L_{2-6}$ |
| COMPOUND 7 | $L_{1-1}$ | $L_{2-7}$ |

-continued

| | | |
|---|---|---|
| COMPOUND 8 | $L_{1-1}$ | $L_{2-8}$ |
| COMPOUND 9 | $L_{1-1}$ | $L_{2-9}$ |
| COMPOUND 10 | $L_{1-1}$ | $L_{2-10}$ |
| COMPOUND 11 | $L_{1-1}$ | $L_{2-11}$ |
| COMPOUND 12 | $L_{1-1}$ | $L_{2-12}$ |
| COMPOUND 13 | $L_{1-1}$ | $L_{2-13}$ |
| COMPOUND 14 | $L_{1-1}$ | $L_{2-14}$ |
| COMPOUND 15 | $L_{1-1}$ | $L_{2-15}$ |
| COMPOUND 16 | $L_{1-1}$ | $L_{2-16}$ |
| COMPOUND 17 | $L_{1-1}$ | $L_{2-17}$ |
| COMPOUND 18 | $L_{1-1}$ | $L_{2-18}$ |
| COMPOUND 19 | $L_{1-1}$ | $L_{2-19}$ |
| COMPOUND 20 | $L_{1-1}$ | $L_{2-20}$ |
| COMPOUND 21 | $L_{1-1}$ | $L_{2-21}$ |
| COMPOUND 22 | $L_{1-1}$ | $L_{2-22}$ |
| COMPOUND 23 | $L_{1-1}$ | $L_{2-23}$ |
| COMPOUND 24 | $L_{1-1}$ | $L_{2-24}$ |
| COMPOUND 25 | $L_{1-1}$ | $L_{2-25}$ |
| COMPOUND 26 | $L_{1-1}$ | $L_{2-26}$ |
| COMPOUND 27 | $L_{1-1}$ | $L_{2-27}$ |
| COMPOUND 28 | $L_{1-1}$ | $L_{2-28}$ |
| COMPOUND 29 | $L_{1-1}$ | $L_{2-29}$ |
| COMPOUND 30 | $L_{1-1}$ | $L_{2-30}$ |
| COMPOUND 31 | $L_{1-1}$ | $L_{2-31}$ |
| COMPOUND 32 | $L_{1-1}$ | $L_{2-32}$ |
| COMPOUND 33 | $L_{1-1}$ | $L_{2-33}$ |
| COMPOUND 34 | $L_{1-1}$ | $L_{2-34}$ |
| COMPOUND 35 | $L_{1-1}$ | $L_{2-35}$ |
| COMPOUND 36 | $L_{1-1}$ | $L_{2-36}$ |
| COMPOUND 37 | $L_{1-1}$ | $L_{2-37}$ |
| COMPOUND 38 | $L_{1-1}$ | $L_{2-38}$ |
| COMPOUND 39 | $L_{1-1}$ | $L_{2-39}$ |
| COMPOUND 40 | $L_{1-1}$ | $L_{2-40}$ |
| COMPOUND 41 | $L_{1-1}$ | $L_{2-41}$ |
| COMPOUND 42 | $L_{1-1}$ | $L_{2-42}$ |
| COMPOUND 43 | $L_{1-1}$ | $L_{2-43}$ |
| COMPOUND 44 | $L_{1-1}$ | $L_{2-44}$ |
| COMPOUND 45 | $L_{1-1}$ | $L_{2-45}$ |
| COMPOUND 46 | $L_{1-1}$ | $L_{2-46}$ |
| COMPOUND 47 | $L_{1-1}$ | $L_{2-47}$ |
| COMPOUND 48 | $L_{1-1}$ | $L_{2-48}$ |
| COMPOUND 49 | $L_{1-1}$ | $L_{2-49}$ |
| COMPOUND 50 | $L_{1-1}$ | $L_{2-50}$ |
| COMPOUND 51 | $L_{1-1}$ | $L_{2-51}$ |
| COMPOUND 52 | $L_{1-1}$ | $L_{2-52}$ |
| COMPOUND 53 | $L_{1-1}$ | $L_{2-53}$ |
| COMPOUND 54 | $L_{1-1}$ | $L_{2-54}$ |
| COMPOUND 55 | $L_{1-1}$ | $L_{2-55}$ |
| COMPOUND 56 | $L_{1-1}$ | $L_{2-56}$ |
| COMPOUND 57 | $L_{1-1}$ | $L_{2-57}$ |
| COMPOUND 58 | $L_{1-1}$ | $L_{2-58}$ |
| COMPOUND 59 | $L_{1-1}$ | $L_{2-59}$ |
| COMPOUND 60 | $L_{1-1}$ | $L_{2-60}$ |
| COMPOUND 61 | $L_{1-1}$ | $L_{2-61}$ |
| COMPOUND 62 | $L_{1-1}$ | $L_{2-62}$ |
| COMPOUND 63 | $L_{1-1}$ | $L_{2-63}$ |
| COMPOUND 64 | $L_{1-1}$ | $L_{2-64}$ |
| COMPOUND 65 | $L_{1-1}$ | $L_{2-65}$ |
| COMPOUND 66 | $L_{1-1}$ | $L_{2-66}$ |
| COMPOUND 67 | $L_{1-1}$ | $L_{2-67}$ |
| COMPOUND 68 | $L_{1-1}$ | $L_{2-68}$ |
| COMPOUND 69 | $L_{1-1}$ | $L_{2-69}$ |
| COMPOUND 70 | $L_{1-1}$ | $L_{2-70}$ |
| COMPOUND 71 | $L_{1-1}$ | $L_{2-71}$ |
| COMPOUND 72 | $L_{1-1}$ | $L_{2-72}$ |
| COMPOUND 73 | $L_{1-1}$ | $L_{2-73}$ |
| COMPOUND 74 | $L_{1-1}$ | $L_{2-74}$ |
| COMPOUND 75 | $L_{1-1}$ | $L_{2-75}$ |
| COMPOUND 76 | $L_{1-1}$ | $L_{2-76}$ |
| COMPOUND 77 | $L_{1-1}$ | $L_{2-77}$ |
| COMPOUND 78 | $L_{1-1}$ | $L_{2-78}$ |
| COMPOUND 79 | $L_{1-1}$ | $L_{2-79}$ |
| COMPOUND 80 | $L_{1-1}$ | $L_{2-80}$ |
| COMPOUND 81 | $L_{1-1}$ | $L_{2-81}$ |
| COMPOUND 82 | $L_{1-1}$ | $L_{2-82}$ |
| COMPOUND 83 | $L_{1-1}$ | $L_{2-83}$ |
| COMPOUND 84 | $L_{1-1}$ | $L_{2-84}$ |
| COMPOUND 85 | $L_{1-1}$ | $L_{2-85}$ |
| COMPOUND 86 | $L_{1-1}$ | $L_{2-86}$ |
| COMPOUND 87 | $L_{1-1}$ | $L_{2-87}$ |
| COMPOUND 88 | $L_{1-1}$ | $L_{2-88}$ |
| COMPOUND 89 | $L_{1-1}$ | $L_{2-89}$ |
| COMPOUND 90 | $L_{1-1}$ | $L_{2-90}$ |
| COMPOUND 91 | $L_{1-1}$ | $L_{2-91}$ |
| COMPOUND 92 | $L_{1-1}$ | $L_{2-92}$ |
| COMPOUND 93 | $L_{1-1}$ | $L_{2-93}$ |
| COMPOUND 94 | $L_{1-1}$ | $L_{2-94}$ |
| COMPOUND 95 | $L_{1-1}$ | $L_{2-95}$ |
| COMPOUND 96 | $L_{1-1}$ | $L_{2-96}$ |
| COMPOUND 97 | $L_{1-1}$ | $L_{2-97}$ |
| COMPOUND 98 | $L_{1-1}$ | $L_{2-98}$ |
| COMPOUND 99 | $L_{1-1}$ | $L_{2-99}$ |
| COMPOUND 100 | $L_{1-1}$ | $L_{2-100}$ |
| COMPOUND 101 | $L_{1-1}$ | $L_{2-101}$ |
| COMPOUND 102 | $L_{1-1}$ | $L_{2-102}$ |
| COMPOUND 103 | $L_{1-1}$ | $L_{2-103}$ |
| COMPOUND 104 | $L_{1-1}$ | $L_{2-104}$ |
| COMPOUND 105 | $L_{1-1}$ | $L_{2-105}$ |
| COMPOUND 106 | $L_{1-1}$ | $L_{2-106}$ |
| COMPOUND 107 | $L_{1-1}$ | $L_{2-107}$ |
| COMPOUND 108 | $L_{1-1}$ | $L_{2-108}$ |
| COMPOUND 109 | $L_{1-1}$ | $L_{2-109}$ |
| COMPOUND 110 | $L_{1-1}$ | $L_{2-110}$ |
| COMPOUND 111 | $L_{1-1}$ | $L_{2-111}$ |
| COMPOUND 112 | $L_{1-1}$ | $L_{2-112}$ |
| COMPOUND 113 | $L_{1-1}$ | $L_{2-113}$ |
| COMPOUND 114 | $L_{1-1}$ | $L_{2-114}$ |
| COMPOUND 115 | $L_{1-1}$ | $L_{2-115}$ |
| COMPOUND 116 | $L_{1-1}$ | $L_{2-116}$ |
| COMPOUND 117 | $L_{1-1}$ | $L_{2-117}$ |
| COMPOUND 118 | $L_{1-1}$ | $L_{2-118}$ |
| COMPOUND 119 | $L_{1-1}$ | $L_{2-119}$ |
| COMPOUND 120 | $L_{1-1}$ | $L_{2-120}$ |
| COMPOUND 121 | $L_{1-1}$ | $L_{2-121}$ |
| COMPOUND 122 | $L_{1-1}$ | $L_{2-122}$ |
| COMPOUND 123 | $L_{1-1}$ | $L_{2-123}$ |
| COMPOUND 124 | $L_{1-1}$ | $L_{2-124}$ |
| COMPOUND 125 | $L_{1-1}$ | $L_{2-125}$ |
| COMPOUND 126 | $L_{1-1}$ | $L_{2-126}$ |
| COMPOUND 127 | $L_{1-1}$ | $L_{2-127}$ |
| COMPOUND 128 | $L_{1-1}$ | $L_{2-128}$ |
| COMPOUND 129 | $L_{1-1}$ | $L_{2-129}$ |
| COMPOUND 130 | $L_{1-1}$ | $L_{2-130}$ |
| COMPOUND 131 | $L_{1-1}$ | $L_{2-131}$ |
| COMPOUND 132 | $L_{1-1}$ | $L_{2-132}$ |
| COMPOUND 133 | $L_{1-1}$ | $L_{2-133}$ |
| COMPOUND 134 | $L_{1-1}$ | $L_{2-134}$ |
| COMPOUND 135 | $L_{1-1}$ | $L_{2-135}$ |
| COMPOUND 136 | $L_{1-1}$ | $L_{2-136}$ |
| COMPOUND 137 | $L_{1-1}$ | $L_{2-137}$ |
| COMPOUND 138 | $L_{1-1}$ | $L_{2-138}$ |
| COMPOUND 139 | $L_{1-1}$ | $L_{2-139}$ |
| COMPOUND 140 | $L_{1-1}$ | $L_{2-140}$ |
| COMPOUND 141 | $L_{1-1}$ | $L_{2-141}$ |
| COMPOUND 142 | $L_{1-1}$ | $L_{2-142}$ |
| COMPOUND 143 | $L_{1-1}$ | $L_{2-143}$ |
| COMPOUND 144 | $L_{1-1}$ | $L_{2-144}$ |
| COMPOUND 145 | $L_{1-1}$ | $L_{2-145}$ |
| COMPOUND 146 | $L_{1-1}$ | $L_{2-146}$ |
| COMPOUND 147 | $L_{1-1}$ | $L_{2-147}$ |
| COMPOUND 148 | $L_{1-1}$ | $L_{2-148}$ |
| COMPOUND 149 | $L_{1-1}$ | $L_{2-149}$ |
| COMPOUND 150 | $L_{1-1}$ | $L_{2-150}$ |
| COMPOUND 151 | $L_{1-1}$ | $L_{2-151}$ |
| COMPOUND 152 | $L_{1-1}$ | $L_{2-152}$ |
| COMPOUND 153 | $L_{1-1}$ | $L_{2-153}$ |
| COMPOUND 154 | $L_{1-1}$ | $L_{2-154}$ |
| COMPOUND 155 | $L_{1-1}$ | $L_{2-155}$ |
| COMPOUND 156 | $L_{1-1}$ | $L_{2-156}$ |
| COMPOUND 157 | $L_{1-1}$ | $L_{2-157}$ |
| COMPOUND 158 | $L_{1-1}$ | $L_{2-158}$ |
| COMPOUND 159 | $L_{1-1}$ | $L_{2-159}$ |
| COMPOUND 160 | $L_{1-1}$ | $L_{2-160}$ |
| COMPOUND 161 | $L_{1-1}$ | $L_{2-161}$ |
| COMPOUND 162 | $L_{1-1}$ | $L_{2-162}$ |
| COMPOUND 163 | $L_{1-1}$ | $L_{2-163}$ |
| COMPOUND 164 | $L_{1-1}$ | $L_{2-164}$ |
| COMPOUND 165 | $L_{1-1}$ | $L_{2-165}$ |

-continued

| | | |
|---|---|---|
| COMPOUND 166 | $L_{1-1}$ | $L_{2-166}$ |
| COMPOUND 167 | $L_{1-1}$ | $L_{2-167}$ |
| COMPOUND 168 | $L_{1-1}$ | $L_{2-168}$ |
| COMPOUND 169 | $L_{1-1}$ | $L_{2-169}$ |
| COMPOUND 170 | $L_{1-1}$ | $L_{2-170}$ |
| COMPOUND 171 | $L_{1-1}$ | $L_{2-171}$ |
| COMPOUND 172 | $L_{1-1}$ | $L_{2-172}$ |
| COMPOUND 173 | $L_{1-1}$ | $L_{2-173}$ |
| COMPOUND 174 | $L_{1-1}$ | $L_{2-174}$ |
| COMPOUND 175 | $L_{1-1}$ | $L_{2-175}$ |
| COMPOUND 176 | $L_{1-1}$ | $L_{2-176}$ |
| COMPOUND 177 | $L_{1-1}$ | $L_{2-177}$ |
| COMPOUND 178 | $L_{1-1}$ | $L_{2-178}$ |
| COMPOUND 179 | $L_{1-1}$ | $L_{2-179}$ |
| COMPOUND 180 | $L_{1-1}$ | $L_{2-180}$ |
| COMPOUND 181 | $L_{1-1}$ | $L_{2-181}$ |
| COMPOUND 182 | $L_{1-1}$ | $L_{2-182}$ |
| COMPOUND 183 | $L_{1-1}$ | $L_{2-183}$ |
| COMPOUND 184 | $L_{1-1}$ | $L_{2-184}$ |
| COMPOUND 185 | $L_{1-1}$ | $L_{2-185}$ |
| COMPOUND 186 | $L_{1-1}$ | $L_{2-186}$ |
| COMPOUND 187 | $L_{1-1}$ | $L_{2-187}$ |
| COMPOUND 188 | $L_{1-1}$ | $L_{2-188}$ |
| COMPOUND 189 | $L_{1-1}$ | $L_{2-189}$ |
| COMPOUND 190 | $L_{1-1}$ | $L_{2-190}$ |
| COMPOUND 191 | $L_{1-1}$ | $L_{2-191}$ |
| COMPOUND 192 | $L_{1-1}$ | $L_{2-192}$ |
| COMPOUND 193 | $L_{1-1}$ | $L_{2-193}$ |
| COMPOUND 194 | $L_{1-1}$ | $L_{2-194}$ |
| COMPOUND 195 | $L_{1-1}$ | $L_{2-195}$ |
| COMPOUND 196 | $L_{1-1}$ | $L_{2-196}$ |
| COMPOUND 197 | $L_{1-1}$ | $L_{2-197}$ |
| COMPOUND 198 | $L_{1-1}$ | $L_{2-198}$ |
| COMPOUND 199 | $L_{1-1}$ | $L_{2-199}$ |
| COMPOUND 200 | $L_{1-1}$ | $L_{2-200}$ |
| COMPOUND 201 | $L_{1-1}$ | $L_{2-201}$ |
| COMPOUND 202 | $L_{1-1}$ | $L_{2-202}$ |
| COMPOUND 203 | $L_{1-1}$ | $L_{2-203}$ |
| COMPOUND 204 | $L_{1-1}$ | $L_{2-204}$ |
| COMPOUND 205 | $L_{1-1}$ | $L_{2-205}$ |
| COMPOUND 206 | $L_{1-1}$ | $L_{2-206}$ |
| COMPOUND 207 | $L_{1-1}$ | $L_{2-207}$ |
| COMPOUND 208 | $L_{1-1}$ | $L_{2-208}$ |
| COMPOUND 209 | $L_{1-1}$ | $L_{2-209}$ |
| COMPOUND 210 | $L_{1-1}$ | $L_{2-210}$ |
| COMPOUND 211 | $L_{1-1}$ | $L_{2-211}$ |
| COMPOUND 212 | $L_{1-1}$ | $L_{2-212}$ |
| COMPOUND 213 | $L_{1-1}$ | $L_{2-213}$ |
| COMPOUND 214 | $L_{1-1}$ | $L_{2-214}$ |
| COMPOUND 215 | $L_{1-1}$ | $L_{2-215}$ |
| COMPOUND 216 | $L_{1-1}$ | $L_{2-216}$ |
| COMPOUND 217 | $L_{1-1}$ | $L_{2-217}$ |
| COMPOUND 218 | $L_{1-1}$ | $L_{2-218}$ |
| COMPOUND 219 | $L_{1-1}$ | $L_{2-219}$ |
| COMPOUND 220 | $L_{1-1}$ | $L_{2-220}$ |
| COMPOUND 221 | $L_{1-1}$ | $L_{2-221}$ |
| COMPOUND 222 | $L_{1-1}$ | $L_{2-222}$ |
| COMPOUND 223 | $L_{1-1}$ | $L_{2-223}$ |
| COMPOUND 224 | $L_{1-1}$ | $L_{2-224}$ |
| COMPOUND 225 | $L_{1-1}$ | $L_{2-225}$ |
| COMPOUND 226 | $L_{1-1}$ | $L_{2-226}$ |
| COMPOUND 227 | $L_{1-1}$ | $L_{2-227}$ |
| COMPOUND 228 | $L_{1-1}$ | $L_{2-228}$ |
| COMPOUND 229 | $L_{1-1}$ | $L_{2-229}$ |
| COMPOUND 230 | $L_{1-1}$ | $L_{2-230}$ |
| COMPOUND 231 | $L_{1-1}$ | $L_{2-231}$ |
| COMPOUND 232 | $L_{1-1}$ | $L_{2-232}$ |
| COMPOUND 233 | $L_{1-1}$ | $L_{2-233}$ |
| COMPOUND 234 | $L_{1-1}$ | $L_{2-234}$ |
| COMPOUND 235 | $L_{1-1}$ | $L_{2-235}$ |
| COMPOUND 236 | $L_{1-1}$ | $L_{2-236}$ |
| COMPOUND 237 | $L_{1-1}$ | $L_{2-237}$ |
| COMPOUND 238 | $L_{1-1}$ | $L_{2-238}$ |
| COMPOUND 239 | $L_{1-1}$ | $L_{2-239}$ |
| COMPOUND 240 | $L_{1-1}$ | $L_{2-240}$ |
| COMPOUND 241 | $L_{1-1}$ | $L_{2-241}$ |
| COMPOUND 242 | $L_{1-1}$ | $L_{2-242}$ |
| COMPOUND 243 | $L_{1-1}$ | $L_{2-243}$ |
| COMPOUND 244 | $L_{1-1}$ | $L_{2-244}$ |

-continued

| | | |
|---|---|---|
| COMPOUND 245 | $L_{1-1}$ | $L_{2-245}$ |
| COMPOUND 246 | $L_{1-1}$ | $L_{2-246}$ |
| COMPOUND 247 | $L_{1-1}$ | $L_{2-247}$ |
| COMPOUND 248 | $L_{1-1}$ | $L_{2-248}$ |
| COMPOUND 249 | $L_{1-1}$ | $L_{2-249}$ |
| COMPOUND 250 | $L_{1-1}$ | $L_{2-250}$ |
| COMPOUND 251 | $L_{1-1}$ | $L_{2-251}$ |
| COMPOUND 252 | $L_{1-1}$ | $L_{2-252}$ |
| COMPOUND 253 | $L_{1-1}$ | $L_{2-253}$ |
| COMPOUND 254 | $L_{1-1}$ | $L_{2-254}$ |
| COMPOUND 255 | $L_{1-1}$ | $L_{2-255}$ |
| COMPOUND 256 | $L_{1-1}$ | $L_{2-256}$ |
| COMPOUND 257 | $L_{1-1}$ | $L_{2-257}$ |
| COMPOUND 258 | $L_{1-1}$ | $L_{2-258}$ |
| COMPOUND 259 | $L_{1-1}$ | $L_{2-259}$ |
| COMPOUND 260 | $L_{1-1}$ | $L_{2-260}$ |
| COMPOUND 261 | $L_{1-1}$ | $L_{2-261}$ |
| COMPOUND 262 | $L_{1-1}$ | $L_{2-262}$ |
| COMPOUND 263 | $L_{1-1}$ | $L_{2-263}$ |
| COMPOUND 264 | $L_{1-1}$ | $L_{2-264}$ |
| COMPOUND 265 | $L_{1-1}$ | $L_{2-265}$ |
| COMPOUND 266 | $L_{1-1}$ | $L_{2-266}$ |
| COMPOUND 267 | $L_{1-1}$ | $L_{2-267}$ |
| COMPOUND 268 | $L_{1-1}$ | $L_{2-268}$ |
| COMPOUND 269 | $L_{1-1}$ | $L_{2-269}$ |
| COMPOUND 270 | $L_{1-1}$ | $L_{2-270}$ |
| COMPOUND 271 | $L_{1-1}$ | $L_{2-271}$ |
| COMPOUND 272 | $L_{1-1}$ | $L_{2-272}$ |
| COMPOUND 273 | $L_{1-1}$ | $L_{2-273}$ |
| COMPOUND 274 | $L_{1-1}$ | $L_{2-274}$ |
| COMPOUND 275 | $L_{1-1}$ | $L_{2-275}$ |
| COMPOUND 276 | $L_{1-1}$ | $L_{2-276}$ |
| COMPOUND 277 | $L_{1-1}$ | $L_{2-277}$ |
| COMPOUND 278 | $L_{1-1}$ | $L_{2-278}$ |
| COMPOUND 279 | $L_{1-1}$ | $L_{2-279}$ |
| COMPOUND 280 | $L_{1-1}$ | $L_{2-280}$ |
| COMPOUND 281 | $L_{1-1}$ | $L_{2-281}$ |
| COMPOUND 282 | $L_{1-1}$ | $L_{2-282}$ |
| COMPOUND 283 | $L_{1-1}$ | $L_{2-283}$ |
| COMPOUND 284 | $L_{1-1}$ | $L_{2-284}$ |
| COMPOUND 285 | $L_{1-1}$ | $L_{2-285}$ |
| COMPOUND 286 | $L_{1-1}$ | $L_{2-286}$ |
| COMPOUND 287 | $L_{1-1}$ | $L_{2-287}$ |
| COMPOUND 288 | $L_{1-1}$ | $L_{2-288}$ |
| COMPOUND 289 | $L_{1-1}$ | $L_{2-289}$ |
| COMPOUND 290 | $L_{1-1}$ | $L_{2-290}$ |
| COMPOUND 291 | $L_{1-1}$ | $L_{2-291}$ |
| COMPOUND 292 | $L_{1-1}$ | $L_{2-292}$ |
| COMPOUND 293 | $L_{1-1}$ | $L_{2-293}$ |
| COMPOUND 294 | $L_{1-1}$ | $L_{2-294}$ |
| COMPOUND 295 | $L_{1-1}$ | $L_{2-295}$ |
| COMPOUND 296 | $L_{1-1}$ | $L_{2-296}$ |
| COMPOUND 297 | $L_{1-1}$ | $L_{2-297}$ |
| COMPOUND 298 | $L_{1-1}$ | $L_{2-298}$ |
| COMPOUND 299 | $L_{1-1}$ | $L_{2-299}$ |
| COMPOUND 300 | $L_{1-1}$ | $L_{2-300}$ |
| COMPOUND 301 | $L_{1-1}$ | $L_{2-301}$ |
| COMPOUND 302 | $L_{1-1}$ | $L_{2-302}$ |
| COMPOUND 303 | $L_{1-1}$ | $L_{2-303}$ |
| COMPOUND 304 | $L_{1-1}$ | $L_{2-304}$ |
| COMPOUND 305 | $L_{1-1}$ | $L_{2-305}$ |
| COMPOUND 306 | $L_{1-1}$ | $L_{2-306}$ |
| COMPOUND 307 | $L_{1-1}$ | $L_{2-307}$ |
| COMPOUND 308 | $L_{1-1}$ | $L_{2-308}$ |
| COMPOUND 309 | $L_{1-1}$ | $L_{2-309}$ |
| COMPOUND 310 | $L_{1-1}$ | $L_{2-310}$ |
| COMPOUND 311 | $L_{1-1}$ | $L_{2-311}$ |
| COMPOUND 312 | $L_{1-1}$ | $L_{2-312}$ |
| COMPOUND 313 | $L_{1-1}$ | $L_{2-313}$ |
| COMPOUND 314 | $L_{1-1}$ | $L_{2-314}$ |
| COMPOUND 315 | $L_{1-1}$ | $L_{2-315}$ |
| COMPOUND 316 | $L_{1-1}$ | $L_{2-316}$ |
| COMPOUND 317 | $L_{1-1}$ | $L_{2-317}$ |
| COMPOUND 318 | $L_{1-1}$ | $L_{2-318}$ |
| COMPOUND 319 | $L_{1-1}$ | $L_{2-319}$ |
| COMPOUND 320 | $L_{1-1}$ | $L_{2-320}$ |
| COMPOUND 321 | $L_{1-1}$ | $L_{2-321}$ |
| COMPOUND 322 | $L_{1-1}$ | $L_{2-322}$ |
| COMPOUND 323 | $L_{1-1}$ | $L_{2-323}$ |

-continued

| | | |
|---|---|---|
| COMPOUND 324 | $L_{1-1}$ | $L_{2-324}$ |
| COMPOUND 325 | $L_{1-1}$ | $L_{2-325}$ |
| COMPOUND 326 | $L_{1-1}$ | $L_{2-326}$ |
| COMPOUND 327 | $L_{1-1}$ | $L_{2-327}$ |
| COMPOUND 328 | $L_{1-1}$ | $L_{2-328}$ |
| COMPOUND 329 | $L_{1-1}$ | $L_{2-329}$ |
| COMPOUND 330 | $L_{1-1}$ | $L_{2-330}$ |
| COMPOUND 331 | $L_{1-1}$ | $L_{2-331}$ |
| COMPOUND 332 | $L_{1-1}$ | $L_{2-332}$ |
| COMPOUND 333 | $L_{1-1}$ | $L_{2-333}$ |
| COMPOUND 334 | $L_{1-1}$ | $L_{2-334}$ |
| COMPOUND 335 | $L_{1-1}$ | $L_{2-335}$ |
| COMPOUND 336 | $L_{1-1}$ | $L_{2-336}$ |
| COMPOUND 337 | $L_{1-1}$ | $L_{2-337}$ |
| COMPOUND 338 | $L_{1-1}$ | $L_{2-338}$ |
| COMPOUND 339 | $L_{1-1}$ | $L_{2-339}$ |
| COMPOUND 340 | $L_{1-1}$ | $L_{2-340}$ |
| COMPOUND 341 | $L_{1-1}$ | $L_{2-341}$ |
| COMPOUND 342 | $L_{1-1}$ | $L_{2-342}$ |
| COMPOUND 343 | $L_{1-1}$ | $L_{2-343}$ |
| COMPOUND 344 | $L_{1-1}$ | $L_{2-344}$ |
| COMPOUND 345 | $L_{1-1}$ | $L_{2-345}$ |
| COMPOUND 346 | $L_{1-1}$ | $L_{2-346}$ |
| COMPOUND 347 | $L_{1-1}$ | $L_{2-347}$ |
| COMPOUND 348 | $L_{1-1}$ | $L_{2-348}$ |
| COMPOUND 349 | $L_{1-1}$ | $L_{2-349}$ |
| COMPOUND 350 | $L_{1-1}$ | $L_{2-350}$ |
| COMPOUND 351 | $L_{1-1}$ | $L_{2-351}$ |
| COMPOUND 352 | $L_{1-1}$ | $L_{2-352}$ |
| COMPOUND 353 | $L_{1-1}$ | $L_{2-353}$ |
| COMPOUND 354 | $L_{1-1}$ | $L_{2-354}$ |
| COMPOUND 355 | $L_{1-1}$ | $L_{2-355}$ |
| COMPOUND 356 | $L_{1-1}$ | $L_{2-356}$ |
| COMPOUND 357 | $L_{1-1}$ | $L_{2-357}$ |
| COMPOUND 358 | $L_{1-1}$ | $L_{2-358}$ |
| COMPOUND 359 | $L_{1-1}$ | $L_{2-359}$ |
| COMPOUND 360 | $L_{1-1}$ | $L_{2-360}$ |
| COMPOUND 361 | $L_{1-1}$ | $L_{2-361}$ |
| COMPOUND 362 | $L_{1-1}$ | $L_{2-362}$ |
| COMPOUND 363 | $L_{1-1}$ | $L_{2-363}$ |
| COMPOUND 364 | $L_{1-1}$ | $L_{2-364}$ |
| COMPOUND 365 | $L_{1-1}$ | $L_{2-365}$ |
| COMPOUND 366 | $L_{1-1}$ | $L_{2-366}$ |
| COMPOUND 367 | $L_{1-1}$ | $L_{2-367}$ |
| COMPOUND 368 | $L_{1-1}$ | $L_{2-368}$ |
| COMPOUND 369 | $L_{1-1}$ | $L_{2-369}$ |
| COMPOUND 370 | $L_{1-1}$ | $L_{2-370}$ |
| COMPOUND 371 | $L_{1-1}$ | $L_{2-371}$ |
| COMPOUND 372 | $L_{1-1}$ | $L_{2-372}$ |
| COMPOUND 373 | $L_{1-1}$ | $L_{2-373}$ |
| COMPOUND 374 | $L_{1-1}$ | $L_{2-374}$ |
| COMPOUND 375 | $L_{1-1}$ | $L_{2-375}$ |
| COMPOUND 376 | $L_{1-1}$ | $L_{2-376}$ |
| COMPOUND 377 | $L_{1-1}$ | $L_{2-377}$ |
| COMPOUND 378 | $L_{1-2}$ | $L_{2-1}$ |
| COMPOUND 379 | $L_{1-2}$ | $L_{2-2}$ |
| COMPOUND 380 | $L_{1-2}$ | $L_{2-3}$ |
| COMPOUND 381 | $L_{1-2}$ | $L_{2-4}$ |
| COMPOUND 382 | $L_{1-2}$ | $L_{2-5}$ |
| COMPOUND 383 | $L_{1-2}$ | $L_{2-6}$ |
| COMPOUND 384 | $L_{1-2}$ | $L_{2-7}$ |
| COMPOUND 385 | $L_{1-2}$ | $L_{2-8}$ |
| COMPOUND 386 | $L_{1-2}$ | $L_{2-9}$ |
| COMPOUND 387 | $L_{1-2}$ | $L_{2-10}$ |
| COMPOUND 388 | $L_{1-2}$ | $L_{2-11}$ |
| COMPOUND 389 | $L_{1-2}$ | $L_{2-12}$ |
| COMPOUND 390 | $L_{1-2}$ | $L_{2-13}$ |
| COMPOUND 391 | $L_{1-2}$ | $L_{2-14}$ |
| COMPOUND 392 | $L_{1-2}$ | $L_{2-15}$ |
| COMPOUND 393 | $L_{1-2}$ | $L_{2-16}$ |
| COMPOUND 394 | $L_{1-2}$ | $L_{2-17}$ |
| COMPOUND 395 | $L_{1-2}$ | $L_{2-18}$ |
| COMPOUND 396 | $L_{1-2}$ | $L_{2-19}$ |
| COMPOUND 397 | $L_{1-2}$ | $L_{2-20}$ |
| COMPOUND 398 | $L_{1-2}$ | $L_{2-21}$ |
| COMPOUND 399 | $L_{1-2}$ | $L_{2-22}$ |
| COMPOUND 400 | $L_{1-2}$ | $L_{2-23}$ |
| COMPOUND 401 | $L_{1-2}$ | $L_{2-24}$ |
| COMPOUND 402 | $L_{1-2}$ | $L_{2-25}$ |

-continued

| | | |
|---|---|---|
| COMPOUND 403 | $L_{1-2}$ | $L_{2-26}$ |
| COMPOUND 404 | $L_{1-2}$ | $L_{2-27}$ |
| COMPOUND 405 | $L_{1-2}$ | $L_{2-28}$ |
| COMPOUND 406 | $L_{1-2}$ | $L_{2-29}$ |
| COMPOUND 407 | $L_{1-2}$ | $L_{2-30}$ |
| COMPOUND 408 | $L_{1-2}$ | $L_{2-31}$ |
| COMPOUND 409 | $L_{1-2}$ | $L_{2-32}$ |
| COMPOUND 410 | $L_{1-2}$ | $L_{2-33}$ |
| COMPOUND 411 | $L_{1-2}$ | $L_{2-34}$ |
| COMPOUND 412 | $L_{1-2}$ | $L_{2-35}$ |
| COMPOUND 413 | $L_{1-2}$ | $L_{2-36}$ |
| COMPOUND 414 | $L_{1-2}$ | $L_{2-37}$ |
| COMPOUND 415 | $L_{1-2}$ | $L_{2-38}$ |
| COMPOUND 416 | $L_{1-2}$ | $L_{2-39}$ |
| COMPOUND 417 | $L_{1-2}$ | $L_{2-40}$ |
| COMPOUND 418 | $L_{1-2}$ | $L_{2-41}$ |
| COMPOUND 419 | $L_{1-2}$ | $L_{2-42}$ |
| COMPOUND 420 | $L_{1-2}$ | $L_{2-43}$ |
| COMPOUND 421 | $L_{1-2}$ | $L_{2-44}$ |
| COMPOUND 422 | $L_{1-2}$ | $L_{2-45}$ |
| COMPOUND 423 | $L_{1-2}$ | $L_{2-46}$ |
| COMPOUND 424 | $L_{1-2}$ | $L_{2-47}$ |
| COMPOUND 425 | $L_{1-2}$ | $L_{2-48}$ |
| COMPOUND 426 | $L_{1-2}$ | $L_{2-49}$ |
| COMPOUND 427 | $L_{1-2}$ | $L_{2-50}$ |
| COMPOUND 428 | $L_{1-2}$ | $L_{2-51}$ |
| COMPOUND 429 | $L_{1-2}$ | $L_{2-52}$ |
| COMPOUND 430 | $L_{1-2}$ | $L_{2-53}$ |
| COMPOUND 431 | $L_{1-2}$ | $L_{2-54}$ |
| COMPOUND 432 | $L_{1-2}$ | $L_{2-55}$ |
| COMPOUND 433 | $L_{1-2}$ | $L_{2-56}$ |
| COMPOUND 434 | $L_{1-2}$ | $L_{2-57}$ |
| COMPOUND 435 | $L_{1-2}$ | $L_{2-58}$ |
| COMPOUND 436 | $L_{1-2}$ | $L_{2-59}$ |
| COMPOUND 437 | $L_{1-2}$ | $L_{2-60}$ |
| COMPOUND 438 | $L_{1-2}$ | $L_{2-61}$ |
| COMPOUND 439 | $L_{1-2}$ | $L_{2-62}$ |
| COMPOUND 440 | $L_{1-2}$ | $L_{2-63}$ |
| COMPOUND 441 | $L_{1-2}$ | $L_{2-64}$ |
| COMPOUND 442 | $L_{1-2}$ | $L_{2-65}$ |
| COMPOUND 443 | $L_{1-2}$ | $L_{2-66}$ |
| COMPOUND 444 | $L_{1-2}$ | $L_{2-67}$ |
| COMPOUND 445 | $L_{1-2}$ | $L_{2-68}$ |
| COMPOUND 446 | $L_{1-2}$ | $L_{2-69}$ |
| COMPOUND 447 | $L_{1-2}$ | $L_{2-70}$ |
| COMPOUND 448 | $L_{1-2}$ | $L_{2-71}$ |
| COMPOUND 449 | $L_{1-2}$ | $L_{2-72}$ |
| COMPOUND 450 | $L_{1-2}$ | $L_{2-73}$ |
| COMPOUND 451 | $L_{1-2}$ | $L_{2-74}$ |
| COMPOUND 452 | $L_{1-2}$ | $L_{2-75}$ |
| COMPOUND 453 | $L_{1-2}$ | $L_{2-76}$ |
| COMPOUND 454 | $L_{1-2}$ | $L_{2-77}$ |
| COMPOUND 455 | $L_{1-2}$ | $L_{2-78}$ |
| COMPOUND 456 | $L_{1-2}$ | $L_{2-79}$ |
| COMPOUND 457 | $L_{1-2}$ | $L_{2-80}$ |
| COMPOUND 458 | $L_{1-2}$ | $L_{2-81}$ |
| COMPOUND 459 | $L_{1-2}$ | $L_{2-82}$ |
| COMPOUND 460 | $L_{1-2}$ | $L_{2-83}$ |
| COMPOUND 461 | $L_{1-2}$ | $L_{2-84}$ |
| COMPOUND 462 | $L_{1-2}$ | $L_{2-85}$ |
| COMPOUND 463 | $L_{1-2}$ | $L_{2-86}$ |
| COMPOUND 464 | $L_{1-2}$ | $L_{2-87}$ |
| COMPOUND 465 | $L_{1-2}$ | $L_{2-88}$ |
| COMPOUND 466 | $L_{1-2}$ | $L_{2-89}$ |
| COMPOUND 467 | $L_{1-2}$ | $L_{2-90}$ |
| COMPOUND 468 | $L_{1-2}$ | $L_{2-91}$ |
| COMPOUND 469 | $L_{1-2}$ | $L_{2-92}$ |
| COMPOUND 470 | $L_{1-2}$ | $L_{2-93}$ |
| COMPOUND 471 | $L_{1-2}$ | $L_{2-94}$ |
| COMPOUND 472 | $L_{1-2}$ | $L_{2-95}$ |
| COMPOUND 473 | $L_{1-2}$ | $L_{2-96}$ |
| COMPOUND 474 | $L_{1-2}$ | $L_{2-97}$ |
| COMPOUND 475 | $L_{1-2}$ | $L_{2-98}$ |
| COMPOUND 476 | $L_{1-2}$ | $L_{2-99}$ |
| COMPOUND 477 | $L_{1-2}$ | $L_{2-100}$ |
| COMPOUND 478 | $L_{1-2}$ | $L_{2-101}$ |
| COMPOUND 479 | $L_{1-2}$ | $L_{2-102}$ |
| COMPOUND 480 | $L_{1-2}$ | $L_{2-103}$ |
| COMPOUND 481 | $L_{1-2}$ | $L_{2-104}$ |

-continued

| | | |
|---|---|---|
| COMPOUND 482 | $L_{1-2}$ | $L_{2-105}$ |
| COMPOUND 483 | $L_{1-2}$ | $L_{2-106}$ |
| COMPOUND 484 | $L_{1-2}$ | $L_{2-107}$ |
| COMPOUND 485 | $L_{1-2}$ | $L_{2-108}$ |
| COMPOUND 486 | $L_{1-2}$ | $L_{2-109}$ |
| COMPOUND 487 | $L_{1-2}$ | $L_{2-110}$ |
| COMPOUND 488 | $L_{1-2}$ | $L_{2-111}$ |
| COMPOUND 489 | $L_{1-2}$ | $L_{2-112}$ |
| COMPOUND 490 | $L_{1-2}$ | $L_{2-113}$ |
| COMPOUND 491 | $L_{1-2}$ | $L_{2-114}$ |
| COMPOUND 492 | $L_{1-2}$ | $L_{2-115}$ |
| COMPOUND 493 | $L_{1-2}$ | $L_{2-116}$ |
| COMPOUND 494 | $L_{1-2}$ | $L_{2-117}$ |
| COMPOUND 495 | $L_{1-2}$ | $L_{2-118}$ |
| COMPOUND 496 | $L_{1-2}$ | $L_{2-119}$ |
| COMPOUND 497 | $L_{1-2}$ | $L_{2-120}$ |
| COMPOUND 498 | $L_{1-2}$ | $L_{2-121}$ |
| COMPOUND 499 | $L_{1-2}$ | $L_{2-122}$ |
| COMPOUND 500 | $L_{1-2}$ | $L_{2-123}$ |
| COMPOUND 501 | $L_{1-2}$ | $L_{2-124}$ |
| COMPOUND 502 | $L_{1-2}$ | $L_{2-125}$ |
| COMPOUND 503 | $L_{1-2}$ | $L_{2-126}$ |
| COMPOUND 504 | $L_{1-2}$ | $L_{2-127}$ |
| COMPOUND 505 | $L_{1-2}$ | $L_{2-128}$ |
| COMPOUND 506 | $L_{1-2}$ | $L_{2-129}$ |
| COMPOUND 507 | $L_{1-2}$ | $L_{2-130}$ |
| COMPOUND 508 | $L_{1-2}$ | $L_{2-131}$ |
| COMPOUND 509 | $L_{1-2}$ | $L_{2-132}$ |
| COMPOUND 510 | $L_{1-2}$ | $L_{2-133}$ |
| COMPOUND 511 | $L_{1-2}$ | $L_{2-134}$ |
| COMPOUND 512 | $L_{1-2}$ | $L_{2-135}$ |
| COMPOUND 513 | $L_{1-2}$ | $L_{2-136}$ |
| COMPOUND 514 | $L_{1-2}$ | $L_{2-137}$ |
| COMPOUND 515 | $L_{1-2}$ | $L_{2-138}$ |
| COMPOUND 516 | $L_{1-2}$ | $L_{2-139}$ |
| COMPOUND 517 | $L_{1-2}$ | $L_{2-140}$ |
| COMPOUND 518 | $L_{1-2}$ | $L_{2-141}$ |
| COMPOUND 519 | $L_{1-2}$ | $L_{2-142}$ |
| COMPOUND 520 | $L_{1-2}$ | $L_{2-143}$ |
| COMPOUND 521 | $L_{1-2}$ | $L_{2-144}$ |
| COMPOUND 522 | $L_{1-2}$ | $L_{2-145}$ |
| COMPOUND 523 | $L_{1-2}$ | $L_{2-146}$ |
| COMPOUND 524 | $L_{1-2}$ | $L_{2-147}$ |
| COMPOUND 525 | $L_{1-2}$ | $L_{2-148}$ |
| COMPOUND 526 | $L_{1-2}$ | $L_{2-149}$ |
| COMPOUND 527 | $L_{1-2}$ | $L_{2-150}$ |
| COMPOUND 528 | $L_{1-2}$ | $L_{2-151}$ |
| COMPOUND 529 | $L_{1-2}$ | $L_{2-152}$ |
| COMPOUND 530 | $L_{1-2}$ | $L_{2-153}$ |
| COMPOUND 531 | $L_{1-2}$ | $L_{2-154}$ |
| COMPOUND 532 | $L_{1-2}$ | $L_{2-155}$ |
| COMPOUND 533 | $L_{1-2}$ | $L_{2-156}$ |
| COMPOUND 534 | $L_{1-2}$ | $L_{2-157}$ |
| COMPOUND 535 | $L_{1-2}$ | $L_{2-158}$ |
| COMPOUND 536 | $L_{1-2}$ | $L_{2-159}$ |
| COMPOUND 537 | $L_{1-2}$ | $L_{2-160}$ |
| COMPOUND 538 | $L_{1-2}$ | $L_{2-161}$ |
| COMPOUND 539 | $L_{1-2}$ | $L_{2-162}$ |
| COMPOUND 540 | $L_{1-2}$ | $L_{2-163}$ |
| COMPOUND 541 | $L_{1-2}$ | $L_{2-164}$ |
| COMPOUND 542 | $L_{1-2}$ | $L_{2-165}$ |
| COMPOUND 543 | $L_{1-2}$ | $L_{2-166}$ |
| COMPOUND 544 | $L_{1-2}$ | $L_{2-167}$ |
| COMPOUND 545 | $L_{1-2}$ | $L_{2-168}$ |
| COMPOUND 546 | $L_{1-2}$ | $L_{2-169}$ |
| COMPOUND 547 | $L_{1-2}$ | $L_{2-170}$ |
| COMPOUND 548 | $L_{1-2}$ | $L_{2-171}$ |
| COMPOUND 549 | $L_{1-2}$ | $L_{2-172}$ |
| COMPOUND 550 | $L_{1-2}$ | $L_{2-173}$ |
| COMPOUND 551 | $L_{1-2}$ | $L_{2-174}$ |
| COMPOUND 552 | $L_{1-2}$ | $L_{2-175}$ |
| COMPOUND 553 | $L_{1-2}$ | $L_{2-176}$ |
| COMPOUND 554 | $L_{1-2}$ | $L_{2-177}$ |
| COMPOUND 555 | $L_{1-2}$ | $L_{2-178}$ |
| COMPOUND 556 | $L_{1-2}$ | $L_{2-179}$ |
| COMPOUND 557 | $L_{1-2}$ | $L_{2-180}$ |
| COMPOUND 558 | $L_{1-2}$ | $L_{2-181}$ |
| COMPOUND 559 | $L_{1-2}$ | $L_{2-182}$ |
| COMPOUND 560 | $L_{1-2}$ | $L_{2-183}$ |

-continued

| | | |
|---|---|---|
| COMPOUND 561 | $L_{1-2}$ | $L_{2-184}$ |
| COMPOUND 562 | $L_{1-2}$ | $L_{2-185}$ |
| COMPOUND 563 | $L_{1-2}$ | $L_{2-186}$ |
| COMPOUND 564 | $L_{1-2}$ | $L_{2-187}$ |
| COMPOUND 565 | $L_{1-2}$ | $L_{2-188}$ |
| COMPOUND 566 | $L_{1-2}$ | $L_{2-189}$ |
| COMPOUND 567 | $L_{1-2}$ | $L_{2-190}$ |
| COMPOUND 568 | $L_{1-2}$ | $L_{2-191}$ |
| COMPOUND 569 | $L_{1-2}$ | $L_{2-192}$ |
| COMPOUND 570 | $L_{1-2}$ | $L_{2-193}$ |
| COMPOUND 571 | $L_{1-2}$ | $L_{2-194}$ |
| COMPOUND 572 | $L_{1-2}$ | $L_{2-195}$ |
| COMPOUND 573 | $L_{1-2}$ | $L_{2-196}$ |
| COMPOUND 574 | $L_{1-2}$ | $L_{2-197}$ |
| COMPOUND 575 | $L_{1-2}$ | $L_{2-198}$ |
| COMPOUND 576 | $L_{1-2}$ | $L_{2-199}$ |
| COMPOUND 577 | $L_{1-2}$ | $L_{2-200}$ |
| COMPOUND 578 | $L_{1-2}$ | $L_{2-201}$ |
| COMPOUND 579 | $L_{1-2}$ | $L_{2-202}$ |
| COMPOUND 580 | $L_{1-2}$ | $L_{2-203}$ |
| COMPOUND 581 | $L_{1-2}$ | $L_{2-204}$ |
| COMPOUND 582 | $L_{1-2}$ | $L_{2-205}$ |
| COMPOUND 583 | $L_{1-2}$ | $L_{2-206}$ |
| COMPOUND 584 | $L_{1-2}$ | $L_{2-207}$ |
| COMPOUND 585 | $L_{1-2}$ | $L_{2-208}$ |
| COMPOUND 586 | $L_{1-2}$ | $L_{2-209}$ |
| COMPOUND 587 | $L_{1-2}$ | $L_{2-210}$ |
| COMPOUND 588 | $L_{1-2}$ | $L_{2-211}$ |
| COMPOUND 589 | $L_{1-2}$ | $L_{2-212}$ |
| COMPOUND 590 | $L_{1-2}$ | $L_{2-213}$ |
| COMPOUND 591 | $L_{1-2}$ | $L_{2-214}$ |
| COMPOUND 592 | $L_{1-2}$ | $L_{2-215}$ |
| COMPOUND 593 | $L_{1-2}$ | $L_{2-216}$ |
| COMPOUND 594 | $L_{1-2}$ | $L_{2-217}$ |
| COMPOUND 595 | $L_{1-2}$ | $L_{2-218}$ |
| COMPOUND 596 | $L_{1-2}$ | $L_{2-219}$ |
| COMPOUND 597 | $L_{1-2}$ | $L_{2-220}$ |
| COMPOUND 598 | $L_{1-2}$ | $L_{2-221}$ |
| COMPOUND 599 | $L_{1-2}$ | $L_{2-222}$ |
| COMPOUND 600 | $L_{1-2}$ | $L_{2-223}$ |
| COMPOUND 601 | $L_{1-2}$ | $L_{2-224}$ |
| COMPOUND 602 | $L_{1-2}$ | $L_{2-225}$ |
| COMPOUND 603 | $L_{1-2}$ | $L_{2-226}$ |
| COMPOUND 604 | $L_{1-2}$ | $L_{2-227}$ |
| COMPOUND 605 | $L_{1-2}$ | $L_{2-228}$ |
| COMPOUND 606 | $L_{1-2}$ | $L_{2-229}$ |
| COMPOUND 607 | $L_{1-2}$ | $L_{2-230}$ |
| COMPOUND 608 | $L_{1-2}$ | $L_{2-231}$ |
| COMPOUND 609 | $L_{1-2}$ | $L_{2-232}$ |
| COMPOUND 610 | $L_{1-2}$ | $L_{2-233}$ |
| COMPOUND 611 | $L_{1-2}$ | $L_{2-234}$ |
| COMPOUND 612 | $L_{1-2}$ | $L_{2-235}$ |
| COMPOUND 613 | $L_{1-2}$ | $L_{2-236}$ |
| COMPOUND 614 | $L_{1-2}$ | $L_{2-237}$ |
| COMPOUND 615 | $L_{1-2}$ | $L_{2-238}$ |
| COMPOUND 616 | $L_{1-2}$ | $L_{2-239}$ |
| COMPOUND 617 | $L_{1-2}$ | $L_{2-240}$ |
| COMPOUND 618 | $L_{1-2}$ | $L_{2-241}$ |
| COMPOUND 619 | $L_{1-2}$ | $L_{2-242}$ |
| COMPOUND 620 | $L_{1-2}$ | $L_{2-243}$ |
| COMPOUND 621 | $L_{1-2}$ | $L_{2-244}$ |
| COMPOUND 622 | $L_{1-2}$ | $L_{2-245}$ |
| COMPOUND 623 | $L_{1-2}$ | $L_{2-246}$ |
| COMPOUND 624 | $L_{1-2}$ | $L_{2-247}$ |
| COMPOUND 625 | $L_{1-2}$ | $L_{2-248}$ |
| COMPOUND 626 | $L_{1-2}$ | $L_{2-249}$ |
| COMPOUND 627 | $L_{1-2}$ | $L_{2-250}$ |
| COMPOUND 628 | $L_{1-2}$ | $L_{2-251}$ |
| COMPOUND 629 | $L_{1-2}$ | $L_{2-252}$ |
| COMPOUND 630 | $L_{1-2}$ | $L_{2-253}$ |
| COMPOUND 631 | $L_{1-2}$ | $L_{2-254}$ |
| COMPOUND 632 | $L_{1-2}$ | $L_{2-255}$ |
| COMPOUND 633 | $L_{1-2}$ | $L_{2-256}$ |
| COMPOUND 634 | $L_{1-2}$ | $L_{2-257}$ |
| COMPOUND 635 | $L_{1-2}$ | $L_{2-258}$ |
| COMPOUND 636 | $L_{1-2}$ | $L_{2-259}$ |
| COMPOUND 637 | $L_{1-2}$ | $L_{2-260}$ |
| COMPOUND 638 | $L_{1-2}$ | $L_{2-261}$ |
| COMPOUND 639 | $L_{1-2}$ | $L_{2-262}$ |

-continued

| | | |
|---|---|---|
| COMPOUND 640 | $L_{1-2}$ | $L_{2-263}$ |
| COMPOUND 641 | $L_{1-2}$ | $L_{2-264}$ |
| COMPOUND 642 | $L_{1-2}$ | $L_{2-265}$ |
| COMPOUND 643 | $L_{1-2}$ | $L_{2-266}$ |
| COMPOUND 644 | $L_{1-2}$ | $L_{2-267}$ |
| COMPOUND 645 | $L_{1-2}$ | $L_{2-268}$ |
| COMPOUND 646 | $L_{1-2}$ | $L_{2-269}$ |
| COMPOUND 647 | $L_{1-2}$ | $L_{2-270}$ |
| COMPOUND 648 | $L_{1-2}$ | $L_{2-271}$ |
| COMPOUND 649 | $L_{1-2}$ | $L_{2-272}$ |
| COMPOUND 650 | $L_{1-2}$ | $L_{2-273}$ |
| COMPOUND 651 | $L_{1-2}$ | $L_{2-274}$ |
| COMPOUND 652 | $L_{1-2}$ | $L_{2-275}$ |
| COMPOUND 653 | $L_{1-2}$ | $L_{2-276}$ |
| COMPOUND 654 | $L_{1-2}$ | $L_{2-277}$ |
| COMPOUND 655 | $L_{1-2}$ | $L_{2-278}$ |
| COMPOUND 656 | $L_{1-2}$ | $L_{2-279}$ |
| COMPOUND 657 | $L_{1-2}$ | $L_{2-280}$ |
| COMPOUND 658 | $L_{1-2}$ | $L_{2-281}$ |
| COMPOUND 659 | $L_{1-2}$ | $L_{2-282}$ |
| COMPOUND 660 | $L_{1-2}$ | $L_{2-283}$ |
| COMPOUND 661 | $L_{1-2}$ | $L_{2-284}$ |
| COMPOUND 662 | $L_{1-2}$ | $L_{2-285}$ |
| COMPOUND 663 | $L_{1-2}$ | $L_{2-286}$ |
| COMPOUND 664 | $L_{1-2}$ | $L_{2-287}$ |
| COMPOUND 665 | $L_{1-2}$ | $L_{2-288}$ |
| COMPOUND 666 | $L_{1-2}$ | $L_{2-289}$ |
| COMPOUND 667 | $L_{1-2}$ | $L_{2-290}$ |
| COMPOUND 668 | $L_{1-2}$ | $L_{2-291}$ |
| COMPOUND 669 | $L_{1-2}$ | $L_{2-292}$ |
| COMPOUND 670 | $L_{1-2}$ | $L_{2-293}$ |
| COMPOUND 671 | $L_{1-2}$ | $L_{2-294}$ |
| COMPOUND 672 | $L_{1-2}$ | $L_{2-295}$ |
| COMPOUND 673 | $L_{1-2}$ | $L_{2-296}$ |
| COMPOUND 674 | $L_{1-2}$ | $L_{2-297}$ |
| COMPOUND 675 | $L_{1-2}$ | $L_{2-298}$ |
| COMPOUND 676 | $L_{1-2}$ | $L_{2-299}$ |
| COMPOUND 677 | $L_{1-2}$ | $L_{2-300}$ |
| COMPOUND 678 | $L_{1-2}$ | $L_{2-301}$ |
| COMPOUND 679 | $L_{1-2}$ | $L_{2-302}$ |
| COMPOUND 680 | $L_{1-2}$ | $L_{2-303}$ |
| COMPOUND 681 | $L_{1-2}$ | $L_{2-304}$ |
| COMPOUND 682 | $L_{1-2}$ | $L_{2-305}$ |
| COMPOUND 683 | $L_{1-2}$ | $L_{2-306}$ |
| COMPOUND 684 | $L_{1-2}$ | $L_{2-307}$ |
| COMPOUND 685 | $L_{1-2}$ | $L_{2-308}$ |
| COMPOUND 686 | $L_{1-2}$ | $L_{2-309}$ |
| COMPOUND 687 | $L_{1-2}$ | $L_{2-310}$ |
| COMPOUND 688 | $L_{1-2}$ | $L_{2-311}$ |
| COMPOUND 689 | $L_{1-2}$ | $L_{2-312}$ |
| COMPOUND 690 | $L_{1-2}$ | $L_{2-313}$ |
| COMPOUND 691 | $L_{1-2}$ | $L_{2-314}$ |
| COMPOUND 692 | $L_{1-2}$ | $L_{2-315}$ |
| COMPOUND 693 | $L_{1-2}$ | $L_{2-316}$ |
| COMPOUND 694 | $L_{1-2}$ | $L_{2-317}$ |
| COMPOUND 695 | $L_{1-2}$ | $L_{2-318}$ |
| COMPOUND 696 | $L_{1-2}$ | $L_{2-319}$ |
| COMPOUND 697 | $L_{1-2}$ | $L_{2-320}$ |
| COMPOUND 698 | $L_{1-2}$ | $L_{2-321}$ |
| COMPOUND 699 | $L_{1-2}$ | $L_{2-322}$ |
| COMPOUND 700 | $L_{1-2}$ | $L_{2-323}$ |
| COMPOUND 701 | $L_{1-2}$ | $L_{2-324}$ |
| COMPOUND 702 | $L_{1-2}$ | $L_{2-325}$ |
| COMPOUND 703 | $L_{1-2}$ | $L_{2-326}$ |
| COMPOUND 704 | $L_{1-2}$ | $L_{2-327}$ |
| COMPOUND 705 | $L_{1-2}$ | $L_{2-328}$ |
| COMPOUND 706 | $L_{1-2}$ | $L_{2-329}$ |
| COMPOUND 707 | $L_{1-2}$ | $L_{2-330}$ |
| COMPOUND 708 | $L_{1-2}$ | $L_{2-331}$ |
| COMPOUND 709 | $L_{1-2}$ | $L_{2-332}$ |
| COMPOUND 710 | $L_{1-2}$ | $L_{2-333}$ |
| COMPOUND 711 | $L_{1-2}$ | $L_{2-334}$ |
| COMPOUND 712 | $L_{1-2}$ | $L_{2-335}$ |
| COMPOUND 713 | $L_{1-2}$ | $L_{2-336}$ |
| COMPOUND 714 | $L_{1-2}$ | $L_{2-337}$ |
| COMPOUND 715 | $L_{1-2}$ | $L_{2-338}$ |
| COMPOUND 716 | $L_{1-2}$ | $L_{2-339}$ |
| COMPOUND 717 | $L_{1-2}$ | $L_{2-340}$ |
| COMPOUND 718 | $L_{1-2}$ | $L_{2-341}$ |
| COMPOUND 719 | $L_{1-2}$ | $L_{2-342}$ |
| COMPOUND 720 | $L_{1-2}$ | $L_{2-343}$ |
| COMPOUND 721 | $L_{1-2}$ | $L_{2-344}$ |
| COMPOUND 722 | $L_{1-2}$ | $L_{2-345}$ |
| COMPOUND 723 | $L_{1-2}$ | $L_{2-346}$ |
| COMPOUND 724 | $L_{1-2}$ | $L_{2-347}$ |
| COMPOUND 725 | $L_{1-2}$ | $L_{2-348}$ |
| COMPOUND 726 | $L_{1-2}$ | $L_{2-349}$ |
| COMPOUND 727 | $L_{1-2}$ | $L_{2-350}$ |
| COMPOUND 728 | $L_{1-2}$ | $L_{2-351}$ |
| COMPOUND 729 | $L_{1-2}$ | $L_{2-352}$ |
| COMPOUND 730 | $L_{1-2}$ | $L_{2-353}$ |
| COMPOUND 731 | $L_{1-2}$ | $L_{2-354}$ |
| COMPOUND 732 | $L_{1-2}$ | $L_{2-355}$ |
| COMPOUND 733 | $L_{1-2}$ | $L_{2-356}$ |
| COMPOUND 734 | $L_{1-2}$ | $L_{2-357}$ |
| COMPOUND 735 | $L_{1-2}$ | $L_{2-358}$ |
| COMPOUND 736 | $L_{1-2}$ | $L_{2-359}$ |
| COMPOUND 737 | $L_{1-2}$ | $L_{2-360}$ |
| COMPOUND 738 | $L_{1-2}$ | $L_{2-361}$ |
| COMPOUND 739 | $L_{1-2}$ | $L_{2-362}$ |
| COMPOUND 740 | $L_{1-2}$ | $L_{2-363}$ |
| COMPOUND 741 | $L_{1-2}$ | $L_{2-364}$ |
| COMPOUND 742 | $L_{1-2}$ | $L_{2-365}$ |
| COMPOUND 743 | $L_{1-2}$ | $L_{2-366}$ |
| COMPOUND 744 | $L_{1-2}$ | $L_{2-367}$ |
| COMPOUND 745 | $L_{1-2}$ | $L_{2-368}$ |
| COMPOUND 746 | $L_{1-2}$ | $L_{2-369}$ |
| COMPOUND 747 | $L_{1-2}$ | $L_{2-370}$ |
| COMPOUND 748 | $L_{1-2}$ | $L_{2-371}$ |
| COMPOUND 749 | $L_{1-2}$ | $L_{2-372}$ |
| COMPOUND 750 | $L_{1-2}$ | $L_{2-373}$ |
| COMPOUND 751 | $L_{1-2}$ | $L_{2-374}$ |
| COMPOUND 752 | $L_{1-2}$ | $L_{2-375}$ |
| COMPOUND 753 | $L_{1-2}$ | $L_{2-376}$ |
| COMPOUND 754 | $L_{1-2}$ | $L_{2-377}$ |
| COMPOUND 755 | $L_{1-3}$ | $L_{2-1}$ |
| COMPOUND 756 | $L_{1-3}$ | $L_{2-2}$ |
| COMPOUND 757 | $L_{1-3}$ | $L_{2-3}$ |
| COMPOUND 758 | $L_{1-3}$ | $L_{2-4}$ |
| COMPOUND 759 | $L_{1-3}$ | $L_{2-5}$ |
| COMPOUND 760 | $L_{1-3}$ | $L_{2-6}$ |
| COMPOUND 761 | $L_{1-3}$ | $L_{2-7}$ |
| COMPOUND 762 | $L_{1-3}$ | $L_{2-8}$ |
| COMPOUND 763 | $L_{1-3}$ | $L_{2-9}$ |
| COMPOUND 764 | $L_{1-3}$ | $L_{2-10}$ |
| COMPOUND 765 | $L_{1-3}$ | $L_{2-11}$ |
| COMPOUND 766 | $L_{1-3}$ | $L_{2-12}$ |
| COMPOUND 767 | $L_{1-3}$ | $L_{2-13}$ |
| COMPOUND 768 | $L_{1-3}$ | $L_{2-14}$ |
| COMPOUND 769 | $L_{1-3}$ | $L_{2-15}$ |
| COMPOUND 770 | $L_{1-3}$ | $L_{2-16}$ |
| COMPOUND 771 | $L_{1-3}$ | $L_{2-17}$ |
| COMPOUND 772 | $L_{1-3}$ | $L_{2-18}$ |
| COMPOUND 773 | $L_{1-3}$ | $L_{2-19}$ |
| COMPOUND 774 | $L_{1-3}$ | $L_{2-20}$ |
| COMPOUND 775 | $L_{1-3}$ | $L_{2-21}$ |
| COMPOUND 776 | $L_{1-3}$ | $L_{2-22}$ |
| COMPOUND 777 | $L_{1-3}$ | $L_{2-23}$ |
| COMPOUND 778 | $L_{1-3}$ | $L_{2-24}$ |
| COMPOUND 779 | $L_{1-3}$ | $L_{2-25}$ |
| COMPOUND 780 | $L_{1-3}$ | $L_{2-26}$ |
| COMPOUND 781 | $L_{1-3}$ | $L_{2-27}$ |
| COMPOUND 782 | $L_{1-3}$ | $L_{2-28}$ |
| COMPOUND 783 | $L_{1-3}$ | $L_{2-29}$ |
| COMPOUND 784 | $L_{1-3}$ | $L_{2-30}$ |
| COMPOUND 785 | $L_{1-3}$ | $L_{2-31}$ |
| COMPOUND 786 | $L_{1-3}$ | $L_{2-32}$ |
| COMPOUND 787 | $L_{1-3}$ | $L_{2-33}$ |
| COMPOUND 788 | $L_{1-3}$ | $L_{2-34}$ |
| COMPOUND 789 | $L_{1-3}$ | $L_{2-35}$ |
| COMPOUND 790 | $L_{1-3}$ | $L_{2-36}$ |
| COMPOUND 791 | $L_{1-3}$ | $L_{2-37}$ |
| COMPOUND 792 | $L_{1-3}$ | $L_{2-38}$ |
| COMPOUND 793 | $L_{1-3}$ | $L_{2-39}$ |
| COMPOUND 794 | $L_{1-3}$ | $L_{2-40}$ |
| COMPOUND 795 | $L_{1-3}$ | $L_{2-41}$ |
| COMPOUND 796 | $L_{1-3}$ | $L_{2-42}$ |
| COMPOUND 797 | $L_{1-3}$ | $L_{2-43}$ |

-continued

| | | |
|---|---|---|
| COMPOUND 798 | $L_{1-3}$ | $L_{2-44}$ |
| COMPOUND 799 | $L_{1-3}$ | $L_{2-45}$ |
| COMPOUND 800 | $L_{1-3}$ | $L_{2-46}$ |
| COMPOUND 801 | $L_{1-3}$ | $L_{2-47}$ |
| COMPOUND 802 | $L_{1-3}$ | $L_{2-48}$ |
| COMPOUND 803 | $L_{1-3}$ | $L_{2-49}$ |
| COMPOUND 804 | $L_{1-3}$ | $L_{2-50}$ |
| COMPOUND 805 | $L_{1-3}$ | $L_{2-51}$ |
| COMPOUND 806 | $L_{1-3}$ | $L_{2-52}$ |
| COMPOUND 807 | $L_{1-3}$ | $L_{2-53}$ |
| COMPOUND 808 | $L_{1-3}$ | $L_{2-54}$ |
| COMPOUND 809 | $L_{1-3}$ | $L_{2-55}$ |
| COMPOUND 810 | $L_{1-3}$ | $L_{2-56}$ |
| COMPOUND 811 | $L_{1-3}$ | $L_{2-57}$ |
| COMPOUND 812 | $L_{1-3}$ | $L_{2-58}$ |
| COMPOUND 813 | $L_{1-3}$ | $L_{2-59}$ |
| COMPOUND 814 | $L_{1-3}$ | $L_{2-60}$ |
| COMPOUND 815 | $L_{1-3}$ | $L_{2-61}$ |
| COMPOUND 816 | $L_{1-3}$ | $L_{2-62}$ |
| COMPOUND 817 | $L_{1-3}$ | $L_{2-63}$ |
| COMPOUND 818 | $L_{1-3}$ | $L_{2-64}$ |
| COMPOUND 819 | $L_{1-3}$ | $L_{2-65}$ |
| COMPOUND 820 | $L_{1-3}$ | $L_{2-66}$ |
| COMPOUND 821 | $L_{1-3}$ | $L_{2-67}$ |
| COMPOUND 822 | $L_{1-3}$ | $L_{2-68}$ |
| COMPOUND 823 | $L_{1-3}$ | $L_{2-69}$ |
| COMPOUND 824 | $L_{1-3}$ | $L_{2-70}$ |
| COMPOUND 825 | $L_{1-3}$ | $L_{2-71}$ |
| COMPOUND 826 | $L_{1-3}$ | $L_{2-72}$ |
| COMPOUND 827 | $L_{1-3}$ | $L_{2-73}$ |
| COMPOUND 828 | $L_{1-3}$ | $L_{2-74}$ |
| COMPOUND 829 | $L_{1-3}$ | $L_{2-75}$ |
| COMPOUND 830 | $L_{1-3}$ | $L_{2-76}$ |
| COMPOUND 831 | $L_{1-3}$ | $L_{2-77}$ |
| COMPOUND 832 | $L_{1-3}$ | $L_{2-78}$ |
| COMPOUND 833 | $L_{1-3}$ | $L_{2-79}$ |
| COMPOUND 834 | $L_{1-3}$ | $L_{2-80}$ |
| COMPOUND 835 | $L_{1-3}$ | $L_{2-81}$ |
| COMPOUND 836 | $L_{1-3}$ | $L_{2-82}$ |
| COMPOUND 837 | $L_{1-3}$ | $L_{2-83}$ |
| COMPOUND 838 | $L_{1-3}$ | $L_{2-84}$ |
| COMPOUND 839 | $L_{1-3}$ | $L_{2-85}$ |
| COMPOUND 840 | $L_{1-3}$ | $L_{2-86}$ |
| COMPOUND 841 | $L_{1-3}$ | $L_{2-87}$ |
| COMPOUND 842 | $L_{1-3}$ | $L_{2-88}$ |
| COMPOUND 843 | $L_{1-3}$ | $L_{2-89}$ |
| COMPOUND 844 | $L_{1-3}$ | $L_{2-90}$ |
| COMPOUND 845 | $L_{1-3}$ | $L_{2-91}$ |
| COMPOUND 846 | $L_{1-3}$ | $L_{2-92}$ |
| COMPOUND 847 | $L_{1-3}$ | $L_{2-93}$ |
| COMPOUND 848 | $L_{1-3}$ | $L_{2-94}$ |
| COMPOUND 849 | $L_{1-3}$ | $L_{2-95}$ |
| COMPOUND 850 | $L_{1-3}$ | $L_{2-96}$ |
| COMPOUND 851 | $L_{1-3}$ | $L_{2-97}$ |
| COMPOUND 852 | $L_{1-3}$ | $L_{2-98}$ |
| COMPOUND 853 | $L_{1-3}$ | $L_{2-99}$ |
| COMPOUND 854 | $L_{1-3}$ | $L_{2-100}$ |
| COMPOUND 855 | $L_{1-3}$ | $L_{2-101}$ |
| COMPOUND 856 | $L_{1-3}$ | $L_{2-102}$ |
| COMPOUND 857 | $L_{1-3}$ | $L_{2-103}$ |
| COMPOUND 858 | $L_{1-3}$ | $L_{2-104}$ |
| COMPOUND 859 | $L_{1-3}$ | $L_{2-105}$ |
| COMPOUND 860 | $L_{1-3}$ | $L_{2-106}$ |
| COMPOUND 861 | $L_{1-3}$ | $L_{2-107}$ |
| COMPOUND 862 | $L_{1-3}$ | $L_{2-108}$ |
| COMPOUND 863 | $L_{1-3}$ | $L_{2-109}$ |
| COMPOUND 864 | $L_{1-3}$ | $L_{2-110}$ |
| COMPOUND 865 | $L_{1-3}$ | $L_{2-111}$ |
| COMPOUND 866 | $L_{1-3}$ | $L_{2-112}$ |
| COMPOUND 867 | $L_{1-3}$ | $L_{2-113}$ |
| COMPOUND 868 | $L_{1-3}$ | $L_{2-114}$ |
| COMPOUND 869 | $L_{1-3}$ | $L_{2-115}$ |
| COMPOUND 870 | $L_{1-3}$ | $L_{2-116}$ |
| COMPOUND 871 | $L_{1-3}$ | $L_{2-117}$ |
| COMPOUND 872 | $L_{1-3}$ | $L_{2-118}$ |
| COMPOUND 873 | $L_{1-3}$ | $L_{2-119}$ |
| COMPOUND 874 | $L_{1-3}$ | $L_{2-120}$ |
| COMPOUND 875 | $L_{1-3}$ | $L_{2-121}$ |
| COMPOUND 876 | $L_{1-3}$ | $L_{2-122}$ |

-continued

| | | |
|---|---|---|
| COMPOUND 877 | $L_{1-3}$ | $L_{2-123}$ |
| COMPOUND 878 | $L_{1-3}$ | $L_{2-124}$ |
| COMPOUND 879 | $L_{1-3}$ | $L_{2-125}$ |
| COMPOUND 880 | $L_{1-3}$ | $L_{2-126}$ |
| COMPOUND 881 | $L_{1-3}$ | $L_{2-127}$ |
| COMPOUND 882 | $L_{1-3}$ | $L_{2-128}$ |
| COMPOUND 883 | $L_{1-3}$ | $L_{2-129}$ |
| COMPOUND 884 | $L_{1-3}$ | $L_{2-130}$ |
| COMPOUND 885 | $L_{1-3}$ | $L_{2-131}$ |
| COMPOUND 886 | $L_{1-3}$ | $L_{2-132}$ |
| COMPOUND 887 | $L_{1-3}$ | $L_{2-133}$ |
| COMPOUND 888 | $L_{1-3}$ | $L_{2-134}$ |
| COMPOUND 889 | $L_{1-3}$ | $L_{2-135}$ |
| COMPOUND 890 | $L_{1-3}$ | $L_{2-136}$ |
| COMPOUND 891 | $L_{1-3}$ | $L_{2-137}$ |
| COMPOUND 892 | $L_{1-3}$ | $L_{2-138}$ |
| COMPOUND 893 | $L_{1-3}$ | $L_{2-139}$ |
| COMPOUND 894 | $L_{1-3}$ | $L_{2-140}$ |
| COMPOUND 895 | $L_{1-3}$ | $L_{2-141}$ |
| COMPOUND 896 | $L_{1-3}$ | $L_{2-142}$ |
| COMPOUND 897 | $L_{1-3}$ | $L_{2-143}$ |
| COMPOUND 898 | $L_{1-3}$ | $L_{2-144}$ |
| COMPOUND 899 | $L_{1-3}$ | $L_{2-145}$ |
| COMPOUND 900 | $L_{1-3}$ | $L_{2-146}$ |
| COMPOUND 901 | $L_{1-3}$ | $L_{2-147}$ |
| COMPOUND 902 | $L_{1-3}$ | $L_{2-148}$ |
| COMPOUND 903 | $L_{1-3}$ | $L_{2-149}$ |
| COMPOUND 904 | $L_{1-3}$ | $L_{2-150}$ |
| COMPOUND 905 | $L_{1-3}$ | $L_{2-151}$ |
| COMPOUND 906 | $L_{1-3}$ | $L_{2-152}$ |
| COMPOUND 907 | $L_{1-3}$ | $L_{2-153}$ |
| COMPOUND 908 | $L_{1-3}$ | $L_{2-154}$ |
| COMPOUND 909 | $L_{1-3}$ | $L_{2-155}$ |
| COMPOUND 910 | $L_{1-3}$ | $L_{2-156}$ |
| COMPOUND 911 | $L_{1-3}$ | $L_{2-157}$ |
| COMPOUND 912 | $L_{1-3}$ | $L_{2-158}$ |
| COMPOUND 913 | $L_{1-3}$ | $L_{2-159}$ |
| COMPOUND 914 | $L_{1-3}$ | $L_{2-160}$ |
| COMPOUND 915 | $L_{1-3}$ | $L_{2-161}$ |
| COMPOUND 916 | $L_{1-3}$ | $L_{2-162}$ |
| COMPOUND 917 | $L_{1-3}$ | $L_{2-163}$ |
| COMPOUND 918 | $L_{1-3}$ | $L_{2-164}$ |
| COMPOUND 919 | $L_{1-3}$ | $L_{2-165}$ |
| COMPOUND 920 | $L_{1-3}$ | $L_{2-166}$ |
| COMPOUND 921 | $L_{1-3}$ | $L_{2-167}$ |
| COMPOUND 922 | $L_{1-3}$ | $L_{2-168}$ |
| COMPOUND 923 | $L_{1-3}$ | $L_{2-169}$ |
| COMPOUND 924 | $L_{1-3}$ | $L_{2-170}$ |
| COMPOUND 925 | $L_{1-3}$ | $L_{2-171}$ |
| COMPOUND 926 | $L_{1-3}$ | $L_{2-172}$ |
| COMPOUND 927 | $L_{1-3}$ | $L_{2-173}$ |
| COMPOUND 928 | $L_{1-3}$ | $L_{2-174}$ |
| COMPOUND 929 | $L_{1-3}$ | $L_{2-175}$ |
| COMPOUND 930 | $L_{1-3}$ | $L_{2-176}$ |
| COMPOUND 931 | $L_{1-3}$ | $L_{2-177}$ |
| COMPOUND 932 | $L_{1-3}$ | $L_{2-178}$ |
| COMPOUND 933 | $L_{1-3}$ | $L_{2-179}$ |
| COMPOUND 934 | $L_{1-3}$ | $L_{2-180}$ |
| COMPOUND 935 | $L_{1-3}$ | $L_{2-181}$ |
| COMPOUND 936 | $L_{1-3}$ | $L_{2-182}$ |
| COMPOUND 937 | $L_{1-3}$ | $L_{2-183}$ |
| COMPOUND 938 | $L_{1-3}$ | $L_{2-184}$ |
| COMPOUND 939 | $L_{1-3}$ | $L_{2-185}$ |
| COMPOUND 940 | $L_{1-3}$ | $L_{2-186}$ |
| COMPOUND 941 | $L_{1-3}$ | $L_{2-187}$ |
| COMPOUND 942 | $L_{1-3}$ | $L_{2-188}$ |
| COMPOUND 943 | $L_{1-3}$ | $L_{2-189}$ |
| COMPOUND 944 | $L_{1-3}$ | $L_{2-190}$ |
| COMPOUND 945 | $L_{1-3}$ | $L_{2-191}$ |
| COMPOUND 946 | $L_{1-3}$ | $L_{2-192}$ |
| COMPOUND 947 | $L_{1-3}$ | $L_{2-193}$ |
| COMPOUND 948 | $L_{1-3}$ | $L_{2-194}$ |
| COMPOUND 949 | $L_{1-3}$ | $L_{2-195}$ |
| COMPOUND 950 | $L_{1-3}$ | $L_{2-196}$ |
| COMPOUND 951 | $L_{1-3}$ | $L_{2-197}$ |
| COMPOUND 952 | $L_{1-3}$ | $L_{2-198}$ |
| COMPOUND 953 | $L_{1-3}$ | $L_{2-199}$ |
| COMPOUND 954 | $L_{1-3}$ | $L_{2-200}$ |
| COMPOUND 955 | $L_{1-3}$ | $L_{2-201}$ |

-continued

| | | |
|---|---|---|
| COMPOUND 956 | $L_{1-3}$ | $L_{2-202}$ |
| COMPOUND 957 | $L_{1-3}$ | $L_{2-203}$ |
| COMPOUND 958 | $L_{1-3}$ | $L_{2-204}$ |
| COMPOUND 959 | $L_{1-3}$ | $L_{2-205}$ |
| COMPOUND 960 | $L_{1-3}$ | $L_{2-206}$ |
| COMPOUND 961 | $L_{1-3}$ | $L_{2-207}$ |
| COMPOUND 962 | $L_{1-3}$ | $L_{2-208}$ |
| COMPOUND 963 | $L_{1-3}$ | $L_{2-209}$ |
| COMPOUND 964 | $L_{1-3}$ | $L_{2-210}$ |
| COMPOUND 965 | $L_{1-3}$ | $L_{2-211}$ |
| COMPOUND 966 | $L_{1-3}$ | $L_{2-212}$ |
| COMPOUND 967 | $L_{1-3}$ | $L_{2-213}$ |
| COMPOUND 968 | $L_{1-3}$ | $L_{2-214}$ |
| COMPOUND 969 | $L_{1-3}$ | $L_{2-215}$ |
| COMPOUND 970 | $L_{1-3}$ | $L_{2-216}$ |
| COMPOUND 971 | $L_{1-3}$ | $L_{2-217}$ |
| COMPOUND 972 | $L_{1-3}$ | $L_{2-218}$ |
| COMPOUND 973 | $L_{1-3}$ | $L_{2-219}$ |
| COMPOUND 974 | $L_{1-3}$ | $L_{2-220}$ |
| COMPOUND 975 | $L_{1-3}$ | $L_{2-221}$ |
| COMPOUND 976 | $L_{1-3}$ | $L_{2-222}$ |
| COMPOUND 977 | $L_{1-3}$ | $L_{2-223}$ |
| COMPOUND 978 | $L_{1-3}$ | $L_{2-224}$ |
| COMPOUND 979 | $L_{1-3}$ | $L_{2-225}$ |
| COMPOUND 980 | $L_{1-3}$ | $L_{2-226}$ |
| COMPOUND 981 | $L_{1-3}$ | $L_{2-227}$ |
| COMPOUND 982 | $L_{1-3}$ | $L_{2-228}$ |
| COMPOUND 983 | $L_{1-3}$ | $L_{2-229}$ |
| COMPOUND 984 | $L_{1-3}$ | $L_{2-230}$ |
| COMPOUND 985 | $L_{1-3}$ | $L_{2-231}$ |
| COMPOUND 986 | $L_{1-3}$ | $L_{2-232}$ |
| COMPOUND 987 | $L_{1-3}$ | $L_{2-233}$ |
| COMPOUND 988 | $L_{1-3}$ | $L_{2-234}$ |
| COMPOUND 989 | $L_{1-3}$ | $L_{2-235}$ |
| COMPOUND 990 | $L_{1-3}$ | $L_{2-236}$ |
| COMPOUND 991 | $L_{1-3}$ | $L_{2-237}$ |
| COMPOUND 992 | $L_{1-3}$ | $L_{2-238}$ |
| COMPOUND 993 | $L_{1-3}$ | $L_{2-239}$ |
| COMPOUND 994 | $L_{1-3}$ | $L_{2-240}$ |
| COMPOUND 995 | $L_{1-3}$ | $L_{2-241}$ |
| COMPOUND 996 | $L_{1-3}$ | $L_{2-242}$ |
| COMPOUND 997 | $L_{1-3}$ | $L_{2-243}$ |
| COMPOUND 998 | $L_{1-3}$ | $L_{2-244}$ |
| COMPOUND 999 | $L_{1-3}$ | $L_{2-245}$ |
| COMPOUND 1000 | $L_{1-3}$ | $L_{2-246}$ |
| COMPOUND 1001 | $L_{1-3}$ | $L_{2-247}$ |
| COMPOUND 1002 | $L_{1-3}$ | $L_{2-248}$ |
| COMPOUND 1003 | $L_{1-3}$ | $L_{2-249}$ |
| COMPOUND 1004 | $L_{1-3}$ | $L_{2-250}$ |
| COMPOUND 1005 | $L_{1-3}$ | $L_{2-251}$ |
| COMPOUND 1006 | $L_{1-3}$ | $L_{2-252}$ |
| COMPOUND 1007 | $L_{1-3}$ | $L_{2-253}$ |
| COMPOUND 1008 | $L_{1-3}$ | $L_{2-254}$ |
| COMPOUND 1009 | $L_{1-3}$ | $L_{2-255}$ |
| COMPOUND 1010 | $L_{1-3}$ | $L_{2-256}$ |
| COMPOUND 1011 | $L_{1-3}$ | $L_{2-257}$ |
| COMPOUND 1012 | $L_{1-3}$ | $L_{2-258}$ |
| COMPOUND 1013 | $L_{1-3}$ | $L_{2-259}$ |
| COMPOUND 1014 | $L_{1-3}$ | $L_{2-260}$ |
| COMPOUND 1015 | $L_{1-3}$ | $L_{2-261}$ |
| COMPOUND 1016 | $L_{1-3}$ | $L_{2-262}$ |
| COMPOUND 1017 | $L_{1-3}$ | $L_{2-263}$ |
| COMPOUND 1018 | $L_{1-3}$ | $L_{2-264}$ |
| COMPOUND 1019 | $L_{1-3}$ | $L_{2-265}$ |
| COMPOUND 1020 | $L_{1-3}$ | $L_{2-266}$ |
| COMPOUND 1021 | $L_{1-3}$ | $L_{2-267}$ |
| COMPOUND 1022 | $L_{1-3}$ | $L_{2-268}$ |
| COMPOUND 1023 | $L_{1-3}$ | $L_{2-269}$ |
| COMPOUND 1024 | $L_{1-3}$ | $L_{2-270}$ |
| COMPOUND 1025 | $L_{1-3}$ | $L_{2-271}$ |
| COMPOUND 1026 | $L_{1-3}$ | $L_{2-272}$ |
| COMPOUND 1027 | $L_{1-3}$ | $L_{2-273}$ |
| COMPOUND 1028 | $L_{1-3}$ | $L_{2-274}$ |
| COMPOUND 1029 | $L_{1-3}$ | $L_{2-275}$ |
| COMPOUND 1030 | $L_{1-3}$ | $L_{2-276}$ |
| COMPOUND 1031 | $L_{1-3}$ | $L_{2-277}$ |
| COMPOUND 1032 | $L_{1-3}$ | $L_{2-278}$ |
| COMPOUND 1033 | $L_{1-3}$ | $L_{2-279}$ |
| COMPOUND 1034 | $L_{1-3}$ | $L_{2-280}$ |

-continued

| | | |
|---|---|---|
| COMPOUND 1035 | $L_{1-3}$ | $L_{2-281}$ |
| COMPOUND 1036 | $L_{1-3}$ | $L_{2-282}$ |
| COMPOUND 1037 | $L_{1-3}$ | $L_{2-283}$ |
| COMPOUND 1038 | $L_{1-3}$ | $L_{2-284}$ |
| COMPOUND 1039 | $L_{1-3}$ | $L_{2-285}$ |
| COMPOUND 1040 | $L_{1-3}$ | $L_{2-286}$ |
| COMPOUND 1041 | $L_{1-3}$ | $L_{2-287}$ |
| COMPOUND 1042 | $L_{1-3}$ | $L_{2-288}$ |
| COMPOUND 1043 | $L_{1-3}$ | $L_{2-289}$ |
| COMPOUND 1044 | $L_{1-3}$ | $L_{2-290}$ |
| COMPOUND 1045 | $L_{1-3}$ | $L_{2-291}$ |
| COMPOUND 1046 | $L_{1-3}$ | $L_{2-292}$ |
| COMPOUND 1047 | $L_{1-3}$ | $L_{2-293}$ |
| COMPOUND 1048 | $L_{1-3}$ | $L_{2-294}$ |
| COMPOUND 1049 | $L_{1-3}$ | $L_{2-295}$ |
| COMPOUND 1050 | $L_{1-3}$ | $L_{2-296}$ |
| COMPOUND 1051 | $L_{1-3}$ | $L_{2-297}$ |
| COMPOUND 1052 | $L_{1-3}$ | $L_{2-298}$ |
| COMPOUND 1053 | $L_{1-3}$ | $L_{2-299}$ |
| COMPOUND 1054 | $L_{1-3}$ | $L_{2-300}$ |
| COMPOUND 1055 | $L_{1-3}$ | $L_{2-301}$ |
| COMPOUND 1056 | $L_{1-3}$ | $L_{2-302}$ |
| COMPOUND 1057 | $L_{1-3}$ | $L_{2-303}$ |
| COMPOUND 1058 | $L_{1-3}$ | $L_{2-304}$ |
| COMPOUND 1059 | $L_{1-3}$ | $L_{2-305}$ |
| COMPOUND 1060 | $L_{1-3}$ | $L_{2-306}$ |
| COMPOUND 1061 | $L_{1-3}$ | $L_{2-307}$ |
| COMPOUND 1062 | $L_{1-3}$ | $L_{2-308}$ |
| COMPOUND 1063 | $L_{1-3}$ | $L_{2-309}$ |
| COMPOUND 1064 | $L_{1-3}$ | $L_{2-310}$ |
| COMPOUND 1065 | $L_{1-3}$ | $L_{2-311}$ |
| COMPOUND 1066 | $L_{1-3}$ | $L_{2-312}$ |
| COMPOUND 1067 | $L_{1-3}$ | $L_{2-313}$ |
| COMPOUND 1068 | $L_{1-3}$ | $L_{2-314}$ |
| COMPOUND 1069 | $L_{1-3}$ | $L_{2-315}$ |
| COMPOUND 1070 | $L_{1-3}$ | $L_{2-316}$ |
| COMPOUND 1071 | $L_{1-3}$ | $L_{2-317}$ |
| COMPOUND 1072 | $L_{1-3}$ | $L_{2-318}$ |
| COMPOUND 1073 | $L_{1-3}$ | $L_{2-319}$ |
| COMPOUND 1074 | $L_{1-3}$ | $L_{2-320}$ |
| COMPOUND 1075 | $L_{1-3}$ | $L_{2-321}$ |
| COMPOUND 1076 | $L_{1-3}$ | $L_{2-322}$ |
| COMPOUND 1077 | $L_{1-3}$ | $L_{2-323}$ |
| COMPOUND 1078 | $L_{1-3}$ | $L_{2-324}$ |
| COMPOUND 1079 | $L_{1-3}$ | $L_{2-325}$ |
| COMPOUND 1080 | $L_{1-3}$ | $L_{2-326}$ |
| COMPOUND 1081 | $L_{1-3}$ | $L_{2-327}$ |
| COMPOUND 1082 | $L_{1-3}$ | $L_{2-328}$ |
| COMPOUND 1083 | $L_{1-3}$ | $L_{2-329}$ |
| COMPOUND 1084 | $L_{1-3}$ | $L_{2-330}$ |
| COMPOUND 1085 | $L_{1-3}$ | $L_{2-331}$ |
| COMPOUND 1086 | $L_{1-3}$ | $L_{2-332}$ |
| COMPOUND 1087 | $L_{1-3}$ | $L_{2-333}$ |
| COMPOUND 1088 | $L_{1-3}$ | $L_{2-334}$ |
| COMPOUND 1089 | $L_{1-3}$ | $L_{2-335}$ |
| COMPOUND 1090 | $L_{1-3}$ | $L_{2-336}$ |
| COMPOUND 1091 | $L_{1-3}$ | $L_{2-337}$ |
| COMPOUND 1092 | $L_{1-3}$ | $L_{2-338}$ |
| COMPOUND 1093 | $L_{1-3}$ | $L_{2-339}$ |
| COMPOUND 1094 | $L_{1-3}$ | $L_{2-340}$ |
| COMPOUND 1095 | $L_{1-3}$ | $L_{2-341}$ |
| COMPOUND 1096 | $L_{1-3}$ | $L_{2-342}$ |
| COMPOUND 1097 | $L_{1-3}$ | $L_{2-343}$ |
| COMPOUND 1098 | $L_{1-3}$ | $L_{2-344}$ |
| COMPOUND 1099 | $L_{1-3}$ | $L_{2-345}$ |
| COMPOUND 1100 | $L_{1-3}$ | $L_{2-346}$ |
| COMPOUND 1101 | $L_{1-3}$ | $L_{2-347}$ |
| COMPOUND 1102 | $L_{1-3}$ | $L_{2-348}$ |
| COMPOUND 1103 | $L_{1-3}$ | $L_{2-349}$ |
| COMPOUND 1104 | $L_{1-3}$ | $L_{2-350}$ |
| COMPOUND 1105 | $L_{1-3}$ | $L_{2-351}$ |
| COMPOUND 1106 | $L_{1-3}$ | $L_{2-352}$ |
| COMPOUND 1107 | $L_{1-3}$ | $L_{2-353}$ |
| COMPOUND 1108 | $L_{1-3}$ | $L_{2-354}$ |
| COMPOUND 1109 | $L_{1-3}$ | $L_{2-355}$ |
| COMPOUND 1110 | $L_{1-3}$ | $L_{2-356}$ |
| COMPOUND 1111 | $L_{1-3}$ | $L_{2-357}$ |
| COMPOUND 1112 | $L_{1-3}$ | $L_{2-358}$ |
| COMPOUND 1113 | $L_{1-3}$ | $L_{2-359}$ |

-continued

| | | |
|---|---|---|
| COMPOUND 1114 | $L_{1-3}$ | $L_{2-360}$ |
| COMPOUND 1115 | $L_{1-3}$ | $L_{2-361}$ |
| COMPOUND 1116 | $L_{1-3}$ | $L_{2-362}$ |
| COMPOUND 1117 | $L_{1-3}$ | $L_{2-363}$ |
| COMPOUND 1118 | $L_{1-3}$ | $L_{2-364}$ |
| COMPOUND 1119 | $L_{1-3}$ | $L_{2-365}$ |
| COMPOUND 1120 | $L_{1-3}$ | $L_{2-366}$ |
| COMPOUND 1121 | $L_{1-3}$ | $L_{2-367}$ |
| COMPOUND 1122 | $L_{1-3}$ | $L_{2-368}$ |
| COMPOUND 1123 | $L_{1-3}$ | $L_{2-369}$ |
| COMPOUND 1124 | $L_{1-3}$ | $L_{2-370}$ |
| COMPOUND 1125 | $L_{1-3}$ | $L_{2-371}$ |
| COMPOUND 1126 | $L_{1-3}$ | $L_{2-372}$ |
| COMPOUND 1127 | $L_{1-3}$ | $L_{2-373}$ |
| COMPOUND 1128 | $L_{1-3}$ | $L_{2-374}$ |
| COMPOUND 1129 | $L_{1-3}$ | $L_{2-375}$ |
| COMPOUND 1130 | $L_{1-3}$ | $L_{2-376}$ |
| COMPOUND 1131 | $L_{1-3}$ | $L_{2-377}$ |
| COMPOUND 1132 | $L_{1-4}$ | $L_{2-1}$ |
| COMPOUND 1133 | $L_{1-4}$ | $L_{2-2}$ |
| COMPOUND 1134 | $L_{1-4}$ | $L_{2-3}$ |
| COMPOUND 1135 | $L_{1-4}$ | $L_{2-4}$ |
| COMPOUND 1136 | $L_{1-4}$ | $L_{2-5}$ |
| COMPOUND 1137 | $L_{1-4}$ | $L_{2-6}$ |
| COMPOUND 1138 | $L_{1-4}$ | $L_{2-7}$ |
| COMPOUND 1139 | $L_{1-4}$ | $L_{2-8}$ |
| COMPOUND 1140 | $L_{1-4}$ | $L_{2-9}$ |
| COMPOUND 1141 | $L_{1-4}$ | $L_{2-10}$ |
| COMPOUND 1142 | $L_{1-4}$ | $L_{2-11}$ |
| COMPOUND 1143 | $L_{1-4}$ | $L_{2-12}$ |
| COMPOUND 1144 | $L_{1-4}$ | $L_{2-13}$ |
| COMPOUND 1145 | $L_{1-4}$ | $L_{2-14}$ |
| COMPOUND 1146 | $L_{1-4}$ | $L_{2-15}$ |
| COMPOUND 1147 | $L_{1-4}$ | $L_{2-16}$ |
| COMPOUND 1148 | $L_{1-4}$ | $L_{2-17}$ |
| COMPOUND 1149 | $L_{1-4}$ | $L_{2-18}$ |
| COMPOUND 1150 | $L_{1-4}$ | $L_{2-19}$ |
| COMPOUND 1151 | $L_{1-4}$ | $L_{2-20}$ |
| COMPOUND 1152 | $L_{1-4}$ | $L_{2-21}$ |
| COMPOUND 1153 | $L_{1-4}$ | $L_{2-22}$ |
| COMPOUND 1154 | $L_{1-4}$ | $L_{2-23}$ |
| COMPOUND 1155 | $L_{1-4}$ | $L_{2-24}$ |
| COMPOUND 1156 | $L_{1-4}$ | $L_{2-25}$ |
| COMPOUND 1157 | $L_{1-4}$ | $L_{2-26}$ |
| COMPOUND 1158 | $L_{1-4}$ | $L_{2-27}$ |
| COMPOUND 1159 | $L_{1-4}$ | $L_{2-28}$ |
| COMPOUND 1160 | $L_{1-4}$ | $L_{2-29}$ |
| COMPOUND 1161 | $L_{1-4}$ | $L_{2-30}$ |
| COMPOUND 1162 | $L_{1-4}$ | $L_{2-31}$ |
| COMPOUND 1163 | $L_{1-4}$ | $L_{2-32}$ |
| COMPOUND 1164 | $L_{1-4}$ | $L_{2-33}$ |
| COMPOUND 1165 | $L_{1-4}$ | $L_{2-34}$ |
| COMPOUND 1166 | $L_{1-4}$ | $L_{2-35}$ |
| COMPOUND 1167 | $L_{1-4}$ | $L_{2-36}$ |
| COMPOUND 1168 | $L_{1-4}$ | $L_{2-37}$ |
| COMPOUND 1169 | $L_{1-4}$ | $L_{2-38}$ |
| COMPOUND 1170 | $L_{1-4}$ | $L_{2-39}$ |
| COMPOUND 1171 | $L_{1-4}$ | $L_{2-40}$ |
| COMPOUND 1172 | $L_{1-4}$ | $L_{2-41}$ |
| COMPOUND 1173 | $L_{1-4}$ | $L_{2-42}$ |
| COMPOUND 1174 | $L_{1-4}$ | $L_{2-43}$ |
| COMPOUND 1175 | $L_{1-4}$ | $L_{2-44}$ |
| COMPOUND 1176 | $L_{1-4}$ | $L_{2-45}$ |
| COMPOUND 1177 | $L_{1-4}$ | $L_{2-46}$ |
| COMPOUND 1178 | $L_{1-4}$ | $L_{2-47}$ |
| COMPOUND 1179 | $L_{1-4}$ | $L_{2-48}$ |
| COMPOUND 1180 | $L_{1-4}$ | $L_{2-49}$ |
| COMPOUND 1181 | $L_{1-4}$ | $L_{2-50}$ |
| COMPOUND 1182 | $L_{1-4}$ | $L_{2-51}$ |
| COMPOUND 1183 | $L_{1-4}$ | $L_{2-52}$ |
| COMPOUND 1184 | $L_{1-4}$ | $L_{2-53}$ |
| COMPOUND 1185 | $L_{1-4}$ | $L_{2-54}$ |
| COMPOUND 1186 | $L_{1-4}$ | $L_{2-55}$ |
| COMPOUND 1187 | $L_{1-4}$ | $L_{2-56}$ |
| COMPOUND 1188 | $L_{1-4}$ | $L_{2-57}$ |
| COMPOUND 1189 | $L_{1-4}$ | $L_{2-58}$ |
| COMPOUND 1190 | $L_{1-4}$ | $L_{2-59}$ |
| COMPOUND 1191 | $L_{1-4}$ | $L_{2-60}$ |
| COMPOUND 1192 | $L_{1-4}$ | $L_{2-61}$ |

-continued

| | | |
|---|---|---|
| COMPOUND 1193 | $L_{1-4}$ | $L_{2-62}$ |
| COMPOUND 1194 | $L_{1-4}$ | $L_{2-63}$ |
| COMPOUND 1195 | $L_{1-4}$ | $L_{2-64}$ |
| COMPOUND 1196 | $L_{1-4}$ | $L_{2-65}$ |
| COMPOUND 1197 | $L_{1-4}$ | $L_{2-66}$ |
| COMPOUND 1198 | $L_{1-4}$ | $L_{2-67}$ |
| COMPOUND 1199 | $L_{1-4}$ | $L_{2-68}$ |
| COMPOUND 1200 | $L_{1-4}$ | $L_{2-69}$ |
| COMPOUND 1201 | $L_{1-4}$ | $L_{2-70}$ |
| COMPOUND 1202 | $L_{1-4}$ | $L_{2-71}$ |
| COMPOUND 1203 | $L_{1-4}$ | $L_{2-72}$ |
| COMPOUND 1204 | $L_{1-4}$ | $L_{2-73}$ |
| COMPOUND 1205 | $L_{1-4}$ | $L_{2-74}$ |
| COMPOUND 1206 | $L_{1-4}$ | $L_{2-75}$ |
| COMPOUND 1207 | $L_{1-4}$ | $L_{2-76}$ |
| COMPOUND 1208 | $L_{1-4}$ | $L_{2-77}$ |
| COMPOUND 1209 | $L_{1-4}$ | $L_{2-78}$ |
| COMPOUND 1210 | $L_{1-4}$ | $L_{2-79}$ |
| COMPOUND 1211 | $L_{1-4}$ | $L_{2-80}$ |
| COMPOUND 1212 | $L_{1-4}$ | $L_{2-81}$ |
| COMPOUND 1213 | $L_{1-4}$ | $L_{2-82}$ |
| COMPOUND 1214 | $L_{1-4}$ | $L_{2-83}$ |
| COMPOUND 1215 | $L_{1-4}$ | $L_{2-84}$ |
| COMPOUND 1216 | $L_{1-4}$ | $L_{2-85}$ |
| COMPOUND 1217 | $L_{1-4}$ | $L_{2-86}$ |
| COMPOUND 1218 | $L_{1-4}$ | $L_{2-87}$ |
| COMPOUND 1219 | $L_{1-4}$ | $L_{2-88}$ |
| COMPOUND 1220 | $L_{1-4}$ | $L_{2-89}$ |
| COMPOUND 1221 | $L_{1-4}$ | $L_{2-90}$ |
| COMPOUND 1222 | $L_{1-4}$ | $L_{2-91}$ |
| COMPOUND 1223 | $L_{1-4}$ | $L_{2-92}$ |
| COMPOUND 1224 | $L_{1-4}$ | $L_{2-93}$ |
| COMPOUND 1225 | $L_{1-4}$ | $L_{2-94}$ |
| COMPOUND 1226 | $L_{1-4}$ | $L_{2-95}$ |
| COMPOUND 1227 | $L_{1-4}$ | $L_{2-96}$ |
| COMPOUND 1228 | $L_{1-4}$ | $L_{2-97}$ |
| COMPOUND 1229 | $L_{1-4}$ | $L_{2-98}$ |
| COMPOUND 1230 | $L_{1-4}$ | $L_{2-99}$ |
| COMPOUND 1231 | $L_{1-4}$ | $L_{2-100}$ |
| COMPOUND 1232 | $L_{1-4}$ | $L_{2-101}$ |
| COMPOUND 1233 | $L_{1-4}$ | $L_{2-102}$ |
| COMPOUND 1234 | $L_{1-4}$ | $L_{2-103}$ |
| COMPOUND 1235 | $L_{1-4}$ | $L_{2-104}$ |
| COMPOUND 1236 | $L_{1-4}$ | $L_{2-105}$ |
| COMPOUND 1237 | $L_{1-4}$ | $L_{2-106}$ |
| COMPOUND 1238 | $L_{1-4}$ | $L_{2-107}$ |
| COMPOUND 1239 | $L_{1-4}$ | $L_{2-108}$ |
| COMPOUND 1240 | $L_{1-4}$ | $L_{2-109}$ |
| COMPOUND 1241 | $L_{1-4}$ | $L_{2-110}$ |
| COMPOUND 1242 | $L_{1-4}$ | $L_{2-111}$ |
| COMPOUND 1243 | $L_{1-4}$ | $L_{2-112}$ |
| COMPOUND 1244 | $L_{1-4}$ | $L_{2-113}$ |
| COMPOUND 1245 | $L_{1-4}$ | $L_{2-114}$ |
| COMPOUND 1246 | $L_{1-4}$ | $L_{2-115}$ |
| COMPOUND 1247 | $L_{1-4}$ | $L_{2-116}$ |
| COMPOUND 1248 | $L_{1-4}$ | $L_{2-117}$ |
| COMPOUND 1249 | $L_{1-4}$ | $L_{2-118}$ |
| COMPOUND 1250 | $L_{1-4}$ | $L_{2-119}$ |
| COMPOUND 1251 | $L_{1-4}$ | $L_{2-120}$ |
| COMPOUND 1252 | $L_{1-4}$ | $L_{2-121}$ |
| COMPOUND 1253 | $L_{1-4}$ | $L_{2-122}$ |
| COMPOUND 1254 | $L_{1-4}$ | $L_{2-123}$ |
| COMPOUND 1255 | $L_{1-4}$ | $L_{2-124}$ |
| COMPOUND 1256 | $L_{1-4}$ | $L_{2-125}$ |
| COMPOUND 1257 | $L_{1-4}$ | $L_{2-126}$ |
| COMPOUND 1258 | $L_{1-4}$ | $L_{2-127}$ |
| COMPOUND 1259 | $L_{1-4}$ | $L_{2-128}$ |
| COMPOUND 1260 | $L_{1-4}$ | $L_{2-129}$ |
| COMPOUND 1261 | $L_{1-4}$ | $L_{2-130}$ |
| COMPOUND 1262 | $L_{1-4}$ | $L_{2-131}$ |
| COMPOUND 1263 | $L_{1-4}$ | $L_{2-132}$ |
| COMPOUND 1264 | $L_{1-4}$ | $L_{2-133}$ |
| COMPOUND 1265 | $L_{1-4}$ | $L_{2-134}$ |
| COMPOUND 1266 | $L_{1-4}$ | $L_{2-135}$ |
| COMPOUND 1267 | $L_{1-4}$ | $L_{2-136}$ |
| COMPOUND 1268 | $L_{1-4}$ | $L_{2-137}$ |
| COMPOUND 1269 | $L_{1-4}$ | $L_{2-138}$ |
| COMPOUND 1270 | $L_{1-4}$ | $L_{2-139}$ |
| COMPOUND 1271 | $L_{1-4}$ | $L_{2-140}$ |

-continued

| | | |
|---|---|---|
| COMPOUND 1272 | $L_{1-4}$ | $L_{2-141}$ |
| COMPOUND 1273 | $L_{1-4}$ | $L_{2-142}$ |
| COMPOUND 1274 | $L_{1-4}$ | $L_{2-143}$ |
| COMPOUND 1275 | $L_{1-4}$ | $L_{2-144}$ |
| COMPOUND 1276 | $L_{1-4}$ | $L_{2-145}$ |
| COMPOUND 1277 | $L_{1-4}$ | $L_{2-146}$ |
| COMPOUND 1278 | $L_{1-4}$ | $L_{2-147}$ |
| COMPOUND 1279 | $L_{1-4}$ | $L_{2-148}$ |
| COMPOUND 1280 | $L_{1-4}$ | $L_{2-149}$ |
| COMPOUND 1281 | $L_{1-4}$ | $L_{2-150}$ |
| COMPOUND 1282 | $L_{1-4}$ | $L_{2-151}$ |
| COMPOUND 1283 | $L_{1-4}$ | $L_{2-152}$ |
| COMPOUND 1284 | $L_{1-4}$ | $L_{2-153}$ |
| COMPOUND 1285 | $L_{1-4}$ | $L_{2-154}$ |
| COMPOUND 1286 | $L_{1-4}$ | $L_{2-155}$ |
| COMPOUND 1287 | $L_{1-4}$ | $L_{2-156}$ |
| COMPOUND 1288 | $L_{1-4}$ | $L_{2-157}$ |
| COMPOUND 1289 | $L_{1-4}$ | $L_{2-158}$ |
| COMPOUND 1290 | $L_{1-4}$ | $L_{2-159}$ |
| COMPOUND 1291 | $L_{1-4}$ | $L_{2-160}$ |
| COMPOUND 1292 | $L_{1-4}$ | $L_{2-161}$ |
| COMPOUND 1293 | $L_{1-4}$ | $L_{2-162}$ |
| COMPOUND 1294 | $L_{1-4}$ | $L_{2-163}$ |
| COMPOUND 1295 | $L_{1-4}$ | $L_{2-164}$ |
| COMPOUND 1296 | $L_{1-4}$ | $L_{2-165}$ |
| COMPOUND 1297 | $L_{1-4}$ | $L_{2-166}$ |
| COMPOUND 1298 | $L_{1-4}$ | $L_{2-167}$ |
| COMPOUND 1299 | $L_{1-4}$ | $L_{2-168}$ |
| COMPOUND 1300 | $L_{1-4}$ | $L_{2-169}$ |
| COMPOUND 1301 | $L_{1-4}$ | $L_{2-170}$ |
| COMPOUND 1302 | $L_{1-4}$ | $L_{2-171}$ |
| COMPOUND 1303 | $L_{1-4}$ | $L_{2-172}$ |
| COMPOUND 1304 | $L_{1-4}$ | $L_{2-173}$ |
| COMPOUND 1305 | $L_{1-4}$ | $L_{2-174}$ |
| COMPOUND 1306 | $L_{1-4}$ | $L_{2-175}$ |
| COMPOUND 1307 | $L_{1-4}$ | $L_{2-176}$ |
| COMPOUND 1308 | $L_{1-4}$ | $L_{2-177}$ |
| COMPOUND 1309 | $L_{1-4}$ | $L_{2-178}$ |
| COMPOUND 1310 | $L_{1-4}$ | $L_{2-179}$ |
| COMPOUND 1311 | $L_{1-4}$ | $L_{2-180}$ |
| COMPOUND 1312 | $L_{1-4}$ | $L_{2-181}$ |
| COMPOUND 1313 | $L_{1-4}$ | $L_{2-182}$ |
| COMPOUND 1314 | $L_{1-4}$ | $L_{2-183}$ |
| COMPOUND 1315 | $L_{1-4}$ | $L_{2-184}$ |
| COMPOUND 1316 | $L_{1-4}$ | $L_{2-185}$ |
| COMPOUND 1317 | $L_{1-4}$ | $L_{2-186}$ |
| COMPOUND 1318 | $L_{1-4}$ | $L_{2-187}$ |
| COMPOUND 1319 | $L_{1-4}$ | $L_{2-188}$ |
| COMPOUND 1320 | $L_{1-4}$ | $L_{2-189}$ |
| COMPOUND 1321 | $L_{1-4}$ | $L_{2-190}$ |
| COMPOUND 1322 | $L_{1-4}$ | $L_{2-191}$ |
| COMPOUND 1323 | $L_{1-4}$ | $L_{2-192}$ |
| COMPOUND 1324 | $L_{1-4}$ | $L_{2-193}$ |
| COMPOUND 1325 | $L_{1-4}$ | $L_{2-194}$ |
| COMPOUND 1326 | $L_{1-4}$ | $L_{2-195}$ |
| COMPOUND 1327 | $L_{1-4}$ | $L_{2-196}$ |
| COMPOUND 1328 | $L_{1-4}$ | $L_{2-197}$ |
| COMPOUND 1329 | $L_{1-4}$ | $L_{2-198}$ |
| COMPOUND 1330 | $L_{1-4}$ | $L_{2-199}$ |
| COMPOUND 1331 | $L_{1-4}$ | $L_{2-200}$ |
| COMPOUND 1332 | $L_{1-4}$ | $L_{2-201}$ |
| COMPOUND 1333 | $L_{1-4}$ | $L_{2-202}$ |
| COMPOUND 1334 | $L_{1-4}$ | $L_{2-203}$ |
| COMPOUND 1335 | $L_{1-4}$ | $L_{2-204}$ |
| COMPOUND 1336 | $L_{1-4}$ | $L_{2-205}$ |
| COMPOUND 1337 | $L_{1-4}$ | $L_{2-206}$ |
| COMPOUND 1338 | $L_{1-4}$ | $L_{2-207}$ |
| COMPOUND 1339 | $L_{1-4}$ | $L_{2-208}$ |
| COMPOUND 1340 | $L_{1-4}$ | $L_{2-209}$ |
| COMPOUND 1341 | $L_{1-4}$ | $L_{2-210}$ |
| COMPOUND 1342 | $L_{1-4}$ | $L_{2-211}$ |
| COMPOUND 1343 | $L_{1-4}$ | $L_{2-212}$ |
| COMPOUND 1344 | $L_{1-4}$ | $L_{2-213}$ |
| COMPOUND 1345 | $L_{1-4}$ | $L_{2-214}$ |
| COMPOUND 1346 | $L_{1-4}$ | $L_{2-215}$ |
| COMPOUND 1347 | $L_{1-4}$ | $L_{2-216}$ |
| COMPOUND 1348 | $L_{1-4}$ | $L_{2-217}$ |
| COMPOUND 1349 | $L_{1-4}$ | $L_{2-218}$ |
| COMPOUND 1350 | $L_{1-4}$ | $L_{2-219}$ |

-continued

| | | |
|---|---|---|
| COMPOUND 1351 | $L_{1-4}$ | $L_{2-220}$ |
| COMPOUND 1352 | $L_{1-4}$ | $L_{2-221}$ |
| COMPOUND 1353 | $L_{1-4}$ | $L_{2-222}$ |
| COMPOUND 1354 | $L_{1-4}$ | $L_{2-223}$ |
| COMPOUND 1355 | $L_{1-4}$ | $L_{2-224}$ |
| COMPOUND 1356 | $L_{1-4}$ | $L_{2-225}$ |
| COMPOUND 1357 | $L_{1-4}$ | $L_{2-226}$ |
| COMPOUND 1358 | $L_{1-4}$ | $L_{2-227}$ |
| COMPOUND 1359 | $L_{1-4}$ | $L_{2-228}$ |
| COMPOUND 1360 | $L_{1-4}$ | $L_{2-229}$ |
| COMPOUND 1361 | $L_{1-4}$ | $L_{2-230}$ |
| COMPOUND 1362 | $L_{1-4}$ | $L_{2-231}$ |
| COMPOUND 1363 | $L_{1-4}$ | $L_{2-232}$ |
| COMPOUND 1364 | $L_{1-4}$ | $L_{2-233}$ |
| COMPOUND 1365 | $L_{1-4}$ | $L_{2-234}$ |
| COMPOUND 1366 | $L_{1-4}$ | $L_{2-235}$ |
| COMPOUND 1367 | $L_{1-4}$ | $L_{2-236}$ |
| COMPOUND 1368 | $L_{1-4}$ | $L_{2-237}$ |
| COMPOUND 1369 | $L_{1-4}$ | $L_{2-238}$ |
| COMPOUND 1370 | $L_{1-4}$ | $L_{2-239}$ |
| COMPOUND 1371 | $L_{1-4}$ | $L_{2-240}$ |
| COMPOUND 1372 | $L_{1-4}$ | $L_{2-241}$ |
| COMPOUND 1373 | $L_{1-4}$ | $L_{2-242}$ |
| COMPOUND 1374 | $L_{1-4}$ | $L_{2-243}$ |
| COMPOUND 1375 | $L_{1-4}$ | $L_{2-244}$ |
| COMPOUND 1376 | $L_{1-4}$ | $L_{2-245}$ |
| COMPOUND 1377 | $L_{1-4}$ | $L_{2-246}$ |
| COMPOUND 1378 | $L_{1-4}$ | $L_{2-247}$ |
| COMPOUND 1379 | $L_{1-4}$ | $L_{2-248}$ |
| COMPOUND 1380 | $L_{1-4}$ | $L_{2-249}$ |
| COMPOUND 1381 | $L_{1-4}$ | $L_{2-250}$ |
| COMPOUND 1382 | $L_{1-4}$ | $L_{2-251}$ |
| COMPOUND 1383 | $L_{1-4}$ | $L_{2-252}$ |
| COMPOUND 1384 | $L_{1-4}$ | $L_{2-253}$ |
| COMPOUND 1385 | $L_{1-4}$ | $L_{2-254}$ |
| COMPOUND 1386 | $L_{1-4}$ | $L_{2-255}$ |
| COMPOUND 1387 | $L_{1-4}$ | $L_{2-256}$ |
| COMPOUND 1388 | $L_{1-4}$ | $L_{2-257}$ |
| COMPOUND 1389 | $L_{1-4}$ | $L_{2-258}$ |
| COMPOUND 1390 | $L_{1-4}$ | $L_{2-259}$ |
| COMPOUND 1391 | $L_{1-4}$ | $L_{2-260}$ |
| COMPOUND 1392 | $L_{1-4}$ | $L_{2-261}$ |
| COMPOUND 1393 | $L_{1-4}$ | $L_{2-262}$ |
| COMPOUND 1394 | $L_{1-4}$ | $L_{2-263}$ |
| COMPOUND 1395 | $L_{1-4}$ | $L_{2-264}$ |
| COMPOUND 1396 | $L_{1-4}$ | $L_{2-265}$ |
| COMPOUND 1397 | $L_{1-4}$ | $L_{2-266}$ |
| COMPOUND 1398 | $L_{1-4}$ | $L_{2-267}$ |
| COMPOUND 1399 | $L_{1-4}$ | $L_{2-268}$ |
| COMPOUND 1400 | $L_{1-4}$ | $L_{2-269}$ |
| COMPOUND 1401 | $L_{1-4}$ | $L_{2-270}$ |
| COMPOUND 1402 | $L_{1-4}$ | $L_{2-271}$ |
| COMPOUND 1403 | $L_{1-4}$ | $L_{2-272}$ |
| COMPOUND 1404 | $L_{1-4}$ | $L_{2-273}$ |
| COMPOUND 1405 | $L_{1-4}$ | $L_{2-274}$ |
| COMPOUND 1406 | $L_{1-4}$ | $L_{2-275}$ |
| COMPOUND 1407 | $L_{1-4}$ | $L_{2-276}$ |
| COMPOUND 1408 | $L_{1-4}$ | $L_{2-277}$ |
| COMPOUND 1409 | $L_{1-4}$ | $L_{2-278}$ |
| COMPOUND 1410 | $L_{1-4}$ | $L_{2-279}$ |
| COMPOUND 1411 | $L_{1-4}$ | $L_{2-280}$ |
| COMPOUND 1412 | $L_{1-4}$ | $L_{2-281}$ |
| COMPOUND 1413 | $L_{1-4}$ | $L_{2-282}$ |
| COMPOUND 1414 | $L_{1-4}$ | $L_{2-283}$ |
| COMPOUND 1415 | $L_{1-4}$ | $L_{2-284}$ |
| COMPOUND 1416 | $L_{1-4}$ | $L_{2-285}$ |
| COMPOUND 1417 | $L_{1-4}$ | $L_{2-286}$ |
| COMPOUND 1418 | $L_{1-4}$ | $L_{2-287}$ |
| COMPOUND 1419 | $L_{1-4}$ | $L_{2-288}$ |
| COMPOUND 1420 | $L_{1-4}$ | $L_{2-289}$ |
| COMPOUND 1421 | $L_{1-4}$ | $L_{2-290}$ |
| COMPOUND 1422 | $L_{1-4}$ | $L_{2-291}$ |
| COMPOUND 1423 | $L_{1-4}$ | $L_{2-292}$ |
| COMPOUND 1424 | $L_{1-4}$ | $L_{2-293}$ |
| COMPOUND 1425 | $L_{1-4}$ | $L_{2-294}$ |
| COMPOUND 1426 | $L_{1-4}$ | $L_{2-295}$ |
| COMPOUND 1427 | $L_{1-4}$ | $L_{2-296}$ |
| COMPOUND 1428 | $L_{1-4}$ | $L_{2-297}$ |
| COMPOUND 1429 | $L_{1-4}$ | $L_{2-298}$ |

-continued

| | | |
|---|---|---|
| COMPOUND 1430 | $L_{1-4}$ | $L_{2-299}$ |
| COMPOUND 1431 | $L_{1-4}$ | $L_{2-300}$ |
| COMPOUND 1432 | $L_{1-4}$ | $L_{2-301}$ |
| COMPOUND 1433 | $L_{1-4}$ | $L_{2-302}$ |
| COMPOUND 1434 | $L_{1-4}$ | $L_{2-303}$ |
| COMPOUND 1435 | $L_{1-4}$ | $L_{2-304}$ |
| COMPOUND 1436 | $L_{1-4}$ | $L_{2-305}$ |
| COMPOUND 1437 | $L_{1-4}$ | $L_{2-306}$ |
| COMPOUND 1438 | $L_{1-4}$ | $L_{2-307}$ |
| COMPOUND 1439 | $L_{1-4}$ | $L_{2-308}$ |
| COMPOUND 1440 | $L_{1-4}$ | $L_{2-309}$ |
| COMPOUND 1441 | $L_{1-4}$ | $L_{2-310}$ |
| COMPOUND 1442 | $L_{1-4}$ | $L_{2-311}$ |
| COMPOUND 1443 | $L_{1-4}$ | $L_{2-312}$ |
| COMPOUND 1444 | $L_{1-4}$ | $L_{2-313}$ |
| COMPOUND 1445 | $L_{1-4}$ | $L_{2-314}$ |
| COMPOUND 1446 | $L_{1-4}$ | $L_{2-315}$ |
| COMPOUND 1447 | $L_{1-4}$ | $L_{2-316}$ |
| COMPOUND 1448 | $L_{1-4}$ | $L_{2-317}$ |
| COMPOUND 1449 | $L_{1-4}$ | $L_{2-318}$ |
| COMPOUND 1450 | $L_{1-4}$ | $L_{2-319}$ |
| COMPOUND 1451 | $L_{1-4}$ | $L_{2-320}$ |
| COMPOUND 1452 | $L_{1-4}$ | $L_{2-321}$ |
| COMPOUND 1453 | $L_{1-4}$ | $L_{2-322}$ |
| COMPOUND 1454 | $L_{1-4}$ | $L_{2-323}$ |
| COMPOUND 1455 | $L_{1-4}$ | $L_{2-324}$ |
| COMPOUND 1456 | $L_{1-4}$ | $L_{2-325}$ |
| COMPOUND 1457 | $L_{1-4}$ | $L_{2-326}$ |
| COMPOUND 1458 | $L_{1-4}$ | $L_{2-327}$ |
| COMPOUND 1459 | $L_{1-4}$ | $L_{2-328}$ |
| COMPOUND 1460 | $L_{1-4}$ | $L_{2-329}$ |
| COMPOUND 1461 | $L_{1-4}$ | $L_{2-330}$ |
| COMPOUND 1462 | $L_{1-4}$ | $L_{2-331}$ |
| COMPOUND 1463 | $L_{1-4}$ | $L_{2-332}$ |
| COMPOUND 1464 | $L_{1-4}$ | $L_{2-333}$ |
| COMPOUND 1465 | $L_{1-4}$ | $L_{2-334}$ |
| COMPOUND 1466 | $L_{1-4}$ | $L_{2-335}$ |
| COMPOUND 1467 | $L_{1-4}$ | $L_{2-336}$ |
| COMPOUND 1468 | $L_{1-4}$ | $L_{2-337}$ |
| COMPOUND 1469 | $L_{1-4}$ | $L_{2-338}$ |
| COMPOUND 1470 | $L_{1-4}$ | $L_{2-339}$ |
| COMPOUND 1471 | $L_{1-4}$ | $L_{2-340}$ |
| COMPOUND 1472 | $L_{1-4}$ | $L_{2-341}$ |
| COMPOUND 1473 | $L_{1-4}$ | $L_{2-342}$ |
| COMPOUND 1474 | $L_{1-4}$ | $L_{2-343}$ |
| COMPOUND 1475 | $L_{1-4}$ | $L_{2-344}$ |
| COMPOUND 1476 | $L_{1-4}$ | $L_{2-345}$ |
| COMPOUND 1477 | $L_{1-4}$ | $L_{2-346}$ |
| COMPOUND 1478 | $L_{1-4}$ | $L_{2-347}$ |
| COMPOUND 1479 | $L_{1-4}$ | $L_{2-348}$ |
| COMPOUND 1480 | $L_{1-4}$ | $L_{2-349}$ |
| COMPOUND 1481 | $L_{1-4}$ | $L_{2-350}$ |
| COMPOUND 1482 | $L_{1-4}$ | $L_{2-351}$ |
| COMPOUND 1483 | $L_{1-4}$ | $L_{2-352}$ |
| COMPOUND 1484 | $L_{1-4}$ | $L_{2-353}$ |
| COMPOUND 1485 | $L_{1-4}$ | $L_{2-354}$ |
| COMPOUND 1486 | $L_{1-4}$ | $L_{2-355}$ |
| COMPOUND 1487 | $L_{1-4}$ | $L_{2-356}$ |
| COMPOUND 1488 | $L_{1-4}$ | $L_{2-357}$ |
| COMPOUND 1489 | $L_{1-4}$ | $L_{2-358}$ |
| COMPOUND 1490 | $L_{1-4}$ | $L_{2-359}$ |
| COMPOUND 1491 | $L_{1-4}$ | $L_{2-360}$ |
| COMPOUND 1492 | $L_{1-4}$ | $L_{2-361}$ |
| COMPOUND 1493 | $L_{1-4}$ | $L_{2-362}$ |
| COMPOUND 1494 | $L_{1-4}$ | $L_{2-363}$ |
| COMPOUND 1495 | $L_{1-4}$ | $L_{2-364}$ |
| COMPOUND 1496 | $L_{1-4}$ | $L_{2-365}$ |
| COMPOUND 1497 | $L_{1-4}$ | $L_{2-366}$ |
| COMPOUND 1498 | $L_{1-4}$ | $L_{2-367}$ |
| COMPOUND 1499 | $L_{1-4}$ | $L_{2-368}$ |
| COMPOUND 1500 | $L_{1-4}$ | $L_{2-369}$ |
| COMPOUND 1501 | $L_{1-4}$ | $L_{2-370}$ |
| COMPOUND 1502 | $L_{1-4}$ | $L_{2-371}$ |
| COMPOUND 1503 | $L_{1-4}$ | $L_{2-372}$ |
| COMPOUND 1504 | $L_{1-4}$ | $L_{2-373}$ |
| COMPOUND 1505 | $L_{1-4}$ | $L_{2-374}$ |
| COMPOUND 1506 | $L_{1-4}$ | $L_{2-375}$ |
| COMPOUND 1507 | $L_{1-4}$ | $L_{2-376}$ |
| COMPOUND 1508 | $L_{1-4}$ | $L_{2-377}$ |

-continued

| | | |
|---|---|---|
| COMPOUND 1509 | $L_{1-5}$ | $L_{2-1}$ |
| COMPOUND 1510 | $L_{1-5}$ | $L_{2-2}$ |
| COMPOUND 1511 | $L_{1-5}$ | $L_{2-3}$ |
| COMPOUND 1512 | $L_{1-5}$ | $L_{2-4}$ |
| COMPOUND 1513 | $L_{1-5}$ | $L_{2-5}$ |
| COMPOUND 1514 | $L_{1-5}$ | $L_{2-6}$ |
| COMPOUND 1515 | $L_{1-5}$ | $L_{2-7}$ |
| COMPOUND 1516 | $L_{1-5}$ | $L_{2-8}$ |
| COMPOUND 1517 | $L_{1-5}$ | $L_{2-9}$ |
| COMPOUND 1518 | $L_{1-5}$ | $L_{2-10}$ |
| COMPOUND 1519 | $L_{1-5}$ | $L_{2-11}$ |
| COMPOUND 1520 | $L_{1-5}$ | $L_{2-12}$ |
| COMPOUND 1521 | $L_{1-5}$ | $L_{2-13}$ |
| COMPOUND 1522 | $L_{1-5}$ | $L_{2-14}$ |
| COMPOUND 1523 | $L_{1-5}$ | $L_{2-15}$ |
| COMPOUND 1524 | $L_{1-5}$ | $L_{2-16}$ |
| COMPOUND 1525 | $L_{1-5}$ | $L_{2-17}$ |
| COMPOUND 1526 | $L_{1-5}$ | $L_{2-18}$ |
| COMPOUND 1527 | $L_{1-5}$ | $L_{2-19}$ |
| COMPOUND 1528 | $L_{1-5}$ | $L_{2-20}$ |
| COMPOUND 1529 | $L_{1-5}$ | $L_{2-21}$ |
| COMPOUND 1530 | $L_{1-5}$ | $L_{2-22}$ |
| COMPOUND 1531 | $L_{1-5}$ | $L_{2-23}$ |
| COMPOUND 1532 | $L_{1-5}$ | $L_{2-24}$ |
| COMPOUND 1533 | $L_{1-5}$ | $L_{2-25}$ |
| COMPOUND 1534 | $L_{1-5}$ | $L_{2-26}$ |
| COMPOUND 1535 | $L_{1-5}$ | $L_{2-27}$ |
| COMPOUND 1536 | $L_{1-5}$ | $L_{2-28}$ |
| COMPOUND 1537 | $L_{1-5}$ | $L_{2-29}$ |
| COMPOUND 1538 | $L_{1-5}$ | $L_{2-30}$ |
| COMPOUND 1539 | $L_{1-5}$ | $L_{2-31}$ |
| COMPOUND 1540 | $L_{1-5}$ | $L_{2-32}$ |
| COMPOUND 1541 | $L_{1-5}$ | $L_{2-33}$ |
| COMPOUND 1542 | $L_{1-5}$ | $L_{2-34}$ |
| COMPOUND 1543 | $L_{1-5}$ | $L_{2-35}$ |
| COMPOUND 1544 | $L_{1-5}$ | $L_{2-36}$ |
| COMPOUND 1545 | $L_{1-5}$ | $L_{2-37}$ |
| COMPOUND 1546 | $L_{1-5}$ | $L_{2-38}$ |
| COMPOUND 1547 | $L_{1-5}$ | $L_{2-39}$ |
| COMPOUND 1548 | $L_{1-5}$ | $L_{2-40}$ |
| COMPOUND 1549 | $L_{1-5}$ | $L_{2-41}$ |
| COMPOUND 1550 | $L_{1-5}$ | $L_{2-42}$ |
| COMPOUND 1551 | $L_{1-5}$ | $L_{2-43}$ |
| COMPOUND 1552 | $L_{1-5}$ | $L_{2-44}$ |
| COMPOUND 1553 | $L_{1-5}$ | $L_{2-45}$ |
| COMPOUND 1554 | $L_{1-5}$ | $L_{2-46}$ |
| COMPOUND 1555 | $L_{1-5}$ | $L_{2-47}$ |
| COMPOUND 1556 | $L_{1-5}$ | $L_{2-48}$ |
| COMPOUND 1557 | $L_{1-5}$ | $L_{2-49}$ |
| COMPOUND 1558 | $L_{1-5}$ | $L_{2-50}$ |
| COMPOUND 1559 | $L_{1-5}$ | $L_{2-51}$ |
| COMPOUND 1560 | $L_{1-5}$ | $L_{2-52}$ |
| COMPOUND 1561 | $L_{1-5}$ | $L_{2-53}$ |
| COMPOUND 1562 | $L_{1-5}$ | $L_{2-54}$ |
| COMPOUND 1563 | $L_{1-5}$ | $L_{2-55}$ |
| COMPOUND 1564 | $L_{1-5}$ | $L_{2-56}$ |
| COMPOUND 1565 | $L_{1-5}$ | $L_{2-57}$ |
| COMPOUND 1566 | $L_{1-5}$ | $L_{2-58}$ |
| COMPOUND 1567 | $L_{1-5}$ | $L_{2-59}$ |
| COMPOUND 1568 | $L_{1-5}$ | $L_{2-60}$ |
| COMPOUND 1569 | $L_{1-5}$ | $L_{2-61}$ |
| COMPOUND 1570 | $L_{1-5}$ | $L_{2-62}$ |
| COMPOUND 1571 | $L_{1-5}$ | $L_{2-63}$ |
| COMPOUND 1572 | $L_{1-5}$ | $L_{2-64}$ |
| COMPOUND 1573 | $L_{1-5}$ | $L_{2-65}$ |
| COMPOUND 1574 | $L_{1-5}$ | $L_{2-66}$ |
| COMPOUND 1575 | $L_{1-5}$ | $L_{2-67}$ |
| COMPOUND 1576 | $L_{1-5}$ | $L_{2-68}$ |
| COMPOUND 1577 | $L_{1-5}$ | $L_{2-69}$ |
| COMPOUND 1578 | $L_{1-5}$ | $L_{2-70}$ |
| COMPOUND 1579 | $L_{1-5}$ | $L_{2-71}$ |
| COMPOUND 1580 | $L_{1-5}$ | $L_{2-72}$ |
| COMPOUND 1581 | $L_{1-5}$ | $L_{2-73}$ |
| COMPOUND 1582 | $L_{1-5}$ | $L_{2-74}$ |
| COMPOUND 1583 | $L_{1-5}$ | $L_{2-75}$ |
| COMPOUND 1584 | $L_{1-5}$ | $L_{2-76}$ |
| COMPOUND 1585 | $L_{1-5}$ | $L_{2-77}$ |
| COMPOUND 1586 | $L_{1-5}$ | $L_{2-78}$ |
| COMPOUND 1587 | $L_{1-5}$ | $L_{2-79}$ |

-continued

| | | |
|---|---|---|
| COMPOUND 1588 | $L_{1-5}$ | $L_{2-80}$ |
| COMPOUND 1589 | $L_{1-5}$ | $L_{2-81}$ |
| COMPOUND 1590 | $L_{1-5}$ | $L_{2-82}$ |
| COMPOUND 1591 | $L_{1-5}$ | $L_{2-83}$ |
| COMPOUND 1592 | $L_{1-5}$ | $L_{2-84}$ |
| COMPOUND 1593 | $L_{1-5}$ | $L_{2-85}$ |
| COMPOUND 1594 | $L_{1-5}$ | $L_{2-86}$ |
| COMPOUND 1595 | $L_{1-5}$ | $L_{2-87}$ |
| COMPOUND 1596 | $L_{1-5}$ | $L_{2-88}$ |
| COMPOUND 1597 | $L_{1-5}$ | $L_{2-89}$ |
| COMPOUND 1598 | $L_{1-5}$ | $L_{2-90}$ |
| COMPOUND 1599 | $L_{1-5}$ | $L_{2-91}$ |
| COMPOUND 1600 | $L_{1-5}$ | $L_{2-92}$ |
| COMPOUND 1601 | $L_{1-5}$ | $L_{2-93}$ |
| COMPOUND 1602 | $L_{1-5}$ | $L_{2-94}$ |
| COMPOUND 1603 | $L_{1-5}$ | $L_{2-95}$ |
| COMPOUND 1604 | $L_{1-5}$ | $L_{2-96}$ |
| COMPOUND 1605 | $L_{1-5}$ | $L_{2-97}$ |
| COMPOUND 1606 | $L_{1-5}$ | $L_{2-98}$ |
| COMPOUND 1607 | $L_{1-5}$ | $L_{2-99}$ |
| COMPOUND 1608 | $L_{1-5}$ | $L_{2-100}$ |
| COMPOUND 1609 | $L_{1-5}$ | $L_{2-101}$ |
| COMPOUND 1610 | $L_{1-5}$ | $L_{2-102}$ |
| COMPOUND 1611 | $L_{1-5}$ | $L_{2-103}$ |
| COMPOUND 1612 | $L_{1-5}$ | $L_{2-104}$ |
| COMPOUND 1613 | $L_{1-5}$ | $L_{2-105}$ |
| COMPOUND 1614 | $L_{1-5}$ | $L_{2-106}$ |
| COMPOUND 1615 | $L_{1-5}$ | $L_{2-107}$ |
| COMPOUND 1616 | $L_{1-5}$ | $L_{2-108}$ |
| COMPOUND 1617 | $L_{1-5}$ | $L_{2-109}$ |
| COMPOUND 1618 | $L_{1-5}$ | $L_{2-110}$ |
| COMPOUND 1619 | $L_{1-5}$ | $L_{2-111}$ |
| COMPOUND 1620 | $L_{1-5}$ | $L_{2-112}$ |
| COMPOUND 1621 | $L_{1-5}$ | $L_{2-113}$ |
| COMPOUND 1622 | $L_{1-5}$ | $L_{2-114}$ |
| COMPOUND 1623 | $L_{1-5}$ | $L_{2-115}$ |
| COMPOUND 1624 | $L_{1-5}$ | $L_{2-116}$ |
| COMPOUND 1625 | $L_{1-5}$ | $L_{2-117}$ |
| COMPOUND 1626 | $L_{1-5}$ | $L_{2-118}$ |
| COMPOUND 1627 | $L_{1-5}$ | $L_{2-119}$ |
| COMPOUND 1628 | $L_{1-5}$ | $L_{2-120}$ |
| COMPOUND 1629 | $L_{1-5}$ | $L_{2-121}$ |
| COMPOUND 1630 | $L_{1-5}$ | $L_{2-122}$ |
| COMPOUND 1631 | $L_{1-5}$ | $L_{2-123}$ |
| COMPOUND 1632 | $L_{1-5}$ | $L_{2-124}$ |
| COMPOUND 1633 | $L_{1-5}$ | $L_{2-125}$ |
| COMPOUND 1634 | $L_{1-5}$ | $L_{2-126}$ |
| COMPOUND 1635 | $L_{1-5}$ | $L_{2-127}$ |
| COMPOUND 1636 | $L_{1-5}$ | $L_{2-128}$ |
| COMPOUND 1637 | $L_{1-5}$ | $L_{2-129}$ |
| COMPOUND 1638 | $L_{1-5}$ | $L_{2-130}$ |
| COMPOUND 1639 | $L_{1-5}$ | $L_{2-131}$ |
| COMPOUND 1640 | $L_{1-5}$ | $L_{2-132}$ |
| COMPOUND 1641 | $L_{1-5}$ | $L_{2-133}$ |
| COMPOUND 1642 | $L_{1-5}$ | $L_{2-134}$ |
| COMPOUND 1643 | $L_{1-5}$ | $L_{2-135}$ |
| COMPOUND 1644 | $L_{1-5}$ | $L_{2-136}$ |
| COMPOUND 1645 | $L_{1-5}$ | $L_{2-137}$ |
| COMPOUND 1646 | $L_{1-5}$ | $L_{2-138}$ |
| COMPOUND 1647 | $L_{1-5}$ | $L_{2-139}$ |
| COMPOUND 1648 | $L_{1-5}$ | $L_{2-140}$ |
| COMPOUND 1649 | $L_{1-5}$ | $L_{2-141}$ |
| COMPOUND 1650 | $L_{1-5}$ | $L_{2-142}$ |
| COMPOUND 1651 | $L_{1-5}$ | $L_{2-143}$ |
| COMPOUND 1652 | $L_{1-5}$ | $L_{2-144}$ |
| COMPOUND 1653 | $L_{1-5}$ | $L_{2-145}$ |
| COMPOUND 1654 | $L_{1-5}$ | $L_{2-146}$ |
| COMPOUND 1655 | $L_{1-5}$ | $L_{2-147}$ |
| COMPOUND 1656 | $L_{1-5}$ | $L_{2-148}$ |
| COMPOUND 1657 | $L_{1-5}$ | $L_{2-149}$ |
| COMPOUND 1658 | $L_{1-5}$ | $L_{2-150}$ |
| COMPOUND 1659 | $L_{1-5}$ | $L_{2-151}$ |
| COMPOUND 1660 | $L_{1-5}$ | $L_{2-152}$ |
| COMPOUND 1661 | $L_{1-5}$ | $L_{2-153}$ |
| COMPOUND 1662 | $L_{1-5}$ | $L_{2-154}$ |
| COMPOUND 1663 | $L_{1-5}$ | $L_{2-155}$ |
| COMPOUND 1664 | $L_{1-5}$ | $L_{2-156}$ |
| COMPOUND 1665 | $L_{1-5}$ | $L_{2-157}$ |
| COMPOUND 1666 | $L_{1-5}$ | $L_{2-158}$ |

-continued

| | | |
|---|---|---|
| COMPOUND 1667 | $L_{1-5}$ | $L_{2-159}$ |
| COMPOUND 1668 | $L_{1-5}$ | $L_{2-160}$ |
| COMPOUND 1669 | $L_{1-5}$ | $L_{2-161}$ |
| COMPOUND 1670 | $L_{1-5}$ | $L_{2-162}$ |
| COMPOUND 1671 | $L_{1-5}$ | $L_{2-163}$ |
| COMPOUND 1672 | $L_{1-5}$ | $L_{2-164}$ |
| COMPOUND 1673 | $L_{1-5}$ | $L_{2-165}$ |
| COMPOUND 1674 | $L_{1-5}$ | $L_{2-166}$ |
| COMPOUND 1675 | $L_{1-5}$ | $L_{2-167}$ |
| COMPOUND 1676 | $L_{1-5}$ | $L_{2-168}$ |
| COMPOUND 1677 | $L_{1-5}$ | $L_{2-169}$ |
| COMPOUND 1678 | $L_{1-5}$ | $L_{2-170}$ |
| COMPOUND 1679 | $L_{1-5}$ | $L_{2-171}$ |
| COMPOUND 1680 | $L_{1-5}$ | $L_{2-172}$ |
| COMPOUND 1681 | $L_{1-5}$ | $L_{2-173}$ |
| COMPOUND 1682 | $L_{1-5}$ | $L_{2-174}$ |
| COMPOUND 1683 | $L_{1-5}$ | $L_{2-175}$ |
| COMPOUND 1684 | $L_{1-5}$ | $L_{2-176}$ |
| COMPOUND 1685 | $L_{1-5}$ | $L_{2-177}$ |
| COMPOUND 1686 | $L_{1-5}$ | $L_{2-178}$ |
| COMPOUND 1687 | $L_{1-5}$ | $L_{2-179}$ |
| COMPOUND 1688 | $L_{1-5}$ | $L_{2-180}$ |
| COMPOUND 1689 | $L_{1-5}$ | $L_{2-181}$ |
| COMPOUND 1690 | $L_{1-5}$ | $L_{2-182}$ |
| COMPOUND 1691 | $L_{1-5}$ | $L_{2-183}$ |
| COMPOUND 1692 | $L_{1-5}$ | $L_{2-184}$ |
| COMPOUND 1693 | $L_{1-5}$ | $L_{2-185}$ |
| COMPOUND 1694 | $L_{1-5}$ | $L_{2-186}$ |
| COMPOUND 1695 | $L_{1-5}$ | $L_{2-187}$ |
| COMPOUND 1696 | $L_{1-5}$ | $L_{2-188}$ |
| COMPOUND 1697 | $L_{1-5}$ | $L_{2-189}$ |
| COMPOUND 1698 | $L_{1-5}$ | $L_{2-190}$ |
| COMPOUND 1699 | $L_{1-5}$ | $L_{2-191}$ |
| COMPOUND 1700 | $L_{1-5}$ | $L_{2-192}$ |
| COMPOUND 1701 | $L_{1-5}$ | $L_{2-193}$ |
| COMPOUND 1702 | $L_{1-5}$ | $L_{2-194}$ |
| COMPOUND 1703 | $L_{1-5}$ | $L_{2-195}$ |
| COMPOUND 1704 | $L_{1-5}$ | $L_{2-196}$ |
| COMPOUND 1705 | $L_{1-5}$ | $L_{2-197}$ |
| COMPOUND 1706 | $L_{1-5}$ | $L_{2-198}$ |
| COMPOUND 1707 | $L_{1-5}$ | $L_{2-199}$ |
| COMPOUND 1708 | $L_{1-5}$ | $L_{2-200}$ |
| COMPOUND 1709 | $L_{1-5}$ | $L_{2-201}$ |
| COMPOUND 1710 | $L_{1-5}$ | $L_{2-202}$ |
| COMPOUND 1711 | $L_{1-5}$ | $L_{2-203}$ |
| COMPOUND 1712 | $L_{1-5}$ | $L_{2-204}$ |
| COMPOUND 1713 | $L_{1-5}$ | $L_{2-205}$ |
| COMPOUND 1714 | $L_{1-5}$ | $L_{2-206}$ |
| COMPOUND 1715 | $L_{1-5}$ | $L_{2-207}$ |
| COMPOUND 1716 | $L_{1-5}$ | $L_{2-208}$ |
| COMPOUND 1717 | $L_{1-5}$ | $L_{2-209}$ |
| COMPOUND 1718 | $L_{1-5}$ | $L_{2-210}$ |
| COMPOUND 1719 | $L_{1-5}$ | $L_{2-211}$ |
| COMPOUND 1720 | $L_{1-5}$ | $L_{2-212}$ |
| COMPOUND 1721 | $L_{1-5}$ | $L_{2-213}$ |
| COMPOUND 1722 | $L_{1-5}$ | $L_{2-214}$ |
| COMPOUND 1723 | $L_{1-5}$ | $L_{2-215}$ |
| COMPOUND 1724 | $L_{1-5}$ | $L_{2-216}$ |
| COMPOUND 1725 | $L_{1-5}$ | $L_{2-217}$ |
| COMPOUND 1726 | $L_{1-5}$ | $L_{2-218}$ |
| COMPOUND 1727 | $L_{1-5}$ | $L_{2-219}$ |
| COMPOUND 1728 | $L_{1-5}$ | $L_{2-220}$ |
| COMPOUND 1729 | $L_{1-5}$ | $L_{2-221}$ |
| COMPOUND 1730 | $L_{1-5}$ | $L_{2-222}$ |
| COMPOUND 1731 | $L_{1-5}$ | $L_{2-223}$ |
| COMPOUND 1732 | $L_{1-5}$ | $L_{2-224}$ |
| COMPOUND 1733 | $L_{1-5}$ | $L_{2-225}$ |
| COMPOUND 1734 | $L_{1-5}$ | $L_{2-226}$ |
| COMPOUND 1735 | $L_{1-5}$ | $L_{2-227}$ |
| COMPOUND 1736 | $L_{1-5}$ | $L_{2-228}$ |
| COMPOUND 1737 | $L_{1-5}$ | $L_{2-229}$ |
| COMPOUND 1738 | $L_{1-5}$ | $L_{2-230}$ |
| COMPOUND 1739 | $L_{1-5}$ | $L_{2-231}$ |
| COMPOUND 1740 | $L_{1-5}$ | $L_{2-232}$ |
| COMPOUND 1741 | $L_{1-5}$ | $L_{2-233}$ |
| COMPOUND 1742 | $L_{1-5}$ | $L_{2-234}$ |
| COMPOUND 1743 | $L_{1-5}$ | $L_{2-235}$ |
| COMPOUND 1744 | $L_{1-5}$ | $L_{2-236}$ |
| COMPOUND 1745 | $L_{1-5}$ | $L_{2-237}$ |

-continued

| | | |
|---|---|---|
| COMPOUND 1746 | $L_{1-5}$ | $L_{2-238}$ |
| COMPOUND 1747 | $L_{1-5}$ | $L_{2-239}$ |
| COMPOUND 1748 | $L_{1-5}$ | $L_{2-240}$ |
| COMPOUND 1749 | $L_{1-5}$ | $L_{2-241}$ |
| COMPOUND 1750 | $L_{1-5}$ | $L_{2-242}$ |
| COMPOUND 1751 | $L_{1-5}$ | $L_{2-243}$ |
| COMPOUND 1752 | $L_{1-5}$ | $L_{2-244}$ |
| COMPOUND 1753 | $L_{1-5}$ | $L_{2-245}$ |
| COMPOUND 1754 | $L_{1-5}$ | $L_{2-246}$ |
| COMPOUND 1755 | $L_{1-5}$ | $L_{2-247}$ |
| COMPOUND 1756 | $L_{1-5}$ | $L_{2-248}$ |
| COMPOUND 1757 | $L_{1-5}$ | $L_{2-249}$ |
| COMPOUND 1758 | $L_{1-5}$ | $L_{2-250}$ |
| COMPOUND 1759 | $L_{1-5}$ | $L_{2-251}$ |
| COMPOUND 1760 | $L_{1-5}$ | $L_{2-252}$ |
| COMPOUND 1761 | $L_{1-5}$ | $L_{2-253}$ |
| COMPOUND 1762 | $L_{1-5}$ | $L_{2-254}$ |
| COMPOUND 1763 | $L_{1-5}$ | $L_{2-255}$ |
| COMPOUND 1764 | $L_{1-5}$ | $L_{2-256}$ |
| COMPOUND 1765 | $L_{1-5}$ | $L_{2-257}$ |
| COMPOUND 1766 | $L_{1-5}$ | $L_{2-258}$ |
| COMPOUND 1767 | $L_{1-5}$ | $L_{2-259}$ |
| COMPOUND 1768 | $L_{1-5}$ | $L_{2-260}$ |
| COMPOUND 1769 | $L_{1-5}$ | $L_{2-261}$ |
| COMPOUND 1770 | $L_{1-5}$ | $L_{2-262}$ |
| COMPOUND 1771 | $L_{1-5}$ | $L_{2-263}$ |
| COMPOUND 1772 | $L_{1-5}$ | $L_{2-264}$ |
| COMPOUND 1773 | $L_{1-5}$ | $L_{2-265}$ |
| COMPOUND 1774 | $L_{1-5}$ | $L_{2-266}$ |
| COMPOUND 1775 | $L_{1-5}$ | $L_{2-267}$ |
| COMPOUND 1776 | $L_{1-5}$ | $L_{2-268}$ |
| COMPOUND 1777 | $L_{1-5}$ | $L_{2-269}$ |
| COMPOUND 1778 | $L_{1-5}$ | $L_{2-270}$ |
| COMPOUND 1779 | $L_{1-5}$ | $L_{2-271}$ |
| COMPOUND 1780 | $L_{1-5}$ | $L_{2-272}$ |
| COMPOUND 1781 | $L_{1-5}$ | $L_{2-273}$ |
| COMPOUND 1782 | $L_{1-5}$ | $L_{2-274}$ |
| COMPOUND 1783 | $L_{1-5}$ | $L_{2-275}$ |
| COMPOUND 1784 | $L_{1-5}$ | $L_{2-276}$ |
| COMPOUND 1785 | $L_{1-5}$ | $L_{2-277}$ |
| COMPOUND 1786 | $L_{1-5}$ | $L_{2-278}$ |
| COMPOUND 1787 | $L_{1-5}$ | $L_{2-279}$ |
| COMPOUND 1788 | $L_{1-5}$ | $L_{2-280}$ |
| COMPOUND 1789 | $L_{1-5}$ | $L_{2-281}$ |
| COMPOUND 1790 | $L_{1-5}$ | $L_{2-282}$ |
| COMPOUND 1791 | $L_{1-5}$ | $L_{2-283}$ |
| COMPOUND 1792 | $L_{1-5}$ | $L_{2-284}$ |
| COMPOUND 1793 | $L_{1-5}$ | $L_{2-285}$ |
| COMPOUND 1794 | $L_{1-5}$ | $L_{2-286}$ |
| COMPOUND 1795 | $L_{1-5}$ | $L_{2-287}$ |
| COMPOUND 1796 | $L_{1-5}$ | $L_{2-288}$ |
| COMPOUND 1797 | $L_{1-5}$ | $L_{2-289}$ |
| COMPOUND 1798 | $L_{1-5}$ | $L_{2-290}$ |
| COMPOUND 1799 | $L_{1-5}$ | $L_{2-291}$ |
| COMPOUND 1800 | $L_{1-5}$ | $L_{2-292}$ |
| COMPOUND 1801 | $L_{1-5}$ | $L_{2-293}$ |
| COMPOUND 1802 | $L_{1-5}$ | $L_{2-294}$ |
| COMPOUND 1803 | $L_{1-5}$ | $L_{2-295}$ |
| COMPOUND 1804 | $L_{1-5}$ | $L_{2-296}$ |
| COMPOUND 1805 | $L_{1-5}$ | $L_{2-297}$ |
| COMPOUND 1806 | $L_{1-5}$ | $L_{2-298}$ |
| COMPOUND 1807 | $L_{1-5}$ | $L_{2-299}$ |
| COMPOUND 1808 | $L_{1-5}$ | $L_{2-300}$ |
| COMPOUND 1809 | $L_{1-5}$ | $L_{2-301}$ |
| COMPOUND 1810 | $L_{1-5}$ | $L_{2-302}$ |
| COMPOUND 1811 | $L_{1-5}$ | $L_{2-303}$ |
| COMPOUND 1812 | $L_{1-5}$ | $L_{2-304}$ |
| COMPOUND 1813 | $L_{1-5}$ | $L_{2-305}$ |
| COMPOUND 1814 | $L_{1-5}$ | $L_{2-306}$ |
| COMPOUND 1815 | $L_{1-5}$ | $L_{2-307}$ |
| COMPOUND 1816 | $L_{1-5}$ | $L_{2-308}$ |
| COMPOUND 1817 | $L_{1-5}$ | $L_{2-309}$ |
| COMPOUND 1818 | $L_{1-5}$ | $L_{2-310}$ |
| COMPOUND 1819 | $L_{1-5}$ | $L_{2-311}$ |
| COMPOUND 1820 | $L_{1-5}$ | $L_{2-312}$ |
| COMPOUND 1821 | $L_{1-5}$ | $L_{2-313}$ |
| COMPOUND 1822 | $L_{1-5}$ | $L_{2-314}$ |
| COMPOUND 1823 | $L_{1-5}$ | $L_{2-315}$ |
| COMPOUND 1824 | $L_{1-5}$ | $L_{2-316}$ |

-continued

| | | |
|---|---|---|
| COMPOUND 1825 | $L_{1-5}$ | $L_{2-317}$ |
| COMPOUND 1826 | $L_{1-5}$ | $L_{2-318}$ |
| COMPOUND 1827 | $L_{1-5}$ | $L_{2-319}$ |
| COMPOUND 1828 | $L_{1-5}$ | $L_{2-320}$ |
| COMPOUND 1829 | $L_{1-5}$ | $L_{2-321}$ |
| COMPOUND 1830 | $L_{1-5}$ | $L_{2-322}$ |
| COMPOUND 1831 | $L_{1-5}$ | $L_{2-323}$ |
| COMPOUND 1832 | $L_{1-5}$ | $L_{2-324}$ |
| COMPOUND 1833 | $L_{1-5}$ | $L_{2-325}$ |
| COMPOUND 1834 | $L_{1-5}$ | $L_{2-326}$ |
| COMPOUND 1835 | $L_{1-5}$ | $L_{2-327}$ |
| COMPOUND 1836 | $L_{1-5}$ | $L_{2-328}$ |
| COMPOUND 1837 | $L_{1-5}$ | $L_{2-329}$ |
| COMPOUND 1838 | $L_{1-5}$ | $L_{2-330}$ |
| COMPOUND 1839 | $L_{1-5}$ | $L_{2-331}$ |
| COMPOUND 1840 | $L_{1-5}$ | $L_{2-332}$ |
| COMPOUND 1841 | $L_{1-5}$ | $L_{2-333}$ |
| COMPOUND 1842 | $L_{1-5}$ | $L_{2-334}$ |
| COMPOUND 1843 | $L_{1-5}$ | $L_{2-335}$ |
| COMPOUND 1844 | $L_{1-5}$ | $L_{2-336}$ |
| COMPOUND 1845 | $L_{1-5}$ | $L_{2-337}$ |
| COMPOUND 1846 | $L_{1-5}$ | $L_{2-338}$ |
| COMPOUND 1847 | $L_{1-5}$ | $L_{2-339}$ |
| COMPOUND 1848 | $L_{1-5}$ | $L_{2-340}$ |
| COMPOUND 1849 | $L_{1-5}$ | $L_{2-341}$ |
| COMPOUND 1850 | $L_{1-5}$ | $L_{2-342}$ |
| COMPOUND 1851 | $L_{1-5}$ | $L_{2-343}$ |
| COMPOUND 1852 | $L_{1-5}$ | $L_{2-344}$ |
| COMPOUND 1853 | $L_{1-5}$ | $L_{2-345}$ |
| COMPOUND 1854 | $L_{1-5}$ | $L_{2-346}$ |
| COMPOUND 1855 | $L_{1-5}$ | $L_{2-347}$ |
| COMPOUND 1856 | $L_{1-5}$ | $L_{2-348}$ |
| COMPOUND 1857 | $L_{1-5}$ | $L_{2-349}$ |
| COMPOUND 1858 | $L_{1-5}$ | $L_{2-350}$ |
| COMPOUND 1859 | $L_{1-5}$ | $L_{2-351}$ |
| COMPOUND 1860 | $L_{1-5}$ | $L_{2-352}$ |
| COMPOUND 1861 | $L_{1-5}$ | $L_{2-353}$ |
| COMPOUND 1862 | $L_{1-5}$ | $L_{2-354}$ |
| COMPOUND 1863 | $L_{1-5}$ | $L_{2-355}$ |
| COMPOUND 1864 | $L_{1-5}$ | $L_{2-356}$ |
| COMPOUND 1865 | $L_{1-5}$ | $L_{2-357}$ |
| COMPOUND 1866 | $L_{1-5}$ | $L_{2-358}$ |
| COMPOUND 1867 | $L_{1-5}$ | $L_{2-359}$ |
| COMPOUND 1868 | $L_{1-5}$ | $L_{2-360}$ |
| COMPOUND 1869 | $L_{1-5}$ | $L_{2-361}$ |
| COMPOUND 1870 | $L_{1-5}$ | $L_{2-362}$ |
| COMPOUND 1871 | $L_{1-5}$ | $L_{2-363}$ |
| COMPOUND 1872 | $L_{1-5}$ | $L_{2-364}$ |
| COMPOUND 1873 | $L_{1-5}$ | $L_{2-365}$ |
| COMPOUND 1874 | $L_{1-5}$ | $L_{2-366}$ |
| COMPOUND 1875 | $L_{1-5}$ | $L_{2-367}$ |
| COMPOUND 1876 | $L_{1-5}$ | $L_{2-368}$ |
| COMPOUND 1877 | $L_{1-5}$ | $L_{2-369}$ |
| COMPOUND 1878 | $L_{1-5}$ | $L_{2-370}$ |
| COMPOUND 1879 | $L_{1-5}$ | $L_{2-371}$ |
| COMPOUND 1880 | $L_{1-5}$ | $L_{2-372}$ |
| COMPOUND 1881 | $L_{1-5}$ | $L_{2-373}$ |
| COMPOUND 1882 | $L_{1-5}$ | $L_{2-374}$ |
| COMPOUND 1883 | $L_{1-5}$ | $L_{2-375}$ |
| COMPOUND 1884 | $L_{1-5}$ | $L_{2-376}$ |
| COMPOUND 1885 | $L_{1-5}$ | $L_{2-377}$ |
| COMPOUND 1886 | $L_{1-6}$ | $L_{2-1}$ |
| COMPOUND 1887 | $L_{1-6}$ | $L_{2-2}$ |
| COMPOUND 1888 | $L_{1-6}$ | $L_{2-3}$ |
| COMPOUND 1889 | $L_{1-6}$ | $L_{2-4}$ |
| COMPOUND 1890 | $L_{1-6}$ | $L_{2-5}$ |
| COMPOUND 1891 | $L_{1-6}$ | $L_{2-6}$ |
| COMPOUND 1892 | $L_{1-6}$ | $L_{2-7}$ |
| COMPOUND 1893 | $L_{1-6}$ | $L_{2-8}$ |
| COMPOUND 1894 | $L_{1-6}$ | $L_{2-9}$ |
| COMPOUND 1895 | $L_{1-6}$ | $L_{2-10}$ |
| COMPOUND 1896 | $L_{1-6}$ | $L_{2-11}$ |
| COMPOUND 1897 | $L_{1-6}$ | $L_{2-12}$ |
| COMPOUND 1898 | $L_{1-6}$ | $L_{2-13}$ |
| COMPOUND 1899 | $L_{1-6}$ | $L_{2-14}$ |
| COMPOUND 1900 | $L_{1-6}$ | $L_{2-15}$ |
| COMPOUND 1901 | $L_{1-6}$ | $L_{2-16}$ |
| COMPOUND 1902 | $L_{1-6}$ | $L_{2-17}$ |
| COMPOUND 1903 | $L_{1-6}$ | $L_{2-18}$ |

-continued

| | | |
|---|---|---|
| COMPOUND 1904 | $L_{1-6}$ | $L_{2-19}$ |
| COMPOUND 1905 | $L_{1-6}$ | $L_{2-20}$ |
| COMPOUND 1906 | $L_{1-6}$ | $L_{2-21}$ |
| COMPOUND 1907 | $L_{1-6}$ | $L_{2-22}$ |
| COMPOUND 1908 | $L_{1-6}$ | $L_{2-23}$ |
| COMPOUND 1909 | $L_{1-6}$ | $L_{2-24}$ |
| COMPOUND 1910 | $L_{1-6}$ | $L_{2-25}$ |
| COMPOUND 1911 | $L_{1-6}$ | $L_{2-26}$ |
| COMPOUND 1912 | $L_{1-6}$ | $L_{2-27}$ |
| COMPOUND 1913 | $L_{1-6}$ | $L_{2-28}$ |
| COMPOUND 1914 | $L_{1-6}$ | $L_{2-29}$ |
| COMPOUND 1915 | $L_{1-6}$ | $L_{2-30}$ |
| COMPOUND 1916 | $L_{1-6}$ | $L_{2-31}$ |
| COMPOUND 1917 | $L_{1-6}$ | $L_{2-32}$ |
| COMPOUND 1918 | $L_{1-6}$ | $L_{2-33}$ |
| COMPOUND 1919 | $L_{1-6}$ | $L_{2-34}$ |
| COMPOUND 1920 | $L_{1-6}$ | $L_{2-35}$ |
| COMPOUND 1921 | $L_{1-6}$ | $L_{2-36}$ |
| COMPOUND 1922 | $L_{1-6}$ | $L_{2-37}$ |
| COMPOUND 1923 | $L_{1-6}$ | $L_{2-38}$ |
| COMPOUND 1924 | $L_{1-6}$ | $L_{2-39}$ |
| COMPOUND 1925 | $L_{1-6}$ | $L_{2-40}$ |
| COMPOUND 1926 | $L_{1-6}$ | $L_{2-41}$ |
| COMPOUND 1927 | $L_{1-6}$ | $L_{2-42}$ |
| COMPOUND 1928 | $L_{1-6}$ | $L_{2-43}$ |
| COMPOUND 1929 | $L_{1-6}$ | $L_{2-44}$ |
| COMPOUND 1930 | $L_{1-6}$ | $L_{2-45}$ |
| COMPOUND 1931 | $L_{1-6}$ | $L_{2-46}$ |
| COMPOUND 1932 | $L_{1-6}$ | $L_{2-47}$ |
| COMPOUND 1933 | $L_{1-6}$ | $L_{2-48}$ |
| COMPOUND 1934 | $L_{1-6}$ | $L_{2-49}$ |
| COMPOUND 1935 | $L_{1-6}$ | $L_{2-50}$ |
| COMPOUND 1936 | $L_{1-6}$ | $L_{2-51}$ |
| COMPOUND 1937 | $L_{1-6}$ | $L_{2-52}$ |
| COMPOUND 1938 | $L_{1-6}$ | $L_{2-53}$ |
| COMPOUND 1939 | $L_{1-6}$ | $L_{2-54}$ |
| COMPOUND 1940 | $L_{1-6}$ | $L_{2-55}$ |
| COMPOUND 1941 | $L_{1-6}$ | $L_{2-56}$ |
| COMPOUND 1942 | $L_{1-6}$ | $L_{2-57}$ |
| COMPOUND 1943 | $L_{1-6}$ | $L_{2-58}$ |
| COMPOUND 1944 | $L_{1-6}$ | $L_{2-59}$ |
| COMPOUND 1945 | $L_{1-6}$ | $L_{2-60}$ |
| COMPOUND 1946 | $L_{1-6}$ | $L_{2-61}$ |
| COMPOUND 1947 | $L_{1-6}$ | $L_{2-62}$ |
| COMPOUND 1948 | $L_{1-6}$ | $L_{2-63}$ |
| COMPOUND 1949 | $L_{1-6}$ | $L_{2-64}$ |
| COMPOUND 1950 | $L_{1-6}$ | $L_{2-65}$ |
| COMPOUND 1951 | $L_{1-6}$ | $L_{2-66}$ |
| COMPOUND 1952 | $L_{1-6}$ | $L_{2-67}$ |
| COMPOUND 1953 | $L_{1-6}$ | $L_{2-68}$ |
| COMPOUND 1954 | $L_{1-6}$ | $L_{2-69}$ |
| COMPOUND 1955 | $L_{1-6}$ | $L_{2-70}$ |
| COMPOUND 1956 | $L_{1-6}$ | $L_{2-71}$ |
| COMPOUND 1957 | $L_{1-6}$ | $L_{2-72}$ |
| COMPOUND 1958 | $L_{1-6}$ | $L_{2-73}$ |
| COMPOUND 1959 | $L_{1-6}$ | $L_{2-74}$ |
| COMPOUND 1960 | $L_{1-6}$ | $L_{2-75}$ |
| COMPOUND 1961 | $L_{1-6}$ | $L_{2-76}$ |
| COMPOUND 1962 | $L_{1-6}$ | $L_{2-77}$ |
| COMPOUND 1963 | $L_{1-6}$ | $L_{2-78}$ |
| COMPOUND 1964 | $L_{1-6}$ | $L_{2-79}$ |
| COMPOUND 1965 | $L_{1-6}$ | $L_{2-80}$ |
| COMPOUND 1966 | $L_{1-6}$ | $L_{2-81}$ |
| COMPOUND 1967 | $L_{1-6}$ | $L_{2-82}$ |
| COMPOUND 1968 | $L_{1-6}$ | $L_{2-83}$ |
| COMPOUND 1969 | $L_{1-6}$ | $L_{2-84}$ |
| COMPOUND 1970 | $L_{1-6}$ | $L_{2-85}$ |
| COMPOUND 1971 | $L_{1-6}$ | $L_{2-86}$ |
| COMPOUND 1972 | $L_{1-6}$ | $L_{2-87}$ |
| COMPOUND 1973 | $L_{1-6}$ | $L_{2-88}$ |
| COMPOUND 1974 | $L_{1-6}$ | $L_{2-89}$ |
| COMPOUND 1975 | $L_{1-6}$ | $L_{2-90}$ |
| COMPOUND 1976 | $L_{1-6}$ | $L_{2-91}$ |
| COMPOUND 1977 | $L_{1-6}$ | $L_{2-92}$ |
| COMPOUND 1978 | $L_{1-6}$ | $L_{2-93}$ |
| COMPOUND 1979 | $L_{1-6}$ | $L_{2-94}$ |
| COMPOUND 1980 | $L_{1-6}$ | $L_{2-95}$ |
| COMPOUND 1981 | $L_{1-6}$ | $L_{2-96}$ |
| COMPOUND 1982 | $L_{1-6}$ | $L_{2-97}$ |

-continued

| | | |
|---|---|---|
| COMPOUND 1983 | $L_{1-6}$ | $L_{2-98}$ |
| COMPOUND 1984 | $L_{1-6}$ | $L_{2-99}$ |
| COMPOUND 1985 | $L_{1-6}$ | $L_{2-100}$ |
| COMPOUND 1986 | $L_{1-6}$ | $L_{2-101}$ |
| COMPOUND 1987 | $L_{1-6}$ | $L_{2-102}$ |
| COMPOUND 1988 | $L_{1-6}$ | $L_{2-103}$ |
| COMPOUND 1989 | $L_{1-6}$ | $L_{2-104}$ |
| COMPOUND 1990 | $L_{1-6}$ | $L_{2-105}$ |
| COMPOUND 1991 | $L_{1-6}$ | $L_{2-106}$ |
| COMPOUND 1992 | $L_{1-6}$ | $L_{2-107}$ |
| COMPOUND 1993 | $L_{1-6}$ | $L_{2-108}$ |
| COMPOUND 1994 | $L_{1-6}$ | $L_{2-109}$ |
| COMPOUND 1995 | $L_{1-6}$ | $L_{2-110}$ |
| COMPOUND 1996 | $L_{1-6}$ | $L_{2-111}$ |
| COMPOUND 1997 | $L_{1-6}$ | $L_{2-112}$ |
| COMPOUND 1998 | $L_{1-6}$ | $L_{2-113}$ |
| COMPOUND 1999 | $L_{1-6}$ | $L_{2-114}$ |
| COMPOUND 2000 | $L_{1-6}$ | $L_{2-115}$ |
| COMPOUND 2001 | $L_{1-6}$ | $L_{2-116}$ |
| COMPOUND 2002 | $L_{1-6}$ | $L_{2-117}$ |
| COMPOUND 2003 | $L_{1-6}$ | $L_{2-118}$ |
| COMPOUND 2004 | $L_{1-6}$ | $L_{2-119}$ |
| COMPOUND 2005 | $L_{1-6}$ | $L_{2-120}$ |
| COMPOUND 2006 | $L_{1-6}$ | $L_{2-121}$ |
| COMPOUND 2007 | $L_{1-6}$ | $L_{2-122}$ |
| COMPOUND 2008 | $L_{1-6}$ | $L_{2-123}$ |
| COMPOUND 2009 | $L_{1-6}$ | $L_{2-124}$ |
| COMPOUND 2010 | $L_{1-6}$ | $L_{2-125}$ |
| COMPOUND 2011 | $L_{1-6}$ | $L_{2-126}$ |
| COMPOUND 2012 | $L_{1-6}$ | $L_{2-127}$ |
| COMPOUND 2013 | $L_{1-6}$ | $L_{2-128}$ |
| COMPOUND 2014 | $L_{1-6}$ | $L_{2-129}$ |
| COMPOUND 2015 | $L_{1-6}$ | $L_{2-130}$ |
| COMPOUND 2016 | $L_{1-6}$ | $L_{2-131}$ |
| COMPOUND 2017 | $L_{1-6}$ | $L_{2-132}$ |
| COMPOUND 2018 | $L_{1-6}$ | $L_{2-133}$ |
| COMPOUND 2019 | $L_{1-6}$ | $L_{2-134}$ |
| COMPOUND 2020 | $L_{1-6}$ | $L_{2-135}$ |
| COMPOUND 2021 | $L_{1-6}$ | $L_{2-136}$ |
| COMPOUND 2022 | $L_{1-6}$ | $L_{2-137}$ |
| COMPOUND 2023 | $L_{1-6}$ | $L_{2-138}$ |
| COMPOUND 2024 | $L_{1-6}$ | $L_{2-139}$ |
| COMPOUND 2025 | $L_{1-6}$ | $L_{2-140}$ |
| COMPOUND 2026 | $L_{1-6}$ | $L_{2-141}$ |
| COMPOUND 2027 | $L_{1-6}$ | $L_{2-142}$ |
| COMPOUND 2028 | $L_{1-6}$ | $L_{2-143}$ |
| COMPOUND 2029 | $L_{1-6}$ | $L_{2-144}$ |
| COMPOUND 2030 | $L_{1-6}$ | $L_{2-145}$ |
| COMPOUND 2031 | $L_{1-6}$ | $L_{2-146}$ |
| COMPOUND 2032 | $L_{1-6}$ | $L_{2-147}$ |
| COMPOUND 2033 | $L_{1-6}$ | $L_{2-148}$ |
| COMPOUND 2034 | $L_{1-6}$ | $L_{2-149}$ |
| COMPOUND 2035 | $L_{1-6}$ | $L_{2-150}$ |
| COMPOUND 2036 | $L_{1-6}$ | $L_{2-151}$ |
| COMPOUND 2037 | $L_{1-6}$ | $L_{2-152}$ |
| COMPOUND 2038 | $L_{1-6}$ | $L_{2-153}$ |
| COMPOUND 2039 | $L_{1-6}$ | $L_{2-154}$ |
| COMPOUND 2040 | $L_{1-6}$ | $L_{2-155}$ |
| COMPOUND 2041 | $L_{1-6}$ | $L_{2-156}$ |
| COMPOUND 2042 | $L_{1-6}$ | $L_{2-157}$ |
| COMPOUND 2043 | $L_{1-6}$ | $L_{2-158}$ |
| COMPOUND 2044 | $L_{1-6}$ | $L_{2-159}$ |
| COMPOUND 2045 | $L_{1-6}$ | $L_{2-160}$ |
| COMPOUND 2046 | $L_{1-6}$ | $L_{2-161}$ |
| COMPOUND 2047 | $L_{1-6}$ | $L_{2-162}$ |
| COMPOUND 2048 | $L_{1-6}$ | $L_{2-163}$ |
| COMPOUND 2049 | $L_{1-6}$ | $L_{2-164}$ |
| COMPOUND 2050 | $L_{1-6}$ | $L_{2-165}$ |
| COMPOUND 2051 | $L_{1-6}$ | $L_{2-166}$ |
| COMPOUND 2052 | $L_{1-6}$ | $L_{2-167}$ |
| COMPOUND 2053 | $L_{1-6}$ | $L_{2-168}$ |
| COMPOUND 2054 | $L_{1-6}$ | $L_{2-169}$ |
| COMPOUND 2055 | $L_{1-6}$ | $L_{2-170}$ |
| COMPOUND 2056 | $L_{1-6}$ | $L_{2-171}$ |
| COMPOUND 2057 | $L_{1-6}$ | $L_{2-172}$ |
| COMPOUND 2058 | $L_{1-6}$ | $L_{2-173}$ |
| COMPOUND 2059 | $L_{1-6}$ | $L_{2-174}$ |
| COMPOUND 2060 | $L_{1-6}$ | $L_{2-175}$ |
| COMPOUND 2061 | $L_{1-6}$ | $L_{2-176}$ |

-continued

| | | |
|---|---|---|
| COMPOUND 2062 | $L_{1-6}$ | $L_{2-177}$ |
| COMPOUND 2063 | $L_{1-6}$ | $L_{2-178}$ |
| COMPOUND 2064 | $L_{1-6}$ | $L_{2-179}$ |
| COMPOUND 2065 | $L_{1-6}$ | $L_{2-180}$ |
| COMPOUND 2066 | $L_{1-6}$ | $L_{2-181}$ |
| COMPOUND 2067 | $L_{1-6}$ | $L_{2-182}$ |
| COMPOUND 2068 | $L_{1-6}$ | $L_{2-183}$ |
| COMPOUND 2069 | $L_{1-6}$ | $L_{2-184}$ |
| COMPOUND 2070 | $L_{1-6}$ | $L_{2-185}$ |
| COMPOUND 2071 | $L_{1-6}$ | $L_{2-186}$ |
| COMPOUND 2072 | $L_{1-6}$ | $L_{2-187}$ |
| COMPOUND 2073 | $L_{1-6}$ | $L_{2-188}$ |
| COMPOUND 2074 | $L_{1-6}$ | $L_{2-189}$ |
| COMPOUND 2075 | $L_{1-6}$ | $L_{2-190}$ |
| COMPOUND 2076 | $L_{1-6}$ | $L_{2-191}$ |
| COMPOUND 2077 | $L_{1-6}$ | $L_{2-192}$ |
| COMPOUND 2078 | $L_{1-6}$ | $L_{2-193}$ |
| COMPOUND 2079 | $L_{1-6}$ | $L_{2-194}$ |
| COMPOUND 2080 | $L_{1-6}$ | $L_{2-195}$ |
| COMPOUND 2081 | $L_{1-6}$ | $L_{2-196}$ |
| COMPOUND 2082 | $L_{1-6}$ | $L_{2-197}$ |
| COMPOUND 2083 | $L_{1-6}$ | $L_{2-198}$ |
| COMPOUND 2084 | $L_{1-6}$ | $L_{2-199}$ |
| COMPOUND 2085 | $L_{1-6}$ | $L_{2-200}$ |
| COMPOUND 2086 | $L_{1-6}$ | $L_{2-201}$ |
| COMPOUND 2087 | $L_{1-6}$ | $L_{2-202}$ |
| COMPOUND 2088 | $L_{1-6}$ | $L_{2-203}$ |
| COMPOUND 2089 | $L_{1-6}$ | $L_{2-204}$ |
| COMPOUND 2090 | $L_{1-6}$ | $L_{2-205}$ |
| COMPOUND 2091 | $L_{1-6}$ | $L_{2-206}$ |
| COMPOUND 2092 | $L_{1-6}$ | $L_{2-207}$ |
| COMPOUND 2093 | $L_{1-6}$ | $L_{2-208}$ |
| COMPOUND 2094 | $L_{1-6}$ | $L_{2-209}$ |
| COMPOUND 2095 | $L_{1-6}$ | $L_{2-210}$ |
| COMPOUND 2096 | $L_{1-6}$ | $L_{2-211}$ |
| COMPOUND 2097 | $L_{1-6}$ | $L_{2-212}$ |
| COMPOUND 2098 | $L_{1-6}$ | $L_{2-213}$ |
| COMPOUND 2099 | $L_{1-6}$ | $L_{2-214}$ |
| COMPOUND 2100 | $L_{1-6}$ | $L_{2-215}$ |
| COMPOUND 2101 | $L_{1-6}$ | $L_{2-216}$ |
| COMPOUND 2102 | $L_{1-6}$ | $L_{2-217}$ |
| COMPOUND 2103 | $L_{1-6}$ | $L_{2-218}$ |
| COMPOUND 2104 | $L_{1-6}$ | $L_{2-219}$ |
| COMPOUND 2105 | $L_{1-6}$ | $L_{2-220}$ |
| COMPOUND 2106 | $L_{1-6}$ | $L_{2-221}$ |
| COMPOUND 2107 | $L_{1-6}$ | $L_{2-222}$ |
| COMPOUND 2108 | $L_{1-6}$ | $L_{2-223}$ |
| COMPOUND 2109 | $L_{1-6}$ | $L_{2-224}$ |
| COMPOUND 2110 | $L_{1-6}$ | $L_{2-225}$ |
| COMPOUND 2111 | $L_{1-6}$ | $L_{2-226}$ |
| COMPOUND 2112 | $L_{1-6}$ | $L_{2-227}$ |
| COMPOUND 2113 | $L_{1-6}$ | $L_{2-228}$ |
| COMPOUND 2114 | $L_{1-6}$ | $L_{2-229}$ |
| COMPOUND 2115 | $L_{1-6}$ | $L_{2-230}$ |
| COMPOUND 2116 | $L_{1-6}$ | $L_{2-231}$ |
| COMPOUND 2117 | $L_{1-6}$ | $L_{2-232}$ |
| COMPOUND 2118 | $L_{1-6}$ | $L_{2-233}$ |
| COMPOUND 2119 | $L_{1-6}$ | $L_{2-234}$ |
| COMPOUND 2120 | $L_{1-6}$ | $L_{2-235}$ |
| COMPOUND 2121 | $L_{1-6}$ | $L_{2-236}$ |
| COMPOUND 2122 | $L_{1-6}$ | $L_{2-237}$ |
| COMPOUND 2123 | $L_{1-6}$ | $L_{2-238}$ |
| COMPOUND 2124 | $L_{1-6}$ | $L_{2-239}$ |
| COMPOUND 2125 | $L_{1-6}$ | $L_{2-240}$ |
| COMPOUND 2126 | $L_{1-6}$ | $L_{2-241}$ |
| COMPOUND 2127 | $L_{1-6}$ | $L_{2-242}$ |
| COMPOUND 2128 | $L_{1-6}$ | $L_{2-243}$ |
| COMPOUND 2129 | $L_{1-6}$ | $L_{2-244}$ |
| COMPOUND 2130 | $L_{1-6}$ | $L_{2-245}$ |
| COMPOUND 2131 | $L_{1-6}$ | $L_{2-246}$ |
| COMPOUND 2132 | $L_{1-6}$ | $L_{2-247}$ |
| COMPOUND 2133 | $L_{1-6}$ | $L_{2-248}$ |
| COMPOUND 2134 | $L_{1-6}$ | $L_{2-249}$ |
| COMPOUND 2135 | $L_{1-6}$ | $L_{2-250}$ |
| COMPOUND 2136 | $L_{1-6}$ | $L_{2-251}$ |
| COMPOUND 2137 | $L_{1-6}$ | $L_{2-252}$ |
| COMPOUND 2138 | $L_{1-6}$ | $L_{2-253}$ |
| COMPOUND 2139 | $L_{1-6}$ | $L_{2-254}$ |
| COMPOUND 2140 | $L_{1-6}$ | $L_{2-255}$ |

-continued

| | | |
|---|---|---|
| COMPOUND 2141 | $L_{1-6}$ | $L_{2-256}$ |
| COMPOUND 2142 | $L_{1-6}$ | $L_{2-257}$ |
| COMPOUND 2143 | $L_{1-6}$ | $L_{2-258}$ |
| COMPOUND 2144 | $L_{1-6}$ | $L_{2-259}$ |
| COMPOUND 2145 | $L_{1-6}$ | $L_{2-260}$ |
| COMPOUND 2146 | $L_{1-6}$ | $L_{2-261}$ |
| COMPOUND 2147 | $L_{1-6}$ | $L_{2-262}$ |
| COMPOUND 2148 | $L_{1-6}$ | $L_{2-263}$ |
| COMPOUND 2149 | $L_{1-6}$ | $L_{2-264}$ |
| COMPOUND 2150 | $L_{1-6}$ | $L_{2-265}$ |
| COMPOUND 2151 | $L_{1-6}$ | $L_{2-266}$ |
| COMPOUND 2152 | $L_{1-6}$ | $L_{2-267}$ |
| COMPOUND 2153 | $L_{1-6}$ | $L_{2-268}$ |
| COMPOUND 2154 | $L_{1-6}$ | $L_{2-269}$ |
| COMPOUND 2155 | $L_{1-6}$ | $L_{2-270}$ |
| COMPOUND 2156 | $L_{1-6}$ | $L_{2-271}$ |
| COMPOUND 2157 | $L_{1-6}$ | $L_{2-272}$ |
| COMPOUND 2158 | $L_{1-6}$ | $L_{2-273}$ |
| COMPOUND 2159 | $L_{1-6}$ | $L_{2-274}$ |
| COMPOUND 2160 | $L_{1-6}$ | $L_{2-275}$ |
| COMPOUND 2161 | $L_{1-6}$ | $L_{2-276}$ |
| COMPOUND 2162 | $L_{1-6}$ | $L_{2-277}$ |
| COMPOUND 2163 | $L_{1-6}$ | $L_{2-278}$ |
| COMPOUND 2164 | $L_{1-6}$ | $L_{2-279}$ |
| COMPOUND 2165 | $L_{1-6}$ | $L_{2-280}$ |
| COMPOUND 2166 | $L_{1-6}$ | $L_{2-281}$ |
| COMPOUND 2167 | $L_{1-6}$ | $L_{2-282}$ |
| COMPOUND 2168 | $L_{1-6}$ | $L_{2-283}$ |
| COMPOUND 2169 | $L_{1-6}$ | $L_{2-284}$ |
| COMPOUND 2170 | $L_{1-6}$ | $L_{2-285}$ |
| COMPOUND 2171 | $L_{1-6}$ | $L_{2-286}$ |
| COMPOUND 2172 | $L_{1-6}$ | $L_{2-287}$ |
| COMPOUND 2173 | $L_{1-6}$ | $L_{2-288}$ |
| COMPOUND 2174 | $L_{1-6}$ | $L_{2-289}$ |
| COMPOUND 2175 | $L_{1-6}$ | $L_{2-290}$ |
| COMPOUND 2176 | $L_{1-6}$ | $L_{2-291}$ |
| COMPOUND 2177 | $L_{1-6}$ | $L_{2-292}$ |
| COMPOUND 2178 | $L_{1-6}$ | $L_{2-293}$ |
| COMPOUND 2179 | $L_{1-6}$ | $L_{2-294}$ |
| COMPOUND 2180 | $L_{1-6}$ | $L_{2-295}$ |
| COMPOUND 2181 | $L_{1-6}$ | $L_{2-296}$ |
| COMPOUND 2182 | $L_{1-6}$ | $L_{2-297}$ |
| COMPOUND 2183 | $L_{1-6}$ | $L_{2-298}$ |
| COMPOUND 2184 | $L_{1-6}$ | $L_{2-299}$ |
| COMPOUND 2185 | $L_{1-6}$ | $L_{2-300}$ |
| COMPOUND 2186 | $L_{1-6}$ | $L_{2-301}$ |
| COMPOUND 2187 | $L_{1-6}$ | $L_{2-302}$ |
| COMPOUND 2188 | $L_{1-6}$ | $L_{2-303}$ |
| COMPOUND 2189 | $L_{1-6}$ | $L_{2-304}$ |
| COMPOUND 2190 | $L_{1-6}$ | $L_{2-305}$ |
| COMPOUND 2191 | $L_{1-6}$ | $L_{2-306}$ |
| COMPOUND 2192 | $L_{1-6}$ | $L_{2-307}$ |
| COMPOUND 2193 | $L_{1-6}$ | $L_{2-308}$ |
| COMPOUND 2194 | $L_{1-6}$ | $L_{2-309}$ |
| COMPOUND 2195 | $L_{1-6}$ | $L_{2-310}$ |
| COMPOUND 2196 | $L_{1-6}$ | $L_{2-311}$ |
| COMPOUND 2197 | $L_{1-6}$ | $L_{2-312}$ |
| COMPOUND 2198 | $L_{1-6}$ | $L_{2-313}$ |
| COMPOUND 2199 | $L_{1-6}$ | $L_{2-314}$ |
| COMPOUND 2200 | $L_{1-6}$ | $L_{2-315}$ |
| COMPOUND 2201 | $L_{1-6}$ | $L_{2-316}$ |
| COMPOUND 2202 | $L_{1-6}$ | $L_{2-317}$ |
| COMPOUND 2203 | $L_{1-6}$ | $L_{2-318}$ |
| COMPOUND 2204 | $L_{1-6}$ | $L_{2-319}$ |
| COMPOUND 2205 | $L_{1-6}$ | $L_{2-320}$ |
| COMPOUND 2206 | $L_{1-6}$ | $L_{2-321}$ |
| COMPOUND 2207 | $L_{1-6}$ | $L_{2-322}$ |
| COMPOUND 2208 | $L_{1-6}$ | $L_{2-323}$ |
| COMPOUND 2209 | $L_{1-6}$ | $L_{2-324}$ |
| COMPOUND 2210 | $L_{1-6}$ | $L_{2-325}$ |
| COMPOUND 2211 | $L_{1-6}$ | $L_{2-326}$ |
| COMPOUND 2212 | $L_{1-6}$ | $L_{2-327}$ |
| COMPOUND 2213 | $L_{1-6}$ | $L_{2-328}$ |
| COMPOUND 2214 | $L_{1-6}$ | $L_{2-329}$ |
| COMPOUND 2215 | $L_{1-6}$ | $L_{2-330}$ |
| COMPOUND 2216 | $L_{1-6}$ | $L_{2-331}$ |
| COMPOUND 2217 | $L_{1-6}$ | $L_{2-332}$ |
| COMPOUND 2218 | $L_{1-6}$ | $L_{2-333}$ |
| COMPOUND 2219 | $L_{1-6}$ | $L_{2-334}$ |

-continued

| | | |
|---|---|---|
| COMPOUND 2220 | $L_{1-6}$ | $L_{2-335}$ |
| COMPOUND 2221 | $L_{1-6}$ | $L_{2-336}$ |
| COMPOUND 2222 | $L_{1-6}$ | $L_{2-337}$ |
| COMPOUND 2223 | $L_{1-6}$ | $L_{2-338}$ |
| COMPOUND 2224 | $L_{1-6}$ | $L_{2-339}$ |
| COMPOUND 2225 | $L_{1-6}$ | $L_{2-340}$ |
| COMPOUND 2226 | $L_{1-6}$ | $L_{2-341}$ |
| COMPOUND 2227 | $L_{1-6}$ | $L_{2-342}$ |
| COMPOUND 2228 | $L_{1-6}$ | $L_{2-343}$ |
| COMPOUND 2229 | $L_{1-6}$ | $L_{2-344}$ |
| COMPOUND 2230 | $L_{1-6}$ | $L_{2-345}$ |
| COMPOUND 2231 | $L_{1-6}$ | $L_{2-346}$ |
| COMPOUND 2232 | $L_{1-6}$ | $L_{2-347}$ |
| COMPOUND 2233 | $L_{1-6}$ | $L_{2-348}$ |
| COMPOUND 2234 | $L_{1-6}$ | $L_{2-349}$ |
| COMPOUND 2235 | $L_{1-6}$ | $L_{2-350}$ |
| COMPOUND 2236 | $L_{1-6}$ | $L_{2-351}$ |
| COMPOUND 2237 | $L_{1-6}$ | $L_{2-352}$ |
| COMPOUND 2238 | $L_{1-6}$ | $L_{2-353}$ |
| COMPOUND 2239 | $L_{1-6}$ | $L_{2-354}$ |
| COMPOUND 2240 | $L_{1-6}$ | $L_{2-355}$ |
| COMPOUND 2241 | $L_{1-6}$ | $L_{2-356}$ |
| COMPOUND 2242 | $L_{1-6}$ | $L_{2-357}$ |
| COMPOUND 2243 | $L_{1-6}$ | $L_{2-358}$ |
| COMPOUND 2244 | $L_{1-6}$ | $L_{2-359}$ |
| COMPOUND 2245 | $L_{1-6}$ | $L_{2-360}$ |
| COMPOUND 2246 | $L_{1-6}$ | $L_{2-361}$ |
| COMPOUND 2247 | $L_{1-6}$ | $L_{2-362}$ |
| COMPOUND 2248 | $L_{1-6}$ | $L_{2-363}$ |
| COMPOUND 2249 | $L_{1-6}$ | $L_{2-364}$ |
| COMPOUND 2250 | $L_{1-6}$ | $L_{2-365}$ |
| COMPOUND 2251 | $L_{1-6}$ | $L_{2-366}$ |
| COMPOUND 2252 | $L_{1-6}$ | $L_{2-367}$ |
| COMPOUND 2253 | $L_{1-6}$ | $L_{2-368}$ |
| COMPOUND 2254 | $L_{1-6}$ | $L_{2-369}$ |
| COMPOUND 2255 | $L_{1-6}$ | $L_{2-370}$ |
| COMPOUND 2256 | $L_{1-6}$ | $L_{2-371}$ |
| COMPOUND 2257 | $L_{1-6}$ | $L_{2-372}$ |
| COMPOUND 2258 | $L_{1-6}$ | $L_{2-373}$ |
| COMPOUND 2259 | $L_{1-6}$ | $L_{2-374}$ |
| COMPOUND 2260 | $L_{1-6}$ | $L_{2-375}$ |
| COMPOUND 2261 | $L_{1-6}$ | $L_{2-376}$ |
| COMPOUND 2262 | $L_{1-6}$ | $L_{2-377}$ |
| COMPOUND 2263 | $L_{1-7}$ | $L_{2-1}$ |
| COMPOUND 2264 | $L_{1-7}$ | $L_{2-2}$ |
| COMPOUND 2265 | $L_{1-7}$ | $L_{2-3}$ |
| COMPOUND 2266 | $L_{1-7}$ | $L_{2-4}$ |
| COMPOUND 2267 | $L_{1-7}$ | $L_{2-5}$ |
| COMPOUND 2268 | $L_{1-7}$ | $L_{2-6}$ |
| COMPOUND 2269 | $L_{1-7}$ | $L_{2-7}$ |
| COMPOUND 2270 | $L_{1-7}$ | $L_{2-8}$ |
| COMPOUND 2271 | $L_{1-7}$ | $L_{2-9}$ |
| COMPOUND 2272 | $L_{1-7}$ | $L_{2-10}$ |
| COMPOUND 2273 | $L_{1-7}$ | $L_{2-11}$ |
| COMPOUND 2274 | $L_{1-7}$ | $L_{2-12}$ |
| COMPOUND 2275 | $L_{1-7}$ | $L_{2-13}$ |
| COMPOUND 2276 | $L_{1-7}$ | $L_{2-14}$ |
| COMPOUND 2277 | $L_{1-7}$ | $L_{2-15}$ |
| COMPOUND 2278 | $L_{1-7}$ | $L_{2-16}$ |
| COMPOUND 2279 | $L_{1-7}$ | $L_{2-17}$ |
| COMPOUND 2280 | $L_{1-7}$ | $L_{2-18}$ |
| COMPOUND 2281 | $L_{1-7}$ | $L_{2-19}$ |
| COMPOUND 2282 | $L_{1-7}$ | $L_{2-20}$ |
| COMPOUND 2283 | $L_{1-7}$ | $L_{2-21}$ |
| COMPOUND 2284 | $L_{1-7}$ | $L_{2-22}$ |
| COMPOUND 2285 | $L_{1-7}$ | $L_{2-23}$ |
| COMPOUND 2286 | $L_{1-7}$ | $L_{2-24}$ |
| COMPOUND 2287 | $L_{1-7}$ | $L_{2-25}$ |
| COMPOUND 2288 | $L_{1-7}$ | $L_{2-26}$ |
| COMPOUND 2289 | $L_{1-7}$ | $L_{2-27}$ |
| COMPOUND 2290 | $L_{1-7}$ | $L_{2-28}$ |
| COMPOUND 2291 | $L_{1-7}$ | $L_{2-29}$ |
| COMPOUND 2292 | $L_{1-7}$ | $L_{2-30}$ |
| COMPOUND 2293 | $L_{1-7}$ | $L_{2-31}$ |
| COMPOUND 2294 | $L_{1-7}$ | $L_{2-32}$ |
| COMPOUND 2295 | $L_{1-7}$ | $L_{2-33}$ |
| COMPOUND 2296 | $L_{1-7}$ | $L_{2-34}$ |
| COMPOUND 2297 | $L_{1-7}$ | $L_{2-35}$ |
| COMPOUND 2298 | $L_{1-7}$ | $L_{2-36}$ |

-continued

| | | |
|---|---|---|
| COMPOUND 2299 | $L_{1-7}$ | $L_{2-37}$ |
| COMPOUND 2300 | $L_{1-7}$ | $L_{2-38}$ |
| COMPOUND 2301 | $L_{1-7}$ | $L_{2-39}$ |
| COMPOUND 2302 | $L_{1-7}$ | $L_{2-40}$ |
| COMPOUND 2303 | $L_{1-7}$ | $L_{2-41}$ |
| COMPOUND 2304 | $L_{1-7}$ | $L_{2-42}$ |
| COMPOUND 2305 | $L_{1-7}$ | $L_{2-43}$ |
| COMPOUND 2306 | $L_{1-7}$ | $L_{2-44}$ |
| COMPOUND 2307 | $L_{1-7}$ | $L_{2-45}$ |
| COMPOUND 2308 | $L_{1-7}$ | $L_{2-46}$ |
| COMPOUND 2309 | $L_{1-7}$ | $L_{2-47}$ |
| COMPOUND 2310 | $L_{1-7}$ | $L_{2-48}$ |
| COMPOUND 2311 | $L_{1-7}$ | $L_{2-49}$ |
| COMPOUND 2312 | $L_{1-7}$ | $L_{2-50}$ |
| COMPOUND 2313 | $L_{1-7}$ | $L_{2-51}$ |
| COMPOUND 2314 | $L_{1-7}$ | $L_{2-52}$ |
| COMPOUND 2315 | $L_{1-7}$ | $L_{2-53}$ |
| COMPOUND 2316 | $L_{1-7}$ | $L_{2-54}$ |
| COMPOUND 2317 | $L_{1-7}$ | $L_{2-55}$ |
| COMPOUND 2318 | $L_{1-7}$ | $L_{2-56}$ |
| COMPOUND 2319 | $L_{1-7}$ | $L_{2-57}$ |
| COMPOUND 2320 | $L_{1-7}$ | $L_{2-58}$ |
| COMPOUND 2321 | $L_{1-7}$ | $L_{2-59}$ |
| COMPOUND 2322 | $L_{1-7}$ | $L_{2-60}$ |
| COMPOUND 2323 | $L_{1-7}$ | $L_{2-61}$ |
| COMPOUND 2324 | $L_{1-7}$ | $L_{2-62}$ |
| COMPOUND 2325 | $L_{1-7}$ | $L_{2-63}$ |
| COMPOUND 2326 | $L_{1-7}$ | $L_{2-64}$ |
| COMPOUND 2327 | $L_{1-7}$ | $L_{2-65}$ |
| COMPOUND 2328 | $L_{1-7}$ | $L_{2-66}$ |
| COMPOUND 2329 | $L_{1-7}$ | $L_{2-67}$ |
| COMPOUND 2330 | $L_{1-7}$ | $L_{2-68}$ |
| COMPOUND 2331 | $L_{1-7}$ | $L_{2-69}$ |
| COMPOUND 2332 | $L_{1-7}$ | $L_{2-70}$ |
| COMPOUND 2333 | $L_{1-7}$ | $L_{2-71}$ |
| COMPOUND 2334 | $L_{1-7}$ | $L_{2-72}$ |
| COMPOUND 2335 | $L_{1-7}$ | $L_{2-73}$ |
| COMPOUND 2336 | $L_{1-7}$ | $L_{2-74}$ |
| COMPOUND 2337 | $L_{1-7}$ | $L_{2-75}$ |
| COMPOUND 2338 | $L_{1-7}$ | $L_{2-76}$ |
| COMPOUND 2339 | $L_{1-7}$ | $L_{2-77}$ |
| COMPOUND 2340 | $L_{1-7}$ | $L_{2-78}$ |
| COMPOUND 2341 | $L_{1-7}$ | $L_{2-79}$ |
| COMPOUND 2342 | $L_{1-7}$ | $L_{2-80}$ |
| COMPOUND 2343 | $L_{1-7}$ | $L_{2-81}$ |
| COMPOUND 2344 | $L_{1-7}$ | $L_{2-82}$ |
| COMPOUND 2345 | $L_{1-7}$ | $L_{2-83}$ |
| COMPOUND 2346 | $L_{1-7}$ | $L_{2-84}$ |
| COMPOUND 2347 | $L_{1-7}$ | $L_{2-85}$ |
| COMPOUND 2348 | $L_{1-7}$ | $L_{2-86}$ |
| COMPOUND 2349 | $L_{1-7}$ | $L_{2-87}$ |
| COMPOUND 2350 | $L_{1-7}$ | $L_{2-88}$ |
| COMPOUND 2351 | $L_{1-7}$ | $L_{2-89}$ |
| COMPOUND 2352 | $L_{1-7}$ | $L_{2-90}$ |
| COMPOUND 2353 | $L_{1-7}$ | $L_{2-91}$ |
| COMPOUND 2354 | $L_{1-7}$ | $L_{2-92}$ |
| COMPOUND 2355 | $L_{1-7}$ | $L_{2-93}$ |
| COMPOUND 2356 | $L_{1-7}$ | $L_{2-94}$ |
| COMPOUND 2357 | $L_{1-7}$ | $L_{2-95}$ |
| COMPOUND 2358 | $L_{1-7}$ | $L_{2-96}$ |
| COMPOUND 2359 | $L_{1-7}$ | $L_{2-97}$ |
| COMPOUND 2360 | $L_{1-7}$ | $L_{2-98}$ |
| COMPOUND 2361 | $L_{1-7}$ | $L_{2-99}$ |
| COMPOUND 2362 | $L_{1-7}$ | $L_{2-100}$ |
| COMPOUND 2363 | $L_{1-7}$ | $L_{2-101}$ |
| COMPOUND 2364 | $L_{1-7}$ | $L_{2-102}$ |
| COMPOUND 2365 | $L_{1-7}$ | $L_{2-103}$ |
| COMPOUND 2366 | $L_{1-7}$ | $L_{2-104}$ |
| COMPOUND 2367 | $L_{1-7}$ | $L_{2-105}$ |
| COMPOUND 2368 | $L_{1-7}$ | $L_{2-106}$ |
| COMPOUND 2369 | $L_{1-7}$ | $L_{2-107}$ |
| COMPOUND 2370 | $L_{1-7}$ | $L_{2-108}$ |
| COMPOUND 2371 | $L_{1-7}$ | $L_{2-109}$ |
| COMPOUND 2372 | $L_{1-7}$ | $L_{2-110}$ |
| COMPOUND 2373 | $L_{1-7}$ | $L_{2-111}$ |
| COMPOUND 2374 | $L_{1-7}$ | $L_{2-112}$ |
| COMPOUND 2375 | $L_{1-7}$ | $L_{2-113}$ |
| COMPOUND 2376 | $L_{1-7}$ | $L_{2-114}$ |
| COMPOUND 2377 | $L_{1-7}$ | $L_{2-115}$ |

| | | |
|---|---|---|
| COMPOUND 2378 | $L_{1-7}$ | $L_{2-116}$ |
| COMPOUND 2379 | $L_{1-7}$ | $L_{2-117}$ |
| COMPOUND 2380 | $L_{1-7}$ | $L_{2-118}$ |
| COMPOUND 2381 | $L_{1-7}$ | $L_{2-119}$ |
| COMPOUND 2382 | $L_{1-7}$ | $L_{2-120}$ |
| COMPOUND 2383 | $L_{1-7}$ | $L_{2-121}$ |
| COMPOUND 2384 | $L_{1-7}$ | $L_{2-122}$ |
| COMPOUND 2385 | $L_{1-7}$ | $L_{2-123}$ |
| COMPOUND 2386 | $L_{1-7}$ | $L_{2-124}$ |
| COMPOUND 2387 | $L_{1-7}$ | $L_{2-125}$ |
| COMPOUND 2388 | $L_{1-7}$ | $L_{2-126}$ |
| COMPOUND 2389 | $L_{1-7}$ | $L_{2-127}$ |
| COMPOUND 2390 | $L_{1-7}$ | $L_{2-128}$ |
| COMPOUND 2391 | $L_{1-7}$ | $L_{2-129}$ |
| COMPOUND 2392 | $L_{1-7}$ | $L_{2-130}$ |
| COMPOUND 2393 | $L_{1-7}$ | $L_{2-131}$ |
| COMPOUND 2394 | $L_{1-7}$ | $L_{2-132}$ |
| COMPOUND 2395 | $L_{1-7}$ | $L_{2-133}$ |
| COMPOUND 2396 | $L_{1-7}$ | $L_{2-134}$ |
| COMPOUND 2397 | $L_{1-7}$ | $L_{2-135}$ |
| COMPOUND 2398 | $L_{1-7}$ | $L_{2-136}$ |
| COMPOUND 2399 | $L_{1-7}$ | $L_{2-137}$ |
| COMPOUND 2400 | $L_{1-7}$ | $L_{2-138}$ |
| COMPOUND 2401 | $L_{1-7}$ | $L_{2-139}$ |
| COMPOUND 2402 | $L_{1-7}$ | $L_{2-140}$ |
| COMPOUND 2403 | $L_{1-7}$ | $L_{2-141}$ |
| COMPOUND 2404 | $L_{1-7}$ | $L_{2-142}$ |
| COMPOUND 2405 | $L_{1-7}$ | $L_{2-143}$ |
| COMPOUND 2406 | $L_{1-7}$ | $L_{2-144}$ |
| COMPOUND 2407 | $L_{1-7}$ | $L_{2-145}$ |
| COMPOUND 2408 | $L_{1-7}$ | $L_{2-146}$ |
| COMPOUND 2409 | $L_{1-7}$ | $L_{2-147}$ |
| COMPOUND 2410 | $L_{1-7}$ | $L_{2-148}$ |
| COMPOUND 2411 | $L_{1-7}$ | $L_{2-149}$ |
| COMPOUND 2412 | $L_{1-7}$ | $L_{2-150}$ |
| COMPOUND 2413 | $L_{1-7}$ | $L_{2-151}$ |
| COMPOUND 2414 | $L_{1-7}$ | $L_{2-152}$ |
| COMPOUND 2415 | $L_{1-7}$ | $L_{2-153}$ |
| COMPOUND 2416 | $L_{1-7}$ | $L_{2-154}$ |
| COMPOUND 2417 | $L_{1-7}$ | $L_{2-155}$ |
| COMPOUND 2418 | $L_{1-7}$ | $L_{2-156}$ |
| COMPOUND 2419 | $L_{1-7}$ | $L_{2-157}$ |
| COMPOUND 2420 | $L_{1-7}$ | $L_{2-158}$ |
| COMPOUND 2421 | $L_{1-7}$ | $L_{2-159}$ |
| COMPOUND 2422 | $L_{1-7}$ | $L_{2-160}$ |
| COMPOUND 2423 | $L_{1-7}$ | $L_{2-161}$ |
| COMPOUND 2424 | $L_{1-7}$ | $L_{2-162}$ |
| COMPOUND 2425 | $L_{1-7}$ | $L_{2-163}$ |
| COMPOUND 2426 | $L_{1-7}$ | $L_{2-164}$ |
| COMPOUND 2427 | $L_{1-7}$ | $L_{2-165}$ |
| COMPOUND 2428 | $L_{1-7}$ | $L_{2-166}$ |
| COMPOUND 2429 | $L_{1-7}$ | $L_{2-167}$ |
| COMPOUND 2430 | $L_{1-7}$ | $L_{2-168}$ |
| COMPOUND 2431 | $L_{1-7}$ | $L_{2-169}$ |
| COMPOUND 2432 | $L_{1-7}$ | $L_{2-170}$ |
| COMPOUND 2433 | $L_{1-7}$ | $L_{2-171}$ |
| COMPOUND 2434 | $L_{1-7}$ | $L_{2-172}$ |
| COMPOUND 2435 | $L_{1-7}$ | $L_{2-173}$ |
| COMPOUND 2436 | $L_{1-7}$ | $L_{2-174}$ |
| COMPOUND 2437 | $L_{1-7}$ | $L_{2-175}$ |
| COMPOUND 2438 | $L_{1-7}$ | $L_{2-176}$ |
| COMPOUND 2439 | $L_{1-7}$ | $L_{2-177}$ |
| COMPOUND 2440 | $L_{1-7}$ | $L_{2-178}$ |
| COMPOUND 2441 | $L_{1-7}$ | $L_{2-179}$ |
| COMPOUND 2442 | $L_{1-7}$ | $L_{2-180}$ |
| COMPOUND 2443 | $L_{1-7}$ | $L_{2-181}$ |
| COMPOUND 2444 | $L_{1-7}$ | $L_{2-182}$ |
| COMPOUND 2445 | $L_{1-7}$ | $L_{2-183}$ |
| COMPOUND 2446 | $L_{1-7}$ | $L_{2-184}$ |
| COMPOUND 2447 | $L_{1-7}$ | $L_{2-185}$ |
| COMPOUND 2448 | $L_{1-7}$ | $L_{2-186}$ |
| COMPOUND 2449 | $L_{1-7}$ | $L_{2-187}$ |
| COMPOUND 2450 | $L_{1-7}$ | $L_{2-188}$ |
| COMPOUND 2451 | $L_{1-7}$ | $L_{2-189}$ |
| COMPOUND 2452 | $L_{1-7}$ | $L_{2-190}$ |
| COMPOUND 2453 | $L_{1-7}$ | $L_{2-191}$ |
| COMPOUND 2454 | $L_{1-7}$ | $L_{2-192}$ |
| COMPOUND 2455 | $L_{1-7}$ | $L_{2-193}$ |
| COMPOUND 2456 | $L_{1-7}$ | $L_{2-194}$ |

| | | |
|---|---|---|
| COMPOUND 2457 | $L_{1-7}$ | $L_{2-195}$ |
| COMPOUND 2458 | $L_{1-7}$ | $L_{2-196}$ |
| COMPOUND 2459 | $L_{1-7}$ | $L_{2-197}$ |
| COMPOUND 2460 | $L_{1-7}$ | $L_{2-198}$ |
| COMPOUND 2461 | $L_{1-7}$ | $L_{2-199}$ |
| COMPOUND 2462 | $L_{1-7}$ | $L_{2-200}$ |
| COMPOUND 2463 | $L_{1-7}$ | $L_{2-201}$ |
| COMPOUND 2464 | $L_{1-7}$ | $L_{2-202}$ |
| COMPOUND 2465 | $L_{1-7}$ | $L_{2-203}$ |
| COMPOUND 2466 | $L_{1-7}$ | $L_{2-204}$ |
| COMPOUND 2467 | $L_{1-7}$ | $L_{2-205}$ |
| COMPOUND 2468 | $L_{1-7}$ | $L_{2-206}$ |
| COMPOUND 2469 | $L_{1-7}$ | $L_{2-207}$ |
| COMPOUND 2470 | $L_{1-7}$ | $L_{2-208}$ |
| COMPOUND 2471 | $L_{1-7}$ | $L_{2-209}$ |
| COMPOUND 2472 | $L_{1-7}$ | $L_{2-210}$ |
| COMPOUND 2473 | $L_{1-7}$ | $L_{2-211}$ |
| COMPOUND 2474 | $L_{1-7}$ | $L_{2-212}$ |
| COMPOUND 2475 | $L_{1-7}$ | $L_{2-213}$ |
| COMPOUND 2476 | $L_{1-7}$ | $L_{2-214}$ |
| COMPOUND 2477 | $L_{1-7}$ | $L_{2-215}$ |
| COMPOUND 2478 | $L_{1-7}$ | $L_{2-216}$ |
| COMPOUND 2479 | $L_{1-7}$ | $L_{2-217}$ |
| COMPOUND 2480 | $L_{1-7}$ | $L_{2-218}$ |
| COMPOUND 2481 | $L_{1-7}$ | $L_{2-219}$ |
| COMPOUND 2482 | $L_{1-7}$ | $L_{2-220}$ |
| COMPOUND 2483 | $L_{1-7}$ | $L_{2-221}$ |
| COMPOUND 2484 | $L_{1-7}$ | $L_{2-222}$ |
| COMPOUND 2485 | $L_{1-7}$ | $L_{2-223}$ |
| COMPOUND 2486 | $L_{1-7}$ | $L_{2-224}$ |
| COMPOUND 2487 | $L_{1-7}$ | $L_{2-225}$ |
| COMPOUND 2488 | $L_{1-7}$ | $L_{2-226}$ |
| COMPOUND 2489 | $L_{1-7}$ | $L_{2-227}$ |
| COMPOUND 2490 | $L_{1-7}$ | $L_{2-228}$ |
| COMPOUND 2491 | $L_{1-7}$ | $L_{2-229}$ |
| COMPOUND 2492 | $L_{1-7}$ | $L_{2-230}$ |
| COMPOUND 2493 | $L_{1-7}$ | $L_{2-231}$ |
| COMPOUND 2494 | $L_{1-7}$ | $L_{2-232}$ |
| COMPOUND 2495 | $L_{1-7}$ | $L_{2-233}$ |
| COMPOUND 2496 | $L_{1-7}$ | $L_{2-234}$ |
| COMPOUND 2497 | $L_{1-7}$ | $L_{2-235}$ |
| COMPOUND 2498 | $L_{1-7}$ | $L_{2-236}$ |
| COMPOUND 2499 | $L_{1-7}$ | $L_{2-237}$ |
| COMPOUND 2500 | $L_{1-7}$ | $L_{2-238}$ |
| COMPOUND 2501 | $L_{1-7}$ | $L_{2-239}$ |
| COMPOUND 2502 | $L_{1-7}$ | $L_{2-240}$ |
| COMPOUND 2503 | $L_{1-7}$ | $L_{2-241}$ |
| COMPOUND 2504 | $L_{1-7}$ | $L_{2-242}$ |
| COMPOUND 2505 | $L_{1-7}$ | $L_{2-243}$ |
| COMPOUND 2506 | $L_{1-7}$ | $L_{2-244}$ |
| COMPOUND 2507 | $L_{1-7}$ | $L_{2-245}$ |
| COMPOUND 2508 | $L_{1-7}$ | $L_{2-246}$ |
| COMPOUND 2509 | $L_{1-7}$ | $L_{2-247}$ |
| COMPOUND 2510 | $L_{1-7}$ | $L_{2-248}$ |
| COMPOUND 2511 | $L_{1-7}$ | $L_{2-249}$ |
| COMPOUND 2512 | $L_{1-7}$ | $L_{2-250}$ |
| COMPOUND 2513 | $L_{1-7}$ | $L_{2-251}$ |
| COMPOUND 2514 | $L_{1-7}$ | $L_{2-252}$ |
| COMPOUND 2515 | $L_{1-7}$ | $L_{2-253}$ |
| COMPOUND 2516 | $L_{1-7}$ | $L_{2-254}$ |
| COMPOUND 2517 | $L_{1-7}$ | $L_{2-255}$ |
| COMPOUND 2518 | $L_{1-7}$ | $L_{2-256}$ |
| COMPOUND 2519 | $L_{1-7}$ | $L_{2-257}$ |
| COMPOUND 2520 | $L_{1-7}$ | $L_{2-258}$ |
| COMPOUND 2521 | $L_{1-7}$ | $L_{2-259}$ |
| COMPOUND 2522 | $L_{1-7}$ | $L_{2-260}$ |
| COMPOUND 2523 | $L_{1-7}$ | $L_{2-261}$ |
| COMPOUND 2524 | $L_{1-7}$ | $L_{2-262}$ |
| COMPOUND 2525 | $L_{1-7}$ | $L_{2-263}$ |
| COMPOUND 2526 | $L_{1-7}$ | $L_{2-264}$ |
| COMPOUND 2527 | $L_{1-7}$ | $L_{2-265}$ |
| COMPOUND 2528 | $L_{1-7}$ | $L_{2-266}$ |
| COMPOUND 2529 | $L_{1-7}$ | $L_{2-267}$ |
| COMPOUND 2530 | $L_{1-7}$ | $L_{2-268}$ |
| COMPOUND 2531 | $L_{1-7}$ | $L_{2-269}$ |
| COMPOUND 2532 | $L_{1-7}$ | $L_{2-270}$ |
| COMPOUND 2533 | $L_{1-7}$ | $L_{2-271}$ |
| COMPOUND 2534 | $L_{1-7}$ | $L_{2-272}$ |
| COMPOUND 2535 | $L_{1-7}$ | $L_{2-273}$ |

-continued

| | | |
|---|---|---|
| COMPOUND 2536 | $L_{1-7}$ | $L_{2-274}$ |
| COMPOUND 2537 | $L_{1-7}$ | $L_{2-275}$ |
| COMPOUND 2538 | $L_{1-7}$ | $L_{2-276}$ |
| COMPOUND 2539 | $L_{1-7}$ | $L_{2-277}$ |
| COMPOUND 2540 | $L_{1-7}$ | $L_{2-278}$ |
| COMPOUND 2541 | $L_{1-7}$ | $L_{2-279}$ |
| COMPOUND 2542 | $L_{1-7}$ | $L_{2-280}$ |
| COMPOUND 2543 | $L_{1-7}$ | $L_{2-281}$ |
| COMPOUND 2544 | $L_{1-7}$ | $L_{2-282}$ |
| COMPOUND 2545 | $L_{1-7}$ | $L_{2-283}$ |
| COMPOUND 2546 | $L_{1-7}$ | $L_{2-284}$ |
| COMPOUND 2547 | $L_{1-7}$ | $L_{2-285}$ |
| COMPOUND 2548 | $L_{1-7}$ | $L_{2-286}$ |
| COMPOUND 2549 | $L_{1-7}$ | $L_{2-287}$ |
| COMPOUND 2550 | $L_{1-7}$ | $L_{2-288}$ |
| COMPOUND 2551 | $L_{1-7}$ | $L_{2-289}$ |
| COMPOUND 2552 | $L_{1-7}$ | $L_{2-290}$ |
| COMPOUND 2553 | $L_{1-7}$ | $L_{2-291}$ |
| COMPOUND 2554 | $L_{1-7}$ | $L_{2-292}$ |
| COMPOUND 2555 | $L_{1-7}$ | $L_{2-293}$ |
| COMPOUND 2556 | $L_{1-7}$ | $L_{2-294}$ |
| COMPOUND 2557 | $L_{1-7}$ | $L_{2-295}$ |
| COMPOUND 2558 | $L_{1-7}$ | $L_{2-296}$ |
| COMPOUND 2559 | $L_{1-7}$ | $L_{2-297}$ |
| COMPOUND 2560 | $L_{1-7}$ | $L_{2-298}$ |
| COMPOUND 2561 | $L_{1-7}$ | $L_{2-299}$ |
| COMPOUND 2562 | $L_{1-7}$ | $L_{2-300}$ |
| COMPOUND 2563 | $L_{1-7}$ | $L_{2-301}$ |
| COMPOUND 2564 | $L_{1-7}$ | $L_{2-302}$ |
| COMPOUND 2565 | $L_{1-7}$ | $L_{2-303}$ |
| COMPOUND 2566 | $L_{1-7}$ | $L_{2-304}$ |
| COMPOUND 2567 | $L_{1-7}$ | $L_{2-305}$ |
| COMPOUND 2568 | $L_{1-7}$ | $L_{2-306}$ |
| COMPOUND 2569 | $L_{1-7}$ | $L_{2-307}$ |
| COMPOUND 2570 | $L_{1-7}$ | $L_{2-308}$ |
| COMPOUND 2571 | $L_{1-7}$ | $L_{2-309}$ |
| COMPOUND 2572 | $L_{1-7}$ | $L_{2-310}$ |
| COMPOUND 2573 | $L_{1-7}$ | $L_{2-311}$ |
| COMPOUND 2574 | $L_{1-7}$ | $L_{2-312}$ |
| COMPOUND 2575 | $L_{1-7}$ | $L_{2-313}$ |
| COMPOUND 2576 | $L_{1-7}$ | $L_{2-314}$ |
| COMPOUND 2577 | $L_{1-7}$ | $L_{2-315}$ |
| COMPOUND 2578 | $L_{1-7}$ | $L_{2-316}$ |
| COMPOUND 2579 | $L_{1-7}$ | $L_{2-317}$ |
| COMPOUND 2580 | $L_{1-7}$ | $L_{2-318}$ |
| COMPOUND 2581 | $L_{1-7}$ | $L_{2-319}$ |
| COMPOUND 2582 | $L_{1-7}$ | $L_{2-320}$ |
| COMPOUND 2583 | $L_{1-7}$ | $L_{2-321}$ |
| COMPOUND 2584 | $L_{1-7}$ | $L_{2-322}$ |
| COMPOUND 2585 | $L_{1-7}$ | $L_{2-323}$ |
| COMPOUND 2586 | $L_{1-7}$ | $L_{2-324}$ |
| COMPOUND 2587 | $L_{1-7}$ | $L_{2-325}$ |
| COMPOUND 2588 | $L_{1-7}$ | $L_{2-326}$ |
| COMPOUND 2589 | $L_{1-7}$ | $L_{2-327}$ |
| COMPOUND 2590 | $L_{1-7}$ | $L_{2-328}$ |
| COMPOUND 2591 | $L_{1-7}$ | $L_{2-329}$ |
| COMPOUND 2592 | $L_{1-7}$ | $L_{2-330}$ |
| COMPOUND 2593 | $L_{1-7}$ | $L_{2-331}$ |
| COMPOUND 2594 | $L_{1-7}$ | $L_{2-332}$ |
| COMPOUND 2595 | $L_{1-7}$ | $L_{2-333}$ |
| COMPOUND 2596 | $L_{1-7}$ | $L_{2-334}$ |
| COMPOUND 2597 | $L_{1-7}$ | $L_{2-335}$ |
| COMPOUND 2598 | $L_{1-7}$ | $L_{2-336}$ |
| COMPOUND 2599 | $L_{1-7}$ | $L_{2-337}$ |
| COMPOUND 2600 | $L_{1-7}$ | $L_{2-338}$ |
| COMPOUND 2601 | $L_{1-7}$ | $L_{2-339}$ |
| COMPOUND 2602 | $L_{1-7}$ | $L_{2-340}$ |
| COMPOUND 2603 | $L_{1-7}$ | $L_{2-341}$ |
| COMPOUND 2604 | $L_{1-7}$ | $L_{2-342}$ |
| COMPOUND 2605 | $L_{1-7}$ | $L_{2-343}$ |
| COMPOUND 2606 | $L_{1-7}$ | $L_{2-344}$ |
| COMPOUND 2607 | $L_{1-7}$ | $L_{2-345}$ |
| COMPOUND 2608 | $L_{1-7}$ | $L_{2-346}$ |
| COMPOUND 2609 | $L_{1-7}$ | $L_{2-347}$ |
| COMPOUND 2610 | $L_{1-7}$ | $L_{2-348}$ |
| COMPOUND 2611 | $L_{1-7}$ | $L_{2-349}$ |
| COMPOUND 2612 | $L_{1-7}$ | $L_{2-350}$ |
| COMPOUND 2613 | $L_{1-7}$ | $L_{2-351}$ |
| COMPOUND 2614 | $L_{1-7}$ | $L_{2-352}$ |

-continued

| | | |
|---|---|---|
| COMPOUND 2615 | $L_{1-7}$ | $L_{2-353}$ |
| COMPOUND 2616 | $L_{1-7}$ | $L_{2-354}$ |
| COMPOUND 2617 | $L_{1-7}$ | $L_{2-355}$ |
| COMPOUND 2618 | $L_{1-7}$ | $L_{2-356}$ |
| COMPOUND 2619 | $L_{1-7}$ | $L_{2-357}$ |
| COMPOUND 2620 | $L_{1-7}$ | $L_{2-358}$ |
| COMPOUND 2621 | $L_{1-7}$ | $L_{2-359}$ |
| COMPOUND 2622 | $L_{1-7}$ | $L_{2-360}$ |
| COMPOUND 2623 | $L_{1-7}$ | $L_{2-361}$ |
| COMPOUND 2624 | $L_{1-7}$ | $L_{2-362}$ |
| COMPOUND 2625 | $L_{1-7}$ | $L_{2-363}$ |
| COMPOUND 2626 | $L_{1-7}$ | $L_{2-364}$ |
| COMPOUND 2627 | $L_{1-7}$ | $L_{2-365}$ |
| COMPOUND 2628 | $L_{1-7}$ | $L_{2-366}$ |
| COMPOUND 2629 | $L_{1-7}$ | $L_{2-367}$ |
| COMPOUND 2630 | $L_{1-7}$ | $L_{2-368}$ |
| COMPOUND 2631 | $L_{1-7}$ | $L_{2-369}$ |
| COMPOUND 2632 | $L_{1-7}$ | $L_{2-370}$ |
| COMPOUND 2633 | $L_{1-7}$ | $L_{2-371}$ |
| COMPOUND 2634 | $L_{1-7}$ | $L_{2-372}$ |
| COMPOUND 2635 | $L_{1-7}$ | $L_{2-373}$ |
| COMPOUND 2636 | $L_{1-7}$ | $L_{2-374}$ |
| COMPOUND 2637 | $L_{1-7}$ | $L_{2-375}$ |
| COMPOUND 2638 | $L_{1-7}$ | $L_{2-376}$ |
| COMPOUND 2639 | $L_{1-7}$ | $L_{2-377}$ |
| COMPOUND 2640 | $L_{1-8}$ | $L_{2-1}$ |
| COMPOUND 2641 | $L_{1-8}$ | $L_{2-2}$ |
| COMPOUND 2642 | $L_{1-8}$ | $L_{2-3}$ |
| COMPOUND 2643 | $L_{1-8}$ | $L_{2-4}$ |
| COMPOUND 2644 | $L_{1-8}$ | $L_{2-5}$ |
| COMPOUND 2645 | $L_{1-8}$ | $L_{2-6}$ |
| COMPOUND 2646 | $L_{1-8}$ | $L_{2-7}$ |
| COMPOUND 2647 | $L_{1-8}$ | $L_{2-8}$ |
| COMPOUND 2648 | $L_{1-8}$ | $L_{2-9}$ |
| COMPOUND 2649 | $L_{1-8}$ | $L_{2-10}$ |
| COMPOUND 2650 | $L_{1-8}$ | $L_{2-11}$ |
| COMPOUND 2651 | $L_{1-8}$ | $L_{2-12}$ |
| COMPOUND 2652 | $L_{1-8}$ | $L_{2-13}$ |
| COMPOUND 2653 | $L_{1-8}$ | $L_{2-14}$ |
| COMPOUND 2654 | $L_{1-8}$ | $L_{2-15}$ |
| COMPOUND 2655 | $L_{1-8}$ | $L_{2-16}$ |
| COMPOUND 2656 | $L_{1-8}$ | $L_{2-17}$ |
| COMPOUND 2657 | $L_{1-8}$ | $L_{2-18}$ |
| COMPOUND 2658 | $L_{1-8}$ | $L_{2-19}$ |
| COMPOUND 2659 | $L_{1-8}$ | $L_{2-20}$ |
| COMPOUND 2660 | $L_{1-8}$ | $L_{2-21}$ |
| COMPOUND 2661 | $L_{1-8}$ | $L_{2-22}$ |
| COMPOUND 2662 | $L_{1-8}$ | $L_{2-23}$ |
| COMPOUND 2663 | $L_{1-8}$ | $L_{2-24}$ |
| COMPOUND 2664 | $L_{1-8}$ | $L_{2-25}$ |
| COMPOUND 2665 | $L_{1-8}$ | $L_{2-26}$ |
| COMPOUND 2666 | $L_{1-8}$ | $L_{2-27}$ |
| COMPOUND 2667 | $L_{1-8}$ | $L_{2-28}$ |
| COMPOUND 2668 | $L_{1-8}$ | $L_{2-29}$ |
| COMPOUND 2669 | $L_{1-8}$ | $L_{2-30}$ |
| COMPOUND 2670 | $L_{1-8}$ | $L_{2-31}$ |
| COMPOUND 2671 | $L_{1-8}$ | $L_{2-32}$ |
| COMPOUND 2672 | $L_{1-8}$ | $L_{2-33}$ |
| COMPOUND 2673 | $L_{1-8}$ | $L_{2-34}$ |
| COMPOUND 2674 | $L_{1-8}$ | $L_{2-35}$ |
| COMPOUND 2675 | $L_{1-8}$ | $L_{2-36}$ |
| COMPOUND 2676 | $L_{1-8}$ | $L_{2-37}$ |
| COMPOUND 2677 | $L_{1-8}$ | $L_{2-38}$ |
| COMPOUND 2678 | $L_{1-8}$ | $L_{2-39}$ |
| COMPOUND 2679 | $L_{1-8}$ | $L_{2-40}$ |
| COMPOUND 2680 | $L_{1-8}$ | $L_{2-41}$ |
| COMPOUND 2681 | $L_{1-8}$ | $L_{2-42}$ |
| COMPOUND 2682 | $L_{1-8}$ | $L_{2-43}$ |
| COMPOUND 2683 | $L_{1-8}$ | $L_{2-44}$ |
| COMPOUND 2684 | $L_{1-8}$ | $L_{2-45}$ |
| COMPOUND 2685 | $L_{1-8}$ | $L_{2-46}$ |
| COMPOUND 2686 | $L_{1-8}$ | $L_{2-47}$ |
| COMPOUND 2687 | $L_{1-8}$ | $L_{2-48}$ |
| COMPOUND 2688 | $L_{1-8}$ | $L_{2-49}$ |
| COMPOUND 2689 | $L_{1-8}$ | $L_{2-50}$ |
| COMPOUND 2690 | $L_{1-8}$ | $L_{2-51}$ |
| COMPOUND 2691 | $L_{1-8}$ | $L_{2-52}$ |
| COMPOUND 2692 | $L_{1-8}$ | $L_{2-53}$ |
| COMPOUND 2693 | $L_{1-8}$ | $L_{2-54}$ |

-continued

| | | |
|---|---|---|
| COMPOUND 2694 | $L_{1-8}$ | $L_{2-55}$ |
| COMPOUND 2695 | $L_{1-8}$ | $L_{2-56}$ |
| COMPOUND 2696 | $L_{1-8}$ | $L_{2-57}$ |
| COMPOUND 2697 | $L_{1-8}$ | $L_{2-58}$ |
| COMPOUND 2698 | $L_{1-8}$ | $L_{2-59}$ |
| COMPOUND 2699 | $L_{1-8}$ | $L_{2-60}$ |
| COMPOUND 2700 | $L_{1-8}$ | $L_{2-61}$ |
| COMPOUND 2701 | $L_{1-8}$ | $L_{2-62}$ |
| COMPOUND 2702 | $L_{1-8}$ | $L_{2-63}$ |
| COMPOUND 2703 | $L_{1-8}$ | $L_{2-64}$ |
| COMPOUND 2704 | $L_{1-8}$ | $L_{2-65}$ |
| COMPOUND 2705 | $L_{1-8}$ | $L_{2-66}$ |
| COMPOUND 2706 | $L_{1-8}$ | $L_{2-67}$ |
| COMPOUND 2707 | $L_{1-8}$ | $L_{2-68}$ |
| COMPOUND 2708 | $L_{1-8}$ | $L_{2-69}$ |
| COMPOUND 2709 | $L_{1-8}$ | $L_{2-70}$ |
| COMPOUND 2710 | $L_{1-8}$ | $L_{2-71}$ |
| COMPOUND 2711 | $L_{1-8}$ | $L_{2-72}$ |
| COMPOUND 2712 | $L_{1-8}$ | $L_{2-73}$ |
| COMPOUND 2713 | $L_{1-8}$ | $L_{2-74}$ |
| COMPOUND 2714 | $L_{1-8}$ | $L_{2-75}$ |
| COMPOUND 2715 | $L_{1-8}$ | $L_{2-76}$ |
| COMPOUND 2716 | $L_{1-8}$ | $L_{2-77}$ |
| COMPOUND 2717 | $L_{1-8}$ | $L_{2-78}$ |
| COMPOUND 2718 | $L_{1-8}$ | $L_{2-79}$ |
| COMPOUND 2719 | $L_{1-8}$ | $L_{2-80}$ |
| COMPOUND 2720 | $L_{1-8}$ | $L_{2-81}$ |
| COMPOUND 2721 | $L_{1-8}$ | $L_{2-82}$ |
| COMPOUND 2722 | $L_{1-8}$ | $L_{2-83}$ |
| COMPOUND 2723 | $L_{1-8}$ | $L_{2-84}$ |
| COMPOUND 2724 | $L_{1-8}$ | $L_{2-85}$ |
| COMPOUND 2725 | $L_{1-8}$ | $L_{2-86}$ |
| COMPOUND 2726 | $L_{1-8}$ | $L_{2-87}$ |
| COMPOUND 2727 | $L_{1-8}$ | $L_{2-88}$ |
| COMPOUND 2728 | $L_{1-8}$ | $L_{2-89}$ |
| COMPOUND 2729 | $L_{1-8}$ | $L_{2-90}$ |
| COMPOUND 2730 | $L_{1-8}$ | $L_{2-91}$ |
| COMPOUND 2731 | $L_{1-8}$ | $L_{2-92}$ |
| COMPOUND 2732 | $L_{1-8}$ | $L_{2-93}$ |
| COMPOUND 2733 | $L_{1-8}$ | $L_{2-94}$ |
| COMPOUND 2734 | $L_{1-8}$ | $L_{2-95}$ |
| COMPOUND 2735 | $L_{1-8}$ | $L_{2-96}$ |
| COMPOUND 2736 | $L_{1-8}$ | $L_{2-97}$ |
| COMPOUND 2737 | $L_{1-8}$ | $L_{2-98}$ |
| COMPOUND 2738 | $L_{1-8}$ | $L_{2-99}$ |
| COMPOUND 2739 | $L_{1-8}$ | $L_{2-100}$ |
| COMPOUND 2740 | $L_{1-8}$ | $L_{2-101}$ |
| COMPOUND 2741 | $L_{1-8}$ | $L_{2-102}$ |
| COMPOUND 2742 | $L_{1-8}$ | $L_{2-103}$ |
| COMPOUND 2743 | $L_{1-8}$ | $L_{2-104}$ |
| COMPOUND 2744 | $L_{1-8}$ | $L_{2-105}$ |
| COMPOUND 2745 | $L_{1-8}$ | $L_{2-106}$ |
| COMPOUND 2746 | $L_{1-8}$ | $L_{2-107}$ |
| COMPOUND 2747 | $L_{1-8}$ | $L_{2-108}$ |
| COMPOUND 2748 | $L_{1-8}$ | $L_{2-109}$ |
| COMPOUND 2749 | $L_{1-8}$ | $L_{2-110}$ |
| COMPOUND 2750 | $L_{1-8}$ | $L_{2-111}$ |
| COMPOUND 2751 | $L_{1-8}$ | $L_{2-112}$ |
| COMPOUND 2752 | $L_{1-8}$ | $L_{2-113}$ |
| COMPOUND 2753 | $L_{1-8}$ | $L_{2-114}$ |
| COMPOUND 2754 | $L_{1-8}$ | $L_{2-115}$ |
| COMPOUND 2755 | $L_{1-8}$ | $L_{2-116}$ |
| COMPOUND 2756 | $L_{1-8}$ | $L_{2-117}$ |
| COMPOUND 2757 | $L_{1-8}$ | $L_{2-118}$ |
| COMPOUND 2758 | $L_{1-8}$ | $L_{2-119}$ |
| COMPOUND 2759 | $L_{1-8}$ | $L_{2-120}$ |
| COMPOUND 2760 | $L_{1-8}$ | $L_{2-121}$ |
| COMPOUND 2761 | $L_{1-8}$ | $L_{2-122}$ |
| COMPOUND 2762 | $L_{1-8}$ | $L_{2-123}$ |
| COMPOUND 2763 | $L_{1-8}$ | $L_{2-124}$ |
| COMPOUND 2764 | $L_{1-8}$ | $L_{2-125}$ |
| COMPOUND 2765 | $L_{1-8}$ | $L_{2-126}$ |
| COMPOUND 2766 | $L_{1-8}$ | $L_{2-127}$ |
| COMPOUND 2767 | $L_{1-8}$ | $L_{2-128}$ |
| COMPOUND 2768 | $L_{1-8}$ | $L_{2-129}$ |
| COMPOUND 2769 | $L_{1-8}$ | $L_{2-130}$ |
| COMPOUND 2770 | $L_{1-8}$ | $L_{2-131}$ |
| COMPOUND 2771 | $L_{1-8}$ | $L_{2-132}$ |
| COMPOUND 2772 | $L_{1-8}$ | $L_{2-133}$ |

-continued

| | | |
|---|---|---|
| COMPOUND 2773 | $L_{1-8}$ | $L_{2-134}$ |
| COMPOUND 2774 | $L_{1-8}$ | $L_{2-135}$ |
| COMPOUND 2775 | $L_{1-8}$ | $L_{2-136}$ |
| COMPOUND 2776 | $L_{1-8}$ | $L_{2-137}$ |
| COMPOUND 2777 | $L_{1-8}$ | $L_{2-138}$ |
| COMPOUND 2778 | $L_{1-8}$ | $L_{2-139}$ |
| COMPOUND 2779 | $L_{1-8}$ | $L_{2-140}$ |
| COMPOUND 2780 | $L_{1-8}$ | $L_{2-141}$ |
| COMPOUND 2781 | $L_{1-8}$ | $L_{2-142}$ |
| COMPOUND 2782 | $L_{1-8}$ | $L_{2-143}$ |
| COMPOUND 2783 | $L_{1-8}$ | $L_{2-144}$ |
| COMPOUND 2784 | $L_{1-8}$ | $L_{2-145}$ |
| COMPOUND 2785 | $L_{1-8}$ | $L_{2-146}$ |
| COMPOUND 2786 | $L_{1-8}$ | $L_{2-147}$ |
| COMPOUND 2787 | $L_{1-8}$ | $L_{2-148}$ |
| COMPOUND 2788 | $L_{1-8}$ | $L_{2-149}$ |
| COMPOUND 2789 | $L_{1-8}$ | $L_{2-150}$ |
| COMPOUND 2790 | $L_{1-8}$ | $L_{2-151}$ |
| COMPOUND 2791 | $L_{1-8}$ | $L_{2-152}$ |
| COMPOUND 2792 | $L_{1-8}$ | $L_{2-153}$ |
| COMPOUND 2793 | $L_{1-8}$ | $L_{2-154}$ |
| COMPOUND 2794 | $L_{1-8}$ | $L_{2-155}$ |
| COMPOUND 2795 | $L_{1-8}$ | $L_{2-156}$ |
| COMPOUND 2796 | $L_{1-8}$ | $L_{2-157}$ |
| COMPOUND 2797 | $L_{1-8}$ | $L_{2-158}$ |
| COMPOUND 2798 | $L_{1-8}$ | $L_{2-159}$ |
| COMPOUND 2799 | $L_{1-8}$ | $L_{2-160}$ |
| COMPOUND 2800 | $L_{1-8}$ | $L_{2-161}$ |
| COMPOUND 2801 | $L_{1-8}$ | $L_{2-162}$ |
| COMPOUND 2802 | $L_{1-8}$ | $L_{2-163}$ |
| COMPOUND 2803 | $L_{1-8}$ | $L_{2-164}$ |
| COMPOUND 2804 | $L_{1-8}$ | $L_{2-165}$ |
| COMPOUND 2805 | $L_{1-8}$ | $L_{2-166}$ |
| COMPOUND 2806 | $L_{1-8}$ | $L_{2-167}$ |
| COMPOUND 2807 | $L_{1-8}$ | $L_{2-168}$ |
| COMPOUND 2808 | $L_{1-8}$ | $L_{2-169}$ |
| COMPOUND 2809 | $L_{1-8}$ | $L_{2-170}$ |
| COMPOUND 2810 | $L_{1-8}$ | $L_{2-171}$ |
| COMPOUND 2811 | $L_{1-8}$ | $L_{2-172}$ |
| COMPOUND 2812 | $L_{1-8}$ | $L_{2-173}$ |
| COMPOUND 2813 | $L_{1-8}$ | $L_{2-174}$ |
| COMPOUND 2814 | $L_{1-8}$ | $L_{2-175}$ |
| COMPOUND 2815 | $L_{1-8}$ | $L_{2-176}$ |
| COMPOUND 2816 | $L_{1-8}$ | $L_{2-177}$ |
| COMPOUND 2817 | $L_{1-8}$ | $L_{2-178}$ |
| COMPOUND 2818 | $L_{1-8}$ | $L_{2-179}$ |
| COMPOUND 2819 | $L_{1-8}$ | $L_{2-180}$ |
| COMPOUND 2820 | $L_{1-8}$ | $L_{2-181}$ |
| COMPOUND 2821 | $L_{1-8}$ | $L_{2-182}$ |
| COMPOUND 2822 | $L_{1-8}$ | $L_{2-183}$ |
| COMPOUND 2823 | $L_{1-8}$ | $L_{2-184}$ |
| COMPOUND 2824 | $L_{1-8}$ | $L_{2-185}$ |
| COMPOUND 2825 | $L_{1-8}$ | $L_{2-186}$ |
| COMPOUND 2826 | $L_{1-8}$ | $L_{2-187}$ |
| COMPOUND 2827 | $L_{1-8}$ | $L_{2-188}$ |
| COMPOUND 2828 | $L_{1-8}$ | $L_{2-189}$ |
| COMPOUND 2829 | $L_{1-8}$ | $L_{2-190}$ |
| COMPOUND 2830 | $L_{1-8}$ | $L_{2-191}$ |
| COMPOUND 2831 | $L_{1-8}$ | $L_{2-192}$ |
| COMPOUND 2832 | $L_{1-8}$ | $L_{2-193}$ |
| COMPOUND 2833 | $L_{1-8}$ | $L_{2-194}$ |
| COMPOUND 2834 | $L_{1-8}$ | $L_{2-195}$ |
| COMPOUND 2835 | $L_{1-8}$ | $L_{2-196}$ |
| COMPOUND 2836 | $L_{1-8}$ | $L_{2-197}$ |
| COMPOUND 2837 | $L_{1-8}$ | $L_{2-198}$ |
| COMPOUND 2838 | $L_{1-8}$ | $L_{2-199}$ |
| COMPOUND 2839 | $L_{1-8}$ | $L_{2-200}$ |
| COMPOUND 2840 | $L_{1-8}$ | $L_{2-201}$ |
| COMPOUND 2841 | $L_{1-8}$ | $L_{2-202}$ |
| COMPOUND 2842 | $L_{1-8}$ | $L_{2-203}$ |
| COMPOUND 2843 | $L_{1-8}$ | $L_{2-204}$ |
| COMPOUND 2844 | $L_{1-8}$ | $L_{2-205}$ |
| COMPOUND 2845 | $L_{1-8}$ | $L_{2-206}$ |
| COMPOUND 2846 | $L_{1-8}$ | $L_{2-207}$ |
| COMPOUND 2847 | $L_{1-8}$ | $L_{2-208}$ |
| COMPOUND 2848 | $L_{1-8}$ | $L_{2-209}$ |
| COMPOUND 2849 | $L_{1-8}$ | $L_{2-210}$ |
| COMPOUND 2850 | $L_{1-8}$ | $L_{2-211}$ |
| COMPOUND 2851 | $L_{1-8}$ | $L_{2-212}$ |

-continued

| | | |
|---|---|---|
| COMPOUND 2852 | $L_{1-8}$ | $L_{2-213}$ |
| COMPOUND 2853 | $L_{1-8}$ | $L_{2-214}$ |
| COMPOUND 2854 | $L_{1-8}$ | $L_{2-215}$ |
| COMPOUND 2855 | $L_{1-8}$ | $L_{2-216}$ |
| COMPOUND 2856 | $L_{1-8}$ | $L_{2-217}$ |
| COMPOUND 2857 | $L_{1-8}$ | $L_{2-218}$ |
| COMPOUND 2858 | $L_{1-8}$ | $L_{2-219}$ |
| COMPOUND 2859 | $L_{1-8}$ | $L_{2-220}$ |
| COMPOUND 2860 | $L_{1-8}$ | $L_{2-221}$ |
| COMPOUND 2861 | $L_{1-8}$ | $L_{2-222}$ |
| COMPOUND 2862 | $L_{1-8}$ | $L_{2-223}$ |
| COMPOUND 2863 | $L_{1-8}$ | $L_{2-224}$ |
| COMPOUND 2864 | $L_{1-8}$ | $L_{2-225}$ |
| COMPOUND 2865 | $L_{1-8}$ | $L_{2-226}$ |
| COMPOUND 2866 | $L_{1-8}$ | $L_{2-227}$ |
| COMPOUND 2867 | $L_{1-8}$ | $L_{2-228}$ |
| COMPOUND 2868 | $L_{1-8}$ | $L_{2-229}$ |
| COMPOUND 2869 | $L_{1-8}$ | $L_{2-230}$ |
| COMPOUND 2870 | $L_{1-8}$ | $L_{2-231}$ |
| COMPOUND 2871 | $L_{1-8}$ | $L_{2-232}$ |
| COMPOUND 2872 | $L_{1-8}$ | $L_{2-233}$ |
| COMPOUND 2873 | $L_{1-8}$ | $L_{2-234}$ |
| COMPOUND 2874 | $L_{1-8}$ | $L_{2-235}$ |
| COMPOUND 2875 | $L_{1-8}$ | $L_{2-236}$ |
| COMPOUND 2876 | $L_{1-8}$ | $L_{2-237}$ |
| COMPOUND 2877 | $L_{1-8}$ | $L_{2-238}$ |
| COMPOUND 2878 | $L_{1-8}$ | $L_{2-239}$ |
| COMPOUND 2879 | $L_{1-8}$ | $L_{2-240}$ |
| COMPOUND 2880 | $L_{1-8}$ | $L_{2-241}$ |
| COMPOUND 2881 | $L_{1-8}$ | $L_{2-242}$ |
| COMPOUND 2882 | $L_{1-8}$ | $L_{2-243}$ |
| COMPOUND 2883 | $L_{1-8}$ | $L_{2-244}$ |
| COMPOUND 2884 | $L_{1-8}$ | $L_{2-245}$ |
| COMPOUND 2885 | $L_{1-8}$ | $L_{2-246}$ |
| COMPOUND 2886 | $L_{1-8}$ | $L_{2-247}$ |
| COMPOUND 2887 | $L_{1-8}$ | $L_{2-248}$ |
| COMPOUND 2888 | $L_{1-8}$ | $L_{2-249}$ |
| COMPOUND 2889 | $L_{1-8}$ | $L_{2-250}$ |
| COMPOUND 2890 | $L_{1-8}$ | $L_{2-251}$ |
| COMPOUND 2891 | $L_{1-8}$ | $L_{2-252}$ |
| COMPOUND 2892 | $L_{1-8}$ | $L_{2-253}$ |
| COMPOUND 2893 | $L_{1-8}$ | $L_{2-254}$ |
| COMPOUND 2894 | $L_{1-8}$ | $L_{2-255}$ |
| COMPOUND 2895 | $L_{1-8}$ | $L_{2-256}$ |
| COMPOUND 2896 | $L_{1-8}$ | $L_{2-257}$ |
| COMPOUND 2897 | $L_{1-8}$ | $L_{2-258}$ |
| COMPOUND 2898 | $L_{1-8}$ | $L_{2-259}$ |
| COMPOUND 2899 | $L_{1-8}$ | $L_{2-260}$ |
| COMPOUND 2900 | $L_{1-8}$ | $L_{2-261}$ |
| COMPOUND 2901 | $L_{1-8}$ | $L_{2-262}$ |
| COMPOUND 2902 | $L_{1-8}$ | $L_{2-263}$ |
| COMPOUND 2903 | $L_{1-8}$ | $L_{2-264}$ |
| COMPOUND 2904 | $L_{1-8}$ | $L_{2-265}$ |
| COMPOUND 2905 | $L_{1-8}$ | $L_{2-266}$ |
| COMPOUND 2906 | $L_{1-8}$ | $L_{2-267}$ |
| COMPOUND 2907 | $L_{1-8}$ | $L_{2-268}$ |
| COMPOUND 2908 | $L_{1-8}$ | $L_{2-269}$ |
| COMPOUND 2909 | $L_{1-8}$ | $L_{2-270}$ |
| COMPOUND 2910 | $L_{1-8}$ | $L_{2-271}$ |
| COMPOUND 2911 | $L_{1-8}$ | $L_{2-272}$ |
| COMPOUND 2912 | $L_{1-8}$ | $L_{2-273}$ |
| COMPOUND 2913 | $L_{1-8}$ | $L_{2-274}$ |
| COMPOUND 2914 | $L_{1-8}$ | $L_{2-275}$ |
| COMPOUND 2915 | $L_{1-8}$ | $L_{2-276}$ |
| COMPOUND 2916 | $L_{1-8}$ | $L_{2-277}$ |
| COMPOUND 2917 | $L_{1-8}$ | $L_{2-278}$ |
| COMPOUND 2918 | $L_{1-8}$ | $L_{2-279}$ |
| COMPOUND 2919 | $L_{1-8}$ | $L_{2-280}$ |
| COMPOUND 2920 | $L_{1-8}$ | $L_{2-281}$ |
| COMPOUND 2921 | $L_{1-8}$ | $L_{2-282}$ |
| COMPOUND 2922 | $L_{1-8}$ | $L_{2-283}$ |
| COMPOUND 2923 | $L_{1-8}$ | $L_{2-284}$ |
| COMPOUND 2924 | $L_{1-8}$ | $L_{2-285}$ |
| COMPOUND 2925 | $L_{1-8}$ | $L_{2-286}$ |
| COMPOUND 2926 | $L_{1-8}$ | $L_{2-287}$ |
| COMPOUND 2927 | $L_{1-8}$ | $L_{2-288}$ |
| COMPOUND 2928 | $L_{1-8}$ | $L_{2-289}$ |
| COMPOUND 2929 | $L_{1-8}$ | $L_{2-290}$ |
| COMPOUND 2930 | $L_{1-8}$ | $L_{2-291}$ |
| COMPOUND 2931 | $L_{1-8}$ | $L_{2-292}$ |
| COMPOUND 2932 | $L_{1-8}$ | $L_{2-293}$ |
| COMPOUND 2933 | $L_{1-8}$ | $L_{2-294}$ |
| COMPOUND 2934 | $L_{1-8}$ | $L_{2-295}$ |
| COMPOUND 2935 | $L_{1-8}$ | $L_{2-296}$ |
| COMPOUND 2936 | $L_{1-8}$ | $L_{2-297}$ |
| COMPOUND 2937 | $L_{1-8}$ | $L_{2-298}$ |
| COMPOUND 2938 | $L_{1-8}$ | $L_{2-299}$ |
| COMPOUND 2939 | $L_{1-8}$ | $L_{2-300}$ |
| COMPOUND 2940 | $L_{1-8}$ | $L_{2-301}$ |
| COMPOUND 2941 | $L_{1-8}$ | $L_{2-302}$ |
| COMPOUND 2942 | $L_{1-8}$ | $L_{2-303}$ |
| COMPOUND 2943 | $L_{1-8}$ | $L_{2-304}$ |
| COMPOUND 2944 | $L_{1-8}$ | $L_{2-305}$ |
| COMPOUND 2945 | $L_{1-8}$ | $L_{2-306}$ |
| COMPOUND 2946 | $L_{1-8}$ | $L_{2-307}$ |
| COMPOUND 2947 | $L_{1-8}$ | $L_{2-308}$ |
| COMPOUND 2948 | $L_{1-8}$ | $L_{2-309}$ |
| COMPOUND 2949 | $L_{1-8}$ | $L_{2-310}$ |
| COMPOUND 2950 | $L_{1-8}$ | $L_{2-311}$ |
| COMPOUND 2951 | $L_{1-8}$ | $L_{2-312}$ |
| COMPOUND 2952 | $L_{1-8}$ | $L_{2-313}$ |
| COMPOUND 2953 | $L_{1-8}$ | $L_{2-314}$ |
| COMPOUND 2954 | $L_{1-8}$ | $L_{2-315}$ |
| COMPOUND 2955 | $L_{1-8}$ | $L_{2-316}$ |
| COMPOUND 2956 | $L_{1-8}$ | $L_{2-317}$ |
| COMPOUND 2957 | $L_{1-8}$ | $L_{2-318}$ |
| COMPOUND 2958 | $L_{1-8}$ | $L_{2-319}$ |
| COMPOUND 2959 | $L_{1-8}$ | $L_{2-320}$ |
| COMPOUND 2960 | $L_{1-8}$ | $L_{2-321}$ |
| COMPOUND 2961 | $L_{1-8}$ | $L_{2-322}$ |
| COMPOUND 2962 | $L_{1-8}$ | $L_{2-323}$ |
| COMPOUND 2963 | $L_{1-8}$ | $L_{2-324}$ |
| COMPOUND 2964 | $L_{1-8}$ | $L_{2-325}$ |
| COMPOUND 2965 | $L_{1-8}$ | $L_{2-326}$ |
| COMPOUND 2966 | $L_{1-8}$ | $L_{2-327}$ |
| COMPOUND 2967 | $L_{1-8}$ | $L_{2-328}$ |
| COMPOUND 2968 | $L_{1-8}$ | $L_{2-329}$ |
| COMPOUND 2969 | $L_{1-8}$ | $L_{2-330}$ |
| COMPOUND 2970 | $L_{1-8}$ | $L_{2-331}$ |
| COMPOUND 2971 | $L_{1-8}$ | $L_{2-332}$ |
| COMPOUND 2972 | $L_{1-8}$ | $L_{2-333}$ |
| COMPOUND 2973 | $L_{1-8}$ | $L_{2-334}$ |
| COMPOUND 2974 | $L_{1-8}$ | $L_{2-335}$ |
| COMPOUND 2975 | $L_{1-8}$ | $L_{2-336}$ |
| COMPOUND 2976 | $L_{1-8}$ | $L_{2-337}$ |
| COMPOUND 2977 | $L_{1-8}$ | $L_{2-338}$ |
| COMPOUND 2978 | $L_{1-8}$ | $L_{2-339}$ |
| COMPOUND 2979 | $L_{1-8}$ | $L_{2-340}$ |
| COMPOUND 2980 | $L_{1-8}$ | $L_{2-341}$ |
| COMPOUND 2981 | $L_{1-8}$ | $L_{2-342}$ |
| COMPOUND 2982 | $L_{1-8}$ | $L_{2-343}$ |
| COMPOUND 2983 | $L_{1-8}$ | $L_{2-344}$ |
| COMPOUND 2984 | $L_{1-8}$ | $L_{2-345}$ |
| COMPOUND 2985 | $L_{1-8}$ | $L_{2-346}$ |
| COMPOUND 2986 | $L_{1-8}$ | $L_{2-347}$ |
| COMPOUND 2987 | $L_{1-8}$ | $L_{2-348}$ |
| COMPOUND 2988 | $L_{1-8}$ | $L_{2-349}$ |
| COMPOUND 2989 | $L_{1-8}$ | $L_{2-350}$ |
| COMPOUND 2990 | $L_{1-8}$ | $L_{2-351}$ |
| COMPOUND 2991 | $L_{1-8}$ | $L_{2-352}$ |
| COMPOUND 2992 | $L_{1-8}$ | $L_{2-353}$ |
| COMPOUND 2993 | $L_{1-8}$ | $L_{2-354}$ |
| COMPOUND 2994 | $L_{1-8}$ | $L_{2-355}$ |
| COMPOUND 2995 | $L_{1-8}$ | $L_{2-356}$ |
| COMPOUND 2996 | $L_{1-8}$ | $L_{2-357}$ |
| COMPOUND 2997 | $L_{1-8}$ | $L_{2-358}$ |
| COMPOUND 2998 | $L_{1-8}$ | $L_{2-359}$ |
| COMPOUND 2999 | $L_{1-8}$ | $L_{2-360}$ |
| COMPOUND 3000 | $L_{1-8}$ | $L_{2-361}$ |
| COMPOUND 3001 | $L_{1-8}$ | $L_{2-362}$ |
| COMPOUND 3002 | $L_{1-8}$ | $L_{2-363}$ |
| COMPOUND 3003 | $L_{1-8}$ | $L_{2-364}$ |
| COMPOUND 3004 | $L_{1-8}$ | $L_{2-365}$ |
| COMPOUND 3005 | $L_{1-8}$ | $L_{2-366}$ |
| COMPOUND 3006 | $L_{1-8}$ | $L_{2-367}$ |
| COMPOUND 3007 | $L_{1-8}$ | $L_{2-368}$ |
| COMPOUND 3008 | $L_{1-8}$ | $L_{2-369}$ |
| COMPOUND 3009 | $L_{1-8}$ | $L_{2-370}$ |

-continued

| | | |
|---|---|---|
| COMPOUND 3010 | $L_{1-8}$ | $L_{2-371}$ |
| COMPOUND 3011 | $L_{1-8}$ | $L_{2-372}$ |
| COMPOUND 3012 | $L_{1-8}$ | $L_{2-373}$ |
| COMPOUND 3013 | $L_{1-8}$ | $L_{2-374}$ |
| COMPOUND 3014 | $L_{1-8}$ | $L_{2-375}$ |
| COMPOUND 3015 | $L_{1-8}$ | $L_{2-376}$ |
| COMPOUND 3016 | $L_{1-8}$ | $L_{2-377}$ |
| COMPOUND 3017 | $L_{1-9}$ | $L_{2-1}$ |
| COMPOUND 3018 | $L_{1-9}$ | $L_{2-2}$ |
| COMPOUND 3019 | $L_{1-9}$ | $L_{2-3}$ |
| COMPOUND 3020 | $L_{1-9}$ | $L_{2-4}$ |
| COMPOUND 3021 | $L_{1-9}$ | $L_{2-5}$ |
| COMPOUND 3022 | $L_{1-9}$ | $L_{2-6}$ |
| COMPOUND 3023 | $L_{1-9}$ | $L_{2-7}$ |
| COMPOUND 3024 | $L_{1-9}$ | $L_{2-8}$ |
| COMPOUND 3025 | $L_{1-9}$ | $L_{2-9}$ |
| COMPOUND 3026 | $L_{1-9}$ | $L_{2-10}$ |
| COMPOUND 3027 | $L_{1-9}$ | $L_{2-11}$ |
| COMPOUND 3028 | $L_{1-9}$ | $L_{2-12}$ |
| COMPOUND 3029 | $L_{1-9}$ | $L_{2-13}$ |
| COMPOUND 3030 | $L_{1-9}$ | $L_{2-14}$ |
| COMPOUND 3031 | $L_{1-9}$ | $L_{2-15}$ |
| COMPOUND 3032 | $L_{1-9}$ | $L_{2-16}$ |
| COMPOUND 3033 | $L_{1-9}$ | $L_{2-17}$ |
| COMPOUND 3034 | $L_{1-9}$ | $L_{2-18}$ |
| COMPOUND 3035 | $L_{1-9}$ | $L_{2-19}$ |
| COMPOUND 3036 | $L_{1-9}$ | $L_{2-20}$ |
| COMPOUND 3037 | $L_{1-9}$ | $L_{2-21}$ |
| COMPOUND 3038 | $L_{1-9}$ | $L_{2-22}$ |
| COMPOUND 3039 | $L_{1-9}$ | $L_{2-23}$ |
| COMPOUND 3040 | $L_{1-9}$ | $L_{2-24}$ |
| COMPOUND 3041 | $L_{1-9}$ | $L_{2-25}$ |
| COMPOUND 3042 | $L_{1-9}$ | $L_{2-26}$ |
| COMPOUND 3043 | $L_{1-9}$ | $L_{2-27}$ |
| COMPOUND 3044 | $L_{1-9}$ | $L_{2-28}$ |
| COMPOUND 3045 | $L_{1-9}$ | $L_{2-29}$ |
| COMPOUND 3046 | $L_{1-9}$ | $L_{2-30}$ |
| COMPOUND 3047 | $L_{1-9}$ | $L_{2-31}$ |
| COMPOUND 3048 | $L_{1-9}$ | $L_{2-32}$ |
| COMPOUND 3049 | $L_{1-9}$ | $L_{2-33}$ |
| COMPOUND 3050 | $L_{1-9}$ | $L_{2-34}$ |
| COMPOUND 3051 | $L_{1-9}$ | $L_{2-35}$ |
| COMPOUND 3052 | $L_{1-9}$ | $L_{2-36}$ |
| COMPOUND 3053 | $L_{1-9}$ | $L_{2-37}$ |
| COMPOUND 3054 | $L_{1-9}$ | $L_{2-38}$ |
| COMPOUND 3055 | $L_{1-9}$ | $L_{2-39}$ |
| COMPOUND 3056 | $L_{1-9}$ | $L_{2-40}$ |
| COMPOUND 3057 | $L_{1-9}$ | $L_{2-41}$ |
| COMPOUND 3058 | $L_{1-9}$ | $L_{2-42}$ |
| COMPOUND 3059 | $L_{1-9}$ | $L_{2-43}$ |
| COMPOUND 3060 | $L_{1-9}$ | $L_{2-44}$ |
| COMPOUND 3061 | $L_{1-9}$ | $L_{2-45}$ |
| COMPOUND 3062 | $L_{1-9}$ | $L_{2-46}$ |
| COMPOUND 3063 | $L_{1-9}$ | $L_{2-47}$ |
| COMPOUND 3064 | $L_{1-9}$ | $L_{2-48}$ |
| COMPOUND 3065 | $L_{1-9}$ | $L_{2-49}$ |
| COMPOUND 3066 | $L_{1-9}$ | $L_{2-50}$ |
| COMPOUND 3067 | $L_{1-9}$ | $L_{2-51}$ |
| COMPOUND 3068 | $L_{1-9}$ | $L_{2-52}$ |
| COMPOUND 3069 | $L_{1-9}$ | $L_{2-53}$ |
| COMPOUND 3070 | $L_{1-9}$ | $L_{2-54}$ |
| COMPOUND 3071 | $L_{1-9}$ | $L_{2-55}$ |
| COMPOUND 3072 | $L_{1-9}$ | $L_{2-56}$ |
| COMPOUND 3073 | $L_{1-9}$ | $L_{2-57}$ |
| COMPOUND 3074 | $L_{1-9}$ | $L_{2-58}$ |
| COMPOUND 3075 | $L_{1-9}$ | $L_{2-59}$ |
| COMPOUND 3076 | $L_{1-9}$ | $L_{2-60}$ |
| COMPOUND 3077 | $L_{1-9}$ | $L_{2-61}$ |
| COMPOUND 3078 | $L_{1-9}$ | $L_{2-62}$ |
| COMPOUND 3079 | $L_{1-9}$ | $L_{2-63}$ |
| COMPOUND 3080 | $L_{1-9}$ | $L_{2-64}$ |
| COMPOUND 3081 | $L_{1-9}$ | $L_{2-65}$ |
| COMPOUND 3082 | $L_{1-9}$ | $L_{2-66}$ |
| COMPOUND 3083 | $L_{1-9}$ | $L_{2-67}$ |
| COMPOUND 3084 | $L_{1-9}$ | $L_{2-68}$ |
| COMPOUND 3085 | $L_{1-9}$ | $L_{2-69}$ |
| COMPOUND 3086 | $L_{1-9}$ | $L_{2-70}$ |
| COMPOUND 3087 | $L_{1-9}$ | $L_{2-71}$ |
| COMPOUND 3088 | $L_{1-9}$ | $L_{2-72}$ |

-continued

| | | |
|---|---|---|
| COMPOUND 3089 | $L_{1-9}$ | $L_{2-73}$ |
| COMPOUND 3090 | $L_{1-9}$ | $L_{2-74}$ |
| COMPOUND 3091 | $L_{1-9}$ | $L_{2-75}$ |
| COMPOUND 3092 | $L_{1-9}$ | $L_{2-76}$ |
| COMPOUND 3093 | $L_{1-9}$ | $L_{2-77}$ |
| COMPOUND 3094 | $L_{1-9}$ | $L_{2-78}$ |
| COMPOUND 3095 | $L_{1-9}$ | $L_{2-79}$ |
| COMPOUND 3096 | $L_{1-9}$ | $L_{2-80}$ |
| COMPOUND 3097 | $L_{1-9}$ | $L_{2-81}$ |
| COMPOUND 3098 | $L_{1-9}$ | $L_{2-82}$ |
| COMPOUND 3099 | $L_{1-9}$ | $L_{2-83}$ |
| COMPOUND 3100 | $L_{1-9}$ | $L_{2-84}$ |
| COMPOUND 3101 | $L_{1-9}$ | $L_{2-85}$ |
| COMPOUND 3102 | $L_{1-9}$ | $L_{2-86}$ |
| COMPOUND 3103 | $L_{1-9}$ | $L_{2-87}$ |
| COMPOUND 3104 | $L_{1-9}$ | $L_{2-88}$ |
| COMPOUND 3105 | $L_{1-9}$ | $L_{2-89}$ |
| COMPOUND 3106 | $L_{1-9}$ | $L_{2-90}$ |
| COMPOUND 3107 | $L_{1-9}$ | $L_{2-91}$ |
| COMPOUND 3108 | $L_{1-9}$ | $L_{2-92}$ |
| COMPOUND 3109 | $L_{1-9}$ | $L_{2-93}$ |
| COMPOUND 3110 | $L_{1-9}$ | $L_{2-94}$ |
| COMPOUND 3111 | $L_{1-9}$ | $L_{2-95}$ |
| COMPOUND 3112 | $L_{1-9}$ | $L_{2-96}$ |
| COMPOUND 3113 | $L_{1-9}$ | $L_{2-97}$ |
| COMPOUND 3114 | $L_{1-9}$ | $L_{2-98}$ |
| COMPOUND 3115 | $L_{1-9}$ | $L_{2-99}$ |
| COMPOUND 3116 | $L_{1-9}$ | $L_{2-100}$ |
| COMPOUND 3117 | $L_{1-9}$ | $L_{2-101}$ |
| COMPOUND 3118 | $L_{1-9}$ | $L_{2-102}$ |
| COMPOUND 3119 | $L_{1-9}$ | $L_{2-103}$ |
| COMPOUND 3120 | $L_{1-9}$ | $L_{2-104}$ |
| COMPOUND 3121 | $L_{1-9}$ | $L_{2-105}$ |
| COMPOUND 3122 | $L_{1-9}$ | $L_{2-106}$ |
| COMPOUND 3123 | $L_{1-9}$ | $L_{2-107}$ |
| COMPOUND 3124 | $L_{1-9}$ | $L_{2-108}$ |
| COMPOUND 3125 | $L_{1-9}$ | $L_{2-109}$ |
| COMPOUND 3126 | $L_{1-9}$ | $L_{2-110}$ |
| COMPOUND 3127 | $L_{1-9}$ | $L_{2-111}$ |
| COMPOUND 3128 | $L_{1-9}$ | $L_{2-112}$ |
| COMPOUND 3129 | $L_{1-9}$ | $L_{2-113}$ |
| COMPOUND 3130 | $L_{1-9}$ | $L_{2-114}$ |
| COMPOUND 3131 | $L_{1-9}$ | $L_{2-115}$ |
| COMPOUND 3132 | $L_{1-9}$ | $L_{2-116}$ |
| COMPOUND 3133 | $L_{1-9}$ | $L_{2-117}$ |
| COMPOUND 3134 | $L_{1-9}$ | $L_{2-118}$ |
| COMPOUND 3135 | $L_{1-9}$ | $L_{2-119}$ |
| COMPOUND 3136 | $L_{1-9}$ | $L_{2-120}$ |
| COMPOUND 3137 | $L_{1-9}$ | $L_{2-121}$ |
| COMPOUND 3138 | $L_{1-9}$ | $L_{2-122}$ |
| COMPOUND 3139 | $L_{1-9}$ | $L_{2-123}$ |
| COMPOUND 3140 | $L_{1-9}$ | $L_{2-124}$ |
| COMPOUND 3141 | $L_{1-9}$ | $L_{2-125}$ |
| COMPOUND 3142 | $L_{1-9}$ | $L_{2-126}$ |
| COMPOUND 3143 | $L_{1-9}$ | $L_{2-127}$ |
| COMPOUND 3144 | $L_{1-9}$ | $L_{2-128}$ |
| COMPOUND 3145 | $L_{1-9}$ | $L_{2-129}$ |
| COMPOUND 3146 | $L_{1-9}$ | $L_{2-130}$ |
| COMPOUND 3147 | $L_{1-9}$ | $L_{2-131}$ |
| COMPOUND 3148 | $L_{1-9}$ | $L_{2-132}$ |
| COMPOUND 3149 | $L_{1-9}$ | $L_{2-133}$ |
| COMPOUND 3150 | $L_{1-9}$ | $L_{2-134}$ |
| COMPOUND 3151 | $L_{1-9}$ | $L_{2-135}$ |
| COMPOUND 3152 | $L_{1-9}$ | $L_{2-136}$ |
| COMPOUND 3153 | $L_{1-9}$ | $L_{2-137}$ |
| COMPOUND 3154 | $L_{1-9}$ | $L_{2-138}$ |
| COMPOUND 3155 | $L_{1-9}$ | $L_{2-139}$ |
| COMPOUND 3156 | $L_{1-9}$ | $L_{2-140}$ |
| COMPOUND 3157 | $L_{1-9}$ | $L_{2-141}$ |
| COMPOUND 3158 | $L_{1-9}$ | $L_{2-142}$ |
| COMPOUND 3159 | $L_{1-9}$ | $L_{2-143}$ |
| COMPOUND 3160 | $L_{1-9}$ | $L_{2-144}$ |
| COMPOUND 3161 | $L_{1-9}$ | $L_{2-145}$ |
| COMPOUND 3162 | $L_{1-9}$ | $L_{2-146}$ |
| COMPOUND 3163 | $L_{1-9}$ | $L_{2-147}$ |
| COMPOUND 3164 | $L_{1-9}$ | $L_{2-148}$ |
| COMPOUND 3165 | $L_{1-9}$ | $L_{2-149}$ |
| COMPOUND 3166 | $L_{1-9}$ | $L_{2-150}$ |
| COMPOUND 3167 | $L_{1-9}$ | $L_{2-151}$ |

-continued

| | | |
|---|---|---|
| COMPOUND 3168 | $L_{1-9}$ | $L_{2-152}$ |
| COMPOUND 3169 | $L_{1-9}$ | $L_{2-153}$ |
| COMPOUND 3170 | $L_{1-9}$ | $L_{2-154}$ |
| COMPOUND 3171 | $L_{1-9}$ | $L_{2-155}$ |
| COMPOUND 3172 | $L_{1-9}$ | $L_{2-156}$ |
| COMPOUND 3173 | $L_{1-9}$ | $L_{2-157}$ |
| COMPOUND 3174 | $L_{1-9}$ | $L_{2-158}$ |
| COMPOUND 3175 | $L_{1-9}$ | $L_{2-159}$ |
| COMPOUND 3176 | $L_{1-9}$ | $L_{2-160}$ |
| COMPOUND 3177 | $L_{1-9}$ | $L_{2-161}$ |
| COMPOUND 3178 | $L_{1-9}$ | $L_{2-162}$ |
| COMPOUND 3179 | $L_{1-9}$ | $L_{2-163}$ |
| COMPOUND 3180 | $L_{1-9}$ | $L_{2-164}$ |
| COMPOUND 3181 | $L_{1-9}$ | $L_{2-165}$ |
| COMPOUND 3182 | $L_{1-9}$ | $L_{2-166}$ |
| COMPOUND 3183 | $L_{1-9}$ | $L_{2-167}$ |
| COMPOUND 3184 | $L_{1-9}$ | $L_{2-168}$ |
| COMPOUND 3185 | $L_{1-9}$ | $L_{2-169}$ |
| COMPOUND 3186 | $L_{1-9}$ | $L_{2-170}$ |
| COMPOUND 3187 | $L_{1-9}$ | $L_{2-171}$ |
| COMPOUND 3188 | $L_{1-9}$ | $L_{2-172}$ |
| COMPOUND 3189 | $L_{1-9}$ | $L_{2-173}$ |
| COMPOUND 3190 | $L_{1-9}$ | $L_{2-174}$ |
| COMPOUND 3191 | $L_{1-9}$ | $L_{2-175}$ |
| COMPOUND 3192 | $L_{1-9}$ | $L_{2-176}$ |
| COMPOUND 3193 | $L_{1-9}$ | $L_{2-177}$ |
| COMPOUND 3194 | $L_{1-9}$ | $L_{2-178}$ |
| COMPOUND 3195 | $L_{1-9}$ | $L_{2-179}$ |
| COMPOUND 3196 | $L_{1-9}$ | $L_{2-180}$ |
| COMPOUND 3197 | $L_{1-9}$ | $L_{2-181}$ |
| COMPOUND 3198 | $L_{1-9}$ | $L_{2-182}$ |
| COMPOUND 3199 | $L_{1-9}$ | $L_{2-183}$ |
| COMPOUND 3200 | $L_{1-9}$ | $L_{2-184}$ |
| COMPOUND 3201 | $L_{1-9}$ | $L_{2-185}$ |
| COMPOUND 3202 | $L_{1-9}$ | $L_{2-186}$ |
| COMPOUND 3203 | $L_{1-9}$ | $L_{2-187}$ |
| COMPOUND 3204 | $L_{1-9}$ | $L_{2-188}$ |
| COMPOUND 3205 | $L_{1-9}$ | $L_{2-189}$ |
| COMPOUND 3206 | $L_{1-9}$ | $L_{2-190}$ |
| COMPOUND 3207 | $L_{1-9}$ | $L_{2-191}$ |
| COMPOUND 3208 | $L_{1-9}$ | $L_{2-192}$ |
| COMPOUND 3209 | $L_{1-9}$ | $L_{2-193}$ |
| COMPOUND 3210 | $L_{1-9}$ | $L_{2-194}$ |
| COMPOUND 3211 | $L_{1-9}$ | $L_{2-195}$ |
| COMPOUND 3212 | $L_{1-9}$ | $L_{2-196}$ |
| COMPOUND 3213 | $L_{1-9}$ | $L_{2-197}$ |
| COMPOUND 3214 | $L_{1-9}$ | $L_{2-198}$ |
| COMPOUND 3215 | $L_{1-9}$ | $L_{2-199}$ |
| COMPOUND 3216 | $L_{1-9}$ | $L_{2-200}$ |
| COMPOUND 3217 | $L_{1-9}$ | $L_{2-201}$ |
| COMPOUND 3218 | $L_{1-9}$ | $L_{2-202}$ |
| COMPOUND 3219 | $L_{1-9}$ | $L_{2-203}$ |
| COMPOUND 3220 | $L_{1-9}$ | $L_{2-204}$ |
| COMPOUND 3221 | $L_{1-9}$ | $L_{2-205}$ |
| COMPOUND 3222 | $L_{1-9}$ | $L_{2-206}$ |
| COMPOUND 3223 | $L_{1-9}$ | $L_{2-207}$ |
| COMPOUND 3224 | $L_{1-9}$ | $L_{2-208}$ |
| COMPOUND 3225 | $L_{1-9}$ | $L_{2-209}$ |
| COMPOUND 3226 | $L_{1-9}$ | $L_{2-210}$ |
| COMPOUND 3227 | $L_{1-9}$ | $L_{2-211}$ |
| COMPOUND 3228 | $L_{1-9}$ | $L_{2-212}$ |
| COMPOUND 3229 | $L_{1-9}$ | $L_{2-213}$ |
| COMPOUND 3230 | $L_{1-9}$ | $L_{2-214}$ |
| COMPOUND 3231 | $L_{1-9}$ | $L_{2-215}$ |
| COMPOUND 3232 | $L_{1-9}$ | $L_{2-216}$ |
| COMPOUND 3233 | $L_{1-9}$ | $L_{2-217}$ |
| COMPOUND 3234 | $L_{1-9}$ | $L_{2-218}$ |
| COMPOUND 3235 | $L_{1-9}$ | $L_{2-219}$ |
| COMPOUND 3236 | $L_{1-9}$ | $L_{2-220}$ |
| COMPOUND 3237 | $L_{1-9}$ | $L_{2-221}$ |
| COMPOUND 3238 | $L_{1-9}$ | $L_{2-222}$ |
| COMPOUND 3239 | $L_{1-9}$ | $L_{2-223}$ |
| COMPOUND 3240 | $L_{1-9}$ | $L_{2-224}$ |
| COMPOUND 3241 | $L_{1-9}$ | $L_{2-225}$ |
| COMPOUND 3242 | $L_{1-9}$ | $L_{2-226}$ |
| COMPOUND 3243 | $L_{1-9}$ | $L_{2-227}$ |
| COMPOUND 3244 | $L_{1-9}$ | $L_{2-228}$ |
| COMPOUND 3245 | $L_{1-9}$ | $L_{2-229}$ |
| COMPOUND 3246 | $L_{1-9}$ | $L_{2-230}$ |
| COMPOUND 3247 | $L_{1-9}$ | $L_{2-231}$ |
| COMPOUND 3248 | $L_{1-9}$ | $L_{2-232}$ |
| COMPOUND 3249 | $L_{1-9}$ | $L_{2-233}$ |
| COMPOUND 3250 | $L_{1-9}$ | $L_{2-234}$ |
| COMPOUND 3251 | $L_{1-9}$ | $L_{2-235}$ |
| COMPOUND 3252 | $L_{1-9}$ | $L_{2-236}$ |
| COMPOUND 3253 | $L_{1-9}$ | $L_{2-237}$ |
| COMPOUND 3254 | $L_{1-9}$ | $L_{2-238}$ |
| COMPOUND 3255 | $L_{1-9}$ | $L_{2-239}$ |
| COMPOUND 3256 | $L_{1-9}$ | $L_{2-240}$ |
| COMPOUND 3257 | $L_{1-9}$ | $L_{2-241}$ |
| COMPOUND 3258 | $L_{1-9}$ | $L_{2-242}$ |
| COMPOUND 3259 | $L_{1-9}$ | $L_{2-243}$ |
| COMPOUND 3260 | $L_{1-9}$ | $L_{2-244}$ |
| COMPOUND 3261 | $L_{1-9}$ | $L_{2-245}$ |
| COMPOUND 3262 | $L_{1-9}$ | $L_{2-246}$ |
| COMPOUND 3263 | $L_{1-9}$ | $L_{2-247}$ |
| COMPOUND 3264 | $L_{1-9}$ | $L_{2-248}$ |
| COMPOUND 3265 | $L_{1-9}$ | $L_{2-249}$ |
| COMPOUND 3266 | $L_{1-9}$ | $L_{2-250}$ |
| COMPOUND 3267 | $L_{1-9}$ | $L_{2-251}$ |
| COMPOUND 3268 | $L_{1-9}$ | $L_{2-252}$ |
| COMPOUND 3269 | $L_{1-9}$ | $L_{2-253}$ |
| COMPOUND 3270 | $L_{1-9}$ | $L_{2-254}$ |
| COMPOUND 3271 | $L_{1-9}$ | $L_{2-255}$ |
| COMPOUND 3272 | $L_{1-9}$ | $L_{2-256}$ |
| COMPOUND 3273 | $L_{1-9}$ | $L_{2-257}$ |
| COMPOUND 3274 | $L_{1-9}$ | $L_{2-258}$ |
| COMPOUND 3275 | $L_{1-9}$ | $L_{2-259}$ |
| COMPOUND 3276 | $L_{1-9}$ | $L_{2-260}$ |
| COMPOUND 3277 | $L_{1-9}$ | $L_{2-261}$ |
| COMPOUND 3278 | $L_{1-9}$ | $L_{2-262}$ |
| COMPOUND 3279 | $L_{1-9}$ | $L_{2-263}$ |
| COMPOUND 3280 | $L_{1-9}$ | $L_{2-264}$ |
| COMPOUND 3281 | $L_{1-9}$ | $L_{2-265}$ |
| COMPOUND 3282 | $L_{1-9}$ | $L_{2-266}$ |
| COMPOUND 3283 | $L_{1-9}$ | $L_{2-267}$ |
| COMPOUND 3284 | $L_{1-9}$ | $L_{2-268}$ |
| COMPOUND 3285 | $L_{1-9}$ | $L_{2-269}$ |
| COMPOUND 3286 | $L_{1-9}$ | $L_{2-270}$ |
| COMPOUND 3287 | $L_{1-9}$ | $L_{2-271}$ |
| COMPOUND 3288 | $L_{1-9}$ | $L_{2-272}$ |
| COMPOUND 3289 | $L_{1-9}$ | $L_{2-273}$ |
| COMPOUND 3290 | $L_{1-9}$ | $L_{2-274}$ |
| COMPOUND 3291 | $L_{1-9}$ | $L_{2-275}$ |
| COMPOUND 3292 | $L_{1-9}$ | $L_{2-276}$ |
| COMPOUND 3293 | $L_{1-9}$ | $L_{2-277}$ |
| COMPOUND 3294 | $L_{1-9}$ | $L_{2-278}$ |
| COMPOUND 3295 | $L_{1-9}$ | $L_{2-279}$ |
| COMPOUND 3296 | $L_{1-9}$ | $L_{2-280}$ |
| COMPOUND 3297 | $L_{1-9}$ | $L_{2-281}$ |
| COMPOUND 3298 | $L_{1-9}$ | $L_{2-282}$ |
| COMPOUND 3299 | $L_{1-9}$ | $L_{2-283}$ |
| COMPOUND 3300 | $L_{1-9}$ | $L_{2-284}$ |
| COMPOUND 3301 | $L_{1-9}$ | $L_{2-285}$ |
| COMPOUND 3302 | $L_{1-9}$ | $L_{2-286}$ |
| COMPOUND 3303 | $L_{1-9}$ | $L_{2-287}$ |
| COMPOUND 3304 | $L_{1-9}$ | $L_{2-288}$ |
| COMPOUND 3305 | $L_{1-9}$ | $L_{2-289}$ |
| COMPOUND 3306 | $L_{1-9}$ | $L_{2-290}$ |
| COMPOUND 3307 | $L_{1-9}$ | $L_{2-291}$ |
| COMPOUND 3308 | $L_{1-9}$ | $L_{2-292}$ |
| COMPOUND 3309 | $L_{1-9}$ | $L_{2-293}$ |
| COMPOUND 3310 | $L_{1-9}$ | $L_{2-294}$ |
| COMPOUND 3311 | $L_{1-9}$ | $L_{2-295}$ |
| COMPOUND 3312 | $L_{1-9}$ | $L_{2-296}$ |
| COMPOUND 3313 | $L_{1-9}$ | $L_{2-297}$ |
| COMPOUND 3314 | $L_{1-9}$ | $L_{2-298}$ |
| COMPOUND 3315 | $L_{1-9}$ | $L_{2-299}$ |
| COMPOUND 3316 | $L_{1-9}$ | $L_{2-300}$ |
| COMPOUND 3317 | $L_{1-9}$ | $L_{2-301}$ |
| COMPOUND 3318 | $L_{1-9}$ | $L_{2-302}$ |
| COMPOUND 3319 | $L_{1-9}$ | $L_{2-303}$ |
| COMPOUND 3320 | $L_{1-9}$ | $L_{2-304}$ |
| COMPOUND 3321 | $L_{1-9}$ | $L_{2-305}$ |
| COMPOUND 3322 | $L_{1-9}$ | $L_{2-306}$ |
| COMPOUND 3323 | $L_{1-9}$ | $L_{2-307}$ |
| COMPOUND 3324 | $L_{1-9}$ | $L_{2-308}$ |
| COMPOUND 3325 | $L_{1-9}$ | $L_{2-309}$ |

-continued

| | | |
|---|---|---|
| COMPOUND 3326 | $L_{1-9}$ | $L_{2-310}$ |
| COMPOUND 3327 | $L_{1-9}$ | $L_{2-311}$ |
| COMPOUND 3328 | $L_{1-9}$ | $L_{2-312}$ |
| COMPOUND 3329 | $L_{1-9}$ | $L_{2-313}$ |
| COMPOUND 3330 | $L_{1-9}$ | $L_{2-314}$ |
| COMPOUND 3331 | $L_{1-9}$ | $L_{2-315}$ |
| COMPOUND 3332 | $L_{1-9}$ | $L_{2-316}$ |
| COMPOUND 3333 | $L_{1-9}$ | $L_{2-317}$ |
| COMPOUND 3334 | $L_{1-9}$ | $L_{2-318}$ |
| COMPOUND 3335 | $L_{1-9}$ | $L_{2-319}$ |
| COMPOUND 3336 | $L_{1-9}$ | $L_{2-320}$ |
| COMPOUND 3337 | $L_{1-9}$ | $L_{2-321}$ |
| COMPOUND 3338 | $L_{1-9}$ | $L_{2-322}$ |
| COMPOUND 3339 | $L_{1-9}$ | $L_{2-323}$ |
| COMPOUND 3340 | $L_{1-9}$ | $L_{2-324}$ |
| COMPOUND 3341 | $L_{1-9}$ | $L_{2-325}$ |
| COMPOUND 3342 | $L_{1-9}$ | $L_{2-326}$ |
| COMPOUND 3343 | $L_{1-9}$ | $L_{2-327}$ |
| COMPOUND 3344 | $L_{1-9}$ | $L_{2-328}$ |
| COMPOUND 3345 | $L_{1-9}$ | $L_{2-329}$ |
| COMPOUND 3346 | $L_{1-9}$ | $L_{2-330}$ |
| COMPOUND 3347 | $L_{1-9}$ | $L_{2-331}$ |
| COMPOUND 3348 | $L_{1-9}$ | $L_{2-332}$ |
| COMPOUND 3349 | $L_{1-9}$ | $L_{2-333}$ |
| COMPOUND 3350 | $L_{1-9}$ | $L_{2-334}$ |
| COMPOUND 3351 | $L_{1-9}$ | $L_{2-335}$ |
| COMPOUND 3352 | $L_{1-9}$ | $L_{2-336}$ |
| COMPOUND 3353 | $L_{1-9}$ | $L_{2-337}$ |
| COMPOUND 3354 | $L_{1-9}$ | $L_{2-338}$ |
| COMPOUND 3355 | $L_{1-9}$ | $L_{2-339}$ |
| COMPOUND 3356 | $L_{1-9}$ | $L_{2-340}$ |
| COMPOUND 3357 | $L_{1-9}$ | $L_{2-341}$ |
| COMPOUND 3358 | $L_{1-9}$ | $L_{2-342}$ |
| COMPOUND 3359 | $L_{1-9}$ | $L_{2-343}$ |
| COMPOUND 3360 | $L_{1-9}$ | $L_{2-344}$ |
| COMPOUND 3361 | $L_{1-9}$ | $L_{2-345}$ |
| COMPOUND 3362 | $L_{1-9}$ | $L_{2-346}$ |
| COMPOUND 3363 | $L_{1-9}$ | $L_{2-347}$ |
| COMPOUND 3364 | $L_{1-9}$ | $L_{2-348}$ |
| COMPOUND 3365 | $L_{1-9}$ | $L_{2-349}$ |
| COMPOUND 3366 | $L_{1-9}$ | $L_{2-350}$ |
| COMPOUND 3367 | $L_{1-9}$ | $L_{2-351}$ |
| COMPOUND 3368 | $L_{1-9}$ | $L_{2-352}$ |
| COMPOUND 3369 | $L_{1-9}$ | $L_{2-353}$ |
| COMPOUND 3370 | $L_{1-9}$ | $L_{2-354}$ |
| COMPOUND 3371 | $L_{1-9}$ | $L_{2-355}$ |
| COMPOUND 3372 | $L_{1-9}$ | $L_{2-356}$ |
| COMPOUND 3373 | $L_{1-9}$ | $L_{2-357}$ |
| COMPOUND 3374 | $L_{1-9}$ | $L_{2-358}$ |
| COMPOUND 3375 | $L_{1-9}$ | $L_{2-359}$ |
| COMPOUND 3376 | $L_{1-9}$ | $L_{2-360}$ |
| COMPOUND 3377 | $L_{1-9}$ | $L_{2-361}$ |
| COMPOUND 3378 | $L_{1-9}$ | $L_{2-362}$ |
| COMPOUND 3379 | $L_{1-9}$ | $L_{2-363}$ |
| COMPOUND 3380 | $L_{1-9}$ | $L_{2-364}$ |
| COMPOUND 3381 | $L_{1-9}$ | $L_{2-365}$ |
| COMPOUND 3382 | $L_{1-9}$ | $L_{2-366}$ |
| COMPOUND 3383 | $L_{1-9}$ | $L_{2-367}$ |
| COMPOUND 3384 | $L_{1-9}$ | $L_{2-368}$ |
| COMPOUND 3385 | $L_{1-9}$ | $L_{2-369}$ |
| COMPOUND 3386 | $L_{1-9}$ | $L_{2-370}$ |
| COMPOUND 3387 | $L_{1-9}$ | $L_{2-371}$ |
| COMPOUND 3388 | $L_{1-9}$ | $L_{2-372}$ |
| COMPOUND 3389 | $L_{1-9}$ | $L_{2-373}$ |
| COMPOUND 3390 | $L_{1-9}$ | $L_{2-374}$ |
| COMPOUND 3391 | $L_{1-9}$ | $L_{2-375}$ |
| COMPOUND 3392 | $L_{1-9}$ | $L_{2-376}$ |
| COMPOUND 3393 | $L_{1-9}$ | $L_{2-377}$ |
| COMPOUND 3394 | $L_{1-10}$ | $L_{2-1}$ |
| COMPOUND 3395 | $L_{1-10}$ | $L_{2-2}$ |
| COMPOUND 3396 | $L_{1-10}$ | $L_{2-3}$ |
| COMPOUND 3397 | $L_{1-10}$ | $L_{2-4}$ |
| COMPOUND 3398 | $L_{1-10}$ | $L_{2-5}$ |
| COMPOUND 3399 | $L_{1-10}$ | $L_{2-6}$ |
| COMPOUND 3400 | $L_{1-10}$ | $L_{2-7}$ |
| COMPOUND 3401 | $L_{1-10}$ | $L_{2-8}$ |
| COMPOUND 3402 | $L_{1-10}$ | $L_{2-9}$ |
| COMPOUND 3403 | $L_{1-10}$ | $L_{2-10}$ |
| COMPOUND 3404 | $L_{1-10}$ | $L_{2-11}$ |

-continued

| | | |
|---|---|---|
| COMPOUND 3405 | $L_{1-10}$ | $L_{2-12}$ |
| COMPOUND 3406 | $L_{1-10}$ | $L_{2-13}$ |
| COMPOUND 3407 | $L_{1-10}$ | $L_{2-14}$ |
| COMPOUND 3408 | $L_{1-10}$ | $L_{2-15}$ |
| COMPOUND 3409 | $L_{1-10}$ | $L_{2-16}$ |
| COMPOUND 3410 | $L_{1-10}$ | $L_{2-17}$ |
| COMPOUND 3411 | $L_{1-10}$ | $L_{2-18}$ |
| COMPOUND 3412 | $L_{1-10}$ | $L_{2-19}$ |
| COMPOUND 3413 | $L_{1-10}$ | $L_{2-20}$ |
| COMPOUND 3414 | $L_{1-10}$ | $L_{2-21}$ |
| COMPOUND 3415 | $L_{1-10}$ | $L_{2-22}$ |
| COMPOUND 3416 | $L_{1-10}$ | $L_{2-23}$ |
| COMPOUND 3417 | $L_{1-10}$ | $L_{2-24}$ |
| COMPOUND 3418 | $L_{1-10}$ | $L_{2-25}$ |
| COMPOUND 3419 | $L_{1-10}$ | $L_{2-26}$ |
| COMPOUND 3420 | $L_{1-10}$ | $L_{2-27}$ |
| COMPOUND 3421 | $L_{1-10}$ | $L_{2-28}$ |
| COMPOUND 3422 | $L_{1-10}$ | $L_{2-29}$ |
| COMPOUND 3423 | $L_{1-10}$ | $L_{2-30}$ |
| COMPOUND 3424 | $L_{1-10}$ | $L_{2-31}$ |
| COMPOUND 3425 | $L_{1-10}$ | $L_{2-32}$ |
| COMPOUND 3426 | $L_{1-10}$ | $L_{2-33}$ |
| COMPOUND 3427 | $L_{1-10}$ | $L_{2-34}$ |
| COMPOUND 3428 | $L_{1-10}$ | $L_{2-35}$ |
| COMPOUND 3429 | $L_{1-10}$ | $L_{2-36}$ |
| COMPOUND 3430 | $L_{1-10}$ | $L_{2-37}$ |
| COMPOUND 3431 | $L_{1-10}$ | $L_{2-38}$ |
| COMPOUND 3432 | $L_{1-10}$ | $L_{2-39}$ |
| COMPOUND 3433 | $L_{1-10}$ | $L_{2-40}$ |
| COMPOUND 3434 | $L_{1-10}$ | $L_{2-41}$ |
| COMPOUND 3435 | $L_{1-10}$ | $L_{2-42}$ |
| COMPOUND 3436 | $L_{1-10}$ | $L_{2-43}$ |
| COMPOUND 3437 | $L_{1-10}$ | $L_{2-44}$ |
| COMPOUND 3438 | $L_{1-10}$ | $L_{2-45}$ |
| COMPOUND 3439 | $L_{1-10}$ | $L_{2-46}$ |
| COMPOUND 3440 | $L_{1-10}$ | $L_{2-47}$ |
| COMPOUND 3441 | $L_{1-10}$ | $L_{2-48}$ |
| COMPOUND 3442 | $L_{1-10}$ | $L_{2-49}$ |
| COMPOUND 3443 | $L_{1-10}$ | $L_{2-50}$ |
| COMPOUND 3444 | $L_{1-10}$ | $L_{2-51}$ |
| COMPOUND 3445 | $L_{1-10}$ | $L_{2-52}$ |
| COMPOUND 3446 | $L_{1-10}$ | $L_{2-53}$ |
| COMPOUND 3447 | $L_{1-10}$ | $L_{2-54}$ |
| COMPOUND 3448 | $L_{1-10}$ | $L_{2-55}$ |
| COMPOUND 3449 | $L_{1-10}$ | $L_{2-56}$ |
| COMPOUND 3450 | $L_{1-10}$ | $L_{2-57}$ |
| COMPOUND 3451 | $L_{1-10}$ | $L_{2-58}$ |
| COMPOUND 3452 | $L_{1-10}$ | $L_{2-59}$ |
| COMPOUND 3453 | $L_{1-10}$ | $L_{2-60}$ |
| COMPOUND 3454 | $L_{1-10}$ | $L_{2-61}$ |
| COMPOUND 3455 | $L_{1-10}$ | $L_{2-62}$ |
| COMPOUND 3456 | $L_{1-10}$ | $L_{2-63}$ |
| COMPOUND 3457 | $L_{1-10}$ | $L_{2-64}$ |
| COMPOUND 3458 | $L_{1-10}$ | $L_{2-65}$ |
| COMPOUND 3459 | $L_{1-10}$ | $L_{2-66}$ |
| COMPOUND 3460 | $L_{1-10}$ | $L_{2-67}$ |
| COMPOUND 3461 | $L_{1-10}$ | $L_{2-68}$ |
| COMPOUND 3462 | $L_{1-10}$ | $L_{2-69}$ |
| COMPOUND 3463 | $L_{1-10}$ | $L_{2-70}$ |
| COMPOUND 3464 | $L_{1-10}$ | $L_{2-71}$ |
| COMPOUND 3465 | $L_{1-10}$ | $L_{2-72}$ |
| COMPOUND 3466 | $L_{1-10}$ | $L_{2-73}$ |
| COMPOUND 3467 | $L_{1-10}$ | $L_{2-74}$ |
| COMPOUND 3468 | $L_{1-10}$ | $L_{2-75}$ |
| COMPOUND 3469 | $L_{1-10}$ | $L_{2-76}$ |
| COMPOUND 3470 | $L_{1-10}$ | $L_{2-77}$ |
| COMPOUND 3471 | $L_{1-10}$ | $L_{2-78}$ |
| COMPOUND 3472 | $L_{1-10}$ | $L_{2-79}$ |
| COMPOUND 3473 | $L_{1-10}$ | $L_{2-80}$ |
| COMPOUND 3474 | $L_{1-10}$ | $L_{2-81}$ |
| COMPOUND 3475 | $L_{1-10}$ | $L_{2-82}$ |
| COMPOUND 3476 | $L_{1-10}$ | $L_{2-83}$ |
| COMPOUND 3477 | $L_{1-10}$ | $L_{2-84}$ |
| COMPOUND 3478 | $L_{1-10}$ | $L_{2-85}$ |
| COMPOUND 3479 | $L_{1-10}$ | $L_{2-86}$ |
| COMPOUND 3480 | $L_{1-10}$ | $L_{2-87}$ |
| COMPOUND 3481 | $L_{1-10}$ | $L_{2-88}$ |
| COMPOUND 3482 | $L_{1-10}$ | $L_{2-89}$ |
| COMPOUND 3483 | $L_{1-10}$ | $L_{2-90}$ |

-continued

| | | |
|---|---|---|
| COMPOUND 3484 | $L_{1-10}$ | $L_{2-91}$ |
| COMPOUND 3485 | $L_{1-10}$ | $L_{2-92}$ |
| COMPOUND 3486 | $L_{1-10}$ | $L_{2-93}$ |
| COMPOUND 3487 | $L_{1-10}$ | $L_{2-94}$ |
| COMPOUND 3488 | $L_{1-10}$ | $L_{2-95}$ |
| COMPOUND 3489 | $L_{1-10}$ | $L_{2-96}$ |
| COMPOUND 3490 | $L_{1-10}$ | $L_{2-97}$ |
| COMPOUND 3491 | $L_{1-10}$ | $L_{2-98}$ |
| COMPOUND 3492 | $L_{1-10}$ | $L_{2-99}$ |
| COMPOUND 3493 | $L_{1-10}$ | $L_{2-100}$ |
| COMPOUND 3494 | $L_{1-10}$ | $L_{2-101}$ |
| COMPOUND 3495 | $L_{1-10}$ | $L_{2-102}$ |
| COMPOUND 3496 | $L_{1-10}$ | $L_{2-103}$ |
| COMPOUND 3497 | $L_{1-10}$ | $L_{2-104}$ |
| COMPOUND 3498 | $L_{1-10}$ | $L_{2-105}$ |
| COMPOUND 3499 | $L_{1-10}$ | $L_{2-106}$ |
| COMPOUND 3500 | $L_{1-10}$ | $L_{2-107}$ |
| COMPOUND 3501 | $L_{1-10}$ | $L_{2-108}$ |
| COMPOUND 3502 | $L_{1-10}$ | $L_{2-109}$ |
| COMPOUND 3503 | $L_{1-10}$ | $L_{2-110}$ |
| COMPOUND 3504 | $L_{1-10}$ | $L_{2-111}$ |
| COMPOUND 3505 | $L_{1-10}$ | $L_{2-112}$ |
| COMPOUND 3506 | $L_{1-10}$ | $L_{2-113}$ |
| COMPOUND 3507 | $L_{1-10}$ | $L_{2-114}$ |
| COMPOUND 3508 | $L_{1-10}$ | $L_{2-115}$ |
| COMPOUND 3509 | $L_{1-10}$ | $L_{2-116}$ |
| COMPOUND 3510 | $L_{1-10}$ | $L_{2-117}$ |
| COMPOUND 3511 | $L_{1-10}$ | $L_{2-118}$ |
| COMPOUND 3512 | $L_{1-10}$ | $L_{2-119}$ |
| COMPOUND 3513 | $L_{1-10}$ | $L_{2-120}$ |
| COMPOUND 3514 | $L_{1-10}$ | $L_{2-121}$ |
| COMPOUND 3515 | $L_{1-10}$ | $L_{2-122}$ |
| COMPOUND 3516 | $L_{1-10}$ | $L_{2-123}$ |
| COMPOUND 3517 | $L_{1-10}$ | $L_{2-124}$ |
| COMPOUND 3518 | $L_{1-10}$ | $L_{2-125}$ |
| COMPOUND 3519 | $L_{1-10}$ | $L_{2-126}$ |
| COMPOUND 3520 | $L_{1-10}$ | $L_{2-127}$ |
| COMPOUND 3521 | $L_{1-10}$ | $L_{2-128}$ |
| COMPOUND 3522 | $L_{1-10}$ | $L_{2-129}$ |
| COMPOUND 3523 | $L_{1-10}$ | $L_{2-130}$ |
| COMPOUND 3524 | $L_{1-10}$ | $L_{2-131}$ |
| COMPOUND 3525 | $L_{1-10}$ | $L_{2-132}$ |
| COMPOUND 3526 | $L_{1-10}$ | $L_{2-133}$ |
| COMPOUND 3527 | $L_{1-10}$ | $L_{2-134}$ |
| COMPOUND 3528 | $L_{1-10}$ | $L_{2-135}$ |
| COMPOUND 3529 | $L_{1-10}$ | $L_{2-136}$ |
| COMPOUND 3530 | $L_{1-10}$ | $L_{2-137}$ |
| COMPOUND 3531 | $L_{1-10}$ | $L_{2-138}$ |
| COMPOUND 3532 | $L_{1-10}$ | $L_{2-139}$ |
| COMPOUND 3533 | $L_{1-10}$ | $L_{2-140}$ |
| COMPOUND 3534 | $L_{1-10}$ | $L_{2-141}$ |
| COMPOUND 3535 | $L_{1-10}$ | $L_{2-142}$ |
| COMPOUND 3536 | $L_{1-10}$ | $L_{2-143}$ |
| COMPOUND 3537 | $L_{1-10}$ | $L_{2-144}$ |
| COMPOUND 3538 | $L_{1-10}$ | $L_{2-145}$ |
| COMPOUND 3539 | $L_{1-10}$ | $L_{2-146}$ |
| COMPOUND 3540 | $L_{1-10}$ | $L_{2-147}$ |
| COMPOUND 3541 | $L_{1-10}$ | $L_{2-148}$ |
| COMPOUND 3542 | $L_{1-10}$ | $L_{2-149}$ |
| COMPOUND 3543 | $L_{1-10}$ | $L_{2-150}$ |
| COMPOUND 3544 | $L_{1-10}$ | $L_{2-151}$ |
| COMPOUND 3545 | $L_{1-10}$ | $L_{2-152}$ |
| COMPOUND 3546 | $L_{1-10}$ | $L_{2-153}$ |
| COMPOUND 3547 | $L_{1-10}$ | $L_{2-154}$ |
| COMPOUND 3548 | $L_{1-10}$ | $L_{2-155}$ |
| COMPOUND 3549 | $L_{1-10}$ | $L_{2-156}$ |
| COMPOUND 3550 | $L_{1-10}$ | $L_{2-157}$ |
| COMPOUND 3551 | $L_{1-10}$ | $L_{2-158}$ |
| COMPOUND 3552 | $L_{1-10}$ | $L_{2-159}$ |
| COMPOUND 3553 | $L_{1-10}$ | $L_{2-160}$ |
| COMPOUND 3554 | $L_{1-10}$ | $L_{2-161}$ |
| COMPOUND 3555 | $L_{1-10}$ | $L_{2-162}$ |
| COMPOUND 3556 | $L_{1-10}$ | $L_{2-163}$ |
| COMPOUND 3557 | $L_{1-10}$ | $L_{2-164}$ |
| COMPOUND 3558 | $L_{1-10}$ | $L_{2-165}$ |
| COMPOUND 3559 | $L_{1-10}$ | $L_{2-166}$ |
| COMPOUND 3560 | $L_{1-10}$ | $L_{2-167}$ |
| COMPOUND 3561 | $L_{1-10}$ | $L_{2-168}$ |
| COMPOUND 3562 | $L_{1-10}$ | $L_{2-169}$ |

-continued

| | | |
|---|---|---|
| COMPOUND 3563 | $L_{1-10}$ | $L_{2-170}$ |
| COMPOUND 3564 | $L_{1-10}$ | $L_{2-171}$ |
| COMPOUND 3565 | $L_{1-10}$ | $L_{2-172}$ |
| COMPOUND 3566 | $L_{1-10}$ | $L_{2-173}$ |
| COMPOUND 3567 | $L_{1-10}$ | $L_{2-174}$ |
| COMPOUND 3568 | $L_{1-10}$ | $L_{2-175}$ |
| COMPOUND 3569 | $L_{1-10}$ | $L_{2-176}$ |
| COMPOUND 3570 | $L_{1-10}$ | $L_{2-177}$ |
| COMPOUND 3571 | $L_{1-10}$ | $L_{2-178}$ |
| COMPOUND 3572 | $L_{1-10}$ | $L_{2-179}$ |
| COMPOUND 3573 | $L_{1-10}$ | $L_{2-180}$ |
| COMPOUND 3574 | $L_{1-10}$ | $L_{2-181}$ |
| COMPOUND 3575 | $L_{1-10}$ | $L_{2-182}$ |
| COMPOUND 3576 | $L_{1-10}$ | $L_{2-183}$ |
| COMPOUND 3577 | $L_{1-10}$ | $L_{2-184}$ |
| COMPOUND 3578 | $L_{1-10}$ | $L_{2-185}$ |
| COMPOUND 3579 | $L_{1-10}$ | $L_{2-186}$ |
| COMPOUND 3580 | $L_{1-10}$ | $L_{2-187}$ |
| COMPOUND 3581 | $L_{1-10}$ | $L_{2-188}$ |
| COMPOUND 3582 | $L_{1-10}$ | $L_{2-189}$ |
| COMPOUND 3583 | $L_{1-10}$ | $L_{2-190}$ |
| COMPOUND 3584 | $L_{1-10}$ | $L_{2-191}$ |
| COMPOUND 3585 | $L_{1-10}$ | $L_{2-192}$ |
| COMPOUND 3586 | $L_{1-10}$ | $L_{2-193}$ |
| COMPOUND 3587 | $L_{1-10}$ | $L_{2-194}$ |
| COMPOUND 3588 | $L_{1-10}$ | $L_{2-195}$ |
| COMPOUND 3589 | $L_{1-10}$ | $L_{2-196}$ |
| COMPOUND 3590 | $L_{1-10}$ | $L_{2-197}$ |
| COMPOUND 3591 | $L_{1-10}$ | $L_{2-198}$ |
| COMPOUND 3592 | $L_{1-10}$ | $L_{2-199}$ |
| COMPOUND 3593 | $L_{1-10}$ | $L_{2-200}$ |
| COMPOUND 3594 | $L_{1-10}$ | $L_{2-201}$ |
| COMPOUND 3595 | $L_{1-10}$ | $L_{2-202}$ |
| COMPOUND 3596 | $L_{1-10}$ | $L_{2-203}$ |
| COMPOUND 3597 | $L_{1-10}$ | $L_{2-204}$ |
| COMPOUND 3598 | $L_{1-10}$ | $L_{2-205}$ |
| COMPOUND 3599 | $L_{1-10}$ | $L_{2-206}$ |
| COMPOUND 3600 | $L_{1-10}$ | $L_{2-207}$ |
| COMPOUND 3601 | $L_{1-10}$ | $L_{2-208}$ |
| COMPOUND 3602 | $L_{1-10}$ | $L_{2-209}$ |
| COMPOUND 3603 | $L_{1-10}$ | $L_{2-210}$ |
| COMPOUND 3604 | $L_{1-10}$ | $L_{2-211}$ |
| COMPOUND 3605 | $L_{1-10}$ | $L_{2-212}$ |
| COMPOUND 3606 | $L_{1-10}$ | $L_{2-213}$ |
| COMPOUND 3607 | $L_{1-10}$ | $L_{2-214}$ |
| COMPOUND 3608 | $L_{1-10}$ | $L_{2-215}$ |
| COMPOUND 3609 | $L_{1-10}$ | $L_{2-216}$ |
| COMPOUND 3610 | $L_{1-10}$ | $L_{2-217}$ |
| COMPOUND 3611 | $L_{1-10}$ | $L_{2-218}$ |
| COMPOUND 3612 | $L_{1-10}$ | $L_{2-219}$ |
| COMPOUND 3613 | $L_{1-10}$ | $L_{2-220}$ |
| COMPOUND 3614 | $L_{1-10}$ | $L_{2-221}$ |
| COMPOUND 3615 | $L_{1-10}$ | $L_{2-222}$ |
| COMPOUND 3616 | $L_{1-10}$ | $L_{2-223}$ |
| COMPOUND 3617 | $L_{1-10}$ | $L_{2-224}$ |
| COMPOUND 3618 | $L_{1-10}$ | $L_{2-225}$ |
| COMPOUND 3619 | $L_{1-10}$ | $L_{2-226}$ |
| COMPOUND 3620 | $L_{1-10}$ | $L_{2-227}$ |
| COMPOUND 3621 | $L_{1-10}$ | $L_{2-228}$ |
| COMPOUND 3622 | $L_{1-10}$ | $L_{2-229}$ |
| COMPOUND 3623 | $L_{1-10}$ | $L_{2-230}$ |
| COMPOUND 3624 | $L_{1-10}$ | $L_{2-231}$ |
| COMPOUND 3625 | $L_{1-10}$ | $L_{2-232}$ |
| COMPOUND 3626 | $L_{1-10}$ | $L_{2-233}$ |
| COMPOUND 3627 | $L_{1-10}$ | $L_{2-234}$ |
| COMPOUND 3628 | $L_{1-10}$ | $L_{2-235}$ |
| COMPOUND 3629 | $L_{1-10}$ | $L_{2-236}$ |
| COMPOUND 3630 | $L_{1-10}$ | $L_{2-237}$ |
| COMPOUND 3631 | $L_{1-10}$ | $L_{2-238}$ |
| COMPOUND 3632 | $L_{1-10}$ | $L_{2-239}$ |
| COMPOUND 3633 | $L_{1-10}$ | $L_{2-240}$ |
| COMPOUND 3634 | $L_{1-10}$ | $L_{2-241}$ |
| COMPOUND 3635 | $L_{1-10}$ | $L_{2-242}$ |
| COMPOUND 3636 | $L_{1-10}$ | $L_{2-243}$ |
| COMPOUND 3637 | $L_{1-10}$ | $L_{2-244}$ |
| COMPOUND 3638 | $L_{1-10}$ | $L_{2-245}$ |
| COMPOUND 3639 | $L_{1-10}$ | $L_{2-246}$ |
| COMPOUND 3640 | $L_{1-10}$ | $L_{2-247}$ |
| COMPOUND 3641 | $L_{1-10}$ | $L_{2-248}$ |

-continued

| | | |
|---|---|---|
| COMPOUND 3642 | $L_{1-10}$ | $L_{2-249}$ |
| COMPOUND 3643 | $L_{1-10}$ | $L_{2-250}$ |
| COMPOUND 3644 | $L_{1-10}$ | $L_{2-251}$ |
| COMPOUND 3645 | $L_{1-10}$ | $L_{2-252}$ |
| COMPOUND 3646 | $L_{1-10}$ | $L_{2-253}$ |
| COMPOUND 3647 | $L_{1-10}$ | $L_{2-254}$ |
| COMPOUND 3648 | $L_{1-10}$ | $L_{2-255}$ |
| COMPOUND 3649 | $L_{1-10}$ | $L_{2-256}$ |
| COMPOUND 3650 | $L_{1-10}$ | $L_{2-257}$ |
| COMPOUND 3651 | $L_{1-10}$ | $L_{2-258}$ |
| COMPOUND 3652 | $L_{1-10}$ | $L_{2-259}$ |
| COMPOUND 3653 | $L_{1-10}$ | $L_{2-260}$ |
| COMPOUND 3654 | $L_{1-10}$ | $L_{2-261}$ |
| COMPOUND 3655 | $L_{1-10}$ | $L_{2-262}$ |
| COMPOUND 3656 | $L_{1-10}$ | $L_{2-263}$ |
| COMPOUND 3657 | $L_{1-10}$ | $L_{2-264}$ |
| COMPOUND 3658 | $L_{1-10}$ | $L_{2-265}$ |
| COMPOUND 3659 | $L_{1-10}$ | $L_{2-266}$ |
| COMPOUND 3660 | $L_{1-10}$ | $L_{2-267}$ |
| COMPOUND 3661 | $L_{1-10}$ | $L_{2-268}$ |
| COMPOUND 3662 | $L_{1-10}$ | $L_{2-269}$ |
| COMPOUND 3663 | $L_{1-10}$ | $L_{2-270}$ |
| COMPOUND 3664 | $L_{1-10}$ | $L_{2-271}$ |
| COMPOUND 3665 | $L_{1-10}$ | $L_{2-272}$ |
| COMPOUND 3666 | $L_{1-10}$ | $L_{2-273}$ |
| COMPOUND 3667 | $L_{1-10}$ | $L_{2-274}$ |
| COMPOUND 3668 | $L_{1-10}$ | $L_{2-275}$ |
| COMPOUND 3669 | $L_{1-10}$ | $L_{2-276}$ |
| COMPOUND 3670 | $L_{1-10}$ | $L_{2-277}$ |
| COMPOUND 3671 | $L_{1-10}$ | $L_{2-278}$ |
| COMPOUND 3672 | $L_{1-10}$ | $L_{2-279}$ |
| COMPOUND 3673 | $L_{1-10}$ | $L_{2-280}$ |
| COMPOUND 3674 | $L_{1-10}$ | $L_{2-281}$ |
| COMPOUND 3675 | $L_{1-10}$ | $L_{2-282}$ |
| COMPOUND 3676 | $L_{1-10}$ | $L_{2-283}$ |
| COMPOUND 3677 | $L_{1-10}$ | $L_{2-284}$ |
| COMPOUND 3678 | $L_{1-10}$ | $L_{2-285}$ |
| COMPOUND 3679 | $L_{1-10}$ | $L_{2-286}$ |
| COMPOUND 3680 | $L_{1-10}$ | $L_{2-287}$ |
| COMPOUND 3681 | $L_{1-10}$ | $L_{2-288}$ |
| COMPOUND 3682 | $L_{1-10}$ | $L_{2-289}$ |
| COMPOUND 3683 | $L_{1-10}$ | $L_{2-290}$ |
| COMPOUND 3684 | $L_{1-10}$ | $L_{2-291}$ |
| COMPOUND 3685 | $L_{1-10}$ | $L_{2-292}$ |
| COMPOUND 3686 | $L_{1-10}$ | $L_{2-293}$ |
| COMPOUND 3687 | $L_{1-10}$ | $L_{2-294}$ |
| COMPOUND 3688 | $L_{1-10}$ | $L_{2-295}$ |
| COMPOUND 3689 | $L_{1-10}$ | $L_{2-296}$ |
| COMPOUND 3690 | $L_{1-10}$ | $L_{2-297}$ |
| COMPOUND 3691 | $L_{1-10}$ | $L_{2-298}$ |
| COMPOUND 3692 | $L_{1-10}$ | $L_{2-299}$ |
| COMPOUND 3693 | $L_{1-10}$ | $L_{2-300}$ |
| COMPOUND 3694 | $L_{1-10}$ | $L_{2-301}$ |
| COMPOUND 3695 | $L_{1-10}$ | $L_{2-302}$ |
| COMPOUND 3696 | $L_{1-10}$ | $L_{2-303}$ |
| COMPOUND 3697 | $L_{1-10}$ | $L_{2-304}$ |
| COMPOUND 3698 | $L_{1-10}$ | $L_{2-305}$ |
| COMPOUND 3699 | $L_{1-10}$ | $L_{2-306}$ |
| COMPOUND 3700 | $L_{1-10}$ | $L_{2-307}$ |
| COMPOUND 3701 | $L_{1-10}$ | $L_{2-308}$ |
| COMPOUND 3702 | $L_{1-10}$ | $L_{2-309}$ |
| COMPOUND 3703 | $L_{1-10}$ | $L_{2-310}$ |
| COMPOUND 3704 | $L_{1-10}$ | $L_{2-311}$ |
| COMPOUND 3705 | $L_{1-10}$ | $L_{2-312}$ |
| COMPOUND 3706 | $L_{1-10}$ | $L_{2-313}$ |
| COMPOUND 3707 | $L_{1-10}$ | $L_{2-314}$ |
| COMPOUND 3708 | $L_{1-10}$ | $L_{2-315}$ |
| COMPOUND 3709 | $L_{1-10}$ | $L_{2-316}$ |
| COMPOUND 3710 | $L_{1-10}$ | $L_{2-317}$ |
| COMPOUND 3711 | $L_{1-10}$ | $L_{2-318}$ |
| COMPOUND 3712 | $L_{1-10}$ | $L_{2-319}$ |
| COMPOUND 3713 | $L_{1-10}$ | $L_{2-320}$ |
| COMPOUND 3714 | $L_{1-10}$ | $L_{2-321}$ |
| COMPOUND 3715 | $L_{1-10}$ | $L_{2-322}$ |
| COMPOUND 3716 | $L_{1-10}$ | $L_{2-323}$ |
| COMPOUND 3717 | $L_{1-10}$ | $L_{2-324}$ |
| COMPOUND 3718 | $L_{1-10}$ | $L_{2-325}$ |
| COMPOUND 3719 | $L_{1-10}$ | $L_{2-326}$ |
| COMPOUND 3720 | $L_{1-10}$ | $L_{2-327}$ |

-continued

| | | |
|---|---|---|
| COMPOUND 3721 | $L_{1-10}$ | $L_{2-328}$ |
| COMPOUND 3722 | $L_{1-10}$ | $L_{2-329}$ |
| COMPOUND 3723 | $L_{1-10}$ | $L_{2-330}$ |
| COMPOUND 3724 | $L_{1-10}$ | $L_{2-331}$ |
| COMPOUND 3725 | $L_{1-10}$ | $L_{2-332}$ |
| COMPOUND 3726 | $L_{1-10}$ | $L_{2-333}$ |
| COMPOUND 3727 | $L_{1-10}$ | $L_{2-334}$ |
| COMPOUND 3728 | $L_{1-10}$ | $L_{2-335}$ |
| COMPOUND 3729 | $L_{1-10}$ | $L_{2-336}$ |
| COMPOUND 3730 | $L_{1-10}$ | $L_{2-337}$ |
| COMPOUND 3731 | $L_{1-10}$ | $L_{2-338}$ |
| COMPOUND 3732 | $L_{1-10}$ | $L_{2-339}$ |
| COMPOUND 3733 | $L_{1-10}$ | $L_{2-340}$ |
| COMPOUND 3734 | $L_{1-10}$ | $L_{2-341}$ |
| COMPOUND 3735 | $L_{1-10}$ | $L_{2-342}$ |
| COMPOUND 3736 | $L_{1-10}$ | $L_{2-343}$ |
| COMPOUND 3737 | $L_{1-10}$ | $L_{2-344}$ |
| COMPOUND 3738 | $L_{1-10}$ | $L_{2-345}$ |
| COMPOUND 3739 | $L_{1-10}$ | $L_{2-346}$ |
| COMPOUND 3740 | $L_{1-10}$ | $L_{2-347}$ |
| COMPOUND 3741 | $L_{1-10}$ | $L_{2-348}$ |
| COMPOUND 3742 | $L_{1-10}$ | $L_{2-349}$ |
| COMPOUND 3743 | $L_{1-10}$ | $L_{2-350}$ |
| COMPOUND 3744 | $L_{1-10}$ | $L_{2-351}$ |
| COMPOUND 3745 | $L_{1-10}$ | $L_{2-352}$ |
| COMPOUND 3746 | $L_{1-10}$ | $L_{2-353}$ |
| COMPOUND 3747 | $L_{1-10}$ | $L_{2-354}$ |
| COMPOUND 3748 | $L_{1-10}$ | $L_{2-355}$ |
| COMPOUND 3749 | $L_{1-10}$ | $L_{2-356}$ |
| COMPOUND 3750 | $L_{1-10}$ | $L_{2-357}$ |
| COMPOUND 3751 | $L_{1-10}$ | $L_{2-358}$ |
| COMPOUND 3752 | $L_{1-10}$ | $L_{2-359}$ |
| COMPOUND 3753 | $L_{1-10}$ | $L_{2-360}$ |
| COMPOUND 3754 | $L_{1-10}$ | $L_{2-361}$ |
| COMPOUND 3755 | $L_{1-10}$ | $L_{2-362}$ |
| COMPOUND 3756 | $L_{1-10}$ | $L_{2-363}$ |
| COMPOUND 3757 | $L_{1-10}$ | $L_{2-364}$ |
| COMPOUND 3758 | $L_{1-10}$ | $L_{2-365}$ |
| COMPOUND 3759 | $L_{1-10}$ | $L_{2-366}$ |
| COMPOUND 3760 | $L_{1-10}$ | $L_{2-367}$ |
| COMPOUND 3761 | $L_{1-10}$ | $L_{2-368}$ |
| COMPOUND 3762 | $L_{1-10}$ | $L_{2-369}$ |
| COMPOUND 3763 | $L_{1-10}$ | $L_{2-370}$ |
| COMPOUND 3764 | $L_{1-10}$ | $L_{2-371}$ |
| COMPOUND 3765 | $L_{1-10}$ | $L_{2-372}$ |
| COMPOUND 3766 | $L_{1-10}$ | $L_{2-373}$ |
| COMPOUND 3767 | $L_{1-10}$ | $L_{2-374}$ |
| COMPOUND 3768 | $L_{1-10}$ | $L_{2-375}$ |
| COMPOUND 3769 | $L_{1-10}$ | $L_{2-376}$ |
| COMPOUND 3770 | $L_{1-10}$ | $L_{2-377}$ |
| COMPOUND 3771 | $L_{1-199}$ | $L_{2-1}$ |
| COMPOUND 3772 | $L_{1-199}$ | $L_{2-2}$ |
| COMPOUND 3773 | $L_{1-199}$ | $L_{2-3}$ |
| COMPOUND 3774 | $L_{1-199}$ | $L_{2-4}$ |
| COMPOUND 3775 | $L_{1-199}$ | $L_{2-5}$ |
| COMPOUND 3776 | $L_{1-199}$ | $L_{2-6}$ |
| COMPOUND 3777 | $L_{1-199}$ | $L_{2-7}$ |
| COMPOUND 3778 | $L_{1-199}$ | $L_{2-8}$ |
| COMPOUND 3779 | $L_{1-199}$ | $L_{2-9}$ |
| COMPOUND 3780 | $L_{1-199}$ | $L_{2-10}$ |
| COMPOUND 3781 | $L_{1-199}$ | $L_{2-11}$ |
| COMPOUND 3782 | $L_{1-199}$ | $L_{2-12}$ |
| COMPOUND 3783 | $L_{1-199}$ | $L_{2-13}$ |
| COMPOUND 3784 | $L_{1-199}$ | $L_{2-14}$ |
| COMPOUND 3785 | $L_{1-199}$ | $L_{2-15}$ |
| COMPOUND 3786 | $L_{1-199}$ | $L_{2-16}$ |
| COMPOUND 3787 | $L_{1-199}$ | $L_{2-17}$ |
| COMPOUND 3788 | $L_{1-199}$ | $L_{2-18}$ |
| COMPOUND 3789 | $L_{1-199}$ | $L_{2-19}$ |
| COMPOUND 3790 | $L_{1-199}$ | $L_{2-20}$ |
| COMPOUND 3791 | $L_{1-199}$ | $L_{2-21}$ |
| COMPOUND 3792 | $L_{1-199}$ | $L_{2-22}$ |
| COMPOUND 3793 | $L_{1-199}$ | $L_{2-23}$ |
| COMPOUND 3794 | $L_{1-199}$ | $L_{2-24}$ |
| COMPOUND 3795 | $L_{1-199}$ | $L_{2-25}$ |
| COMPOUND 3796 | $L_{1-199}$ | $L_{2-26}$ |
| COMPOUND 3797 | $L_{1-199}$ | $L_{2-27}$ |
| COMPOUND 3798 | $L_{1-199}$ | $L_{2-28}$ |
| COMPOUND 3799 | $L_{1-199}$ | $L_{2-29}$ |

-continued

| | | |
|---|---|---|
| COMPOUND 3800 | $L_{1-199}$ | $L_{2-30}$ |
| COMPOUND 3801 | $L_{1-199}$ | $L_{2-31}$ |
| COMPOUND 3802 | $L_{1-199}$ | $L_{2-32}$ |
| COMPOUND 3803 | $L_{1-199}$ | $L_{2-33}$ |
| COMPOUND 3804 | $L_{1-199}$ | $L_{2-34}$ |
| COMPOUND 3805 | $L_{1-199}$ | $L_{2-35}$ |
| COMPOUND 3806 | $L_{1-199}$ | $L_{2-36}$ |
| COMPOUND 3807 | $L_{1-199}$ | $L_{2-37}$ |
| COMPOUND 3808 | $L_{1-199}$ | $L_{2-38}$ |
| COMPOUND 3809 | $L_{1-199}$ | $L_{2-39}$ |
| COMPOUND 3810 | $L_{1-199}$ | $L_{2-40}$ |
| COMPOUND 3811 | $L_{1-199}$ | $L_{2-41}$ |
| COMPOUND 3812 | $L_{1-199}$ | $L_{2-42}$ |
| COMPOUND 3813 | $L_{1-199}$ | $L_{2-43}$ |
| COMPOUND 3814 | $L_{1-199}$ | $L_{2-44}$ |
| COMPOUND 3815 | $L_{1-199}$ | $L_{2-45}$ |
| COMPOUND 3816 | $L_{1-199}$ | $L_{2-46}$ |
| COMPOUND 3817 | $L_{1-199}$ | $L_{2-47}$ |
| COMPOUND 3818 | $L_{1-199}$ | $L_{2-48}$ |
| COMPOUND 3819 | $L_{1-199}$ | $L_{2-49}$ |
| COMPOUND 3820 | $L_{1-199}$ | $L_{2-50}$ |
| COMPOUND 3821 | $L_{1-199}$ | $L_{2-51}$ |
| COMPOUND 3822 | $L_{1-199}$ | $L_{2-52}$ |
| COMPOUND 3823 | $L_{1-199}$ | $L_{2-53}$ |
| COMPOUND 3824 | $L_{1-199}$ | $L_{2-54}$ |
| COMPOUND 3825 | $L_{1-199}$ | $L_{2-55}$ |
| COMPOUND 3826 | $L_{1-199}$ | $L_{2-56}$ |
| COMPOUND 3827 | $L_{1-199}$ | $L_{2-57}$ |
| COMPOUND 3828 | $L_{1-199}$ | $L_{2-58}$ |
| COMPOUND 3829 | $L_{1-199}$ | $L_{2-59}$ |
| COMPOUND 3830 | $L_{1-199}$ | $L_{2-60}$ |
| COMPOUND 3831 | $L_{1-199}$ | $L_{2-61}$ |
| COMPOUND 3832 | $L_{1-199}$ | $L_{2-62}$ |
| COMPOUND 3833 | $L_{1-199}$ | $L_{2-63}$ |
| COMPOUND 3834 | $L_{1-199}$ | $L_{2-64}$ |
| COMPOUND 3835 | $L_{1-199}$ | $L_{2-65}$ |
| COMPOUND 3836 | $L_{1-199}$ | $L_{2-66}$ |
| COMPOUND 3837 | $L_{1-199}$ | $L_{2-67}$ |
| COMPOUND 3838 | $L_{1-199}$ | $L_{2-68}$ |
| COMPOUND 3839 | $L_{1-199}$ | $L_{2-69}$ |
| COMPOUND 3840 | $L_{1-199}$ | $L_{2-70}$ |
| COMPOUND 3841 | $L_{1-199}$ | $L_{2-71}$ |
| COMPOUND 3842 | $L_{1-199}$ | $L_{2-72}$ |
| COMPOUND 3843 | $L_{1-199}$ | $L_{2-73}$ |
| COMPOUND 3844 | $L_{1-199}$ | $L_{2-74}$ |
| COMPOUND 3845 | $L_{1-199}$ | $L_{2-75}$ |
| COMPOUND 3846 | $L_{1-199}$ | $L_{2-76}$ |
| COMPOUND 3847 | $L_{1-199}$ | $L_{2-77}$ |
| COMPOUND 3848 | $L_{1-199}$ | $L_{2-78}$ |
| COMPOUND 3849 | $L_{1-199}$ | $L_{2-79}$ |
| COMPOUND 3850 | $L_{1-199}$ | $L_{2-80}$ |
| COMPOUND 3851 | $L_{1-199}$ | $L_{2-81}$ |
| COMPOUND 3852 | $L_{1-199}$ | $L_{2-82}$ |
| COMPOUND 3853 | $L_{1-199}$ | $L_{2-83}$ |
| COMPOUND 3854 | $L_{1-199}$ | $L_{2-84}$ |
| COMPOUND 3855 | $L_{1-199}$ | $L_{2-85}$ |
| COMPOUND 3856 | $L_{1-199}$ | $L_{2-86}$ |
| COMPOUND 3857 | $L_{1-199}$ | $L_{2-87}$ |
| COMPOUND 3858 | $L_{1-199}$ | $L_{2-88}$ |
| COMPOUND 3859 | $L_{1-199}$ | $L_{2-89}$ |
| COMPOUND 3860 | $L_{1-199}$ | $L_{2-90}$ |
| COMPOUND 3861 | $L_{1-199}$ | $L_{2-91}$ |
| COMPOUND 3862 | $L_{1-199}$ | $L_{2-92}$ |
| COMPOUND 3863 | $L_{1-199}$ | $L_{2-93}$ |
| COMPOUND 3864 | $L_{1-199}$ | $L_{2-94}$ |
| COMPOUND 3865 | $L_{1-199}$ | $L_{2-95}$ |
| COMPOUND 3866 | $L_{1-199}$ | $L_{2-96}$ |
| COMPOUND 3867 | $L_{1-199}$ | $L_{2-97}$ |
| COMPOUND 3868 | $L_{1-199}$ | $L_{2-98}$ |
| COMPOUND 3869 | $L_{1-199}$ | $L_{2-99}$ |
| COMPOUND 3870 | $L_{1-199}$ | $L_{2-100}$ |
| COMPOUND 3871 | $L_{1-199}$ | $L_{2-101}$ |
| COMPOUND 3872 | $L_{1-199}$ | $L_{2-102}$ |
| COMPOUND 3873 | $L_{1-199}$ | $L_{2-103}$ |
| COMPOUND 3874 | $L_{1-199}$ | $L_{2-104}$ |
| COMPOUND 3875 | $L_{1-199}$ | $L_{2-105}$ |
| COMPOUND 3876 | $L_{1-199}$ | $L_{2-106}$ |
| COMPOUND 3877 | $L_{1-199}$ | $L_{2-107}$ |
| COMPOUND 3878 | $L_{1-199}$ | $L_{2-108}$ |
| COMPOUND 3879 | $L_{1-199}$ | $L_{2-109}$ |
| COMPOUND 3880 | $L_{1-199}$ | $L_{2-110}$ |
| COMPOUND 3881 | $L_{1-199}$ | $L_{2-111}$ |
| COMPOUND 3882 | $L_{1-199}$ | $L_{2-112}$ |
| COMPOUND 3883 | $L_{1-199}$ | $L_{2-113}$ |
| COMPOUND 3884 | $L_{1-199}$ | $L_{2-114}$ |
| COMPOUND 3885 | $L_{1-199}$ | $L_{2-115}$ |
| COMPOUND 3886 | $L_{1-199}$ | $L_{2-116}$ |
| COMPOUND 3887 | $L_{1-199}$ | $L_{2-117}$ |
| COMPOUND 3888 | $L_{1-199}$ | $L_{2-118}$ |
| COMPOUND 3889 | $L_{1-199}$ | $L_{2-119}$ |
| COMPOUND 3890 | $L_{1-199}$ | $L_{2-120}$ |
| COMPOUND 3891 | $L_{1-199}$ | $L_{2-121}$ |
| COMPOUND 3892 | $L_{1-199}$ | $L_{2-122}$ |
| COMPOUND 3893 | $L_{1-199}$ | $L_{2-123}$ |
| COMPOUND 3894 | $L_{1-199}$ | $L_{2-124}$ |
| COMPOUND 3895 | $L_{1-199}$ | $L_{2-125}$ |
| COMPOUND 3896 | $L_{1-199}$ | $L_{2-126}$ |
| COMPOUND 3897 | $L_{1-199}$ | $L_{2-127}$ |
| COMPOUND 3898 | $L_{1-199}$ | $L_{2-128}$ |
| COMPOUND 3899 | $L_{1-199}$ | $L_{2-129}$ |
| COMPOUND 3900 | $L_{1-199}$ | $L_{2-130}$ |
| COMPOUND 3901 | $L_{1-199}$ | $L_{2-131}$ |
| COMPOUND 3902 | $L_{1-199}$ | $L_{2-132}$ |
| COMPOUND 3903 | $L_{1-199}$ | $L_{2-133}$ |
| COMPOUND 3904 | $L_{1-199}$ | $L_{2-134}$ |
| COMPOUND 3905 | $L_{1-199}$ | $L_{2-135}$ |
| COMPOUND 3906 | $L_{1-199}$ | $L_{2-136}$ |
| COMPOUND 3907 | $L_{1-199}$ | $L_{2-137}$ |
| COMPOUND 3908 | $L_{1-199}$ | $L_{2-138}$ |
| COMPOUND 3909 | $L_{1-199}$ | $L_{2-139}$ |
| COMPOUND 3910 | $L_{1-199}$ | $L_{2-140}$ |
| COMPOUND 3911 | $L_{1-199}$ | $L_{2-141}$ |
| COMPOUND 3912 | $L_{1-199}$ | $L_{2-142}$ |
| COMPOUND 3913 | $L_{1-199}$ | $L_{2-143}$ |
| COMPOUND 3914 | $L_{1-199}$ | $L_{2-144}$ |
| COMPOUND 3915 | $L_{1-199}$ | $L_{2-145}$ |
| COMPOUND 3916 | $L_{1-199}$ | $L_{2-146}$ |
| COMPOUND 3917 | $L_{1-199}$ | $L_{2-147}$ |
| COMPOUND 3918 | $L_{1-199}$ | $L_{2-148}$ |
| COMPOUND 3919 | $L_{1-199}$ | $L_{2-149}$ |
| COMPOUND 3920 | $L_{1-199}$ | $L_{2-150}$ |
| COMPOUND 3921 | $L_{1-199}$ | $L_{2-151}$ |
| COMPOUND 3922 | $L_{1-199}$ | $L_{2-152}$ |
| COMPOUND 3923 | $L_{1-199}$ | $L_{2-153}$ |
| COMPOUND 3924 | $L_{1-199}$ | $L_{2-154}$ |
| COMPOUND 3925 | $L_{1-199}$ | $L_{2-155}$ |
| COMPOUND 3926 | $L_{1-199}$ | $L_{2-156}$ |
| COMPOUND 3927 | $L_{1-199}$ | $L_{2-157}$ |
| COMPOUND 3928 | $L_{1-199}$ | $L_{2-158}$ |
| COMPOUND 3929 | $L_{1-199}$ | $L_{2-159}$ |
| COMPOUND 3930 | $L_{1-199}$ | $L_{2-160}$ |
| COMPOUND 3931 | $L_{1-199}$ | $L_{2-161}$ |
| COMPOUND 3932 | $L_{1-199}$ | $L_{2-162}$ |
| COMPOUND 3933 | $L_{1-199}$ | $L_{2-163}$ |
| COMPOUND 3934 | $L_{1-199}$ | $L_{2-164}$ |
| COMPOUND 3935 | $L_{1-199}$ | $L_{2-165}$ |
| COMPOUND 3936 | $L_{1-199}$ | $L_{2-166}$ |
| COMPOUND 3937 | $L_{1-199}$ | $L_{2-167}$ |
| COMPOUND 3938 | $L_{1-199}$ | $L_{2-168}$ |
| COMPOUND 3939 | $L_{1-199}$ | $L_{2-169}$ |
| COMPOUND 3940 | $L_{1-199}$ | $L_{2-170}$ |
| COMPOUND 3941 | $L_{1-199}$ | $L_{2-171}$ |
| COMPOUND 3942 | $L_{1-199}$ | $L_{2-172}$ |
| COMPOUND 3943 | $L_{1-199}$ | $L_{2-173}$ |
| COMPOUND 3944 | $L_{1-199}$ | $L_{2-174}$ |
| COMPOUND 3945 | $L_{1-199}$ | $L_{2-175}$ |
| COMPOUND 3946 | $L_{1-199}$ | $L_{2-176}$ |
| COMPOUND 3947 | $L_{1-199}$ | $L_{2-177}$ |
| COMPOUND 3948 | $L_{1-199}$ | $L_{2-178}$ |
| COMPOUND 3949 | $L_{1-199}$ | $L_{2-179}$ |
| COMPOUND 3950 | $L_{1-199}$ | $L_{2-180}$ |
| COMPOUND 3951 | $L_{1-199}$ | $L_{2-181}$ |
| COMPOUND 3952 | $L_{1-199}$ | $L_{2-182}$ |
| COMPOUND 3953 | $L_{1-199}$ | $L_{2-183}$ |
| COMPOUND 3954 | $L_{1-199}$ | $L_{2-184}$ |
| COMPOUND 3955 | $L_{1-199}$ | $L_{2-185}$ |
| COMPOUND 3956 | $L_{1-199}$ | $L_{2-186}$ |
| COMPOUND 3957 | $L_{1-199}$ | $L_{2-187}$ |

-continued

| | | |
|---|---|---|
| COMPOUND 3958 | $L_{1-199}$ | $L_{2-188}$ |
| COMPOUND 3959 | $L_{1-199}$ | $L_{2-189}$ |
| COMPOUND 3960 | $L_{1-199}$ | $L_{2-190}$ |
| COMPOUND 3961 | $L_{1-199}$ | $L_{2-191}$ |
| COMPOUND 3962 | $L_{1-199}$ | $L_{2-192}$ |
| COMPOUND 3963 | $L_{1-199}$ | $L_{2-193}$ |
| COMPOUND 3964 | $L_{1-199}$ | $L_{2-194}$ |
| COMPOUND 3965 | $L_{1-199}$ | $L_{2-195}$ |
| COMPOUND 3966 | $L_{1-199}$ | $L_{2-196}$ |
| COMPOUND 3967 | $L_{1-199}$ | $L_{2-197}$ |
| COMPOUND 3968 | $L_{1-199}$ | $L_{2-198}$ |
| COMPOUND 3969 | $L_{1-199}$ | $L_{2-199}$ |
| COMPOUND 3970 | $L_{1-199}$ | $L_{2-200}$ |
| COMPOUND 3971 | $L_{1-199}$ | $L_{2-201}$ |
| COMPOUND 3972 | $L_{1-199}$ | $L_{2-202}$ |
| COMPOUND 3973 | $L_{1-199}$ | $L_{2-203}$ |
| COMPOUND 3974 | $L_{1-199}$ | $L_{2-204}$ |
| COMPOUND 3975 | $L_{1-199}$ | $L_{2-205}$ |
| COMPOUND 3976 | $L_{1-199}$ | $L_{2-206}$ |
| COMPOUND 3977 | $L_{1-199}$ | $L_{2-207}$ |
| COMPOUND 3978 | $L_{1-199}$ | $L_{2-208}$ |
| COMPOUND 3979 | $L_{1-199}$ | $L_{2-209}$ |
| COMPOUND 3980 | $L_{1-199}$ | $L_{2-210}$ |
| COMPOUND 3981 | $L_{1-199}$ | $L_{2-211}$ |
| COMPOUND 3982 | $L_{1-199}$ | $L_{2-212}$ |
| COMPOUND 3983 | $L_{1-199}$ | $L_{2-213}$ |
| COMPOUND 3984 | $L_{1-199}$ | $L_{2-214}$ |
| COMPOUND 3985 | $L_{1-199}$ | $L_{2-215}$ |
| COMPOUND 3986 | $L_{1-199}$ | $L_{2-216}$ |
| COMPOUND 3987 | $L_{1-199}$ | $L_{2-217}$ |
| COMPOUND 3988 | $L_{1-199}$ | $L_{2-218}$ |
| COMPOUND 3989 | $L_{1-199}$ | $L_{2-219}$ |
| COMPOUND 3990 | $L_{1-199}$ | $L_{2-220}$ |
| COMPOUND 3991 | $L_{1-199}$ | $L_{2-221}$ |
| COMPOUND 3992 | $L_{1-199}$ | $L_{2-222}$ |
| COMPOUND 3993 | $L_{1-199}$ | $L_{2-223}$ |
| COMPOUND 3994 | $L_{1-199}$ | $L_{2-224}$ |
| COMPOUND 3995 | $L_{1-199}$ | $L_{2-225}$ |
| COMPOUND 3996 | $L_{1-199}$ | $L_{2-226}$ |
| COMPOUND 3997 | $L_{1-199}$ | $L_{2-227}$ |
| COMPOUND 3998 | $L_{1-199}$ | $L_{2-228}$ |
| COMPOUND 3999 | $L_{1-199}$ | $L_{2-229}$ |
| COMPOUND 4000 | $L_{1-199}$ | $L_{2-230}$ |
| COMPOUND 4001 | $L_{1-199}$ | $L_{2-231}$ |
| COMPOUND 4002 | $L_{1-199}$ | $L_{2-232}$ |
| COMPOUND 4003 | $L_{1-199}$ | $L_{2-233}$ |
| COMPOUND 4004 | $L_{1-199}$ | $L_{2-234}$ |
| COMPOUND 4005 | $L_{1-199}$ | $L_{2-235}$ |
| COMPOUND 4006 | $L_{1-199}$ | $L_{2-236}$ |
| COMPOUND 4007 | $L_{1-199}$ | $L_{2-237}$ |
| COMPOUND 4008 | $L_{1-199}$ | $L_{2-238}$ |
| COMPOUND 4009 | $L_{1-199}$ | $L_{2-239}$ |
| COMPOUND 4010 | $L_{1-199}$ | $L_{2-240}$ |
| COMPOUND 4011 | $L_{1-199}$ | $L_{2-241}$ |
| COMPOUND 4012 | $L_{1-199}$ | $L_{2-242}$ |
| COMPOUND 4013 | $L_{1-199}$ | $L_{2-243}$ |
| COMPOUND 4014 | $L_{1-199}$ | $L_{2-244}$ |
| COMPOUND 4015 | $L_{1-199}$ | $L_{2-245}$ |
| COMPOUND 4016 | $L_{1-199}$ | $L_{2-246}$ |
| COMPOUND 4017 | $L_{1-199}$ | $L_{2-247}$ |
| COMPOUND 4018 | $L_{1-199}$ | $L_{2-248}$ |
| COMPOUND 4019 | $L_{1-199}$ | $L_{2-249}$ |
| COMPOUND 4020 | $L_{1-199}$ | $L_{2-250}$ |
| COMPOUND 4021 | $L_{1-199}$ | $L_{2-251}$ |
| COMPOUND 4022 | $L_{1-199}$ | $L_{2-252}$ |
| COMPOUND 4023 | $L_{1-199}$ | $L_{2-253}$ |
| COMPOUND 4024 | $L_{1-199}$ | $L_{2-254}$ |
| COMPOUND 4025 | $L_{1-199}$ | $L_{2-255}$ |
| COMPOUND 4026 | $L_{1-199}$ | $L_{2-256}$ |
| COMPOUND 4027 | $L_{1-199}$ | $L_{2-257}$ |
| COMPOUND 4028 | $L_{1-199}$ | $L_{2-258}$ |
| COMPOUND 4029 | $L_{1-199}$ | $L_{2-259}$ |
| COMPOUND 4030 | $L_{1-199}$ | $L_{2-260}$ |
| COMPOUND 4031 | $L_{1-199}$ | $L_{2-261}$ |
| COMPOUND 4032 | $L_{1-199}$ | $L_{2-262}$ |
| COMPOUND 4033 | $L_{1-199}$ | $L_{2-263}$ |
| COMPOUND 4034 | $L_{1-199}$ | $L_{2-264}$ |
| COMPOUND 4035 | $L_{1-199}$ | $L_{2-265}$ |
| COMPOUND 4036 | $L_{1-199}$ | $L_{2-266}$ |

-continued

| | | |
|---|---|---|
| COMPOUND 4037 | $L_{1-199}$ | $L_{2-267}$ |
| COMPOUND 4038 | $L_{1-199}$ | $L_{2-268}$ |
| COMPOUND 4039 | $L_{1-199}$ | $L_{2-269}$ |
| COMPOUND 4040 | $L_{1-199}$ | $L_{2-270}$ |
| COMPOUND 4041 | $L_{1-199}$ | $L_{2-271}$ |
| COMPOUND 4042 | $L_{1-199}$ | $L_{2-272}$ |
| COMPOUND 4043 | $L_{1-199}$ | $L_{2-273}$ |
| COMPOUND 4044 | $L_{1-199}$ | $L_{2-274}$ |
| COMPOUND 4045 | $L_{1-199}$ | $L_{2-275}$ |
| COMPOUND 4046 | $L_{1-199}$ | $L_{2-276}$ |
| COMPOUND 4047 | $L_{1-199}$ | $L_{2-277}$ |
| COMPOUND 4048 | $L_{1-199}$ | $L_{2-278}$ |
| COMPOUND 4049 | $L_{1-199}$ | $L_{2-279}$ |
| COMPOUND 4050 | $L_{1-199}$ | $L_{2-280}$ |
| COMPOUND 4051 | $L_{1-199}$ | $L_{2-281}$ |
| COMPOUND 4052 | $L_{1-199}$ | $L_{2-282}$ |
| COMPOUND 4053 | $L_{1-199}$ | $L_{2-283}$ |
| COMPOUND 4054 | $L_{1-199}$ | $L_{2-284}$ |
| COMPOUND 4055 | $L_{1-199}$ | $L_{2-285}$ |
| COMPOUND 4056 | $L_{1-199}$ | $L_{2-286}$ |
| COMPOUND 4057 | $L_{1-199}$ | $L_{2-287}$ |
| COMPOUND 4058 | $L_{1-199}$ | $L_{2-288}$ |
| COMPOUND 4059 | $L_{1-199}$ | $L_{2-289}$ |
| COMPOUND 4060 | $L_{1-199}$ | $L_{2-290}$ |
| COMPOUND 4061 | $L_{1-199}$ | $L_{2-291}$ |
| COMPOUND 4062 | $L_{1-199}$ | $L_{2-292}$ |
| COMPOUND 4063 | $L_{1-199}$ | $L_{2-293}$ |
| COMPOUND 4064 | $L_{1-199}$ | $L_{2-294}$ |
| COMPOUND 4065 | $L_{1-199}$ | $L_{2-295}$ |
| COMPOUND 4066 | $L_{1-199}$ | $L_{2-296}$ |
| COMPOUND 4067 | $L_{1-199}$ | $L_{2-297}$ |
| COMPOUND 4068 | $L_{1-199}$ | $L_{2-298}$ |
| COMPOUND 4069 | $L_{1-199}$ | $L_{2-299}$ |
| COMPOUND 4070 | $L_{1-199}$ | $L_{2-300}$ |
| COMPOUND 4071 | $L_{1-199}$ | $L_{2-301}$ |
| COMPOUND 4072 | $L_{1-199}$ | $L_{2-302}$ |
| COMPOUND 4073 | $L_{1-199}$ | $L_{2-303}$ |
| COMPOUND 4074 | $L_{1-199}$ | $L_{2-304}$ |
| COMPOUND 4075 | $L_{1-199}$ | $L_{2-305}$ |
| COMPOUND 4076 | $L_{1-199}$ | $L_{2-306}$ |
| COMPOUND 4077 | $L_{1-199}$ | $L_{2-307}$ |
| COMPOUND 4078 | $L_{1-199}$ | $L_{2-308}$ |
| COMPOUND 4079 | $L_{1-199}$ | $L_{2-309}$ |
| COMPOUND 4080 | $L_{1-199}$ | $L_{2-310}$ |
| COMPOUND 4081 | $L_{1-199}$ | $L_{2-311}$ |
| COMPOUND 4082 | $L_{1-199}$ | $L_{2-312}$ |
| COMPOUND 4083 | $L_{1-199}$ | $L_{2-313}$ |
| COMPOUND 4084 | $L_{1-199}$ | $L_{2-314}$ |
| COMPOUND 4085 | $L_{1-199}$ | $L_{2-315}$ |
| COMPOUND 4086 | $L_{1-199}$ | $L_{2-316}$ |
| COMPOUND 4087 | $L_{1-199}$ | $L_{2-317}$ |
| COMPOUND 4088 | $L_{1-199}$ | $L_{2-318}$ |
| COMPOUND 4089 | $L_{1-199}$ | $L_{2-319}$ |
| COMPOUND 4090 | $L_{1-199}$ | $L_{2-320}$ |
| COMPOUND 4091 | $L_{1-199}$ | $L_{2-321}$ |
| COMPOUND 4092 | $L_{1-199}$ | $L_{2-322}$ |
| COMPOUND 4093 | $L_{1-199}$ | $L_{2-323}$ |
| COMPOUND 4094 | $L_{1-199}$ | $L_{2-324}$ |
| COMPOUND 4095 | $L_{1-199}$ | $L_{2-325}$ |
| COMPOUND 4096 | $L_{1-199}$ | $L_{2-326}$ |
| COMPOUND 4097 | $L_{1-199}$ | $L_{2-327}$ |
| COMPOUND 4098 | $L_{1-199}$ | $L_{2-328}$ |
| COMPOUND 4099 | $L_{1-199}$ | $L_{2-329}$ |
| COMPOUND 4100 | $L_{1-199}$ | $L_{2-330}$ |
| COMPOUND 4101 | $L_{1-199}$ | $L_{2-331}$ |
| COMPOUND 4102 | $L_{1-199}$ | $L_{2-332}$ |
| COMPOUND 4103 | $L_{1-199}$ | $L_{2-333}$ |
| COMPOUND 4104 | $L_{1-199}$ | $L_{2-334}$ |
| COMPOUND 4105 | $L_{1-199}$ | $L_{2-335}$ |
| COMPOUND 4106 | $L_{1-199}$ | $L_{2-336}$ |
| COMPOUND 4107 | $L_{1-199}$ | $L_{2-337}$ |
| COMPOUND 4108 | $L_{1-199}$ | $L_{2-338}$ |
| COMPOUND 4109 | $L_{1-199}$ | $L_{2-339}$ |
| COMPOUND 4110 | $L_{1-199}$ | $L_{2-340}$ |
| COMPOUND 4111 | $L_{1-199}$ | $L_{2-341}$ |
| COMPOUND 4112 | $L_{1-199}$ | $L_{2-342}$ |
| COMPOUND 4113 | $L_{1-199}$ | $L_{2-343}$ |
| COMPOUND 4114 | $L_{1-199}$ | $L_{2-344}$ |
| COMPOUND 4115 | $L_{1-199}$ | $L_{2-345}$ |

-continued

| | | |
|---|---|---|
| COMPOUND 4116 | $L_{1-199}$ | $L_{2-346}$ |
| COMPOUND 4117 | $L_{1-199}$ | $L_{2-347}$ |
| COMPOUND 4118 | $L_{1-199}$ | $L_{2-348}$ |
| COMPOUND 4119 | $L_{1-199}$ | $L_{2-349}$ |
| COMPOUND 4120 | $L_{1-199}$ | $L_{2-350}$ |
| COMPOUND 4121 | $L_{1-199}$ | $L_{2-351}$ |
| COMPOUND 4122 | $L_{1-199}$ | $L_{2-352}$ |
| COMPOUND 4123 | $L_{1-199}$ | $L_{2-353}$ |
| COMPOUND 4124 | $L_{1-199}$ | $L_{2-354}$ |
| COMPOUND 4125 | $L_{1-199}$ | $L_{2-355}$ |
| COMPOUND 4126 | $L_{1-199}$ | $L_{2-356}$ |
| COMPOUND 4127 | $L_{1-199}$ | $L_{2-357}$ |
| COMPOUND 4128 | $L_{1-199}$ | $L_{2-358}$ |
| COMPOUND 4129 | $L_{1-199}$ | $L_{2-359}$ |
| COMPOUND 4130 | $L_{1-199}$ | $L_{2-360}$ |
| COMPOUND 4131 | $L_{1-199}$ | $L_{2-361}$ |
| COMPOUND 4132 | $L_{1-199}$ | $L_{2-362}$ |
| COMPOUND 4133 | $L_{1-199}$ | $L_{2-363}$ |
| COMPOUND 4134 | $L_{1-199}$ | $L_{2-364}$ |
| COMPOUND 4135 | $L_{1-199}$ | $L_{2-365}$ |
| COMPOUND 4136 | $L_{1-199}$ | $L_{2-366}$ |
| COMPOUND 4137 | $L_{1-199}$ | $L_{2-367}$ |
| COMPOUND 4138 | $L_{1-199}$ | $L_{2-368}$ |
| COMPOUND 4139 | $L_{1-199}$ | $L_{2-369}$ |
| COMPOUND 4140 | $L_{1-199}$ | $L_{2-370}$ |
| COMPOUND 4141 | $L_{1-199}$ | $L_{2-371}$ |
| COMPOUND 4142 | $L_{1-199}$ | $L_{2-372}$ |
| COMPOUND 4143 | $L_{1-199}$ | $L_{2-373}$ |
| COMPOUND 4144 | $L_{1-199}$ | $L_{2-374}$ |
| COMPOUND 4145 | $L_{1-199}$ | $L_{2-375}$ |
| COMPOUND 4146 | $L_{1-199}$ | $L_{2-376}$ |
| COMPOUND 4147 | $L_{1-199}$ | $L_{2-377}$ |
| COMPOUND 4148 | $L_{1-200}$ | $L_{2-1}$ |
| COMPOUND 4149 | $L_{1-200}$ | $L_{2-2}$ |
| COMPOUND 4150 | $L_{1-200}$ | $L_{2-3}$ |
| COMPOUND 4151 | $L_{1-200}$ | $L_{2-4}$ |
| COMPOUND 4152 | $L_{1-200}$ | $L_{2-5}$ |
| COMPOUND 4153 | $L_{1-200}$ | $L_{2-6}$ |
| COMPOUND 4154 | $L_{1-200}$ | $L_{2-7}$ |
| COMPOUND 4155 | $L_{1-200}$ | $L_{2-8}$ |
| COMPOUND 4156 | $L_{1-200}$ | $L_{2-9}$ |
| COMPOUND 4157 | $L_{1-200}$ | $L_{2-10}$ |
| COMPOUND 4158 | $L_{1-200}$ | $L_{2-11}$ |
| COMPOUND 4159 | $L_{1-200}$ | $L_{2-12}$ |
| COMPOUND 4160 | $L_{1-200}$ | $L_{2-13}$ |
| COMPOUND 4161 | $L_{1-200}$ | $L_{2-14}$ |
| COMPOUND 4162 | $L_{1-200}$ | $L_{2-15}$ |
| COMPOUND 4163 | $L_{1-200}$ | $L_{2-16}$ |
| COMPOUND 4164 | $L_{1-200}$ | $L_{2-17}$ |
| COMPOUND 4165 | $L_{1-200}$ | $L_{2-18}$ |
| COMPOUND 4166 | $L_{1-200}$ | $L_{2-19}$ |
| COMPOUND 4167 | $L_{1-200}$ | $L_{2-20}$ |
| COMPOUND 4168 | $L_{1-200}$ | $L_{2-21}$ |
| COMPOUND 4169 | $L_{1-200}$ | $L_{2-22}$ |
| COMPOUND 4170 | $L_{1-200}$ | $L_{2-23}$ |
| COMPOUND 4171 | $L_{1-200}$ | $L_{2-24}$ |
| COMPOUND 4172 | $L_{1-200}$ | $L_{2-25}$ |
| COMPOUND 4173 | $L_{1-200}$ | $L_{2-26}$ |
| COMPOUND 4174 | $L_{1-200}$ | $L_{2-27}$ |
| COMPOUND 4175 | $L_{1-200}$ | $L_{2-28}$ |
| COMPOUND 4176 | $L_{1-200}$ | $L_{2-29}$ |
| COMPOUND 4177 | $L_{1-200}$ | $L_{2-30}$ |
| COMPOUND 4178 | $L_{1-200}$ | $L_{2-31}$ |
| COMPOUND 4179 | $L_{1-200}$ | $L_{2-32}$ |
| COMPOUND 4180 | $L_{1-200}$ | $L_{2-33}$ |
| COMPOUND 4181 | $L_{1-200}$ | $L_{2-34}$ |
| COMPOUND 4182 | $L_{1-200}$ | $L_{2-35}$ |
| COMPOUND 4183 | $L_{1-200}$ | $L_{2-36}$ |
| COMPOUND 4184 | $L_{1-200}$ | $L_{2-37}$ |
| COMPOUND 4185 | $L_{1-200}$ | $L_{2-38}$ |
| COMPOUND 4186 | $L_{1-200}$ | $L_{2-39}$ |
| COMPOUND 4187 | $L_{1-200}$ | $L_{2-40}$ |
| COMPOUND 4188 | $L_{1-200}$ | $L_{2-41}$ |
| COMPOUND 4189 | $L_{1-200}$ | $L_{2-42}$ |
| COMPOUND 4190 | $L_{1-200}$ | $L_{2-43}$ |
| COMPOUND 4191 | $L_{1-200}$ | $L_{2-44}$ |
| COMPOUND 4192 | $L_{1-200}$ | $L_{2-45}$ |
| COMPOUND 4193 | $L_{1-200}$ | $L_{2-46}$ |
| COMPOUND 4194 | $L_{1-200}$ | $L_{2-47}$ |
| COMPOUND 4195 | $L_{1-200}$ | $L_{2-48}$ |
| COMPOUND 4196 | $L_{1-200}$ | $L_{2-49}$ |
| COMPOUND 4197 | $L_{1-200}$ | $L_{2-50}$ |
| COMPOUND 4198 | $L_{1-200}$ | $L_{2-51}$ |
| COMPOUND 4199 | $L_{1-200}$ | $L_{2-52}$ |
| COMPOUND 4200 | $L_{1-200}$ | $L_{2-53}$ |
| COMPOUND 4201 | $L_{1-200}$ | $L_{2-54}$ |
| COMPOUND 4202 | $L_{1-200}$ | $L_{2-55}$ |
| COMPOUND 4203 | $L_{1-200}$ | $L_{2-56}$ |
| COMPOUND 4204 | $L_{1-200}$ | $L_{2-57}$ |
| COMPOUND 4205 | $L_{1-200}$ | $L_{2-58}$ |
| COMPOUND 4206 | $L_{1-200}$ | $L_{2-59}$ |
| COMPOUND 4207 | $L_{1-200}$ | $L_{2-60}$ |
| COMPOUND 4208 | $L_{1-200}$ | $L_{2-61}$ |
| COMPOUND 4209 | $L_{1-200}$ | $L_{2-62}$ |
| COMPOUND 4210 | $L_{1-200}$ | $L_{2-63}$ |
| COMPOUND 4211 | $L_{1-200}$ | $L_{2-64}$ |
| COMPOUND 4212 | $L_{1-200}$ | $L_{2-65}$ |
| COMPOUND 4213 | $L_{1-200}$ | $L_{2-66}$ |
| COMPOUND 4214 | $L_{1-200}$ | $L_{2-67}$ |
| COMPOUND 4215 | $L_{1-200}$ | $L_{2-68}$ |
| COMPOUND 4216 | $L_{1-200}$ | $L_{2-69}$ |
| COMPOUND 4217 | $L_{1-200}$ | $L_{2-70}$ |
| COMPOUND 4218 | $L_{1-200}$ | $L_{2-71}$ |
| COMPOUND 4219 | $L_{1-200}$ | $L_{2-72}$ |
| COMPOUND 4220 | $L_{1-200}$ | $L_{2-73}$ |
| COMPOUND 4221 | $L_{1-200}$ | $L_{2-74}$ |
| COMPOUND 4222 | $L_{1-200}$ | $L_{2-75}$ |
| COMPOUND 4223 | $L_{1-200}$ | $L_{2-76}$ |
| COMPOUND 4224 | $L_{1-200}$ | $L_{2-77}$ |
| COMPOUND 4225 | $L_{1-200}$ | $L_{2-78}$ |
| COMPOUND 4226 | $L_{1-200}$ | $L_{2-79}$ |
| COMPOUND 4227 | $L_{1-200}$ | $L_{2-80}$ |
| COMPOUND 4228 | $L_{1-200}$ | $L_{2-81}$ |
| COMPOUND 4229 | $L_{1-200}$ | $L_{2-82}$ |
| COMPOUND 4230 | $L_{1-200}$ | $L_{2-83}$ |
| COMPOUND 4231 | $L_{1-200}$ | $L_{2-84}$ |
| COMPOUND 4232 | $L_{1-200}$ | $L_{2-85}$ |
| COMPOUND 4233 | $L_{1-200}$ | $L_{2-86}$ |
| COMPOUND 4234 | $L_{1-200}$ | $L_{2-87}$ |
| COMPOUND 4235 | $L_{1-200}$ | $L_{2-88}$ |
| COMPOUND 4236 | $L_{1-200}$ | $L_{2-89}$ |
| COMPOUND 4237 | $L_{1-200}$ | $L_{2-90}$ |
| COMPOUND 4238 | $L_{1-200}$ | $L_{2-91}$ |
| COMPOUND 4239 | $L_{1-200}$ | $L_{2-92}$ |
| COMPOUND 4240 | $L_{1-200}$ | $L_{2-93}$ |
| COMPOUND 4241 | $L_{1-200}$ | $L_{2-94}$ |
| COMPOUND 4242 | $L_{1-200}$ | $L_{2-95}$ |
| COMPOUND 4243 | $L_{1-200}$ | $L_{2-96}$ |
| COMPOUND 4244 | $L_{1-200}$ | $L_{2-97}$ |
| COMPOUND 4245 | $L_{1-200}$ | $L_{2-98}$ |
| COMPOUND 4246 | $L_{1-200}$ | $L_{2-99}$ |
| COMPOUND 4247 | $L_{1-200}$ | $L_{2-100}$ |
| COMPOUND 4248 | $L_{1-200}$ | $L_{2-101}$ |
| COMPOUND 4249 | $L_{1-200}$ | $L_{2-102}$ |
| COMPOUND 4250 | $L_{1-200}$ | $L_{2-103}$ |
| COMPOUND 4251 | $L_{1-200}$ | $L_{2-104}$ |
| COMPOUND 4252 | $L_{1-200}$ | $L_{2-105}$ |
| COMPOUND 4253 | $L_{1-200}$ | $L_{2-106}$ |
| COMPOUND 4254 | $L_{1-200}$ | $L_{2-107}$ |
| COMPOUND 4255 | $L_{1-200}$ | $L_{2-108}$ |
| COMPOUND 4256 | $L_{1-200}$ | $L_{2-109}$ |
| COMPOUND 4257 | $L_{1-200}$ | $L_{2-110}$ |
| COMPOUND 4258 | $L_{1-200}$ | $L_{2-111}$ |
| COMPOUND 4259 | $L_{1-200}$ | $L_{2-112}$ |
| COMPOUND 4260 | $L_{1-200}$ | $L_{2-113}$ |
| COMPOUND 4261 | $L_{1-200}$ | $L_{2-114}$ |
| COMPOUND 4262 | $L_{1-200}$ | $L_{2-115}$ |
| COMPOUND 4263 | $L_{1-200}$ | $L_{2-116}$ |
| COMPOUND 4264 | $L_{1-200}$ | $L_{2-117}$ |
| COMPOUND 4265 | $L_{1-200}$ | $L_{2-118}$ |
| COMPOUND 4266 | $L_{1-200}$ | $L_{2-119}$ |
| COMPOUND 4267 | $L_{1-200}$ | $L_{2-120}$ |
| COMPOUND 4268 | $L_{1-200}$ | $L_{2-121}$ |
| COMPOUND 4269 | $L_{1-200}$ | $L_{2-122}$ |
| COMPOUND 4270 | $L_{1-200}$ | $L_{2-123}$ |
| COMPOUND 4271 | $L_{1-200}$ | $L_{2-124}$ |
| COMPOUND 4272 | $L_{1-200}$ | $L_{2-125}$ |
| COMPOUND 4273 | $L_{1-200}$ | $L_{2-126}$ |

-continued

| | | |
|---|---|---|
| COMPOUND 4274 | $L_{1-200}$ | $L_{2-127}$ |
| COMPOUND 4275 | $L_{1-200}$ | $L_{2-128}$ |
| COMPOUND 4276 | $L_{1-200}$ | $L_{2-129}$ |
| COMPOUND 4277 | $L_{1-200}$ | $L_{2-130}$ |
| COMPOUND 4278 | $L_{1-200}$ | $L_{2-131}$ |
| COMPOUND 4279 | $L_{1-200}$ | $L_{2-132}$ |
| COMPOUND 4280 | $L_{1-200}$ | $L_{2-133}$ |
| COMPOUND 4281 | $L_{1-200}$ | $L_{2-134}$ |
| COMPOUND 4282 | $L_{1-200}$ | $L_{2-135}$ |
| COMPOUND 4283 | $L_{1-200}$ | $L_{2-136}$ |
| COMPOUND 4284 | $L_{1-200}$ | $L_{2-137}$ |
| COMPOUND 4285 | $L_{1-200}$ | $L_{2-138}$ |
| COMPOUND 4286 | $L_{1-200}$ | $L_{2-139}$ |
| COMPOUND 4287 | $L_{1-200}$ | $L_{2-140}$ |
| COMPOUND 4288 | $L_{1-200}$ | $L_{2-141}$ |
| COMPOUND 4289 | $L_{1-200}$ | $L_{2-142}$ |
| COMPOUND 4290 | $L_{1-200}$ | $L_{2-143}$ |
| COMPOUND 4291 | $L_{1-200}$ | $L_{2-144}$ |
| COMPOUND 4292 | $L_{1-200}$ | $L_{2-145}$ |
| COMPOUND 4293 | $L_{1-200}$ | $L_{2-146}$ |
| COMPOUND 4294 | $L_{1-200}$ | $L_{2-147}$ |
| COMPOUND 4295 | $L_{1-200}$ | $L_{2-148}$ |
| COMPOUND 4296 | $L_{1-200}$ | $L_{2-149}$ |
| COMPOUND 4297 | $L_{1-200}$ | $L_{2-150}$ |
| COMPOUND 4298 | $L_{1-200}$ | $L_{2-151}$ |
| COMPOUND 4299 | $L_{1-200}$ | $L_{2-152}$ |
| COMPOUND 4300 | $L_{1-200}$ | $L_{2-153}$ |
| COMPOUND 4301 | $L_{1-200}$ | $L_{2-154}$ |
| COMPOUND 4302 | $L_{1-200}$ | $L_{2-155}$ |
| COMPOUND 4303 | $L_{1-200}$ | $L_{2-156}$ |
| COMPOUND 4304 | $L_{1-200}$ | $L_{2-157}$ |
| COMPOUND 4305 | $L_{1-200}$ | $L_{2-158}$ |
| COMPOUND 4306 | $L_{1-200}$ | $L_{2-159}$ |
| COMPOUND 4307 | $L_{1-200}$ | $L_{2-160}$ |
| COMPOUND 4308 | $L_{1-200}$ | $L_{2-161}$ |
| COMPOUND 4309 | $L_{1-200}$ | $L_{2-162}$ |
| COMPOUND 4310 | $L_{1-200}$ | $L_{2-163}$ |
| COMPOUND 4311 | $L_{1-200}$ | $L_{2-164}$ |
| COMPOUND 4312 | $L_{1-200}$ | $L_{2-165}$ |
| COMPOUND 4313 | $L_{1-200}$ | $L_{2-166}$ |
| COMPOUND 4314 | $L_{1-200}$ | $L_{2-167}$ |
| COMPOUND 4315 | $L_{1-200}$ | $L_{2-168}$ |
| COMPOUND 4316 | $L_{1-200}$ | $L_{2-169}$ |
| COMPOUND 4317 | $L_{1-200}$ | $L_{2-170}$ |
| COMPOUND 4318 | $L_{1-200}$ | $L_{2-171}$ |
| COMPOUND 4319 | $L_{1-200}$ | $L_{2-172}$ |
| COMPOUND 4320 | $L_{1-200}$ | $L_{2-173}$ |
| COMPOUND 4321 | $L_{1-200}$ | $L_{2-174}$ |
| COMPOUND 4322 | $L_{1-200}$ | $L_{2-175}$ |
| COMPOUND 4323 | $L_{1-200}$ | $L_{2-176}$ |
| COMPOUND 4324 | $L_{1-200}$ | $L_{2-177}$ |
| COMPOUND 4325 | $L_{1-200}$ | $L_{2-178}$ |
| COMPOUND 4326 | $L_{1-200}$ | $L_{2-179}$ |
| COMPOUND 4327 | $L_{1-200}$ | $L_{2-180}$ |
| COMPOUND 4328 | $L_{1-200}$ | $L_{2-181}$ |
| COMPOUND 4329 | $L_{1-200}$ | $L_{2-182}$ |
| COMPOUND 4330 | $L_{1-200}$ | $L_{2-183}$ |
| COMPOUND 4331 | $L_{1-200}$ | $L_{2-184}$ |
| COMPOUND 4332 | $L_{1-200}$ | $L_{2-185}$ |
| COMPOUND 4333 | $L_{1-200}$ | $L_{2-186}$ |
| COMPOUND 4334 | $L_{1-200}$ | $L_{2-187}$ |
| COMPOUND 4335 | $L_{1-200}$ | $L_{2-188}$ |
| COMPOUND 4336 | $L_{1-200}$ | $L_{2-189}$ |
| COMPOUND 4337 | $L_{1-200}$ | $L_{2-190}$ |
| COMPOUND 4338 | $L_{1-200}$ | $L_{2-191}$ |
| COMPOUND 4339 | $L_{1-200}$ | $L_{2-192}$ |
| COMPOUND 4340 | $L_{1-200}$ | $L_{2-193}$ |
| COMPOUND 4341 | $L_{1-200}$ | $L_{2-194}$ |
| COMPOUND 4342 | $L_{1-200}$ | $L_{2-195}$ |
| COMPOUND 4343 | $L_{1-200}$ | $L_{2-196}$ |
| COMPOUND 4344 | $L_{1-200}$ | $L_{2-197}$ |
| COMPOUND 4345 | $L_{1-200}$ | $L_{2-198}$ |
| COMPOUND 4346 | $L_{1-200}$ | $L_{2-199}$ |
| COMPOUND 4347 | $L_{1-200}$ | $L_{2-200}$ |
| COMPOUND 4348 | $L_{1-200}$ | $L_{2-201}$ |
| COMPOUND 4349 | $L_{1-200}$ | $L_{2-202}$ |
| COMPOUND 4350 | $L_{1-200}$ | $L_{2-203}$ |
| COMPOUND 4351 | $L_{1-200}$ | $L_{2-204}$ |
| COMPOUND 4352 | $L_{1-200}$ | $L_{2-205}$ |

-continued

| | | |
|---|---|---|
| COMPOUND 4353 | $L_{1-200}$ | $L_{2-206}$ |
| COMPOUND 4354 | $L_{1-200}$ | $L_{2-207}$ |
| COMPOUND 4355 | $L_{1-200}$ | $L_{2-208}$ |
| COMPOUND 4356 | $L_{1-200}$ | $L_{2-209}$ |
| COMPOUND 4357 | $L_{1-200}$ | $L_{2-210}$ |
| COMPOUND 4358 | $L_{1-200}$ | $L_{2-211}$ |
| COMPOUND 4359 | $L_{1-200}$ | $L_{2-212}$ |
| COMPOUND 4360 | $L_{1-200}$ | $L_{2-213}$ |
| COMPOUND 4361 | $L_{1-200}$ | $L_{2-214}$ |
| COMPOUND 4362 | $L_{1-200}$ | $L_{2-215}$ |
| COMPOUND 4363 | $L_{1-200}$ | $L_{2-216}$ |
| COMPOUND 4364 | $L_{1-200}$ | $L_{2-217}$ |
| COMPOUND 4365 | $L_{1-200}$ | $L_{2-218}$ |
| COMPOUND 4366 | $L_{1-200}$ | $L_{2-219}$ |
| COMPOUND 4367 | $L_{1-200}$ | $L_{2-220}$ |
| COMPOUND 4368 | $L_{1-200}$ | $L_{2-221}$ |
| COMPOUND 4369 | $L_{1-200}$ | $L_{2-222}$ |
| COMPOUND 4370 | $L_{1-200}$ | $L_{2-223}$ |
| COMPOUND 4371 | $L_{1-200}$ | $L_{2-224}$ |
| COMPOUND 4372 | $L_{1-200}$ | $L_{2-225}$ |
| COMPOUND 4373 | $L_{1-200}$ | $L_{2-226}$ |
| COMPOUND 4374 | $L_{1-200}$ | $L_{2-227}$ |
| COMPOUND 4375 | $L_{1-200}$ | $L_{2-228}$ |
| COMPOUND 4376 | $L_{1-200}$ | $L_{2-229}$ |
| COMPOUND 4377 | $L_{1-200}$ | $L_{2-230}$ |
| COMPOUND 4378 | $L_{1-200}$ | $L_{2-231}$ |
| COMPOUND 4379 | $L_{1-200}$ | $L_{2-232}$ |
| COMPOUND 4380 | $L_{1-200}$ | $L_{2-233}$ |
| COMPOUND 4381 | $L_{1-200}$ | $L_{2-234}$ |
| COMPOUND 4382 | $L_{1-200}$ | $L_{2-235}$ |
| COMPOUND 4383 | $L_{1-200}$ | $L_{2-236}$ |
| COMPOUND 4384 | $L_{1-200}$ | $L_{2-237}$ |
| COMPOUND 4385 | $L_{1-200}$ | $L_{2-238}$ |
| COMPOUND 4386 | $L_{1-200}$ | $L_{2-239}$ |
| COMPOUND 4387 | $L_{1-200}$ | $L_{2-240}$ |
| COMPOUND 4388 | $L_{1-200}$ | $L_{2-241}$ |
| COMPOUND 4389 | $L_{1-200}$ | $L_{2-242}$ |
| COMPOUND 4390 | $L_{1-200}$ | $L_{2-243}$ |
| COMPOUND 4391 | $L_{1-200}$ | $L_{2-244}$ |
| COMPOUND 4392 | $L_{1-200}$ | $L_{2-245}$ |
| COMPOUND 4393 | $L_{1-200}$ | $L_{2-246}$ |
| COMPOUND 4394 | $L_{1-200}$ | $L_{2-247}$ |
| COMPOUND 4395 | $L_{1-200}$ | $L_{2-248}$ |
| COMPOUND 4396 | $L_{1-200}$ | $L_{2-249}$ |
| COMPOUND 4397 | $L_{1-200}$ | $L_{2-250}$ |
| COMPOUND 4398 | $L_{1-200}$ | $L_{2-251}$ |
| COMPOUND 4399 | $L_{1-200}$ | $L_{2-252}$ |
| COMPOUND 4400 | $L_{1-200}$ | $L_{2-253}$ |
| COMPOUND 4401 | $L_{1-200}$ | $L_{2-254}$ |
| COMPOUND 4402 | $L_{1-200}$ | $L_{2-255}$ |
| COMPOUND 4403 | $L_{1-200}$ | $L_{2-256}$ |
| COMPOUND 4404 | $L_{1-200}$ | $L_{2-257}$ |
| COMPOUND 4405 | $L_{1-200}$ | $L_{2-258}$ |
| COMPOUND 4406 | $L_{1-200}$ | $L_{2-259}$ |
| COMPOUND 4407 | $L_{1-200}$ | $L_{2-260}$ |
| COMPOUND 4408 | $L_{1-200}$ | $L_{2-261}$ |
| COMPOUND 4409 | $L_{1-200}$ | $L_{2-262}$ |
| COMPOUND 4410 | $L_{1-200}$ | $L_{2-263}$ |
| COMPOUND 4411 | $L_{1-200}$ | $L_{2-264}$ |
| COMPOUND 4412 | $L_{1-200}$ | $L_{2-265}$ |
| COMPOUND 4413 | $L_{1-200}$ | $L_{2-266}$ |
| COMPOUND 4414 | $L_{1-200}$ | $L_{2-267}$ |
| COMPOUND 4415 | $L_{1-200}$ | $L_{2-268}$ |
| COMPOUND 4416 | $L_{1-200}$ | $L_{2-269}$ |
| COMPOUND 4417 | $L_{1-200}$ | $L_{2-270}$ |
| COMPOUND 4418 | $L_{1-200}$ | $L_{2-271}$ |
| COMPOUND 4419 | $L_{1-200}$ | $L_{2-272}$ |
| COMPOUND 4420 | $L_{1-200}$ | $L_{2-273}$ |
| COMPOUND 4421 | $L_{1-200}$ | $L_{2-274}$ |
| COMPOUND 4422 | $L_{1-200}$ | $L_{2-275}$ |
| COMPOUND 4423 | $L_{1-200}$ | $L_{2-276}$ |
| COMPOUND 4424 | $L_{1-200}$ | $L_{2-277}$ |
| COMPOUND 4425 | $L_{1-200}$ | $L_{2-278}$ |
| COMPOUND 4426 | $L_{1-200}$ | $L_{2-279}$ |
| COMPOUND 4427 | $L_{1-200}$ | $L_{2-280}$ |
| COMPOUND 4428 | $L_{1-200}$ | $L_{2-281}$ |
| COMPOUND 4429 | $L_{1-200}$ | $L_{2-282}$ |
| COMPOUND 4430 | $L_{1-200}$ | $L_{2-283}$ |
| COMPOUND 4431 | $L_{1-200}$ | $L_{2-284}$ |

-continued

| | | |
|---|---|---|
| COMPOUND 4432 | $L_{1-200}$ | $L_{2-285}$ |
| COMPOUND 4433 | $L_{1-200}$ | $L_{2-286}$ |
| COMPOUND 4434 | $L_{1-200}$ | $L_{2-287}$ |
| COMPOUND 4435 | $L_{1-200}$ | $L_{2-288}$ |
| COMPOUND 4436 | $L_{1-200}$ | $L_{2-289}$ |
| COMPOUND 4437 | $L_{1-200}$ | $L_{2-290}$ |
| COMPOUND 4438 | $L_{1-200}$ | $L_{2-291}$ |
| COMPOUND 4439 | $L_{1-200}$ | $L_{2-292}$ |
| COMPOUND 4440 | $L_{1-200}$ | $L_{2-293}$ |
| COMPOUND 4441 | $L_{1-200}$ | $L_{2-294}$ |
| COMPOUND 4442 | $L_{1-200}$ | $L_{2-295}$ |
| COMPOUND 4443 | $L_{1-200}$ | $L_{2-296}$ |
| COMPOUND 4444 | $L_{1-200}$ | $L_{2-297}$ |
| COMPOUND 4445 | $L_{1-200}$ | $L_{2-298}$ |
| COMPOUND 4446 | $L_{1-200}$ | $L_{2-299}$ |
| COMPOUND 4447 | $L_{1-200}$ | $L_{2-300}$ |
| COMPOUND 4448 | $L_{1-200}$ | $L_{2-301}$ |
| COMPOUND 4449 | $L_{1-200}$ | $L_{2-302}$ |
| COMPOUND 4450 | $L_{1-200}$ | $L_{2-303}$ |
| COMPOUND 4451 | $L_{1-200}$ | $L_{2-304}$ |
| COMPOUND 4452 | $L_{1-200}$ | $L_{2-305}$ |
| COMPOUND 4453 | $L_{1-200}$ | $L_{2-306}$ |
| COMPOUND 4454 | $L_{1-200}$ | $L_{2-307}$ |
| COMPOUND 4455 | $L_{1-200}$ | $L_{2-308}$ |
| COMPOUND 4456 | $L_{1-200}$ | $L_{2-309}$ |
| COMPOUND 4457 | $L_{1-200}$ | $L_{2-310}$ |
| COMPOUND 4458 | $L_{1-200}$ | $L_{2-311}$ |
| COMPOUND 4459 | $L_{1-200}$ | $L_{2-312}$ |
| COMPOUND 4460 | $L_{1-200}$ | $L_{2-313}$ |
| COMPOUND 4461 | $L_{1-200}$ | $L_{2-314}$ |
| COMPOUND 4462 | $L_{1-200}$ | $L_{2-315}$ |
| COMPOUND 4463 | $L_{1-200}$ | $L_{2-316}$ |
| COMPOUND 4464 | $L_{1-200}$ | $L_{2-317}$ |
| COMPOUND 4465 | $L_{1-200}$ | $L_{2-318}$ |
| COMPOUND 4466 | $L_{1-200}$ | $L_{2-319}$ |
| COMPOUND 4467 | $L_{1-200}$ | $L_{2-320}$ |
| COMPOUND 4468 | $L_{1-200}$ | $L_{2-321}$ |
| COMPOUND 4469 | $L_{1-200}$ | $L_{2-322}$ |
| COMPOUND 4470 | $L_{1-200}$ | $L_{2-323}$ |
| COMPOUND 4471 | $L_{1-200}$ | $L_{2-324}$ |
| COMPOUND 4472 | $L_{1-200}$ | $L_{2-325}$ |
| COMPOUND 4473 | $L_{1-200}$ | $L_{2-326}$ |
| COMPOUND 4474 | $L_{1-200}$ | $L_{2-327}$ |
| COMPOUND 4475 | $L_{1-200}$ | $L_{2-328}$ |
| COMPOUND 4476 | $L_{1-200}$ | $L_{2-329}$ |
| COMPOUND 4477 | $L_{1-200}$ | $L_{2-330}$ |
| COMPOUND 4478 | $L_{1-200}$ | $L_{2-331}$ |
| COMPOUND 4479 | $L_{1-200}$ | $L_{2-332}$ |
| COMPOUND 4480 | $L_{1-200}$ | $L_{2-333}$ |
| COMPOUND 4481 | $L_{1-200}$ | $L_{2-334}$ |
| COMPOUND 4482 | $L_{1-200}$ | $L_{2-335}$ |
| COMPOUND 4483 | $L_{1-200}$ | $L_{2-336}$ |
| COMPOUND 4484 | $L_{1-200}$ | $L_{2-337}$ |
| COMPOUND 4485 | $L_{1-200}$ | $L_{2-338}$ |
| COMPOUND 4486 | $L_{1-200}$ | $L_{2-339}$ |
| COMPOUND 4487 | $L_{1-200}$ | $L_{2-340}$ |
| COMPOUND 4488 | $L_{1-200}$ | $L_{2-341}$ |
| COMPOUND 4489 | $L_{1-200}$ | $L_{2-342}$ |
| COMPOUND 4490 | $L_{1-200}$ | $L_{2-343}$ |
| COMPOUND 4491 | $L_{1-200}$ | $L_{2-344}$ |
| COMPOUND 4492 | $L_{1-200}$ | $L_{2-345}$ |
| COMPOUND 4493 | $L_{1-200}$ | $L_{2-346}$ |
| COMPOUND 4494 | $L_{1-200}$ | $L_{2-347}$ |
| COMPOUND 4495 | $L_{1-200}$ | $L_{2-348}$ |
| COMPOUND 4496 | $L_{1-200}$ | $L_{2-349}$ |
| COMPOUND 4497 | $L_{1-200}$ | $L_{2-350}$ |
| COMPOUND 4498 | $L_{1-200}$ | $L_{2-351}$ |
| COMPOUND 4499 | $L_{1-200}$ | $L_{2-352}$ |
| COMPOUND 4500 | $L_{1-200}$ | $L_{2-353}$ |
| COMPOUND 4501 | $L_{1-200}$ | $L_{2-354}$ |
| COMPOUND 4502 | $L_{1-200}$ | $L_{2-355}$ |
| COMPOUND 4503 | $L_{1-200}$ | $L_{2-356}$ |
| COMPOUND 4504 | $L_{1-200}$ | $L_{2-357}$ |
| COMPOUND 4505 | $L_{1-200}$ | $L_{2-358}$ |
| COMPOUND 4506 | $L_{1-200}$ | $L_{2-359}$ |
| COMPOUND 4507 | $L_{1-200}$ | $L_{2-360}$ |
| COMPOUND 4508 | $L_{1-200}$ | $L_{2-361}$ |
| COMPOUND 4509 | $L_{1-200}$ | $L_{2-362}$ |
| COMPOUND 4510 | $L_{1-200}$ | $L_{2-363}$ |

-continued

| | | |
|---|---|---|
| COMPOUND 4511 | $L_{1-200}$ | $L_{2-364}$ |
| COMPOUND 4512 | $L_{1-200}$ | $L_{2-365}$ |
| COMPOUND 4513 | $L_{1-200}$ | $L_{2-366}$ |
| COMPOUND 4514 | $L_{1-200}$ | $L_{2-367}$ |
| COMPOUND 4515 | $L_{1-200}$ | $L_{2-368}$ |
| COMPOUND 4516 | $L_{1-200}$ | $L_{2-369}$ |
| COMPOUND 4517 | $L_{1-200}$ | $L_{2-370}$ |
| COMPOUND 4518 | $L_{1-200}$ | $L_{2-371}$ |
| COMPOUND 4519 | $L_{1-200}$ | $L_{2-372}$ |
| COMPOUND 4520 | $L_{1-200}$ | $L_{2-373}$ |
| COMPOUND 4521 | $L_{1-200}$ | $L_{2-374}$ |
| COMPOUND 4522 | $L_{1-200}$ | $L_{2-375}$ |
| COMPOUND 4523 | $L_{1-200}$ | $L_{2-376}$ |
| COMPOUND 4524 | $L_{1-201}$ | $L_{2-377}$ |
| COMPOUND 4525 | $L_{1-201}$ | $L_{2-1}$ |
| COMPOUND 4526 | $L_{1-201}$ | $L_{2-2}$ |
| COMPOUND 4527 | $L_{1-201}$ | $L_{2-3}$ |
| COMPOUND 4528 | $L_{1-201}$ | $L_{2-4}$ |
| COMPOUND 4529 | $L_{1-201}$ | $L_{2-5}$ |
| COMPOUND 4530 | $L_{1-201}$ | $L_{2-6}$ |
| COMPOUND 4531 | $L_{1-201}$ | $L_{2-7}$ |
| COMPOUND 4532 | $L_{1-201}$ | $L_{2-8}$ |
| COMPOUND 4533 | $L_{1-201}$ | $L_{2-9}$ |
| COMPOUND 4534 | $L_{1-201}$ | $L_{2-10}$ |
| COMPOUND 4535 | $L_{1-201}$ | $L_{2-11}$ |
| COMPOUND 4536 | $L_{1-201}$ | $L_{2-12}$ |
| COMPOUND 4537 | $L_{1-201}$ | $L_{2-13}$ |
| COMPOUND 4538 | $L_{1-201}$ | $L_{2-14}$ |
| COMPOUND 4539 | $L_{1-201}$ | $L_{2-15}$ |
| COMPOUND 4540 | $L_{1-201}$ | $L_{2-16}$ |
| COMPOUND 4541 | $L_{1-201}$ | $L_{2-17}$ |
| COMPOUND 4542 | $L_{1-201}$ | $L_{2-18}$ |
| COMPOUND 4543 | $L_{1-201}$ | $L_{2-19}$ |
| COMPOUND 4544 | $L_{1-201}$ | $L_{2-20}$ |
| COMPOUND 4545 | $L_{1-201}$ | $L_{2-21}$ |
| COMPOUND 4546 | $L_{1-201}$ | $L_{2-22}$ |
| COMPOUND 4547 | $L_{1-201}$ | $L_{2-23}$ |
| COMPOUND 4548 | $L_{1-201}$ | $L_{2-24}$ |
| COMPOUND 4549 | $L_{1-201}$ | $L_{2-25}$ |
| COMPOUND 4550 | $L_{1-201}$ | $L_{2-26}$ |
| COMPOUND 4551 | $L_{1-201}$ | $L_{2-27}$ |
| COMPOUND 4552 | $L_{1-201}$ | $L_{2-28}$ |
| COMPOUND 4553 | $L_{1-201}$ | $L_{2-29}$ |
| COMPOUND 4554 | $L_{1-201}$ | $L_{2-30}$ |
| COMPOUND 4555 | $L_{1-201}$ | $L_{2-31}$ |
| COMPOUND 4556 | $L_{1-201}$ | $L_{2-32}$ |
| COMPOUND 4557 | $L_{1-201}$ | $L_{2-33}$ |
| COMPOUND 4558 | $L_{1-201}$ | $L_{2-34}$ |
| COMPOUND 4559 | $L_{1-201}$ | $L_{2-35}$ |
| COMPOUND 4560 | $L_{1-201}$ | $L_{2-36}$ |
| COMPOUND 4561 | $L_{1-201}$ | $L_{2-37}$ |
| COMPOUND 4562 | $L_{1-201}$ | $L_{2-38}$ |
| COMPOUND 4563 | $L_{1-201}$ | $L_{2-39}$ |
| COMPOUND 4564 | $L_{1-201}$ | $L_{2-40}$ |
| COMPOUND 4565 | $L_{1-201}$ | $L_{2-41}$ |
| COMPOUND 4566 | $L_{1-201}$ | $L_{2-42}$ |
| COMPOUND 4567 | $L_{1-201}$ | $L_{2-43}$ |
| COMPOUND 4568 | $L_{1-201}$ | $L_{2-44}$ |
| COMPOUND 4569 | $L_{1-201}$ | $L_{2-45}$ |
| COMPOUND 4570 | $L_{1-201}$ | $L_{2-46}$ |
| COMPOUND 4571 | $L_{1-201}$ | $L_{2-47}$ |
| COMPOUND 4572 | $L_{1-201}$ | $L_{2-48}$ |
| COMPOUND 4573 | $L_{1-201}$ | $L_{2-49}$ |
| COMPOUND 4574 | $L_{1-201}$ | $L_{2-50}$ |
| COMPOUND 4575 | $L_{1-201}$ | $L_{2-51}$ |
| COMPOUND 4576 | $L_{1-201}$ | $L_{2-52}$ |
| COMPOUND 4577 | $L_{1-201}$ | $L_{2-53}$ |
| COMPOUND 4578 | $L_{1-201}$ | $L_{2-54}$ |
| COMPOUND 4579 | $L_{1-201}$ | $L_{2-55}$ |
| COMPOUND 4580 | $L_{1-201}$ | $L_{2-56}$ |
| COMPOUND 4581 | $L_{1-201}$ | $L_{2-57}$ |
| COMPOUND 4582 | $L_{1-201}$ | $L_{2-58}$ |
| COMPOUND 4583 | $L_{1-201}$ | $L_{2-59}$ |
| COMPOUND 4584 | $L_{1-201}$ | $L_{2-60}$ |
| COMPOUND 4585 | $L_{1-201}$ | $L_{2-61}$ |
| COMPOUND 4586 | $L_{1-201}$ | $L_{2-62}$ |
| COMPOUND 4587 | $L_{1-201}$ | $L_{2-63}$ |
| COMPOUND 4588 | $L_{1-201}$ | $L_{2-64}$ |
| COMPOUND 4589 | $L_{1-201}$ | $L_{2-65}$ |

-continued

| | | |
|---|---|---|
| COMPOUND 4590 | $L_{1-201}$ | $L_{2-66}$ |
| COMPOUND 4591 | $L_{1-201}$ | $L_{2-67}$ |
| COMPOUND 4592 | $L_{1-201}$ | $L_{2-68}$ |
| COMPOUND 4593 | $L_{1-201}$ | $L_{2-69}$ |
| COMPOUND 4594 | $L_{1-201}$ | $L_{2-70}$ |
| COMPOUND 4595 | $L_{1-201}$ | $L_{2-71}$ |
| COMPOUND 4596 | $L_{1-201}$ | $L_{2-72}$ |
| COMPOUND 4597 | $L_{1-201}$ | $L_{2-73}$ |
| COMPOUND 4598 | $L_{1-201}$ | $L_{2-74}$ |
| COMPOUND 4599 | $L_{1-201}$ | $L_{2-75}$ |
| COMPOUND 4600 | $L_{1-201}$ | $L_{2-76}$ |
| COMPOUND 4601 | $L_{1-201}$ | $L_{2-77}$ |
| COMPOUND 4602 | $L_{1-201}$ | $L_{2-78}$ |
| COMPOUND 4603 | $L_{1-201}$ | $L_{2-79}$ |
| COMPOUND 4604 | $L_{1-201}$ | $L_{2-80}$ |
| COMPOUND 4605 | $L_{1-201}$ | $L_{2-81}$ |
| COMPOUND 4606 | $L_{1-201}$ | $L_{2-82}$ |
| COMPOUND 4607 | $L_{1-201}$ | $L_{2-83}$ |
| COMPOUND 4608 | $L_{1-201}$ | $L_{2-84}$ |
| COMPOUND 4609 | $L_{1-201}$ | $L_{2-85}$ |
| COMPOUND 4610 | $L_{1-201}$ | $L_{2-86}$ |
| COMPOUND 4611 | $L_{1-201}$ | $L_{2-87}$ |
| COMPOUND 4612 | $L_{1-201}$ | $L_{2-88}$ |
| COMPOUND 4613 | $L_{1-201}$ | $L_{2-89}$ |
| COMPOUND 4614 | $L_{1-201}$ | $L_{2-90}$ |
| COMPOUND 4615 | $L_{1-201}$ | $L_{2-91}$ |
| COMPOUND 4616 | $L_{1-201}$ | $L_{2-92}$ |
| COMPOUND 4617 | $L_{1-201}$ | $L_{2-93}$ |
| COMPOUND 4618 | $L_{1-201}$ | $L_{2-94}$ |
| COMPOUND 4619 | $L_{1-201}$ | $L_{2-95}$ |
| COMPOUND 4620 | $L_{1-201}$ | $L_{2-96}$ |
| COMPOUND 4621 | $L_{1-201}$ | $L_{2-97}$ |
| COMPOUND 4622 | $L_{1-201}$ | $L_{2-98}$ |
| COMPOUND 4623 | $L_{1-201}$ | $L_{2-99}$ |
| COMPOUND 4624 | $L_{1-201}$ | $L_{2-100}$ |
| COMPOUND 4625 | $L_{1-201}$ | $L_{2-101}$ |
| COMPOUND 4626 | $L_{1-201}$ | $L_{2-102}$ |
| COMPOUND 4627 | $L_{1-201}$ | $L_{2-103}$ |
| COMPOUND 4628 | $L_{1-201}$ | $L_{2-104}$ |
| COMPOUND 4629 | $L_{1-201}$ | $L_{2-105}$ |
| COMPOUND 4630 | $L_{1-201}$ | $L_{2-106}$ |
| COMPOUND 4631 | $L_{1-201}$ | $L_{2-107}$ |
| COMPOUND 4632 | $L_{1-201}$ | $L_{2-108}$ |
| COMPOUND 4633 | $L_{1-201}$ | $L_{2-109}$ |
| COMPOUND 4634 | $L_{1-201}$ | $L_{2-110}$ |
| COMPOUND 4635 | $L_{1-201}$ | $L_{2-111}$ |
| COMPOUND 4636 | $L_{1-201}$ | $L_{2-112}$ |
| COMPOUND 4637 | $L_{1-201}$ | $L_{2-113}$ |
| COMPOUND 4638 | $L_{1-201}$ | $L_{2-114}$ |
| COMPOUND 4639 | $L_{1-201}$ | $L_{2-115}$ |
| COMPOUND 4640 | $L_{1-201}$ | $L_{2-116}$ |
| COMPOUND 4641 | $L_{1-201}$ | $L_{2-117}$ |
| COMPOUND 4642 | $L_{1-201}$ | $L_{2-118}$ |
| COMPOUND 4643 | $L_{1-201}$ | $L_{2-119}$ |
| COMPOUND 4644 | $L_{1-201}$ | $L_{2-120}$ |
| COMPOUND 4645 | $L_{1-201}$ | $L_{2-121}$ |
| COMPOUND 4646 | $L_{1-201}$ | $L_{2-122}$ |
| COMPOUND 4647 | $L_{1-201}$ | $L_{2-123}$ |
| COMPOUND 4648 | $L_{1-201}$ | $L_{2-124}$ |
| COMPOUND 4649 | $L_{1-201}$ | $L_{2-125}$ |
| COMPOUND 4650 | $L_{1-201}$ | $L_{2-126}$ |
| COMPOUND 4651 | $L_{1-201}$ | $L_{2-127}$ |
| COMPOUND 4652 | $L_{1-201}$ | $L_{2-128}$ |
| COMPOUND 4653 | $L_{1-201}$ | $L_{2-129}$ |
| COMPOUND 4654 | $L_{1-201}$ | $L_{2-130}$ |
| COMPOUND 4655 | $L_{1-201}$ | $L_{2-131}$ |
| COMPOUND 4656 | $L_{1-201}$ | $L_{2-132}$ |
| COMPOUND 4657 | $L_{1-201}$ | $L_{2-133}$ |
| COMPOUND 4658 | $L_{1-201}$ | $L_{2-134}$ |
| COMPOUND 4659 | $L_{1-201}$ | $L_{2-135}$ |
| COMPOUND 4660 | $L_{1-201}$ | $L_{2-136}$ |
| COMPOUND 4661 | $L_{1-201}$ | $L_{2-137}$ |
| COMPOUND 4662 | $L_{1-201}$ | $L_{2-138}$ |
| COMPOUND 4663 | $L_{1-201}$ | $L_{2-139}$ |
| COMPOUND 4664 | $L_{1-201}$ | $L_{2-140}$ |
| COMPOUND 4665 | $L_{1-201}$ | $L_{2-141}$ |
| COMPOUND 4666 | $L_{1-201}$ | $L_{2-142}$ |
| COMPOUND 4667 | $L_{1-201}$ | $L_{2-143}$ |
| COMPOUND 4668 | $L_{1-201}$ | $L_{2-144}$ |

-continued

| | | |
|---|---|---|
| COMPOUND 4669 | $L_{1-201}$ | $L_{2-145}$ |
| COMPOUND 4670 | $L_{1-201}$ | $L_{2-146}$ |
| COMPOUND 4671 | $L_{1-201}$ | $L_{2-147}$ |
| COMPOUND 4672 | $L_{1-201}$ | $L_{2-148}$ |
| COMPOUND 4673 | $L_{1-201}$ | $L_{2-149}$ |
| COMPOUND 4674 | $L_{1-201}$ | $L_{2-150}$ |
| COMPOUND 4675 | $L_{1-201}$ | $L_{2-151}$ |
| COMPOUND 4676 | $L_{1-201}$ | $L_{2-152}$ |
| COMPOUND 4677 | $L_{1-201}$ | $L_{2-153}$ |
| COMPOUND 4678 | $L_{1-201}$ | $L_{2-154}$ |
| COMPOUND 4679 | $L_{1-201}$ | $L_{2-155}$ |
| COMPOUND 4680 | $L_{1-201}$ | $L_{2-156}$ |
| COMPOUND 4681 | $L_{1-201}$ | $L_{2-157}$ |
| COMPOUND 4682 | $L_{1-201}$ | $L_{2-158}$ |
| COMPOUND 4683 | $L_{1-201}$ | $L_{2-159}$ |
| COMPOUND 4684 | $L_{1-201}$ | $L_{2-160}$ |
| COMPOUND 4685 | $L_{1-201}$ | $L_{2-161}$ |
| COMPOUND 4686 | $L_{1-201}$ | $L_{2-162}$ |
| COMPOUND 4687 | $L_{1-201}$ | $L_{2-163}$ |
| COMPOUND 4688 | $L_{1-201}$ | $L_{2-164}$ |
| COMPOUND 4689 | $L_{1-201}$ | $L_{2-165}$ |
| COMPOUND 4690 | $L_{1-201}$ | $L_{2-166}$ |
| COMPOUND 4691 | $L_{1-201}$ | $L_{2-167}$ |
| COMPOUND 4692 | $L_{1-201}$ | $L_{2-168}$ |
| COMPOUND 4693 | $L_{1-201}$ | $L_{2-169}$ |
| COMPOUND 4694 | $L_{1-201}$ | $L_{2-170}$ |
| COMPOUND 4695 | $L_{1-201}$ | $L_{2-171}$ |
| COMPOUND 4696 | $L_{1-201}$ | $L_{2-172}$ |
| COMPOUND 4697 | $L_{1-201}$ | $L_{2-173}$ |
| COMPOUND 4698 | $L_{1-201}$ | $L_{2-174}$ |
| COMPOUND 4699 | $L_{1-201}$ | $L_{2-175}$ |
| COMPOUND 4700 | $L_{1-201}$ | $L_{2-176}$ |
| COMPOUND 4701 | $L_{1-201}$ | $L_{2-177}$ |
| COMPOUND 4702 | $L_{1-201}$ | $L_{2-178}$ |
| COMPOUND 4703 | $L_{1-201}$ | $L_{2-179}$ |
| COMPOUND 4704 | $L_{1-201}$ | $L_{2-180}$ |
| COMPOUND 4705 | $L_{1-201}$ | $L_{2-181}$ |
| COMPOUND 4706 | $L_{1-201}$ | $L_{2-182}$ |
| COMPOUND 4707 | $L_{1-201}$ | $L_{2-183}$ |
| COMPOUND 4708 | $L_{1-201}$ | $L_{2-184}$ |
| COMPOUND 4709 | $L_{1-201}$ | $L_{2-185}$ |
| COMPOUND 4710 | $L_{1-201}$ | $L_{2-186}$ |
| COMPOUND 4711 | $L_{1-201}$ | $L_{2-187}$ |
| COMPOUND 4712 | $L_{1-201}$ | $L_{2-188}$ |
| COMPOUND 4713 | $L_{1-201}$ | $L_{2-189}$ |
| COMPOUND 4714 | $L_{1-201}$ | $L_{2-190}$ |
| COMPOUND 4715 | $L_{1-201}$ | $L_{2-191}$ |
| COMPOUND 4716 | $L_{1-201}$ | $L_{2-192}$ |
| COMPOUND 4717 | $L_{1-201}$ | $L_{2-193}$ |
| COMPOUND 4718 | $L_{1-201}$ | $L_{2-194}$ |
| COMPOUND 4719 | $L_{1-201}$ | $L_{2-195}$ |
| COMPOUND 4720 | $L_{1-201}$ | $L_{2-196}$ |
| COMPOUND 4721 | $L_{1-201}$ | $L_{2-197}$ |
| COMPOUND 4722 | $L_{1-201}$ | $L_{2-198}$ |
| COMPOUND 4723 | $L_{1-201}$ | $L_{2-199}$ |
| COMPOUND 4724 | $L_{1-201}$ | $L_{2-200}$ |
| COMPOUND 4725 | $L_{1-201}$ | $L_{2-201}$ |
| COMPOUND 4726 | $L_{1-201}$ | $L_{2-202}$ |
| COMPOUND 4727 | $L_{1-201}$ | $L_{2-203}$ |
| COMPOUND 4728 | $L_{1-201}$ | $L_{2-204}$ |
| COMPOUND 4729 | $L_{1-201}$ | $L_{2-205}$ |
| COMPOUND 4730 | $L_{1-201}$ | $L_{2-206}$ |
| COMPOUND 4731 | $L_{1-201}$ | $L_{2-207}$ |
| COMPOUND 4732 | $L_{1-201}$ | $L_{2-208}$ |
| COMPOUND 4733 | $L_{1-201}$ | $L_{2-209}$ |
| COMPOUND 4734 | $L_{1-201}$ | $L_{2-210}$ |
| COMPOUND 4735 | $L_{1-201}$ | $L_{2-211}$ |
| COMPOUND 4736 | $L_{1-201}$ | $L_{2-212}$ |
| COMPOUND 4737 | $L_{1-201}$ | $L_{2-213}$ |
| COMPOUND 4738 | $L_{1-201}$ | $L_{2-214}$ |
| COMPOUND 4739 | $L_{1-201}$ | $L_{2-215}$ |
| COMPOUND 4740 | $L_{1-201}$ | $L_{2-216}$ |
| COMPOUND 4741 | $L_{1-201}$ | $L_{2-217}$ |
| COMPOUND 4742 | $L_{1-201}$ | $L_{2-218}$ |
| COMPOUND 4743 | $L_{1-201}$ | $L_{2-219}$ |
| COMPOUND 4744 | $L_{1-201}$ | $L_{2-220}$ |
| COMPOUND 4745 | $L_{1-201}$ | $L_{2-221}$ |
| COMPOUND 4746 | $L_{1-201}$ | $L_{2-222}$ |
| COMPOUND 4747 | $L_{1-201}$ | $L_{2-223}$ |

-continued

| | | |
|---|---|---|
| COMPOUND 4748 | $L_{1-201}$ | $L_{2-224}$ |
| COMPOUND 4749 | $L_{1-201}$ | $L_{2-225}$ |
| COMPOUND 4750 | $L_{1-201}$ | $L_{2-226}$ |
| COMPOUND 4751 | $L_{1-201}$ | $L_{2-227}$ |
| COMPOUND 4752 | $L_{1-201}$ | $L_{2-228}$ |
| COMPOUND 4753 | $L_{1-201}$ | $L_{2-229}$ |
| COMPOUND 4754 | $L_{1-201}$ | $L_{2-230}$ |
| COMPOUND 4755 | $L_{1-201}$ | $L_{2-231}$ |
| COMPOUND 4756 | $L_{1-201}$ | $L_{2-232}$ |
| COMPOUND 4757 | $L_{1-201}$ | $L_{2-233}$ |
| COMPOUND 4758 | $L_{1-201}$ | $L_{2-234}$ |
| COMPOUND 4759 | $L_{1-201}$ | $L_{2-235}$ |
| COMPOUND 4760 | $L_{1-201}$ | $L_{2-236}$ |
| COMPOUND 4761 | $L_{1-201}$ | $L_{2-237}$ |
| COMPOUND 4762 | $L_{1-201}$ | $L_{2-238}$ |
| COMPOUND 4763 | $L_{1-201}$ | $L_{2-239}$ |
| COMPOUND 4764 | $L_{1-201}$ | $L_{2-240}$ |
| COMPOUND 4765 | $L_{1-201}$ | $L_{2-241}$ |
| COMPOUND 4766 | $L_{1-201}$ | $L_{2-242}$ |
| COMPOUND 4767 | $L_{1-201}$ | $L_{2-243}$ |
| COMPOUND 4768 | $L_{1-201}$ | $L_{2-244}$ |
| COMPOUND 4769 | $L_{1-201}$ | $L_{2-245}$ |
| COMPOUND 4770 | $L_{1-201}$ | $L_{2-246}$ |
| COMPOUND 4771 | $L_{1-201}$ | $L_{2-247}$ |
| COMPOUND 4772 | $L_{1-201}$ | $L_{2-248}$ |
| COMPOUND 4773 | $L_{1-201}$ | $L_{2-249}$ |
| COMPOUND 4774 | $L_{1-201}$ | $L_{2-250}$ |
| COMPOUND 4775 | $L_{1-201}$ | $L_{2-251}$ |
| COMPOUND 4776 | $L_{1-201}$ | $L_{2-252}$ |
| COMPOUND 4777 | $L_{1-201}$ | $L_{2-253}$ |
| COMPOUND 4778 | $L_{1-201}$ | $L_{2-254}$ |
| COMPOUND 4779 | $L_{1-201}$ | $L_{2-255}$ |
| COMPOUND 4780 | $L_{1-201}$ | $L_{2-256}$ |
| COMPOUND 4781 | $L_{1-201}$ | $L_{2-257}$ |
| COMPOUND 4782 | $L_{1-201}$ | $L_{2-258}$ |
| COMPOUND 4783 | $L_{1-201}$ | $L_{2-259}$ |
| COMPOUND 4784 | $L_{1-201}$ | $L_{2-260}$ |
| COMPOUND 4785 | $L_{1-201}$ | $L_{2-261}$ |
| COMPOUND 4786 | $L_{1-201}$ | $L_{2-262}$ |
| COMPOUND 4787 | $L_{1-201}$ | $L_{2-263}$ |
| COMPOUND 4788 | $L_{1-201}$ | $L_{2-264}$ |
| COMPOUND 4789 | $L_{1-201}$ | $L_{2-265}$ |
| COMPOUND 4790 | $L_{1-201}$ | $L_{2-266}$ |
| COMPOUND 4791 | $L_{1-201}$ | $L_{2-267}$ |
| COMPOUND 4792 | $L_{1-201}$ | $L_{2-268}$ |
| COMPOUND 4793 | $L_{1-201}$ | $L_{2-269}$ |
| COMPOUND 4794 | $L_{1-201}$ | $L_{2-270}$ |
| COMPOUND 4795 | $L_{1-201}$ | $L_{2-271}$ |
| COMPOUND 4796 | $L_{1-201}$ | $L_{2-272}$ |
| COMPOUND 4797 | $L_{1-201}$ | $L_{2-273}$ |
| COMPOUND 4798 | $L_{1-201}$ | $L_{2-274}$ |
| COMPOUND 4799 | $L_{1-201}$ | $L_{2-275}$ |
| COMPOUND 4800 | $L_{1-201}$ | $L_{2-276}$ |
| COMPOUND 4801 | $L_{1-201}$ | $L_{2-277}$ |
| COMPOUND 4802 | $L_{1-201}$ | $L_{2-278}$ |
| COMPOUND 4803 | $L_{1-201}$ | $L_{2-279}$ |
| COMPOUND 4804 | $L_{1-201}$ | $L_{2-280}$ |
| COMPOUND 4805 | $L_{1-201}$ | $L_{2-281}$ |
| COMPOUND 4806 | $L_{1-201}$ | $L_{2-282}$ |
| COMPOUND 4807 | $L_{1-201}$ | $L_{2-283}$ |
| COMPOUND 4808 | $L_{1-201}$ | $L_{2-284}$ |
| COMPOUND 4809 | $L_{1-201}$ | $L_{2-285}$ |
| COMPOUND 4810 | $L_{1-201}$ | $L_{2-286}$ |
| COMPOUND 4811 | $L_{1-201}$ | $L_{2-287}$ |
| COMPOUND 4812 | $L_{1-201}$ | $L_{2-288}$ |
| COMPOUND 4813 | $L_{1-201}$ | $L_{2-289}$ |
| COMPOUND 4814 | $L_{1-201}$ | $L_{2-290}$ |
| COMPOUND 4815 | $L_{1-201}$ | $L_{2-291}$ |
| COMPOUND 4816 | $L_{1-201}$ | $L_{2-292}$ |
| COMPOUND 4817 | $L_{1-201}$ | $L_{2-293}$ |
| COMPOUND 4818 | $L_{1-201}$ | $L_{2-294}$ |
| COMPOUND 4819 | $L_{1-201}$ | $L_{2-295}$ |
| COMPOUND 4820 | $L_{1-201}$ | $L_{2-296}$ |
| COMPOUND 4821 | $L_{1-201}$ | $L_{2-297}$ |
| COMPOUND 4822 | $L_{1-201}$ | $L_{2-298}$ |
| COMPOUND 4823 | $L_{1-201}$ | $L_{2-299}$ |
| COMPOUND 4824 | $L_{1-201}$ | $L_{2-300}$ |
| COMPOUND 4825 | $L_{1-201}$ | $L_{2-301}$ |
| COMPOUND 4826 | $L_{1-201}$ | $L_{2-302}$ |

-continued

| | | |
|---|---|---|
| COMPOUND 4827 | $L_{1-201}$ | $L_{2-303}$ |
| COMPOUND 4828 | $L_{1-201}$ | $L_{2-304}$ |
| COMPOUND 4829 | $L_{1-201}$ | $L_{2-305}$ |
| COMPOUND 4830 | $L_{1-201}$ | $L_{2-306}$ |
| COMPOUND 4831 | $L_{1-201}$ | $L_{2-307}$ |
| COMPOUND 4832 | $L_{1-201}$ | $L_{2-308}$ |
| COMPOUND 4833 | $L_{1-201}$ | $L_{2-309}$ |
| COMPOUND 4834 | $L_{1-201}$ | $L_{2-310}$ |
| COMPOUND 4835 | $L_{1-201}$ | $L_{2-311}$ |
| COMPOUND 4836 | $L_{1-201}$ | $L_{2-312}$ |
| COMPOUND 4837 | $L_{1-201}$ | $L_{2-313}$ |
| COMPOUND 4838 | $L_{1-201}$ | $L_{2-314}$ |
| COMPOUND 4839 | $L_{1-201}$ | $L_{2-315}$ |
| COMPOUND 4840 | $L_{1-201}$ | $L_{2-316}$ |
| COMPOUND 4841 | $L_{1-201}$ | $L_{2-317}$ |
| COMPOUND 4842 | $L_{1-201}$ | $L_{2-318}$ |
| COMPOUND 4843 | $L_{1-201}$ | $L_{2-319}$ |
| COMPOUND 4844 | $L_{1-201}$ | $L_{2-320}$ |
| COMPOUND 4845 | $L_{1-201}$ | $L_{2-321}$ |
| COMPOUND 4846 | $L_{1-201}$ | $L_{2-322}$ |
| COMPOUND 4847 | $L_{1-201}$ | $L_{2-323}$ |
| COMPOUND 4848 | $L_{1-201}$ | $L_{2-324}$ |
| COMPOUND 4849 | $L_{1-201}$ | $L_{2-325}$ |
| COMPOUND 4850 | $L_{1-201}$ | $L_{2-326}$ |
| COMPOUND 4851 | $L_{1-201}$ | $L_{2-327}$ |
| COMPOUND 4852 | $L_{1-201}$ | $L_{2-328}$ |
| COMPOUND 4853 | $L_{1-201}$ | $L_{2-329}$ |
| COMPOUND 4854 | $L_{1-201}$ | $L_{2-330}$ |
| COMPOUND 4855 | $L_{1-201}$ | $L_{2-331}$ |
| COMPOUND 4856 | $L_{1-201}$ | $L_{2-332}$ |
| COMPOUND 4857 | $L_{1-201}$ | $L_{2-333}$ |
| COMPOUND 4858 | $L_{1-201}$ | $L_{2-334}$ |
| COMPOUND 4859 | $L_{1-201}$ | $L_{2-335}$ |
| COMPOUND 4860 | $L_{1-201}$ | $L_{2-336}$ |
| COMPOUND 4861 | $L_{1-201}$ | $L_{2-337}$ |
| COMPOUND 4862 | $L_{1-201}$ | $L_{2-338}$ |
| COMPOUND 4863 | $L_{1-201}$ | $L_{2-339}$ |
| COMPOUND 4864 | $L_{1-201}$ | $L_{2-340}$ |
| COMPOUND 4865 | $L_{1-201}$ | $L_{2-341}$ |
| COMPOUND 4866 | $L_{1-201}$ | $L_{2-342}$ |
| COMPOUND 4867 | $L_{1-201}$ | $L_{2-343}$ |
| COMPOUND 4868 | $L_{1-201}$ | $L_{2-344}$ |
| COMPOUND 4869 | $L_{1-201}$ | $L_{2-345}$ |
| COMPOUND 4870 | $L_{1-201}$ | $L_{2-346}$ |
| COMPOUND 4871 | $L_{1-201}$ | $L_{2-347}$ |
| COMPOUND 4872 | $L_{1-201}$ | $L_{2-348}$ |
| COMPOUND 4873 | $L_{1-201}$ | $L_{2-349}$ |
| COMPOUND 4874 | $L_{1-201}$ | $L_{2-350}$ |
| COMPOUND 4875 | $L_{1-201}$ | $L_{2-351}$ |
| COMPOUND 4876 | $L_{1-201}$ | $L_{2-352}$ |
| COMPOUND 4877 | $L_{1-201}$ | $L_{2-353}$ |
| COMPOUND 4878 | $L_{1-201}$ | $L_{2-354}$ |
| COMPOUND 4879 | $L_{1-201}$ | $L_{2-355}$ |
| COMPOUND 4880 | $L_{1-201}$ | $L_{2-356}$ |
| COMPOUND 4881 | $L_{1-201}$ | $L_{2-357}$ |
| COMPOUND 4882 | $L_{1-201}$ | $L_{2-358}$ |
| COMPOUND 4883 | $L_{1-201}$ | $L_{2-359}$ |
| COMPOUND 4884 | $L_{1-201}$ | $L_{2-360}$ |
| COMPOUND 4885 | $L_{1-201}$ | $L_{2-361}$ |
| COMPOUND 4886 | $L_{1-201}$ | $L_{2-362}$ |
| COMPOUND 4887 | $L_{1-201}$ | $L_{2-363}$ |
| COMPOUND 4888 | $L_{1-201}$ | $L_{2-364}$ |
| COMPOUND 4889 | $L_{1-201}$ | $L_{2-365}$ |
| COMPOUND 4890 | $L_{1-201}$ | $L_{2-366}$ |
| COMPOUND 4891 | $L_{1-201}$ | $L_{2-367}$ |
| COMPOUND 4892 | $L_{1-201}$ | $L_{2-368}$ |
| COMPOUND 4893 | $L_{1-201}$ | $L_{2-369}$ |
| COMPOUND 4894 | $L_{1-201}$ | $L_{2-370}$ |
| COMPOUND 4895 | $L_{1-201}$ | $L_{2-371}$ |
| COMPOUND 4896 | $L_{1-201}$ | $L_{2-372}$ |
| COMPOUND 4897 | $L_{1-201}$ | $L_{2-373}$ |
| COMPOUND 4898 | $L_{1-201}$ | $L_{2-374}$ |
| COMPOUND 4899 | $L_{1-201}$ | $L_{2-375}$ |
| COMPOUND 4900 | $L_{1-201}$ | $L_{2-376}$ |
| COMPOUND 4901 | $L_{1-202}$ | $L_{2-377}$ |
| COMPOUND 4902 | $L_{1-202}$ | $L_{2-1}$ |
| COMPOUND 4903 | $L_{1-202}$ | $L_{2-2}$ |
| COMPOUND 4904 | $L_{1-202}$ | $L_{2-3}$ |
| COMPOUND 4905 | $L_{1-202}$ | $L_{2-4}$ |

-continued

| | | |
|---|---|---|
| COMPOUND 4906 | $L_{1-202}$ | $L_{2-5}$ |
| COMPOUND 4907 | $L_{1-202}$ | $L_{2-6}$ |
| COMPOUND 4908 | $L_{1-202}$ | $L_{2-7}$ |
| COMPOUND 4909 | $L_{1-202}$ | $L_{2-8}$ |
| COMPOUND 4910 | $L_{1-202}$ | $L_{2-9}$ |
| COMPOUND 4911 | $L_{1-202}$ | $L_{2-10}$ |
| COMPOUND 4912 | $L_{1-202}$ | $L_{2-11}$ |
| COMPOUND 4913 | $L_{1-202}$ | $L_{2-12}$ |
| COMPOUND 4914 | $L_{1-202}$ | $L_{2-13}$ |
| COMPOUND 4915 | $L_{1-202}$ | $L_{2-14}$ |
| COMPOUND 4916 | $L_{1-202}$ | $L_{2-15}$ |
| COMPOUND 4917 | $L_{1-202}$ | $L_{2-16}$ |
| COMPOUND 4918 | $L_{1-202}$ | $L_{2-17}$ |
| COMPOUND 4919 | $L_{1-202}$ | $L_{2-18}$ |
| COMPOUND 4920 | $L_{1-202}$ | $L_{2-19}$ |
| COMPOUND 4921 | $L_{1-202}$ | $L_{2-20}$ |
| COMPOUND 4922 | $L_{1-202}$ | $L_{2-21}$ |
| COMPOUND 4923 | $L_{1-202}$ | $L_{2-22}$ |
| COMPOUND 4924 | $L_{1-202}$ | $L_{2-23}$ |
| COMPOUND 4925 | $L_{1-202}$ | $L_{2-24}$ |
| COMPOUND 4926 | $L_{1-202}$ | $L_{2-25}$ |
| COMPOUND 4927 | $L_{1-202}$ | $L_{2-26}$ |
| COMPOUND 4928 | $L_{1-202}$ | $L_{2-27}$ |
| COMPOUND 4929 | $L_{1-202}$ | $L_{2-28}$ |
| COMPOUND 4930 | $L_{1-202}$ | $L_{2-29}$ |
| COMPOUND 4931 | $L_{1-202}$ | $L_{2-30}$ |
| COMPOUND 4932 | $L_{1-202}$ | $L_{2-31}$ |
| COMPOUND 4933 | $L_{1-202}$ | $L_{2-32}$ |
| COMPOUND 4934 | $L_{1-202}$ | $L_{2-33}$ |
| COMPOUND 4935 | $L_{1-202}$ | $L_{2-34}$ |
| COMPOUND 4936 | $L_{1-202}$ | $L_{2-35}$ |
| COMPOUND 4937 | $L_{1-202}$ | $L_{2-36}$ |
| COMPOUND 4938 | $L_{1-202}$ | $L_{2-37}$ |
| COMPOUND 4939 | $L_{1-202}$ | $L_{2-38}$ |
| COMPOUND 4940 | $L_{1-202}$ | $L_{2-39}$ |
| COMPOUND 4941 | $L_{1-202}$ | $L_{2-40}$ |
| COMPOUND 4942 | $L_{1-202}$ | $L_{2-41}$ |
| COMPOUND 4943 | $L_{1-202}$ | $L_{2-42}$ |
| COMPOUND 4944 | $L_{1-202}$ | $L_{2-43}$ |
| COMPOUND 4945 | $L_{1-202}$ | $L_{2-44}$ |
| COMPOUND 4946 | $L_{1-202}$ | $L_{2-45}$ |
| COMPOUND 4947 | $L_{1-202}$ | $L_{2-46}$ |
| COMPOUND 4948 | $L_{1-202}$ | $L_{2-47}$ |
| COMPOUND 4949 | $L_{1-202}$ | $L_{2-48}$ |
| COMPOUND 4950 | $L_{1-202}$ | $L_{2-49}$ |
| COMPOUND 4951 | $L_{1-202}$ | $L_{2-50}$ |
| COMPOUND 4952 | $L_{1-202}$ | $L_{2-51}$ |
| COMPOUND 4953 | $L_{1-202}$ | $L_{2-52}$ |
| COMPOUND 4954 | $L_{1-202}$ | $L_{2-53}$ |
| COMPOUND 4955 | $L_{1-202}$ | $L_{2-54}$ |
| COMPOUND 4956 | $L_{1-202}$ | $L_{2-55}$ |
| COMPOUND 4957 | $L_{1-202}$ | $L_{2-56}$ |
| COMPOUND 4958 | $L_{1-202}$ | $L_{2-57}$ |
| COMPOUND 4959 | $L_{1-202}$ | $L_{2-58}$ |
| COMPOUND 4960 | $L_{1-202}$ | $L_{2-59}$ |
| COMPOUND 4961 | $L_{1-202}$ | $L_{2-60}$ |
| COMPOUND 4962 | $L_{1-202}$ | $L_{2-61}$ |
| COMPOUND 4963 | $L_{1-202}$ | $L_{2-62}$ |
| COMPOUND 4964 | $L_{1-202}$ | $L_{2-63}$ |
| COMPOUND 4965 | $L_{1-202}$ | $L_{2-64}$ |
| COMPOUND 4966 | $L_{1-202}$ | $L_{2-65}$ |
| COMPOUND 4967 | $L_{1-202}$ | $L_{2-66}$ |
| COMPOUND 4968 | $L_{1-202}$ | $L_{2-67}$ |
| COMPOUND 4969 | $L_{1-202}$ | $L_{2-68}$ |
| COMPOUND 4970 | $L_{1-202}$ | $L_{2-69}$ |
| COMPOUND 4971 | $L_{1-202}$ | $L_{2-70}$ |
| COMPOUND 4972 | $L_{1-202}$ | $L_{2-71}$ |
| COMPOUND 4973 | $L_{1-202}$ | $L_{2-72}$ |
| COMPOUND 4974 | $L_{1-202}$ | $L_{2-73}$ |
| COMPOUND 4975 | $L_{1-202}$ | $L_{2-74}$ |
| COMPOUND 4976 | $L_{1-202}$ | $L_{2-75}$ |
| COMPOUND 4977 | $L_{1-202}$ | $L_{2-76}$ |
| COMPOUND 4978 | $L_{1-202}$ | $L_{2-77}$ |
| COMPOUND 4979 | $L_{1-202}$ | $L_{2-78}$ |
| COMPOUND 4980 | $L_{1-202}$ | $L_{2-79}$ |
| COMPOUND 4981 | $L_{1-202}$ | $L_{2-80}$ |
| COMPOUND 4982 | $L_{1-202}$ | $L_{2-81}$ |
| COMPOUND 4983 | $L_{1-202}$ | $L_{2-82}$ |
| COMPOUND 4984 | $L_{1-202}$ | $L_{2-83}$ |

-continued

| | | |
|---|---|---|
| COMPOUND 4985 | $L_{1-202}$ | $L_{2-84}$ |
| COMPOUND 4986 | $L_{1-202}$ | $L_{2-85}$ |
| COMPOUND 4987 | $L_{1-202}$ | $L_{2-86}$ |
| COMPOUND 4988 | $L_{1-202}$ | $L_{2-87}$ |
| COMPOUND 4989 | $L_{1-202}$ | $L_{2-88}$ |
| COMPOUND 4990 | $L_{1-202}$ | $L_{2-89}$ |
| COMPOUND 4991 | $L_{1-202}$ | $L_{2-90}$ |
| COMPOUND 4992 | $L_{1-202}$ | $L_{2-91}$ |
| COMPOUND 4993 | $L_{1-202}$ | $L_{2-92}$ |
| COMPOUND 4994 | $L_{1-202}$ | $L_{2-93}$ |
| COMPOUND 4995 | $L_{1-202}$ | $L_{2-94}$ |
| COMPOUND 4996 | $L_{1-202}$ | $L_{2-95}$ |
| COMPOUND 4997 | $L_{1-202}$ | $L_{2-96}$ |
| COMPOUND 4998 | $L_{1-202}$ | $L_{2-97}$ |
| COMPOUND 4999 | $L_{1-202}$ | $L_{2-98}$ |
| COMPOUND 5000 | $L_{1-202}$ | $L_{2-99}$ |
| COMPOUND 5001 | $L_{1-202}$ | $L_{2-100}$ |
| COMPOUND 5002 | $L_{1-202}$ | $L_{2-101}$ |
| COMPOUND 5003 | $L_{1-202}$ | $L_{2-102}$ |
| COMPOUND 5004 | $L_{1-202}$ | $L_{2-103}$ |
| COMPOUND 5005 | $L_{1-202}$ | $L_{2-104}$ |
| COMPOUND 5006 | $L_{1-202}$ | $L_{2-105}$ |
| COMPOUND 5007 | $L_{1-202}$ | $L_{2-106}$ |
| COMPOUND 5008 | $L_{1-202}$ | $L_{2-107}$ |
| COMPOUND 5009 | $L_{1-202}$ | $L_{2-108}$ |
| COMPOUND 5010 | $L_{1-202}$ | $L_{2-109}$ |
| COMPOUND 5011 | $L_{1-202}$ | $L_{2-110}$ |
| COMPOUND 5012 | $L_{1-202}$ | $L_{2-111}$ |
| COMPOUND 5013 | $L_{1-202}$ | $L_{2-112}$ |
| COMPOUND 5014 | $L_{1-202}$ | $L_{2-113}$ |
| COMPOUND 5015 | $L_{1-202}$ | $L_{2-114}$ |
| COMPOUND 5016 | $L_{1-202}$ | $L_{2-115}$ |
| COMPOUND 5017 | $L_{1-202}$ | $L_{2-116}$ |
| COMPOUND 5018 | $L_{1-202}$ | $L_{2-117}$ |
| COMPOUND 5019 | $L_{1-202}$ | $L_{2-118}$ |
| COMPOUND 5020 | $L_{1-202}$ | $L_{2-119}$ |
| COMPOUND 5021 | $L_{1-202}$ | $L_{2-120}$ |
| COMPOUND 5022 | $L_{1-202}$ | $L_{2-121}$ |
| COMPOUND 5023 | $L_{1-202}$ | $L_{2-122}$ |
| COMPOUND 5024 | $L_{1-202}$ | $L_{2-123}$ |
| COMPOUND 5025 | $L_{1-202}$ | $L_{2-124}$ |
| COMPOUND 5026 | $L_{1-202}$ | $L_{2-125}$ |
| COMPOUND 5027 | $L_{1-202}$ | $L_{2-126}$ |
| COMPOUND 5028 | $L_{1-202}$ | $L_{2-127}$ |
| COMPOUND 5029 | $L_{1-202}$ | $L_{2-128}$ |
| COMPOUND 5030 | $L_{1-202}$ | $L_{2-129}$ |
| COMPOUND 5031 | $L_{1-202}$ | $L_{2-130}$ |
| COMPOUND 5032 | $L_{1-202}$ | $L_{2-131}$ |
| COMPOUND 5033 | $L_{1-202}$ | $L_{2-132}$ |
| COMPOUND 5034 | $L_{1-202}$ | $L_{2-133}$ |
| COMPOUND 5035 | $L_{1-202}$ | $L_{2-134}$ |
| COMPOUND 5036 | $L_{1-202}$ | $L_{2-135}$ |
| COMPOUND 5037 | $L_{1-202}$ | $L_{2-136}$ |
| COMPOUND 5038 | $L_{1-202}$ | $L_{2-137}$ |
| COMPOUND 5039 | $L_{1-202}$ | $L_{2-138}$ |
| COMPOUND 5040 | $L_{1-202}$ | $L_{2-139}$ |
| COMPOUND 5041 | $L_{1-202}$ | $L_{2-140}$ |
| COMPOUND 5042 | $L_{1-202}$ | $L_{2-141}$ |
| COMPOUND 5043 | $L_{1-202}$ | $L_{2-142}$ |
| COMPOUND 5044 | $L_{1-202}$ | $L_{2-143}$ |
| COMPOUND 5045 | $L_{1-202}$ | $L_{2-144}$ |
| COMPOUND 5046 | $L_{1-202}$ | $L_{2-145}$ |
| COMPOUND 5047 | $L_{1-202}$ | $L_{2-146}$ |
| COMPOUND 5048 | $L_{1-202}$ | $L_{2-147}$ |
| COMPOUND 5049 | $L_{1-202}$ | $L_{2-148}$ |
| COMPOUND 5050 | $L_{1-202}$ | $L_{2-149}$ |
| COMPOUND 5051 | $L_{1-202}$ | $L_{2-150}$ |
| COMPOUND 5052 | $L_{1-202}$ | $L_{2-151}$ |
| COMPOUND 5053 | $L_{1-202}$ | $L_{2-152}$ |
| COMPOUND 5054 | $L_{1-202}$ | $L_{2-153}$ |
| COMPOUND 5055 | $L_{1-202}$ | $L_{2-154}$ |
| COMPOUND 5056 | $L_{1-202}$ | $L_{2-155}$ |
| COMPOUND 5057 | $L_{1-202}$ | $L_{2-156}$ |
| COMPOUND 5058 | $L_{1-202}$ | $L_{2-157}$ |
| COMPOUND 5059 | $L_{1-202}$ | $L_{2-158}$ |
| COMPOUND 5060 | $L_{1-202}$ | $L_{2-159}$ |
| COMPOUND 5061 | $L_{1-202}$ | $L_{2-160}$ |
| COMPOUND 5062 | $L_{1-202}$ | $L_{2-161}$ |
| COMPOUND 5063 | $L_{1-202}$ | $L_{2-162}$ |

-continued

| | | |
|---|---|---|
| COMPOUND 5064 | $L_{1-202}$ | $L_{2-163}$ |
| COMPOUND 5065 | $L_{1-202}$ | $L_{2-164}$ |
| COMPOUND 5066 | $L_{1-202}$ | $L_{2-165}$ |
| COMPOUND 5067 | $L_{1-202}$ | $L_{2-166}$ |
| COMPOUND 5068 | $L_{1-202}$ | $L_{2-167}$ |
| COMPOUND 5069 | $L_{1-202}$ | $L_{2-168}$ |
| COMPOUND 5070 | $L_{1-202}$ | $L_{2-169}$ |
| COMPOUND 5071 | $L_{1-202}$ | $L_{2-170}$ |
| COMPOUND 5072 | $L_{1-202}$ | $L_{2-171}$ |
| COMPOUND 5073 | $L_{1-202}$ | $L_{2-172}$ |
| COMPOUND 5074 | $L_{1-202}$ | $L_{2-173}$ |
| COMPOUND 5075 | $L_{1-202}$ | $L_{2-174}$ |
| COMPOUND 5076 | $L_{1-202}$ | $L_{2-175}$ |
| COMPOUND 5077 | $L_{1-202}$ | $L_{2-176}$ |
| COMPOUND 5078 | $L_{1-202}$ | $L_{2-177}$ |
| COMPOUND 5079 | $L_{1-202}$ | $L_{2-178}$ |
| COMPOUND 5080 | $L_{1-202}$ | $L_{2-179}$ |
| COMPOUND 5081 | $L_{1-202}$ | $L_{2-180}$ |
| COMPOUND 5082 | $L_{1-202}$ | $L_{2-181}$ |
| COMPOUND 5083 | $L_{1-202}$ | $L_{2-182}$ |
| COMPOUND 5084 | $L_{1-202}$ | $L_{2-183}$ |
| COMPOUND 5085 | $L_{1-202}$ | $L_{2-184}$ |
| COMPOUND 5086 | $L_{1-202}$ | $L_{2-185}$ |
| COMPOUND 5087 | $L_{1-202}$ | $L_{2-186}$ |
| COMPOUND 5088 | $L_{1-202}$ | $L_{2-187}$ |
| COMPOUND 5089 | $L_{1-202}$ | $L_{2-188}$ |
| COMPOUND 5090 | $L_{1-202}$ | $L_{2-189}$ |
| COMPOUND 5091 | $L_{1-202}$ | $L_{2-190}$ |
| COMPOUND 5092 | $L_{1-202}$ | $L_{2-191}$ |
| COMPOUND 5093 | $L_{1-202}$ | $L_{2-192}$ |
| COMPOUND 5094 | $L_{1-202}$ | $L_{2-193}$ |
| COMPOUND 5095 | $L_{1-202}$ | $L_{2-194}$ |
| COMPOUND 5096 | $L_{1-202}$ | $L_{2-195}$ |
| COMPOUND 5097 | $L_{1-202}$ | $L_{2-196}$ |
| COMPOUND 5098 | $L_{1-202}$ | $L_{2-197}$ |
| COMPOUND 5099 | $L_{1-202}$ | $L_{2-198}$ |
| COMPOUND 5100 | $L_{1-202}$ | $L_{2-199}$ |
| COMPOUND 5101 | $L_{1-202}$ | $L_{2-200}$ |
| COMPOUND 5102 | $L_{1-202}$ | $L_{2-201}$ |
| COMPOUND 5103 | $L_{1-202}$ | $L_{2-202}$ |
| COMPOUND 5104 | $L_{1-202}$ | $L_{2-203}$ |
| COMPOUND 5105 | $L_{1-202}$ | $L_{2-204}$ |
| COMPOUND 5106 | $L_{1-202}$ | $L_{2-205}$ |
| COMPOUND 5107 | $L_{1-202}$ | $L_{2-206}$ |
| COMPOUND 5108 | $L_{1-202}$ | $L_{2-207}$ |
| COMPOUND 5109 | $L_{1-202}$ | $L_{2-208}$ |
| COMPOUND 5110 | $L_{1-202}$ | $L_{2-209}$ |
| COMPOUND 5111 | $L_{1-202}$ | $L_{2-210}$ |
| COMPOUND 5112 | $L_{1-202}$ | $L_{2-211}$ |
| COMPOUND 5113 | $L_{1-202}$ | $L_{2-212}$ |
| COMPOUND 5114 | $L_{1-202}$ | $L_{2-213}$ |
| COMPOUND 5115 | $L_{1-202}$ | $L_{2-214}$ |
| COMPOUND 5116 | $L_{1-202}$ | $L_{2-215}$ |
| COMPOUND 5117 | $L_{1-202}$ | $L_{2-216}$ |
| COMPOUND 5118 | $L_{1-202}$ | $L_{2-217}$ |
| COMPOUND 5119 | $L_{1-202}$ | $L_{2-218}$ |
| COMPOUND 5120 | $L_{1-202}$ | $L_{2-219}$ |
| COMPOUND 5121 | $L_{1-202}$ | $L_{2-220}$ |
| COMPOUND 5122 | $L_{1-202}$ | $L_{2-221}$ |
| COMPOUND 5123 | $L_{1-202}$ | $L_{2-222}$ |
| COMPOUND 5124 | $L_{1-202}$ | $L_{2-223}$ |
| COMPOUND 5125 | $L_{1-202}$ | $L_{2-224}$ |
| COMPOUND 5126 | $L_{1-202}$ | $L_{2-225}$ |
| COMPOUND 5127 | $L_{1-202}$ | $L_{2-226}$ |
| COMPOUND 5128 | $L_{1-202}$ | $L_{2-227}$ |
| COMPOUND 5129 | $L_{1-202}$ | $L_{2-228}$ |
| COMPOUND 5130 | $L_{1-202}$ | $L_{2-229}$ |
| COMPOUND 5131 | $L_{1-202}$ | $L_{2-230}$ |
| COMPOUND 5132 | $L_{1-202}$ | $L_{2-231}$ |
| COMPOUND 5133 | $L_{1-202}$ | $L_{2-232}$ |
| COMPOUND 5134 | $L_{1-202}$ | $L_{2-233}$ |
| COMPOUND 5135 | $L_{1-202}$ | $L_{2-234}$ |
| COMPOUND 5136 | $L_{1-202}$ | $L_{2-235}$ |
| COMPOUND 5137 | $L_{1-202}$ | $L_{2-236}$ |
| COMPOUND 5138 | $L_{1-202}$ | $L_{2-237}$ |
| COMPOUND 5139 | $L_{1-202}$ | $L_{2-238}$ |
| COMPOUND 5140 | $L_{1-202}$ | $L_{2-239}$ |
| COMPOUND 5141 | $L_{1-202}$ | $L_{2-240}$ |
| COMPOUND 5142 | $L_{1-202}$ | $L_{2-241}$ |
| COMPOUND 5143 | $L_{1-202}$ | $L_{2-242}$ |
| COMPOUND 5144 | $L_{1-202}$ | $L_{2-243}$ |
| COMPOUND 5145 | $L_{1-202}$ | $L_{2-244}$ |
| COMPOUND 5146 | $L_{1-202}$ | $L_{2-245}$ |
| COMPOUND 5147 | $L_{1-202}$ | $L_{2-246}$ |
| COMPOUND 5148 | $L_{1-202}$ | $L_{2-247}$ |
| COMPOUND 5149 | $L_{1-202}$ | $L_{2-248}$ |
| COMPOUND 5150 | $L_{1-202}$ | $L_{2-249}$ |
| COMPOUND 5151 | $L_{1-202}$ | $L_{2-250}$ |
| COMPOUND 5152 | $L_{1-202}$ | $L_{2-251}$ |
| COMPOUND 5153 | $L_{1-202}$ | $L_{2-252}$ |
| COMPOUND 5154 | $L_{1-202}$ | $L_{2-253}$ |
| COMPOUND 5155 | $L_{1-202}$ | $L_{2-254}$ |
| COMPOUND 5156 | $L_{1-202}$ | $L_{2-255}$ |
| COMPOUND 5157 | $L_{1-202}$ | $L_{2-256}$ |
| COMPOUND 5158 | $L_{1-202}$ | $L_{2-257}$ |
| COMPOUND 5159 | $L_{1-202}$ | $L_{2-258}$ |
| COMPOUND 5160 | $L_{1-202}$ | $L_{2-259}$ |
| COMPOUND 5161 | $L_{1-202}$ | $L_{2-260}$ |
| COMPOUND 5162 | $L_{1-202}$ | $L_{2-261}$ |
| COMPOUND 5163 | $L_{1-202}$ | $L_{2-262}$ |
| COMPOUND 5164 | $L_{1-202}$ | $L_{2-263}$ |
| COMPOUND 5165 | $L_{1-202}$ | $L_{2-264}$ |
| COMPOUND 5166 | $L_{1-202}$ | $L_{2-265}$ |
| COMPOUND 5167 | $L_{1-202}$ | $L_{2-266}$ |
| COMPOUND 5168 | $L_{1-202}$ | $L_{2-267}$ |
| COMPOUND 5169 | $L_{1-202}$ | $L_{2-268}$ |
| COMPOUND 5170 | $L_{1-202}$ | $L_{2-269}$ |
| COMPOUND 5171 | $L_{1-202}$ | $L_{2-270}$ |
| COMPOUND 5172 | $L_{1-202}$ | $L_{2-271}$ |
| COMPOUND 5173 | $L_{1-202}$ | $L_{2-272}$ |
| COMPOUND 5174 | $L_{1-202}$ | $L_{2-273}$ |
| COMPOUND 5175 | $L_{1-202}$ | $L_{2-274}$ |
| COMPOUND 5176 | $L_{1-202}$ | $L_{2-275}$ |
| COMPOUND 5177 | $L_{1-202}$ | $L_{2-276}$ |
| COMPOUND 5178 | $L_{1-202}$ | $L_{2-277}$ |
| COMPOUND 5179 | $L_{1-202}$ | $L_{2-278}$ |
| COMPOUND 5180 | $L_{1-202}$ | $L_{2-279}$ |
| COMPOUND 5181 | $L_{1-202}$ | $L_{2-280}$ |
| COMPOUND 5182 | $L_{1-202}$ | $L_{2-281}$ |
| COMPOUND 5183 | $L_{1-202}$ | $L_{2-282}$ |
| COMPOUND 5184 | $L_{1-202}$ | $L_{2-283}$ |
| COMPOUND 5185 | $L_{1-202}$ | $L_{2-284}$ |
| COMPOUND 5186 | $L_{1-202}$ | $L_{2-285}$ |
| COMPOUND 5187 | $L_{1-202}$ | $L_{2-286}$ |
| COMPOUND 5188 | $L_{1-202}$ | $L_{2-287}$ |
| COMPOUND 5189 | $L_{1-202}$ | $L_{2-288}$ |
| COMPOUND 5190 | $L_{1-202}$ | $L_{2-289}$ |
| COMPOUND 5191 | $L_{1-202}$ | $L_{2-290}$ |
| COMPOUND 5192 | $L_{1-202}$ | $L_{2-291}$ |
| COMPOUND 5193 | $L_{1-202}$ | $L_{2-292}$ |
| COMPOUND 5194 | $L_{1-202}$ | $L_{2-293}$ |
| COMPOUND 5195 | $L_{1-202}$ | $L_{2-294}$ |
| COMPOUND 5196 | $L_{1-202}$ | $L_{2-295}$ |
| COMPOUND 5197 | $L_{1-202}$ | $L_{2-296}$ |
| COMPOUND 5198 | $L_{1-202}$ | $L_{2-297}$ |
| COMPOUND 5199 | $L_{1-202}$ | $L_{2-298}$ |
| COMPOUND 5200 | $L_{1-202}$ | $L_{2-299}$ |
| COMPOUND 5201 | $L_{1-202}$ | $L_{2-300}$ |
| COMPOUND 5202 | $L_{1-202}$ | $L_{2-301}$ |
| COMPOUND 5203 | $L_{1-202}$ | $L_{2-302}$ |
| COMPOUND 5204 | $L_{1-202}$ | $L_{2-303}$ |
| COMPOUND 5205 | $L_{1-202}$ | $L_{2-304}$ |
| COMPOUND 5206 | $L_{1-202}$ | $L_{2-305}$ |
| COMPOUND 5207 | $L_{1-202}$ | $L_{2-306}$ |
| COMPOUND 5208 | $L_{1-202}$ | $L_{2-307}$ |
| COMPOUND 5209 | $L_{1-202}$ | $L_{2-308}$ |
| COMPOUND 5210 | $L_{1-202}$ | $L_{2-309}$ |
| COMPOUND 5211 | $L_{1-202}$ | $L_{2-310}$ |
| COMPOUND 5212 | $L_{1-202}$ | $L_{2-311}$ |
| COMPOUND 5213 | $L_{1-202}$ | $L_{2-312}$ |
| COMPOUND 5214 | $L_{1-202}$ | $L_{2-313}$ |
| COMPOUND 5215 | $L_{1-202}$ | $L_{2-314}$ |
| COMPOUND 5216 | $L_{1-202}$ | $L_{2-315}$ |
| COMPOUND 5217 | $L_{1-202}$ | $L_{2-316}$ |
| COMPOUND 5218 | $L_{1-202}$ | $L_{2-317}$ |
| COMPOUND 5219 | $L_{1-202}$ | $L_{2-318}$ |
| COMPOUND 5220 | $L_{1-202}$ | $L_{2-319}$ |
| COMPOUND 5221 | $L_{1-202}$ | $L_{2-320}$ |

-continued

| | | |
|---|---|---|
| COMPOUND 5222 | $L_{1-202}$ | $L_{2-321}$ |
| COMPOUND 5223 | $L_{1-202}$ | $L_{2-322}$ |
| COMPOUND 5224 | $L_{1-202}$ | $L_{2-323}$ |
| COMPOUND 5225 | $L_{1-202}$ | $L_{2-324}$ |
| COMPOUND 5226 | $L_{1-202}$ | $L_{2-325}$ |
| COMPOUND 5227 | $L_{1-202}$ | $L_{2-326}$ |
| COMPOUND 5228 | $L_{1-202}$ | $L_{2-327}$ |
| COMPOUND 5229 | $L_{1-202}$ | $L_{2-328}$ |
| COMPOUND 5230 | $L_{1-202}$ | $L_{2-329}$ |
| COMPOUND 5231 | $L_{1-202}$ | $L_{2-330}$ |
| COMPOUND 5232 | $L_{1-202}$ | $L_{2-331}$ |
| COMPOUND 5233 | $L_{1-202}$ | $L_{2-332}$ |
| COMPOUND 5234 | $L_{1-202}$ | $L_{2-333}$ |
| COMPOUND 5235 | $L_{1-202}$ | $L_{2-334}$ |
| COMPOUND 5236 | $L_{1-202}$ | $L_{2-335}$ |
| COMPOUND 5237 | $L_{1-202}$ | $L_{2-336}$ |
| COMPOUND 5238 | $L_{1-202}$ | $L_{2-337}$ |
| COMPOUND 5239 | $L_{1-202}$ | $L_{2-338}$ |
| COMPOUND 5240 | $L_{1-202}$ | $L_{2-339}$ |
| COMPOUND 5241 | $L_{1-202}$ | $L_{2-340}$ |
| COMPOUND 5242 | $L_{1-202}$ | $L_{2-341}$ |
| COMPOUND 5243 | $L_{1-202}$ | $L_{2-342}$ |
| COMPOUND 5244 | $L_{1-202}$ | $L_{2-343}$ |
| COMPOUND 5245 | $L_{1-202}$ | $L_{2-344}$ |
| COMPOUND 5246 | $L_{1-202}$ | $L_{2-345}$ |
| COMPOUND 5247 | $L_{1-202}$ | $L_{2-346}$ |
| COMPOUND 5248 | $L_{1-202}$ | $L_{2-347}$ |
| COMPOUND 5249 | $L_{1-202}$ | $L_{2-348}$ |
| COMPOUND 5250 | $L_{1-202}$ | $L_{2-349}$ |
| COMPOUND 5251 | $L_{1-202}$ | $L_{2-350}$ |
| COMPOUND 5252 | $L_{1-202}$ | $L_{2-351}$ |
| COMPOUND 5253 | $L_{1-202}$ | $L_{2-352}$ |
| COMPOUND 5254 | $L_{1-202}$ | $L_{2-353}$ |
| COMPOUND 5255 | $L_{1-202}$ | $L_{2-354}$ |
| COMPOUND 5256 | $L_{1-202}$ | $L_{2-355}$ |
| COMPOUND 5257 | $L_{1-202}$ | $L_{2-356}$ |
| COMPOUND 5258 | $L_{1-202}$ | $L_{2-357}$ |
| COMPOUND 5259 | $L_{1-202}$ | $L_{2-358}$ |
| COMPOUND 5260 | $L_{1-202}$ | $L_{2-359}$ |
| COMPOUND 5261 | $L_{1-202}$ | $L_{2-360}$ |
| COMPOUND 5262 | $L_{1-202}$ | $L_{2-361}$ |
| COMPOUND 5263 | $L_{1-202}$ | $L_{2-362}$ |
| COMPOUND 5264 | $L_{1-202}$ | $L_{2-363}$ |
| COMPOUND 5265 | $L_{1-202}$ | $L_{2-364}$ |
| COMPOUND 5266 | $L_{1-202}$ | $L_{2-365}$ |
| COMPOUND 5267 | $L_{1-202}$ | $L_{2-366}$ |
| COMPOUND 5268 | $L_{1-202}$ | $L_{2-367}$ |
| COMPOUND 5269 | $L_{1-202}$ | $L_{2-368}$ |
| COMPOUND 5270 | $L_{1-202}$ | $L_{2-369}$ |
| COMPOUND 5271 | $L_{1-202}$ | $L_{2-370}$ |
| COMPOUND 5272 | $L_{1-202}$ | $L_{2-371}$ |
| COMPOUND 5273 | $L_{1-202}$ | $L_{2-372}$ |
| COMPOUND 5274 | $L_{1-202}$ | $L_{2-373}$ |
| COMPOUND 5275 | $L_{1-202}$ | $L_{2-374}$ |
| COMPOUND 5276 | $L_{1-202}$ | $L_{2-375}$ |
| COMPOUND 5277 | $L_{1-202}$ | $L_{2-376}$ |
| COMPOUND 5278 | $L_{1-203}$ | $L_{2-377}$ |
| COMPOUND 5279 | $L_{1-203}$ | $L_{2-1}$ |
| COMPOUND 5280 | $L_{1-203}$ | $L_{2-2}$ |
| COMPOUND 5281 | $L_{1-203}$ | $L_{2-3}$ |
| COMPOUND 5282 | $L_{1-203}$ | $L_{2-4}$ |
| COMPOUND 5283 | $L_{1-203}$ | $L_{2-5}$ |
| COMPOUND 5284 | $L_{1-203}$ | $L_{2-6}$ |
| COMPOUND 5285 | $L_{1-203}$ | $L_{2-7}$ |
| COMPOUND 5286 | $L_{1-203}$ | $L_{2-8}$ |
| COMPOUND 5287 | $L_{1-203}$ | $L_{2-9}$ |
| COMPOUND 5288 | $L_{1-203}$ | $L_{2-10}$ |
| COMPOUND 5289 | $L_{1-203}$ | $L_{2-11}$ |
| COMPOUND 5290 | $L_{1-203}$ | $L_{2-12}$ |
| COMPOUND 5291 | $L_{1-203}$ | $L_{2-13}$ |
| COMPOUND 5292 | $L_{1-203}$ | $L_{2-14}$ |
| COMPOUND 5293 | $L_{1-203}$ | $L_{2-15}$ |
| COMPOUND 5294 | $L_{1-203}$ | $L_{2-16}$ |
| COMPOUND 5295 | $L_{1-203}$ | $L_{2-17}$ |
| COMPOUND 5296 | $L_{1-203}$ | $L_{2-18}$ |
| COMPOUND 5297 | $L_{1-203}$ | $L_{2-19}$ |
| COMPOUND 5298 | $L_{1-203}$ | $L_{2-20}$ |
| COMPOUND 5299 | $L_{1-203}$ | $L_{2-21}$ |
| COMPOUND 5300 | $L_{1-203}$ | $L_{2-22}$ |
| COMPOUND 5301 | $L_{1-203}$ | $L_{2-23}$ |
| COMPOUND 5302 | $L_{1-203}$ | $L_{2-24}$ |
| COMPOUND 5303 | $L_{1-203}$ | $L_{2-25}$ |
| COMPOUND 5304 | $L_{1-203}$ | $L_{2-26}$ |
| COMPOUND 5305 | $L_{1-203}$ | $L_{2-27}$ |
| COMPOUND 5306 | $L_{1-203}$ | $L_{2-28}$ |
| COMPOUND 5307 | $L_{1-203}$ | $L_{2-29}$ |
| COMPOUND 5308 | $L_{1-203}$ | $L_{2-30}$ |
| COMPOUND 5309 | $L_{1-203}$ | $L_{2-31}$ |
| COMPOUND 5310 | $L_{1-203}$ | $L_{2-32}$ |
| COMPOUND 5311 | $L_{1-203}$ | $L_{2-33}$ |
| COMPOUND 5312 | $L_{1-203}$ | $L_{2-34}$ |
| COMPOUND 5313 | $L_{1-203}$ | $L_{2-35}$ |
| COMPOUND 5314 | $L_{1-203}$ | $L_{2-36}$ |
| COMPOUND 5315 | $L_{1-203}$ | $L_{2-37}$ |
| COMPOUND 5316 | $L_{1-203}$ | $L_{2-38}$ |
| COMPOUND 5317 | $L_{1-203}$ | $L_{2-39}$ |
| COMPOUND 5318 | $L_{1-203}$ | $L_{2-40}$ |
| COMPOUND 5319 | $L_{1-203}$ | $L_{2-41}$ |
| COMPOUND 5320 | $L_{1-203}$ | $L_{2-42}$ |
| COMPOUND 5321 | $L_{1-203}$ | $L_{2-43}$ |
| COMPOUND 5322 | $L_{1-203}$ | $L_{2-44}$ |
| COMPOUND 5323 | $L_{1-203}$ | $L_{2-45}$ |
| COMPOUND 5324 | $L_{1-203}$ | $L_{2-46}$ |
| COMPOUND 5325 | $L_{1-203}$ | $L_{2-47}$ |
| COMPOUND 5326 | $L_{1-203}$ | $L_{2-48}$ |
| COMPOUND 5327 | $L_{1-203}$ | $L_{2-49}$ |
| COMPOUND 5328 | $L_{1-203}$ | $L_{2-50}$ |
| COMPOUND 5329 | $L_{1-203}$ | $L_{2-51}$ |
| COMPOUND 5330 | $L_{1-203}$ | $L_{2-52}$ |
| COMPOUND 5331 | $L_{1-203}$ | $L_{2-53}$ |
| COMPOUND 5332 | $L_{1-203}$ | $L_{2-54}$ |
| COMPOUND 5333 | $L_{1-203}$ | $L_{2-55}$ |
| COMPOUND 5334 | $L_{1-203}$ | $L_{2-56}$ |
| COMPOUND 5335 | $L_{1-203}$ | $L_{2-57}$ |
| COMPOUND 5336 | $L_{1-203}$ | $L_{2-58}$ |
| COMPOUND 5337 | $L_{1-203}$ | $L_{2-59}$ |
| COMPOUND 5338 | $L_{1-203}$ | $L_{2-60}$ |
| COMPOUND 5339 | $L_{1-203}$ | $L_{2-61}$ |
| COMPOUND 5340 | $L_{1-203}$ | $L_{2-62}$ |
| COMPOUND 5341 | $L_{1-203}$ | $L_{2-63}$ |
| COMPOUND 5342 | $L_{1-203}$ | $L_{2-64}$ |
| COMPOUND 5343 | $L_{1-203}$ | $L_{2-65}$ |
| COMPOUND 5344 | $L_{1-203}$ | $L_{2-66}$ |
| COMPOUND 5345 | $L_{1-203}$ | $L_{2-67}$ |
| COMPOUND 5346 | $L_{1-203}$ | $L_{2-68}$ |
| COMPOUND 5347 | $L_{1-203}$ | $L_{2-69}$ |
| COMPOUND 5348 | $L_{1-203}$ | $L_{2-70}$ |
| COMPOUND 5349 | $L_{1-203}$ | $L_{2-71}$ |
| COMPOUND 5350 | $L_{1-203}$ | $L_{2-72}$ |
| COMPOUND 5351 | $L_{1-203}$ | $L_{2-73}$ |
| COMPOUND 5352 | $L_{1-203}$ | $L_{2-74}$ |
| COMPOUND 5353 | $L_{1-203}$ | $L_{2-75}$ |
| COMPOUND 5354 | $L_{1-203}$ | $L_{2-76}$ |
| COMPOUND 5355 | $L_{1-203}$ | $L_{2-77}$ |
| COMPOUND 5356 | $L_{1-203}$ | $L_{2-78}$ |
| COMPOUND 5357 | $L_{1-203}$ | $L_{2-79}$ |
| COMPOUND 5358 | $L_{1-203}$ | $L_{2-80}$ |
| COMPOUND 5359 | $L_{1-203}$ | $L_{2-81}$ |
| COMPOUND 5360 | $L_{1-203}$ | $L_{2-82}$ |
| COMPOUND 5361 | $L_{1-203}$ | $L_{2-83}$ |
| COMPOUND 5362 | $L_{1-203}$ | $L_{2-84}$ |
| COMPOUND 5363 | $L_{1-203}$ | $L_{2-85}$ |
| COMPOUND 5364 | $L_{1-203}$ | $L_{2-86}$ |
| COMPOUND 5365 | $L_{1-203}$ | $L_{2-87}$ |
| COMPOUND 5366 | $L_{1-203}$ | $L_{2-88}$ |
| COMPOUND 5367 | $L_{1-203}$ | $L_{2-89}$ |
| COMPOUND 5368 | $L_{1-203}$ | $L_{2-90}$ |
| COMPOUND 5369 | $L_{1-203}$ | $L_{2-91}$ |
| COMPOUND 5370 | $L_{1-203}$ | $L_{2-92}$ |
| COMPOUND 5371 | $L_{1-203}$ | $L_{2-93}$ |
| COMPOUND 5372 | $L_{1-203}$ | $L_{2-94}$ |
| COMPOUND 5373 | $L_{1-203}$ | $L_{2-95}$ |
| COMPOUND 5374 | $L_{1-203}$ | $L_{2-96}$ |
| COMPOUND 5375 | $L_{1-203}$ | $L_{2-97}$ |
| COMPOUND 5376 | $L_{1-203}$ | $L_{2-98}$ |
| COMPOUND 5377 | $L_{1-203}$ | $L_{2-99}$ |
| COMPOUND 5378 | $L_{1-203}$ | $L_{2-100}$ |
| COMPOUND 5379 | $L_{1-203}$ | $L_{2-101}$ |

| | | |
|---|---|---|
| COMPOUND 5380 | $L_{1-203}$ | $L_{2-102}$ |
| COMPOUND 5381 | $L_{1-203}$ | $L_{2-103}$ |
| COMPOUND 5382 | $L_{1-203}$ | $L_{2-104}$ |
| COMPOUND 5383 | $L_{1-203}$ | $L_{2-105}$ |
| COMPOUND 5384 | $L_{1-203}$ | $L_{2-106}$ |
| COMPOUND 5385 | $L_{1-203}$ | $L_{2-107}$ |
| COMPOUND 5386 | $L_{1-203}$ | $L_{2-108}$ |
| COMPOUND 5387 | $L_{1-203}$ | $L_{2-109}$ |
| COMPOUND 5388 | $L_{1-203}$ | $L_{2-110}$ |
| COMPOUND 5389 | $L_{1-203}$ | $L_{2-111}$ |
| COMPOUND 5390 | $L_{1-203}$ | $L_{2-112}$ |
| COMPOUND 5391 | $L_{1-203}$ | $L_{2-113}$ |
| COMPOUND 5392 | $L_{1-203}$ | $L_{2-114}$ |
| COMPOUND 5393 | $L_{1-203}$ | $L_{2-115}$ |
| COMPOUND 5394 | $L_{1-203}$ | $L_{2-116}$ |
| COMPOUND 5395 | $L_{1-203}$ | $L_{2-117}$ |
| COMPOUND 5396 | $L_{1-203}$ | $L_{2-118}$ |
| COMPOUND 5397 | $L_{1-203}$ | $L_{2-119}$ |
| COMPOUND 5398 | $L_{1-203}$ | $L_{2-120}$ |
| COMPOUND 5399 | $L_{1-203}$ | $L_{2-121}$ |
| COMPOUND 5400 | $L_{1-203}$ | $L_{2-122}$ |
| COMPOUND 5401 | $L_{1-203}$ | $L_{2-123}$ |
| COMPOUND 5402 | $L_{1-203}$ | $L_{2-124}$ |
| COMPOUND 5403 | $L_{1-203}$ | $L_{2-125}$ |
| COMPOUND 5404 | $L_{1-203}$ | $L_{2-126}$ |
| COMPOUND 5405 | $L_{1-203}$ | $L_{2-127}$ |
| COMPOUND 5406 | $L_{1-203}$ | $L_{2-128}$ |
| COMPOUND 5407 | $L_{1-203}$ | $L_{2-129}$ |
| COMPOUND 5408 | $L_{1-203}$ | $L_{2-130}$ |
| COMPOUND 5409 | $L_{1-203}$ | $L_{2-131}$ |
| COMPOUND 5410 | $L_{1-203}$ | $L_{2-132}$ |
| COMPOUND 5411 | $L_{1-203}$ | $L_{2-133}$ |
| COMPOUND 5412 | $L_{1-203}$ | $L_{2-134}$ |
| COMPOUND 5413 | $L_{1-203}$ | $L_{2-135}$ |
| COMPOUND 5414 | $L_{1-203}$ | $L_{2-136}$ |
| COMPOUND 5415 | $L_{1-203}$ | $L_{2-137}$ |
| COMPOUND 5416 | $L_{1-203}$ | $L_{2-138}$ |
| COMPOUND 5417 | $L_{1-203}$ | $L_{2-139}$ |
| COMPOUND 5418 | $L_{1-203}$ | $L_{2-140}$ |
| COMPOUND 5419 | $L_{1-203}$ | $L_{2-141}$ |
| COMPOUND 5420 | $L_{1-203}$ | $L_{2-142}$ |
| COMPOUND 5421 | $L_{1-203}$ | $L_{2-143}$ |
| COMPOUND 5422 | $L_{1-203}$ | $L_{2-144}$ |
| COMPOUND 5423 | $L_{1-203}$ | $L_{2-145}$ |
| COMPOUND 5424 | $L_{1-203}$ | $L_{2-146}$ |
| COMPOUND 5425 | $L_{1-203}$ | $L_{2-147}$ |
| COMPOUND 5426 | $L_{1-203}$ | $L_{2-148}$ |
| COMPOUND 5427 | $L_{1-203}$ | $L_{2-149}$ |
| COMPOUND 5428 | $L_{1-203}$ | $L_{2-150}$ |
| COMPOUND 5429 | $L_{1-203}$ | $L_{2-151}$ |
| COMPOUND 5430 | $L_{1-203}$ | $L_{2-152}$ |
| COMPOUND 5431 | $L_{1-203}$ | $L_{2-153}$ |
| COMPOUND 5432 | $L_{1-203}$ | $L_{2-154}$ |
| COMPOUND 5433 | $L_{1-203}$ | $L_{2-155}$ |
| COMPOUND 5434 | $L_{1-203}$ | $L_{2-156}$ |
| COMPOUND 5435 | $L_{1-203}$ | $L_{2-157}$ |
| COMPOUND 5436 | $L_{1-203}$ | $L_{2-158}$ |
| COMPOUND 5437 | $L_{1-203}$ | $L_{2-159}$ |
| COMPOUND 5438 | $L_{1-203}$ | $L_{2-160}$ |
| COMPOUND 5439 | $L_{1-203}$ | $L_{2-161}$ |
| COMPOUND 5440 | $L_{1-203}$ | $L_{2-162}$ |
| COMPOUND 5441 | $L_{1-203}$ | $L_{2-163}$ |
| COMPOUND 5442 | $L_{1-203}$ | $L_{2-164}$ |
| COMPOUND 5443 | $L_{1-203}$ | $L_{2-165}$ |
| COMPOUND 5444 | $L_{1-203}$ | $L_{2-166}$ |
| COMPOUND 5445 | $L_{1-203}$ | $L_{2-167}$ |
| COMPOUND 5446 | $L_{1-203}$ | $L_{2-168}$ |
| COMPOUND 5447 | $L_{1-203}$ | $L_{2-169}$ |
| COMPOUND 5448 | $L_{1-203}$ | $L_{2-170}$ |
| COMPOUND 5449 | $L_{1-203}$ | $L_{2-171}$ |
| COMPOUND 5450 | $L_{1-203}$ | $L_{2-172}$ |
| COMPOUND 5451 | $L_{1-203}$ | $L_{2-173}$ |
| COMPOUND 5452 | $L_{1-203}$ | $L_{2-174}$ |
| COMPOUND 5453 | $L_{1-203}$ | $L_{2-175}$ |
| COMPOUND 5454 | $L_{1-203}$ | $L_{2-176}$ |
| COMPOUND 5455 | $L_{1-203}$ | $L_{2-177}$ |
| COMPOUND 5456 | $L_{1-203}$ | $L_{2-178}$ |
| COMPOUND 5457 | $L_{1-203}$ | $L_{2-179}$ |
| COMPOUND 5458 | $L_{1-203}$ | $L_{2-180}$ |

| | | |
|---|---|---|
| COMPOUND 5459 | $L_{1-203}$ | $L_{2-181}$ |
| COMPOUND 5460 | $L_{1-203}$ | $L_{2-182}$ |
| COMPOUND 5461 | $L_{1-203}$ | $L_{2-183}$ |
| COMPOUND 5462 | $L_{1-203}$ | $L_{2-184}$ |
| COMPOUND 5463 | $L_{1-203}$ | $L_{2-185}$ |
| COMPOUND 5464 | $L_{1-203}$ | $L_{2-186}$ |
| COMPOUND 5465 | $L_{1-203}$ | $L_{2-187}$ |
| COMPOUND 5466 | $L_{1-203}$ | $L_{2-188}$ |
| COMPOUND 5467 | $L_{1-203}$ | $L_{2-189}$ |
| COMPOUND 5468 | $L_{1-203}$ | $L_{2-190}$ |
| COMPOUND 5469 | $L_{1-203}$ | $L_{2-191}$ |
| COMPOUND 5470 | $L_{1-203}$ | $L_{2-192}$ |
| COMPOUND 5471 | $L_{1-203}$ | $L_{2-193}$ |
| COMPOUND 5472 | $L_{1-203}$ | $L_{2-194}$ |
| COMPOUND 5473 | $L_{1-203}$ | $L_{2-195}$ |
| COMPOUND 5474 | $L_{1-203}$ | $L_{2-196}$ |
| COMPOUND 5475 | $L_{1-203}$ | $L_{2-197}$ |
| COMPOUND 5476 | $L_{1-203}$ | $L_{2-198}$ |
| COMPOUND 5477 | $L_{1-203}$ | $L_{2-199}$ |
| COMPOUND 5478 | $L_{1-203}$ | $L_{2-200}$ |
| COMPOUND 5479 | $L_{1-203}$ | $L_{2-201}$ |
| COMPOUND 5480 | $L_{1-203}$ | $L_{2-202}$ |
| COMPOUND 5481 | $L_{1-203}$ | $L_{2-203}$ |
| COMPOUND 5482 | $L_{1-203}$ | $L_{2-204}$ |
| COMPOUND 5483 | $L_{1-203}$ | $L_{2-205}$ |
| COMPOUND 5484 | $L_{1-203}$ | $L_{2-206}$ |
| COMPOUND 5485 | $L_{1-203}$ | $L_{2-207}$ |
| COMPOUND 5486 | $L_{1-203}$ | $L_{2-208}$ |
| COMPOUND 5487 | $L_{1-203}$ | $L_{2-209}$ |
| COMPOUND 5488 | $L_{1-203}$ | $L_{2-210}$ |
| COMPOUND 5489 | $L_{1-203}$ | $L_{2-211}$ |
| COMPOUND 5490 | $L_{1-203}$ | $L_{2-212}$ |
| COMPOUND 5491 | $L_{1-203}$ | $L_{2-213}$ |
| COMPOUND 5492 | $L_{1-203}$ | $L_{2-214}$ |
| COMPOUND 5493 | $L_{1-203}$ | $L_{2-215}$ |
| COMPOUND 5494 | $L_{1-203}$ | $L_{2-216}$ |
| COMPOUND 5495 | $L_{1-203}$ | $L_{2-217}$ |
| COMPOUND 5496 | $L_{1-203}$ | $L_{2-218}$ |
| COMPOUND 5497 | $L_{1-203}$ | $L_{2-219}$ |
| COMPOUND 5498 | $L_{1-203}$ | $L_{2-220}$ |
| COMPOUND 5499 | $L_{1-203}$ | $L_{2-221}$ |
| COMPOUND 5500 | $L_{1-203}$ | $L_{2-222}$ |
| COMPOUND 5501 | $L_{1-203}$ | $L_{2-223}$ |
| COMPOUND 5502 | $L_{1-203}$ | $L_{2-224}$ |
| COMPOUND 5503 | $L_{1-203}$ | $L_{2-225}$ |
| COMPOUND 5504 | $L_{1-203}$ | $L_{2-226}$ |
| COMPOUND 5505 | $L_{1-203}$ | $L_{2-227}$ |
| COMPOUND 5506 | $L_{1-203}$ | $L_{2-228}$ |
| COMPOUND 5507 | $L_{1-203}$ | $L_{2-229}$ |
| COMPOUND 5508 | $L_{1-203}$ | $L_{2-230}$ |
| COMPOUND 5509 | $L_{1-203}$ | $L_{2-231}$ |
| COMPOUND 5510 | $L_{1-203}$ | $L_{2-232}$ |
| COMPOUND 5511 | $L_{1-203}$ | $L_{2-233}$ |
| COMPOUND 5512 | $L_{1-203}$ | $L_{2-234}$ |
| COMPOUND 5513 | $L_{1-203}$ | $L_{2-235}$ |
| COMPOUND 5514 | $L_{1-203}$ | $L_{2-236}$ |
| COMPOUND 5515 | $L_{1-203}$ | $L_{2-237}$ |
| COMPOUND 5516 | $L_{1-203}$ | $L_{2-238}$ |
| COMPOUND 5517 | $L_{1-203}$ | $L_{2-239}$ |
| COMPOUND 5518 | $L_{1-203}$ | $L_{2-240}$ |
| COMPOUND 5519 | $L_{1-203}$ | $L_{2-241}$ |
| COMPOUND 5520 | $L_{1-203}$ | $L_{2-242}$ |
| COMPOUND 5521 | $L_{1-203}$ | $L_{2-243}$ |
| COMPOUND 5522 | $L_{1-203}$ | $L_{2-244}$ |
| COMPOUND 5523 | $L_{1-203}$ | $L_{2-245}$ |
| COMPOUND 5524 | $L_{1-203}$ | $L_{2-246}$ |
| COMPOUND 5525 | $L_{1-203}$ | $L_{2-247}$ |
| COMPOUND 5526 | $L_{1-203}$ | $L_{2-248}$ |
| COMPOUND 5527 | $L_{1-203}$ | $L_{2-249}$ |
| COMPOUND 5528 | $L_{1-203}$ | $L_{2-250}$ |
| COMPOUND 5529 | $L_{1-203}$ | $L_{2-251}$ |
| COMPOUND 5530 | $L_{1-203}$ | $L_{2-252}$ |
| COMPOUND 5531 | $L_{1-203}$ | $L_{2-253}$ |
| COMPOUND 5532 | $L_{1-203}$ | $L_{2-254}$ |
| COMPOUND 5533 | $L_{1-203}$ | $L_{2-255}$ |
| COMPOUND 5534 | $L_{1-203}$ | $L_{2-256}$ |
| COMPOUND 5535 | $L_{1-203}$ | $L_{2-257}$ |
| COMPOUND 5536 | $L_{1-203}$ | $L_{2-258}$ |
| COMPOUND 5537 | $L_{1-203}$ | $L_{2-259}$ |

-continued

| | | |
|---|---|---|
| COMPOUND 5538 | $L_{1-203}$ | $L_{2-260}$ |
| COMPOUND 5539 | $L_{1-203}$ | $L_{2-261}$ |
| COMPOUND 5540 | $L_{1-203}$ | $L_{2-262}$ |
| COMPOUND 5541 | $L_{1-203}$ | $L_{2-263}$ |
| COMPOUND 5542 | $L_{1-203}$ | $L_{2-264}$ |
| COMPOUND 5543 | $L_{1-203}$ | $L_{2-265}$ |
| COMPOUND 5544 | $L_{1-203}$ | $L_{2-266}$ |
| COMPOUND 5545 | $L_{1-203}$ | $L_{2-267}$ |
| COMPOUND 5546 | $L_{1-203}$ | $L_{2-268}$ |
| COMPOUND 5547 | $L_{1-203}$ | $L_{2-269}$ |
| COMPOUND 5548 | $L_{1-203}$ | $L_{2-270}$ |
| COMPOUND 5549 | $L_{1-203}$ | $L_{2-271}$ |
| COMPOUND 5550 | $L_{1-203}$ | $L_{2-272}$ |
| COMPOUND 5551 | $L_{1-203}$ | $L_{2-273}$ |
| COMPOUND 5552 | $L_{1-203}$ | $L_{2-274}$ |
| COMPOUND 5553 | $L_{1-203}$ | $L_{2-275}$ |
| COMPOUND 5554 | $L_{1-203}$ | $L_{2-276}$ |
| COMPOUND 5555 | $L_{1-203}$ | $L_{2-277}$ |
| COMPOUND 5556 | $L_{1-203}$ | $L_{2-278}$ |
| COMPOUND 5557 | $L_{1-203}$ | $L_{2-279}$ |
| COMPOUND 5558 | $L_{1-203}$ | $L_{2-280}$ |
| COMPOUND 5559 | $L_{1-203}$ | $L_{2-281}$ |
| COMPOUND 5560 | $L_{1-203}$ | $L_{2-282}$ |
| COMPOUND 5561 | $L_{1-203}$ | $L_{2-283}$ |
| COMPOUND 5562 | $L_{1-203}$ | $L_{2-284}$ |
| COMPOUND 5563 | $L_{1-203}$ | $L_{2-285}$ |
| COMPOUND 5564 | $L_{1-203}$ | $L_{2-286}$ |
| COMPOUND 5565 | $L_{1-203}$ | $L_{2-287}$ |
| COMPOUND 5566 | $L_{1-203}$ | $L_{2-288}$ |
| COMPOUND 5567 | $L_{1-203}$ | $L_{2-289}$ |
| COMPOUND 5568 | $L_{1-203}$ | $L_{2-290}$ |
| COMPOUND 5569 | $L_{1-203}$ | $L_{2-291}$ |
| COMPOUND 5570 | $L_{1-203}$ | $L_{2-292}$ |
| COMPOUND 5571 | $L_{1-203}$ | $L_{2-293}$ |
| COMPOUND 5572 | $L_{1-203}$ | $L_{2-294}$ |
| COMPOUND 5573 | $L_{1-203}$ | $L_{2-295}$ |
| COMPOUND 5574 | $L_{1-203}$ | $L_{2-296}$ |
| COMPOUND 5575 | $L_{1-203}$ | $L_{2-297}$ |
| COMPOUND 5576 | $L_{1-203}$ | $L_{2-298}$ |
| COMPOUND 5577 | $L_{1-203}$ | $L_{2-299}$ |
| COMPOUND 5578 | $L_{1-203}$ | $L_{2-300}$ |
| COMPOUND 5579 | $L_{1-203}$ | $L_{2-301}$ |
| COMPOUND 5580 | $L_{1-203}$ | $L_{2-302}$ |
| COMPOUND 5581 | $L_{1-203}$ | $L_{2-303}$ |
| COMPOUND 5582 | $L_{1-203}$ | $L_{2-304}$ |
| COMPOUND 5583 | $L_{1-203}$ | $L_{2-305}$ |
| COMPOUND 5584 | $L_{1-203}$ | $L_{2-306}$ |
| COMPOUND 5585 | $L_{1-203}$ | $L_{2-307}$ |
| COMPOUND 5586 | $L_{1-203}$ | $L_{2-308}$ |
| COMPOUND 5587 | $L_{1-203}$ | $L_{2-309}$ |
| COMPOUND 5588 | $L_{1-203}$ | $L_{2-310}$ |
| COMPOUND 5589 | $L_{1-203}$ | $L_{2-311}$ |
| COMPOUND 5590 | $L_{1-203}$ | $L_{2-312}$ |
| COMPOUND 5591 | $L_{1-203}$ | $L_{2-313}$ |
| COMPOUND 5592 | $L_{1-203}$ | $L_{2-314}$ |
| COMPOUND 5593 | $L_{1-203}$ | $L_{2-315}$ |
| COMPOUND 5594 | $L_{1-203}$ | $L_{2-316}$ |
| COMPOUND 5595 | $L_{1-203}$ | $L_{2-317}$ |
| COMPOUND 5596 | $L_{1-203}$ | $L_{2-318}$ |
| COMPOUND 5597 | $L_{1-203}$ | $L_{2-319}$ |
| COMPOUND 5598 | $L_{1-203}$ | $L_{2-320}$ |
| COMPOUND 5599 | $L_{1-203}$ | $L_{2-321}$ |
| COMPOUND 5600 | $L_{1-203}$ | $L_{2-322}$ |
| COMPOUND 5601 | $L_{1-203}$ | $L_{2-323}$ |
| COMPOUND 5602 | $L_{1-203}$ | $L_{2-324}$ |
| COMPOUND 5603 | $L_{1-203}$ | $L_{2-325}$ |
| COMPOUND 5604 | $L_{1-203}$ | $L_{2-326}$ |
| COMPOUND 5605 | $L_{1-203}$ | $L_{2-327}$ |
| COMPOUND 5606 | $L_{1-203}$ | $L_{2-328}$ |
| COMPOUND 5607 | $L_{1-203}$ | $L_{2-329}$ |
| COMPOUND 5608 | $L_{1-203}$ | $L_{2-330}$ |
| COMPOUND 5609 | $L_{1-203}$ | $L_{2-331}$ |
| COMPOUND 5610 | $L_{1-203}$ | $L_{2-332}$ |
| COMPOUND 5611 | $L_{1-203}$ | $L_{2-333}$ |
| COMPOUND 5612 | $L_{1-203}$ | $L_{2-334}$ |
| COMPOUND 5613 | $L_{1-203}$ | $L_{2-335}$ |
| COMPOUND 5614 | $L_{1-203}$ | $L_{2-336}$ |
| COMPOUND 5615 | $L_{1-203}$ | $L_{2-337}$ |
| COMPOUND 5616 | $L_{1-203}$ | $L_{2-338}$ |

-continued

| | | |
|---|---|---|
| COMPOUND 5617 | $L_{1-203}$ | $L_{2-339}$ |
| COMPOUND 5618 | $L_{1-203}$ | $L_{2-340}$ |
| COMPOUND 5619 | $L_{1-203}$ | $L_{2-341}$ |
| COMPOUND 5620 | $L_{1-203}$ | $L_{2-342}$ |
| COMPOUND 5621 | $L_{1-203}$ | $L_{2-343}$ |
| COMPOUND 5622 | $L_{1-203}$ | $L_{2-344}$ |
| COMPOUND 5623 | $L_{1-203}$ | $L_{2-345}$ |
| COMPOUND 5624 | $L_{1-203}$ | $L_{2-346}$ |
| COMPOUND 5625 | $L_{1-203}$ | $L_{2-347}$ |
| COMPOUND 5626 | $L_{1-203}$ | $L_{2-348}$ |
| COMPOUND 5627 | $L_{1-203}$ | $L_{2-349}$ |
| COMPOUND 5628 | $L_{1-203}$ | $L_{2-350}$ |
| COMPOUND 5629 | $L_{1-203}$ | $L_{2-351}$ |
| COMPOUND 5630 | $L_{1-203}$ | $L_{2-352}$ |
| COMPOUND 5631 | $L_{1-203}$ | $L_{2-353}$ |
| COMPOUND 5632 | $L_{1-203}$ | $L_{2-354}$ |
| COMPOUND 5633 | $L_{1-203}$ | $L_{2-355}$ |
| COMPOUND 5634 | $L_{1-203}$ | $L_{2-356}$ |
| COMPOUND 5635 | $L_{1-203}$ | $L_{2-357}$ |
| COMPOUND 5636 | $L_{1-203}$ | $L_{2-358}$ |
| COMPOUND 5637 | $L_{1-203}$ | $L_{2-359}$ |
| COMPOUND 5638 | $L_{1-203}$ | $L_{2-360}$ |
| COMPOUND 5639 | $L_{1-203}$ | $L_{2-361}$ |
| COMPOUND 5640 | $L_{1-203}$ | $L_{2-362}$ |
| COMPOUND 5641 | $L_{1-203}$ | $L_{2-363}$ |
| COMPOUND 5642 | $L_{1-203}$ | $L_{2-364}$ |
| COMPOUND 5643 | $L_{1-203}$ | $L_{2-365}$ |
| COMPOUND 5644 | $L_{1-203}$ | $L_{2-366}$ |
| COMPOUND 5645 | $L_{1-203}$ | $L_{2-367}$ |
| COMPOUND 5646 | $L_{1-203}$ | $L_{2-368}$ |
| COMPOUND 5647 | $L_{1-203}$ | $L_{2-369}$ |
| COMPOUND 5648 | $L_{1-203}$ | $L_{2-370}$ |
| COMPOUND 5649 | $L_{1-203}$ | $L_{2-371}$ |
| COMPOUND 5650 | $L_{1-203}$ | $L_{2-372}$ |
| COMPOUND 5651 | $L_{1-203}$ | $L_{2-373}$ |
| COMPOUND 5652 | $L_{1-203}$ | $L_{2-374}$ |
| COMPOUND 5653 | $L_{1-203}$ | $L_{2-375}$ |
| COMPOUND 5654 | $L_{1-203}$ | $L_{2-376}$ |
| COMPOUND 5655 | $L_{1-204}$ | $L_{2-377}$ |
| COMPOUND 5656 | $L_{1-204}$ | $L_{2-1}$ |
| COMPOUND 5657 | $L_{1-204}$ | $L_{2-2}$ |
| COMPOUND 5658 | $L_{1-204}$ | $L_{2-3}$ |
| COMPOUND 5659 | $L_{1-204}$ | $L_{2-4}$ |
| COMPOUND 5660 | $L_{1-204}$ | $L_{2-5}$ |
| COMPOUND 5661 | $L_{1-204}$ | $L_{2-6}$ |
| COMPOUND 5662 | $L_{1-204}$ | $L_{2-7}$ |
| COMPOUND 5663 | $L_{1-204}$ | $L_{2-8}$ |
| COMPOUND 5664 | $L_{1-204}$ | $L_{2-9}$ |
| COMPOUND 5665 | $L_{1-204}$ | $L_{2-10}$ |
| COMPOUND 5666 | $L_{1-204}$ | $L_{2-11}$ |
| COMPOUND 5667 | $L_{1-204}$ | $L_{2-12}$ |
| COMPOUND 5668 | $L_{1-204}$ | $L_{2-13}$ |
| COMPOUND 5669 | $L_{1-204}$ | $L_{2-14}$ |
| COMPOUND 5670 | $L_{1-204}$ | $L_{2-15}$ |
| COMPOUND 5671 | $L_{1-204}$ | $L_{2-16}$ |
| COMPOUND 5672 | $L_{1-204}$ | $L_{2-17}$ |
| COMPOUND 5673 | $L_{1-204}$ | $L_{2-18}$ |
| COMPOUND 5674 | $L_{1-204}$ | $L_{2-19}$ |
| COMPOUND 5675 | $L_{1-204}$ | $L_{2-20}$ |
| COMPOUND 5676 | $L_{1-204}$ | $L_{2-21}$ |
| COMPOUND 5677 | $L_{1-204}$ | $L_{2-22}$ |
| COMPOUND 5678 | $L_{1-204}$ | $L_{2-23}$ |
| COMPOUND 5679 | $L_{1-204}$ | $L_{2-24}$ |
| COMPOUND 5680 | $L_{1-204}$ | $L_{2-25}$ |
| COMPOUND 5681 | $L_{1-204}$ | $L_{2-26}$ |
| COMPOUND 5682 | $L_{1-204}$ | $L_{2-27}$ |
| COMPOUND 5683 | $L_{1-204}$ | $L_{2-28}$ |
| COMPOUND 5684 | $L_{1-204}$ | $L_{2-29}$ |
| COMPOUND 5685 | $L_{1-204}$ | $L_{2-30}$ |
| COMPOUND 5686 | $L_{1-204}$ | $L_{2-31}$ |
| COMPOUND 5687 | $L_{1-204}$ | $L_{2-32}$ |
| COMPOUND 5688 | $L_{1-204}$ | $L_{2-33}$ |
| COMPOUND 5689 | $L_{1-204}$ | $L_{2-34}$ |
| COMPOUND 5690 | $L_{1-204}$ | $L_{2-35}$ |
| COMPOUND 5691 | $L_{1-204}$ | $L_{2-36}$ |
| COMPOUND 5692 | $L_{1-204}$ | $L_{2-37}$ |
| COMPOUND 5693 | $L_{1-204}$ | $L_{2-38}$ |
| COMPOUND 5694 | $L_{1-204}$ | $L_{2-39}$ |
| COMPOUND 5695 | $L_{1-204}$ | $L_{2-40}$ |

| | | |
|---|---|---|
| COMPOUND 5696 | $L_{1-204}$ | $L_{2-41}$ |
| COMPOUND 5697 | $L_{1-204}$ | $L_{2-42}$ |
| COMPOUND 5698 | $L_{1-204}$ | $L_{2-43}$ |
| COMPOUND 5699 | $L_{1-204}$ | $L_{2-44}$ |
| COMPOUND 5700 | $L_{1-204}$ | $L_{2-45}$ |
| COMPOUND 5701 | $L_{1-204}$ | $L_{2-46}$ |
| COMPOUND 5702 | $L_{1-204}$ | $L_{2-47}$ |
| COMPOUND 5703 | $L_{1-204}$ | $L_{2-48}$ |
| COMPOUND 5704 | $L_{1-204}$ | $L_{2-49}$ |
| COMPOUND 5705 | $L_{1-204}$ | $L_{2-50}$ |
| COMPOUND 5706 | $L_{1-204}$ | $L_{2-51}$ |
| COMPOUND 5707 | $L_{1-204}$ | $L_{2-52}$ |
| COMPOUND 5708 | $L_{1-204}$ | $L_{2-53}$ |
| COMPOUND 5709 | $L_{1-204}$ | $L_{2-54}$ |
| COMPOUND 5710 | $L_{1-204}$ | $L_{2-55}$ |
| COMPOUND 5711 | $L_{1-204}$ | $L_{2-56}$ |
| COMPOUND 5712 | $L_{1-204}$ | $L_{2-57}$ |
| COMPOUND 5713 | $L_{1-204}$ | $L_{2-58}$ |
| COMPOUND 5714 | $L_{1-204}$ | $L_{2-59}$ |
| COMPOUND 5715 | $L_{1-204}$ | $L_{2-60}$ |
| COMPOUND 5716 | $L_{1-204}$ | $L_{2-61}$ |
| COMPOUND 5717 | $L_{1-204}$ | $L_{2-62}$ |
| COMPOUND 5718 | $L_{1-204}$ | $L_{2-63}$ |
| COMPOUND 5719 | $L_{1-204}$ | $L_{2-64}$ |
| COMPOUND 5720 | $L_{1-204}$ | $L_{2-65}$ |
| COMPOUND 5721 | $L_{1-204}$ | $L_{2-66}$ |
| COMPOUND 5722 | $L_{1-204}$ | $L_{2-67}$ |
| COMPOUND 5723 | $L_{1-204}$ | $L_{2-68}$ |
| COMPOUND 5724 | $L_{1-204}$ | $L_{2-69}$ |
| COMPOUND 5725 | $L_{1-204}$ | $L_{2-70}$ |
| COMPOUND 5726 | $L_{1-204}$ | $L_{2-71}$ |
| COMPOUND 5727 | $L_{1-204}$ | $L_{2-72}$ |
| COMPOUND 5728 | $L_{1-204}$ | $L_{2-73}$ |
| COMPOUND 5729 | $L_{1-204}$ | $L_{2-74}$ |
| COMPOUND 5730 | $L_{1-204}$ | $L_{2-75}$ |
| COMPOUND 5731 | $L_{1-204}$ | $L_{2-76}$ |
| COMPOUND 5732 | $L_{1-204}$ | $L_{2-77}$ |
| COMPOUND 5733 | $L_{1-204}$ | $L_{2-78}$ |
| COMPOUND 5734 | $L_{1-204}$ | $L_{2-79}$ |
| COMPOUND 5735 | $L_{1-204}$ | $L_{2-80}$ |
| COMPOUND 5736 | $L_{1-204}$ | $L_{2-81}$ |
| COMPOUND 5737 | $L_{1-204}$ | $L_{2-82}$ |
| COMPOUND 5738 | $L_{1-204}$ | $L_{2-83}$ |
| COMPOUND 5739 | $L_{1-204}$ | $L_{2-84}$ |
| COMPOUND 5740 | $L_{1-204}$ | $L_{2-85}$ |
| COMPOUND 5741 | $L_{1-204}$ | $L_{2-86}$ |
| COMPOUND 5742 | $L_{1-204}$ | $L_{2-87}$ |
| COMPOUND 5743 | $L_{1-204}$ | $L_{2-88}$ |
| COMPOUND 5744 | $L_{1-204}$ | $L_{2-89}$ |
| COMPOUND 5745 | $L_{1-204}$ | $L_{2-90}$ |
| COMPOUND 5746 | $L_{1-204}$ | $L_{2-91}$ |
| COMPOUND 5747 | $L_{1-204}$ | $L_{2-92}$ |
| COMPOUND 5748 | $L_{1-204}$ | $L_{2-93}$ |
| COMPOUND 5749 | $L_{1-204}$ | $L_{2-94}$ |
| COMPOUND 5750 | $L_{1-204}$ | $L_{2-95}$ |
| COMPOUND 5751 | $L_{1-204}$ | $L_{2-96}$ |
| COMPOUND 5752 | $L_{1-204}$ | $L_{2-97}$ |
| COMPOUND 5753 | $L_{1-204}$ | $L_{2-98}$ |
| COMPOUND 5754 | $L_{1-204}$ | $L_{2-99}$ |
| COMPOUND 5755 | $L_{1-204}$ | $L_{2-100}$ |
| COMPOUND 5756 | $L_{1-204}$ | $L_{2-101}$ |
| COMPOUND 5757 | $L_{1-204}$ | $L_{2-102}$ |
| COMPOUND 5758 | $L_{1-204}$ | $L_{2-103}$ |
| COMPOUND 5759 | $L_{1-204}$ | $L_{2-104}$ |
| COMPOUND 5760 | $L_{1-204}$ | $L_{2-105}$ |
| COMPOUND 5761 | $L_{1-204}$ | $L_{2-106}$ |
| COMPOUND 5762 | $L_{1-204}$ | $L_{2-107}$ |
| COMPOUND 5763 | $L_{1-204}$ | $L_{2-108}$ |
| COMPOUND 5764 | $L_{1-204}$ | $L_{2-109}$ |
| COMPOUND 5765 | $L_{1-204}$ | $L_{2-110}$ |
| COMPOUND 5766 | $L_{1-204}$ | $L_{2-111}$ |
| COMPOUND 5767 | $L_{1-204}$ | $L_{2-112}$ |
| COMPOUND 5768 | $L_{1-204}$ | $L_{2-113}$ |
| COMPOUND 5769 | $L_{1-204}$ | $L_{2-114}$ |
| COMPOUND 5770 | $L_{1-204}$ | $L_{2-115}$ |
| COMPOUND 5771 | $L_{1-204}$ | $L_{2-116}$ |
| COMPOUND 5772 | $L_{1-204}$ | $L_{2-117}$ |
| COMPOUND 5773 | $L_{1-204}$ | $L_{2-118}$ |
| COMPOUND 5774 | $L_{1-204}$ | $L_{2-119}$ |

| | | |
|---|---|---|
| COMPOUND 5775 | $L_{1-204}$ | $L_{2-120}$ |
| COMPOUND 5776 | $L_{1-204}$ | $L_{2-121}$ |
| COMPOUND 5777 | $L_{1-204}$ | $L_{2-122}$ |
| COMPOUND 5778 | $L_{1-204}$ | $L_{2-123}$ |
| COMPOUND 5779 | $L_{1-204}$ | $L_{2-124}$ |
| COMPOUND 5780 | $L_{1-204}$ | $L_{2-125}$ |
| COMPOUND 5781 | $L_{1-204}$ | $L_{2-126}$ |
| COMPOUND 5782 | $L_{1-204}$ | $L_{2-127}$ |
| COMPOUND 5783 | $L_{1-204}$ | $L_{2-128}$ |
| COMPOUND 5784 | $L_{1-204}$ | $L_{2-129}$ |
| COMPOUND 5785 | $L_{1-204}$ | $L_{2-130}$ |
| COMPOUND 5786 | $L_{1-204}$ | $L_{2-131}$ |
| COMPOUND 5787 | $L_{1-204}$ | $L_{2-132}$ |
| COMPOUND 5788 | $L_{1-204}$ | $L_{2-133}$ |
| COMPOUND 5789 | $L_{1-204}$ | $L_{2-134}$ |
| COMPOUND 5790 | $L_{1-204}$ | $L_{2-135}$ |
| COMPOUND 5791 | $L_{1-204}$ | $L_{2-136}$ |
| COMPOUND 5792 | $L_{1-204}$ | $L_{2-137}$ |
| COMPOUND 5793 | $L_{1-204}$ | $L_{2-138}$ |
| COMPOUND 5794 | $L_{1-204}$ | $L_{2-139}$ |
| COMPOUND 5795 | $L_{1-204}$ | $L_{2-140}$ |
| COMPOUND 5796 | $L_{1-204}$ | $L_{2-141}$ |
| COMPOUND 5797 | $L_{1-204}$ | $L_{2-142}$ |
| COMPOUND 5798 | $L_{1-204}$ | $L_{2-143}$ |
| COMPOUND 5799 | $L_{1-204}$ | $L_{2-144}$ |
| COMPOUND 5800 | $L_{1-204}$ | $L_{2-145}$ |
| COMPOUND 5801 | $L_{1-204}$ | $L_{2-146}$ |
| COMPOUND 5802 | $L_{1-204}$ | $L_{2-147}$ |
| COMPOUND 5803 | $L_{1-204}$ | $L_{2-148}$ |
| COMPOUND 5804 | $L_{1-204}$ | $L_{2-149}$ |
| COMPOUND 5805 | $L_{1-204}$ | $L_{2-150}$ |
| COMPOUND 5806 | $L_{1-204}$ | $L_{2-151}$ |
| COMPOUND 5807 | $L_{1-204}$ | $L_{2-152}$ |
| COMPOUND 5808 | $L_{1-204}$ | $L_{2-153}$ |
| COMPOUND 5809 | $L_{1-204}$ | $L_{2-154}$ |
| COMPOUND 5810 | $L_{1-204}$ | $L_{2-155}$ |
| COMPOUND 5811 | $L_{1-204}$ | $L_{2-156}$ |
| COMPOUND 5812 | $L_{1-204}$ | $L_{2-157}$ |
| COMPOUND 5813 | $L_{1-204}$ | $L_{2-158}$ |
| COMPOUND 5814 | $L_{1-204}$ | $L_{2-159}$ |
| COMPOUND 5815 | $L_{1-204}$ | $L_{2-160}$ |
| COMPOUND 5816 | $L_{1-204}$ | $L_{2-161}$ |
| COMPOUND 5817 | $L_{1-204}$ | $L_{2-162}$ |
| COMPOUND 5818 | $L_{1-204}$ | $L_{2-163}$ |
| COMPOUND 5819 | $L_{1-204}$ | $L_{2-164}$ |
| COMPOUND 5820 | $L_{1-204}$ | $L_{2-165}$ |
| COMPOUND 5821 | $L_{1-204}$ | $L_{2-166}$ |
| COMPOUND 5822 | $L_{1-204}$ | $L_{2-167}$ |
| COMPOUND 5823 | $L_{1-204}$ | $L_{2-168}$ |
| COMPOUND 5824 | $L_{1-204}$ | $L_{2-169}$ |
| COMPOUND 5825 | $L_{1-204}$ | $L_{2-170}$ |
| COMPOUND 5826 | $L_{1-204}$ | $L_{2-171}$ |
| COMPOUND 5827 | $L_{1-204}$ | $L_{2-172}$ |
| COMPOUND 5828 | $L_{1-204}$ | $L_{2-173}$ |
| COMPOUND 5829 | $L_{1-204}$ | $L_{2-174}$ |
| COMPOUND 5830 | $L_{1-204}$ | $L_{2-175}$ |
| COMPOUND 5831 | $L_{1-204}$ | $L_{2-176}$ |
| COMPOUND 5832 | $L_{1-204}$ | $L_{2-177}$ |
| COMPOUND 5833 | $L_{1-204}$ | $L_{2-178}$ |
| COMPOUND 5834 | $L_{1-204}$ | $L_{2-179}$ |
| COMPOUND 5835 | $L_{1-204}$ | $L_{2-180}$ |
| COMPOUND 5836 | $L_{1-204}$ | $L_{2-181}$ |
| COMPOUND 5837 | $L_{1-204}$ | $L_{2-182}$ |
| COMPOUND 5838 | $L_{1-204}$ | $L_{2-183}$ |
| COMPOUND 5839 | $L_{1-204}$ | $L_{2-184}$ |
| COMPOUND 5840 | $L_{1-204}$ | $L_{2-185}$ |
| COMPOUND 5841 | $L_{1-204}$ | $L_{2-186}$ |
| COMPOUND 5842 | $L_{1-204}$ | $L_{2-187}$ |
| COMPOUND 5843 | $L_{1-204}$ | $L_{2-188}$ |
| COMPOUND 5844 | $L_{1-204}$ | $L_{2-189}$ |
| COMPOUND 5845 | $L_{1-204}$ | $L_{2-190}$ |
| COMPOUND 5846 | $L_{1-204}$ | $L_{2-191}$ |
| COMPOUND 5847 | $L_{1-204}$ | $L_{2-192}$ |
| COMPOUND 5848 | $L_{1-204}$ | $L_{2-193}$ |
| COMPOUND 5849 | $L_{1-204}$ | $L_{2-194}$ |
| COMPOUND 5850 | $L_{1-204}$ | $L_{2-195}$ |
| COMPOUND 5851 | $L_{1-204}$ | $L_{2-196}$ |
| COMPOUND 5852 | $L_{1-204}$ | $L_{2-197}$ |
| COMPOUND 5853 | $L_{1-204}$ | $L_{2-198}$ |

-continued

| | | |
|---|---|---|
| COMPOUND 5854 | $L_{1-204}$ | $L_{2-199}$ |
| COMPOUND 5855 | $L_{1-204}$ | $L_{2-200}$ |
| COMPOUND 5856 | $L_{1-204}$ | $L_{2-201}$ |
| COMPOUND 5857 | $L_{1-204}$ | $L_{2-202}$ |
| COMPOUND 5858 | $L_{1-204}$ | $L_{2-203}$ |
| COMPOUND 5859 | $L_{1-204}$ | $L_{2-204}$ |
| COMPOUND 5860 | $L_{1-204}$ | $L_{2-205}$ |
| COMPOUND 5861 | $L_{1-204}$ | $L_{2-206}$ |
| COMPOUND 5862 | $L_{1-204}$ | $L_{2-207}$ |
| COMPOUND 5863 | $L_{1-204}$ | $L_{2-208}$ |
| COMPOUND 5864 | $L_{1-204}$ | $L_{2-209}$ |
| COMPOUND 5865 | $L_{1-204}$ | $L_{2-210}$ |
| COMPOUND 5866 | $L_{1-204}$ | $L_{2-211}$ |
| COMPOUND 5867 | $L_{1-204}$ | $L_{2-212}$ |
| COMPOUND 5868 | $L_{1-204}$ | $L_{2-213}$ |
| COMPOUND 5869 | $L_{1-204}$ | $L_{2-214}$ |
| COMPOUND 5870 | $L_{1-204}$ | $L_{2-215}$ |
| COMPOUND 5871 | $L_{1-204}$ | $L_{2-216}$ |
| COMPOUND 5872 | $L_{1-204}$ | $L_{2-217}$ |
| COMPOUND 5873 | $L_{1-204}$ | $L_{2-218}$ |
| COMPOUND 5874 | $L_{1-204}$ | $L_{2-219}$ |
| COMPOUND 5875 | $L_{1-204}$ | $L_{2-220}$ |
| COMPOUND 5876 | $L_{1-204}$ | $L_{2-221}$ |
| COMPOUND 5877 | $L_{1-204}$ | $L_{2-222}$ |
| COMPOUND 5878 | $L_{1-204}$ | $L_{2-223}$ |
| COMPOUND 5879 | $L_{1-204}$ | $L_{2-224}$ |
| COMPOUND 5880 | $L_{1-204}$ | $L_{2-225}$ |
| COMPOUND 5881 | $L_{1-204}$ | $L_{2-226}$ |
| COMPOUND 5882 | $L_{1-204}$ | $L_{2-227}$ |
| COMPOUND 5883 | $L_{1-204}$ | $L_{2-228}$ |
| COMPOUND 5884 | $L_{1-204}$ | $L_{2-229}$ |
| COMPOUND 5885 | $L_{1-204}$ | $L_{2-230}$ |
| COMPOUND 5886 | $L_{1-204}$ | $L_{2-231}$ |
| COMPOUND 5887 | $L_{1-204}$ | $L_{2-232}$ |
| COMPOUND 5888 | $L_{1-204}$ | $L_{2-233}$ |
| COMPOUND 5889 | $L_{1-204}$ | $L_{2-234}$ |
| COMPOUND 5890 | $L_{1-204}$ | $L_{2-235}$ |
| COMPOUND 5891 | $L_{1-204}$ | $L_{2-236}$ |
| COMPOUND 5892 | $L_{1-204}$ | $L_{2-237}$ |
| COMPOUND 5893 | $L_{1-204}$ | $L_{2-238}$ |
| COMPOUND 5894 | $L_{1-204}$ | $L_{2-239}$ |
| COMPOUND 5895 | $L_{1-204}$ | $L_{2-240}$ |
| COMPOUND 5896 | $L_{1-204}$ | $L_{2-241}$ |
| COMPOUND 5897 | $L_{1-204}$ | $L_{2-242}$ |
| COMPOUND 5898 | $L_{1-204}$ | $L_{2-243}$ |
| COMPOUND 5899 | $L_{1-204}$ | $L_{2-244}$ |
| COMPOUND 5900 | $L_{1-204}$ | $L_{2-245}$ |
| COMPOUND 5901 | $L_{1-204}$ | $L_{2-246}$ |
| COMPOUND 5902 | $L_{1-204}$ | $L_{2-247}$ |
| COMPOUND 5903 | $L_{1-204}$ | $L_{2-248}$ |
| COMPOUND 5904 | $L_{1-204}$ | $L_{2-249}$ |
| COMPOUND 5905 | $L_{1-204}$ | $L_{2-250}$ |
| COMPOUND 5906 | $L_{1-204}$ | $L_{2-251}$ |
| COMPOUND 5907 | $L_{1-204}$ | $L_{2-252}$ |
| COMPOUND 5908 | $L_{1-204}$ | $L_{2-253}$ |
| COMPOUND 5909 | $L_{1-204}$ | $L_{2-254}$ |
| COMPOUND 5910 | $L_{1-204}$ | $L_{2-255}$ |
| COMPOUND 5911 | $L_{1-204}$ | $L_{2-256}$ |
| COMPOUND 5912 | $L_{1-204}$ | $L_{2-257}$ |
| COMPOUND 5913 | $L_{1-204}$ | $L_{2-258}$ |
| COMPOUND 5914 | $L_{1-204}$ | $L_{2-259}$ |
| COMPOUND 5915 | $L_{1-204}$ | $L_{2-260}$ |
| COMPOUND 5916 | $L_{1-204}$ | $L_{2-261}$ |
| COMPOUND 5917 | $L_{1-204}$ | $L_{2-262}$ |
| COMPOUND 5918 | $L_{1-204}$ | $L_{2-263}$ |
| COMPOUND 5919 | $L_{1-204}$ | $L_{2-264}$ |
| COMPOUND 5920 | $L_{1-204}$ | $L_{2-265}$ |
| COMPOUND 5921 | $L_{1-204}$ | $L_{2-266}$ |
| COMPOUND 5922 | $L_{1-204}$ | $L_{2-267}$ |
| COMPOUND 5923 | $L_{1-204}$ | $L_{2-268}$ |
| COMPOUND 5924 | $L_{1-204}$ | $L_{2-269}$ |
| COMPOUND 5925 | $L_{1-204}$ | $L_{2-270}$ |
| COMPOUND 5926 | $L_{1-204}$ | $L_{2-271}$ |
| COMPOUND 5927 | $L_{1-204}$ | $L_{2-272}$ |
| COMPOUND 5928 | $L_{1-204}$ | $L_{2-273}$ |
| COMPOUND 5929 | $L_{1-204}$ | $L_{2-274}$ |
| COMPOUND 5930 | $L_{1-204}$ | $L_{2-275}$ |
| COMPOUND 5931 | $L_{1-204}$ | $L_{2-276}$ |
| COMPOUND 5932 | $L_{1-204}$ | $L_{2-277}$ |

-continued

| | | |
|---|---|---|
| COMPOUND 5933 | $L_{1-204}$ | $L_{2-278}$ |
| COMPOUND 5934 | $L_{1-204}$ | $L_{2-279}$ |
| COMPOUND 5935 | $L_{1-204}$ | $L_{2-280}$ |
| COMPOUND 5936 | $L_{1-204}$ | $L_{2-281}$ |
| COMPOUND 5937 | $L_{1-204}$ | $L_{2-282}$ |
| COMPOUND 5938 | $L_{1-204}$ | $L_{2-283}$ |
| COMPOUND 5939 | $L_{1-204}$ | $L_{2-284}$ |
| COMPOUND 5940 | $L_{1-204}$ | $L_{2-285}$ |
| COMPOUND 5941 | $L_{1-204}$ | $L_{2-286}$ |
| COMPOUND 5942 | $L_{1-204}$ | $L_{2-287}$ |
| COMPOUND 5943 | $L_{1-204}$ | $L_{2-288}$ |
| COMPOUND 5944 | $L_{1-204}$ | $L_{2-289}$ |
| COMPOUND 5945 | $L_{1-204}$ | $L_{2-290}$ |
| COMPOUND 5946 | $L_{1-204}$ | $L_{2-291}$ |
| COMPOUND 5947 | $L_{1-204}$ | $L_{2-292}$ |
| COMPOUND 5948 | $L_{1-204}$ | $L_{2-293}$ |
| COMPOUND 5949 | $L_{1-204}$ | $L_{2-294}$ |
| COMPOUND 5950 | $L_{1-204}$ | $L_{2-295}$ |
| COMPOUND 5951 | $L_{1-204}$ | $L_{2-296}$ |
| COMPOUND 5952 | $L_{1-204}$ | $L_{2-297}$ |
| COMPOUND 5953 | $L_{1-204}$ | $L_{2-298}$ |
| COMPOUND 5954 | $L_{1-204}$ | $L_{2-299}$ |
| COMPOUND 5955 | $L_{1-204}$ | $L_{2-300}$ |
| COMPOUND 5956 | $L_{1-204}$ | $L_{2-301}$ |
| COMPOUND 5957 | $L_{1-204}$ | $L_{2-302}$ |
| COMPOUND 5958 | $L_{1-204}$ | $L_{2-303}$ |
| COMPOUND 5959 | $L_{1-204}$ | $L_{2-304}$ |
| COMPOUND 5960 | $L_{1-204}$ | $L_{2-305}$ |
| COMPOUND 5961 | $L_{1-204}$ | $L_{2-306}$ |
| COMPOUND 5962 | $L_{1-204}$ | $L_{2-307}$ |
| COMPOUND 5963 | $L_{1-204}$ | $L_{2-308}$ |
| COMPOUND 5964 | $L_{1-204}$ | $L_{2-309}$ |
| COMPOUND 5965 | $L_{1-204}$ | $L_{2-310}$ |
| COMPOUND 5966 | $L_{1-204}$ | $L_{2-311}$ |
| COMPOUND 5967 | $L_{1-204}$ | $L_{2-312}$ |
| COMPOUND 5968 | $L_{1-204}$ | $L_{2-313}$ |
| COMPOUND 5969 | $L_{1-204}$ | $L_{2-314}$ |
| COMPOUND 5970 | $L_{1-204}$ | $L_{2-315}$ |
| COMPOUND 5971 | $L_{1-204}$ | $L_{2-316}$ |
| COMPOUND 5972 | $L_{1-204}$ | $L_{2-317}$ |
| COMPOUND 5973 | $L_{1-204}$ | $L_{2-318}$ |
| COMPOUND 5974 | $L_{1-204}$ | $L_{2-319}$ |
| COMPOUND 5975 | $L_{1-204}$ | $L_{2-320}$ |
| COMPOUND 5976 | $L_{1-204}$ | $L_{2-321}$ |
| COMPOUND 5977 | $L_{1-204}$ | $L_{2-322}$ |
| COMPOUND 5978 | $L_{1-204}$ | $L_{2-323}$ |
| COMPOUND 5979 | $L_{1-204}$ | $L_{2-324}$ |
| COMPOUND 5980 | $L_{1-204}$ | $L_{2-325}$ |
| COMPOUND 5981 | $L_{1-204}$ | $L_{2-326}$ |
| COMPOUND 5982 | $L_{1-204}$ | $L_{2-327}$ |
| COMPOUND 5983 | $L_{1-204}$ | $L_{2-328}$ |
| COMPOUND 5984 | $L_{1-204}$ | $L_{2-329}$ |
| COMPOUND 5985 | $L_{1-204}$ | $L_{2-330}$ |
| COMPOUND 5986 | $L_{1-204}$ | $L_{2-331}$ |
| COMPOUND 5987 | $L_{1-204}$ | $L_{2-332}$ |
| COMPOUND 5988 | $L_{1-204}$ | $L_{2-333}$ |
| COMPOUND 5989 | $L_{1-204}$ | $L_{2-334}$ |
| COMPOUND 5990 | $L_{1-204}$ | $L_{2-335}$ |
| COMPOUND 5991 | $L_{1-204}$ | $L_{2-336}$ |
| COMPOUND 5992 | $L_{1-204}$ | $L_{2-337}$ |
| COMPOUND 5993 | $L_{1-204}$ | $L_{2-338}$ |
| COMPOUND 5994 | $L_{1-204}$ | $L_{2-339}$ |
| COMPOUND 5995 | $L_{1-204}$ | $L_{2-340}$ |
| COMPOUND 5996 | $L_{1-204}$ | $L_{2-341}$ |
| COMPOUND 5997 | $L_{1-204}$ | $L_{2-342}$ |
| COMPOUND 5998 | $L_{1-204}$ | $L_{2-343}$ |
| COMPOUND 5999 | $L_{1-204}$ | $L_{2-344}$ |
| COMPOUND 6000 | $L_{1-204}$ | $L_{2-345}$ |
| COMPOUND 6001 | $L_{1-204}$ | $L_{2-346}$ |
| COMPOUND 6002 | $L_{1-204}$ | $L_{2-347}$ |
| COMPOUND 6003 | $L_{1-204}$ | $L_{2-348}$ |
| COMPOUND 6004 | $L_{1-204}$ | $L_{2-349}$ |
| COMPOUND 6005 | $L_{1-204}$ | $L_{2-350}$ |
| COMPOUND 6006 | $L_{1-204}$ | $L_{2-351}$ |
| COMPOUND 6007 | $L_{1-204}$ | $L_{2-352}$ |
| COMPOUND 6008 | $L_{1-204}$ | $L_{2-353}$ |
| COMPOUND 6009 | $L_{1-204}$ | $L_{2-354}$ |
| COMPOUND 6010 | $L_{1-204}$ | $L_{2-355}$ |
| COMPOUND 6011 | $L_{1-204}$ | $L_{2-356}$ |

| | | |
|---|---|---|
| COMPOUND 6012 | $L_{1-204}$ | $L_{2-357}$ |
| COMPOUND 6013 | $L_{1-204}$ | $L_{2-358}$ |
| COMPOUND 6014 | $L_{1-204}$ | $L_{2-359}$ |
| COMPOUND 6015 | $L_{1-204}$ | $L_{2-360}$ |
| COMPOUND 6016 | $L_{1-204}$ | $L_{2-361}$ |
| COMPOUND 6017 | $L_{1-204}$ | $L_{2-362}$ |
| COMPOUND 6018 | $L_{1-204}$ | $L_{2-363}$ |
| COMPOUND 6019 | $L_{1-204}$ | $L_{2-364}$ |
| COMPOUND 6020 | $L_{1-204}$ | $L_{2-365}$ |
| COMPOUND 6021 | $L_{1-204}$ | $L_{2-366}$ |
| COMPOUND 6022 | $L_{1-204}$ | $L_{2-367}$ |
| COMPOUND 6023 | $L_{1-204}$ | $L_{2-368}$ |
| COMPOUND 6024 | $L_{1-204}$ | $L_{2-369}$ |
| COMPOUND 6025 | $L_{1-204}$ | $L_{2-370}$ |
| COMPOUND 6026 | $L_{1-204}$ | $L_{2-371}$ |
| COMPOUND 6027 | $L_{1-204}$ | $L_{2-372}$ |
| COMPOUND 6028 | $L_{1-204}$ | $L_{2-373}$ |
| COMPOUND 6029 | $L_{1-204}$ | $L_{2-374}$ |
| COMPOUND 6030 | $L_{1-204}$ | $L_{2-375}$ |
| COMPOUND 6031 | $L_{1-204}$ | $L_{2-376}$ |
| COMPOUND 6032 | $L_{1-205}$ | $L_{2-377}$ |
| COMPOUND 6033 | $L_{1-205}$ | $L_{2-1}$ |
| COMPOUND 6034 | $L_{1-205}$ | $L_{2-2}$ |
| COMPOUND 6035 | $L_{1-205}$ | $L_{2-3}$ |
| COMPOUND 6036 | $L_{1-205}$ | $L_{2-4}$ |
| COMPOUND 6037 | $L_{1-205}$ | $L_{2-5}$ |
| COMPOUND 6038 | $L_{1-205}$ | $L_{2-6}$ |
| COMPOUND 6039 | $L_{1-205}$ | $L_{2-7}$ |
| COMPOUND 6040 | $L_{1-205}$ | $L_{2-8}$ |
| COMPOUND 6041 | $L_{1-205}$ | $L_{2-9}$ |
| COMPOUND 6042 | $L_{1-205}$ | $L_{2-10}$ |
| COMPOUND 6043 | $L_{1-205}$ | $L_{2-11}$ |
| COMPOUND 6044 | $L_{1-205}$ | $L_{2-12}$ |
| COMPOUND 6045 | $L_{1-205}$ | $L_{2-13}$ |
| COMPOUND 6046 | $L_{1-205}$ | $L_{2-14}$ |
| COMPOUND 6047 | $L_{1-205}$ | $L_{2-15}$ |
| COMPOUND 6048 | $L_{1-205}$ | $L_{2-16}$ |
| COMPOUND 6049 | $L_{1-205}$ | $L_{2-17}$ |
| COMPOUND 6050 | $L_{1-205}$ | $L_{2-18}$ |
| COMPOUND 6051 | $L_{1-205}$ | $L_{2-19}$ |
| COMPOUND 6052 | $L_{1-205}$ | $L_{2-20}$ |
| COMPOUND 6053 | $L_{1-205}$ | $L_{2-21}$ |
| COMPOUND 6054 | $L_{1-205}$ | $L_{2-22}$ |
| COMPOUND 6055 | $L_{1-205}$ | $L_{2-23}$ |
| COMPOUND 6056 | $L_{1-205}$ | $L_{2-24}$ |
| COMPOUND 6057 | $L_{1-205}$ | $L_{2-25}$ |
| COMPOUND 6058 | $L_{1-205}$ | $L_{2-26}$ |
| COMPOUND 6059 | $L_{1-205}$ | $L_{2-27}$ |
| COMPOUND 6060 | $L_{1-205}$ | $L_{2-28}$ |
| COMPOUND 6061 | $L_{1-205}$ | $L_{2-29}$ |
| COMPOUND 6062 | $L_{1-205}$ | $L_{2-30}$ |
| COMPOUND 6063 | $L_{1-205}$ | $L_{2-31}$ |
| COMPOUND 6064 | $L_{1-205}$ | $L_{2-32}$ |
| COMPOUND 6065 | $L_{1-205}$ | $L_{2-33}$ |
| COMPOUND 6066 | $L_{1-205}$ | $L_{2-34}$ |
| COMPOUND 6067 | $L_{1-205}$ | $L_{2-35}$ |
| COMPOUND 6068 | $L_{1-205}$ | $L_{2-36}$ |
| COMPOUND 6069 | $L_{1-205}$ | $L_{2-37}$ |
| COMPOUND 6070 | $L_{1-205}$ | $L_{2-38}$ |
| COMPOUND 6071 | $L_{1-205}$ | $L_{2-39}$ |
| COMPOUND 6072 | $L_{1-205}$ | $L_{2-40}$ |
| COMPOUND 6073 | $L_{1-205}$ | $L_{2-41}$ |
| COMPOUND 6074 | $L_{1-205}$ | $L_{2-42}$ |
| COMPOUND 6075 | $L_{1-205}$ | $L_{2-43}$ |
| COMPOUND 6076 | $L_{1-205}$ | $L_{2-44}$ |
| COMPOUND 6077 | $L_{1-205}$ | $L_{2-45}$ |
| COMPOUND 6078 | $L_{1-205}$ | $L_{2-46}$ |
| COMPOUND 6079 | $L_{1-205}$ | $L_{2-47}$ |
| COMPOUND 6080 | $L_{1-205}$ | $L_{2-48}$ |
| COMPOUND 6081 | $L_{1-205}$ | $L_{2-49}$ |
| COMPOUND 6082 | $L_{1-205}$ | $L_{2-50}$ |
| COMPOUND 6083 | $L_{1-205}$ | $L_{2-51}$ |
| COMPOUND 6084 | $L_{1-205}$ | $L_{2-52}$ |
| COMPOUND 6085 | $L_{1-205}$ | $L_{2-53}$ |
| COMPOUND 6086 | $L_{1-205}$ | $L_{2-54}$ |
| COMPOUND 6087 | $L_{1-205}$ | $L_{2-55}$ |
| COMPOUND 6088 | $L_{1-205}$ | $L_{2-56}$ |
| COMPOUND 6089 | $L_{1-205}$ | $L_{2-57}$ |
| COMPOUND 6090 | $L_{1-205}$ | $L_{2-58}$ |

| | | |
|---|---|---|
| COMPOUND 6091 | $L_{1-205}$ | $L_{2-59}$ |
| COMPOUND 6092 | $L_{1-205}$ | $L_{2-60}$ |
| COMPOUND 6093 | $L_{1-205}$ | $L_{2-61}$ |
| COMPOUND 6094 | $L_{1-205}$ | $L_{2-62}$ |
| COMPOUND 6095 | $L_{1-205}$ | $L_{2-63}$ |
| COMPOUND 6096 | $L_{1-205}$ | $L_{2-64}$ |
| COMPOUND 6097 | $L_{1-205}$ | $L_{2-65}$ |
| COMPOUND 6098 | $L_{1-205}$ | $L_{2-66}$ |
| COMPOUND 6099 | $L_{1-205}$ | $L_{2-67}$ |
| COMPOUND 6100 | $L_{1-205}$ | $L_{2-68}$ |
| COMPOUND 6101 | $L_{1-205}$ | $L_{2-69}$ |
| COMPOUND 6102 | $L_{1-205}$ | $L_{2-70}$ |
| COMPOUND 6103 | $L_{1-205}$ | $L_{2-71}$ |
| COMPOUND 6104 | $L_{1-205}$ | $L_{2-72}$ |
| COMPOUND 6105 | $L_{1-205}$ | $L_{2-73}$ |
| COMPOUND 6106 | $L_{1-205}$ | $L_{2-74}$ |
| COMPOUND 6107 | $L_{1-205}$ | $L_{2-75}$ |
| COMPOUND 6108 | $L_{1-205}$ | $L_{2-76}$ |
| COMPOUND 6109 | $L_{1-205}$ | $L_{2-77}$ |
| COMPOUND 6110 | $L_{1-205}$ | $L_{2-78}$ |
| COMPOUND 6111 | $L_{1-205}$ | $L_{2-79}$ |
| COMPOUND 6112 | $L_{1-205}$ | $L_{2-80}$ |
| COMPOUND 6113 | $L_{1-205}$ | $L_{2-81}$ |
| COMPOUND 6114 | $L_{1-205}$ | $L_{2-82}$ |
| COMPOUND 6115 | $L_{1-205}$ | $L_{2-83}$ |
| COMPOUND 6116 | $L_{1-205}$ | $L_{2-84}$ |
| COMPOUND 6117 | $L_{1-205}$ | $L_{2-85}$ |
| COMPOUND 6118 | $L_{1-205}$ | $L_{2-86}$ |
| COMPOUND 6119 | $L_{1-205}$ | $L_{2-87}$ |
| COMPOUND 6120 | $L_{1-205}$ | $L_{2-88}$ |
| COMPOUND 6121 | $L_{1-205}$ | $L_{2-89}$ |
| COMPOUND 6122 | $L_{1-205}$ | $L_{2-90}$ |
| COMPOUND 6123 | $L_{1-205}$ | $L_{2-91}$ |
| COMPOUND 6124 | $L_{1-205}$ | $L_{2-92}$ |
| COMPOUND 6125 | $L_{1-205}$ | $L_{2-93}$ |
| COMPOUND 6126 | $L_{1-205}$ | $L_{2-94}$ |
| COMPOUND 6127 | $L_{1-205}$ | $L_{2-95}$ |
| COMPOUND 6128 | $L_{1-205}$ | $L_{2-96}$ |
| COMPOUND 6129 | $L_{1-205}$ | $L_{2-97}$ |
| COMPOUND 6130 | $L_{1-205}$ | $L_{2-98}$ |
| COMPOUND 6131 | $L_{1-205}$ | $L_{2-99}$ |
| COMPOUND 6132 | $L_{1-205}$ | $L_{2-100}$ |
| COMPOUND 6133 | $L_{1-205}$ | $L_{2-101}$ |
| COMPOUND 6134 | $L_{1-205}$ | $L_{2-102}$ |
| COMPOUND 6135 | $L_{1-205}$ | $L_{2-103}$ |
| COMPOUND 6136 | $L_{1-205}$ | $L_{2-104}$ |
| COMPOUND 6137 | $L_{1-205}$ | $L_{2-105}$ |
| COMPOUND 6138 | $L_{1-205}$ | $L_{2-106}$ |
| COMPOUND 6139 | $L_{1-205}$ | $L_{2-107}$ |
| COMPOUND 6140 | $L_{1-205}$ | $L_{2-108}$ |
| COMPOUND 6141 | $L_{1-205}$ | $L_{2-109}$ |
| COMPOUND 6142 | $L_{1-205}$ | $L_{2-110}$ |
| COMPOUND 6143 | $L_{1-205}$ | $L_{2-111}$ |
| COMPOUND 6144 | $L_{1-205}$ | $L_{2-112}$ |
| COMPOUND 6145 | $L_{1-205}$ | $L_{2-113}$ |
| COMPOUND 6146 | $L_{1-205}$ | $L_{2-114}$ |
| COMPOUND 6147 | $L_{1-205}$ | $L_{2-115}$ |
| COMPOUND 6148 | $L_{1-205}$ | $L_{2-116}$ |
| COMPOUND 6149 | $L_{1-205}$ | $L_{2-117}$ |
| COMPOUND 6150 | $L_{1-205}$ | $L_{2-118}$ |
| COMPOUND 6151 | $L_{1-205}$ | $L_{2-119}$ |
| COMPOUND 6152 | $L_{1-205}$ | $L_{2-120}$ |
| COMPOUND 6153 | $L_{1-205}$ | $L_{2-121}$ |
| COMPOUND 6154 | $L_{1-205}$ | $L_{2-122}$ |
| COMPOUND 6155 | $L_{1-205}$ | $L_{2-123}$ |
| COMPOUND 6156 | $L_{1-205}$ | $L_{2-124}$ |
| COMPOUND 6157 | $L_{1-205}$ | $L_{2-125}$ |
| COMPOUND 6158 | $L_{1-205}$ | $L_{2-126}$ |
| COMPOUND 6159 | $L_{1-205}$ | $L_{2-127}$ |
| COMPOUND 6160 | $L_{1-205}$ | $L_{2-128}$ |
| COMPOUND 6161 | $L_{1-205}$ | $L_{2-129}$ |
| COMPOUND 6162 | $L_{1-205}$ | $L_{2-130}$ |
| COMPOUND 6163 | $L_{1-205}$ | $L_{2-131}$ |
| COMPOUND 6164 | $L_{1-205}$ | $L_{2-132}$ |
| COMPOUND 6165 | $L_{1-205}$ | $L_{2-133}$ |
| COMPOUND 6166 | $L_{1-205}$ | $L_{2-134}$ |
| COMPOUND 6167 | $L_{1-205}$ | $L_{2-135}$ |
| COMPOUND 6168 | $L_{1-205}$ | $L_{2-136}$ |
| COMPOUND 6169 | $L_{1-205}$ | $L_{2-137}$ |

-continued

| | | |
|---|---|---|
| COMPOUND 6170 | $L_{1-205}$ | $L_{2-138}$ |
| COMPOUND 6171 | $L_{1-205}$ | $L_{2-139}$ |
| COMPOUND 6172 | $L_{1-205}$ | $L_{2-140}$ |
| COMPOUND 6173 | $L_{1-205}$ | $L_{2-141}$ |
| COMPOUND 6174 | $L_{1-205}$ | $L_{2-142}$ |
| COMPOUND 6175 | $L_{1-205}$ | $L_{2-143}$ |
| COMPOUND 6176 | $L_{1-205}$ | $L_{2-144}$ |
| COMPOUND 6177 | $L_{1-205}$ | $L_{2-145}$ |
| COMPOUND 6178 | $L_{1-205}$ | $L_{2-146}$ |
| COMPOUND 6179 | $L_{1-205}$ | $L_{2-147}$ |
| COMPOUND 6180 | $L_{1-205}$ | $L_{2-148}$ |
| COMPOUND 6181 | $L_{1-205}$ | $L_{2-149}$ |
| COMPOUND 6182 | $L_{1-205}$ | $L_{2-150}$ |
| COMPOUND 6183 | $L_{1-205}$ | $L_{2-151}$ |
| COMPOUND 6184 | $L_{1-205}$ | $L_{2-152}$ |
| COMPOUND 6185 | $L_{1-205}$ | $L_{2-153}$ |
| COMPOUND 6186 | $L_{1-205}$ | $L_{2-154}$ |
| COMPOUND 6187 | $L_{1-205}$ | $L_{2-155}$ |
| COMPOUND 6188 | $L_{1-205}$ | $L_{2-156}$ |
| COMPOUND 6189 | $L_{1-205}$ | $L_{2-157}$ |
| COMPOUND 6190 | $L_{1-205}$ | $L_{2-158}$ |
| COMPOUND 6191 | $L_{1-205}$ | $L_{2-159}$ |
| COMPOUND 6192 | $L_{1-205}$ | $L_{2-160}$ |
| COMPOUND 6193 | $L_{1-205}$ | $L_{2-161}$ |
| COMPOUND 6194 | $L_{1-205}$ | $L_{2-162}$ |
| COMPOUND 6195 | $L_{1-205}$ | $L_{2-163}$ |
| COMPOUND 6196 | $L_{1-205}$ | $L_{2-164}$ |
| COMPOUND 6197 | $L_{1-205}$ | $L_{2-165}$ |
| COMPOUND 6198 | $L_{1-205}$ | $L_{2-166}$ |
| COMPOUND 6199 | $L_{1-205}$ | $L_{2-167}$ |
| COMPOUND 6200 | $L_{1-205}$ | $L_{2-168}$ |
| COMPOUND 6201 | $L_{1-205}$ | $L_{2-169}$ |
| COMPOUND 6202 | $L_{1-205}$ | $L_{2-170}$ |
| COMPOUND 6203 | $L_{1-205}$ | $L_{2-171}$ |
| COMPOUND 6204 | $L_{1-205}$ | $L_{2-172}$ |
| COMPOUND 6205 | $L_{1-205}$ | $L_{2-173}$ |
| COMPOUND 6206 | $L_{1-205}$ | $L_{2-174}$ |
| COMPOUND 6207 | $L_{1-205}$ | $L_{2-175}$ |
| COMPOUND 6208 | $L_{1-205}$ | $L_{2-176}$ |
| COMPOUND 6209 | $L_{1-205}$ | $L_{2-177}$ |
| COMPOUND 6210 | $L_{1-205}$ | $L_{2-178}$ |
| COMPOUND 6211 | $L_{1-205}$ | $L_{2-179}$ |
| COMPOUND 6212 | $L_{1-205}$ | $L_{2-180}$ |
| COMPOUND 6213 | $L_{1-205}$ | $L_{2-181}$ |
| COMPOUND 6214 | $L_{1-205}$ | $L_{2-182}$ |
| COMPOUND 6215 | $L_{1-205}$ | $L_{2-183}$ |
| COMPOUND 6216 | $L_{1-205}$ | $L_{2-184}$ |
| COMPOUND 6217 | $L_{1-205}$ | $L_{2-185}$ |
| COMPOUND 6218 | $L_{1-205}$ | $L_{2-186}$ |
| COMPOUND 6219 | $L_{1-205}$ | $L_{2-187}$ |
| COMPOUND 6220 | $L_{1-205}$ | $L_{2-188}$ |
| COMPOUND 6221 | $L_{1-205}$ | $L_{2-189}$ |
| COMPOUND 6222 | $L_{1-205}$ | $L_{2-190}$ |
| COMPOUND 6223 | $L_{1-205}$ | $L_{2-191}$ |
| COMPOUND 6224 | $L_{1-205}$ | $L_{2-192}$ |
| COMPOUND 6225 | $L_{1-205}$ | $L_{2-193}$ |
| COMPOUND 6226 | $L_{1-205}$ | $L_{2-194}$ |
| COMPOUND 6227 | $L_{1-205}$ | $L_{2-195}$ |
| COMPOUND 6228 | $L_{1-205}$ | $L_{2-196}$ |
| COMPOUND 6229 | $L_{1-205}$ | $L_{2-197}$ |
| COMPOUND 6230 | $L_{1-205}$ | $L_{2-198}$ |
| COMPOUND 6231 | $L_{1-205}$ | $L_{2-199}$ |
| COMPOUND 6232 | $L_{1-205}$ | $L_{2-200}$ |
| COMPOUND 6233 | $L_{1-205}$ | $L_{2-201}$ |
| COMPOUND 6234 | $L_{1-205}$ | $L_{2-202}$ |
| COMPOUND 6235 | $L_{1-205}$ | $L_{2-203}$ |
| COMPOUND 6236 | $L_{1-205}$ | $L_{2-204}$ |
| COMPOUND 6237 | $L_{1-205}$ | $L_{2-205}$ |
| COMPOUND 6238 | $L_{1-205}$ | $L_{2-206}$ |
| COMPOUND 6239 | $L_{1-205}$ | $L_{2-207}$ |
| COMPOUND 6240 | $L_{1-205}$ | $L_{2-208}$ |
| COMPOUND 6241 | $L_{1-205}$ | $L_{2-209}$ |
| COMPOUND 6242 | $L_{1-205}$ | $L_{2-210}$ |
| COMPOUND 6243 | $L_{1-205}$ | $L_{2-211}$ |
| COMPOUND 6244 | $L_{1-205}$ | $L_{2-212}$ |
| COMPOUND 6245 | $L_{1-205}$ | $L_{2-213}$ |
| COMPOUND 6246 | $L_{1-205}$ | $L_{2-214}$ |
| COMPOUND 6247 | $L_{1-205}$ | $L_{2-215}$ |
| COMPOUND 6248 | $L_{1-205}$ | $L_{2-216}$ |

-continued

| | | |
|---|---|---|
| COMPOUND 6249 | $L_{1-205}$ | $L_{2-217}$ |
| COMPOUND 6250 | $L_{1-205}$ | $L_{2-218}$ |
| COMPOUND 6251 | $L_{1-205}$ | $L_{2-219}$ |
| COMPOUND 6252 | $L_{1-205}$ | $L_{2-220}$ |
| COMPOUND 6253 | $L_{1-205}$ | $L_{2-221}$ |
| COMPOUND 6254 | $L_{1-205}$ | $L_{2-222}$ |
| COMPOUND 6255 | $L_{1-205}$ | $L_{2-223}$ |
| COMPOUND 6256 | $L_{1-205}$ | $L_{2-224}$ |
| COMPOUND 6257 | $L_{1-205}$ | $L_{2-225}$ |
| COMPOUND 6258 | $L_{1-205}$ | $L_{2-226}$ |
| COMPOUND 6259 | $L_{1-205}$ | $L_{2-227}$ |
| COMPOUND 6260 | $L_{1-205}$ | $L_{2-228}$ |
| COMPOUND 6261 | $L_{1-205}$ | $L_{2-229}$ |
| COMPOUND 6262 | $L_{1-205}$ | $L_{2-230}$ |
| COMPOUND 6263 | $L_{1-205}$ | $L_{2-231}$ |
| COMPOUND 6264 | $L_{1-205}$ | $L_{2-232}$ |
| COMPOUND 6265 | $L_{1-205}$ | $L_{2-233}$ |
| COMPOUND 6266 | $L_{1-205}$ | $L_{2-234}$ |
| COMPOUND 6267 | $L_{1-205}$ | $L_{2-235}$ |
| COMPOUND 6268 | $L_{1-205}$ | $L_{2-236}$ |
| COMPOUND 6269 | $L_{1-205}$ | $L_{2-237}$ |
| COMPOUND 6270 | $L_{1-205}$ | $L_{2-238}$ |
| COMPOUND 6271 | $L_{1-205}$ | $L_{2-239}$ |
| COMPOUND 6272 | $L_{1-205}$ | $L_{2-240}$ |
| COMPOUND 6273 | $L_{1-205}$ | $L_{2-241}$ |
| COMPOUND 6274 | $L_{1-205}$ | $L_{2-242}$ |
| COMPOUND 6275 | $L_{1-205}$ | $L_{2-243}$ |
| COMPOUND 6276 | $L_{1-205}$ | $L_{2-244}$ |
| COMPOUND 6277 | $L_{1-205}$ | $L_{2-245}$ |
| COMPOUND 6278 | $L_{1-205}$ | $L_{2-246}$ |
| COMPOUND 6279 | $L_{1-205}$ | $L_{2-247}$ |
| COMPOUND 6280 | $L_{1-205}$ | $L_{2-248}$ |
| COMPOUND 6281 | $L_{1-205}$ | $L_{2-249}$ |
| COMPOUND 6282 | $L_{1-205}$ | $L_{2-250}$ |
| COMPOUND 6283 | $L_{1-205}$ | $L_{2-251}$ |
| COMPOUND 6284 | $L_{1-205}$ | $L_{2-252}$ |
| COMPOUND 6285 | $L_{1-205}$ | $L_{2-253}$ |
| COMPOUND 6286 | $L_{1-205}$ | $L_{2-254}$ |
| COMPOUND 6287 | $L_{1-205}$ | $L_{2-255}$ |
| COMPOUND 6288 | $L_{1-205}$ | $L_{2-256}$ |
| COMPOUND 6289 | $L_{1-205}$ | $L_{2-257}$ |
| COMPOUND 6290 | $L_{1-205}$ | $L_{2-258}$ |
| COMPOUND 6291 | $L_{1-205}$ | $L_{2-259}$ |
| COMPOUND 6292 | $L_{1-205}$ | $L_{2-260}$ |
| COMPOUND 6293 | $L_{1-205}$ | $L_{2-261}$ |
| COMPOUND 6294 | $L_{1-205}$ | $L_{2-262}$ |
| COMPOUND 6295 | $L_{1-205}$ | $L_{2-263}$ |
| COMPOUND 6296 | $L_{1-205}$ | $L_{2-264}$ |
| COMPOUND 6297 | $L_{1-205}$ | $L_{2-265}$ |
| COMPOUND 6298 | $L_{1-205}$ | $L_{2-266}$ |
| COMPOUND 6299 | $L_{1-205}$ | $L_{2-267}$ |
| COMPOUND 6300 | $L_{1-205}$ | $L_{2-268}$ |
| COMPOUND 6301 | $L_{1-205}$ | $L_{2-269}$ |
| COMPOUND 6302 | $L_{1-205}$ | $L_{2-270}$ |
| COMPOUND 6303 | $L_{1-205}$ | $L_{2-271}$ |
| COMPOUND 6304 | $L_{1-205}$ | $L_{2-272}$ |
| COMPOUND 6305 | $L_{1-205}$ | $L_{2-273}$ |
| COMPOUND 6306 | $L_{1-205}$ | $L_{2-274}$ |
| COMPOUND 6307 | $L_{1-205}$ | $L_{2-275}$ |
| COMPOUND 6308 | $L_{1-205}$ | $L_{2-276}$ |
| COMPOUND 6309 | $L_{1-205}$ | $L_{2-277}$ |
| COMPOUND 6310 | $L_{1-205}$ | $L_{2-278}$ |
| COMPOUND 6311 | $L_{1-205}$ | $L_{2-279}$ |
| COMPOUND 6312 | $L_{1-205}$ | $L_{2-280}$ |
| COMPOUND 6313 | $L_{1-205}$ | $L_{2-281}$ |
| COMPOUND 6314 | $L_{1-205}$ | $L_{2-282}$ |
| COMPOUND 6315 | $L_{1-205}$ | $L_{2-283}$ |
| COMPOUND 6316 | $L_{1-205}$ | $L_{2-284}$ |
| COMPOUND 6317 | $L_{1-205}$ | $L_{2-285}$ |
| COMPOUND 6318 | $L_{1-205}$ | $L_{2-286}$ |
| COMPOUND 6319 | $L_{1-205}$ | $L_{2-287}$ |
| COMPOUND 6320 | $L_{1-205}$ | $L_{2-288}$ |
| COMPOUND 6321 | $L_{1-205}$ | $L_{2-289}$ |
| COMPOUND 6322 | $L_{1-205}$ | $L_{2-290}$ |
| COMPOUND 6323 | $L_{1-205}$ | $L_{2-291}$ |
| COMPOUND 6324 | $L_{1-205}$ | $L_{2-292}$ |
| COMPOUND 6325 | $L_{1-205}$ | $L_{2-293}$ |
| COMPOUND 6326 | $L_{1-205}$ | $L_{2-294}$ |
| COMPOUND 6327 | $L_{1-205}$ | $L_{2-295}$ |

-continued

| | | |
|---|---|---|
| COMPOUND 6328 | $L_{1-205}$ | $L_{2-296}$ |
| COMPOUND 6329 | $L_{1-205}$ | $L_{2-297}$ |
| COMPOUND 6330 | $L_{1-205}$ | $L_{2-298}$ |
| COMPOUND 6331 | $L_{1-205}$ | $L_{2-299}$ |
| COMPOUND 6332 | $L_{1-205}$ | $L_{2-300}$ |
| COMPOUND 6333 | $L_{1-205}$ | $L_{2-301}$ |
| COMPOUND 6334 | $L_{1-205}$ | $L_{2-302}$ |
| COMPOUND 6335 | $L_{1-205}$ | $L_{2-303}$ |
| COMPOUND 6336 | $L_{1-205}$ | $L_{2-304}$ |
| COMPOUND 6337 | $L_{1-205}$ | $L_{2-305}$ |
| COMPOUND 6338 | $L_{1-205}$ | $L_{2-306}$ |
| COMPOUND 6339 | $L_{1-205}$ | $L_{2-307}$ |
| COMPOUND 6340 | $L_{1-205}$ | $L_{2-308}$ |
| COMPOUND 6341 | $L_{1-205}$ | $L_{2-309}$ |
| COMPOUND 6342 | $L_{1-205}$ | $L_{2-310}$ |
| COMPOUND 6343 | $L_{1-205}$ | $L_{2-311}$ |
| COMPOUND 6344 | $L_{1-205}$ | $L_{2-312}$ |
| COMPOUND 6345 | $L_{1-205}$ | $L_{2-313}$ |
| COMPOUND 6346 | $L_{1-205}$ | $L_{2-314}$ |
| COMPOUND 6347 | $L_{1-205}$ | $L_{2-315}$ |
| COMPOUND 6348 | $L_{1-205}$ | $L_{2-316}$ |
| COMPOUND 6349 | $L_{1-205}$ | $L_{2-317}$ |
| COMPOUND 6350 | $L_{1-205}$ | $L_{2-318}$ |
| COMPOUND 6351 | $L_{1-205}$ | $L_{2-319}$ |
| COMPOUND 6352 | $L_{1-205}$ | $L_{2-320}$ |
| COMPOUND 6353 | $L_{1-205}$ | $L_{2-321}$ |
| COMPOUND 6354 | $L_{1-205}$ | $L_{2-322}$ |
| COMPOUND 6355 | $L_{1-205}$ | $L_{2-323}$ |
| COMPOUND 6356 | $L_{1-205}$ | $L_{2-324}$ |
| COMPOUND 6357 | $L_{1-205}$ | $L_{2-325}$ |
| COMPOUND 6358 | $L_{1-205}$ | $L_{2-326}$ |
| COMPOUND 6359 | $L_{1-205}$ | $L_{2-327}$ |
| COMPOUND 6360 | $L_{1-205}$ | $L_{2-328}$ |
| COMPOUND 6361 | $L_{1-205}$ | $L_{2-329}$ |
| COMPOUND 6362 | $L_{1-205}$ | $L_{2-330}$ |
| COMPOUND 6363 | $L_{1-205}$ | $L_{2-331}$ |
| COMPOUND 6364 | $L_{1-205}$ | $L_{2-332}$ |
| COMPOUND 6365 | $L_{1-205}$ | $L_{2-333}$ |
| COMPOUND 6366 | $L_{1-205}$ | $L_{2-334}$ |
| COMPOUND 6367 | $L_{1-205}$ | $L_{2-335}$ |
| COMPOUND 6368 | $L_{1-205}$ | $L_{2-336}$ |
| COMPOUND 6369 | $L_{1-205}$ | $L_{2-337}$ |
| COMPOUND 6370 | $L_{1-205}$ | $L_{2-338}$ |
| COMPOUND 6371 | $L_{1-205}$ | $L_{2-339}$ |
| COMPOUND 6372 | $L_{1-205}$ | $L_{2-340}$ |
| COMPOUND 6373 | $L_{1-205}$ | $L_{2-341}$ |
| COMPOUND 6374 | $L_{1-205}$ | $L_{2-342}$ |
| COMPOUND 6375 | $L_{1-205}$ | $L_{2-343}$ |
| COMPOUND 6376 | $L_{1-205}$ | $L_{2-344}$ |
| COMPOUND 6377 | $L_{1-205}$ | $L_{2-345}$ |
| COMPOUND 6378 | $L_{1-205}$ | $L_{2-346}$ |
| COMPOUND 6379 | $L_{1-205}$ | $L_{2-347}$ |
| COMPOUND 6380 | $L_{1-205}$ | $L_{2-348}$ |
| COMPOUND 6381 | $L_{1-205}$ | $L_{2-349}$ |
| COMPOUND 6382 | $L_{1-205}$ | $L_{2-350}$ |
| COMPOUND 6383 | $L_{1-205}$ | $L_{2-351}$ |
| COMPOUND 6384 | $L_{1-205}$ | $L_{2-352}$ |
| COMPOUND 6385 | $L_{1-205}$ | $L_{2-353}$ |
| COMPOUND 6386 | $L_{1-205}$ | $L_{2-354}$ |
| COMPOUND 6387 | $L_{1-205}$ | $L_{2-355}$ |
| COMPOUND 6388 | $L_{1-205}$ | $L_{2-356}$ |
| COMPOUND 6389 | $L_{1-205}$ | $L_{2-357}$ |
| COMPOUND 6390 | $L_{1-205}$ | $L_{2-358}$ |
| COMPOUND 6391 | $L_{1-205}$ | $L_{2-359}$ |
| COMPOUND 6392 | $L_{1-205}$ | $L_{2-360}$ |
| COMPOUND 6393 | $L_{1-205}$ | $L_{2-361}$ |
| COMPOUND 6394 | $L_{1-205}$ | $L_{2-362}$ |
| COMPOUND 6395 | $L_{1-205}$ | $L_{2-363}$ |
| COMPOUND 6396 | $L_{1-205}$ | $L_{2-364}$ |
| COMPOUND 6397 | $L_{1-205}$ | $L_{2-365}$ |
| COMPOUND 6398 | $L_{1-205}$ | $L_{2-366}$ |
| COMPOUND 6399 | $L_{1-205}$ | $L_{2-367}$ |
| COMPOUND 6400 | $L_{1-205}$ | $L_{2-368}$ |
| COMPOUND 6401 | $L_{1-205}$ | $L_{2-369}$ |
| COMPOUND 6402 | $L_{1-205}$ | $L_{2-370}$ |
| COMPOUND 6403 | $L_{1-205}$ | $L_{2-371}$ |
| COMPOUND 6404 | $L_{1-205}$ | $L_{2-372}$ |
| COMPOUND 6405 | $L_{1-205}$ | $L_{2-373}$ |
| COMPOUND 6406 | $L_{1-205}$ | $L_{2-374}$ |

-continued

| | | |
|---|---|---|
| COMPOUND 6407 | $L_{1-205}$ | $L_{2-375}$ |
| COMPOUND 6408 | $L_{1-205}$ | $L_{2-376}$ |
| COMPOUND 6409 | $L_{1-206}$ | $L_{2-377}$ |
| COMPOUND 6410 | $L_{1-206}$ | $L_{2-1}$ |
| COMPOUND 6411 | $L_{1-206}$ | $L_{2-2}$ |
| COMPOUND 6412 | $L_{1-206}$ | $L_{2-3}$ |
| COMPOUND 6413 | $L_{1-206}$ | $L_{2-4}$ |
| COMPOUND 6414 | $L_{1-206}$ | $L_{2-5}$ |
| COMPOUND 6415 | $L_{1-206}$ | $L_{2-6}$ |
| COMPOUND 6416 | $L_{1-206}$ | $L_{2-7}$ |
| COMPOUND 6417 | $L_{1-206}$ | $L_{2-8}$ |
| COMPOUND 6418 | $L_{1-206}$ | $L_{2-9}$ |
| COMPOUND 6419 | $L_{1-206}$ | $L_{2-10}$ |
| COMPOUND 6420 | $L_{1-206}$ | $L_{2-11}$ |
| COMPOUND 6421 | $L_{1-206}$ | $L_{2-12}$ |
| COMPOUND 6422 | $L_{1-206}$ | $L_{2-13}$ |
| COMPOUND 6423 | $L_{1-206}$ | $L_{2-14}$ |
| COMPOUND 6424 | $L_{1-206}$ | $L_{2-15}$ |
| COMPOUND 6425 | $L_{1-206}$ | $L_{2-16}$ |
| COMPOUND 6426 | $L_{1-206}$ | $L_{2-17}$ |
| COMPOUND 6427 | $L_{1-206}$ | $L_{2-18}$ |
| COMPOUND 6428 | $L_{1-206}$ | $L_{2-19}$ |
| COMPOUND 6429 | $L_{1-206}$ | $L_{2-20}$ |
| COMPOUND 6430 | $L_{1-206}$ | $L_{2-21}$ |
| COMPOUND 6431 | $L_{1-206}$ | $L_{2-22}$ |
| COMPOUND 6432 | $L_{1-206}$ | $L_{2-23}$ |
| COMPOUND 6433 | $L_{1-206}$ | $L_{2-24}$ |
| COMPOUND 6434 | $L_{1-206}$ | $L_{2-25}$ |
| COMPOUND 6435 | $L_{1-206}$ | $L_{2-26}$ |
| COMPOUND 6436 | $L_{1-206}$ | $L_{2-27}$ |
| COMPOUND 6437 | $L_{1-206}$ | $L_{2-28}$ |
| COMPOUND 6438 | $L_{1-206}$ | $L_{2-29}$ |
| COMPOUND 6439 | $L_{1-206}$ | $L_{2-30}$ |
| COMPOUND 6440 | $L_{1-206}$ | $L_{2-31}$ |
| COMPOUND 6441 | $L_{1-206}$ | $L_{2-32}$ |
| COMPOUND 6442 | $L_{1-206}$ | $L_{2-33}$ |
| COMPOUND 6443 | $L_{1-206}$ | $L_{2-34}$ |
| COMPOUND 6444 | $L_{1-206}$ | $L_{2-35}$ |
| COMPOUND 6445 | $L_{1-206}$ | $L_{2-36}$ |
| COMPOUND 6446 | $L_{1-206}$ | $L_{2-37}$ |
| COMPOUND 6447 | $L_{1-206}$ | $L_{2-38}$ |
| COMPOUND 6448 | $L_{1-206}$ | $L_{2-39}$ |
| COMPOUND 6449 | $L_{1-206}$ | $L_{2-40}$ |
| COMPOUND 6450 | $L_{1-206}$ | $L_{2-41}$ |
| COMPOUND 6451 | $L_{1-206}$ | $L_{2-42}$ |
| COMPOUND 6452 | $L_{1-206}$ | $L_{2-43}$ |
| COMPOUND 6453 | $L_{1-206}$ | $L_{2-44}$ |
| COMPOUND 6454 | $L_{1-206}$ | $L_{2-45}$ |
| COMPOUND 6455 | $L_{1-206}$ | $L_{2-46}$ |
| COMPOUND 6456 | $L_{1-206}$ | $L_{2-47}$ |
| COMPOUND 6457 | $L_{1-206}$ | $L_{2-48}$ |
| COMPOUND 6458 | $L_{1-206}$ | $L_{2-49}$ |
| COMPOUND 6459 | $L_{1-206}$ | $L_{2-50}$ |
| COMPOUND 6460 | $L_{1-206}$ | $L_{2-51}$ |
| COMPOUND 6461 | $L_{1-206}$ | $L_{2-52}$ |
| COMPOUND 6462 | $L_{1-206}$ | $L_{2-53}$ |
| COMPOUND 6463 | $L_{1-206}$ | $L_{2-54}$ |
| COMPOUND 6464 | $L_{1-206}$ | $L_{2-55}$ |
| COMPOUND 6465 | $L_{1-206}$ | $L_{2-56}$ |
| COMPOUND 6466 | $L_{1-206}$ | $L_{2-57}$ |
| COMPOUND 6467 | $L_{1-206}$ | $L_{2-58}$ |
| COMPOUND 6468 | $L_{1-206}$ | $L_{2-59}$ |
| COMPOUND 6469 | $L_{1-206}$ | $L_{2-60}$ |
| COMPOUND 6470 | $L_{1-206}$ | $L_{2-61}$ |
| COMPOUND 6471 | $L_{1-206}$ | $L_{2-62}$ |
| COMPOUND 6472 | $L_{1-206}$ | $L_{2-63}$ |
| COMPOUND 6473 | $L_{1-206}$ | $L_{2-64}$ |
| COMPOUND 6474 | $L_{1-206}$ | $L_{2-65}$ |
| COMPOUND 6475 | $L_{1-206}$ | $L_{2-66}$ |
| COMPOUND 6476 | $L_{1-206}$ | $L_{2-67}$ |
| COMPOUND 6477 | $L_{1-206}$ | $L_{2-68}$ |
| COMPOUND 6478 | $L_{1-206}$ | $L_{2-69}$ |
| COMPOUND 6479 | $L_{1-206}$ | $L_{2-70}$ |
| COMPOUND 6480 | $L_{1-206}$ | $L_{2-71}$ |
| COMPOUND 6481 | $L_{1-206}$ | $L_{2-72}$ |
| COMPOUND 6482 | $L_{1-206}$ | $L_{2-73}$ |
| COMPOUND 6483 | $L_{1-206}$ | $L_{2-74}$ |
| COMPOUND 6484 | $L_{1-206}$ | $L_{2-75}$ |
| COMPOUND 6485 | $L_{1-206}$ | $L_{2-76}$ |

-continued

| | | |
|---|---|---|
| COMPOUND 6486 | $L_{1-206}$ | $L_{2-77}$ |
| COMPOUND 6487 | $L_{1-206}$ | $L_{2-78}$ |
| COMPOUND 6488 | $L_{1-206}$ | $L_{2-79}$ |
| COMPOUND 6489 | $L_{1-206}$ | $L_{2-80}$ |
| COMPOUND 6490 | $L_{1-206}$ | $L_{2-81}$ |
| COMPOUND 6491 | $L_{1-206}$ | $L_{2-82}$ |
| COMPOUND 6492 | $L_{1-206}$ | $L_{2-83}$ |
| COMPOUND 6493 | $L_{1-206}$ | $L_{2-84}$ |
| COMPOUND 6494 | $L_{1-206}$ | $L_{2-85}$ |
| COMPOUND 6495 | $L_{1-206}$ | $L_{2-86}$ |
| COMPOUND 6496 | $L_{1-206}$ | $L_{2-87}$ |
| COMPOUND 6497 | $L_{1-206}$ | $L_{2-88}$ |
| COMPOUND 6498 | $L_{1-206}$ | $L_{2-89}$ |
| COMPOUND 6499 | $L_{1-206}$ | $L_{2-90}$ |
| COMPOUND 6500 | $L_{1-206}$ | $L_{2-91}$ |
| COMPOUND 6501 | $L_{1-206}$ | $L_{2-92}$ |
| COMPOUND 6502 | $L_{1-206}$ | $L_{2-93}$ |
| COMPOUND 6503 | $L_{1-206}$ | $L_{2-94}$ |
| COMPOUND 6504 | $L_{1-206}$ | $L_{2-95}$ |
| COMPOUND 6505 | $L_{1-206}$ | $L_{2-96}$ |
| COMPOUND 6506 | $L_{1-206}$ | $L_{2-97}$ |
| COMPOUND 6507 | $L_{1-206}$ | $L_{2-98}$ |
| COMPOUND 6508 | $L_{1-206}$ | $L_{2-99}$ |
| COMPOUND 6509 | $L_{1-206}$ | $L_{2-100}$ |
| COMPOUND 6510 | $L_{1-206}$ | $L_{2-101}$ |
| COMPOUND 6511 | $L_{1-206}$ | $L_{2-102}$ |
| COMPOUND 6512 | $L_{1-206}$ | $L_{2-103}$ |
| COMPOUND 6513 | $L_{1-206}$ | $L_{2-104}$ |
| COMPOUND 6514 | $L_{1-206}$ | $L_{2-105}$ |
| COMPOUND 6515 | $L_{1-206}$ | $L_{2-106}$ |
| COMPOUND 6516 | $L_{1-206}$ | $L_{2-107}$ |
| COMPOUND 6517 | $L_{1-206}$ | $L_{2-108}$ |
| COMPOUND 6518 | $L_{1-206}$ | $L_{2-109}$ |
| COMPOUND 6519 | $L_{1-206}$ | $L_{2-110}$ |
| COMPOUND 6520 | $L_{1-206}$ | $L_{2-111}$ |
| COMPOUND 6521 | $L_{1-206}$ | $L_{2-112}$ |
| COMPOUND 6522 | $L_{1-206}$ | $L_{2-113}$ |
| COMPOUND 6523 | $L_{1-206}$ | $L_{2-114}$ |
| COMPOUND 6524 | $L_{1-206}$ | $L_{2-115}$ |
| COMPOUND 6525 | $L_{1-206}$ | $L_{2-116}$ |
| COMPOUND 6526 | $L_{1-206}$ | $L_{2-117}$ |
| COMPOUND 6527 | $L_{1-206}$ | $L_{2-118}$ |
| COMPOUND 6528 | $L_{1-206}$ | $L_{2-119}$ |
| COMPOUND 6529 | $L_{1-206}$ | $L_{2-120}$ |
| COMPOUND 6530 | $L_{1-206}$ | $L_{2-121}$ |
| COMPOUND 6531 | $L_{1-206}$ | $L_{2-122}$ |
| COMPOUND 6532 | $L_{1-206}$ | $L_{2-123}$ |
| COMPOUND 6533 | $L_{1-206}$ | $L_{2-124}$ |
| COMPOUND 6534 | $L_{1-206}$ | $L_{2-125}$ |
| COMPOUND 6535 | $L_{1-206}$ | $L_{2-126}$ |
| COMPOUND 6536 | $L_{1-206}$ | $L_{2-127}$ |
| COMPOUND 6537 | $L_{1-206}$ | $L_{2-128}$ |
| COMPOUND 6538 | $L_{1-206}$ | $L_{2-129}$ |
| COMPOUND 6539 | $L_{1-206}$ | $L_{2-130}$ |
| COMPOUND 6540 | $L_{1-206}$ | $L_{2-131}$ |
| COMPOUND 6541 | $L_{1-206}$ | $L_{2-132}$ |
| COMPOUND 6542 | $L_{1-206}$ | $L_{2-133}$ |
| COMPOUND 6543 | $L_{1-206}$ | $L_{2-134}$ |
| COMPOUND 6544 | $L_{1-206}$ | $L_{2-135}$ |
| COMPOUND 6545 | $L_{1-206}$ | $L_{2-136}$ |
| COMPOUND 6546 | $L_{1-206}$ | $L_{2-137}$ |
| COMPOUND 6547 | $L_{1-206}$ | $L_{2-138}$ |
| COMPOUND 6548 | $L_{1-206}$ | $L_{2-139}$ |
| COMPOUND 6549 | $L_{1-206}$ | $L_{2-140}$ |
| COMPOUND 6550 | $L_{1-206}$ | $L_{2-141}$ |
| COMPOUND 6551 | $L_{1-206}$ | $L_{2-142}$ |
| COMPOUND 6552 | $L_{1-206}$ | $L_{2-143}$ |
| COMPOUND 6553 | $L_{1-206}$ | $L_{2-144}$ |
| COMPOUND 6554 | $L_{1-206}$ | $L_{2-145}$ |
| COMPOUND 6555 | $L_{1-206}$ | $L_{2-146}$ |
| COMPOUND 6556 | $L_{1-206}$ | $L_{2-147}$ |
| COMPOUND 6557 | $L_{1-206}$ | $L_{2-148}$ |
| COMPOUND 6558 | $L_{1-206}$ | $L_{2-149}$ |
| COMPOUND 6559 | $L_{1-206}$ | $L_{2-150}$ |
| COMPOUND 6560 | $L_{1-206}$ | $L_{2-151}$ |
| COMPOUND 6561 | $L_{1-206}$ | $L_{2-152}$ |
| COMPOUND 6562 | $L_{1-206}$ | $L_{2-153}$ |
| COMPOUND 6563 | $L_{1-206}$ | $L_{2-154}$ |
| COMPOUND 6564 | $L_{1-206}$ | $L_{2-155}$ |

-continued

| | | |
|---|---|---|
| COMPOUND 6565 | $L_{1-206}$ | $L_{2-156}$ |
| COMPOUND 6566 | $L_{1-206}$ | $L_{2-157}$ |
| COMPOUND 6567 | $L_{1-206}$ | $L_{2-158}$ |
| COMPOUND 6568 | $L_{1-206}$ | $L_{2-159}$ |
| COMPOUND 6569 | $L_{1-206}$ | $L_{2-160}$ |
| COMPOUND 6570 | $L_{1-206}$ | $L_{2-161}$ |
| COMPOUND 6571 | $L_{1-206}$ | $L_{2-162}$ |
| COMPOUND 6572 | $L_{1-206}$ | $L_{2-163}$ |
| COMPOUND 6573 | $L_{1-206}$ | $L_{2-164}$ |
| COMPOUND 6574 | $L_{1-206}$ | $L_{2-165}$ |
| COMPOUND 6575 | $L_{1-206}$ | $L_{2-166}$ |
| COMPOUND 6576 | $L_{1-206}$ | $L_{2-167}$ |
| COMPOUND 6577 | $L_{1-206}$ | $L_{2-168}$ |
| COMPOUND 6578 | $L_{1-206}$ | $L_{2-169}$ |
| COMPOUND 6579 | $L_{1-206}$ | $L_{2-170}$ |
| COMPOUND 6580 | $L_{1-206}$ | $L_{2-171}$ |
| COMPOUND 6581 | $L_{1-206}$ | $L_{2-172}$ |
| COMPOUND 6582 | $L_{1-206}$ | $L_{2-173}$ |
| COMPOUND 6583 | $L_{1-206}$ | $L_{2-174}$ |
| COMPOUND 6584 | $L_{1-206}$ | $L_{2-175}$ |
| COMPOUND 6585 | $L_{1-206}$ | $L_{2-176}$ |
| COMPOUND 6586 | $L_{1-206}$ | $L_{2-177}$ |
| COMPOUND 6587 | $L_{1-206}$ | $L_{2-178}$ |
| COMPOUND 6588 | $L_{1-206}$ | $L_{2-179}$ |
| COMPOUND 6589 | $L_{1-206}$ | $L_{2-180}$ |
| COMPOUND 6590 | $L_{1-206}$ | $L_{2-181}$ |
| COMPOUND 6591 | $L_{1-206}$ | $L_{2-182}$ |
| COMPOUND 6592 | $L_{1-206}$ | $L_{2-183}$ |
| COMPOUND 6593 | $L_{1-206}$ | $L_{2-184}$ |
| COMPOUND 6594 | $L_{1-206}$ | $L_{2-185}$ |
| COMPOUND 6595 | $L_{1-206}$ | $L_{2-186}$ |
| COMPOUND 6596 | $L_{1-206}$ | $L_{2-187}$ |
| COMPOUND 6597 | $L_{1-206}$ | $L_{2-188}$ |
| COMPOUND 6598 | $L_{1-206}$ | $L_{2-189}$ |
| COMPOUND 6599 | $L_{1-206}$ | $L_{2-190}$ |
| COMPOUND 6600 | $L_{1-206}$ | $L_{2-191}$ |
| COMPOUND 6601 | $L_{1-206}$ | $L_{2-192}$ |
| COMPOUND 6602 | $L_{1-206}$ | $L_{2-193}$ |
| COMPOUND 6603 | $L_{1-206}$ | $L_{2-194}$ |
| COMPOUND 6604 | $L_{1-206}$ | $L_{2-195}$ |
| COMPOUND 6605 | $L_{1-206}$ | $L_{2-196}$ |
| COMPOUND 6606 | $L_{1-206}$ | $L_{2-197}$ |
| COMPOUND 6607 | $L_{1-206}$ | $L_{2-198}$ |
| COMPOUND 6608 | $L_{1-206}$ | $L_{2-199}$ |
| COMPOUND 6609 | $L_{1-206}$ | $L_{2-200}$ |
| COMPOUND 6610 | $L_{1-206}$ | $L_{2-201}$ |
| COMPOUND 6611 | $L_{1-206}$ | $L_{2-202}$ |
| COMPOUND 6612 | $L_{1-206}$ | $L_{2-203}$ |
| COMPOUND 6613 | $L_{1-206}$ | $L_{2-204}$ |
| COMPOUND 6614 | $L_{1-206}$ | $L_{2-205}$ |
| COMPOUND 6615 | $L_{1-206}$ | $L_{2-206}$ |
| COMPOUND 6616 | $L_{1-206}$ | $L_{2-207}$ |
| COMPOUND 6617 | $L_{1-206}$ | $L_{2-208}$ |
| COMPOUND 6618 | $L_{1-206}$ | $L_{2-209}$ |
| COMPOUND 6619 | $L_{1-206}$ | $L_{2-210}$ |
| COMPOUND 6620 | $L_{1-206}$ | $L_{2-211}$ |
| COMPOUND 6621 | $L_{1-206}$ | $L_{2-212}$ |
| COMPOUND 6622 | $L_{1-206}$ | $L_{2-213}$ |
| COMPOUND 6623 | $L_{1-206}$ | $L_{2-214}$ |
| COMPOUND 6624 | $L_{1-206}$ | $L_{2-215}$ |
| COMPOUND 6625 | $L_{1-206}$ | $L_{2-216}$ |
| COMPOUND 6626 | $L_{1-206}$ | $L_{2-217}$ |
| COMPOUND 6627 | $L_{1-206}$ | $L_{2-218}$ |
| COMPOUND 6628 | $L_{1-206}$ | $L_{2-219}$ |
| COMPOUND 6629 | $L_{1-206}$ | $L_{2-220}$ |
| COMPOUND 6630 | $L_{1-206}$ | $L_{2-221}$ |
| COMPOUND 6631 | $L_{1-206}$ | $L_{2-222}$ |
| COMPOUND 6632 | $L_{1-206}$ | $L_{2-223}$ |
| COMPOUND 6633 | $L_{1-206}$ | $L_{2-224}$ |
| COMPOUND 6634 | $L_{1-206}$ | $L_{2-225}$ |
| COMPOUND 6635 | $L_{1-206}$ | $L_{2-226}$ |
| COMPOUND 6636 | $L_{1-206}$ | $L_{2-227}$ |
| COMPOUND 6637 | $L_{1-206}$ | $L_{2-228}$ |
| COMPOUND 6638 | $L_{1-206}$ | $L_{2-229}$ |
| COMPOUND 6639 | $L_{1-206}$ | $L_{2-230}$ |
| COMPOUND 6640 | $L_{1-206}$ | $L_{2-231}$ |
| COMPOUND 6641 | $L_{1-206}$ | $L_{2-232}$ |
| COMPOUND 6642 | $L_{1-206}$ | $L_{2-233}$ |
| COMPOUND 6643 | $L_{1-206}$ | $L_{2-234}$ |

-continued

| | | |
|---|---|---|
| COMPOUND 6644 | $L_{1-206}$ | $L_{2-235}$ |
| COMPOUND 6645 | $L_{1-206}$ | $L_{2-236}$ |
| COMPOUND 6646 | $L_{1-206}$ | $L_{2-237}$ |
| COMPOUND 6647 | $L_{1-206}$ | $L_{2-238}$ |
| COMPOUND 6648 | $L_{1-206}$ | $L_{2-239}$ |
| COMPOUND 6649 | $L_{1-206}$ | $L_{2-240}$ |
| COMPOUND 6650 | $L_{1-206}$ | $L_{2-241}$ |
| COMPOUND 6651 | $L_{1-206}$ | $L_{2-242}$ |
| COMPOUND 6652 | $L_{1-206}$ | $L_{2-243}$ |
| COMPOUND 6653 | $L_{1-206}$ | $L_{2-244}$ |
| COMPOUND 6654 | $L_{1-206}$ | $L_{2-245}$ |
| COMPOUND 6655 | $L_{1-206}$ | $L_{2-246}$ |
| COMPOUND 6656 | $L_{1-206}$ | $L_{2-247}$ |
| COMPOUND 6657 | $L_{1-206}$ | $L_{2-248}$ |
| COMPOUND 6658 | $L_{1-206}$ | $L_{2-249}$ |
| COMPOUND 6659 | $L_{1-206}$ | $L_{2-250}$ |
| COMPOUND 6660 | $L_{1-206}$ | $L_{2-251}$ |
| COMPOUND 6661 | $L_{1-206}$ | $L_{2-252}$ |
| COMPOUND 6662 | $L_{1-206}$ | $L_{2-253}$ |
| COMPOUND 6663 | $L_{1-206}$ | $L_{2-254}$ |
| COMPOUND 6664 | $L_{1-206}$ | $L_{2-255}$ |
| COMPOUND 6665 | $L_{1-206}$ | $L_{2-256}$ |
| COMPOUND 6666 | $L_{1-206}$ | $L_{2-257}$ |
| COMPOUND 6667 | $L_{1-206}$ | $L_{2-258}$ |
| COMPOUND 6668 | $L_{1-206}$ | $L_{2-259}$ |
| COMPOUND 6669 | $L_{1-206}$ | $L_{2-260}$ |
| COMPOUND 6670 | $L_{1-206}$ | $L_{2-261}$ |
| COMPOUND 6671 | $L_{1-206}$ | $L_{2-262}$ |
| COMPOUND 6672 | $L_{1-206}$ | $L_{2-263}$ |
| COMPOUND 6673 | $L_{1-206}$ | $L_{2-264}$ |
| COMPOUND 6674 | $L_{1-206}$ | $L_{2-265}$ |
| COMPOUND 6675 | $L_{1-206}$ | $L_{2-266}$ |
| COMPOUND 6676 | $L_{1-206}$ | $L_{2-267}$ |
| COMPOUND 6677 | $L_{1-206}$ | $L_{2-268}$ |
| COMPOUND 6678 | $L_{1-206}$ | $L_{2-269}$ |
| COMPOUND 6679 | $L_{1-206}$ | $L_{2-270}$ |
| COMPOUND 6680 | $L_{1-206}$ | $L_{2-271}$ |
| COMPOUND 6681 | $L_{1-206}$ | $L_{2-272}$ |
| COMPOUND 6682 | $L_{1-206}$ | $L_{2-273}$ |
| COMPOUND 6683 | $L_{1-206}$ | $L_{2-274}$ |
| COMPOUND 6684 | $L_{1-206}$ | $L_{2-275}$ |
| COMPOUND 6685 | $L_{1-206}$ | $L_{2-276}$ |
| COMPOUND 6686 | $L_{1-206}$ | $L_{2-277}$ |
| COMPOUND 6687 | $L_{1-206}$ | $L_{2-278}$ |
| COMPOUND 6688 | $L_{1-206}$ | $L_{2-279}$ |
| COMPOUND 6689 | $L_{1-206}$ | $L_{2-280}$ |
| COMPOUND 6690 | $L_{1-206}$ | $L_{2-281}$ |
| COMPOUND 6691 | $L_{1-206}$ | $L_{2-282}$ |
| COMPOUND 6692 | $L_{1-206}$ | $L_{2-283}$ |
| COMPOUND 6693 | $L_{1-206}$ | $L_{2-284}$ |
| COMPOUND 6694 | $L_{1-206}$ | $L_{2-285}$ |
| COMPOUND 6695 | $L_{1-206}$ | $L_{2-286}$ |
| COMPOUND 6696 | $L_{1-206}$ | $L_{2-287}$ |
| COMPOUND 6697 | $L_{1-206}$ | $L_{2-288}$ |
| COMPOUND 6698 | $L_{1-206}$ | $L_{2-289}$ |
| COMPOUND 6699 | $L_{1-206}$ | $L_{2-290}$ |
| COMPOUND 6700 | $L_{1-206}$ | $L_{2-291}$ |
| COMPOUND 6701 | $L_{1-206}$ | $L_{2-292}$ |
| COMPOUND 6702 | $L_{1-206}$ | $L_{2-293}$ |
| COMPOUND 6703 | $L_{1-206}$ | $L_{2-294}$ |
| COMPOUND 6704 | $L_{1-206}$ | $L_{2-295}$ |
| COMPOUND 6705 | $L_{1-206}$ | $L_{2-296}$ |
| COMPOUND 6706 | $L_{1-206}$ | $L_{2-297}$ |
| COMPOUND 6707 | $L_{1-206}$ | $L_{2-298}$ |
| COMPOUND 6708 | $L_{1-206}$ | $L_{2-299}$ |
| COMPOUND 6709 | $L_{1-206}$ | $L_{2-300}$ |
| COMPOUND 6710 | $L_{1-206}$ | $L_{2-301}$ |
| COMPOUND 6711 | $L_{1-206}$ | $L_{2-302}$ |
| COMPOUND 6712 | $L_{1-206}$ | $L_{2-303}$ |
| COMPOUND 6713 | $L_{1-206}$ | $L_{2-304}$ |
| COMPOUND 6714 | $L_{1-206}$ | $L_{2-305}$ |
| COMPOUND 6715 | $L_{1-206}$ | $L_{2-306}$ |
| COMPOUND 6716 | $L_{1-206}$ | $L_{2-307}$ |
| COMPOUND 6717 | $L_{1-206}$ | $L_{2-308}$ |
| COMPOUND 6718 | $L_{1-206}$ | $L_{2-309}$ |
| COMPOUND 6719 | $L_{1-206}$ | $L_{2-310}$ |
| COMPOUND 6720 | $L_{1-206}$ | $L_{2-311}$ |
| COMPOUND 6721 | $L_{1-206}$ | $L_{2-312}$ |
| COMPOUND 6722 | $L_{1-206}$ | $L_{2-313}$ |

-continued

| | | |
|---|---|---|
| COMPOUND 6723 | $L_{1-206}$ | $L_{2-314}$ |
| COMPOUND 6724 | $L_{1-206}$ | $L_{2-315}$ |
| COMPOUND 6725 | $L_{1-206}$ | $L_{2-316}$ |
| COMPOUND 6726 | $L_{1-206}$ | $L_{2-317}$ |
| COMPOUND 6727 | $L_{1-206}$ | $L_{2-318}$ |
| COMPOUND 6728 | $L_{1-206}$ | $L_{2-319}$ |
| COMPOUND 6729 | $L_{1-206}$ | $L_{2-320}$ |
| COMPOUND 6730 | $L_{1-206}$ | $L_{2-321}$ |
| COMPOUND 6731 | $L_{1-206}$ | $L_{2-322}$ |
| COMPOUND 6732 | $L_{1-206}$ | $L_{2-323}$ |
| COMPOUND 6733 | $L_{1-206}$ | $L_{2-324}$ |
| COMPOUND 6734 | $L_{1-206}$ | $L_{2-325}$ |
| COMPOUND 6735 | $L_{1-206}$ | $L_{2-326}$ |
| COMPOUND 6736 | $L_{1-206}$ | $L_{2-327}$ |
| COMPOUND 6737 | $L_{1-206}$ | $L_{2-328}$ |
| COMPOUND 6738 | $L_{1-206}$ | $L_{2-329}$ |
| COMPOUND 6739 | $L_{1-206}$ | $L_{2-330}$ |
| COMPOUND 6740 | $L_{1-206}$ | $L_{2-331}$ |
| COMPOUND 6741 | $L_{1-206}$ | $L_{2-332}$ |
| COMPOUND 6742 | $L_{1-206}$ | $L_{2-333}$ |
| COMPOUND 6743 | $L_{1-206}$ | $L_{2-334}$ |
| COMPOUND 6744 | $L_{1-206}$ | $L_{2-335}$ |
| COMPOUND 6745 | $L_{1-206}$ | $L_{2-336}$ |
| COMPOUND 6746 | $L_{1-206}$ | $L_{2-337}$ |
| COMPOUND 6747 | $L_{1-206}$ | $L_{2-338}$ |
| COMPOUND 6748 | $L_{1-206}$ | $L_{2-339}$ |
| COMPOUND 6749 | $L_{1-206}$ | $L_{2-340}$ |
| COMPOUND 6750 | $L_{1-206}$ | $L_{2-341}$ |
| COMPOUND 6751 | $L_{1-206}$ | $L_{2-342}$ |
| COMPOUND 6752 | $L_{1-206}$ | $L_{2-343}$ |
| COMPOUND 6753 | $L_{1-206}$ | $L_{2-344}$ |
| COMPOUND 6754 | $L_{1-206}$ | $L_{2-345}$ |
| COMPOUND 6755 | $L_{1-206}$ | $L_{2-346}$ |
| COMPOUND 6756 | $L_{1-206}$ | $L_{2-347}$ |
| COMPOUND 6757 | $L_{1-206}$ | $L_{2-348}$ |
| COMPOUND 6758 | $L_{1-206}$ | $L_{2-349}$ |
| COMPOUND 6759 | $L_{1-206}$ | $L_{2-350}$ |
| COMPOUND 6760 | $L_{1-206}$ | $L_{2-351}$ |
| COMPOUND 6761 | $L_{1-206}$ | $L_{2-352}$ |
| COMPOUND 6762 | $L_{1-206}$ | $L_{2-353}$ |
| COMPOUND 6763 | $L_{1-206}$ | $L_{2-354}$ |
| COMPOUND 6764 | $L_{1-206}$ | $L_{2-355}$ |
| COMPOUND 6765 | $L_{1-206}$ | $L_{2-356}$ |
| COMPOUND 6766 | $L_{1-206}$ | $L_{2-357}$ |
| COMPOUND 6767 | $L_{1-206}$ | $L_{2-358}$ |
| COMPOUND 6768 | $L_{1-206}$ | $L_{2-359}$ |
| COMPOUND 6769 | $L_{1-206}$ | $L_{2-360}$ |
| COMPOUND 6770 | $L_{1-206}$ | $L_{2-361}$ |
| COMPOUND 6771 | $L_{1-206}$ | $L_{2-362}$ |
| COMPOUND 6772 | $L_{1-206}$ | $L_{2-363}$ |
| COMPOUND 6773 | $L_{1-206}$ | $L_{2-364}$ |
| COMPOUND 6774 | $L_{1-206}$ | $L_{2-365}$ |
| COMPOUND 6775 | $L_{1-206}$ | $L_{2-366}$ |
| COMPOUND 6776 | $L_{1-206}$ | $L_{2-367}$ |
| COMPOUND 6777 | $L_{1-206}$ | $L_{2-368}$ |
| COMPOUND 6778 | $L_{1-206}$ | $L_{2-369}$ |
| COMPOUND 6779 | $L_{1-206}$ | $L_{2-370}$ |
| COMPOUND 6780 | $L_{1-206}$ | $L_{2-371}$ |
| COMPOUND 6781 | $L_{1-206}$ | $L_{2-372}$ |
| COMPOUND 6782 | $L_{1-206}$ | $L_{2-373}$ |
| COMPOUND 6783 | $L_{1-206}$ | $L_{2-374}$ |
| COMPOUND 6784 | $L_{1-206}$ | $L_{2-375}$ |
| COMPOUND 6785 | $L_{1-206}$ | $L_{2-376}$ |
| COMPOUND 6786 | $L_{1-207}$ | $L_{2-377}$ |
| COMPOUND 6787 | $L_{1-207}$ | $L_{2-1}$ |
| COMPOUND 6788 | $L_{1-207}$ | $L_{2-2}$ |
| COMPOUND 6789 | $L_{1-207}$ | $L_{2-3}$ |
| COMPOUND 6790 | $L_{1-207}$ | $L_{2-4}$ |
| COMPOUND 6791 | $L_{1-207}$ | $L_{2-5}$ |
| COMPOUND 6792 | $L_{1-207}$ | $L_{2-6}$ |
| COMPOUND 6793 | $L_{1-207}$ | $L_{2-7}$ |
| COMPOUND 6794 | $L_{1-207}$ | $L_{2-8}$ |
| COMPOUND 6795 | $L_{1-207}$ | $L_{2-9}$ |
| COMPOUND 6796 | $L_{1-207}$ | $L_{2-10}$ |
| COMPOUND 6797 | $L_{1-207}$ | $L_{2-11}$ |
| COMPOUND 6798 | $L_{1-207}$ | $L_{2-12}$ |
| COMPOUND 6799 | $L_{1-207}$ | $L_{2-13}$ |
| COMPOUND 6800 | $L_{1-207}$ | $L_{2-14}$ |
| COMPOUND 6801 | $L_{1-207}$ | $L_{2-15}$ |

-continued

| | | |
|---|---|---|
| COMPOUND 6802 | $L_{1-207}$ | $L_{2-16}$ |
| COMPOUND 6803 | $L_{1-207}$ | $L_{2-17}$ |
| COMPOUND 6804 | $L_{1-207}$ | $L_{2-18}$ |
| COMPOUND 6805 | $L_{1-207}$ | $L_{2-19}$ |
| COMPOUND 6806 | $L_{1-207}$ | $L_{2-20}$ |
| COMPOUND 6807 | $L_{1-207}$ | $L_{2-21}$ |
| COMPOUND 6808 | $L_{1-207}$ | $L_{2-22}$ |
| COMPOUND 6809 | $L_{1-207}$ | $L_{2-23}$ |
| COMPOUND 6810 | $L_{1-207}$ | $L_{2-24}$ |
| COMPOUND 6811 | $L_{1-207}$ | $L_{2-25}$ |
| COMPOUND 6812 | $L_{1-207}$ | $L_{2-26}$ |
| COMPOUND 6813 | $L_{1-207}$ | $L_{2-27}$ |
| COMPOUND 6814 | $L_{1-207}$ | $L_{2-28}$ |
| COMPOUND 6815 | $L_{1-207}$ | $L_{2-29}$ |
| COMPOUND 6816 | $L_{1-207}$ | $L_{2-30}$ |
| COMPOUND 6817 | $L_{1-207}$ | $L_{2-31}$ |
| COMPOUND 6818 | $L_{1-207}$ | $L_{2-32}$ |
| COMPOUND 6819 | $L_{1-207}$ | $L_{2-33}$ |
| COMPOUND 6820 | $L_{1-207}$ | $L_{2-34}$ |
| COMPOUND 6821 | $L_{1-207}$ | $L_{2-35}$ |
| COMPOUND 6822 | $L_{1-207}$ | $L_{2-36}$ |
| COMPOUND 6823 | $L_{1-207}$ | $L_{2-37}$ |
| COMPOUND 6824 | $L_{1-207}$ | $L_{2-38}$ |
| COMPOUND 6825 | $L_{1-207}$ | $L_{2-39}$ |
| COMPOUND 6826 | $L_{1-207}$ | $L_{2-40}$ |
| COMPOUND 6827 | $L_{1-207}$ | $L_{2-41}$ |
| COMPOUND 6828 | $L_{1-207}$ | $L_{2-42}$ |
| COMPOUND 6829 | $L_{1-207}$ | $L_{2-43}$ |
| COMPOUND 6830 | $L_{1-207}$ | $L_{2-44}$ |
| COMPOUND 6831 | $L_{1-207}$ | $L_{2-45}$ |
| COMPOUND 6832 | $L_{1-207}$ | $L_{2-46}$ |
| COMPOUND 6833 | $L_{1-207}$ | $L_{2-47}$ |
| COMPOUND 6834 | $L_{1-207}$ | $L_{2-48}$ |
| COMPOUND 6835 | $L_{1-207}$ | $L_{2-49}$ |
| COMPOUND 6836 | $L_{1-207}$ | $L_{2-50}$ |
| COMPOUND 6837 | $L_{1-207}$ | $L_{2-51}$ |
| COMPOUND 6838 | $L_{1-207}$ | $L_{2-52}$ |
| COMPOUND 6839 | $L_{1-207}$ | $L_{2-53}$ |
| COMPOUND 6840 | $L_{1-207}$ | $L_{2-54}$ |
| COMPOUND 6841 | $L_{1-207}$ | $L_{2-55}$ |
| COMPOUND 6842 | $L_{1-207}$ | $L_{2-56}$ |
| COMPOUND 6843 | $L_{1-207}$ | $L_{2-57}$ |
| COMPOUND 6844 | $L_{1-207}$ | $L_{2-58}$ |
| COMPOUND 6845 | $L_{1-207}$ | $L_{2-59}$ |
| COMPOUND 6846 | $L_{1-207}$ | $L_{2-60}$ |
| COMPOUND 6847 | $L_{1-207}$ | $L_{2-61}$ |
| COMPOUND 6848 | $L_{1-207}$ | $L_{2-62}$ |
| COMPOUND 6849 | $L_{1-207}$ | $L_{2-63}$ |
| COMPOUND 6850 | $L_{1-207}$ | $L_{2-64}$ |
| COMPOUND 6851 | $L_{1-207}$ | $L_{2-65}$ |
| COMPOUND 6852 | $L_{1-207}$ | $L_{2-66}$ |
| COMPOUND 6853 | $L_{1-207}$ | $L_{2-67}$ |
| COMPOUND 6854 | $L_{1-207}$ | $L_{2-68}$ |
| COMPOUND 6855 | $L_{1-207}$ | $L_{2-69}$ |
| COMPOUND 6856 | $L_{1-207}$ | $L_{2-70}$ |
| COMPOUND 6857 | $L_{1-207}$ | $L_{2-71}$ |
| COMPOUND 6858 | $L_{1-207}$ | $L_{2-72}$ |
| COMPOUND 6859 | $L_{1-207}$ | $L_{2-73}$ |
| COMPOUND 6860 | $L_{1-207}$ | $L_{2-74}$ |
| COMPOUND 6861 | $L_{1-207}$ | $L_{2-75}$ |
| COMPOUND 6862 | $L_{1-207}$ | $L_{2-76}$ |
| COMPOUND 6863 | $L_{1-207}$ | $L_{2-77}$ |
| COMPOUND 6864 | $L_{1-207}$ | $L_{2-78}$ |
| COMPOUND 6865 | $L_{1-207}$ | $L_{2-79}$ |
| COMPOUND 6866 | $L_{1-207}$ | $L_{2-80}$ |
| COMPOUND 6867 | $L_{1-207}$ | $L_{2-81}$ |
| COMPOUND 6868 | $L_{1-207}$ | $L_{2-82}$ |
| COMPOUND 6869 | $L_{1-207}$ | $L_{2-83}$ |
| COMPOUND 6870 | $L_{1-207}$ | $L_{2-84}$ |
| COMPOUND 6871 | $L_{1-207}$ | $L_{2-85}$ |
| COMPOUND 6872 | $L_{1-207}$ | $L_{2-86}$ |
| COMPOUND 6873 | $L_{1-207}$ | $L_{2-87}$ |
| COMPOUND 6874 | $L_{1-207}$ | $L_{2-88}$ |
| COMPOUND 6875 | $L_{1-207}$ | $L_{2-89}$ |
| COMPOUND 6876 | $L_{1-207}$ | $L_{2-90}$ |
| COMPOUND 6877 | $L_{1-207}$ | $L_{2-91}$ |
| COMPOUND 6878 | $L_{1-207}$ | $L_{2-92}$ |
| COMPOUND 6879 | $L_{1-207}$ | $L_{2-93}$ |
| COMPOUND 6880 | $L_{1-207}$ | $L_{2-94}$ |

-continued

| | | |
|---|---|---|
| COMPOUND 6881 | $L_{1-207}$ | $L_{2-95}$ |
| COMPOUND 6882 | $L_{1-207}$ | $L_{2-96}$ |
| COMPOUND 6883 | $L_{1-207}$ | $L_{2-97}$ |
| COMPOUND 6884 | $L_{1-207}$ | $L_{2-98}$ |
| COMPOUND 6885 | $L_{1-207}$ | $L_{2-99}$ |
| COMPOUND 6886 | $L_{1-207}$ | $L_{2-100}$ |
| COMPOUND 6887 | $L_{1-207}$ | $L_{2-101}$ |
| COMPOUND 6888 | $L_{1-207}$ | $L_{2-102}$ |
| COMPOUND 6889 | $L_{1-207}$ | $L_{2-103}$ |
| COMPOUND 6890 | $L_{1-207}$ | $L_{2-104}$ |
| COMPOUND 6891 | $L_{1-207}$ | $L_{2-105}$ |
| COMPOUND 6892 | $L_{1-207}$ | $L_{2-106}$ |
| COMPOUND 6893 | $L_{1-207}$ | $L_{2-107}$ |
| COMPOUND 6894 | $L_{1-207}$ | $L_{2-108}$ |
| COMPOUND 6895 | $L_{1-207}$ | $L_{2-109}$ |
| COMPOUND 6896 | $L_{1-207}$ | $L_{2-110}$ |
| COMPOUND 6897 | $L_{1-207}$ | $L_{2-111}$ |
| COMPOUND 6898 | $L_{1-207}$ | $L_{2-112}$ |
| COMPOUND 6899 | $L_{1-207}$ | $L_{2-113}$ |
| COMPOUND 6900 | $L_{1-207}$ | $L_{2-114}$ |
| COMPOUND 6901 | $L_{1-207}$ | $L_{2-115}$ |
| COMPOUND 6902 | $L_{1-207}$ | $L_{2-116}$ |
| COMPOUND 6903 | $L_{1-207}$ | $L_{2-117}$ |
| COMPOUND 6904 | $L_{1-207}$ | $L_{2-118}$ |
| COMPOUND 6905 | $L_{1-207}$ | $L_{2-119}$ |
| COMPOUND 6906 | $L_{1-207}$ | $L_{2-120}$ |
| COMPOUND 6907 | $L_{1-207}$ | $L_{2-121}$ |
| COMPOUND 6908 | $L_{1-207}$ | $L_{2-122}$ |
| COMPOUND 6909 | $L_{1-207}$ | $L_{2-123}$ |
| COMPOUND 6910 | $L_{1-207}$ | $L_{2-124}$ |
| COMPOUND 6911 | $L_{1-207}$ | $L_{2-125}$ |
| COMPOUND 6912 | $L_{1-207}$ | $L_{2-126}$ |
| COMPOUND 6913 | $L_{1-207}$ | $L_{2-127}$ |
| COMPOUND 6914 | $L_{1-207}$ | $L_{2-128}$ |
| COMPOUND 6915 | $L_{1-207}$ | $L_{2-129}$ |
| COMPOUND 6916 | $L_{1-207}$ | $L_{2-130}$ |
| COMPOUND 6917 | $L_{1-207}$ | $L_{2-131}$ |
| COMPOUND 6918 | $L_{1-207}$ | $L_{2-132}$ |
| COMPOUND 6919 | $L_{1-207}$ | $L_{2-133}$ |
| COMPOUND 6920 | $L_{1-207}$ | $L_{2-134}$ |
| COMPOUND 6921 | $L_{1-207}$ | $L_{2-135}$ |
| COMPOUND 6922 | $L_{1-207}$ | $L_{2-136}$ |
| COMPOUND 6923 | $L_{1-207}$ | $L_{2-137}$ |
| COMPOUND 6924 | $L_{1-207}$ | $L_{2-138}$ |
| COMPOUND 6925 | $L_{1-207}$ | $L_{2-139}$ |
| COMPOUND 6926 | $L_{1-207}$ | $L_{2-140}$ |
| COMPOUND 6927 | $L_{1-207}$ | $L_{2-141}$ |
| COMPOUND 6928 | $L_{1-207}$ | $L_{2-142}$ |
| COMPOUND 6929 | $L_{1-207}$ | $L_{2-143}$ |
| COMPOUND 6930 | $L_{1-207}$ | $L_{2-144}$ |
| COMPOUND 6931 | $L_{1-207}$ | $L_{2-145}$ |
| COMPOUND 6932 | $L_{1-207}$ | $L_{2-146}$ |
| COMPOUND 6933 | $L_{1-207}$ | $L_{2-147}$ |
| COMPOUND 6934 | $L_{1-207}$ | $L_{2-148}$ |
| COMPOUND 6935 | $L_{1-207}$ | $L_{2-149}$ |
| COMPOUND 6936 | $L_{1-207}$ | $L_{2-150}$ |
| COMPOUND 6937 | $L_{1-207}$ | $L_{2-151}$ |
| COMPOUND 6938 | $L_{1-207}$ | $L_{2-152}$ |
| COMPOUND 6939 | $L_{1-207}$ | $L_{2-153}$ |
| COMPOUND 6940 | $L_{1-207}$ | $L_{2-154}$ |
| COMPOUND 6941 | $L_{1-207}$ | $L_{2-155}$ |
| COMPOUND 6942 | $L_{1-207}$ | $L_{2-156}$ |
| COMPOUND 6943 | $L_{1-207}$ | $L_{2-157}$ |
| COMPOUND 6944 | $L_{1-207}$ | $L_{2-158}$ |
| COMPOUND 6945 | $L_{1-207}$ | $L_{2-159}$ |
| COMPOUND 6946 | $L_{1-207}$ | $L_{2-160}$ |
| COMPOUND 6947 | $L_{1-207}$ | $L_{2-161}$ |
| COMPOUND 6948 | $L_{1-207}$ | $L_{2-162}$ |
| COMPOUND 6949 | $L_{1-207}$ | $L_{2-163}$ |
| COMPOUND 6950 | $L_{1-207}$ | $L_{2-164}$ |
| COMPOUND 6951 | $L_{1-207}$ | $L_{2-165}$ |
| COMPOUND 6952 | $L_{1-207}$ | $L_{2-166}$ |
| COMPOUND 6953 | $L_{1-207}$ | $L_{2-167}$ |
| COMPOUND 6954 | $L_{1-207}$ | $L_{2-168}$ |
| COMPOUND 6955 | $L_{1-207}$ | $L_{2-169}$ |
| COMPOUND 6956 | $L_{1-207}$ | $L_{2-170}$ |
| COMPOUND 6957 | $L_{1-207}$ | $L_{2-171}$ |
| COMPOUND 6958 | $L_{1-207}$ | $L_{2-172}$ |
| COMPOUND 6959 | $L_{1-207}$ | $L_{2-173}$ |

-continued

| | | |
|---|---|---|
| COMPOUND 6960 | $L_{1-207}$ | $L_{2-174}$ |
| COMPOUND 6961 | $L_{1-207}$ | $L_{2-175}$ |
| COMPOUND 6962 | $L_{1-207}$ | $L_{2-176}$ |
| COMPOUND 6963 | $L_{1-207}$ | $L_{2-177}$ |
| COMPOUND 6964 | $L_{1-207}$ | $L_{2-178}$ |
| COMPOUND 6965 | $L_{1-207}$ | $L_{2-179}$ |
| COMPOUND 6966 | $L_{1-207}$ | $L_{2-180}$ |
| COMPOUND 6967 | $L_{1-207}$ | $L_{2-181}$ |
| COMPOUND 6968 | $L_{1-207}$ | $L_{2-182}$ |
| COMPOUND 6969 | $L_{1-207}$ | $L_{2-183}$ |
| COMPOUND 6970 | $L_{1-207}$ | $L_{2-184}$ |
| COMPOUND 6971 | $L_{1-207}$ | $L_{2-185}$ |
| COMPOUND 6972 | $L_{1-207}$ | $L_{2-186}$ |
| COMPOUND 6973 | $L_{1-207}$ | $L_{2-187}$ |
| COMPOUND 6974 | $L_{1-207}$ | $L_{2-188}$ |
| COMPOUND 6975 | $L_{1-207}$ | $L_{2-189}$ |
| COMPOUND 6976 | $L_{1-207}$ | $L_{2-190}$ |
| COMPOUND 6977 | $L_{1-207}$ | $L_{2-191}$ |
| COMPOUND 6978 | $L_{1-207}$ | $L_{2-192}$ |
| COMPOUND 6979 | $L_{1-207}$ | $L_{2-193}$ |
| COMPOUND 6980 | $L_{1-207}$ | $L_{2-194}$ |
| COMPOUND 6981 | $L_{1-207}$ | $L_{2-195}$ |
| COMPOUND 6982 | $L_{1-207}$ | $L_{2-196}$ |
| COMPOUND 6983 | $L_{1-207}$ | $L_{2-197}$ |
| COMPOUND 6984 | $L_{1-207}$ | $L_{2-198}$ |
| COMPOUND 6985 | $L_{1-207}$ | $L_{2-199}$ |
| COMPOUND 6986 | $L_{1-207}$ | $L_{2-200}$ |
| COMPOUND 6987 | $L_{1-207}$ | $L_{2-201}$ |
| COMPOUND 6988 | $L_{1-207}$ | $L_{2-202}$ |
| COMPOUND 6989 | $L_{1-207}$ | $L_{2-203}$ |
| COMPOUND 6990 | $L_{1-207}$ | $L_{2-204}$ |
| COMPOUND 6991 | $L_{1-207}$ | $L_{2-205}$ |
| COMPOUND 6992 | $L_{1-207}$ | $L_{2-206}$ |
| COMPOUND 6993 | $L_{1-207}$ | $L_{2-207}$ |
| COMPOUND 6994 | $L_{1-207}$ | $L_{2-208}$ |
| COMPOUND 6995 | $L_{1-207}$ | $L_{2-209}$ |
| COMPOUND 6996 | $L_{1-207}$ | $L_{2-210}$ |
| COMPOUND 6997 | $L_{1-207}$ | $L_{2-211}$ |
| COMPOUND 6998 | $L_{1-207}$ | $L_{2-212}$ |
| COMPOUND 6999 | $L_{1-207}$ | $L_{2-213}$ |
| COMPOUND 7000 | $L_{1-207}$ | $L_{2-214}$ |
| COMPOUND 7001 | $L_{1-207}$ | $L_{2-215}$ |
| COMPOUND 7002 | $L_{1-207}$ | $L_{2-216}$ |
| COMPOUND 7003 | $L_{1-207}$ | $L_{2-217}$ |
| COMPOUND 7004 | $L_{1-207}$ | $L_{2-218}$ |
| COMPOUND 7005 | $L_{1-207}$ | $L_{2-219}$ |
| COMPOUND 7006 | $L_{1-207}$ | $L_{2-220}$ |
| COMPOUND 7007 | $L_{1-207}$ | $L_{2-221}$ |
| COMPOUND 7008 | $L_{1-207}$ | $L_{2-222}$ |
| COMPOUND 7009 | $L_{1-207}$ | $L_{2-223}$ |
| COMPOUND 7010 | $L_{1-207}$ | $L_{2-224}$ |
| COMPOUND 7011 | $L_{1-207}$ | $L_{2-225}$ |
| COMPOUND 7012 | $L_{1-207}$ | $L_{2-226}$ |
| COMPOUND 7013 | $L_{1-207}$ | $L_{2-227}$ |
| COMPOUND 7014 | $L_{1-207}$ | $L_{2-228}$ |
| COMPOUND 7015 | $L_{1-207}$ | $L_{2-229}$ |
| COMPOUND 7016 | $L_{1-207}$ | $L_{2-230}$ |
| COMPOUND 7017 | $L_{1-207}$ | $L_{2-231}$ |
| COMPOUND 7018 | $L_{1-207}$ | $L_{2-232}$ |
| COMPOUND 7019 | $L_{1-207}$ | $L_{2-233}$ |
| COMPOUND 7020 | $L_{1-207}$ | $L_{2-234}$ |
| COMPOUND 7021 | $L_{1-207}$ | $L_{2-235}$ |
| COMPOUND 7022 | $L_{1-207}$ | $L_{2-236}$ |
| COMPOUND 7023 | $L_{1-207}$ | $L_{2-237}$ |
| COMPOUND 7024 | $L_{1-207}$ | $L_{2-238}$ |
| COMPOUND 7025 | $L_{1-207}$ | $L_{2-239}$ |
| COMPOUND 7026 | $L_{1-207}$ | $L_{2-240}$ |
| COMPOUND 7027 | $L_{1-207}$ | $L_{2-241}$ |
| COMPOUND 7028 | $L_{1-207}$ | $L_{2-242}$ |
| COMPOUND 7029 | $L_{1-207}$ | $L_{2-243}$ |
| COMPOUND 7030 | $L_{1-207}$ | $L_{2-244}$ |
| COMPOUND 7031 | $L_{1-207}$ | $L_{2-245}$ |
| COMPOUND 7032 | $L_{1-207}$ | $L_{2-246}$ |
| COMPOUND 7033 | $L_{1-207}$ | $L_{2-247}$ |
| COMPOUND 7034 | $L_{1-207}$ | $L_{2-248}$ |
| COMPOUND 7035 | $L_{1-207}$ | $L_{2-249}$ |
| COMPOUND 7036 | $L_{1-207}$ | $L_{2-250}$ |
| COMPOUND 7037 | $L_{1-207}$ | $L_{2-251}$ |
| COMPOUND 7038 | $L_{1-207}$ | $L_{2-252}$ |

-continued

| | | |
|---|---|---|
| COMPOUND 7039 | $L_{1-207}$ | $L_{2-253}$ |
| COMPOUND 7040 | $L_{1-207}$ | $L_{2-254}$ |
| COMPOUND 7041 | $L_{1-207}$ | $L_{2-255}$ |
| COMPOUND 7042 | $L_{1-207}$ | $L_{2-256}$ |
| COMPOUND 7043 | $L_{1-207}$ | $L_{2-257}$ |
| COMPOUND 7044 | $L_{1-207}$ | $L_{2-258}$ |
| COMPOUND 7045 | $L_{1-207}$ | $L_{2-259}$ |
| COMPOUND 7046 | $L_{1-207}$ | $L_{2-260}$ |
| COMPOUND 7047 | $L_{1-207}$ | $L_{2-261}$ |
| COMPOUND 7048 | $L_{1-207}$ | $L_{2-262}$ |
| COMPOUND 7049 | $L_{1-207}$ | $L_{2-263}$ |
| COMPOUND 7050 | $L_{1-207}$ | $L_{2-264}$ |
| COMPOUND 7051 | $L_{1-207}$ | $L_{2-265}$ |
| COMPOUND 7052 | $L_{1-207}$ | $L_{2-266}$ |
| COMPOUND 7053 | $L_{1-207}$ | $L_{2-267}$ |
| COMPOUND 7054 | $L_{1-207}$ | $L_{2-268}$ |
| COMPOUND 7055 | $L_{1-207}$ | $L_{2-269}$ |
| COMPOUND 7056 | $L_{1-207}$ | $L_{2-270}$ |
| COMPOUND 7057 | $L_{1-207}$ | $L_{2-271}$ |
| COMPOUND 7058 | $L_{1-207}$ | $L_{2-272}$ |
| COMPOUND 7059 | $L_{1-207}$ | $L_{2-273}$ |
| COMPOUND 7060 | $L_{1-207}$ | $L_{2-274}$ |
| COMPOUND 7061 | $L_{1-207}$ | $L_{2-275}$ |
| COMPOUND 7062 | $L_{1-207}$ | $L_{2-276}$ |
| COMPOUND 7063 | $L_{1-207}$ | $L_{2-277}$ |
| COMPOUND 7064 | $L_{1-207}$ | $L_{2-278}$ |
| COMPOUND 7065 | $L_{1-207}$ | $L_{2-279}$ |
| COMPOUND 7066 | $L_{1-207}$ | $L_{2-280}$ |
| COMPOUND 7067 | $L_{1-207}$ | $L_{2-281}$ |
| COMPOUND 7068 | $L_{1-207}$ | $L_{2-282}$ |
| COMPOUND 7069 | $L_{1-207}$ | $L_{2-283}$ |
| COMPOUND 7070 | $L_{1-207}$ | $L_{2-284}$ |
| COMPOUND 7071 | $L_{1-207}$ | $L_{2-285}$ |
| COMPOUND 7072 | $L_{1-207}$ | $L_{2-286}$ |
| COMPOUND 7073 | $L_{1-207}$ | $L_{2-287}$ |
| COMPOUND 7074 | $L_{1-207}$ | $L_{2-288}$ |
| COMPOUND 7075 | $L_{1-207}$ | $L_{2-289}$ |
| COMPOUND 7076 | $L_{1-207}$ | $L_{2-290}$ |
| COMPOUND 7077 | $L_{1-207}$ | $L_{2-291}$ |
| COMPOUND 7078 | $L_{1-207}$ | $L_{2-292}$ |
| COMPOUND 7079 | $L_{1-207}$ | $L_{2-293}$ |
| COMPOUND 7080 | $L_{1-207}$ | $L_{2-294}$ |
| COMPOUND 7081 | $L_{1-207}$ | $L_{2-295}$ |
| COMPOUND 7082 | $L_{1-207}$ | $L_{2-296}$ |
| COMPOUND 7083 | $L_{1-207}$ | $L_{2-297}$ |
| COMPOUND 7084 | $L_{1-207}$ | $L_{2-298}$ |
| COMPOUND 7085 | $L_{1-207}$ | $L_{2-299}$ |
| COMPOUND 7086 | $L_{1-207}$ | $L_{2-300}$ |
| COMPOUND 7087 | $L_{1-207}$ | $L_{2-301}$ |
| COMPOUND 7088 | $L_{1-207}$ | $L_{2-302}$ |
| COMPOUND 7089 | $L_{1-207}$ | $L_{2-303}$ |
| COMPOUND 7090 | $L_{1-207}$ | $L_{2-304}$ |
| COMPOUND 7091 | $L_{1-207}$ | $L_{2-305}$ |
| COMPOUND 7092 | $L_{1-207}$ | $L_{2-306}$ |
| COMPOUND 7093 | $L_{1-207}$ | $L_{2-307}$ |
| COMPOUND 7094 | $L_{1-207}$ | $L_{2-308}$ |
| COMPOUND 7095 | $L_{1-207}$ | $L_{2-309}$ |
| COMPOUND 7096 | $L_{1-207}$ | $L_{2-310}$ |
| COMPOUND 7097 | $L_{1-207}$ | $L_{2-311}$ |
| COMPOUND 7098 | $L_{1-207}$ | $L_{2-312}$ |
| COMPOUND 7099 | $L_{1-207}$ | $L_{2-313}$ |
| COMPOUND 7100 | $L_{1-207}$ | $L_{2-314}$ |
| COMPOUND 7101 | $L_{1-207}$ | $L_{2-315}$ |
| COMPOUND 7102 | $L_{1-207}$ | $L_{2-316}$ |
| COMPOUND 7103 | $L_{1-207}$ | $L_{2-317}$ |
| COMPOUND 7104 | $L_{1-207}$ | $L_{2-318}$ |
| COMPOUND 7105 | $L_{1-207}$ | $L_{2-319}$ |
| COMPOUND 7106 | $L_{1-207}$ | $L_{2-320}$ |
| COMPOUND 7107 | $L_{1-207}$ | $L_{2-321}$ |
| COMPOUND 7108 | $L_{1-207}$ | $L_{2-322}$ |
| COMPOUND 7109 | $L_{1-207}$ | $L_{2-323}$ |
| COMPOUND 7110 | $L_{1-207}$ | $L_{2-324}$ |
| COMPOUND 7111 | $L_{1-207}$ | $L_{2-325}$ |
| COMPOUND 7112 | $L_{1-207}$ | $L_{2-326}$ |
| COMPOUND 7113 | $L_{1-207}$ | $L_{2-327}$ |
| COMPOUND 7114 | $L_{1-207}$ | $L_{2-328}$ |
| COMPOUND 7115 | $L_{1-207}$ | $L_{2-329}$ |
| COMPOUND 7116 | $L_{1-207}$ | $L_{2-330}$ |
| COMPOUND 7117 | $L_{1-207}$ | $L_{2-331}$ |

-continued

| | | |
|---|---|---|
| COMPOUND 7118 | $L_{1-207}$ | $L_{2-332}$ |
| COMPOUND 7119 | $L_{1-207}$ | $L_{2-333}$ |
| COMPOUND 7120 | $L_{1-207}$ | $L_{2-334}$ |
| COMPOUND 7121 | $L_{1-207}$ | $L_{2-335}$ |
| COMPOUND 7122 | $L_{1-207}$ | $L_{2-336}$ |
| COMPOUND 7123 | $L_{1-207}$ | $L_{2-337}$ |
| COMPOUND 7124 | $L_{1-207}$ | $L_{2-338}$ |
| COMPOUND 7125 | $L_{1-207}$ | $L_{2-339}$ |
| COMPOUND 7126 | $L_{1-207}$ | $L_{2-340}$ |
| COMPOUND 7127 | $L_{1-207}$ | $L_{2-341}$ |
| COMPOUND 7128 | $L_{1-207}$ | $L_{2-342}$ |
| COMPOUND 7129 | $L_{1-207}$ | $L_{2-343}$ |
| COMPOUND 7130 | $L_{1-207}$ | $L_{2-344}$ |
| COMPOUND 7131 | $L_{1-207}$ | $L_{2-345}$ |
| COMPOUND 7132 | $L_{1-207}$ | $L_{2-346}$ |
| COMPOUND 7133 | $L_{1-207}$ | $L_{2-347}$ |
| COMPOUND 7134 | $L_{1-207}$ | $L_{2-348}$ |
| COMPOUND 7135 | $L_{1-207}$ | $L_{2-349}$ |
| COMPOUND 7136 | $L_{1-207}$ | $L_{2-350}$ |
| COMPOUND 7137 | $L_{1-207}$ | $L_{2-351}$ |
| COMPOUND 7138 | $L_{1-207}$ | $L_{2-352}$ |
| COMPOUND 7139 | $L_{1-207}$ | $L_{2-353}$ |
| COMPOUND 7140 | $L_{1-207}$ | $L_{2-354}$ |
| COMPOUND 7141 | $L_{1-207}$ | $L_{2-355}$ |
| COMPOUND 7142 | $L_{1-207}$ | $L_{2-356}$ |
| COMPOUND 7143 | $L_{1-207}$ | $L_{2-357}$ |
| COMPOUND 7144 | $L_{1-207}$ | $L_{2-358}$ |
| COMPOUND 7145 | $L_{1-207}$ | $L_{2-359}$ |
| COMPOUND 7146 | $L_{1-207}$ | $L_{2-360}$ |
| COMPOUND 7147 | $L_{1-207}$ | $L_{2-361}$ |
| COMPOUND 7148 | $L_{1-207}$ | $L_{2-362}$ |
| COMPOUND 7149 | $L_{1-207}$ | $L_{2-363}$ |
| COMPOUND 7150 | $L_{1-207}$ | $L_{2-364}$ |
| COMPOUND 7151 | $L_{1-207}$ | $L_{2-365}$ |
| COMPOUND 7152 | $L_{1-207}$ | $L_{2-366}$ |
| COMPOUND 7153 | $L_{1-207}$ | $L_{2-367}$ |
| COMPOUND 7154 | $L_{1-207}$ | $L_{2-368}$ |
| COMPOUND 7155 | $L_{1-207}$ | $L_{2-369}$ |
| COMPOUND 7156 | $L_{1-207}$ | $L_{2-370}$ |
| COMPOUND 7157 | $L_{1-207}$ | $L_{2-371}$ |
| COMPOUND 7158 | $L_{1-207}$ | $L_{2-372}$ |
| COMPOUND 7159 | $L_{1-207}$ | $L_{2-373}$ |
| COMPOUND 7160 | $L_{1-207}$ | $L_{2-374}$ |
| COMPOUND 7161 | $L_{1-207}$ | $L_{2-375}$ |
| COMPOUND 7162 | $L_{1-207}$ | $L_{2-376}$ |
| COMPOUND 7163 | $L_{1-208}$ | $L_{2-377}$ |
| COMPOUND 7164 | $L_{1-208}$ | $L_{2-1}$ |
| COMPOUND 7165 | $L_{1-208}$ | $L_{2-2}$ |
| COMPOUND 7166 | $L_{1-208}$ | $L_{2-3}$ |
| COMPOUND 7167 | $L_{1-208}$ | $L_{2-4}$ |
| COMPOUND 7168 | $L_{1-208}$ | $L_{2-5}$ |
| COMPOUND 7169 | $L_{1-208}$ | $L_{2-6}$ |
| COMPOUND 7170 | $L_{1-208}$ | $L_{2-7}$ |
| COMPOUND 7171 | $L_{1-208}$ | $L_{2-8}$ |
| COMPOUND 7172 | $L_{1-208}$ | $L_{2-9}$ |
| COMPOUND 7173 | $L_{1-208}$ | $L_{2-10}$ |
| COMPOUND 7174 | $L_{1-208}$ | $L_{2-11}$ |
| COMPOUND 7175 | $L_{1-208}$ | $L_{2-12}$ |
| COMPOUND 7176 | $L_{1-208}$ | $L_{2-13}$ |
| COMPOUND 7177 | $L_{1-208}$ | $L_{2-14}$ |
| COMPOUND 7178 | $L_{1-208}$ | $L_{2-15}$ |
| COMPOUND 7179 | $L_{1-208}$ | $L_{2-16}$ |
| COMPOUND 7180 | $L_{1-208}$ | $L_{2-17}$ |
| COMPOUND 7181 | $L_{1-208}$ | $L_{2-18}$ |
| COMPOUND 7182 | $L_{1-208}$ | $L_{2-19}$ |
| COMPOUND 7183 | $L_{1-208}$ | $L_{2-20}$ |
| COMPOUND 7184 | $L_{1-208}$ | $L_{2-21}$ |
| COMPOUND 7185 | $L_{1-208}$ | $L_{2-22}$ |
| COMPOUND 7186 | $L_{1-208}$ | $L_{2-23}$ |
| COMPOUND 7187 | $L_{1-208}$ | $L_{2-24}$ |
| COMPOUND 7188 | $L_{1-208}$ | $L_{2-25}$ |
| COMPOUND 7189 | $L_{1-208}$ | $L_{2-26}$ |
| COMPOUND 7190 | $L_{1-208}$ | $L_{2-27}$ |
| COMPOUND 7191 | $L_{1-208}$ | $L_{2-28}$ |
| COMPOUND 7192 | $L_{1-208}$ | $L_{2-29}$ |
| COMPOUND 7193 | $L_{1-208}$ | $L_{2-30}$ |
| COMPOUND 7194 | $L_{1-208}$ | $L_{2-31}$ |
| COMPOUND 7195 | $L_{1-208}$ | $L_{2-32}$ |
| COMPOUND 7196 | $L_{1-208}$ | $L_{2-33}$ |

-continued

| | | |
|---|---|---|
| COMPOUND 7197 | $L_{1-208}$ | $L_{2-34}$ |
| COMPOUND 7198 | $L_{1-208}$ | $L_{2-35}$ |
| COMPOUND 7199 | $L_{1-208}$ | $L_{2-36}$ |
| COMPOUND 7200 | $L_{1-208}$ | $L_{2-37}$ |
| COMPOUND 7201 | $L_{1-208}$ | $L_{2-38}$ |
| COMPOUND 7202 | $L_{1-208}$ | $L_{2-39}$ |
| COMPOUND 7203 | $L_{1-208}$ | $L_{2-40}$ |
| COMPOUND 7204 | $L_{1-208}$ | $L_{2-41}$ |
| COMPOUND 7205 | $L_{1-208}$ | $L_{2-42}$ |
| COMPOUND 7206 | $L_{1-208}$ | $L_{2-43}$ |
| COMPOUND 7207 | $L_{1-208}$ | $L_{2-44}$ |
| COMPOUND 7208 | $L_{1-208}$ | $L_{2-45}$ |
| COMPOUND 7209 | $L_{1-208}$ | $L_{2-46}$ |
| COMPOUND 7210 | $L_{1-208}$ | $L_{2-47}$ |
| COMPOUND 7211 | $L_{1-208}$ | $L_{2-48}$ |
| COMPOUND 7212 | $L_{1-208}$ | $L_{2-49}$ |
| COMPOUND 7213 | $L_{1-208}$ | $L_{2-50}$ |
| COMPOUND 7214 | $L_{1-208}$ | $L_{2-51}$ |
| COMPOUND 7215 | $L_{1-208}$ | $L_{2-52}$ |
| COMPOUND 7216 | $L_{1-208}$ | $L_{2-53}$ |
| COMPOUND 7217 | $L_{1-208}$ | $L_{2-54}$ |
| COMPOUND 7218 | $L_{1-208}$ | $L_{2-55}$ |
| COMPOUND 7219 | $L_{1-208}$ | $L_{2-56}$ |
| COMPOUND 7220 | $L_{1-208}$ | $L_{2-57}$ |
| COMPOUND 7221 | $L_{1-208}$ | $L_{2-58}$ |
| COMPOUND 7222 | $L_{1-208}$ | $L_{2-59}$ |
| COMPOUND 7223 | $L_{1-208}$ | $L_{2-60}$ |
| COMPOUND 7224 | $L_{1-208}$ | $L_{2-61}$ |
| COMPOUND 7225 | $L_{1-208}$ | $L_{2-62}$ |
| COMPOUND 7226 | $L_{1-208}$ | $L_{2-63}$ |
| COMPOUND 7227 | $L_{1-208}$ | $L_{2-64}$ |
| COMPOUND 7228 | $L_{1-208}$ | $L_{2-65}$ |
| COMPOUND 7229 | $L_{1-208}$ | $L_{2-66}$ |
| COMPOUND 7230 | $L_{1-208}$ | $L_{2-67}$ |
| COMPOUND 7231 | $L_{1-208}$ | $L_{2-68}$ |
| COMPOUND 7232 | $L_{1-208}$ | $L_{2-69}$ |
| COMPOUND 7233 | $L_{1-208}$ | $L_{2-70}$ |
| COMPOUND 7234 | $L_{1-208}$ | $L_{2-71}$ |
| COMPOUND 7235 | $L_{1-208}$ | $L_{2-72}$ |
| COMPOUND 7236 | $L_{1-208}$ | $L_{2-73}$ |
| COMPOUND 7237 | $L_{1-208}$ | $L_{2-74}$ |
| COMPOUND 7238 | $L_{1-208}$ | $L_{2-75}$ |
| COMPOUND 7239 | $L_{1-208}$ | $L_{2-76}$ |
| COMPOUND 7240 | $L_{1-208}$ | $L_{2-77}$ |
| COMPOUND 7241 | $L_{1-208}$ | $L_{2-78}$ |
| COMPOUND 7242 | $L_{1-208}$ | $L_{2-79}$ |
| COMPOUND 7243 | $L_{1-208}$ | $L_{2-80}$ |
| COMPOUND 7244 | $L_{1-208}$ | $L_{2-81}$ |
| COMPOUND 7245 | $L_{1-208}$ | $L_{2-82}$ |
| COMPOUND 7246 | $L_{1-208}$ | $L_{2-83}$ |
| COMPOUND 7247 | $L_{1-208}$ | $L_{2-84}$ |
| COMPOUND 7248 | $L_{1-208}$ | $L_{2-85}$ |
| COMPOUND 7249 | $L_{1-208}$ | $L_{2-86}$ |
| COMPOUND 7250 | $L_{1-208}$ | $L_{2-87}$ |
| COMPOUND 7251 | $L_{1-208}$ | $L_{2-88}$ |
| COMPOUND 7252 | $L_{1-208}$ | $L_{2-89}$ |
| COMPOUND 7253 | $L_{1-208}$ | $L_{2-90}$ |
| COMPOUND 7254 | $L_{1-208}$ | $L_{2-91}$ |
| COMPOUND 7255 | $L_{1-208}$ | $L_{2-92}$ |
| COMPOUND 7256 | $L_{1-208}$ | $L_{2-93}$ |
| COMPOUND 7257 | $L_{1-208}$ | $L_{2-94}$ |
| COMPOUND 7258 | $L_{1-208}$ | $L_{2-95}$ |
| COMPOUND 7259 | $L_{1-208}$ | $L_{2-96}$ |
| COMPOUND 7260 | $L_{1-208}$ | $L_{2-97}$ |
| COMPOUND 7261 | $L_{1-208}$ | $L_{2-98}$ |
| COMPOUND 7262 | $L_{1-208}$ | $L_{2-99}$ |
| COMPOUND 7263 | $L_{1-208}$ | $L_{2-100}$ |
| COMPOUND 7264 | $L_{1-208}$ | $L_{2-101}$ |
| COMPOUND 7265 | $L_{1-208}$ | $L_{2-102}$ |
| COMPOUND 7266 | $L_{1-208}$ | $L_{2-103}$ |
| COMPOUND 7267 | $L_{1-208}$ | $L_{2-104}$ |
| COMPOUND 7268 | $L_{1-208}$ | $L_{2-105}$ |
| COMPOUND 7269 | $L_{1-208}$ | $L_{2-106}$ |
| COMPOUND 7270 | $L_{1-208}$ | $L_{2-107}$ |
| COMPOUND 7271 | $L_{1-208}$ | $L_{2-108}$ |
| COMPOUND 7272 | $L_{1-208}$ | $L_{2-109}$ |
| COMPOUND 7273 | $L_{1-208}$ | $L_{2-110}$ |
| COMPOUND 7274 | $L_{1-208}$ | $L_{2-111}$ |
| COMPOUND 7275 | $L_{1-208}$ | $L_{2-112}$ |

| | | |
|---|---|---|
| COMPOUND 7276 | $L_{1-208}$ | $L_{2-113}$ |
| COMPOUND 7277 | $L_{1-208}$ | $L_{2-114}$ |
| COMPOUND 7278 | $L_{1-208}$ | $L_{2-115}$ |
| COMPOUND 7279 | $L_{1-208}$ | $L_{2-116}$ |
| COMPOUND 7280 | $L_{1-208}$ | $L_{2-117}$ |
| COMPOUND 7281 | $L_{1-208}$ | $L_{2-118}$ |
| COMPOUND 7282 | $L_{1-208}$ | $L_{2-119}$ |
| COMPOUND 7283 | $L_{1-208}$ | $L_{2-120}$ |
| COMPOUND 7284 | $L_{1-208}$ | $L_{2-121}$ |
| COMPOUND 7285 | $L_{1-208}$ | $L_{2-122}$ |
| COMPOUND 7286 | $L_{1-208}$ | $L_{2-123}$ |
| COMPOUND 7287 | $L_{1-208}$ | $L_{2-124}$ |
| COMPOUND 7288 | $L_{1-208}$ | $L_{2-125}$ |
| COMPOUND 7289 | $L_{1-208}$ | $L_{2-126}$ |
| COMPOUND 7290 | $L_{1-208}$ | $L_{2-127}$ |
| COMPOUND 7291 | $L_{1-208}$ | $L_{2-128}$ |
| COMPOUND 7292 | $L_{1-208}$ | $L_{2-129}$ |
| COMPOUND 7293 | $L_{1-208}$ | $L_{2-130}$ |
| COMPOUND 7294 | $L_{1-208}$ | $L_{2-131}$ |
| COMPOUND 7295 | $L_{1-208}$ | $L_{2-132}$ |
| COMPOUND 7296 | $L_{1-208}$ | $L_{2-133}$ |
| COMPOUND 7297 | $L_{1-208}$ | $L_{2-134}$ |
| COMPOUND 7298 | $L_{1-208}$ | $L_{2-135}$ |
| COMPOUND 7299 | $L_{1-208}$ | $L_{2-136}$ |
| COMPOUND 7300 | $L_{1-208}$ | $L_{2-137}$ |
| COMPOUND 7301 | $L_{1-208}$ | $L_{2-138}$ |
| COMPOUND 7302 | $L_{1-208}$ | $L_{2-139}$ |
| COMPOUND 7303 | $L_{1-208}$ | $L_{2-140}$ |
| COMPOUND 7304 | $L_{1-208}$ | $L_{2-141}$ |
| COMPOUND 7305 | $L_{1-208}$ | $L_{2-142}$ |
| COMPOUND 7306 | $L_{1-208}$ | $L_{2-143}$ |
| COMPOUND 7307 | $L_{1-208}$ | $L_{2-144}$ |
| COMPOUND 7308 | $L_{1-208}$ | $L_{2-145}$ |
| COMPOUND 7309 | $L_{1-208}$ | $L_{2-146}$ |
| COMPOUND 7310 | $L_{1-208}$ | $L_{2-147}$ |
| COMPOUND 7311 | $L_{1-208}$ | $L_{2-148}$ |
| COMPOUND 7312 | $L_{1-208}$ | $L_{2-149}$ |
| COMPOUND 7313 | $L_{1-208}$ | $L_{2-150}$ |
| COMPOUND 7314 | $L_{1-208}$ | $L_{2-151}$ |
| COMPOUND 7315 | $L_{1-208}$ | $L_{2-152}$ |
| COMPOUND 7316 | $L_{1-208}$ | $L_{2-153}$ |
| COMPOUND 7317 | $L_{1-208}$ | $L_{2-154}$ |
| COMPOUND 7318 | $L_{1-208}$ | $L_{2-155}$ |
| COMPOUND 7319 | $L_{1-208}$ | $L_{2-156}$ |
| COMPOUND 7320 | $L_{1-208}$ | $L_{2-157}$ |
| COMPOUND 7321 | $L_{1-208}$ | $L_{2-158}$ |
| COMPOUND 7322 | $L_{1-208}$ | $L_{2-159}$ |
| COMPOUND 7323 | $L_{1-208}$ | $L_{2-160}$ |
| COMPOUND 7324 | $L_{1-208}$ | $L_{2-161}$ |
| COMPOUND 7325 | $L_{1-208}$ | $L_{2-162}$ |
| COMPOUND 7326 | $L_{1-208}$ | $L_{2-163}$ |
| COMPOUND 7327 | $L_{1-208}$ | $L_{2-164}$ |
| COMPOUND 7328 | $L_{1-208}$ | $L_{2-165}$ |
| COMPOUND 7329 | $L_{1-208}$ | $L_{2-166}$ |
| COMPOUND 7330 | $L_{1-208}$ | $L_{2-167}$ |
| COMPOUND 7331 | $L_{1-208}$ | $L_{2-168}$ |
| COMPOUND 7332 | $L_{1-208}$ | $L_{2-169}$ |
| COMPOUND 7333 | $L_{1-208}$ | $L_{2-170}$ |
| COMPOUND 7334 | $L_{1-208}$ | $L_{2-171}$ |
| COMPOUND 7335 | $L_{1-208}$ | $L_{2-172}$ |
| COMPOUND 7336 | $L_{1-208}$ | $L_{2-173}$ |
| COMPOUND 7337 | $L_{1-208}$ | $L_{2-174}$ |
| COMPOUND 7338 | $L_{1-208}$ | $L_{2-175}$ |
| COMPOUND 7339 | $L_{1-208}$ | $L_{2-176}$ |
| COMPOUND 7340 | $L_{1-208}$ | $L_{2-177}$ |
| COMPOUND 7341 | $L_{1-208}$ | $L_{2-178}$ |
| COMPOUND 7342 | $L_{1-208}$ | $L_{2-179}$ |
| COMPOUND 7343 | $L_{1-208}$ | $L_{2-180}$ |
| COMPOUND 7344 | $L_{1-208}$ | $L_{2-181}$ |
| COMPOUND 7345 | $L_{1-208}$ | $L_{2-182}$ |
| COMPOUND 7346 | $L_{1-208}$ | $L_{2-183}$ |
| COMPOUND 7347 | $L_{1-208}$ | $L_{2-184}$ |
| COMPOUND 7348 | $L_{1-208}$ | $L_{2-185}$ |
| COMPOUND 7349 | $L_{1-208}$ | $L_{2-186}$ |
| COMPOUND 7350 | $L_{1-208}$ | $L_{2-187}$ |
| COMPOUND 7351 | $L_{1-208}$ | $L_{2-188}$ |
| COMPOUND 7352 | $L_{1-208}$ | $L_{2-189}$ |
| COMPOUND 7353 | $L_{1-208}$ | $L_{2-190}$ |
| COMPOUND 7354 | $L_{1-208}$ | $L_{2-191}$ |
| COMPOUND 7355 | $L_{1-208}$ | $L_{2-192}$ |
| COMPOUND 7356 | $L_{1-208}$ | $L_{2-193}$ |
| COMPOUND 7357 | $L_{1-208}$ | $L_{2-194}$ |
| COMPOUND 7358 | $L_{1-208}$ | $L_{2-195}$ |
| COMPOUND 7359 | $L_{1-208}$ | $L_{2-196}$ |
| COMPOUND 7360 | $L_{1-208}$ | $L_{2-197}$ |
| COMPOUND 7361 | $L_{1-208}$ | $L_{2-198}$ |
| COMPOUND 7362 | $L_{1-208}$ | $L_{2-199}$ |
| COMPOUND 7363 | $L_{1-208}$ | $L_{2-200}$ |
| COMPOUND 7364 | $L_{1-208}$ | $L_{2-201}$ |
| COMPOUND 7365 | $L_{1-208}$ | $L_{2-202}$ |
| COMPOUND 7366 | $L_{1-208}$ | $L_{2-203}$ |
| COMPOUND 7367 | $L_{1-208}$ | $L_{2-204}$ |
| COMPOUND 7368 | $L_{1-208}$ | $L_{2-205}$ |
| COMPOUND 7369 | $L_{1-208}$ | $L_{2-206}$ |
| COMPOUND 7370 | $L_{1-208}$ | $L_{2-207}$ |
| COMPOUND 7371 | $L_{1-208}$ | $L_{2-208}$ |
| COMPOUND 7372 | $L_{1-208}$ | $L_{2-209}$ |
| COMPOUND 7373 | $L_{1-208}$ | $L_{2-210}$ |
| COMPOUND 7374 | $L_{1-208}$ | $L_{2-211}$ |
| COMPOUND 7375 | $L_{1-208}$ | $L_{2-212}$ |
| COMPOUND 7376 | $L_{1-208}$ | $L_{2-213}$ |
| COMPOUND 7377 | $L_{1-208}$ | $L_{2-214}$ |
| COMPOUND 7378 | $L_{1-208}$ | $L_{2-215}$ |
| COMPOUND 7379 | $L_{1-208}$ | $L_{2-216}$ |
| COMPOUND 7380 | $L_{1-208}$ | $L_{2-217}$ |
| COMPOUND 7381 | $L_{1-208}$ | $L_{2-218}$ |
| COMPOUND 7382 | $L_{1-208}$ | $L_{2-219}$ |
| COMPOUND 7383 | $L_{1-208}$ | $L_{2-220}$ |
| COMPOUND 7384 | $L_{1-208}$ | $L_{2-221}$ |
| COMPOUND 7385 | $L_{1-208}$ | $L_{2-222}$ |
| COMPOUND 7386 | $L_{1-208}$ | $L_{2-223}$ |
| COMPOUND 7387 | $L_{1-208}$ | $L_{2-224}$ |
| COMPOUND 7388 | $L_{1-208}$ | $L_{2-225}$ |
| COMPOUND 7389 | $L_{1-208}$ | $L_{2-226}$ |
| COMPOUND 7390 | $L_{1-208}$ | $L_{2-227}$ |
| COMPOUND 7391 | $L_{1-208}$ | $L_{2-228}$ |
| COMPOUND 7392 | $L_{1-208}$ | $L_{2-229}$ |
| COMPOUND 7393 | $L_{1-208}$ | $L_{2-230}$ |
| COMPOUND 7394 | $L_{1-208}$ | $L_{2-231}$ |
| COMPOUND 7395 | $L_{1-208}$ | $L_{2-232}$ |
| COMPOUND 7396 | $L_{1-208}$ | $L_{2-233}$ |
| COMPOUND 7397 | $L_{1-208}$ | $L_{2-234}$ |
| COMPOUND 7398 | $L_{1-208}$ | $L_{2-235}$ |
| COMPOUND 7399 | $L_{1-208}$ | $L_{2-236}$ |
| COMPOUND 7400 | $L_{1-208}$ | $L_{2-237}$ |
| COMPOUND 7401 | $L_{1-208}$ | $L_{2-238}$ |
| COMPOUND 7402 | $L_{1-208}$ | $L_{2-239}$ |
| COMPOUND 7403 | $L_{1-208}$ | $L_{2-240}$ |
| COMPOUND 7404 | $L_{1-208}$ | $L_{2-241}$ |
| COMPOUND 7405 | $L_{1-208}$ | $L_{2-242}$ |
| COMPOUND 7406 | $L_{1-208}$ | $L_{2-243}$ |
| COMPOUND 7407 | $L_{1-208}$ | $L_{2-244}$ |
| COMPOUND 7408 | $L_{1-208}$ | $L_{2-245}$ |
| COMPOUND 7409 | $L_{1-208}$ | $L_{2-246}$ |
| COMPOUND 7410 | $L_{1-208}$ | $L_{2-247}$ |
| COMPOUND 7411 | $L_{1-208}$ | $L_{2-248}$ |
| COMPOUND 7412 | $L_{1-208}$ | $L_{2-249}$ |
| COMPOUND 7413 | $L_{1-208}$ | $L_{2-250}$ |
| COMPOUND 7414 | $L_{1-208}$ | $L_{2-251}$ |
| COMPOUND 7415 | $L_{1-208}$ | $L_{2-252}$ |
| COMPOUND 7416 | $L_{1-208}$ | $L_{2-253}$ |
| COMPOUND 7417 | $L_{1-208}$ | $L_{2-254}$ |
| COMPOUND 7418 | $L_{1-208}$ | $L_{2-255}$ |
| COMPOUND 7419 | $L_{1-208}$ | $L_{2-256}$ |
| COMPOUND 7420 | $L_{1-208}$ | $L_{2-257}$ |
| COMPOUND 7421 | $L_{1-208}$ | $L_{2-258}$ |
| COMPOUND 7422 | $L_{1-208}$ | $L_{2-259}$ |
| COMPOUND 7423 | $L_{1-208}$ | $L_{2-260}$ |
| COMPOUND 7424 | $L_{1-208}$ | $L_{2-261}$ |
| COMPOUND 7425 | $L_{1-208}$ | $L_{2-262}$ |
| COMPOUND 7426 | $L_{1-208}$ | $L_{2-263}$ |
| COMPOUND 7427 | $L_{1-208}$ | $L_{2-264}$ |
| COMPOUND 7428 | $L_{1-208}$ | $L_{2-265}$ |
| COMPOUND 7429 | $L_{1-208}$ | $L_{2-266}$ |
| COMPOUND 7430 | $L_{1-208}$ | $L_{2-267}$ |
| COMPOUND 7431 | $L_{1-208}$ | $L_{2-268}$ |
| COMPOUND 7432 | $L_{1-208}$ | $L_{2-269}$ |
| COMPOUND 7433 | $L_{1-208}$ | $L_{2-270}$ |

| | | |
|---|---|---|
| COMPOUND 7434 | $L_{1-208}$ | $L_{2-271}$ |
| COMPOUND 7435 | $L_{1-208}$ | $L_{2-272}$ |
| COMPOUND 7436 | $L_{1-208}$ | $L_{2-273}$ |
| COMPOUND 7437 | $L_{1-208}$ | $L_{2-274}$ |
| COMPOUND 7438 | $L_{1-208}$ | $L_{2-275}$ |
| COMPOUND 7439 | $L_{1-208}$ | $L_{2-276}$ |
| COMPOUND 7440 | $L_{1-208}$ | $L_{2-277}$ |
| COMPOUND 7441 | $L_{1-208}$ | $L_{2-278}$ |
| COMPOUND 7442 | $L_{1-208}$ | $L_{2-279}$ |
| COMPOUND 7443 | $L_{1-208}$ | $L_{2-280}$ |
| COMPOUND 7444 | $L_{1-208}$ | $L_{2-281}$ |
| COMPOUND 7445 | $L_{1-208}$ | $L_{2-282}$ |
| COMPOUND 7446 | $L_{1-208}$ | $L_{2-283}$ |
| COMPOUND 7447 | $L_{1-208}$ | $L_{2-284}$ |
| COMPOUND 7448 | $L_{1-208}$ | $L_{2-285}$ |
| COMPOUND 7449 | $L_{1-208}$ | $L_{2-286}$ |
| COMPOUND 7450 | $L_{1-208}$ | $L_{2-287}$ |
| COMPOUND 7451 | $L_{1-208}$ | $L_{2-288}$ |
| COMPOUND 7452 | $L_{1-208}$ | $L_{2-289}$ |
| COMPOUND 7453 | $L_{1-208}$ | $L_{2-290}$ |
| COMPOUND 7454 | $L_{1-208}$ | $L_{2-291}$ |
| COMPOUND 7455 | $L_{1-208}$ | $L_{2-292}$ |
| COMPOUND 7456 | $L_{1-208}$ | $L_{2-293}$ |
| COMPOUND 7457 | $L_{1-208}$ | $L_{2-294}$ |
| COMPOUND 7458 | $L_{1-208}$ | $L_{2-295}$ |
| COMPOUND 7459 | $L_{1-208}$ | $L_{2-296}$ |
| COMPOUND 7460 | $L_{1-208}$ | $L_{2-297}$ |
| COMPOUND 7461 | $L_{1-208}$ | $L_{2-298}$ |
| COMPOUND 7462 | $L_{1-208}$ | $L_{2-299}$ |
| COMPOUND 7463 | $L_{1-208}$ | $L_{2-300}$ |
| COMPOUND 7464 | $L_{1-208}$ | $L_{2-301}$ |
| COMPOUND 7465 | $L_{1-208}$ | $L_{2-302}$ |
| COMPOUND 7466 | $L_{1-208}$ | $L_{2-303}$ |
| COMPOUND 7467 | $L_{1-208}$ | $L_{2-304}$ |
| COMPOUND 7468 | $L_{1-208}$ | $L_{2-305}$ |
| COMPOUND 7469 | $L_{1-208}$ | $L_{2-306}$ |
| COMPOUND 7470 | $L_{1-208}$ | $L_{2-307}$ |
| COMPOUND 7471 | $L_{1-208}$ | $L_{2-308}$ |
| COMPOUND 7472 | $L_{1-208}$ | $L_{2-309}$ |
| COMPOUND 7473 | $L_{1-208}$ | $L_{2-310}$ |
| COMPOUND 7474 | $L_{1-208}$ | $L_{2-311}$ |
| COMPOUND 7475 | $L_{1-208}$ | $L_{2-312}$ |
| COMPOUND 7476 | $L_{1-208}$ | $L_{2-313}$ |
| COMPOUND 7477 | $L_{1-208}$ | $L_{2-314}$ |
| COMPOUND 7478 | $L_{1-208}$ | $L_{2-315}$ |
| COMPOUND 7479 | $L_{1-208}$ | $L_{2-316}$ |
| COMPOUND 7480 | $L_{1-208}$ | $L_{2-317}$ |
| COMPOUND 7481 | $L_{1-208}$ | $L_{2-318}$ |
| COMPOUND 7482 | $L_{1-208}$ | $L_{2-319}$ |
| COMPOUND 7483 | $L_{1-208}$ | $L_{2-320}$ |
| COMPOUND 7484 | $L_{1-208}$ | $L_{2-321}$ |
| COMPOUND 7485 | $L_{1-208}$ | $L_{2-322}$ |
| COMPOUND 7486 | $L_{1-208}$ | $L_{2-323}$ |
| COMPOUND 7487 | $L_{1-208}$ | $L_{2-324}$ |
| COMPOUND 7488 | $L_{1-208}$ | $L_{2-325}$ |
| COMPOUND 7489 | $L_{1-208}$ | $L_{2-326}$ |
| COMPOUND 7490 | $L_{1-208}$ | $L_{2-327}$ |
| COMPOUND 7491 | $L_{1-208}$ | $L_{2-328}$ |
| COMPOUND 7492 | $L_{1-208}$ | $L_{2-329}$ |
| COMPOUND 7493 | $L_{1-208}$ | $L_{2-330}$ |
| COMPOUND 7494 | $L_{1-208}$ | $L_{2-331}$ |
| COMPOUND 7495 | $L_{1-208}$ | $L_{2-332}$ |
| COMPOUND 7496 | $L_{1-208}$ | $L_{2-333}$ |
| COMPOUND 7497 | $L_{1-208}$ | $L_{2-334}$ |
| COMPOUND 7498 | $L_{1-208}$ | $L_{2-335}$ |
| COMPOUND 7499 | $L_{1-208}$ | $L_{2-336}$ |
| COMPOUND 7500 | $L_{1-208}$ | $L_{2-337}$ |
| COMPOUND 7501 | $L_{1-208}$ | $L_{2-338}$ |
| COMPOUND 7502 | $L_{1-208}$ | $L_{2-339}$ |
| COMPOUND 7503 | $L_{1-208}$ | $L_{2-340}$ |
| COMPOUND 7504 | $L_{1-208}$ | $L_{2-341}$ |
| COMPOUND 7505 | $L_{1-208}$ | $L_{2-342}$ |
| COMPOUND 7506 | $L_{1-208}$ | $L_{2-343}$ |
| COMPOUND 7507 | $L_{1-208}$ | $L_{2-344}$ |
| COMPOUND 7508 | $L_{1-208}$ | $L_{2-345}$ |
| COMPOUND 7509 | $L_{1-208}$ | $L_{2-346}$ |
| COMPOUND 7510 | $L_{1-208}$ | $L_{2-347}$ |
| COMPOUND 7511 | $L_{1-208}$ | $L_{2-348}$ |
| COMPOUND 7512 | $L_{1-208}$ | $L_{2-349}$ |

| | | |
|---|---|---|
| COMPOUND 7513 | $L_{1-208}$ | $L_{2-350}$ |
| COMPOUND 7514 | $L_{1-208}$ | $L_{2-351}$ |
| COMPOUND 7515 | $L_{1-208}$ | $L_{2-352}$ |
| COMPOUND 7516 | $L_{1-208}$ | $L_{2-353}$ |
| COMPOUND 7517 | $L_{1-208}$ | $L_{2-354}$ |
| COMPOUND 7518 | $L_{1-208}$ | $L_{2-355}$ |
| COMPOUND 7519 | $L_{1-208}$ | $L_{2-356}$ |
| COMPOUND 7520 | $L_{1-208}$ | $L_{2-357}$ |
| COMPOUND 7521 | $L_{1-208}$ | $L_{2-358}$ |
| COMPOUND 7522 | $L_{1-208}$ | $L_{2-359}$ |
| COMPOUND 7523 | $L_{1-208}$ | $L_{2-360}$ |
| COMPOUND 7524 | $L_{1-208}$ | $L_{2-361}$ |
| COMPOUND 7525 | $L_{1-208}$ | $L_{2-362}$ |
| COMPOUND 7526 | $L_{1-208}$ | $L_{2-363}$ |
| COMPOUND 7527 | $L_{1-208}$ | $L_{2-364}$ |
| COMPOUND 7528 | $L_{1-208}$ | $L_{2-365}$ |
| COMPOUND 7529 | $L_{1-208}$ | $L_{2-366}$ |
| COMPOUND 7530 | $L_{1-208}$ | $L_{2-367}$ |
| COMPOUND 7531 | $L_{1-208}$ | $L_{2-368}$ |
| COMPOUND 7532 | $L_{1-208}$ | $L_{2-369}$ |
| COMPOUND 7533 | $L_{1-208}$ | $L_{2-370}$ |
| COMPOUND 7534 | $L_{1-208}$ | $L_{2-371}$ |
| COMPOUND 7535 | $L_{1-208}$ | $L_{2-372}$ |
| COMPOUND 7536 | $L_{1-208}$ | $L_{2-373}$ |
| COMPOUND 7537 | $L_{1-208}$ | $L_{2-374}$ |
| COMPOUND 7538 | $L_{1-208}$ | $L_{2-375}$ |
| COMPOUND 7539 | $L_{1-208}$ | $L_{2-376}$ |
| COMPOUND 7540 | $L_{1-208}$ | $L_{2-377}$ |
| COMPOUND 7541 | $L_{1-11}$ | $L_{2-1}$ |
| COMPOUND 7542 | $L_{1-11}$ | $L_{2-10}$ |
| COMPOUND 7543 | $L_{1-11}$ | $L_{2-15}$ |
| COMPOUND 7544 | $L_{1-11}$ | $L_{2-20}$ |
| COMPOUND 7545 | $L_{1-11}$ | $L_{2-65}$ |
| COMPOUND 7546 | $L_{1-11}$ | $L_{2-109}$ |
| COMPOUND 7547 | $L_{1-12}$ | $L_{2-1}$ |
| COMPOUND 7548 | $L_{1-12}$ | $L_{2-10}$ |
| COMPOUND 7549 | $L_{1-12}$ | $L_{2-15}$ |
| COMPOUND 7550 | $L_{1-12}$ | $L_{2-20}$ |
| COMPOUND 7551 | $L_{1-12}$ | $L_{2-65}$ |
| COMPOUND 7552 | $L_{1-12}$ | $L_{2-109}$ |
| COMPOUND 7553 | $L_{1-13}$ | $L_{2-1}$ |
| COMPOUND 7554 | $L_{1-13}$ | $L_{2-10}$ |
| COMPOUND 7555 | $L_{1-13}$ | $L_{2-15}$ |
| COMPOUND 7556 | $L_{1-13}$ | $L_{2-20}$ |
| COMPOUND 7557 | $L_{1-13}$ | $L_{2-65}$ |
| COMPOUND 7558 | $L_{1-13}$ | $L_{2-109}$ |
| COMPOUND 7559 | $L_{1-14}$ | $L_{2-1}$ |
| COMPOUND 7560 | $L_{1-14}$ | $L_{2-10}$ |
| COMPOUND 7561 | $L_{1-14}$ | $L_{2-15}$ |
| COMPOUND 7562 | $L_{1-14}$ | $L_{2-20}$ |
| COMPOUND 7563 | $L_{1-14}$ | $L_{2-65}$ |
| COMPOUND 7564 | $L_{1-14}$ | $L_{2-109}$ |
| COMPOUND 7565 | $L_{1-15}$ | $L_{2-1}$ |
| COMPOUND 7566 | $L_{1-15}$ | $L_{2-10}$ |
| COMPOUND 7567 | $L_{1-15}$ | $L_{2-15}$ |
| COMPOUND 7568 | $L_{1-15}$ | $L_{2-20}$ |
| COMPOUND 7569 | $L_{1-15}$ | $L_{2-65}$ |
| COMPOUND 7570 | $L_{1-15}$ | $L_{2-109}$ |
| COMPOUND 7571 | $L_{1-16}$ | $L_{2-1}$ |
| COMPOUND 7572 | $L_{1-16}$ | $L_{2-10}$ |
| COMPOUND 7573 | $L_{1-16}$ | $L_{2-15}$ |
| COMPOUND 7574 | $L_{1-16}$ | $L_{2-20}$ |
| COMPOUND 7575 | $L_{1-16}$ | $L_{2-65}$ |
| COMPOUND 7576 | $L_{1-16}$ | $L_{2-109}$ |
| COMPOUND 7577 | $L_{1-17}$ | $L_{2-1}$ |
| COMPOUND 7578 | $L_{1-17}$ | $L_{2-10}$ |
| COMPOUND 7579 | $L_{1-17}$ | $L_{2-15}$ |
| COMPOUND 7580 | $L_{1-17}$ | $L_{2-20}$ |
| COMPOUND 7581 | $L_{1-17}$ | $L_{2-65}$ |
| COMPOUND 7582 | $L_{1-17}$ | $L_{2-109}$ |
| COMPOUND 7583 | $L_{1-18}$ | $L_{2-1}$ |
| COMPOUND 7584 | $L_{1-18}$ | $L_{2-10}$ |
| COMPOUND 7585 | $L_{1-18}$ | $L_{2-15}$ |
| COMPOUND 7586 | $L_{1-18}$ | $L_{2-20}$ |
| COMPOUND 7587 | $L_{1-18}$ | $L_{2-65}$ |
| COMPOUND 7588 | $L_{1-18}$ | $L_{2-109}$ |
| COMPOUND 7589 | $L_{1-19}$ | $L_{2-1}$ |
| COMPOUND 7590 | $L_{1-19}$ | $L_{2-10}$ |
| COMPOUND 7591 | $L_{1-19}$ | $L_{2-15}$ |

-continued

| | | |
|---|---|---|
| COMPOUND 7592 | $L_{1-19}$ | $L_{2-20}$ |
| COMPOUND 7593 | $L_{1-19}$ | $L_{2-65}$ |
| COMPOUND 7594 | $L_{1-19}$ | $L_{2-109}$ |
| COMPOUND 7595 | $L_{1-20}$ | $L_{2-1}$ |
| COMPOUND 7596 | $L_{1-20}$ | $L_{2-10}$ |
| COMPOUND 7597 | $L_{1-20}$ | $L_{2-15}$ |
| COMPOUND 7598 | $L_{1-20}$ | $L_{2-20}$ |
| COMPOUND 7599 | $L_{1-20}$ | $L_{2-65}$ |
| COMPOUND 7600 | $L_{1-20}$ | $L_{2-109}$ |
| COMPOUND 7601 | $L_{1-21}$ | $L_{2-1}$ |
| COMPOUND 7602 | $L_{1-21}$ | $L_{2-10}$ |
| COMPOUND 7603 | $L_{1-21}$ | $L_{2-15}$ |
| COMPOUND 7604 | $L_{1-21}$ | $L_{2-20}$ |
| COMPOUND 7605 | $L_{1-21}$ | $L_{2-65}$ |
| COMPOUND 7606 | $L_{1-21}$ | $L_{2-109}$ |
| COMPOUND 7607 | $L_{1-22}$ | $L_{2-1}$ |
| COMPOUND 7608 | $L_{1-22}$ | $L_{2-10}$ |
| COMPOUND 7609 | $L_{1-22}$ | $L_{2-15}$ |
| COMPOUND 7610 | $L_{1-22}$ | $L_{2-20}$ |
| COMPOUND 7611 | $L_{1-22}$ | $L_{2-65}$ |
| COMPOUND 7612 | $L_{1-22}$ | $L_{2-109}$ |
| COMPOUND 7613 | $L_{1-23}$ | $L_{2-1}$ |
| COMPOUND 7614 | $L_{1-23}$ | $L_{2-10}$ |
| COMPOUND 7615 | $L_{1-23}$ | $L_{2-15}$ |
| COMPOUND 7616 | $L_{1-23}$ | $L_{2-20}$ |
| COMPOUND 7617 | $L_{1-23}$ | $L_{2-65}$ |
| COMPOUND 7618 | $L_{1-23}$ | $L_{2-109}$ |
| COMPOUND 7619 | $L_{1-24}$ | $L_{2-1}$ |
| COMPOUND 7620 | $L_{1-24}$ | $L_{2-10}$ |
| COMPOUND 7621 | $L_{1-24}$ | $L_{2-15}$ |
| COMPOUND 7622 | $L_{1-24}$ | $L_{2-20}$ |
| COMPOUND 7623 | $L_{1-24}$ | $L_{2-65}$ |
| COMPOUND 7624 | $L_{1-24}$ | $L_{2-109}$ |
| COMPOUND 7625 | $L_{1-25}$ | $L_{2-1}$ |
| COMPOUND 7626 | $L_{1-25}$ | $L_{2-10}$ |
| COMPOUND 7627 | $L_{1-25}$ | $L_{2-15}$ |
| COMPOUND 7628 | $L_{1-25}$ | $L_{2-20}$ |
| COMPOUND 7629 | $L_{1-25}$ | $L_{2-65}$ |
| COMPOUND 7630 | $L_{1-25}$ | $L_{2-109}$ |
| COMPOUND 7631 | $L_{1-26}$ | $L_{2-1}$ |
| COMPOUND 7632 | $L_{1-26}$ | $L_{2-10}$ |
| COMPOUND 7633 | $L_{1-26}$ | $L_{2-15}$ |
| COMPOUND 7634 | $L_{1-26}$ | $L_{2-20}$ |
| COMPOUND 7635 | $L_{1-26}$ | $L_{2-65}$ |
| COMPOUND 7636 | $L_{1-26}$ | $L_{2-109}$ |
| COMPOUND 7637 | $L_{1-27}$ | $L_{2-1}$ |
| COMPOUND 7638 | $L_{1-27}$ | $L_{2-10}$ |
| COMPOUND 7639 | $L_{1-27}$ | $L_{2-15}$ |
| COMPOUND 7640 | $L_{1-27}$ | $L_{2-20}$ |
| COMPOUND 7641 | $L_{1-27}$ | $L_{2-65}$ |
| COMPOUND 7642 | $L_{1-27}$ | $L_{2-109}$ |
| COMPOUND 7643 | $L_{1-28}$ | $L_{2-1}$ |
| COMPOUND 7644 | $L_{1-28}$ | $L_{2-10}$ |
| COMPOUND 7645 | $L_{1-28}$ | $L_{2-15}$ |
| COMPOUND 7646 | $L_{1-28}$ | $L_{2-20}$ |
| COMPOUND 7647 | $L_{1-28}$ | $L_{2-65}$ |
| COMPOUND 7648 | $L_{1-28}$ | $L_{2-109}$ |
| COMPOUND 7649 | $L_{1-29}$ | $L_{2-1}$ |
| COMPOUND 7650 | $L_{1-29}$ | $L_{2-10}$ |
| COMPOUND 7651 | $L_{1-29}$ | $L_{2-15}$ |
| COMPOUND 7652 | $L_{1-29}$ | $L_{2-20}$ |
| COMPOUND 7653 | $L_{1-29}$ | $L_{2-65}$ |
| COMPOUND 7654 | $L_{1-29}$ | $L_{2-109}$ |
| COMPOUND 7655 | $L_{1-30}$ | $L_{2-1}$ |
| COMPOUND 7656 | $L_{1-30}$ | $L_{2-10}$ |
| COMPOUND 7657 | $L_{1-30}$ | $L_{2-15}$ |
| COMPOUND 7658 | $L_{1-30}$ | $L_{2-20}$ |
| COMPOUND 7659 | $L_{1-30}$ | $L_{2-65}$ |
| COMPOUND 7660 | $L_{1-30}$ | $L_{2-109}$ |
| COMPOUND 7661 | $L_{1-31}$ | $L_{2-1}$ |
| COMPOUND 7662 | $L_{1-31}$ | $L_{2-10}$ |
| COMPOUND 7663 | $L_{1-31}$ | $L_{2-15}$ |
| COMPOUND 7664 | $L_{1-31}$ | $L_{2-20}$ |
| COMPOUND 7665 | $L_{1-31}$ | $L_{2-65}$ |
| COMPOUND 7666 | $L_{1-31}$ | $L_{2-109}$ |
| COMPOUND 7667 | $L_{1-32}$ | $L_{2-1}$ |
| COMPOUND 7668 | $L_{1-32}$ | $L_{2-10}$ |
| COMPOUND 7669 | $L_{1-32}$ | $L_{2-15}$ |
| COMPOUND 7670 | $L_{1-32}$ | $L_{2-20}$ |

-continued

| | | |
|---|---|---|
| COMPOUND 7671 | $L_{1-32}$ | $L_{2-65}$ |
| COMPOUND 7672 | $L_{1-32}$ | $L_{2-109}$ |
| COMPOUND 7673 | $L_{1-33}$ | $L_{2-1}$ |
| COMPOUND 7674 | $L_{1-33}$ | $L_{2-10}$ |
| COMPOUND 7675 | $L_{1-33}$ | $L_{2-15}$ |
| COMPOUND 7676 | $L_{1-33}$ | $L_{2-20}$ |
| COMPOUND 7677 | $L_{1-33}$ | $L_{2-65}$ |
| COMPOUND 7678 | $L_{1-33}$ | $L_{2-109}$ |
| COMPOUND 7679 | $L_{1-34}$ | $L_{2-1}$ |
| COMPOUND 7680 | $L_{1-34}$ | $L_{2-10}$ |
| COMPOUND 7681 | $L_{1-34}$ | $L_{2-15}$ |
| COMPOUND 7682 | $L_{1-34}$ | $L_{2-20}$ |
| COMPOUND 7683 | $L_{1-34}$ | $L_{2-65}$ |
| COMPOUND 7684 | $L_{1-34}$ | $L_{2-109}$ |
| COMPOUND 7685 | $L_{1-35}$ | $L_{2-1}$ |
| COMPOUND 7686 | $L_{1-35}$ | $L_{2-10}$ |
| COMPOUND 7687 | $L_{1-35}$ | $L_{2-15}$ |
| COMPOUND 7688 | $L_{1-35}$ | $L_{2-20}$ |
| COMPOUND 7689 | $L_{1-35}$ | $L_{2-65}$ |
| COMPOUND 7690 | $L_{1-35}$ | $L_{2-109}$ |
| COMPOUND 7691 | $L_{1-36}$ | $L_{2-1}$ |
| COMPOUND 7692 | $L_{1-36}$ | $L_{2-10}$ |
| COMPOUND 7693 | $L_{1-36}$ | $L_{2-15}$ |
| COMPOUND 7694 | $L_{1-36}$ | $L_{2-20}$ |
| COMPOUND 7695 | $L_{1-36}$ | $L_{2-65}$ |
| COMPOUND 7696 | $L_{1-36}$ | $L_{2-109}$ |
| COMPOUND 7697 | $L_{1-37}$ | $L_{2-1}$ |
| COMPOUND 7698 | $L_{1-37}$ | $L_{2-10}$ |
| COMPOUND 7699 | $L_{1-37}$ | $L_{2-15}$ |
| COMPOUND 7700 | $L_{1-37}$ | $L_{2-20}$ |
| COMPOUND 7701 | $L_{1-37}$ | $L_{2-65}$ |
| COMPOUND 7702 | $L_{1-37}$ | $L_{2-109}$ |
| COMPOUND 7703 | $L_{1-38}$ | $L_{2-1}$ |
| COMPOUND 7704 | $L_{1-38}$ | $L_{2-10}$ |
| COMPOUND 7705 | $L_{1-38}$ | $L_{2-15}$ |
| COMPOUND 7706 | $L_{1-38}$ | $L_{2-20}$ |
| COMPOUND 7707 | $L_{1-38}$ | $L_{2-65}$ |
| COMPOUND 7708 | $L_{1-38}$ | $L_{2-109}$ |
| COMPOUND 7709 | $L_{1-39}$ | $L_{2-1}$ |
| COMPOUND 7710 | $L_{1-39}$ | $L_{2-10}$ |
| COMPOUND 7711 | $L_{1-39}$ | $L_{2-15}$ |
| COMPOUND 7712 | $L_{1-39}$ | $L_{2-20}$ |
| COMPOUND 7713 | $L_{1-39}$ | $L_{2-65}$ |
| COMPOUND 7714 | $L_{1-39}$ | $L_{2-109}$ |
| COMPOUND 7715 | $L_{1-40}$ | $L_{2-1}$ |
| COMPOUND 7716 | $L_{1-40}$ | $L_{2-10}$ |
| COMPOUND 7717 | $L_{1-40}$ | $L_{2-15}$ |
| COMPOUND 7718 | $L_{1-40}$ | $L_{2-20}$ |
| COMPOUND 7719 | $L_{1-40}$ | $L_{2-65}$ |
| COMPOUND 7720 | $L_{1-40}$ | $L_{2-109}$ |
| COMPOUND 7721 | $L_{1-41}$ | $L_{2-1}$ |
| COMPOUND 7722 | $L_{1-41}$ | $L_{2-10}$ |
| COMPOUND 7723 | $L_{1-41}$ | $L_{2-15}$ |
| COMPOUND 7724 | $L_{1-41}$ | $L_{2-20}$ |
| COMPOUND 7725 | $L_{1-41}$ | $L_{2-65}$ |
| COMPOUND 7726 | $L_{1-41}$ | $L_{2-109}$ |
| COMPOUND 7727 | $L_{1-42}$ | $L_{2-1}$ |
| COMPOUND 7728 | $L_{1-42}$ | $L_{2-10}$ |
| COMPOUND 7729 | $L_{1-42}$ | $L_{2-15}$ |
| COMPOUND 7730 | $L_{1-42}$ | $L_{2-20}$ |
| COMPOUND 7731 | $L_{1-42}$ | $L_{2-65}$ |
| COMPOUND 7732 | $L_{1-42}$ | $L_{2-109}$ |
| COMPOUND 7733 | $L_{1-43}$ | $L_{2-1}$ |
| COMPOUND 7734 | $L_{1-43}$ | $L_{2-10}$ |
| COMPOUND 7735 | $L_{1-43}$ | $L_{2-15}$ |
| COMPOUND 7736 | $L_{1-43}$ | $L_{2-20}$ |
| COMPOUND 7737 | $L_{1-43}$ | $L_{2-65}$ |
| COMPOUND 7738 | $L_{1-43}$ | $L_{2-109}$ |
| COMPOUND 7739 | $L_{1-44}$ | $L_{2-1}$ |
| COMPOUND 7740 | $L_{1-44}$ | $L_{2-10}$ |
| COMPOUND 7741 | $L_{1-44}$ | $L_{2-15}$ |
| COMPOUND 7742 | $L_{1-44}$ | $L_{2-20}$ |
| COMPOUND 7743 | $L_{1-44}$ | $L_{2-65}$ |
| COMPOUND 7744 | $L_{1-44}$ | $L_{2-109}$ |
| COMPOUND 7745 | $L_{1-45}$ | $L_{2-1}$ |
| COMPOUND 7746 | $L_{1-45}$ | $L_{2-10}$ |
| COMPOUND 7747 | $L_{1-45}$ | $L_{2-15}$ |
| COMPOUND 7748 | $L_{1-45}$ | $L_{2-20}$ |
| COMPOUND 7749 | $L_{1-45}$ | $L_{2-65}$ |

-continued

| | | |
|---|---|---|
| COMPOUND 7750 | $L_{1-45}$ | $L_{2-109}$ |
| COMPOUND 7751 | $L_{1-46}$ | $L_{2-1}$ |
| COMPOUND 7752 | $L_{1-46}$ | $L_{2-10}$ |
| COMPOUND 7753 | $L_{1-46}$ | $L_{2-15}$ |
| COMPOUND 7754 | $L_{1-46}$ | $L_{2-20}$ |
| COMPOUND 7755 | $L_{1-46}$ | $L_{2-65}$ |
| COMPOUND 7756 | $L_{1-46}$ | $L_{2-109}$ |
| COMPOUND 7757 | $L_{1-47}$ | $L_{2-1}$ |
| COMPOUND 7758 | $L_{1-47}$ | $L_{2-10}$ |
| COMPOUND 7759 | $L_{1-47}$ | $L_{2-15}$ |
| COMPOUND 7760 | $L_{1-47}$ | $L_{2-20}$ |
| COMPOUND 7761 | $L_{1-47}$ | $L_{2-65}$ |
| COMPOUND 7762 | $L_{1-47}$ | $L_{2-109}$ |
| COMPOUND 7763 | $L_{1-48}$ | $L_{2-1}$ |
| COMPOUND 7764 | $L_{1-48}$ | $L_{2-10}$ |
| COMPOUND 7765 | $L_{1-48}$ | $L_{2-15}$ |
| COMPOUND 7766 | $L_{1-48}$ | $L_{2-20}$ |
| COMPOUND 7767 | $L_{1-48}$ | $L_{2-65}$ |
| COMPOUND 7768 | $L_{1-48}$ | $L_{2-109}$ |
| COMPOUND 7769 | $L_{1-49}$ | $L_{2-1}$ |
| COMPOUND 7770 | $L_{1-49}$ | $L_{2-10}$ |
| COMPOUND 7771 | $L_{1-49}$ | $L_{2-15}$ |
| COMPOUND 7772 | $L_{1-49}$ | $L_{2-20}$ |
| COMPOUND 7773 | $L_{1-49}$ | $L_{2-65}$ |
| COMPOUND 7774 | $L_{1-49}$ | $L_{2-109}$ |
| COMPOUND 7775 | $L_{1-50}$ | $L_{2-1}$ |
| COMPOUND 7776 | $L_{1-50}$ | $L_{2-10}$ |
| COMPOUND 7777 | $L_{1-50}$ | $L_{2-15}$ |
| COMPOUND 7778 | $L_{1-50}$ | $L_{2-20}$ |
| COMPOUND 7779 | $L_{1-50}$ | $L_{2-65}$ |
| COMPOUND 7780 | $L_{1-50}$ | $L_{2-109}$ |
| COMPOUND 7781 | $L_{1-51}$ | $L_{2-1}$ |
| COMPOUND 7782 | $L_{1-51}$ | $L_{2-10}$ |
| COMPOUND 7783 | $L_{1-51}$ | $L_{2-15}$ |
| COMPOUND 7784 | $L_{1-51}$ | $L_{2-20}$ |
| COMPOUND 7785 | $L_{1-51}$ | $L_{2-65}$ |
| COMPOUND 7786 | $L_{1-51}$ | $L_{2-109}$ |
| COMPOUND 7787 | $L_{1-52}$ | $L_{2-1}$ |
| COMPOUND 7788 | $L_{1-52}$ | $L_{2-10}$ |
| COMPOUND 7789 | $L_{1-52}$ | $L_{2-15}$ |
| COMPOUND 7790 | $L_{1-52}$ | $L_{2-20}$ |
| COMPOUND 7791 | $L_{1-52}$ | $L_{2-65}$ |
| COMPOUND 7792 | $L_{1-52}$ | $L_{2-109}$ |
| COMPOUND 7793 | $L_{1-53}$ | $L_{2-1}$ |
| COMPOUND 7794 | $L_{1-53}$ | $L_{2-10}$ |
| COMPOUND 7795 | $L_{1-53}$ | $L_{2-15}$ |
| COMPOUND 7796 | $L_{1-53}$ | $L_{2-20}$ |
| COMPOUND 7797 | $L_{1-53}$ | $L_{2-65}$ |
| COMPOUND 7798 | $L_{1-53}$ | $L_{2-109}$ |
| COMPOUND 7799 | $L_{1-54}$ | $L_{2-1}$ |
| COMPOUND 7800 | $L_{1-54}$ | $L_{2-10}$ |
| COMPOUND 7801 | $L_{1-54}$ | $L_{2-15}$ |
| COMPOUND 7802 | $L_{1-54}$ | $L_{2-20}$ |
| COMPOUND 7803 | $L_{1-54}$ | $L_{2-65}$ |
| COMPOUND 7804 | $L_{1-54}$ | $L_{2-109}$ |
| COMPOUND 7805 | $L_{1-55}$ | $L_{2-1}$ |
| COMPOUND 7806 | $L_{1-55}$ | $L_{2-10}$ |
| COMPOUND 7807 | $L_{1-55}$ | $L_{2-15}$ |
| COMPOUND 7808 | $L_{1-55}$ | $L_{2-20}$ |
| COMPOUND 7809 | $L_{1-55}$ | $L_{2-65}$ |
| COMPOUND 7810 | $L_{1-55}$ | $L_{2-109}$ |
| COMPOUND 7811 | $L_{1-56}$ | $L_{2-1}$ |
| COMPOUND 7812 | $L_{1-56}$ | $L_{2-10}$ |
| COMPOUND 7813 | $L_{1-56}$ | $L_{2-15}$ |
| COMPOUND 7814 | $L_{1-56}$ | $L_{2-20}$ |
| COMPOUND 7815 | $L_{1-56}$ | $L_{2-65}$ |
| COMPOUND 7816 | $L_{1-56}$ | $L_{2-109}$ |
| COMPOUND 7817 | $L_{1-57}$ | $L_{2-1}$ |
| COMPOUND 7818 | $L_{1-57}$ | $L_{2-10}$ |
| COMPOUND 7819 | $L_{1-57}$ | $L_{2-15}$ |
| COMPOUND 7820 | $L_{1-57}$ | $L_{2-20}$ |
| COMPOUND 7821 | $L_{1-57}$ | $L_{2-65}$ |
| COMPOUND 7822 | $L_{1-57}$ | $L_{2-109}$ |
| COMPOUND 7823 | $L_{1-58}$ | $L_{2-1}$ |
| COMPOUND 7824 | $L_{1-58}$ | $L_{2-10}$ |
| COMPOUND 7825 | $L_{1-58}$ | $L_{2-15}$ |
| COMPOUND 7826 | $L_{1-58}$ | $L_{2-20}$ |
| COMPOUND 7827 | $L_{1-58}$ | $L_{2-65}$ |
| COMPOUND 7828 | $L_{1-58}$ | $L_{2-109}$ |

-continued

| | | |
|---|---|---|
| COMPOUND 7829 | $L_{1-59}$ | $L_{2-1}$ |
| COMPOUND 7830 | $L_{1-59}$ | $L_{2-10}$ |
| COMPOUND 7831 | $L_{1-59}$ | $L_{2-15}$ |
| COMPOUND 7832 | $L_{1-59}$ | $L_{2-20}$ |
| COMPOUND 7833 | $L_{1-59}$ | $L_{2-65}$ |
| COMPOUND 7834 | $L_{1-59}$ | $L_{2-109}$ |
| COMPOUND 7835 | $L_{1-60}$ | $L_{2-1}$ |
| COMPOUND 7836 | $L_{1-60}$ | $L_{2-10}$ |
| COMPOUND 7837 | $L_{1-60}$ | $L_{2-15}$ |
| COMPOUND 7838 | $L_{1-60}$ | $L_{2-20}$ |
| COMPOUND 7839 | $L_{1-60}$ | $L_{2-65}$ |
| COMPOUND 7840 | $L_{1-60}$ | $L_{2-109}$ |
| COMPOUND 7841 | $L_{1-61}$ | $L_{2-1}$ |
| COMPOUND 7842 | $L_{1-61}$ | $L_{2-10}$ |
| COMPOUND 7843 | $L_{1-61}$ | $L_{2-15}$ |
| COMPOUND 7844 | $L_{1-61}$ | $L_{2-20}$ |
| COMPOUND 7845 | $L_{1-61}$ | $L_{2-65}$ |
| COMPOUND 7846 | $L_{1-61}$ | $L_{2-109}$ |
| COMPOUND 7847 | $L_{1-62}$ | $L_{2-1}$ |
| COMPOUND 7848 | $L_{1-62}$ | $L_{2-10}$ |
| COMPOUND 7849 | $L_{1-62}$ | $L_{2-15}$ |
| COMPOUND 7850 | $L_{1-62}$ | $L_{2-20}$ |
| COMPOUND 7851 | $L_{1-62}$ | $L_{2-65}$ |
| COMPOUND 7852 | $L_{1-62}$ | $L_{2-109}$ |
| COMPOUND 7853 | $L_{1-63}$ | $L_{2-1}$ |
| COMPOUND 7854 | $L_{1-63}$ | $L_{2-10}$ |
| COMPOUND 7855 | $L_{1-63}$ | $L_{2-15}$ |
| COMPOUND 7856 | $L_{1-63}$ | $L_{2-20}$ |
| COMPOUND 7857 | $L_{1-63}$ | $L_{2-65}$ |
| COMPOUND 7858 | $L_{1-63}$ | $L_{2-109}$ |
| COMPOUND 7859 | $L_{1-64}$ | $L_{2-1}$ |
| COMPOUND 7860 | $L_{1-64}$ | $L_{2-10}$ |
| COMPOUND 7861 | $L_{1-64}$ | $L_{2-15}$ |
| COMPOUND 7862 | $L_{1-64}$ | $L_{2-20}$ |
| COMPOUND 7863 | $L_{1-64}$ | $L_{2-65}$ |
| COMPOUND 7864 | $L_{1-64}$ | $L_{2-109}$ |
| COMPOUND 7865 | $L_{1-65}$ | $L_{2-1}$ |
| COMPOUND 7866 | $L_{1-65}$ | $L_{2-10}$ |
| COMPOUND 7867 | $L_{1-65}$ | $L_{2-15}$ |
| COMPOUND 7868 | $L_{1-65}$ | $L_{2-20}$ |
| COMPOUND 7869 | $L_{1-65}$ | $L_{2-65}$ |
| COMPOUND 7870 | $L_{1-65}$ | $L_{2-109}$ |
| COMPOUND 7871 | $L_{1-66}$ | $L_{2-1}$ |
| COMPOUND 7872 | $L_{1-66}$ | $L_{2-10}$ |
| COMPOUND 7873 | $L_{1-66}$ | $L_{2-15}$ |
| COMPOUND 7874 | $L_{1-66}$ | $L_{2-20}$ |
| COMPOUND 7875 | $L_{1-66}$ | $L_{2-65}$ |
| COMPOUND 7876 | $L_{1-66}$ | $L_{2-109}$ |
| COMPOUND 7877 | $L_{1-67}$ | $L_{2-1}$ |
| COMPOUND 7878 | $L_{1-67}$ | $L_{2-10}$ |
| COMPOUND 7879 | $L_{1-67}$ | $L_{2-15}$ |
| COMPOUND 7880 | $L_{1-67}$ | $L_{2-20}$ |
| COMPOUND 7881 | $L_{1-67}$ | $L_{2-65}$ |
| COMPOUND 7882 | $L_{1-67}$ | $L_{2-109}$ |
| COMPOUND 7883 | $L_{1-68}$ | $L_{2-1}$ |
| COMPOUND 7884 | $L_{1-68}$ | $L_{2-10}$ |
| COMPOUND 7885 | $L_{1-68}$ | $L_{2-15}$ |
| COMPOUND 7886 | $L_{1-68}$ | $L_{2-20}$ |
| COMPOUND 7887 | $L_{1-68}$ | $L_{2-65}$ |
| COMPOUND 7888 | $L_{1-68}$ | $L_{2-109}$ |
| COMPOUND 7889 | $L_{1-69}$ | $L_{2-1}$ |
| COMPOUND 7890 | $L_{1-69}$ | $L_{2-10}$ |
| COMPOUND 7891 | $L_{1-69}$ | $L_{2-15}$ |
| COMPOUND 7892 | $L_{1-69}$ | $L_{2-20}$ |
| COMPOUND 7893 | $L_{1-69}$ | $L_{2-65}$ |
| COMPOUND 7894 | $L_{1-69}$ | $L_{2-109}$ |
| COMPOUND 7895 | $L_{1-70}$ | $L_{2-1}$ |
| COMPOUND 7896 | $L_{1-70}$ | $L_{2-10}$ |
| COMPOUND 7897 | $L_{1-70}$ | $L_{2-15}$ |
| COMPOUND 7898 | $L_{1-70}$ | $L_{2-20}$ |
| COMPOUND 7899 | $L_{1-70}$ | $L_{2-65}$ |
| COMPOUND 7900 | $L_{1-70}$ | $L_{2-109}$ |
| COMPOUND 7901 | $L_{1-71}$ | $L_{2-1}$ |
| COMPOUND 7902 | $L_{1-71}$ | $L_{2-10}$ |
| COMPOUND 7903 | $L_{1-71}$ | $L_{2-15}$ |
| COMPOUND 7904 | $L_{1-71}$ | $L_{2-20}$ |
| COMPOUND 7905 | $L_{1-71}$ | $L_{2-65}$ |
| COMPOUND 7906 | $L_{1-71}$ | $L_{2-109}$ |
| COMPOUND 7907 | $L_{1-72}$ | $L_{2-1}$ |

-continued

| | | |
|---|---|---|
| COMPOUND 7908 | $L_{1-72}$ | $L_{2-10}$ |
| COMPOUND 7909 | $L_{1-72}$ | $L_{2-15}$ |
| COMPOUND 7910 | $L_{1-72}$ | $L_{2-20}$ |
| COMPOUND 7911 | $L_{1-72}$ | $L_{2-65}$ |
| COMPOUND 7912 | $L_{1-72}$ | $L_{2-109}$ |
| COMPOUND 7913 | $L_{1-73}$ | $L_{2-1}$ |
| COMPOUND 7914 | $L_{1-73}$ | $L_{2-10}$ |
| COMPOUND 7915 | $L_{1-73}$ | $L_{2-15}$ |
| COMPOUND 7916 | $L_{1-73}$ | $L_{2-20}$ |
| COMPOUND 7917 | $L_{1-73}$ | $L_{2-65}$ |
| COMPOUND 7918 | $L_{1-73}$ | $L_{2-109}$ |
| COMPOUND 7919 | $L_{1-74}$ | $L_{2-1}$ |
| COMPOUND 7920 | $L_{1-74}$ | $L_{2-10}$ |
| COMPOUND 7921 | $L_{1-74}$ | $L_{2-15}$ |
| COMPOUND 7922 | $L_{1-74}$ | $L_{2-20}$ |
| COMPOUND 7923 | $L_{1-74}$ | $L_{2-65}$ |
| COMPOUND 7924 | $L_{1-74}$ | $L_{2-109}$ |
| COMPOUND 7925 | $L_{1-75}$ | $L_{2-1}$ |
| COMPOUND 7926 | $L_{1-75}$ | $L_{2-10}$ |
| COMPOUND 7927 | $L_{1-75}$ | $L_{2-15}$ |
| COMPOUND 7928 | $L_{1-75}$ | $L_{2-20}$ |
| COMPOUND 7929 | $L_{1-75}$ | $L_{2-65}$ |
| COMPOUND 7930 | $L_{1-75}$ | $L_{2-109}$ |
| COMPOUND 7931 | $L_{1-76}$ | $L_{2-1}$ |
| COMPOUND 7932 | $L_{1-76}$ | $L_{2-10}$ |
| COMPOUND 7933 | $L_{1-76}$ | $L_{2-15}$ |
| COMPOUND 7934 | $L_{1-76}$ | $L_{2-20}$ |
| COMPOUND 7935 | $L_{1-76}$ | $L_{2-65}$ |
| COMPOUND 7936 | $L_{1-76}$ | $L_{2-109}$ |
| COMPOUND 7937 | $L_{1-77}$ | $L_{2-1}$ |
| COMPOUND 7938 | $L_{1-77}$ | $L_{2-10}$ |
| COMPOUND 7939 | $L_{1-77}$ | $L_{2-15}$ |
| COMPOUND 7940 | $L_{1-77}$ | $L_{2-20}$ |
| COMPOUND 7941 | $L_{1-77}$ | $L_{2-65}$ |
| COMPOUND 7942 | $L_{1-77}$ | $L_{2-109}$ |
| COMPOUND 7943 | $L_{1-78}$ | $L_{2-1}$ |
| COMPOUND 7944 | $L_{1-78}$ | $L_{2-10}$ |
| COMPOUND 7945 | $L_{1-78}$ | $L_{2-15}$ |
| COMPOUND 7946 | $L_{1-78}$ | $L_{2-20}$ |
| COMPOUND 7947 | $L_{1-78}$ | $L_{2-65}$ |
| COMPOUND 7948 | $L_{1-78}$ | $L_{2-109}$ |
| COMPOUND 7949 | $L_{1-79}$ | $L_{2-1}$ |
| COMPOUND 7950 | $L_{1-79}$ | $L_{2-10}$ |
| COMPOUND 7951 | $L_{1-79}$ | $L_{2-15}$ |
| COMPOUND 7952 | $L_{1-79}$ | $L_{2-20}$ |
| COMPOUND 7953 | $L_{1-79}$ | $L_{2-65}$ |
| COMPOUND 7954 | $L_{1-79}$ | $L_{2-109}$ |
| COMPOUND 7955 | $L_{1-80}$ | $L_{2-1}$ |
| COMPOUND 7956 | $L_{1-80}$ | $L_{2-10}$ |
| COMPOUND 7957 | $L_{1-80}$ | $L_{2-15}$ |
| COMPOUND 7958 | $L_{1-80}$ | $L_{2-20}$ |
| COMPOUND 7959 | $L_{1-80}$ | $L_{2-65}$ |
| COMPOUND 7960 | $L_{1-80}$ | $L_{2-109}$ |
| COMPOUND 7961 | $L_{1-81}$ | $L_{2-1}$ |
| COMPOUND 7962 | $L_{1-81}$ | $L_{2-10}$ |
| COMPOUND 7963 | $L_{1-81}$ | $L_{2-15}$ |
| COMPOUND 7964 | $L_{1-81}$ | $L_{2-20}$ |
| COMPOUND 7965 | $L_{1-81}$ | $L_{2-65}$ |
| COMPOUND 7966 | $L_{1-81}$ | $L_{2-109}$ |
| COMPOUND 7967 | $L_{1-82}$ | $L_{2-1}$ |
| COMPOUND 7968 | $L_{1-82}$ | $L_{2-10}$ |
| COMPOUND 7969 | $L_{1-82}$ | $L_{2-15}$ |
| COMPOUND 7970 | $L_{1-82}$ | $L_{2-20}$ |
| COMPOUND 7971 | $L_{1-82}$ | $L_{2-65}$ |
| COMPOUND 7972 | $L_{1-82}$ | $L_{2-109}$ |
| COMPOUND 7973 | $L_{1-83}$ | $L_{2-1}$ |
| COMPOUND 7974 | $L_{1-83}$ | $L_{2-10}$ |
| COMPOUND 7975 | $L_{1-83}$ | $L_{2-15}$ |
| COMPOUND 7976 | $L_{1-83}$ | $L_{2-20}$ |
| COMPOUND 7977 | $L_{1-83}$ | $L_{2-65}$ |
| COMPOUND 7978 | $L_{1-83}$ | $L_{2-109}$ |
| COMPOUND 7979 | $L_{1-84}$ | $L_{2-1}$ |
| COMPOUND 7980 | $L_{1-84}$ | $L_{2-10}$ |
| COMPOUND 7981 | $L_{1-84}$ | $L_{2-15}$ |
| COMPOUND 7982 | $L_{1-84}$ | $L_{2-20}$ |
| COMPOUND 7983 | $L_{1-84}$ | $L_{2-65}$ |
| COMPOUND 7984 | $L_{1-84}$ | $L_{2-109}$ |
| COMPOUND 7985 | $L_{1-85}$ | $L_{2-1}$ |
| COMPOUND 7986 | $L_{1-85}$ | $L_{2-10}$ |

-continued

| | | |
|---|---|---|
| COMPOUND 7987 | $L_{1-85}$ | $L_{2-15}$ |
| COMPOUND 7988 | $L_{1-85}$ | $L_{2-20}$ |
| COMPOUND 7989 | $L_{1-85}$ | $L_{2-65}$ |
| COMPOUND 7990 | $L_{1-85}$ | $L_{2-109}$ |
| COMPOUND 7991 | $L_{1-86}$ | $L_{2-1}$ |
| COMPOUND 7992 | $L_{1-86}$ | $L_{2-10}$ |
| COMPOUND 7993 | $L_{1-86}$ | $L_{2-15}$ |
| COMPOUND 7994 | $L_{1-86}$ | $L_{2-20}$ |
| COMPOUND 7995 | $L_{1-86}$ | $L_{2-65}$ |
| COMPOUND 7996 | $L_{1-86}$ | $L_{2-109}$ |
| COMPOUND 7997 | $L_{1-87}$ | $L_{2-1}$ |
| COMPOUND 7998 | $L_{1-87}$ | $L_{2-10}$ |
| COMPOUND 7999 | $L_{1-87}$ | $L_{2-15}$ |
| COMPOUND 8000 | $L_{1-87}$ | $L_{2-20}$ |
| COMPOUND 8001 | $L_{1-87}$ | $L_{2-65}$ |
| COMPOUND 8002 | $L_{1-87}$ | $L_{2-109}$ |
| COMPOUND 8003 | $L_{1-88}$ | $L_{2-1}$ |
| COMPOUND 8004 | $L_{1-88}$ | $L_{2-10}$ |
| COMPOUND 8005 | $L_{1-88}$ | $L_{2-15}$ |
| COMPOUND 8006 | $L_{1-88}$ | $L_{2-20}$ |
| COMPOUND 8007 | $L_{1-88}$ | $L_{2-65}$ |
| COMPOUND 8008 | $L_{1-88}$ | $L_{2-109}$ |
| COMPOUND 8009 | $L_{1-89}$ | $L_{2-1}$ |
| COMPOUND 8010 | $L_{1-89}$ | $L_{2-10}$ |
| COMPOUND 8011 | $L_{1-89}$ | $L_{2-15}$ |
| COMPOUND 8012 | $L_{1-89}$ | $L_{2-20}$ |
| COMPOUND 8013 | $L_{1-89}$ | $L_{2-65}$ |
| COMPOUND 8014 | $L_{1-89}$ | $L_{2-109}$ |
| COMPOUND 8015 | $L_{1-90}$ | $L_{2-1}$ |
| COMPOUND 8016 | $L_{1-90}$ | $L_{2-10}$ |
| COMPOUND 8017 | $L_{1-90}$ | $L_{2-15}$ |
| COMPOUND 8018 | $L_{1-90}$ | $L_{2-20}$ |
| COMPOUND 8019 | $L_{1-90}$ | $L_{2-65}$ |
| COMPOUND 8020 | $L_{1-90}$ | $L_{2-109}$ |
| COMPOUND 8021 | $L_{1-91}$ | $L_{2-1}$ |
| COMPOUND 8022 | $L_{1-91}$ | $L_{2-10}$ |
| COMPOUND 8023 | $L_{1-91}$ | $L_{2-15}$ |
| COMPOUND 8024 | $L_{1-91}$ | $L_{2-20}$ |
| COMPOUND 8025 | $L_{1-91}$ | $L_{2-65}$ |
| COMPOUND 8026 | $L_{1-91}$ | $L_{2-109}$ |
| COMPOUND 8027 | $L_{1-92}$ | $L_{2-1}$ |
| COMPOUND 8028 | $L_{1-92}$ | $L_{2-10}$ |
| COMPOUND 8029 | $L_{1-92}$ | $L_{2-15}$ |
| COMPOUND 8030 | $L_{1-92}$ | $L_{2-20}$ |
| COMPOUND 8031 | $L_{1-92}$ | $L_{2-65}$ |
| COMPOUND 8032 | $L_{1-92}$ | $L_{2-109}$ |
| COMPOUND 8033 | $L_{1-93}$ | $L_{2-1}$ |
| COMPOUND 8034 | $L_{1-93}$ | $L_{2-10}$ |
| COMPOUND 8035 | $L_{1-93}$ | $L_{2-15}$ |
| COMPOUND 8036 | $L_{1-93}$ | $L_{2-20}$ |
| COMPOUND 8037 | $L_{1-93}$ | $L_{2-65}$ |
| COMPOUND 8038 | $L_{1-93}$ | $L_{2-109}$ |
| COMPOUND 8039 | $L_{1-94}$ | $L_{2-1}$ |
| COMPOUND 8040 | $L_{1-94}$ | $L_{2-10}$ |
| COMPOUND 8041 | $L_{1-94}$ | $L_{2-15}$ |
| COMPOUND 8042 | $L_{1-94}$ | $L_{2-20}$ |
| COMPOUND 8043 | $L_{1-94}$ | $L_{2-65}$ |
| COMPOUND 8044 | $L_{1-94}$ | $L_{2-109}$ |
| COMPOUND 8045 | $L_{1-95}$ | $L_{2-1}$ |
| COMPOUND 8046 | $L_{1-95}$ | $L_{2-10}$ |
| COMPOUND 8047 | $L_{1-95}$ | $L_{2-15}$ |
| COMPOUND 8048 | $L_{1-95}$ | $L_{2-20}$ |
| COMPOUND 8049 | $L_{1-95}$ | $L_{2-65}$ |
| COMPOUND 8050 | $L_{1-95}$ | $L_{2-109}$ |
| COMPOUND 8051 | $L_{1-96}$ | $L_{2-1}$ |
| COMPOUND 8052 | $L_{1-96}$ | $L_{2-10}$ |
| COMPOUND 8053 | $L_{1-96}$ | $L_{2-15}$ |
| COMPOUND 8054 | $L_{1-96}$ | $L_{2-20}$ |
| COMPOUND 8055 | $L_{1-96}$ | $L_{2-65}$ |
| COMPOUND 8056 | $L_{1-96}$ | $L_{2-109}$ |
| COMPOUND 8057 | $L_{1-97}$ | $L_{2-1}$ |
| COMPOUND 8058 | $L_{1-97}$ | $L_{2-10}$ |
| COMPOUND 8059 | $L_{1-97}$ | $L_{2-15}$ |
| COMPOUND 8060 | $L_{1-97}$ | $L_{2-20}$ |
| COMPOUND 8061 | $L_{1-97}$ | $L_{2-65}$ |
| COMPOUND 8062 | $L_{1-97}$ | $L_{2-109}$ |
| COMPOUND 8063 | $L_{1-98}$ | $L_{2-1}$ |
| COMPOUND 8064 | $L_{1-98}$ | $L_{2-10}$ |
| COMPOUND 8065 | $L_{1-98}$ | $L_{2-15}$ |

-continued

| | | |
|---|---|---|
| COMPOUND 8066 | $L_{1-98}$ | $L_{2-20}$ |
| COMPOUND 8067 | $L_{1-98}$ | $L_{2-65}$ |
| COMPOUND 8068 | $L_{1-98}$ | $L_{2-109}$ |
| COMPOUND 8069 | $L_{1-99}$ | $L_{2-1}$ |
| COMPOUND 8070 | $L_{1-99}$ | $L_{2-10}$ |
| COMPOUND 8071 | $L_{1-99}$ | $L_{2-15}$ |
| COMPOUND 8072 | $L_{1-99}$ | $L_{2-20}$ |
| COMPOUND 8073 | $L_{1-99}$ | $L_{2-65}$ |
| COMPOUND 8074 | $L_{1-99}$ | $L_{2-109}$ |
| COMPOUND 8075 | $L_{1-100}$ | $L_{2-1}$ |
| COMPOUND 8076 | $L_{1-100}$ | $L_{2-10}$ |
| COMPOUND 8077 | $L_{1-100}$ | $L_{2-15}$ |
| COMPOUND 8078 | $L_{1-100}$ | $L_{2-20}$ |
| COMPOUND 8079 | $L_{1-100}$ | $L_{2-65}$ |
| COMPOUND 8080 | $L_{1-100}$ | $L_{2-109}$ |
| COMPOUND 8081 | $L_{1-101}$ | $L_{2-1}$ |
| COMPOUND 8082 | $L_{1-101}$ | $L_{2-10}$ |
| COMPOUND 8083 | $L_{1-101}$ | $L_{2-15}$ |
| COMPOUND 8084 | $L_{1-101}$ | $L_{2-20}$ |
| COMPOUND 8085 | $L_{1-101}$ | $L_{2-65}$ |
| COMPOUND 8086 | $L_{1-101}$ | $L_{2-109}$ |
| COMPOUND 8087 | $L_{1-102}$ | $L_{2-1}$ |
| COMPOUND 8088 | $L_{1-102}$ | $L_{2-10}$ |
| COMPOUND 8089 | $L_{1-102}$ | $L_{2-15}$ |
| COMPOUND 8090 | $L_{1-102}$ | $L_{2-20}$ |
| COMPOUND 8091 | $L_{1-102}$ | $L_{2-65}$ |
| COMPOUND 8092 | $L_{1-102}$ | $L_{2-109}$ |
| COMPOUND 8093 | $L_{1-103}$ | $L_{2-1}$ |
| COMPOUND 8094 | $L_{1-103}$ | $L_{2-10}$ |
| COMPOUND 8095 | $L_{1-103}$ | $L_{2-15}$ |
| COMPOUND 8096 | $L_{1-103}$ | $L_{2-20}$ |
| COMPOUND 8097 | $L_{1-103}$ | $L_{2-65}$ |
| COMPOUND 8098 | $L_{1-103}$ | $L_{2-109}$ |
| COMPOUND 8099 | $L_{1-104}$ | $L_{2-1}$ |
| COMPOUND 8100 | $L_{1-104}$ | $L_{2-10}$ |
| COMPOUND 8101 | $L_{1-104}$ | $L_{2-15}$ |
| COMPOUND 8102 | $L_{1-104}$ | $L_{2-20}$ |
| COMPOUND 8103 | $L_{1-104}$ | $L_{2-65}$ |
| COMPOUND 8104 | $L_{1-104}$ | $L_{2-109}$ |
| COMPOUND 8105 | $L_{1-105}$ | $L_{2-1}$ |
| COMPOUND 8106 | $L_{1-105}$ | $L_{2-10}$ |
| COMPOUND 8107 | $L_{1-105}$ | $L_{2-15}$ |
| COMPOUND 8108 | $L_{1-105}$ | $L_{2-20}$ |
| COMPOUND 8109 | $L_{1-105}$ | $L_{2-65}$ |
| COMPOUND 8110 | $L_{1-105}$ | $L_{2-109}$ |
| COMPOUND 8111 | $L_{1-106}$ | $L_{2-1}$ |
| COMPOUND 8112 | $L_{1-106}$ | $L_{2-10}$ |
| COMPOUND 8113 | $L_{1-106}$ | $L_{2-15}$ |
| COMPOUND 8114 | $L_{1-106}$ | $L_{2-20}$ |
| COMPOUND 8115 | $L_{1-106}$ | $L_{2-65}$ |
| COMPOUND 8116 | $L_{1-106}$ | $L_{2-109}$ |
| COMPOUND 8117 | $L_{1-107}$ | $L_{2-1}$ |
| COMPOUND 8118 | $L_{1-107}$ | $L_{2-10}$ |
| COMPOUND 8119 | $L_{1-107}$ | $L_{2-15}$ |
| COMPOUND 8120 | $L_{1-107}$ | $L_{2-20}$ |
| COMPOUND 8121 | $L_{1-107}$ | $L_{2-65}$ |
| COMPOUND 8122 | $L_{1-107}$ | $L_{2-109}$ |
| COMPOUND 8123 | $L_{1-108}$ | $L_{2-1}$ |
| COMPOUND 8124 | $L_{1-108}$ | $L_{2-10}$ |
| COMPOUND 8125 | $L_{1-108}$ | $L_{2-15}$ |
| COMPOUND 8126 | $L_{1-108}$ | $L_{2-20}$ |
| COMPOUND 8127 | $L_{1-108}$ | $L_{2-65}$ |
| COMPOUND 8128 | $L_{1-108}$ | $L_{2-109}$ |
| COMPOUND 8129 | $L_{1-109}$ | $L_{2-1}$ |
| COMPOUND 8130 | $L_{1-109}$ | $L_{2-10}$ |
| COMPOUND 8131 | $L_{1-109}$ | $L_{2-15}$ |
| COMPOUND 8132 | $L_{1-109}$ | $L_{2-20}$ |
| COMPOUND 8133 | $L_{1-109}$ | $L_{2-65}$ |
| COMPOUND 8134 | $L_{1-109}$ | $L_{2-109}$ |
| COMPOUND 8135 | $L_{1-110}$ | $L_{2-1}$ |
| COMPOUND 8136 | $L_{1-110}$ | $L_{2-10}$ |
| COMPOUND 8137 | $L_{1-110}$ | $L_{2-15}$ |
| COMPOUND 8138 | $L_{1-110}$ | $L_{2-20}$ |
| COMPOUND 8139 | $L_{1-110}$ | $L_{2-65}$ |
| COMPOUND 8140 | $L_{1-110}$ | $L_{2-109}$ |
| COMPOUND 8141 | $L_{1-111}$ | $L_{2-1}$ |
| COMPOUND 8142 | $L_{1-111}$ | $L_{2-10}$ |
| COMPOUND 8143 | $L_{1-111}$ | $L_{2-15}$ |
| COMPOUND 8144 | $L_{1-111}$ | $L_{2-20}$ |

-continued

| | | |
|---|---|---|
| COMPOUND 8145 | $L_{1-111}$ | $L_{2-65}$ |
| COMPOUND 8146 | $L_{1-111}$ | $L_{2-109}$ |
| COMPOUND 8147 | $L_{1-112}$ | $L_{2-1}$ |
| COMPOUND 8148 | $L_{1-112}$ | $L_{2-10}$ |
| COMPOUND 8149 | $L_{1-112}$ | $L_{2-15}$ |
| COMPOUND 8150 | $L_{1-112}$ | $L_{2-20}$ |
| COMPOUND 8151 | $L_{1-112}$ | $L_{2-65}$ |
| COMPOUND 8152 | $L_{1-112}$ | $L_{2-109}$ |
| COMPOUND 8153 | $L_{1-113}$ | $L_{2-1}$ |
| COMPOUND 8154 | $L_{1-113}$ | $L_{2-10}$ |
| COMPOUND 8155 | $L_{1-113}$ | $L_{2-15}$ |
| COMPOUND 8156 | $L_{1-113}$ | $L_{2-20}$ |
| COMPOUND 8157 | $L_{1-113}$ | $L_{2-65}$ |
| COMPOUND 8158 | $L_{1-113}$ | $L_{2-109}$ |
| COMPOUND 8159 | $L_{1-114}$ | $L_{2-1}$ |
| COMPOUND 8160 | $L_{1-114}$ | $L_{2-10}$ |
| COMPOUND 8161 | $L_{1-114}$ | $L_{2-15}$ |
| COMPOUND 8162 | $L_{1-114}$ | $L_{2-20}$ |
| COMPOUND 8163 | $L_{1-114}$ | $L_{2-65}$ |
| COMPOUND 8164 | $L_{1-114}$ | $L_{2-109}$ |
| COMPOUND 8165 | $L_{1-115}$ | $L_{2-1}$ |
| COMPOUND 8166 | $L_{1-115}$ | $L_{2-10}$ |
| COMPOUND 8167 | $L_{1-115}$ | $L_{2-15}$ |
| COMPOUND 8168 | $L_{1-115}$ | $L_{2-20}$ |
| COMPOUND 8169 | $L_{1-115}$ | $L_{2-65}$ |
| COMPOUND 8170 | $L_{1-115}$ | $L_{2-109}$ |
| COMPOUND 8171 | $L_{1-116}$ | $L_{2-1}$ |
| COMPOUND 8172 | $L_{1-116}$ | $L_{2-10}$ |
| COMPOUND 8173 | $L_{1-116}$ | $L_{2-15}$ |
| COMPOUND 8174 | $L_{1-116}$ | $L_{2-20}$ |
| COMPOUND 8175 | $L_{1-116}$ | $L_{2-65}$ |
| COMPOUND 8176 | $L_{1-116}$ | $L_{2-109}$ |
| COMPOUND 8177 | $L_{1-117}$ | $L_{2-1}$ |
| COMPOUND 8178 | $L_{1-117}$ | $L_{2-10}$ |
| COMPOUND 8179 | $L_{1-117}$ | $L_{2-15}$ |
| COMPOUND 8180 | $L_{1-117}$ | $L_{2-20}$ |
| COMPOUND 8181 | $L_{1-117}$ | $L_{2-65}$ |
| COMPOUND 8182 | $L_{1-117}$ | $L_{2-109}$ |
| COMPOUND 8183 | $L_{1-118}$ | $L_{2-1}$ |
| COMPOUND 8184 | $L_{1-118}$ | $L_{2-10}$ |
| COMPOUND 8185 | $L_{1-118}$ | $L_{2-15}$ |
| COMPOUND 8186 | $L_{1-118}$ | $L_{2-20}$ |
| COMPOUND 8187 | $L_{1-118}$ | $L_{2-65}$ |
| COMPOUND 8188 | $L_{1-118}$ | $L_{2-109}$ |
| COMPOUND 8189 | $L_{1-119}$ | $L_{2-1}$ |
| COMPOUND 8190 | $L_{1-119}$ | $L_{2-10}$ |
| COMPOUND 8191 | $L_{1-119}$ | $L_{2-15}$ |
| COMPOUND 8192 | $L_{1-119}$ | $L_{2-20}$ |
| COMPOUND 8193 | $L_{1-119}$ | $L_{2-65}$ |
| COMPOUND 8194 | $L_{1-119}$ | $L_{2-109}$ |
| COMPOUND 8195 | $L_{1-120}$ | $L_{2-1}$ |
| COMPOUND 8196 | $L_{1-120}$ | $L_{2-10}$ |
| COMPOUND 8197 | $L_{1-120}$ | $L_{2-15}$ |
| COMPOUND 8198 | $L_{1-120}$ | $L_{2-20}$ |
| COMPOUND 8199 | $L_{1-120}$ | $L_{2-65}$ |
| COMPOUND 8200 | $L_{1-120}$ | $L_{2-109}$ |
| COMPOUND 8201 | $L_{1-121}$ | $L_{2-1}$ |
| COMPOUND 8202 | $L_{1-121}$ | $L_{2-10}$ |
| COMPOUND 8203 | $L_{1-121}$ | $L_{2-15}$ |
| COMPOUND 8204 | $L_{1-121}$ | $L_{2-20}$ |
| COMPOUND 8205 | $L_{1-121}$ | $L_{2-65}$ |
| COMPOUND 8206 | $L_{1-121}$ | $L_{2-109}$ |
| COMPOUND 8207 | $L_{1-122}$ | $L_{2-1}$ |
| COMPOUND 8208 | $L_{1-122}$ | $L_{2-10}$ |
| COMPOUND 8209 | $L_{1-122}$ | $L_{2-15}$ |
| COMPOUND 8210 | $L_{1-122}$ | $L_{2-20}$ |
| COMPOUND 8211 | $L_{1-122}$ | $L_{2-65}$ |
| COMPOUND 8212 | $L_{1-122}$ | $L_{2-109}$ |
| COMPOUND 8213 | $L_{1-123}$ | $L_{2-1}$ |
| COMPOUND 8214 | $L_{1-123}$ | $L_{2-10}$ |
| COMPOUND 8215 | $L_{1-123}$ | $L_{2-15}$ |
| COMPOUND 8216 | $L_{1-123}$ | $L_{2-20}$ |
| COMPOUND 8217 | $L_{1-123}$ | $L_{2-65}$ |
| COMPOUND 8218 | $L_{1-123}$ | $L_{2-109}$ |
| COMPOUND 8219 | $L_{1-124}$ | $L_{2-1}$ |
| COMPOUND 8220 | $L_{1-124}$ | $L_{2-10}$ |
| COMPOUND 8221 | $L_{1-124}$ | $L_{2-15}$ |
| COMPOUND 8222 | $L_{1-124}$ | $L_{2-20}$ |
| COMPOUND 8223 | $L_{1-124}$ | $L_{2-65}$ |

-continued

| | | |
|---|---|---|
| COMPOUND 8224 | $L_{1-124}$ | $L_{2-109}$ |
| COMPOUND 8225 | $L_{1-125}$ | $L_{2-1}$ |
| COMPOUND 8226 | $L_{1-125}$ | $L_{2-10}$ |
| COMPOUND 8227 | $L_{1-125}$ | $L_{2-15}$ |
| COMPOUND 8228 | $L_{1-125}$ | $L_{2-20}$ |
| COMPOUND 8229 | $L_{1-125}$ | $L_{2-65}$ |
| COMPOUND 8230 | $L_{1-125}$ | $L_{2-109}$ |
| COMPOUND 8231 | $L_{1-126}$ | $L_{2-1}$ |
| COMPOUND 8232 | $L_{1-126}$ | $L_{2-10}$ |
| COMPOUND 8233 | $L_{1-126}$ | $L_{2-15}$ |
| COMPOUND 8234 | $L_{1-126}$ | $L_{2-20}$ |
| COMPOUND 8235 | $L_{1-126}$ | $L_{2-65}$ |
| COMPOUND 8236 | $L_{1-126}$ | $L_{2-109}$ |
| COMPOUND 8237 | $L_{1-127}$ | $L_{2-1}$ |
| COMPOUND 8238 | $L_{1-127}$ | $L_{2-10}$ |
| COMPOUND 8239 | $L_{1-127}$ | $L_{2-15}$ |
| COMPOUND 8240 | $L_{1-127}$ | $L_{2-20}$ |
| COMPOUND 8241 | $L_{1-127}$ | $L_{2-65}$ |
| COMPOUND 8242 | $L_{1-127}$ | $L_{2-109}$ |
| COMPOUND 8243 | $L_{1-128}$ | $L_{2-1}$ |
| COMPOUND 8244 | $L_{1-128}$ | $L_{2-10}$ |
| COMPOUND 8245 | $L_{1-128}$ | $L_{2-15}$ |
| COMPOUND 8246 | $L_{1-128}$ | $L_{2-20}$ |
| COMPOUND 8247 | $L_{1-128}$ | $L_{2-65}$ |
| COMPOUND 8248 | $L_{1-128}$ | $L_{2-109}$ |
| COMPOUND 8249 | $L_{1-129}$ | $L_{2-1}$ |
| COMPOUND 8250 | $L_{1-129}$ | $L_{2-10}$ |
| COMPOUND 8251 | $L_{1-129}$ | $L_{2-15}$ |
| COMPOUND 8252 | $L_{1-129}$ | $L_{2-20}$ |
| COMPOUND 8253 | $L_{1-129}$ | $L_{2-65}$ |
| COMPOUND 8254 | $L_{1-129}$ | $L_{2-109}$ |
| COMPOUND 8255 | $L_{1-130}$ | $L_{2-1}$ |
| COMPOUND 8256 | $L_{1-130}$ | $L_{2-10}$ |
| COMPOUND 8257 | $L_{1-130}$ | $L_{2-15}$ |
| COMPOUND 8258 | $L_{1-130}$ | $L_{2-20}$ |
| COMPOUND 8259 | $L_{1-130}$ | $L_{2-65}$ |
| COMPOUND 8260 | $L_{1-130}$ | $L_{2-109}$ |
| COMPOUND 8261 | $L_{1-131}$ | $L_{2-1}$ |
| COMPOUND 8262 | $L_{1-131}$ | $L_{2-10}$ |
| COMPOUND 8263 | $L_{1-131}$ | $L_{2-15}$ |
| COMPOUND 8264 | $L_{1-131}$ | $L_{2-20}$ |
| COMPOUND 8265 | $L_{1-131}$ | $L_{2-65}$ |
| COMPOUND 8266 | $L_{1-131}$ | $L_{2-109}$ |
| COMPOUND 8267 | $L_{1-132}$ | $L_{2-1}$ |
| COMPOUND 8268 | $L_{1-132}$ | $L_{2-10}$ |
| COMPOUND 8269 | $L_{1-132}$ | $L_{2-15}$ |
| COMPOUND 8270 | $L_{1-132}$ | $L_{2-20}$ |
| COMPOUND 8271 | $L_{1-132}$ | $L_{2-65}$ |
| COMPOUND 8272 | $L_{1-132}$ | $L_{2-109}$ |
| COMPOUND 8273 | $L_{1-133}$ | $L_{2-1}$ |
| COMPOUND 8274 | $L_{1-133}$ | $L_{2-10}$ |
| COMPOUND 8275 | $L_{1-133}$ | $L_{2-15}$ |
| COMPOUND 8276 | $L_{1-133}$ | $L_{2-20}$ |
| COMPOUND 8277 | $L_{1-133}$ | $L_{2-65}$ |
| COMPOUND 8278 | $L_{1-133}$ | $L_{2-109}$ |
| COMPOUND 8279 | $L_{1-134}$ | $L_{2-1}$ |
| COMPOUND 8280 | $L_{1-134}$ | $L_{2-10}$ |
| COMPOUND 8281 | $L_{1-134}$ | $L_{2-15}$ |
| COMPOUND 8282 | $L_{1-134}$ | $L_{2-20}$ |
| COMPOUND 8283 | $L_{1-134}$ | $L_{2-65}$ |
| COMPOUND 8284 | $L_{1-134}$ | $L_{2-109}$ |
| COMPOUND 8285 | $L_{1-135}$ | $L_{2-1}$ |
| COMPOUND 8286 | $L_{1-135}$ | $L_{2-10}$ |
| COMPOUND 8287 | $L_{1-135}$ | $L_{2-15}$ |
| COMPOUND 8288 | $L_{1-135}$ | $L_{2-20}$ |
| COMPOUND 8289 | $L_{1-135}$ | $L_{2-65}$ |
| COMPOUND 8290 | $L_{1-135}$ | $L_{2-109}$ |
| COMPOUND 8291 | $L_{1-136}$ | $L_{2-1}$ |
| COMPOUND 8292 | $L_{1-136}$ | $L_{2-10}$ |
| COMPOUND 8293 | $L_{1-136}$ | $L_{2-15}$ |
| COMPOUND 8294 | $L_{1-136}$ | $L_{2-20}$ |
| COMPOUND 8295 | $L_{1-136}$ | $L_{2-65}$ |
| COMPOUND 8296 | $L_{1-136}$ | $L_{2-109}$ |
| COMPOUND 8297 | $L_{1-137}$ | $L_{2-1}$ |
| COMPOUND 8298 | $L_{1-137}$ | $L_{2-10}$ |
| COMPOUND 8299 | $L_{1-137}$ | $L_{2-15}$ |
| COMPOUND 8300 | $L_{1-137}$ | $L_{2-20}$ |
| COMPOUND 8301 | $L_{1-137}$ | $L_{2-65}$ |
| COMPOUND 8302 | $L_{1-137}$ | $L_{2-109}$ |

-continued

| | | |
|---|---|---|
| COMPOUND 8303 | $L_{1-138}$ | $L_{2-1}$ |
| COMPOUND 8304 | $L_{1-138}$ | $L_{2-10}$ |
| COMPOUND 8305 | $L_{1-138}$ | $L_{2-15}$ |
| COMPOUND 8306 | $L_{1-138}$ | $L_{2-20}$ |
| COMPOUND 8307 | $L_{1-138}$ | $L_{2-65}$ |
| COMPOUND 8308 | $L_{1-138}$ | $L_{2-109}$ |
| COMPOUND 8309 | $L_{1-139}$ | $L_{2-1}$ |
| COMPOUND 8310 | $L_{1-139}$ | $L_{2-10}$ |
| COMPOUND 8311 | $L_{1-139}$ | $L_{2-15}$ |
| COMPOUND 8312 | $L_{1-139}$ | $L_{2-20}$ |
| COMPOUND 8313 | $L_{1-139}$ | $L_{2-65}$ |
| COMPOUND 8314 | $L_{1-139}$ | $L_{2-109}$ |
| COMPOUND 8315 | $L_{1-140}$ | $L_{2-1}$ |
| COMPOUND 8316 | $L_{1-140}$ | $L_{2-10}$ |
| COMPOUND 8317 | $L_{1-140}$ | $L_{2-15}$ |
| COMPOUND 8318 | $L_{1-140}$ | $L_{2-20}$ |
| COMPOUND 8319 | $L_{1-140}$ | $L_{2-65}$ |
| COMPOUND 8320 | $L_{1-140}$ | $L_{2-109}$ |
| COMPOUND 8321 | $L_{1-141}$ | $L_{2-1}$ |
| COMPOUND 8322 | $L_{1-141}$ | $L_{2-10}$ |
| COMPOUND 8323 | $L_{1-141}$ | $L_{2-15}$ |
| COMPOUND 8324 | $L_{1-141}$ | $L_{2-20}$ |
| COMPOUND 8325 | $L_{1-141}$ | $L_{2-65}$ |
| COMPOUND 8326 | $L_{1-141}$ | $L_{2-109}$ |
| COMPOUND 8327 | $L_{1-142}$ | $L_{2-1}$ |
| COMPOUND 8328 | $L_{1-142}$ | $L_{2-10}$ |
| COMPOUND 8329 | $L_{1-142}$ | $L_{2-15}$ |
| COMPOUND 8330 | $L_{1-142}$ | $L_{2-20}$ |
| COMPOUND 8331 | $L_{1-142}$ | $L_{2-65}$ |
| COMPOUND 8332 | $L_{1-142}$ | $L_{2-109}$ |
| COMPOUND 8333 | $L_{1-143}$ | $L_{2-1}$ |
| COMPOUND 8334 | $L_{1-143}$ | $L_{2-10}$ |
| COMPOUND 8335 | $L_{1-143}$ | $L_{2-15}$ |
| COMPOUND 8336 | $L_{1-143}$ | $L_{2-20}$ |
| COMPOUND 8337 | $L_{1-143}$ | $L_{2-65}$ |
| COMPOUND 8338 | $L_{1-143}$ | $L_{2-109}$ |
| COMPOUND 8339 | $L_{1-144}$ | $L_{2-1}$ |
| COMPOUND 8340 | $L_{1-144}$ | $L_{2-10}$ |
| COMPOUND 8341 | $L_{1-144}$ | $L_{2-15}$ |
| COMPOUND 8342 | $L_{1-144}$ | $L_{2-20}$ |
| COMPOUND 8343 | $L_{1-144}$ | $L_{2-65}$ |
| COMPOUND 8344 | $L_{1-144}$ | $L_{2-109}$ |
| COMPOUND 8345 | $L_{1-145}$ | $L_{2-1}$ |
| COMPOUND 8346 | $L_{1-145}$ | $L_{2-10}$ |
| COMPOUND 8347 | $L_{1-145}$ | $L_{2-15}$ |
| COMPOUND 8348 | $L_{1-145}$ | $L_{2-20}$ |
| COMPOUND 8349 | $L_{1-145}$ | $L_{2-65}$ |
| COMPOUND 8350 | $L_{1-145}$ | $L_{2-109}$ |
| COMPOUND 8351 | $L_{1-146}$ | $L_{2-1}$ |
| COMPOUND 8352 | $L_{1-146}$ | $L_{2-10}$ |
| COMPOUND 8353 | $L_{1-146}$ | $L_{2-15}$ |
| COMPOUND 8354 | $L_{1-146}$ | $L_{2-20}$ |
| COMPOUND 8355 | $L_{1-146}$ | $L_{2-65}$ |
| COMPOUND 8356 | $L_{1-146}$ | $L_{2-109}$ |
| COMPOUND 8357 | $L_{1-147}$ | $L_{2-1}$ |
| COMPOUND 8358 | $L_{1-147}$ | $L_{2-10}$ |
| COMPOUND 8359 | $L_{1-147}$ | $L_{2-15}$ |
| COMPOUND 8360 | $L_{1-147}$ | $L_{2-20}$ |
| COMPOUND 8361 | $L_{1-147}$ | $L_{2-65}$ |
| COMPOUND 8362 | $L_{1-147}$ | $L_{2-109}$ |
| COMPOUND 8363 | $L_{1-148}$ | $L_{2-1}$ |
| COMPOUND 8364 | $L_{1-148}$ | $L_{2-10}$ |
| COMPOUND 8365 | $L_{1-148}$ | $L_{2-15}$ |
| COMPOUND 8366 | $L_{1-148}$ | $L_{2-20}$ |
| COMPOUND 8367 | $L_{1-148}$ | $L_{2-65}$ |
| COMPOUND 8368 | $L_{1-148}$ | $L_{2-109}$ |
| COMPOUND 8369 | $L_{1-149}$ | $L_{2-1}$ |
| COMPOUND 8370 | $L_{1-149}$ | $L_{2-10}$ |
| COMPOUND 8371 | $L_{1-149}$ | $L_{2-15}$ |
| COMPOUND 8372 | $L_{1-149}$ | $L_{2-20}$ |
| COMPOUND 8373 | $L_{1-149}$ | $L_{2-65}$ |
| COMPOUND 8374 | $L_{1-149}$ | $L_{2-109}$ |
| COMPOUND 8375 | $L_{1-150}$ | $L_{2-1}$ |
| COMPOUND 8376 | $L_{1-150}$ | $L_{2-10}$ |
| COMPOUND 8377 | $L_{1-150}$ | $L_{2-15}$ |
| COMPOUND 8378 | $L_{1-150}$ | $L_{2-20}$ |
| COMPOUND 8379 | $L_{1-150}$ | $L_{2-65}$ |
| COMPOUND 8380 | $L_{1-150}$ | $L_{2-109}$ |
| COMPOUND 8381 | $L_{1-151}$ | $L_{2-1}$ |

| | | |
|---|---|---|
| COMPOUND 8382 | $L_{1-151}$ | $L_{2-10}$ |
| COMPOUND 8383 | $L_{1-151}$ | $L_{2-15}$ |
| COMPOUND 8384 | $L_{1-151}$ | $L_{2-20}$ |
| COMPOUND 8385 | $L_{1-151}$ | $L_{2-65}$ |
| COMPOUND 8386 | $L_{1-151}$ | $L_{2-109}$ |
| COMPOUND 8387 | $L_{1-152}$ | $L_{2-1}$ |
| COMPOUND 8388 | $L_{1-152}$ | $L_{2-10}$ |
| COMPOUND 8389 | $L_{1-152}$ | $L_{2-15}$ |
| COMPOUND 8390 | $L_{1-152}$ | $L_{2-20}$ |
| COMPOUND 8391 | $L_{1-152}$ | $L_{2-65}$ |
| COMPOUND 8392 | $L_{1-152}$ | $L_{2-109}$ |
| COMPOUND 8393 | $L_{1-153}$ | $L_{2-1}$ |
| COMPOUND 8394 | $L_{1-153}$ | $L_{2-10}$ |
| COMPOUND 8395 | $L_{1-153}$ | $L_{2-15}$ |
| COMPOUND 8396 | $L_{1-153}$ | $L_{2-20}$ |
| COMPOUND 8397 | $L_{1-153}$ | $L_{2-65}$ |
| COMPOUND 8398 | $L_{1-153}$ | $L_{2-109}$ |
| COMPOUND 8399 | $L_{1-154}$ | $L_{2-1}$ |
| COMPOUND 8400 | $L_{1-154}$ | $L_{2-10}$ |
| COMPOUND 8401 | $L_{1-154}$ | $L_{2-15}$ |
| COMPOUND 8402 | $L_{1-154}$ | $L_{2-20}$ |
| COMPOUND 8403 | $L_{1-154}$ | $L_{2-65}$ |
| COMPOUND 8404 | $L_{1-154}$ | $L_{2-109}$ |
| COMPOUND 8405 | $L_{1-155}$ | $L_{2-1}$ |
| COMPOUND 8406 | $L_{1-155}$ | $L_{2-10}$ |
| COMPOUND 8407 | $L_{1-155}$ | $L_{2-15}$ |
| COMPOUND 8408 | $L_{1-155}$ | $L_{2-20}$ |
| COMPOUND 8409 | $L_{1-155}$ | $L_{2-65}$ |
| COMPOUND 8410 | $L_{1-155}$ | $L_{2-109}$ |
| COMPOUND 8411 | $L_{1-156}$ | $L_{2-1}$ |
| COMPOUND 8412 | $L_{1-156}$ | $L_{2-10}$ |
| COMPOUND 8413 | $L_{1-156}$ | $L_{2-15}$ |
| COMPOUND 8414 | $L_{1-156}$ | $L_{2-20}$ |
| COMPOUND 8415 | $L_{1-156}$ | $L_{2-65}$ |
| COMPOUND 8416 | $L_{1-156}$ | $L_{2-109}$ |
| COMPOUND 8417 | $L_{1-157}$ | $L_{2-1}$ |
| COMPOUND 8418 | $L_{1-157}$ | $L_{2-10}$ |
| COMPOUND 8419 | $L_{1-157}$ | $L_{2-15}$ |
| COMPOUND 8420 | $L_{1-157}$ | $L_{2-20}$ |
| COMPOUND 8421 | $L_{1-157}$ | $L_{2-65}$ |
| COMPOUND 8422 | $L_{1-157}$ | $L_{2-109}$ |
| COMPOUND 8423 | $L_{1-158}$ | $L_{2-1}$ |
| COMPOUND 8424 | $L_{1-158}$ | $L_{2-10}$ |
| COMPOUND 8425 | $L_{1-158}$ | $L_{2-15}$ |
| COMPOUND 8426 | $L_{1-158}$ | $L_{2-20}$ |
| COMPOUND 8427 | $L_{1-158}$ | $L_{2-65}$ |
| COMPOUND 8428 | $L_{1-158}$ | $L_{2-109}$ |
| COMPOUND 8429 | $L_{1-159}$ | $L_{2-1}$ |
| COMPOUND 8430 | $L_{1-159}$ | $L_{2-10}$ |
| COMPOUND 8431 | $L_{1-159}$ | $L_{2-15}$ |
| COMPOUND 8432 | $L_{1-159}$ | $L_{2-20}$ |
| COMPOUND 8433 | $L_{1-159}$ | $L_{2-65}$ |
| COMPOUND 8434 | $L_{1-159}$ | $L_{2-109}$ |
| COMPOUND 8435 | $L_{1-160}$ | $L_{2-1}$ |
| COMPOUND 8436 | $L_{1-160}$ | $L_{2-10}$ |
| COMPOUND 8437 | $L_{1-160}$ | $L_{2-15}$ |
| COMPOUND 8438 | $L_{1-160}$ | $L_{2-20}$ |
| COMPOUND 8439 | $L_{1-160}$ | $L_{2-65}$ |
| COMPOUND 8440 | $L_{1-160}$ | $L_{2-109}$ |
| COMPOUND 8441 | $L_{1-161}$ | $L_{2-1}$ |
| COMPOUND 8442 | $L_{1-161}$ | $L_{2-10}$ |
| COMPOUND 8443 | $L_{1-161}$ | $L_{2-15}$ |
| COMPOUND 8444 | $L_{1-161}$ | $L_{2-20}$ |
| COMPOUND 8445 | $L_{1-161}$ | $L_{2-65}$ |
| COMPOUND 8446 | $L_{1-161}$ | $L_{2-109}$ |
| COMPOUND 8447 | $L_{1-162}$ | $L_{2-1}$ |
| COMPOUND 8448 | $L_{1-162}$ | $L_{2-10}$ |
| COMPOUND 8449 | $L_{1-162}$ | $L_{2-15}$ |
| COMPOUND 8450 | $L_{1-162}$ | $L_{2-20}$ |
| COMPOUND 8451 | $L_{1-162}$ | $L_{2-65}$ |
| COMPOUND 8452 | $L_{1-162}$ | $L_{2-109}$ |
| COMPOUND 8453 | $L_{1-163}$ | $L_{2-1}$ |
| COMPOUND 8454 | $L_{1-163}$ | $L_{2-10}$ |
| COMPOUND 8455 | $L_{1-163}$ | $L_{2-15}$ |
| COMPOUND 8456 | $L_{1-163}$ | $L_{2-20}$ |
| COMPOUND 8457 | $L_{1-163}$ | $L_{2-65}$ |
| COMPOUND 8458 | $L_{1-163}$ | $L_{2-109}$ |
| COMPOUND 8459 | $L_{1-164}$ | $L_{2-1}$ |
| COMPOUND 8460 | $L_{1-164}$ | $L_{2-10}$ |

| | | |
|---|---|---|
| COMPOUND 8461 | $L_{1-164}$ | $L_{2-15}$ |
| COMPOUND 8462 | $L_{1-164}$ | $L_{2-20}$ |
| COMPOUND 8463 | $L_{1-164}$ | $L_{2-65}$ |
| COMPOUND 8464 | $L_{1-164}$ | $L_{2-109}$ |
| COMPOUND 8465 | $L_{1-165}$ | $L_{2-1}$ |
| COMPOUND 8466 | $L_{1-165}$ | $L_{2-10}$ |
| COMPOUND 8467 | $L_{1-165}$ | $L_{2-15}$ |
| COMPOUND 8468 | $L_{1-165}$ | $L_{2-20}$ |
| COMPOUND 8469 | $L_{1-165}$ | $L_{2-65}$ |
| COMPOUND 8470 | $L_{1-165}$ | $L_{2-109}$ |
| COMPOUND 8471 | $L_{1-166}$ | $L_{2-1}$ |
| COMPOUND 8472 | $L_{1-166}$ | $L_{2-10}$ |
| COMPOUND 8473 | $L_{1-166}$ | $L_{2-15}$ |
| COMPOUND 8474 | $L_{1-166}$ | $L_{2-20}$ |
| COMPOUND 8475 | $L_{1-166}$ | $L_{2-65}$ |
| COMPOUND 8476 | $L_{1-166}$ | $L_{2-109}$ |
| COMPOUND 8477 | $L_{1-167}$ | $L_{2-1}$ |
| COMPOUND 8478 | $L_{1-167}$ | $L_{2-10}$ |
| COMPOUND 8479 | $L_{1-167}$ | $L_{2-15}$ |
| COMPOUND 8480 | $L_{1-167}$ | $L_{2-20}$ |
| COMPOUND 8481 | $L_{1-167}$ | $L_{2-65}$ |
| COMPOUND 8482 | $L_{1-167}$ | $L_{2-109}$ |
| COMPOUND 8483 | $L_{1-168}$ | $L_{2-1}$ |
| COMPOUND 8484 | $L_{1-168}$ | $L_{2-10}$ |
| COMPOUND 8485 | $L_{1-168}$ | $L_{2-15}$ |
| COMPOUND 8486 | $L_{1-168}$ | $L_{2-20}$ |
| COMPOUND 8487 | $L_{1-168}$ | $L_{2-65}$ |
| COMPOUND 8488 | $L_{1-168}$ | $L_{2-109}$ |
| COMPOUND 8489 | $L_{1-169}$ | $L_{2-1}$ |
| COMPOUND 8490 | $L_{1-169}$ | $L_{2-10}$ |
| COMPOUND 8491 | $L_{1-169}$ | $L_{2-15}$ |
| COMPOUND 8492 | $L_{1-169}$ | $L_{2-20}$ |
| COMPOUND 8493 | $L_{1-169}$ | $L_{2-65}$ |
| COMPOUND 8494 | $L_{1-169}$ | $L_{2-109}$ |
| COMPOUND 8495 | $L_{1-170}$ | $L_{2-1}$ |
| COMPOUND 8496 | $L_{1-170}$ | $L_{2-10}$ |
| COMPOUND 8497 | $L_{1-170}$ | $L_{2-15}$ |
| COMPOUND 8498 | $L_{1-170}$ | $L_{2-20}$ |
| COMPOUND 8499 | $L_{1-170}$ | $L_{2-65}$ |
| COMPOUND 8500 | $L_{1-170}$ | $L_{2-109}$ |
| COMPOUND 8501 | $L_{1-171}$ | $L_{2-1}$ |
| COMPOUND 8502 | $L_{1-171}$ | $L_{2-10}$ |
| COMPOUND 8503 | $L_{1-171}$ | $L_{2-15}$ |
| COMPOUND 8504 | $L_{1-171}$ | $L_{2-20}$ |
| COMPOUND 8505 | $L_{1-171}$ | $L_{2-65}$ |
| COMPOUND 8506 | $L_{1-171}$ | $L_{2-109}$ |
| COMPOUND 8507 | $L_{1-172}$ | $L_{2-1}$ |
| COMPOUND 8508 | $L_{1-172}$ | $L_{2-10}$ |
| COMPOUND 8509 | $L_{1-172}$ | $L_{2-15}$ |
| COMPOUND 8510 | $L_{1-172}$ | $L_{2-20}$ |
| COMPOUND 8511 | $L_{1-172}$ | $L_{2-65}$ |
| COMPOUND 8512 | $L_{1-172}$ | $L_{2-109}$ |
| COMPOUND 8513 | $L_{1-173}$ | $L_{2-1}$ |
| COMPOUND 8514 | $L_{1-173}$ | $L_{2-10}$ |
| COMPOUND 8515 | $L_{1-173}$ | $L_{2-15}$ |
| COMPOUND 8516 | $L_{1-173}$ | $L_{2-20}$ |
| COMPOUND 8517 | $L_{1-173}$ | $L_{2-65}$ |
| COMPOUND 8518 | $L_{1-173}$ | $L_{2-109}$ |
| COMPOUND 8519 | $L_{1-174}$ | $L_{2-1}$ |
| COMPOUND 8520 | $L_{1-174}$ | $L_{2-10}$ |
| COMPOUND 8521 | $L_{1-174}$ | $L_{2-15}$ |
| COMPOUND 8522 | $L_{1-174}$ | $L_{2-20}$ |
| COMPOUND 8523 | $L_{1-174}$ | $L_{2-65}$ |
| COMPOUND 8524 | $L_{1-174}$ | $L_{2-109}$ |
| COMPOUND 8525 | $L_{1-175}$ | $L_{2-1}$ |
| COMPOUND 8526 | $L_{1-175}$ | $L_{2-10}$ |
| COMPOUND 8527 | $L_{1-175}$ | $L_{2-15}$ |
| COMPOUND 8528 | $L_{1-175}$ | $L_{2-20}$ |
| COMPOUND 8529 | $L_{1-175}$ | $L_{2-65}$ |
| COMPOUND 8530 | $L_{1-175}$ | $L_{2-109}$ |
| COMPOUND 8531 | $L_{1-176}$ | $L_{2-1}$ |
| COMPOUND 8532 | $L_{1-176}$ | $L_{2-10}$ |
| COMPOUND 8533 | $L_{1-176}$ | $L_{2-15}$ |
| COMPOUND 8534 | $L_{1-176}$ | $L_{2-20}$ |
| COMPOUND 8535 | $L_{1-176}$ | $L_{2-65}$ |
| COMPOUND 8536 | $L_{1-176}$ | $L_{2-109}$ |
| COMPOUND 8537 | $L_{1-177}$ | $L_{2-1}$ |
| COMPOUND 8538 | $L_{1-177}$ | $L_{2-10}$ |
| COMPOUND 8539 | $L_{1-177}$ | $L_{2-15}$ |

-continued

| | | |
|---|---|---|
| COMPOUND 8540 | $L_{1-177}$ | $L_{2-20}$ |
| COMPOUND 8541 | $L_{1-177}$ | $L_{2-65}$ |
| COMPOUND 8542 | $L_{1-177}$ | $L_{2-109}$ |
| COMPOUND 8543 | $L_{1-178}$ | $L_{2-1}$ |
| COMPOUND 8544 | $L_{1-178}$ | $L_{2-10}$ |
| COMPOUND 8545 | $L_{1-178}$ | $L_{2-15}$ |
| COMPOUND 8546 | $L_{1-178}$ | $L_{2-20}$ |
| COMPOUND 8547 | $L_{1-178}$ | $L_{2-65}$ |
| COMPOUND 8548 | $L_{1-178}$ | $L_{2-109}$ |
| COMPOUND 8549 | $L_{1-179}$ | $L_{2-1}$ |
| COMPOUND 8550 | $L_{1-179}$ | $L_{2-10}$ |
| COMPOUND 8551 | $L_{1-179}$ | $L_{2-15}$ |
| COMPOUND 8552 | $L_{1-179}$ | $L_{2-20}$ |
| COMPOUND 8553 | $L_{1-179}$ | $L_{2-65}$ |
| COMPOUND 8554 | $L_{1-179}$ | $L_{2-109}$ |
| COMPOUND 8555 | $L_{1-180}$ | $L_{2-1}$ |
| COMPOUND 8556 | $L_{1-180}$ | $L_{2-10}$ |
| COMPOUND 8557 | $L_{1-180}$ | $L_{2-15}$ |
| COMPOUND 8558 | $L_{1-180}$ | $L_{2-20}$ |
| COMPOUND 8559 | $L_{1-180}$ | $L_{2-65}$ |
| COMPOUND 8560 | $L_{1-180}$ | $L_{2-109}$ |
| COMPOUND 8561 | $L_{1-181}$ | $L_{2-1}$ |
| COMPOUND 8562 | $L_{1-181}$ | $L_{2-10}$ |
| COMPOUND 8563 | $L_{1-181}$ | $L_{2-15}$ |
| COMPOUND 8564 | $L_{1-181}$ | $L_{2-20}$ |
| COMPOUND 8565 | $L_{1-181}$ | $L_{2-65}$ |
| COMPOUND 8566 | $L_{1-181}$ | $L_{2-109}$ |
| COMPOUND 8567 | $L_{1-182}$ | $L_{2-1}$ |
| COMPOUND 8568 | $L_{1-182}$ | $L_{2-10}$ |
| COMPOUND 8569 | $L_{1-182}$ | $L_{2-15}$ |
| COMPOUND 8570 | $L_{1-182}$ | $L_{2-20}$ |
| COMPOUND 8571 | $L_{1-182}$ | $L_{2-65}$ |
| COMPOUND 8572 | $L_{1-182}$ | $L_{2-109}$ |
| COMPOUND 8573 | $L_{1-183}$ | $L_{2-1}$ |
| COMPOUND 8574 | $L_{1-183}$ | $L_{2-10}$ |
| COMPOUND 8575 | $L_{1-183}$ | $L_{2-15}$ |
| COMPOUND 8576 | $L_{1-183}$ | $L_{2-20}$ |
| COMPOUND 8577 | $L_{1-183}$ | $L_{2-65}$ |
| COMPOUND 8578 | $L_{1-183}$ | $L_{2-109}$ |
| COMPOUND 8579 | $L_{1-184}$ | $L_{2-1}$ |
| COMPOUND 8580 | $L_{1-184}$ | $L_{2-10}$ |
| COMPOUND 8581 | $L_{1-184}$ | $L_{2-15}$ |
| COMPOUND 8582 | $L_{1-184}$ | $L_{2-20}$ |
| COMPOUND 8583 | $L_{1-184}$ | $L_{2-65}$ |
| COMPOUND 8584 | $L_{1-184}$ | $L_{2-109}$ |
| COMPOUND 8585 | $L_{1-185}$ | $L_{2-1}$ |
| COMPOUND 8586 | $L_{1-185}$ | $L_{2-10}$ |
| COMPOUND 8587 | $L_{1-185}$ | $L_{2-15}$ |
| COMPOUND 8588 | $L_{1-185}$ | $L_{2-20}$ |
| COMPOUND 8589 | $L_{1-185}$ | $L_{2-65}$ |
| COMPOUND 8590 | $L_{1-185}$ | $L_{2-109}$ |
| COMPOUND 8591 | $L_{1-186}$ | $L_{2-1}$ |
| COMPOUND 8592 | $L_{1-186}$ | $L_{2-10}$ |
| COMPOUND 8593 | $L_{1-186}$ | $L_{2-15}$ |
| COMPOUND 8594 | $L_{1-186}$ | $L_{2-20}$ |
| COMPOUND 8595 | $L_{1-186}$ | $L_{2-65}$ |
| COMPOUND 8596 | $L_{1-186}$ | $L_{2-109}$ |
| COMPOUND 8597 | $L_{1-187}$ | $L_{2-1}$ |
| COMPOUND 8598 | $L_{1-187}$ | $L_{2-10}$ |
| COMPOUND 8599 | $L_{1-187}$ | $L_{2-15}$ |
| COMPOUND 8600 | $L_{1-187}$ | $L_{2-20}$ |
| COMPOUND 8601 | $L_{1-187}$ | $L_{2-65}$ |
| COMPOUND 8602 | $L_{1-187}$ | $L_{2-109}$ |
| COMPOUND 8603 | $L_{1-188}$ | $L_{2-1}$ |
| COMPOUND 8604 | $L_{1-188}$ | $L_{2-10}$ |
| COMPOUND 8605 | $L_{1-188}$ | $L_{2-15}$ |
| COMPOUND 8606 | $L_{1-188}$ | $L_{2-20}$ |
| COMPOUND 8607 | $L_{1-188}$ | $L_{2-65}$ |
| COMPOUND 8608 | $L_{1-188}$ | $L_{2-109}$ |
| COMPOUND 8609 | $L_{1-189}$ | $L_{2-1}$ |
| COMPOUND 8610 | $L_{1-189}$ | $L_{2-10}$ |
| COMPOUND 8611 | $L_{1-189}$ | $L_{2-15}$ |
| COMPOUND 8612 | $L_{1-189}$ | $L_{2-20}$ |
| COMPOUND 8613 | $L_{1-189}$ | $L_{2-65}$ |
| COMPOUND 8614 | $L_{1-189}$ | $L_{2-109}$ |
| COMPOUND 8615 | $L_{1-190}$ | $L_{2-1}$ |
| COMPOUND 8616 | $L_{1-190}$ | $L_{2-10}$ |
| COMPOUND 8617 | $L_{1-190}$ | $L_{2-15}$ |
| COMPOUND 8618 | $L_{1-190}$ | $L_{2-20}$ |

-continued

| | | |
|---|---|---|
| COMPOUND 8619 | $L_{1-190}$ | $L_{2-65}$ |
| COMPOUND 8620 | $L_{1-190}$ | $L_{2-109}$ |
| COMPOUND 8621 | $L_{1-191}$ | $L_{2-1}$ |
| COMPOUND 8622 | $L_{1-191}$ | $L_{2-10}$ |
| COMPOUND 8623 | $L_{1-191}$ | $L_{2-15}$ |
| COMPOUND 8624 | $L_{1-191}$ | $L_{2-20}$ |
| COMPOUND 8625 | $L_{1-191}$ | $L_{2-65}$ |
| COMPOUND 8626 | $L_{1-191}$ | $L_{2-109}$ |
| COMPOUND 8627 | $L_{1-192}$ | $L_{2-1}$ |
| COMPOUND 8628 | $L_{1-192}$ | $L_{2-10}$ |
| COMPOUND 8629 | $L_{1-192}$ | $L_{2-15}$ |
| COMPOUND 8630 | $L_{1-192}$ | $L_{2-20}$ |
| COMPOUND 8631 | $L_{1-192}$ | $L_{2-65}$ |
| COMPOUND 8632 | $L_{1-192}$ | $L_{2-109}$ |
| COMPOUND 8633 | $L_{1-193}$ | $L_{2-1}$ |
| COMPOUND 8634 | $L_{1-193}$ | $L_{2-10}$ |
| COMPOUND 8635 | $L_{1-193}$ | $L_{2-15}$ |
| COMPOUND 8636 | $L_{1-193}$ | $L_{2-20}$ |
| COMPOUND 8637 | $L_{1-193}$ | $L_{2-65}$ |
| COMPOUND 8638 | $L_{1-193}$ | $L_{2-109}$ |
| COMPOUND 8639 | $L_{1-194}$ | $L_{2-1}$ |
| COMPOUND 8640 | $L_{1-194}$ | $L_{2-10}$ |
| COMPOUND 8641 | $L_{1-194}$ | $L_{2-15}$ |
| COMPOUND 8642 | $L_{1-194}$ | $L_{2-20}$ |
| COMPOUND 8643 | $L_{1-194}$ | $L_{2-65}$ |
| COMPOUND 8644 | $L_{1-194}$ | $L_{2-109}$ |
| COMPOUND 8645 | $L_{1-195}$ | $L_{2-1}$ |
| COMPOUND 8646 | $L_{1-195}$ | $L_{2-10}$ |
| COMPOUND 8647 | $L_{1-195}$ | $L_{2-15}$ |
| COMPOUND 8648 | $L_{1-195}$ | $L_{2-20}$ |
| COMPOUND 8649 | $L_{1-195}$ | $L_{2-65}$ |
| COMPOUND 8650 | $L_{1-195}$ | $L_{2-109}$ |
| COMPOUND 8651 | $L_{1-196}$ | $L_{2-1}$ |
| COMPOUND 8652 | $L_{1-196}$ | $L_{2-10}$ |
| COMPOUND 8653 | $L_{1-196}$ | $L_{2-15}$ |
| COMPOUND 8654 | $L_{1-196}$ | $L_{2-20}$ |
| COMPOUND 8655 | $L_{1-196}$ | $L_{2-65}$ |
| COMPOUND 8656 | $L_{1-196}$ | $L_{2-109}$ |
| COMPOUND 8657 | $L_{1-197}$ | $L_{2-1}$ |
| COMPOUND 8658 | $L_{1-197}$ | $L_{2-10}$ |
| COMPOUND 8659 | $L_{1-197}$ | $L_{2-15}$ |
| COMPOUND 8660 | $L_{1-197}$ | $L_{2-20}$ |
| COMPOUND 8661 | $L_{1-197}$ | $L_{2-65}$ |
| COMPOUND 8662 | $L_{1-197}$ | $L_{2-109}$ |
| COMPOUND 8663 | $L_{1-198}$ | $L_{2-1}$ |
| COMPOUND 8664 | $L_{1-198}$ | $L_{2-10}$ |
| COMPOUND 8665 | $L_{1-198}$ | $L_{2-15}$ |
| COMPOUND 8666 | $L_{1-198}$ | $L_{2-20}$ |
| COMPOUND 8667 | $L_{1-198}$ | $L_{2-65}$ |
| COMPOUND 8668 | $L_{1-198}$ | $L_{2-109}$ |
| COMPOUND 8669 | $L_{1-209}$ | $L_{2-1}$ |
| COMPOUND 8670 | $L_{1-209}$ | $L_{2-10}$ |
| COMPOUND 8671 | $L_{1-209}$ | $L_{2-15}$ |
| COMPOUND 8672 | $L_{1-209}$ | $L_{2-20}$ |
| COMPOUND 8673 | $L_{1-209}$ | $L_{2-65}$ |
| COMPOUND 8674 | $L_{1-209}$ | $L_{2-109}$ |
| COMPOUND 8675 | $L_{1-210}$ | $L_{2-1}$ |
| COMPOUND 8676 | $L_{1-210}$ | $L_{2-10}$ |
| COMPOUND 8677 | $L_{1-210}$ | $L_{2-15}$ |
| COMPOUND 8678 | $L_{1-210}$ | $L_{2-20}$ |
| COMPOUND 8679 | $L_{1-210}$ | $L_{2-65}$ |
| COMPOUND 8680 | $L_{1-210}$ | $L_{2-109}$ |
| COMPOUND 8681 | $L_{1-211}$ | $L_{2-1}$ |
| COMPOUND 8682 | $L_{1-211}$ | $L_{2-10}$ |
| COMPOUND 8683 | $L_{1-211}$ | $L_{2-15}$ |
| COMPOUND 8684 | $L_{1-211}$ | $L_{2-20}$ |
| COMPOUND 8685 | $L_{1-211}$ | $L_{2-65}$ |
| COMPOUND 8686 | $L_{1-211}$ | $L_{2-109}$ |
| COMPOUND 8687 | $L_{1-212}$ | $L_{2-1}$ |
| COMPOUND 8688 | $L_{1-212}$ | $L_{2-10}$ |
| COMPOUND 8689 | $L_{1-212}$ | $L_{2-15}$ |
| COMPOUND 8690 | $L_{1-212}$ | $L_{2-20}$ |
| COMPOUND 8691 | $L_{1-212}$ | $L_{2-65}$ |
| COMPOUND 8692 | $L_{1-212}$ | $L_{2-109}$ |
| COMPOUND 8693 | $L_{1-213}$ | $L_{2-1}$ |
| COMPOUND 8694 | $L_{1-213}$ | $L_{2-10}$ |
| COMPOUND 8695 | $L_{1-213}$ | $L_{2-15}$ |
| COMPOUND 8696 | $L_{1-213}$ | $L_{2-20}$ |
| COMPOUND 8697 | $L_{1-213}$ | $L_{2-65}$ |

-continued

| | | |
|---|---|---|
| COMPOUND 8698 | $L_{1-213}$ | $L_{2-109}$ |
| COMPOUND 8699 | $L_{1-214}$ | $L_{2-1}$ |
| COMPOUND 8700 | $L_{1-214}$ | $L_{2-10}$ |
| COMPOUND 8701 | $L_{1-214}$ | $L_{2-15}$ |
| COMPOUND 8702 | $L_{1-214}$ | $L_{2-20}$ |
| COMPOUND 8703 | $L_{1-214}$ | $L_{2-65}$ |
| COMPOUND 8704 | $L_{1-214}$ | $L_{2-109}$ |
| COMPOUND 8705 | $L_{1-215}$ | $L_{2-1}$ |
| COMPOUND 8706 | $L_{1-215}$ | $L_{2-10}$ |
| COMPOUND 8707 | $L_{1-215}$ | $L_{2-15}$ |
| COMPOUND 8708 | $L_{1-215}$ | $L_{2-20}$ |
| COMPOUND 8709 | $L_{1-215}$ | $L_{2-65}$ |
| COMPOUND 8710 | $L_{1-215}$ | $L_{2-109}$ |
| COMPOUND 8711 | $L_{1-216}$ | $L_{2-1}$ |
| COMPOUND 8712 | $L_{1-216}$ | $L_{2-10}$ |
| COMPOUND 8713 | $L_{1-216}$ | $L_{2-15}$ |
| COMPOUND 8714 | $L_{1-216}$ | $L_{2-20}$ |
| COMPOUND 8715 | $L_{1-216}$ | $L_{2-65}$ |
| COMPOUND 8716 | $L_{1-216}$ | $L_{2-109}$ |
| COMPOUND 8717 | $L_{1-217}$ | $L_{2-1}$ |
| COMPOUND 8718 | $L_{1-217}$ | $L_{2-10}$ |
| COMPOUND 8719 | $L_{1-217}$ | $L_{2-15}$ |
| COMPOUND 8720 | $L_{1-217}$ | $L_{2-20}$ |
| COMPOUND 8721 | $L_{1-217}$ | $L_{2-65}$ |
| COMPOUND 8722 | $L_{1-217}$ | $L_{2-109}$ |
| COMPOUND 8723 | $L_{1-218}$ | $L_{2-1}$ |
| COMPOUND 8724 | $L_{1-218}$ | $L_{2-10}$ |
| COMPOUND 8725 | $L_{1-218}$ | $L_{2-15}$ |
| COMPOUND 8726 | $L_{1-218}$ | $L_{2-20}$ |
| COMPOUND 8727 | $L_{1-218}$ | $L_{2-65}$ |
| COMPOUND 8728 | $L_{1-218}$ | $L_{2-109}$ |
| COMPOUND 8729 | $L_{1-219}$ | $L_{2-1}$ |
| COMPOUND 8730 | $L_{1-219}$ | $L_{2-10}$ |
| COMPOUND 8731 | $L_{1-219}$ | $L_{2-15}$ |
| COMPOUND 8732 | $L_{1-219}$ | $L_{2-20}$ |
| COMPOUND 8733 | $L_{1-219}$ | $L_{2-65}$ |
| COMPOUND 8734 | $L_{1-219}$ | $L_{2-109}$ |
| COMPOUND 8735 | $L_{1-220}$ | $L_{2-1}$ |
| COMPOUND 8736 | $L_{1-220}$ | $L_{2-10}$ |
| COMPOUND 8737 | $L_{1-220}$ | $L_{2-15}$ |
| COMPOUND 8738 | $L_{1-220}$ | $L_{2-20}$ |
| COMPOUND 8739 | $L_{1-220}$ | $L_{2-65}$ |
| COMPOUND 8740 | $L_{1-220}$ | $L_{2-109}$ |
| COMPOUND 8741 | $L_{1-221}$ | $L_{2-1}$ |
| COMPOUND 8742 | $L_{1-221}$ | $L_{2-10}$ |
| COMPOUND 8743 | $L_{1-221}$ | $L_{2-15}$ |
| COMPOUND 8744 | $L_{1-221}$ | $L_{2-20}$ |
| COMPOUND 8745 | $L_{1-221}$ | $L_{2-65}$ |
| COMPOUND 8746 | $L_{1-221}$ | $L_{2-109}$ |
| COMPOUND 8747 | $L_{1-222}$ | $L_{2-1}$ |
| COMPOUND 8748 | $L_{1-222}$ | $L_{2-10}$ |
| COMPOUND 8749 | $L_{1-222}$ | $L_{2-15}$ |
| COMPOUND 8750 | $L_{1-222}$ | $L_{2-20}$ |
| COMPOUND 8751 | $L_{1-222}$ | $L_{2-65}$ |
| COMPOUND 8752 | $L_{1-222}$ | $L_{2-109}$ |
| COMPOUND 8753 | $L_{1-223}$ | $L_{2-1}$ |
| COMPOUND 8754 | $L_{1-223}$ | $L_{2-10}$ |
| COMPOUND 8755 | $L_{1-223}$ | $L_{2-15}$ |
| COMPOUND 8756 | $L_{1-223}$ | $L_{2-20}$ |
| COMPOUND 8757 | $L_{1-223}$ | $L_{2-65}$ |
| COMPOUND 8758 | $L_{1-223}$ | $L_{2-109}$ |
| COMPOUND 8759 | $L_{1-224}$ | $L_{2-1}$ |
| COMPOUND 8760 | $L_{1-224}$ | $L_{2-10}$ |
| COMPOUND 8761 | $L_{1-224}$ | $L_{2-15}$ |
| COMPOUND 8762 | $L_{1-224}$ | $L_{2-20}$ |
| COMPOUND 8763 | $L_{1-224}$ | $L_{2-65}$ |
| COMPOUND 8764 | $L_{1-224}$ | $L_{2-109}$ |
| COMPOUND 8765 | $L_{1-225}$ | $L_{2-1}$ |
| COMPOUND 8766 | $L_{1-225}$ | $L_{2-10}$ |
| COMPOUND 8767 | $L_{1-225}$ | $L_{2-15}$ |
| COMPOUND 8768 | $L_{1-225}$ | $L_{2-20}$ |
| COMPOUND 8769 | $L_{1-225}$ | $L_{2-65}$ |
| COMPOUND 8770 | $L_{1-225}$ | $L_{2-109}$ |
| COMPOUND 8771 | $L_{1-226}$ | $L_{2-1}$ |
| COMPOUND 8772 | $L_{1-226}$ | $L_{2-10}$ |
| COMPOUND 8773 | $L_{1-226}$ | $L_{2-15}$ |
| COMPOUND 8774 | $L_{1-226}$ | $L_{2-20}$ |
| COMPOUND 8775 | $L_{1-226}$ | $L_{2-65}$ |
| COMPOUND 8776 | $L_{1-226}$ | $L_{2-109}$ |
| COMPOUND 8777 | $L_{1-227}$ | $L_{2-1}$ |
| COMPOUND 8778 | $L_{1-227}$ | $L_{2-10}$ |
| COMPOUND 8779 | $L_{1-227}$ | $L_{2-15}$ |
| COMPOUND 8780 | $L_{1-227}$ | $L_{2-20}$ |
| COMPOUND 8781 | $L_{1-227}$ | $L_{2-65}$ |
| COMPOUND 8782 | $L_{1-227}$ | $L_{2-109}$ |
| COMPOUND 8783 | $L_{1-228}$ | $L_{2-1}$ |
| COMPOUND 8784 | $L_{1-228}$ | $L_{2-10}$ |
| COMPOUND 8785 | $L_{1-228}$ | $L_{2-15}$ |
| COMPOUND 8786 | $L_{1-228}$ | $L_{2-20}$ |
| COMPOUND 8787 | $L_{1-228}$ | $L_{2-65}$ |
| COMPOUND 8788 | $L_{1-228}$ | $L_{2-109}$ |
| COMPOUND 8789 | $L_{1-229}$ | $L_{2-1}$ |
| COMPOUND 8790 | $L_{1-229}$ | $L_{2-10}$ |
| COMPOUND 8791 | $L_{1-229}$ | $L_{2-15}$ |
| COMPOUND 8792 | $L_{1-229}$ | $L_{2-20}$ |
| COMPOUND 8793 | $L_{1-229}$ | $L_{2-65}$ |
| COMPOUND 8794 | $L_{1-229}$ | $L_{2-109}$ |
| COMPOUND 8795 | $L_{1-230}$ | $L_{2-1}$ |
| COMPOUND 8796 | $L_{1-230}$ | $L_{2-10}$ |
| COMPOUND 8797 | $L_{1-230}$ | $L_{2-15}$ |
| COMPOUND 8798 | $L_{1-230}$ | $L_{2-20}$ |
| COMPOUND 8799 | $L_{1-230}$ | $L_{2-65}$ |
| COMPOUND 8800 | $L_{1-230}$ | $L_{2-109}$ |
| COMPOUND 8801 | $L_{1-231}$ | $L_{2-1}$ |
| COMPOUND 8802 | $L_{1-231}$ | $L_{2-10}$ |
| COMPOUND 8803 | $L_{1-231}$ | $L_{2-15}$ |
| COMPOUND 8804 | $L_{1-231}$ | $L_{2-20}$ |
| COMPOUND 8805 | $L_{1-231}$ | $L_{2-65}$ |
| COMPOUND 8806 | $L_{1-231}$ | $L_{2-109}$ |
| COMPOUND 8807 | $L_{1-232}$ | $L_{2-1}$ |
| COMPOUND 8808 | $L_{1-232}$ | $L_{2-10}$ |
| COMPOUND 8809 | $L_{1-232}$ | $L_{2-15}$ |
| COMPOUND 8810 | $L_{1-232}$ | $L_{2-20}$ |
| COMPOUND 8811 | $L_{1-232}$ | $L_{2-65}$ |
| COMPOUND 8812 | $L_{1-232}$ | $L_{2-109}$ |
| COMPOUND 8813 | $L_{1-233}$ | $L_{2-1}$ |
| COMPOUND 8814 | $L_{1-233}$ | $L_{2-10}$ |
| COMPOUND 8815 | $L_{1-233}$ | $L_{2-15}$ |
| COMPOUND 8816 | $L_{1-233}$ | $L_{2-20}$ |
| COMPOUND 8817 | $L_{1-233}$ | $L_{2-65}$ |
| COMPOUND 8818 | $L_{1-233}$ | $L_{2-109}$ |
| COMPOUND 8819 | $L_{1-234}$ | $L_{2-1}$ |
| COMPOUND 8820 | $L_{1-234}$ | $L_{2-10}$ |
| COMPOUND 8821 | $L_{1-234}$ | $L_{2-15}$ |
| COMPOUND 8822 | $L_{1-234}$ | $L_{2-20}$ |
| COMPOUND 8823 | $L_{1-234}$ | $L_{2-65}$ |
| COMPOUND 8824 | $L_{1-234}$ | $L_{2-109}$ |
| COMPOUND 8825 | $L_{1-235}$ | $L_{2-1}$ |
| COMPOUND 8826 | $L_{1-235}$ | $L_{2-10}$ |
| COMPOUND 8827 | $L_{1-235}$ | $L_{2-15}$ |
| COMPOUND 8828 | $L_{1-235}$ | $L_{2-20}$ |
| COMPOUND 8829 | $L_{1-235}$ | $L_{2-65}$ |
| COMPOUND 8830 | $L_{1-235}$ | $L_{2-109}$ |
| COMPOUND 8831 | $L_{1-236}$ | $L_{2-1}$ |
| COMPOUND 8832 | $L_{1-236}$ | $L_{2-10}$ |
| COMPOUND 8833 | $L_{1-236}$ | $L_{2-15}$ |
| COMPOUND 8834 | $L_{1-236}$ | $L_{2-20}$ |
| COMPOUND 8835 | $L_{1-236}$ | $L_{2-65}$ |
| COMPOUND 8836 | $L_{1-236}$ | $L_{2-109}$ |
| COMPOUND 8837 | $L_{1-237}$ | $L_{2-1}$ |
| COMPOUND 8838 | $L_{1-237}$ | $L_{2-10}$ |
| COMPOUND 8839 | $L_{1-237}$ | $L_{2-15}$ |
| COMPOUND 8840 | $L_{1-237}$ | $L_{2-20}$ |
| COMPOUND 8841 | $L_{1-237}$ | $L_{2-65}$ |
| COMPOUND 8842 | $L_{1-237}$ | $L_{2-109}$ |
| COMPOUND 8843 | $L_{1-238}$ | $L_{2-1}$ |
| COMPOUND 8844 | $L_{1-238}$ | $L_{2-10}$ |
| COMPOUND 8845 | $L_{1-238}$ | $L_{2-15}$ |
| COMPOUND 8846 | $L_{1-238}$ | $L_{2-20}$ |
| COMPOUND 8847 | $L_{1-238}$ | $L_{2-65}$ |
| COMPOUND 8848 | $L_{1-238}$ | $L_{2-109}$ |
| COMPOUND 8849 | $L_{1-239}$ | $L_{2-1}$ |
| COMPOUND 8850 | $L_{1-239}$ | $L_{2-10}$ |
| COMPOUND 8851 | $L_{1-239}$ | $L_{2-15}$ |
| COMPOUND 8852 | $L_{1-239}$ | $L_{2-20}$ |
| COMPOUND 8853 | $L_{1-239}$ | $L_{2-65}$ |
| COMPOUND 8854 | $L_{1-239}$ | $L_{2-109}$ |
| COMPOUND 8855 | $L_{1-240}$ | $L_{2-1}$ |

-continued

| | | |
|---|---|---|
| COMPOUND 8856 | $L_{1-240}$ | $L_{2-10}$ |
| COMPOUND 8857 | $L_{1-240}$ | $L_{2-15}$ |
| COMPOUND 8858 | $L_{1-240}$ | $L_{2-20}$ |
| COMPOUND 8859 | $L_{1-240}$ | $L_{2-65}$ |
| COMPOUND 8860 | $L_{1-240}$ | $L_{2-109}$ |
| COMPOUND 8861 | $L_{1-241}$ | $L_{2-1}$ |
| COMPOUND 8862 | $L_{1-241}$ | $L_{2-10}$ |
| COMPOUND 8863 | $L_{1-241}$ | $L_{2-15}$ |
| COMPOUND 8864 | $L_{1-241}$ | $L_{2-20}$ |
| COMPOUND 8865 | $L_{1-241}$ | $L_{2-65}$ |
| COMPOUND 8866 | $L_{1-241}$ | $L_{2-109}$ |
| COMPOUND 8867 | $L_{1-242}$ | $L_{2-1}$ |
| COMPOUND 8868 | $L_{1-242}$ | $L_{2-10}$ |
| COMPOUND 8869 | $L_{1-242}$ | $L_{2-15}$ |
| COMPOUND 8870 | $L_{1-242}$ | $L_{2-20}$ |
| COMPOUND 8871 | $L_{1-242}$ | $L_{2-65}$ |
| COMPOUND 8872 | $L_{1-242}$ | $L_{2-109}$ |
| COMPOUND 8873 | $L_{1-243}$ | $L_{2-1}$ |
| COMPOUND 8874 | $L_{1-243}$ | $L_{2-10}$ |
| COMPOUND 8875 | $L_{1-243}$ | $L_{2-15}$ |
| COMPOUND 8876 | $L_{1-243}$ | $L_{2-20}$ |
| COMPOUND 8877 | $L_{1-243}$ | $L_{2-65}$ |
| COMPOUND 8878 | $L_{1-243}$ | $L_{2-109}$ |
| COMPOUND 8879 | $L_{1-244}$ | $L_{2-1}$ |
| COMPOUND 8880 | $L_{1-244}$ | $L_{2-10}$ |
| COMPOUND 8881 | $L_{1-244}$ | $L_{2-15}$ |
| COMPOUND 8882 | $L_{1-244}$ | $L_{2-20}$ |
| COMPOUND 8883 | $L_{1-244}$ | $L_{2-65}$ |
| COMPOUND 8884 | $L_{1-244}$ | $L_{2-109}$ |
| COMPOUND 8885 | $L_{1-245}$ | $L_{2-1}$ |
| COMPOUND 8886 | $L_{1-245}$ | $L_{2-10}$ |
| COMPOUND 8887 | $L_{1-245}$ | $L_{2-15}$ |
| COMPOUND 8888 | $L_{1-245}$ | $L_{2-20}$ |
| COMPOUND 8889 | $L_{1-245}$ | $L_{2-65}$ |
| COMPOUND 8890 | $L_{1-245}$ | $L_{2-109}$ |
| COMPOUND 8891 | $L_{1-246}$ | $L_{2-1}$ |
| COMPOUND 8892 | $L_{1-246}$ | $L_{2-10}$ |
| COMPOUND 8893 | $L_{1-246}$ | $L_{2-15}$ |
| COMPOUND 8894 | $L_{1-246}$ | $L_{2-20}$ |
| COMPOUND 8895 | $L_{1-246}$ | $L_{2-65}$ |
| COMPOUND 8896 | $L_{1-246}$ | $L_{2-109}$ |
| COMPOUND 8897 | $L_{1-247}$ | $L_{2-1}$ |
| COMPOUND 8898 | $L_{1-247}$ | $L_{2-10}$ |
| COMPOUND 8899 | $L_{1-247}$ | $L_{2-15}$ |
| COMPOUND 8900 | $L_{1-247}$ | $L_{2-20}$ |
| COMPOUND 8901 | $L_{1-247}$ | $L_{2-65}$ |
| COMPOUND 8902 | $L_{1-247}$ | $L_{2-109}$ |
| COMPOUND 8903 | $L_{1-248}$ | $L_{2-1}$ |
| COMPOUND 8904 | $L_{1-248}$ | $L_{2-10}$ |
| COMPOUND 8905 | $L_{1-248}$ | $L_{2-15}$ |
| COMPOUND 8906 | $L_{1-248}$ | $L_{2-20}$ |
| COMPOUND 8907 | $L_{1-248}$ | $L_{2-65}$ |
| COMPOUND 8908 | $L_{1-248}$ | $L_{2-109}$ |
| COMPOUND 8909 | $L_{1-249}$ | $L_{2-1}$ |
| COMPOUND 8910 | $L_{1-249}$ | $L_{2-10}$ |
| COMPOUND 8911 | $L_{1-249}$ | $L_{2-15}$ |
| COMPOUND 8912 | $L_{1-249}$ | $L_{2-20}$ |
| COMPOUND 8913 | $L_{1-249}$ | $L_{2-65}$ |
| COMPOUND 8914 | $L_{1-249}$ | $L_{2-109}$ |
| COMPOUND 8915 | $L_{1-250}$ | $L_{2-1}$ |
| COMPOUND 8916 | $L_{1-250}$ | $L_{2-10}$ |
| COMPOUND 8917 | $L_{1-250}$ | $L_{2-15}$ |
| COMPOUND 8918 | $L_{1-250}$ | $L_{2-20}$ |
| COMPOUND 8919 | $L_{1-250}$ | $L_{2-65}$ |
| COMPOUND 8920 | $L_{1-250}$ | $L_{2-109}$ |
| COMPOUND 8921 | $L_{1-251}$ | $L_{2-1}$ |
| COMPOUND 8922 | $L_{1-251}$ | $L_{2-10}$ |
| COMPOUND 8923 | $L_{1-251}$ | $L_{2-15}$ |
| COMPOUND 8924 | $L_{1-251}$ | $L_{2-20}$ |
| COMPOUND 8925 | $L_{1-251}$ | $L_{2-65}$ |
| COMPOUND 8926 | $L_{1-251}$ | $L_{2-109}$ |
| COMPOUND 8927 | $L_{1-252}$ | $L_{2-1}$ |
| COMPOUND 8928 | $L_{1-252}$ | $L_{2-10}$ |
| COMPOUND 8929 | $L_{1-252}$ | $L_{2-15}$ |
| COMPOUND 8930 | $L_{1-252}$ | $L_{2-20}$ |
| COMPOUND 8931 | $L_{1-252}$ | $L_{2-65}$ |
| COMPOUND 8932 | $L_{1-252}$ | $L_{2-109}$ |
| COMPOUND 8933 | $L_{1-253}$ | $L_{2-1}$ |
| COMPOUND 8934 | $L_{1-253}$ | $L_{2-10}$ |
| COMPOUND 8935 | $L_{1-253}$ | $L_{2-15}$ |
| COMPOUND 8936 | $L_{1-253}$ | $L_{2-20}$ |
| COMPOUND 8937 | $L_{1-253}$ | $L_{2-65}$ |
| COMPOUND 8938 | $L_{1-253}$ | $L_{2-109}$ |
| COMPOUND 8939 | $L_{1-254}$ | $L_{2-1}$ |
| COMPOUND 8940 | $L_{1-254}$ | $L_{2-10}$ |
| COMPOUND 8941 | $L_{1-254}$ | $L_{2-15}$ |
| COMPOUND 8942 | $L_{1-254}$ | $L_{2-20}$ |
| COMPOUND 8943 | $L_{1-254}$ | $L_{2-65}$ |
| COMPOUND 8944 | $L_{1-254}$ | $L_{2-109}$ |
| COMPOUND 8945 | $L_{1-255}$ | $L_{2-1}$ |
| COMPOUND 8946 | $L_{1-255}$ | $L_{2-10}$ |
| COMPOUND 8947 | $L_{1-255}$ | $L_{2-15}$ |
| COMPOUND 8948 | $L_{1-255}$ | $L_{2-20}$ |
| COMPOUND 8949 | $L_{1-255}$ | $L_{2-65}$ |
| COMPOUND 8950 | $L_{1-255}$ | $L_{2-109}$ |
| COMPOUND 8951 | $L_{1-256}$ | $L_{2-1}$ |
| COMPOUND 8952 | $L_{1-256}$ | $L_{2-10}$ |
| COMPOUND 8953 | $L_{1-256}$ | $L_{2-15}$ |
| COMPOUND 8954 | $L_{1-256}$ | $L_{2-20}$ |
| COMPOUND 8955 | $L_{1-256}$ | $L_{2-65}$ |
| COMPOUND 8956 | $L_{1-256}$ | $L_{2-109}$ |
| COMPOUND 8957 | $L_{1-257}$ | $L_{2-1}$ |
| COMPOUND 8958 | $L_{1-257}$ | $L_{2-10}$ |
| COMPOUND 8959 | $L_{1-257}$ | $L_{2-15}$ |
| COMPOUND 8960 | $L_{1-257}$ | $L_{2-20}$ |
| COMPOUND 8961 | $L_{1-257}$ | $L_{2-65}$ |
| COMPOUND 8962 | $L_{1-257}$ | $L_{2-109}$ |
| COMPOUND 8963 | $L_{1-258}$ | $L_{2-1}$ |
| COMPOUND 8964 | $L_{1-258}$ | $L_{2-10}$ |
| COMPOUND 8965 | $L_{1-258}$ | $L_{2-15}$ |
| COMPOUND 8966 | $L_{1-258}$ | $L_{2-20}$ |
| COMPOUND 8967 | $L_{1-258}$ | $L_{2-65}$ |
| COMPOUND 8968 | $L_{1-258}$ | $L_{2-109}$ |
| COMPOUND 8969 | $L_{1-259}$ | $L_{2-1}$ |
| COMPOUND 8970 | $L_{1-259}$ | $L_{2-10}$ |
| COMPOUND 8971 | $L_{1-259}$ | $L_{2-15}$ |
| COMPOUND 8972 | $L_{1-259}$ | $L_{2-20}$ |
| COMPOUND 8973 | $L_{1-259}$ | $L_{2-65}$ |
| COMPOUND 8974 | $L_{1-259}$ | $L_{2-109}$ |
| COMPOUND 8975 | $L_{1-260}$ | $L_{2-1}$ |
| COMPOUND 8976 | $L_{1-260}$ | $L_{2-10}$ |
| COMPOUND 8977 | $L_{1-260}$ | $L_{2-15}$ |
| COMPOUND 8978 | $L_{1-260}$ | $L_{2-20}$ |
| COMPOUND 8979 | $L_{1-260}$ | $L_{2-65}$ |
| COMPOUND 8980 | $L_{1-260}$ | $L_{2-109}$ |
| COMPOUND 8981 | $L_{1-261}$ | $L_{2-1}$ |
| COMPOUND 8982 | $L_{1-261}$ | $L_{2-10}$ |
| COMPOUND 8983 | $L_{1-261}$ | $L_{2-15}$ |
| COMPOUND 8984 | $L_{1-261}$ | $L_{2-20}$ |
| COMPOUND 8985 | $L_{1-261}$ | $L_{2-65}$ |
| COMPOUND 8986 | $L_{1-261}$ | $L_{2-109}$ |
| COMPOUND 8987 | $L_{1-262}$ | $L_{2-1}$ |
| COMPOUND 8988 | $L_{1-262}$ | $L_{2-10}$ |
| COMPOUND 8989 | $L_{1-262}$ | $L_{2-15}$ |
| COMPOUND 8990 | $L_{1-262}$ | $L_{2-20}$ |
| COMPOUND 8991 | $L_{1-262}$ | $L_{2-65}$ |
| COMPOUND 8992 | $L_{1-262}$ | $L_{2-109}$ |
| COMPOUND 8993 | $L_{1-263}$ | $L_{2-1}$ |
| COMPOUND 8994 | $L_{1-263}$ | $L_{2-10}$ |
| COMPOUND 8995 | $L_{1-263}$ | $L_{2-15}$ |
| COMPOUND 8996 | $L_{1-263}$ | $L_{2-20}$ |
| COMPOUND 8997 | $L_{1-263}$ | $L_{2-65}$ |
| COMPOUND 8998 | $L_{1-263}$ | $L_{2-109}$ |
| COMPOUND 8999 | $L_{1-264}$ | $L_{2-1}$ |
| COMPOUND 9000 | $L_{1-264}$ | $L_{2-10}$ |
| COMPOUND 9001 | $L_{1-264}$ | $L_{2-15}$ |
| COMPOUND 9002 | $L_{1-264}$ | $L_{2-20}$ |
| COMPOUND 9003 | $L_{1-264}$ | $L_{2-65}$ |
| COMPOUND 9004 | $L_{1-264}$ | $L_{2-109}$ |
| COMPOUND 9005 | $L_{1-265}$ | $L_{2-1}$ |
| COMPOUND 9006 | $L_{1-265}$ | $L_{2-10}$ |
| COMPOUND 9007 | $L_{1-265}$ | $L_{2-15}$ |
| COMPOUND 9008 | $L_{1-265}$ | $L_{2-20}$ |
| COMPOUND 9009 | $L_{1-265}$ | $L_{2-65}$ |
| COMPOUND 9010 | $L_{1-265}$ | $L_{2-109}$ |
| COMPOUND 9011 | $L_{1-266}$ | $L_{2-1}$ |
| COMPOUND 9012 | $L_{1-266}$ | $L_{2-10}$ |
| COMPOUND 9013 | $L_{1-266}$ | $L_{2-15}$ |

-continued

| | | |
|---|---|---|
| COMPOUND 9014 | $L_{1-266}$ | $L_{2-20}$ |
| COMPOUND 9015 | $L_{1-266}$ | $L_{2-65}$ |
| COMPOUND 9016 | $L_{1-266}$ | $L_{2-109}$ |
| COMPOUND 9017 | $L_{1-267}$ | $L_{2-1}$ |
| COMPOUND 9018 | $L_{1-267}$ | $L_{2-10}$ |
| COMPOUND 9019 | $L_{1-267}$ | $L_{2-15}$ |
| COMPOUND 9020 | $L_{1-267}$ | $L_{2-20}$ |
| COMPOUND 9021 | $L_{1-267}$ | $L_{2-65}$ |
| COMPOUND 9022 | $L_{1-267}$ | $L_{2-109}$ |
| COMPOUND 9023 | $L_{1-268}$ | $L_{2-1}$ |
| COMPOUND 9024 | $L_{1-268}$ | $L_{2-10}$ |
| COMPOUND 9025 | $L_{1-268}$ | $L_{2-15}$ |
| COMPOUND 9026 | $L_{1-268}$ | $L_{2-20}$ |
| COMPOUND 9027 | $L_{1-268}$ | $L_{2-65}$ |
| COMPOUND 9028 | $L_{1-268}$ | $L_{2-109}$ |
| COMPOUND 9029 | $L_{1-269}$ | $L_{2-1}$ |
| COMPOUND 9030 | $L_{1-269}$ | $L_{2-10}$ |
| COMPOUND 9031 | $L_{1-269}$ | $L_{2-15}$ |
| COMPOUND 9032 | $L_{1-269}$ | $L_{2-20}$ |
| COMPOUND 9033 | $L_{1-269}$ | $L_{2-65}$ |
| COMPOUND 9034 | $L_{1-269}$ | $L_{2-109}$ |
| COMPOUND 9035 | $L_{1-270}$ | $L_{2-1}$ |
| COMPOUND 9036 | $L_{1-270}$ | $L_{2-10}$ |
| COMPOUND 9037 | $L_{1-270}$ | $L_{2-15}$ |
| COMPOUND 9038 | $L_{1-270}$ | $L_{2-20}$ |
| COMPOUND 9039 | $L_{1-270}$ | $L_{2-65}$ |
| COMPOUND 9040 | $L_{1-270}$ | $L_{2-109}$ |
| COMPOUND 9041 | $L_{1-271}$ | $L_{2-1}$ |
| COMPOUND 9042 | $L_{1-271}$ | $L_{2-10}$ |
| COMPOUND 9043 | $L_{1-271}$ | $L_{2-15}$ |
| COMPOUND 9044 | $L_{1-271}$ | $L_{2-20}$ |
| COMPOUND 9045 | $L_{1-271}$ | $L_{2-65}$ |
| COMPOUND 9046 | $L_{1-271}$ | $L_{2-109}$ |
| COMPOUND 9047 | $L_{1-272}$ | $L_{2-1}$ |
| COMPOUND 9048 | $L_{1-272}$ | $L_{2-10}$ |
| COMPOUND 9049 | $L_{1-272}$ | $L_{2-15}$ |
| COMPOUND 9050 | $L_{1-272}$ | $L_{2-20}$ |
| COMPOUND 9051 | $L_{1-272}$ | $L_{2-65}$ |
| COMPOUND 9052 | $L_{1-272}$ | $L_{2-109}$ |
| COMPOUND 9053 | $L_{1-273}$ | $L_{2-1}$ |
| COMPOUND 9054 | $L_{1-273}$ | $L_{2-10}$ |
| COMPOUND 9055 | $L_{1-273}$ | $L_{2-15}$ |
| COMPOUND 9056 | $L_{1-273}$ | $L_{2-20}$ |
| COMPOUND 9057 | $L_{1-273}$ | $L_{2-65}$ |
| COMPOUND 9058 | $L_{1-273}$ | $L_{2-109}$ |
| COMPOUND 9059 | $L_{1-274}$ | $L_{2-1}$ |
| COMPOUND 9060 | $L_{1-274}$ | $L_{2-10}$ |
| COMPOUND 9061 | $L_{1-274}$ | $L_{2-15}$ |
| COMPOUND 9062 | $L_{1-274}$ | $L_{2-20}$ |
| COMPOUND 9063 | $L_{1-274}$ | $L_{2-65}$ |
| COMPOUND 9064 | $L_{1-274}$ | $L_{2-109}$ |
| COMPOUND 9065 | $L_{1-275}$ | $L_{2-1}$ |
| COMPOUND 9066 | $L_{1-275}$ | $L_{2-10}$ |
| COMPOUND 9067 | $L_{1-275}$ | $L_{2-15}$ |
| COMPOUND 9068 | $L_{1-275}$ | $L_{2-20}$ |
| COMPOUND 9069 | $L_{1-275}$ | $L_{2-65}$ |
| COMPOUND 9070 | $L_{1-275}$ | $L_{2-109}$ |
| COMPOUND 9071 | $L_{1-276}$ | $L_{2-1}$ |
| COMPOUND 9072 | $L_{1-276}$ | $L_{2-10}$ |
| COMPOUND 9073 | $L_{1-276}$ | $L_{2-15}$ |
| COMPOUND 9074 | $L_{1-276}$ | $L_{2-20}$ |
| COMPOUND 9075 | $L_{1-276}$ | $L_{2-65}$ |
| COMPOUND 9076 | $L_{1-276}$ | $L_{2-109}$ |
| COMPOUND 9077 | $L_{1-277}$ | $L_{2-1}$ |
| COMPOUND 9078 | $L_{1-277}$ | $L_{2-10}$ |
| COMPOUND 9079 | $L_{1-277}$ | $L_{2-15}$ |
| COMPOUND 9080 | $L_{1-277}$ | $L_{2-20}$ |
| COMPOUND 9081 | $L_{1-277}$ | $L_{2-65}$ |
| COMPOUND 9082 | $L_{1-277}$ | $L_{2-109}$ |
| COMPOUND 9083 | $L_{1-278}$ | $L_{2-1}$ |
| COMPOUND 9084 | $L_{1-278}$ | $L_{2-10}$ |
| COMPOUND 9085 | $L_{1-278}$ | $L_{2-15}$ |
| COMPOUND 9086 | $L_{1-278}$ | $L_{2-20}$ |
| COMPOUND 9087 | $L_{1-278}$ | $L_{2-65}$ |
| COMPOUND 9088 | $L_{1-278}$ | $L_{2-109}$ |
| COMPOUND 9089 | $L_{1-279}$ | $L_{2-1}$ |
| COMPOUND 9090 | $L_{1-279}$ | $L_{2-10}$ |
| COMPOUND 9091 | $L_{1-279}$ | $L_{2-15}$ |
| COMPOUND 9092 | $L_{1-279}$ | $L_{2-20}$ |
| COMPOUND 9093 | $L_{1-279}$ | $L_{2-65}$ |
| COMPOUND 9094 | $L_{1-279}$ | $L_{2-109}$ |
| COMPOUND 9095 | $L_{1-280}$ | $L_{2-1}$ |
| COMPOUND 9096 | $L_{1-280}$ | $L_{2-10}$ |
| COMPOUND 9097 | $L_{1-280}$ | $L_{2-15}$ |
| COMPOUND 9098 | $L_{1-280}$ | $L_{2-20}$ |
| COMPOUND 9099 | $L_{1-280}$ | $L_{2-65}$ |
| COMPOUND 9100 | $L_{1-280}$ | $L_{2-109}$ |
| COMPOUND 9101 | $L_{1-281}$ | $L_{2-1}$ |
| COMPOUND 9102 | $L_{1-281}$ | $L_{2-10}$ |
| COMPOUND 9103 | $L_{1-281}$ | $L_{2-15}$ |
| COMPOUND 9104 | $L_{1-281}$ | $L_{2-20}$ |
| COMPOUND 9105 | $L_{1-281}$ | $L_{2-65}$ |
| COMPOUND 9106 | $L_{1-281}$ | $L_{2-109}$ |
| COMPOUND 9107 | $L_{1-282}$ | $L_{2-1}$ |
| COMPOUND 9108 | $L_{1-282}$ | $L_{2-10}$ |
| COMPOUND 9109 | $L_{1-282}$ | $L_{2-15}$ |
| COMPOUND 9110 | $L_{1-282}$ | $L_{2-20}$ |
| COMPOUND 9111 | $L_{1-282}$ | $L_{2-65}$ |
| COMPOUND 9112 | $L_{1-282}$ | $L_{2-109}$ |
| COMPOUND 9113 | $L_{1-283}$ | $L_{2-1}$ |
| COMPOUND 9114 | $L_{1-283}$ | $L_{2-10}$ |
| COMPOUND 9115 | $L_{1-283}$ | $L_{2-15}$ |
| COMPOUND 9116 | $L_{1-283}$ | $L_{2-20}$ |
| COMPOUND 9117 | $L_{1-283}$ | $L_{2-65}$ |
| COMPOUND 9118 | $L_{1-283}$ | $L_{2-109}$ |
| COMPOUND 9119 | $L_{1-284}$ | $L_{2-1}$ |
| COMPOUND 9120 | $L_{1-284}$ | $L_{2-10}$ |
| COMPOUND 9121 | $L_{1-284}$ | $L_{2-15}$ |
| COMPOUND 9122 | $L_{1-284}$ | $L_{2-20}$ |
| COMPOUND 9123 | $L_{1-284}$ | $L_{2-65}$ |
| COMPOUND 9124 | $L_{1-284}$ | $L_{2-109}$ |
| COMPOUND 9125 | $L_{1-285}$ | $L_{2-1}$ |
| COMPOUND 9126 | $L_{1-285}$ | $L_{2-10}$ |
| COMPOUND 9127 | $L_{1-285}$ | $L_{2-15}$ |
| COMPOUND 9128 | $L_{1-285}$ | $L_{2-20}$ |
| COMPOUND 9129 | $L_{1-285}$ | $L_{2-65}$ |
| COMPOUND 9130 | $L_{1-285}$ | $L_{2-109}$ |
| COMPOUND 9131 | $L_{1-286}$ | $L_{2-1}$ |
| COMPOUND 9132 | $L_{1-286}$ | $L_{2-10}$ |
| COMPOUND 9133 | $L_{1-286}$ | $L_{2-15}$ |
| COMPOUND 9134 | $L_{1-286}$ | $L_{2-20}$ |
| COMPOUND 9135 | $L_{1-286}$ | $L_{2-65}$ |
| COMPOUND 9136 | $L_{1-286}$ | $L_{2-109}$ |
| COMPOUND 9137 | $L_{1-287}$ | $L_{2-1}$ |
| COMPOUND 9138 | $L_{1-287}$ | $L_{2-10}$ |
| COMPOUND 9139 | $L_{1-287}$ | $L_{2-15}$ |
| COMPOUND 9140 | $L_{1-287}$ | $L_{2-20}$ |
| COMPOUND 9141 | $L_{1-287}$ | $L_{2-65}$ |
| COMPOUND 9142 | $L_{1-287}$ | $L_{2-109}$ |
| COMPOUND 9143 | $L_{1-288}$ | $L_{2-1}$ |
| COMPOUND 9144 | $L_{1-288}$ | $L_{2-10}$ |
| COMPOUND 9145 | $L_{1-288}$ | $L_{2-15}$ |
| COMPOUND 9146 | $L_{1-288}$ | $L_{2-20}$ |
| COMPOUND 9147 | $L_{1-288}$ | $L_{2-65}$ |
| COMPOUND 9148 | $L_{1-288}$ | $L_{2-109}$ |
| COMPOUND 9149 | $L_{1-289}$ | $L_{2-1}$ |
| COMPOUND 9150 | $L_{1-289}$ | $L_{2-10}$ |
| COMPOUND 9151 | $L_{1-289}$ | $L_{2-15}$ |
| COMPOUND 9152 | $L_{1-289}$ | $L_{2-20}$ |
| COMPOUND 9153 | $L_{1-289}$ | $L_{2-65}$ |
| COMPOUND 9154 | $L_{1-289}$ | $L_{2-109}$ |
| COMPOUND 9155 | $L_{1-290}$ | $L_{2-1}$ |
| COMPOUND 9156 | $L_{1-290}$ | $L_{2-10}$ |
| COMPOUND 9157 | $L_{1-290}$ | $L_{2-15}$ |
| COMPOUND 9158 | $L_{1-290}$ | $L_{2-20}$ |
| COMPOUND 9159 | $L_{1-290}$ | $L_{2-65}$ |
| COMPOUND 9160 | $L_{1-290}$ | $L_{2-109}$ |
| COMPOUND 9161 | $L_{1-291}$ | $L_{2-1}$ |
| COMPOUND 9162 | $L_{1-291}$ | $L_{2-10}$ |
| COMPOUND 9163 | $L_{1-291}$ | $L_{2-15}$ |
| COMPOUND 9164 | $L_{1-291}$ | $L_{2-20}$ |
| COMPOUND 9165 | $L_{1-291}$ | $L_{2-65}$ |
| COMPOUND 9166 | $L_{1-291}$ | $L_{2-109}$ |
| COMPOUND 9167 | $L_{1-292}$ | $L_{2-1}$ |
| COMPOUND 9168 | $L_{1-292}$ | $L_{2-10}$ |
| COMPOUND 9169 | $L_{1-292}$ | $L_{2-15}$ |
| COMPOUND 9170 | $L_{1-292}$ | $L_{2-20}$ |
| COMPOUND 9171 | $L_{1-292}$ | $L_{2-65}$ |

-continued

| | | |
|---|---|---|
| COMPOUND 9172 | $L_{1-292}$ | $L_{2-109}$ |
| COMPOUND 9173 | $L_{1-293}$ | $L_{2-1}$ |
| COMPOUND 9174 | $L_{1-293}$ | $L_{2-10}$ |
| COMPOUND 9175 | $L_{1-293}$ | $L_{2-15}$ |
| COMPOUND 9176 | $L_{1-293}$ | $L_{2-20}$ |
| COMPOUND 9177 | $L_{1-293}$ | $L_{2-65}$ |
| COMPOUND 9178 | $L_{1-293}$ | $L_{2-109}$ |
| COMPOUND 9179 | $L_{1-294}$ | $L_{2-1}$ |
| COMPOUND 9180 | $L_{1-294}$ | $L_{2-10}$ |
| COMPOUND 9181 | $L_{1-294}$ | $L_{2-15}$ |
| COMPOUND 9182 | $L_{1-294}$ | $L_{2-20}$ |
| COMPOUND 9183 | $L_{1-294}$ | $L_{2-65}$ |
| COMPOUND 9184 | $L_{1-294}$ | $L_{2-109}$ |
| COMPOUND 9185 | $L_{1-295}$ | $L_{2-1}$ |
| COMPOUND 9186 | $L_{1-295}$ | $L_{2-10}$ |
| COMPOUND 9187 | $L_{1-295}$ | $L_{2-15}$ |
| COMPOUND 9188 | $L_{1-295}$ | $L_{2-20}$ |
| COMPOUND 9189 | $L_{1-295}$ | $L_{2-65}$ |
| COMPOUND 9190 | $L_{1-295}$ | $L_{2-109}$ |
| COMPOUND 9191 | $L_{1-296}$ | $L_{2-1}$ |
| COMPOUND 9192 | $L_{1-296}$ | $L_{2-10}$ |
| COMPOUND 9193 | $L_{1-296}$ | $L_{2-15}$ |
| COMPOUND 9194 | $L_{1-296}$ | $L_{2-20}$ |
| COMPOUND 9195 | $L_{1-296}$ | $L_{2-65}$ |
| COMPOUND 9196 | $L_{1-296}$ | $L_{2-109}$ |
| COMPOUND 9197 | $L_{1-297}$ | $L_{2-1}$ |
| COMPOUND 9198 | $L_{1-297}$ | $L_{2-10}$ |
| COMPOUND 9199 | $L_{1-297}$ | $L_{2-15}$ |
| COMPOUND 9200 | $L_{1-297}$ | $L_{2-20}$ |
| COMPOUND 9201 | $L_{1-297}$ | $L_{2-65}$ |
| COMPOUND 9202 | $L_{1-297}$ | $L_{2-109}$ |
| COMPOUND 9203 | $L_{1-298}$ | $L_{2-1}$ |
| COMPOUND 9204 | $L_{1-298}$ | $L_{2-10}$ |
| COMPOUND 9205 | $L_{1-298}$ | $L_{2-15}$ |
| COMPOUND 9206 | $L_{1-298}$ | $L_{2-20}$ |
| COMPOUND 9207 | $L_{1-298}$ | $L_{2-65}$ |
| COMPOUND 9208 | $L_{1-298}$ | $L_{2-109}$ |
| COMPOUND 9209 | $L_{1-299}$ | $L_{2-1}$ |
| COMPOUND 9210 | $L_{1-299}$ | $L_{2-10}$ |
| COMPOUND 9211 | $L_{1-299}$ | $L_{2-15}$ |
| COMPOUND 9212 | $L_{1-299}$ | $L_{2-20}$ |
| COMPOUND 9213 | $L_{1-299}$ | $L_{2-65}$ |
| COMPOUND 9214 | $L_{1-299}$ | $L_{2-109}$ |
| COMPOUND 9215 | $L_{1-300}$ | $L_{2-1}$ |
| COMPOUND 9216 | $L_{1-300}$ | $L_{2-10}$ |
| COMPOUND 9217 | $L_{1-300}$ | $L_{2-15}$ |
| COMPOUND 9218 | $L_{1-300}$ | $L_{2-20}$ |
| COMPOUND 9219 | $L_{1-300}$ | $L_{2-65}$ |
| COMPOUND 9220 | $L_{1-300}$ | $L_{2-109}$ |
| COMPOUND 9221 | $L_{1-301}$ | $L_{2-1}$ |
| COMPOUND 9222 | $L_{1-301}$ | $L_{2-10}$ |
| COMPOUND 9223 | $L_{1-301}$ | $L_{2-15}$ |
| COMPOUND 9224 | $L_{1-301}$ | $L_{2-20}$ |
| COMPOUND 9225 | $L_{1-301}$ | $L_{2-65}$ |
| COMPOUND 9226 | $L_{1-301}$ | $L_{2-109}$ |
| COMPOUND 9227 | $L_{1-302}$ | $L_{2-1}$ |
| COMPOUND 9228 | $L_{1-302}$ | $L_{2-10}$ |
| COMPOUND 9229 | $L_{1-302}$ | $L_{2-15}$ |
| COMPOUND 9230 | $L_{1-302}$ | $L_{2-20}$ |
| COMPOUND 9231 | $L_{1-302}$ | $L_{2-65}$ |
| COMPOUND 9232 | $L_{1-302}$ | $L_{2-109}$ |
| COMPOUND 9233 | $L_{1-303}$ | $L_{2-1}$ |
| COMPOUND 9234 | $L_{1-303}$ | $L_{2-10}$ |
| COMPOUND 9235 | $L_{1-303}$ | $L_{2-15}$ |
| COMPOUND 9236 | $L_{1-303}$ | $L_{2-20}$ |
| COMPOUND 9237 | $L_{1-303}$ | $L_{2-65}$ |
| COMPOUND 9238 | $L_{1-303}$ | $L_{2-109}$ |
| COMPOUND 9239 | $L_{1-304}$ | $L_{2-1}$ |
| COMPOUND 9240 | $L_{1-304}$ | $L_{2-10}$ |
| COMPOUND 9241 | $L_{1-304}$ | $L_{2-15}$ |
| COMPOUND 9242 | $L_{1-304}$ | $L_{2-20}$ |
| COMPOUND 9243 | $L_{1-304}$ | $L_{2-65}$ |
| COMPOUND 9244 | $L_{1-304}$ | $L_{2-109}$ |
| COMPOUND 9245 | $L_{1-305}$ | $L_{2-1}$ |
| COMPOUND 9246 | $L_{1-305}$ | $L_{2-10}$ |
| COMPOUND 9247 | $L_{1-305}$ | $L_{2-15}$ |
| COMPOUND 9248 | $L_{1-305}$ | $L_{2-20}$ |
| COMPOUND 9249 | $L_{1-305}$ | $L_{2-65}$ |
| COMPOUND 9250 | $L_{1-305}$ | $L_{2-109}$ |

-continued

| | | |
|---|---|---|
| COMPOUND 9251 | $L_{1-306}$ | $L_{2-1}$ |
| COMPOUND 9252 | $L_{1-306}$ | $L_{2-10}$ |
| COMPOUND 9253 | $L_{1-306}$ | $L_{2-15}$ |
| COMPOUND 9254 | $L_{1-306}$ | $L_{2-20}$ |
| COMPOUND 9255 | $L_{1-306}$ | $L_{2-65}$ |
| COMPOUND 9256 | $L_{1-306}$ | $L_{2-109}$ |
| COMPOUND 9257 | $L_{1-307}$ | $L_{2-1}$ |
| COMPOUND 9258 | $L_{1-307}$ | $L_{2-10}$ |
| COMPOUND 9259 | $L_{1-307}$ | $L_{2-15}$ |
| COMPOUND 9260 | $L_{1-307}$ | $L_{2-20}$ |
| COMPOUND 9261 | $L_{1-307}$ | $L_{2-65}$ |
| COMPOUND 9262 | $L_{1-307}$ | $L_{2-109}$ |
| COMPOUND 9263 | $L_{1-308}$ | $L_{2-1}$ |
| COMPOUND 9264 | $L_{1-308}$ | $L_{2-10}$ |
| COMPOUND 9265 | $L_{1-308}$ | $L_{2-15}$ |
| COMPOUND 9266 | $L_{1-308}$ | $L_{2-20}$ |
| COMPOUND 9267 | $L_{1-308}$ | $L_{2-65}$ |
| COMPOUND 9268 | $L_{1-308}$ | $L_{2-109}$ |
| COMPOUND 9269 | $L_{1-309}$ | $L_{2-1}$ |
| COMPOUND 9270 | $L_{1-309}$ | $L_{2-10}$ |
| COMPOUND 9271 | $L_{1-309}$ | $L_{2-15}$ |
| COMPOUND 9272 | $L_{1-309}$ | $L_{2-20}$ |
| COMPOUND 9273 | $L_{1-309}$ | $L_{2-65}$ |
| COMPOUND 9274 | $L_{1-309}$ | $L_{2-109}$ |
| COMPOUND 9275 | $L_{1-310}$ | $L_{2-1}$ |
| COMPOUND 9276 | $L_{1-310}$ | $L_{2-10}$ |
| COMPOUND 9277 | $L_{1-310}$ | $L_{2-15}$ |
| COMPOUND 9278 | $L_{1-310}$ | $L_{2-20}$ |
| COMPOUND 9279 | $L_{1-310}$ | $L_{2-65}$ |
| COMPOUND 9280 | $L_{1-310}$ | $L_{2-109}$ |
| COMPOUND 9281 | $L_{1-311}$ | $L_{2-1}$ |
| COMPOUND 9282 | $L_{1-311}$ | $L_{2-10}$ |
| COMPOUND 9283 | $L_{1-311}$ | $L_{2-15}$ |
| COMPOUND 9284 | $L_{1-311}$ | $L_{2-20}$ |
| COMPOUND 9285 | $L_{1-311}$ | $L_{2-65}$ |
| COMPOUND 9286 | $L_{1-311}$ | $L_{2-109}$ |
| COMPOUND 9287 | $L_{1-312}$ | $L_{2-1}$ |
| COMPOUND 9288 | $L_{1-312}$ | $L_{2-10}$ |
| COMPOUND 9289 | $L_{1-312}$ | $L_{2-15}$ |
| COMPOUND 9290 | $L_{1-312}$ | $L_{2-20}$ |
| COMPOUND 9291 | $L_{1-312}$ | $L_{2-65}$ |
| COMPOUND 9292 | $L_{1-312}$ | $L_{2-109}$ |
| COMPOUND 9293 | $L_{1-313}$ | $L_{2-1}$ |
| COMPOUND 9294 | $L_{1-313}$ | $L_{2-10}$ |
| COMPOUND 9295 | $L_{1-313}$ | $L_{2-15}$ |
| COMPOUND 9296 | $L_{1-313}$ | $L_{2-20}$ |
| COMPOUND 9297 | $L_{1-313}$ | $L_{2-65}$ |
| COMPOUND 9298 | $L_{1-313}$ | $L_{2-109}$ |
| COMPOUND 9299 | $L_{1-314}$ | $L_{2-1}$ |
| COMPOUND 9300 | $L_{1-314}$ | $L_{2-10}$ |
| COMPOUND 9301 | $L_{1-314}$ | $L_{2-15}$ |
| COMPOUND 9302 | $L_{1-314}$ | $L_{2-20}$ |
| COMPOUND 9303 | $L_{1-314}$ | $L_{2-65}$ |
| COMPOUND 9304 | $L_{1-314}$ | $L_{2-109}$ |
| COMPOUND 9305 | $L_{1-315}$ | $L_{2-1}$ |
| COMPOUND 9306 | $L_{1-315}$ | $L_{2-10}$ |
| COMPOUND 9307 | $L_{1-315}$ | $L_{2-15}$ |
| COMPOUND 9308 | $L_{1-315}$ | $L_{2-20}$ |
| COMPOUND 9309 | $L_{1-315}$ | $L_{2-65}$ |
| COMPOUND 9310 | $L_{1-315}$ | $L_{2-109}$ |
| COMPOUND 9311 | $L_{1-316}$ | $L_{2-1}$ |
| COMPOUND 9312 | $L_{1-316}$ | $L_{2-10}$ |
| COMPOUND 9313 | $L_{1-316}$ | $L_{2-15}$ |
| COMPOUND 9314 | $L_{1-316}$ | $L_{2-20}$ |
| COMPOUND 9315 | $L_{1-316}$ | $L_{2-65}$ |
| COMPOUND 9316 | $L_{1-316}$ | $L_{2-109}$ |
| COMPOUND 9317 | $L_{1-317}$ | $L_{2-1}$ |
| COMPOUND 9318 | $L_{1-317}$ | $L_{2-10}$ |
| COMPOUND 9319 | $L_{1-317}$ | $L_{2-15}$ |
| COMPOUND 9320 | $L_{1-317}$ | $L_{2-20}$ |
| COMPOUND 9321 | $L_{1-317}$ | $L_{2-65}$ |
| COMPOUND 9322 | $L_{1-317}$ | $L_{2-109}$ |
| COMPOUND 9323 | $L_{1-318}$ | $L_{2-1}$ |
| COMPOUND 9324 | $L_{1-318}$ | $L_{2-10}$ |
| COMPOUND 9325 | $L_{1-318}$ | $L_{2-15}$ |
| COMPOUND 9326 | $L_{1-318}$ | $L_{2-20}$ |
| COMPOUND 9327 | $L_{1-318}$ | $L_{2-65}$ |
| COMPOUND 9328 | $L_{1-318}$ | $L_{2-109}$ |
| COMPOUND 9329 | $L_{1-319}$ | $L_{2-1}$ |

-continued

| | | |
|---|---|---|
| COMPOUND 9330 | $L_{1-319}$ | $L_{2-10}$ |
| COMPOUND 9331 | $L_{1-319}$ | $L_{2-15}$ |
| COMPOUND 9332 | $L_{1-319}$ | $L_{2-20}$ |
| COMPOUND 9333 | $L_{1-319}$ | $L_{2-65}$ |
| COMPOUND 9334 | $L_{1-319}$ | $L_{2-109}$ |
| COMPOUND 9335 | $L_{1-320}$ | $L_{2-1}$ |
| COMPOUND 9336 | $L_{1-320}$ | $L_{2-10}$ |
| COMPOUND 9337 | $L_{1-320}$ | $L_{2-15}$ |
| COMPOUND 9338 | $L_{1-320}$ | $L_{2-20}$ |
| COMPOUND 9339 | $L_{1-320}$ | $L_{2-65}$ |
| COMPOUND 9340 | $L_{1-320}$ | $L_{2-109}$ |
| COMPOUND 9341 | $L_{1-321}$ | $L_{2-1}$ |
| COMPOUND 9342 | $L_{1-321}$ | $L_{2-10}$ |
| COMPOUND 9343 | $L_{1-321}$ | $L_{2-15}$ |
| COMPOUND 9344 | $L_{1-321}$ | $L_{2-20}$ |
| COMPOUND 9345 | $L_{1-321}$ | $L_{2-65}$ |
| COMPOUND 9346 | $L_{1-321}$ | $L_{2-109}$ |
| COMPOUND 9347 | $L_{1-322}$ | $L_{2-1}$ |
| COMPOUND 9348 | $L_{1-322}$ | $L_{2-10}$ |
| COMPOUND 9349 | $L_{1-322}$ | $L_{2-15}$ |
| COMPOUND 9350 | $L_{1-322}$ | $L_{2-20}$ |
| COMPOUND 9351 | $L_{1-322}$ | $L_{2-65}$ |
| COMPOUND 9352 | $L_{1-322}$ | $L_{2-109}$ |
| COMPOUND 9353 | $L_{1-323}$ | $L_{2-1}$ |
| COMPOUND 9354 | $L_{1-323}$ | $L_{2-10}$ |
| COMPOUND 9355 | $L_{1-323}$ | $L_{2-15}$ |
| COMPOUND 9356 | $L_{1-323}$ | $L_{2-20}$ |
| COMPOUND 9357 | $L_{1-323}$ | $L_{2-65}$ |
| COMPOUND 9358 | $L_{1-323}$ | $L_{2-109}$ |
| COMPOUND 9359 | $L_{1-324}$ | $L_{2-1}$ |
| COMPOUND 9360 | $L_{1-324}$ | $L_{2-10}$ |
| COMPOUND 9361 | $L_{1-324}$ | $L_{2-15}$ |
| COMPOUND 9362 | $L_{1-324}$ | $L_{2-20}$ |
| COMPOUND 9363 | $L_{1-324}$ | $L_{2-65}$ |
| COMPOUND 9364 | $L_{1-324}$ | $L_{2-109}$ |
| COMPOUND 9365 | $L_{1-325}$ | $L_{2-1}$ |
| COMPOUND 9366 | $L_{1-325}$ | $L_{2-10}$ |
| COMPOUND 9367 | $L_{1-325}$ | $L_{2-15}$ |
| COMPOUND 9368 | $L_{1-325}$ | $L_{2-20}$ |
| COMPOUND 9369 | $L_{1-325}$ | $L_{2-65}$ |
| COMPOUND 9370 | $L_{1-325}$ | $L_{2-109}$ |
| COMPOUND 9371 | $L_{1-326}$ | $L_{2-1}$ |
| COMPOUND 9372 | $L_{1-326}$ | $L_{2-10}$ |
| COMPOUND 9373 | $L_{1-326}$ | $L_{2-15}$ |
| COMPOUND 9374 | $L_{1-326}$ | $L_{2-20}$ |
| COMPOUND 9375 | $L_{1-326}$ | $L_{2-65}$ |
| COMPOUND 9376 | $L_{1-326}$ | $L_{2-109}$ |
| COMPOUND 9377 | $L_{1-327}$ | $L_{2-1}$ |
| COMPOUND 9378 | $L_{1-327}$ | $L_{2-10}$ |
| COMPOUND 9379 | $L_{1-327}$ | $L_{2-15}$ |
| COMPOUND 9380 | $L_{1-327}$ | $L_{2-20}$ |
| COMPOUND 9381 | $L_{1-327}$ | $L_{2-65}$ |
| COMPOUND 9382 | $L_{1-327}$ | $L_{2-109}$ |
| COMPOUND 9383 | $L_{1-328}$ | $L_{2-1}$ |
| COMPOUND 9384 | $L_{1-328}$ | $L_{2-10}$ |
| COMPOUND 9385 | $L_{1-328}$ | $L_{2-15}$ |
| COMPOUND 9386 | $L_{1-328}$ | $L_{2-20}$ |
| COMPOUND 9387 | $L_{1-328}$ | $L_{2-65}$ |
| COMPOUND 9388 | $L_{1-328}$ | $L_{2-109}$ |
| COMPOUND 9389 | $L_{1-329}$ | $L_{2-1}$ |
| COMPOUND 9390 | $L_{1-329}$ | $L_{2-10}$ |
| COMPOUND 9391 | $L_{1-329}$ | $L_{2-15}$ |
| COMPOUND 9392 | $L_{1-329}$ | $L_{2-20}$ |
| COMPOUND 9393 | $L_{1-329}$ | $L_{2-65}$ |
| COMPOUND 9394 | $L_{1-329}$ | $L_{2-109}$ |
| COMPOUND 9395 | $L_{1-330}$ | $L_{2-1}$ |
| COMPOUND 9396 | $L_{1-330}$ | $L_{2-10}$ |
| COMPOUND 9397 | $L_{1-330}$ | $L_{2-15}$ |
| COMPOUND 9398 | $L_{1-330}$ | $L_{2-20}$ |
| COMPOUND 9399 | $L_{1-330}$ | $L_{2-65}$ |
| COMPOUND 9400 | $L_{1-330}$ | $L_{2-109}$ |
| COMPOUND 9401 | $L_{1-331}$ | $L_{2-1}$ |
| COMPOUND 9402 | $L_{1-331}$ | $L_{2-10}$ |
| COMPOUND 9403 | $L_{1-331}$ | $L_{2-15}$ |
| COMPOUND 9404 | $L_{1-331}$ | $L_{2-20}$ |
| COMPOUND 9405 | $L_{1-331}$ | $L_{2-65}$ |
| COMPOUND 9406 | $L_{1-331}$ | $L_{2-109}$ |
| COMPOUND 9407 | $L_{1-332}$ | $L_{2-1}$ |
| COMPOUND 9408 | $L_{1-332}$ | $L_{2-10}$ |

-continued

| | | |
|---|---|---|
| COMPOUND 9409 | $L_{1-332}$ | $L_{2-15}$ |
| COMPOUND 9410 | $L_{1-332}$ | $L_{2-20}$ |
| COMPOUND 9411 | $L_{1-332}$ | $L_{2-65}$ |
| COMPOUND 9412 | $L_{1-332}$ | $L_{2-109}$ |
| COMPOUND 9413 | $L_{1-333}$ | $L_{2-1}$ |
| COMPOUND 9414 | $L_{1-333}$ | $L_{2-10}$ |
| COMPOUND 9415 | $L_{1-333}$ | $L_{2-15}$ |
| COMPOUND 9416 | $L_{1-333}$ | $L_{2-20}$ |
| COMPOUND 9417 | $L_{1-333}$ | $L_{2-65}$ |
| COMPOUND 9418 | $L_{1-333}$ | $L_{2-109}$ |
| COMPOUND 9419 | $L_{1-334}$ | $L_{2-1}$ |
| COMPOUND 9420 | $L_{1-334}$ | $L_{2-10}$ |
| COMPOUND 9421 | $L_{1-334}$ | $L_{2-15}$ |
| COMPOUND 9422 | $L_{1-334}$ | $L_{2-20}$ |
| COMPOUND 9423 | $L_{1-334}$ | $L_{2-65}$ |
| COMPOUND 9424 | $L_{1-334}$ | $L_{2-109}$ |
| COMPOUND 9425 | $L_{1-335}$ | $L_{2-1}$ |
| COMPOUND 9426 | $L_{1-335}$ | $L_{2-10}$ |
| COMPOUND 9427 | $L_{1-335}$ | $L_{2-15}$ |
| COMPOUND 9428 | $L_{1-335}$ | $L_{2-20}$ |
| COMPOUND 9429 | $L_{1-335}$ | $L_{2-65}$ |
| COMPOUND 9430 | $L_{1-335}$ | $L_{2-109}$ |
| COMPOUND 9431 | $L_{1-336}$ | $L_{2-1}$ |
| COMPOUND 9432 | $L_{1-336}$ | $L_{2-10}$ |
| COMPOUND 9433 | $L_{1-336}$ | $L_{2-15}$ |
| COMPOUND 9434 | $L_{1-336}$ | $L_{2-20}$ |
| COMPOUND 9435 | $L_{1-336}$ | $L_{2-65}$ |
| COMPOUND 9436 | $L_{1-336}$ | $L_{2-109}$ |
| COMPOUND 9437 | $L_{1-337}$ | $L_{2-1}$ |
| COMPOUND 9438 | $L_{1-337}$ | $L_{2-10}$ |
| COMPOUND 9439 | $L_{1-337}$ | $L_{2-15}$ |
| COMPOUND 9440 | $L_{1-337}$ | $L_{2-20}$ |
| COMPOUND 9441 | $L_{1-337}$ | $L_{2-65}$ |
| COMPOUND 9442 | $L_{1-337}$ | $L_{2-109}$ |
| COMPOUND 9443 | $L_{1-338}$ | $L_{2-1}$ |
| COMPOUND 9444 | $L_{1-338}$ | $L_{2-10}$ |
| COMPOUND 9445 | $L_{1-338}$ | $L_{2-15}$ |
| COMPOUND 9446 | $L_{1-338}$ | $L_{2-20}$ |
| COMPOUND 9447 | $L_{1-338}$ | $L_{2-65}$ |
| COMPOUND 9448 | $L_{1-338}$ | $L_{2-109}$ |
| COMPOUND 9449 | $L_{1-339}$ | $L_{2-1}$ |
| COMPOUND 9450 | $L_{1-339}$ | $L_{2-10}$ |
| COMPOUND 9451 | $L_{1-339}$ | $L_{2-15}$ |
| COMPOUND 9452 | $L_{1-339}$ | $L_{2-20}$ |
| COMPOUND 9453 | $L_{1-339}$ | $L_{2-65}$ |
| COMPOUND 9454 | $L_{1-339}$ | $L_{2-109}$ |
| COMPOUND 9455 | $L_{1-340}$ | $L_{2-1}$ |
| COMPOUND 9456 | $L_{1-340}$ | $L_{2-10}$ |
| COMPOUND 9457 | $L_{1-340}$ | $L_{2-15}$ |
| COMPOUND 9458 | $L_{1-340}$ | $L_{2-20}$ |
| COMPOUND 9459 | $L_{1-340}$ | $L_{2-65}$ |
| COMPOUND 9460 | $L_{1-340}$ | $L_{2-109}$ |
| COMPOUND 9461 | $L_{1-341}$ | $L_{2-1}$ |
| COMPOUND 9462 | $L_{1-341}$ | $L_{2-10}$ |
| COMPOUND 9463 | $L_{1-341}$ | $L_{2-15}$ |
| COMPOUND 9464 | $L_{1-341}$ | $L_{2-20}$ |
| COMPOUND 9465 | $L_{1-341}$ | $L_{2-65}$ |
| COMPOUND 9466 | $L_{1-341}$ | $L_{2-109}$ |
| COMPOUND 9467 | $L_{1-342}$ | $L_{2-1}$ |
| COMPOUND 9468 | $L_{1-342}$ | $L_{2-10}$ |
| COMPOUND 9469 | $L_{1-342}$ | $L_{2-15}$ |
| COMPOUND 9470 | $L_{1-342}$ | $L_{2-20}$ |
| COMPOUND 9471 | $L_{1-342}$ | $L_{2-65}$ |
| COMPOUND 9472 | $L_{1-342}$ | $L_{2-109}$ |
| COMPOUND 9473 | $L_{1-343}$ | $L_{2-1}$ |
| COMPOUND 9474 | $L_{1-343}$ | $L_{2-10}$ |
| COMPOUND 9475 | $L_{1-343}$ | $L_{2-15}$ |
| COMPOUND 9476 | $L_{1-343}$ | $L_{2-20}$ |
| COMPOUND 9477 | $L_{1-343}$ | $L_{2-65}$ |
| COMPOUND 9478 | $L_{1-343}$ | $L_{2-109}$ |
| COMPOUND 9479 | $L_{1-344}$ | $L_{2-1}$ |
| COMPOUND 9480 | $L_{1-344}$ | $L_{2-10}$ |
| COMPOUND 9481 | $L_{1-344}$ | $L_{2-15}$ |
| COMPOUND 9482 | $L_{1-344}$ | $L_{2-20}$ |
| COMPOUND 9483 | $L_{1-344}$ | $L_{2-65}$ |
| COMPOUND 9484 | $L_{1-344}$ | $L_{2-109}$ |
| COMPOUND 9485 | $L_{1-345}$ | $L_{2-1}$ |
| COMPOUND 9486 | $L_{1-345}$ | $L_{2-10}$ |
| COMPOUND 9487 | $L_{1-345}$ | $L_{2-15}$ |

| | | |
|---|---|---|
| COMPOUND 9488 | $L_{1-345}$ | $L_{2-20}$ |
| COMPOUND 9489 | $L_{1-345}$ | $L_{2-65}$ |
| COMPOUND 9490 | $L_{1-345}$ | $L_{2-109}$ |
| COMPOUND 9491 | $L_{1-346}$ | $L_{2-1}$ |
| COMPOUND 9492 | $L_{1-346}$ | $L_{2-10}$ |
| COMPOUND 9493 | $L_{1-346}$ | $L_{2-15}$ |
| COMPOUND 9494 | $L_{1-346}$ | $L_{2-20}$ |
| COMPOUND 9495 | $L_{1-346}$ | $L_{2-65}$ |
| COMPOUND 9496 | $L_{1-346}$ | $L_{2-109}$ |
| COMPOUND 9497 | $L_{1-347}$ | $L_{2-1}$ |
| COMPOUND 9498 | $L_{1-347}$ | $L_{2-10}$ |
| COMPOUND 9499 | $L_{1-347}$ | $L_{2-15}$ |
| COMPOUND 9500 | $L_{1-347}$ | $L_{2-20}$ |
| COMPOUND 9501 | $L_{1-347}$ | $L_{2-65}$ |
| COMPOUND 9502 | $L_{1-347}$ | $L_{2-109}$ |
| COMPOUND 9503 | $L_{1-348}$ | $L_{2-1}$ |
| COMPOUND 9504 | $L_{1-348}$ | $L_{2-10}$ |
| COMPOUND 9505 | $L_{1-348}$ | $L_{2-15}$ |
| COMPOUND 9506 | $L_{1-348}$ | $L_{2-20}$ |
| COMPOUND 9507 | $L_{1-348}$ | $L_{2-65}$ |
| COMPOUND 9508 | $L_{1-348}$ | $L_{2-109}$ |
| COMPOUND 9509 | $L_{1-349}$ | $L_{2-1}$ |
| COMPOUND 9510 | $L_{1-349}$ | $L_{2-10}$ |
| COMPOUND 9511 | $L_{1-349}$ | $L_{2-15}$ |
| COMPOUND 9512 | $L_{1-349}$ | $L_{2-20}$ |
| COMPOUND 9513 | $L_{1-349}$ | $L_{2-65}$ |
| COMPOUND 9514 | $L_{1-349}$ | $L_{2-109}$ |
| COMPOUND 9515 | $L_{1-350}$ | $L_{2-1}$ |
| COMPOUND 9516 | $L_{1-350}$ | $L_{2-10}$ |
| COMPOUND 9517 | $L_{1-350}$ | $L_{2-15}$ |
| COMPOUND 9518 | $L_{1-350}$ | $L_{2-20}$ |
| COMPOUND 9519 | $L_{1-350}$ | $L_{2-65}$ |
| COMPOUND 9520 | $L_{1-350}$ | $L_{2-109}$ |
| COMPOUND 9521 | $L_{1-351}$ | $L_{2-1}$ |
| COMPOUND 9522 | $L_{1-351}$ | $L_{2-10}$ |
| COMPOUND 9523 | $L_{1-351}$ | $L_{2-15}$ |
| COMPOUND 9524 | $L_{1-351}$ | $L_{2-20}$ |
| COMPOUND 9525 | $L_{1-351}$ | $L_{2-65}$ |
| COMPOUND 9526 | $L_{1-351}$ | $L_{2-109}$ |
| COMPOUND 9527 | $L_{1-352}$ | $L_{2-1}$ |
| COMPOUND 9528 | $L_{1-352}$ | $L_{2-10}$ |
| COMPOUND 9529 | $L_{1-352}$ | $L_{2-15}$ |
| COMPOUND 9530 | $L_{1-352}$ | $L_{2-20}$ |
| COMPOUND 9531 | $L_{1-352}$ | $L_{2-65}$ |
| COMPOUND 9532 | $L_{1-352}$ | $L_{2-109}$ |
| COMPOUND 9533 | $L_{1-353}$ | $L_{2-1}$ |
| COMPOUND 9534 | $L_{1-353}$ | $L_{2-10}$ |
| COMPOUND 9535 | $L_{1-353}$ | $L_{2-15}$ |
| COMPOUND 9536 | $L_{1-353}$ | $L_{2-20}$ |
| COMPOUND 9537 | $L_{1-353}$ | $L_{2-65}$ |
| COMPOUND 9538 | $L_{1-353}$ | $L_{2-109}$ |
| COMPOUND 9539 | $L_{1-354}$ | $L_{2-1}$ |
| COMPOUND 9540 | $L_{1-354}$ | $L_{2-10}$ |
| COMPOUND 9541 | $L_{1-354}$ | $L_{2-15}$ |
| COMPOUND 9542 | $L_{1-354}$ | $L_{2-20}$ |
| COMPOUND 9543 | $L_{1-354}$ | $L_{2-65}$ |
| COMPOUND 9544 | $L_{1-354}$ | $L_{2-109}$ |
| COMPOUND 9545 | $L_{1-355}$ | $L_{2-1}$ |
| COMPOUND 9546 | $L_{1-355}$ | $L_{2-10}$ |
| COMPOUND 9547 | $L_{1-355}$ | $L_{2-15}$ |
| COMPOUND 9548 | $L_{1-355}$ | $L_{2-20}$ |
| COMPOUND 9549 | $L_{1-355}$ | $L_{2-65}$ |
| COMPOUND 9550 | $L_{1-355}$ | $L_{2-109}$ |
| COMPOUND 9551 | $L_{1-356}$ | $L_{2-1}$ |
| COMPOUND 9552 | $L_{1-356}$ | $L_{2-10}$ |
| COMPOUND 9553 | $L_{1-356}$ | $L_{2-15}$ |
| COMPOUND 9554 | $L_{1-356}$ | $L_{2-20}$ |
| COMPOUND 9555 | $L_{1-356}$ | $L_{2-65}$ |
| COMPOUND 9556 | $L_{1-356}$ | $L_{2-109}$ |
| COMPOUND 9557 | $L_{1-357}$ | $L_{2-1}$ |
| COMPOUND 9558 | $L_{1-357}$ | $L_{2-10}$ |
| COMPOUND 9559 | $L_{1-357}$ | $L_{2-15}$ |
| COMPOUND 9560 | $L_{1-357}$ | $L_{2-20}$ |
| COMPOUND 9561 | $L_{1-357}$ | $L_{2-65}$ |
| COMPOUND 9562 | $L_{1-357}$ | $L_{2-109}$ |
| COMPOUND 9563 | $L_{1-358}$ | $L_{2-1}$ |
| COMPOUND 9564 | $L_{1-358}$ | $L_{2-10}$ |
| COMPOUND 9565 | $L_{1-358}$ | $L_{2-15}$ |
| COMPOUND 9566 | $L_{1-358}$ | $L_{2-20}$ |

| | | |
|---|---|---|
| COMPOUND 9567 | $L_{1-358}$ | $L_{2-65}$ |
| COMPOUND 9568 | $L_{1-358}$ | $L_{2-109}$ |
| COMPOUND 9569 | $L_{1-359}$ | $L_{2-1}$ |
| COMPOUND 9570 | $L_{1-359}$ | $L_{2-10}$ |
| COMPOUND 9571 | $L_{1-359}$ | $L_{2-15}$ |
| COMPOUND 9572 | $L_{1-359}$ | $L_{2-20}$ |
| COMPOUND 9573 | $L_{1-359}$ | $L_{2-65}$ |
| COMPOUND 9574 | $L_{1-359}$ | $L_{2-109}$ |
| COMPOUND 9575 | $L_{1-360}$ | $L_{2-1}$ |
| COMPOUND 9576 | $L_{1-360}$ | $L_{2-10}$ |
| COMPOUND 9577 | $L_{1-360}$ | $L_{2-15}$ |
| COMPOUND 9578 | $L_{1-360}$ | $L_{2-20}$ |
| COMPOUND 9579 | $L_{1-360}$ | $L_{2-65}$ |
| COMPOUND 9580 | $L_{1-360}$ | $L_{2-109}$ |
| COMPOUND 9581 | $L_{1-361}$ | $L_{2-1}$ |
| COMPOUND 9582 | $L_{1-361}$ | $L_{2-10}$ |
| COMPOUND 9583 | $L_{1-361}$ | $L_{2-15}$ |
| COMPOUND 9584 | $L_{1-361}$ | $L_{2-20}$ |
| COMPOUND 9585 | $L_{1-361}$ | $L_{2-65}$ |
| COMPOUND 9586 | $L_{1-361}$ | $L_{2-109}$ |
| COMPOUND 9587 | $L_{1-362}$ | $L_{2-1}$ |
| COMPOUND 9588 | $L_{1-362}$ | $L_{2-10}$ |
| COMPOUND 9589 | $L_{1-362}$ | $L_{2-15}$ |
| COMPOUND 9590 | $L_{1-362}$ | $L_{2-20}$ |
| COMPOUND 9591 | $L_{1-362}$ | $L_{2-65}$ |
| COMPOUND 9592 | $L_{1-362}$ | $L_{2-109}$ |
| COMPOUND 9593 | $L_{1-363}$ | $L_{2-1}$ |
| COMPOUND 9594 | $L_{1-363}$ | $L_{2-10}$ |
| COMPOUND 9595 | $L_{1-363}$ | $L_{2-15}$ |
| COMPOUND 9596 | $L_{1-363}$ | $L_{2-20}$ |
| COMPOUND 9597 | $L_{1-363}$ | $L_{2-65}$ |
| COMPOUND 9598 | $L_{1-363}$ | $L_{2-109}$ |
| COMPOUND 9599 | $L_{1-364}$ | $L_{2-1}$ |
| COMPOUND 9600 | $L_{1-364}$ | $L_{2-10}$ |
| COMPOUND 9601 | $L_{1-364}$ | $L_{2-15}$ |
| COMPOUND 9602 | $L_{1-364}$ | $L_{2-20}$ |
| COMPOUND 9603 | $L_{1-364}$ | $L_{2-65}$ |
| COMPOUND 9604 | $L_{1-364}$ | $L_{2-109}$ |
| COMPOUND 9605 | $L_{1-365}$ | $L_{2-1}$ |
| COMPOUND 9606 | $L_{1-365}$ | $L_{2-10}$ |
| COMPOUND 9607 | $L_{1-365}$ | $L_{2-15}$ |
| COMPOUND 9608 | $L_{1-365}$ | $L_{2-20}$ |
| COMPOUND 9609 | $L_{1-365}$ | $L_{2-65}$ |
| COMPOUND 9610 | $L_{1-365}$ | $L_{2-109}$ |
| COMPOUND 9611 | $L_{1-366}$ | $L_{2-1}$ |
| COMPOUND 9612 | $L_{1-366}$ | $L_{2-10}$ |
| COMPOUND 9613 | $L_{1-366}$ | $L_{2-15}$ |
| COMPOUND 9614 | $L_{1-366}$ | $L_{2-20}$ |
| COMPOUND 9615 | $L_{1-366}$ | $L_{2-65}$ |
| COMPOUND 9616 | $L_{1-366}$ | $L_{2-109}$ |
| COMPOUND 9617 | $L_{1-367}$ | $L_{2-1}$ |
| COMPOUND 9618 | $L_{1-367}$ | $L_{2-10}$ |
| COMPOUND 9619 | $L_{1-367}$ | $L_{2-15}$ |
| COMPOUND 9620 | $L_{1-367}$ | $L_{2-20}$ |
| COMPOUND 9621 | $L_{1-367}$ | $L_{2-65}$ |
| COMPOUND 9622 | $L_{1-367}$ | $L_{2-109}$ |
| COMPOUND 9623 | $L_{1-368}$ | $L_{2-1}$ |
| COMPOUND 9624 | $L_{1-368}$ | $L_{2-10}$ |
| COMPOUND 9625 | $L_{1-368}$ | $L_{2-15}$ |
| COMPOUND 9626 | $L_{1-368}$ | $L_{2-20}$ |
| COMPOUND 9627 | $L_{1-368}$ | $L_{2-65}$ |
| COMPOUND 9628 | $L_{1-368}$ | $L_{2-109}$ |
| COMPOUND 9629 | $L_{1-369}$ | $L_{2-1}$ |
| COMPOUND 9630 | $L_{1-369}$ | $L_{2-10}$ |
| COMPOUND 9631 | $L_{1-369}$ | $L_{2-15}$ |
| COMPOUND 9632 | $L_{1-369}$ | $L_{2-20}$ |
| COMPOUND 9633 | $L_{1-369}$ | $L_{2-65}$ |
| COMPOUND 9634 | $L_{1-369}$ | $L_{2-109}$ |
| COMPOUND 9635 | $L_{1-370}$ | $L_{2-1}$ |
| COMPOUND 9636 | $L_{1-370}$ | $L_{2-10}$ |
| COMPOUND 9637 | $L_{1-370}$ | $L_{2-15}$ |
| COMPOUND 9638 | $L_{1-370}$ | $L_{2-20}$ |
| COMPOUND 9639 | $L_{1-370}$ | $L_{2-65}$ |
| COMPOUND 9640 | $L_{1-370}$ | $L_{2-109}$ |
| COMPOUND 9641 | $L_{1-371}$ | $L_{2-1}$ |
| COMPOUND 9642 | $L_{1-371}$ | $L_{2-10}$ |
| COMPOUND 9643 | $L_{1-371}$ | $L_{2-15}$ |
| COMPOUND 9644 | $L_{1-371}$ | $L_{2-20}$ |
| COMPOUND 9645 | $L_{1-371}$ | $L_{2-65}$ |

-continued

| | | |
|---|---|---|
| COMPOUND 9646 | $L_{1-371}$ | $L_{2-109}$ |
| COMPOUND 9647 | $L_{1-372}$ | $L_{2-1}$ |
| COMPOUND 9648 | $L_{1-372}$ | $L_{2-10}$ |
| COMPOUND 9649 | $L_{1-372}$ | $L_{2-15}$ |
| COMPOUND 9650 | $L_{1-372}$ | $L_{2-20}$ |
| COMPOUND 9651 | $L_{1-372}$ | $L_{2-65}$ |
| COMPOUND 9652 | $L_{1-372}$ | $L_{2-109}$ |
| COMPOUND 9653 | $L_{1-373}$ | $L_{2-1}$ |
| COMPOUND 9654 | $L_{1-373}$ | $L_{2-10}$ |
| COMPOUND 9655 | $L_{1-373}$ | $L_{2-15}$ |
| COMPOUND 9656 | $L_{1-373}$ | $L_{2-20}$ |
| COMPOUND 9657 | $L_{1-373}$ | $L_{2-65}$ |
| COMPOUND 9658 | $L_{1-373}$ | $L_{2-109}$ |
| COMPOUND 9659 | $L_{1-374}$ | $L_{2-1}$ |
| COMPOUND 9660 | $L_{1-374}$ | $L_{2-10}$ |
| COMPOUND 9661 | $L_{1-374}$ | $L_{2-15}$ |
| COMPOUND 9662 | $L_{1-374}$ | $L_{2-20}$ |
| COMPOUND 9663 | $L_{1-374}$ | $L_{2-65}$ |
| COMPOUND 9664 | $L_{1-374}$ | $L_{2-109}$ |
| COMPOUND 9665 | $L_{1-375}$ | $L_{2-1}$ |
| COMPOUND 9666 | $L_{1-375}$ | $L_{2-10}$ |
| COMPOUND 9667 | $L_{1-375}$ | $L_{2-15}$ |
| COMPOUND 9668 | $L_{1-375}$ | $L_{2-20}$ |
| COMPOUND 9669 | $L_{1-375}$ | $L_{2-65}$ |
| COMPOUND 9670 | $L_{1-375}$ | $L_{2-109}$ |
| COMPOUND 9671 | $L_{1-376}$ | $L_{2-1}$ |
| COMPOUND 9672 | $L_{1-376}$ | $L_{2-10}$ |
| COMPOUND 9673 | $L_{1-376}$ | $L_{2-15}$ |
| COMPOUND 9674 | $L_{1-376}$ | $L_{2-20}$ |
| COMPOUND 9675 | $L_{1-376}$ | $L_{2-65}$ |
| COMPOUND 9676 | $L_{1-376}$ | $L_{2-109}$ |
| COMPOUND 9677 | $L_{1-377}$ | $L_{2-1}$ |
| COMPOUND 9678 | $L_{1-377}$ | $L_{2-10}$ |
| COMPOUND 9679 | $L_{1-377}$ | $L_{2-15}$ |
| COMPOUND 9680 | $L_{1-377}$ | $L_{2-20}$ |
| COMPOUND 9681 | $L_{1-377}$ | $L_{2-65}$ |
| COMPOUND 9682 | $L_{1-377}$ | $L_{2-109}$ |
| COMPOUND 9683 | $L_{1-378}$ | $L_{2-1}$ |
| COMPOUND 9684 | $L_{1-378}$ | $L_{2-10}$ |
| COMPOUND 9685 | $L_{1-378}$ | $L_{2-15}$ |
| COMPOUND 9686 | $L_{1-378}$ | $L_{2-20}$ |
| COMPOUND 9687 | $L_{1-378}$ | $L_{2-65}$ |
| COMPOUND 9688 | $L_{1-378}$ | $L_{2-109}$ |
| COMPOUND 9689 | $L_{1-379}$ | $L_{2-1}$ |
| COMPOUND 9690 | $L_{1-379}$ | $L_{2-10}$ |
| COMPOUND 9691 | $L_{1-379}$ | $L_{2-15}$ |
| COMPOUND 9692 | $L_{1-379}$ | $L_{2-20}$ |
| COMPOUND 9693 | $L_{1-379}$ | $L_{2-65}$ |
| COMPOUND 9694 | $L_{1-379}$ | $L_{2-109}$ |
| COMPOUND 9695 | $L_{1-380}$ | $L_{2-1}$ |
| COMPOUND 9696 | $L_{1-380}$ | $L_{2-10}$ |
| COMPOUND 9697 | $L_{1-380}$ | $L_{2-15}$ |
| COMPOUND 9698 | $L_{1-380}$ | $L_{2-20}$ |
| COMPOUND 9699 | $L_{1-380}$ | $L_{2-65}$ |
| COMPOUND 9700 | $L_{1-380}$ | $L_{2-109}$ |
| COMPOUND 9701 | $L_{1-381}$ | $L_{2-1}$ |
| COMPOUND 9702 | $L_{1-381}$ | $L_{2-10}$ |
| COMPOUND 9703 | $L_{1-381}$ | $L_{2-15}$ |
| COMPOUND 9704 | $L_{1-381}$ | $L_{2-20}$ |
| COMPOUND 9705 | $L_{1-381}$ | $L_{2-65}$ |
| COMPOUND 9706 | $L_{1-381}$ | $L_{2-109}$ |
| COMPOUND 9707 | $L_{1-382}$ | $L_{2-1}$ |
| COMPOUND 9708 | $L_{1-382}$ | $L_{2-10}$ |
| COMPOUND 9709 | $L_{1-382}$ | $L_{2-15}$ |
| COMPOUND 9710 | $L_{1-382}$ | $L_{2-20}$ |
| COMPOUND 9711 | $L_{1-382}$ | $L_{2-65}$ |
| COMPOUND 9712 | $L_{1-382}$ | $L_{2-109}$ |
| COMPOUND 9713 | $L_{1-383}$ | $L_{2-1}$ |
| COMPOUND 9714 | $L_{1-383}$ | $L_{2-10}$ |
| COMPOUND 9715 | $L_{1-383}$ | $L_{2-15}$ |
| COMPOUND 9716 | $L_{1-383}$ | $L_{2-20}$ |
| COMPOUND 9717 | $L_{1-383}$ | $L_{2-65}$ |
| COMPOUND 9718 | $L_{1-383}$ | $L_{2-109}$ |
| COMPOUND 9719 | $L_{1-384}$ | $L_{2-1}$ |
| COMPOUND 9720 | $L_{1-384}$ | $L_{2-10}$ |
| COMPOUND 9721 | $L_{1-384}$ | $L_{2-15}$ |
| COMPOUND 9722 | $L_{1-384}$ | $L_{2-20}$ |
| COMPOUND 9723 | $L_{1-384}$ | $L_{2-65}$ |
| COMPOUND 9724 | $L_{1-384}$ | $L_{2-109}$ |

-continued

| | | |
|---|---|---|
| COMPOUND 9725 | $L_{1-385}$ | $L_{2-1}$ |
| COMPOUND 9726 | $L_{1-385}$ | $L_{2-10}$ |
| COMPOUND 9727 | $L_{1-385}$ | $L_{2-15}$ |
| COMPOUND 9728 | $L_{1-385}$ | $L_{2-20}$ |
| COMPOUND 9729 | $L_{1-385}$ | $L_{2-65}$ |
| COMPOUND 9730 | $L_{1-385}$ | $L_{2-109}$ |
| COMPOUND 9731 | $L_{1-386}$ | $L_{2-1}$ |
| COMPOUND 9732 | $L_{1-386}$ | $L_{2-10}$ |
| COMPOUND 9733 | $L_{1-386}$ | $L_{2-15}$ |
| COMPOUND 9734 | $L_{1-386}$ | $L_{2-20}$ |
| COMPOUND 9735 | $L_{1-386}$ | $L_{2-65}$ |
| COMPOUND 9736 | $L_{1-386}$ | $L_{2-109}$ |
| COMPOUND 9737 | $L_{1-387}$ | $L_{2-1}$ |
| COMPOUND 9738 | $L_{1-387}$ | $L_{2-10}$ |
| COMPOUND 9739 | $L_{1-387}$ | $L_{2-15}$ |
| COMPOUND 9740 | $L_{1-387}$ | $L_{2-20}$ |
| COMPOUND 9741 | $L_{1-387}$ | $L_{2-65}$ |
| COMPOUND 9742 | $L_{1-387}$ | $L_{2-109}$ |
| COMPOUND 9743 | $L_{1-388}$ | $L_{2-1}$ |
| COMPOUND 9744 | $L_{1-388}$ | $L_{2-10}$ |
| COMPOUND 9745 | $L_{1-388}$ | $L_{2-15}$ |
| COMPOUND 9746 | $L_{1-388}$ | $L_{2-20}$ |
| COMPOUND 9747 | $L_{1-388}$ | $L_{2-65}$ |
| COMPOUND 9748 | $L_{1-388}$ | $L_{2-109}$ |
| COMPOUND 9749 | $L_{1-389}$ | $L_{2-1}$ |
| COMPOUND 9750 | $L_{1-389}$ | $L_{2-10}$ |
| COMPOUND 9751 | $L_{1-389}$ | $L_{2-15}$ |
| COMPOUND 9752 | $L_{1-389}$ | $L_{2-20}$ |
| COMPOUND 9753 | $L_{1-389}$ | $L_{2-65}$ |
| COMPOUND 9754 | $L_{1-389}$ | $L_{2-109}$ |
| COMPOUND 9755 | $L_{1-390}$ | $L_{2-1}$ |
| COMPOUND 9756 | $L_{1-390}$ | $L_{2-10}$ |
| COMPOUND 9757 | $L_{1-390}$ | $L_{2-15}$ |
| COMPOUND 9758 | $L_{1-390}$ | $L_{2-20}$ |
| COMPOUND 9759 | $L_{1-390}$ | $L_{2-65}$ |
| COMPOUND 9760 | $L_{1-390}$ | $L_{2-109}$ |
| COMPOUND 9761 | $L_{1-391}$ | $L_{2-1}$ |
| COMPOUND 9762 | $L_{1-391}$ | $L_{2-10}$ |
| COMPOUND 9763 | $L_{1-391}$ | $L_{2-15}$ |
| COMPOUND 9764 | $L_{1-391}$ | $L_{2-20}$ |
| COMPOUND 9765 | $L_{1-391}$ | $L_{2-65}$ |
| COMPOUND 9766 | $L_{1-391}$ | $L_{2-109}$ |
| COMPOUND 9767 | $L_{1-392}$ | $L_{2-1}$ |
| COMPOUND 9768 | $L_{1-392}$ | $L_{2-10}$ |
| COMPOUND 9769 | $L_{1-392}$ | $L_{2-15}$ |
| COMPOUND 9770 | $L_{1-392}$ | $L_{2-20}$ |
| COMPOUND 9771 | $L_{1-392}$ | $L_{2-65}$ |
| COMPOUND 9772 | $L_{1-392}$ | $L_{2-109}$ |
| COMPOUND 9773 | $L_{1-393}$ | $L_{2-1}$ |
| COMPOUND 9774 | $L_{1-393}$ | $L_{2-10}$ |
| COMPOUND 9775 | $L_{1-393}$ | $L_{2-15}$ |
| COMPOUND 9776 | $L_{1-393}$ | $L_{2-20}$ |
| COMPOUND 9777 | $L_{1-393}$ | $L_{2-65}$ |
| COMPOUND 9778 | $L_{1-393}$ | $L_{2-109}$ |
| COMPOUND 9779 | $L_{1-394}$ | $L_{2-1}$ |
| COMPOUND 9780 | $L_{1-394}$ | $L_{2-10}$ |
| COMPOUND 9781 | $L_{1-394}$ | $L_{2-15}$ |
| COMPOUND 9782 | $L_{1-394}$ | $L_{2-20}$ |
| COMPOUND 9783 | $L_{1-394}$ | $L_{2-65}$ |
| COMPOUND 9784 | $L_{1-394}$ | $L_{2-109}$ |
| COMPOUND 9785 | $L_{1-395}$ | $L_{2-1}$ |
| COMPOUND 9786 | $L_{1-395}$ | $L_{2-10}$ |
| COMPOUND 9787 | $L_{1-395}$ | $L_{2-15}$ |
| COMPOUND 9788 | $L_{1-395}$ | $L_{2-20}$ |
| COMPOUND 9789 | $L_{1-395}$ | $L_{2-65}$ |
| COMPOUND 9790 | $L_{1-395}$ | $L_{2-109}$ |
| COMPOUND 9791 | $L_{1-396}$ | $L_{2-1}$ |
| COMPOUND 9792 | $L_{1-396}$ | $L_{2-10}$ |
| COMPOUND 9793 | $L_{1-396}$ | $L_{2-15}$ |
| COMPOUND 9794 | $L_{1-396}$ | $L_{2-20}$ |
| COMPOUND 9795 | $L_{1-396}$ | $L_{2-65}$ |
| COMPOUND 9796 | $L_{1-396}$ | $L_{2-109}$ |

-continued
$L_{1-1}$
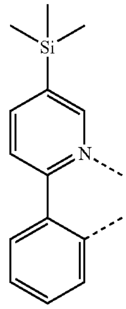
$L_{1-2}$
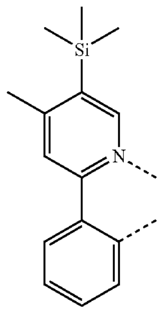
$L_{1-3}$
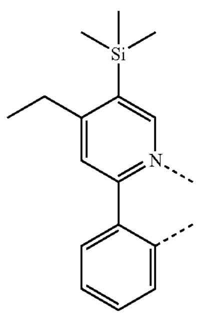
$L_{1-4}$
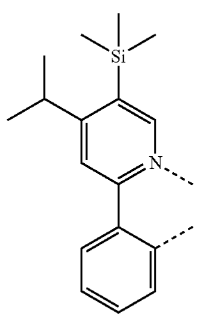
$L_{1-5}$
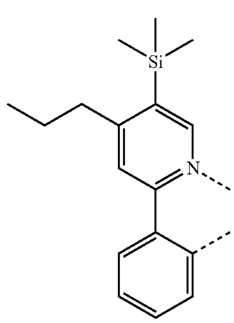
$L_{1-6}$
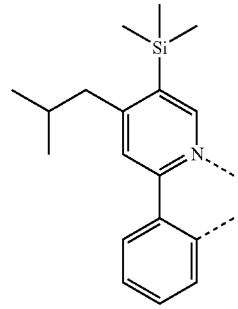
$L_{1-7}$
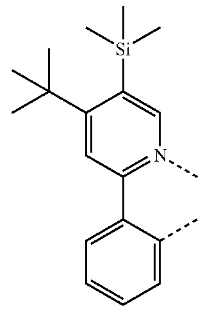
$L_{1-8}$
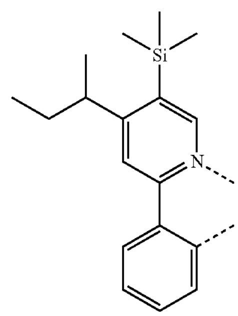
$L_{1-9}$
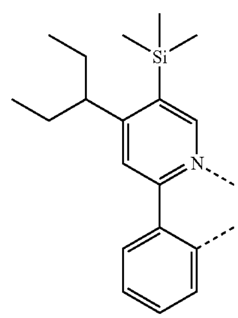
$L_{1-10}$
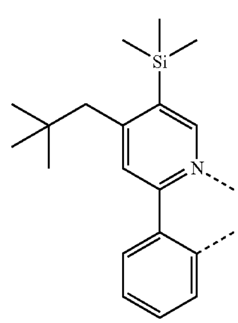

-continued
L1-11
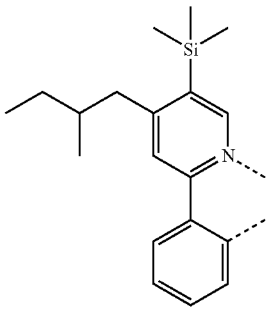
L1-12
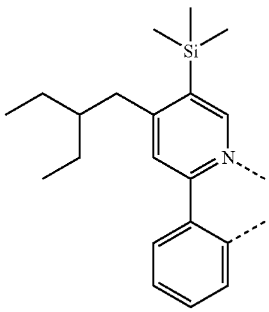
L1-13
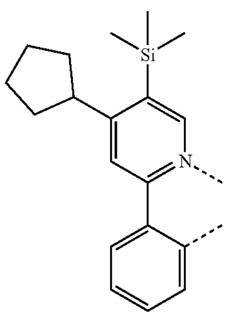
L1-14
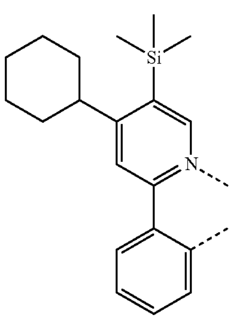
L1-15
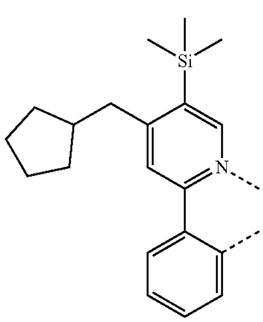
-continued
L1-16
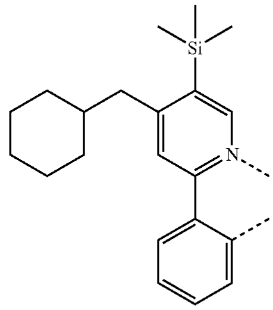
L1-17
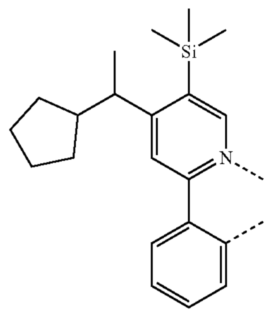
L1-18
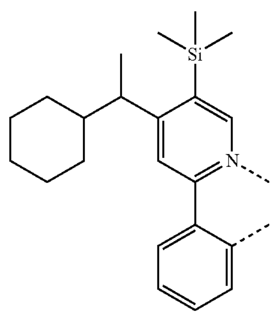
L1-19
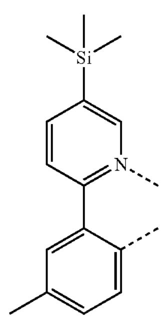
L1-20
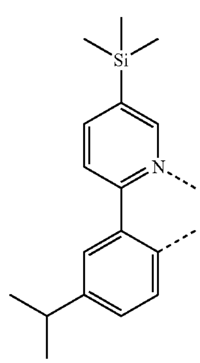

-continued
L1-21
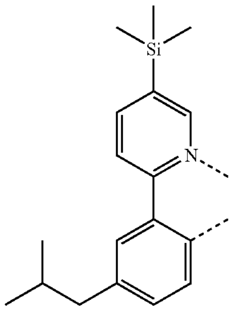
L1-22
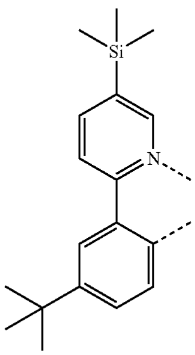
L1-23
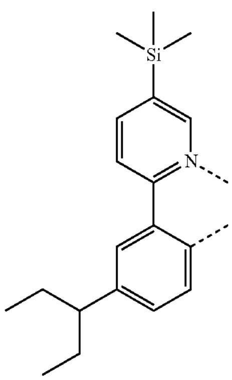
L1-24
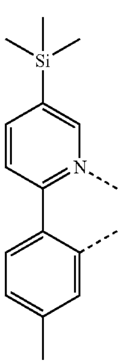
-continued
L1-25
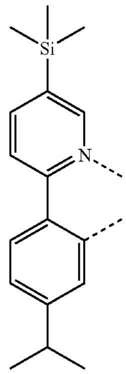
L1-26
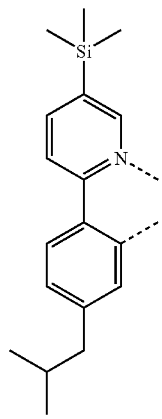
L1-27
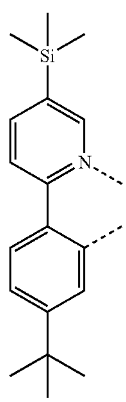
L1-28
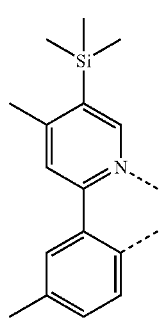

-continued
$L_{1-29}$
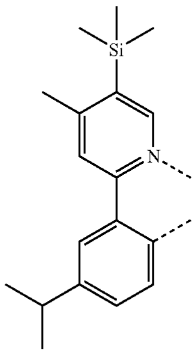
$L_{1-30}$
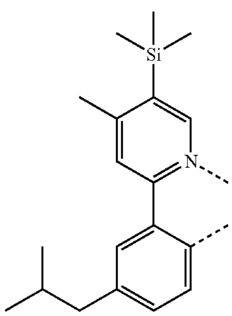
$L_{1-31}$
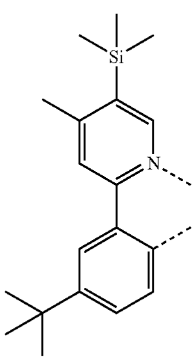
$L_{1-32}$
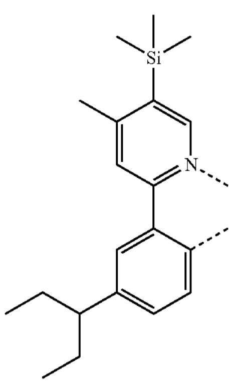
-continued
$L_{1-33}$
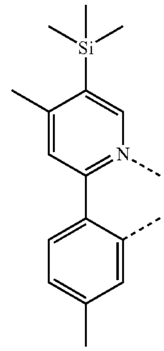
$L_{1-34}$
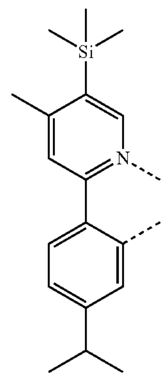
$L_{1-35}$
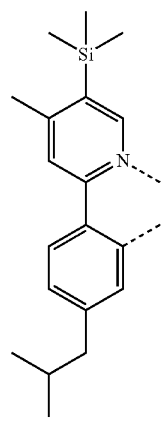
$L_{1-36}$
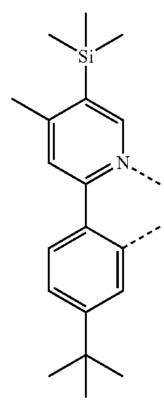

-continued
L1-37
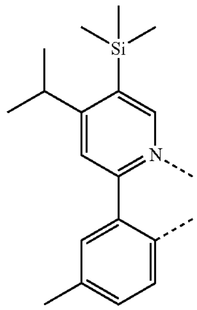
L1-38
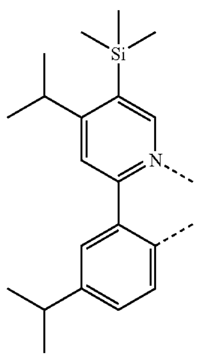
L1-39
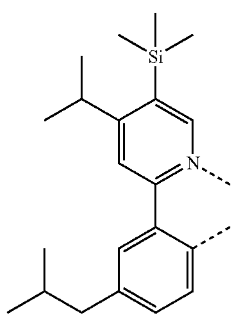
L1-40
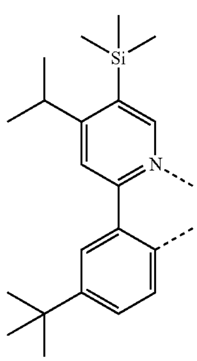
-continued
L1-41
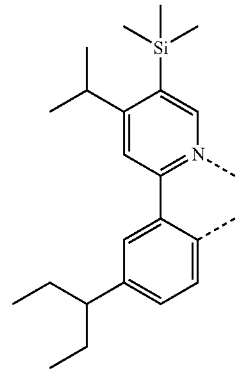
L1-42
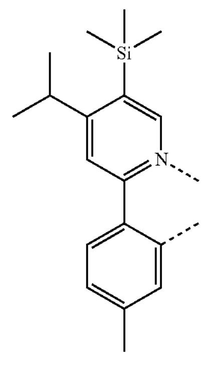
L1-43
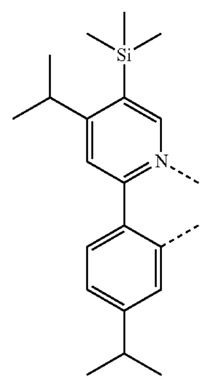
L1-44
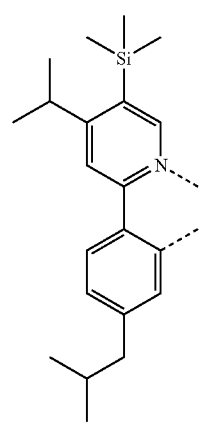

-continued
L1-45
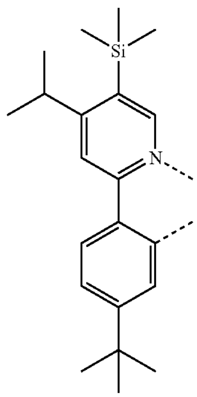
L1-46
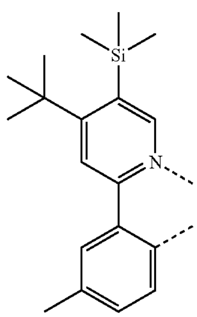
L1-47
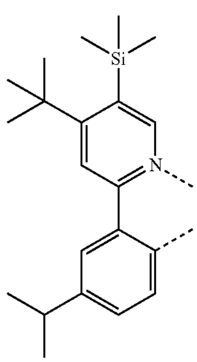
L1-48
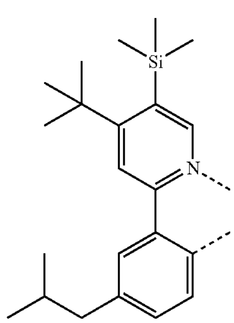
-continued
L1-49
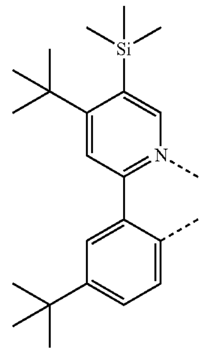
L1-50
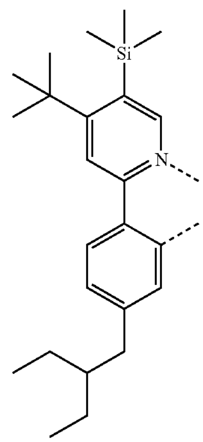
L1-51
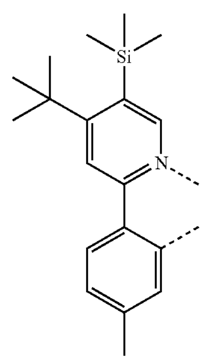
L1-52
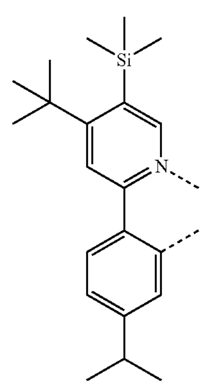

-continued
L1-53
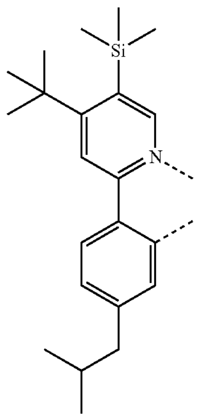
L1-54
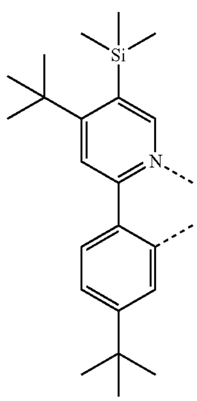
L1-55
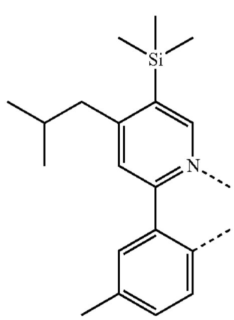
L1-56
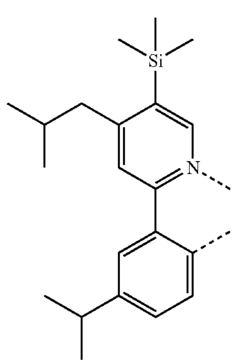
-continued
L1-57
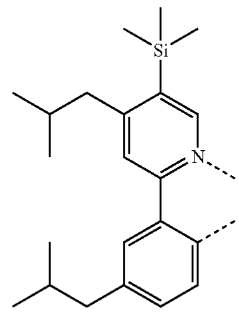
L1-58
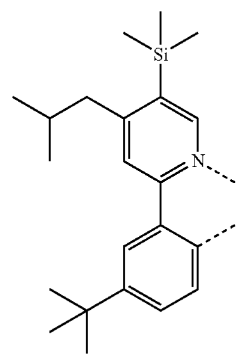
L1-59
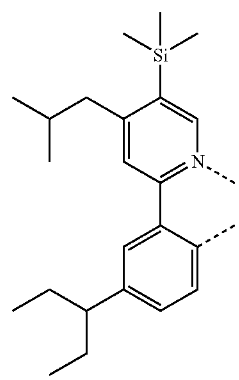
L1-60
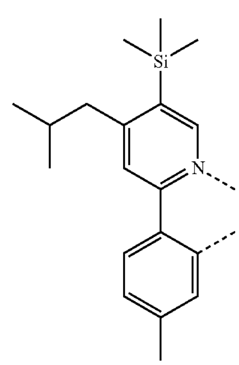

-continued
$L_{1-61}$
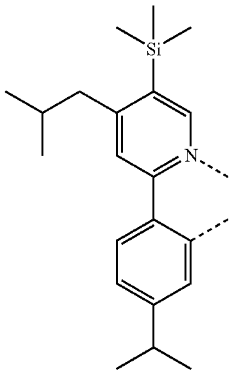
$L_{1-62}$
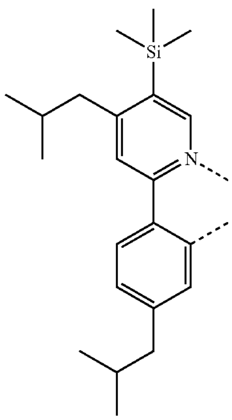
$L_{1-63}$
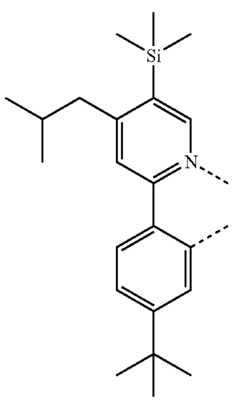
$L_{1-64}$
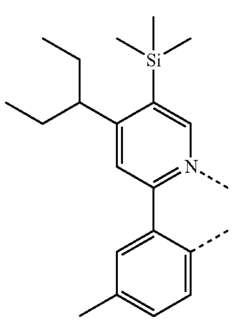
-continued
$L_{1-65}$
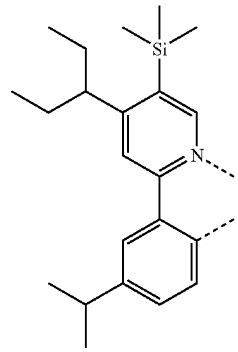
$L_{1-66}$
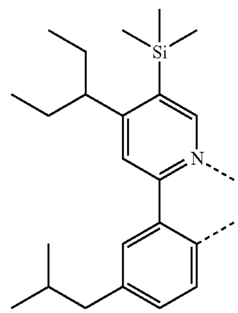
$L_{1-67}$
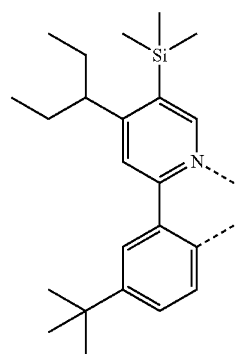
$L_{1-68}$
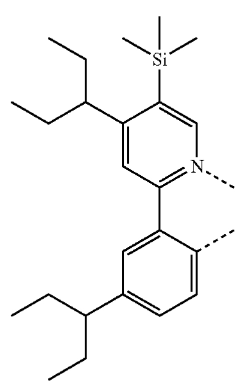

-continued
L1-69
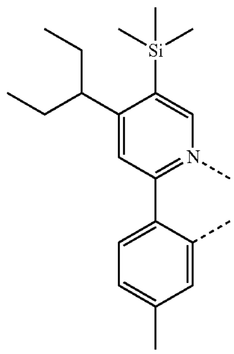
L1-70
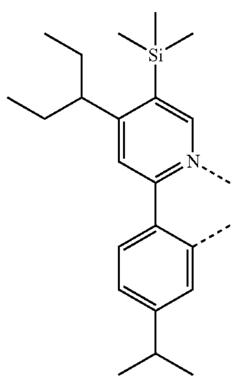
L1-71
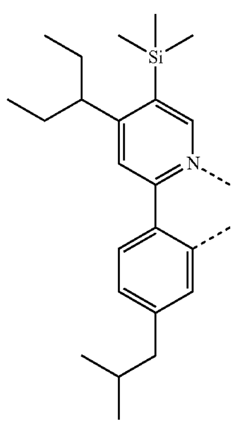
L1-72
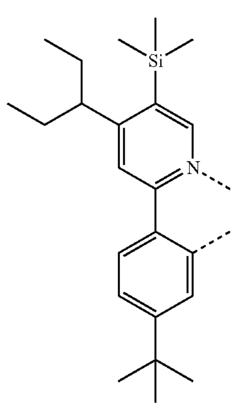
-continued
L1-73
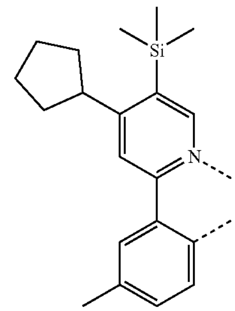
L1-74
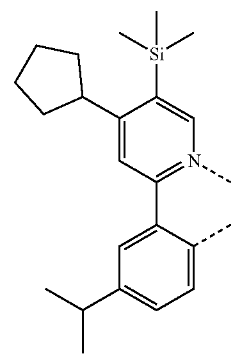
L1-75
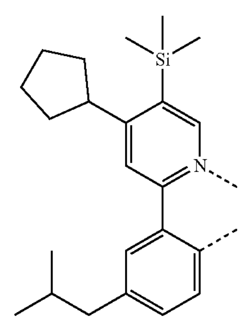
L1-76
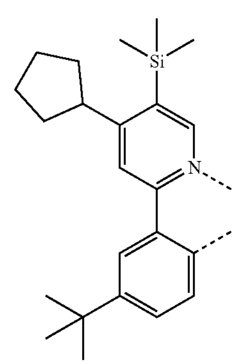

532
-continued
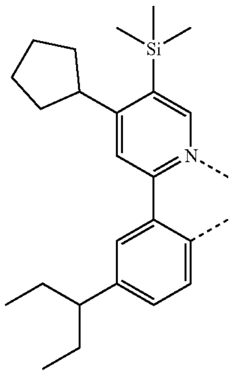
$L_{1\text{-}77}$
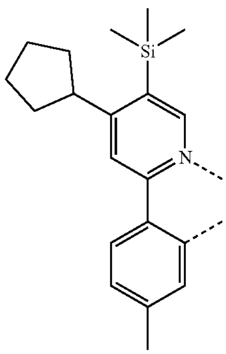
$L_{1\text{-}78}$
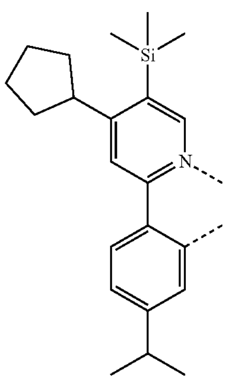
$L_{1\text{-}79}$
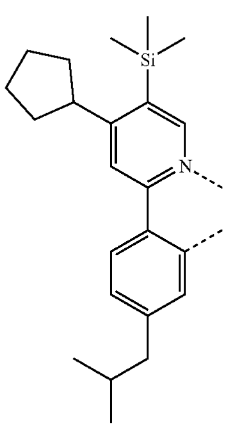
$L_{1\text{-}80}$
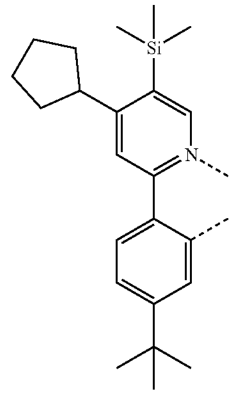
$L_{1\text{-}81}$
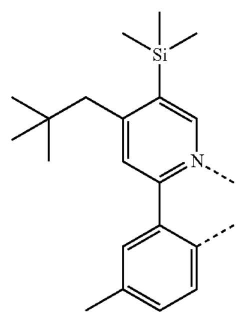
$L_{1\text{-}82}$
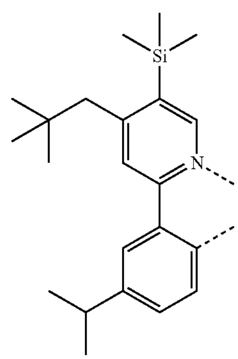
$L_{1\text{-}83}$
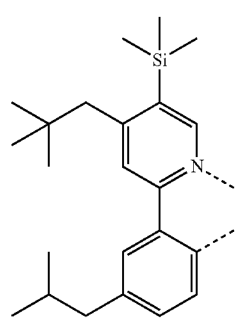
$L_{1\text{-}84}$ -continued
$L_{1-85}$
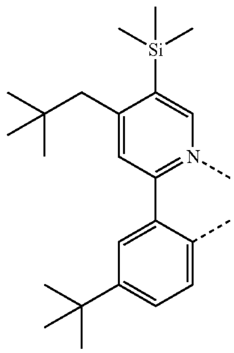
$L_{1-86}$
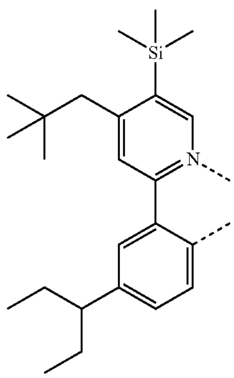
$L_{1-87}$
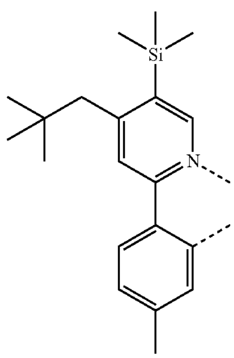
$L_{1-88}$
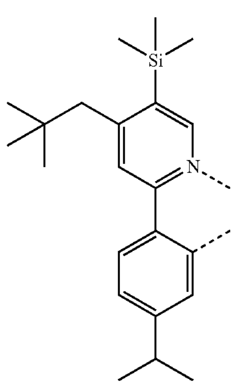
-continued
$L_{1-89}$
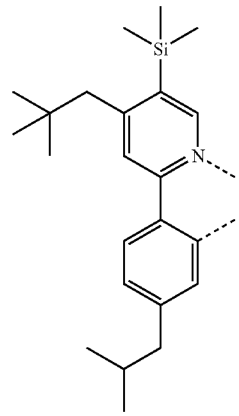
$L_{1-90}$
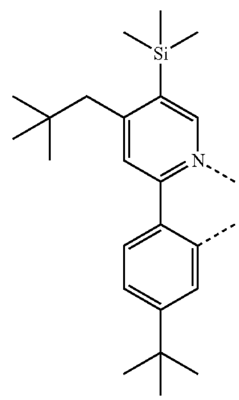
$L_{1-91}$
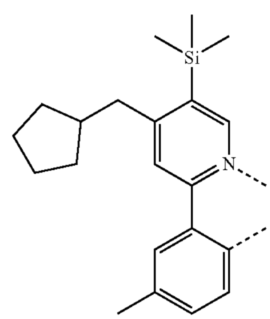
$L_{1-92}$
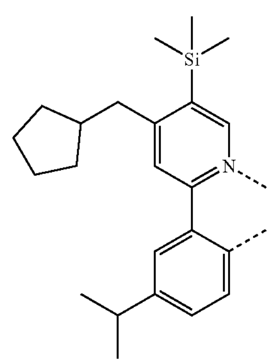

$L_{1-93}$
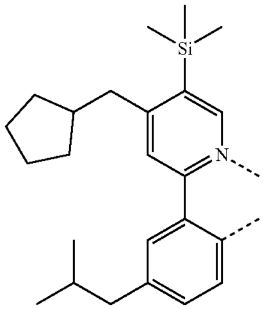
$L_{1-94}$
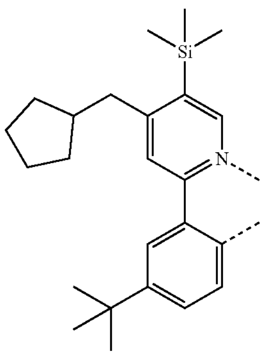
$L_{1-95}$
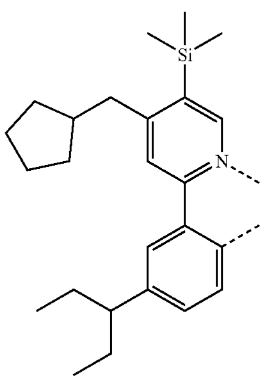
$L_{1-96}$
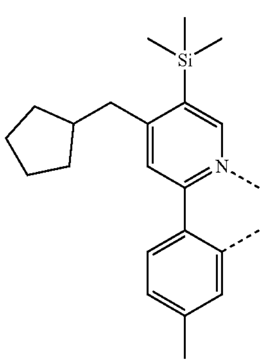
$L_{1-97}$
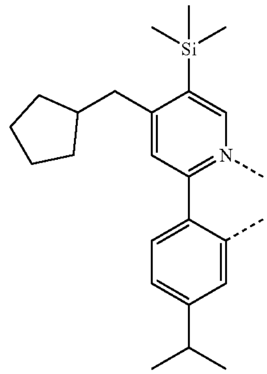
$L_{1-98}$
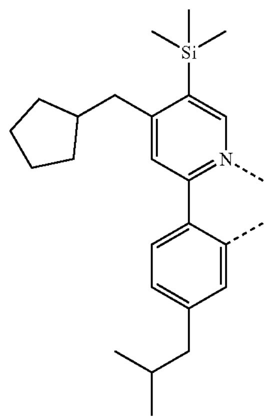
$L_{1-99}$
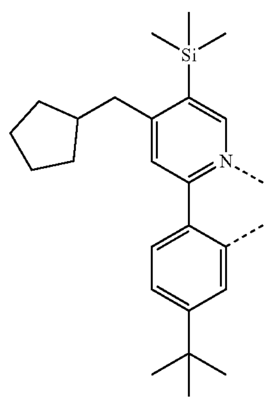
$L_{1-100}$
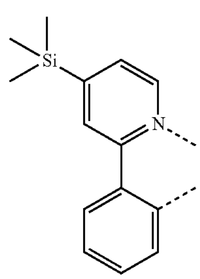

-continued
L1-101
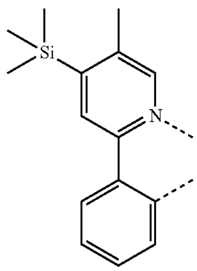
L1-102
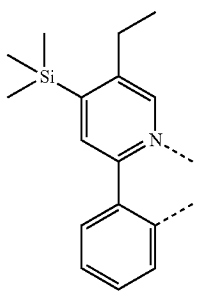
L1-103
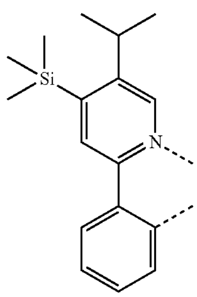
L1-104
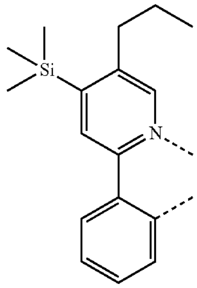
L1-105
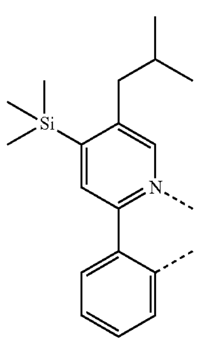
-continued
L1-106
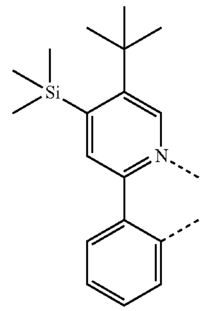
L1-107
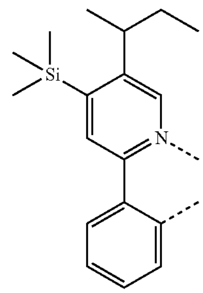
L1-108
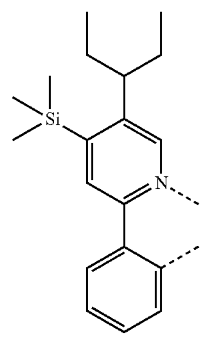
L1-109
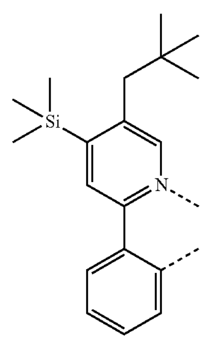
L1-110
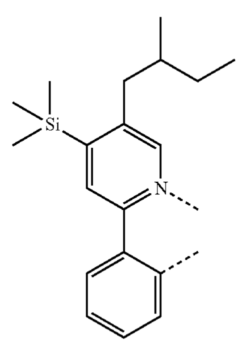

-continued
L1-111
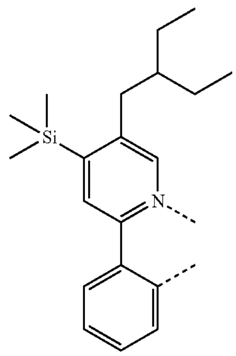
L1-112
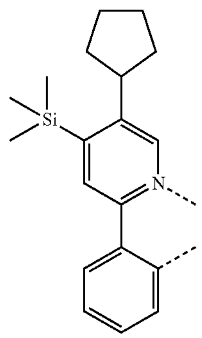
L1-113
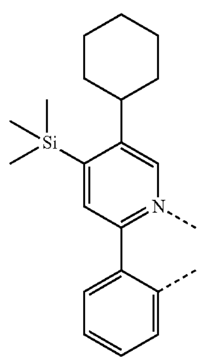
L1-114
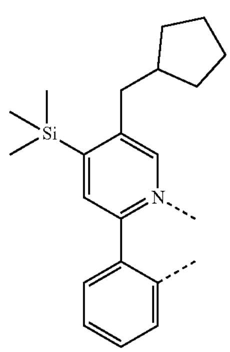
-continued
L1-115
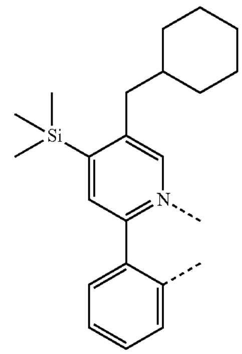
L1-116
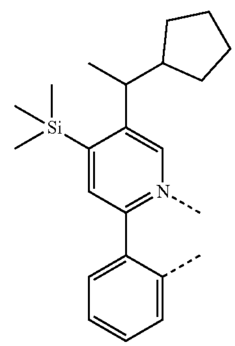
L1-117
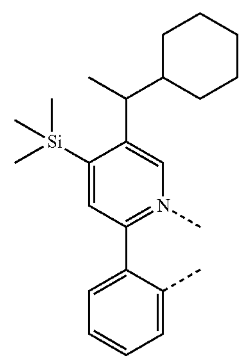
L1-118
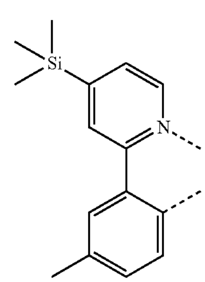

-continued
L1-119
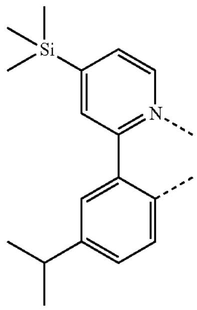
L1-120
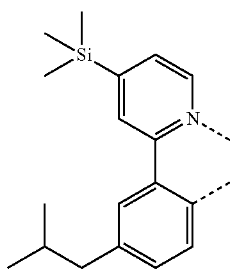
L1-121
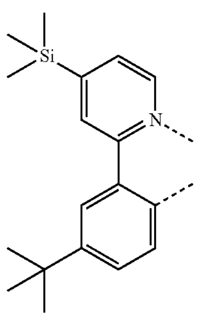
L1-122
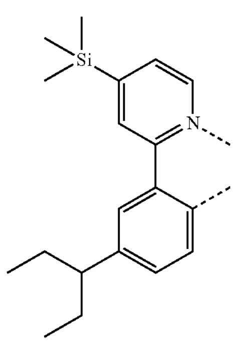
L1-123
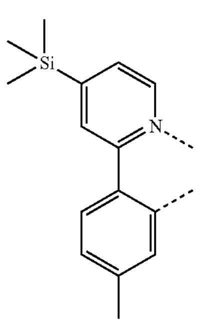
-continued
L1-124
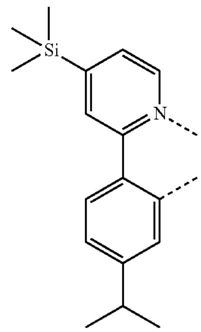
L1-125
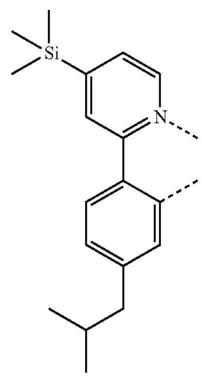
L1-126
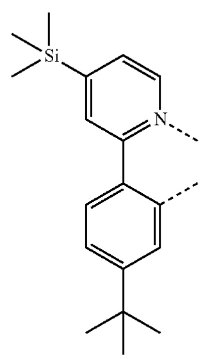
L1-127
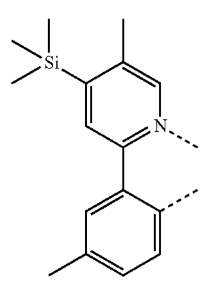

-continued
L1-128
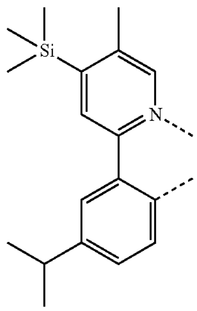
L1-129
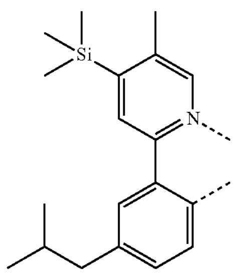
L1-130
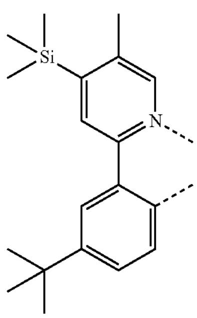
L1-131
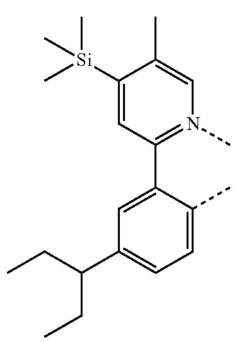
L1-132
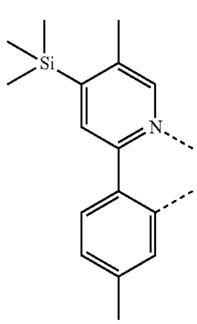
-continued
L1-133
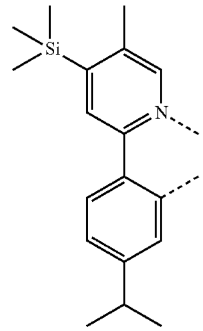
L1-134
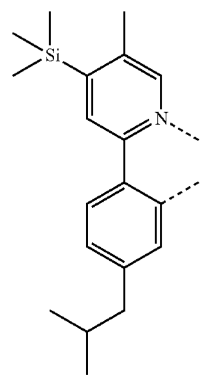
L1-135
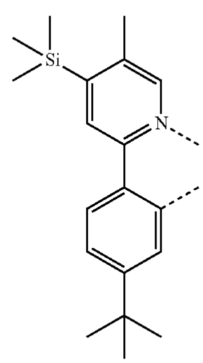
L1-136
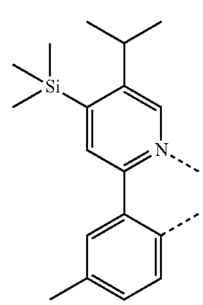

-continued
$L_{1-137}$
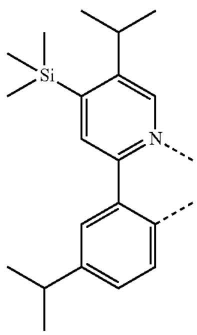
$L_{1-138}$
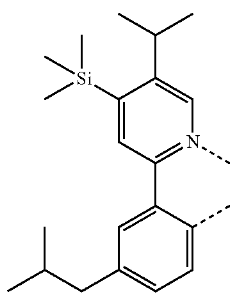
$L_{1-139}$
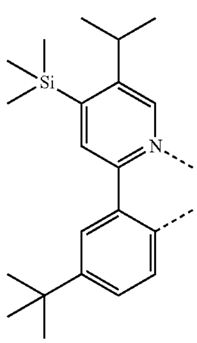
$L_{1-140}$
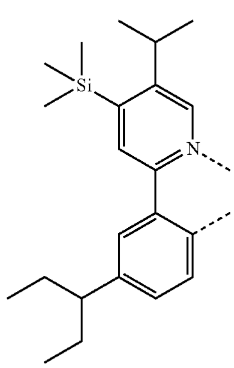
-continued
$L_{1-141}$
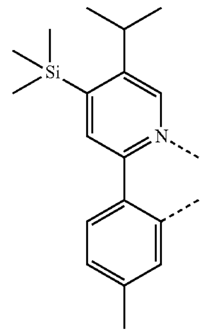
$L_{1-142}$
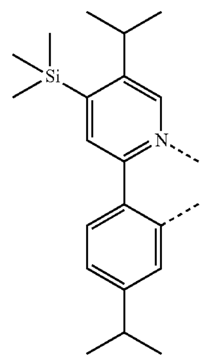
$L_{1-143}$
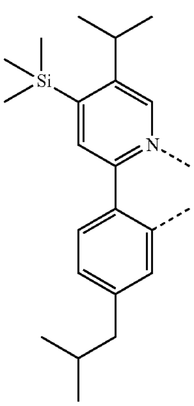
$L_{1-144}$
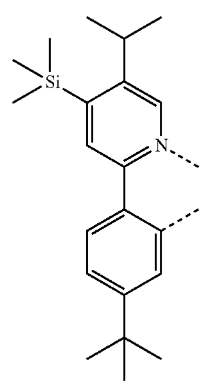

-continued
$L_{1-145}$
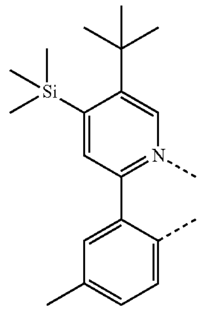
$L_{1-146}$
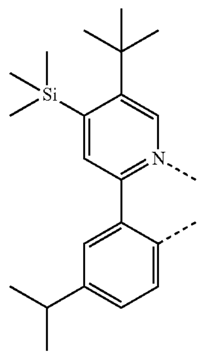
$L_{1-147}$
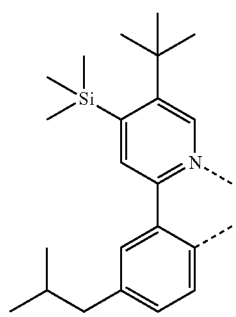
$L_{1-148}$
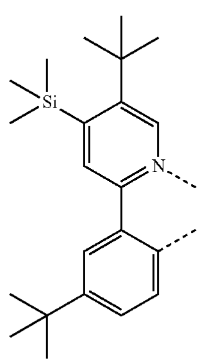
-continued
$L_{1-149}$
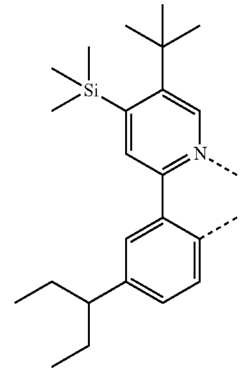
$L_{1-150}$
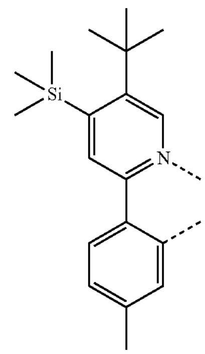
$L_{1-151}$
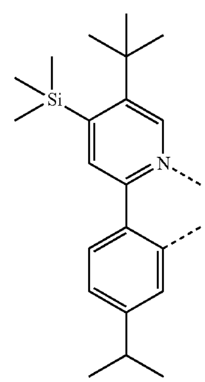
$L_{1-152}$
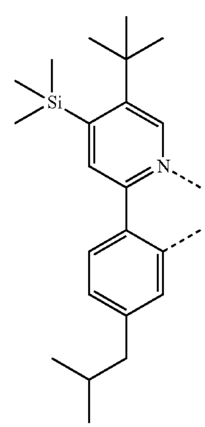

-continued
$L_{1-153}$
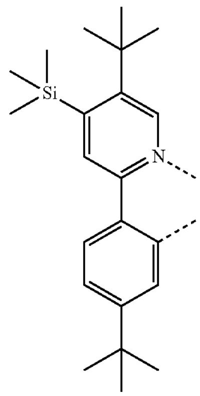
$L_{1-154}$
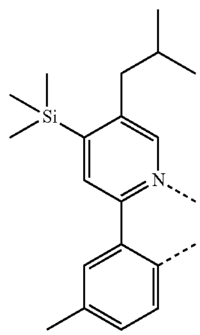
$L_{1-155}$
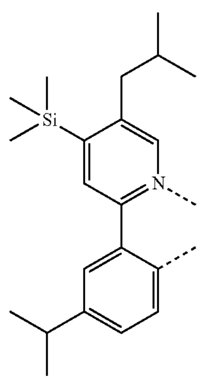
$L_{1-156}$
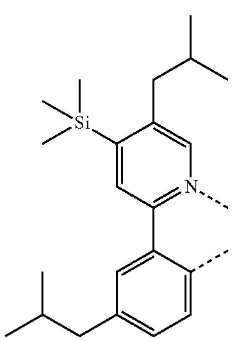
-continued
$L_{1-157}$
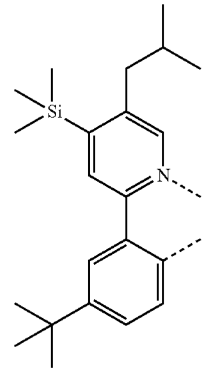
$L_{1-158}$
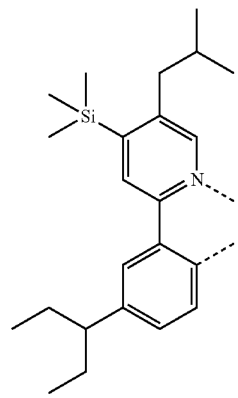
$L_{1-159}$
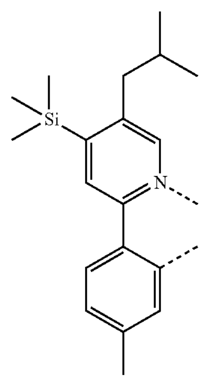
$L_{1-160}$
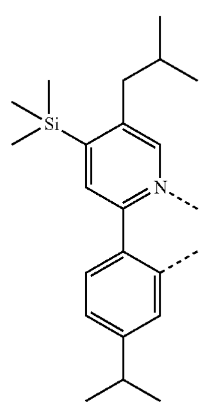

-continued
$L_{1-161}$
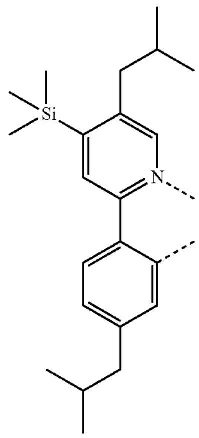
$L_{1-162}$
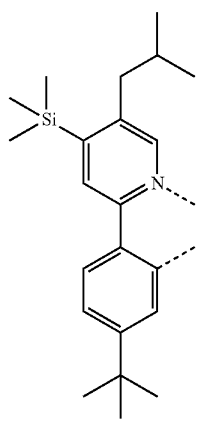
$L_{1-163}$
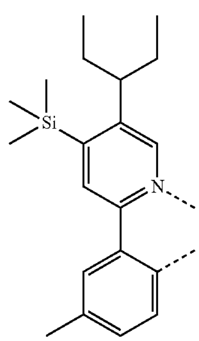
$L_{1-164}$
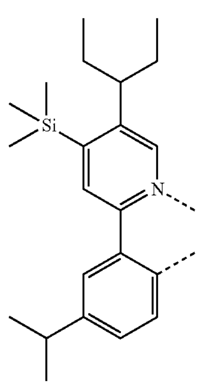
-continued
$L_{1-165}$
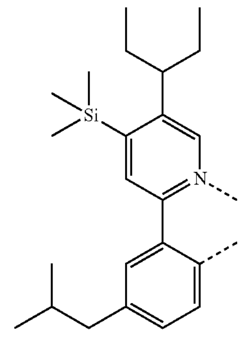
$L_{1-166}$
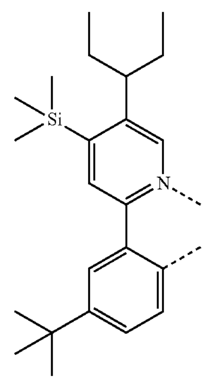
$L_{1-167}$
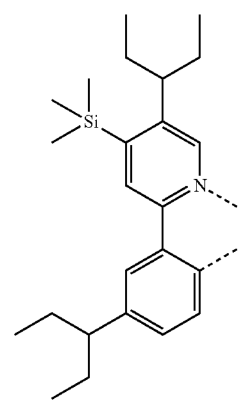
$L_{1-168}$
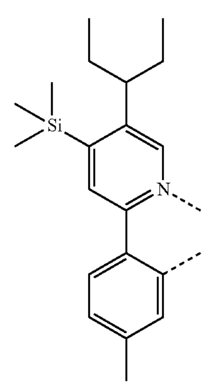

$L_{1-169}$
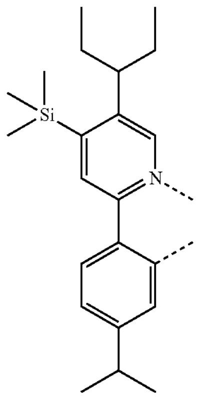
$L_{1-170}$
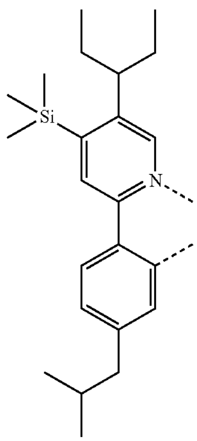
$L_{1-171}$
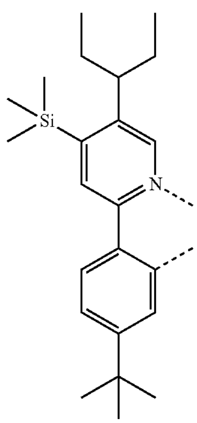
$L_{1-172}$
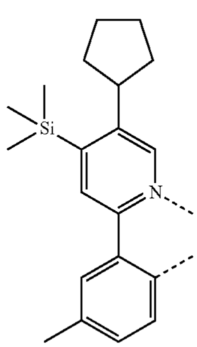
$L_{1-173}$
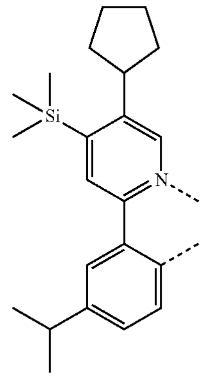
$L_{1-174}$
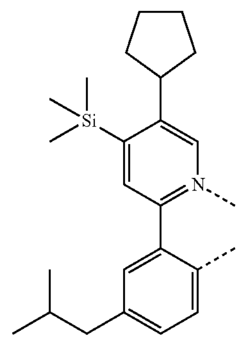
$L_{1-175}$
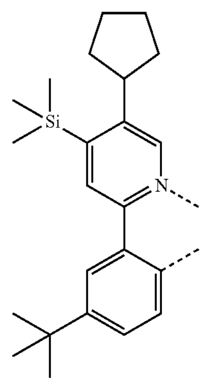
$L_{1-176}$
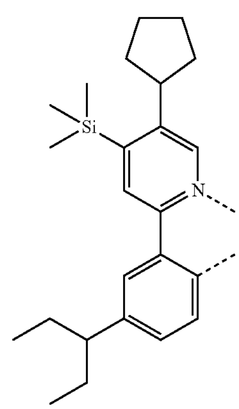

-continued
$L_{1-177}$
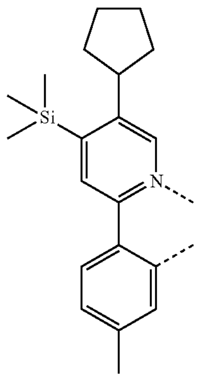
$L_{1-178}$
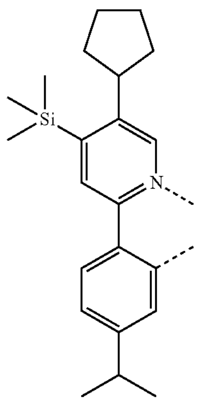
$L_{1-179}$
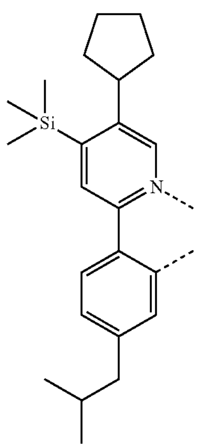
$L_{1-180}$
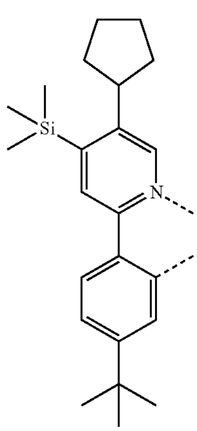
-continued
$L_{1-181}$
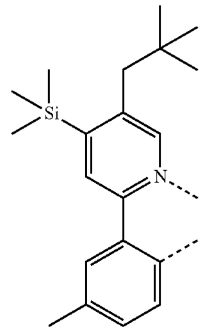
$L_{1-182}$
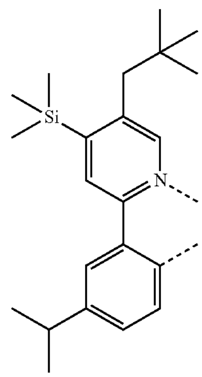
$L_{1-183}$
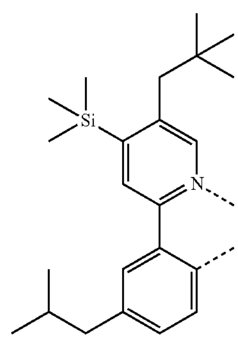
$L_{1-184}$
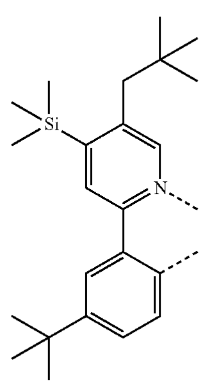

-continued
L1-185
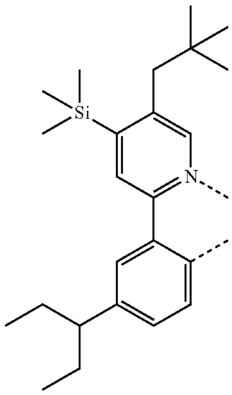
L1-186
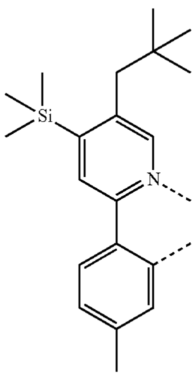
L1-187
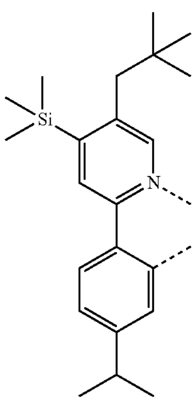
L1-188
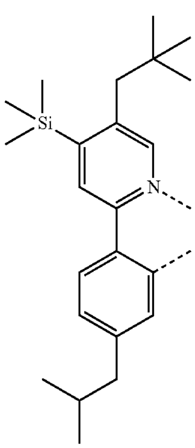
-continued
L1-189
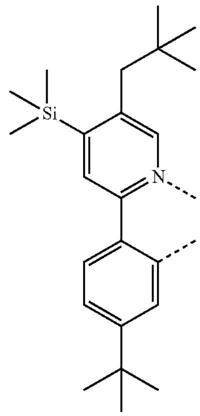
L1-190
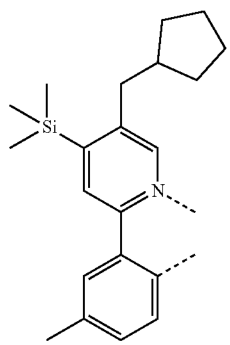
L1-191
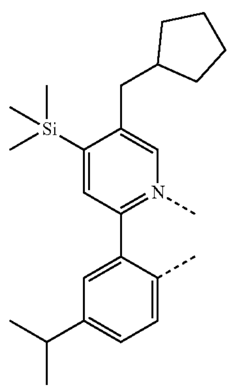
L1-192
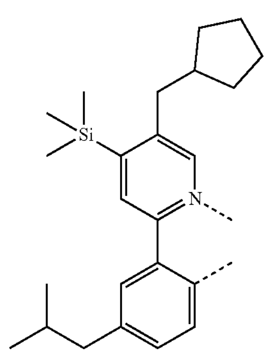

-continued
L1-193
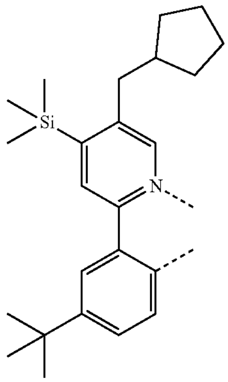
L1-194
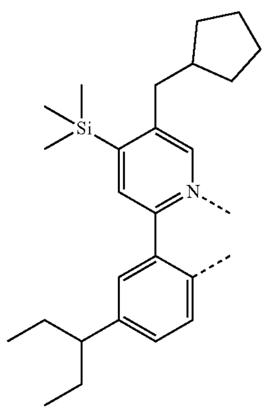
L1-195
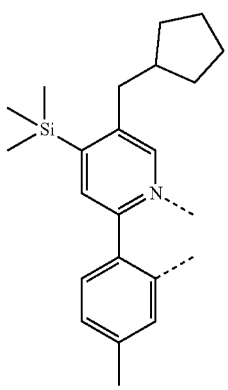
L1-196
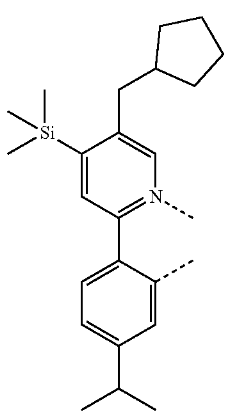
-continued
L1-197
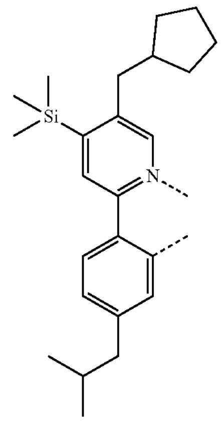
L1-198
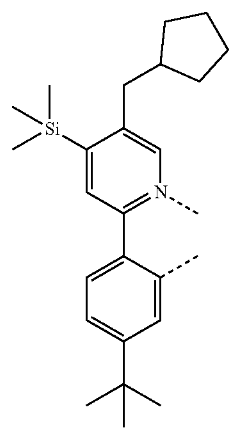
L1-199
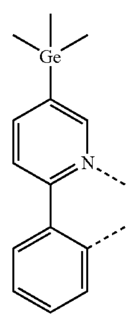
L1-200
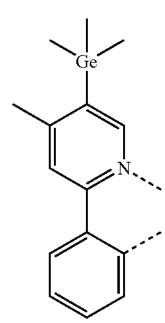

-continued
$L_{1-201}$
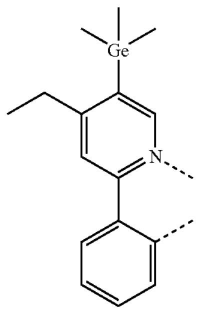
$L_{1-202}$
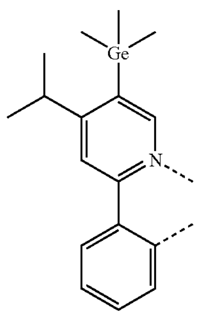
$L_{1-203}$
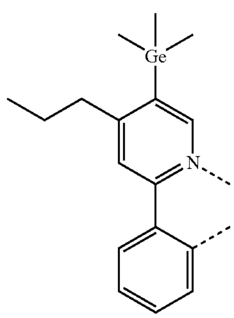
$L_{1-204}$
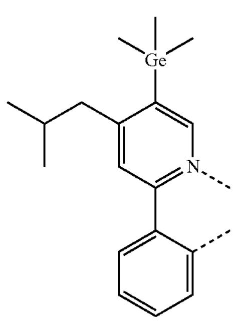
$L_{1-205}$
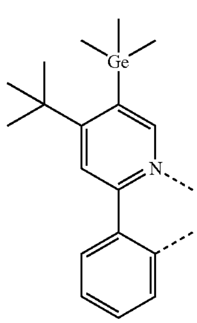
-continued
$L_{1-206}$
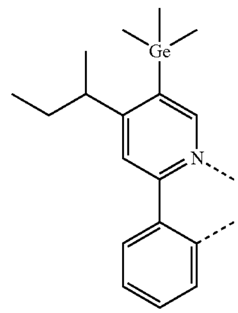
$L_{1-207}$
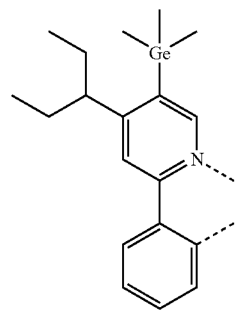
$L_{1-208}$
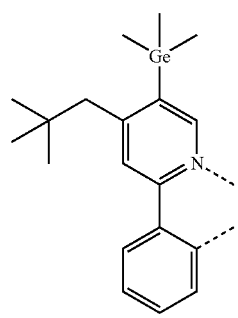
$L_{1-209}$
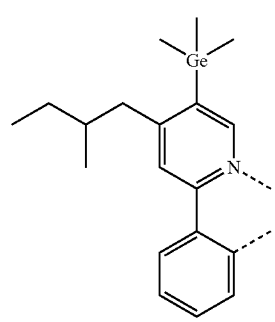
$L_{1-210}$
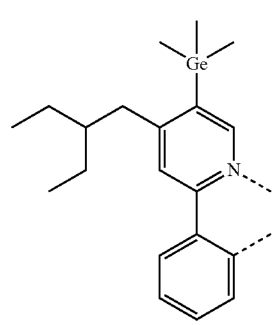

L1-211
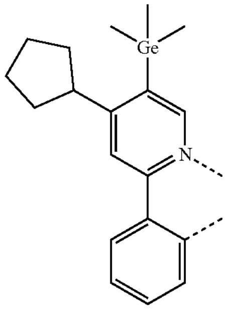
L1-212
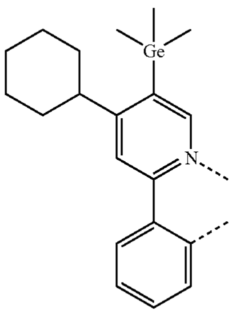
L1-213
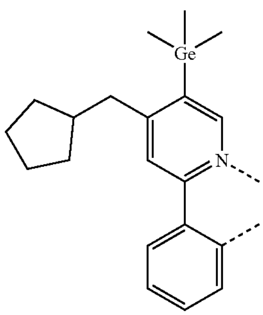
L1-214
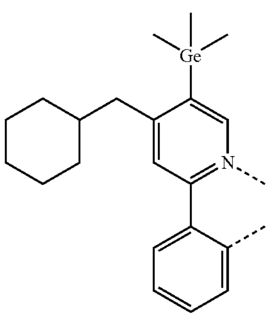
L1-215
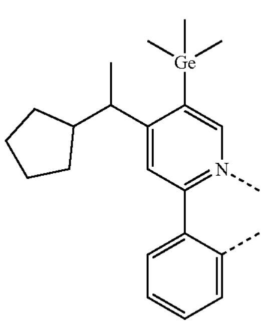
L1-216
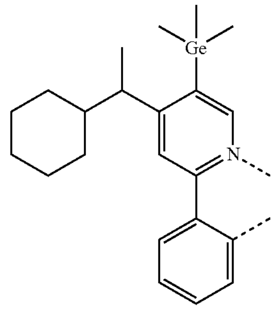
L1-217
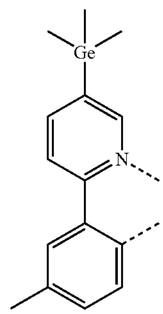
L1-218
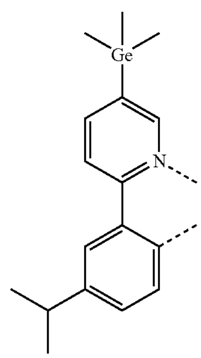
L1-219
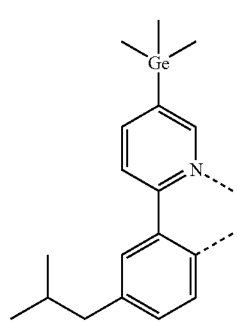

-continued
L1-220
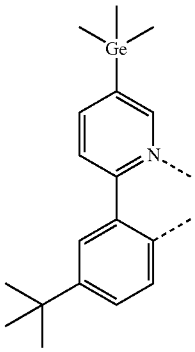
L1-221
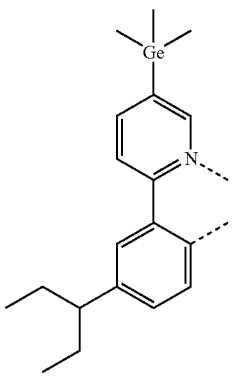
L1-222
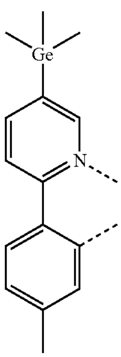
L1-223
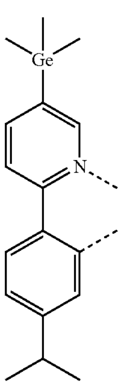
-continued
L1-224
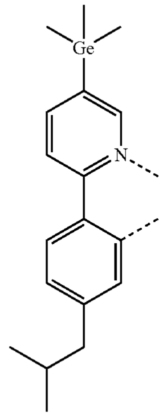
L1-225
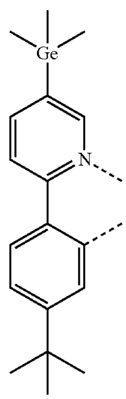
L1-226
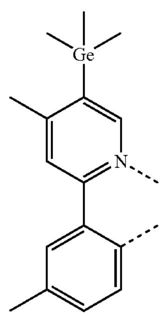
L1-227
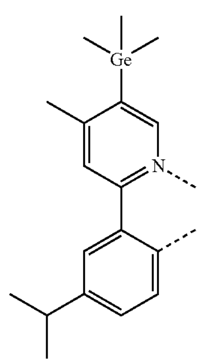

L1-228
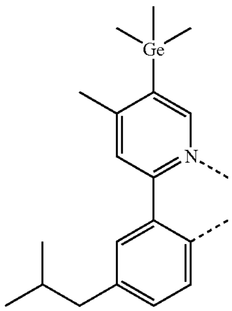
L1-229
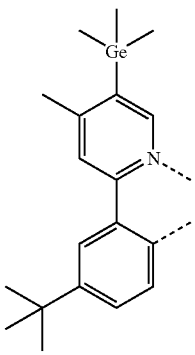
L1-230
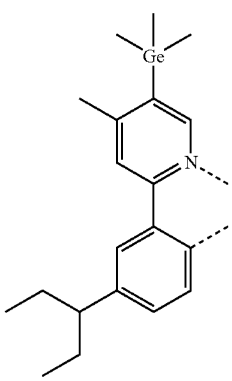
L1-231
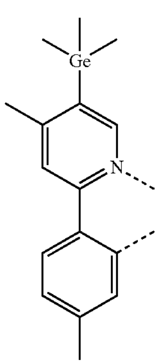
L1-232
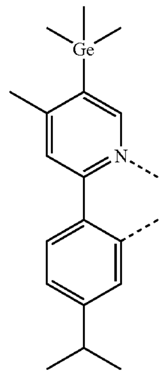
L1-223
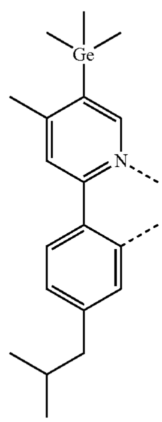
L1-234
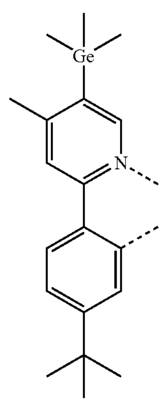
L1-235
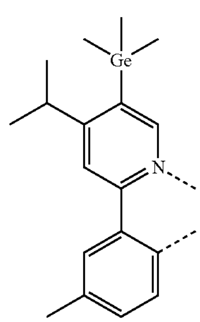

-continued
L1-236
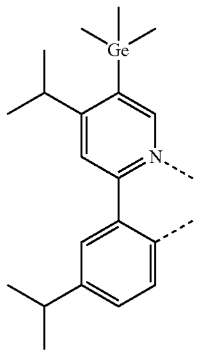
L1-237
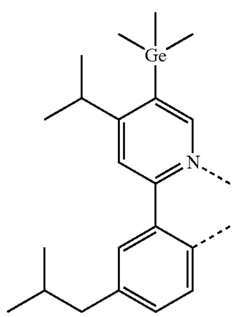
L1-238
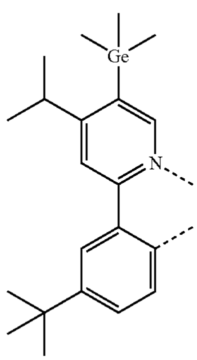
L1-239
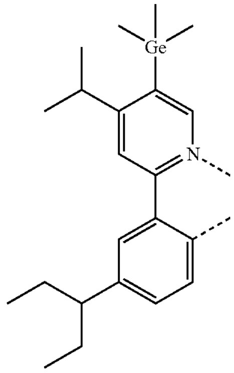
-continued
L1-240
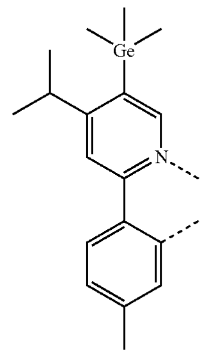
L1-241
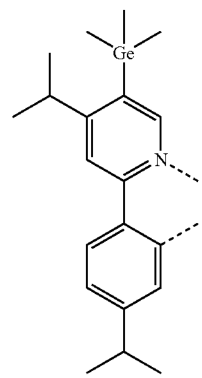
L1-242
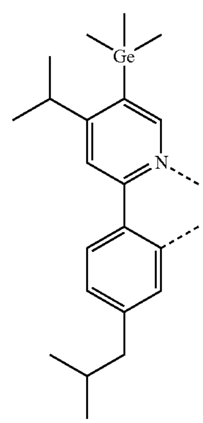
L1-243
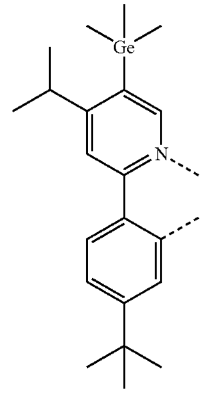

-continued
L$_{1-244}$
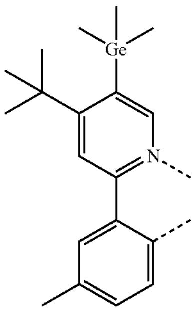
L$_{1-245}$
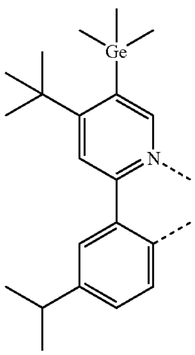
L$_{1-246}$
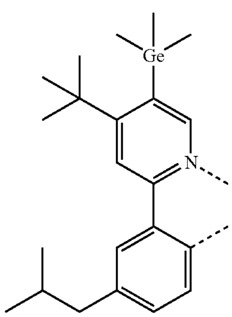
L$_{1-247}$
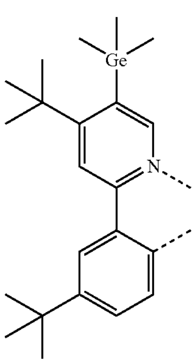
-continued
L$_{1-248}$
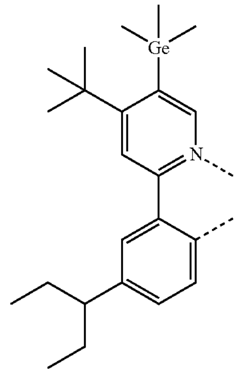
L$_{1-249}$
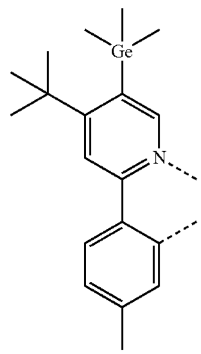
L$_{1-250}$
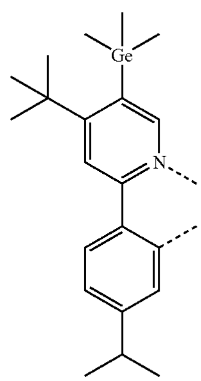
L$_{1-251}$
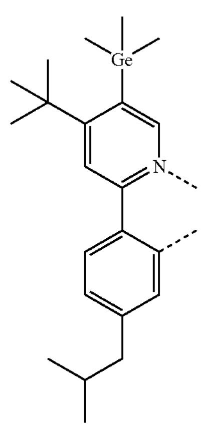

-continued
L1-252
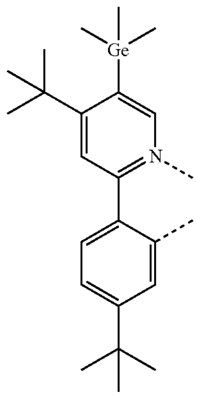
L1-253
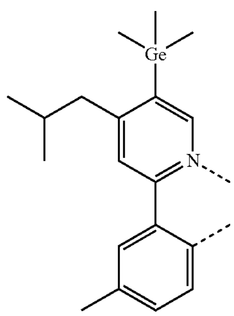
L1-254
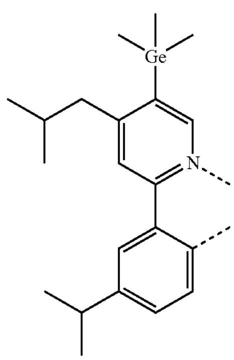
L1-255
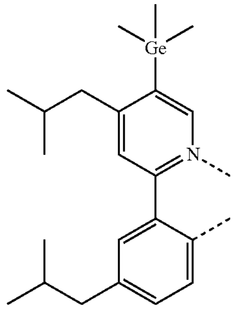
-continued
L1-256
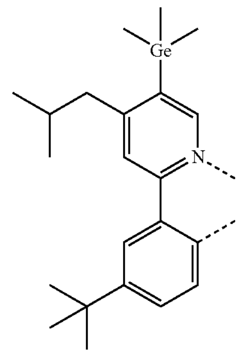
L1-257
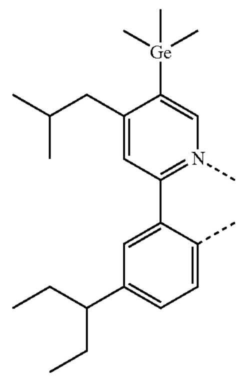
L1-258
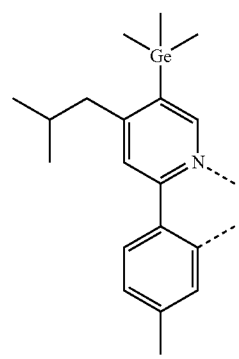
L1-259
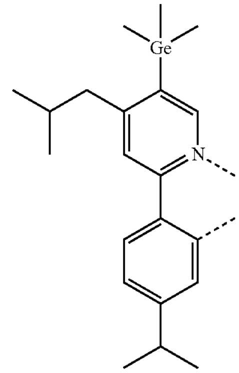

L1-260
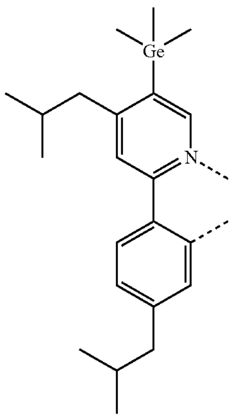
L1-261
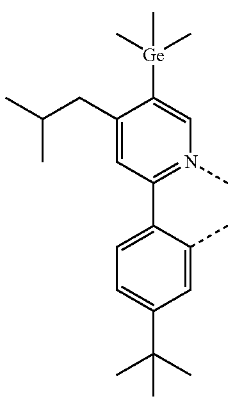
L1-262
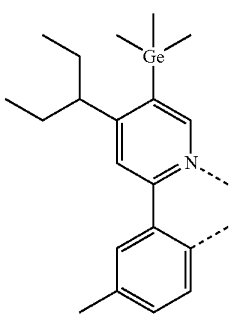
L1-263
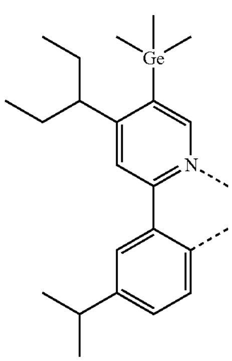
L1-264
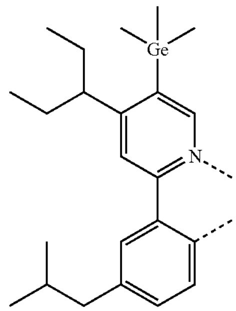
L1-265
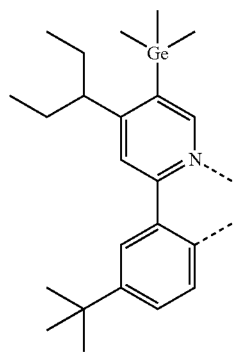
L1-266
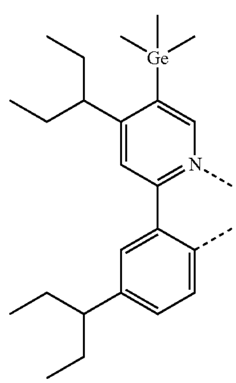
L1-267
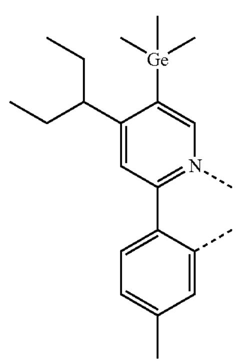

-continued
$L_{1-268}$
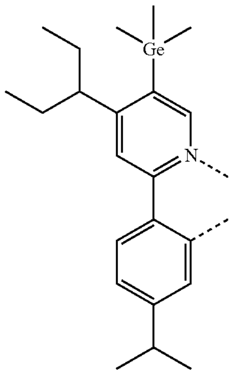
$L_{1-269}$
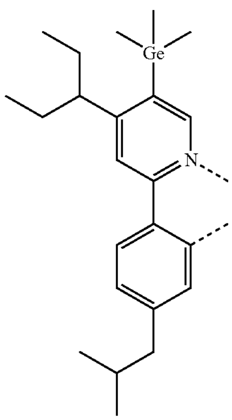
$L_{1-270}$
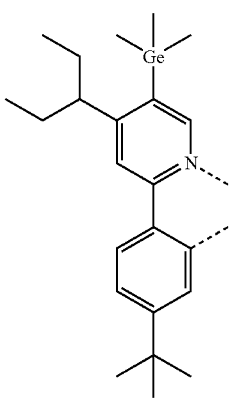
$L_{1-271}$
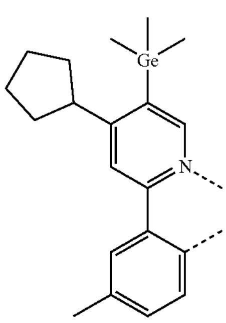
-continued
$L_{1-272}$
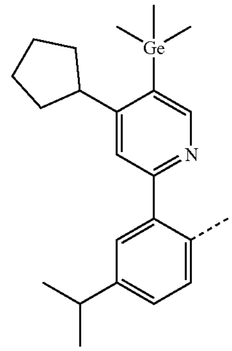
$L_{1-273}$
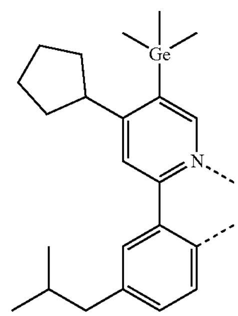
$L_{1-274}$
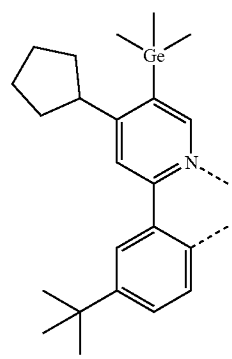
$L_{1-275}$
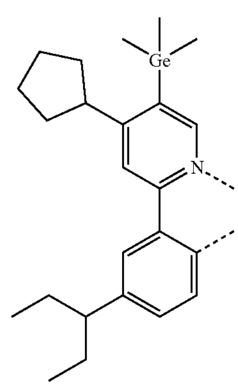

L1-276
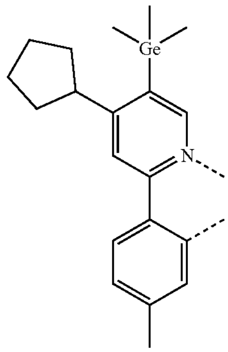
L1-277
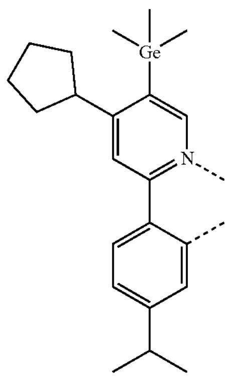
L1-278
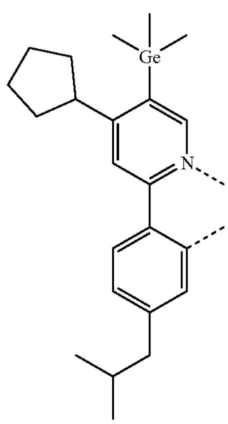
L1-279
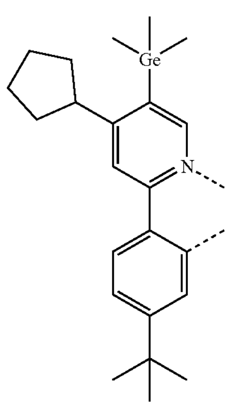
L1-280
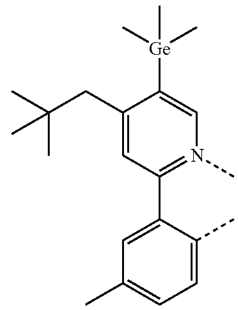
L1-281
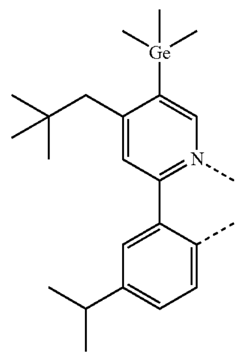
L1-282
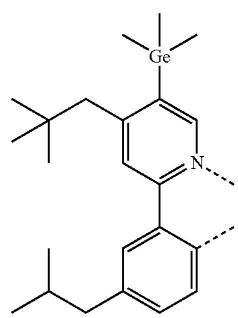
L1-283
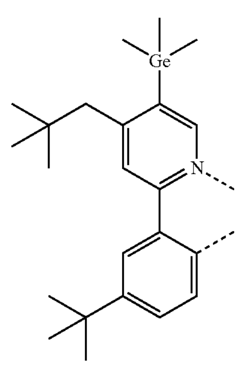

-continued
$L_{1-284}$
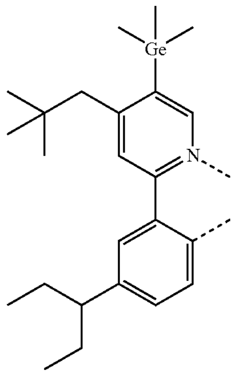
$L_{1-285}$
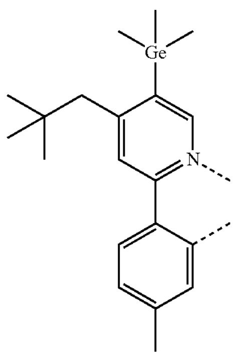
$L_{1-286}$
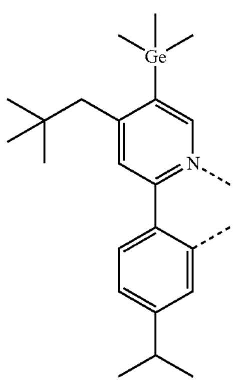
$L_{1-287}$
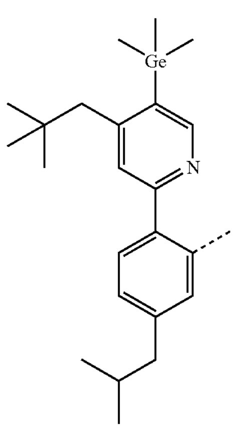
-continued
$L_{1-288}$
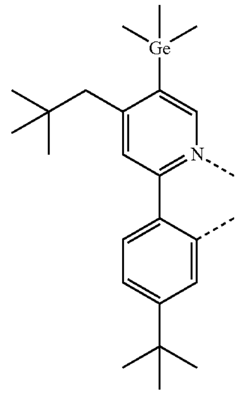
$L_{1-289}$
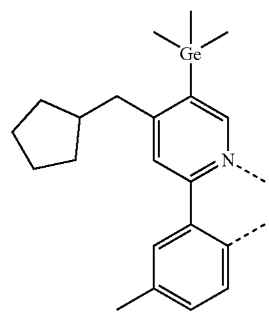
$L_{1-290}$
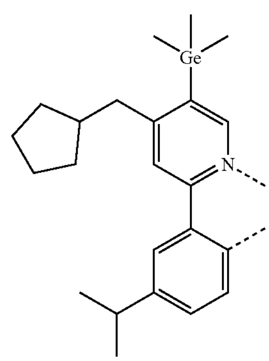
$L_{1-291}$
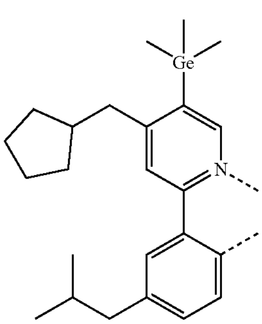

-continued
$L_{1-292}$
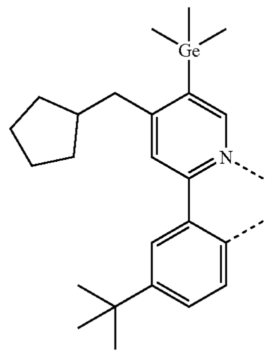
$L_{1-293}$
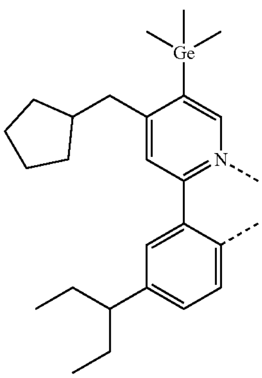
$L_{1-294}$
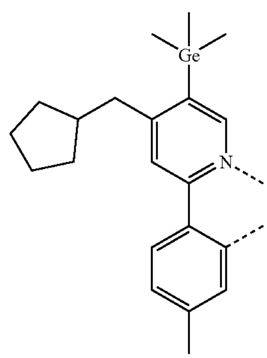
$L_{1-295}$
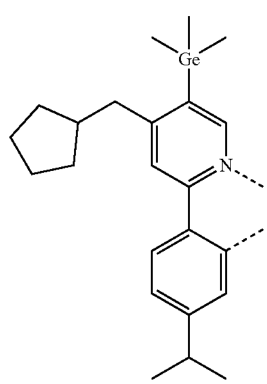
-continued
$L_{1-296}$
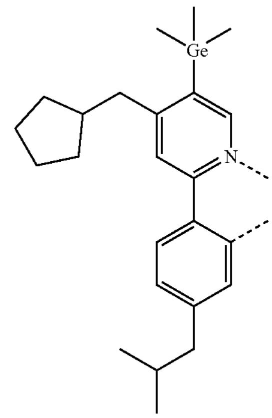
$L_{1-297}$
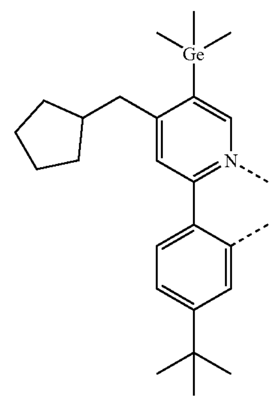
$L_{1-298}$
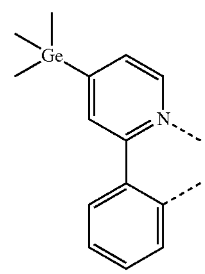
$L_{1-299}$
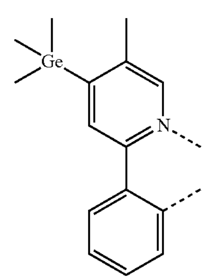

-continued
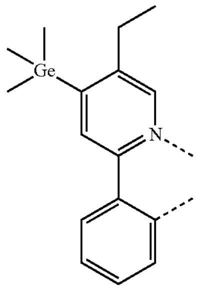
$L_{1-300}$
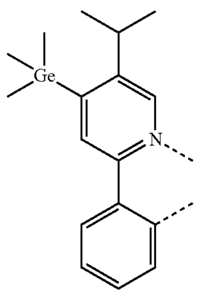
$L_{1-301}$
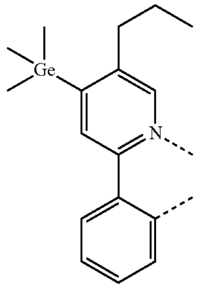
$L_{1-302}$
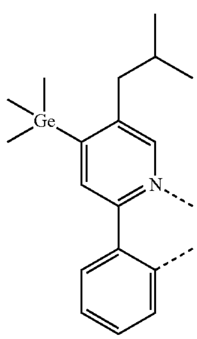
$L_{1-303}$
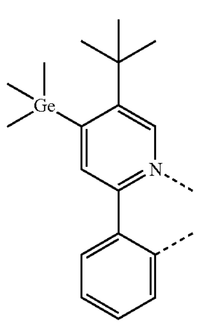
$L_{1-304}$
-continued
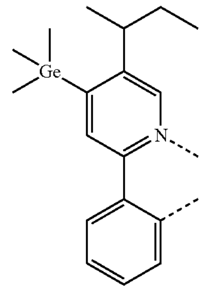
$L_{1-305}$
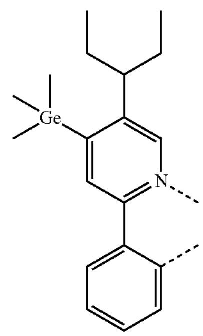
$L_{1-306}$
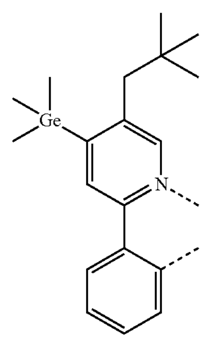
$L_{1-307}$
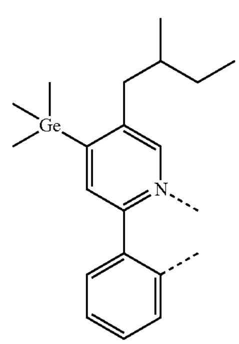
$L_{1-308}$ -continued
$L_{1-309}$
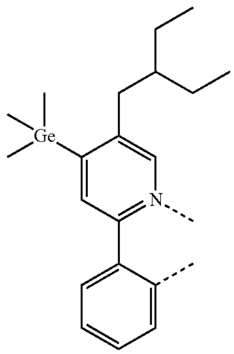
$L_{1-310}$
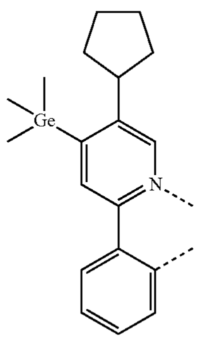
$L_{1-311}$
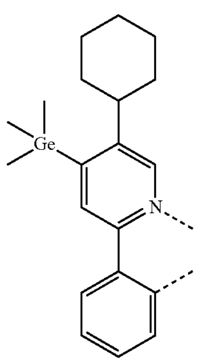
$L_{1-312}$
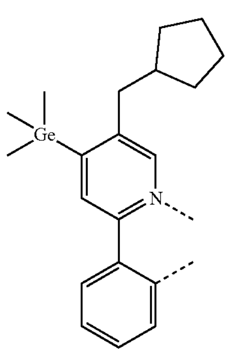
-continued
$L_{1-313}$
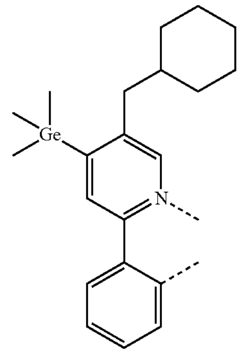
$L_{1-314}$
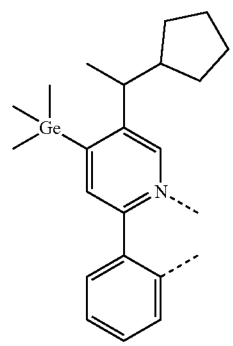
$L_{1-315}$
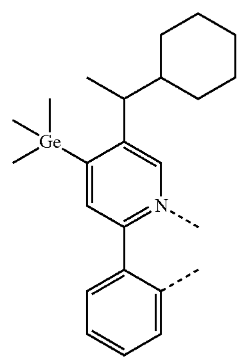
$L_{1-316}$
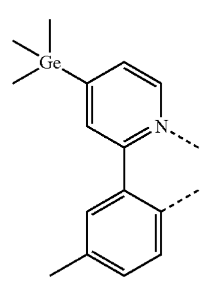

L1-317
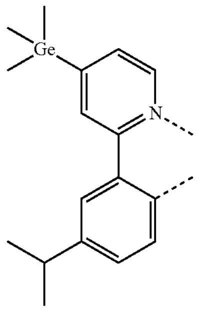
L1-318
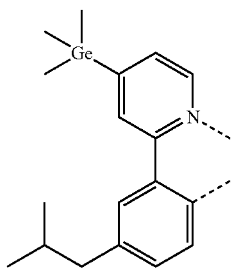
L1-319
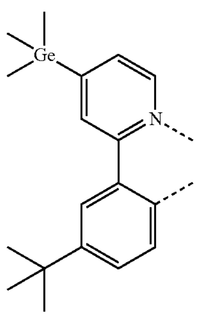
L1-320
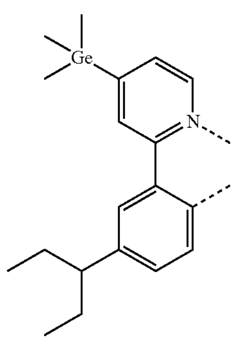
L1-321
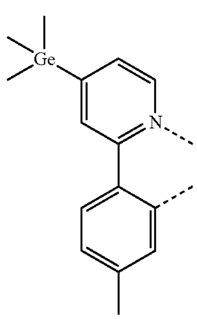
L1-322
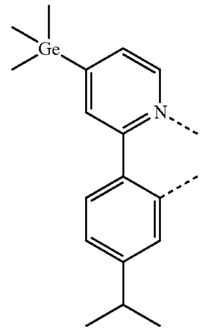
L1-323
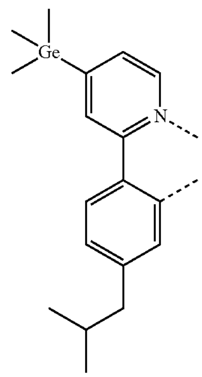
L1-324
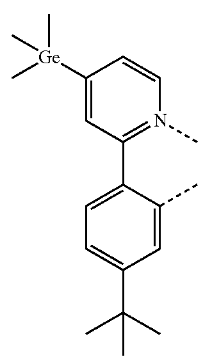
L1-325
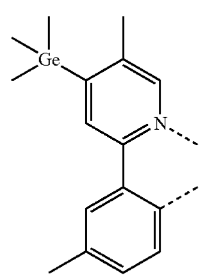

-continued
$L_{1\text{-}326}$
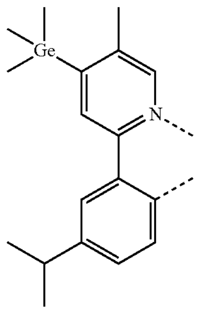
$L_{1\text{-}327}$
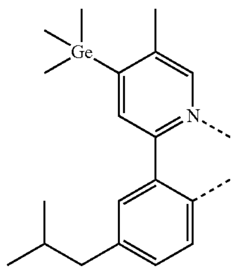
$L_{1\text{-}328}$
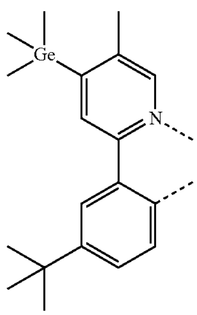
$L_{1\text{-}329}$
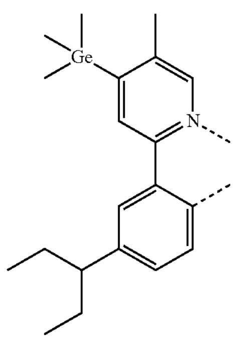
$L_{1\text{-}330}$
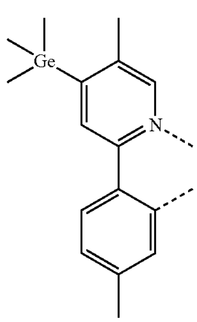
-continued
$L_{1\text{-}331}$
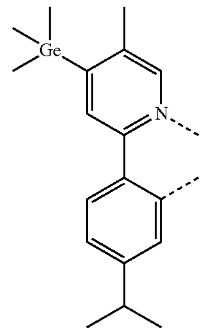
$L_{1\text{-}332}$
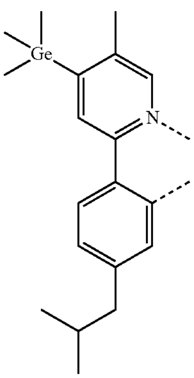
$L_{1\text{-}333}$
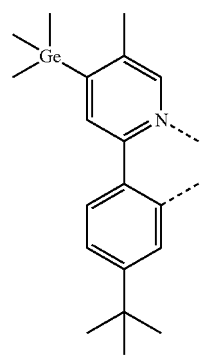
$L_{1\text{-}334}$
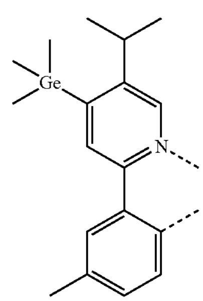

-continued
L1-335
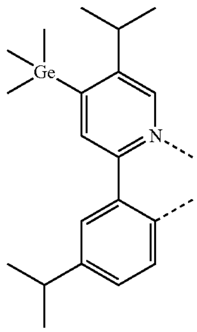
L1-336
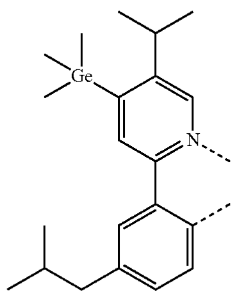
L1-337
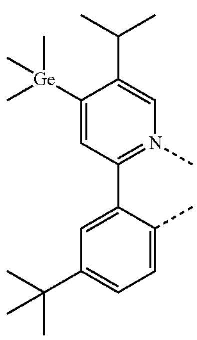
L1-338
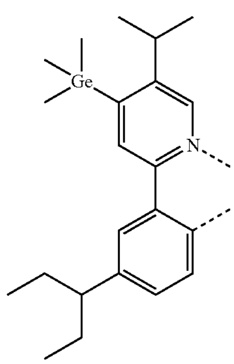
-continued
L1-339
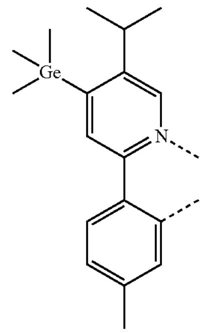
L1-340
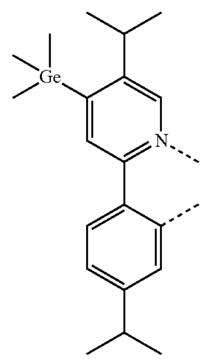
L1-341
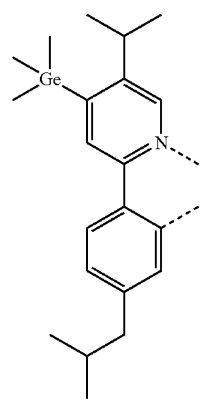
L1-342
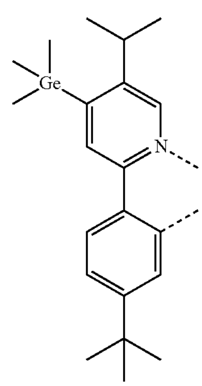

-continued
L1-343
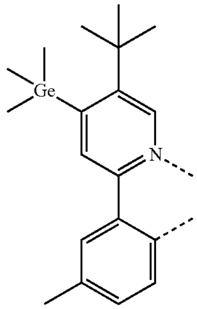
L1-344
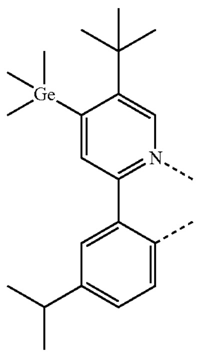
L1-345
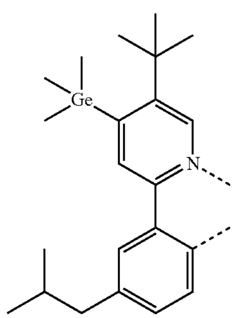
L1-346
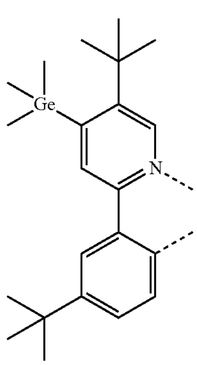
-continued
L1-347
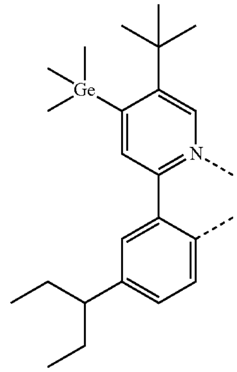
L1-348
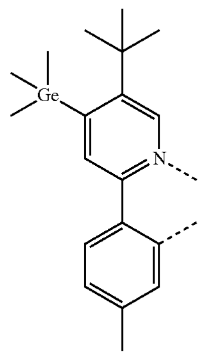
L1-349
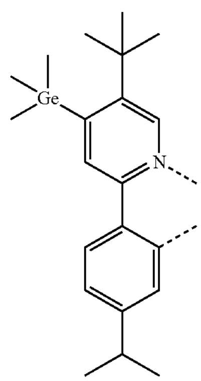
L1-350
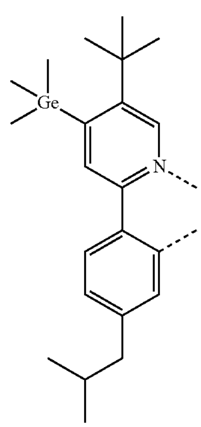

-continued
L1-351
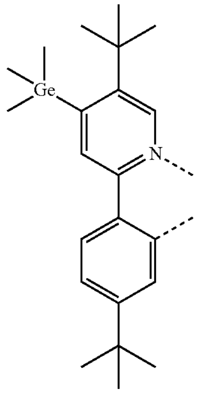
L1-352
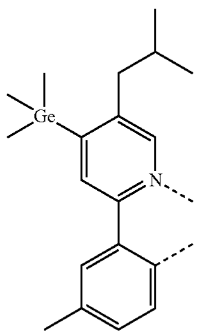
L1-353
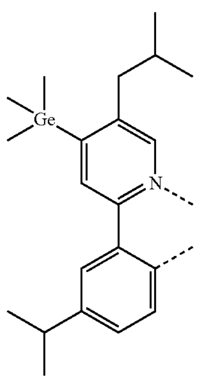
L1-354
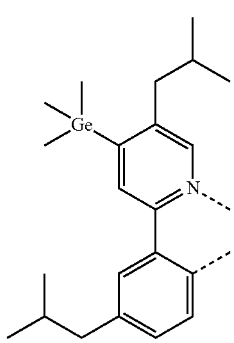
-continued
L1-355
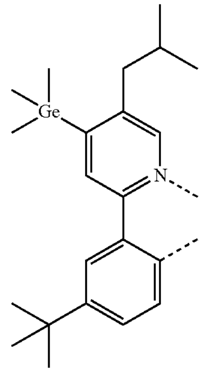
L1-356
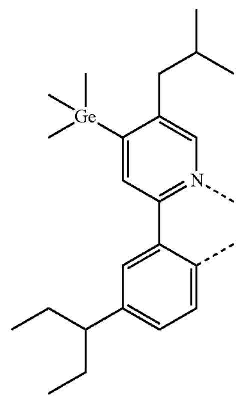
L1-357
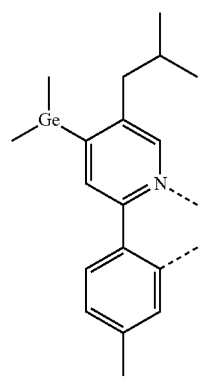
L1-358
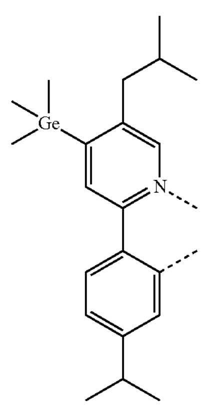

-continued
L1-359
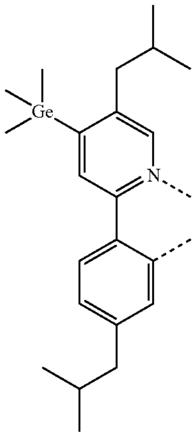
L1-360
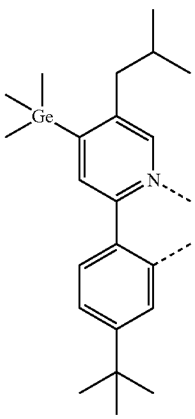
L1-361
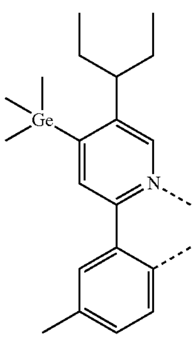
L1-362
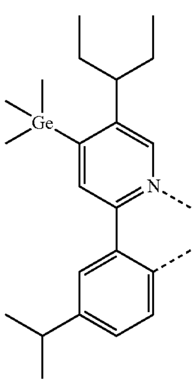
-continued
L1-363
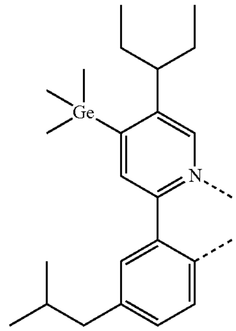
L1-364
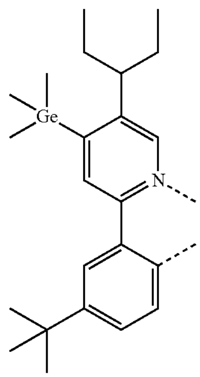
L1-365
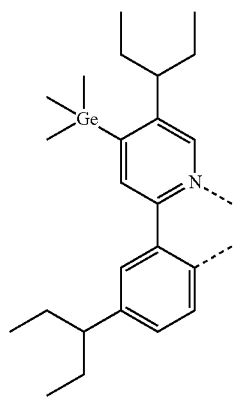
L1-366
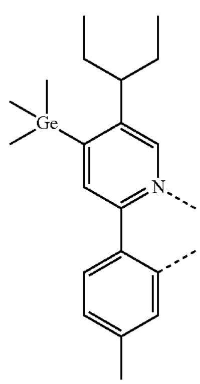

-continued
L1-367
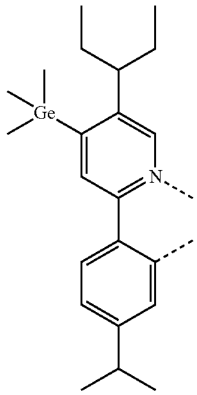
L1-368
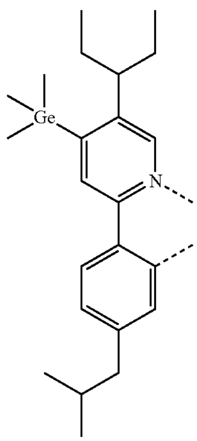
L1-369
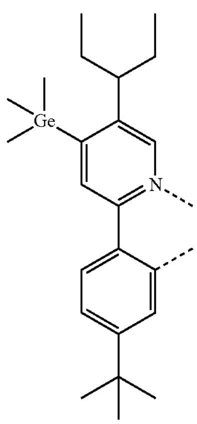
L1-370
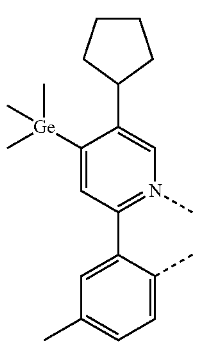
-continued
L1-371
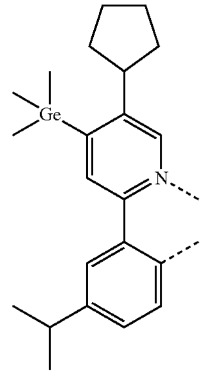
L1-372
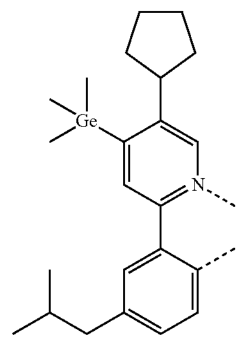
L1-373
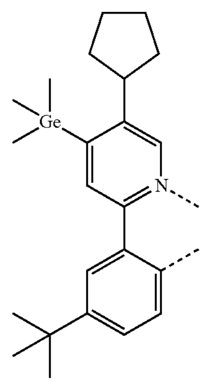
L1-374
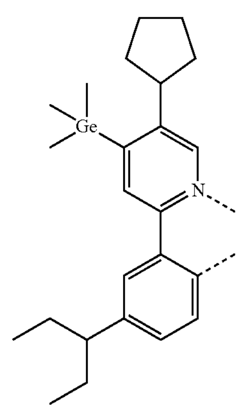

-continued
L1-375
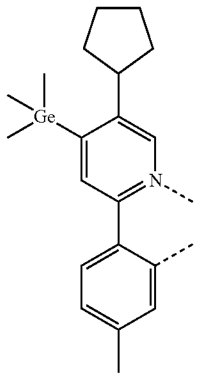
L1-376
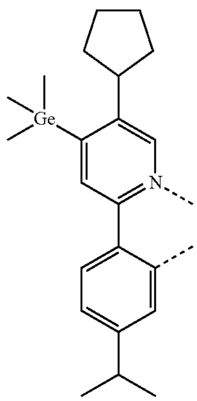
L1-377
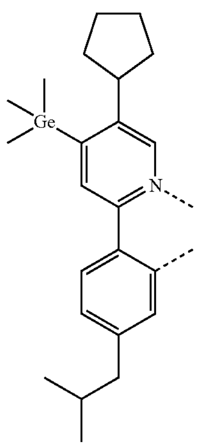
L1-378
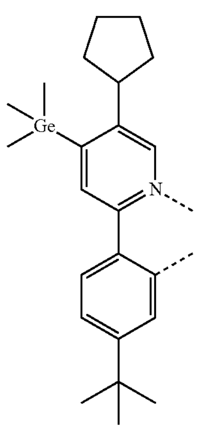
-continued
L1-379
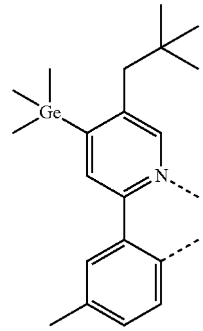
L1-380
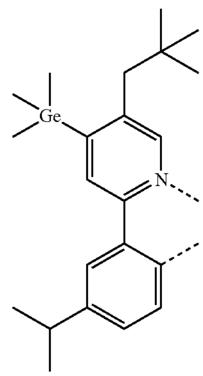
L1-381
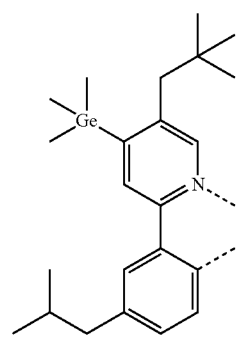
L1-382
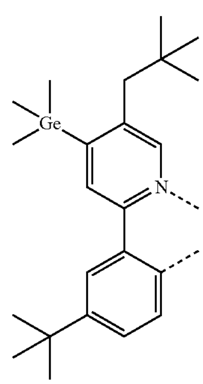

-continued
$L_{1-383}$
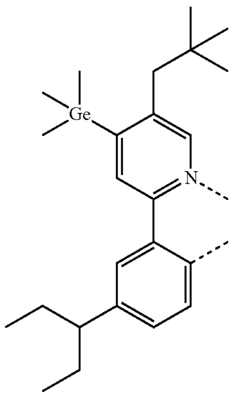
$L_{1-384}$
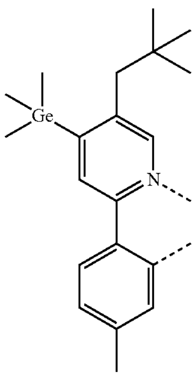
$L_{1-385}$
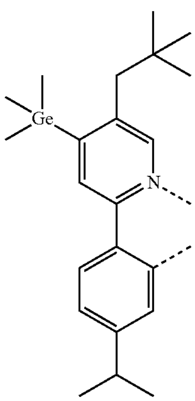
$L_{1-386}$
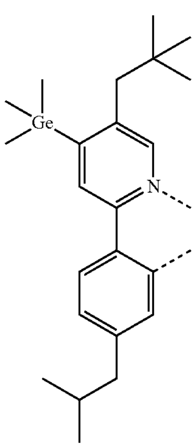
-continued
$L_{1-387}$
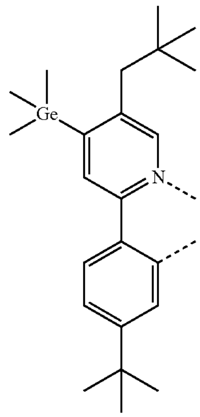
$L_{1-388}$
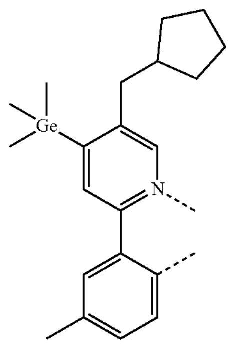
$L_{1-389}$
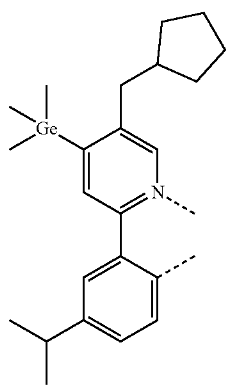
$L_{1-390}$
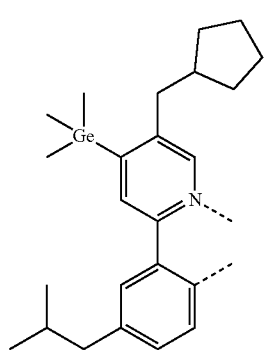

-continued
$L_{1-391}$
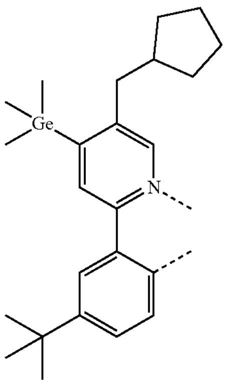
$L_{1-392}$
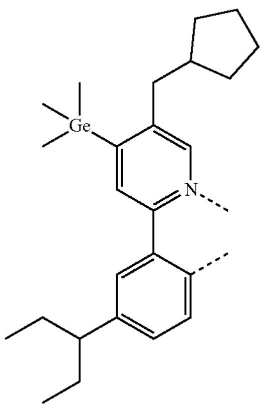
$L_{1-393}$
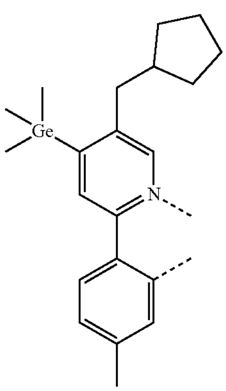
$L_{1-394}$
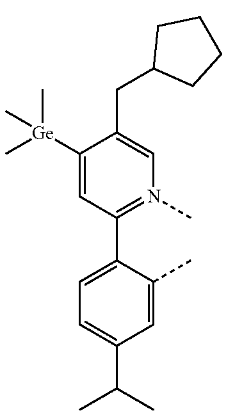
-continued
$L_{1-395}$
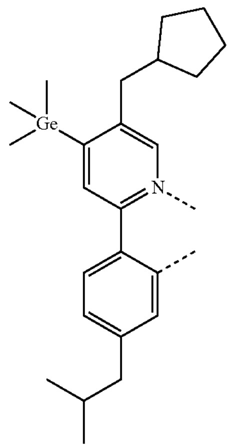
$L_{1-396}$
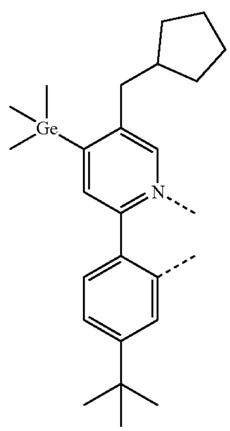
$L_{2-1}$
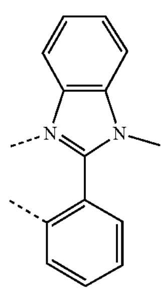
$L_{2-2}$
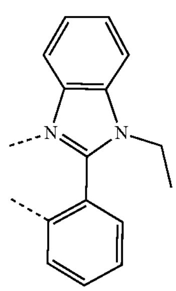

-continued
$L_{2-3}$
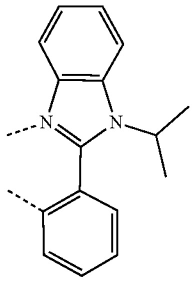
$L_{2-4}$
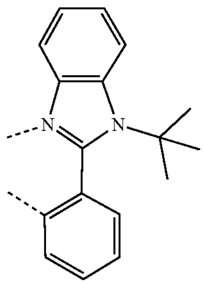
$L_{2-5}$
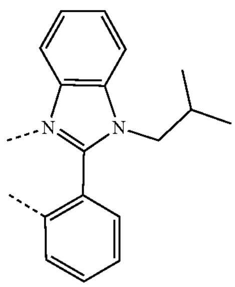
$L_{2-6}$
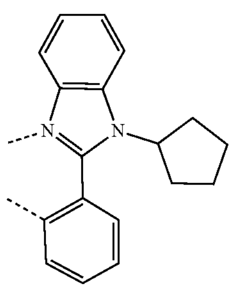
$L_{2-7}$
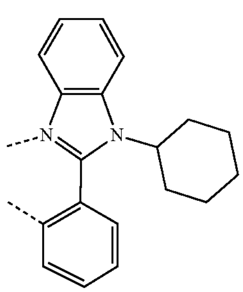
-continued
$L_{2-8}$
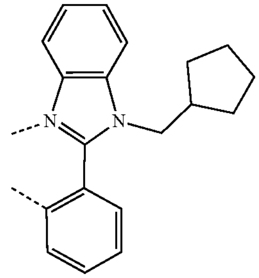
$L_{2-9}$
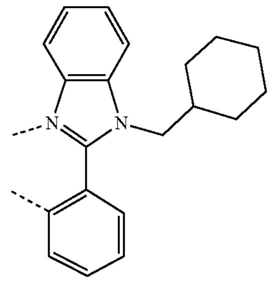
$L_{2-10}$
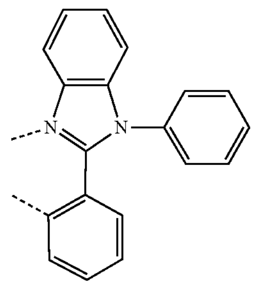
$L_{2-11}$
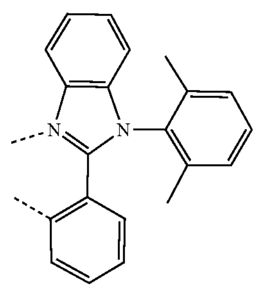
$L_{2-12}$
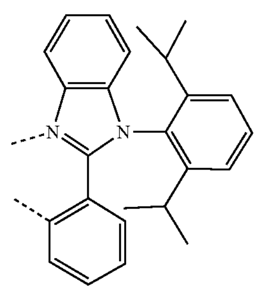

-continued
L2-13
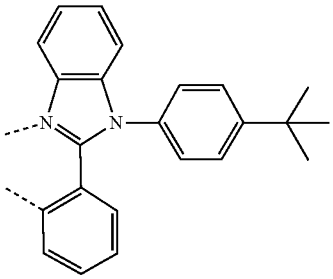
L2-14
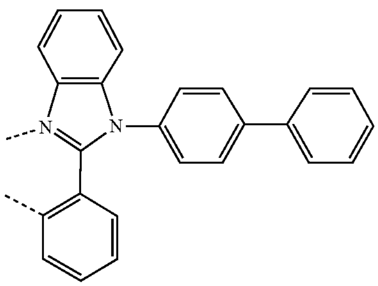
L2-15
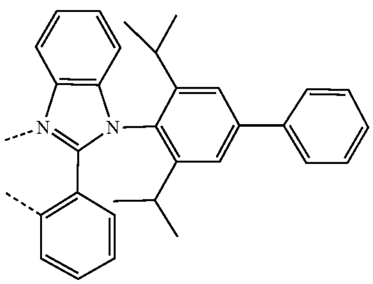
L2-16
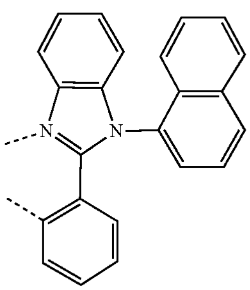
L2-17
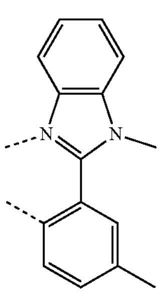
-continued
L2-18
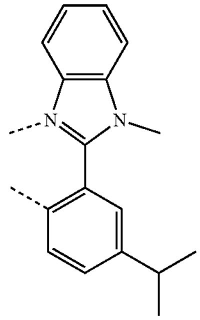
L2-19
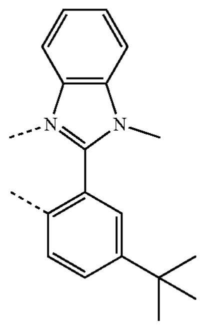
L2-20
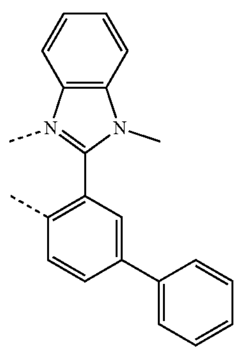
L2-21
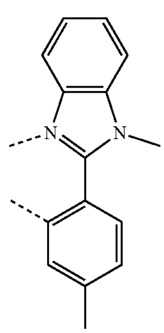

L2-22
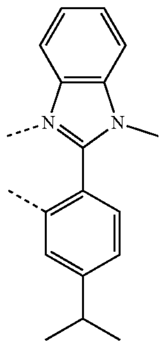
L2-23
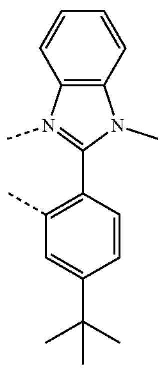
L2-24
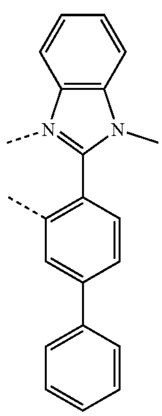
L2-25
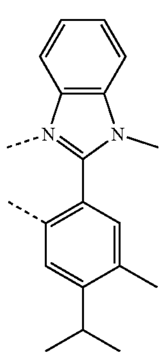
L2-26
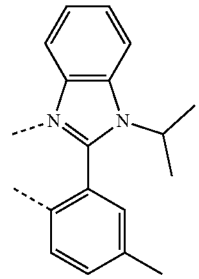
L2-27
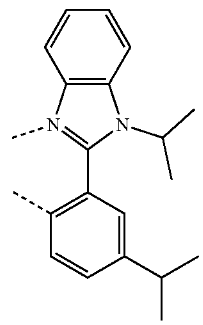
L2-28
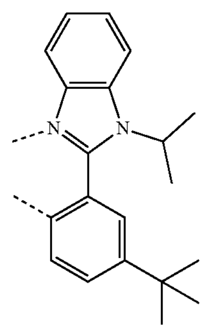
L2-29
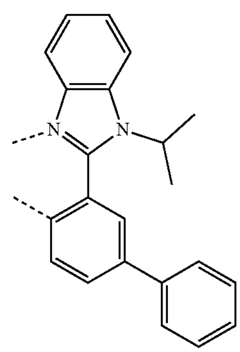
L2-30
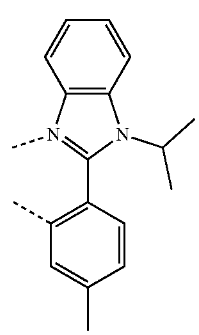

-continued
L2-31
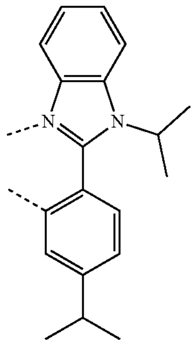
L2-32
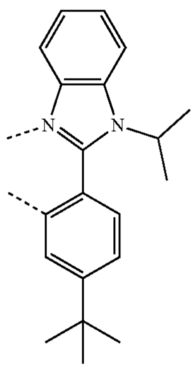
L2-33
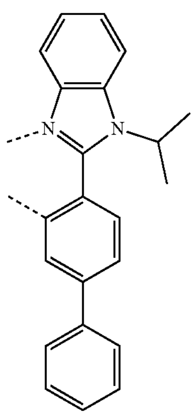
L2-34
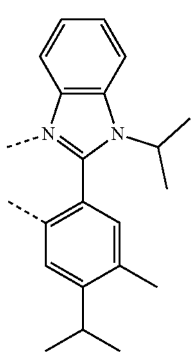
-continued
L2-35
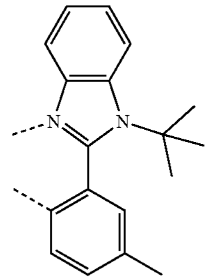
L2-36
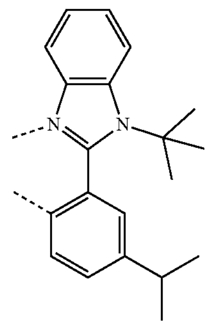
L2-37
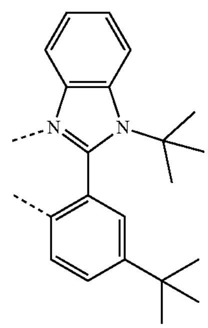
L2-38
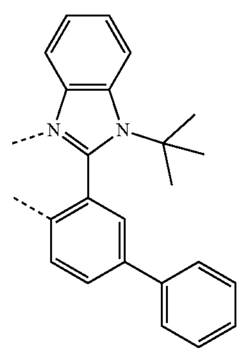
L2-39
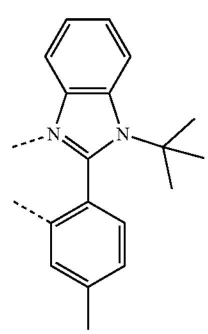

L2-40
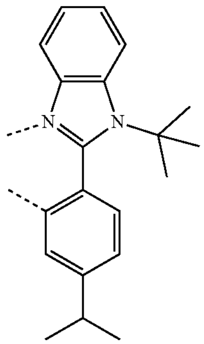
L2-41
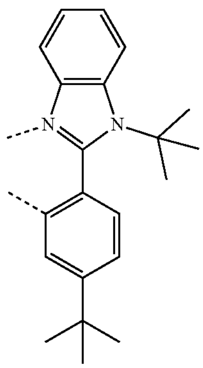
L2-42
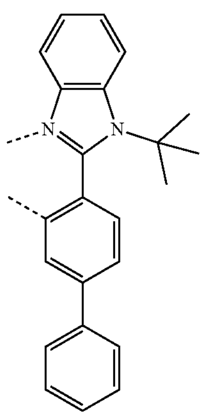
L2-43
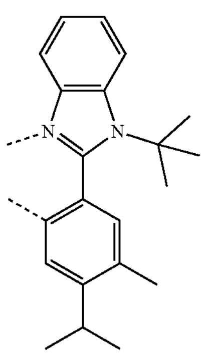
L2-44
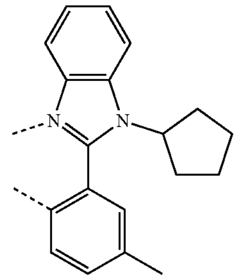
L2-45
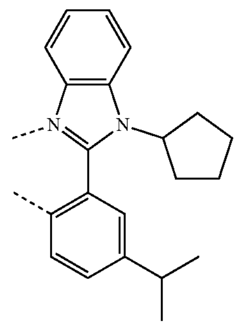
L2-46
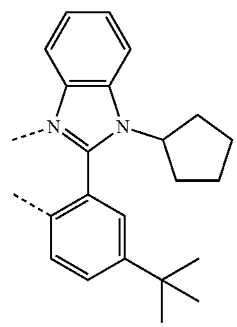
L2-47
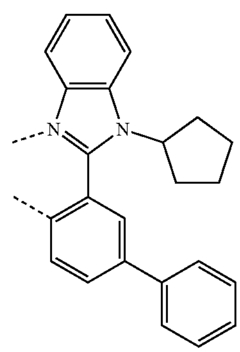
L2-48
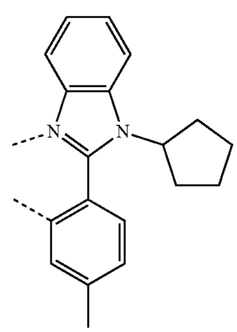

-continued
$L_{2-49}$
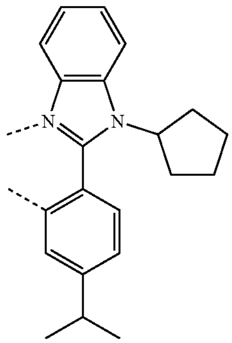
$L_{2-50}$
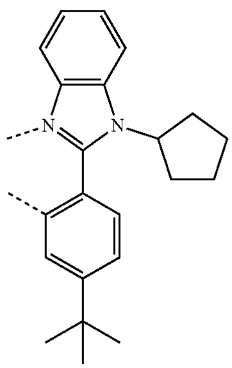
$L_{2-51}$
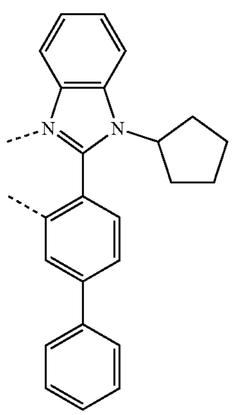
$L_{2-52}$
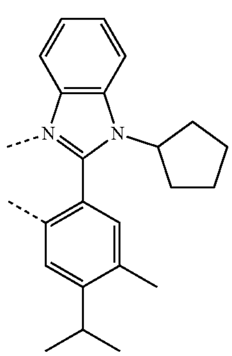
-continued
$L_{2-53}$
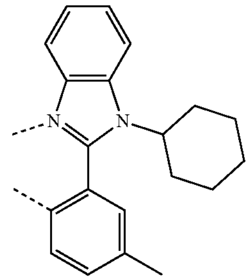
$L_{2-54}$
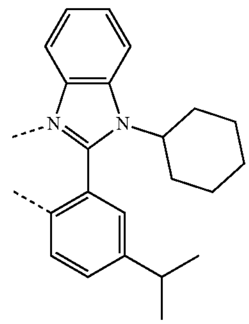
$L_{2-55}$
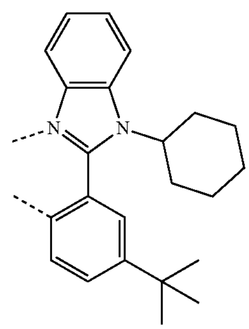
$L_{2-56}$
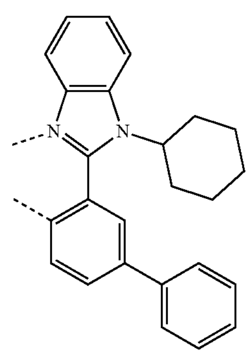
$L_{2-57}$
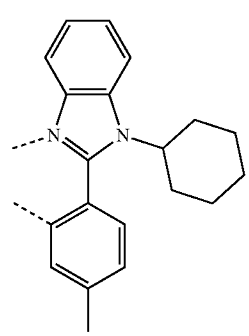

-continued
L2-58
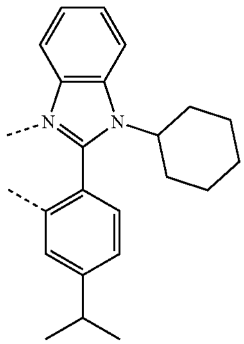
L2-59
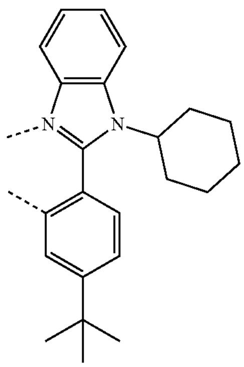
L2-60
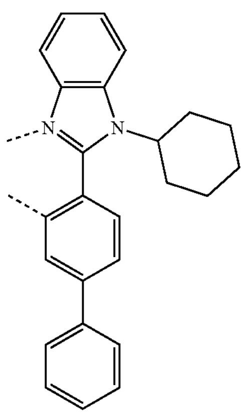
L2-61
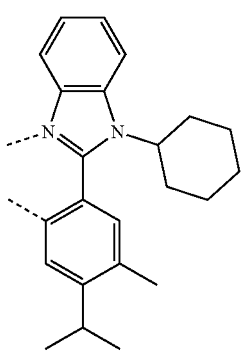
-continued
L2-62
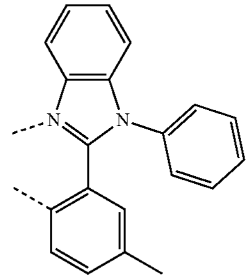
L2-63
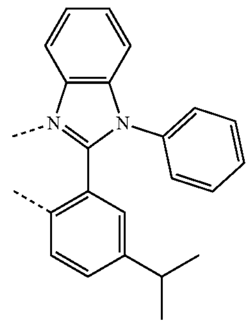
L2-64
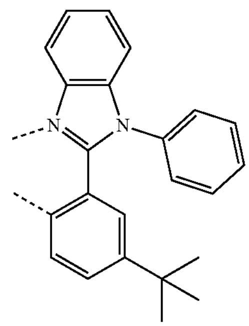
L2-65
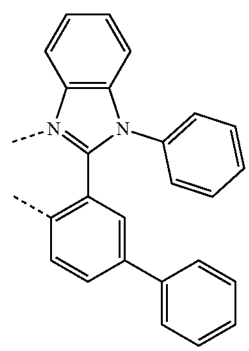
L2-66
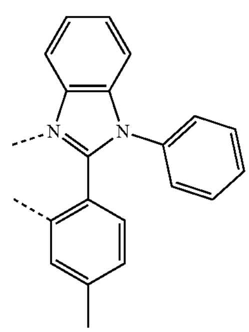

L2-67
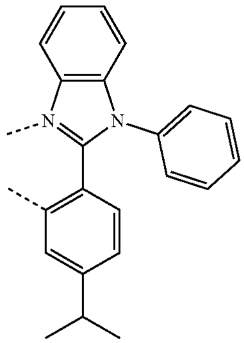
L2-68
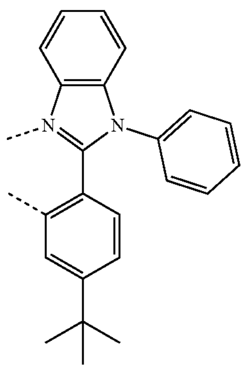
L2-69
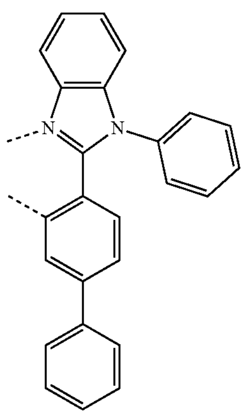
L2-70
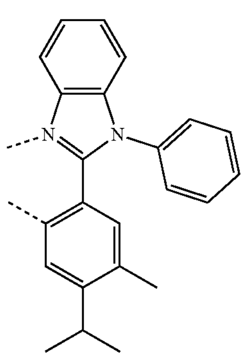
L2-71
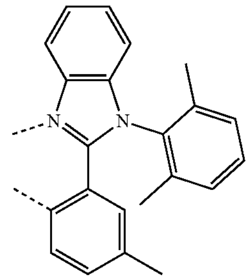
L2-72
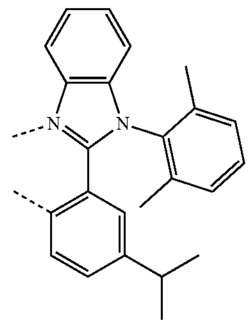
L2-73
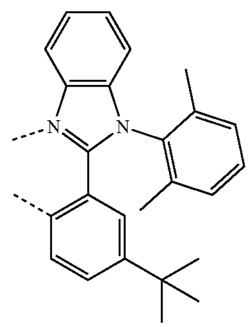
L2-74
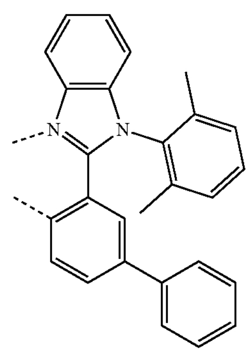
L2-75
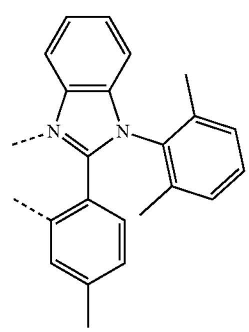

-continued
L2-76
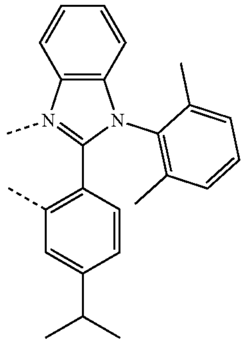
L2-77
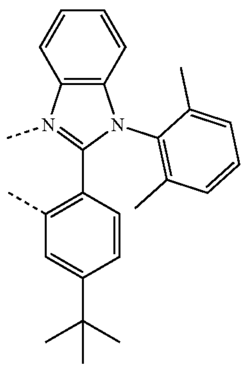
L2-78
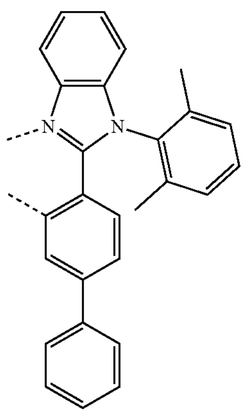
L2-79
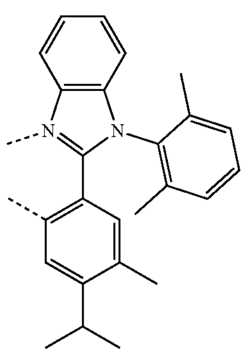
-continued
L2-80
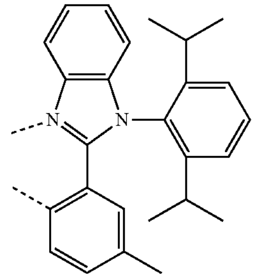
L2-81
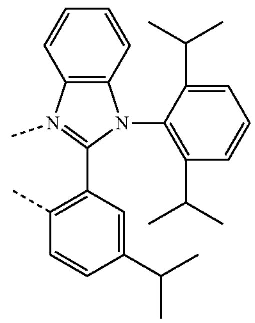
L2-82
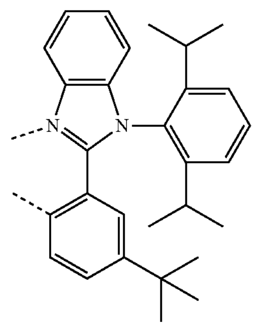
L2-83
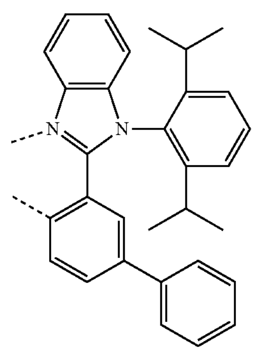
L2-84
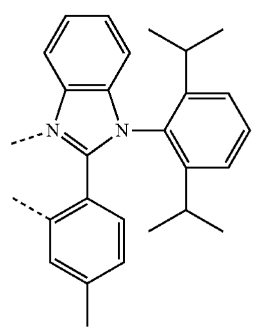

-continued
L2-85
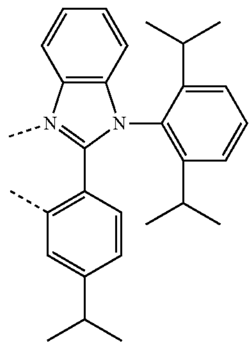
L2-86
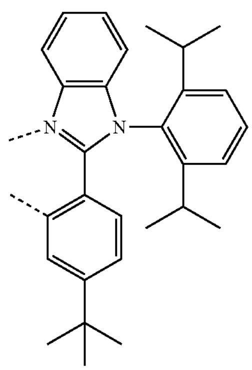
L2-87
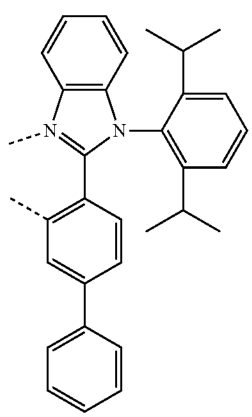
L2-88
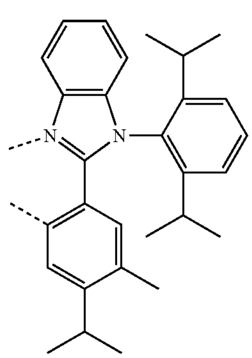
-continued
L2-89
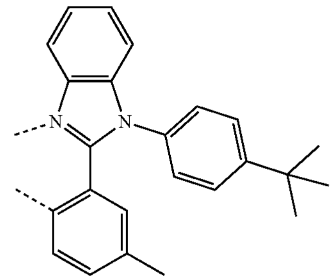
L2-90
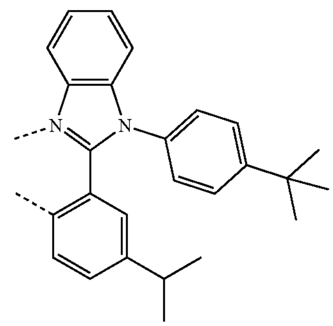
L2-91
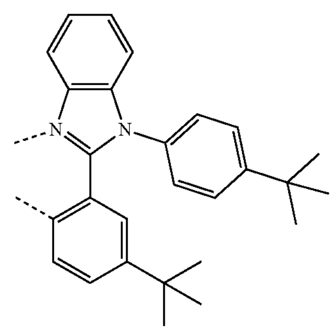
L2-92
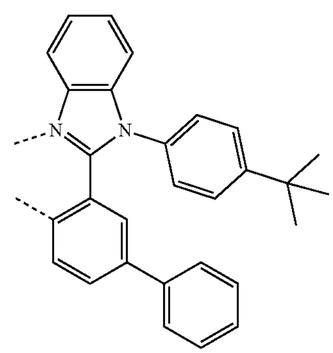
L2-93
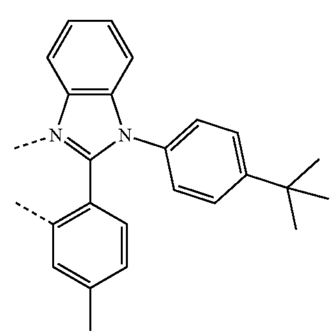

-continued
L2-94
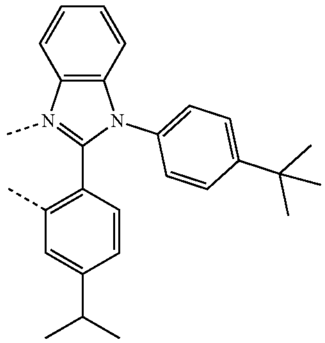
L2-95
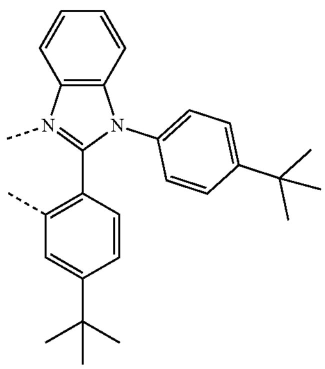
L2-96
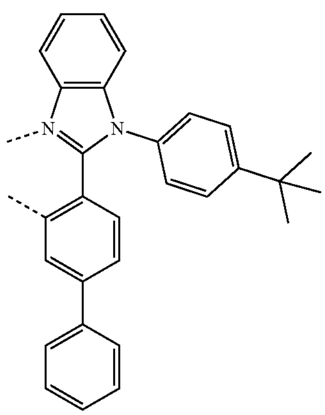
L2-97
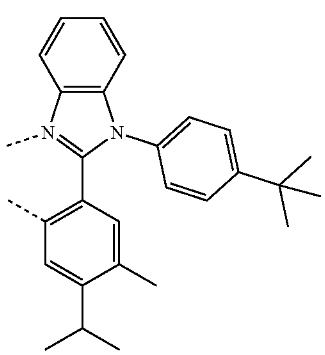
-continued
L2-98
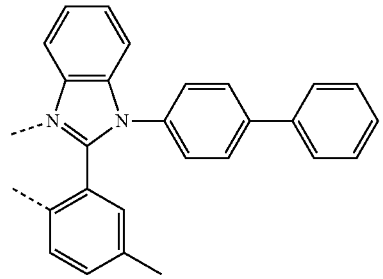
L2-99
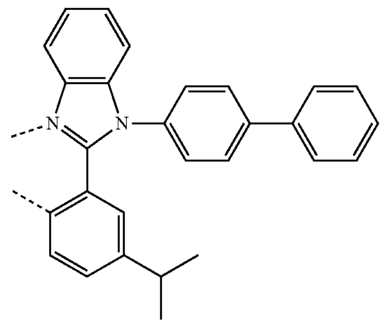
L2-100
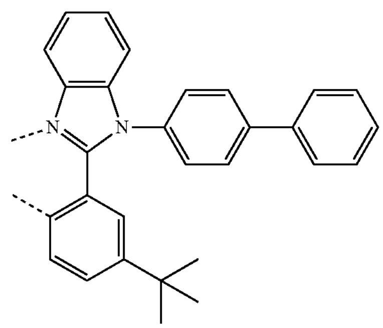
L2-101
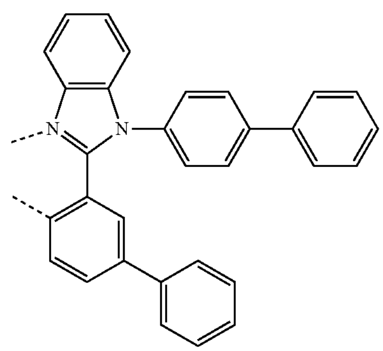
L2-102
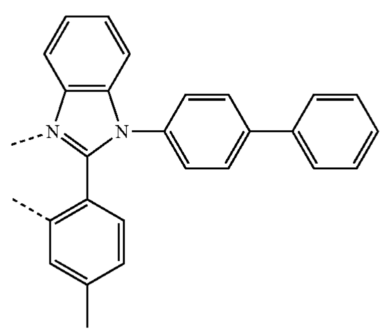

-continued
L2-103
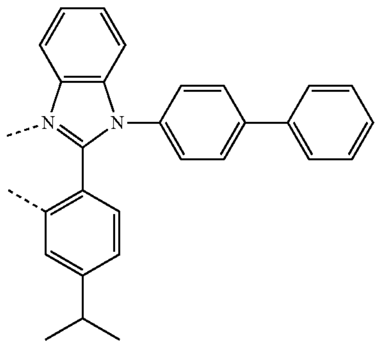
L2-104
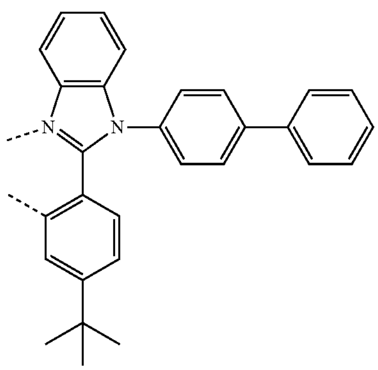
L2-105
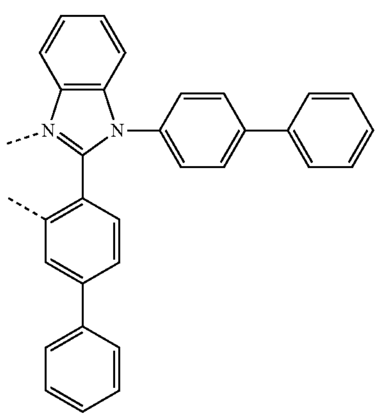
L2-106
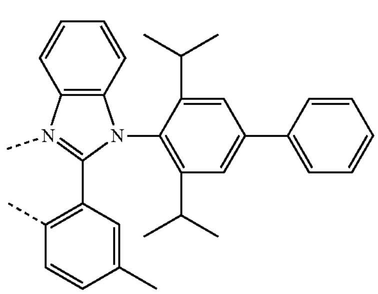
-continued
L2-107
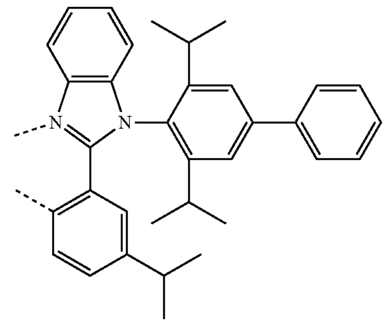
L2-108
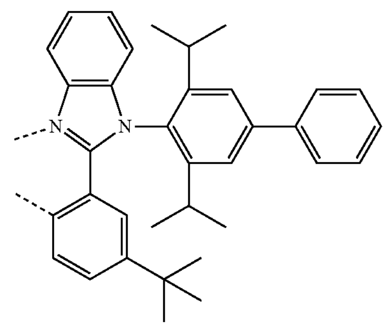
L2-109
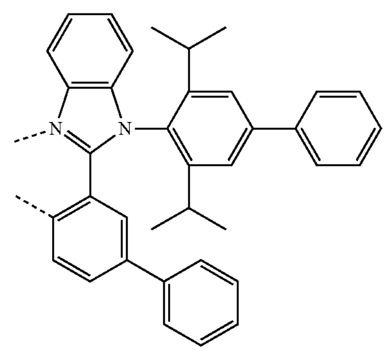
L2-110
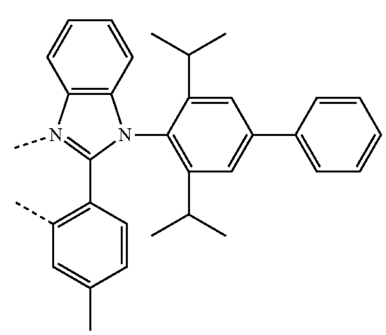

-continued
L2-111
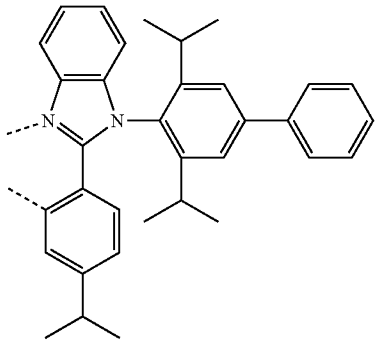
L2-112
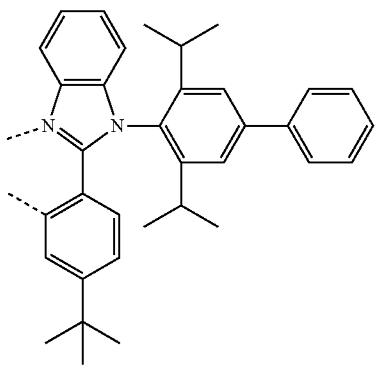
L2-113
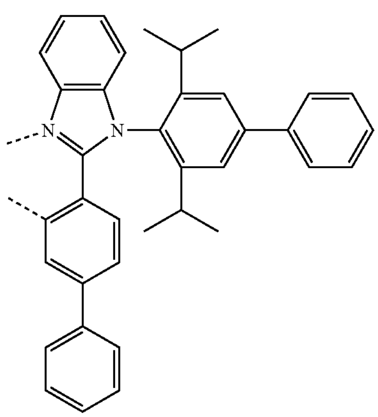
L2-114
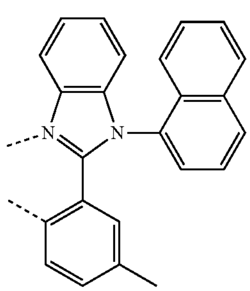
-continued
L2-115
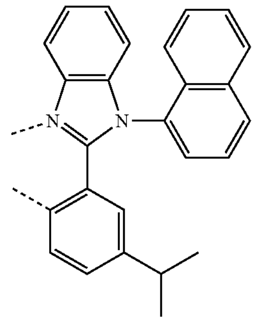
L2-116
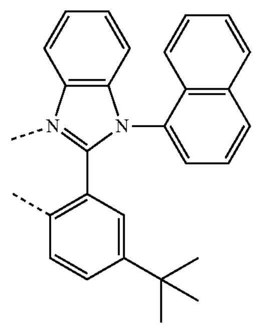
L2-117
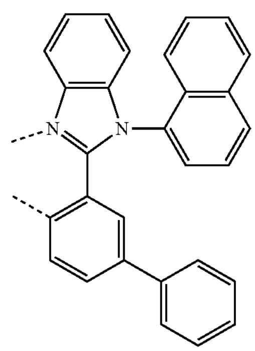
L2-118
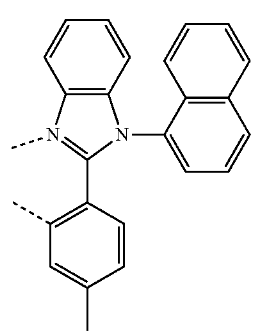

-continued
$L_{2-119}$
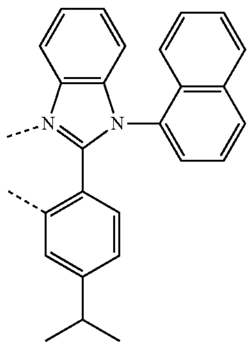
$L_{2-120}$
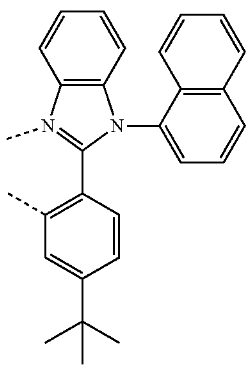
$L_{2-121}$
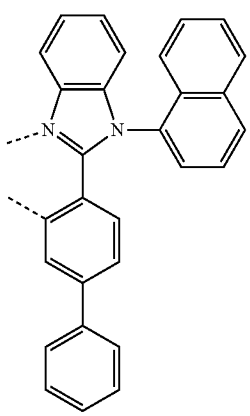
$L_{2-122}$
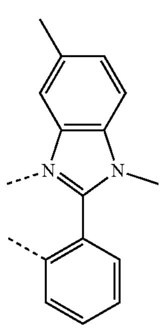
-continued
$L_{2-123}$
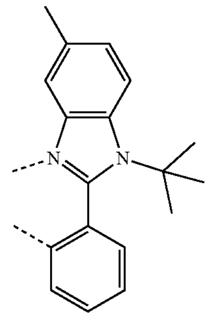
L2-124
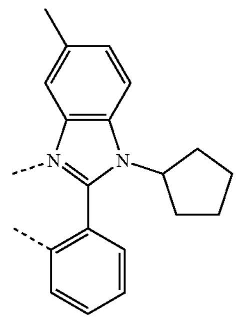
$L_{2-125}$
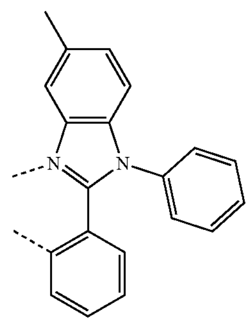
$L_{2-126}$
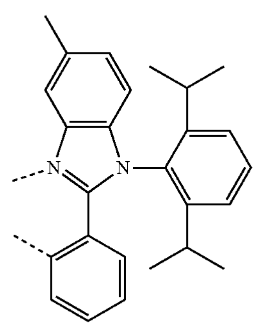
$L_{2-127}$
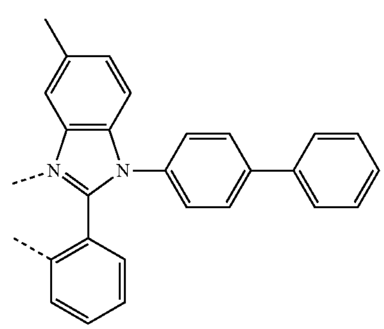

L2-128
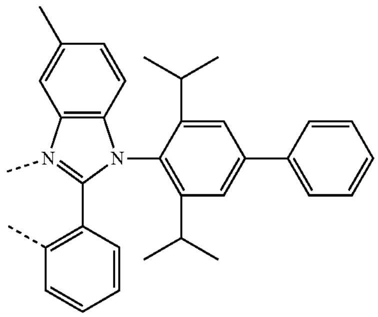
L2-129
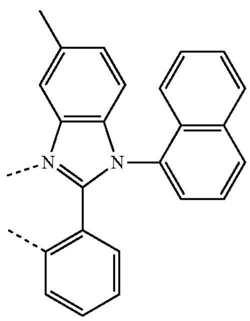
L2-130
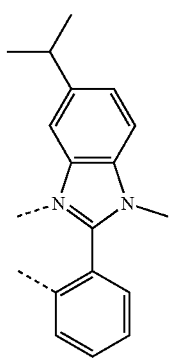
L2-131
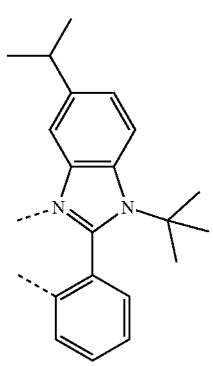
L2-132
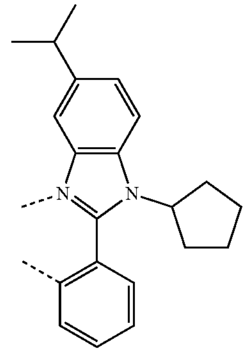
L2-133
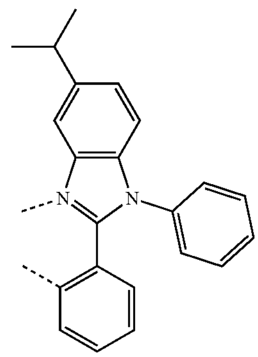
L2-134
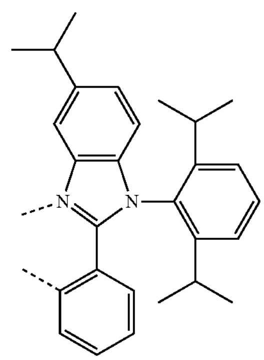
L2-135
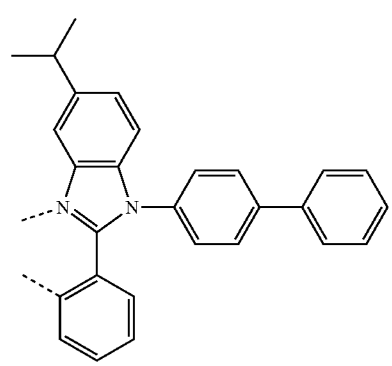

-continued
$L_{2\text{-}136}$
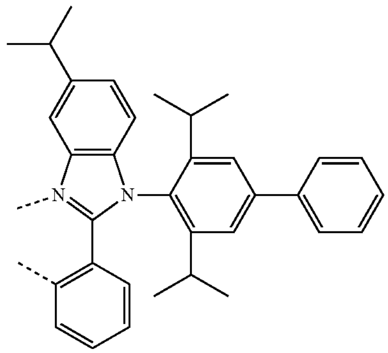
$L_{2\text{-}137}$
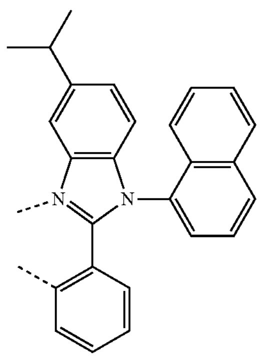
$L_{2\text{-}138}$
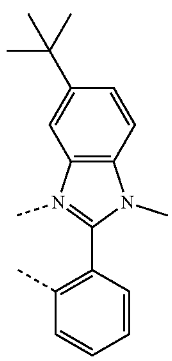
$L_{2\text{-}139}$
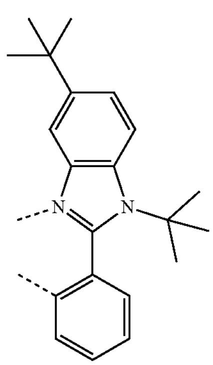
-continued
$L_{2\text{-}140}$
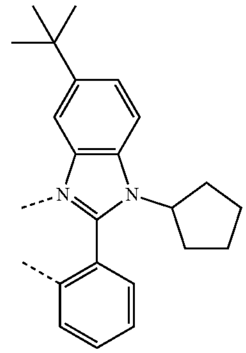
$L_{2\text{-}141}$
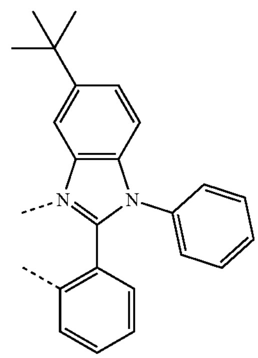
$L_{2\text{-}142}$
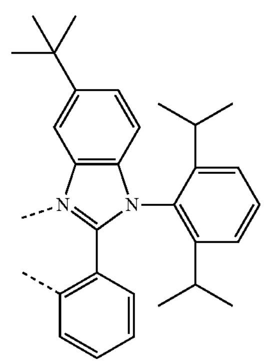
$L_{2\text{-}143}$
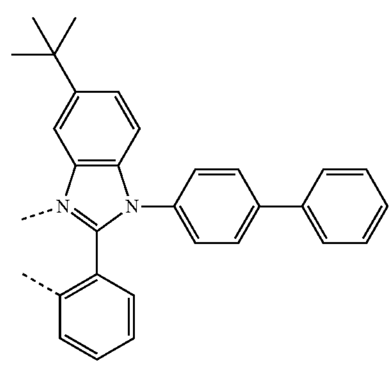

-continued
L2-144
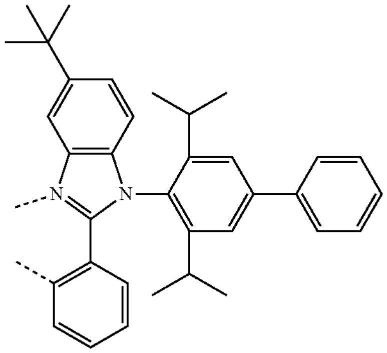
L2-145
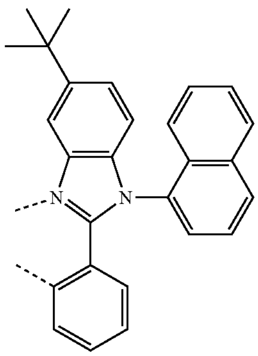
L2-146
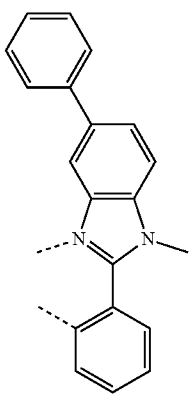
L2-147
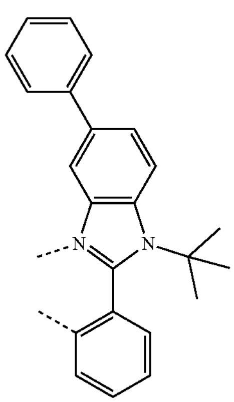
-continued
L2-148
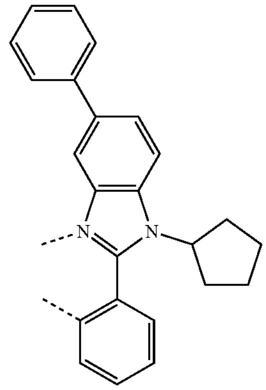
L2-149
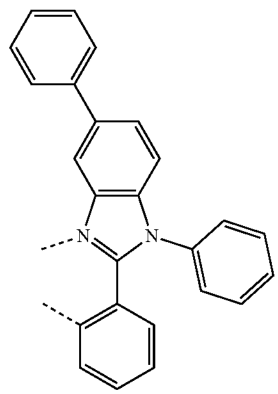
L2-150
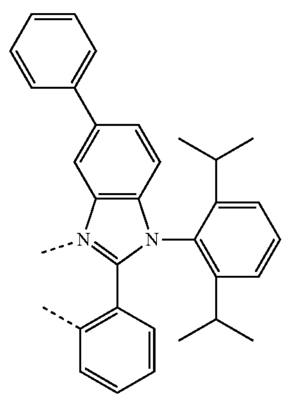
L2-151
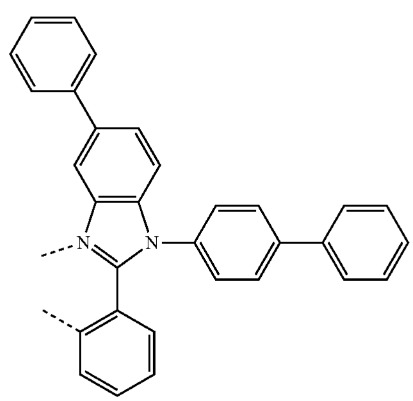

L2-152
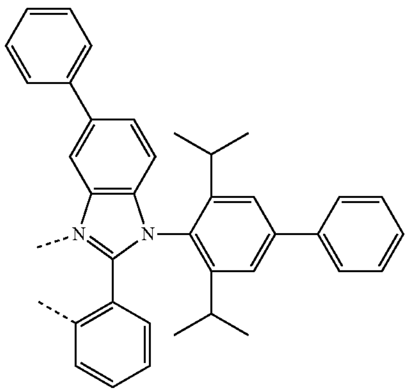
L2-153
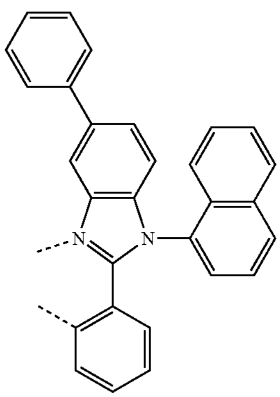
L2-154
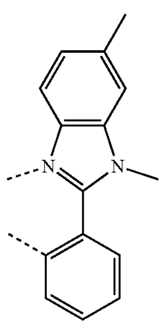
L2-155
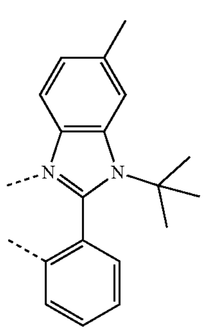
L2-156
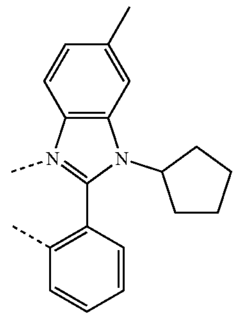
L2-157
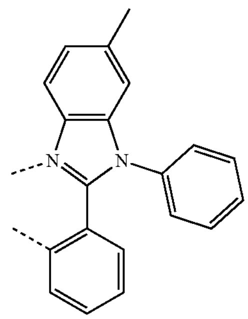
L2-158
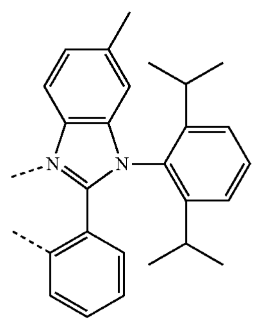
L2-159
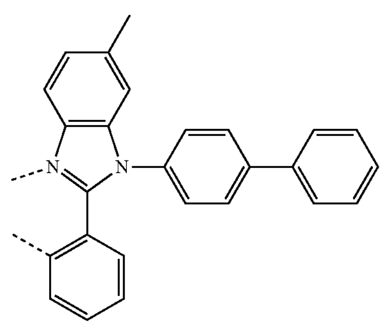
L2-160
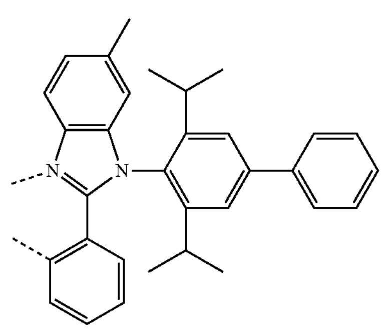

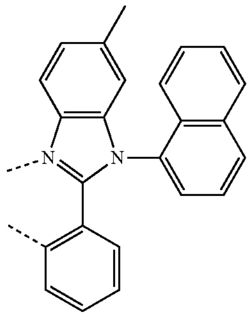
$L_{2-161}$
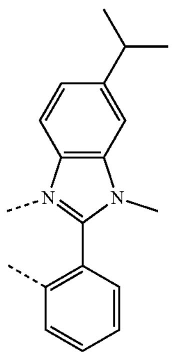
$L_{2-162}$
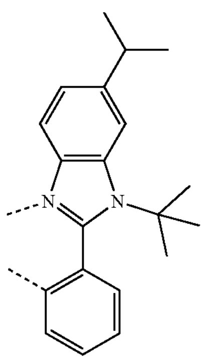
$L_{2-163}$
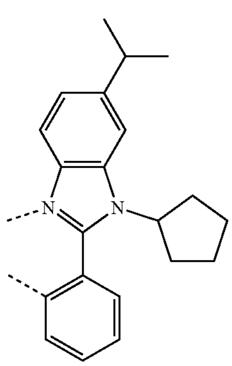
$L_{2-164}$
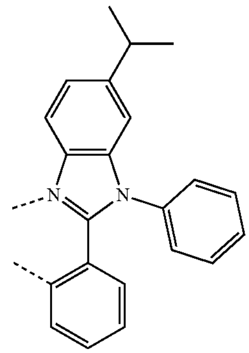
$L_{2-165}$
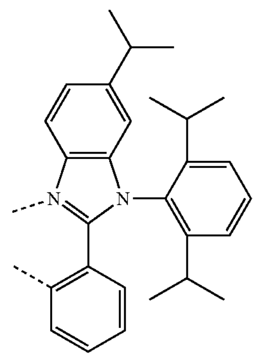
$L_{2-166}$
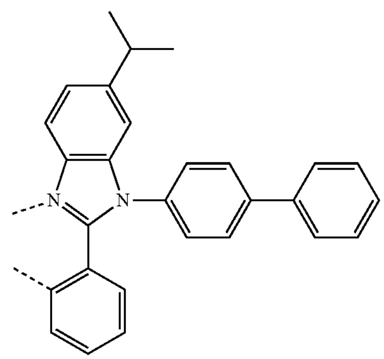
$L_{2-167}$
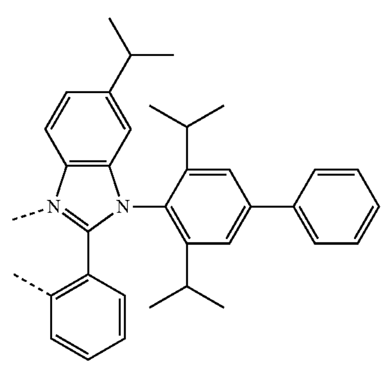
$L_{2-168}$ -continued
$L_{2\text{-}169}$
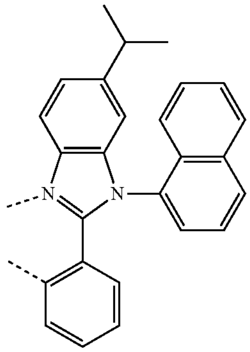
$L_{2\text{-}170}$
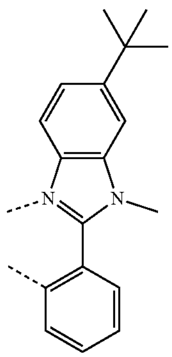
$L_{2\text{-}171}$
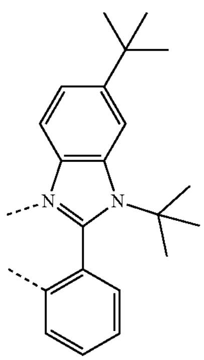
$L_{2\text{-}172}$
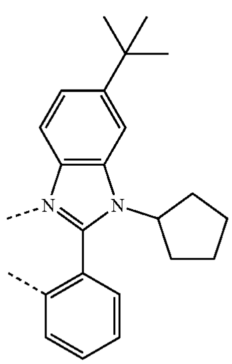
-continued
$L_{2\text{-}173}$
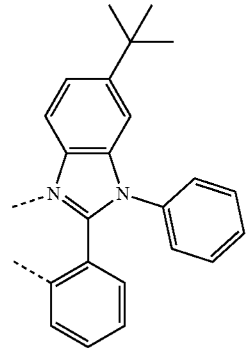
$L_{2\text{-}174}$
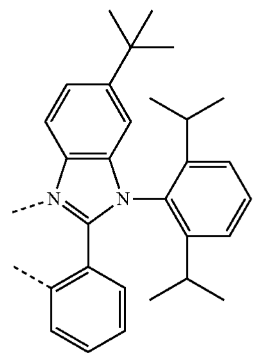
$L_{2\text{-}175}$
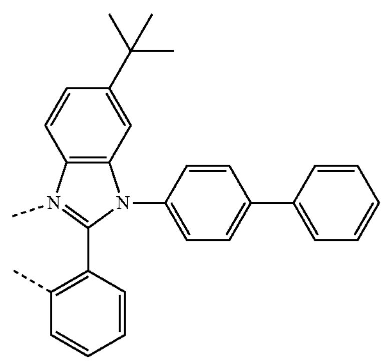
$L_{2\text{-}176}$
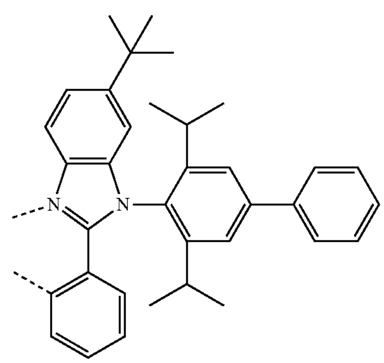

-continued
L2-177
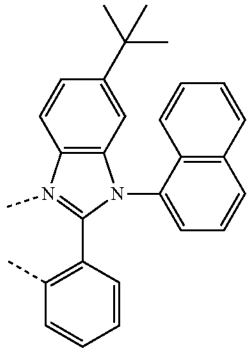
L2-178
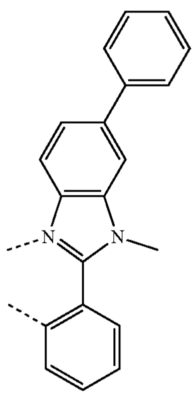
L2-179
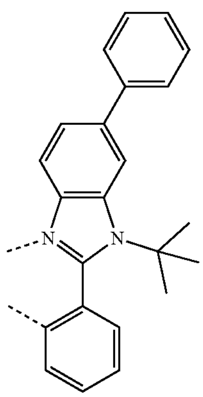
L2-180
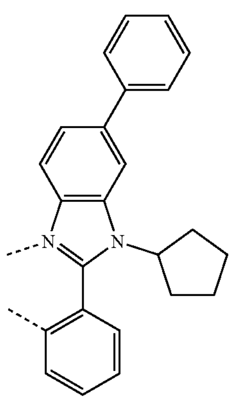
-continued
L2-181
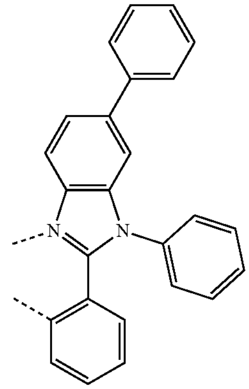
L2-182
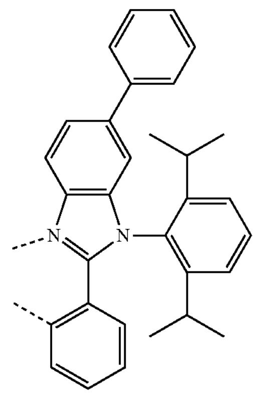
L2-183
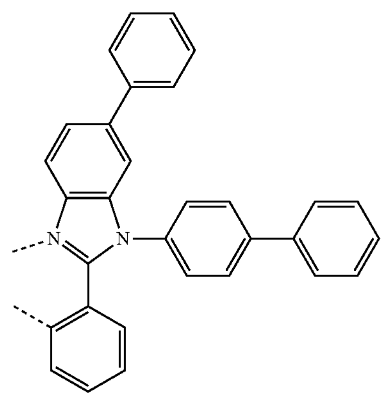
L2-184
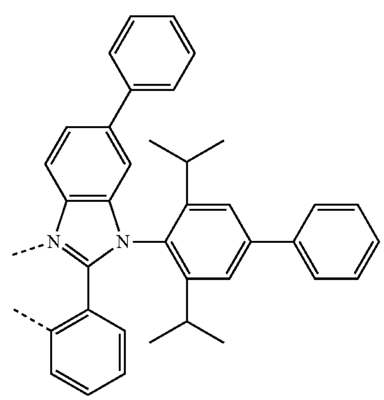

-continued
L2-185
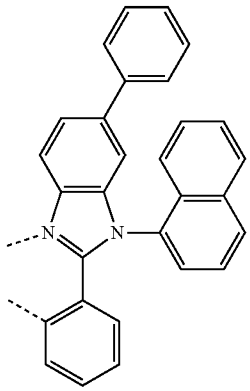
L2-186
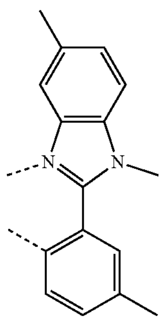
L2-187
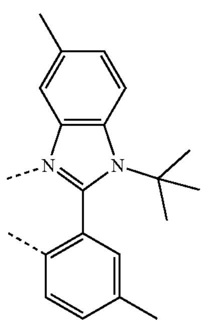
L2-188
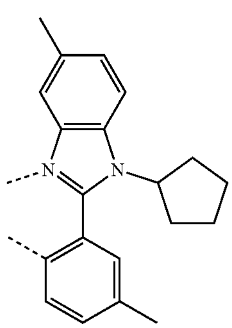
-continued
L2-189
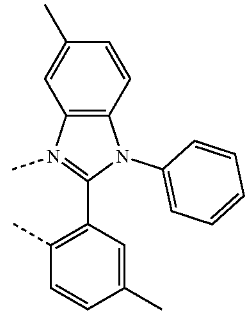
L2-190
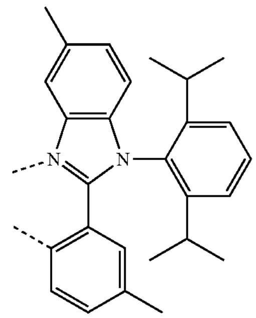
L2-191
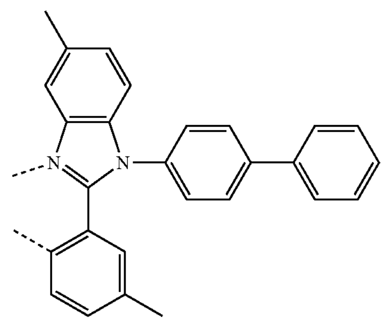
L2-192
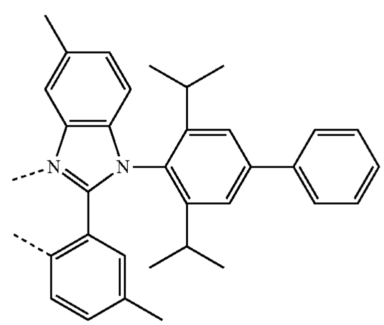
L2-193
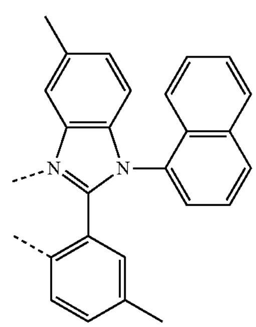

-continued
L2-194
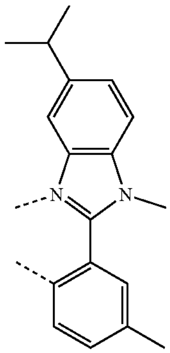
L2-195
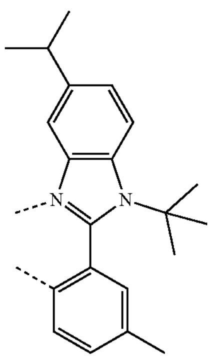
L2-196
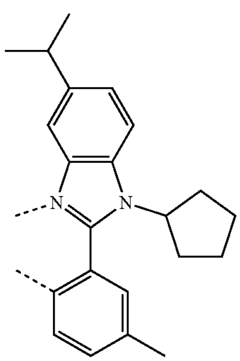
L2-197
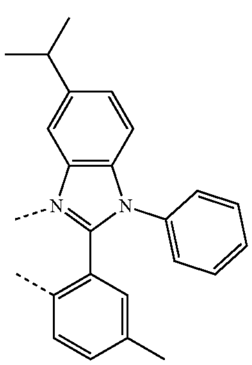
-continued
L2-198
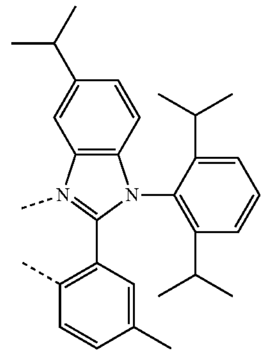
L2-199
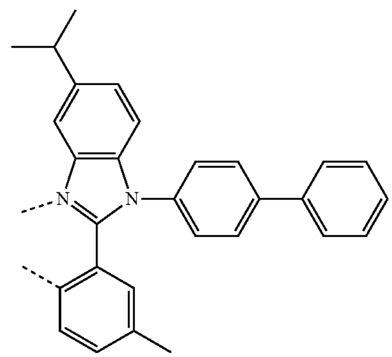
L2-200
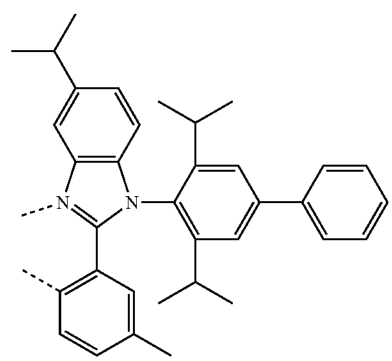
L2-201
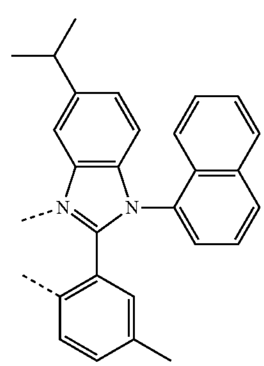

L2-202
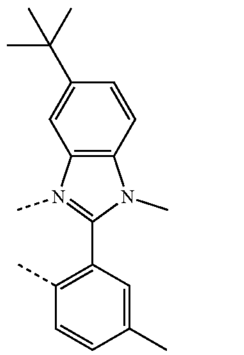
L2-203
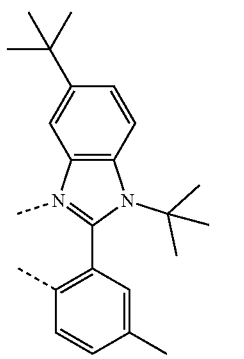
L2-204
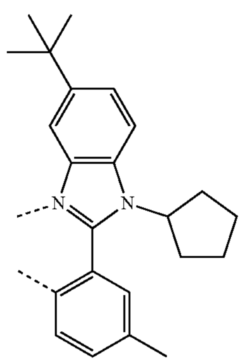
L2-205
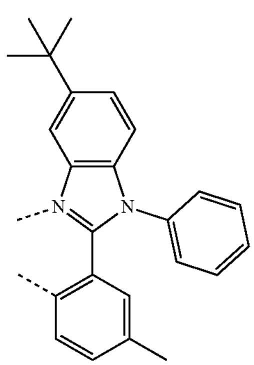
L2-206
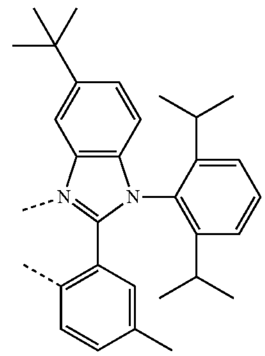
L2-207
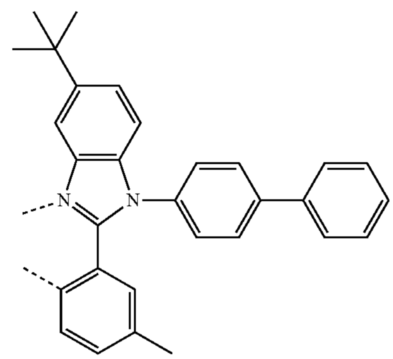
L2-208
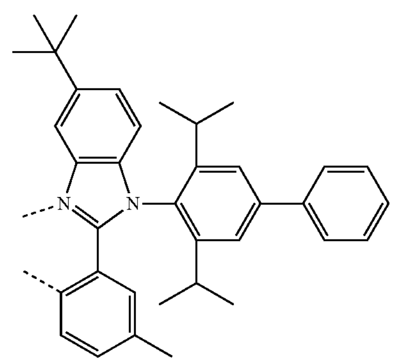
L2-209
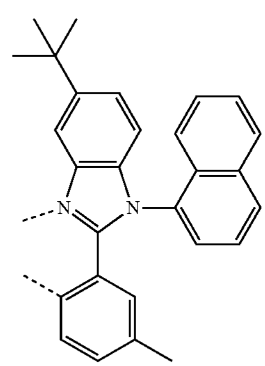

-continued
$L_{2-210}$
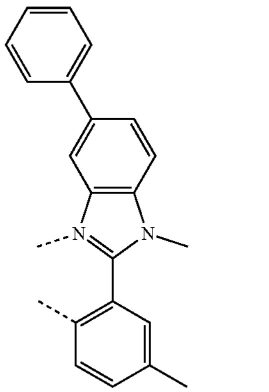
$L_{2-211}$
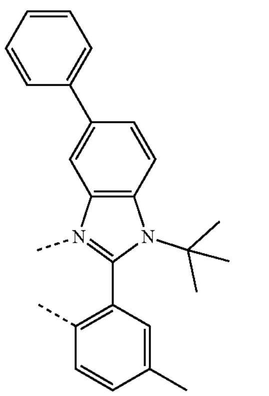
$L_{2-212}$
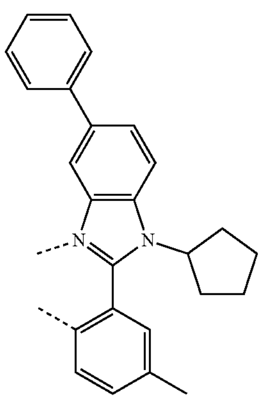
$L_{2-213}$
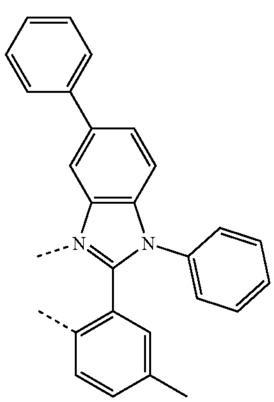
-continued
$L_{2-214}$
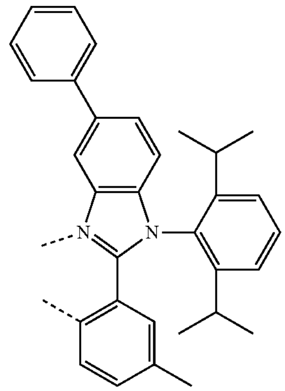
$L_{2-215}$
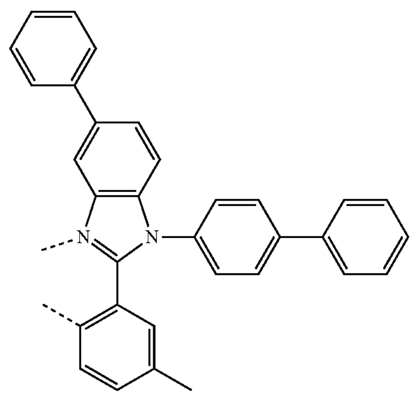
$L_{2-216}$
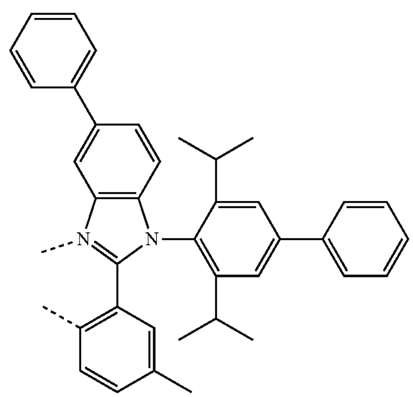
$L_{2-217}$
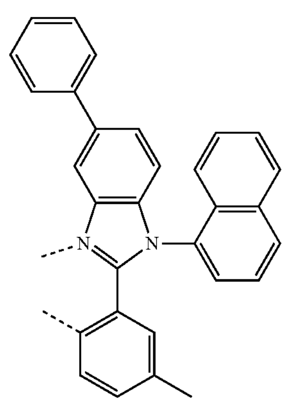

-continued
$L_{2\text{-}218}$
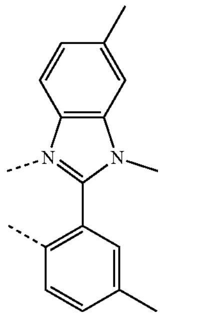
$L_{2\text{-}219}$
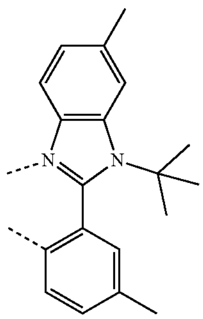
$L_{2\text{-}220}$
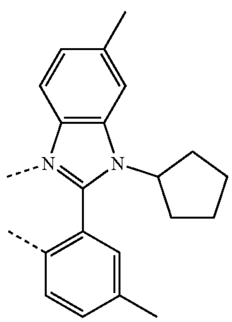
$L_{2\text{-}221}$
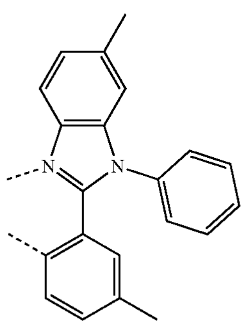
$L_{2\text{-}222}$
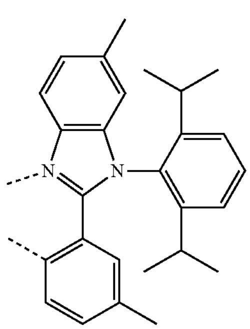
-continued
$L_{2\text{-}223}$
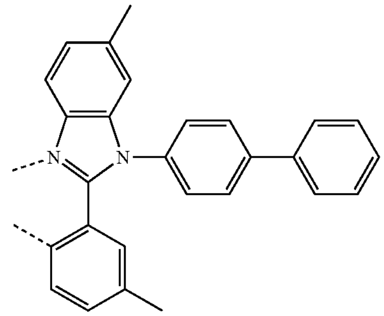
$L_{2\text{-}224}$
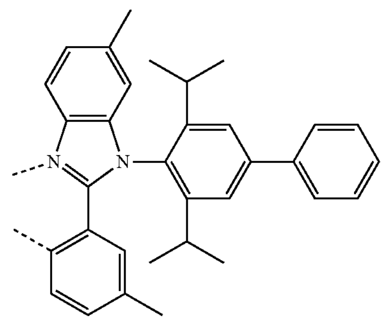
$L_{2\text{-}225}$
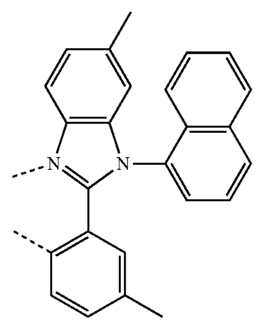
$L_{2\text{-}226}$
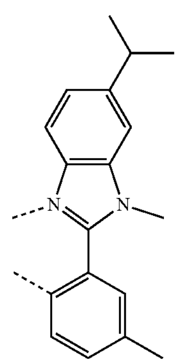

-continued
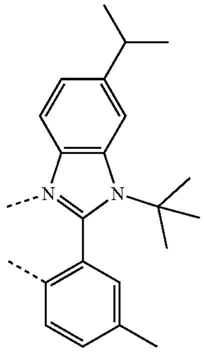
$L_{2-227}$
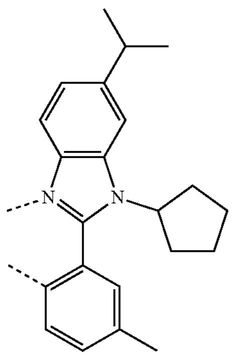
$L_{2-228}$
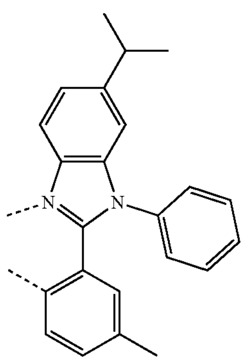
L2-229
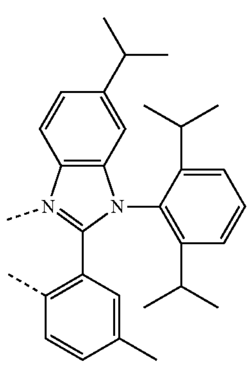
$L_{2-230}$
-continued
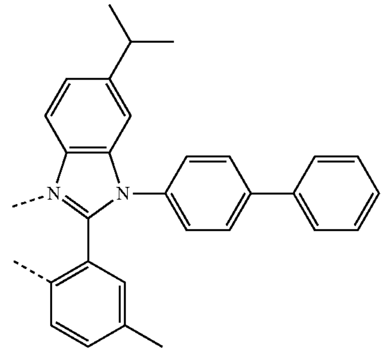
$L_{2-231}$
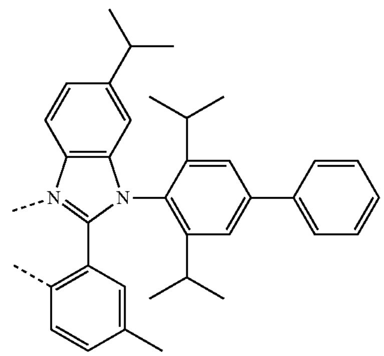
$L_{2-232}$
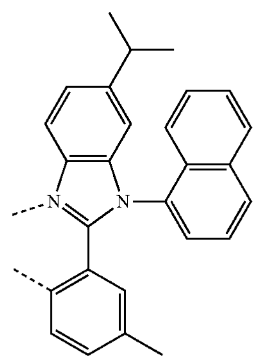
$L_{2-233}$
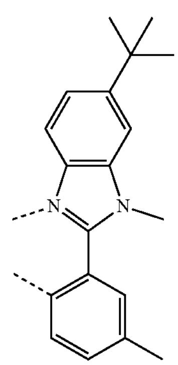
$L_{2-234}$ -continued
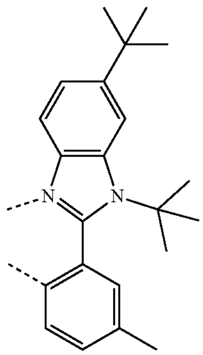
$L_{2\text{-}235}$
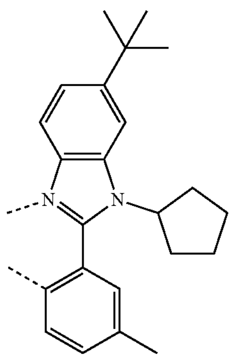
$L_{2\text{-}236}$
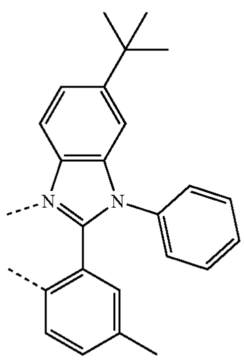
$L_{2\text{-}237}$
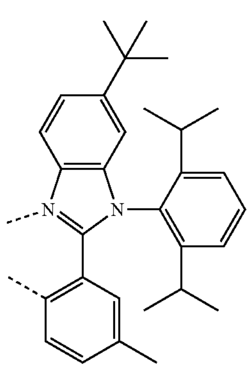
$L_{2\text{-}238}$
-continued
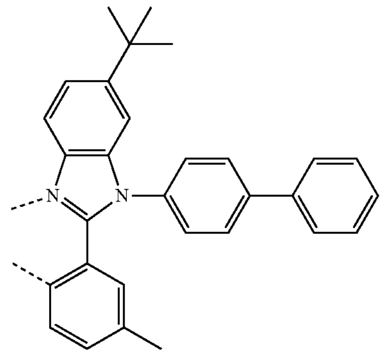
$L_{2\text{-}239}$
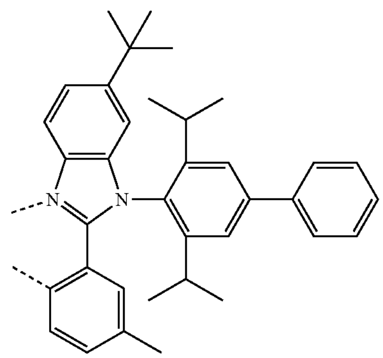
$L_{2\text{-}240}$
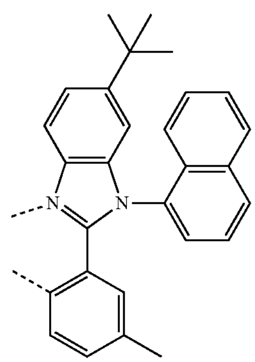
$L_{2\text{-}241}$
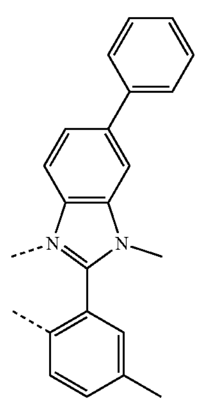
$L_{2\text{-}242}$ -continued
L2-243
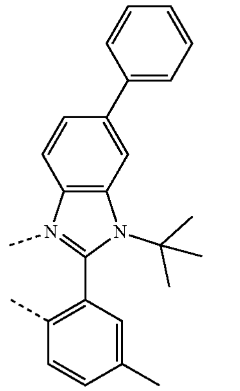
L2-244
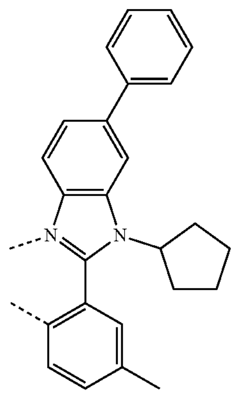
L2-245
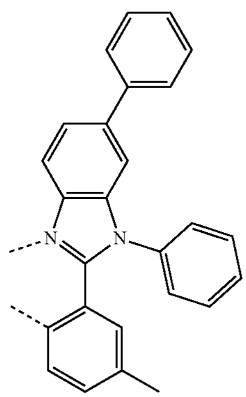
L2-246
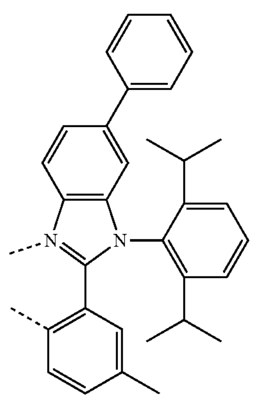
-continued
L2-247
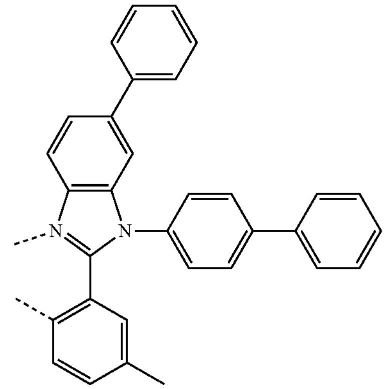
L2-248
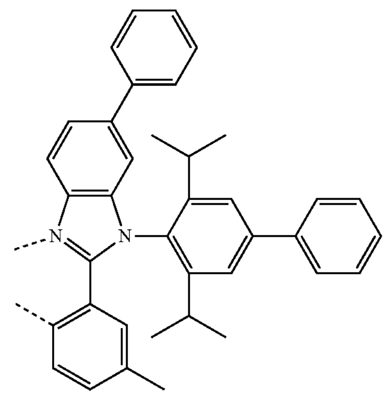
L2-249
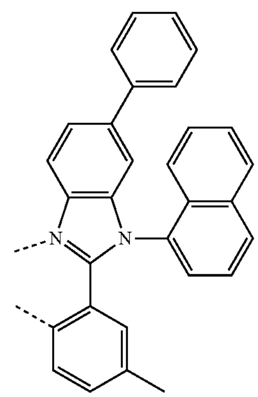
L2-250
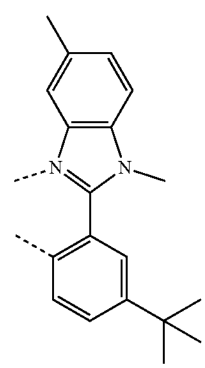

-continued
L2-251
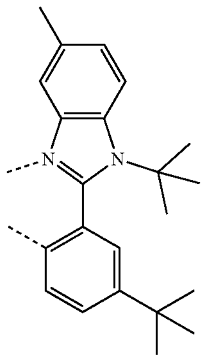
L2-252
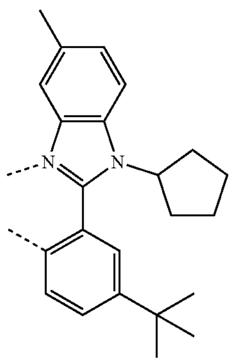
L2-253
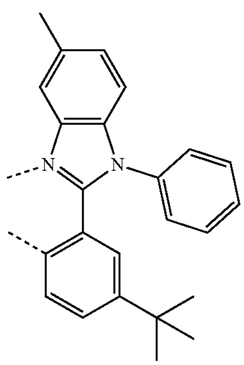
L2-254
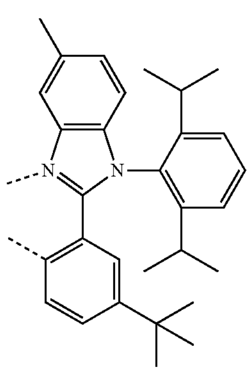
-continued
L2-255
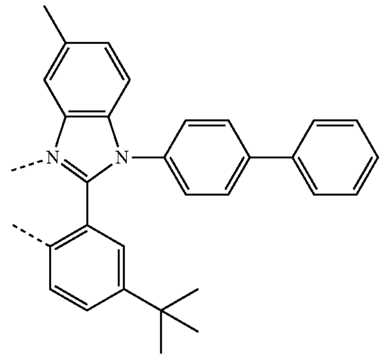
L2-256
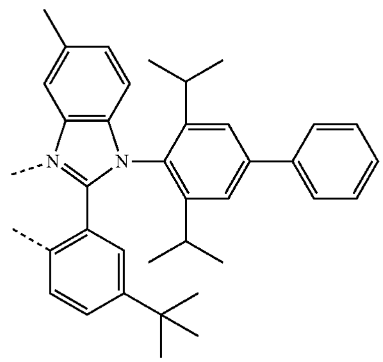
L2-257
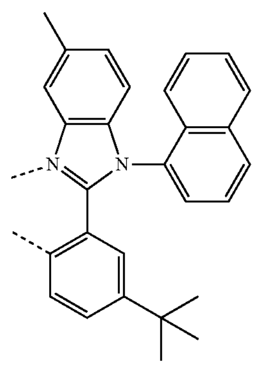
L2-258
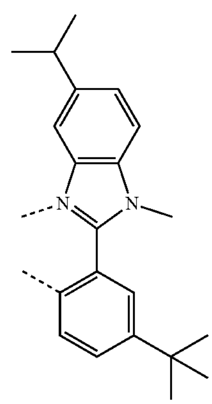

-continued
$L_{2\text{-}259}$
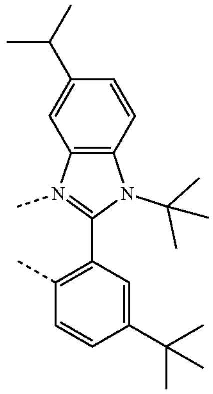
$L_{2\text{-}260}$
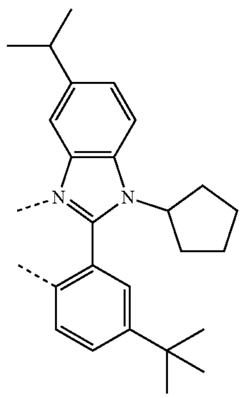
$L_{2\text{-}261}$
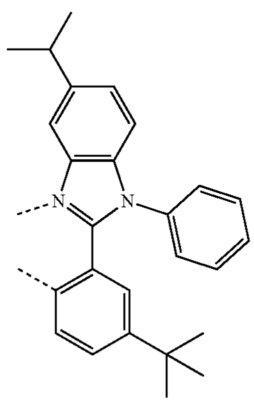
$L_{2\text{-}262}$
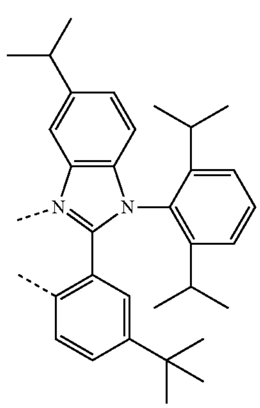
-continued
$L_{2\text{-}263}$
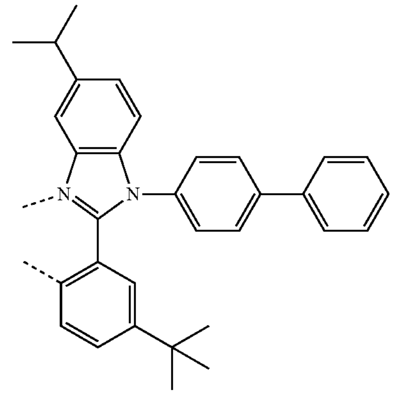
$L_{2\text{-}264}$
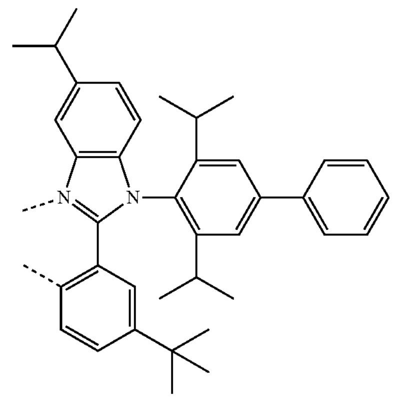
$L_{2\text{-}265}$
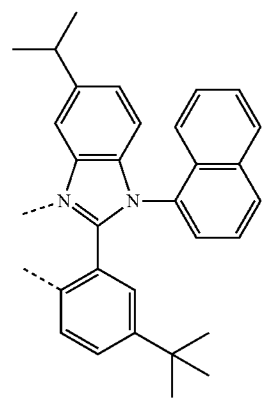
$L_{2\text{-}266}$
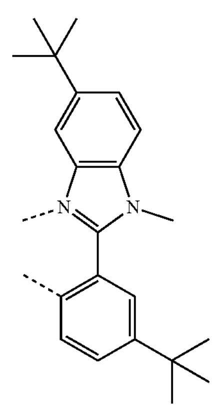

-continued
L2-267
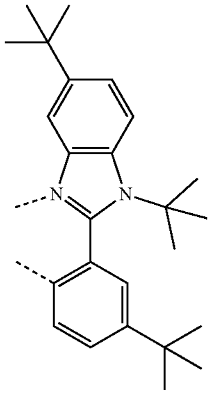
L2-268
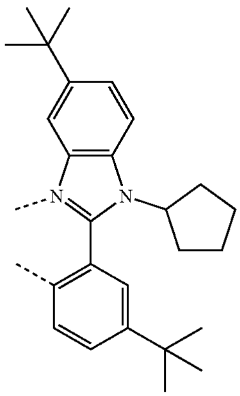
L2-269
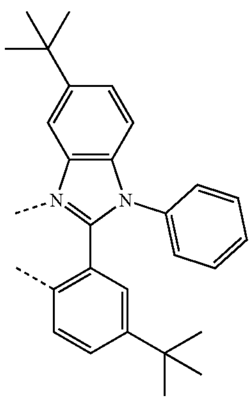
L2-270
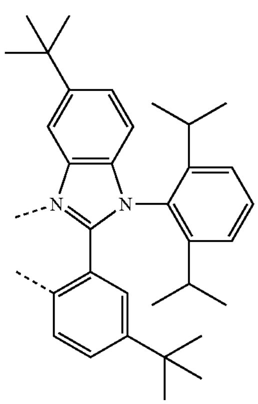
-continued
L2-271
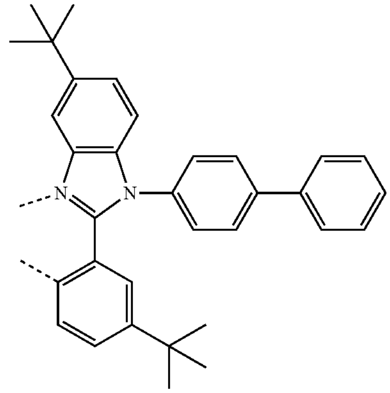
L2-272
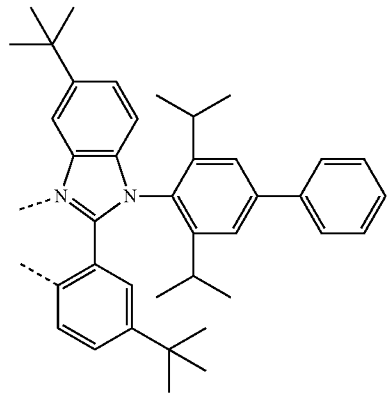
L2-273
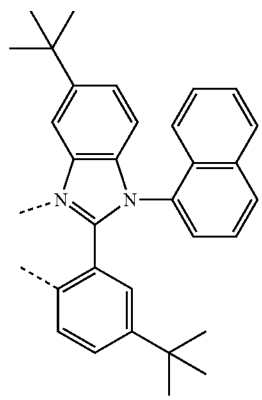
L2-274
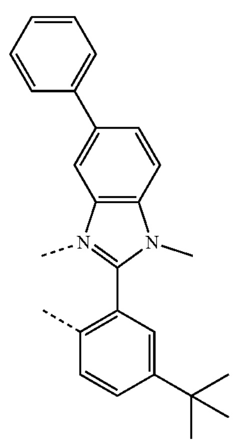

-continued
$L_{2-275}$
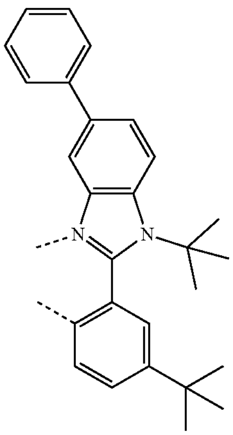
$L_{2-276}$
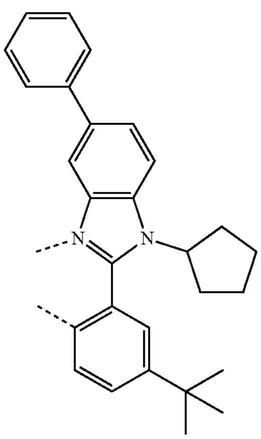
$L_{2-277}$
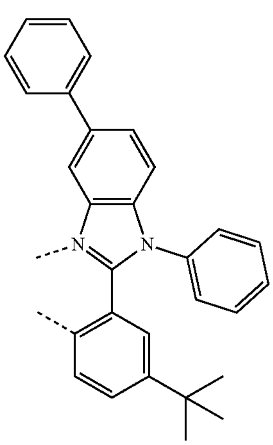
-continued
$L_{2-278}$
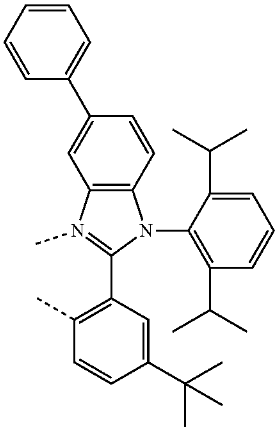
$L_{2-279}$
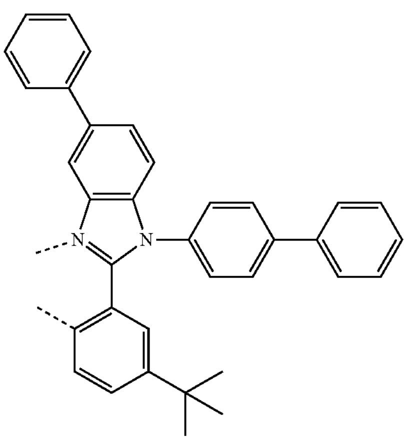
$L_{2-280}$
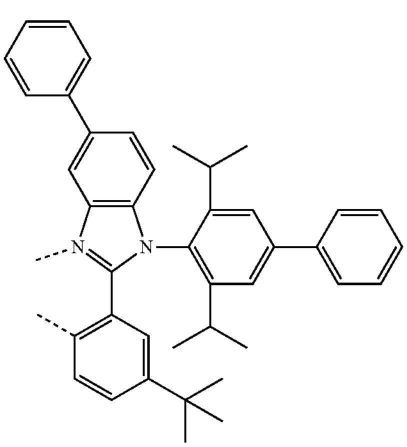

-continued
L2-281
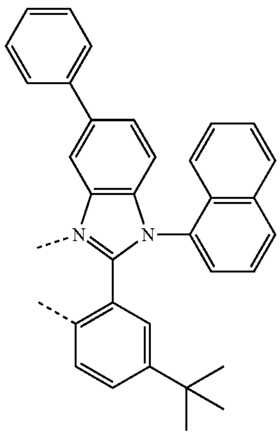
L2-314
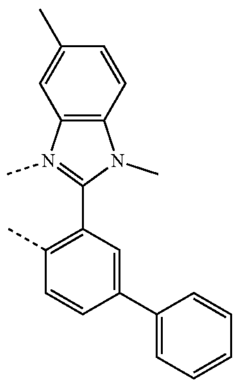
L2-315
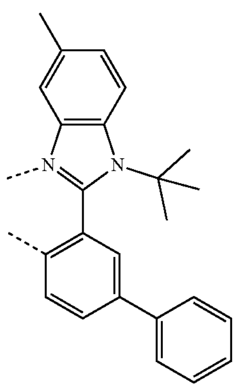
L2-316
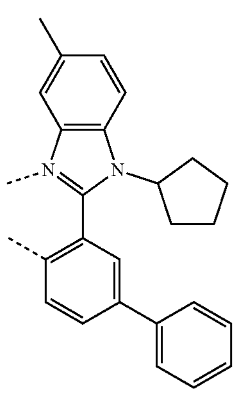
-continued
L2-317
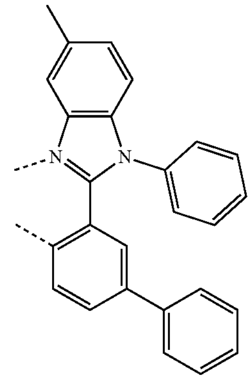
L2-318
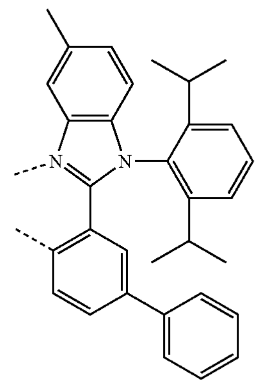
L2-319
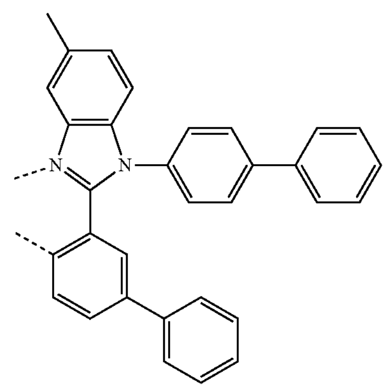
L2-320
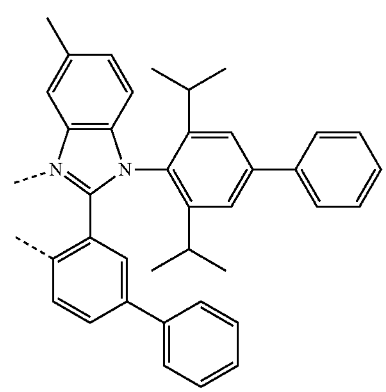

-continued
L2-321
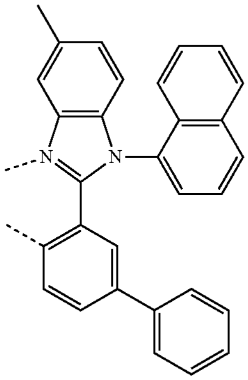
L2-322
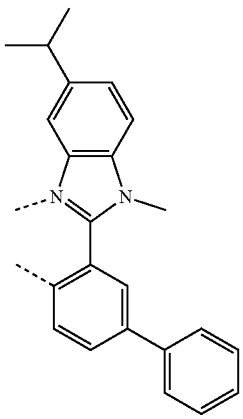
L2-323
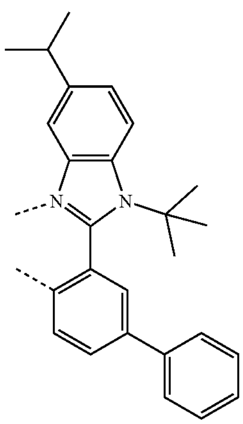
L2-324
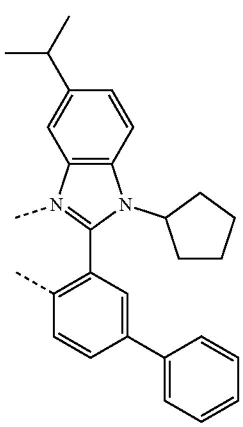
-continued
L2-325
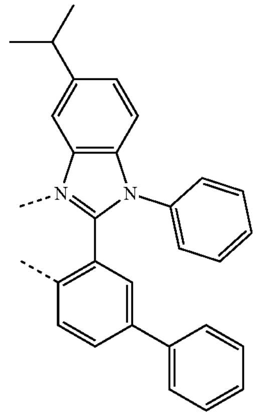
L2-326
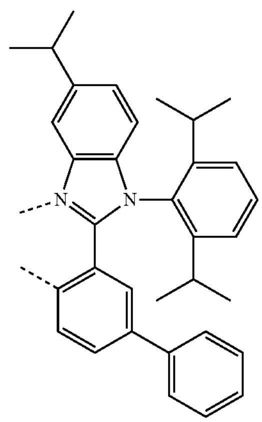
L2-327
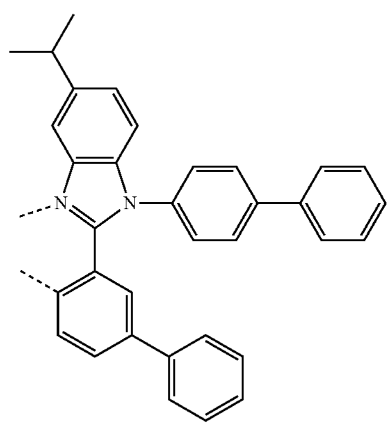

-continued
$L_{2-328}$
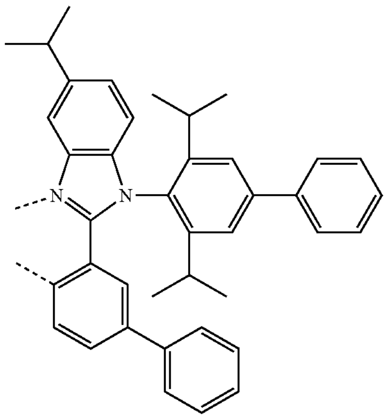
$L_{2-329}$
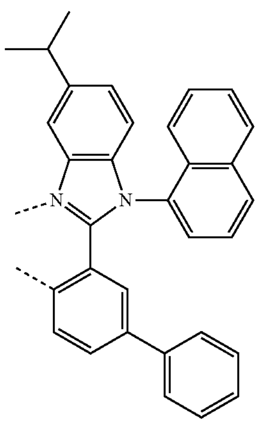
$L_{2-330}$
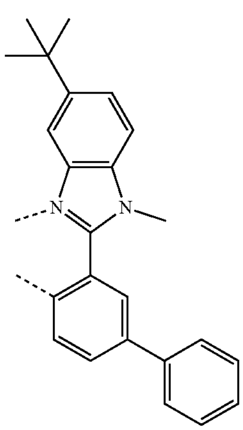
-continued
$L_{2-331}$
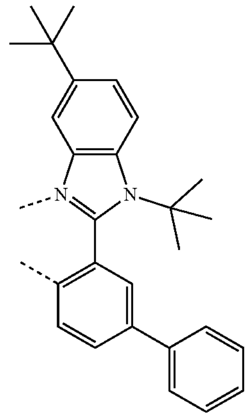
$L_{2-332}$
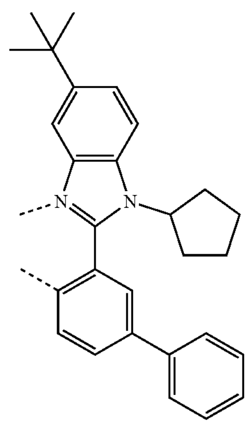
$L_{2-333}$
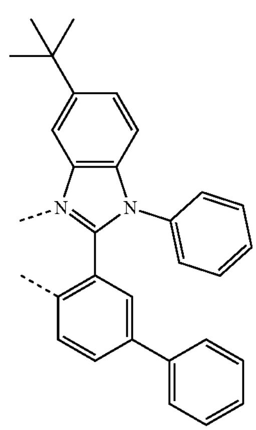

-continued
$L_{2\text{-}334}$
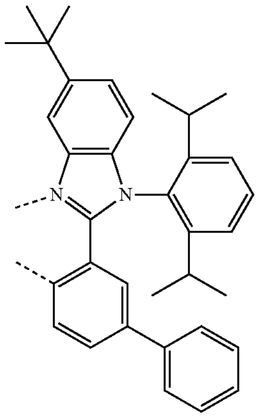
$L_{2\text{-}335}$
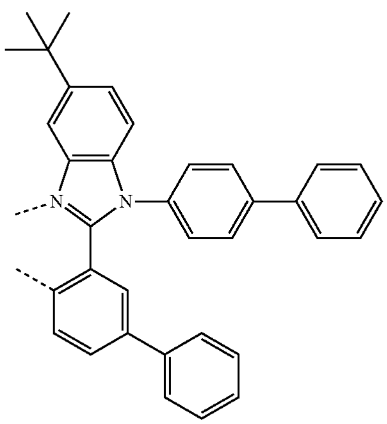
$L_{2\text{-}336}$
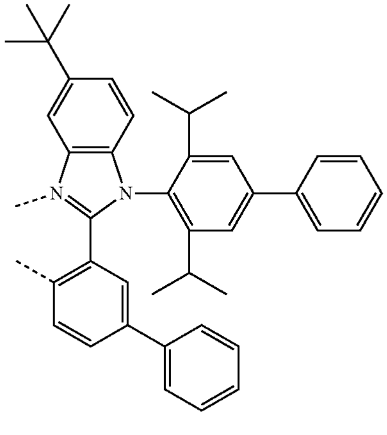
-continued
$L_{2\text{-}337}$
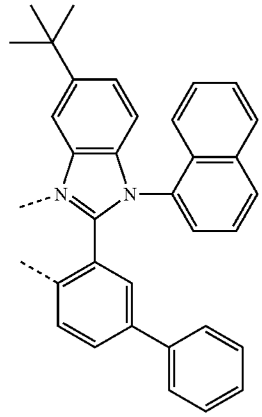
$L_{2\text{-}338}$
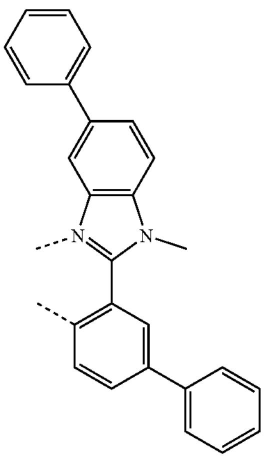
$L_{2\text{-}339}$
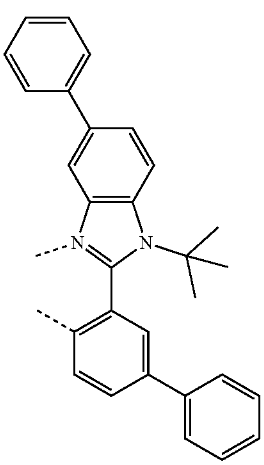

-continued
$L_{2-340}$
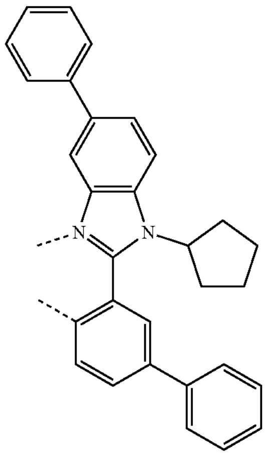
$L_{2-341}$
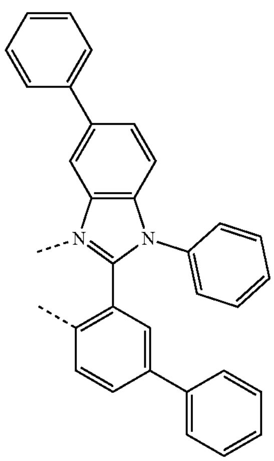
$L_{2-342}$
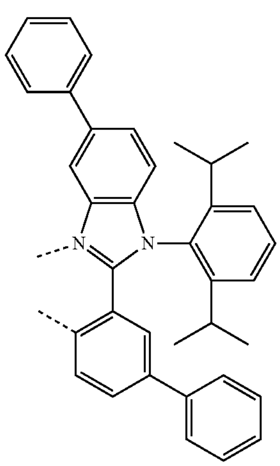
-continued
$L_{2-343}$
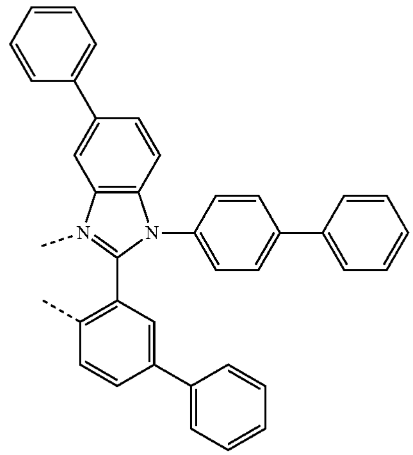
$L_{2-344}$
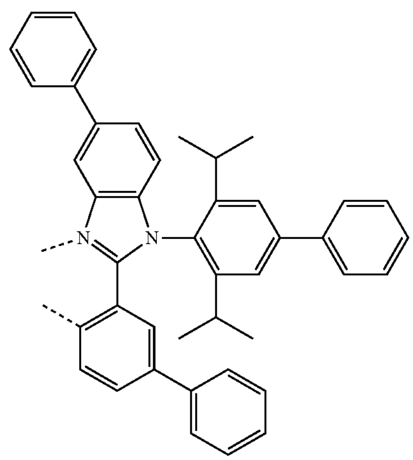
$L_{2-345}$
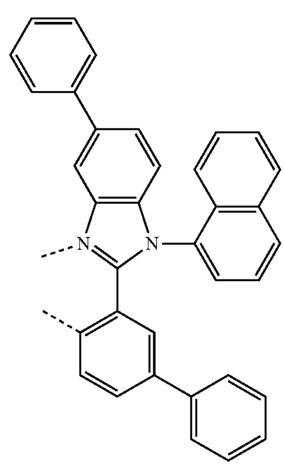

-continued
L2-346
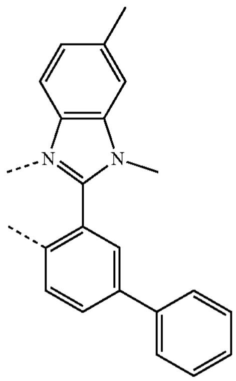
L2-347
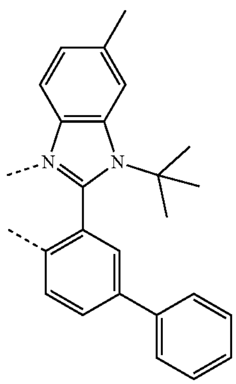
L2-348
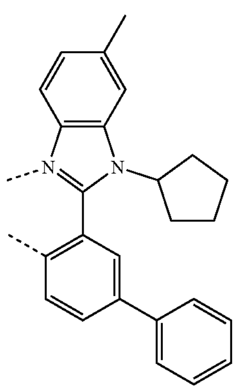
L2-349
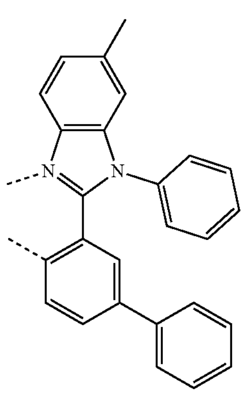
-continued
L2-350
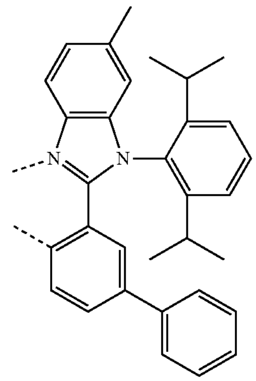
L2-351
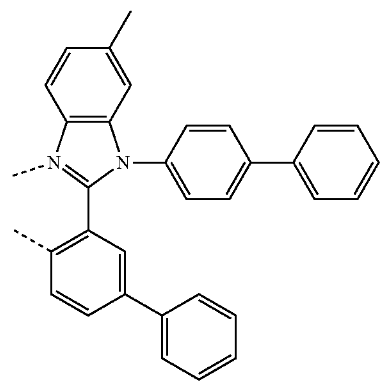
L2-352
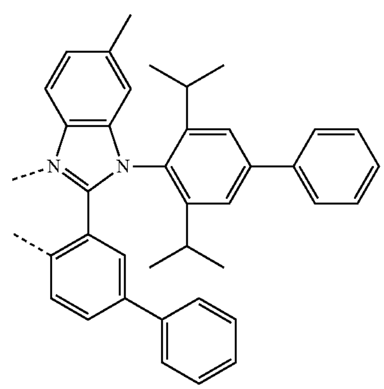
L2-353
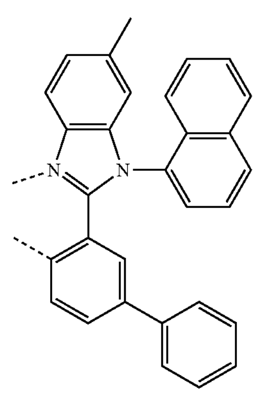

-continued
$L_{2\text{-}354}$
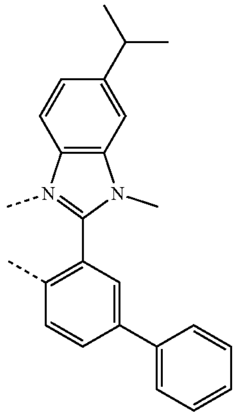
$L_{2\text{-}355}$
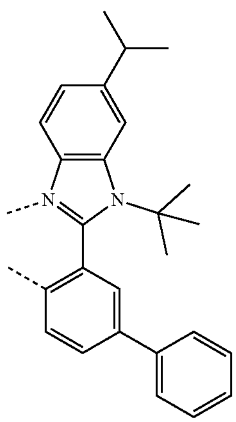
$L_{2\text{-}356}$
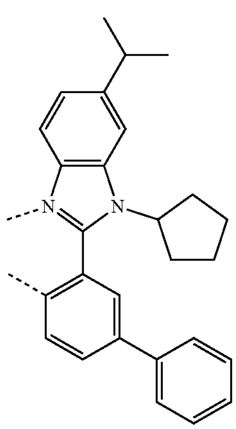
-continued
$L_{2\text{-}347}$
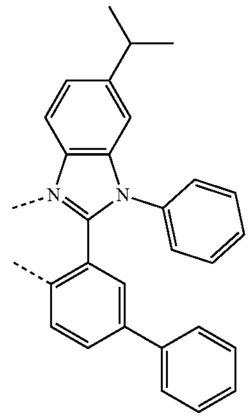
$L_{2\text{-}348}$
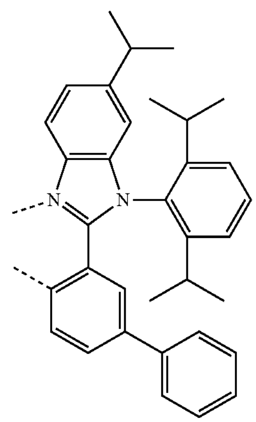
$L_{2\text{-}359}$
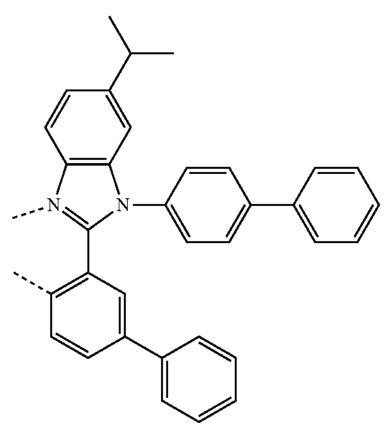

-continued
$L_{2\text{-}360}$
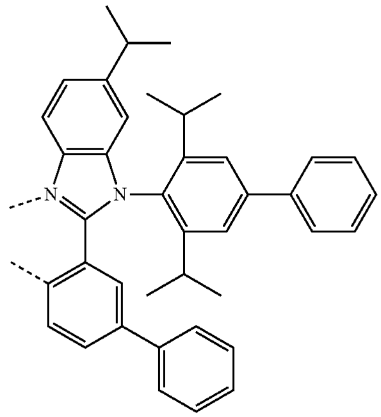
$L_{2\text{-}361}$
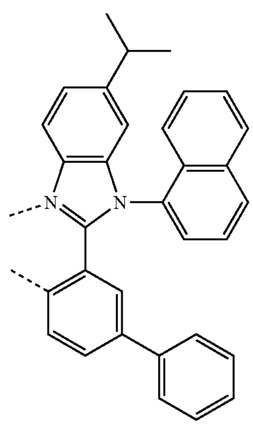
$L_{2\text{-}362}$
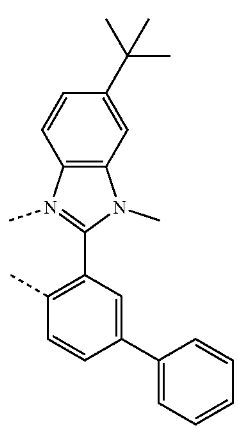
-continued
$L_{2\text{-}363}$
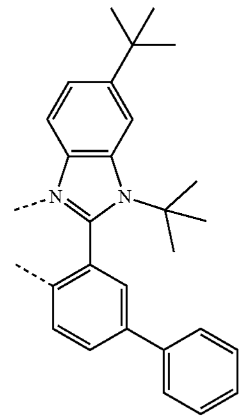
$L_{2\text{-}364}$
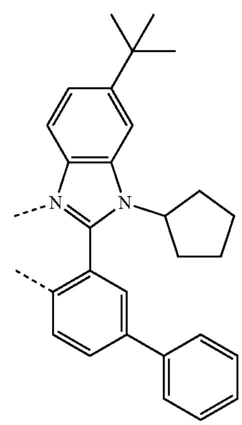
$L_{2\text{-}365}$
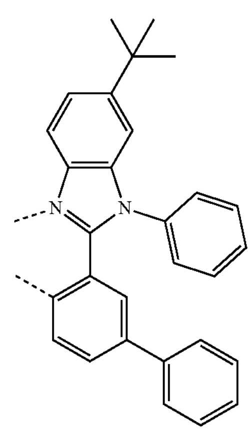

-continued
L2-366
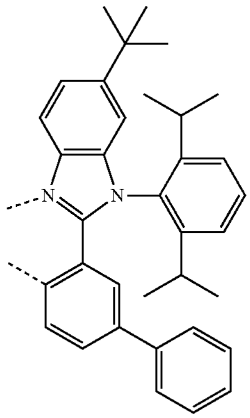
L2-367
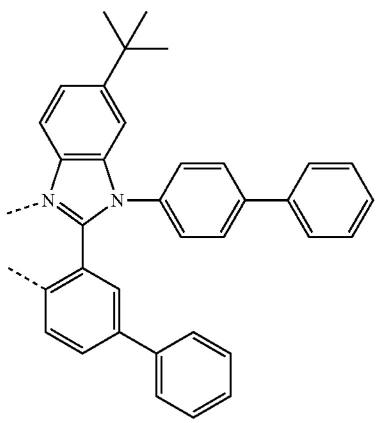
L2-368
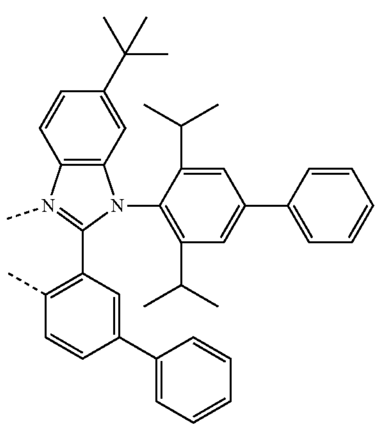
-continued
L2-369
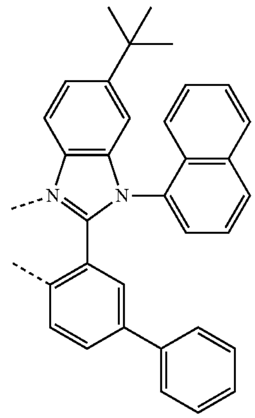
L2-379
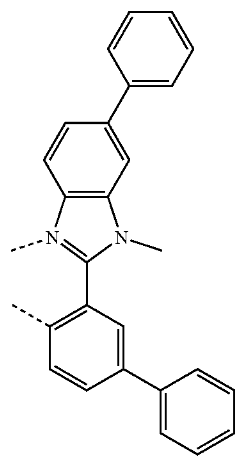
L2-371
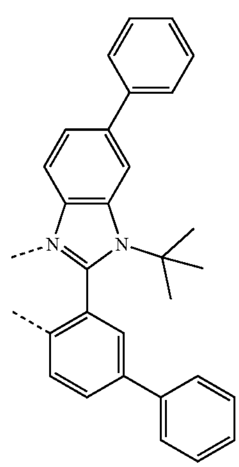

-continued
L2-372
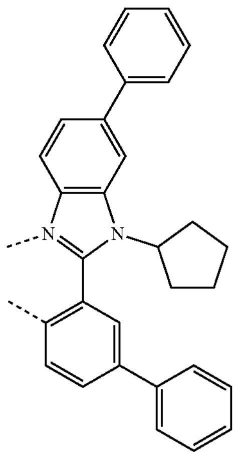
L2-373
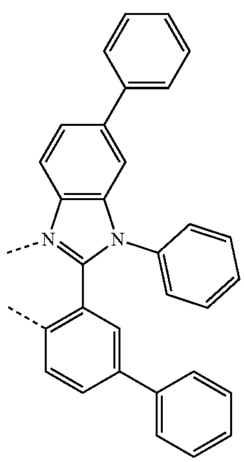
L2-374
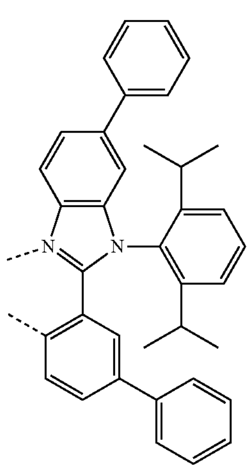
-continued
L2-375
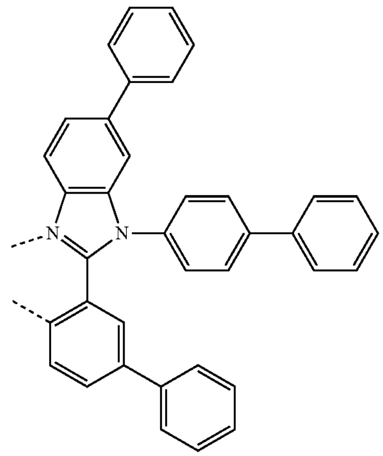
L2-376
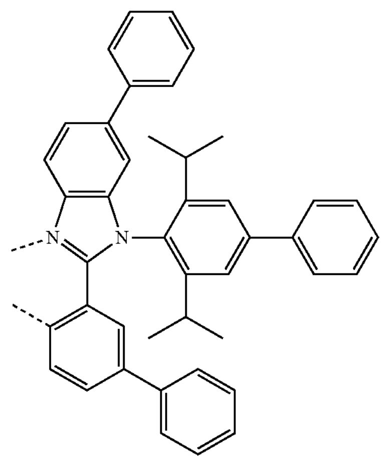
L2-377
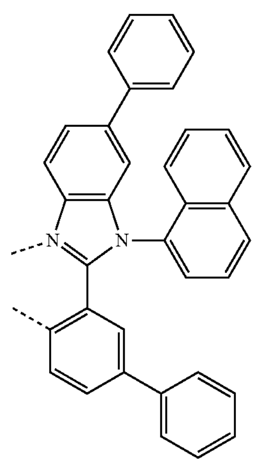
11. An organic light-emitting device comprising:
a first electrode;
a second electrode; and
an organic layer between the first electrode and the second electrode and comprising an emission layer,
wherein the organic layer comprises at least one of the organometallic compound of claim 1.

12. The organic light-emitting device of claim 11, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

13. The organic light-emitting device of claim 10, wherein the organometallic compound is included in the emission layer.

14. The organic light-emitting device of claim 12, wherein the emission layer further comprises a host, and
and an amount of the host in the emission layer is greater than that of the organometallic compound.

15. A diagnostic composition comprising at least one of the organometallic compound of claim 1.

* * * * *